US011569461B2

(12) United States Patent
Bae et al.

(10) Patent No.: US 11,569,461 B2
(45) Date of Patent: Jan. 31, 2023

(54) ORGANIC ELECTROLUMINESCENCE DEVICE AND ORGANOMETALLIC COMPOUND FOR ORGANIC ELECTROLUMINESCENCE DEVICE

(71) Applicants: SAMSUNG DISPLAY CO., LTD., Yongin-si (KR); LAPTO CO., LTD., Seongnam-si (KR)

(72) Inventors: Sung-soo Bae, Yongin-si (KR); Hwanhee Cho, Yongin-si (KR); Eu-gene Oh, Seongnam-si (KR); Hyein Jeong, Yongin-si (KR); Gyuri Kim, Seongnam-si (KR); Kap-jong Han, Seongnam-si (KR); Namho Kim, Seongnam-si (KR); Hyejeong Kim, Seongnam-si (KR); Juwan Maeng, Seongnam-si (KR); Yongpil Park, Seongnam-si (KR); Jeunghun Yoon, Seongnam-si (KR)

(73) Assignees: Samsung Display Co., Ltd., Yongin-si (KR); Lapto Co., Ltd., Seongnam-si (KR)

( * ) Notice: Subject to any disclaimer, the term of this patent is extended or adjusted under 35 U.S.C. 154(b) by 399 days.

(21) Appl. No.: 16/194,880

(22) Filed: Nov. 19, 2018

(65) Prior Publication Data

US 2019/0181358 A1 Jun. 13, 2019

(30) Foreign Application Priority Data

Dec. 8, 2017 (KR) ........................ 10-2017-0168710

(51) Int. Cl.
*H01L 51/00* (2006.01)
*C07F 15/00* (2006.01)
(Continued)

(52) U.S. Cl.
CPC ...... *H01L 51/0087* (2013.01); *C07F 15/0086* (2013.01); *C09K 11/06* (2013.01);
(Continued)

(58) Field of Classification Search
CPC ... H01L 51/0084–0088; H01L 51/5012; H01L 51/5024; H01L 51/5056; H01L 51/5072; H01L 51/5088; H01L 51/5092; H01L 51/0077–0089; H01L 51/0091–0092; H01L 51/5096; H01L 51/0083–0092; C07F 15/0086; C07F 15/002; C07F 15/0033; C07F 15/0046; C07F 15/006; C07F 15/0073; C07F 5/00; C07F 5/003; C07F 5/06–069; C07F 7/00; C07F 7/003; C07F 7/22–28; C09K 2211/185; C09K 11/06; C09K 2211/1033; C09K 2211/1048; C09K 2211/1037; C09K 2211/1051; C09K 2211/1088;
(Continued)

(56) References Cited

U.S. PATENT DOCUMENTS 8,940,415 B2 1/2015 Nii et al.
2005/0227112 A1* 10/2005 Ise ...................... H01L 51/0087 428/690

(Continued)

FOREIGN PATENT DOCUMENTS

| | | | |
|---|---|---|---|
| JP | 4154140 | B2 | 9/2008 |
| KR | 10-1098807 | B1 | 12/2011 |

(Continued)

OTHER PUBLICATIONS

Wang et al., Strongly phosphorescent platinum(II) complexes supported by tetradentate benzazole-containing ligands) teaches a specific example of a platinum complex comprising tetradentate ligand similar to instant Formula 1 wherein Q is O and R5 is fused to Ar2, 2015, J. Mater. Chem. C, 2015, 3, 8212 (Year: 2015).*

(Continued)

*Primary Examiner* — Jennifer A Boyd
*Assistant Examiner* — Braelyn R Watson
(74) *Attorney, Agent, or Firm* — Lewis Roca Rothgerber Christie LLP

(57) ABSTRACT

An organic electroluminescence device includes a first electrode, an organic layer disposed on the first electrode, and a second electrode disposed on the organic layer. The organic layer includes an organometallic compound represented by Formula 1 below.

[Formula 1]

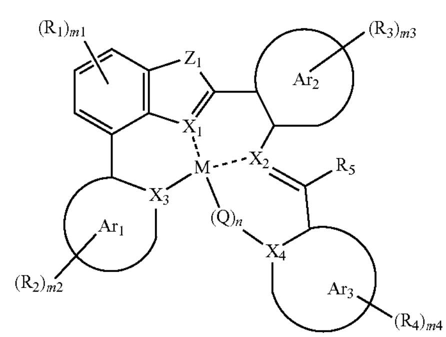

where $R_1$ to $R_4$, $X_1$ to $X_4$, $Ar_1$ to $Ar_3$, M, Q, m1 to m4, and n are as defined in the specification.

19 Claims, 2 Drawing Sheets

(51) Int. Cl.
*C09K 11/06* (2006.01)
*H01L 51/50* (2006.01)

(52) U.S. Cl.
CPC ................. *C09K 2211/1033* (2013.01); *C09K 2211/1037* (2013.01); *C09K 2211/1088* (2013.01); *C09K 2211/185* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC .... C09K 2211/1062; C09K 2211/1066; C09K 2211/1077; C09K 2211/1081; C09K 2211/1092; C09K 2211/182–188
See application file for complete search history.

(56) References Cited

U.S. PATENT DOCUMENTS

| | | | | |
|---|---|---|---|---|
| 2006/0099451 | A1* | 5/2006 | Igarashi | H05B 33/14 428/690 |
| 2009/0306395 | A1* | 12/2009 | Suh | C07F 15/004 548/108 |
| 2016/0204362 | A1* | 7/2016 | Park | H01L 51/0085 257/40 |
| 2016/0240800 | A1 | 8/2016 | Ma et al. | |
| 2016/0301019 | A1 | 10/2016 | Lee et al. | |
| 2017/0077425 | A1 | 3/2017 | Ma et al. | |
| 2017/0098788 | A1 | 4/2017 | Lee et al. | |

FOREIGN PATENT DOCUMENTS

| | | | |
|---|---|---|---|
| KR | 10-2015-0134992 | A | 12/2015 |
| KR | 10-2016-0121369 | A | 10/2016 |
| KR | 10-2017-0028268 | A | 3/2017 |
| KR | 10-2017-0039443 | A | 4/2017 |
| KR | 10-1794558 | B1 | 11/2017 |

OTHER PUBLICATIONS

C. W. Tang, et al., "Organic electroluminescent diodes", Appl. Phys. Lett., 1987, vol. 51, 913-915.

J. Kido, et al., "Multilayer White Light-Emitting Organic Electroluminescent Device", Science, 1995, vol. 267, 1332-1334.

K. Wong, et al., "Nonconjugated Hybrid of Carbazole and Fluorene: A Novel Host Material for Highly Efficient Green and Red Phosphorescent OLEDs", Organic Letters, 2005, vol. 7, No. 24, 5361-5364.

Yiru Sun et al. "High-efficiency white organic light emitting devices with three separate phosphorescent emission layers", App. Phys. Lett. 91, 26350-3, 2007.

* cited by examiner

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

Korean Patent Application No. 10-2017-0168710, filed on Dec. 8, 2017, in the Korean Intellectual Property Office, and entitled: "Organic Electroluminescence Device and Organometallic Compound for Organic Electroluminescence Device," is incorporated by reference herein in its entirety.

BACKGROUND

1. Field

Embodiments relate to an organic electroluminescence device and an organometallic compound for an organic electroluminescence device. Embodiments relate to an organic electroluminescence device including an organometallic compound which contains a benzazole derivative as a ligand in an organic layer.

2. Description of the Related Art

The development of an organic electroluminescence display device as an image display device has been actively conducted. Different from a liquid crystal display device, the organic electroluminescence display device is so-called a self-luminescent display device in which holes and electrons injected from a first electrode and a second electrode recombine in an emission layer, and a light emission material including an organic compound in the emission layer emits light to attain display.

SUMMARY

Embodiments are directed to an organic electroluminescence device including a first electrode, an organic layer on the first electrode, and a second electrode on the organic layer. The organic layer includes an organometallic compound represented by the following Formula 1:

[Formula 1]

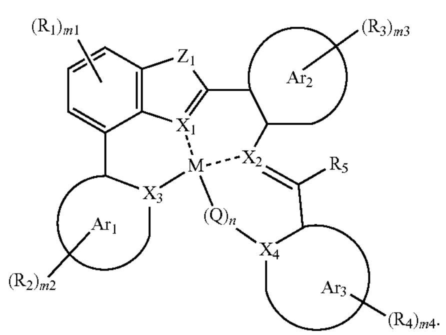

In Formula 1, M is a transition metal in period 1, a transition metal in period 2, or a transition metal in period 3, $Z_1$ is O, S or $NR_6$, Q is O, S or $CH_2$, n is 0 or 1, $X_1$, $X_2$, $X_3$ and $X_4$ are each independently N or C, if n is 0, M is combined with two C atoms and two N atoms, $Ar_1$, $Ar_2$ and $Ar_3$ are each independently a substituted or unsubstituted aryl group having 6 to 30 ring carbon atoms, or a substituted or unsubstituted heteroaryl group having 2 to 30 ring carbon atoms. $R_1$, $R_2$, $R_3$, $R_4$, $R_5$ and $R_6$ are each independently a hydrogen atom, a deuterium atom, a halogen atom, a substituted or unsubstituted alkyl group having 1 to 20 carbon atoms, a substituted or unsubstituted hydrocarbon ring having 5 to 20 ring carbon atoms, a substituted or unsubstituted heteroalkyl group having 1 to 20 carbon atoms, an alkoxy group, an aryloxy group, a cyano group, an amino group, a substituted or unsubstituted silyl group, an alkenyl group, a heteroalkenyl group, an alkynyl group, an unsaturated hydrocarbon ring, a substituted or unsubstituted aryl group having 6 to 30 ring carbon atoms, a substituted or unsubstituted heteroaryl group having 2 to 30 ring carbon atoms, an acyl group, a carbonyl group, a carbonyl acid, a carbonyl ester, a nitrile group, an isonitrile group, a sulfanyl group, a sulfinyl group, a sulfonyl group, a phosphino group, a substituted or unsubstituted monovalent non aromatic condensed polycycle, or a substituted or unsubstituted monovalent non aromatic condensed heteropolycycle, or may be combined with an adjacent group to form a ring. $m_1$ to $m_4$ are each independently an integer of 0 to 4.

The organic layer of the organic electroluminescence device may include a hole transport region, an emission layer on the hole transport region, and an electron transport region on the emission layer. The emission layer may include the organometallic compound represented by Formula 1.

The emission layer of the organic electroluminescence device may include a host and a dopant. The dopant may include the organometallic compound represented by Formula 1.

M may be osmium (Os), iridium (Ir), or platinum (Pt). For example, M may be platinum (Pt).

$Ar_1$ to $Ar_3$ in Formula 1 may be each independently phenyl, naphthyl, pyridine, pyrimidine, pyrazine, pyridazine, quinoline, isoquinoline, furan, thiophene, pyrrole, benzofuran, benzothiophene, phenanthryl, phenanthridine, indole, or indazole.

Formula 1 may be represented by one of the following Formula 1-1 to Formula 1-3:

[Formula 1-1]

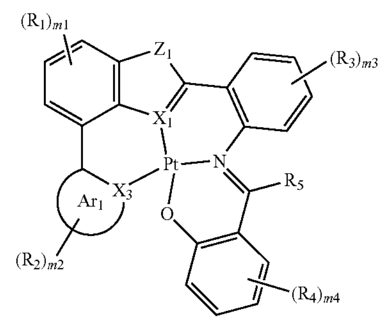

[Formula 1-2]

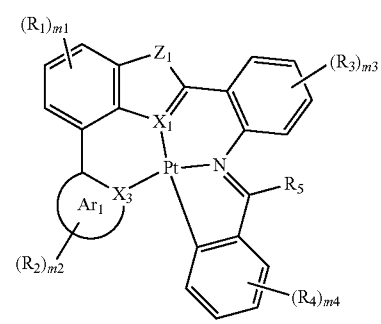

-continued

[Formula 1-3]

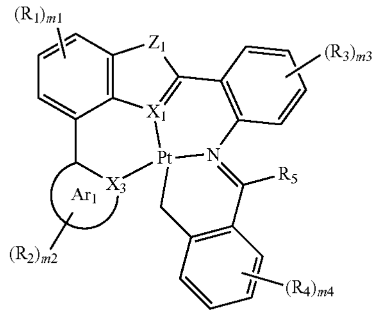

wherein in Formula 1-1 to Formula 1-3, $X_1$ and $X_3$ are each independently N or C, and $Z_1$, $Ar_1$, $R_1$ to $R_5$, and $m_1$ to $m_4$ are the same as described above, and in Formula 1-2, Pt is combined with two C atoms and two N atoms.

In Formula 1-1 to Formula 1-3. $R_1$, $R_2$, $R_3$, $R_4$ and $R_5$ may be each independently a hydrogen atom, a deuterium atom, a halogen atom, a substituted or unsubstituted alkyl group having 1 to 20 carbon atoms, a substituted or unsubstituted heteroalkyl group having 1 to 20 carbon atoms, a substituted or unsubstituted silyl group, a substituted or unsubstituted aryl group having 6 to 30 ring carbon atoms, or a substituted or unsubstituted heteroaryl group having 2 to 30 ring carbon atoms.

An embodiment provides an organometallic compound represented by Formula 1.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
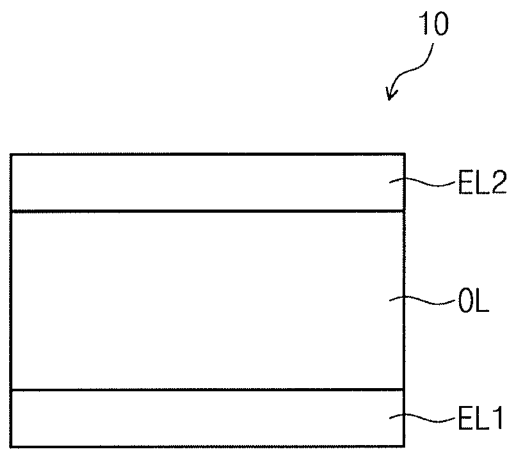
FIG. 1 is a cross-sectional view schematically illustrating an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the description, "a solid line" means Covalent Bonding, and "a dotted line" means Coordination bonding.

In the description, "substituted or unsubstituted" may indicate that a group is substituted with at least one substituent selected from t a deuterium atom, a halogen group, a cyano group, a nitro group, an amino group, a hydroxyl group, a silyl group, a boron group, a phosphine oxide group, a phosphine sulfide group, an alkyl group, an alkoxy group, an alkenyl group, an aryl group, a heteroaryl group, and a heterocycle, or unsubstituted. In addition, each of the substituents illustrated above may be substituted or unsubstituted. For example, a biphenyl group may be interpreted as an aryl group, or a phenyl group substituted with a phenyl group.

In the description, the halogen atom may be a fluorine atom, a chlorine atom, a bromine atom or an iodine atom.

In the description, the alkyl group may be a linear, branched or cyclic type. The carbon number of the alkyl group may be from 1 to 50, from 1 to 30, from 1 to 20, from 1 to 10, or from 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, I-methylhexyl, 2-ethylhexyl, 2-butylhexyl, cyclohexyl, 4-methylcyclohexyl, 4-t-butylcyclohexyl, n-heptyl, I-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., groups.

In the description, the hydrocarbon ring means an optional functional group or substituent derived from an aliphatic hydrocarbon ring. The hydrocarbon ring may be a saturated hydrocarbon ring having 5 to 20 ring carbon atoms.

In the description, the term "aryl group" indicates an optional functional group or substituent derived from an aromatic hydrocarbon ring. The aryl group may be a monocyclic aryl group or polycyclic aryl group. The number of carbon atoms that form a ring in the aryl may be from 6 to 30, or, for example, from 6 to 20, or, for example, from 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, perylenyl, naphthacenyl, pyrenyl, benzofluoranthenyl, chrysenyl, etc., groups.

In the description, the fluorenyl group may be substituted. Two substituents may be combined with each other to form a spiro structure. In the description, the heteroaryl group may be a heteroaryl group including at least one of O, N, P, Si or S as a heteroatom. N and S atoms may be oxidized in certain situations, and N atom(s) may be quaternized in certain situations. The number of carbon atoms included in a ring of the heteroaryl group may be 2 to 30, or 2 to 20. The heteroaryl group may be monocyclic heteroaryl group or polycyclic heteroaryl group. In some implementations, the polycyclic heteroaryl group may have a dicyclic or tricyclic structure.

Examples of the heteroaryl group may include thiophene, furan, pyrrole, imidazole, pyrazolyl, thiazole, oxazole, oxadiazole, triazole, pyridine, bipyridine, pyrimidine, triazine, tetrazine, triazole, tetrazole, acridyl, pyridazine, pyrazinyl, quinoline, quinazoline, quinoxaline, phenoxazine, phthalazine, pyrido pyrimidine, pyrido pyrazino pyrazine, isoquinoline, cinnolinyl, indole, isoindole, indazole, carbazole, N-arylcarbazole, N-heteroarylcarbazole, N-alkylcarbazole, benzoxazole, benzoimidazole, benzothiazole, benzocarbazole, benzothiophene, benzothiophene, benzoisothiazolyl, benzoisoxazolyl, dibenzothiophene, thienothiophene, benzofuran, phenanthroline, phenanthridine, thiazole, isoxazole, oxadiazole, thiadiazole, isothiazole, isoxazole, phenothiazine, benzodioxole, dibenzosilole, dibenzofuran, isobenzofuran, etc., groups. In some implementations, the heteroaryl group may be a quaternized salt such as an N-oxide aryl group corresponding to the monocyclic heteroaryl or the polycyclic heteroaryl, for example, a pyridyl N-oxide group, a quinolyl N-oxide group, etc.

In the description, the term "silyl group" includes alkyl silyl groups and aryl silyl groups. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc., groups. In the description, the term "boron group" includes alkyl boron groups and aryl boron groups. Examples of boron groups include trimethylboron, triethylboron, t-butyldimethylboron, triphenylboron, diphenylboron, phenylboron, etc., groups.

In the description, the alkenyl group may include a linear chain or a branched chain. The carbon number may be, for example, 2 to 30, 2 to 20, or 2 to 10. Examples of the alkenyl group include vinyl, I-butenyl, 1-pentenyl, 1,3-butadienyl aryl, styrenyl, styrylvinyl, etc., groups.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

Hereinafter, organic electroluminescence devices according to embodiments will be explained.

Figure 2:
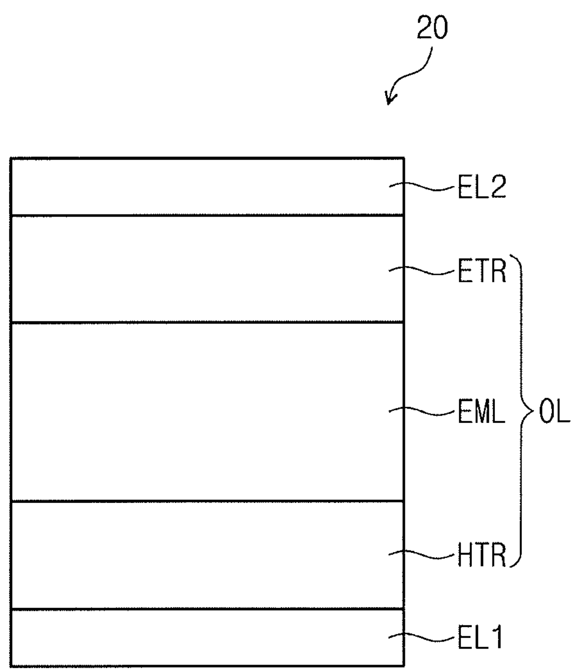
FIG. 2 is a cross-sectional view schematically illustrating an organic electroluminescence device according to an embodiment.
Figure 3:
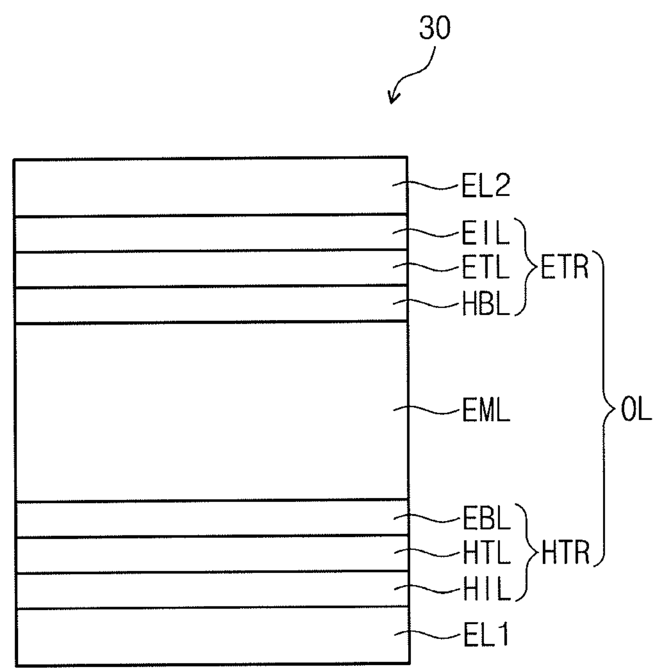
FIG. 3 is a cross-sectional view schematically illustrating an organic electroluminescence device according to an embodiment.

FIGS. 1 to 3 are cross-sectional views schematically illustrating organic electroluminescence devices 10, 20, and 30 according to exemplary embodiments. Referring to FIGS. 1 to 3, an organic electroluminescence device 10 illustrated in FIG. 1 includes a first electrode EL1, an organic layer OL and a second electrode EL2, which may be sequentially laminated. The first electrode EL1 and the second electrode EL2 may be oppositely disposed. The organic layer OL may be between the first electrode EL1 and the second electrode EL2.

In the organic electroluminescence device 20 illustrated in FIG. 2, the organic layer OL may include a hole transport region HTR, an emission layer EML and an electron transport region ETR.

In the electrode electroluminescence device 30 illustrated in FIG. 3, the hole transport region HTR may include a hole injection layer HIL, a hole transport layer HTL and an electron blocking layer EBL, and the electron transport region ETR may include an electron injection layer EIL, an electron transport layer ETL and a hole blocking layer HBL.

In the organic electroluminescence devices 10, 20, and 30 exemplified in FIGS. 1 to 3, the first electrode EL1 has conductivity. The first electrode EL1 may be formed using a metal alloy or a conductive compound. The first electrode EL1 may be an anode.

The first electrode EL1 may be formed on a substrate by a deposition method, such as an electron beam method, or a sputtering method. The material of the first electrode EL1 may be selected from materials having high work function for easy injection of holes into an organic electroluminescence device. According to the light-emitting direction of an organic electroluminescence device, a reflective electrode may be used for a top emission type, a transmissive electrode may be used for a bottom emission type, and a transflective electrode may be used for a dual emission type. The first electrode EL1 may be manufactured by adjusting transmittance by forming using a material such as indium tin oxide (ITO), indium zinc oxide (IZO), tin oxide ($SnO_2$), and zinc oxide (ZnO) to an appropriate thickness. In some implementations, the first electrode EL1 may be formed using a metal that is not an oxide, such as magnesium (Mg), aluminum (Al), aluminum-lithium (Al—Li), calcium (Ca), magnesium-indium (Mg—In), and magnesium-silver (Mg—Ag). A carbon substrate flexible electrode material such as carbon nanotube (CNT) and graphene may be used.

The organic layer OL may be formed to have a plurality of layers. If the organic layer OL includes the plurality of layers, the organic layer OL may include a hole transport region HTR disposed on the first electrode EL1, an emission layer EML disposed on the hole transport region, and an electron transport region ETR disposed on the emission layer.

The organic layer OL of an embodiment includes an organometallic compound represented by Formula 1, which will be described below.

When the organic layer OL of an embodiment includes a plurality of layers including a hole transport region HTR, an emission layer EML, and an electron transport region ETR, the emission layer EML may include an organometallic compound represented by Formula 1, which will be described below.

A hole transport region HTR may be provided on the first electrode EL1. The hole transport region HTR may include at least one of a hole injection layer HIL, a hole transport layer HTL, a hole buffer layer and an electron blocking layer EBL. The hole transport region HTR may provide for smooth injection and transportation of holes into an organic electroluminescence device. Generally, hole mobility is greater than electron mobility. Accordingly, the hole transport region may have a greater thickness than an electron transport region.

The hole transport region HTR may be in a form of a single layer formed using a single material, a single layer formed using a plurality of different materials, or a multilayer structure including a plurality of layers formed using a plurality of different materials.

For example, the hole transport region HTR may have a single-layer structure such as a hole injection layer HIL and a hole transport layer HTL, formed, for example, using a hole injection material and a hole transport material. In some implementations, the hole transport region HTR may have a single-layer structure formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, as examples.

The hole injection layer HIL in the hole transport region HTR may be formed on an anode using a suitable method such as a vacuum deposition method, a spin coating method, a cast method, and a Langmuir-Blodgett (LB) method. If the hole injection layer HIL is formed by a vacuum deposition method, deposition conditions may be optionally controlled at from about 100° C. to about 500° C. in a deposition rate of about 1 Å/s according to the structure and thermal properties of a target hole injection layer. If the hole injection layer HIL is formed by a spin coating method, coating conditions may vary according to the compound used as the material for a hole injection layer and properties between layers for forming and interface. Coating conditions may include a specific coating rate for forming a uniform layer, and a heat treatment for removing solvents after coating, etc.

The hole transport region HTR may include, for example, m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrene sulfonate) (PEDOT/PSS), polyaniline/camphor sulfonic acid (Pani/CSA), polyaniline/poly(4-styrenesulfonate (PANI/PSS), etc.

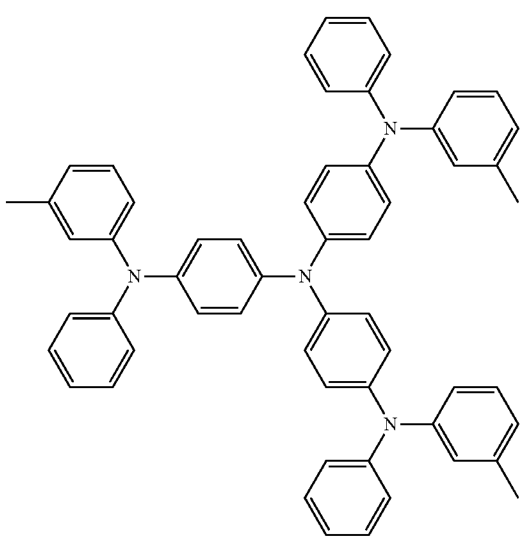

m-MTDATA

-continued

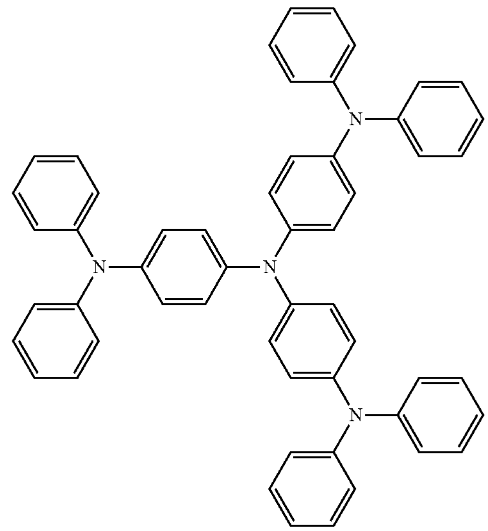

TDATA

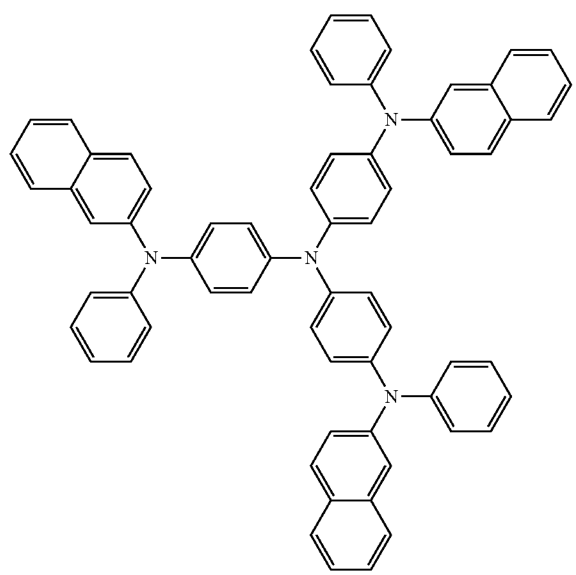

2-TNATA

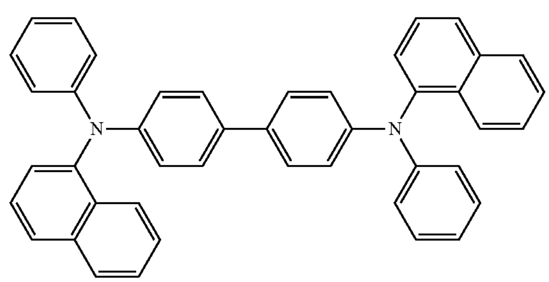

NPB

-continued

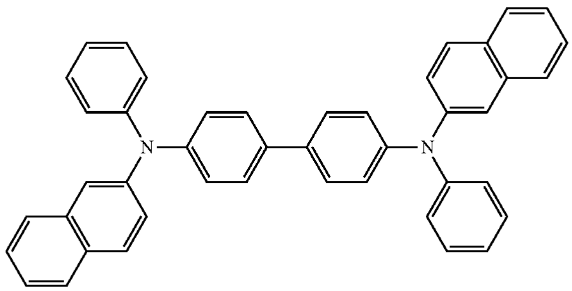

β-NPB

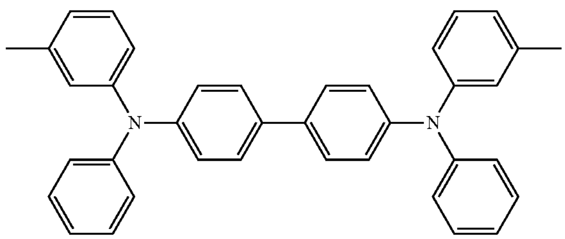

TPD

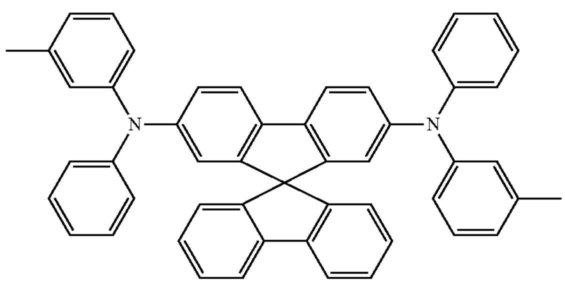

Spiro-TPD

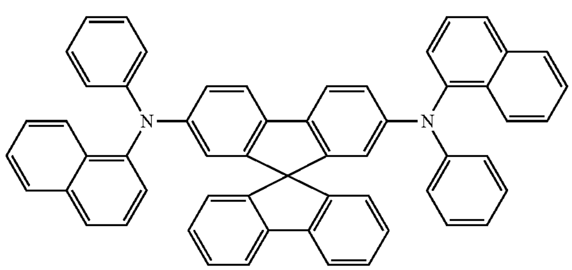

Spiro-MPB

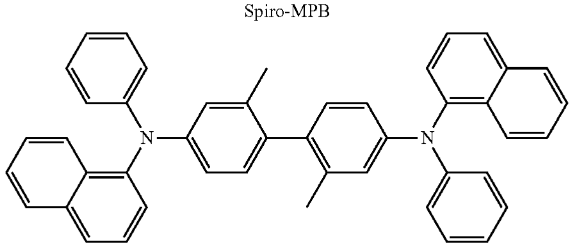

methylated NPB

-continued

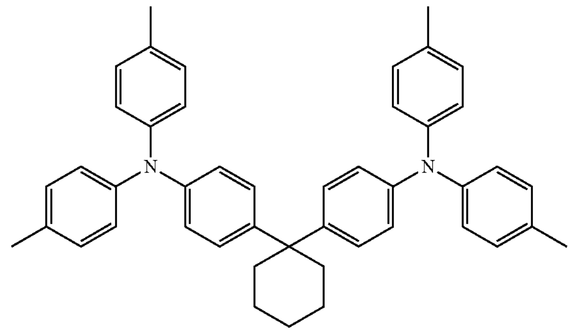

TAPC

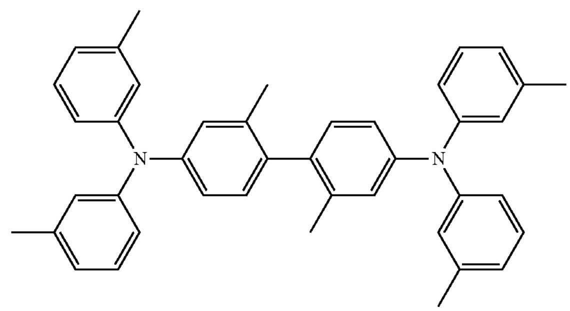

HMTPD

The thickness of the hole transport region HTR may be from about 100 Å to about 10,000 Å. The thicknesses of corresponding organic layers of the hole transport region may vary. For example, if the thickness of a hole injection layer is about 50 Å, the thickness of a hole transport layer may be about 1,000 Å, and the thickness of an electron blocking layer may be about 500 Å. The thickness conditions of the hole transport region may be determined to a degree that satisfies efficiency and life in a range where the driving voltage of an organic electroluminescence device is not increased.

The hole transport region HTR may be doped as in the emission layer to improve properties. The doping of a charge-generating material into the hole transport region HTR may serve to improve electrical properties of an organic electroluminescence device.

The charge-generating material may be formed using a material having very low HOMO and LUMO values. For example, the LUMO of the charge-generating material may have a similar value as that of the HOMO of a material for a hole transport layer. Due to such a low LUMO value, the LUMO may be vacant without electrons, and thus, holes may be easily transported to an adjacent hole transport layer to improve electrical properties.

The charge-generating material may be, for example, a p-dopant. The p-dopant may be a quinone derivative, a metal oxide or a cyano group-containing compound, as examples. Examples of the p-dopant may include a quinone derivative such as tetracyanoquinonedimethane (TCNQ) and 2,3,5,6-tetrafluoro-tetracyano-1,4-benzoquinonedimethane (F4-TCNQ); a metal oxide such as tungsten oxide and molybdenum oxide; and a cyano group-containing compound such as HT-D 1.

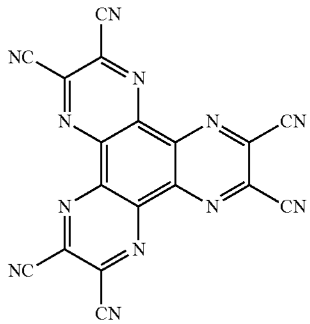

TCNQ

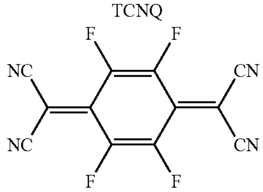

$F_4$-TCNQ

The hole transport region HTR may further include a charge generating material to improve conductivity, in addition to the above-described materials. The charge generating material may be uniformly or non-uniformly dispersed in the hole transport region HTR. The charge generating material may be, for example, a p-dopant. The p-dopant may be a quinone derivative, a metal oxide or a cyano group-containing compounds. Examples of the p-dopant may include a quinone derivative such as tetracyanoquinonedimethane (TCNQ) and 2,3,5,6-tetrafluoro-tetrafluoro-tetracyanoquinodimethane (F4-TCNQ); and a metal oxide such as tungsten oxide and molybdenum oxide.

As described above, the hole transport region HTR may further include at least one of a hole buffer layer or an electron blocking layer in addition to the hole injection layer HIL and the hole transport layer HTL. The hole buffer layer may compensate a resonance distance according to the wavelength of light emitted from the emission layer EML and may increase light emission efficiency. Materials included in the hole transport region HTR may be used as materials included in the hole buffer layer.

The electron blocking layer is a layer that prevents electron injection from the electron transport region ETR to the hole transport region HTR. The electron blocking layer may block electrons moving to the hole transport region. The electron blocking layer may include a material having a high T1 value so as to prevent the diffusion of excitons produced in an emission layer to the hole transport region. For example, a host of an emission layer having a high T1 value may be used as a material for an electron blocking layer.

The emission layer EML may be provided on the hole transport region HTR. The emission layer EML may have a thickness of, for example, from about 100 Å to about 1,000 Å, or from about 100 Å to about 300 Å. The emission layer EML may be a single layer formed using a single material, a single layer formed using a plurality of different materials, or a multilayer structure having a plurality of layers formed using a plurality of different materials.

The emission layer EML is a region where holes and electrons meet to generate excitons. It is desirable that materials constituting the emission layer have an appropriate energy band gap so as to exhibit high emission properties and a desired emitting color. Materials constituting the emission layer may be composed of two kinds of materials having respective functions as a host and a dopant.

The host may include at least one of TPBi, TBADN, ADN (also referred to as "DNA"), CBP, CDBP, TCP, or mCP, as examples.

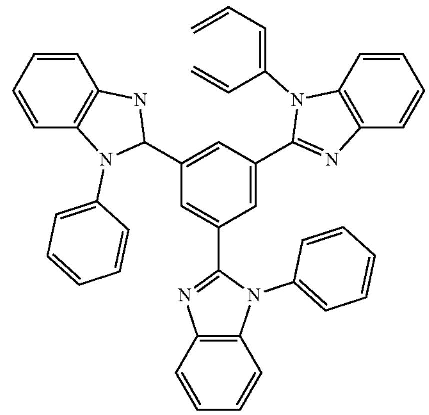

TPBI

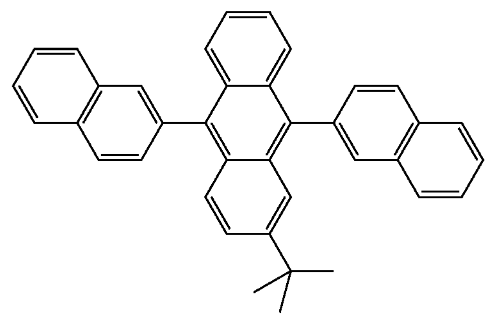

TBADN

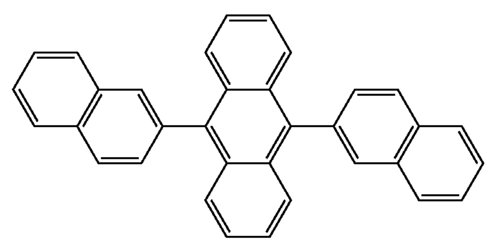

ADN

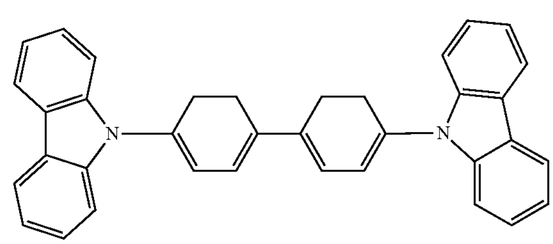

CBP

-continued

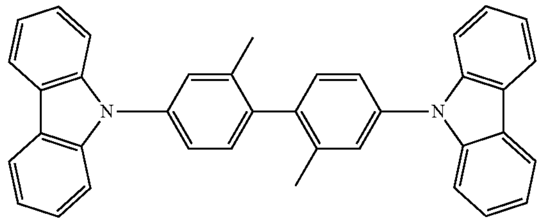

CDBP

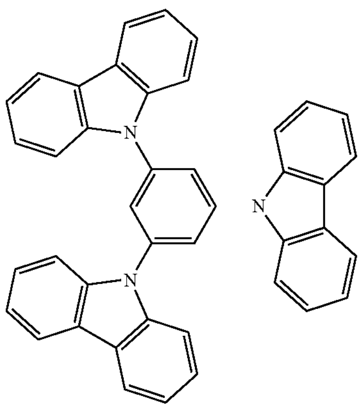

TCP

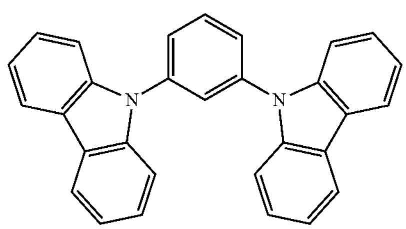

mCP

The dopant of an emission layer EML of an embodiment may be an organometallic compound represented by Formula 1. The amount of the dopant may be, for example, from about 0.01 to about 20%.

The electron transport region ETR is provided on the emission layer EML. The electron transport region ETR may include, for example at least one of a hole blocking layer, an electron transport layer ETL, or an electron injection layer EIL.

The electron transport region ETR may be in a form of a single layer formed using a single material, a single layer formed using a plurality of different materials, or a multi-layer structure having a plurality of layers formed using a plurality of different materials.

For example, the electron transport region ETR may have a single-layer structure of an electron injection layer EIL or an electron transport layer ETL, or a single-layer structure formed using an electron injection material and an electron transport material. In some implementations, the electron transport region ETR may have a single-layer structure having a plurality of different materials, or a structure laminated from the emission layer EML of electron transport layer ETL/electron injection layer EIL, or hole blocking layer/electron transport layer ETL/electron injection layer EIL. The thickness of the electron transport region ETR may be, for example, from about 1,000 Å to about 1,500 Å.

The electron transport region ETR may be formed using a suitable method such as a vacuum deposition method, a spin coating method, a cast method, a Langmuir-Blodgett (LB) method, an inkjet printing method, a laser printing method, or a laser induced thermal imaging (LITI) method.

When the electron transport region ETR includes an electron transport layer ETL, the electron transport region ETR may include an anthracene-based compound. The electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof.

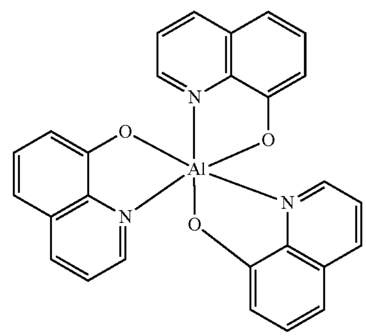

$Alq_3$

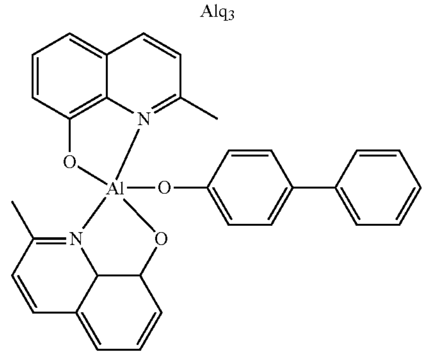

BAlq

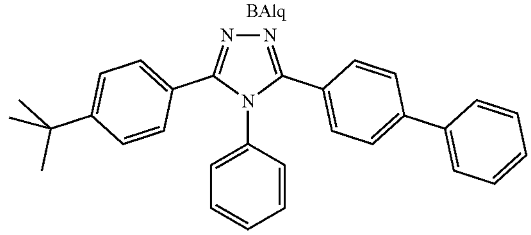

TAZ

-continued

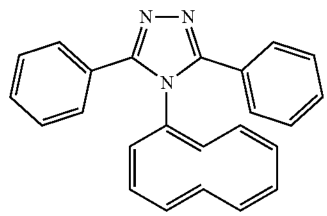

NTAZ

A material selected for the electron transport layer ETL may be a material providing fast electron mobility or a material providing slow electron mobility according to the structure of an organic electroluminescence device. Accordingly, various materials may be used for the electron transport layer ETL. In some implementations, the electron transport layer ETL may include a material doped with Liq or Li.

The thickness of the electron transport layer ETL may be from about 100 Å to about 1,000 Å, or, for example, from about 150 Å to about 500 Å. If the thickness of the electron transport layer ETL satisfies the above-described range, satisfactory electron transport properties may be obtained without a substantial increase of a driving voltage.

If the electron transport region ETR includes the electron injection layer EIL, the electron transport region ETR may include a metal material that facilitates electron injection. For example, the electron transport region ETR may include LiF, lithium quinolate (LiQ), $Li_2O$, BaO, NaCl, CsF, a metal in the lanthanide series such as Yb, or a metal halide such as RbCl or RbI. The electron injection layer EIL may be formed using a mixture material of an electron transport material and an insulating organo metal salt. The organo metal salt may be a material having an energy band gap of about 4 eV or more. For example, the organo metal salt may include a metal acetate, a metal benzoats, a metal acetoacetate, a metal acetylacetonate, or a metal stearate. The thickness of the electron injection layer EIL may be from about 1 Å to about 100 Å, or, for example, from 3 Å to about 90 Å. If the thickness of the electron injection layer EIL satisfies the above-described range, satisfactory electron injection properties may be obtained without a substantial increase of the driving voltage.

The electron transport region ETR may include a hole blocking layer as described above. The hole blocking layer may include, for example, 2,9-dimethyl-4,7-diphenyl-1,10-phenanthroline (BCP), 4,7-diphenyl-1,10-phenanthroline (Bphen), or Balq, as examples.

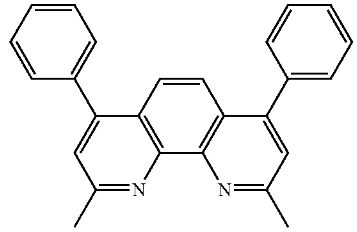

BCP

-continued

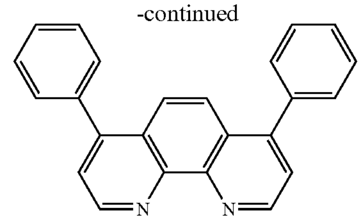

Bphen

The second electrode EL2 may be provided on the electron transport region ETR. The second electrode EL2 may be a common electrode or a cathode. The second electrode EL2 may be a transmissive electrode, a transflective electrode or a reflective electrode. The second electrode EL2 may include a metal having a relatively low work function, an electro conductive compound, an alloy, etc. in a combination different from the first electrode EL1.

When the second electrode EL2 is a transmissive electrode, the second electrode EL2 may include a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include lithium (Li), magnesium (Mg), aluminum (Al), aluminum-lithium (Al—Li), calcium (Ca), magnesium-indium (Mg—In), magnesium-silver (Mg—Ag), a compound including same, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO. ITZO, etc.

The transmittance and the material of the second electrode EL2 may be determined according to the light-emitting direction of an organic electroluminescence device. In a top emission type, transflective electrode materials and thicknesses may be selected so as to maximize a micro-resonance effect. In a bottom emission type, materials having high reflectivity may be selected.

The second electrode EL2 may be connected with an auxiliary electrode. When the second electrode EL2 is connected with the auxiliary electrode, the resistance of the second electrode EL2 may decrease.

In addition, an organic electroluminescence device may include a substrate. An electrode and an organic layer may be formed on the substrate. A hard or soft material may be used as a substrate material. For example, the hard material may include soda-lime glass, alkali-free glass, alumino silicate glass, etc. The soft material may include polycarbonate (PC), polyethersulfone (PES), cyclic olefin copolymer (COC), polyethylene terephthalate (PET), polyethylene naphthalate (PEN), etc.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, which emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

Hereinafter, an organometallic compound according to an embodiment will be explained.

An organometallic compound according to an embodiment may be represented by the following Formula 1:

[Formula 1]

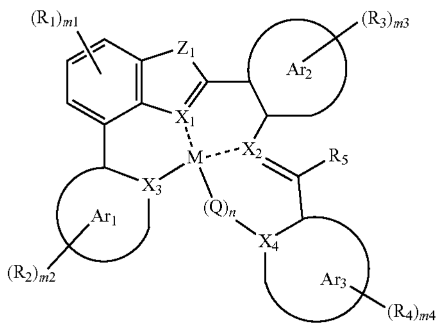

In Formula 1, M is a transition metal in period 1, a transition metal in period 2, or a transition metal in period 3, $Z_1$ is O, S or $NR_6$, Q is O, S or $CH_2$, n is 0 or 1, where if n is 0, M is combined with two C atoms and two N atoms.

In Formula 1, $X_1$, $X_2$, $X_3$ and $X_4$ are each independently N or C, $Ar_1$, $Ar_2$ and $Ar_3$ are each independently a substituted or unsubstituted aryl group having 6 to 30 ring carbon atoms, or a substituted or unsubstituted heteroaryl group having 2 to 30 ring carbon atoms.

In Formula 1, $R_1$, $R_2$, $R_3$, $R_4$, $R_5$ and $R_6$ are each independently a hydrogen atom, a deuterium atom, a halogen atom, a substituted or unsubstituted alkyl group having 1 to 20 carbon atoms, a substituted or unsubstituted hydrocarbon ring having 5 to 20 ring carbon atoms, a substituted or unsubstituted heteroalkyl group having 1 to 20 carbon atoms, an alkoxy group, an aryloxy group, a cyano group, an amino group, a substituted or unsubstituted silyl group, an alkenyl group, a heteroalkenyl group, an alkynyl group, an unsaturated hydrocarbon ring, a substituted or unsubstituted aryl group having 6 to 30 ring carbon atoms, a substituted or unsubstituted heteroaryl group having 2 to 30 ring carbon atoms, an acyl group, a carbonyl group, a carbonyl acid, a carbonyl ester, a nitrile group, an isonitrile group, a sulfanyl group, a sulfinyl group, a sulfonyl group, a phosphino group, a substituted or unsubstituted monovalent non aromatic condensed polycycle, or a substituted or unsubstituted monovalent non aromatic condensed heteropolycycle, or may be combined with an adjacent group to form a ring, and $m_1$ to $m_4$ are each independently an integer of 0 to 4.

In Formula 1, M may be osmium (Os), iridium (Ir), or platinum (Pt).

In Formula 1, M may be platinum (Pt).

In Formula 1, $Ar_1$ to $Ar_3$ may each independently be phenyl, naphthyl, pyridine, pyrimidine, pyrazine, pyridazine, quinoline, isoquinoline, furan, thiophene, pyrrole, benzofuran, benzothiophene, phenanthryl, phenanthridine, indole, or indazole.

Formula 1 may be represented by one of Formula 1-1 to Formula 1-3 below, as examples.

[Formula 1-1]

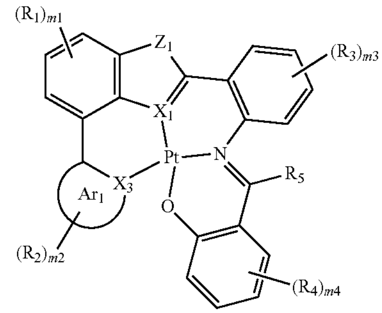

[Formula 1-2]

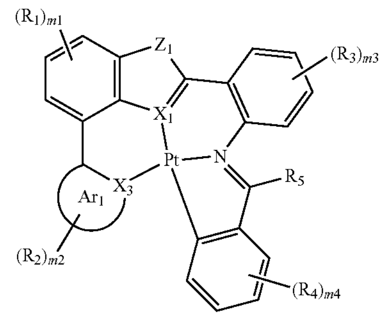

[Formula 1-3]

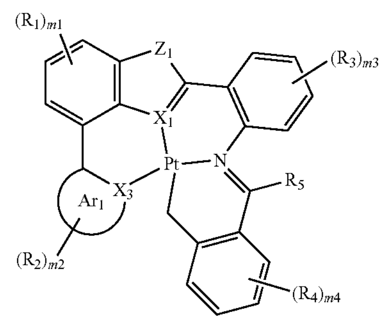

In Formula 1-1 to Formula 1-3, $X_1$ and $X_3$ are each independently N or C, and $Z_1$, $Ar_1$, $R_1$ to $R_5$, and $m_1$ to $m_4$ are the same as described above. In Formula 1-2, Pt may be combined with two C atoms and two N atoms.

In Formulae 1-1 to 1-3, $R_1$, $R_2$, $R_3$, $R_4$ and $R_5$ may be each independently a hydrogen atom, a deuterium atom, a halogen atom, a substituted or unsubstituted alkyl group having 1 to 20 carbon atoms, a substituted or unsubstituted heteroalkyl group having 1 to 20 carbon atoms, a substituted or unsubstituted silyl group, a substituted or unsubstituted aryl group having 6 to 30 ring carbon atoms, a substituted or unsubstituted heteroaryl group having 2 to 30 ring carbon atoms, without limitation.

Formula 1 may be represented by one of Formulae 2-1 to 2-30 below, as examples.

2-1
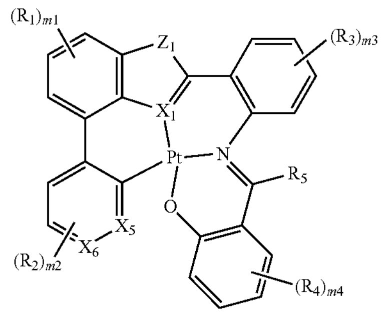
2-2
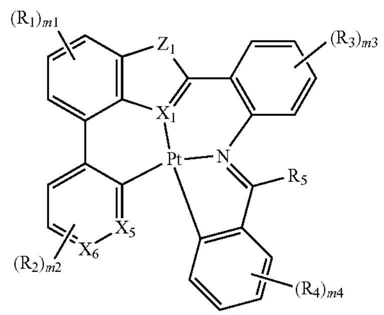
2-3
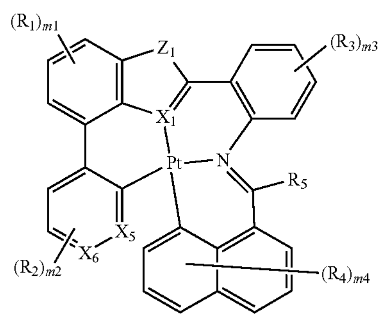
2-4
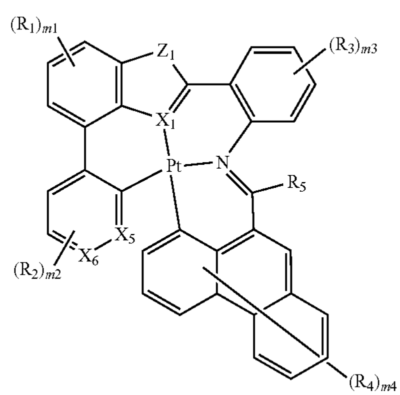
2-5
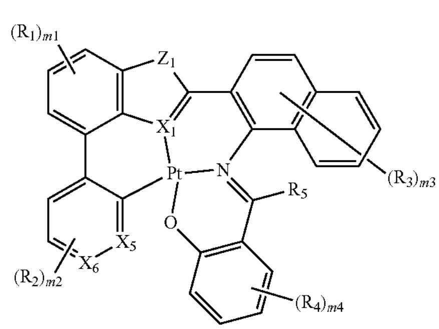
-continued
2-6
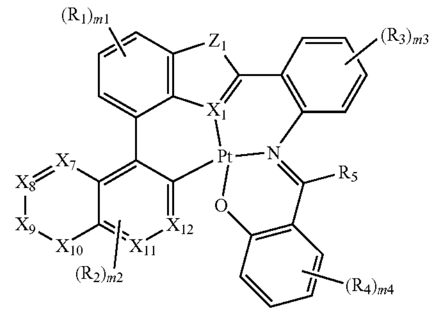
2-7
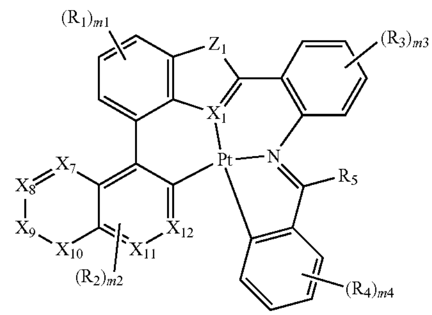
2-8
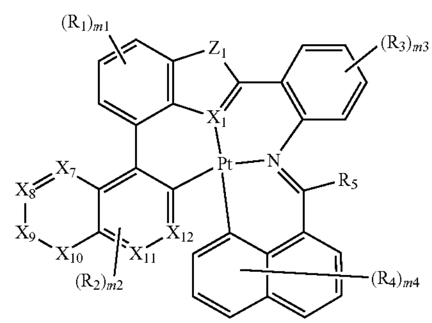
2-9
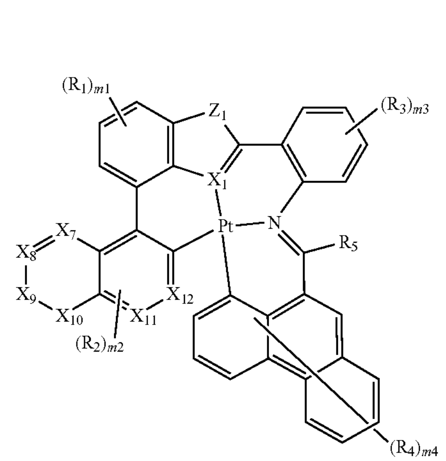

-continued
2-10
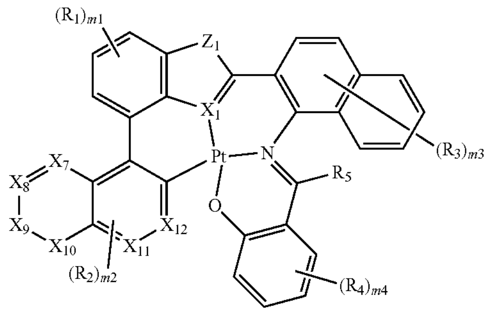
2-11
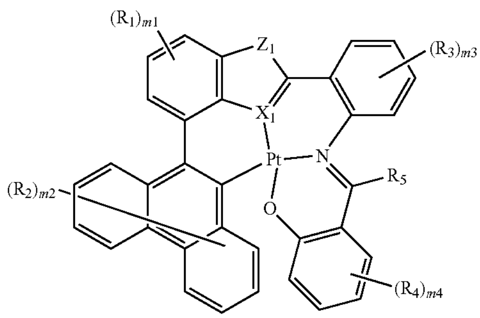
2-12
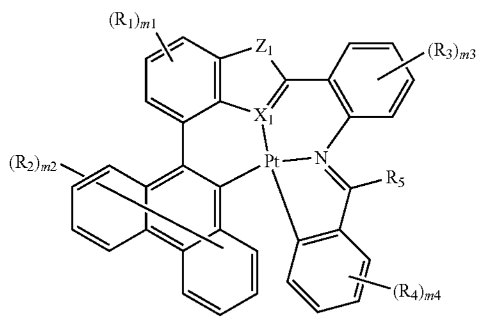
2-13
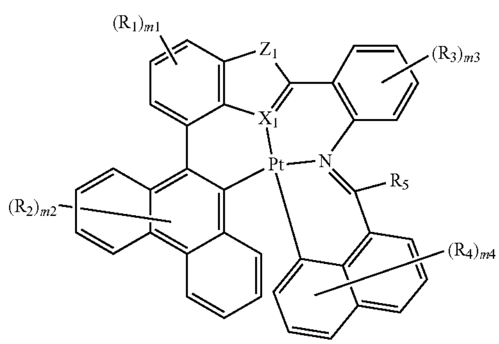
2-14
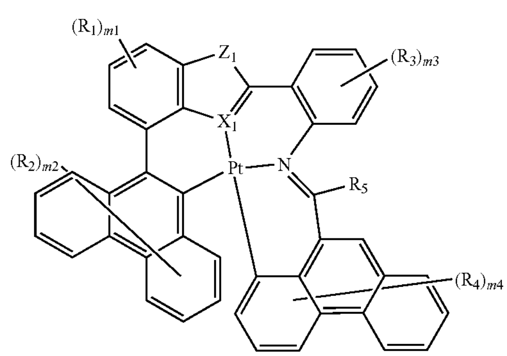
-continued
2-15
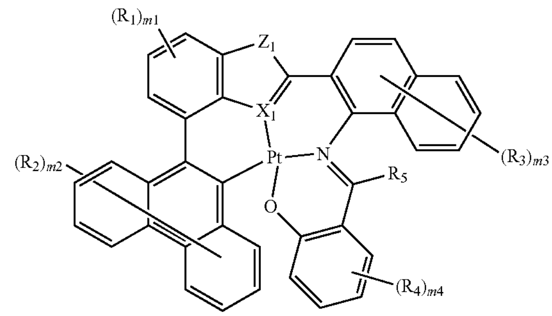
2-16
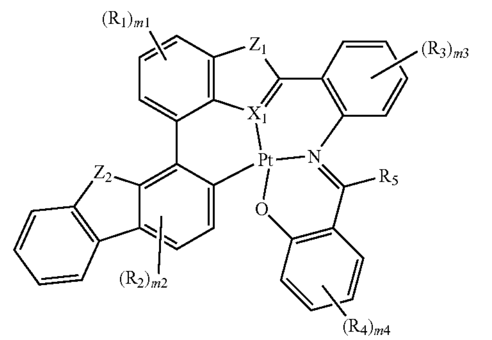
2-17
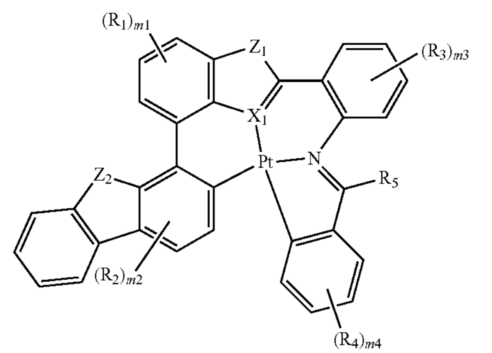
2-18
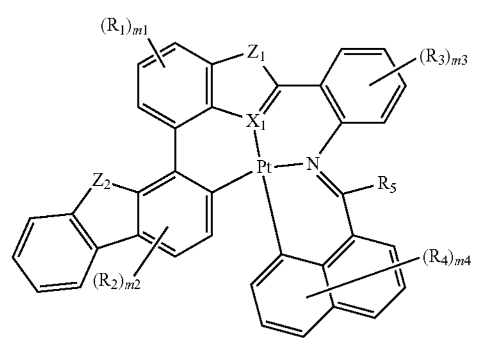

-continued
2-19
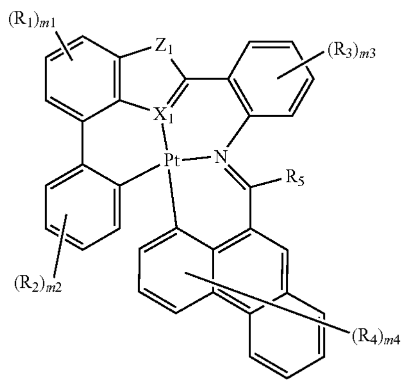
2-20
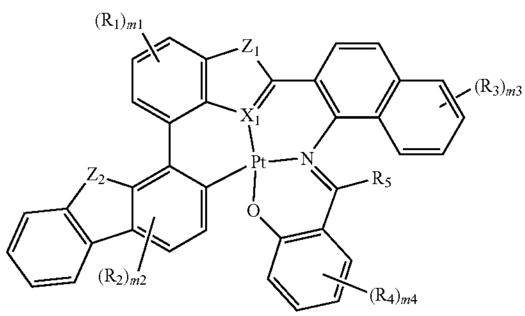
2-21
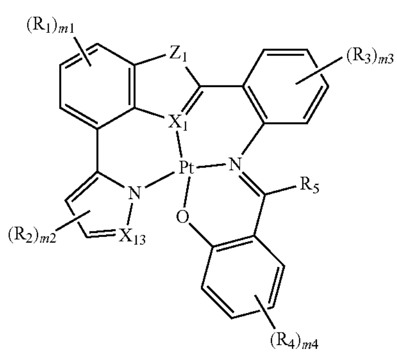
2-22
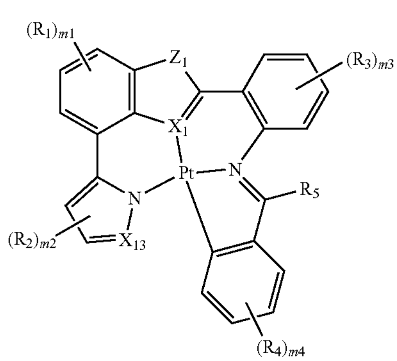
-continued
2-23
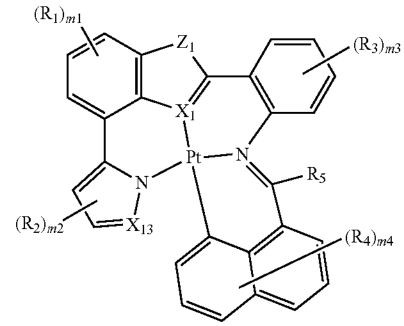
2-24
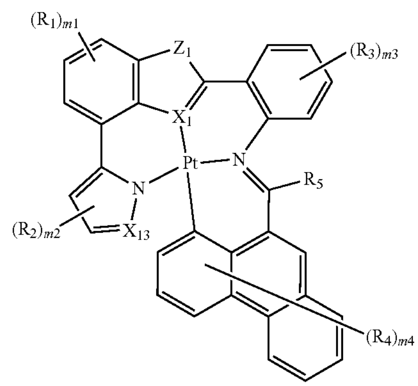
2-25
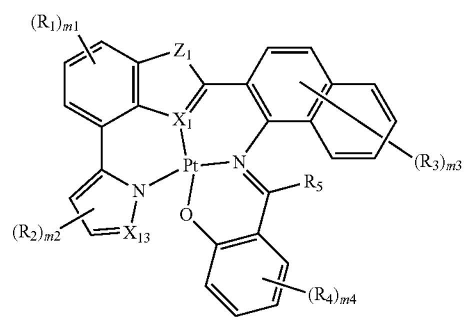
2-26
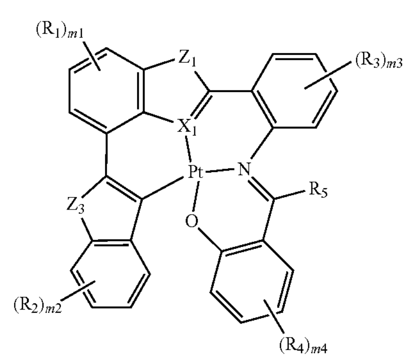

-continued 2-27

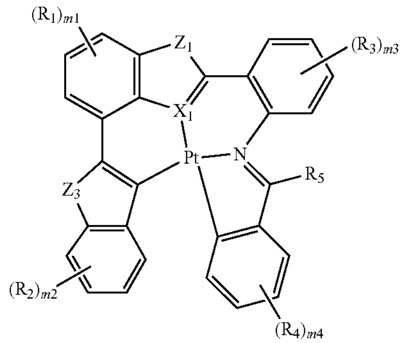

2-28

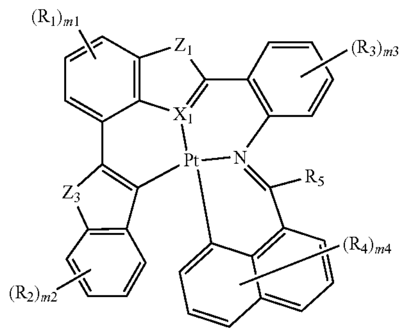

2-29

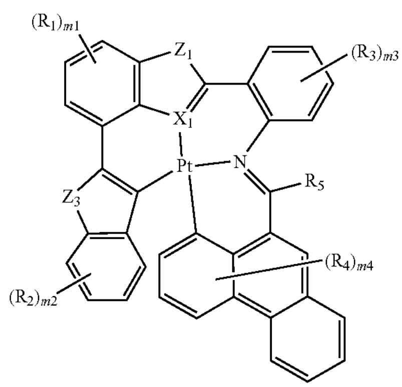

2-30

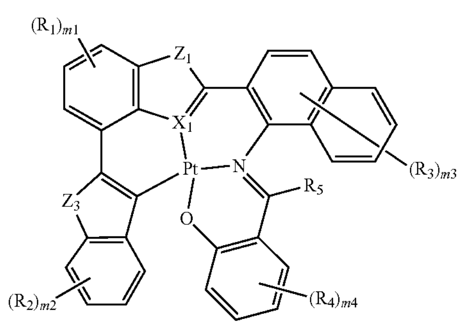

In Formulae 2-1 to 2-30, $X_5$ to $X_3$ may each independently be N or CH, $Z_1$, $Z_2$ and $Z_3$ may each independently be O or S, and $X_1$, $R_1$ to $R_5$, and $m_1$ to $m_4$ are the same as described above.

In Formulae 2-1 to 2-30, $R_1$ to $R_5$ may each independently be hydrogen, deuterium, a fluorine atom, a cyano group, a methyl group, an isopropyl group, an isobutyl group, a t-butyl group, a trimethylsilyl group, a triphenylsilyl group, a trifluoromethyl group, a substituted or unsubstituted phenyl group, a substituted or unsubstituted naphthyl group, a substituted or unsubstituted phenanthryl group, a substituted or unsubstituted dibenzothiophene group, or a substituted or unsubstituted dibenzofuran group, as examples.

The organometallic compound represented by Formula 1 according to an embodiment may be one selected from the compounds represented in Compound Groups 3 to 5, as examples Compound Group 3

3-1

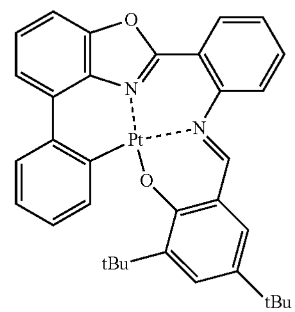

3-2

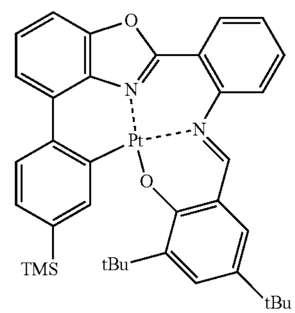

3-3

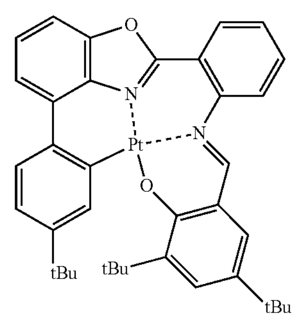

3-4

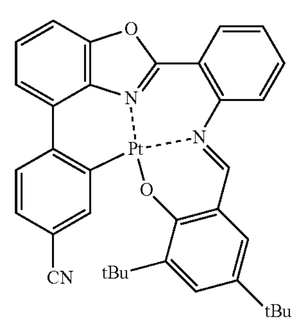

-continued
3-5
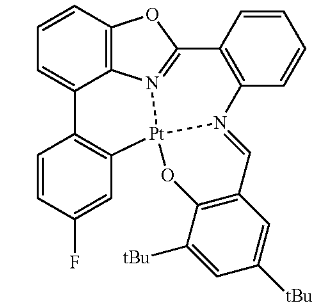
3-6
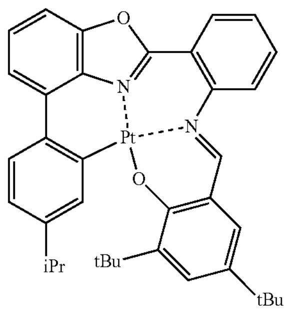
3-7
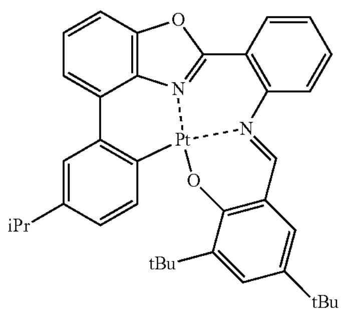
3-8
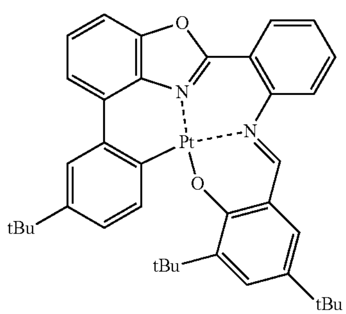
3-9
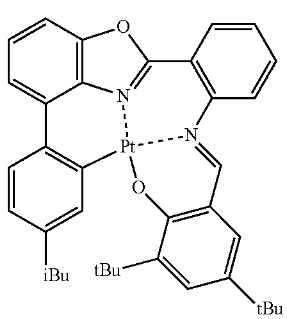
-continued
3-10
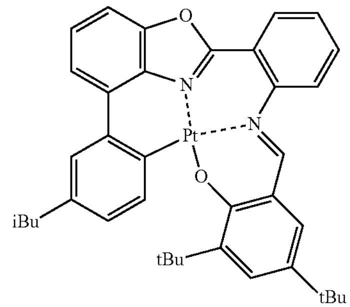
3-11
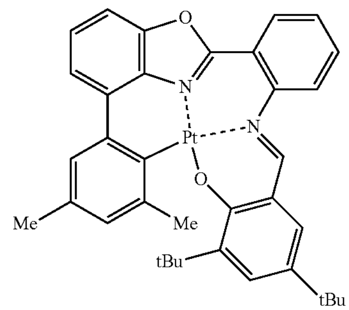
3-12
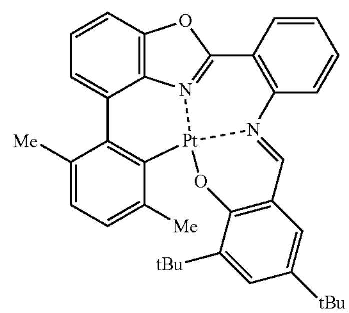
3-13
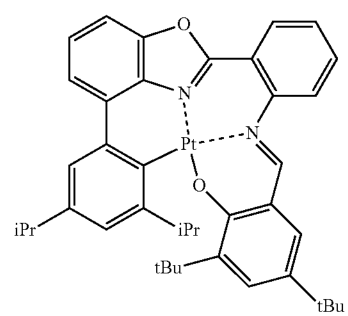
3-14
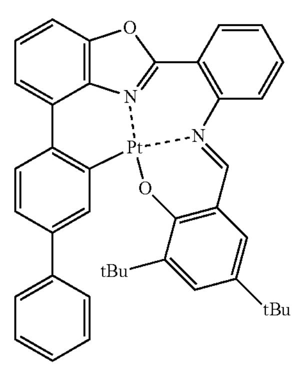

3-15
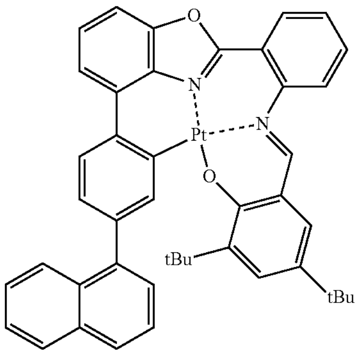
3-16
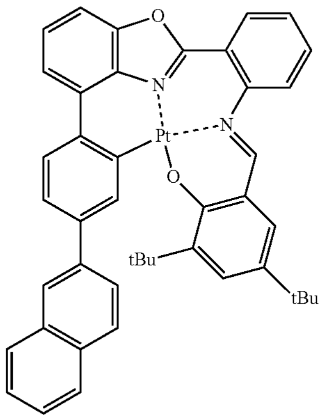
3-17
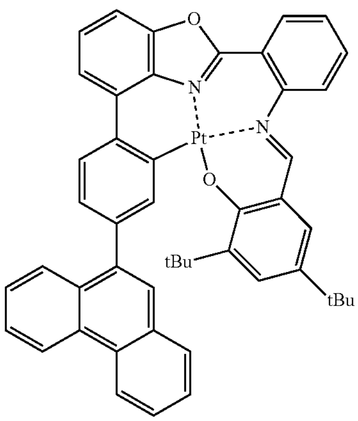
3-18
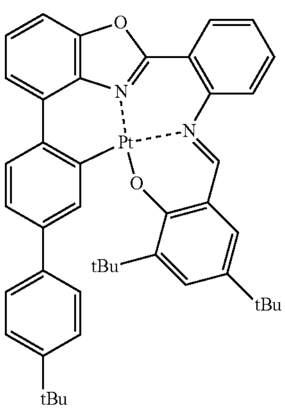
3-19
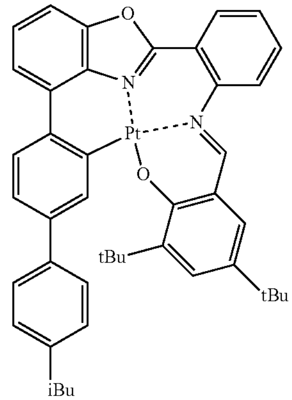
3-20
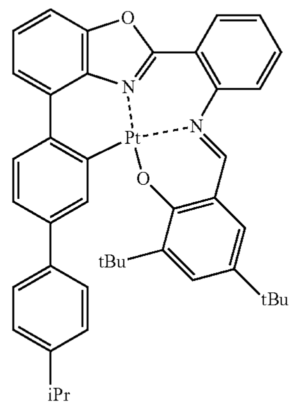
3-21
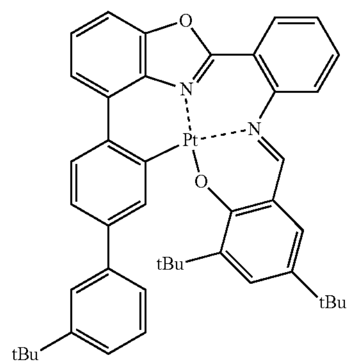
3-22
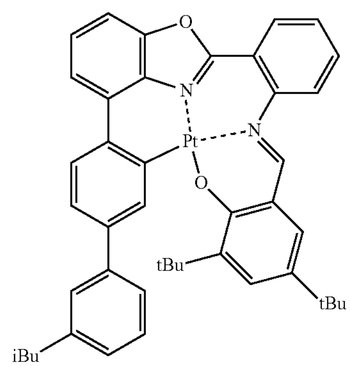

3-23
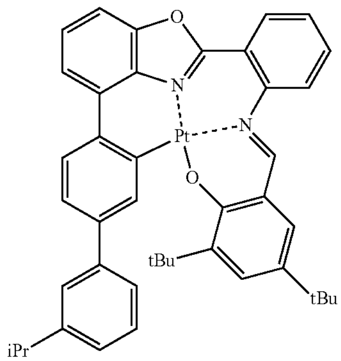
3-24
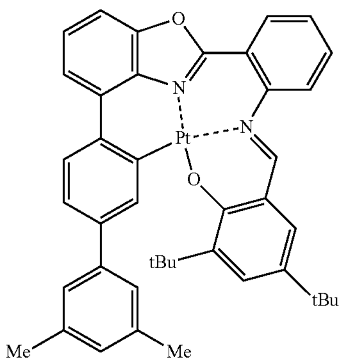
3-25
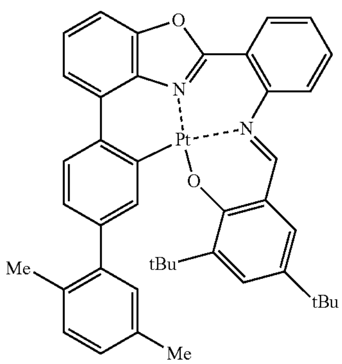
3-26
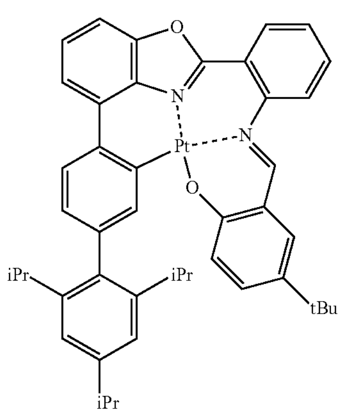
3-27
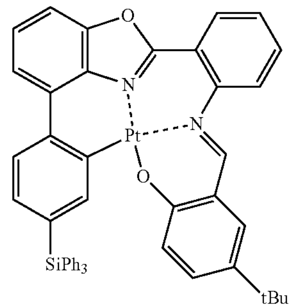
3-28
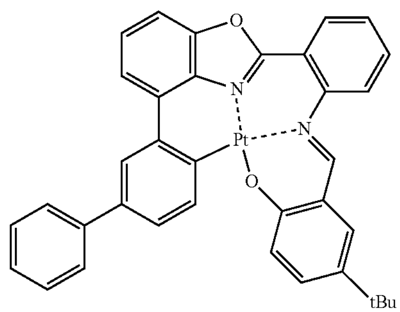
3-29
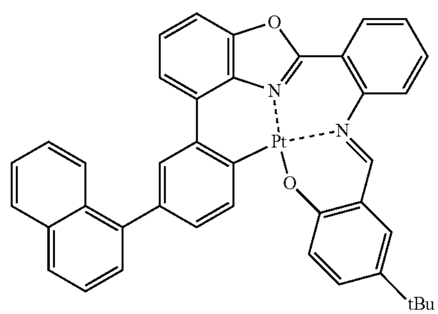
3-30
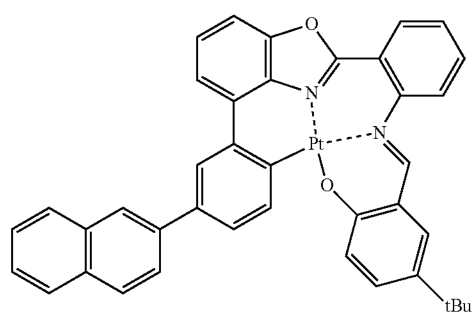
3-31
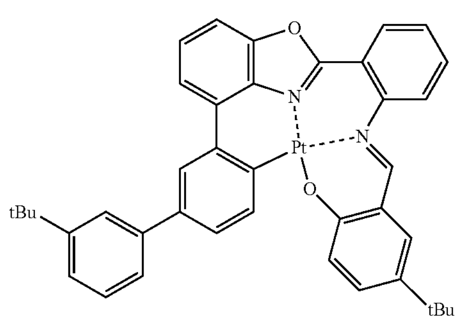

-continued
3-32
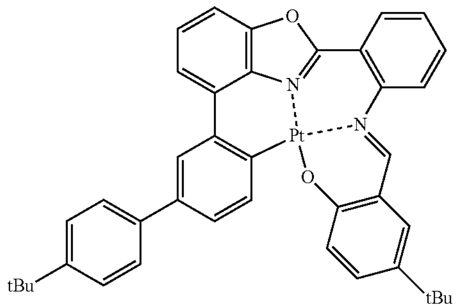
3-33
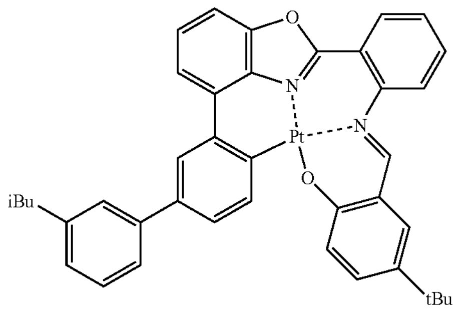
3-34
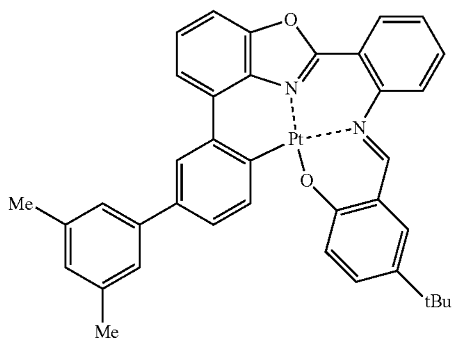
3-35
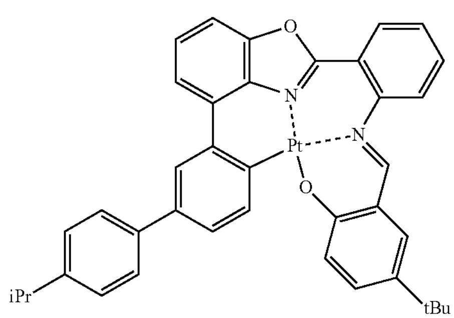
3-36
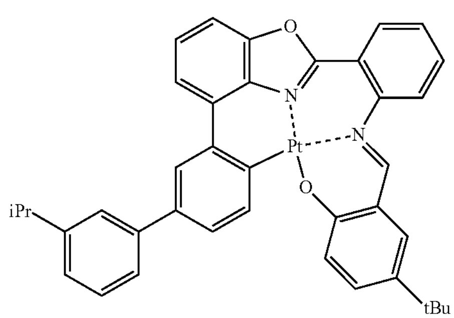
-continued
3-37
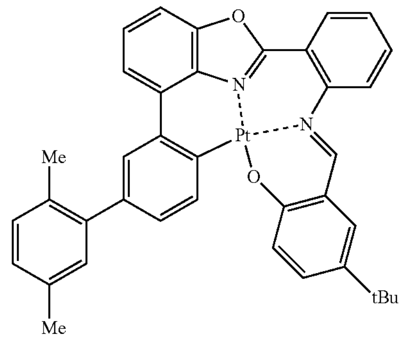
3-38
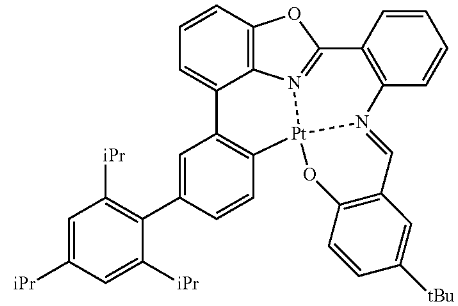
3-39
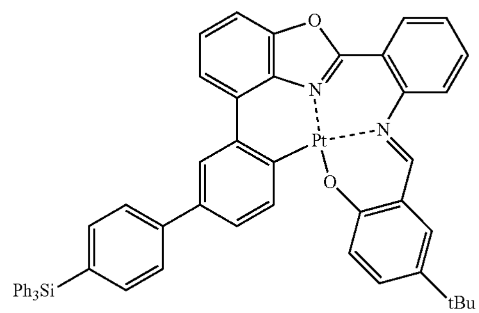
3-40
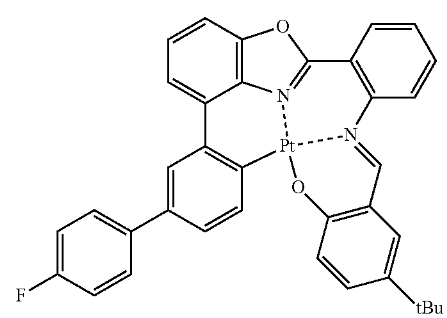
3-41
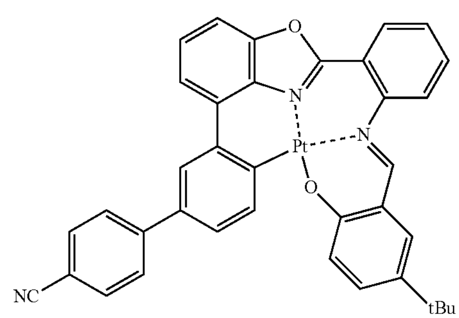

-continued
3-42
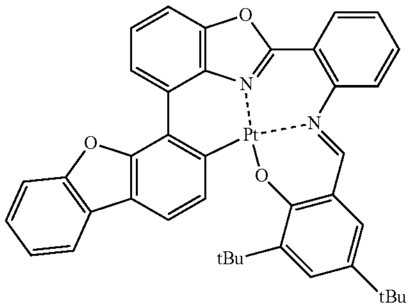
3-43
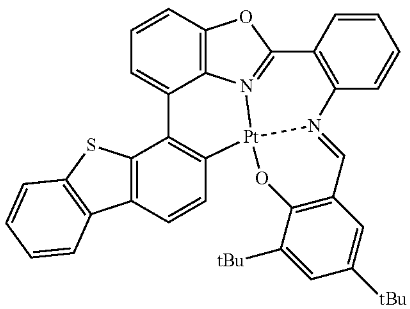
3-44
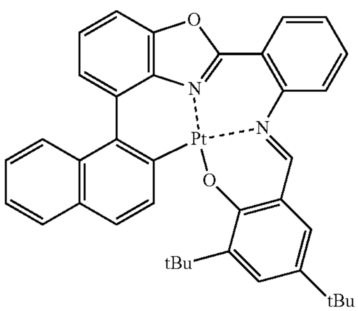
3-45
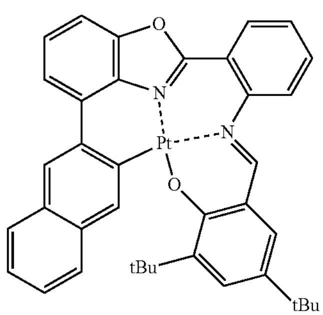
3-46
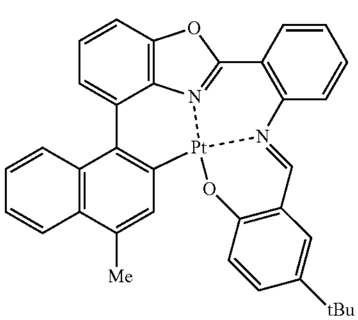
-continued
3-47
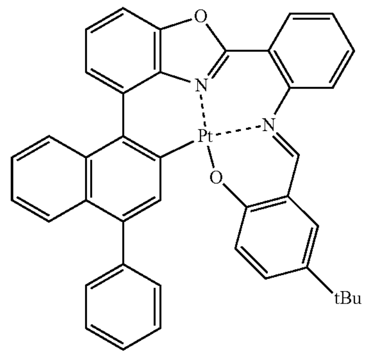
3-48
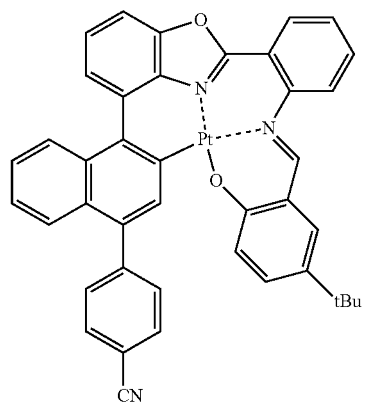
3-49
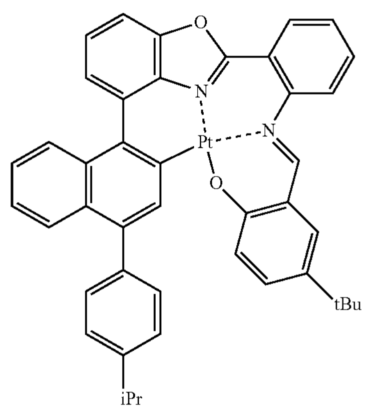
3-50
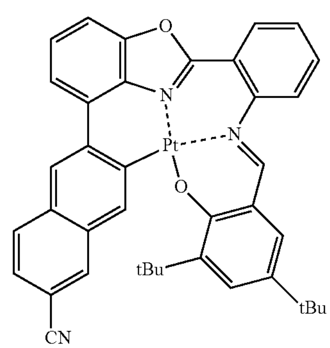

-continued
3-51
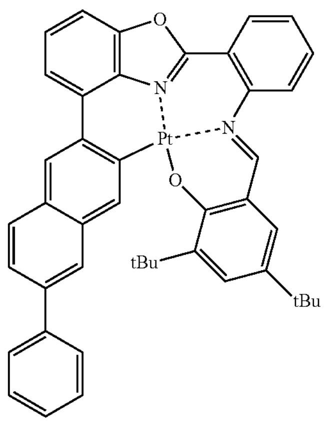
3-52
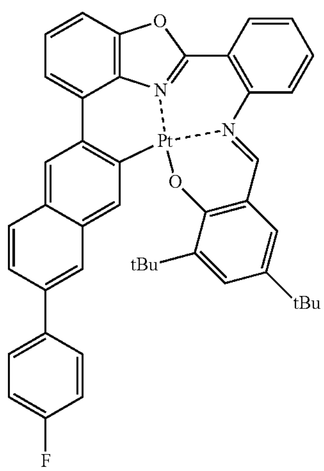
3-53
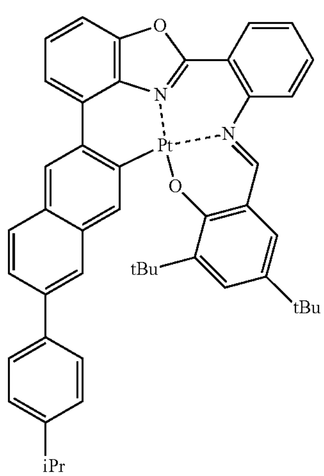
-continued
3-54
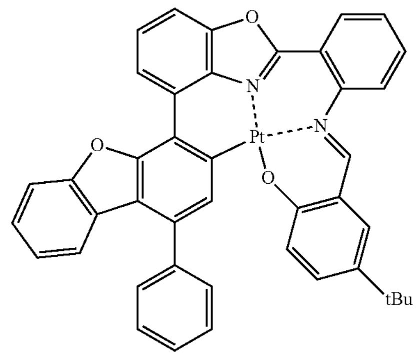
3-55
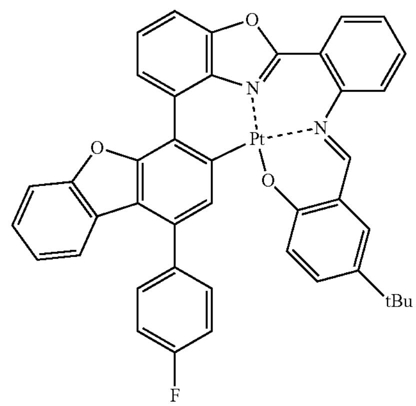
3-56
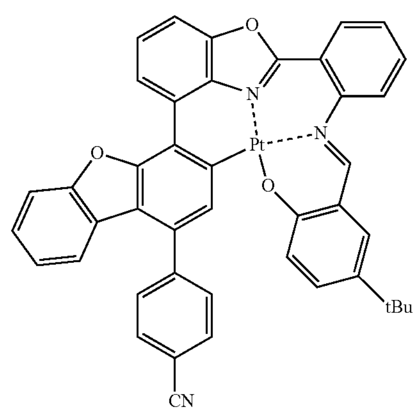
3-57
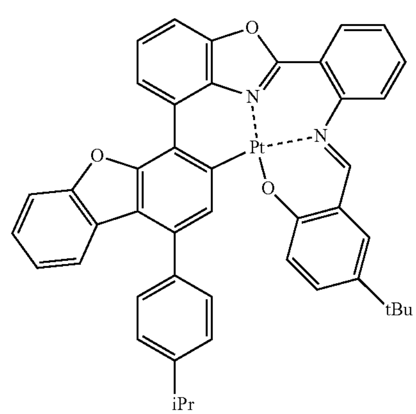

3-58
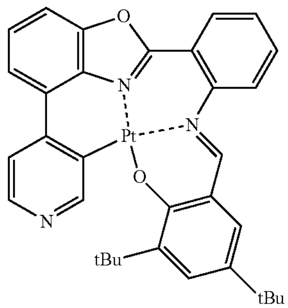
3-59
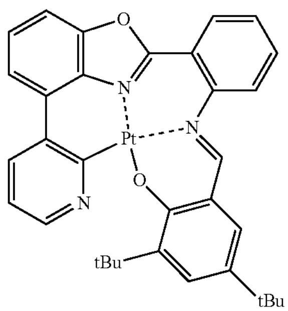
3-60
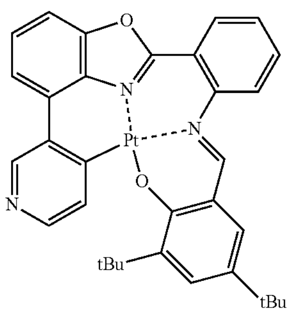
3-61
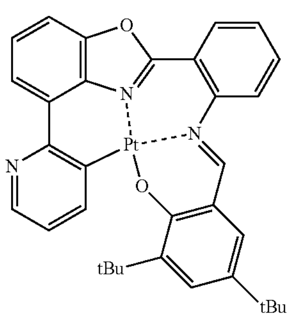
3-62
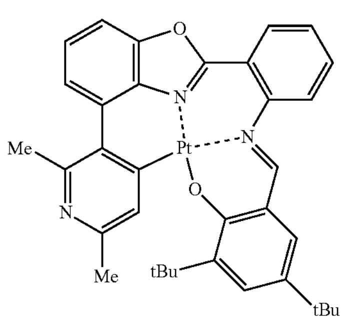
3-63
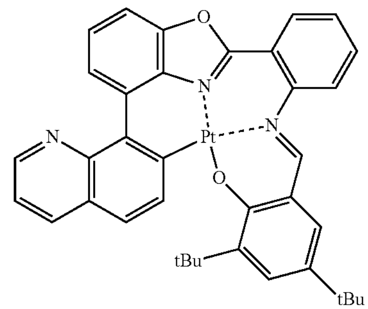
3-64
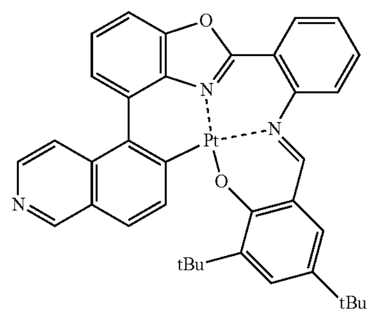
3-65
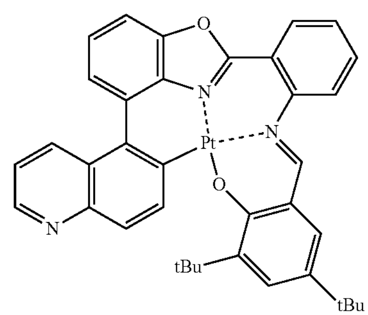
3-66
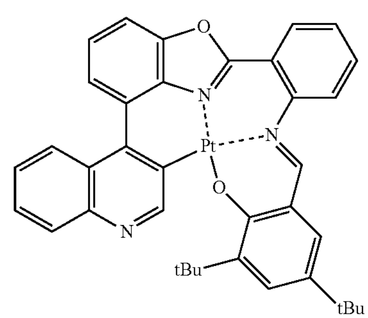
3-67
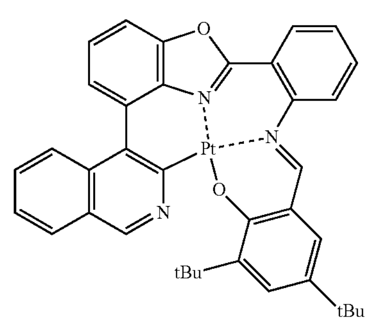

-continued
3-68
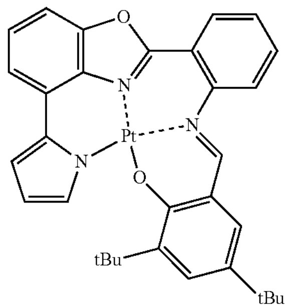
3-69
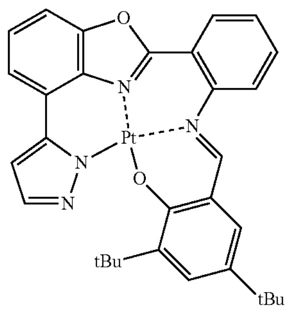
3-70
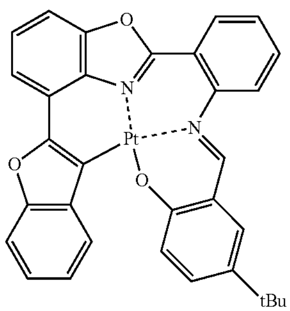
3-71
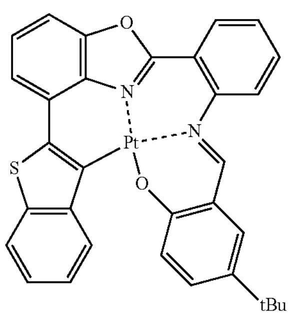
3-72
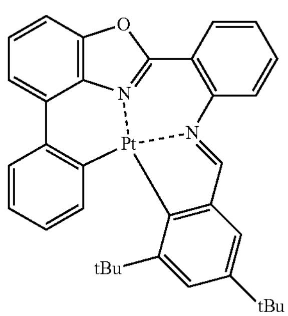
-continued
3-73
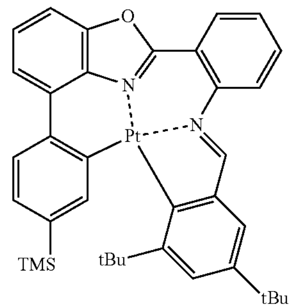
3-74
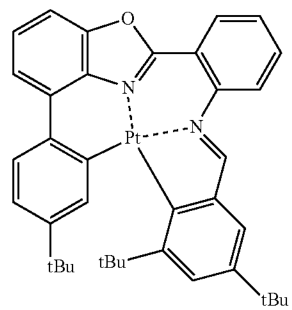
3-75
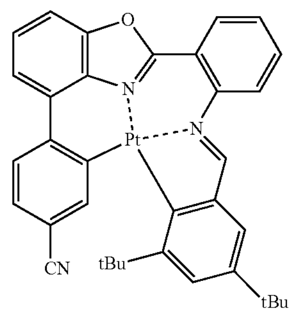
3-76
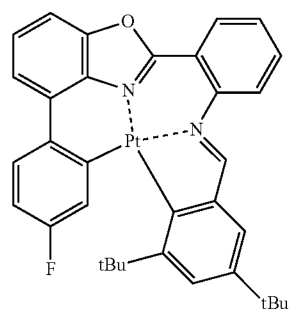
3-82
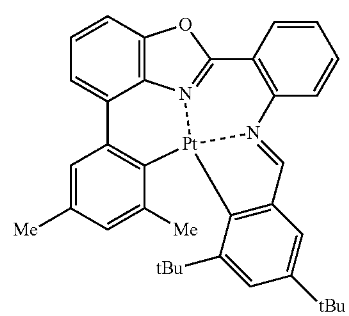

-continued
3-83
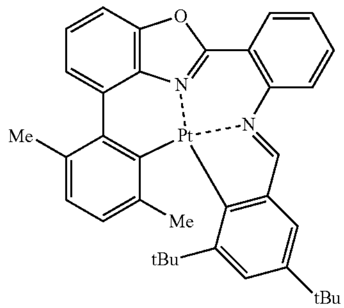
3-84
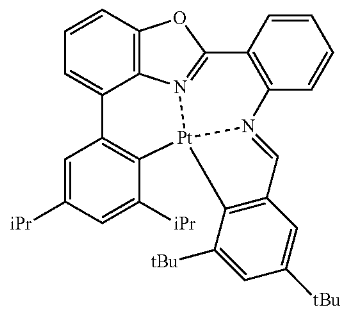
3-85
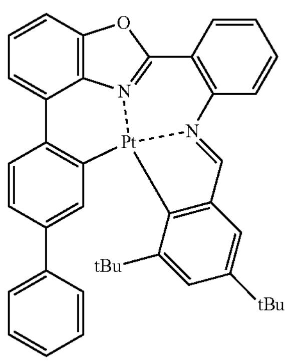
3-86
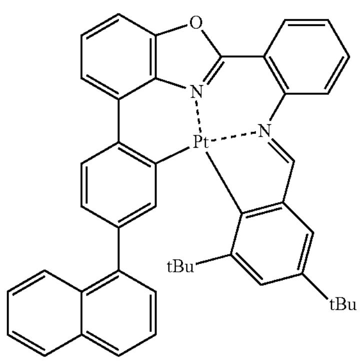
-continued
3-87
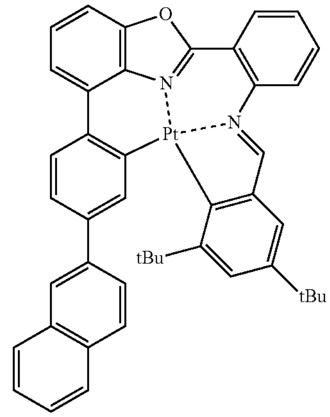
3-88
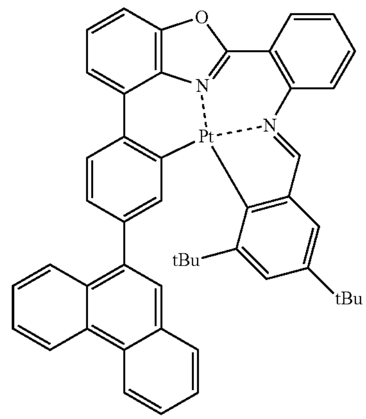
3-89
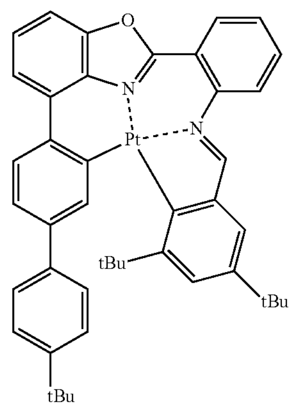
3-90
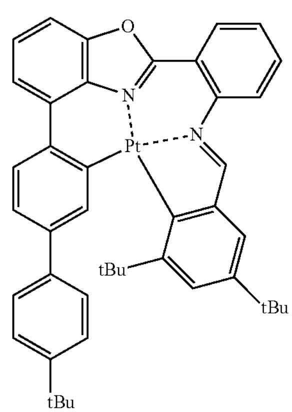

-continued
3-91
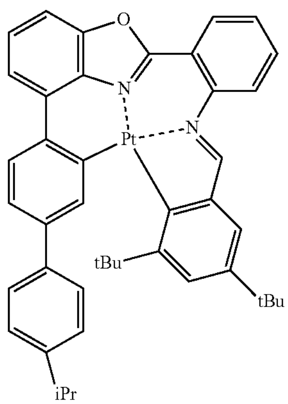
3-92
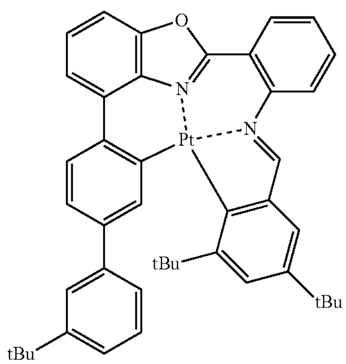
3-93
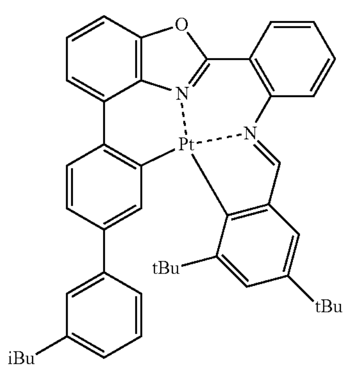
3-94
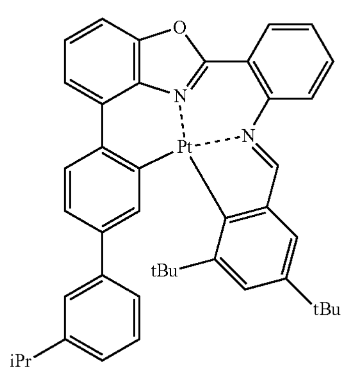
-continued
3-95
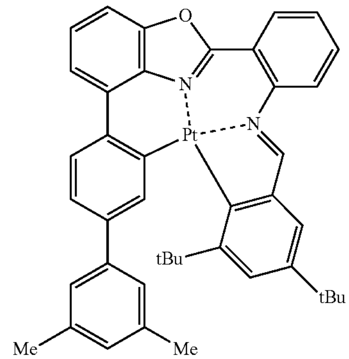
3-96
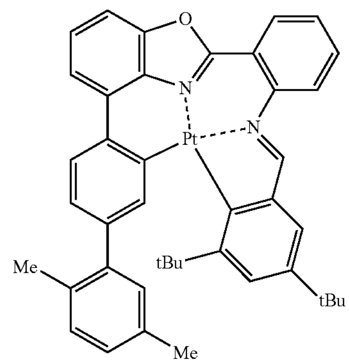
3-97
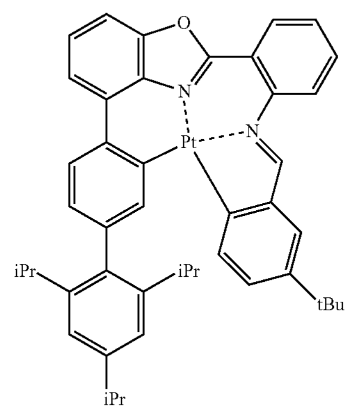
3-98
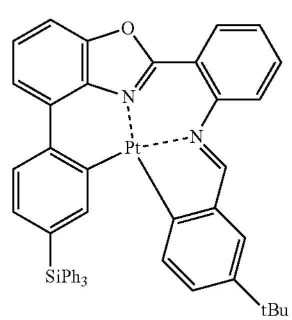

-continued
3-99
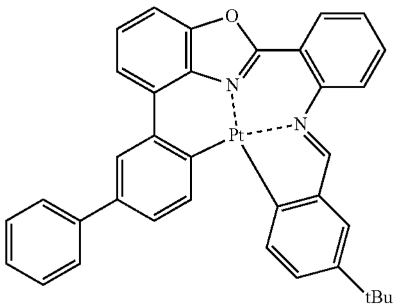
3-100
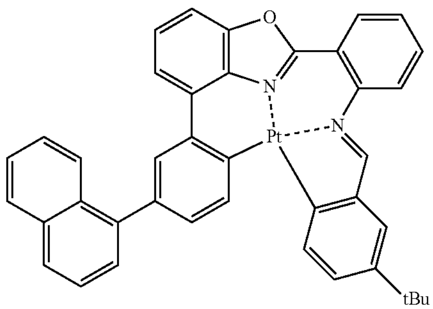
3-101
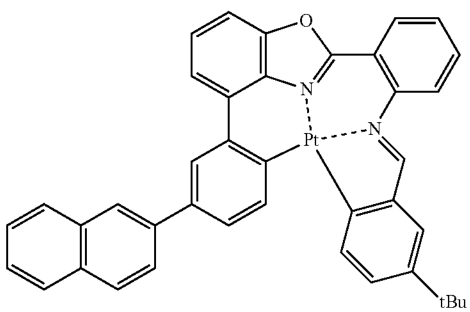
3-102
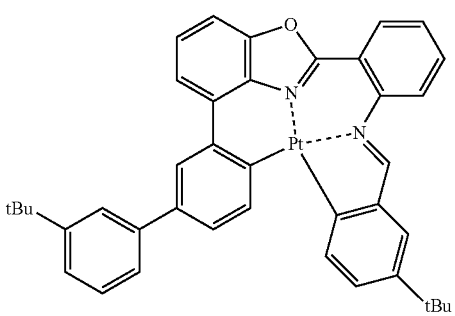
3-103
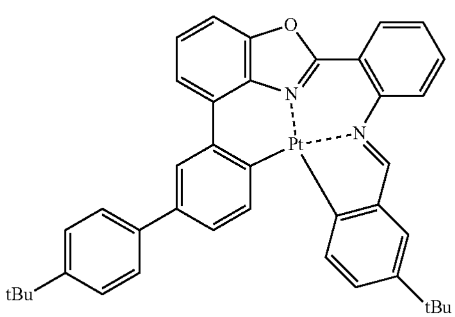
-continued
3-104
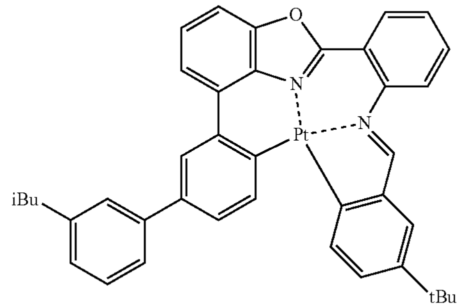
3-105
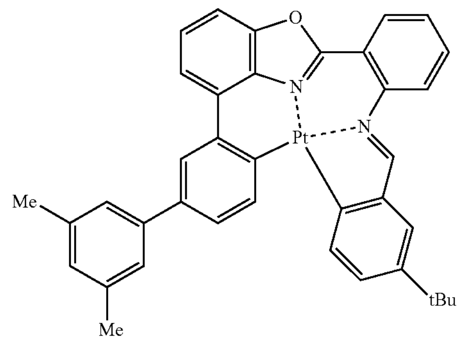
3-106
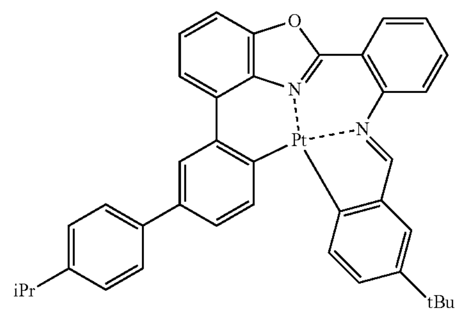
3-107
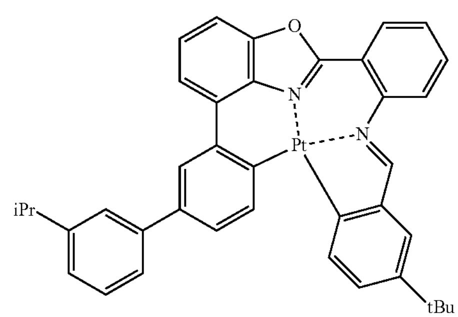
3-108
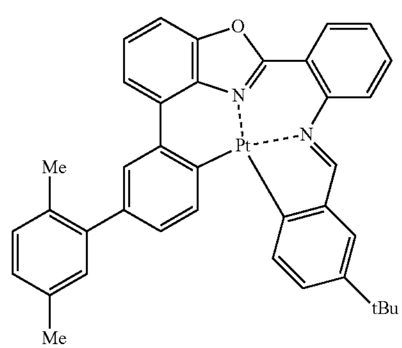

-continued
3-109
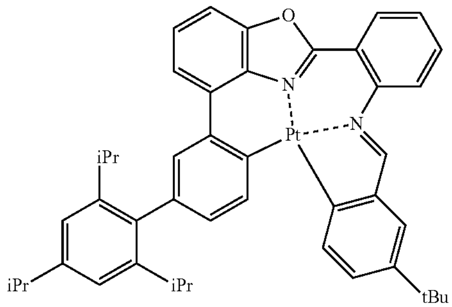
3-110
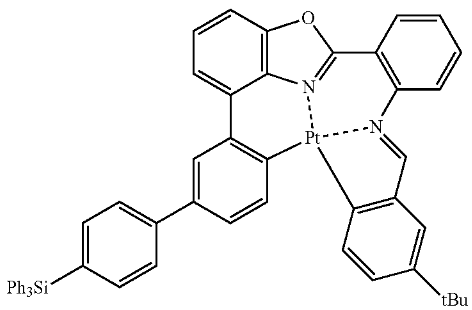
3-111
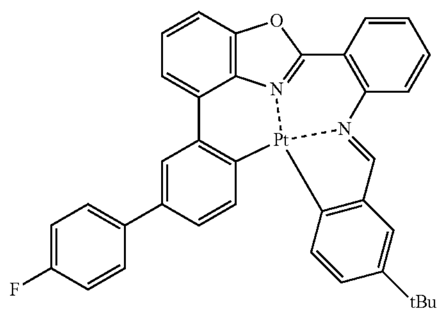
3-112
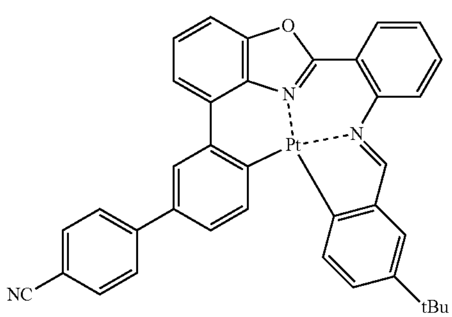
3-113
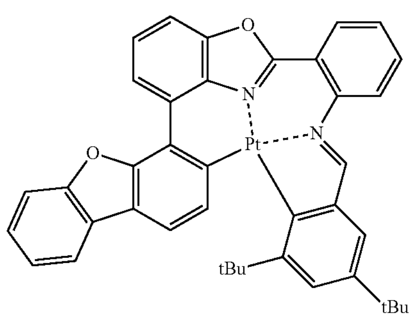
-continued
3-114
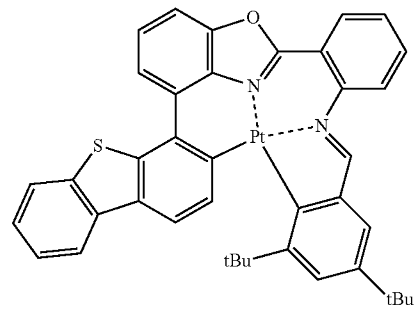
3-115
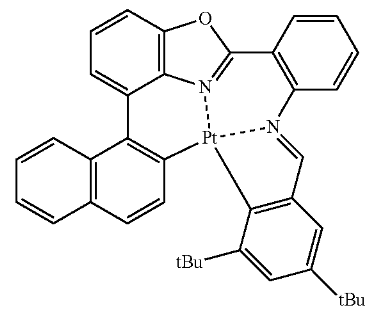
3-116
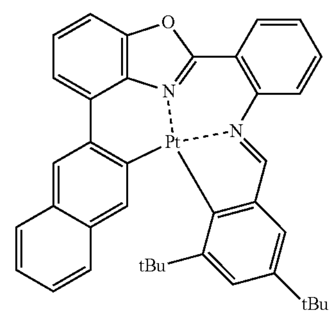
3-117
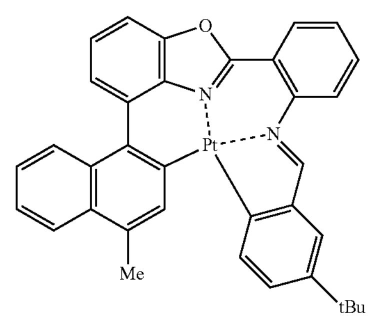
3-118
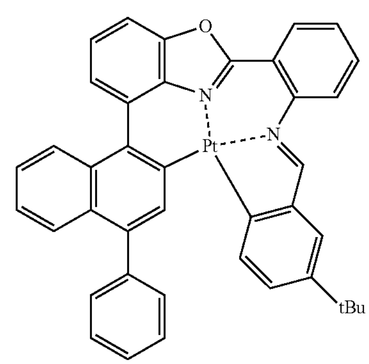

3-119
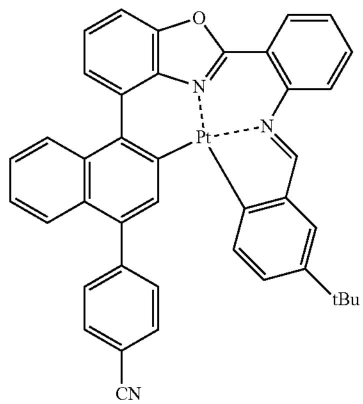
3-120
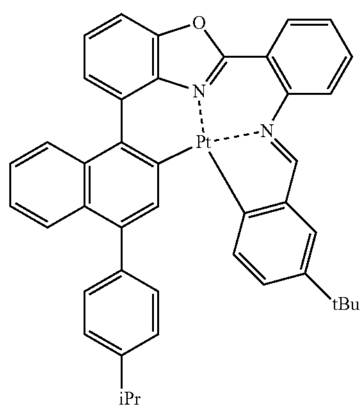
3-121
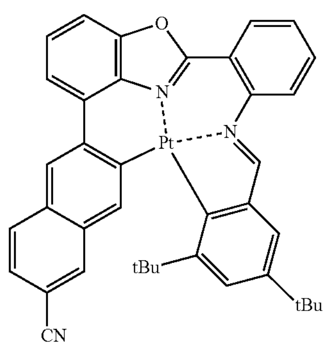
3-122
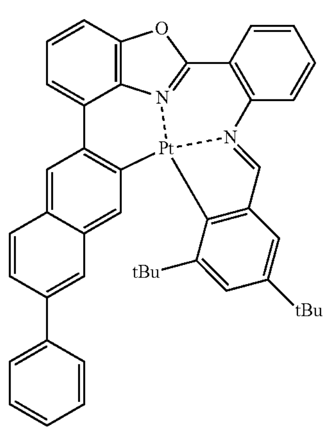
3-123
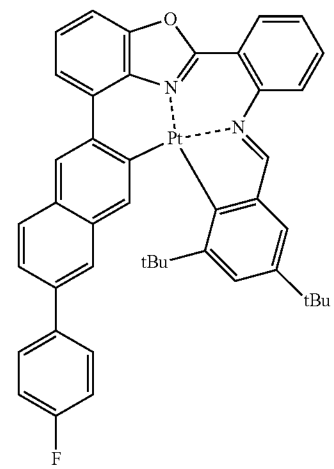
3-124
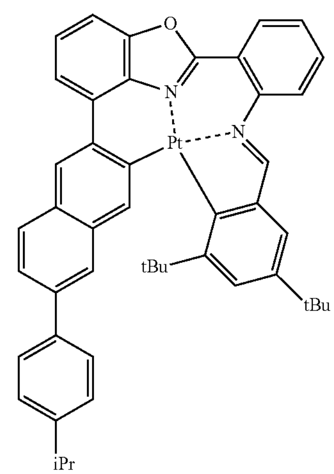
3-125
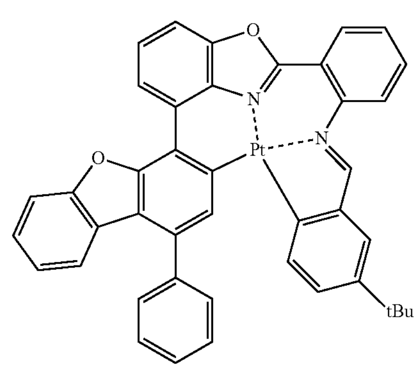

-continued
3-126
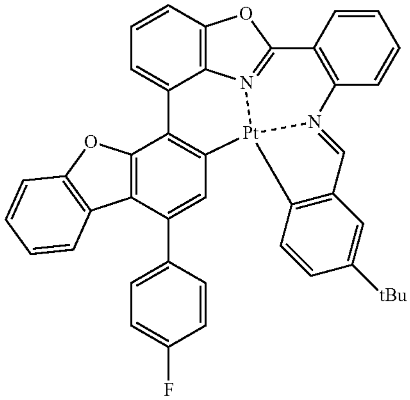
3-127
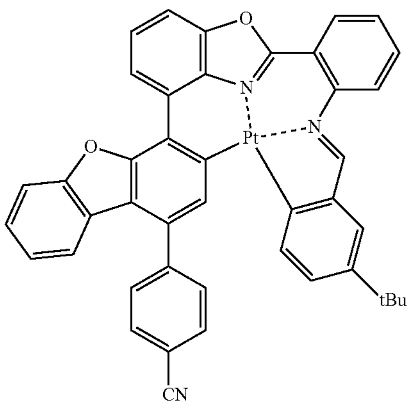
3-128
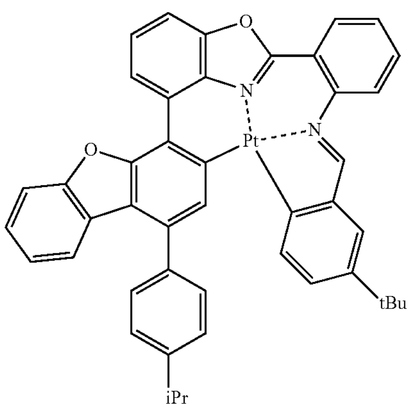
3-129
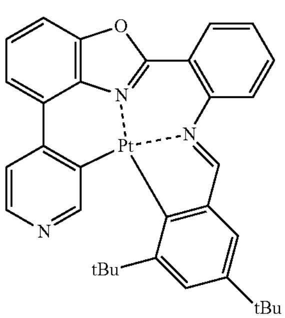
-continued
3-130
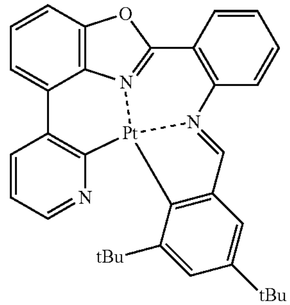
3-131
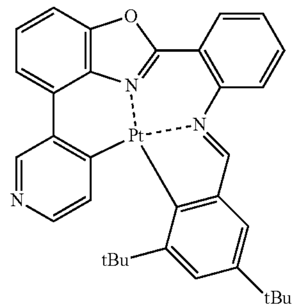
3-132
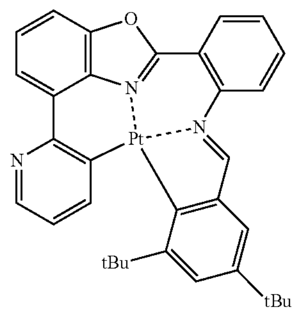
3-133
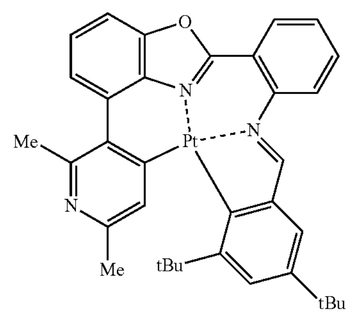
3-134
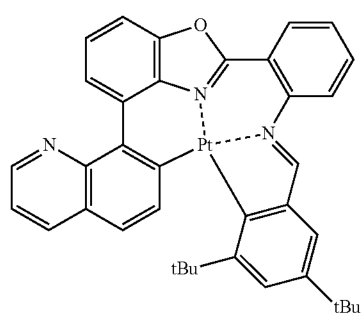

3-135
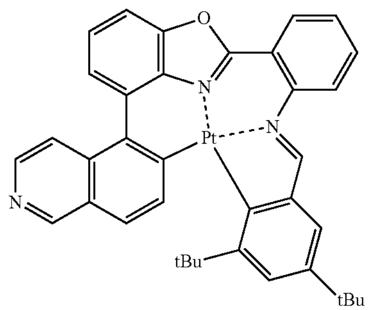
3-136
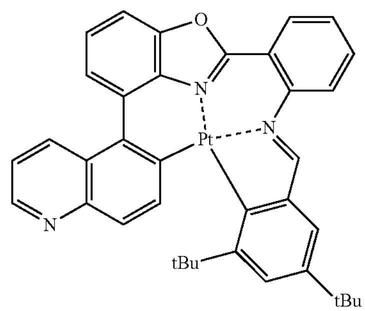
3-137
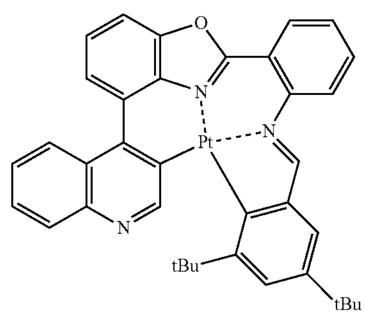
3-138
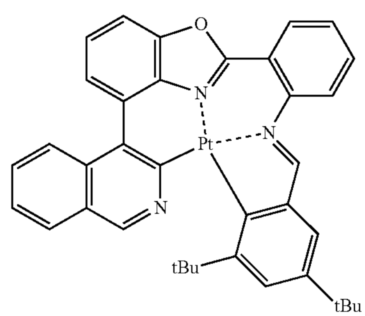
3-139
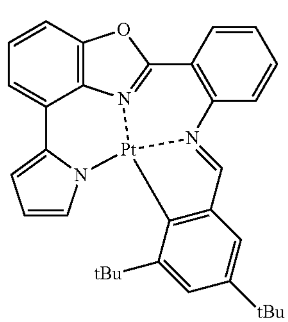
3-140
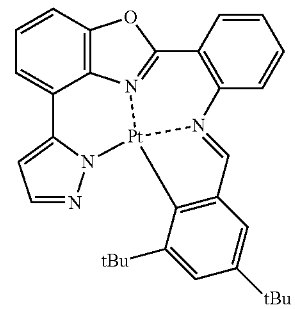
3-141
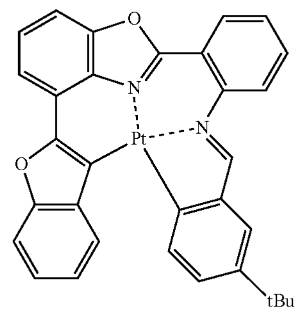
3-142
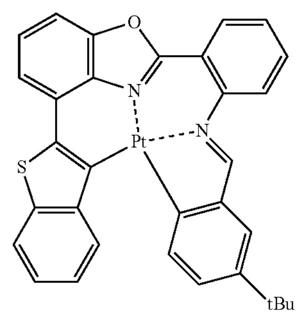
3-143
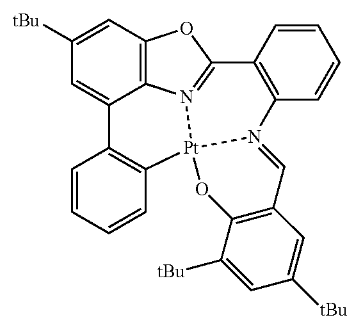
3-144
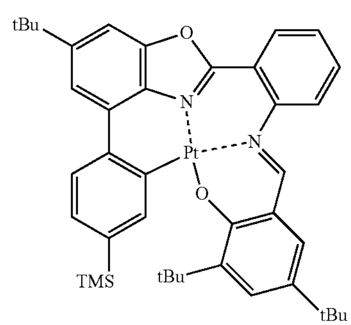

-continued
3-145
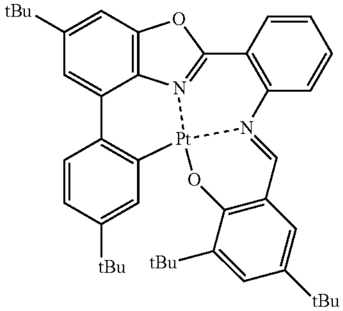
3-146
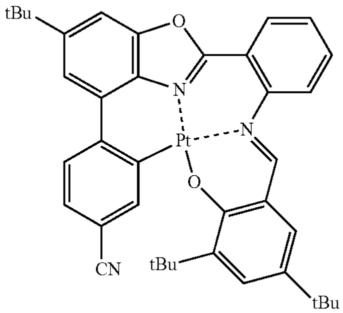
3-147
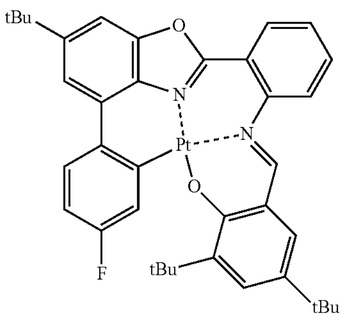
3-148
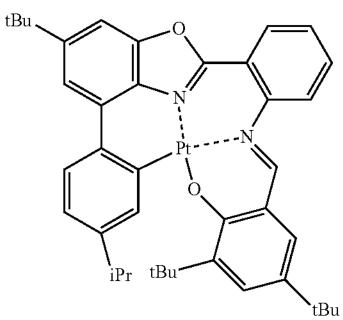
3-149
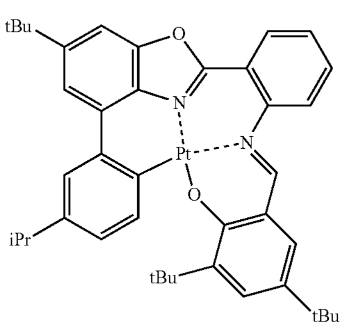
-continued
3-150
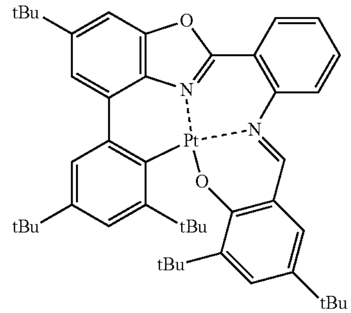
3-151
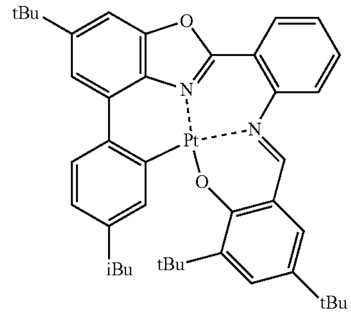
3-152
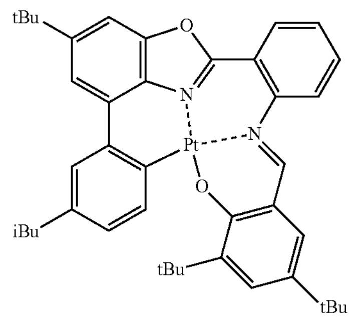
3-153
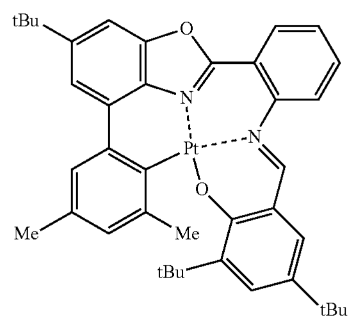
3-154
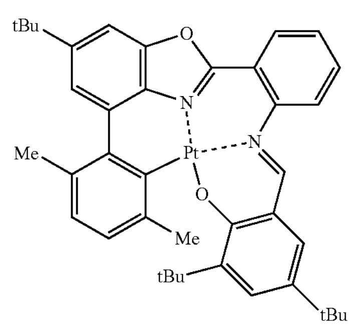

3-155
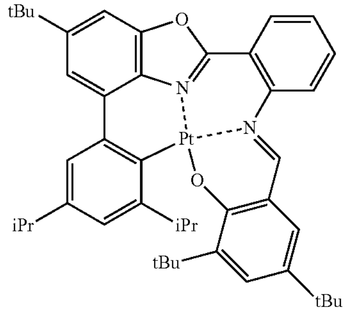
3-156
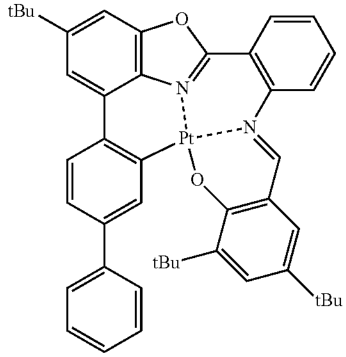
3-157
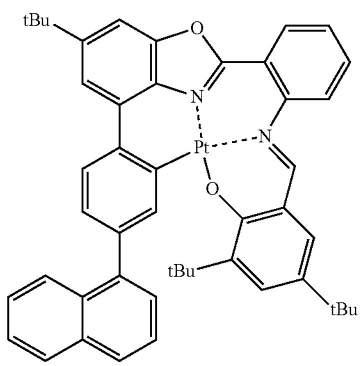
3-158
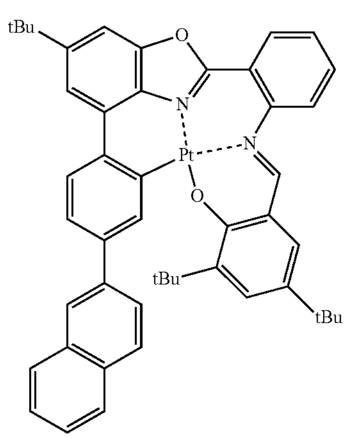
3-159
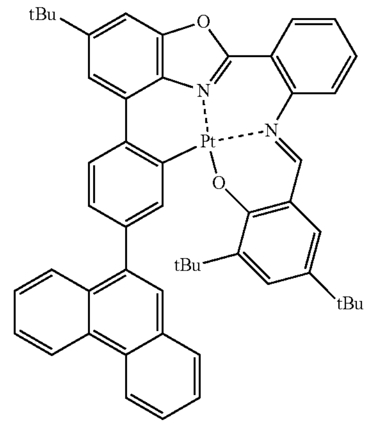
3-160
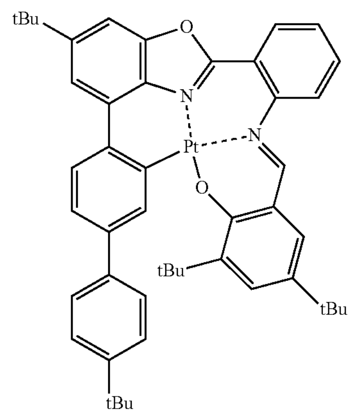
3-161
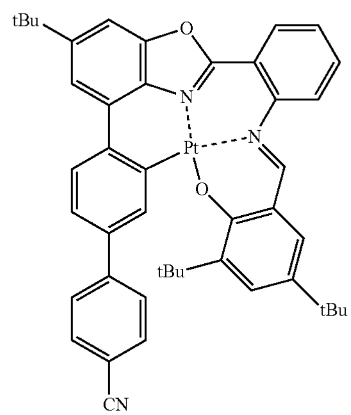
3-162
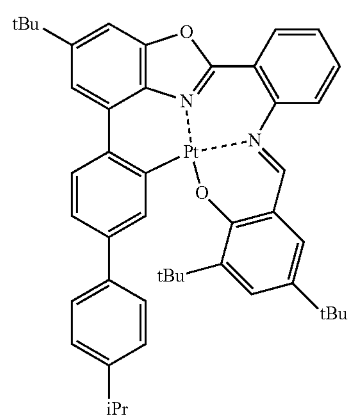

-continued
3-168
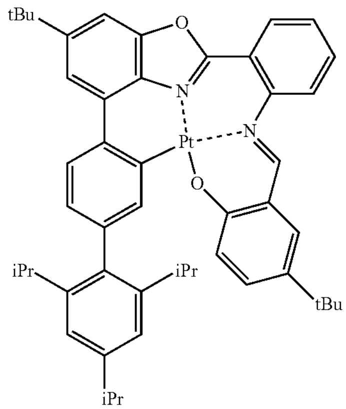
3-169
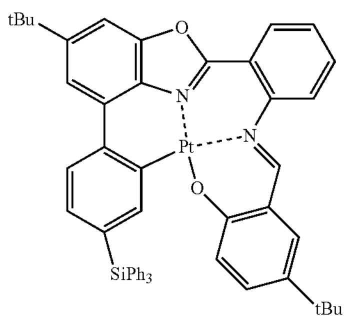
3-170
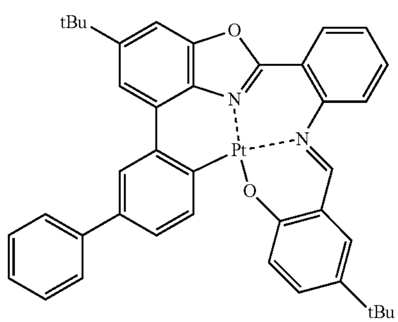
3-171
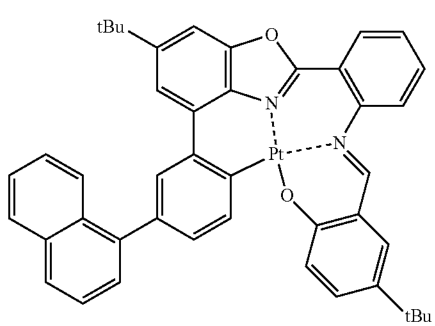
-continued
3-172
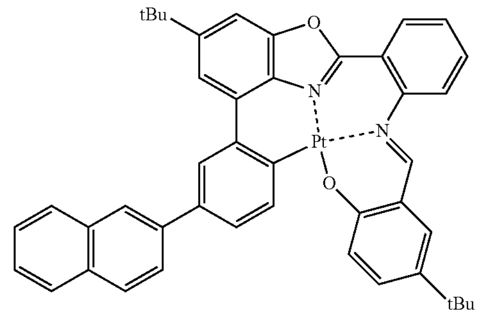
3-173
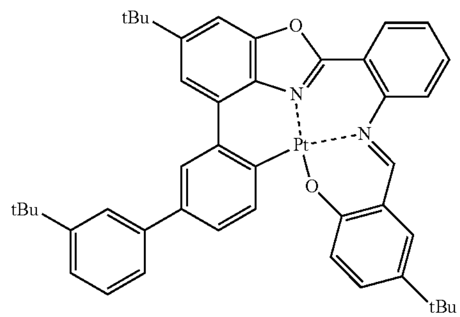
3-174
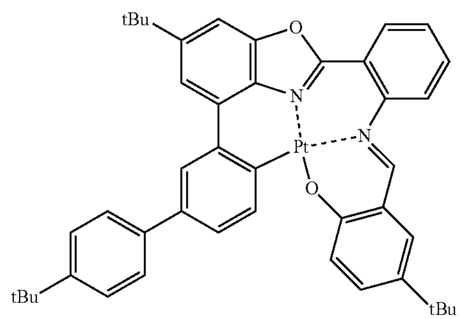
3-175
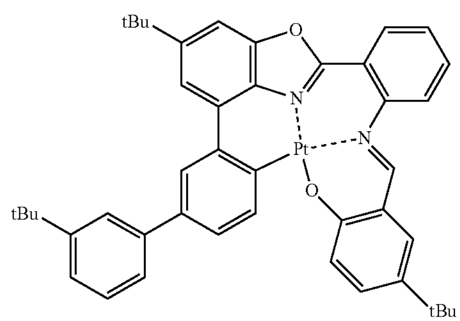
3-176
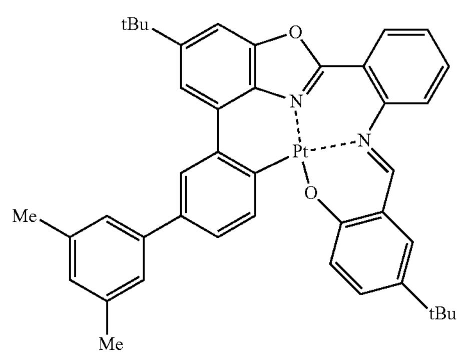

-continued
3-177
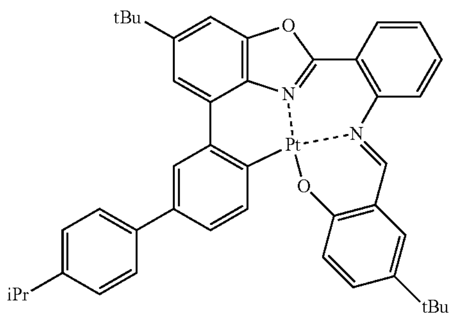
3-178
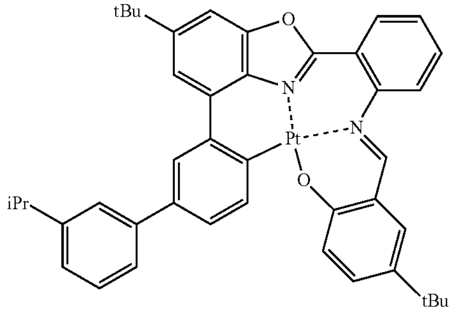
3-179
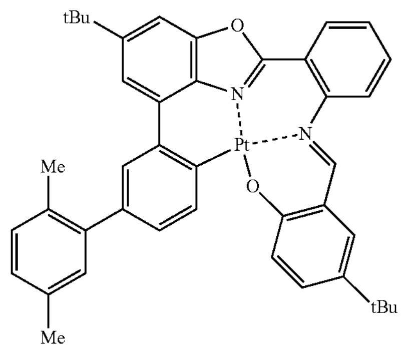
3-180
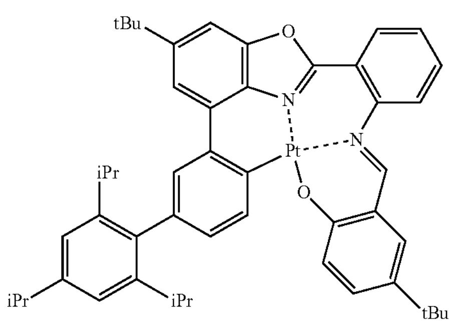
3-181
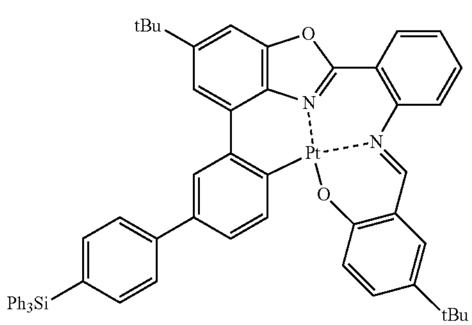
-continued
3-182
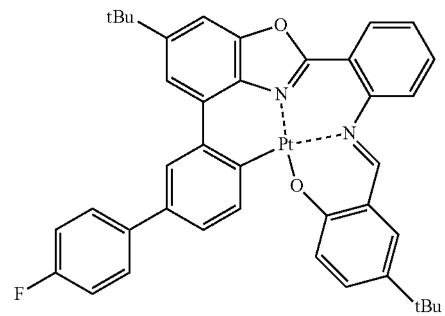
3-183
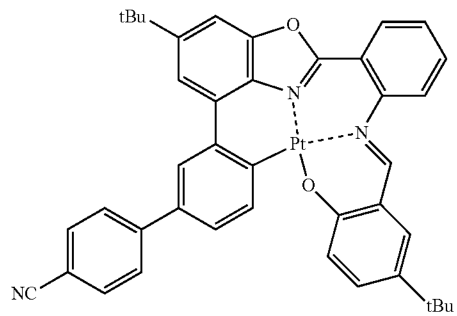
3-184
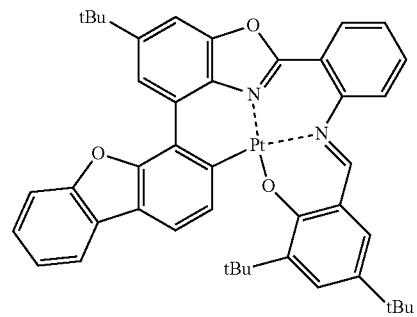
3-185
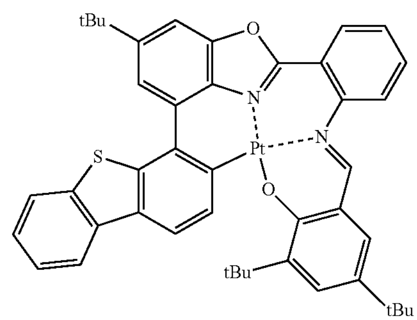
3-186
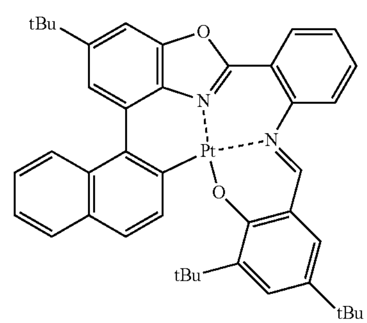

-continued
3-187
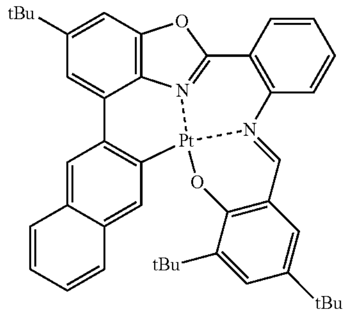
3-188
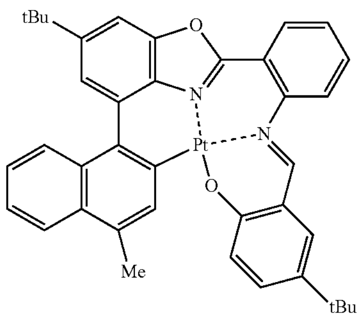
3-189
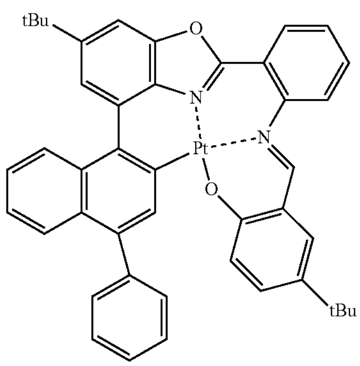
3-190
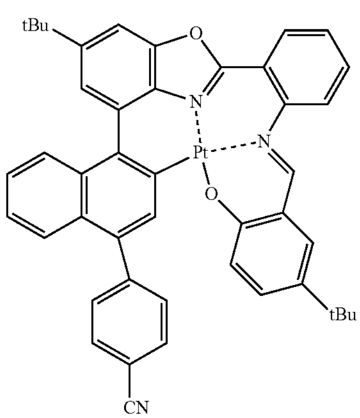
-continued
3-191
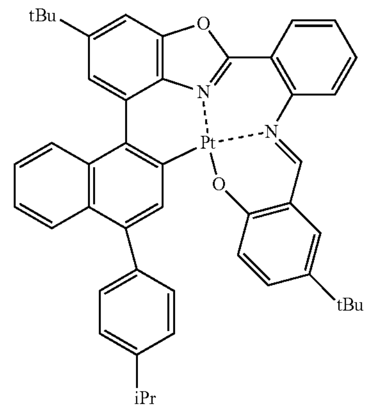
3-192
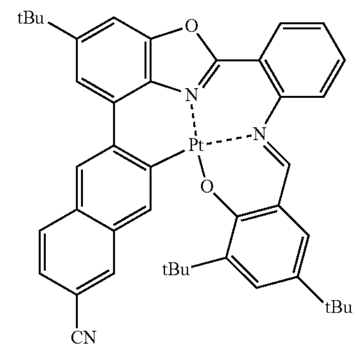
3-193
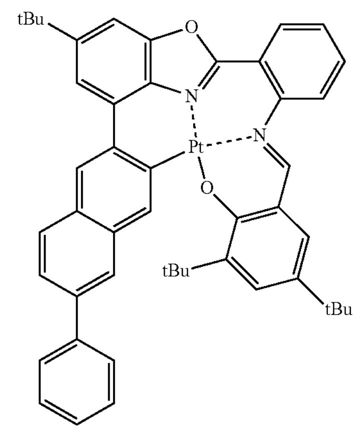
3-194
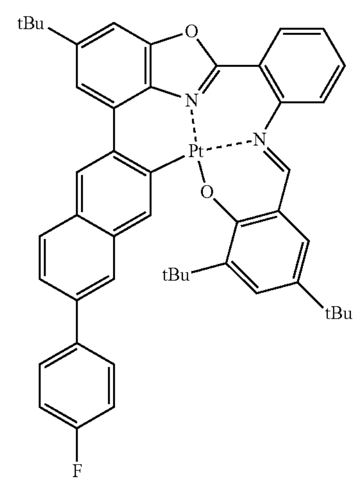

-continued
3-195
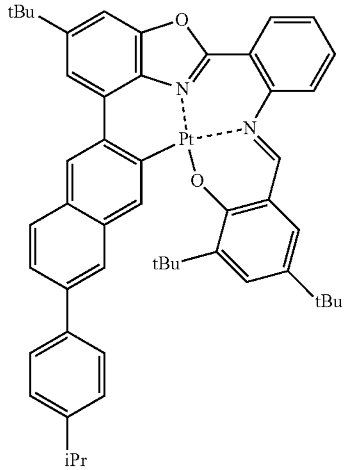
3-196
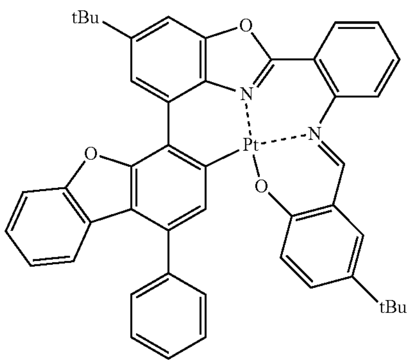
3-197
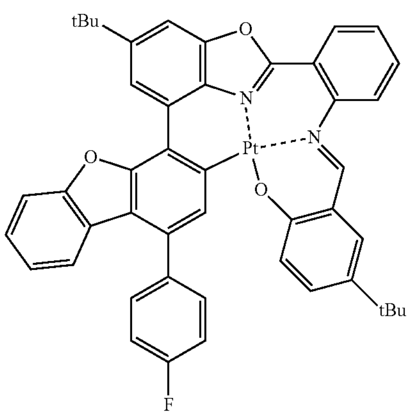
3-198
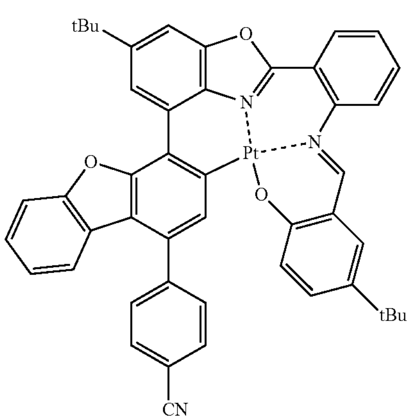
-continued
3-199
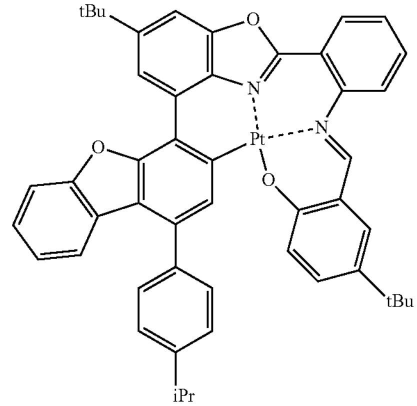
3-200
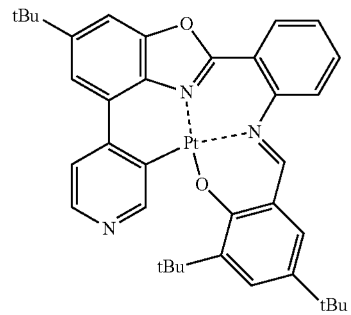
3-201
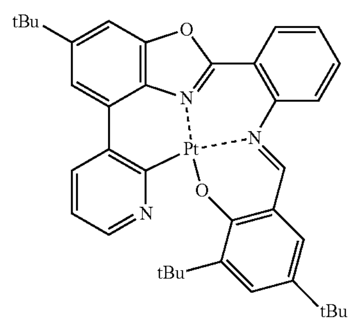
3-202
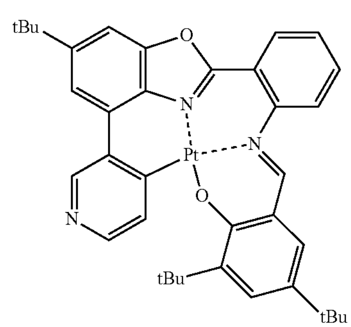

-continued
3-203
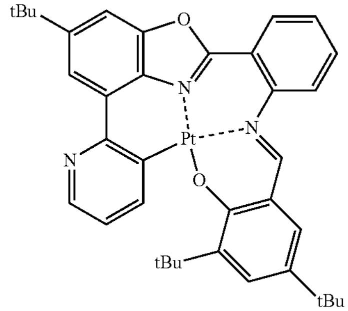
3-204
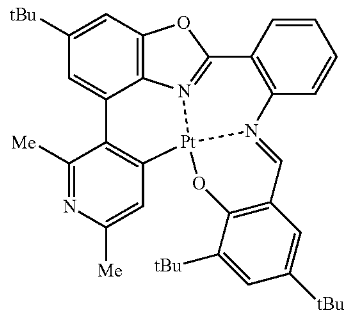
3-205
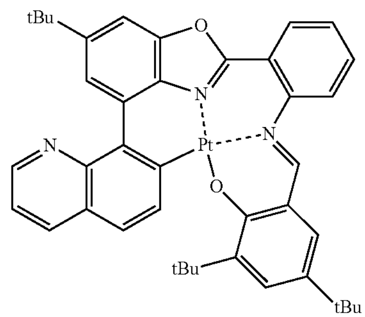
3-206
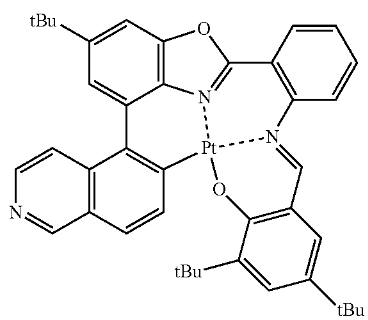
3-207
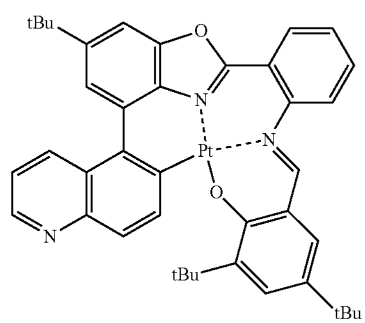
-continued
3-208
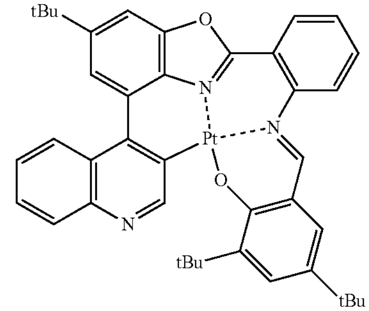
3-209
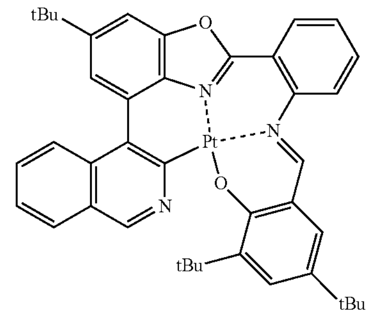
3-210
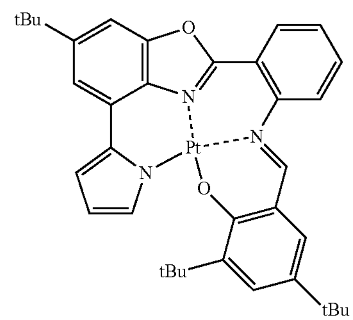
3-211
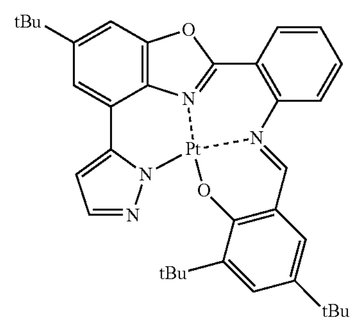
3-212
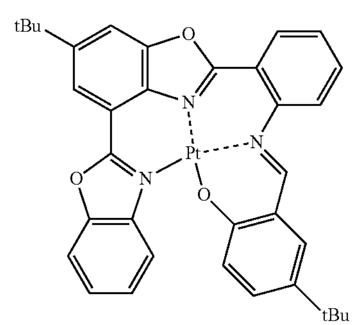

-continued
3-213
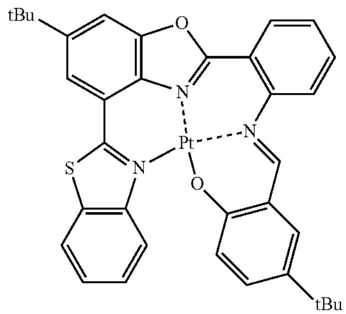
3-214
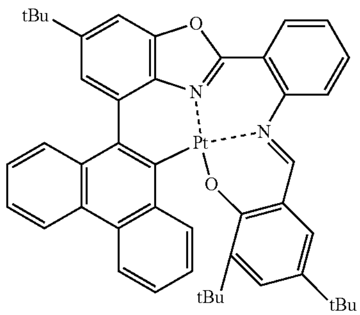
3-215
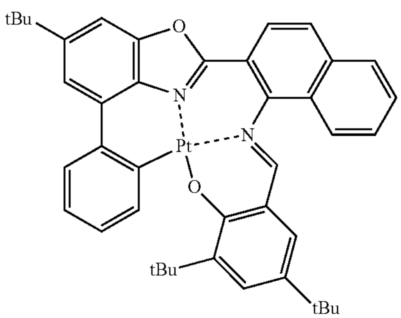
3-216
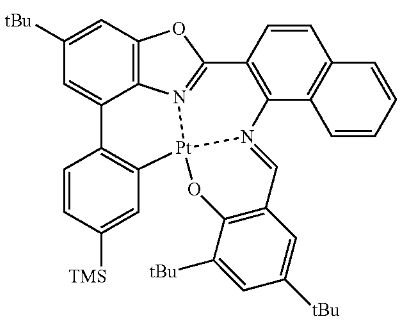
3-217
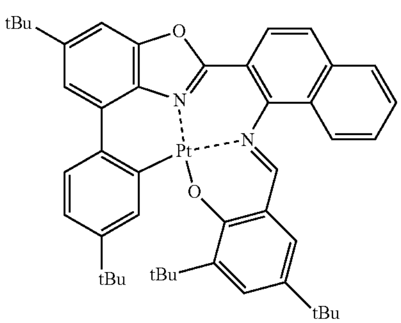
-continued
3-218
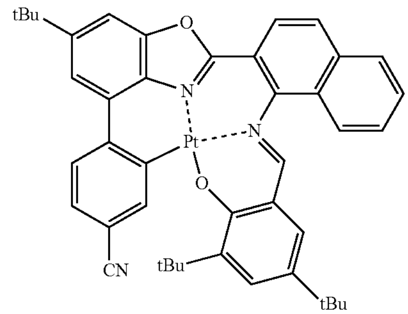
3-219
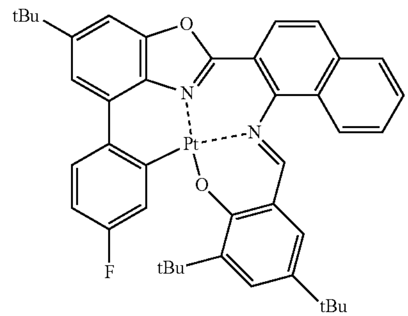
3-220
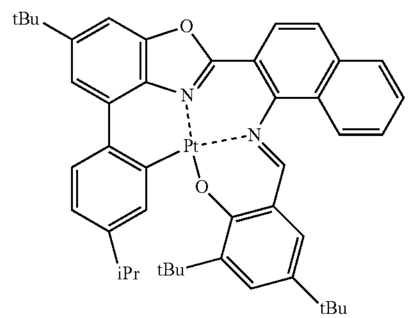
3-221
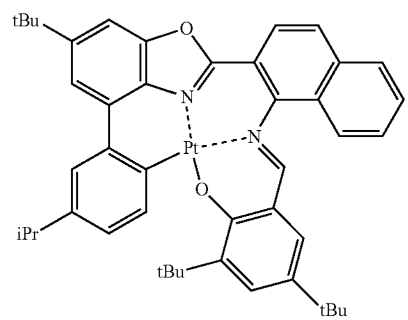
3-222
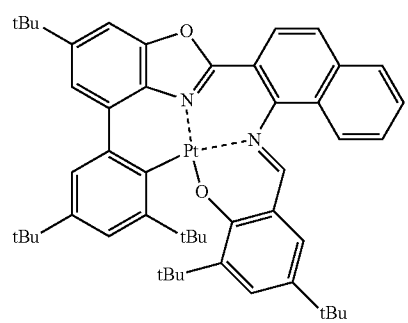

-continued
3-223
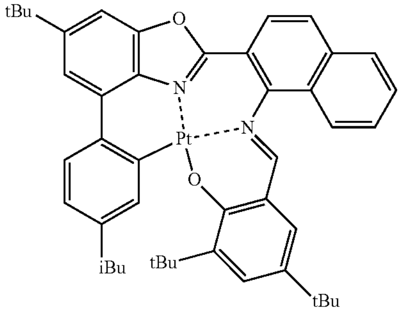
3-224
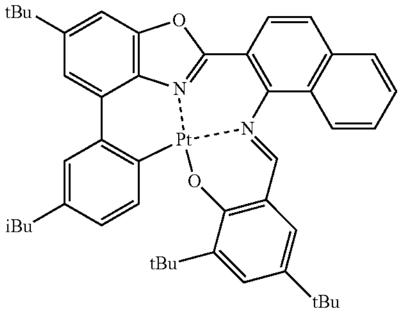
3-225
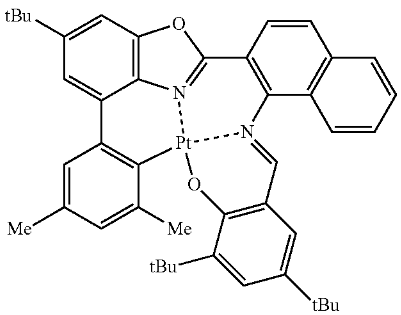
3-226
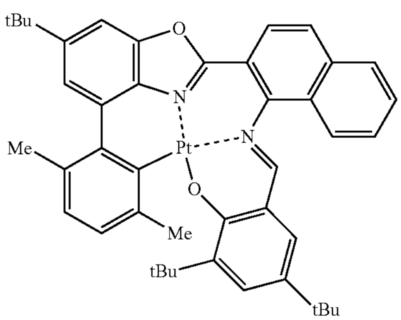
3-227
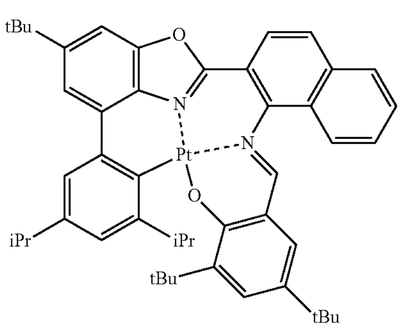
-continued
3-228
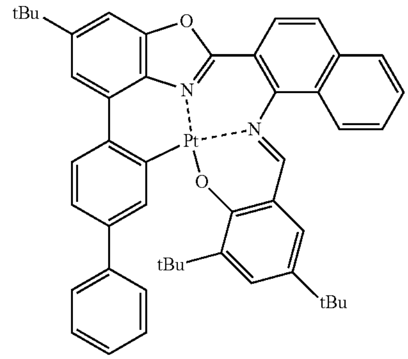
3-229
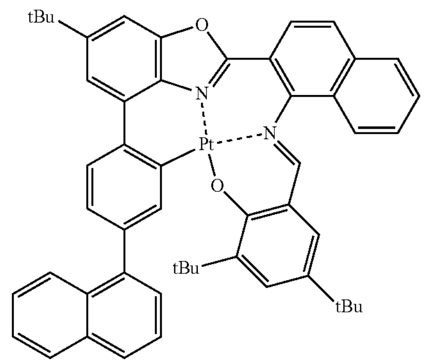
3-230
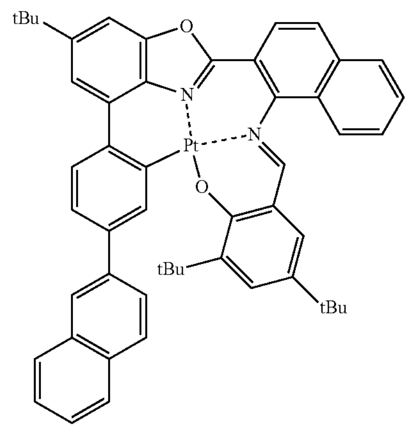
3-231
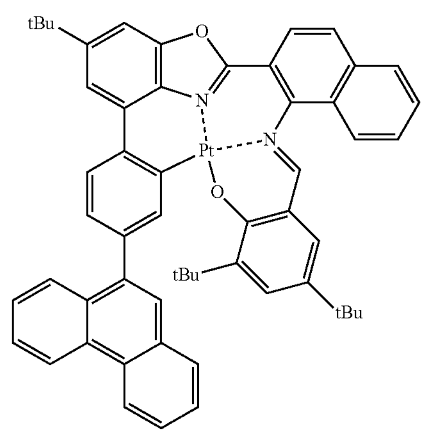

3-232
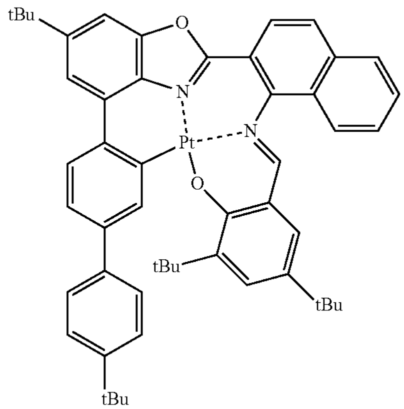
3-233
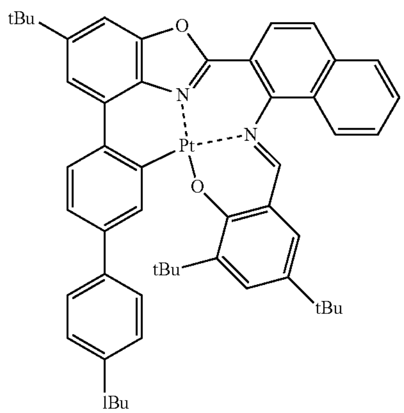
3-234
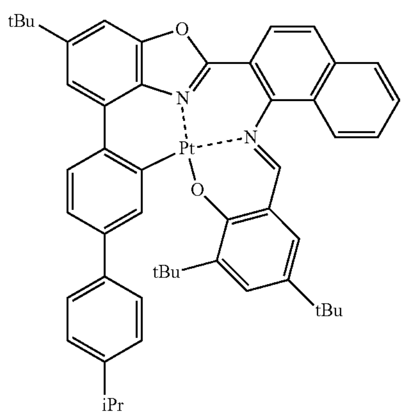
3-235
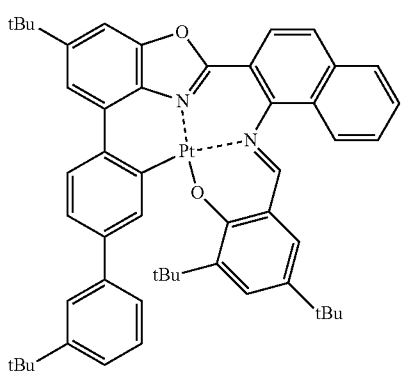
3-236
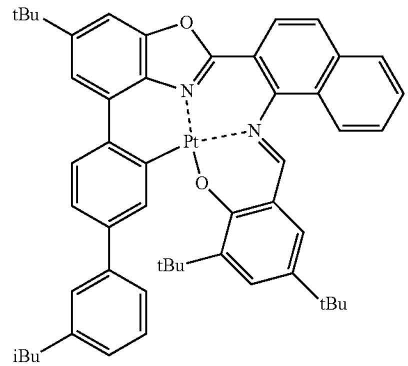
3-237
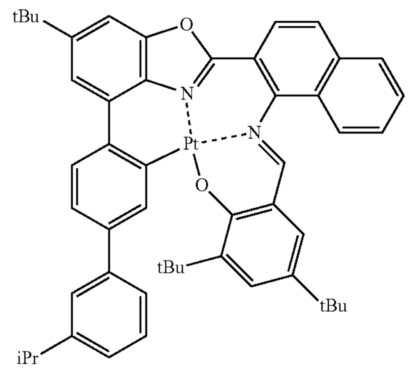
3-238
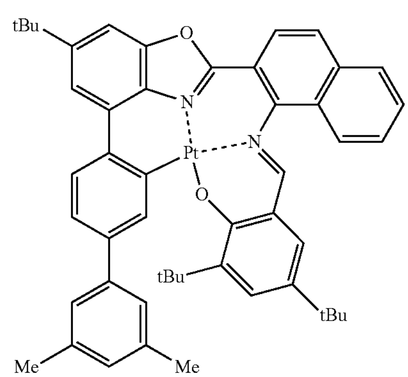
3-239
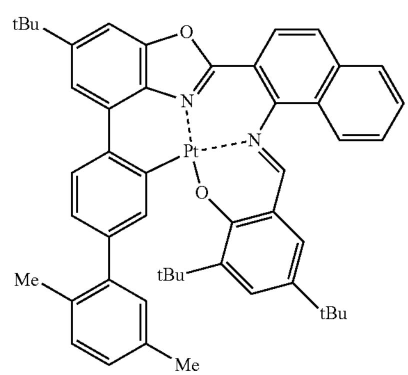

-continued
3-240
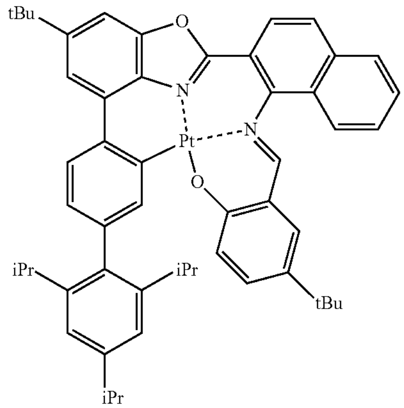
3-241
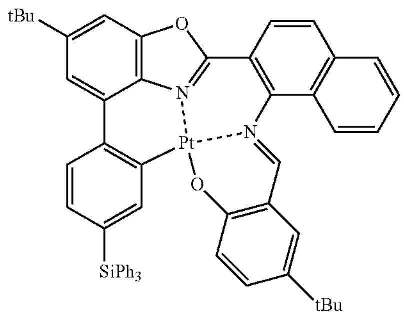
3-242
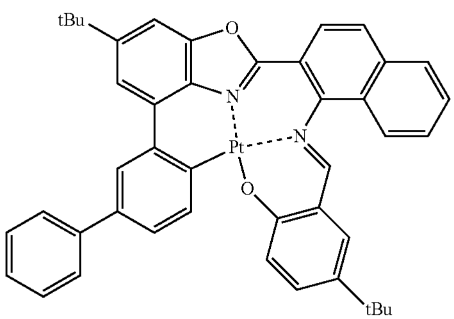
3-243
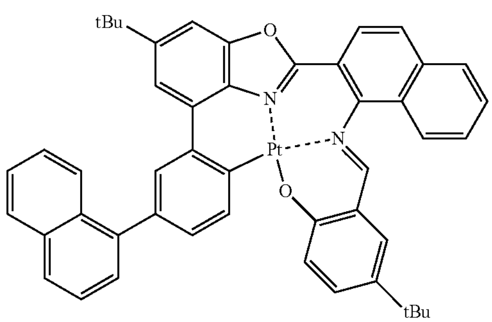
-continued
3-244
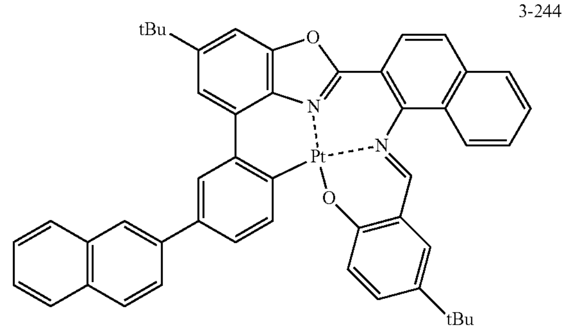
3-245
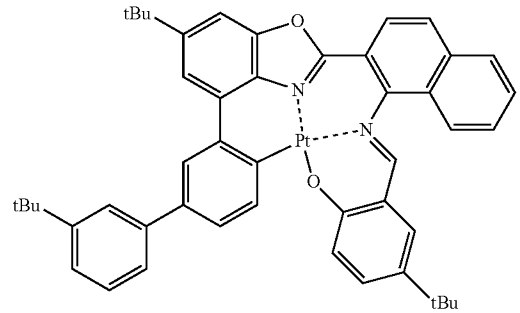
3-246
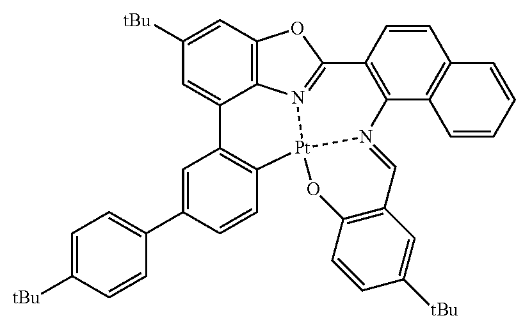
3-247
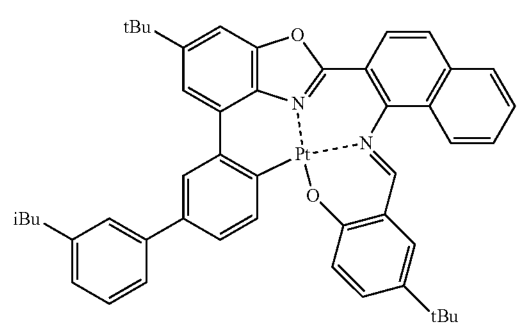

-continued
3-248
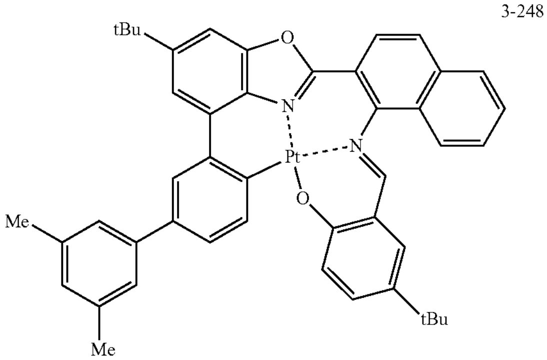
3-249
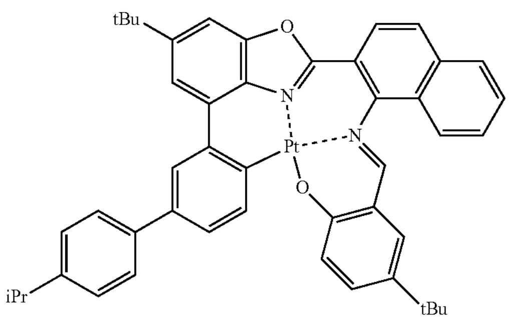
3-250
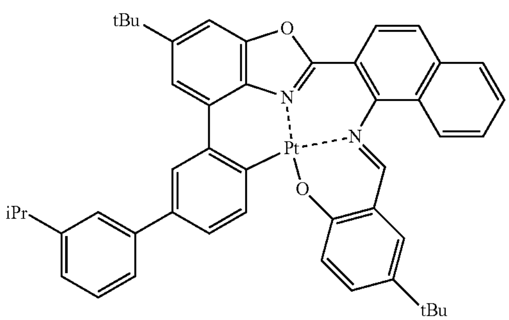
3-251
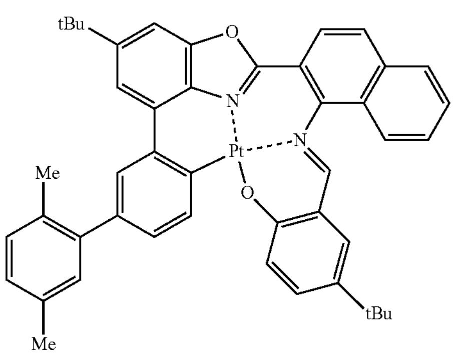
-continued
3-252
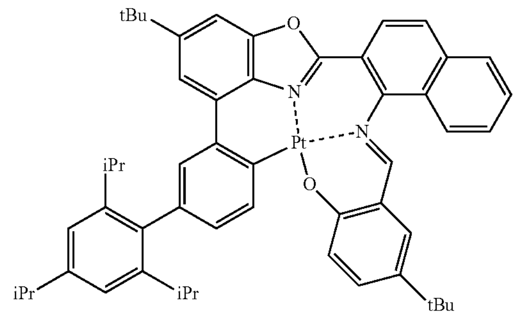
3-253
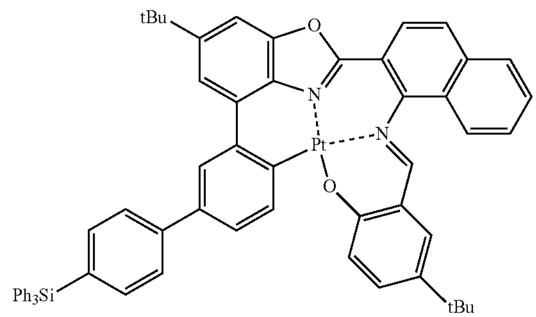
3-254
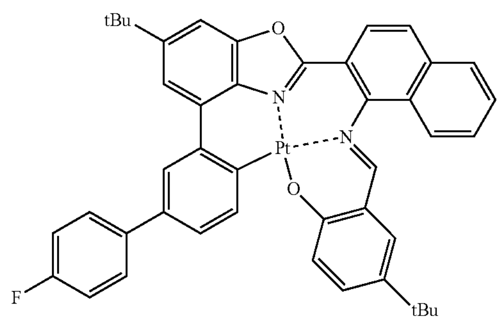
3-255
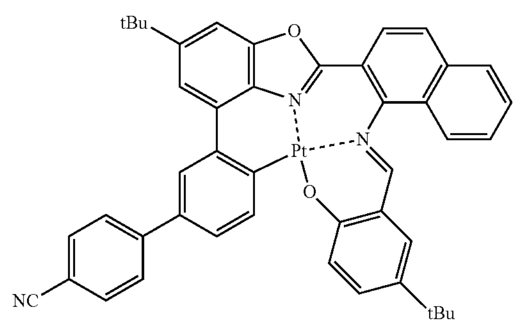
3-256
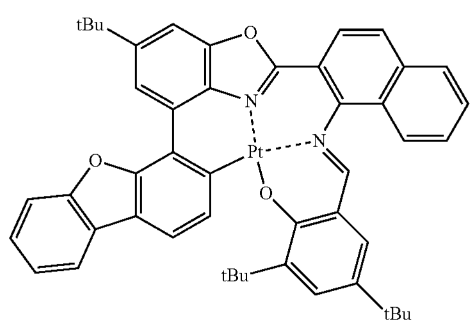

-continued
3-257
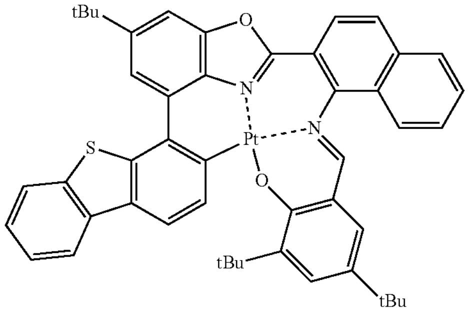
3-258
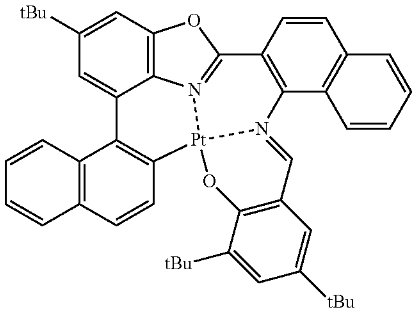
3-259
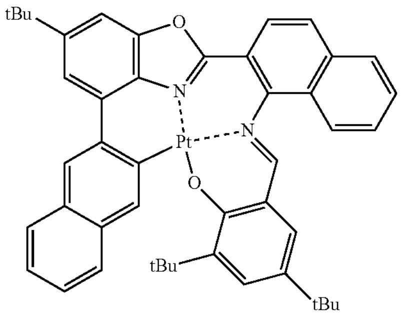
3-260
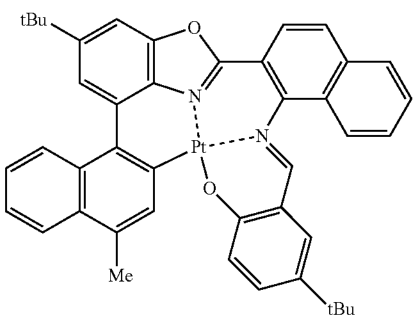
3-261
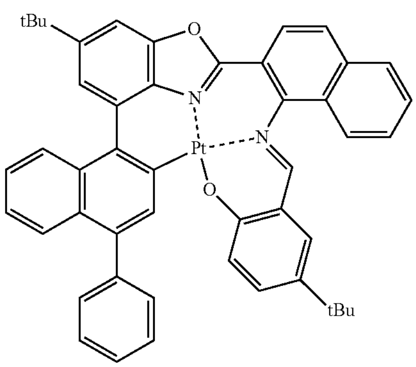
-continued
3-262
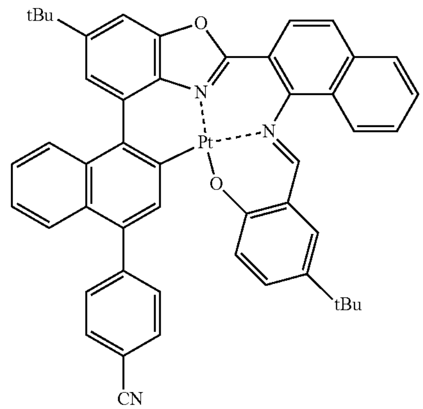
3-263
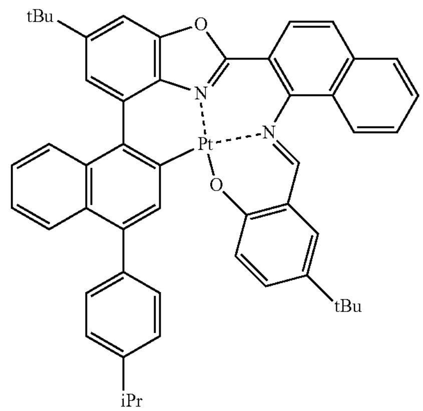
3-264
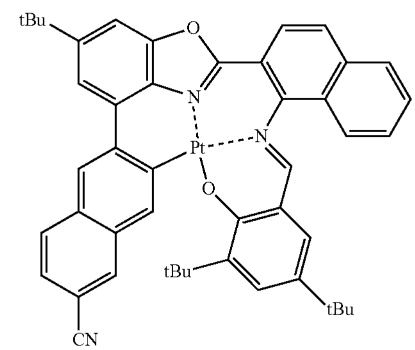
3-265
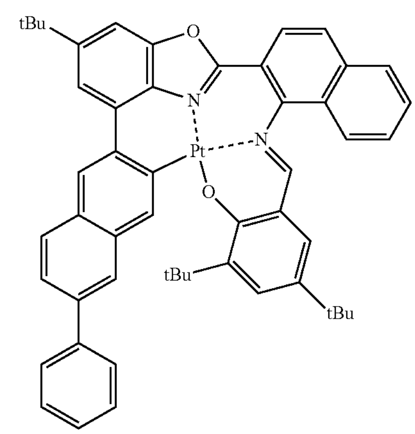

-continued
3-266
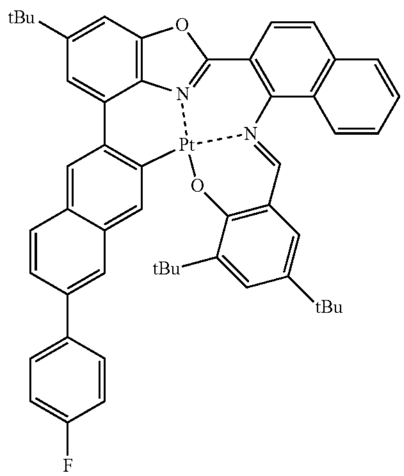
3-267
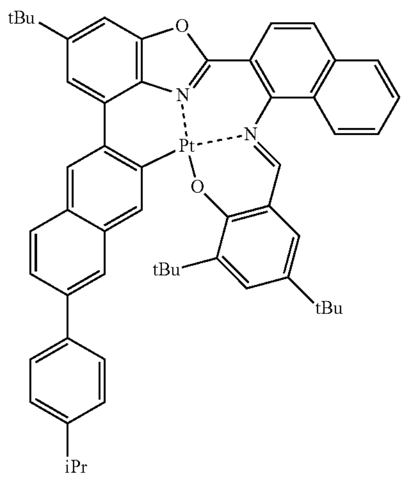
3-268
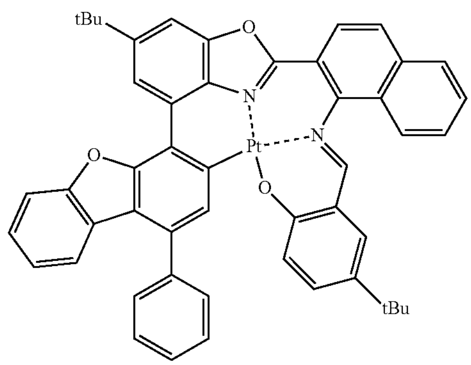
-continued
3-269
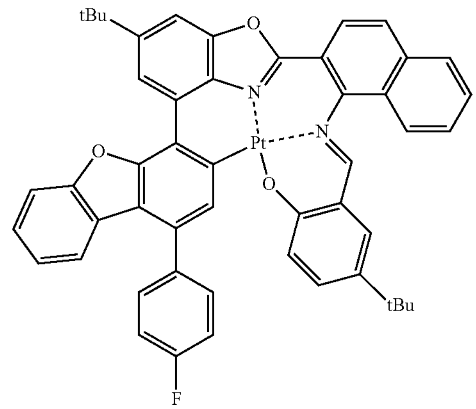
3-270
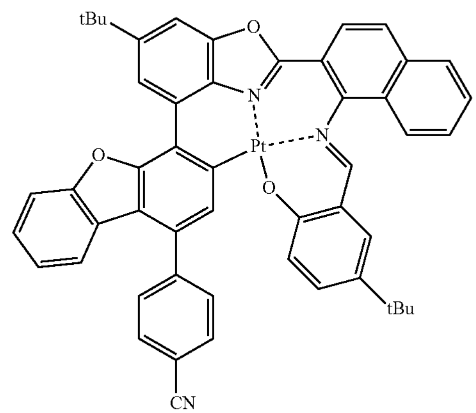
3-271
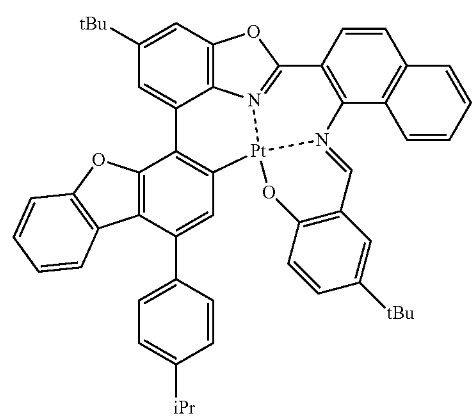
3-272
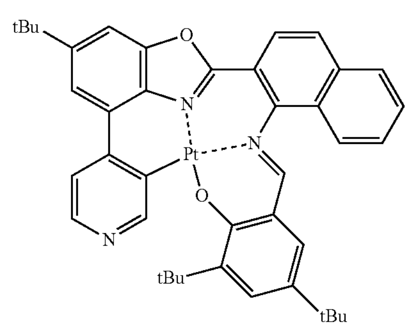

3-273
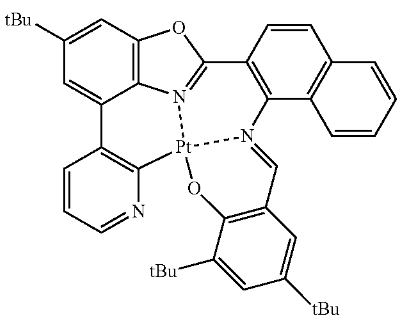
3-274
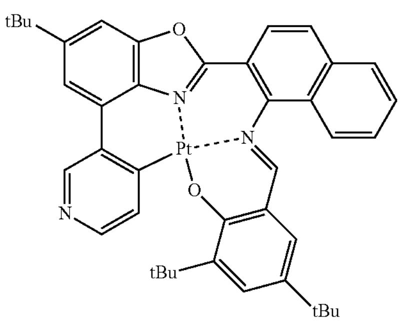
3-275
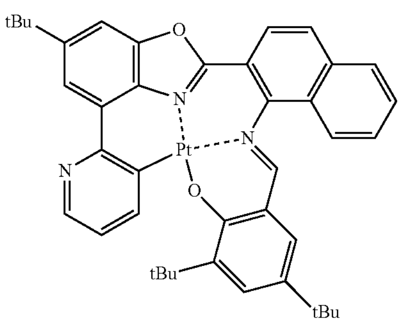
3-276
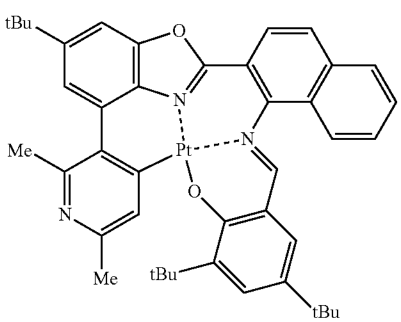
3-277
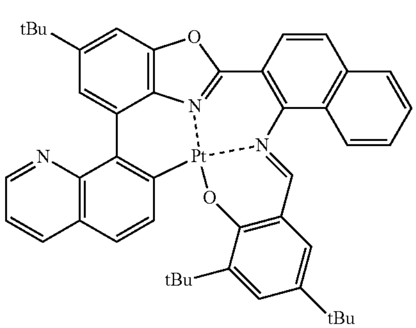
3-278
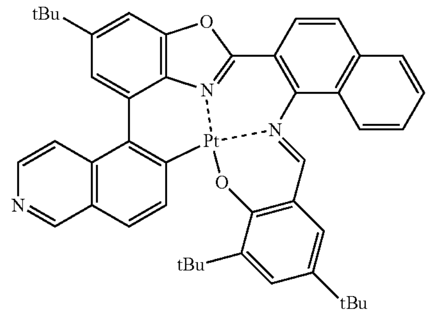
3-279
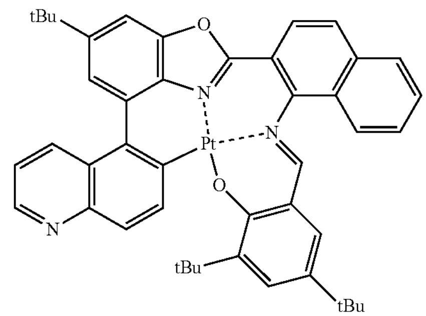
3-280
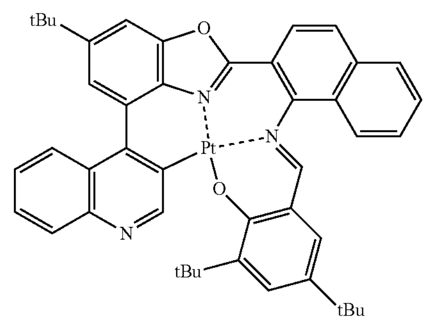
3-281
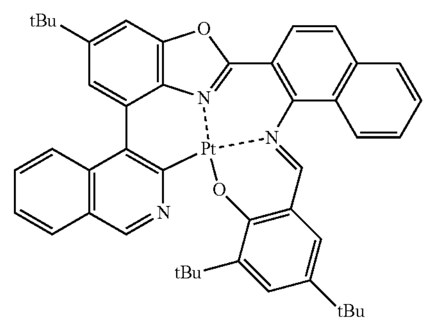
3-282
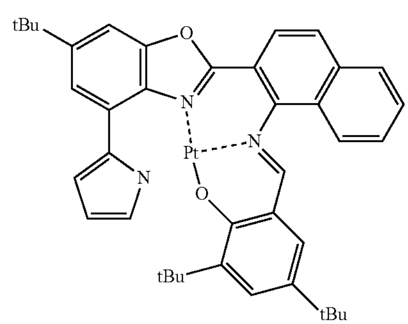

3-283
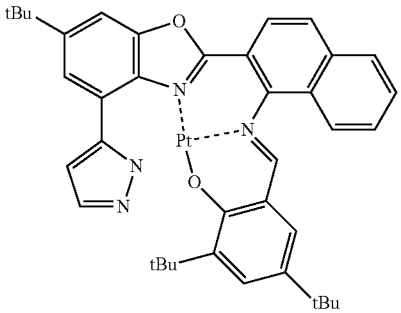
3-284
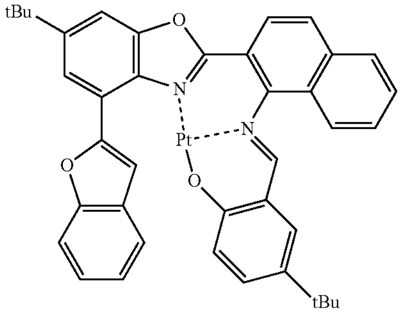
3-285
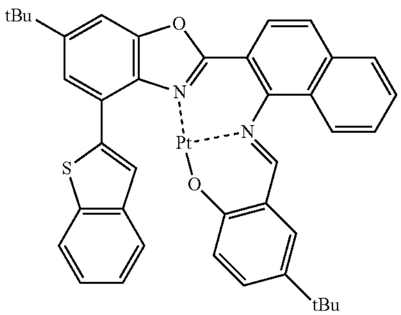
3-286
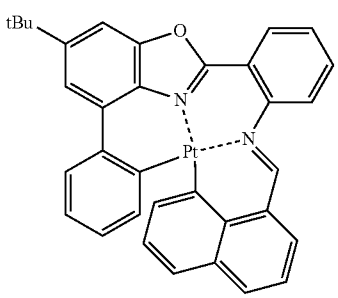
3-287
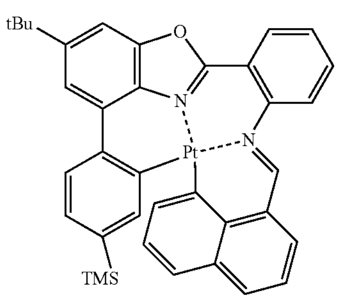
3-288
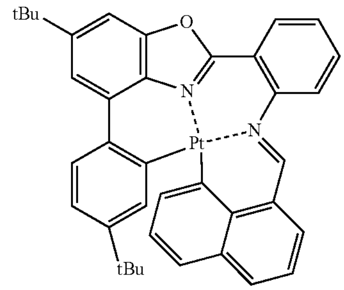
3-289
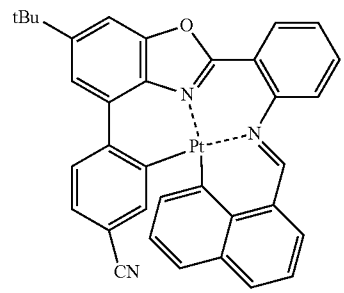
3-290
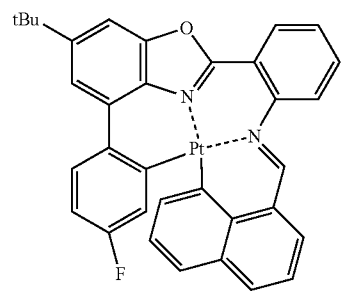
3-291
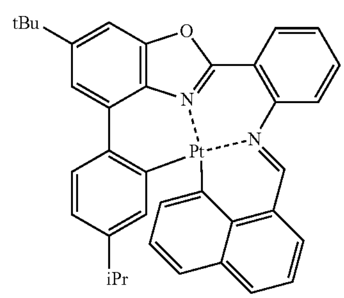
3-292
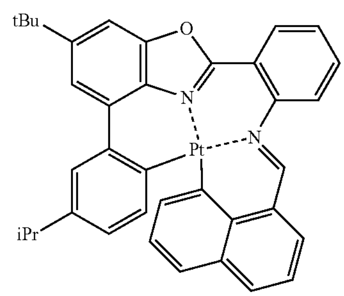

-continued
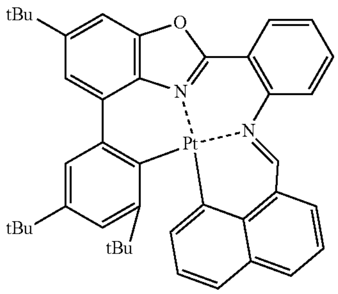
3-293
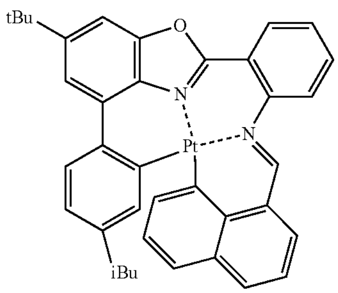
3-294
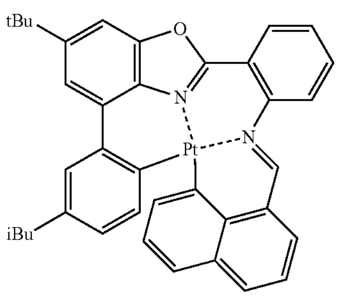
3-295
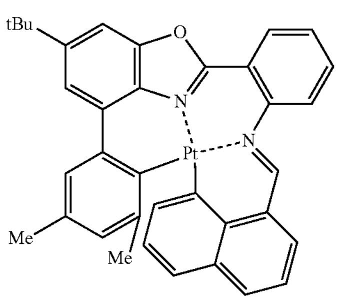
3-296
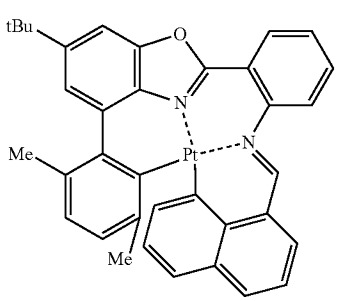
3-297
-continued
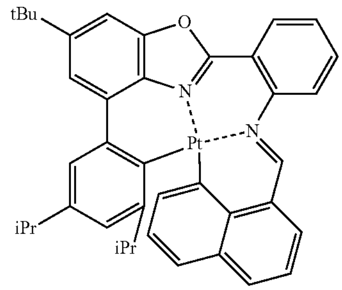
3-298
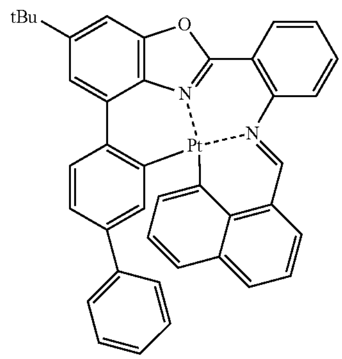
3-299
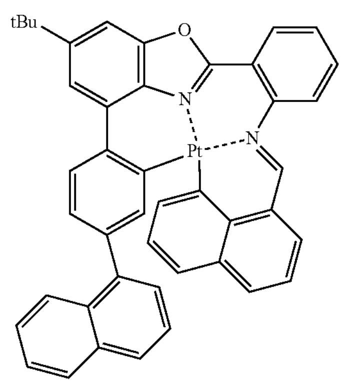
3-300
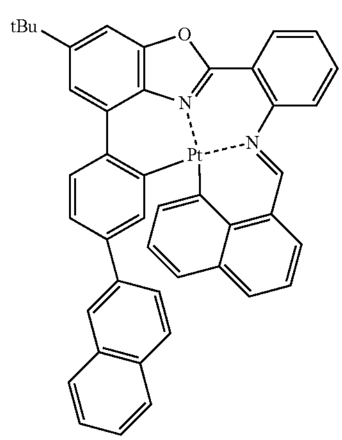
3-301

-continued
3-302
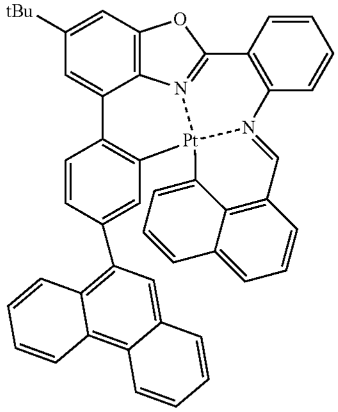
3-303
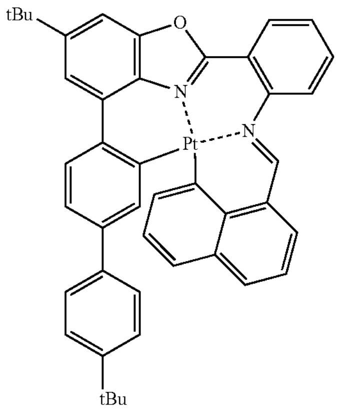
3-304
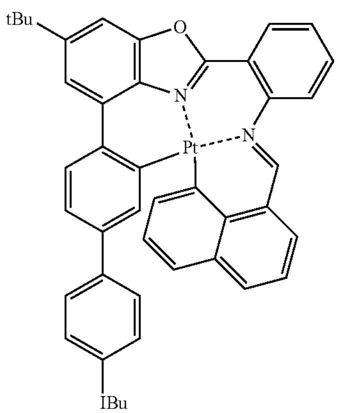
3-305
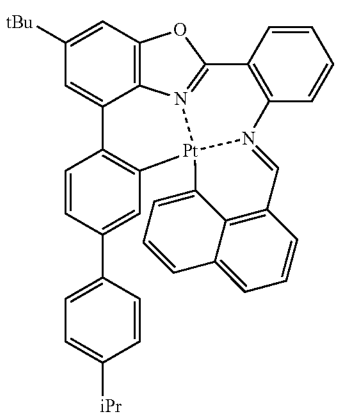
-continued
3-306
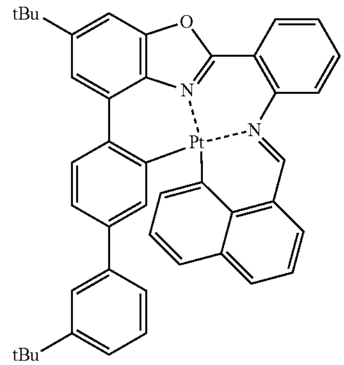
3-307
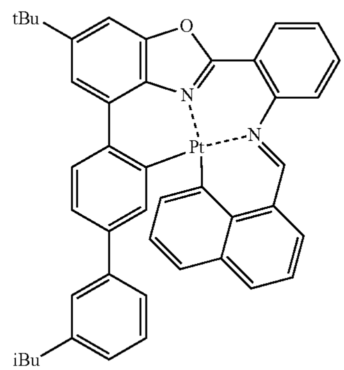
3-308
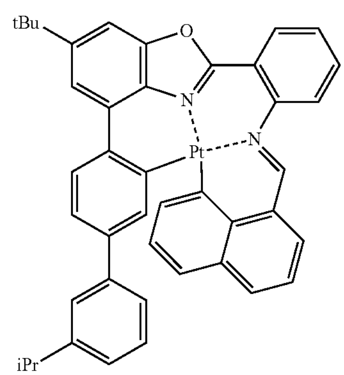
3-309
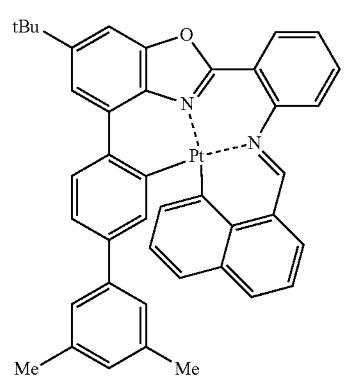

-continued
3-310
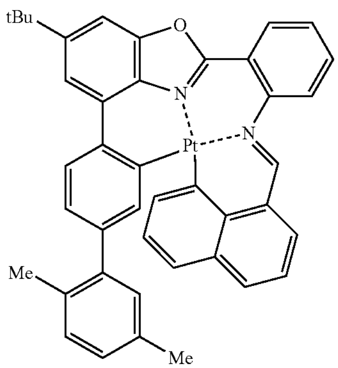
3-311
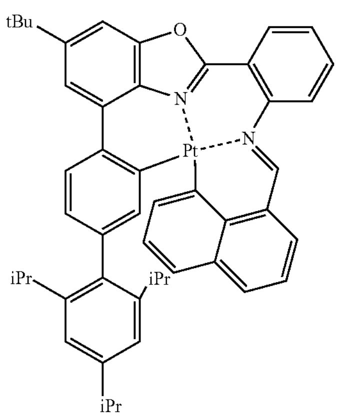
3-312
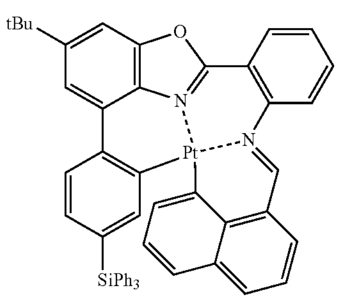
3-313
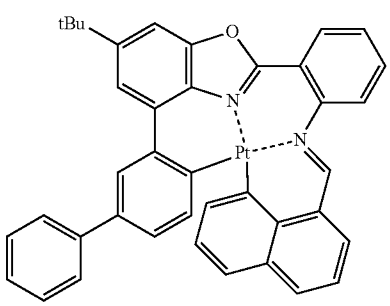
-continued
3-314
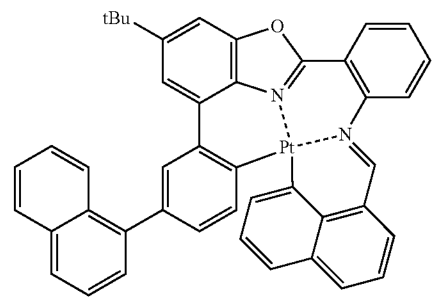
3-315
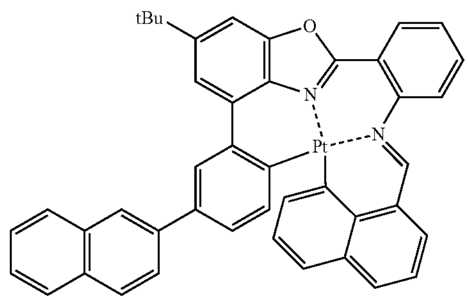
3-316
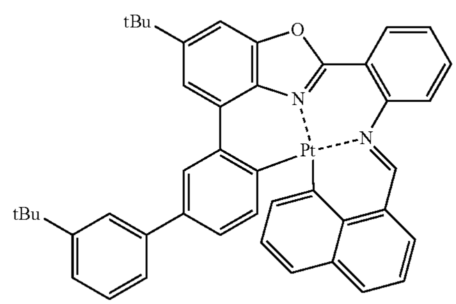
3-317
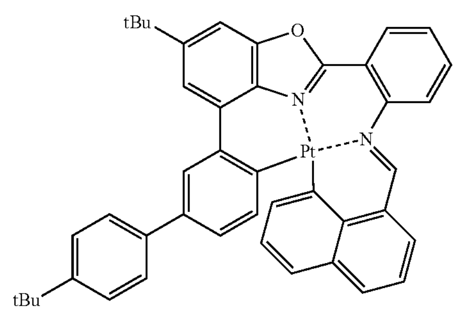
3-318
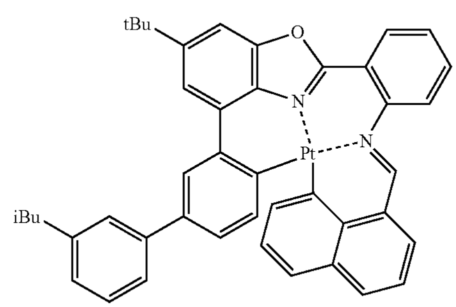

3-319
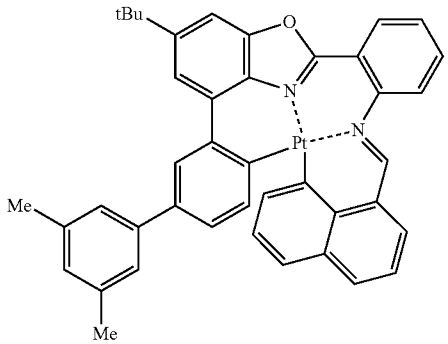
3-320
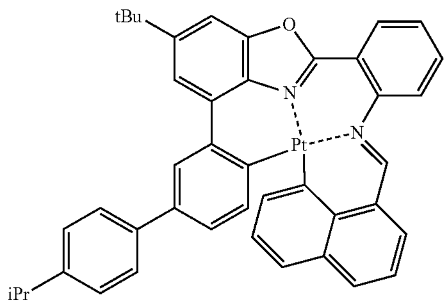
3-321
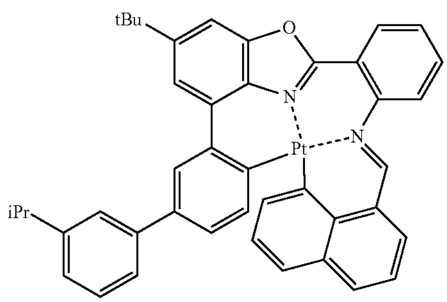
3-322
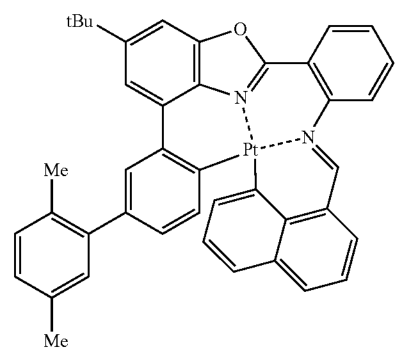
3-323
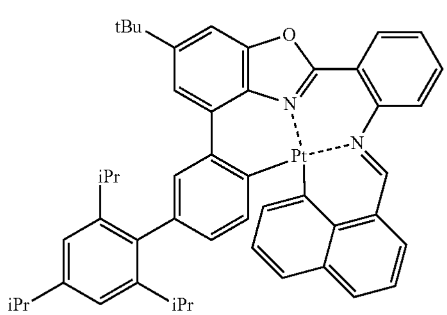
3-324
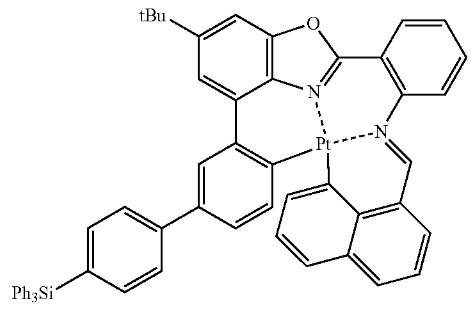
3-325
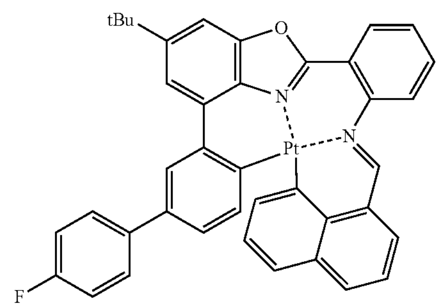
3-326
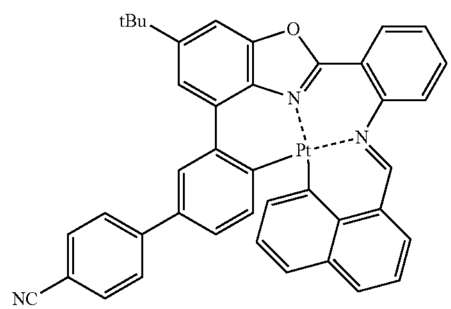
3-327
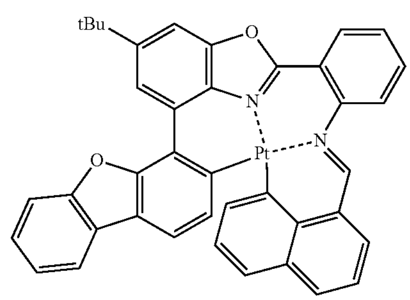
3-328
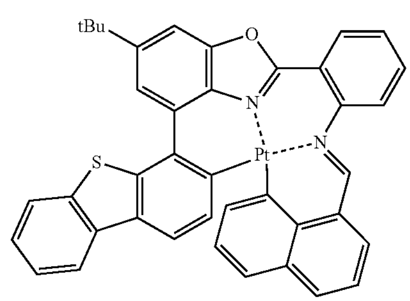

3-329
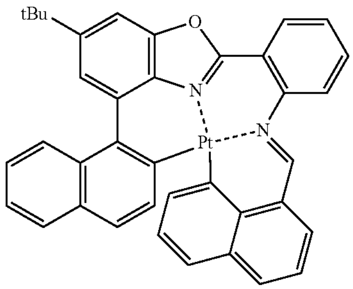
3-330
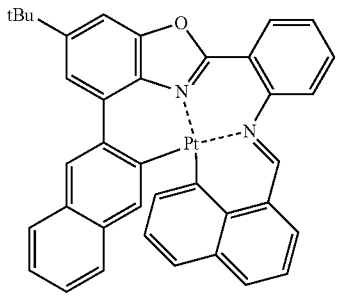
3-331
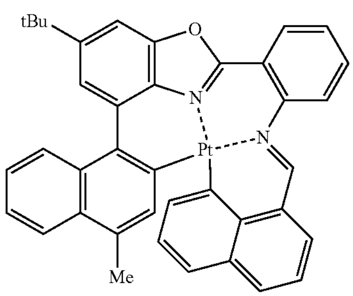
3-332
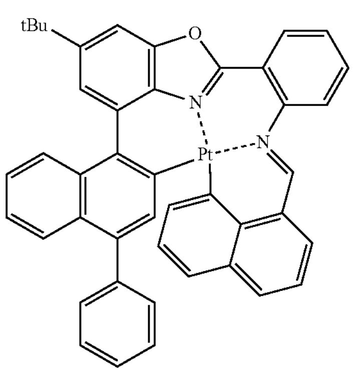
3-333
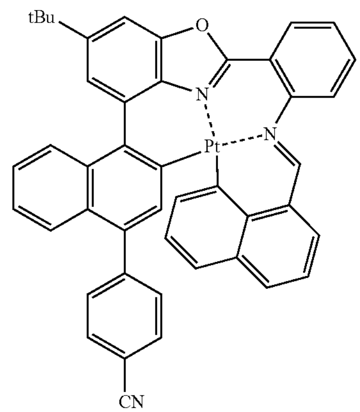
3-334
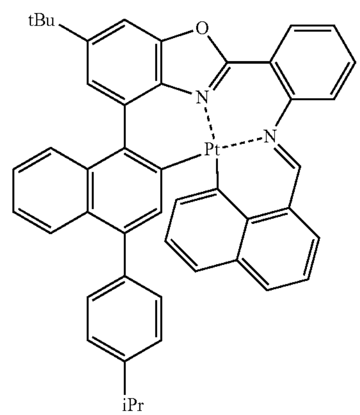
3-335
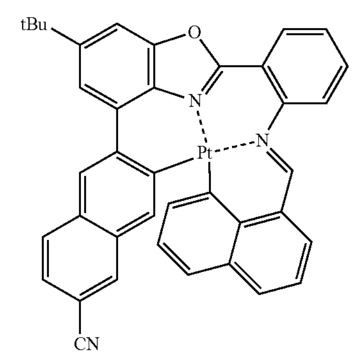
3-336
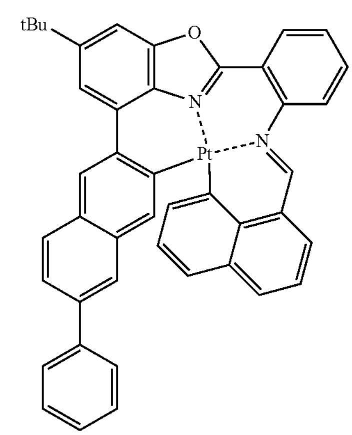

-continued
3-337
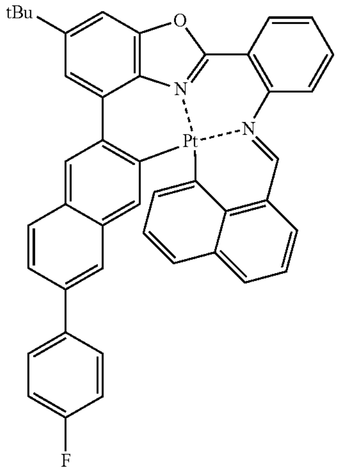
3-338
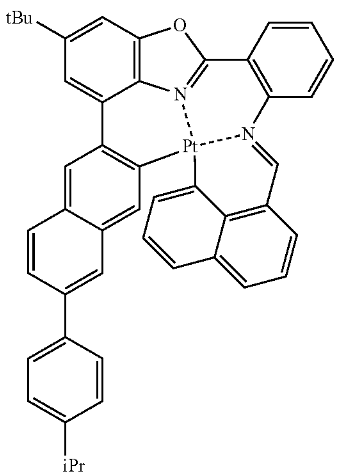
3-339
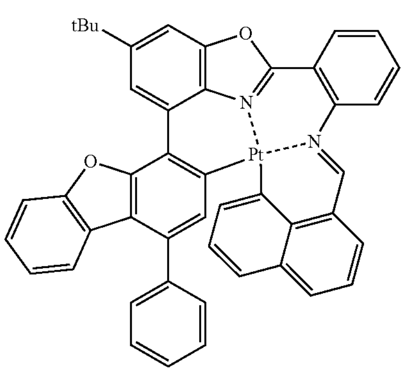
-continued
3-340
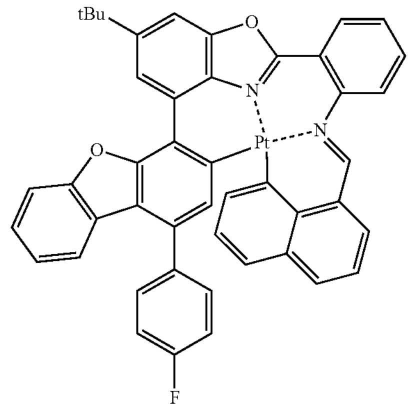
3-341
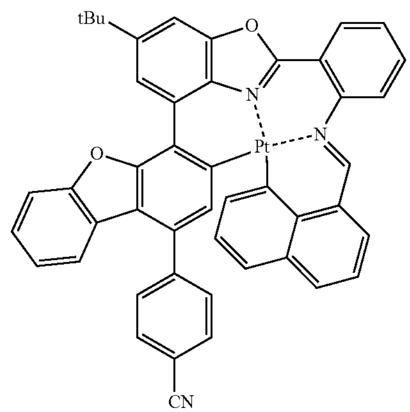
3-342
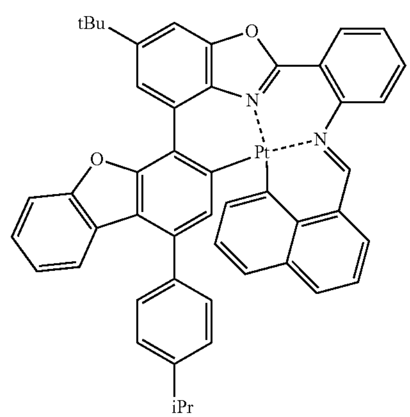
3-343
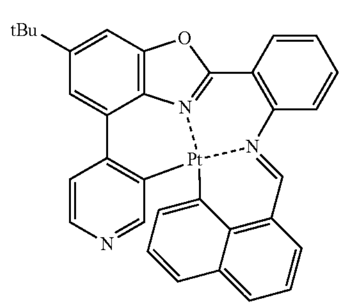

3-344
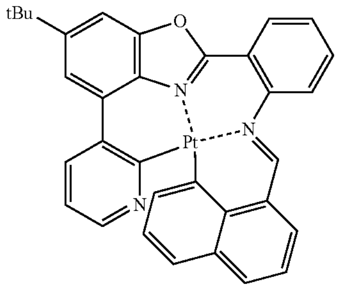
3-345
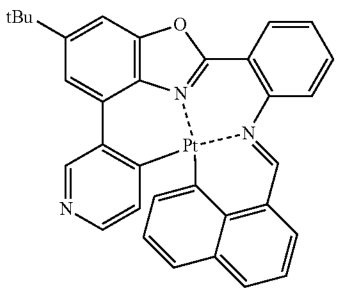
3-346
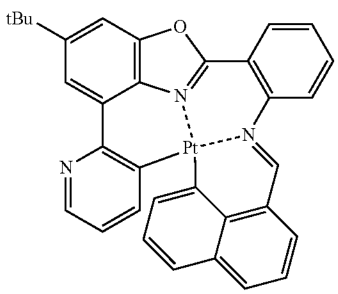
3-347
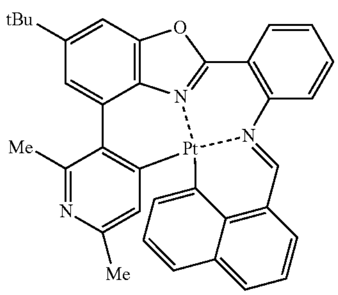
3-348
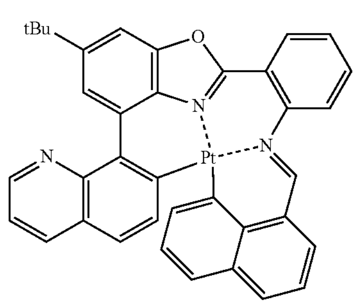
3-349
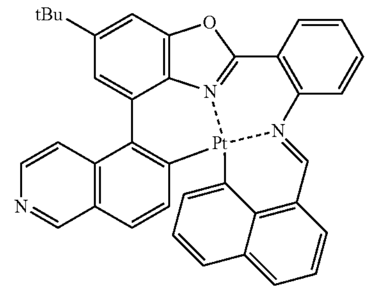
3-350
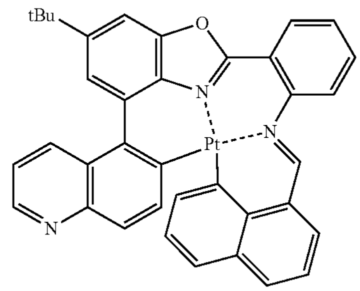
3-351
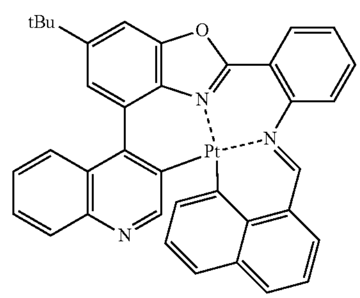
3-352
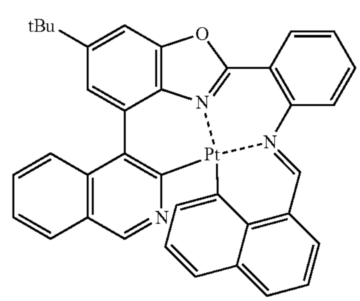
3-353
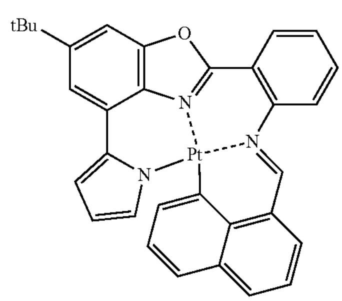

-continued
3-354
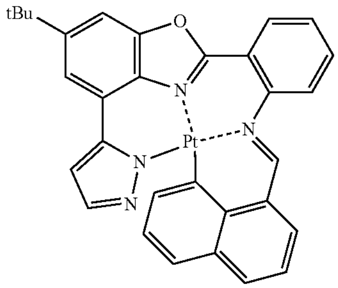
3-355
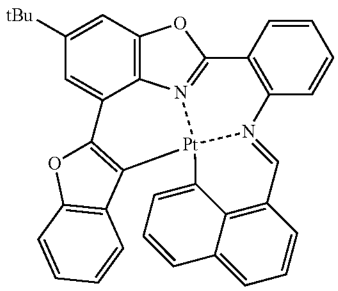
3-356
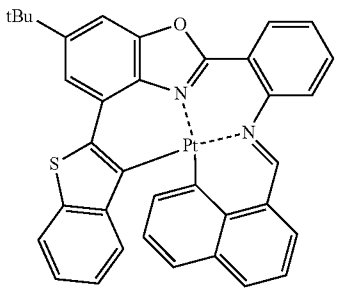
3-357
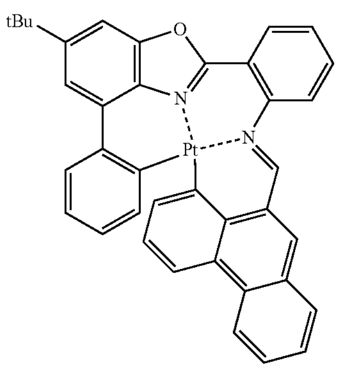
3-358
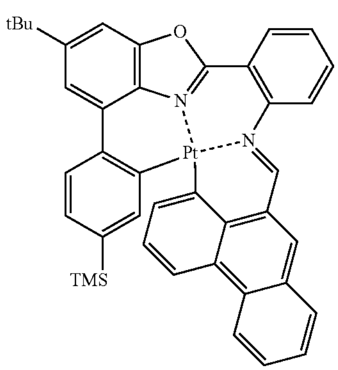
-continued
3-359
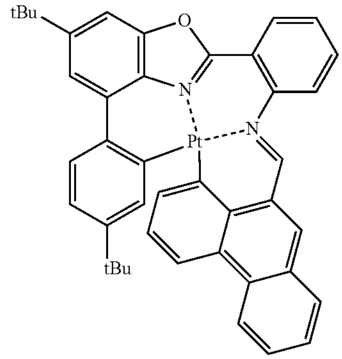
3-360
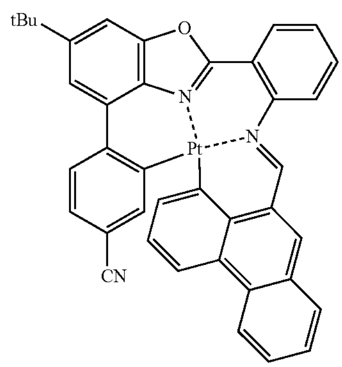
3-361
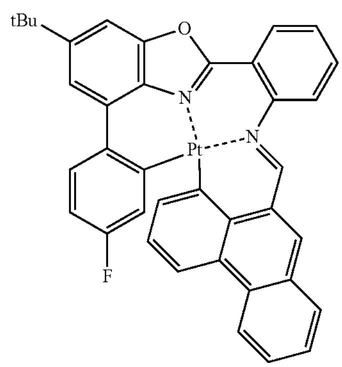
3-362
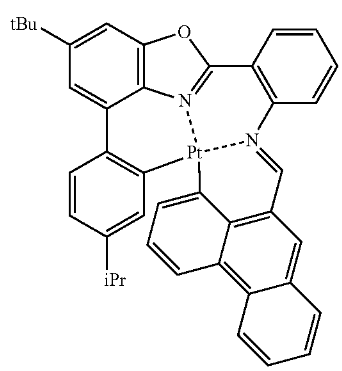

3-363
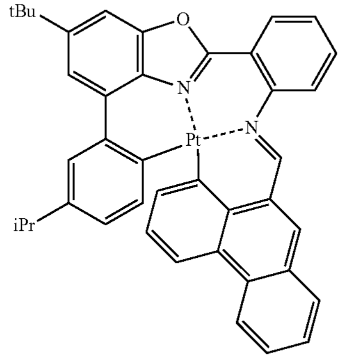
3-364
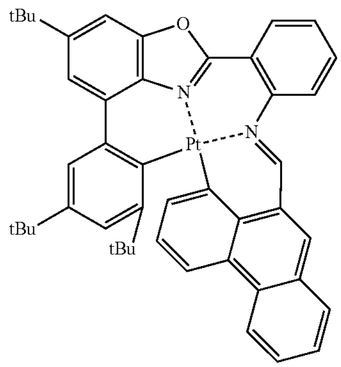
3-365
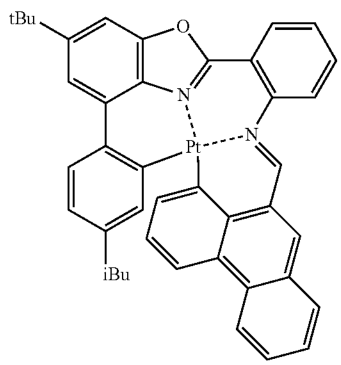
3-366
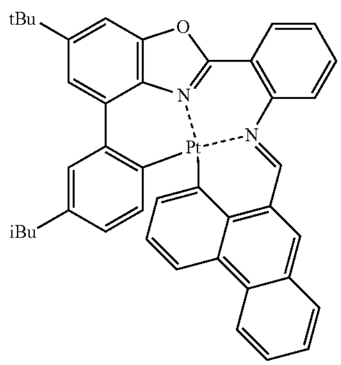
3-367
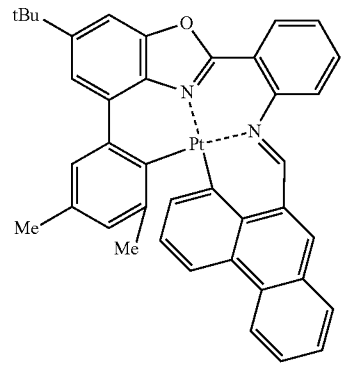
3-368
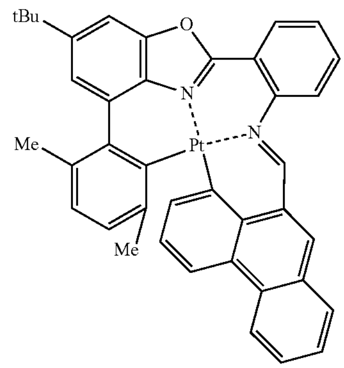
3-369
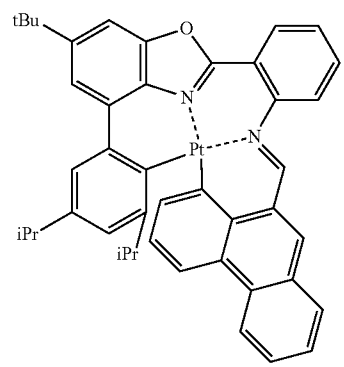
3-370
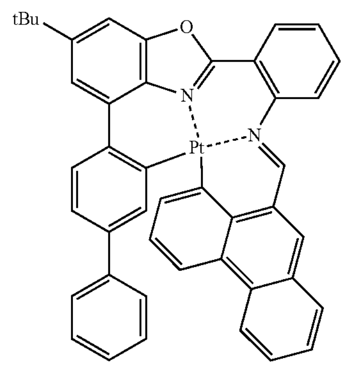

-continued
3-371
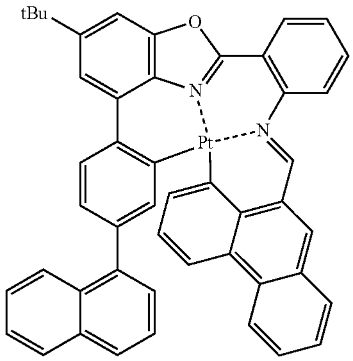
3-372
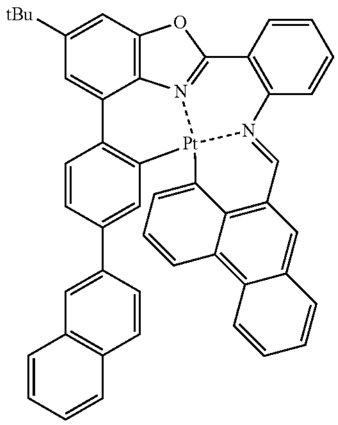
3-373
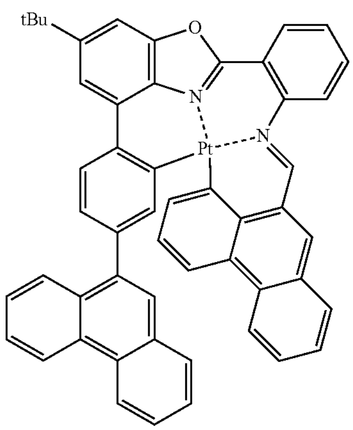
3-374
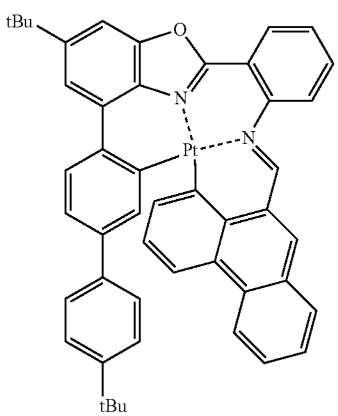
-continued
3-375
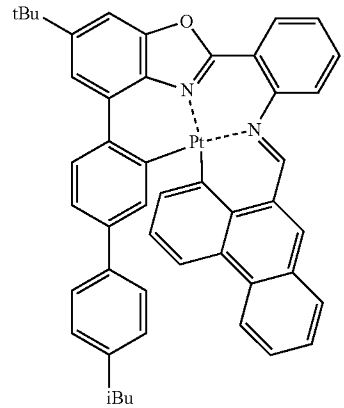
3-376
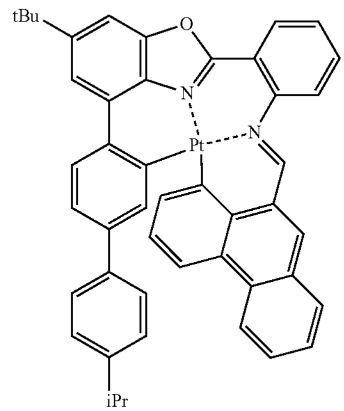
3-377
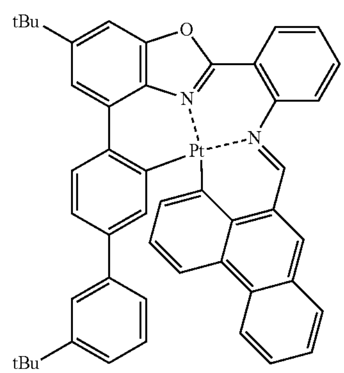
3-378
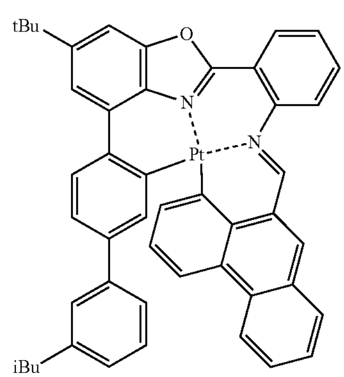

-continued
3-379
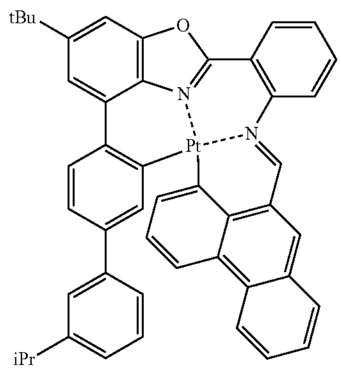
3-380
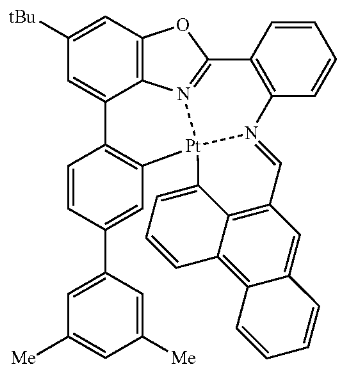
3-381
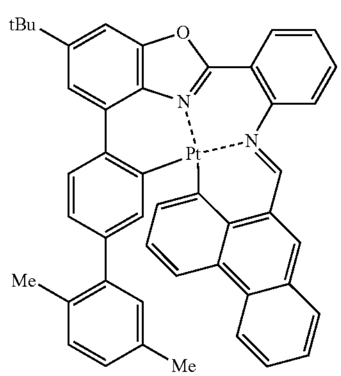
3-382
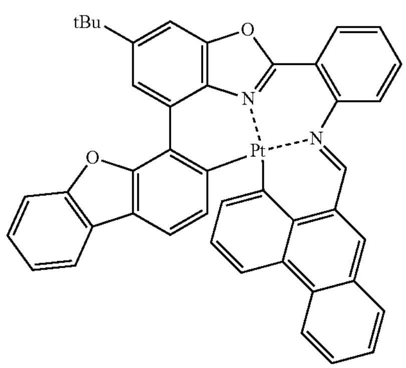
-continued
3-383
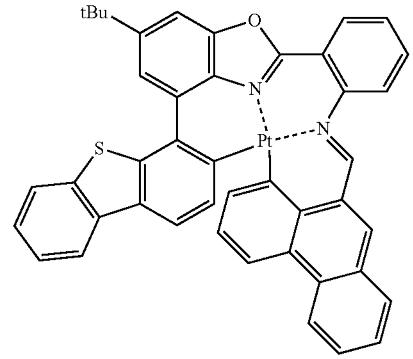
3-384
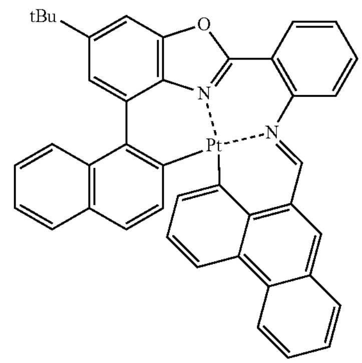
3-385
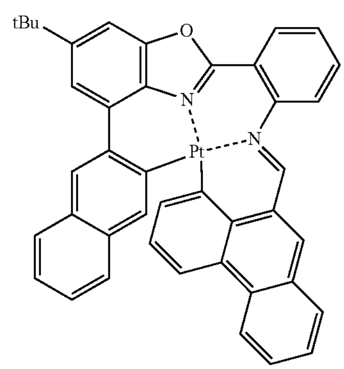
3-386
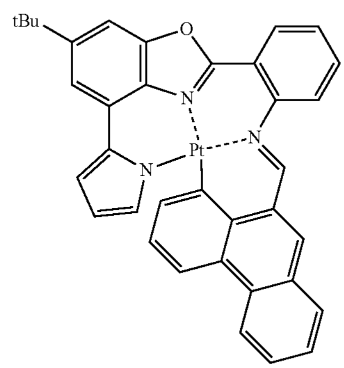

-continued
3-387
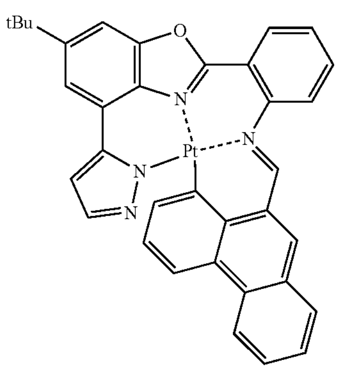
3-388
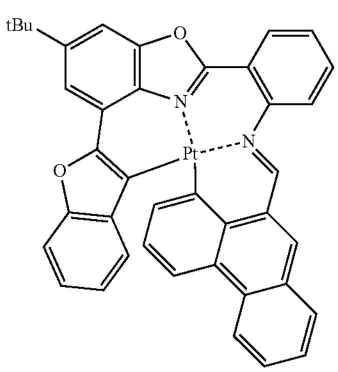
3-389
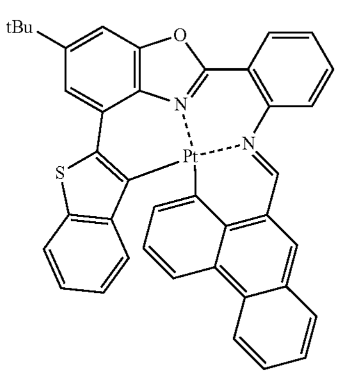
3-390
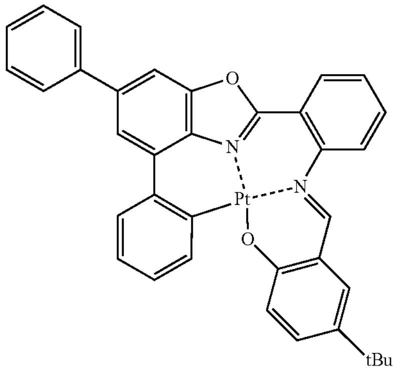
-continued
3-391
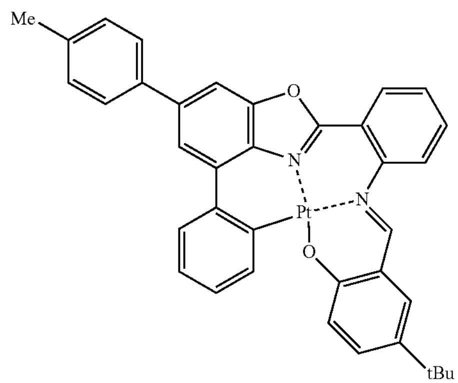
3-392
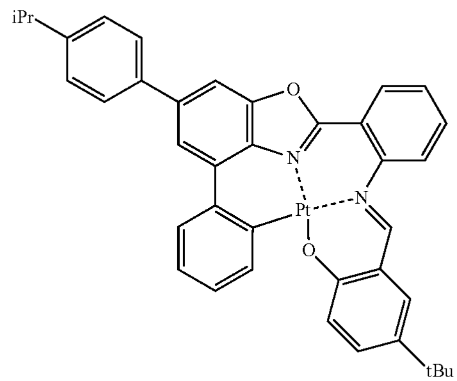
3-393
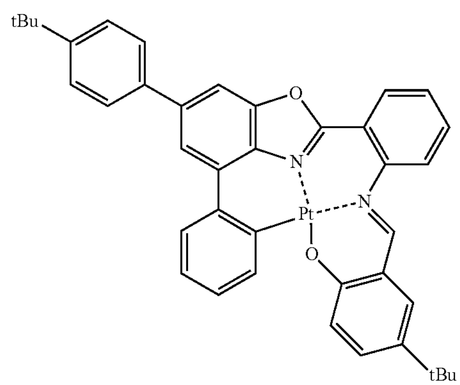
3-394
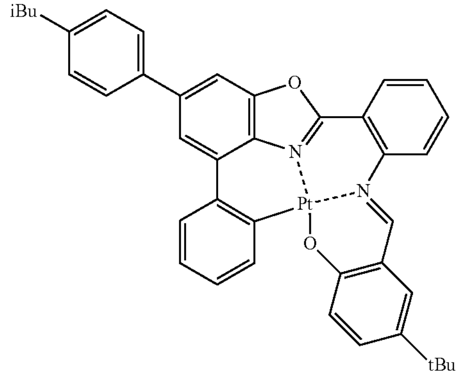

-continued
3-395
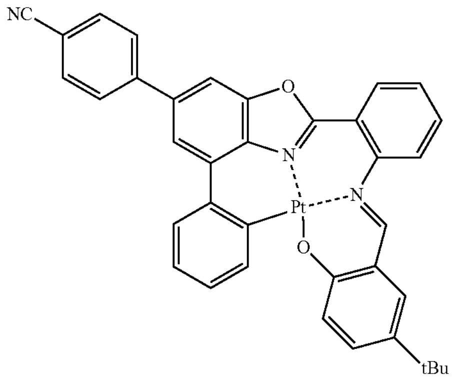
3-396
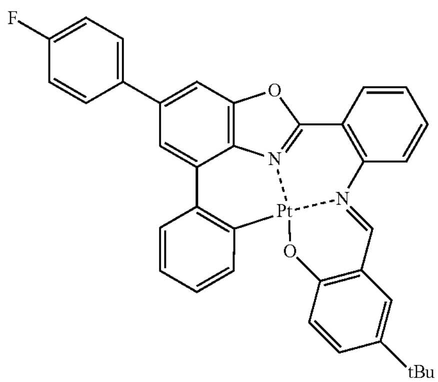
3-397
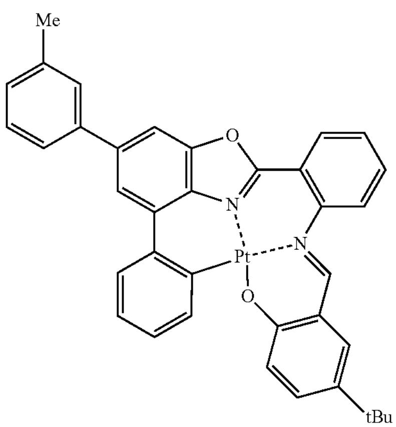
3-398
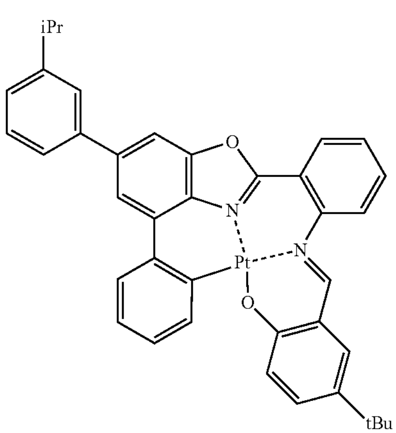
-continued
3-399
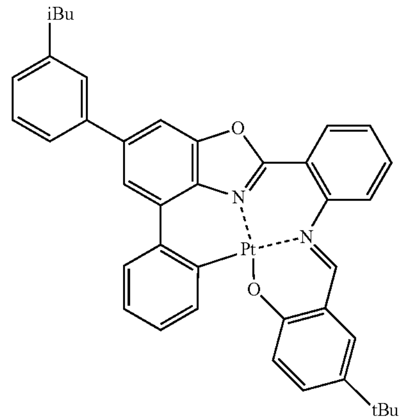
3-400
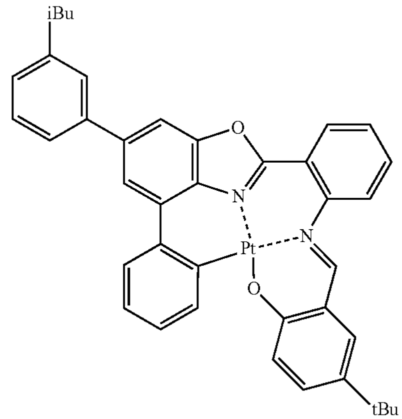
3-401
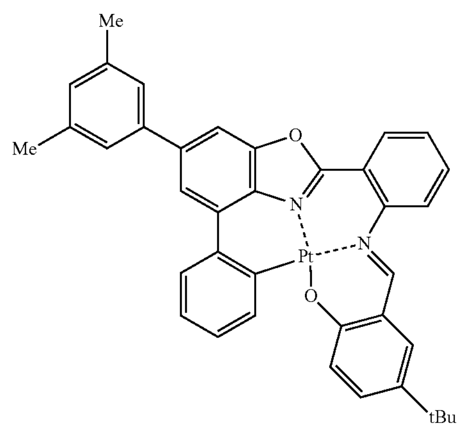
3-402
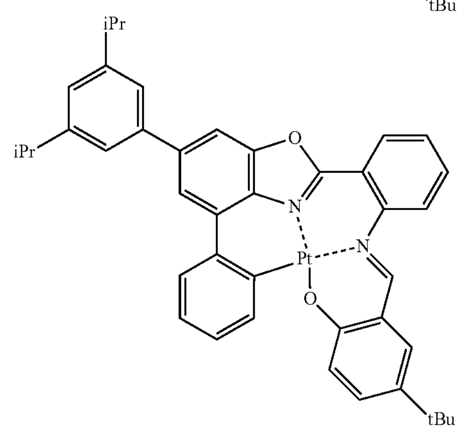

3-403
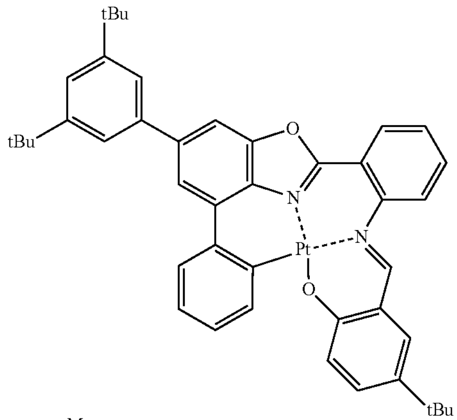
3-404
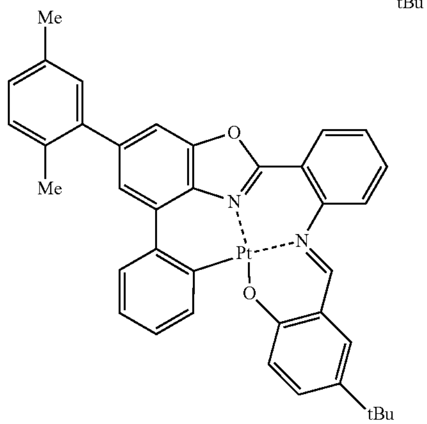
3-405
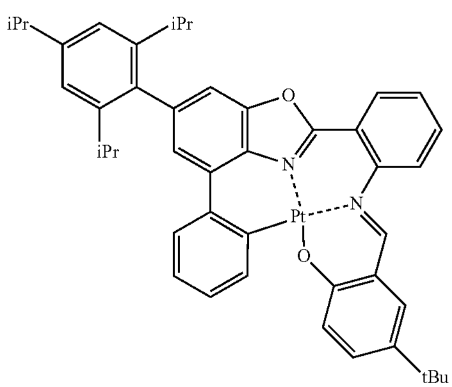
3-406
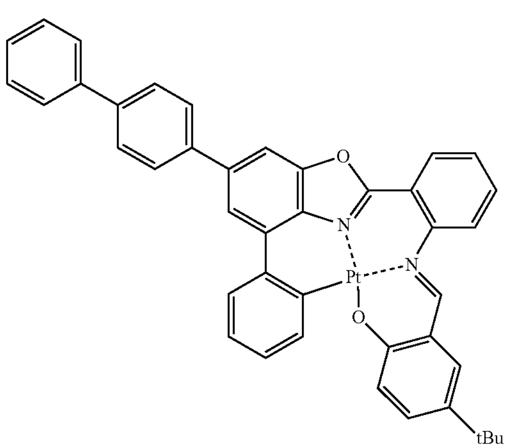
3-407
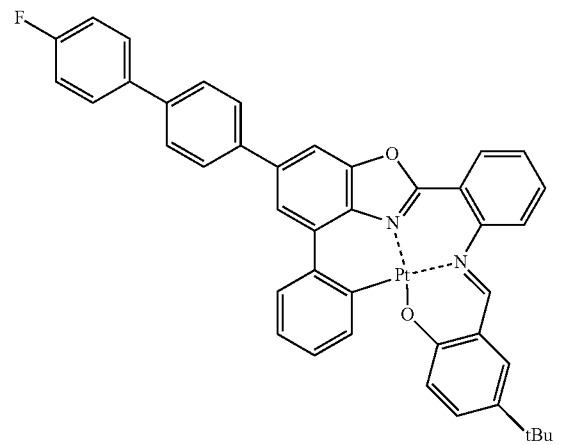
3-408
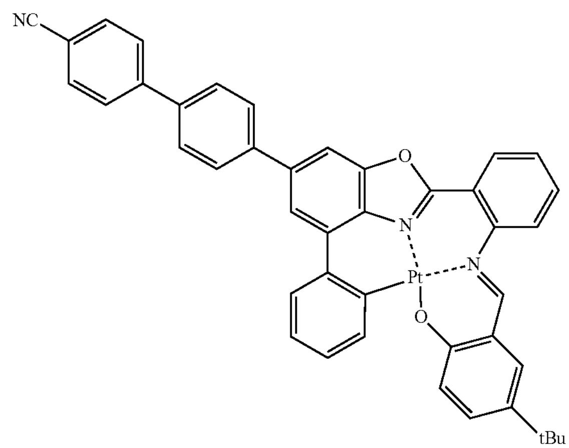
3-409
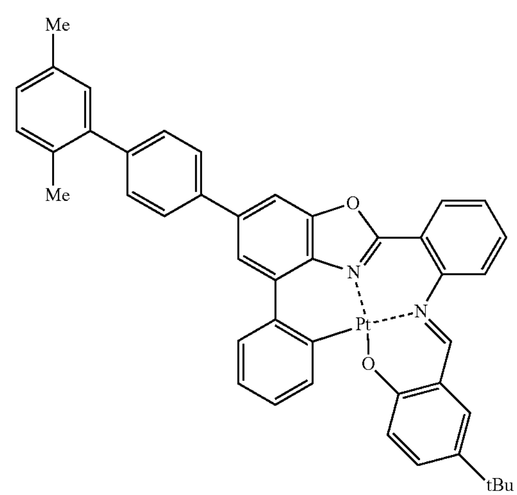

3-410
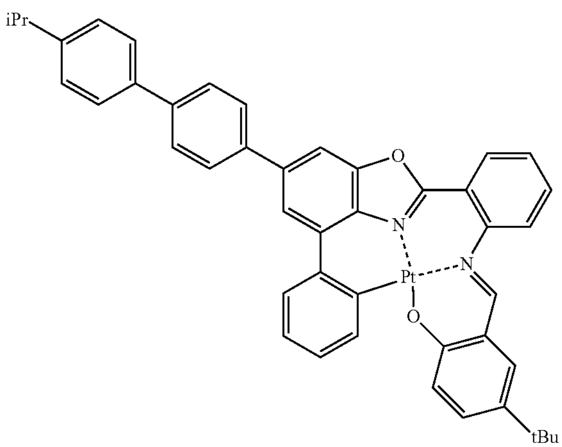
3-411
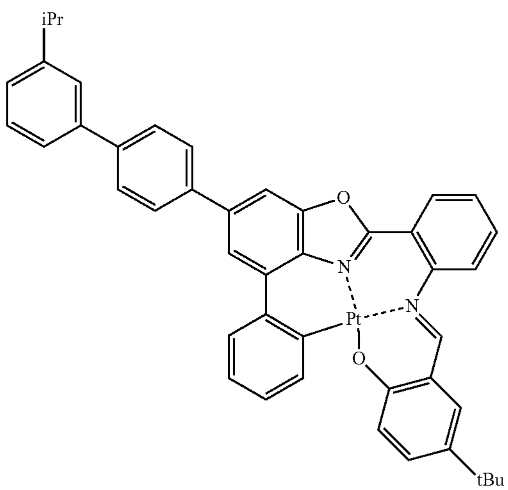
3-412
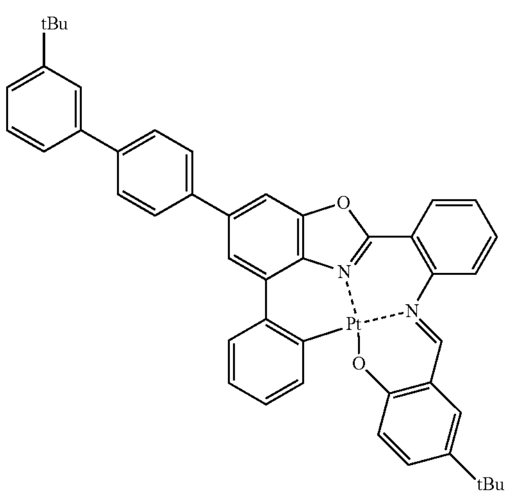
3-413
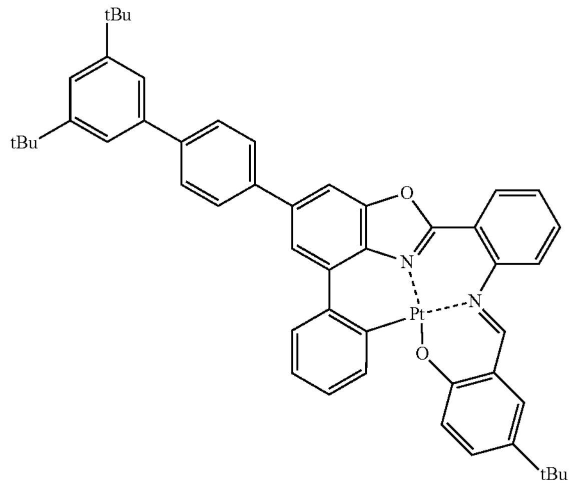
3-414
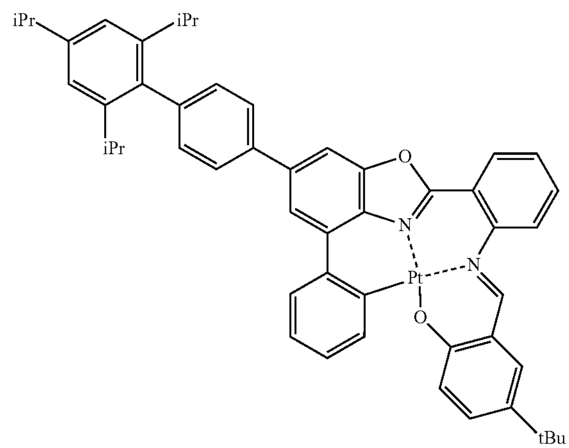
3-415
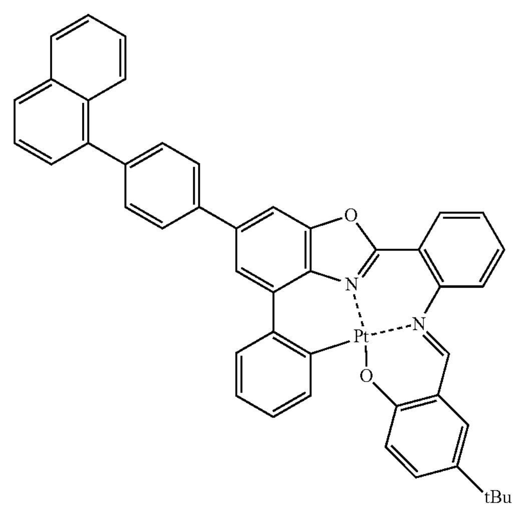

3-416
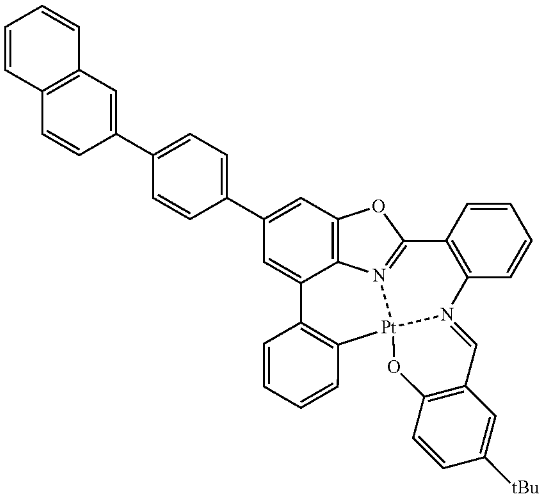
3-417
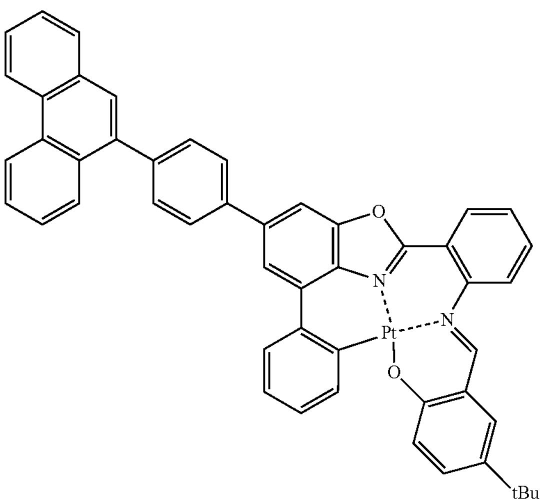
3-418
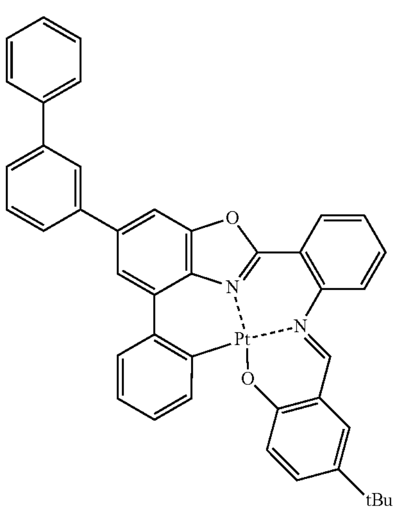
3-419
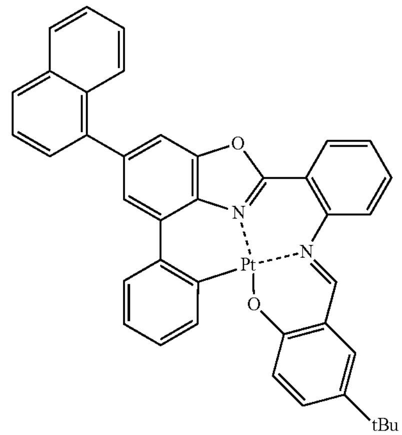
3-420
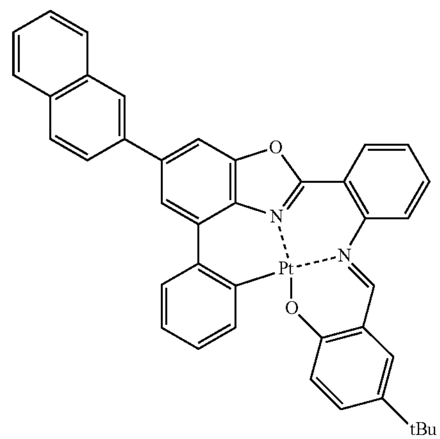
3-421
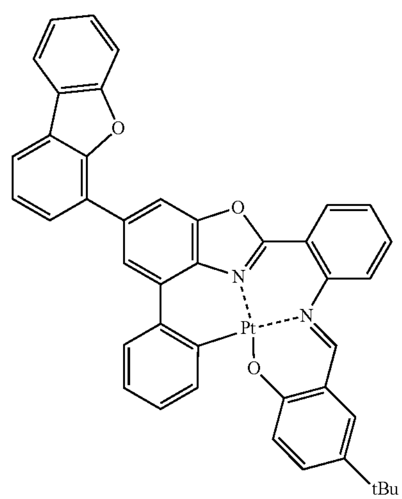

-continued
3-422
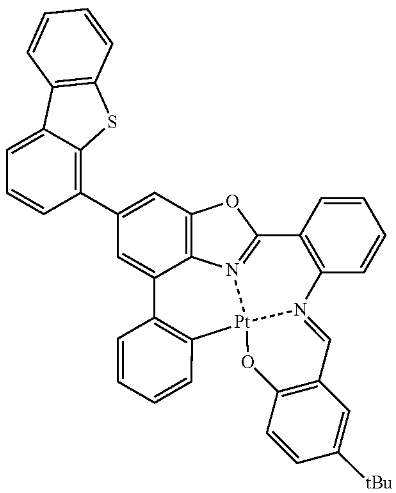
3-423
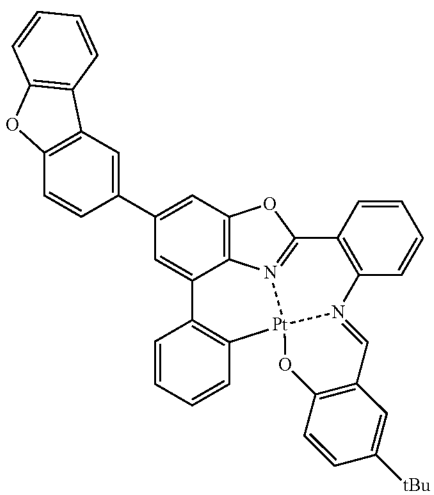
3-424
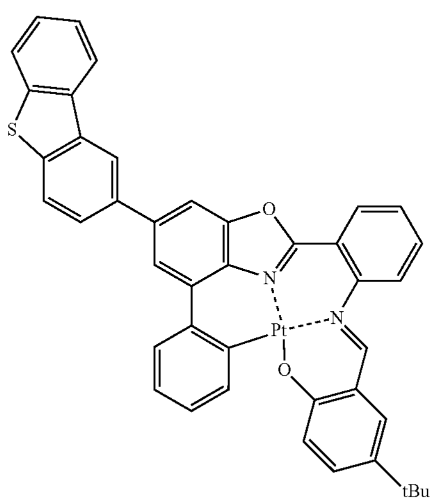
-continued
3-425
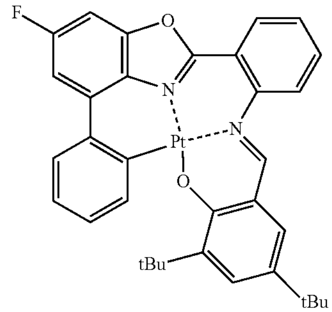
3-426
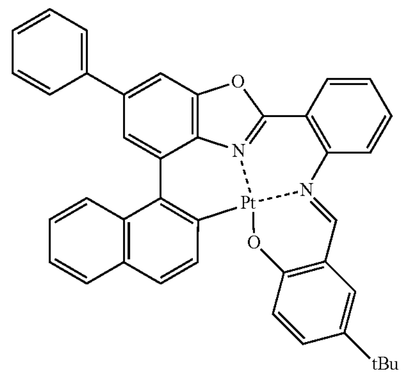
3-427
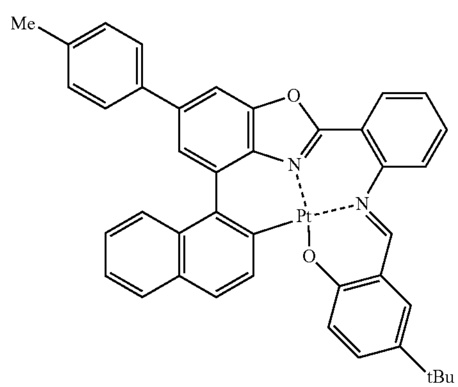
3-428
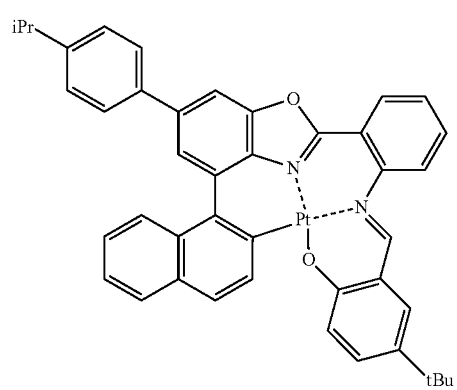

-continued
3-429
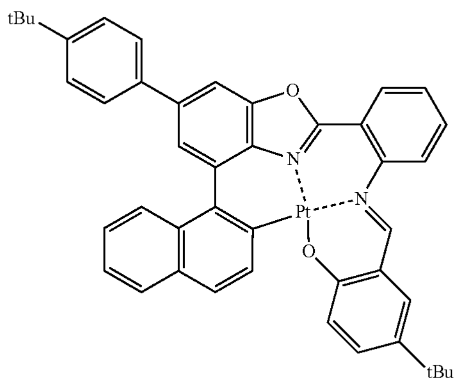
3-430
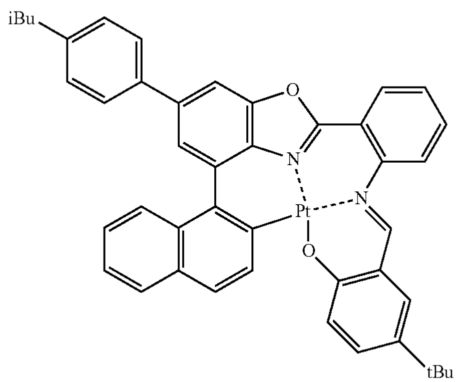
3-431
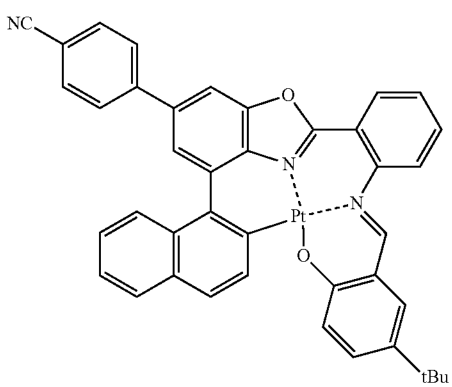
3-432
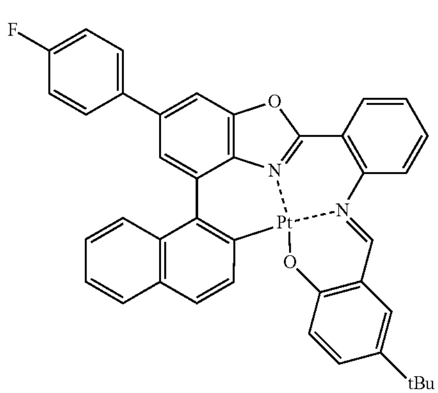
-continued
3-433
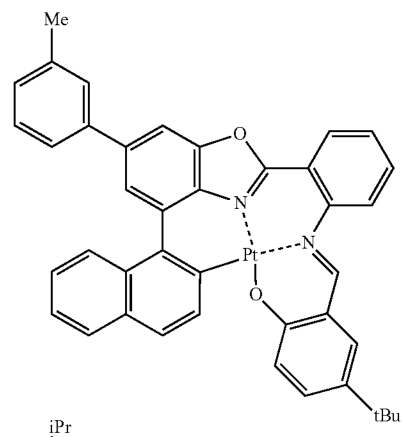
3-434
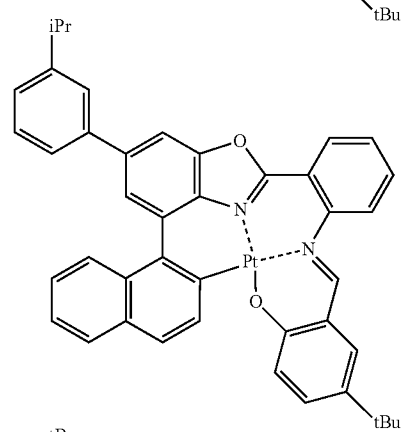
3-435
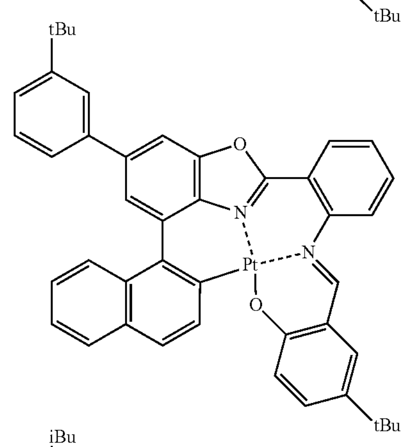
3-436
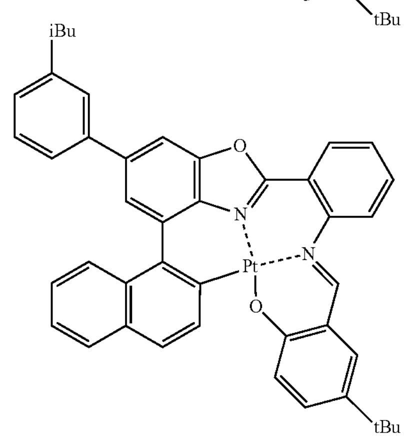

-continued
3-437
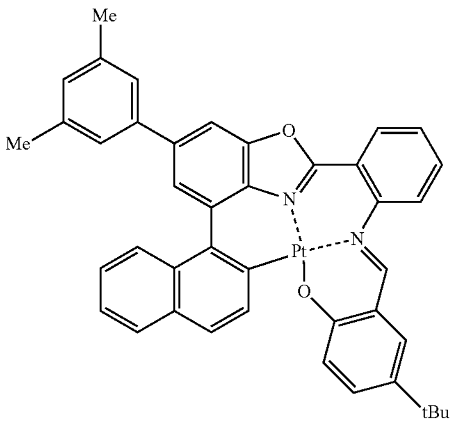
3-438
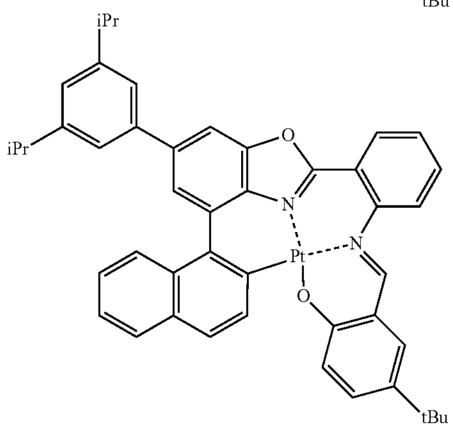
3-439
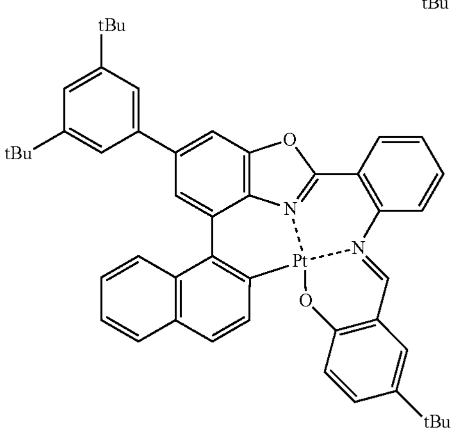
3-440
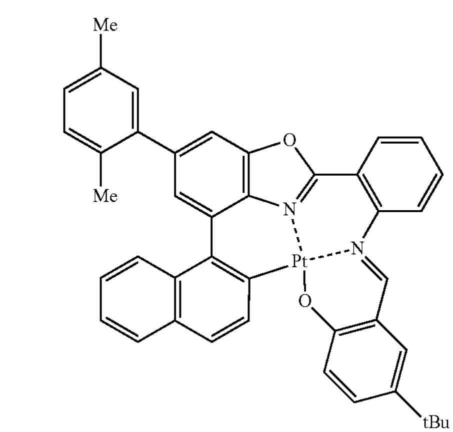
-continued
3-441
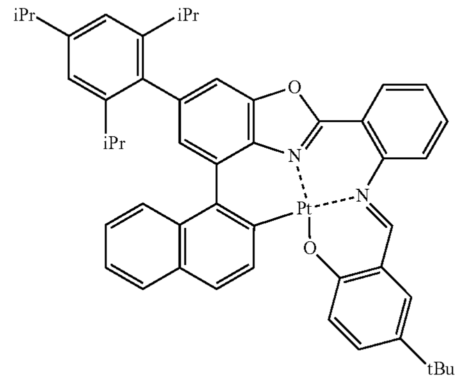
3-442
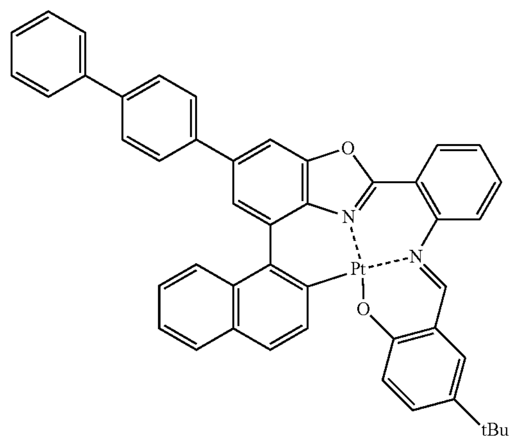
3-443
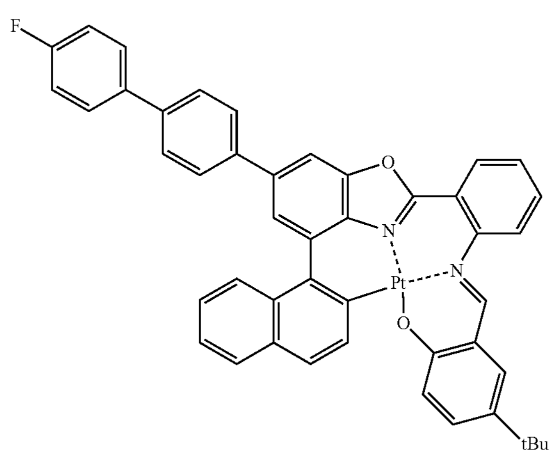

3-444
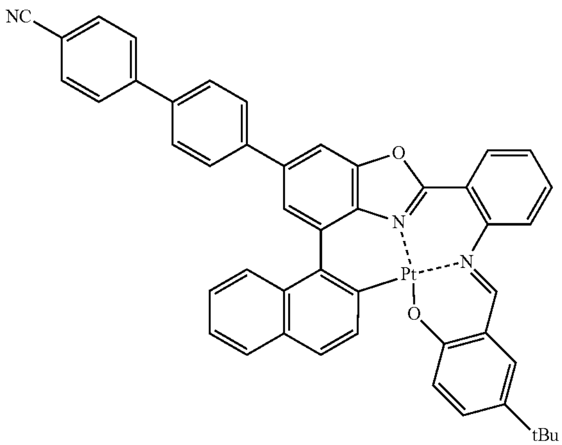
3-445
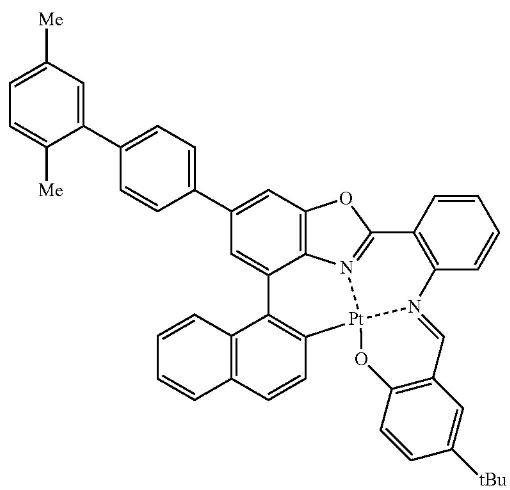
3-446
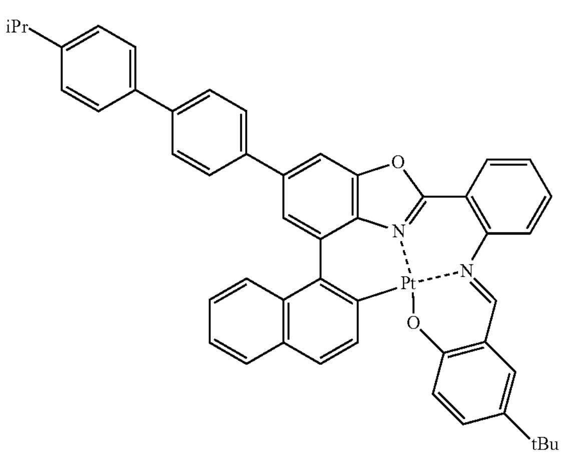
3-447
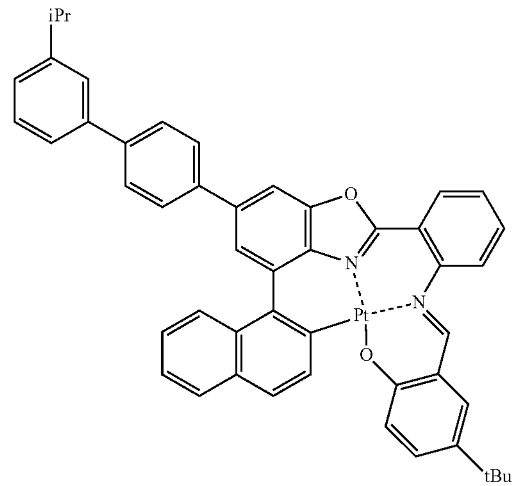
3-448
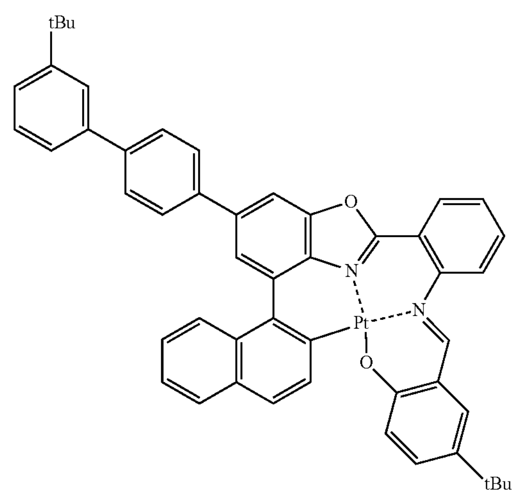
3-449
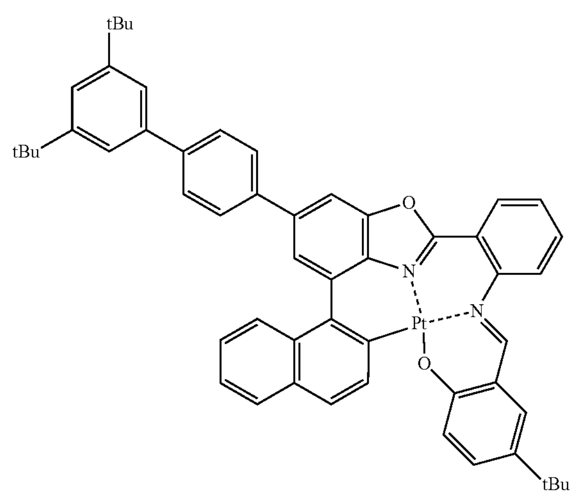

-continued
3-450
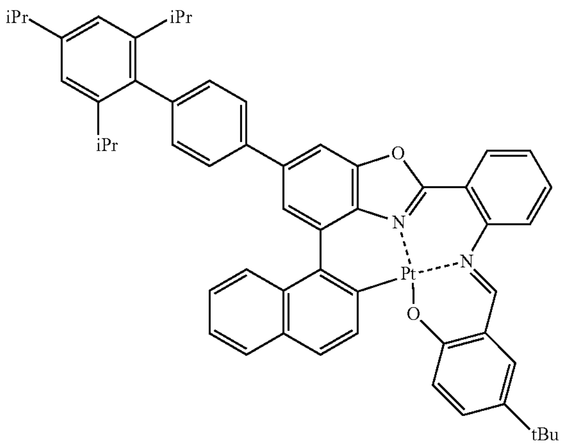
3-451
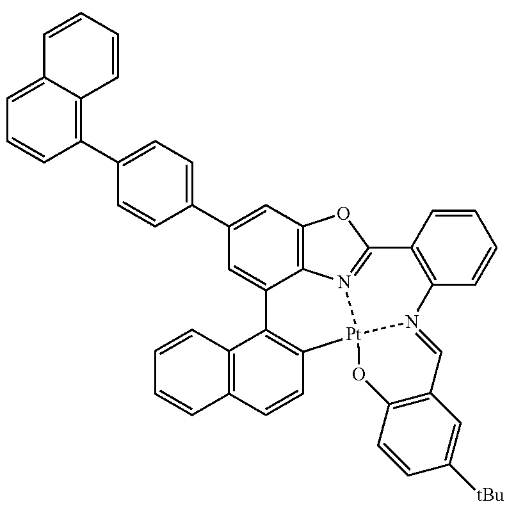
3-452
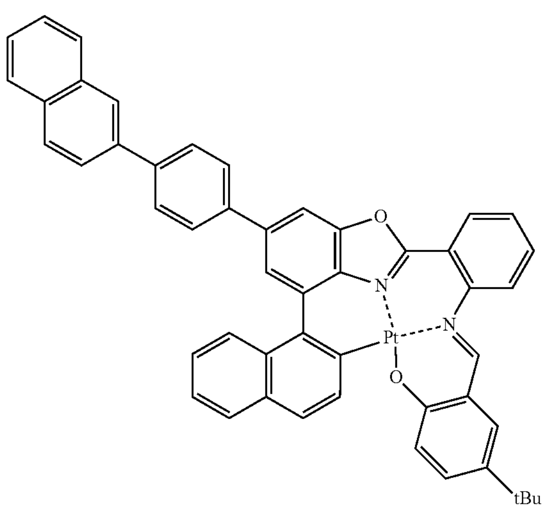
-continued
3-453
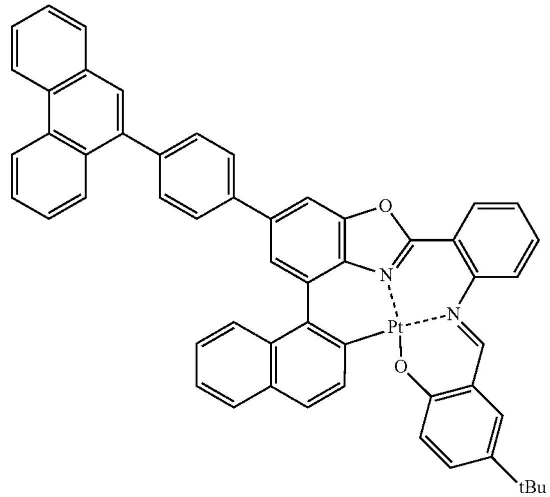
3-454
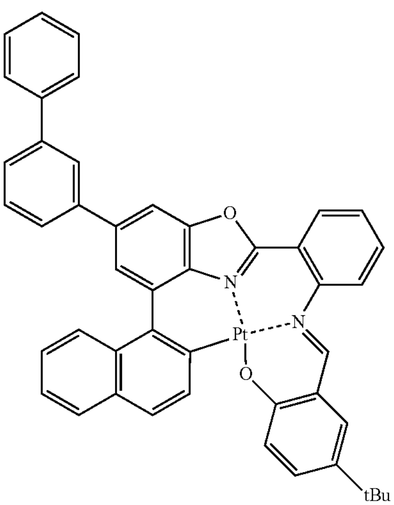
3-455
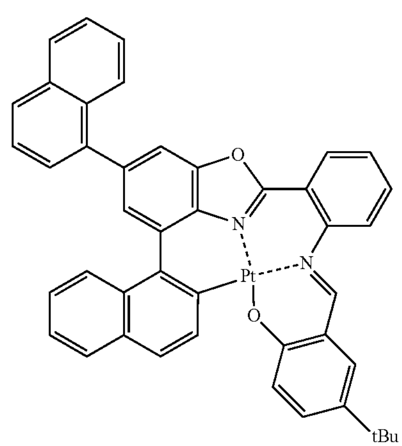

-continued
3-456
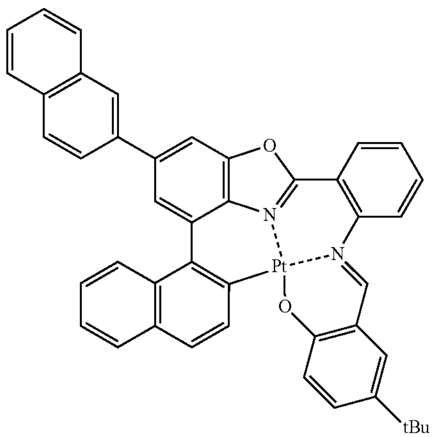
3-457
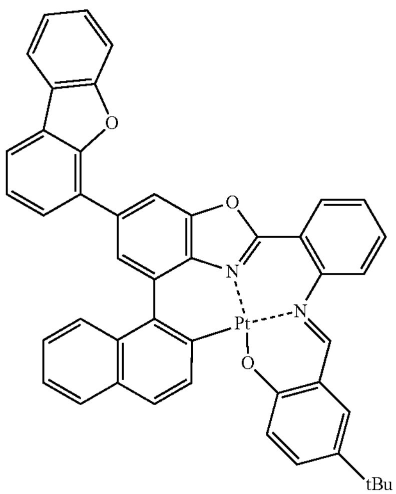
3-458
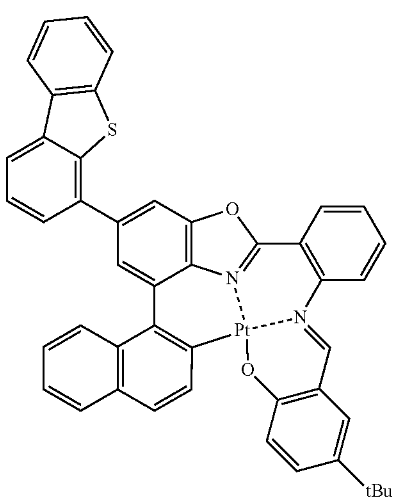
-continued
3-459
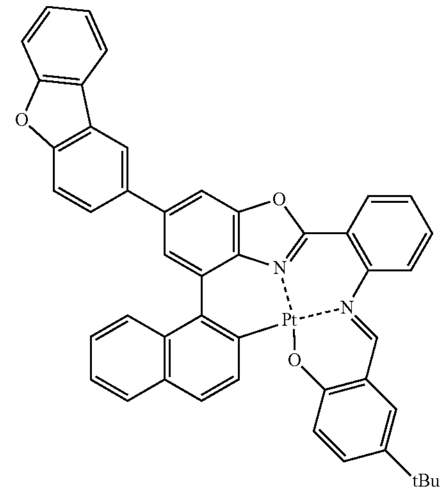
3-460
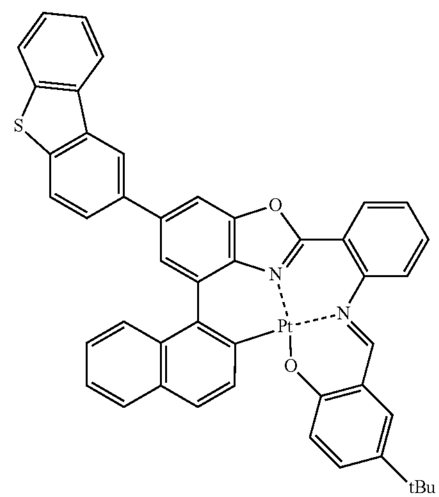
3-461
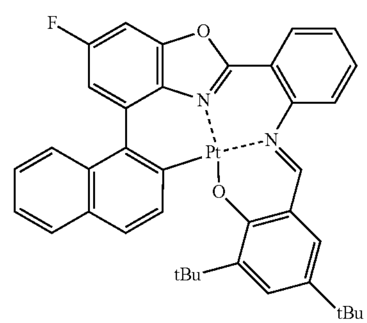

-continued
3-462
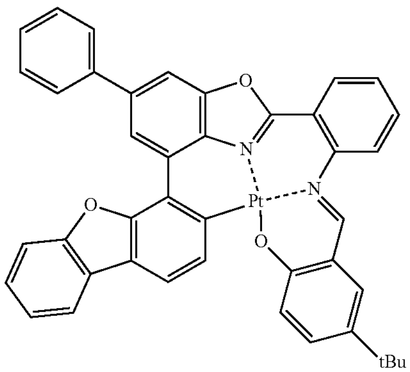
3-463
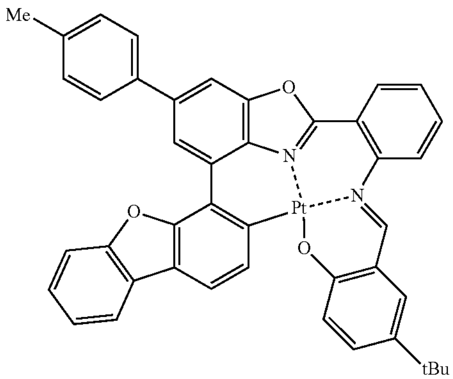
3-464
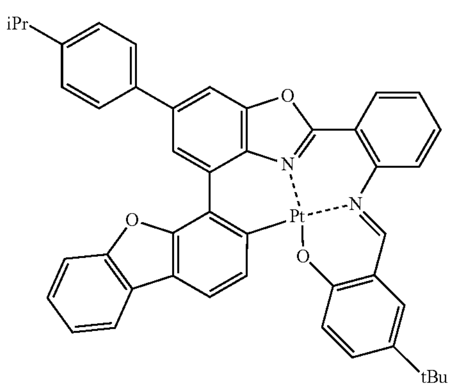
3-465
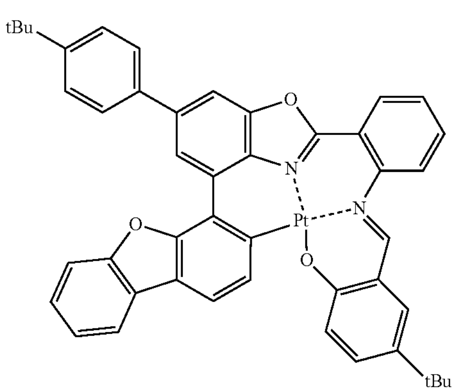
-continued
3-466
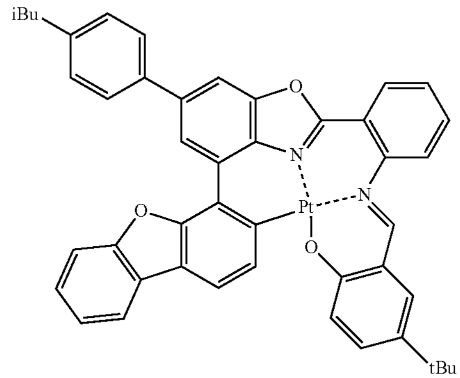
3-467
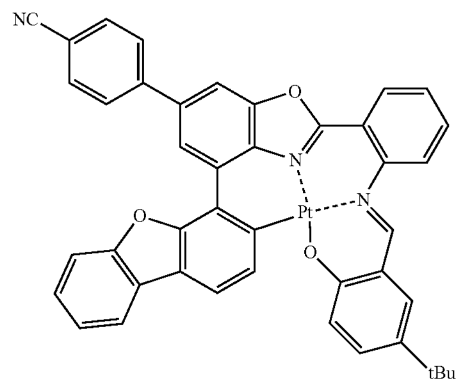
3-468
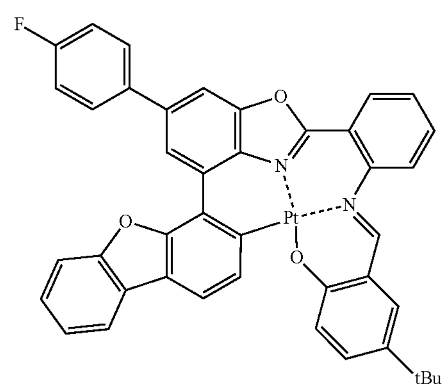
3-469
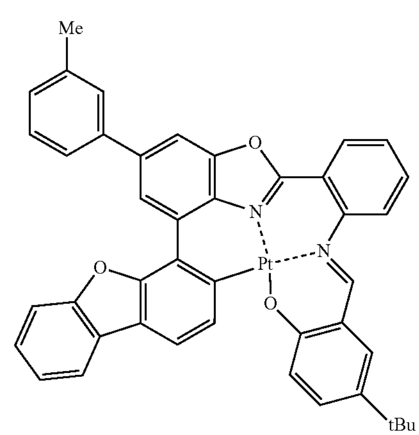

-continued
3-470
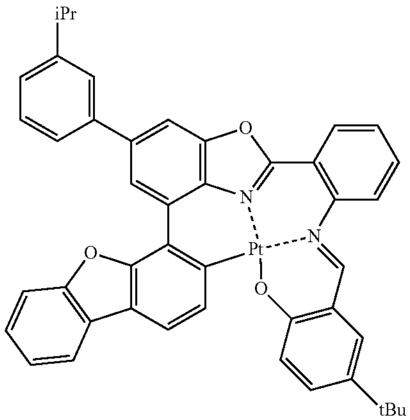
3-471
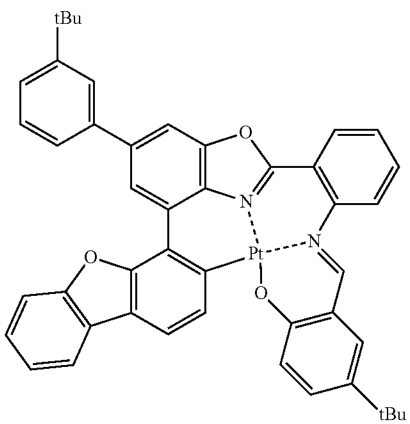
3-472
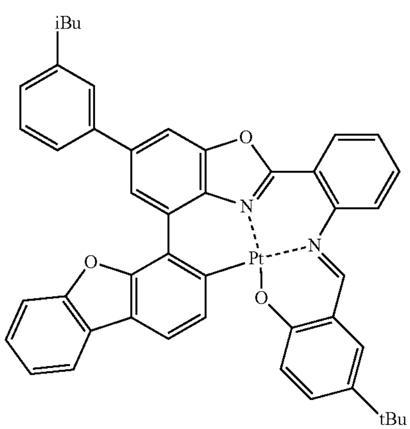
-continued
3-473
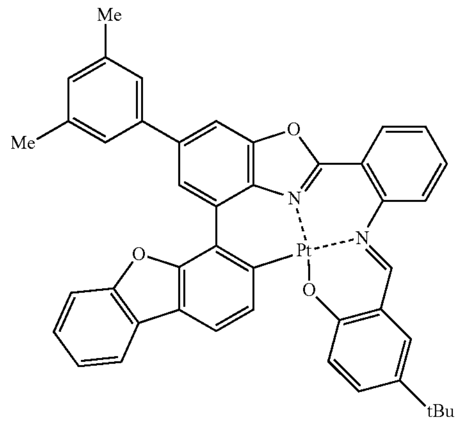
3-474
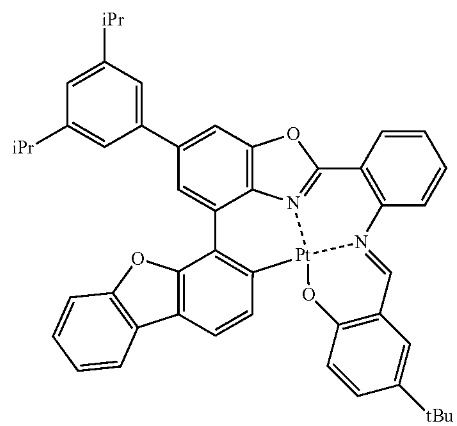
3-475
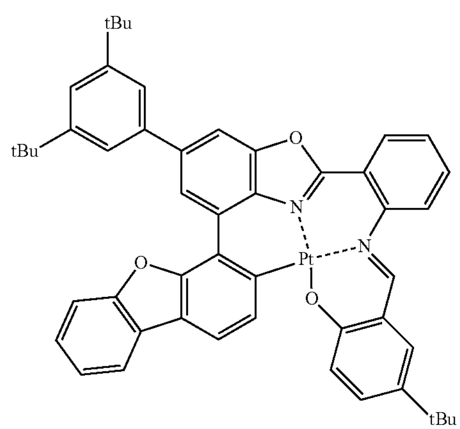

-continued
3-476
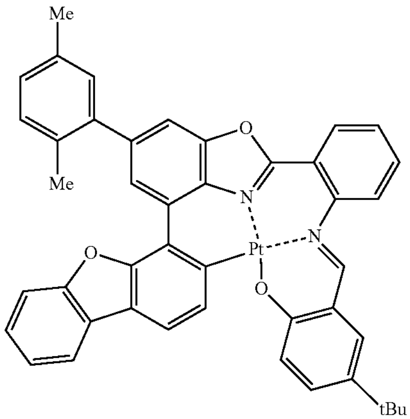
3-477
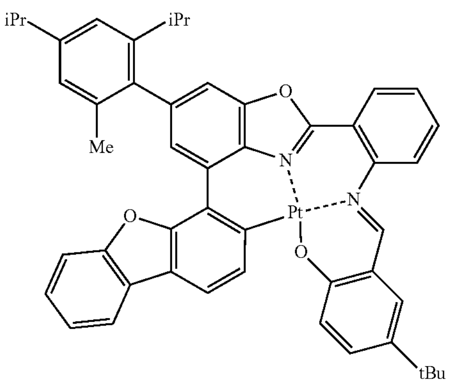
3-478
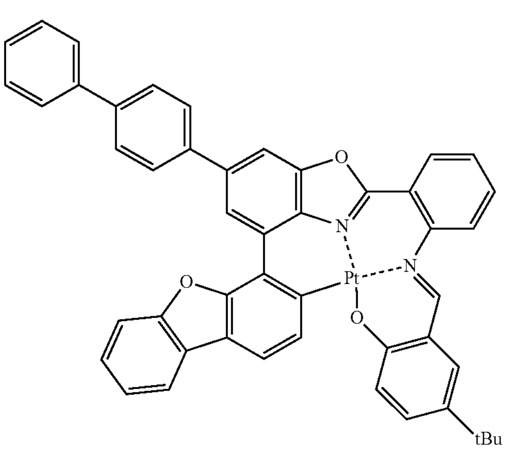
-continued
3-479
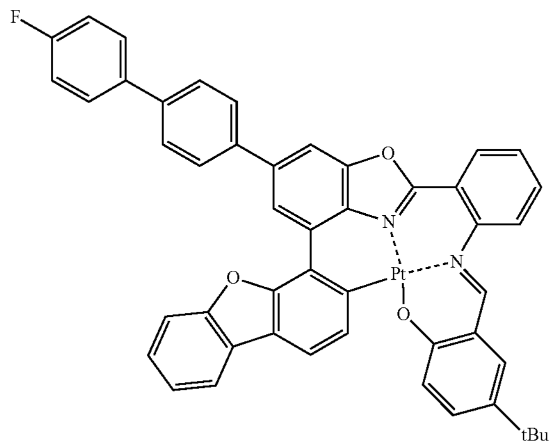
3-480
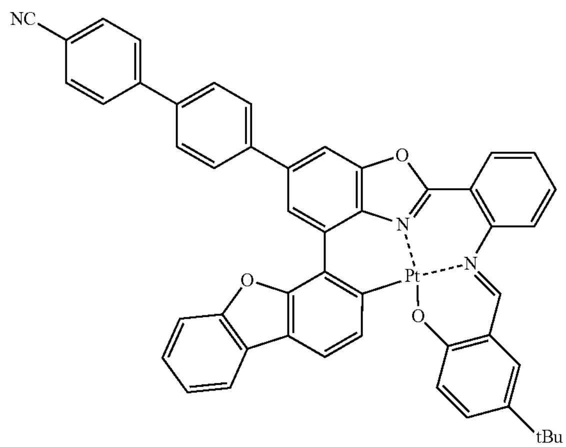
3-481
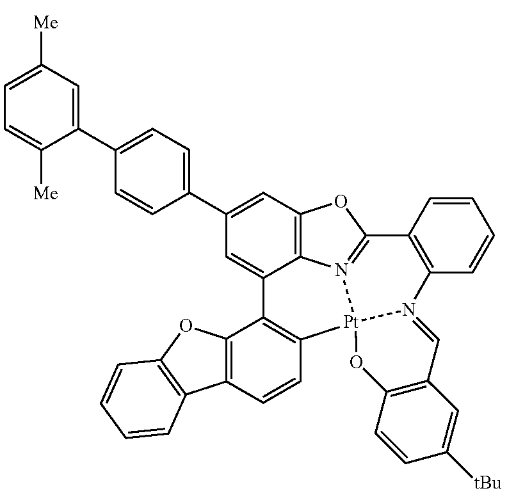

3-482
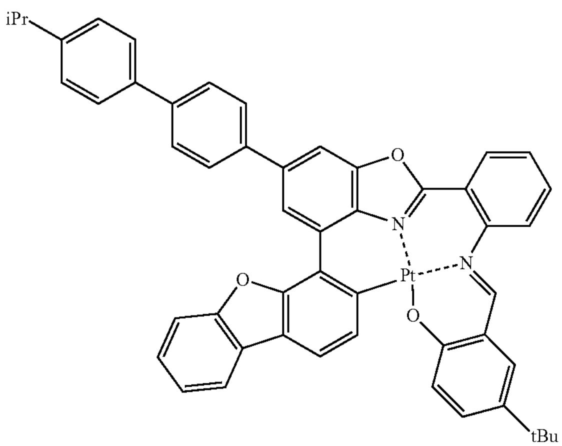
3-483
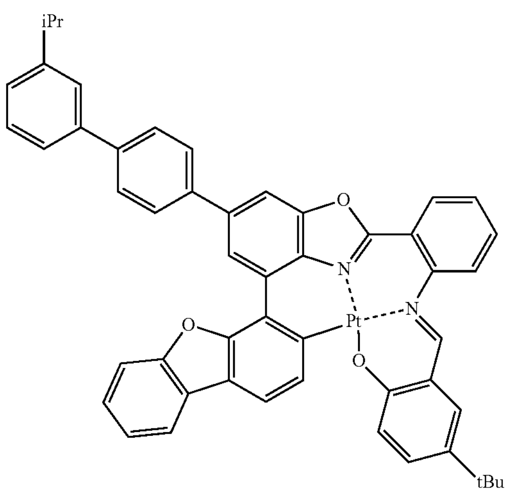
3-484
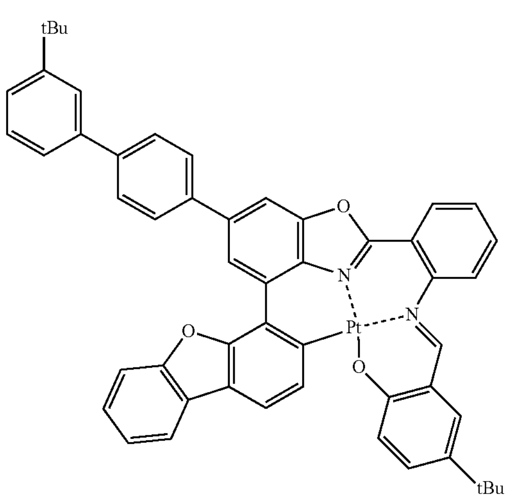
3-485
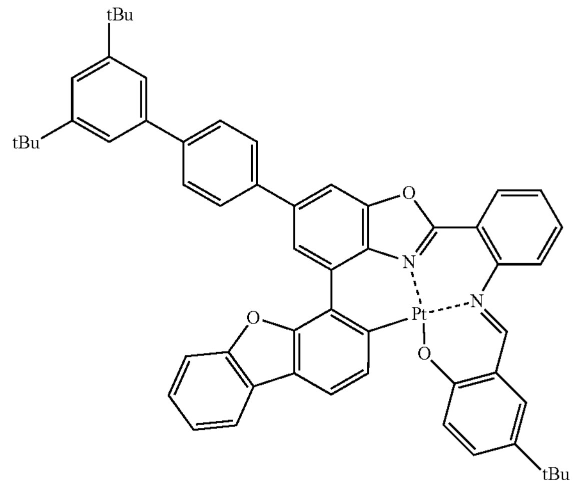
3-486
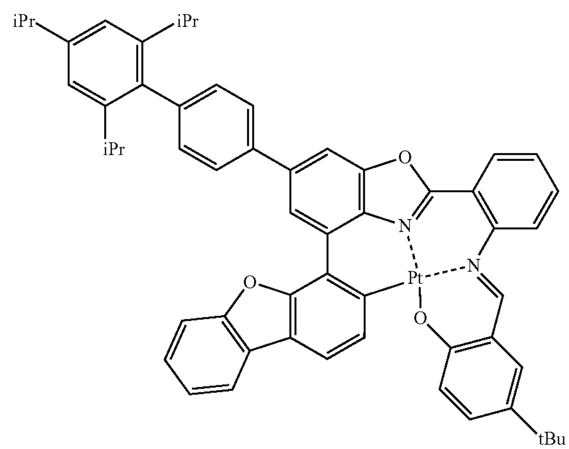
3-487
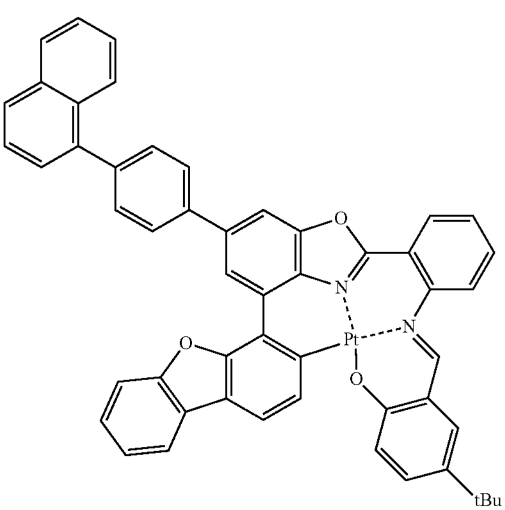

-continued
3-488
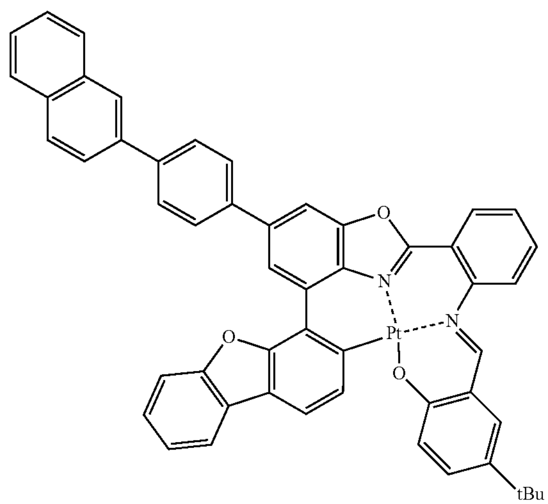
3-489
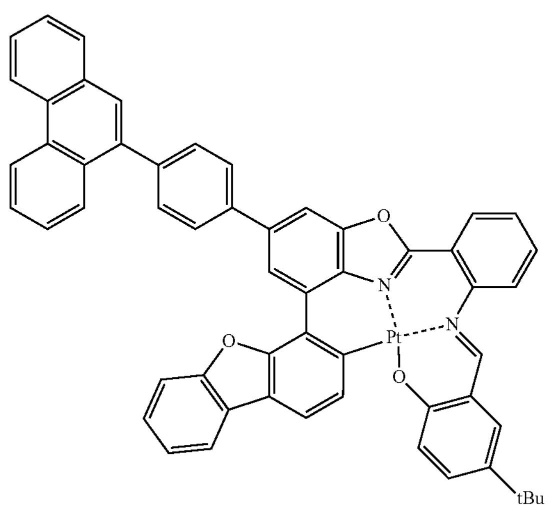
3-490
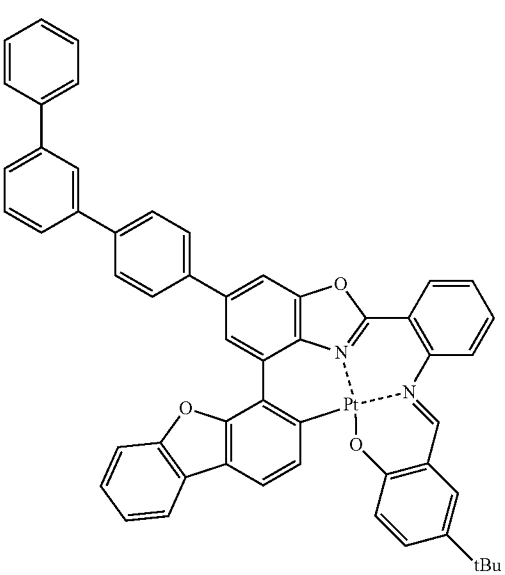
-continued
3-491
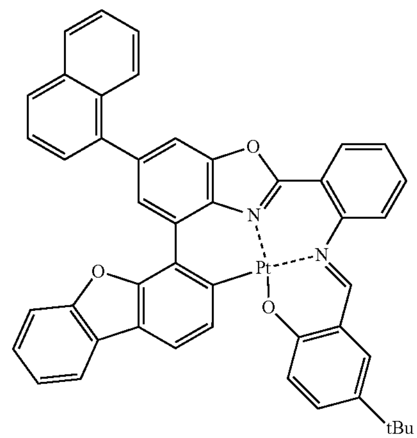
3-492
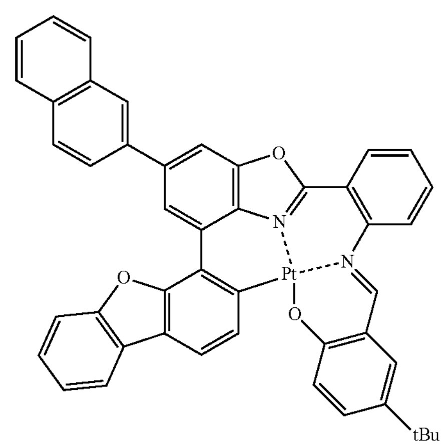
3-493
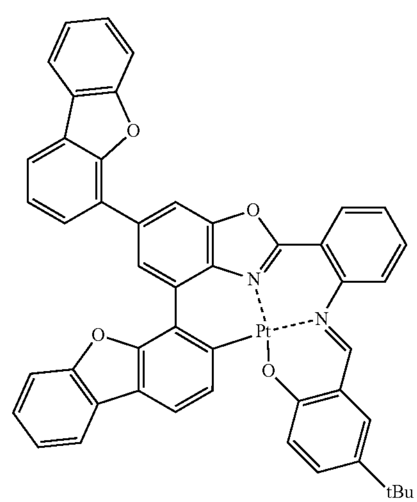

-continued
3-450
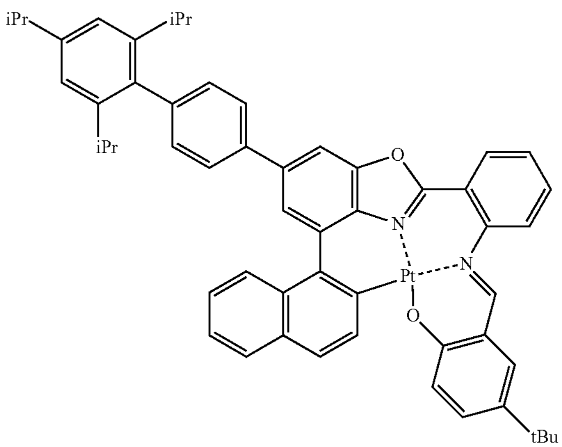
3-451
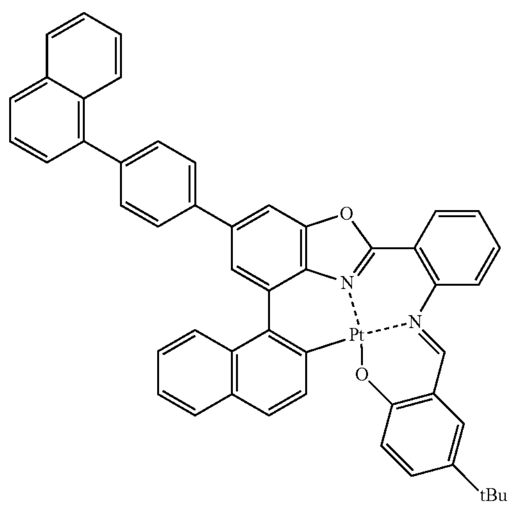
3-452
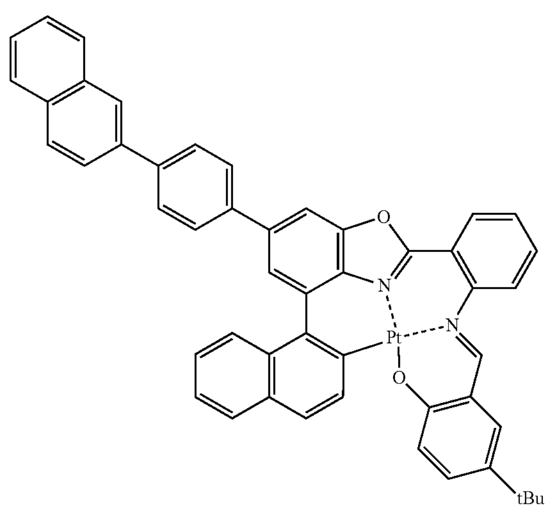
-continued
3-453
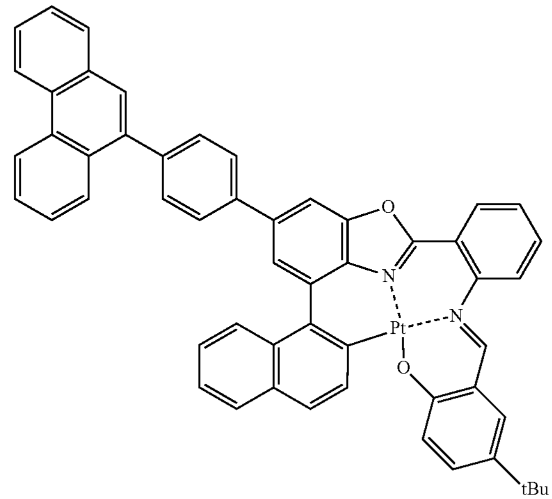
3-454
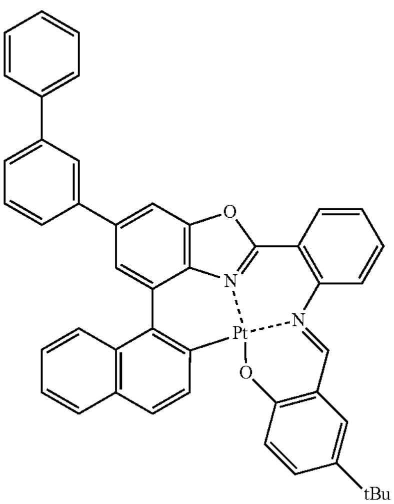
3-455
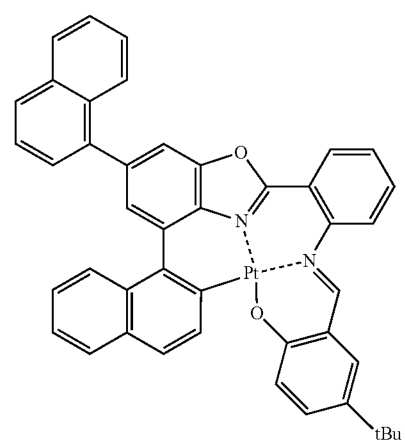

-continued
3-456
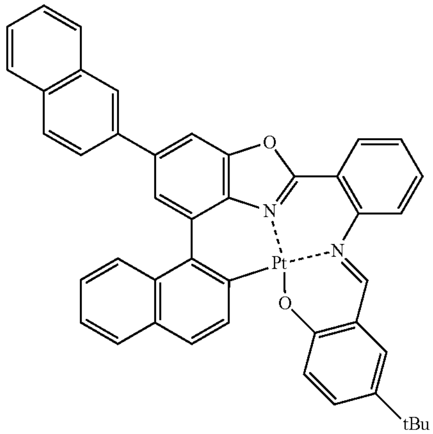
3-457
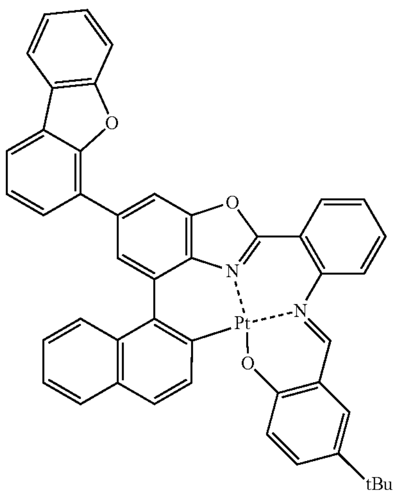
3-458
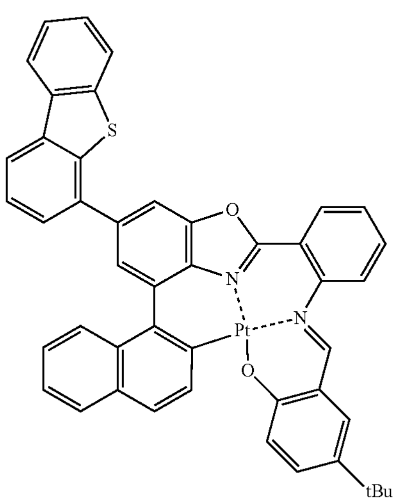
-continued
3-459
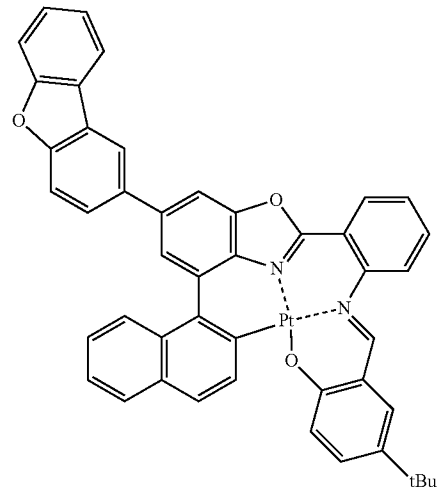
3-460
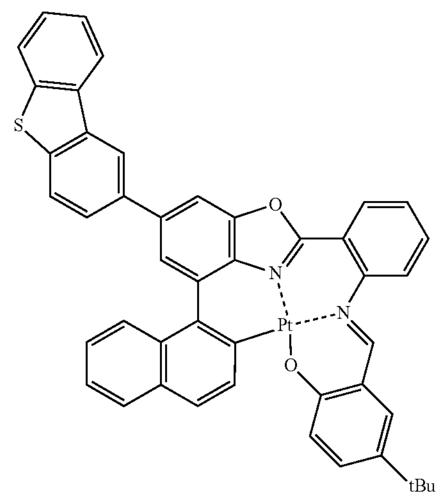
3-461
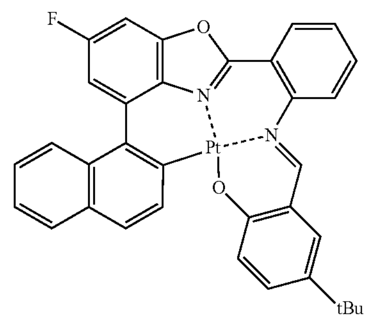

-continued
3-462
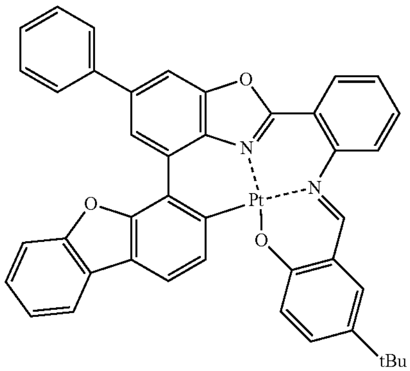
3-463
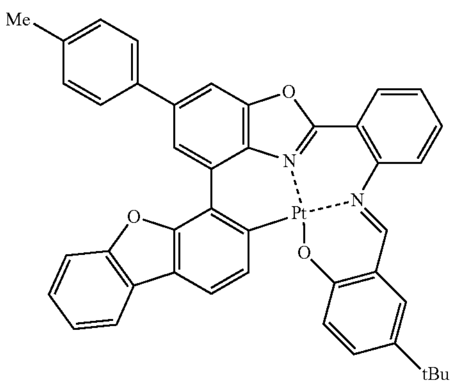
3-464
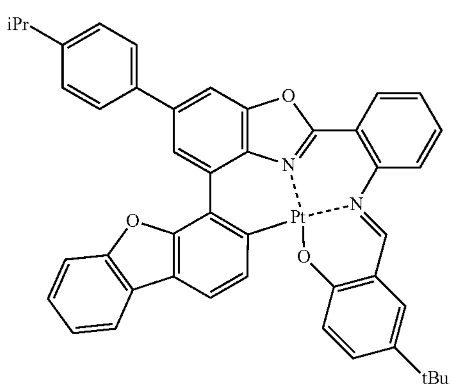
3-465
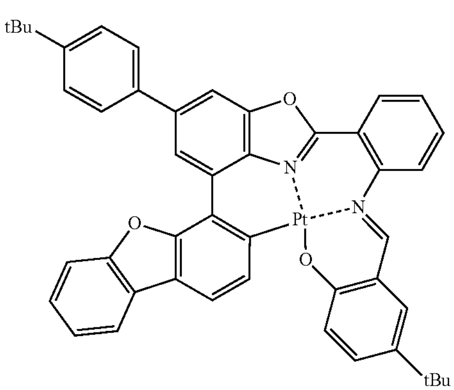
-continued
3-466
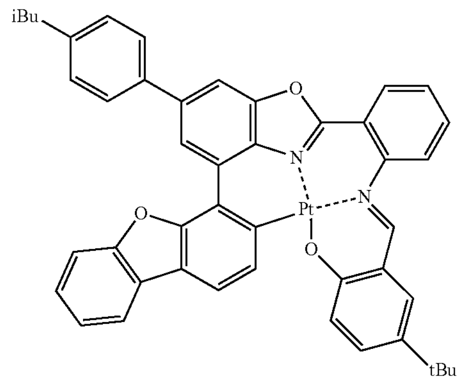
3-467
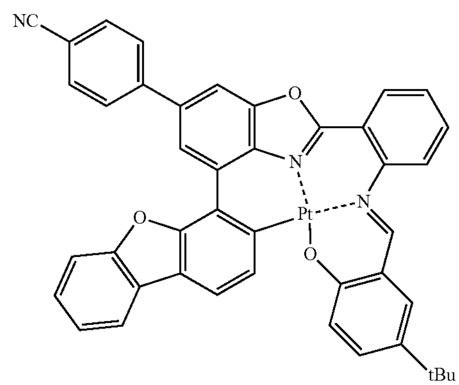
3-468
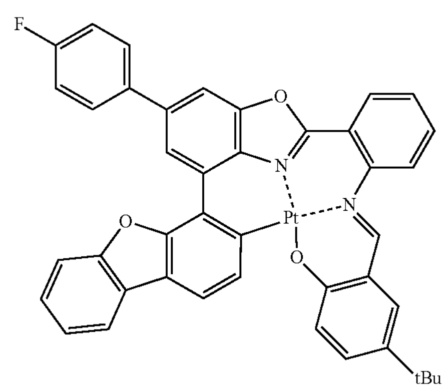
3-469
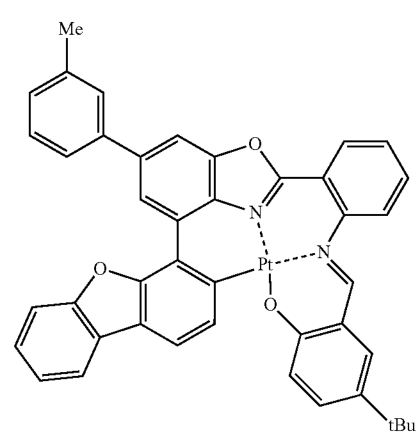

-continued
3-470
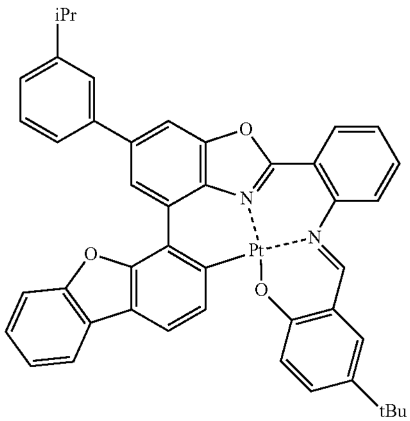
3-471
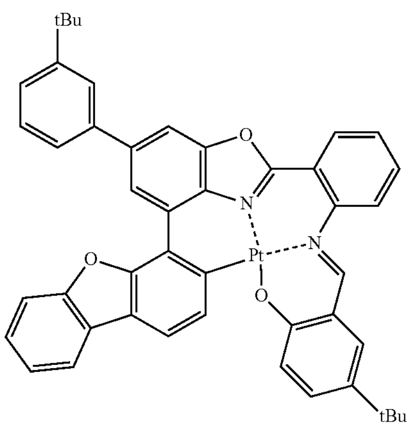
3-472
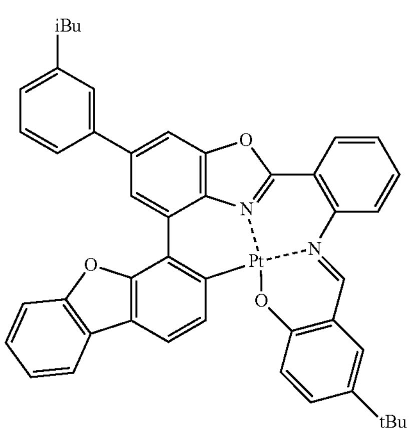
-continued
3-473
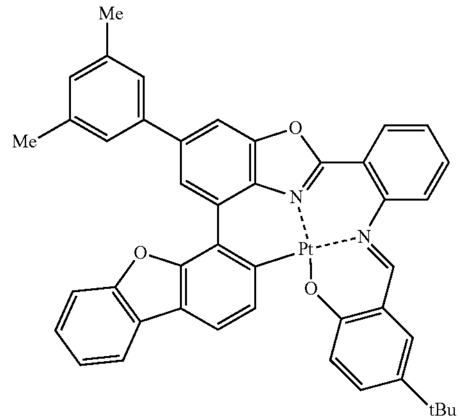
3-474
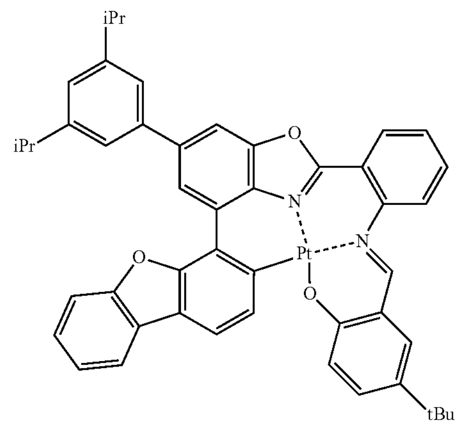
3-475
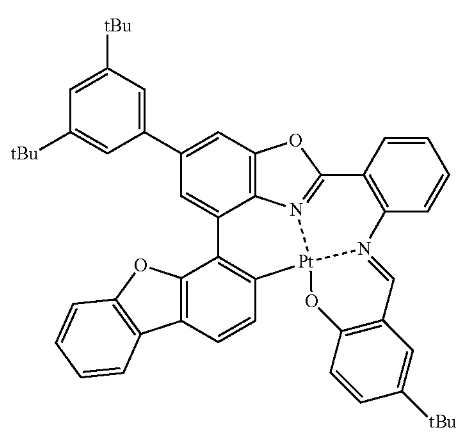

3-476
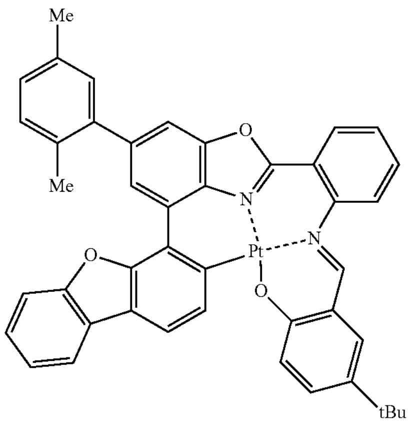
3-477
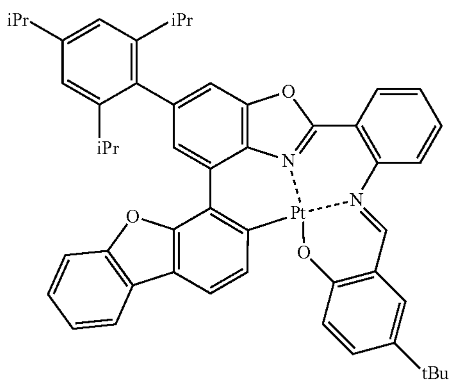
3-478
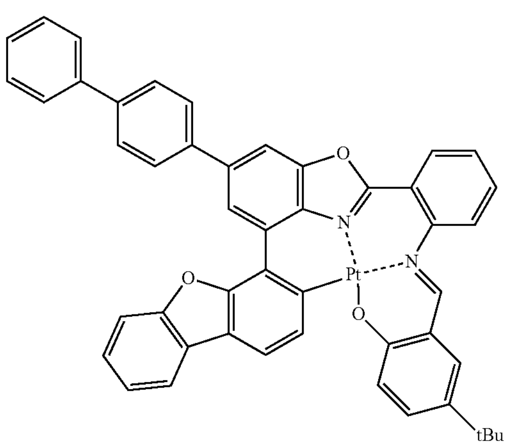
3-479
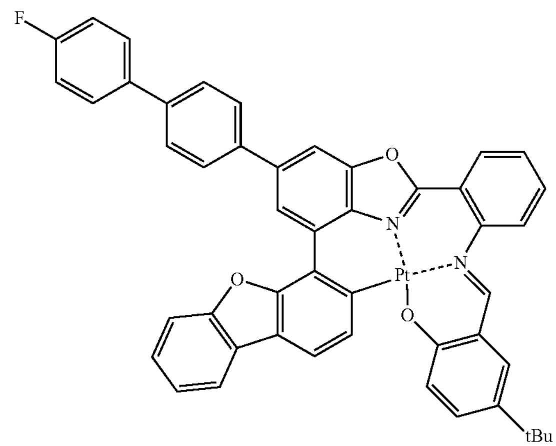
3-480
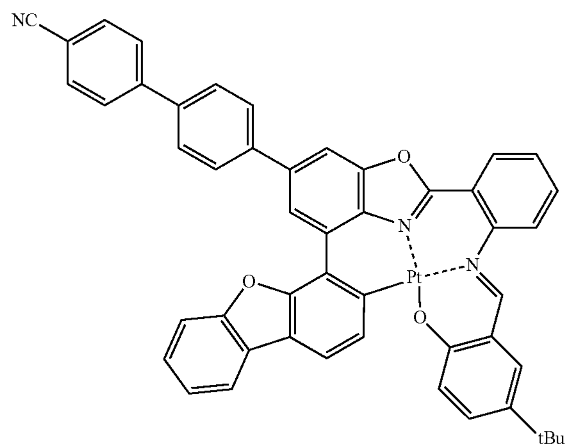
3-481
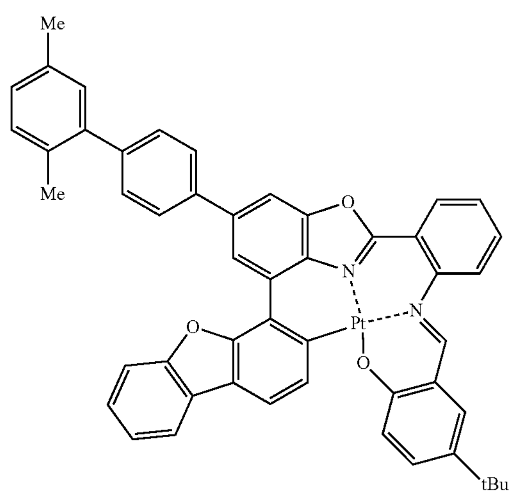

-continued
3-482
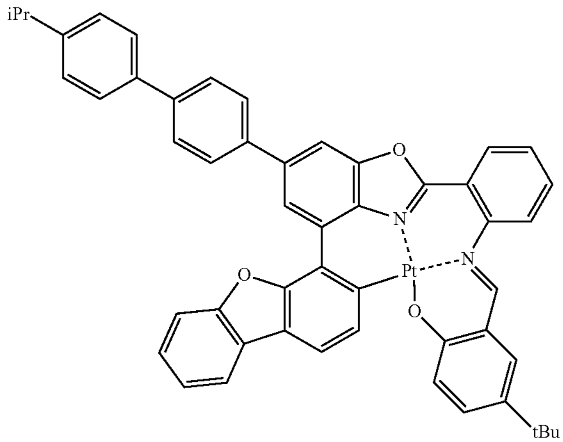
3-483
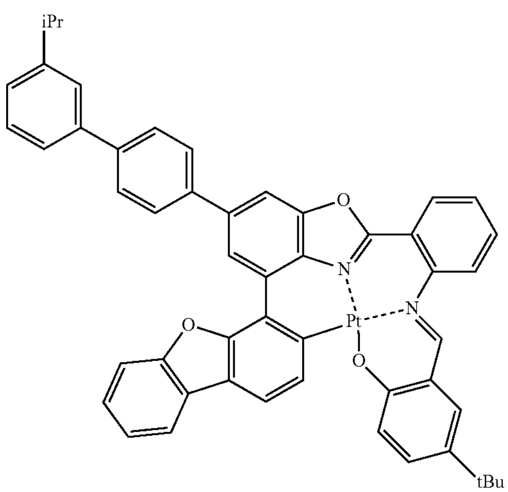
3-484
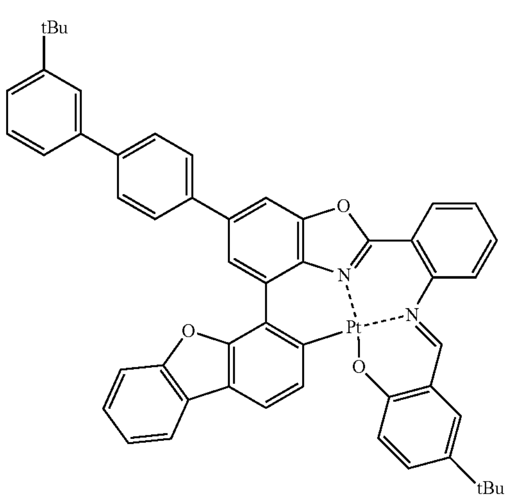
-continued
3-485
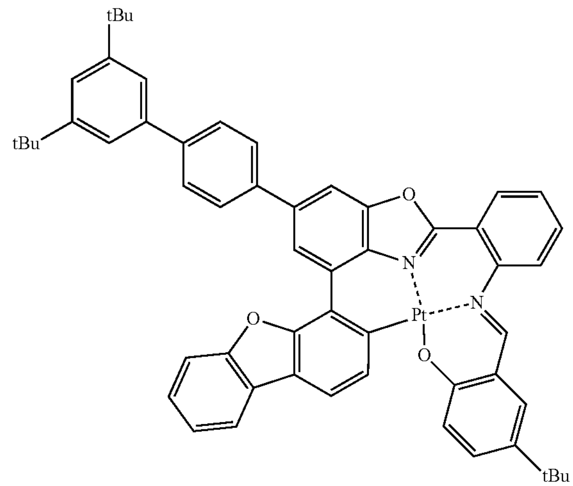
3-486
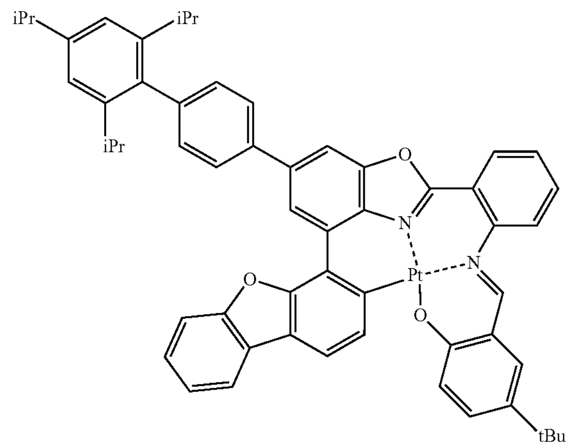
3-487
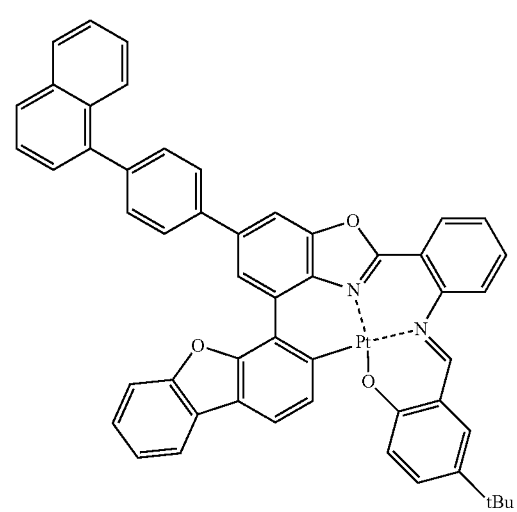

-continued
3-488
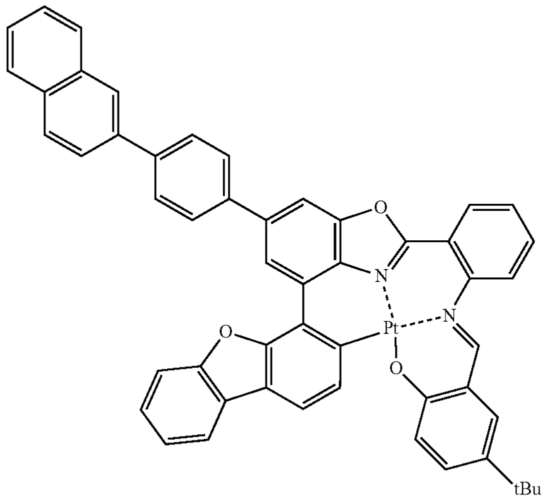
3-489
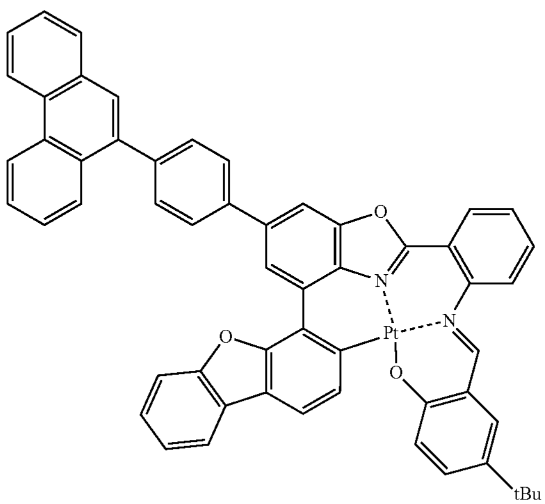
3-490
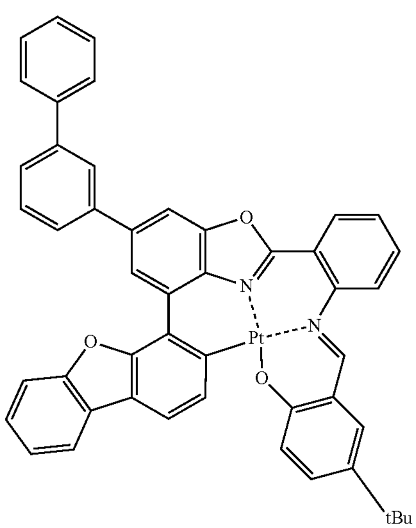
-continued
3-491
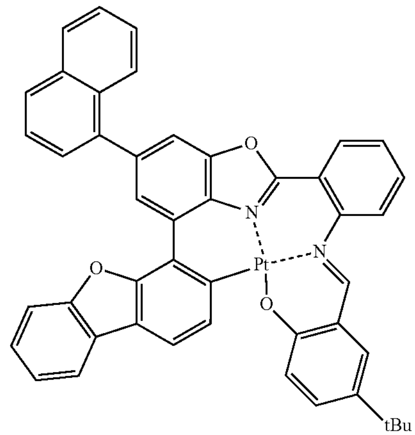
3-492
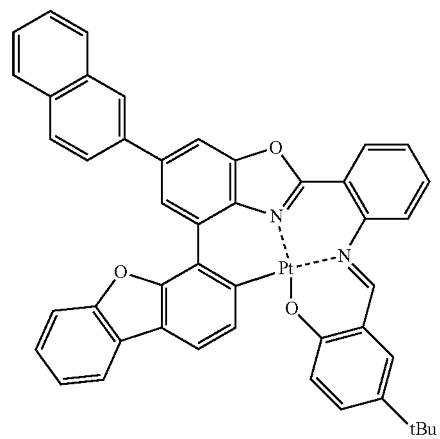
3-493
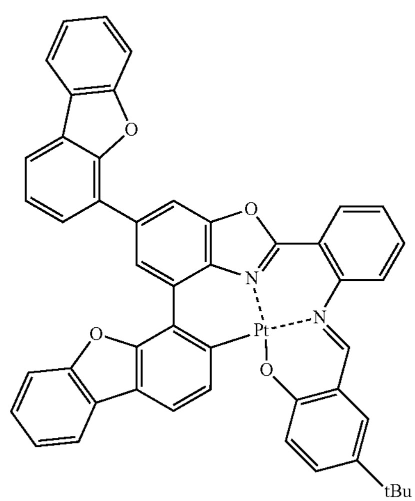

-continued
3-494
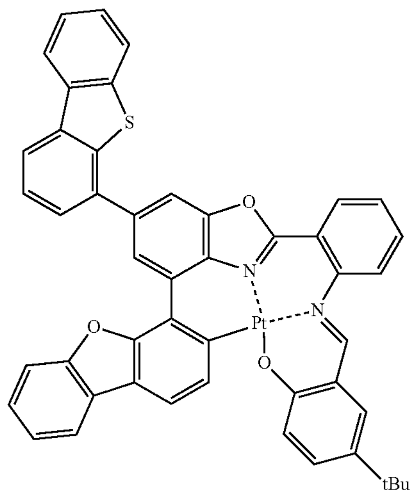
3-495
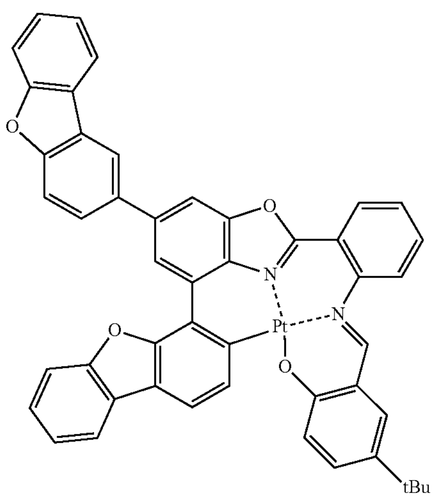
3-496
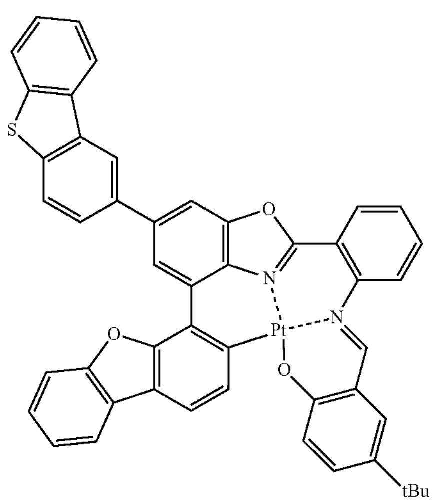
-continued
3-497
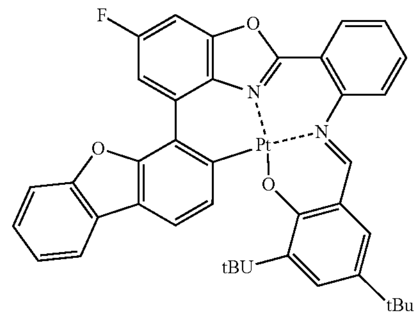
3-498
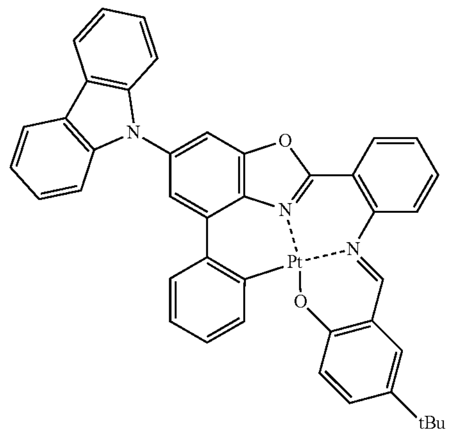
3-499
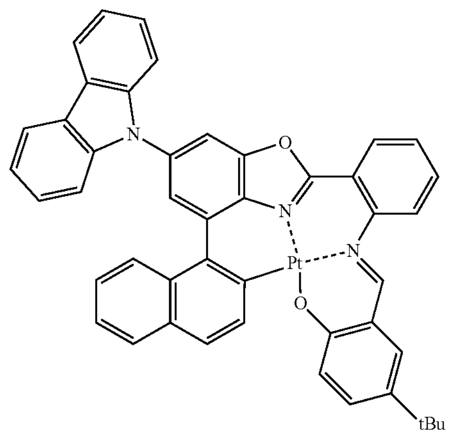
3-500
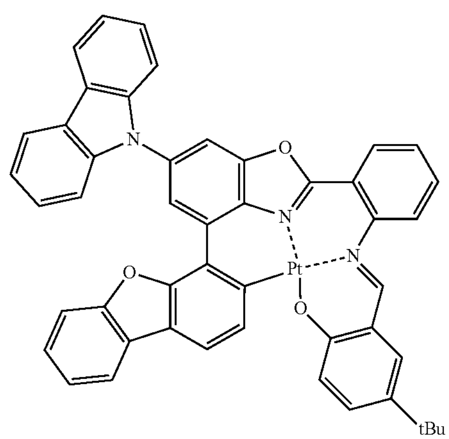

-continued
3-501
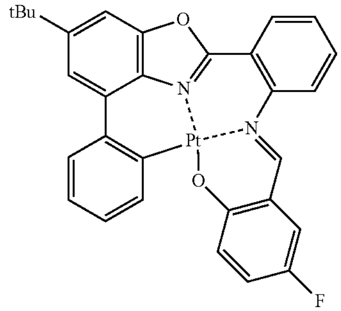
3-502
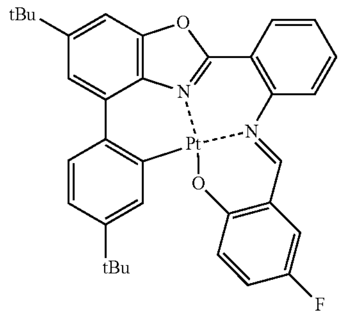
3-503
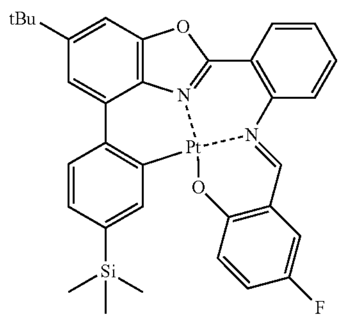
3-504
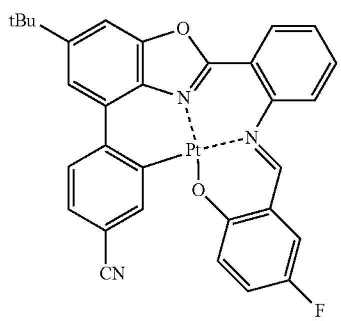
3-505
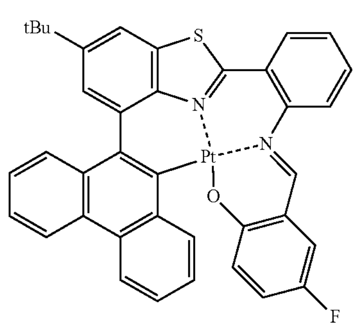
-continued
3-506
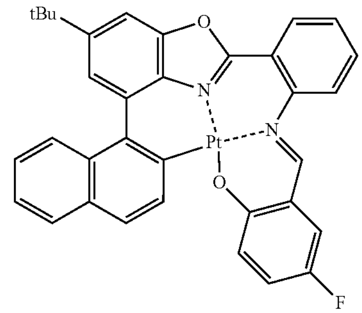
3-507
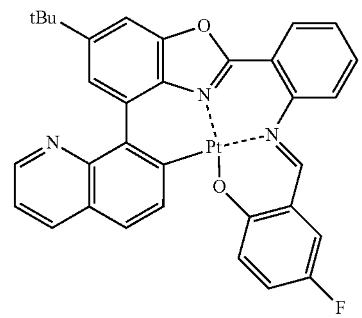
3-508
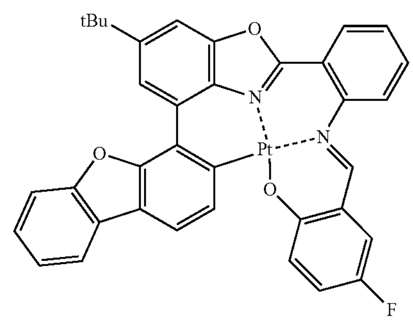
3-509
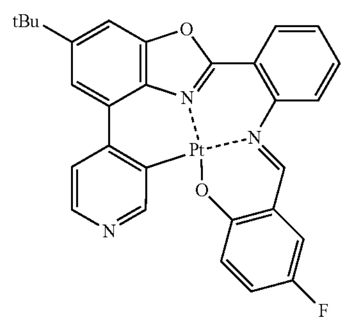
3-510
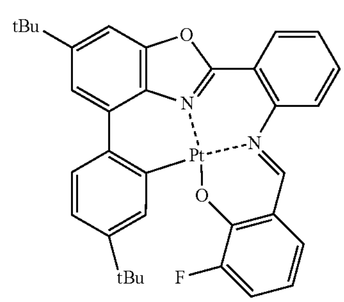

-continued
3-511
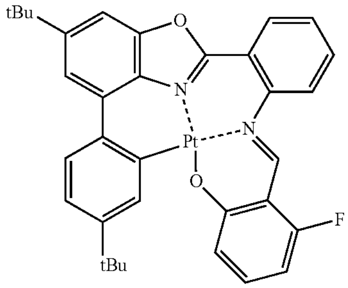
3-512
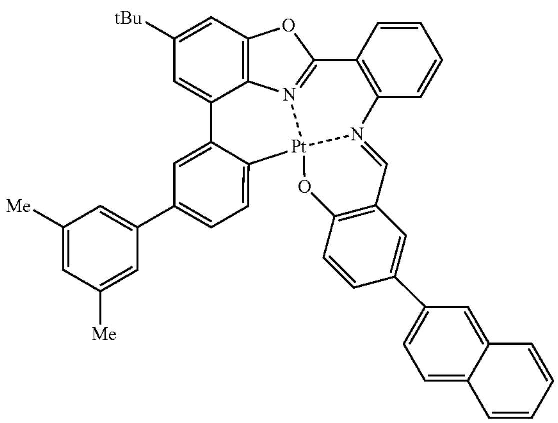
3-513
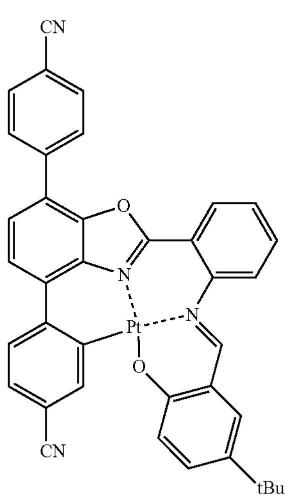
-continued
3-514
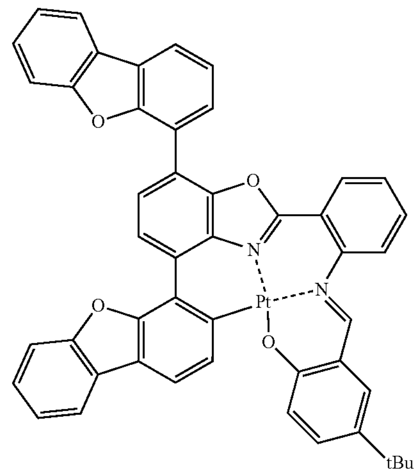
3-515
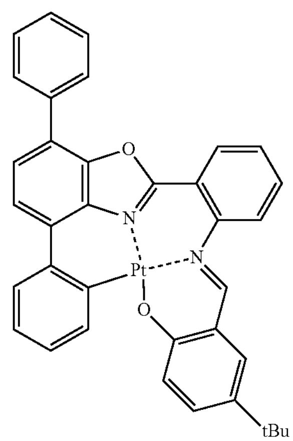
3-516
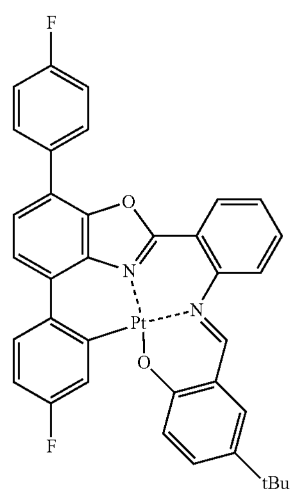

3-517
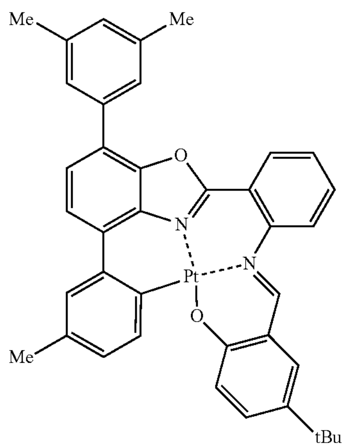
3-518
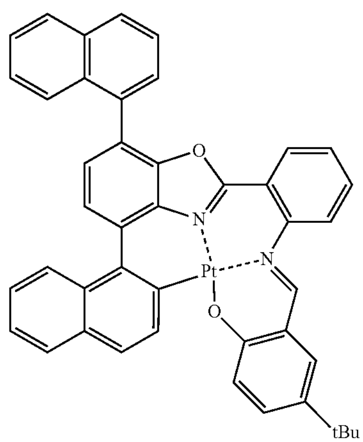
3-519
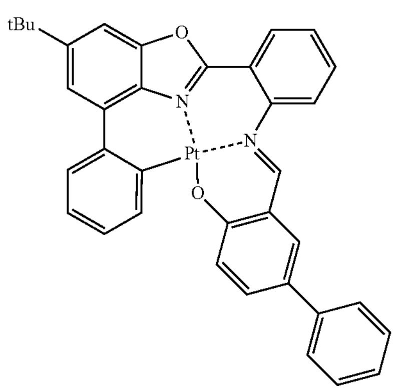
3-520
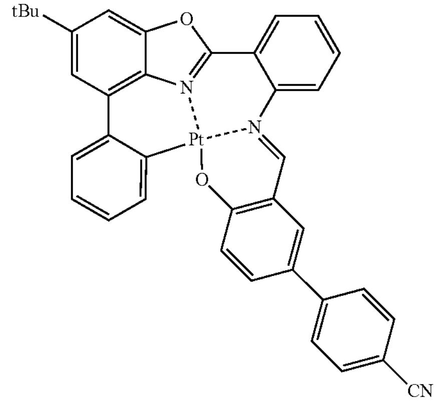
3-521
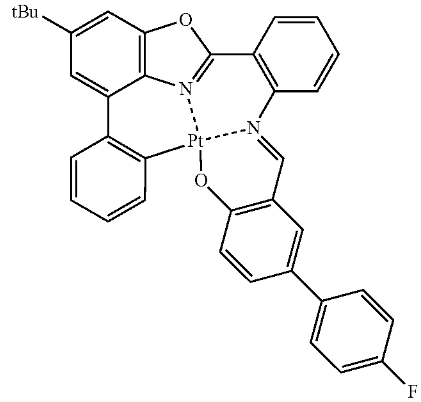
3-522
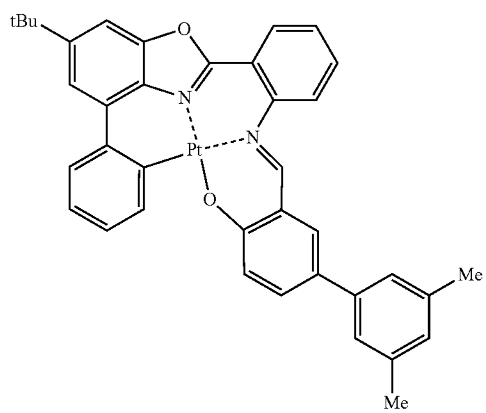
Compound Group 4
4-1
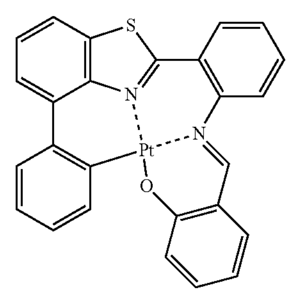

4-2
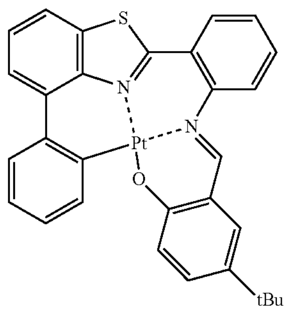
4-3
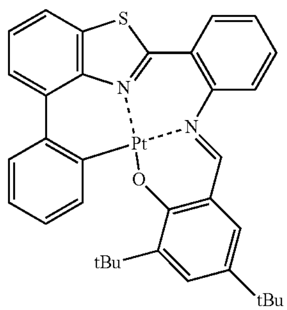
4-4
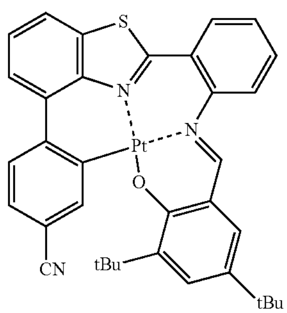
4-5
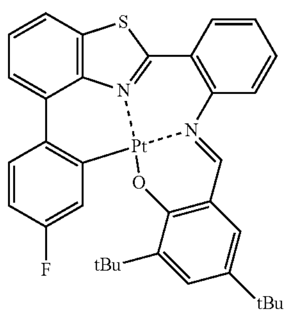
4-6
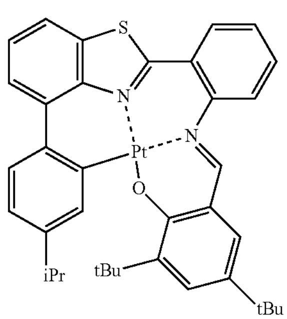
4-7
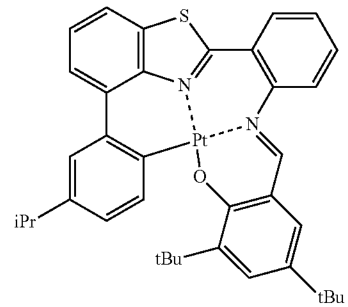
4-8
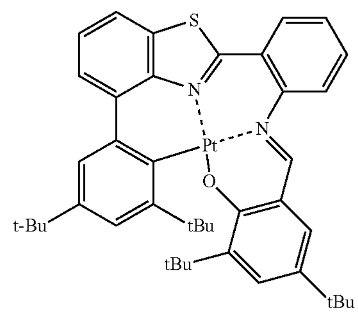
4-9
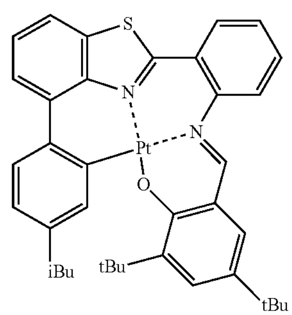
4-10
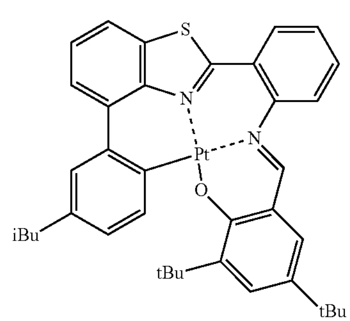

-continued
4-16
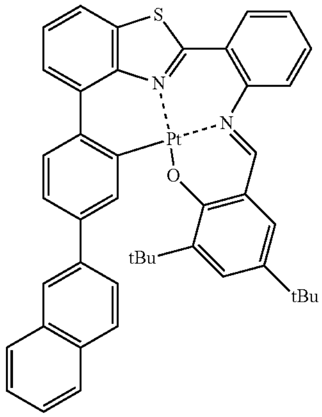
4-17
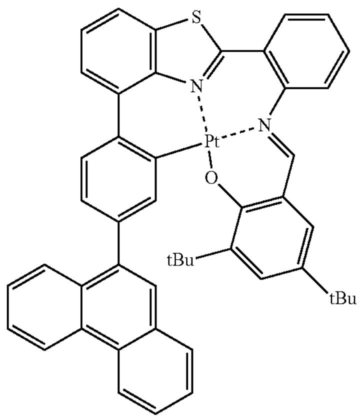
4-18
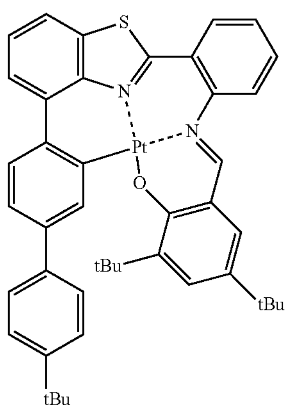
4-19
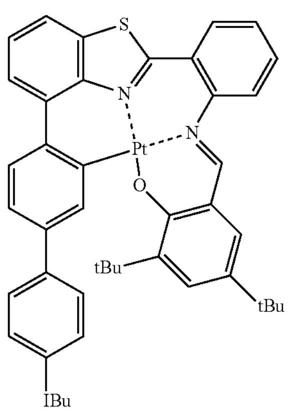
-continued
4-20
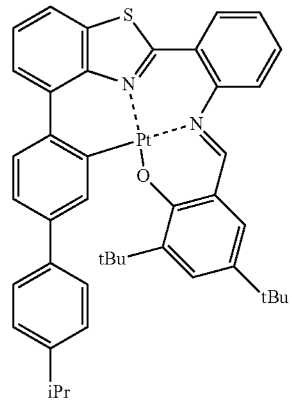
4-21
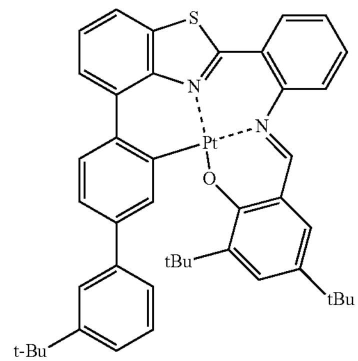
4-22
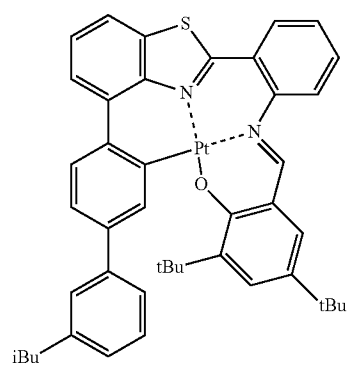
4-23
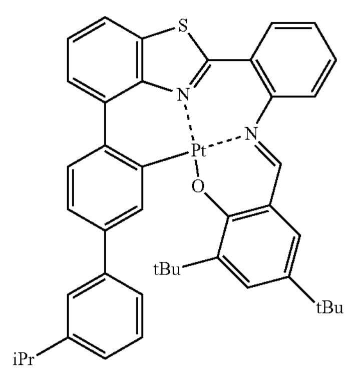

-continued
4-24
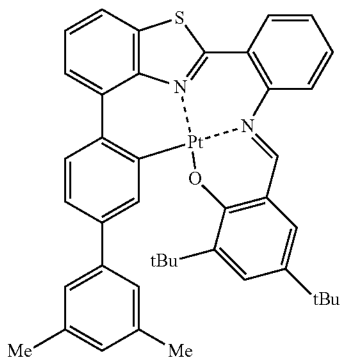
4-25
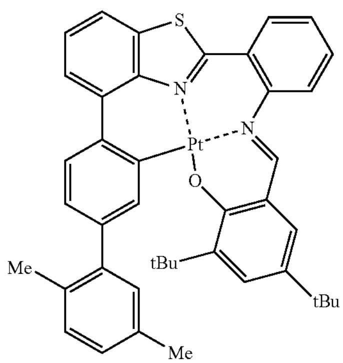
4-26
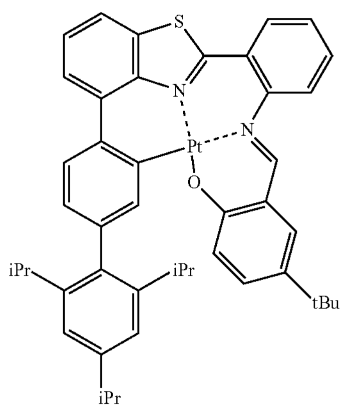
4-27
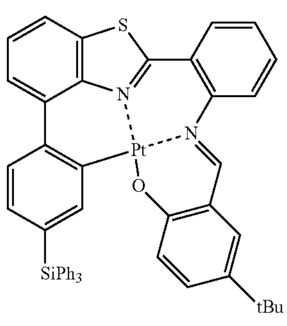
-continued
4-28
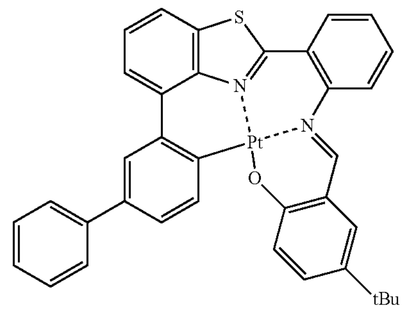
4-29
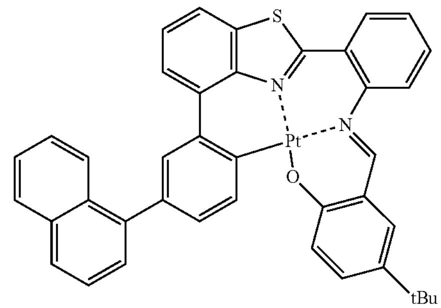
4-30
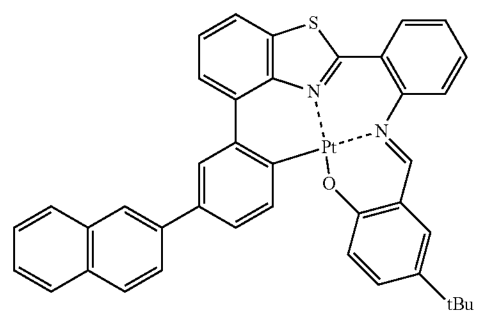
4-31
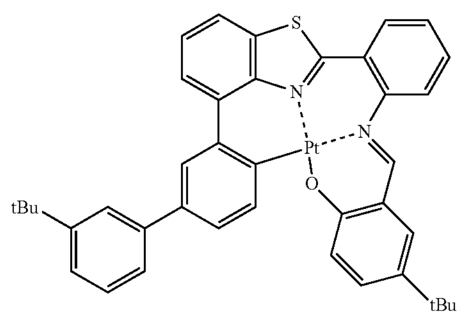
4-32
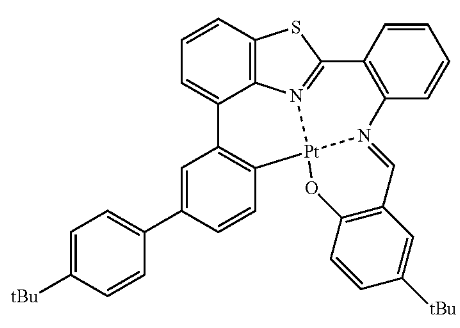

-continued
4-33
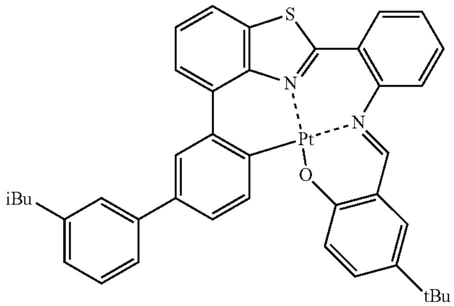
4-34
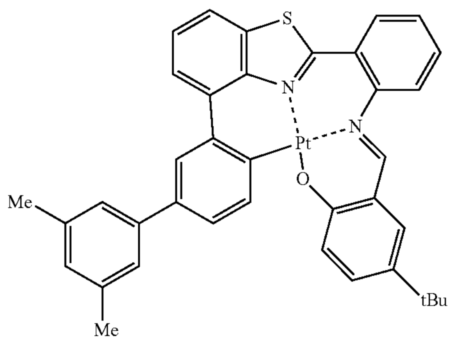
4-35
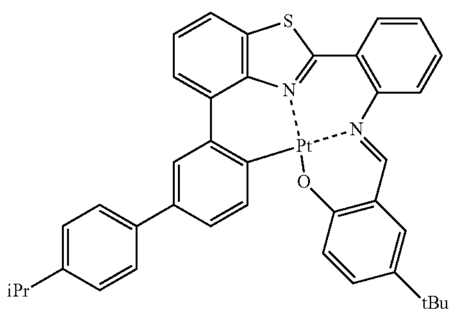
4-36
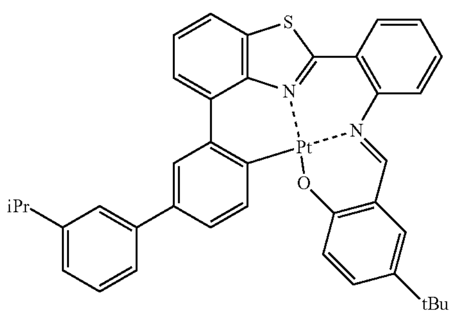
4-37
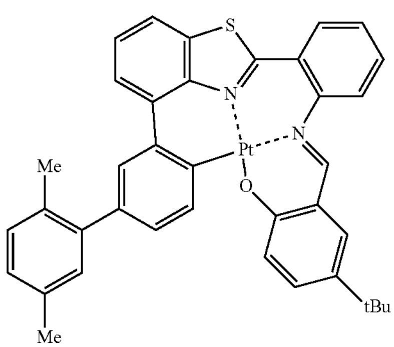
-continued
4-38
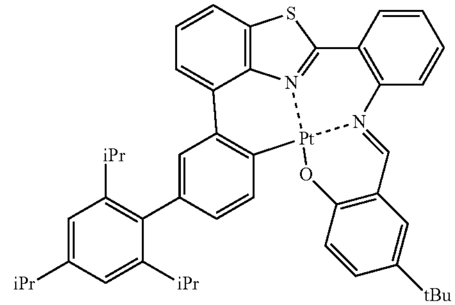
4-39
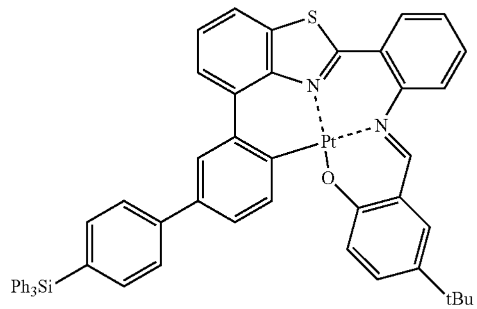
4-40
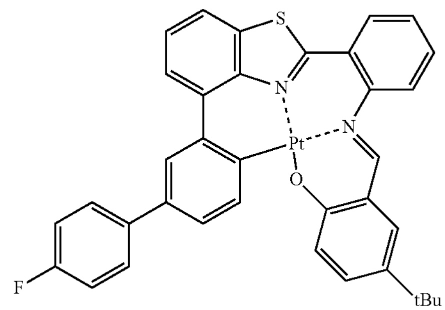
4-41
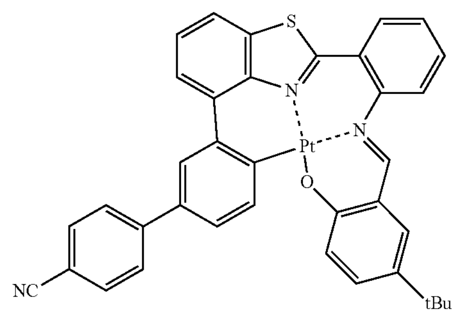
4-42
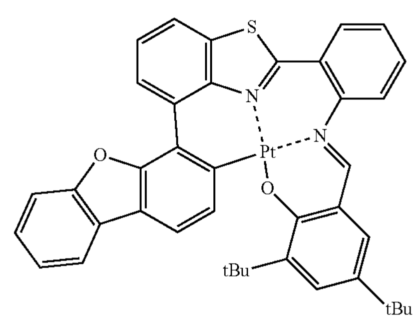

-continued
4-43
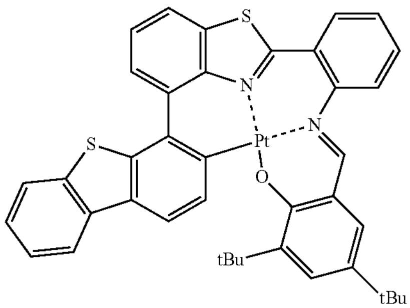
4-44
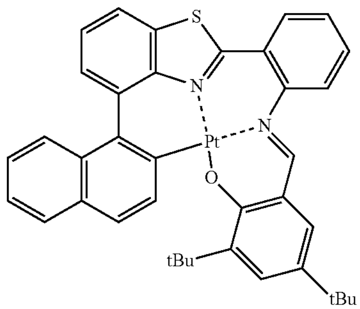
4-45
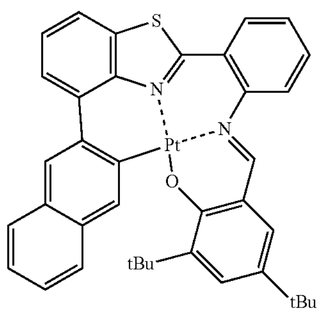
4-46
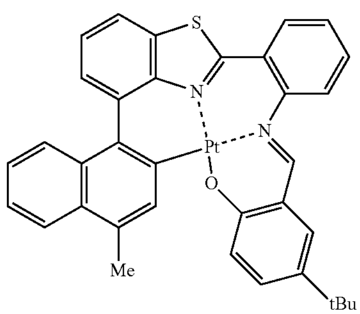
4-47
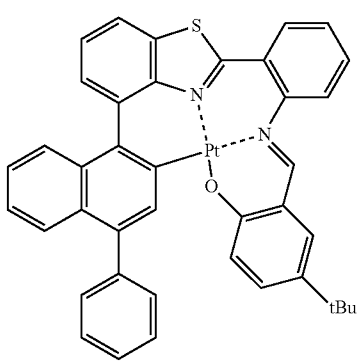
-continued
4-48
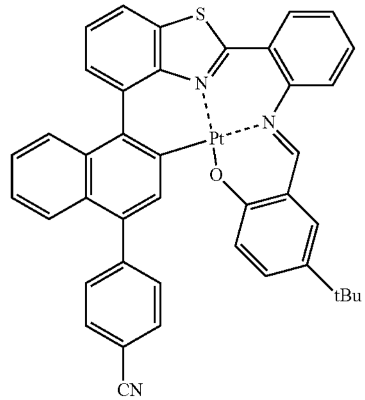
4-49
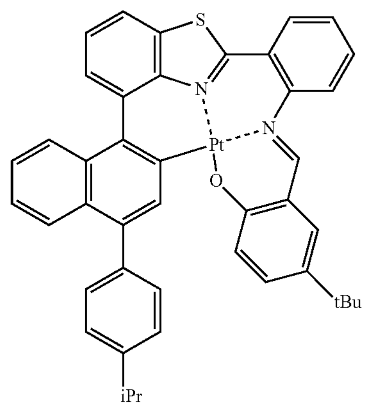
4-50
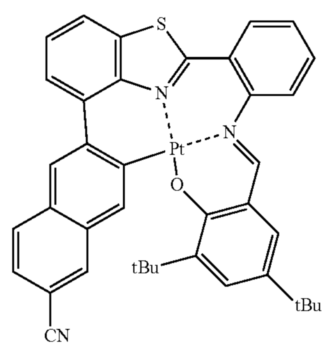
4-51
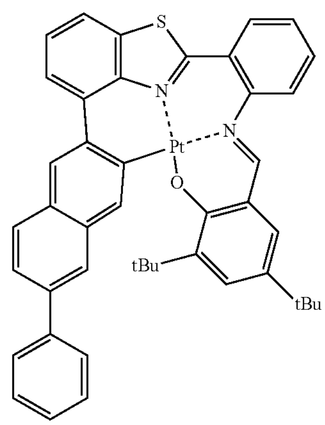

4-52
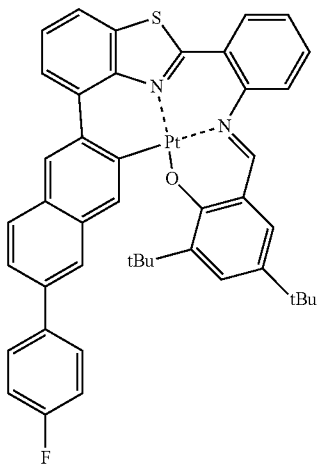
4-53
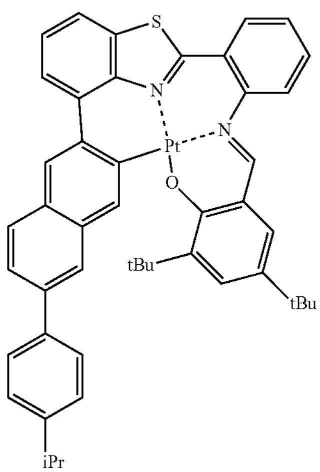
4-54
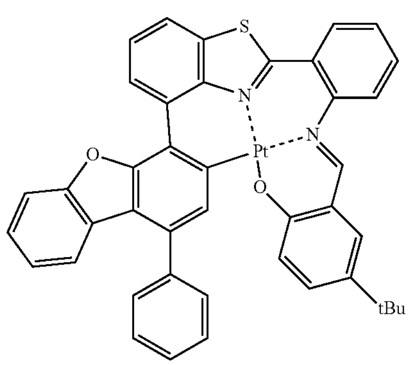
4-55
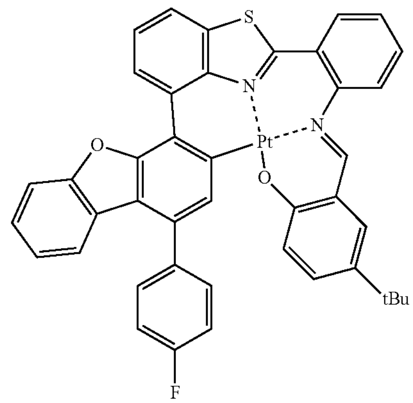
4-56
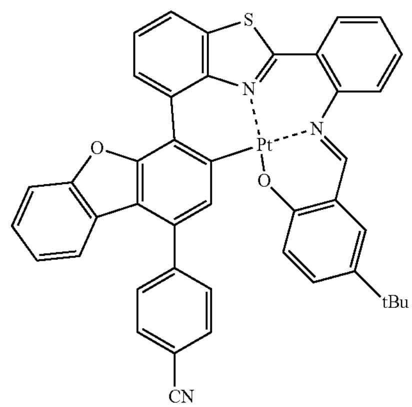
4-57
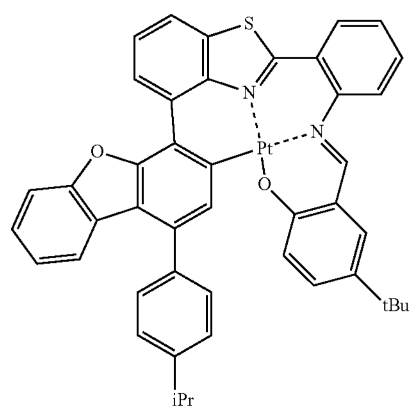
4-58
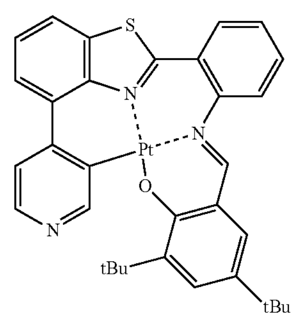

4-59
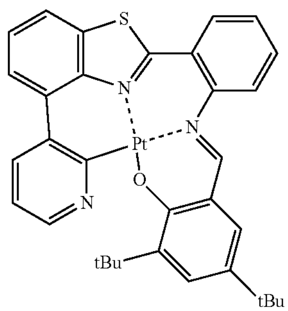
4-60
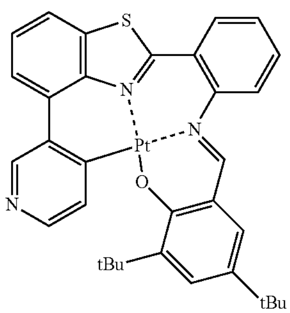
4-61
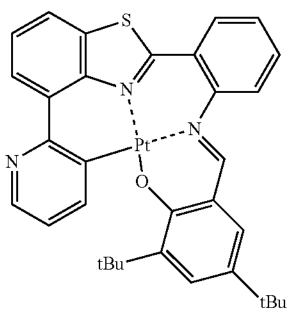
4-62
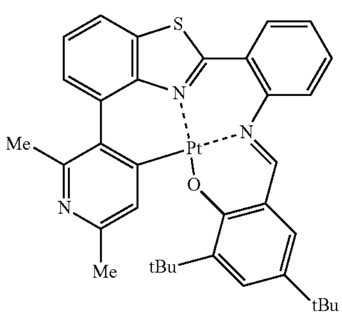
4-63
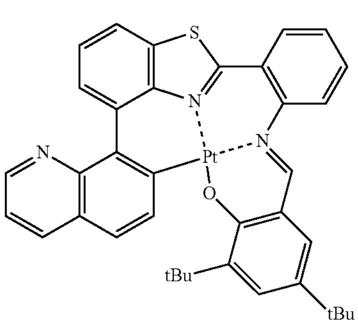
4-64
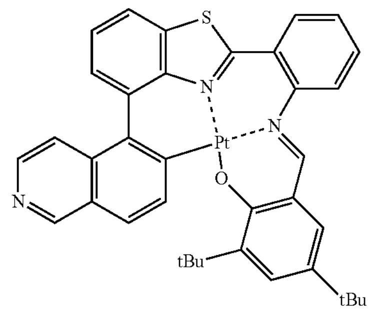
4-65
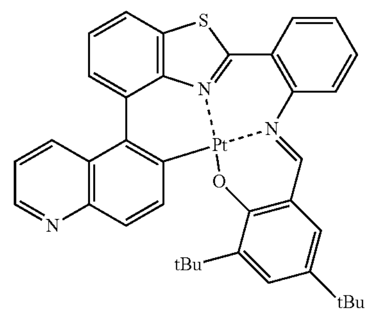
4-66
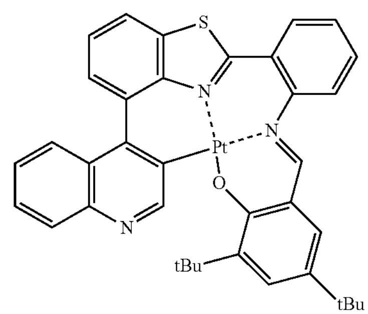
4-67
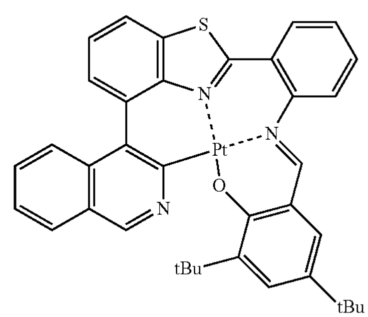
4-68
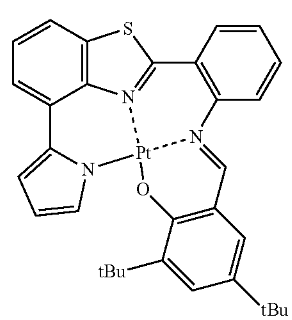

-continued
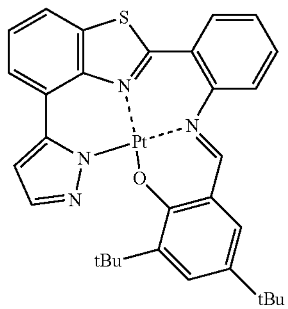
4-69
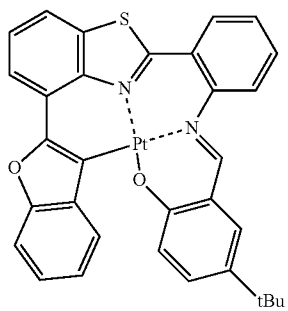
4-70
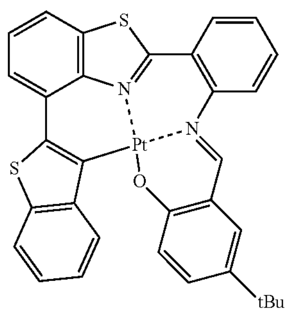
4-71
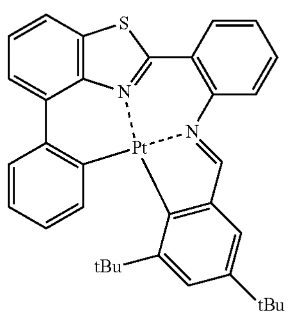
4-72
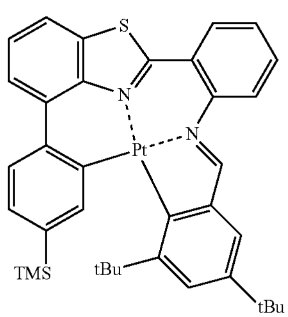
4-73
-continued
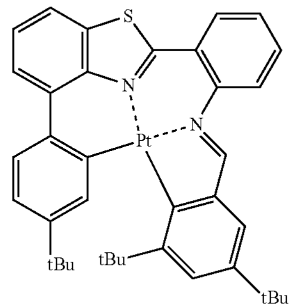
4-74
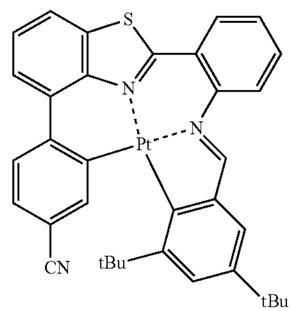
4-75
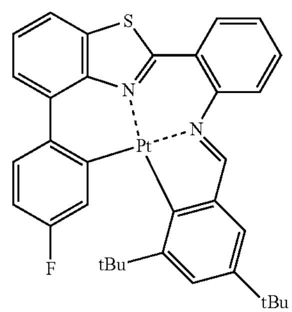
4-76
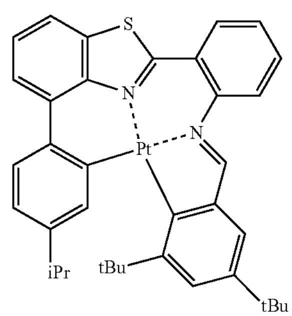
4-77
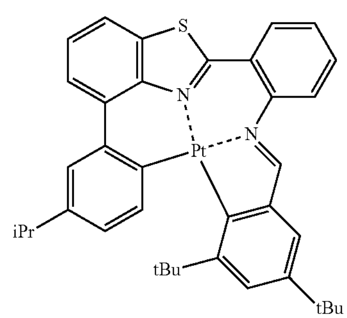
4-78

-continued
4-79
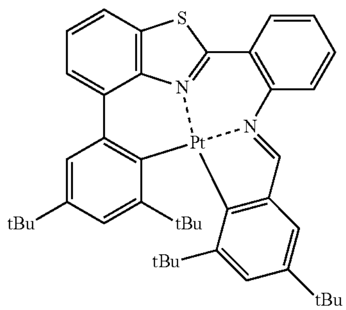
4-80
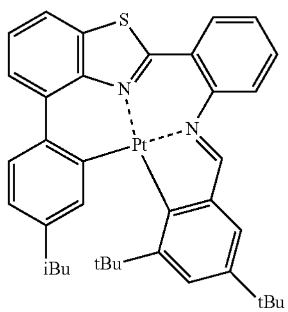
4-81
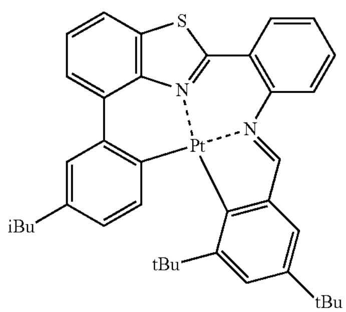
4-82
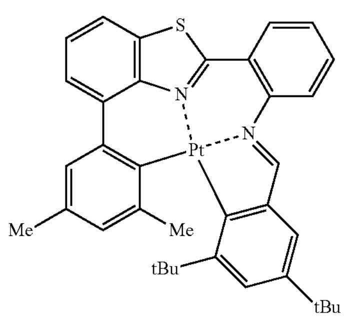
4-83
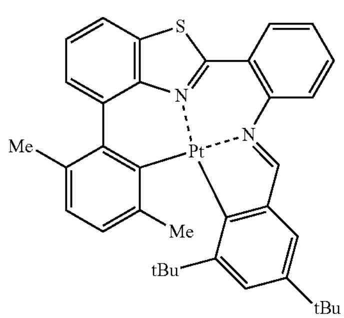
-continued
4-84
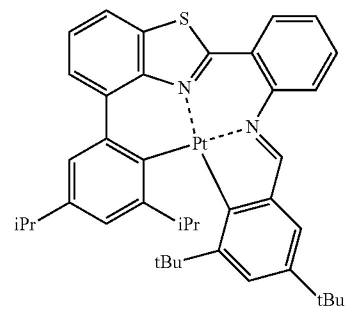
4-85
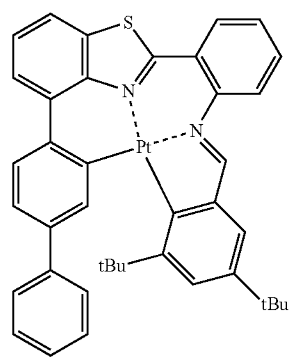
4-86
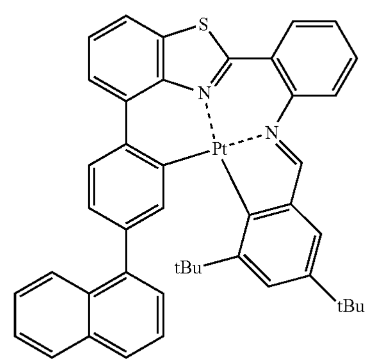
4-87
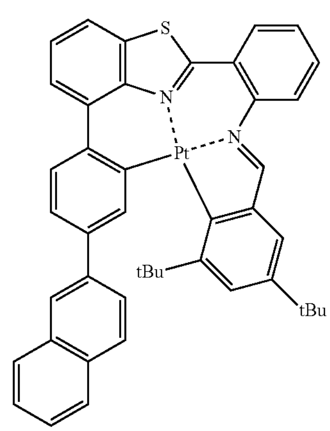

-continued
4-88
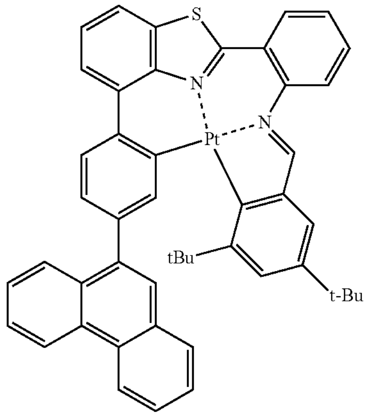
4-89
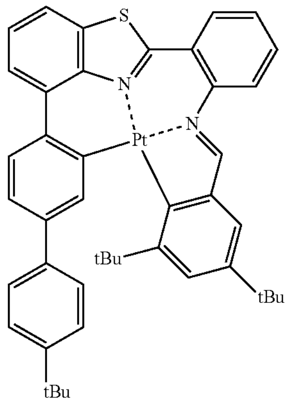
4-90
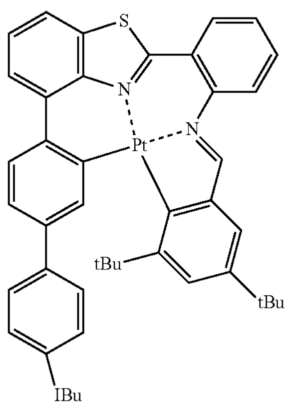
4-91
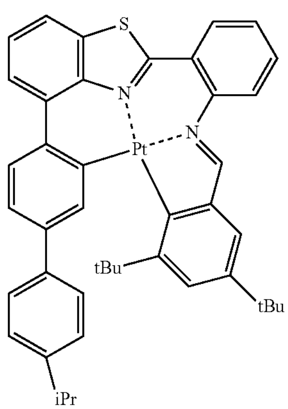
-continued
4-92
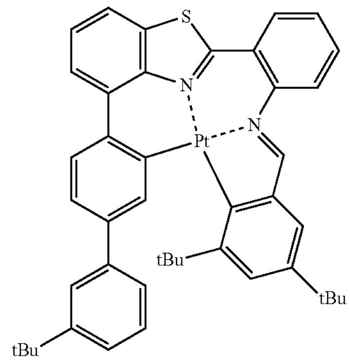
4-93
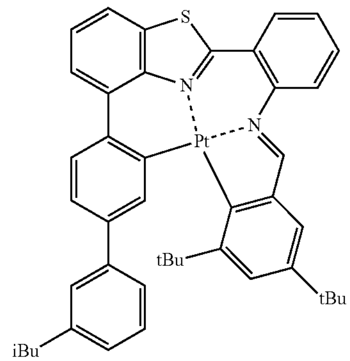
4-94
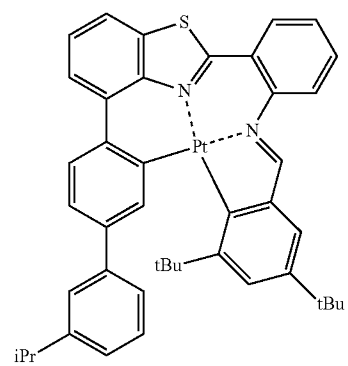
4-95
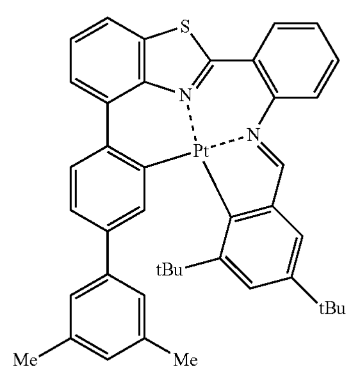

-continued
4-96
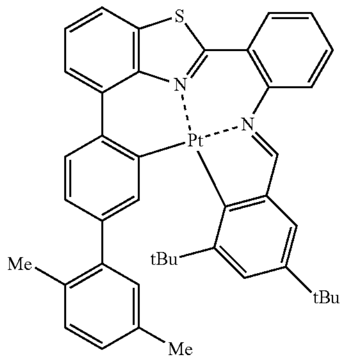
4-97
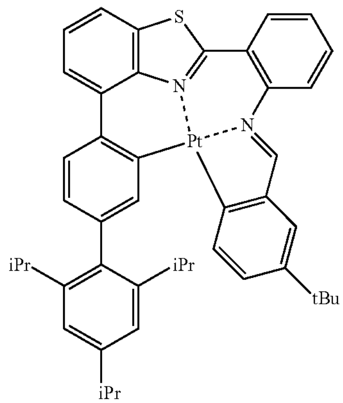
4-98
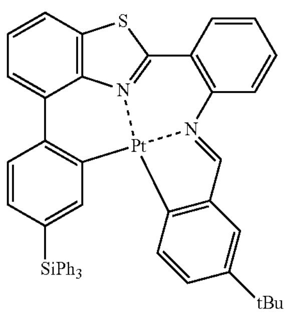
4-99
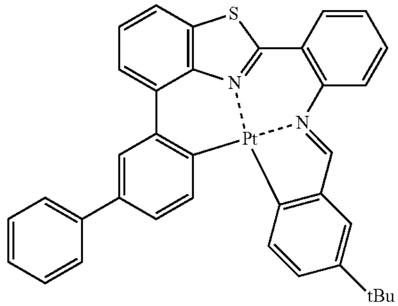
-continued
4-100
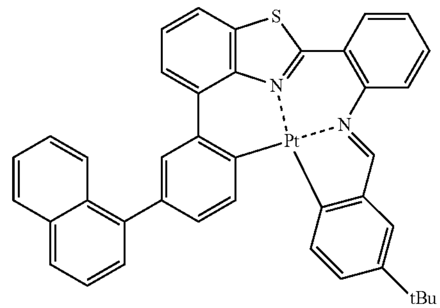
4-101
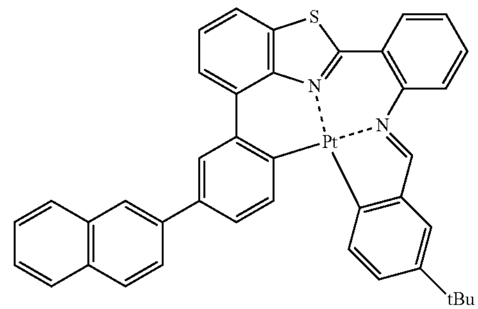
4-102
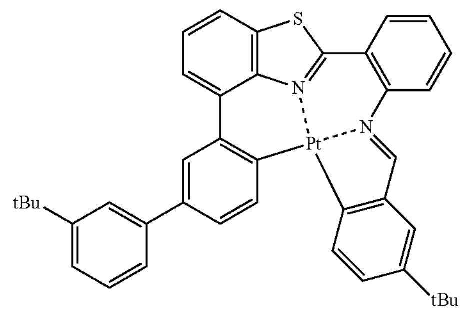
4-103
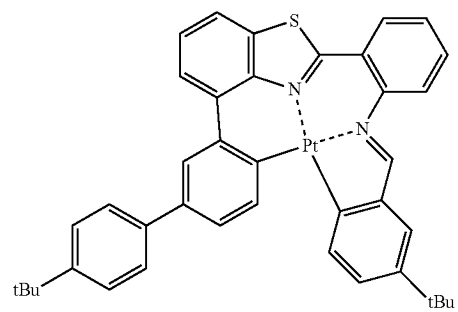
4-104
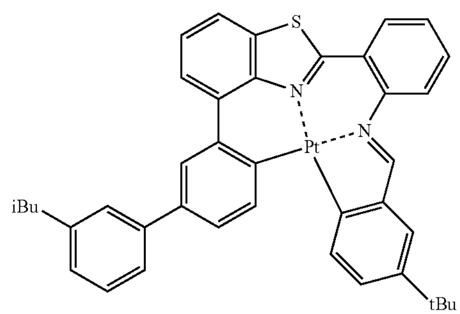

-continued
4-105
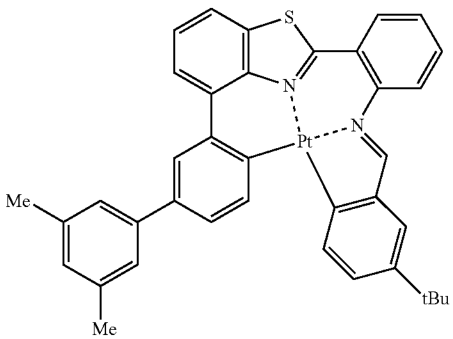
4-106
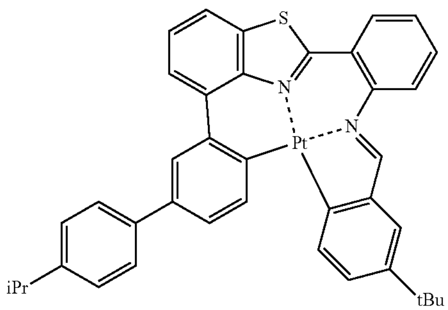
4-107
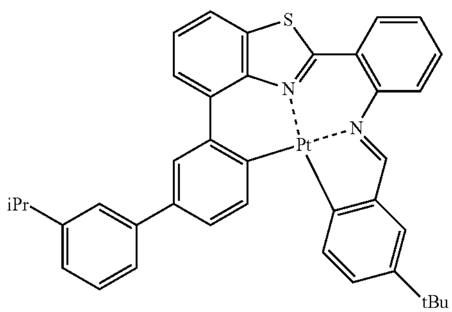
4-108
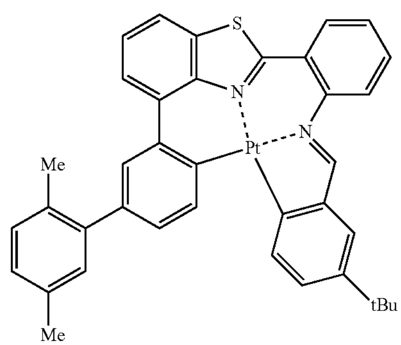
4-109
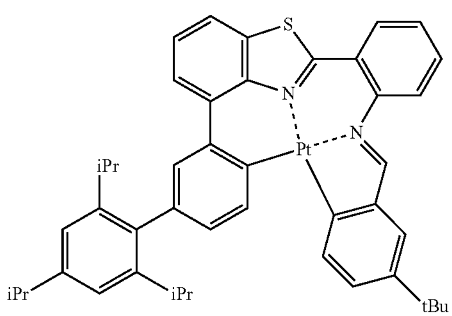
-continued
4-110
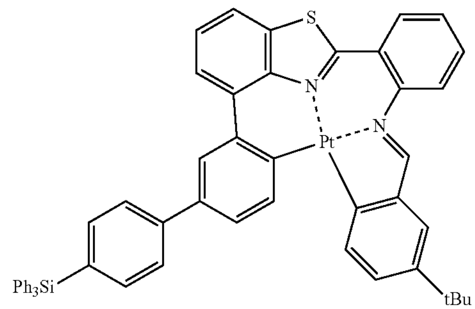
4-111
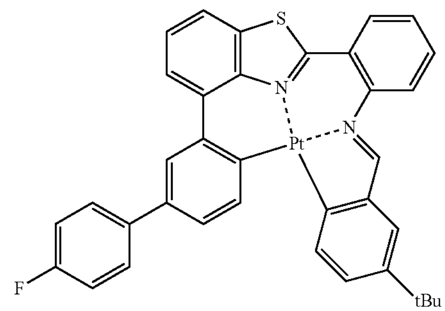
4-112
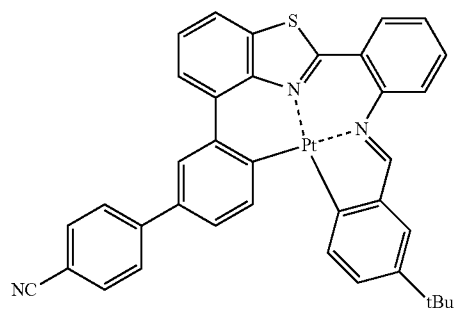
4-113
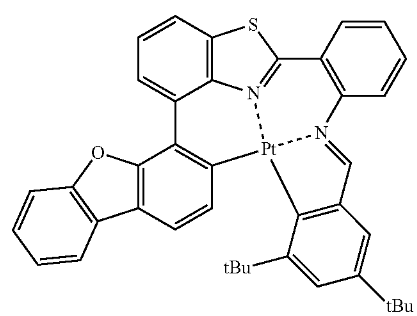
4-114
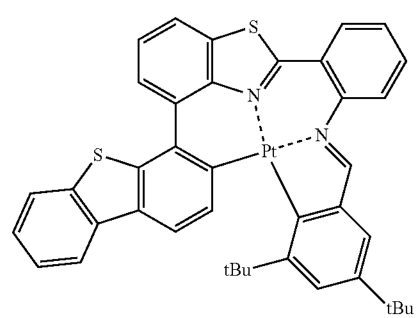

4-115
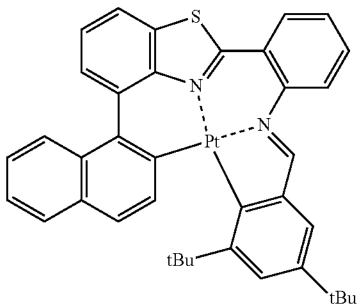
4-116
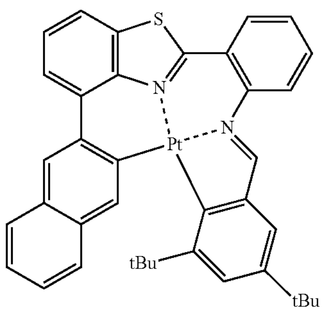
4-117
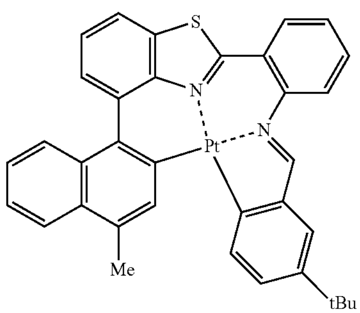
4-118
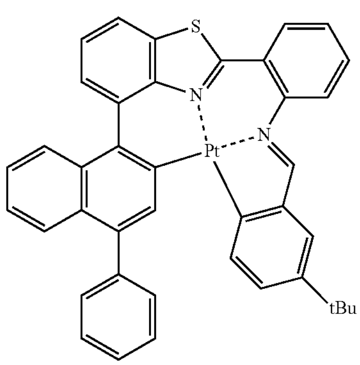
4-119
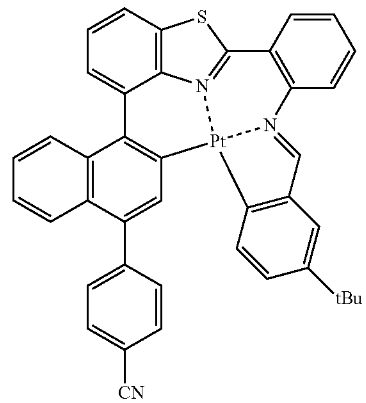
4-120
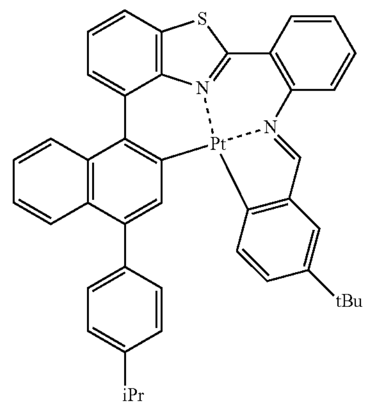
4-121
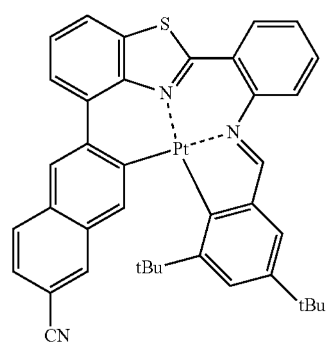
4-122
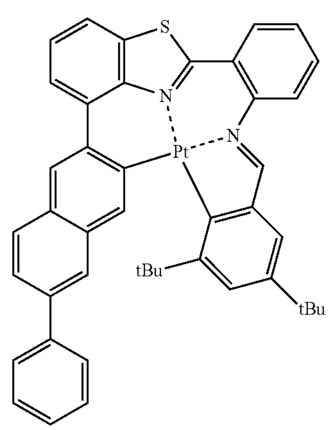

-continued
4-123
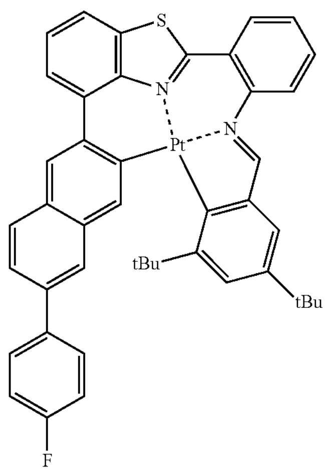
4-124
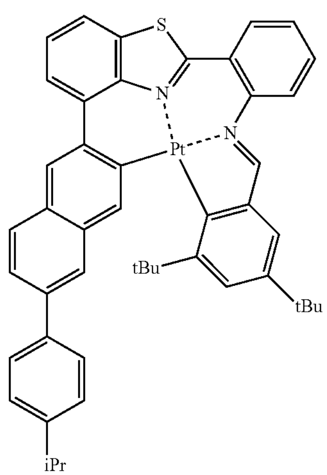
4-125
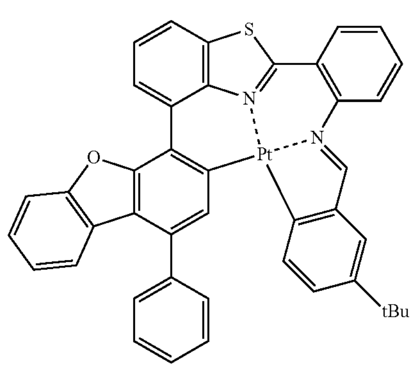
-continued
4-126
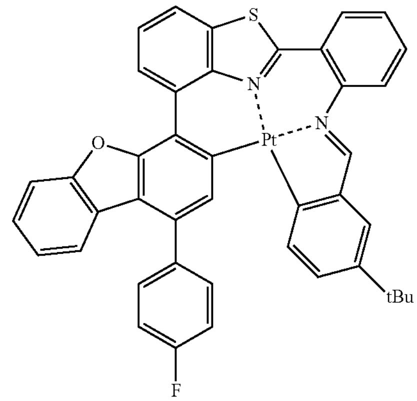
4-127
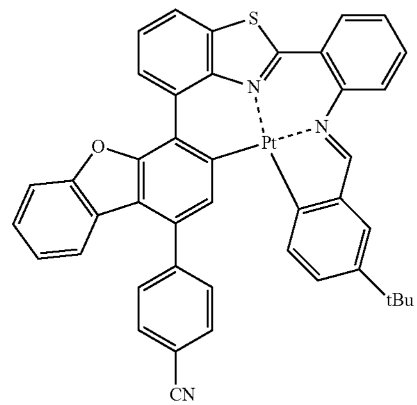
4-128
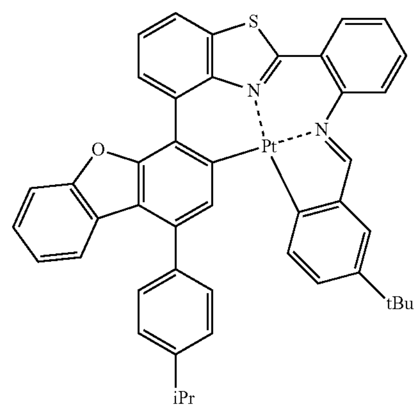
4-129
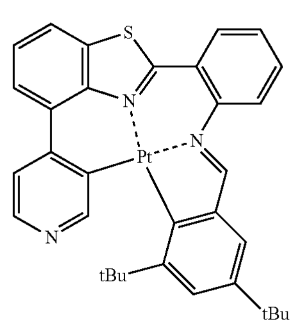

-continued
4-130
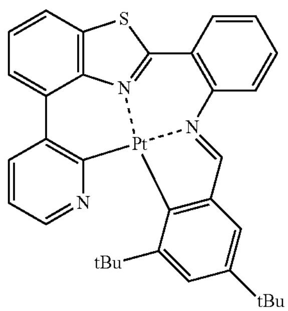
4-131
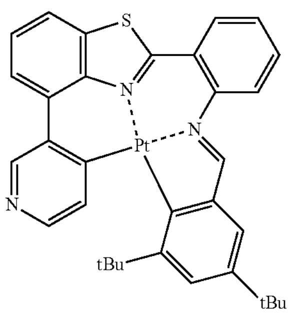
4-132
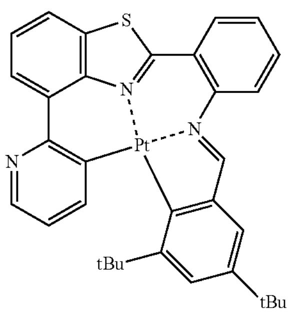
4-133
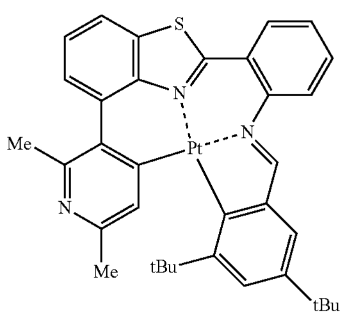
4-134
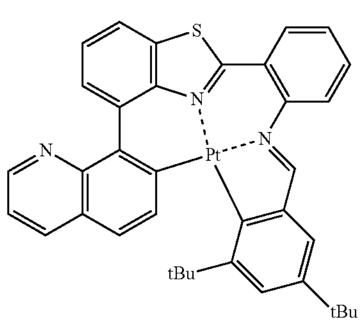
-continued
4-135
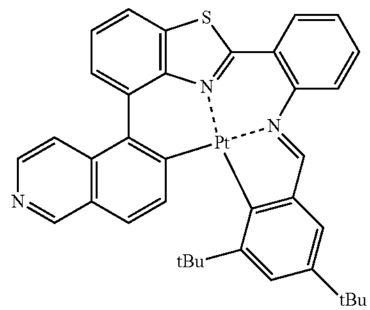
4-136
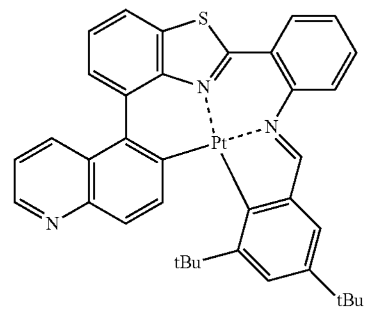
4-137
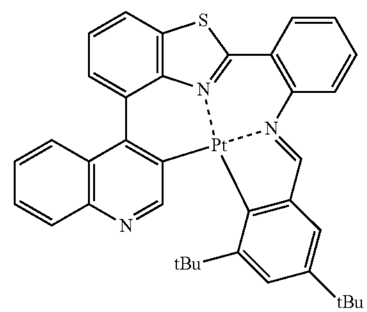
4-138
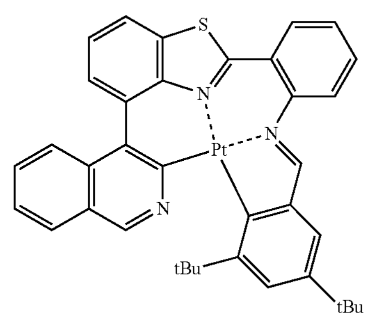
4-139
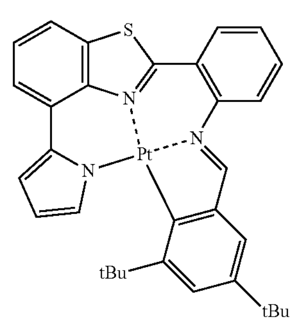

-continued
4-140
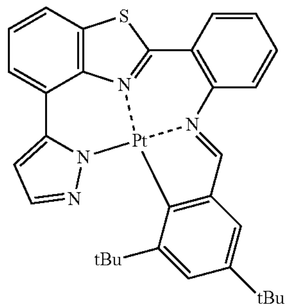
4-141
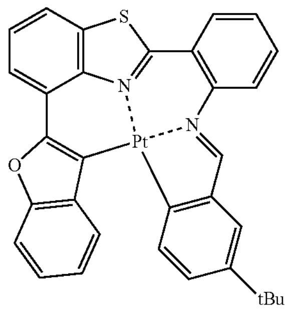
4-142
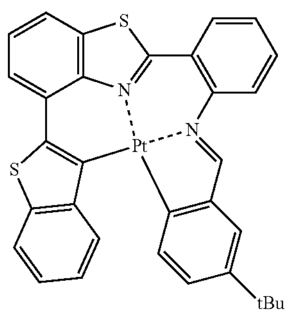
4-143
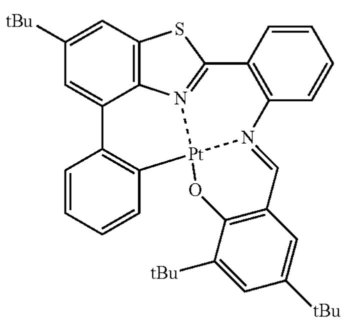
4-144
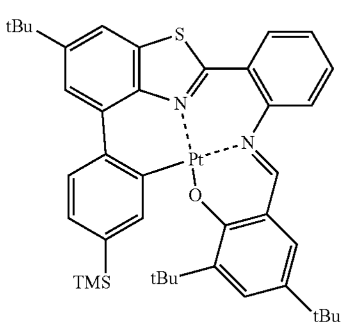
-continued
4-145
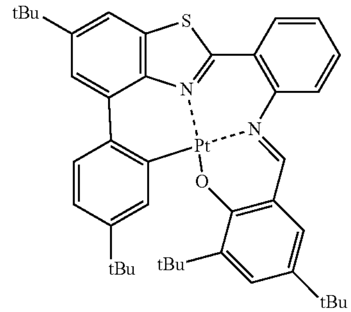
4-146
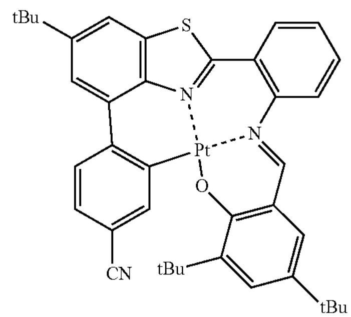
4-147
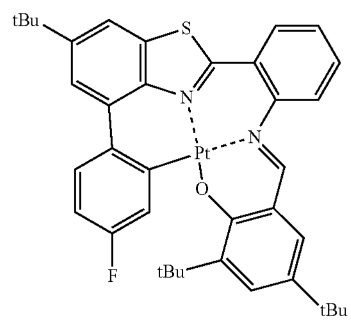
4-148
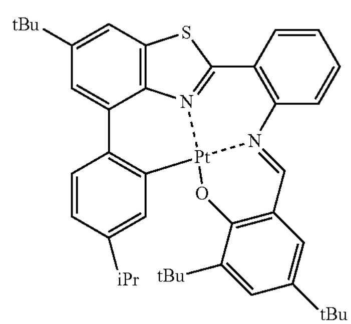
4-149
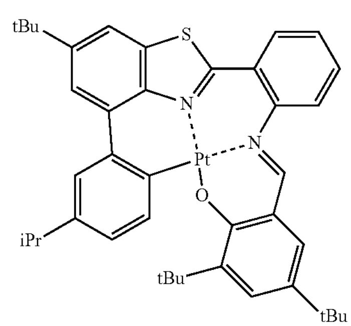

-continued
4-150
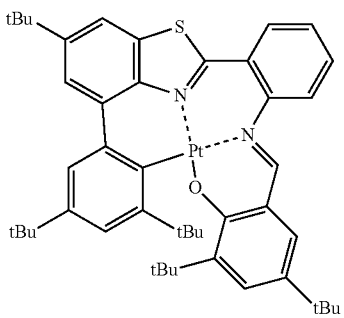
4-151
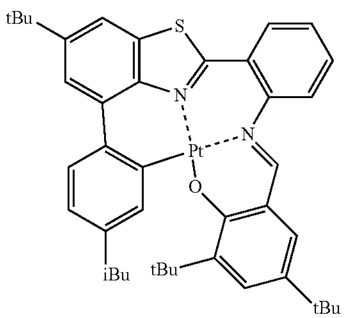
4-152
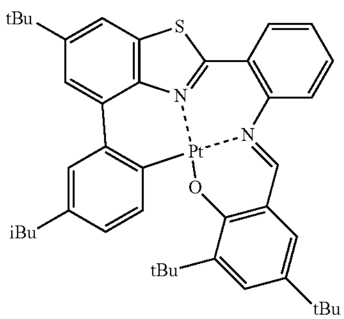
4-153
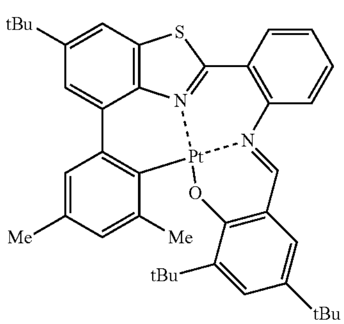
4-154
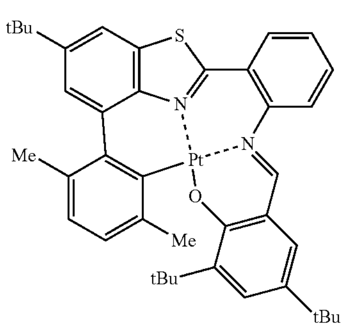
-continued
4-155
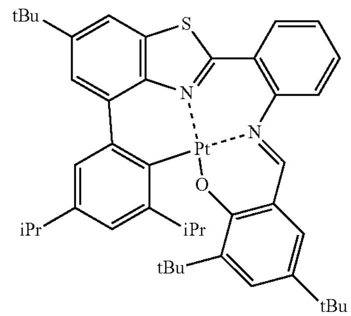
4-156
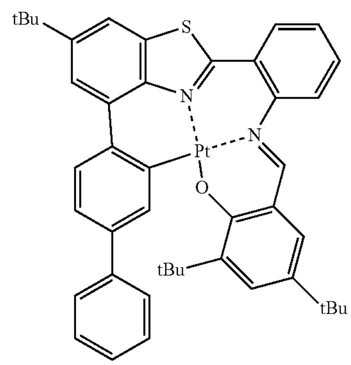
4-157
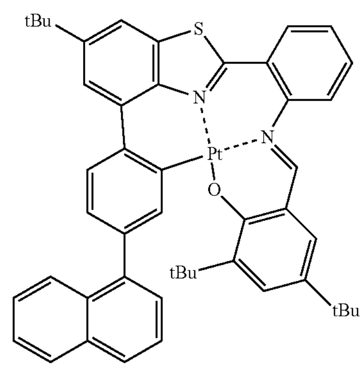
4-158
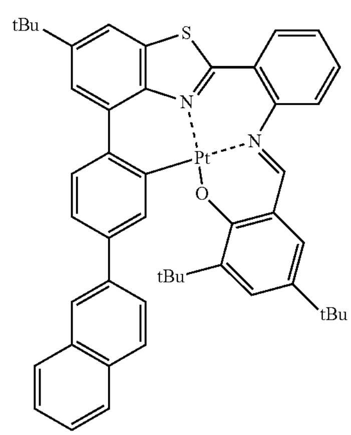

-continued
4-159
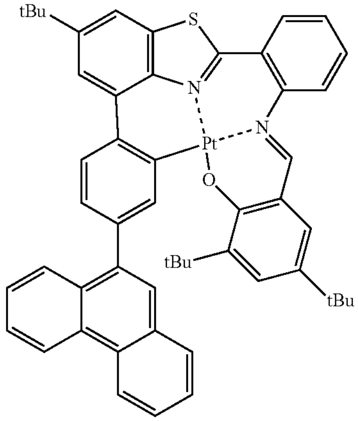
4-160
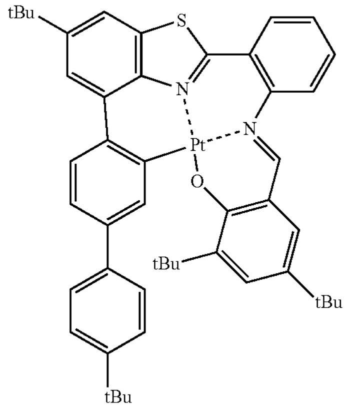
4-161
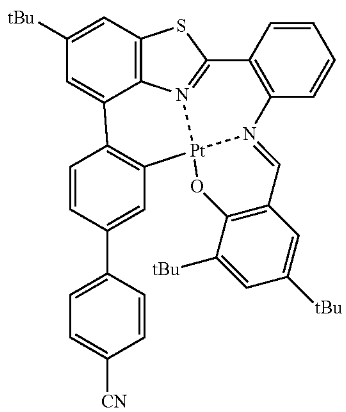
4-162
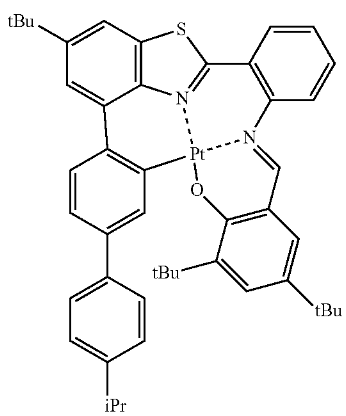
-continued
4-163
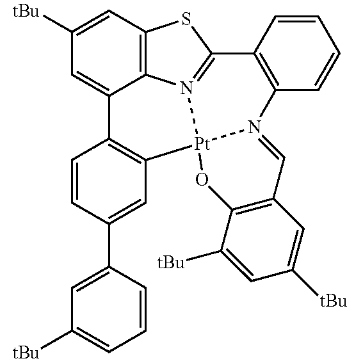
4-164
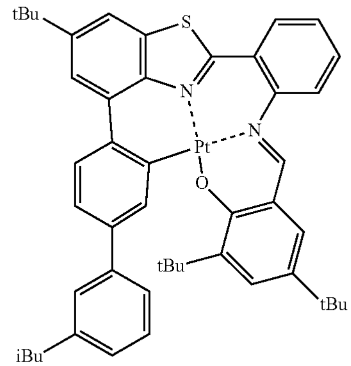
4-165
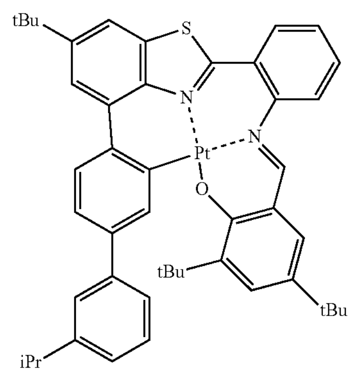
4-166
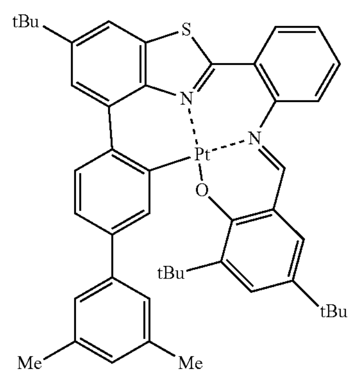

-continued
4-167
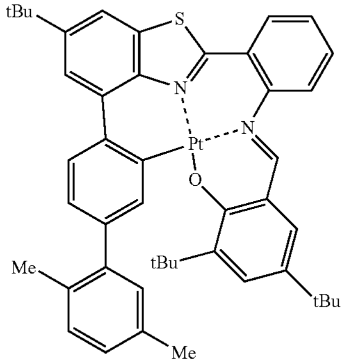
4-168
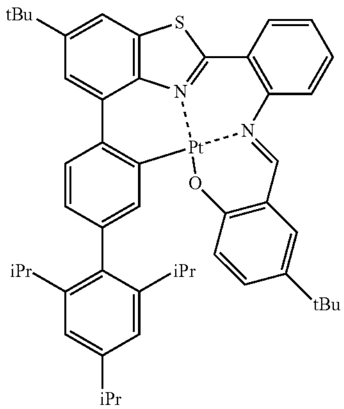
4-169
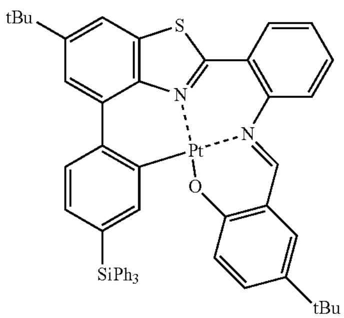
4-170
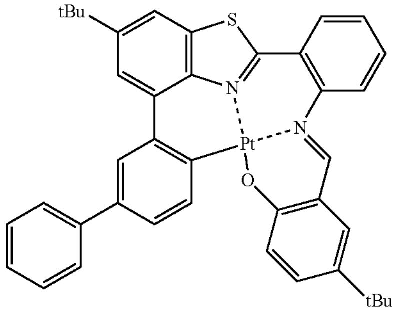
-continued
4-171
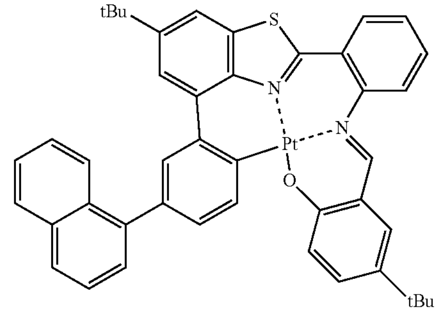
4-172
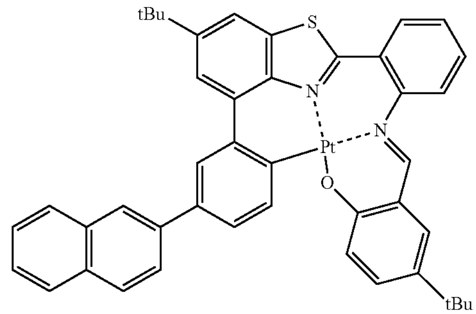
4-173
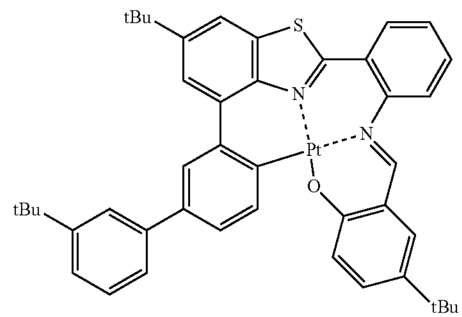
4-174
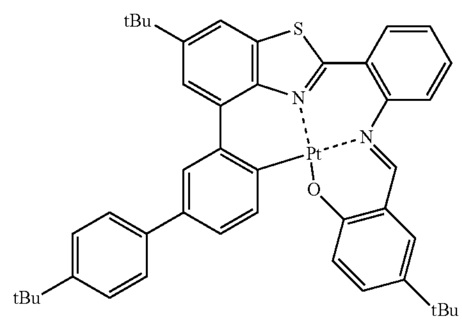
4-175
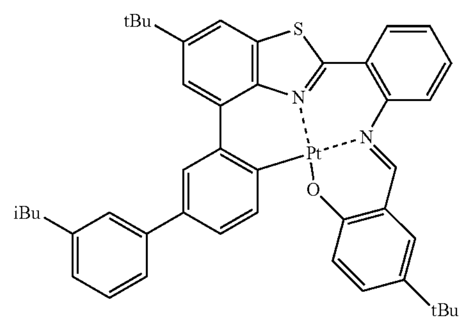

-continued
4-176
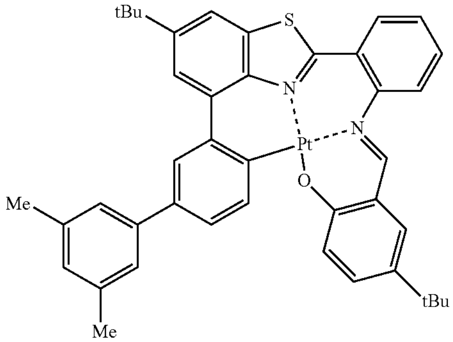
4-177
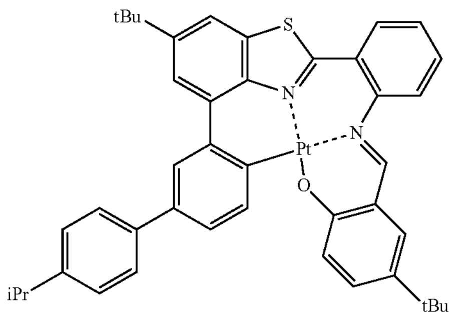
4-178
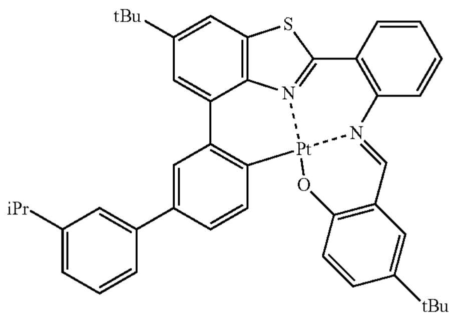
4-179
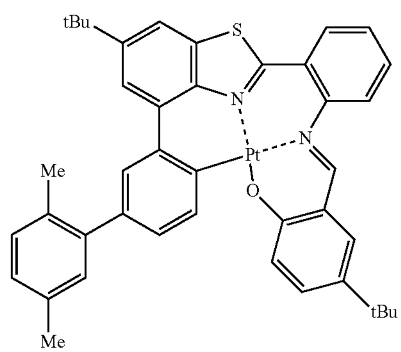
4-180
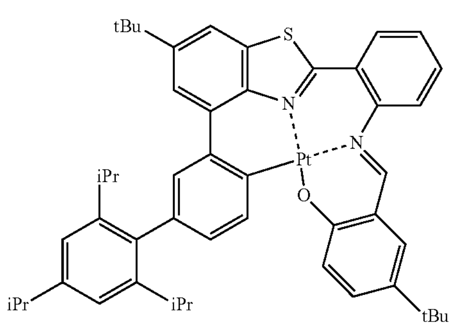
-continued
4-181
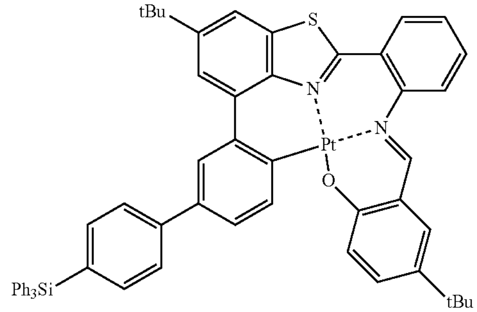
4-182
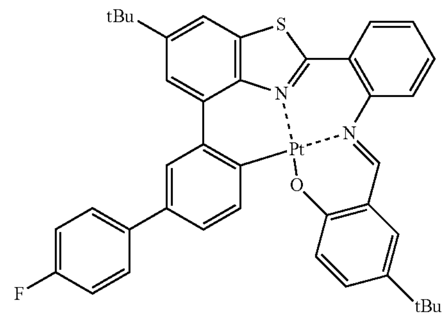
4-183
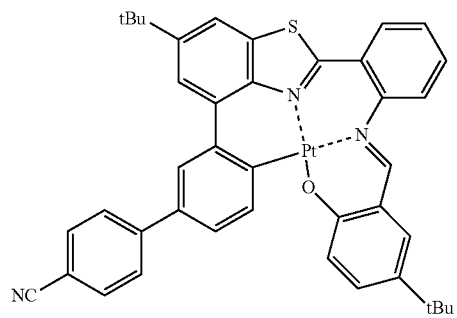
4-184
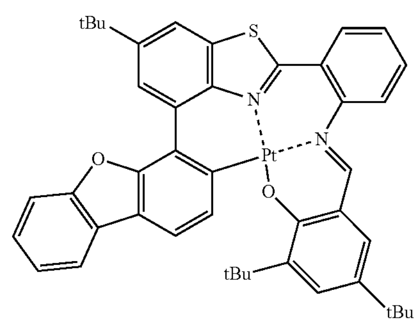
4-185
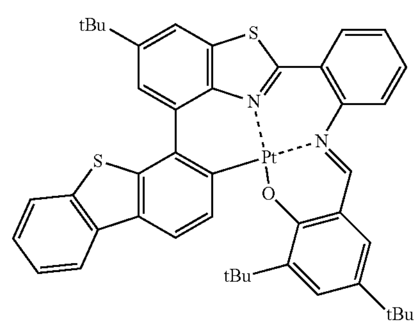

4-186
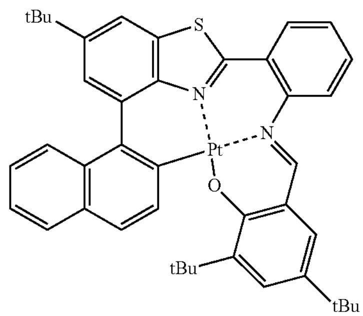
4-187
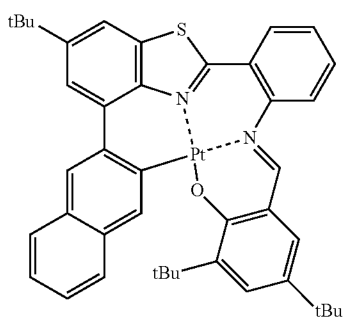
4-188
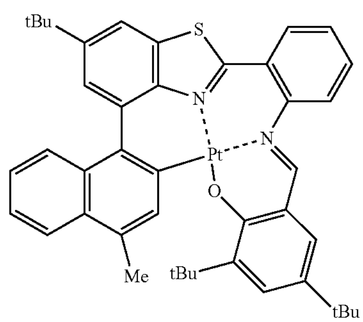
4-189
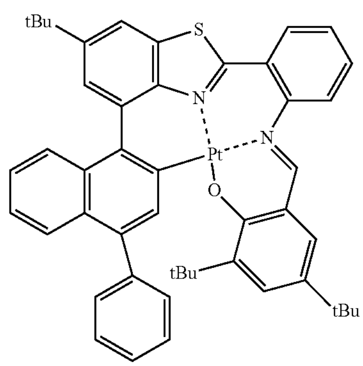
4-190
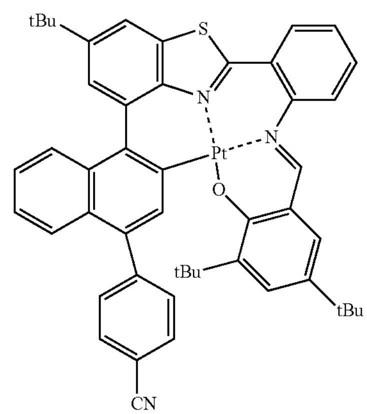
4-191
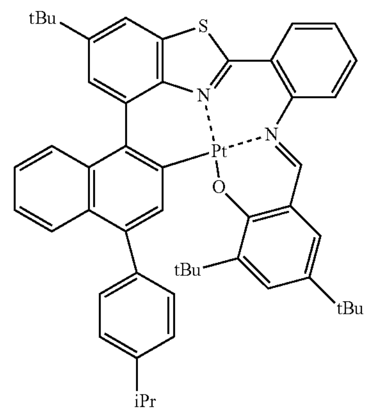
4-192
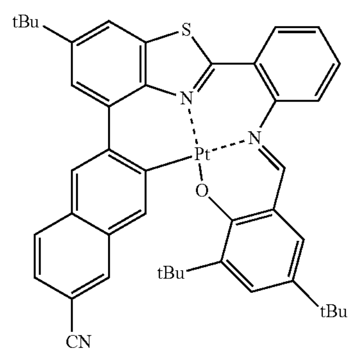
4-193
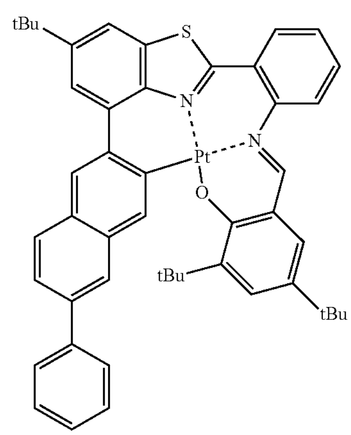

-continued
4-194
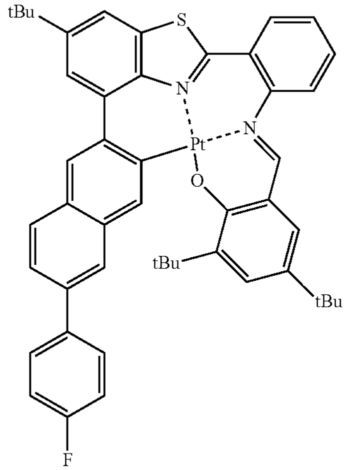
4-195
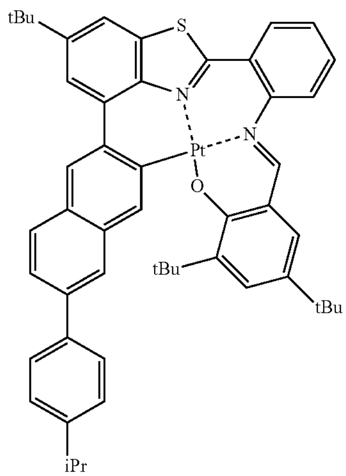
4-196
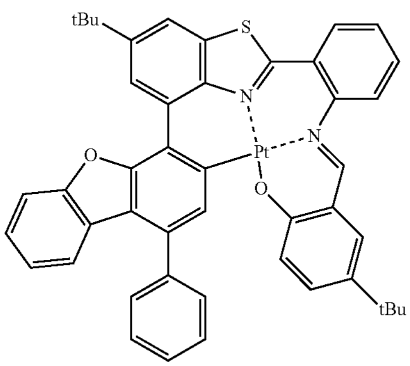
-continued
4-197
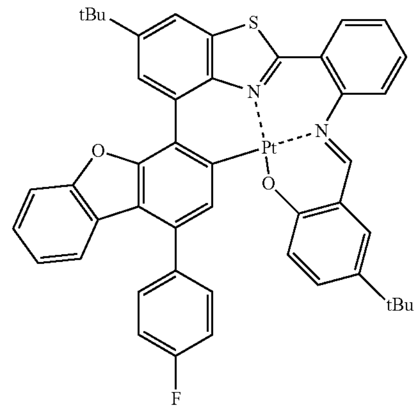
4-198
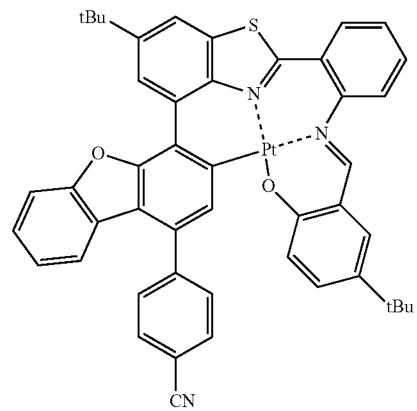
4-199
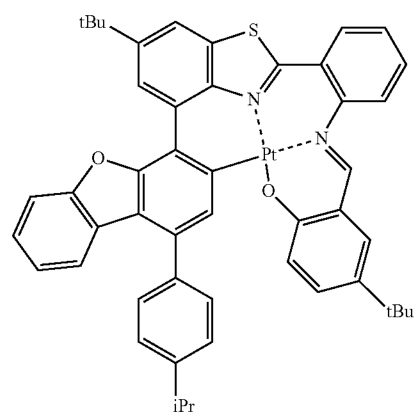
4-200
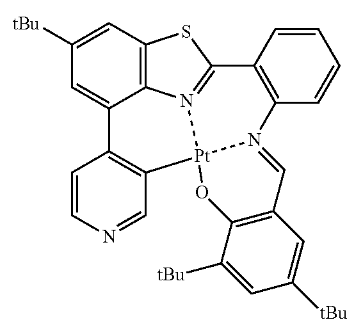

-continued
4-201
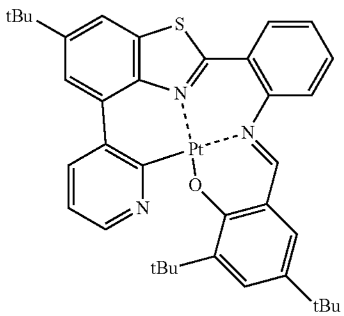
4-202
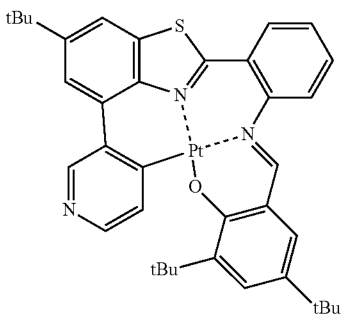
4-203
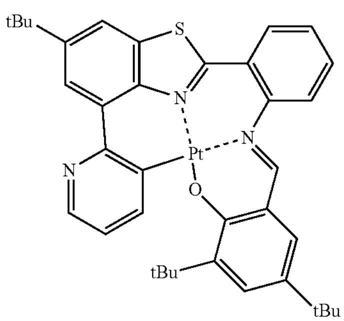
4-204
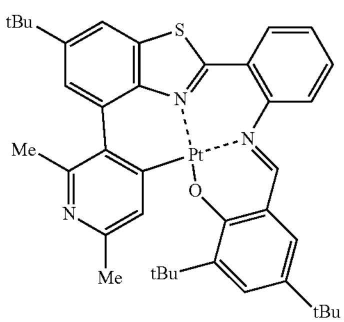
4-205
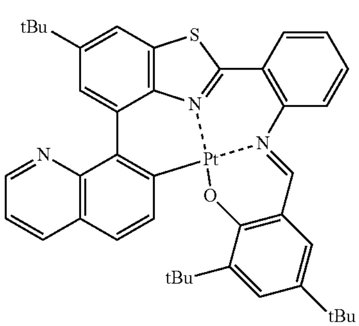
-continued
4-206
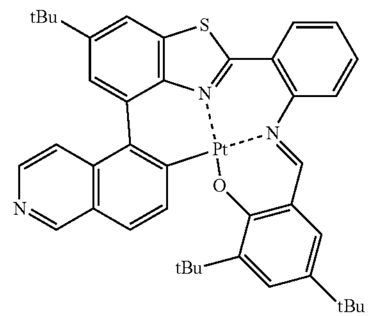
4-207
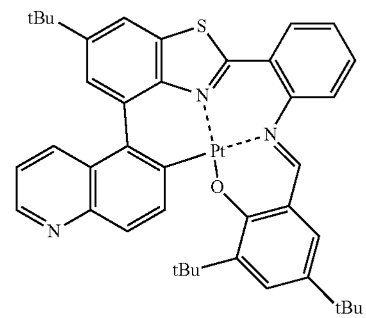
4-208
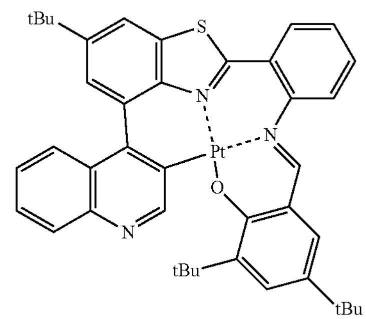
4-209
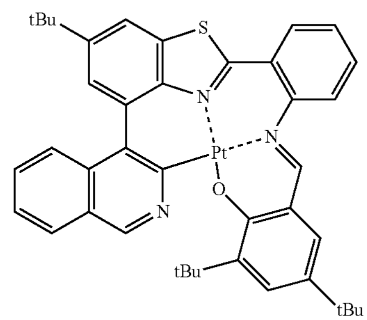
4-210
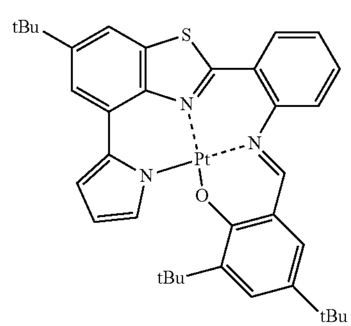

4-211
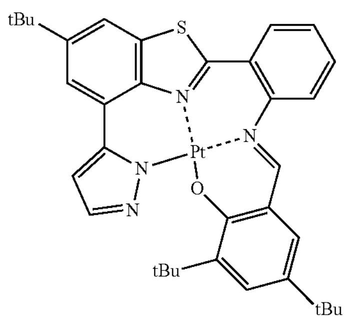
4-212
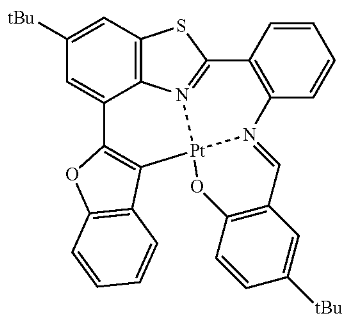
4-213
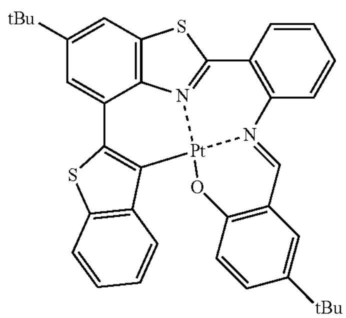
4-214
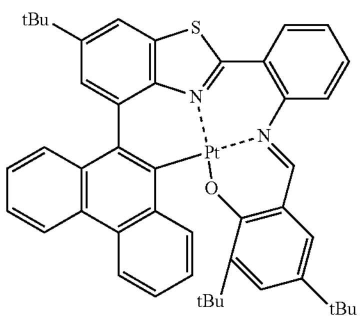
4-215
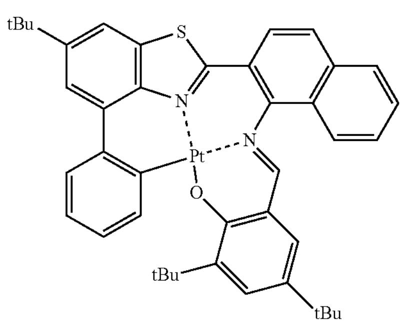
4-216
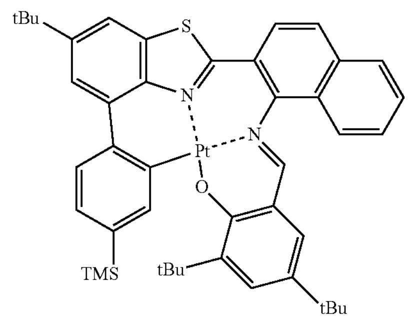
4-217
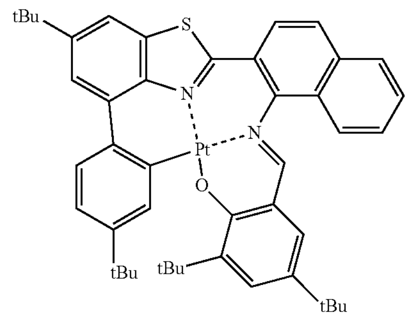
4-218
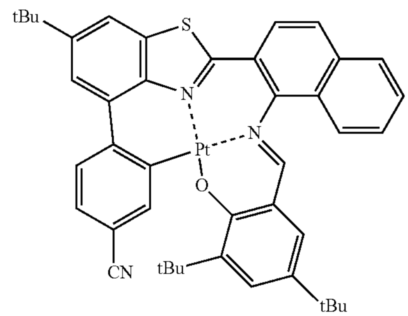
4-219
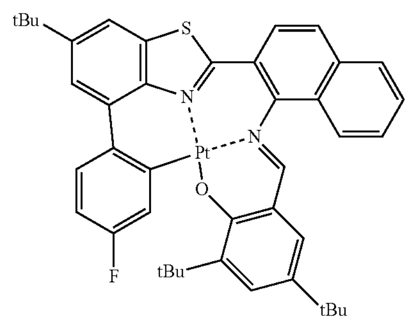
4-220
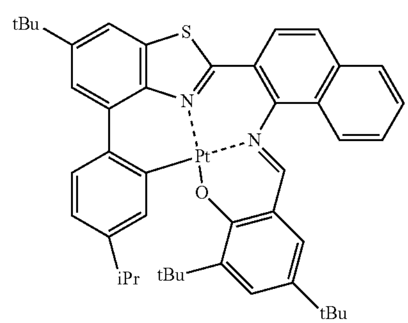

-continued
4-221
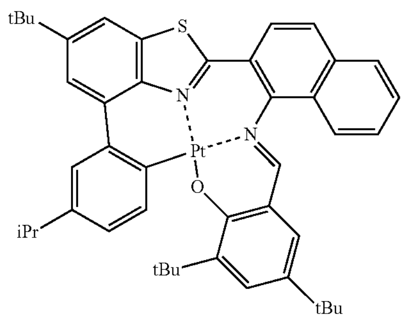
4-222
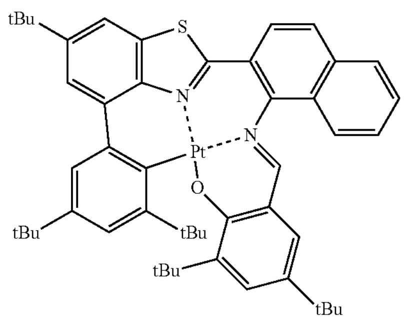
4-223
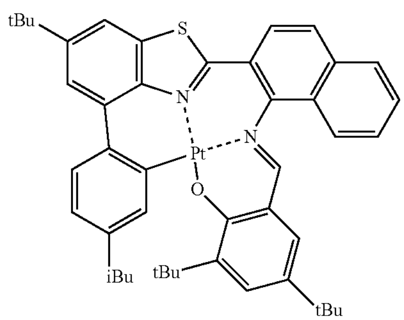
4-224
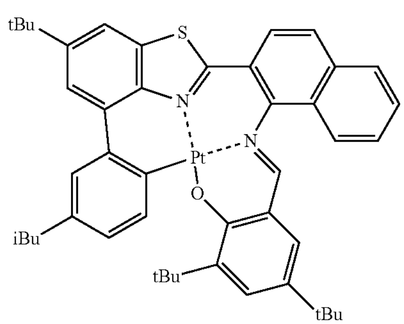
4-225
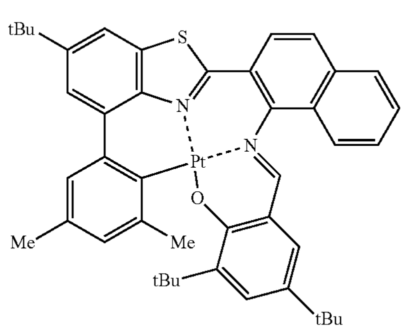
-continued
4-226
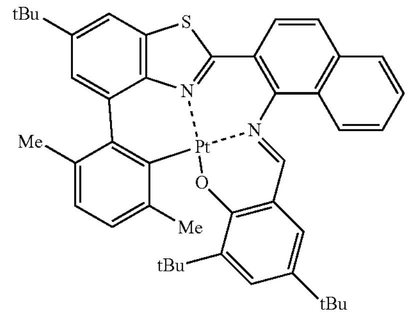
4-227
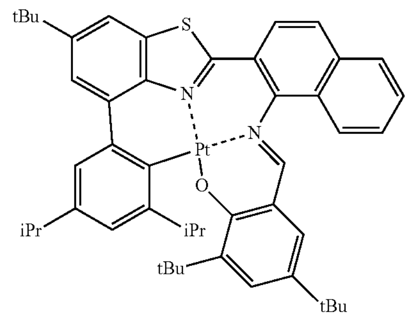
4-228
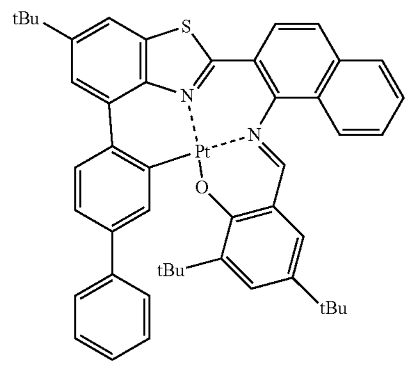
4-229
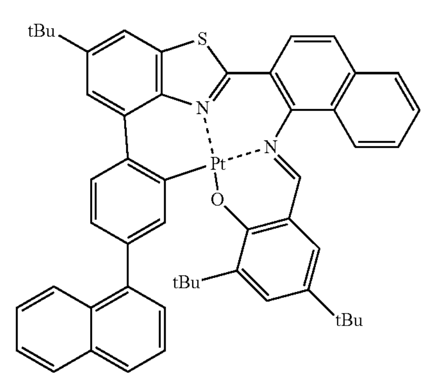

-continued
4-230
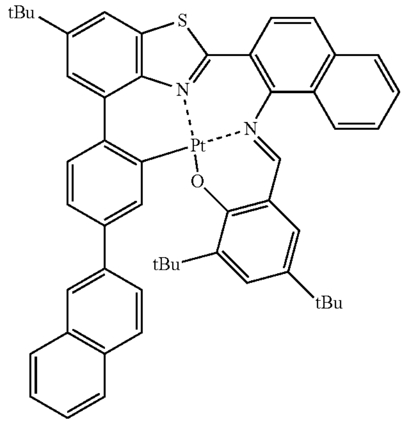
4-231
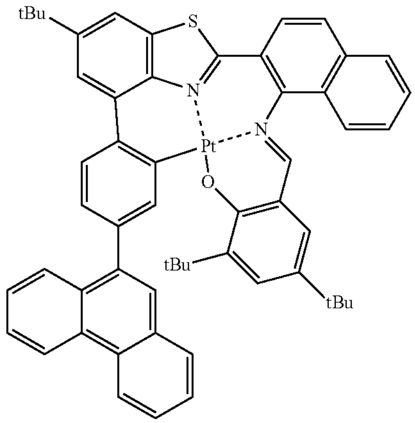
4-232
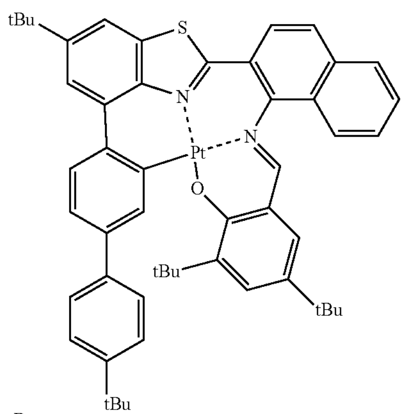
4-233
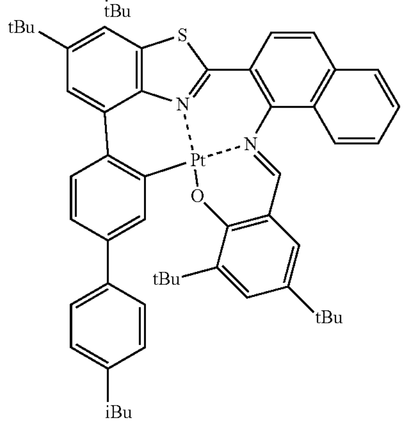
-continued
4-234
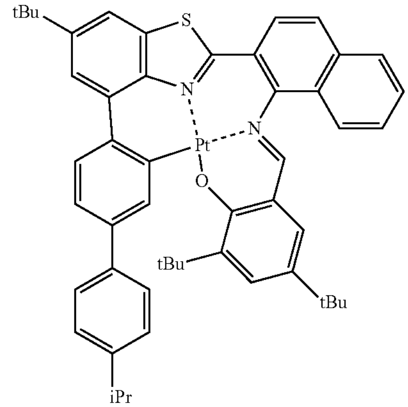
4-235
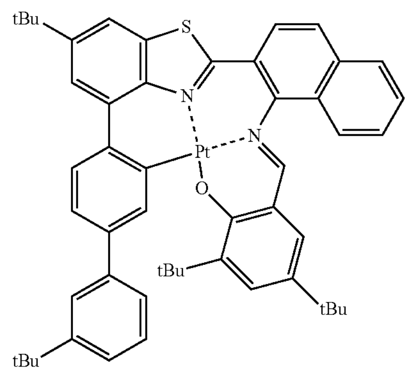
4-236
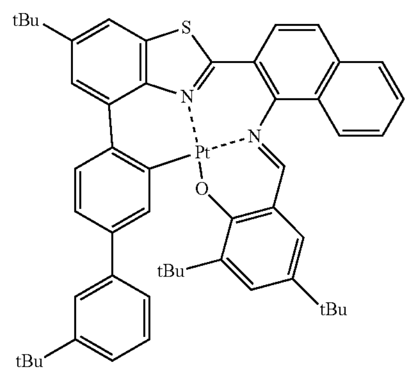
4-237
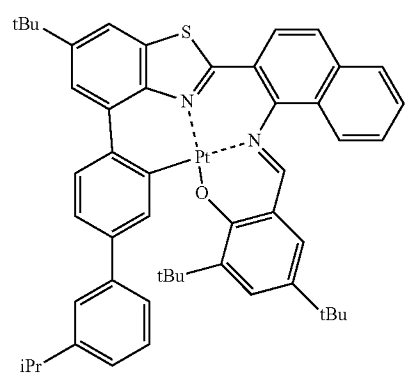

4-238
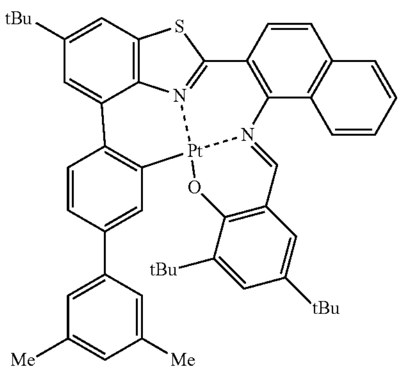
4-239
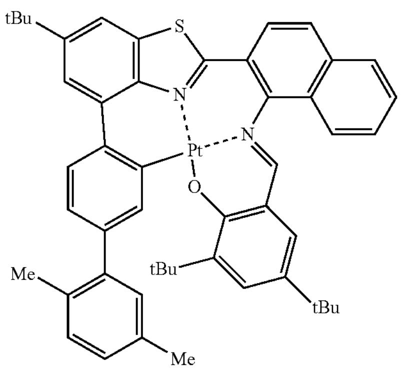
4-240
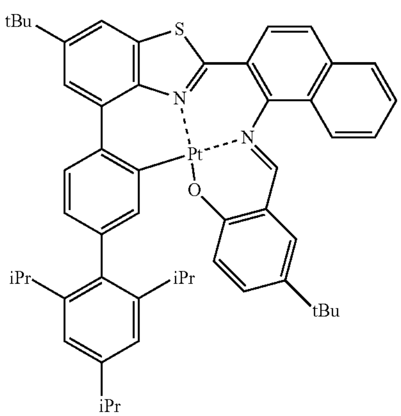
4-241
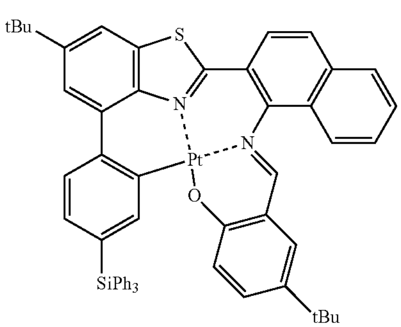
4-242
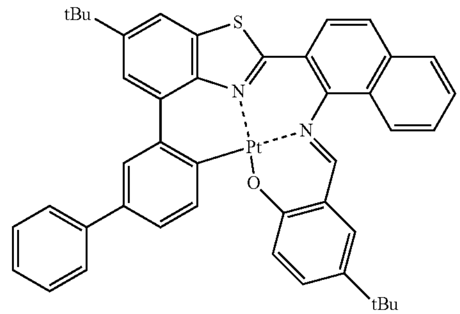
4-243
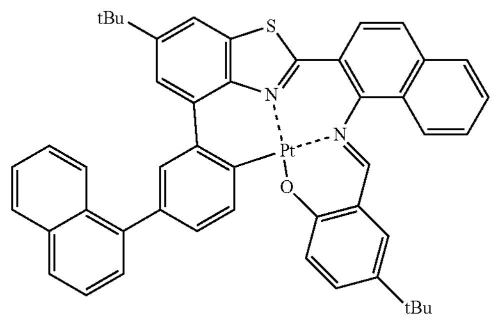
4-244
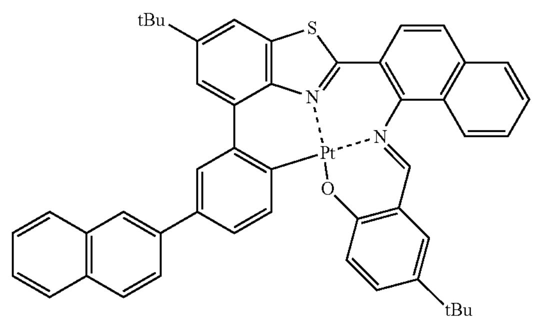
4-245
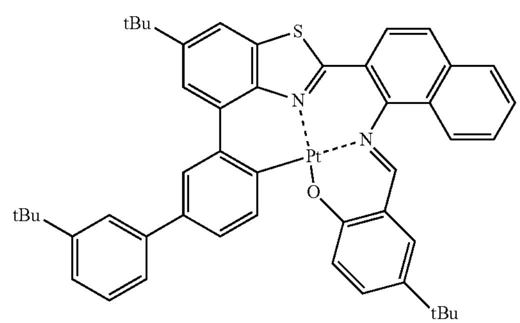
4-246
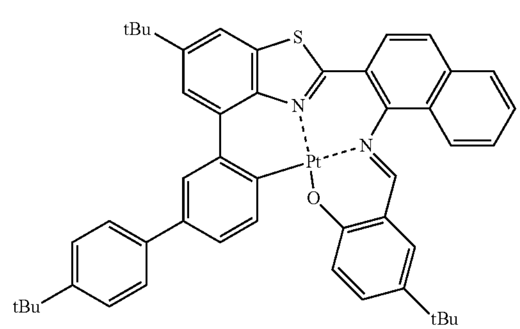

4-247
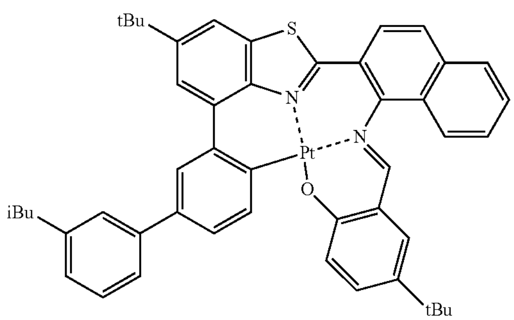
4-248
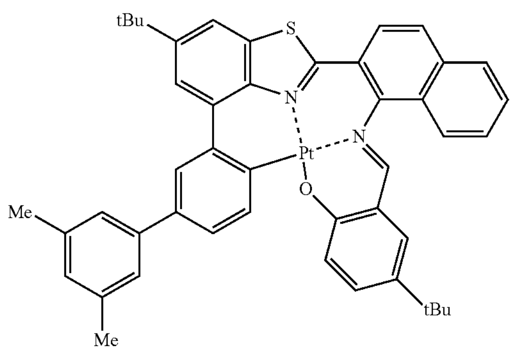
4-249
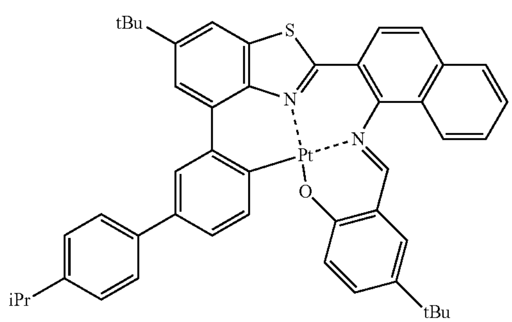
4-250
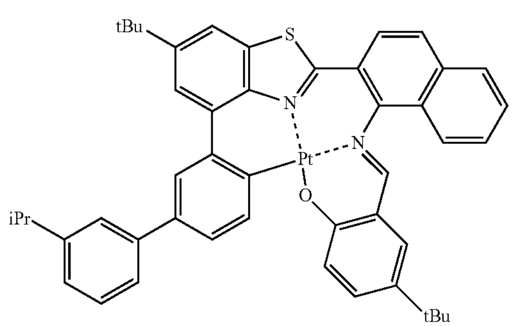
4-251
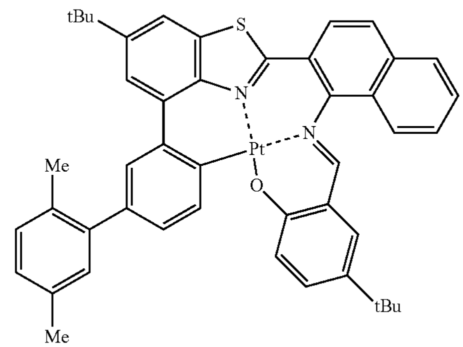
4-252
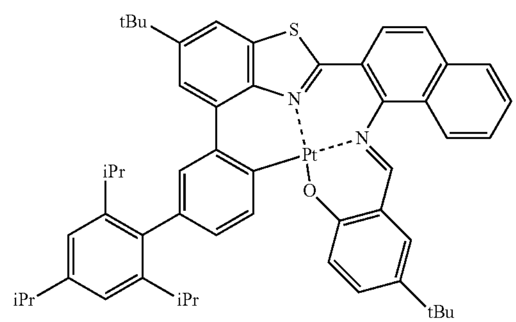
4-253
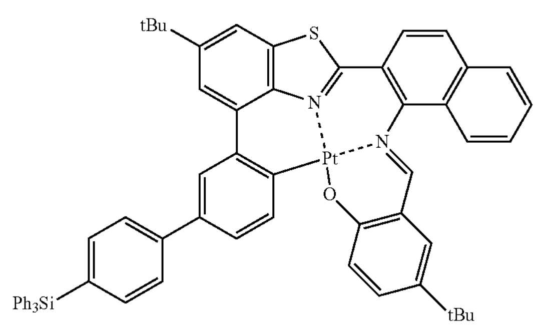
4-254
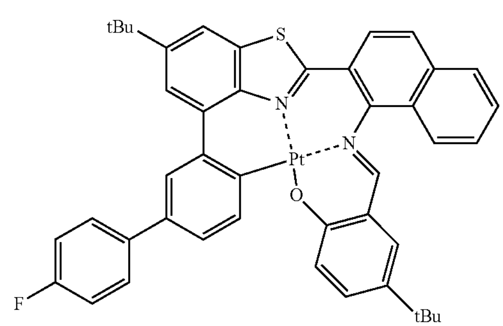

4-255
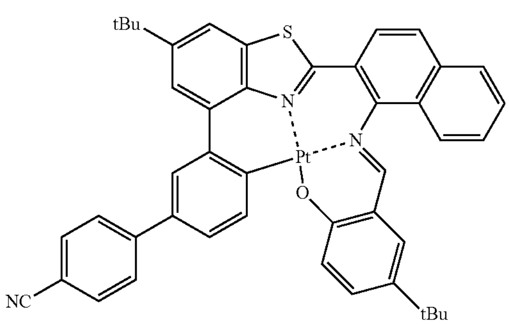
4-256
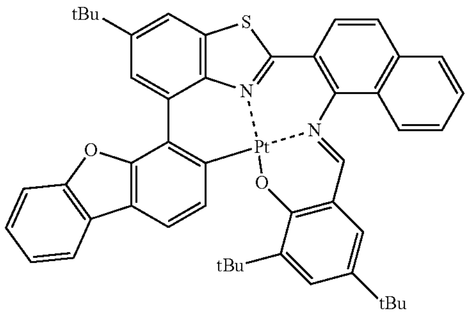
4-257
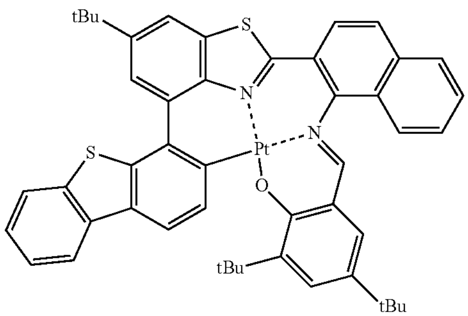
4-258
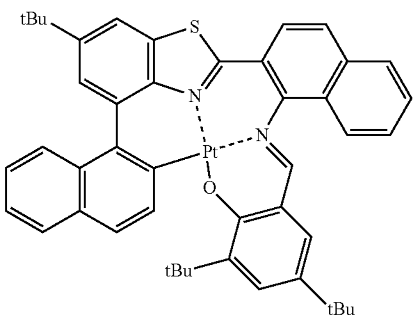
4-259
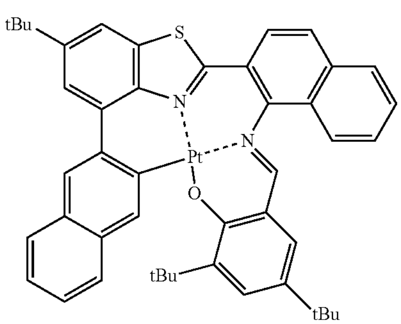
4-260
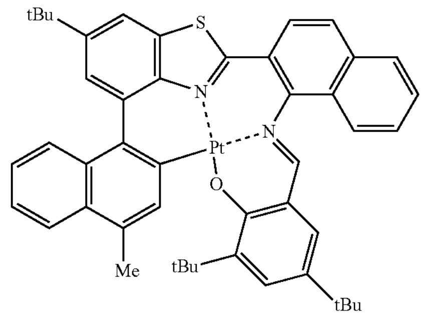
4-261
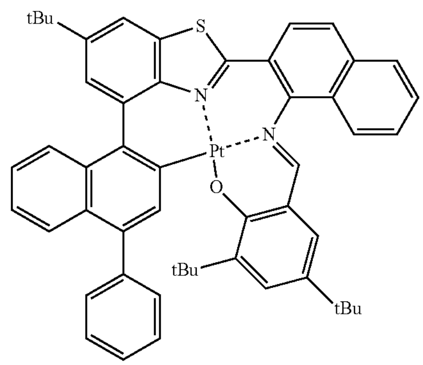
4-262
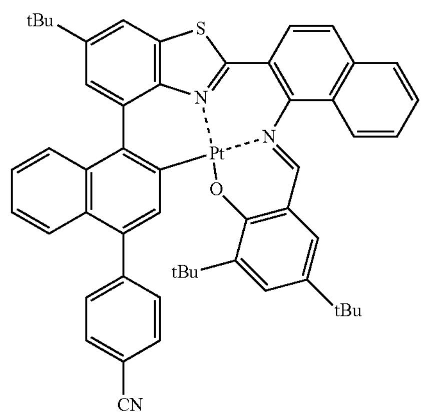
4-263
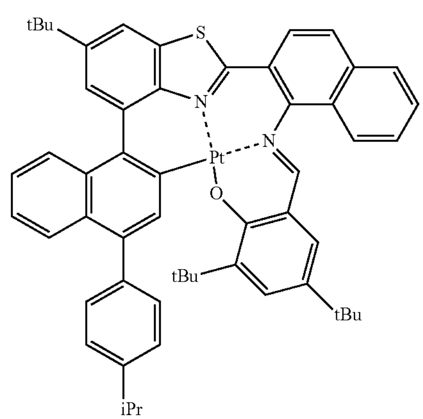

-continued
4-264
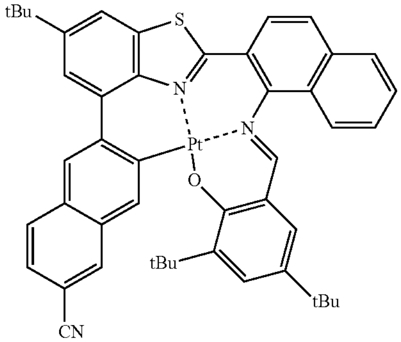
4-265
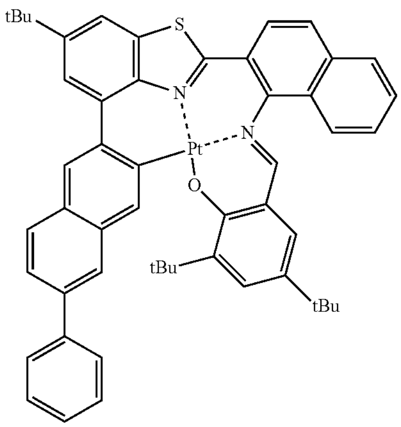
4-266
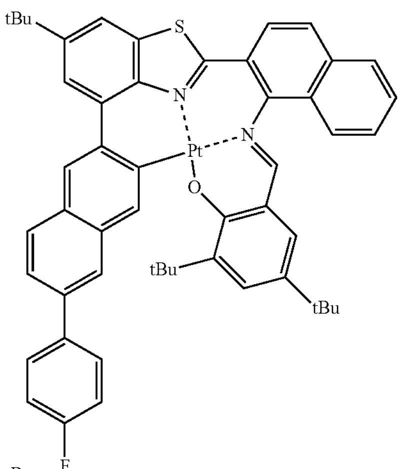
4-267
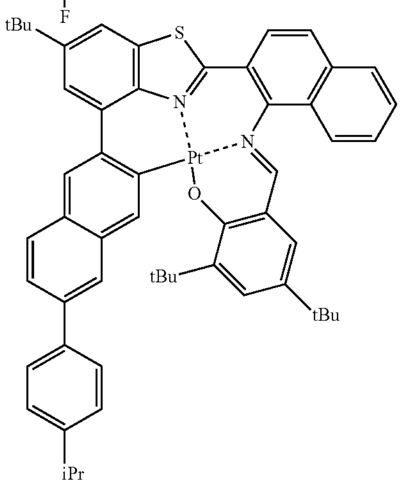
-continued
4-268
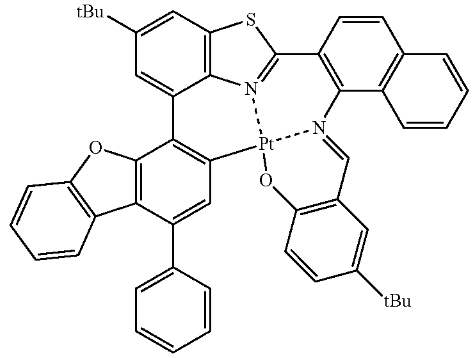
4-269
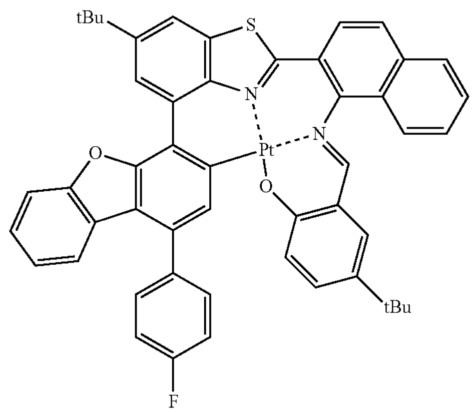
4-270
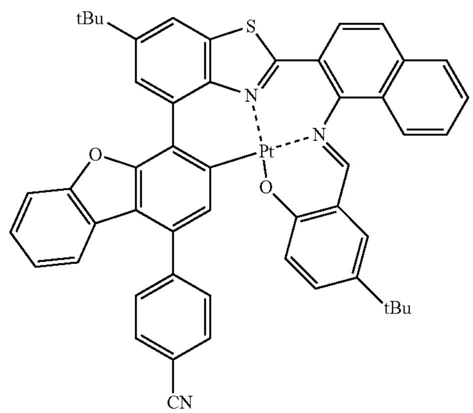
4-271
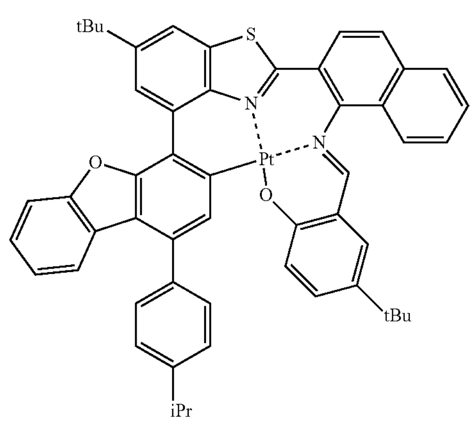

4-272
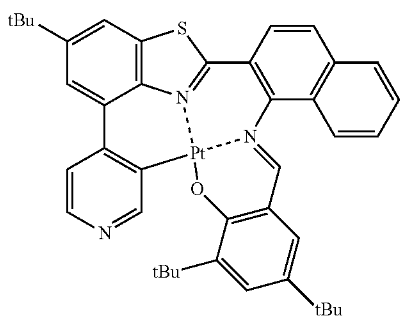
4-273
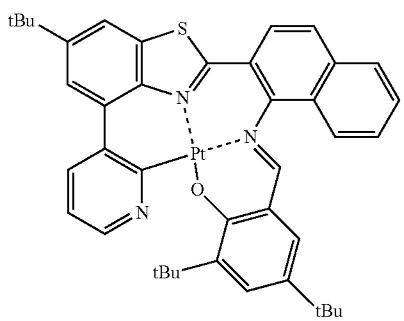
4-274
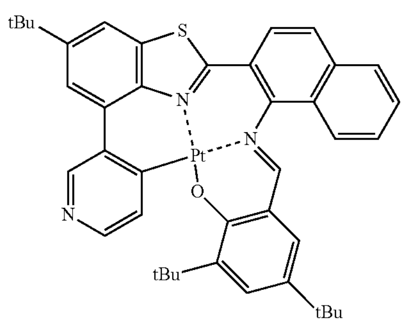
4-275
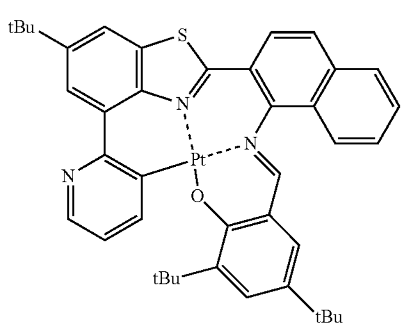
4-276
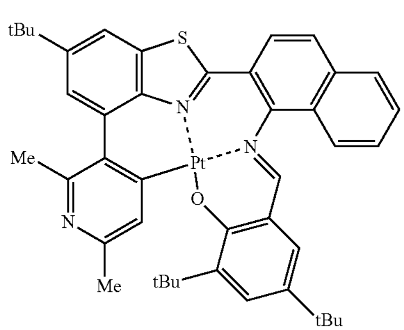
4-277
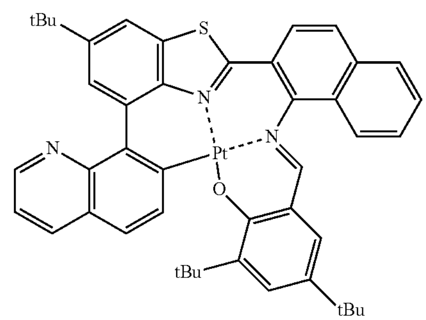
4-278
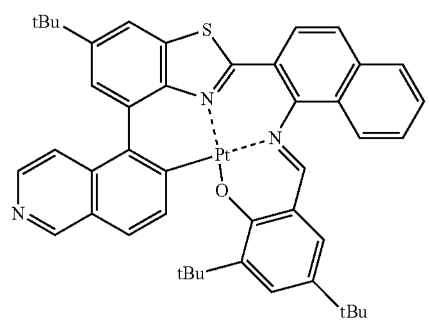
4-279
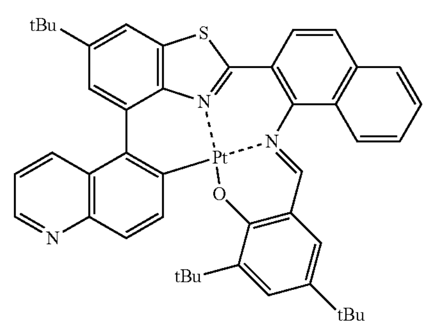
4-280
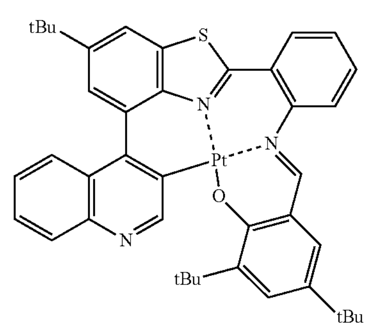
4-281
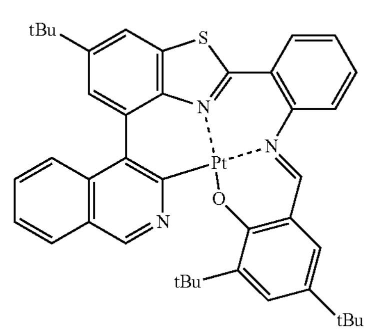

-continued
4-282
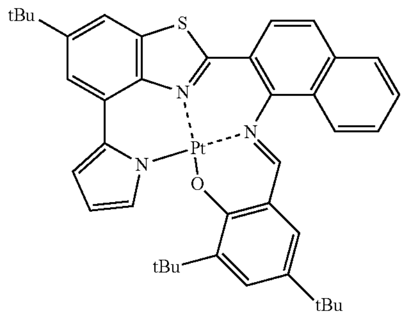
4-283
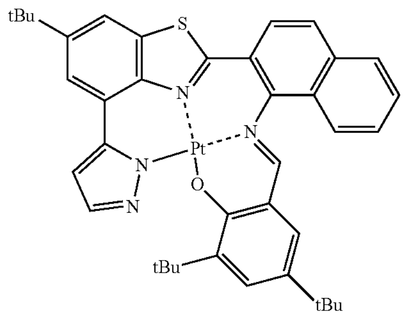
4-284
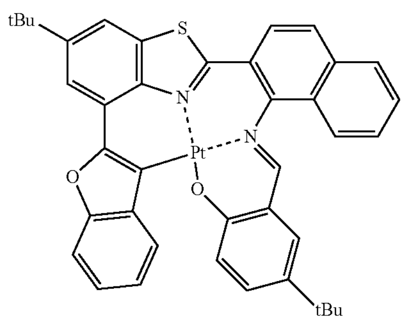
4-285
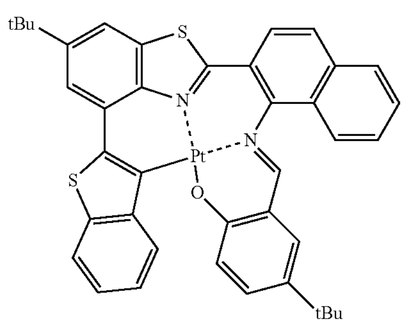
4-286
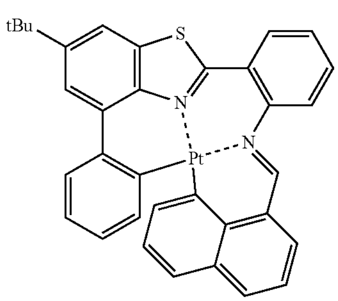
-continued
4-287
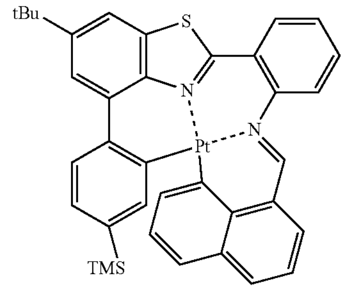
4-288
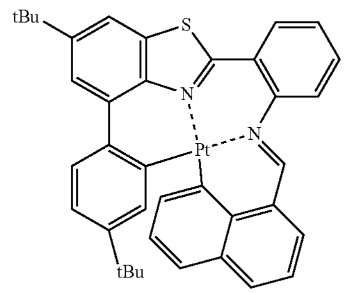
4-289
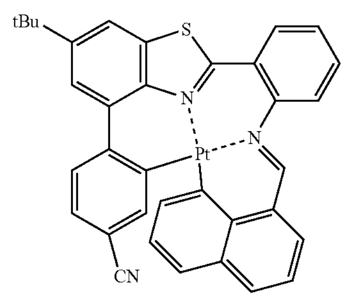
4-290
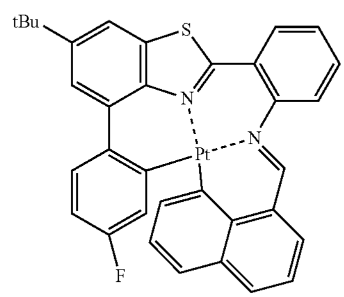
4-291
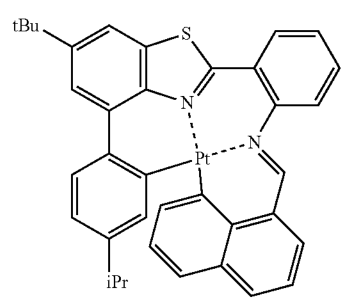

-continued
4-292
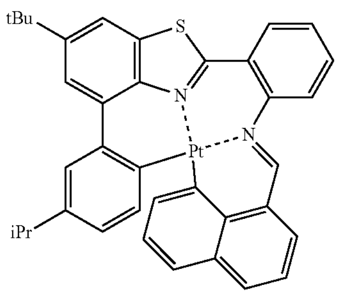
4-293
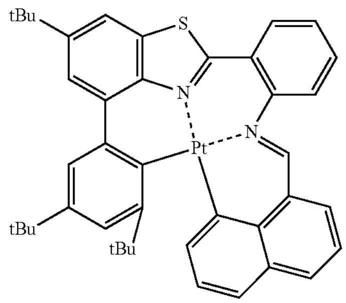
4-294
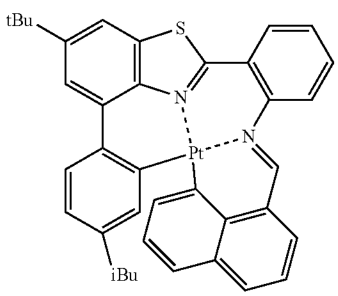
2-295
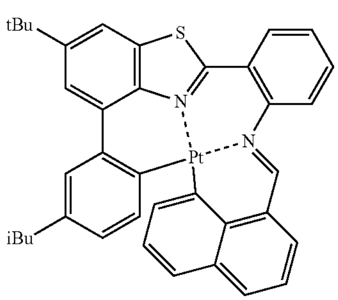
4-296
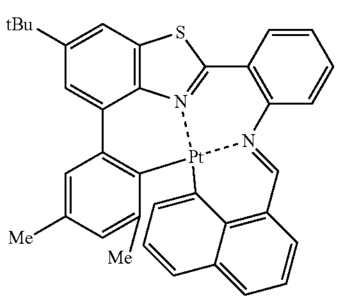
-continued
4-297
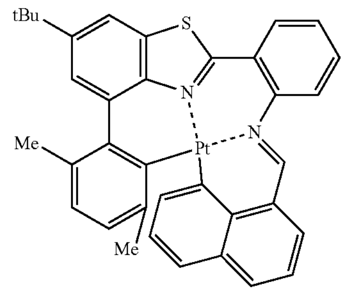
4-298
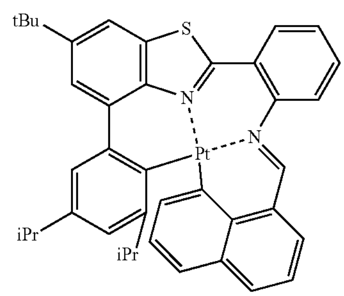
4-299
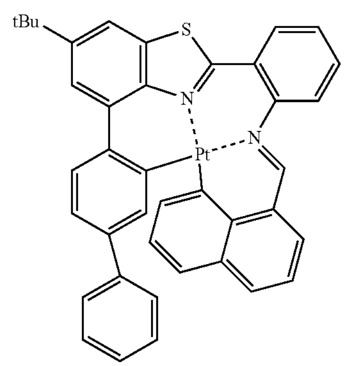
4-300
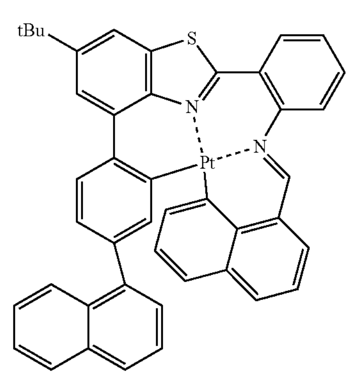

-continued
4-301
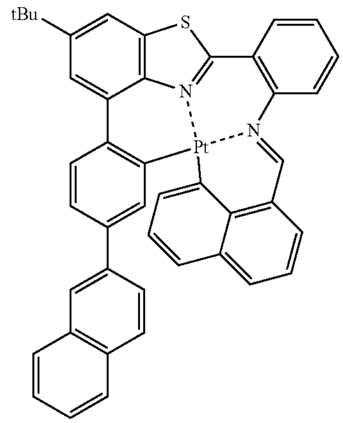
4-302
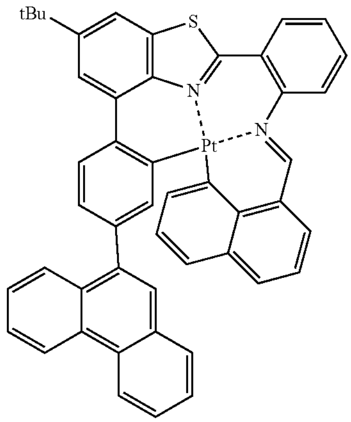
4-303
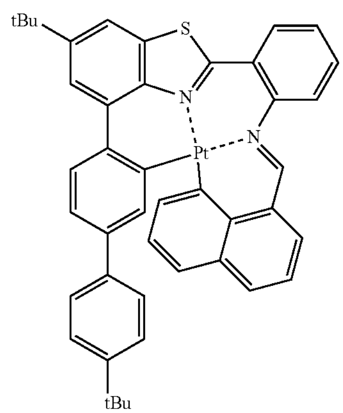
4-304
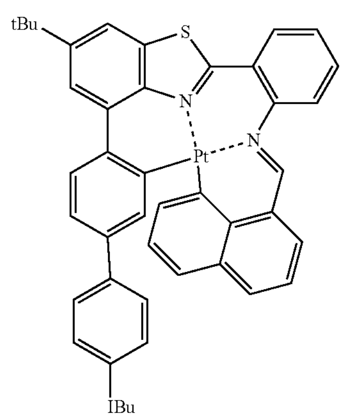
-continued
4-305
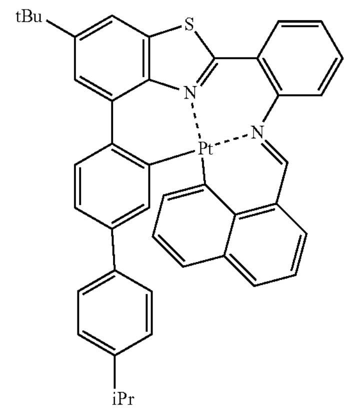
4-306
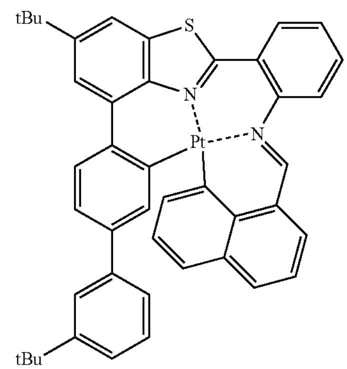
4-307
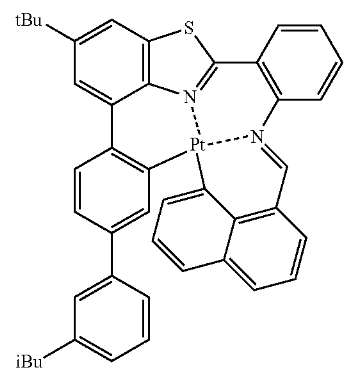
4-308
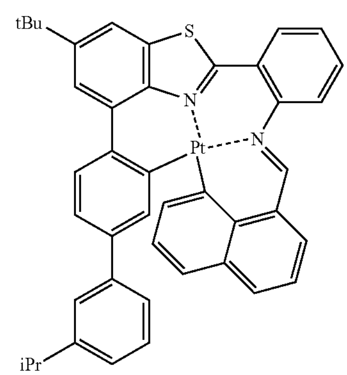

-continued
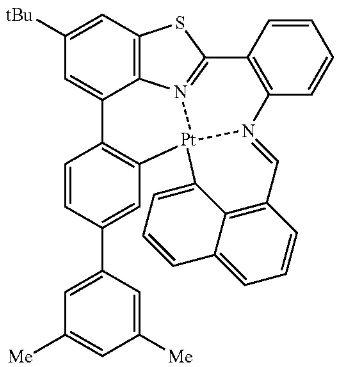
4-309
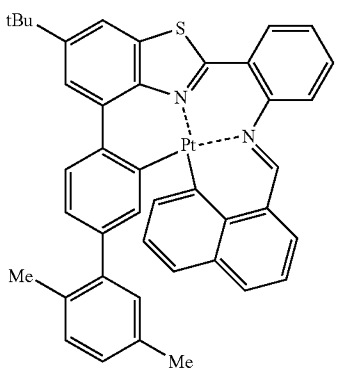
4-310
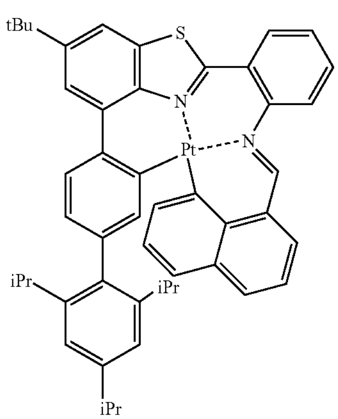
4-311
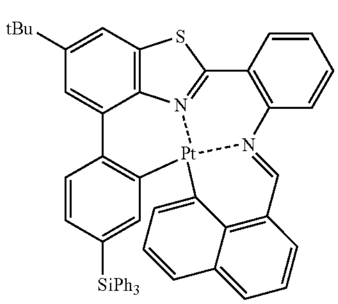
4-312
-continued
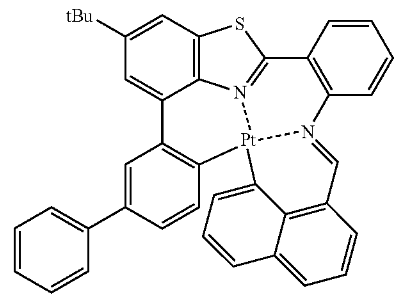
4-313
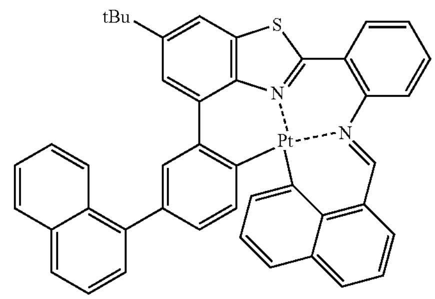
4-314
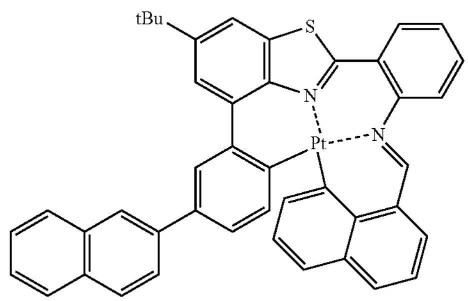
4-315
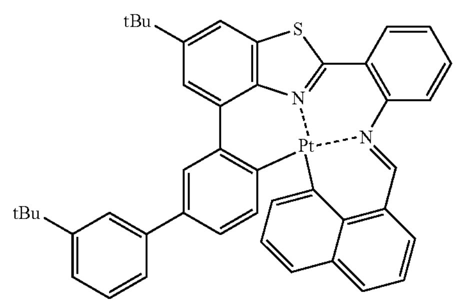
4-316
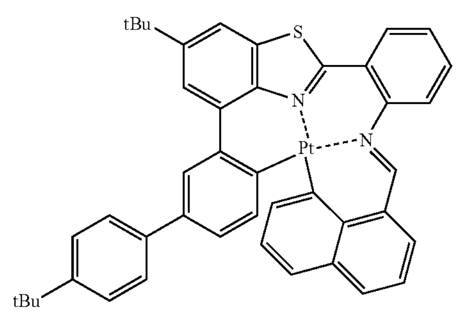
4-317

-continued
4-318
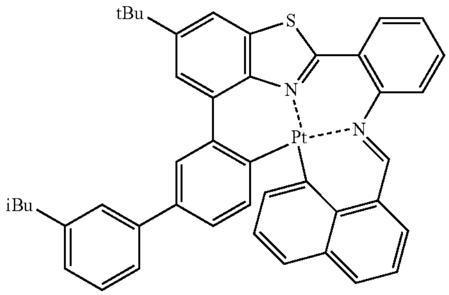
4-319
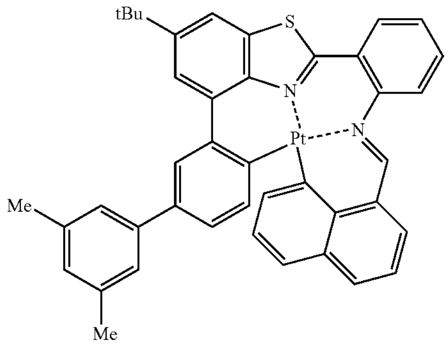
4-320
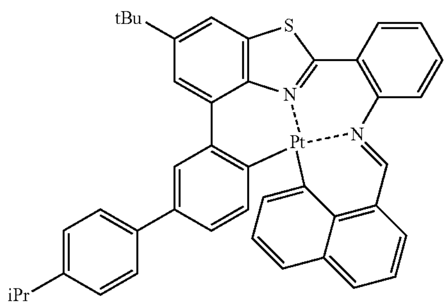
4-321
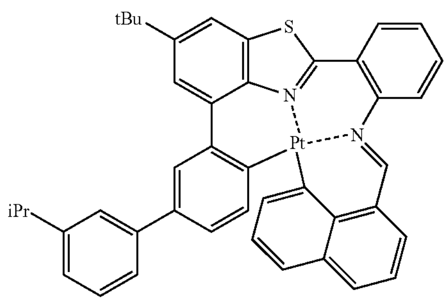
4-322
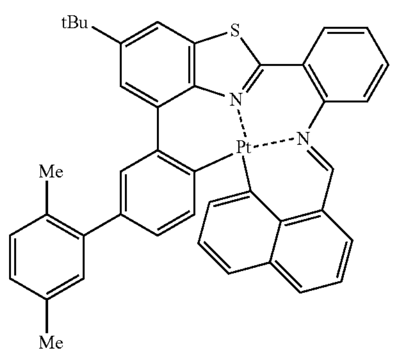
4-323
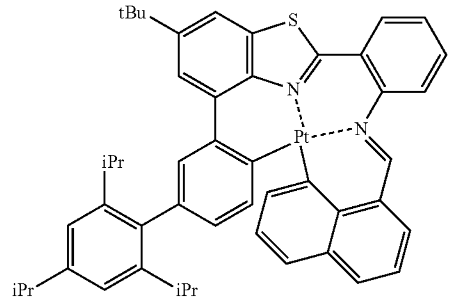
4-324
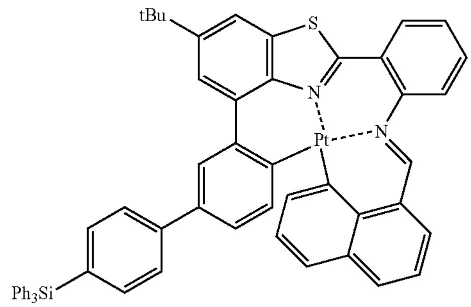
4-325
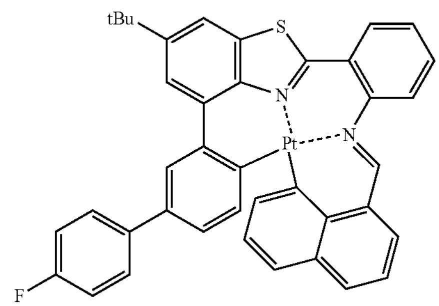
4-326
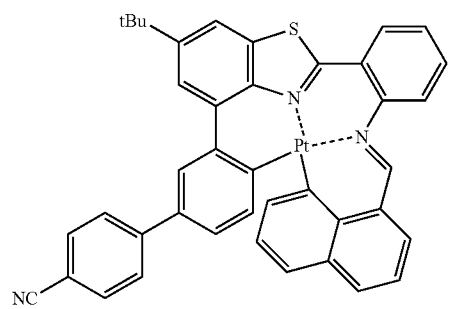
4-327
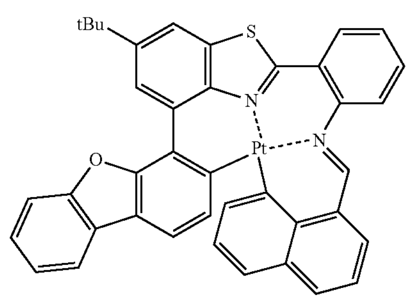

4-328
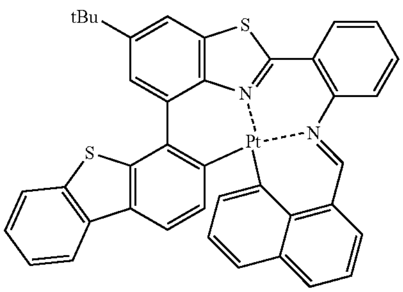
4-329
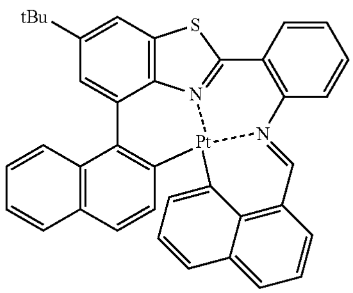
4-330
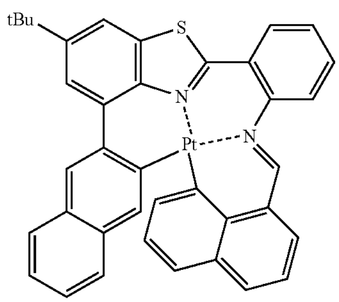
4-331
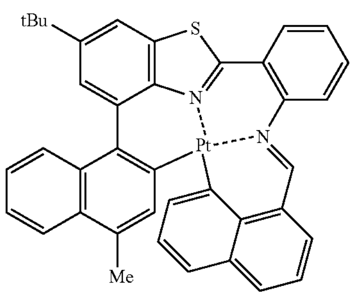
4-332
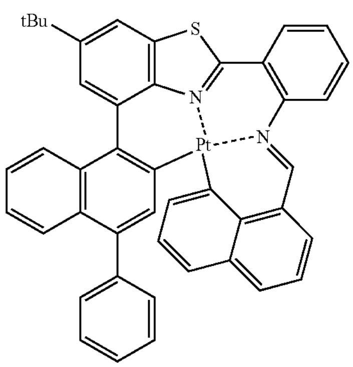
4-333
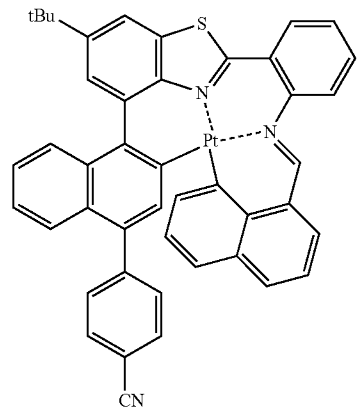
4-334
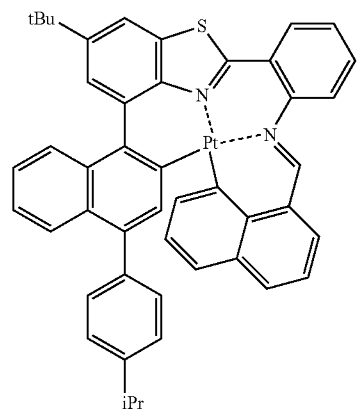
4-335
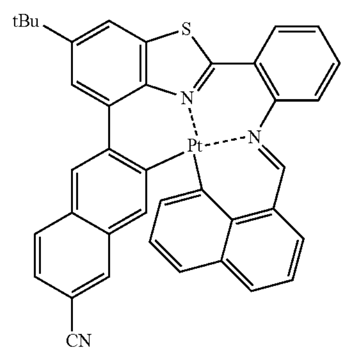
4-336
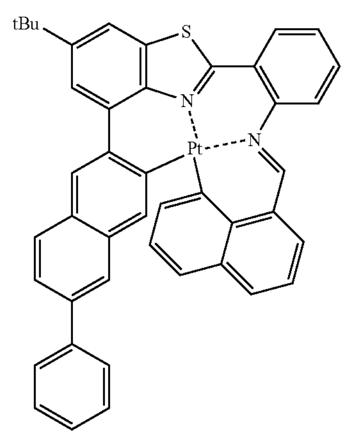

-continued
4-337
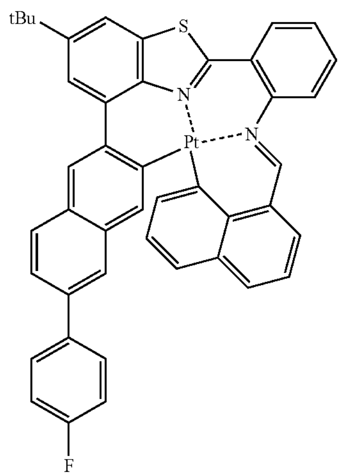
4-338
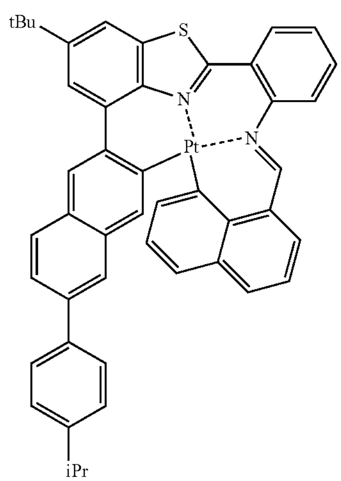
4-339
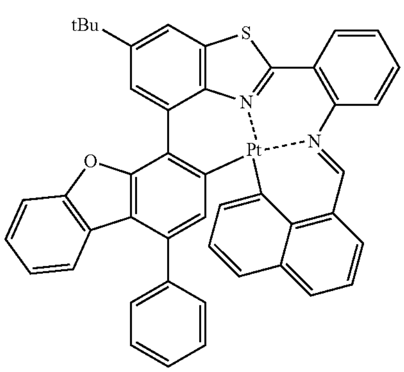
-continued
4-340
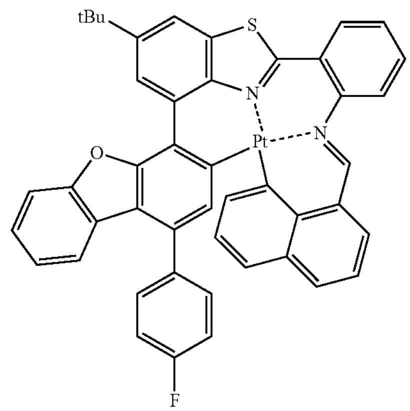
4-341
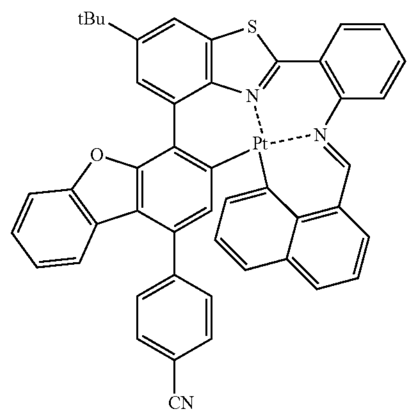
4-342
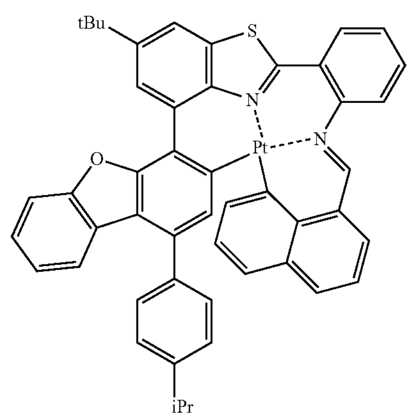
4-343
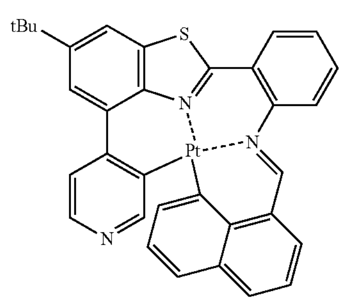

-continued
4-344
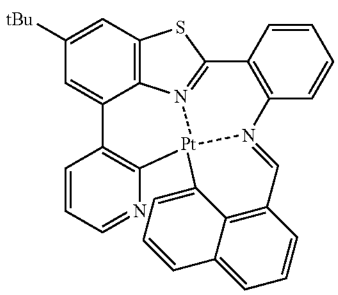
4-345
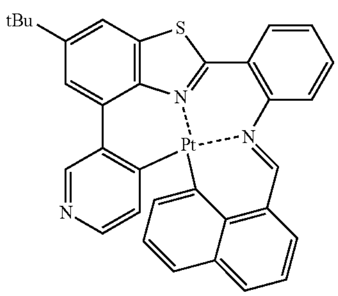
4-346
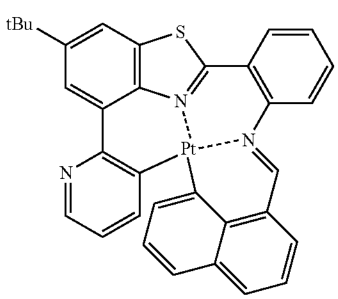
4-347
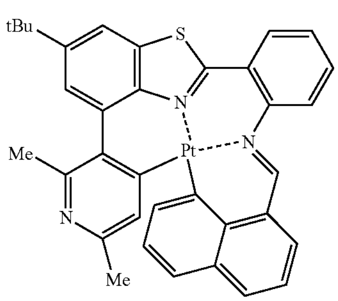
4-348
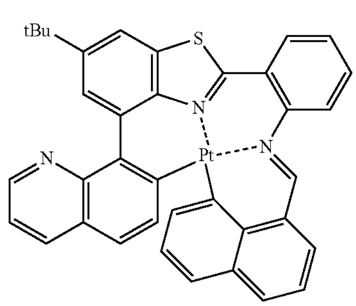
-continued
4-349
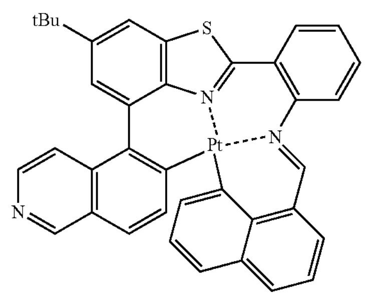
4-350
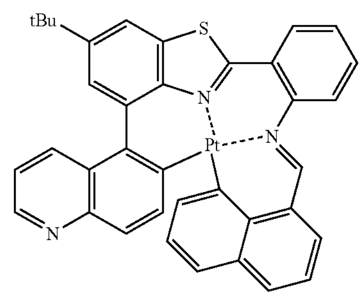
4-351
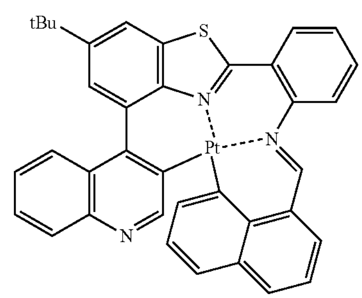
4-352
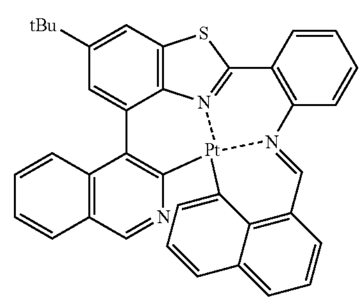
4-353
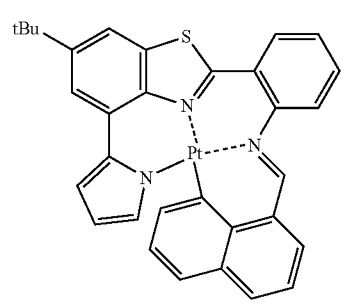

-continued
4-354
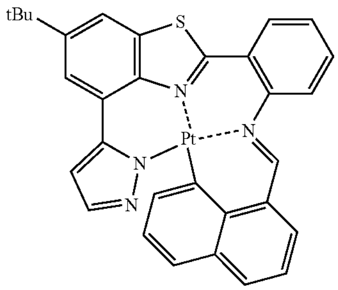
4-355
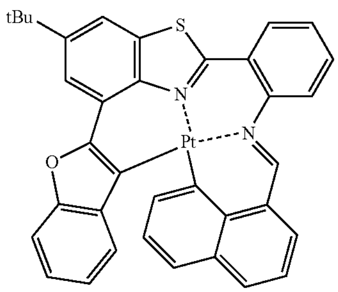
4-356
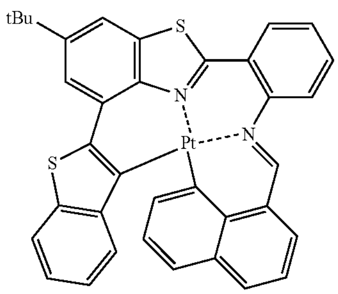
4-357
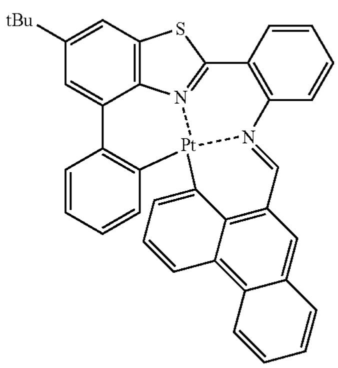
4-358
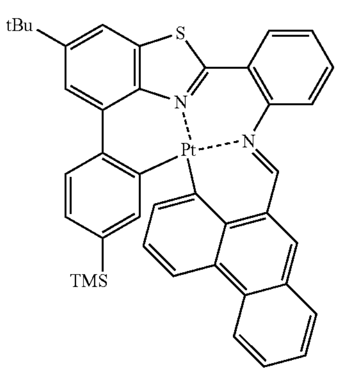
-continued
4-359
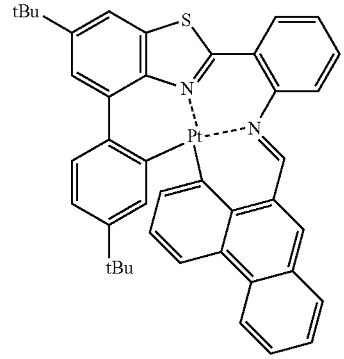
4-360
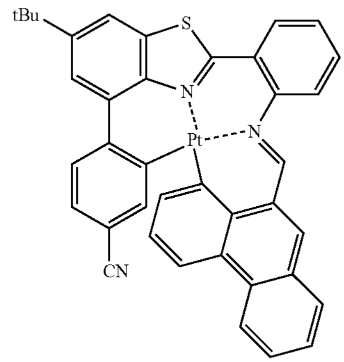
4-361
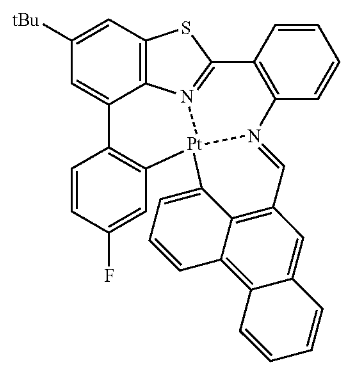
4-362
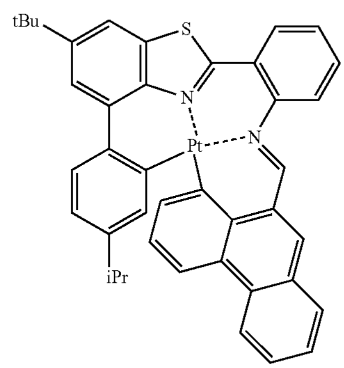

4-363
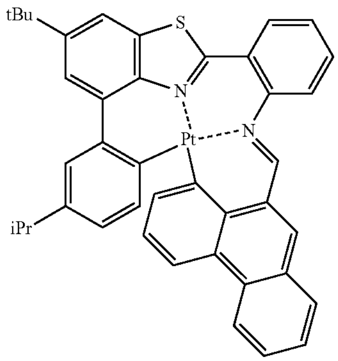
4-364
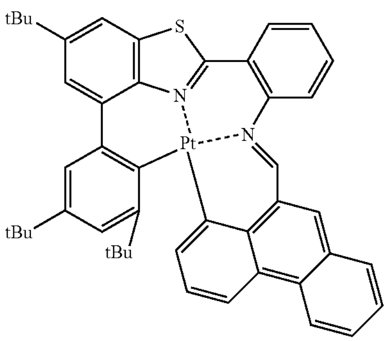
4-365
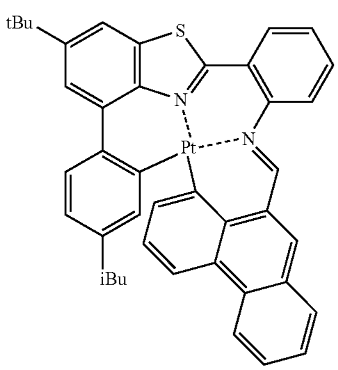
4-366
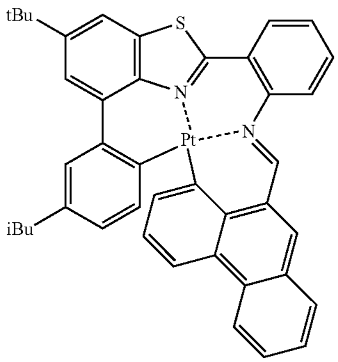
4-367
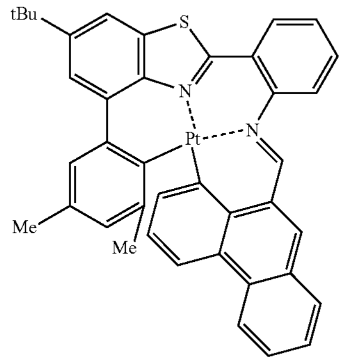
4-368
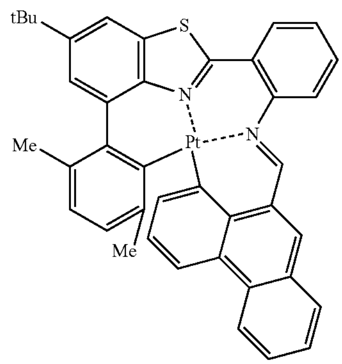
4-369
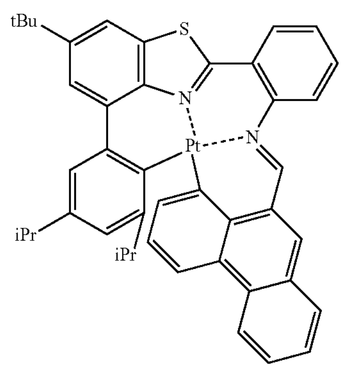
4-370
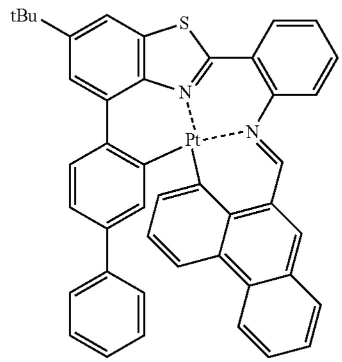

-continued
4-371
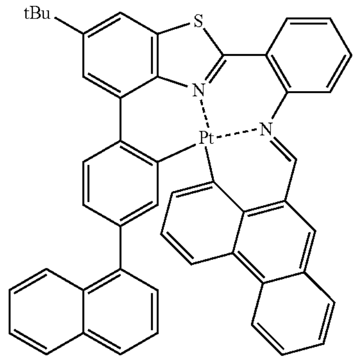
4-372
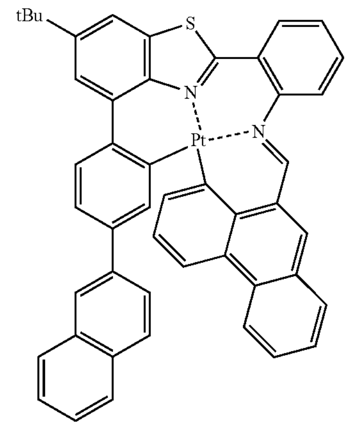
4-373
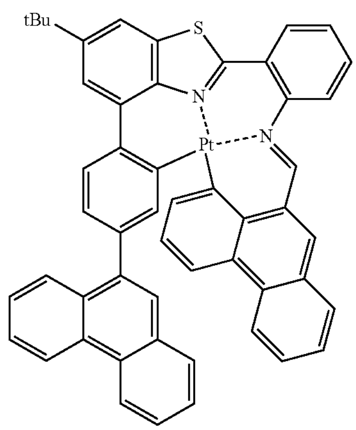
4-374
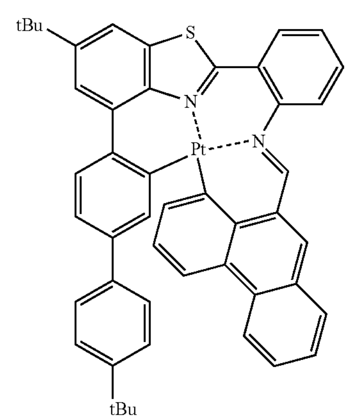
-continued
4-375
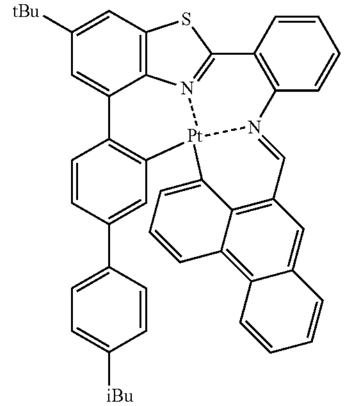
4-376
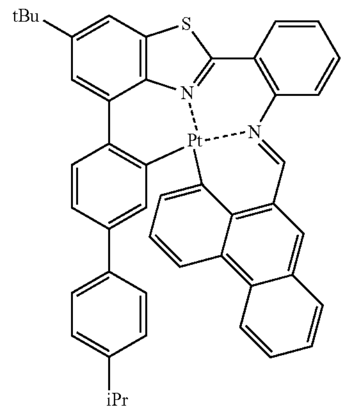
4-377
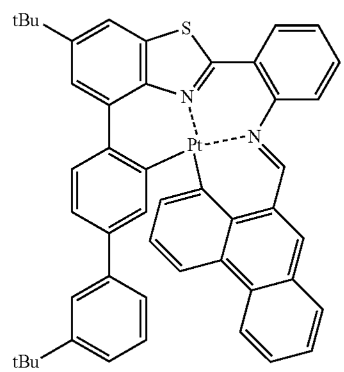
4-378
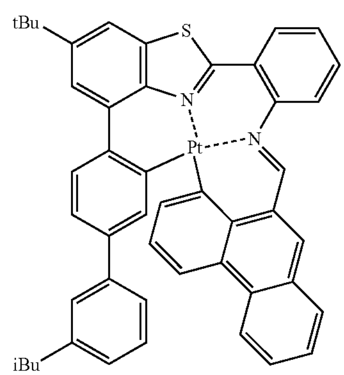

-continued
4-379
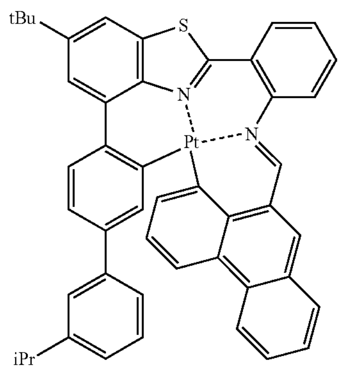
4-380
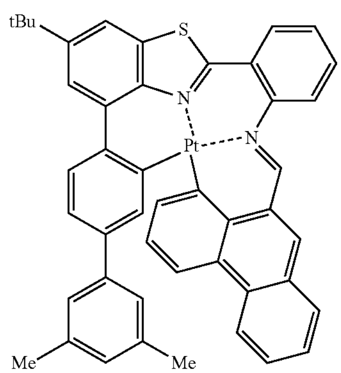
4-381
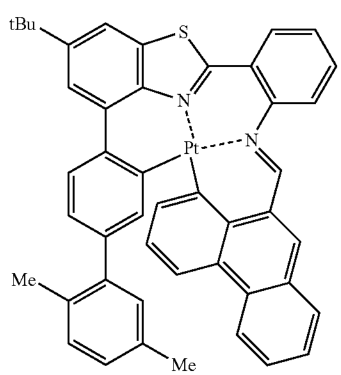
4-382
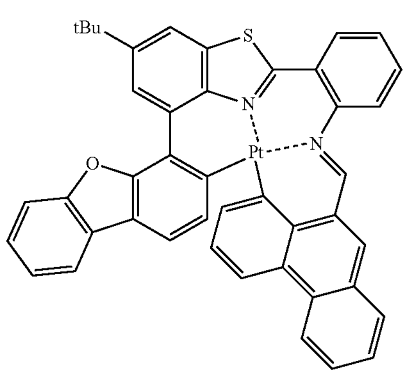
-continued
4-383
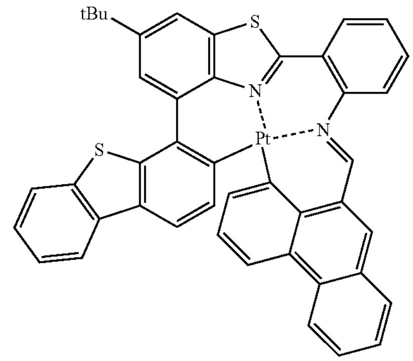
4-384
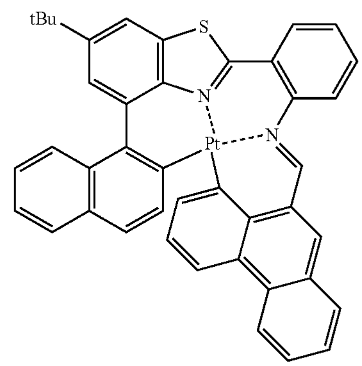
4-385
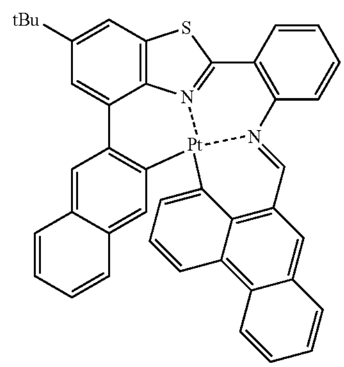
4-386
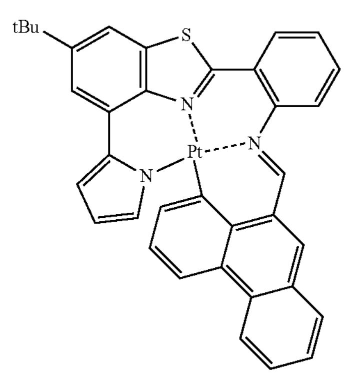

4-387
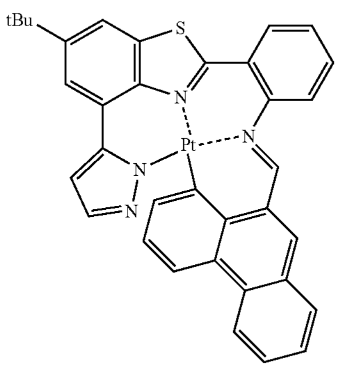
4-388
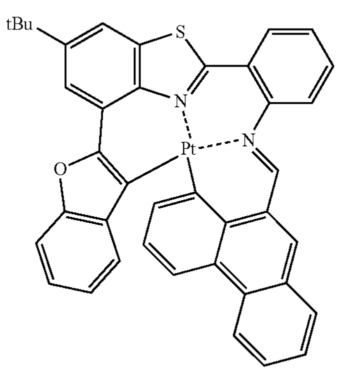
4-389
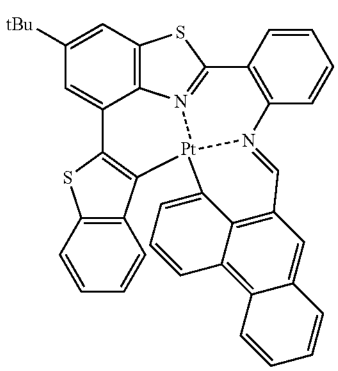
4-390
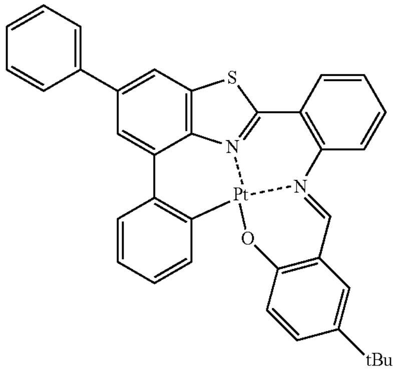
4-391
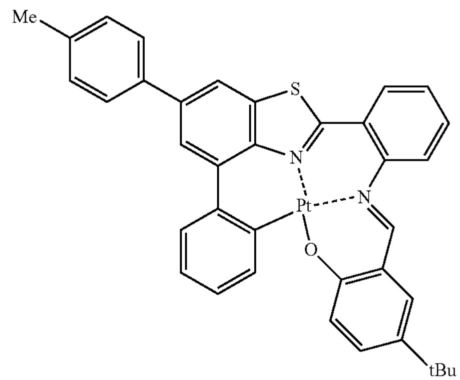
4-392
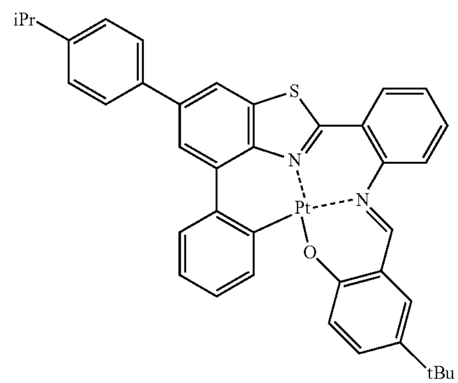
4-393
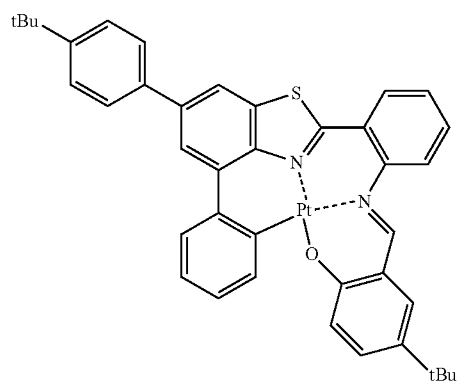
4-394
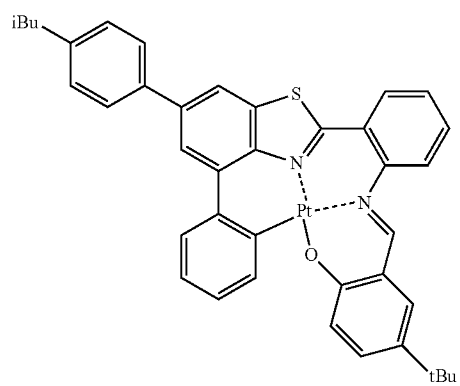

4-395
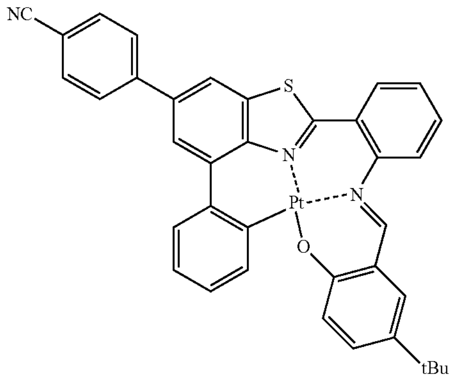
4-396
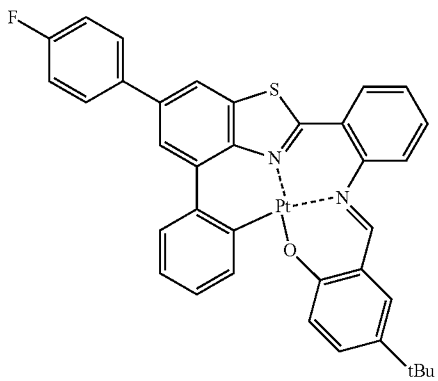
4-397
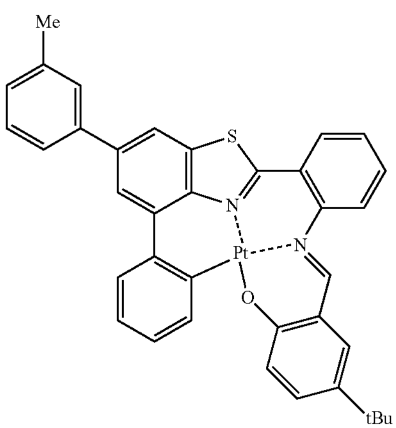
4-398
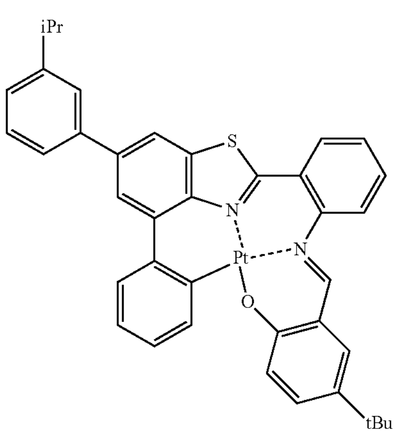
4-399
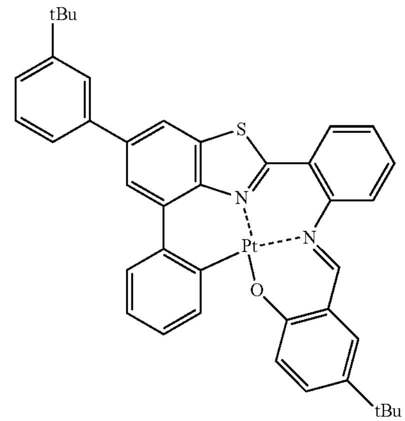
4-400
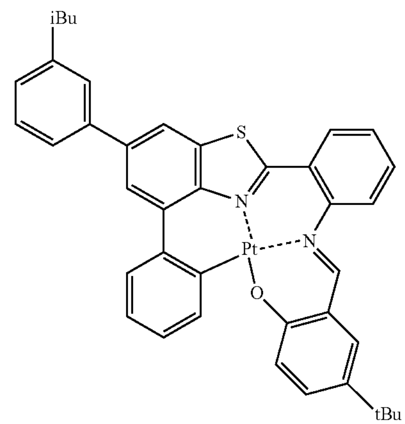
4-401
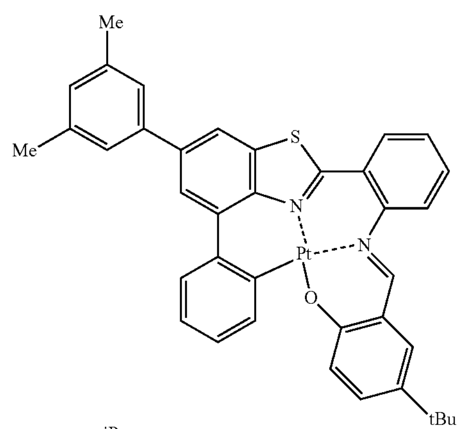
4-402
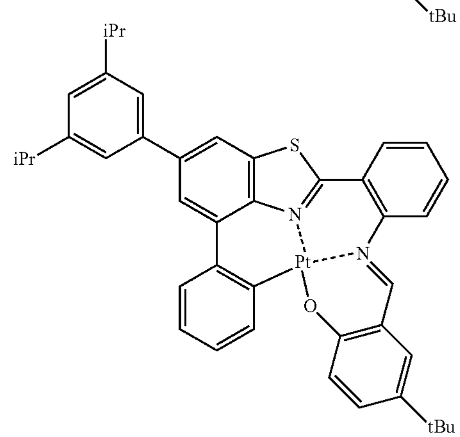

-continued
4-403
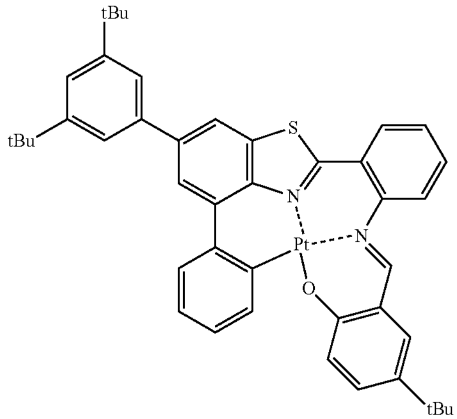
4-404
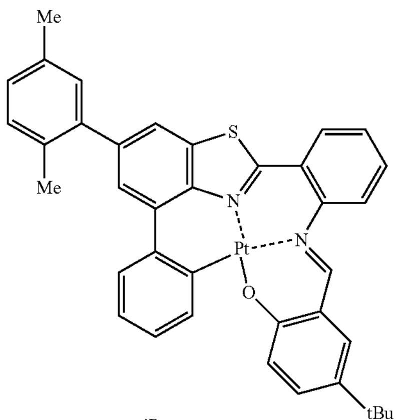
4-405
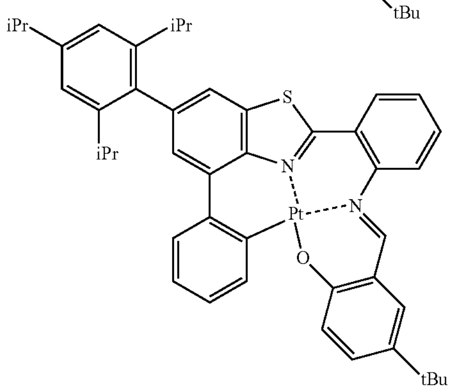
4-406
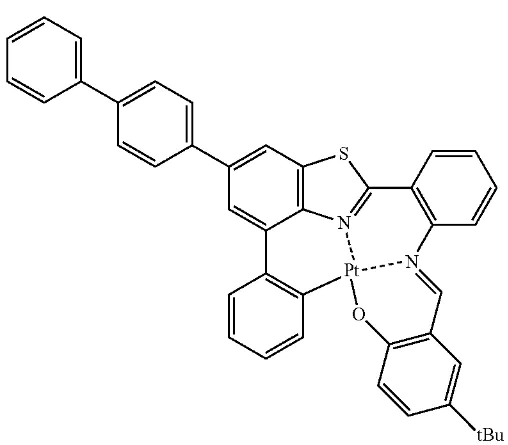
-continued
4-407
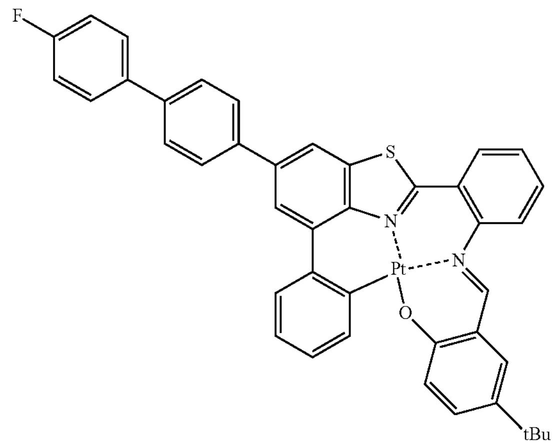
4-408
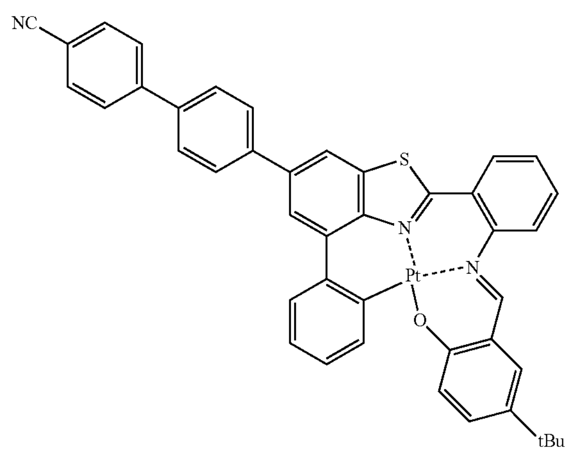
4-409
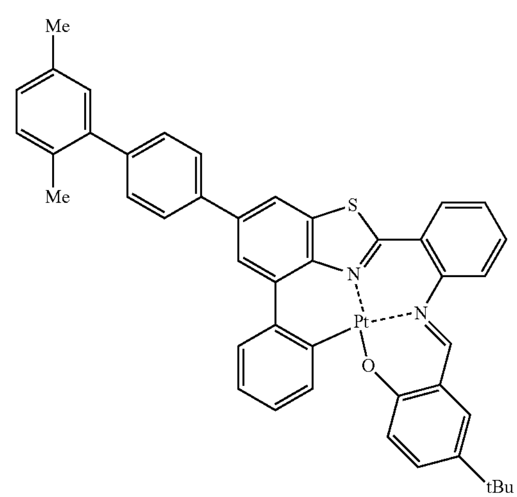

-continued
4-410
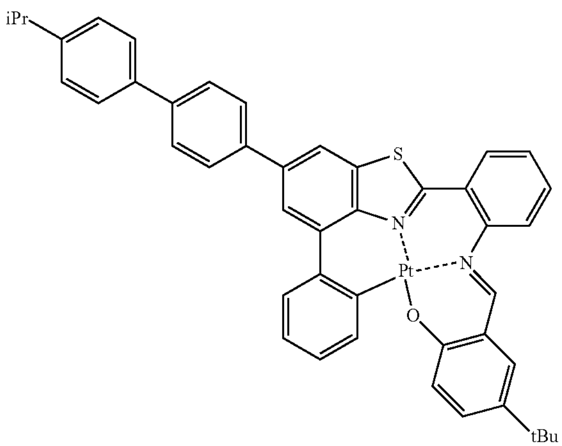
4-411
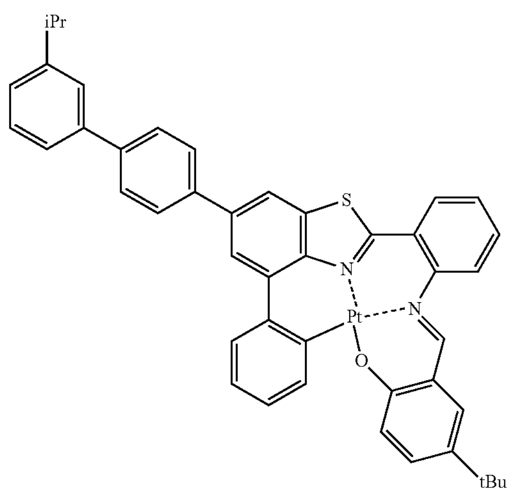
4-412
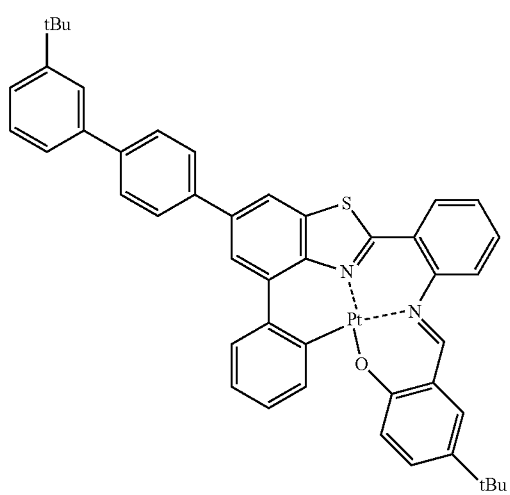
-continued
4-413
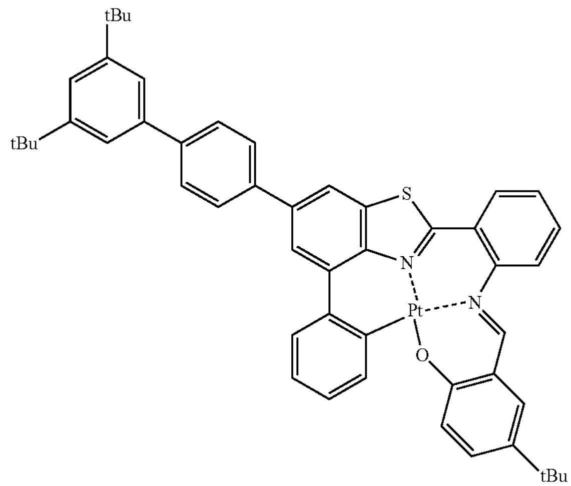
4-414
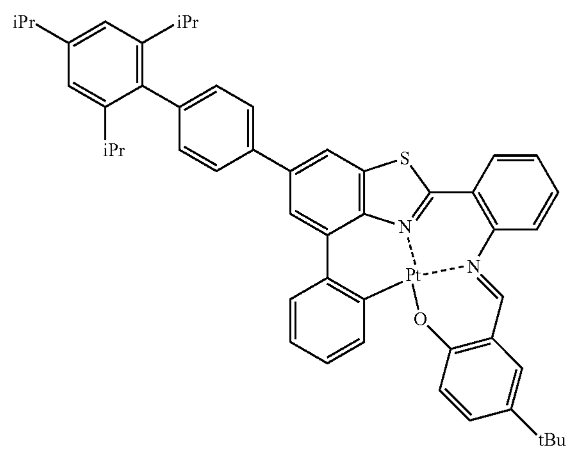
4-415
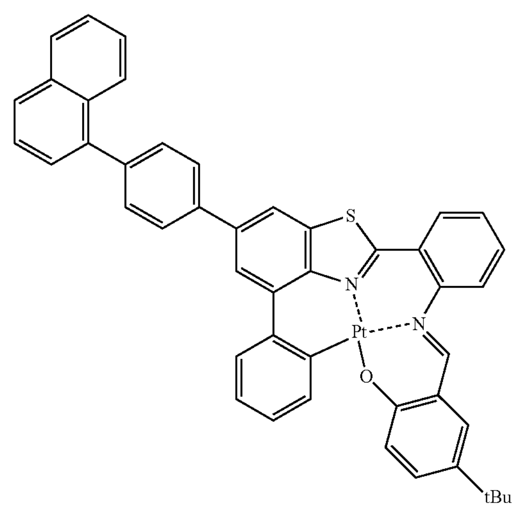

-continued
4-416
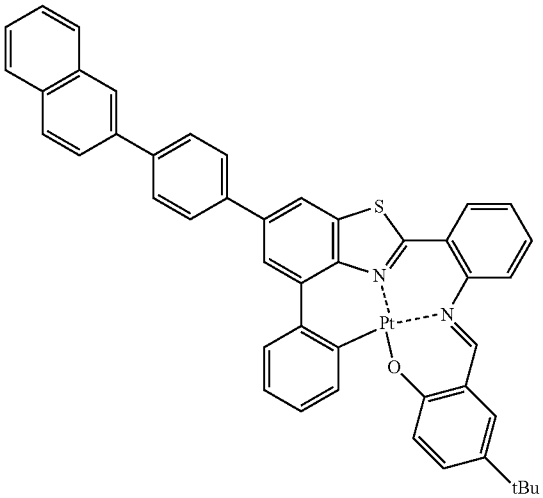
4-417
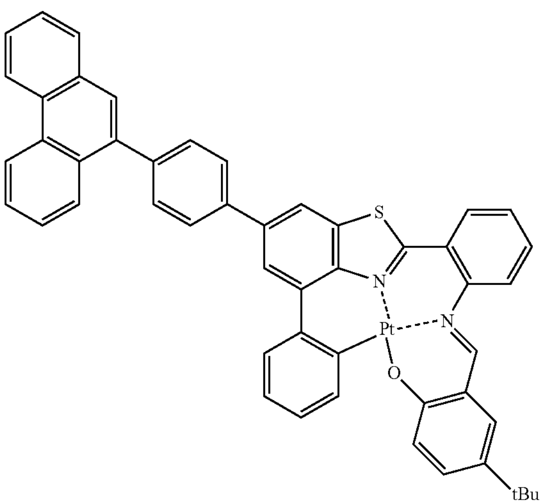
4-418
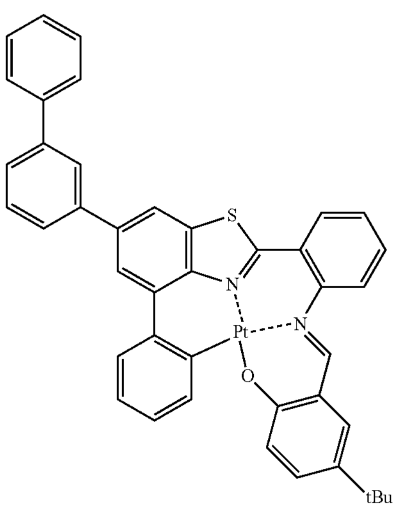
-continued
4-419
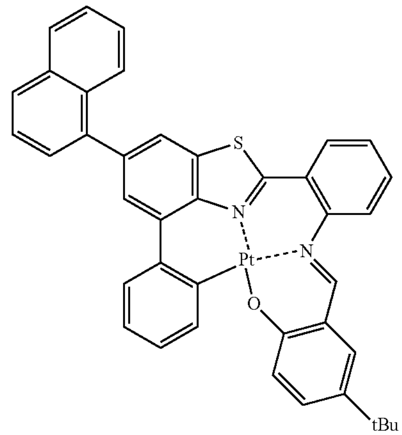
4-420
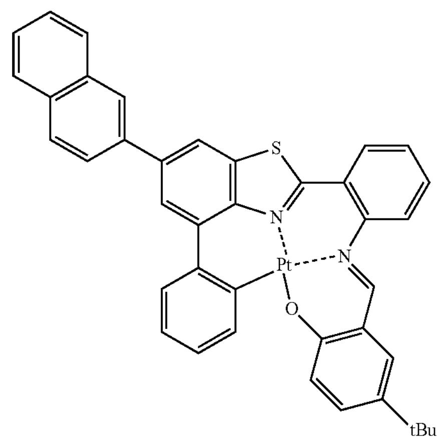
4-421
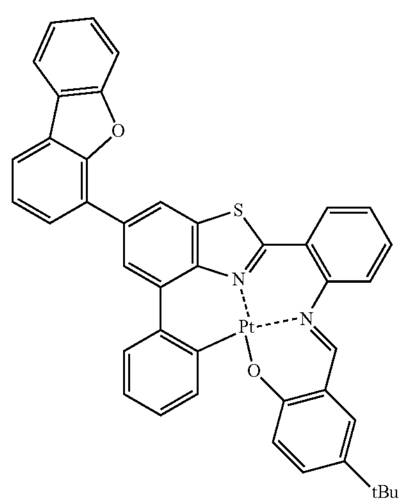

-continued
4-422
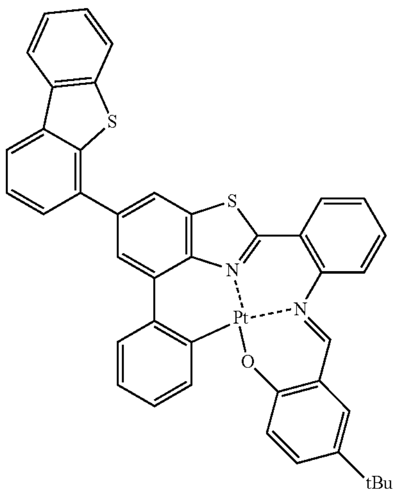
4-423
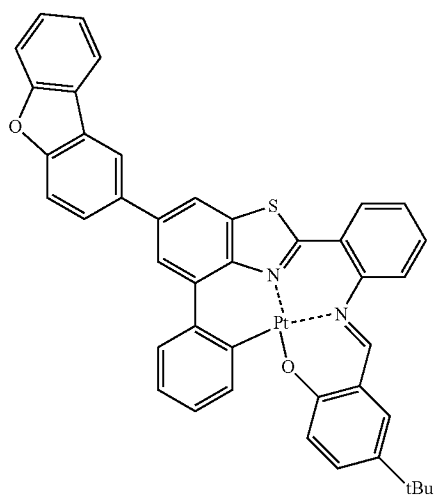
4-424
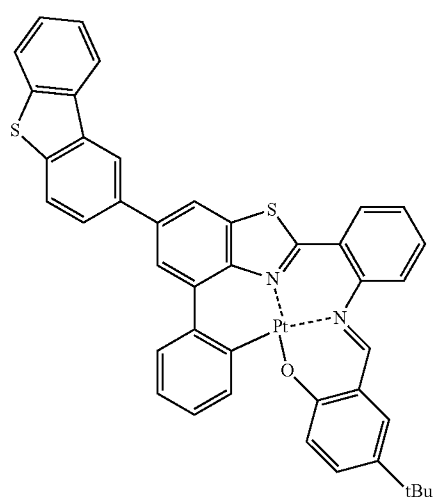
-continued
4-425
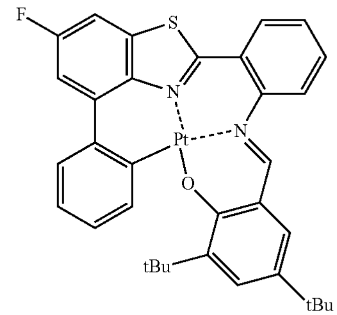
4-426
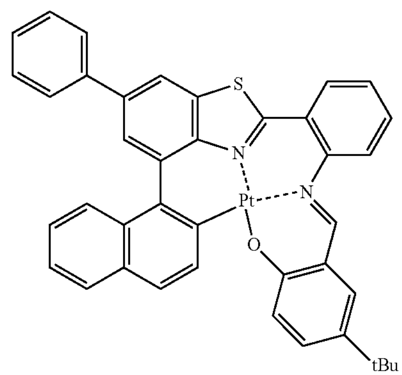
4-427
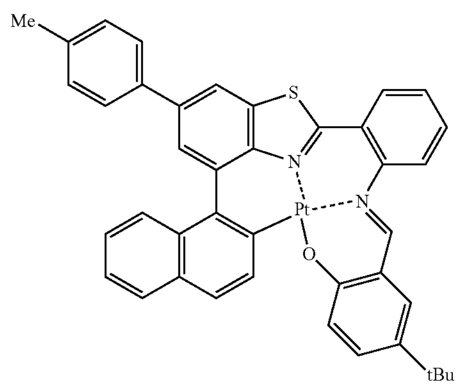
4-428
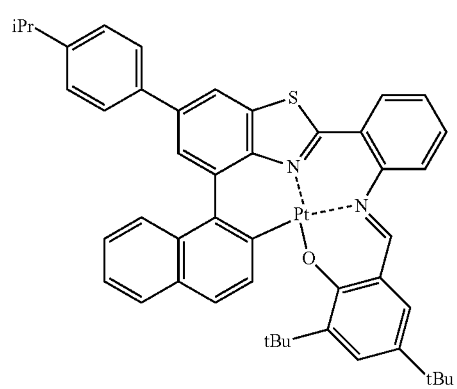

4-429
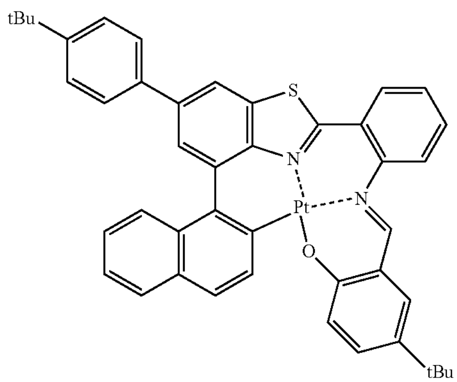
4-430
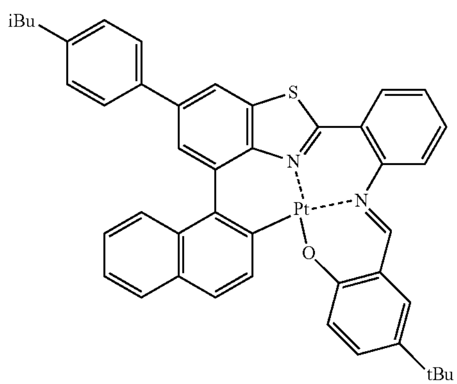
4-431
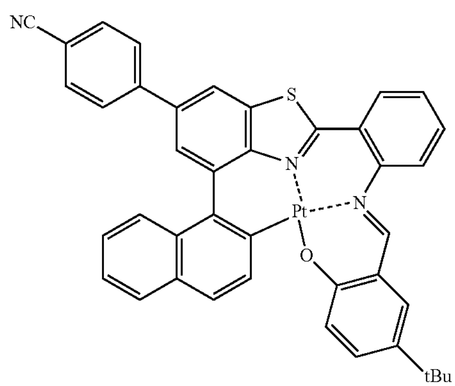
4-432
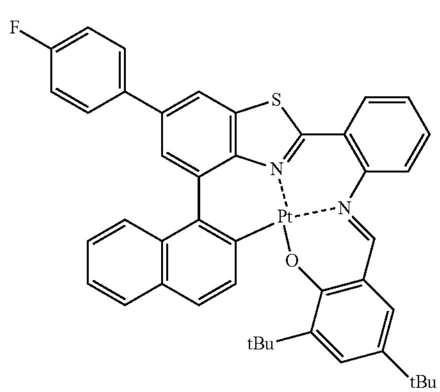
4-433
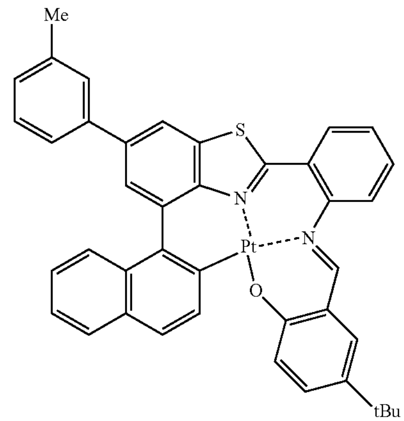
4-434
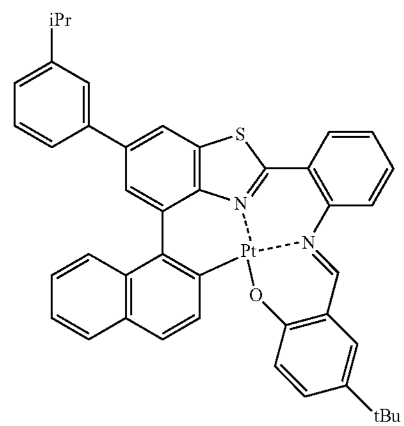
4-435
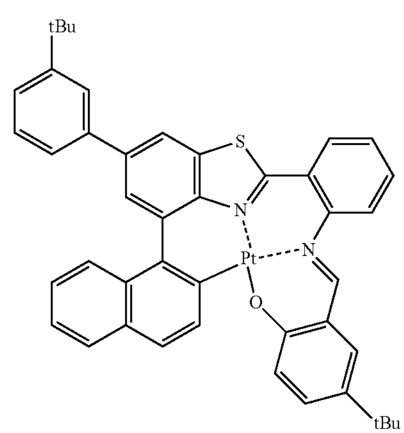

4-436
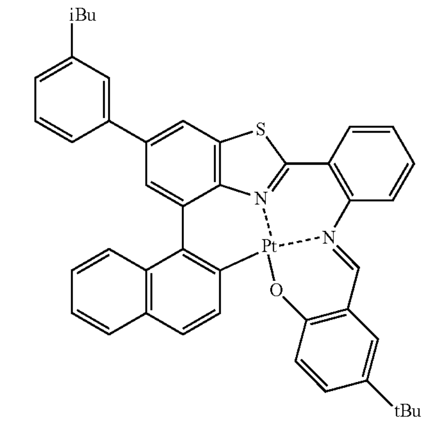
4-437
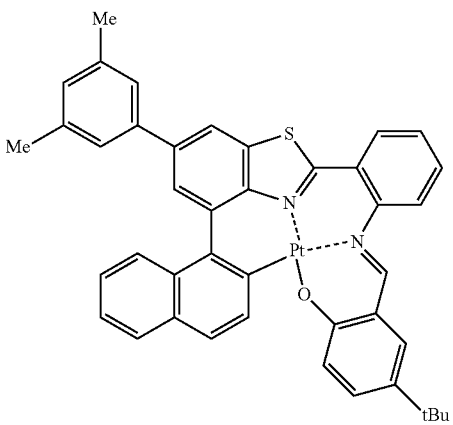
4-438
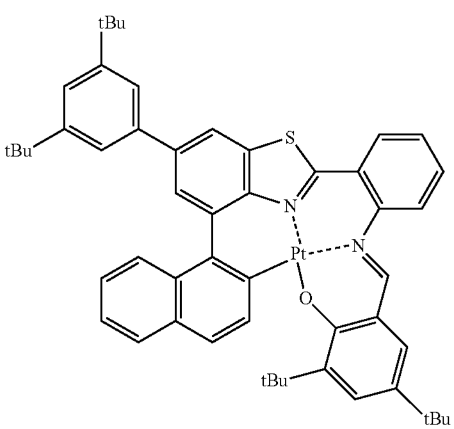
4-439
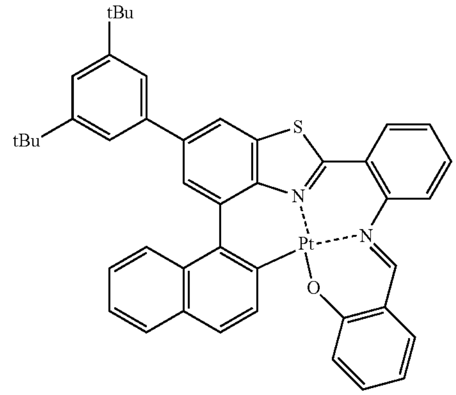
4-440
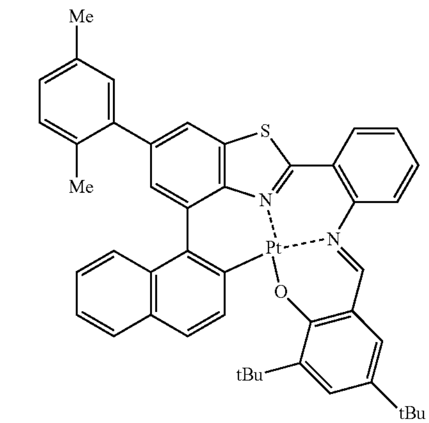
4-441
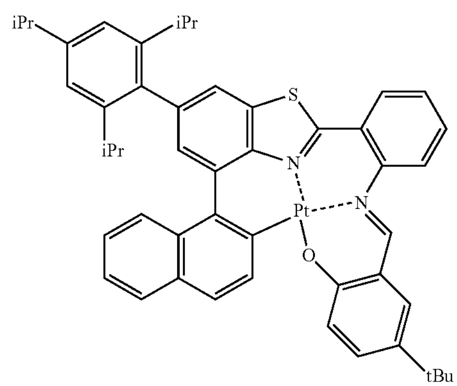
4-442
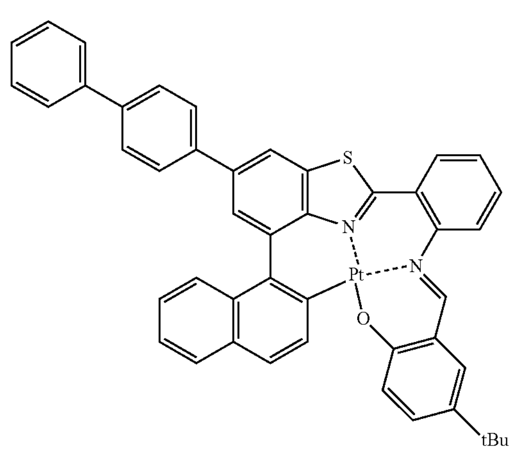

4-443
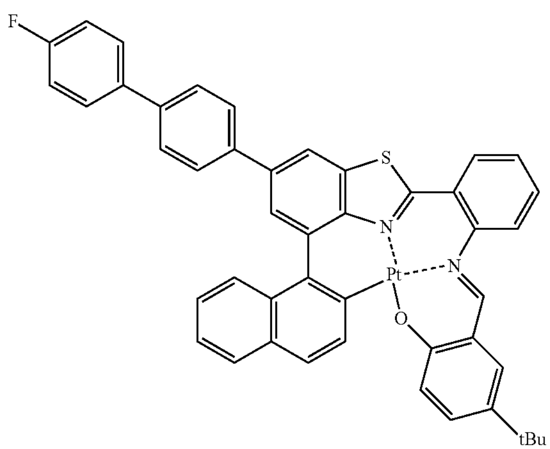
4-444
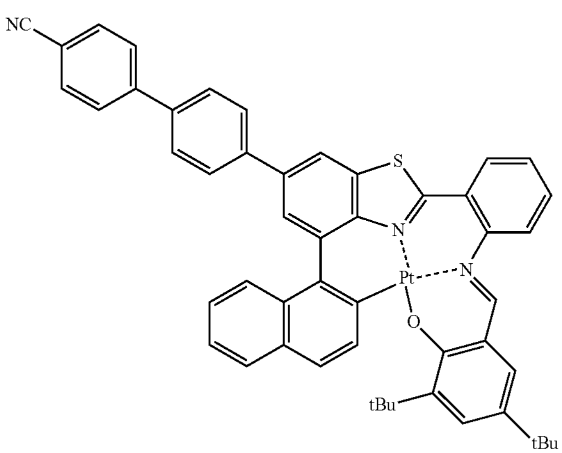
4-445
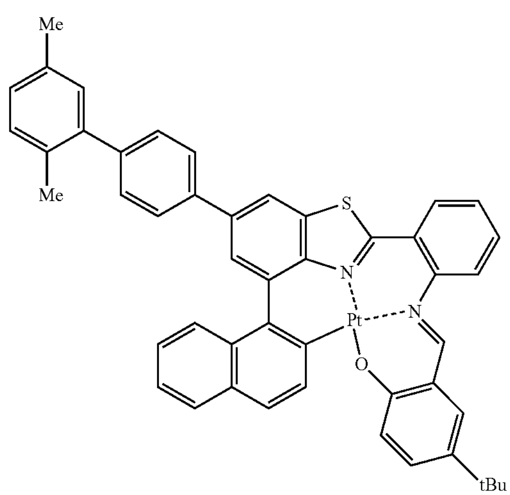
4-446
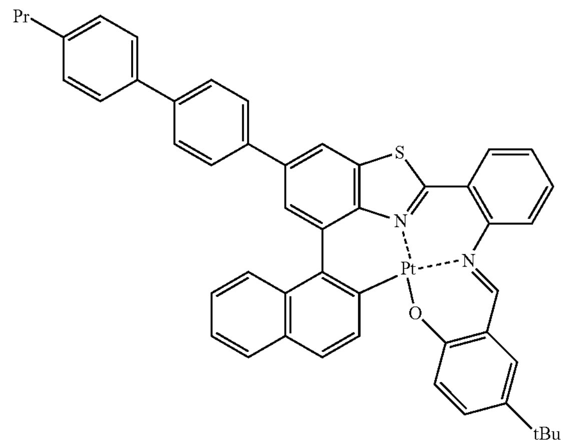
4-447
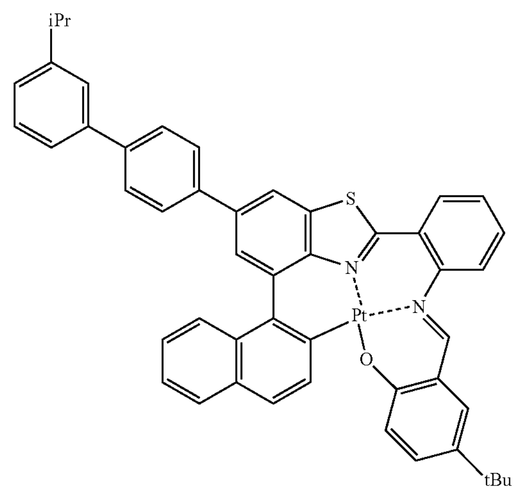
4-448
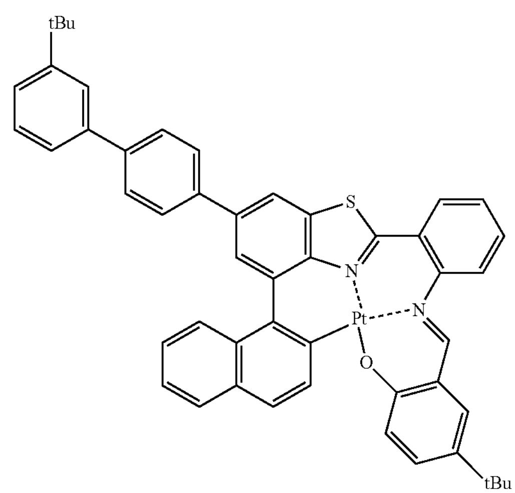

4-449
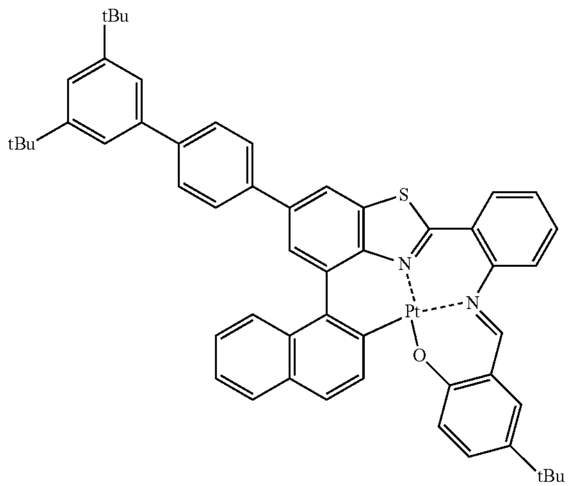
4-450
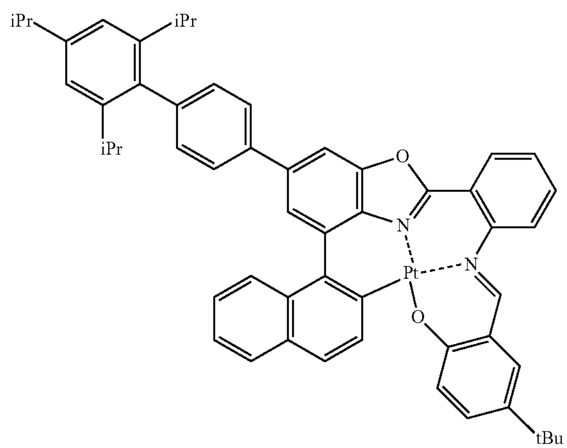
4-451
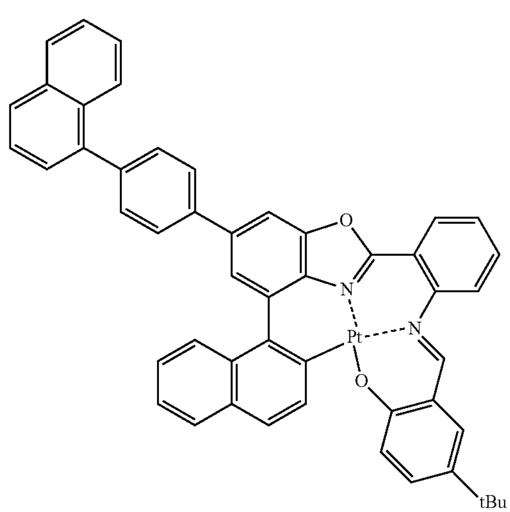
4-452
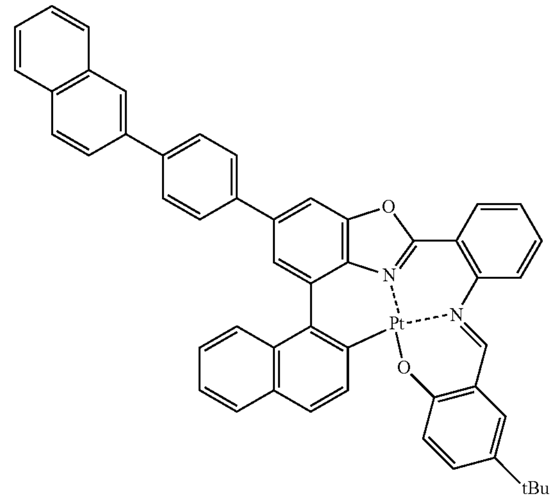
4-453
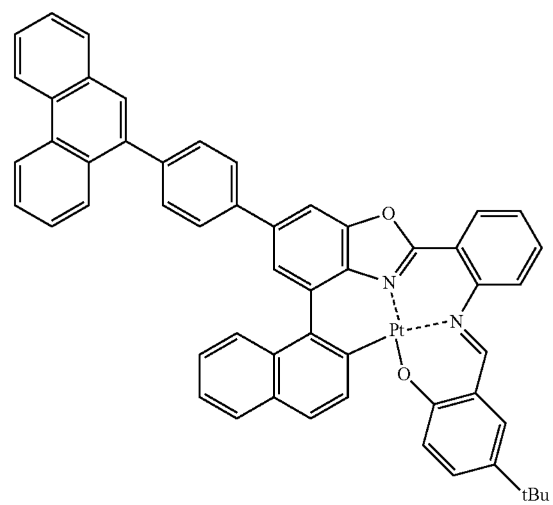
4-454
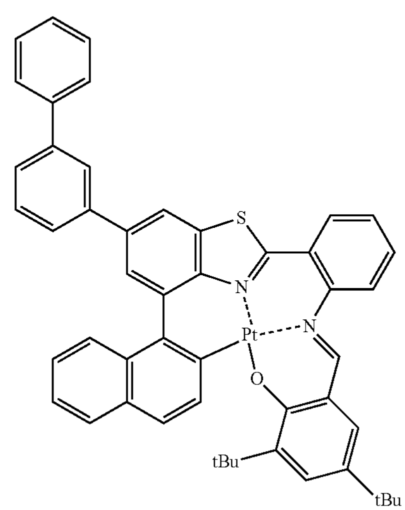

4-455
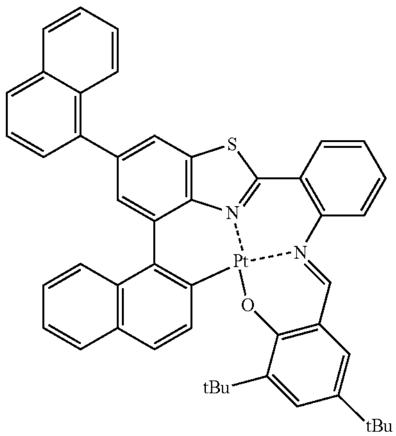
4-456
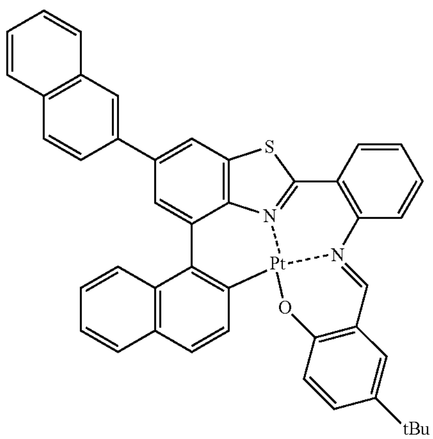
4-457
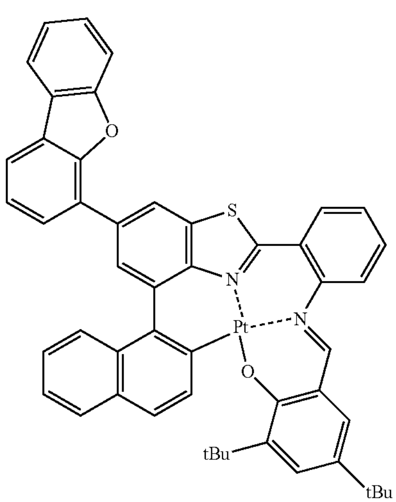
4-458
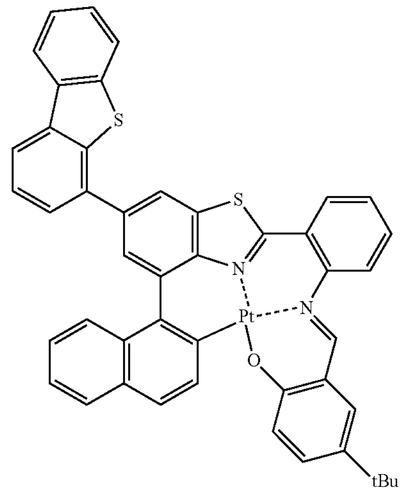
4-459
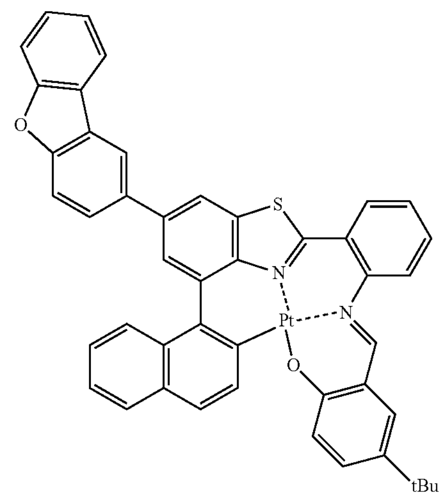
4-460
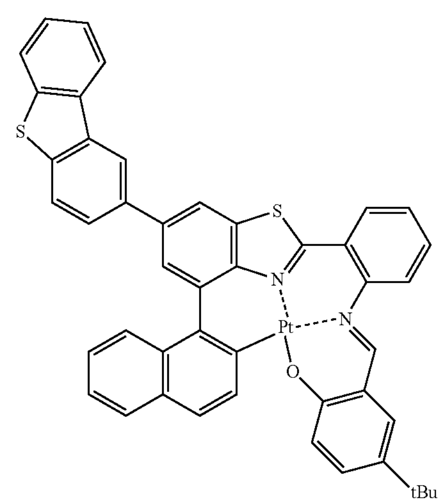

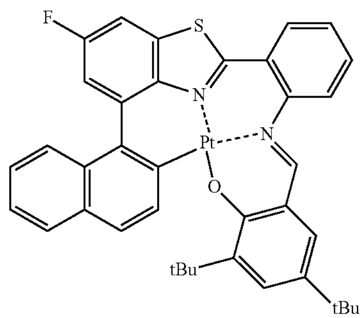
4-461
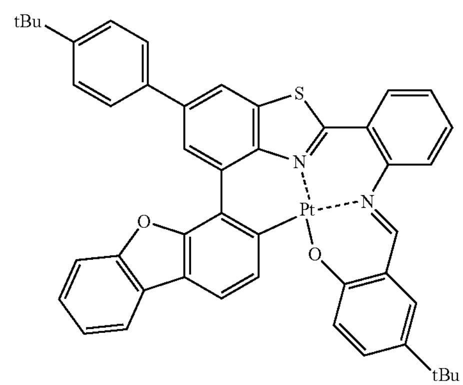
4-465
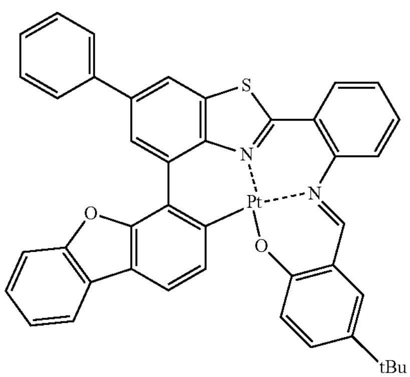
4-462
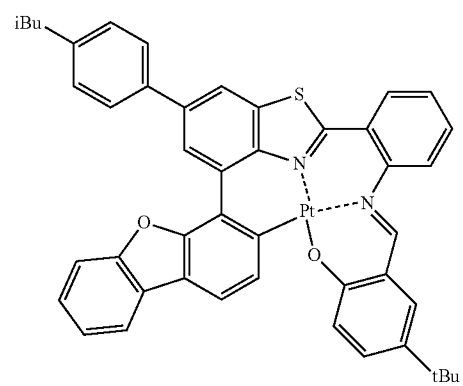
4-466
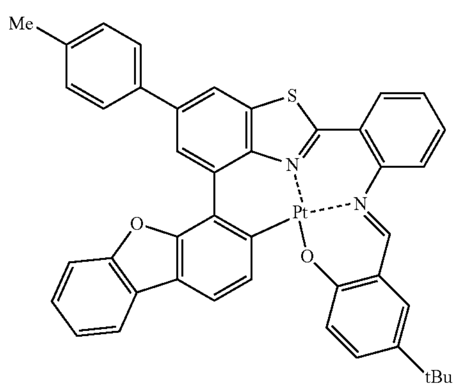
4-463
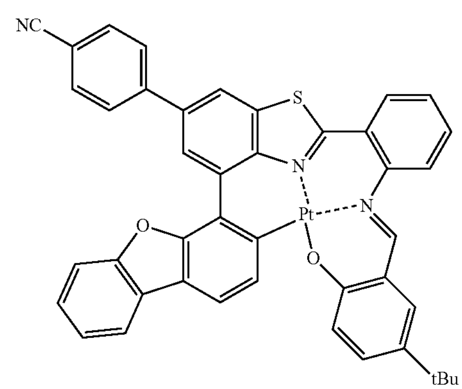
4-467
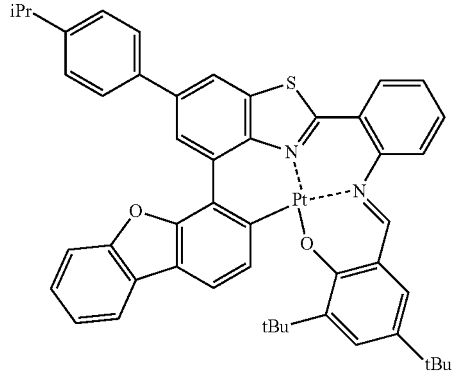
4-464
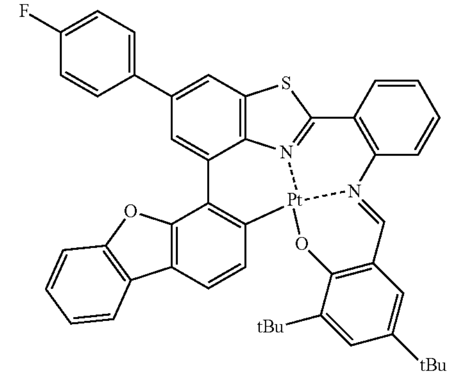
4-468

-continued
4-469
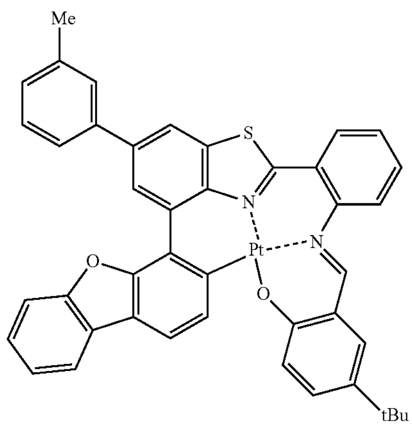
4-470
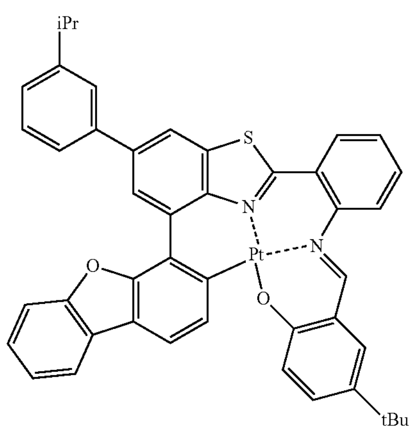
4-471
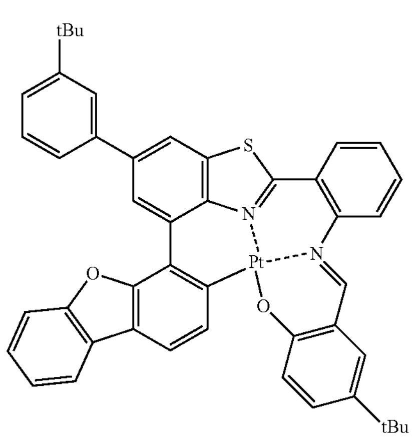
-continued
4-472
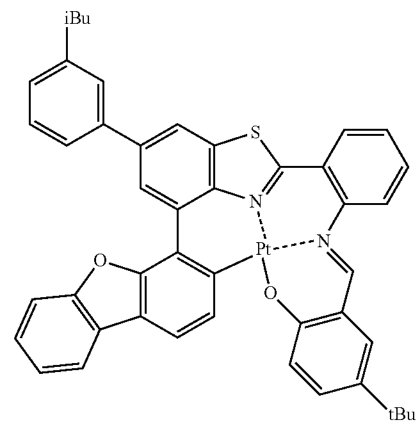
4-473
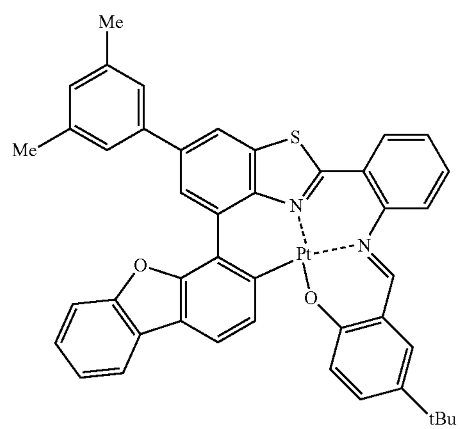
4-474
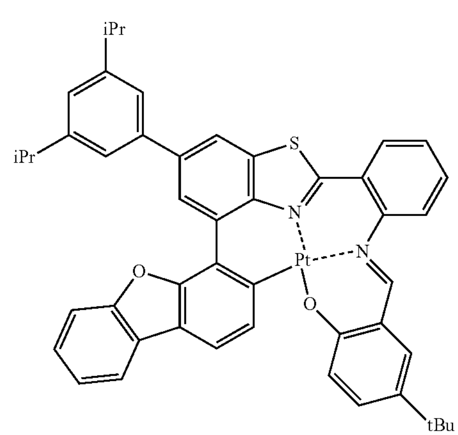

4-475
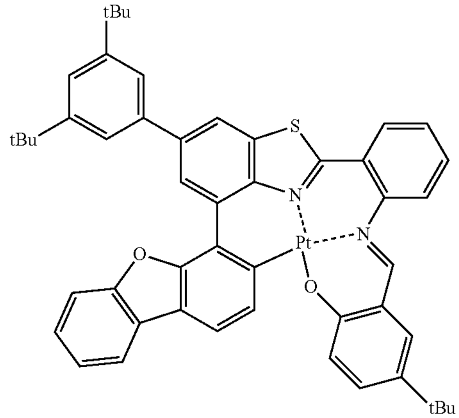
4-476
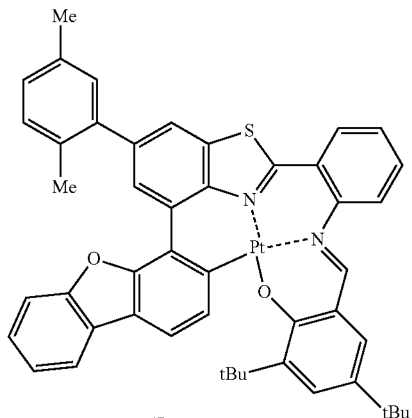
4-477
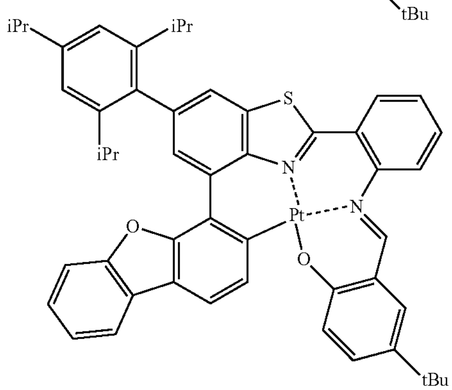
4-478
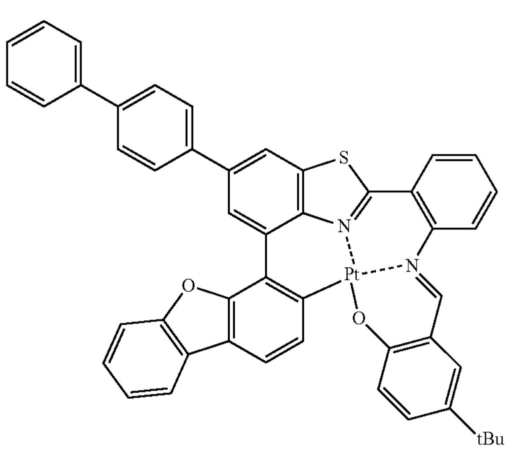
4-479
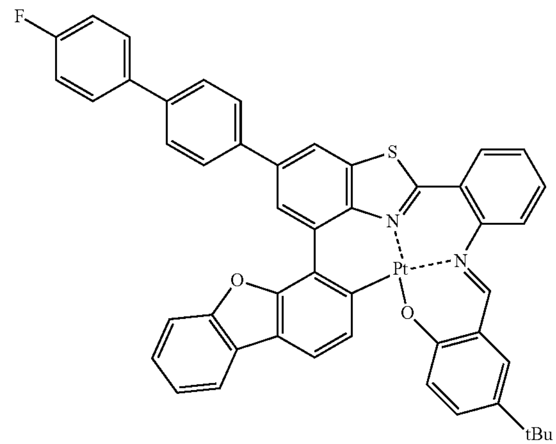
4-480
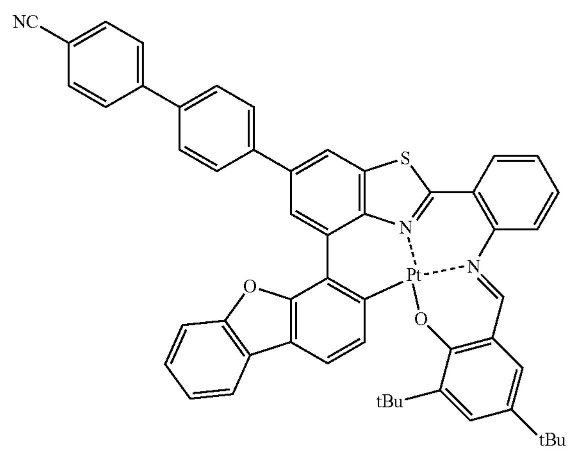
4-481
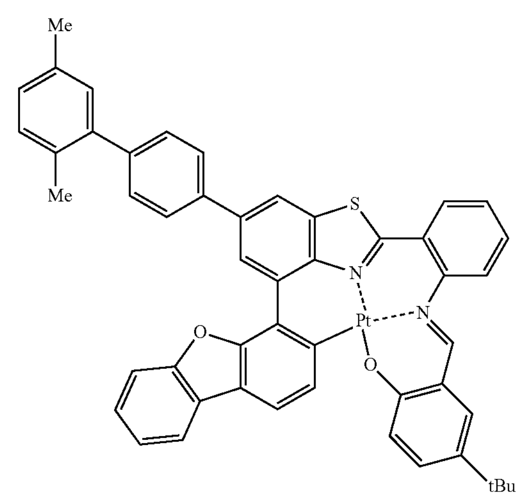

4-482
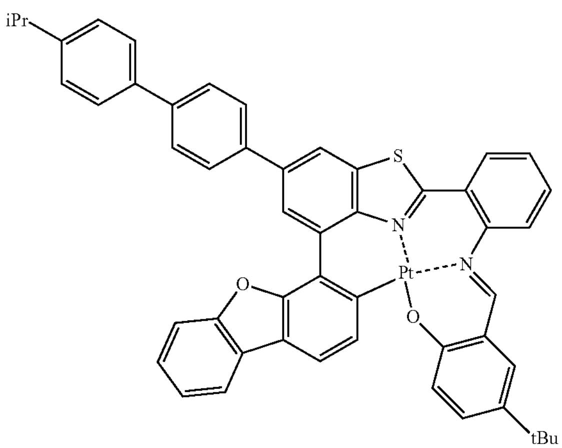
4-483
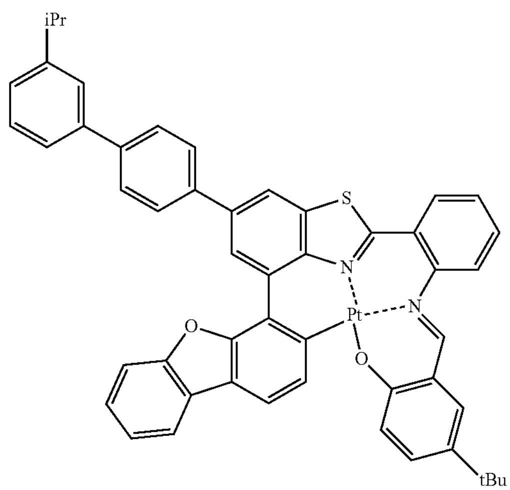
4-484
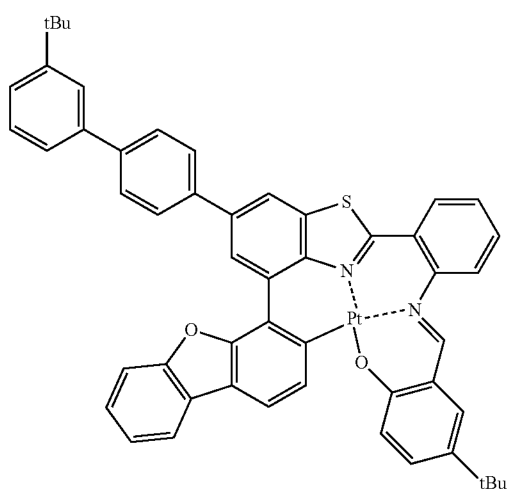
4-485
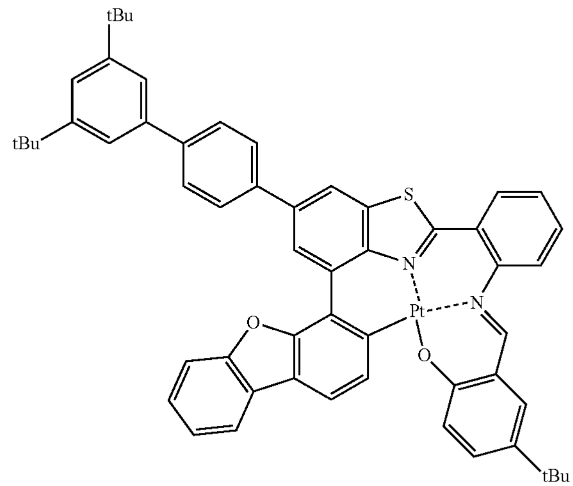
4-486
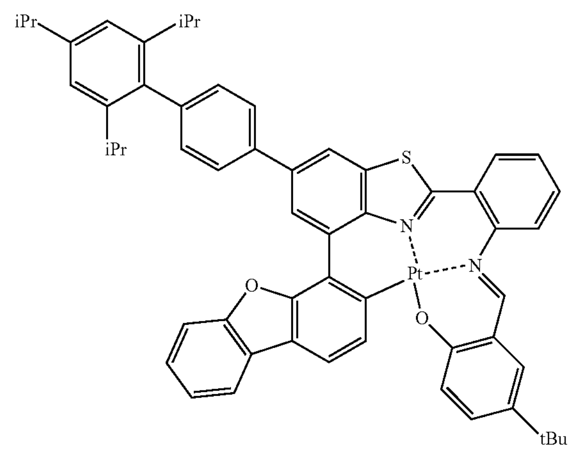
4-487
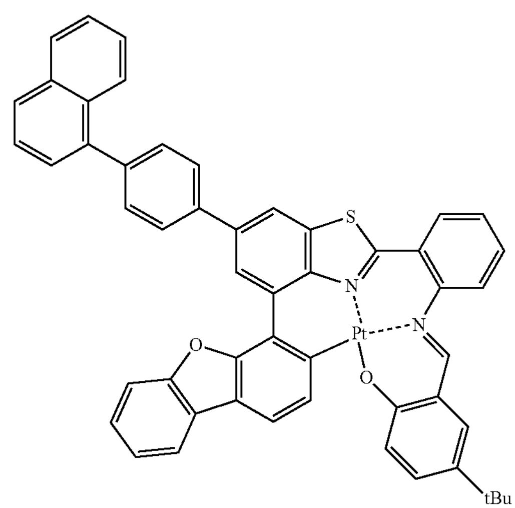

4-488
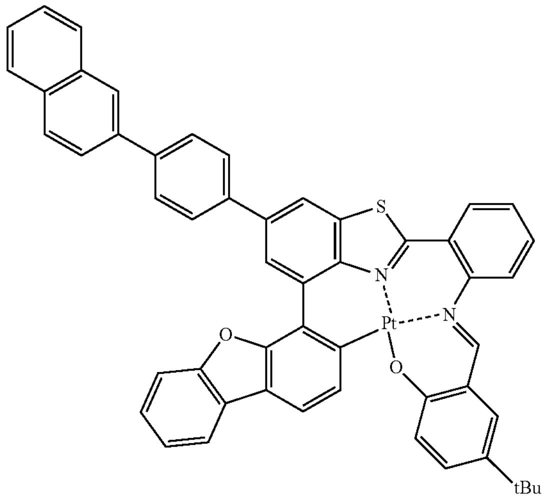
4-489
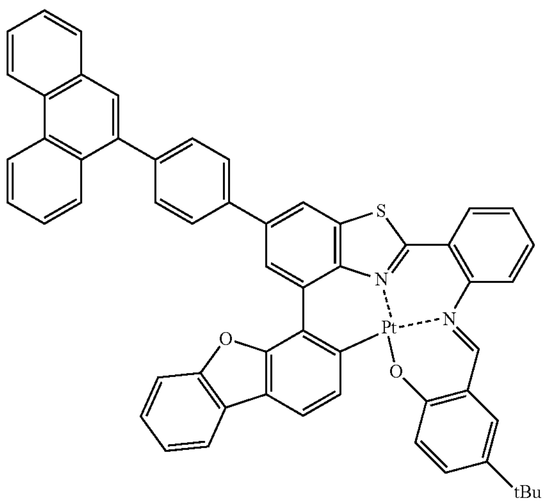
4-490
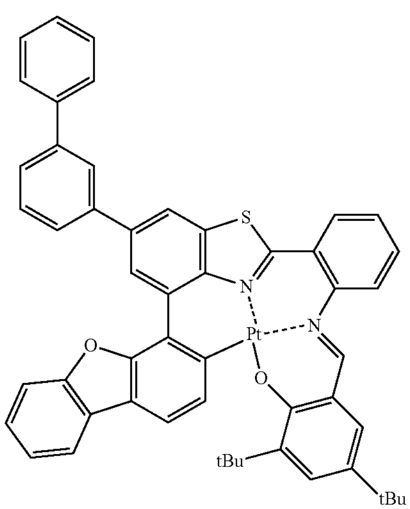
4-491
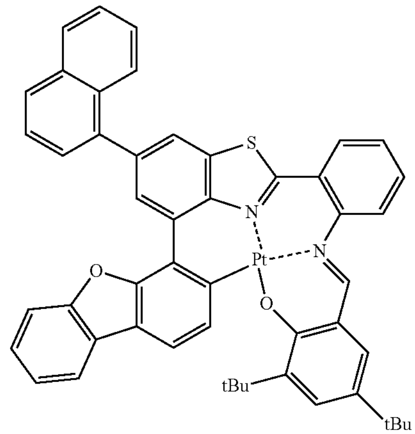
4-492
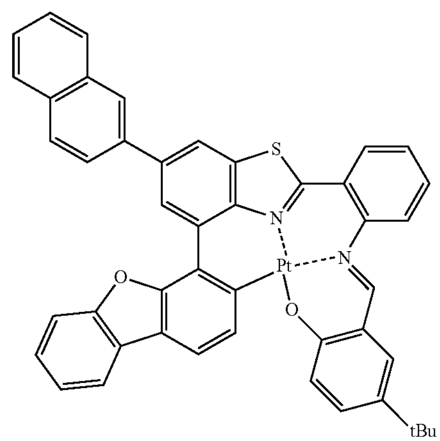
4-493
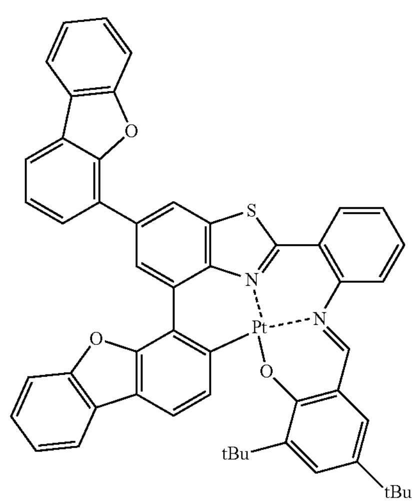

-continued
4-494
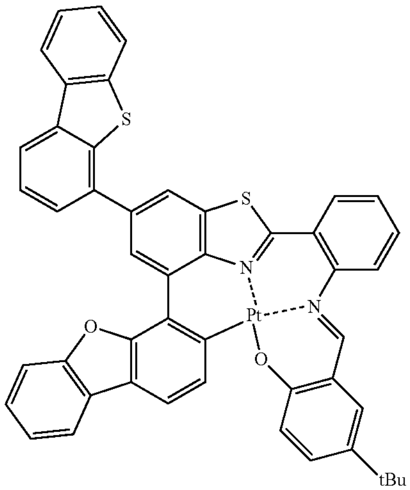
4-495
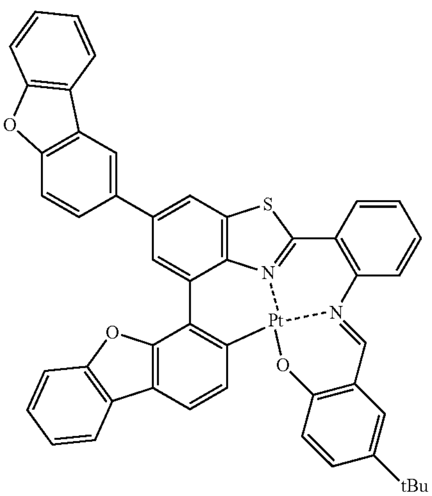
4-496
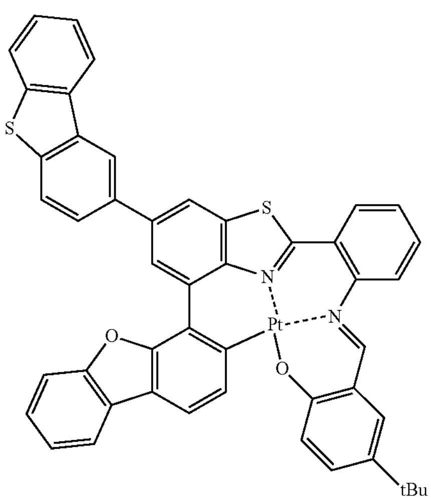
-continued
4-497
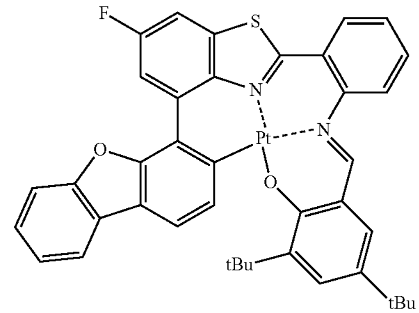
4-498
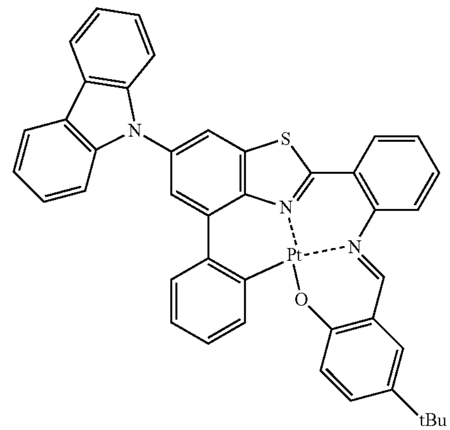
4-499
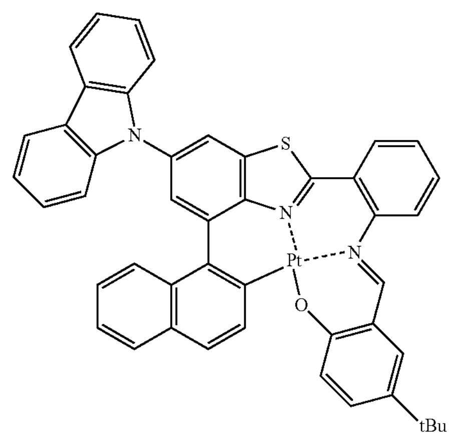
4-500
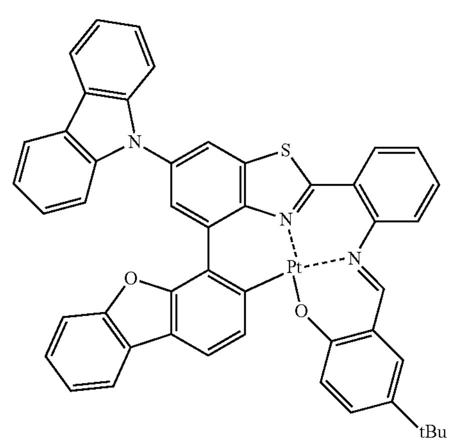

-continued
4-501
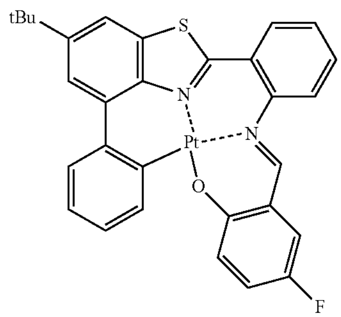
4-502
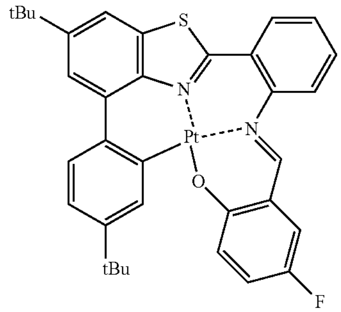
4-503
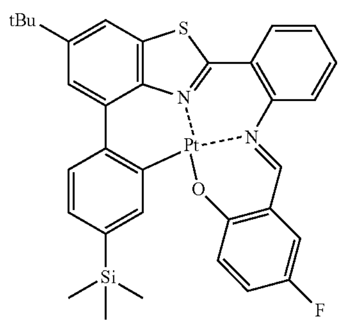
4-504
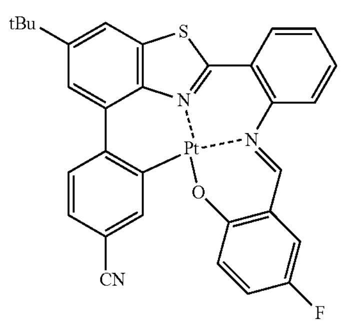
4-505
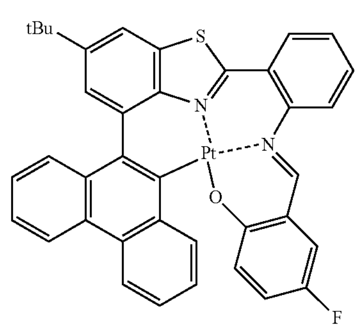
-continued
4-506
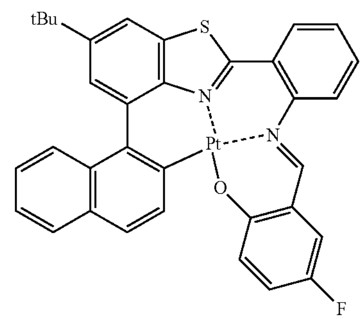
4-507
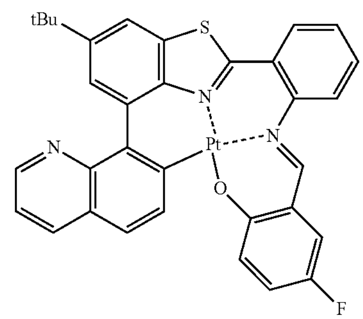
4-508
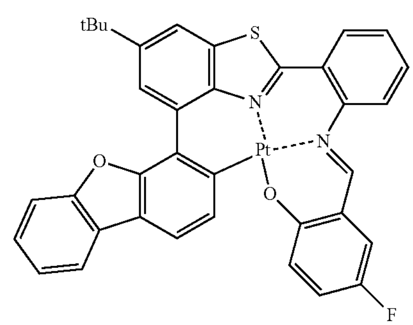
4-509
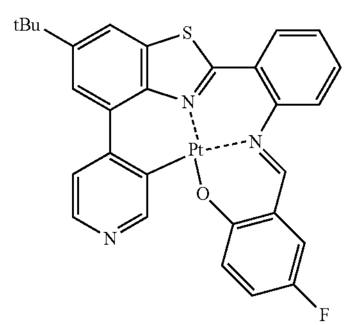
4-510
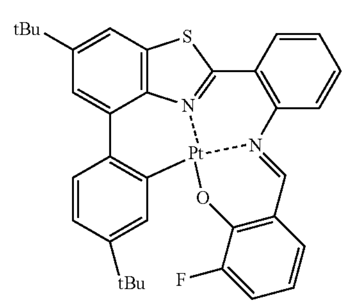

-continued
4-511
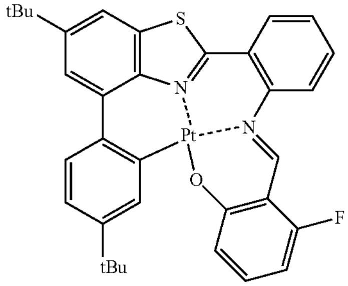
4-512
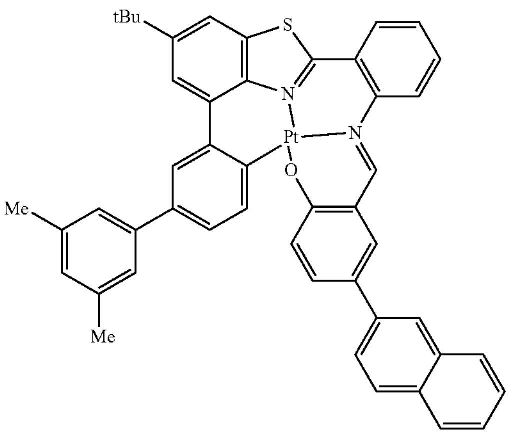
4-513
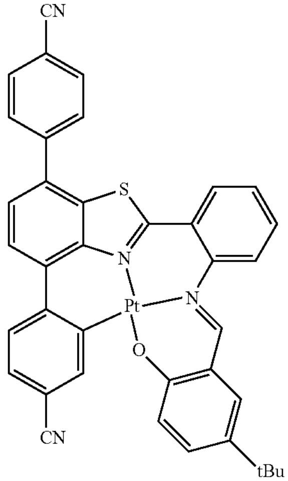
-continued
4-514
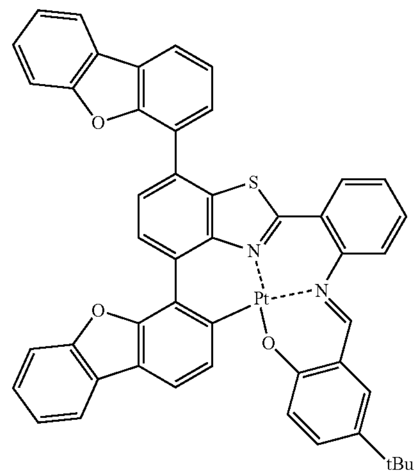
4-515
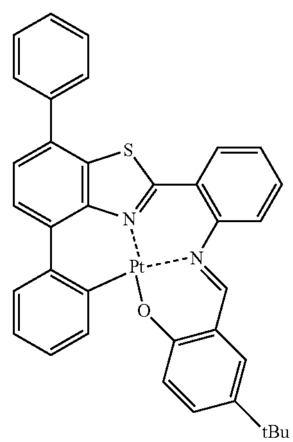
4-516
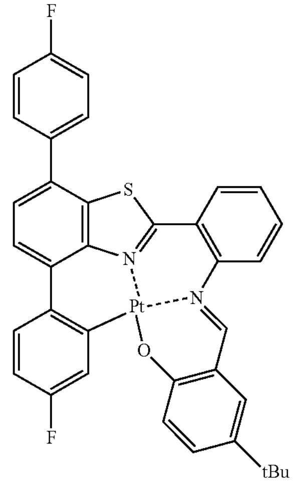

-continued
4-517
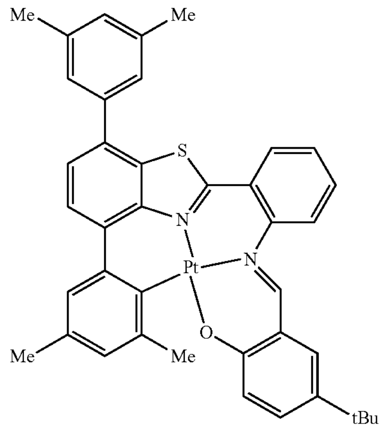
4-518
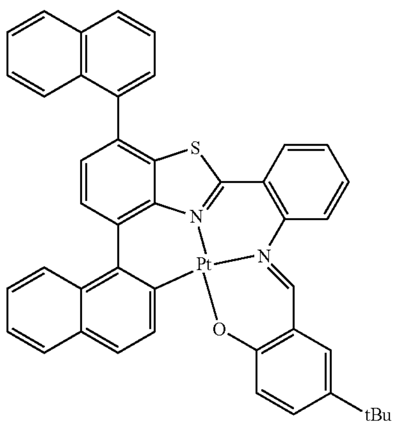
4-519
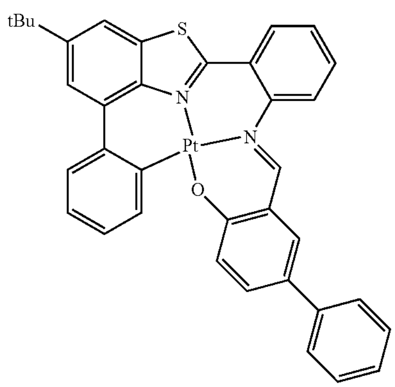
4-520
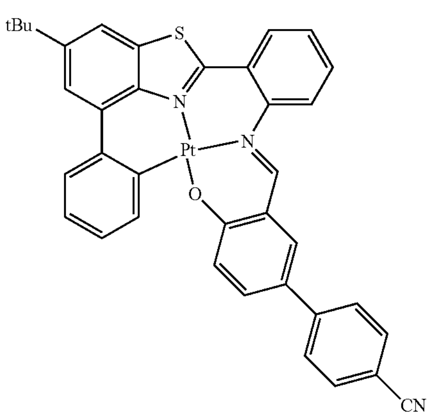
-continued
4-521
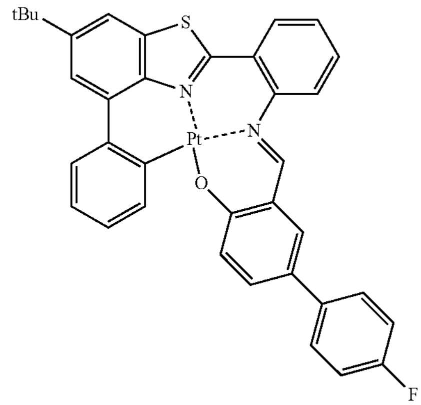
4-522
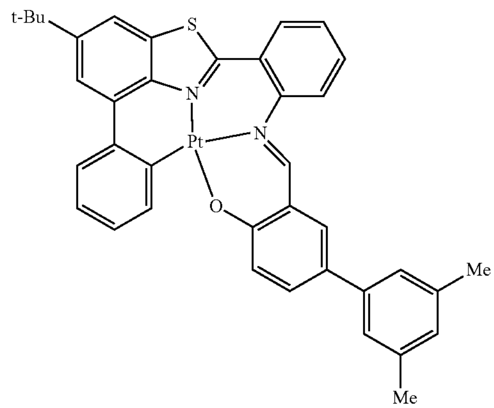
4-523
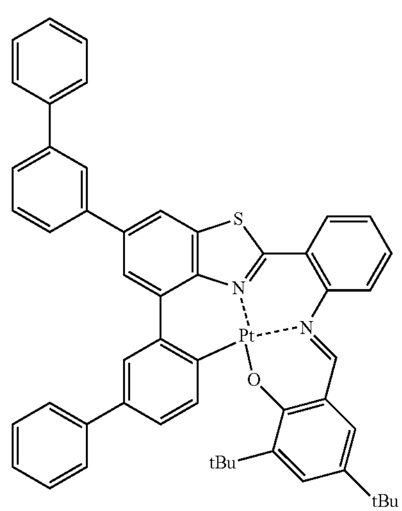

Compound Group 5
5-1
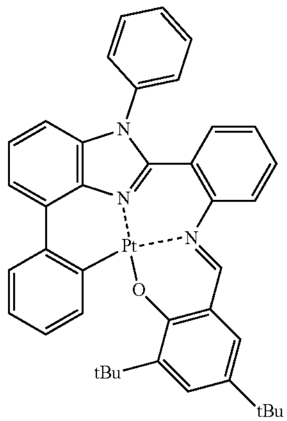
5-2
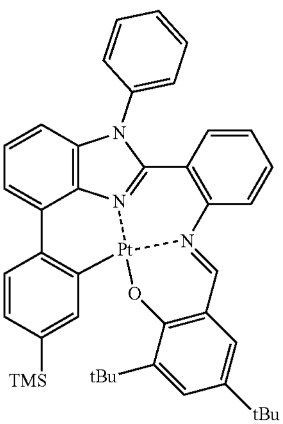
5-3
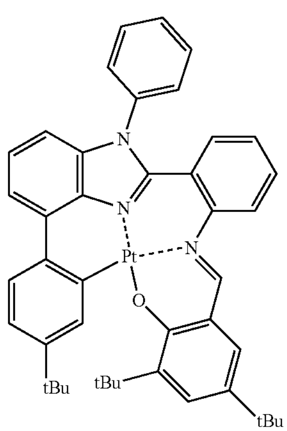
-continued
5-4
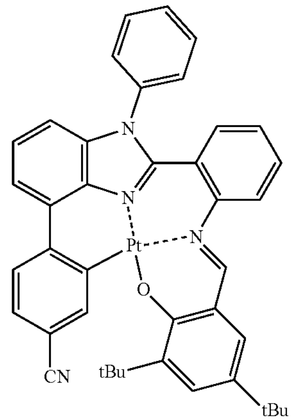
5-5
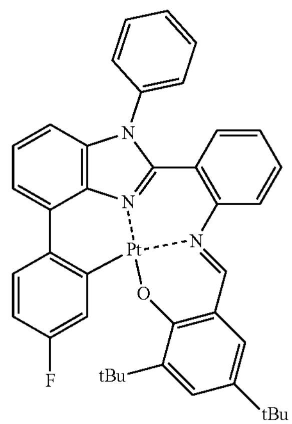
5-6
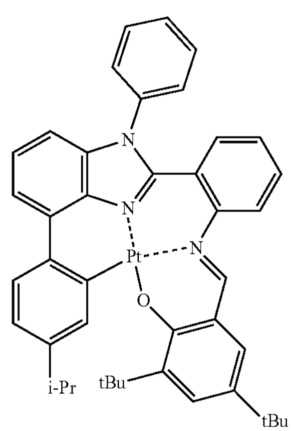

5-7
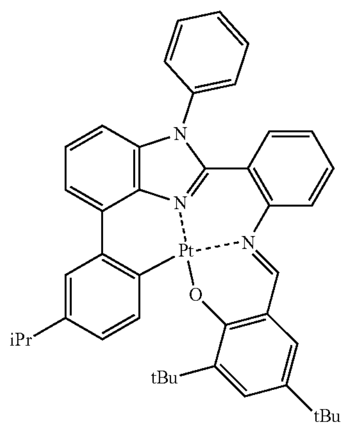
5-10
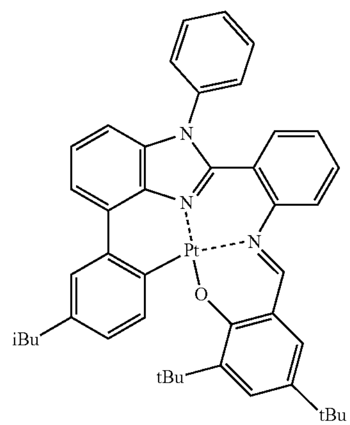
5-8
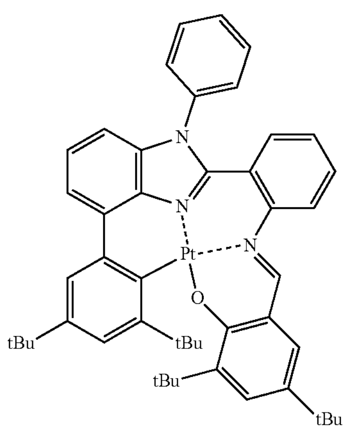
5-11
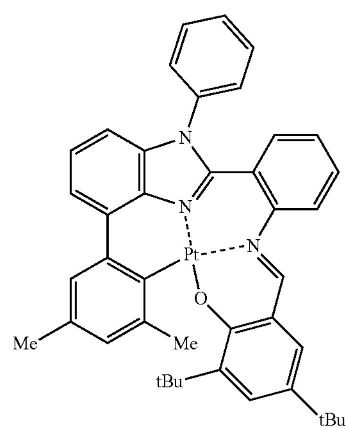
5-9
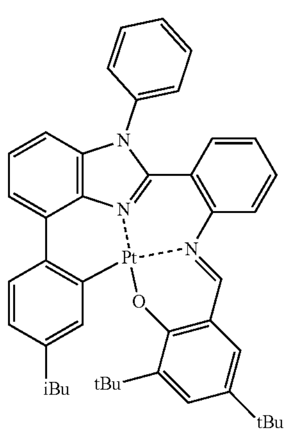
5-12
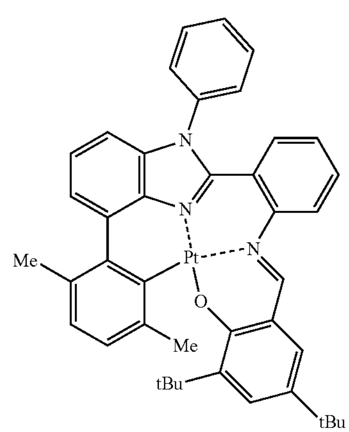

-continued
5-13
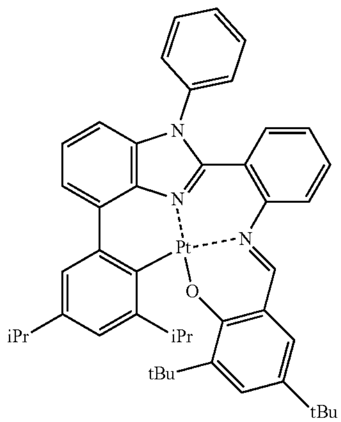
5-14
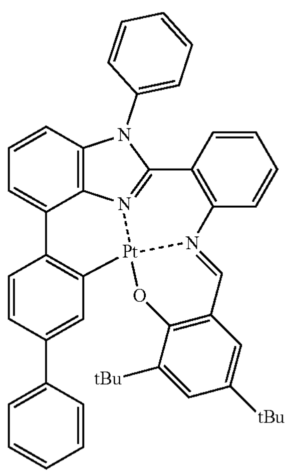
5-15
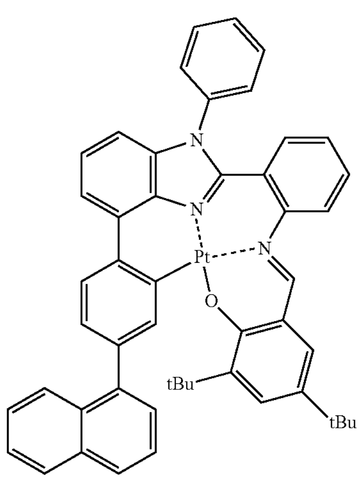
-continued
5-16
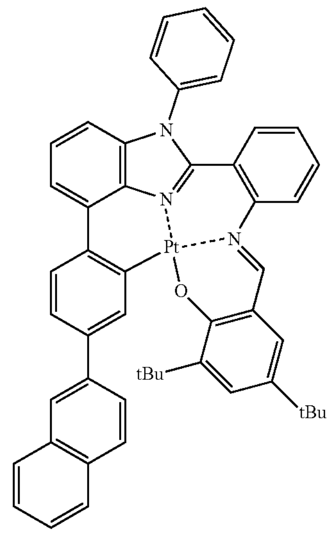
5-17
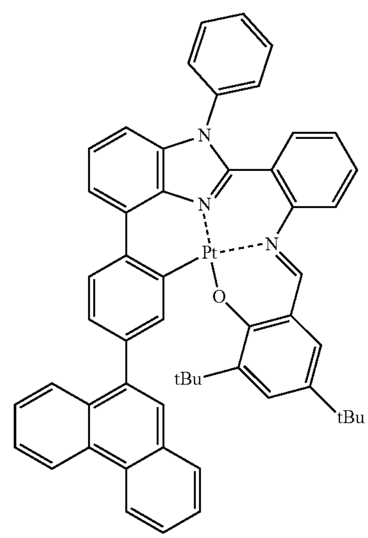
5-18
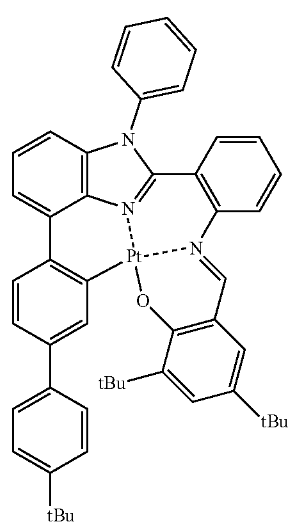

-continued
5-19
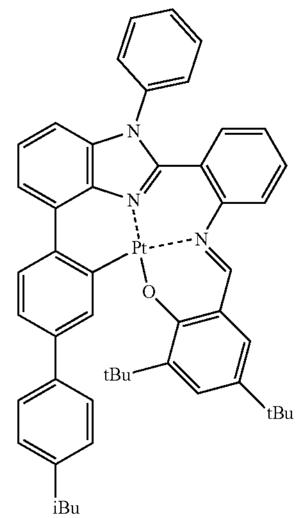
5-20
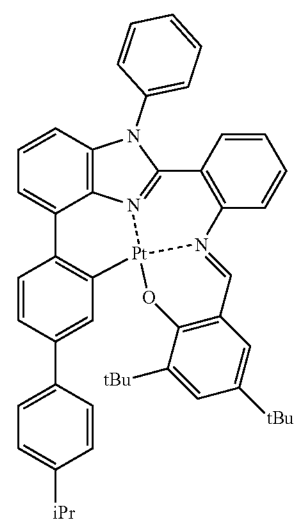
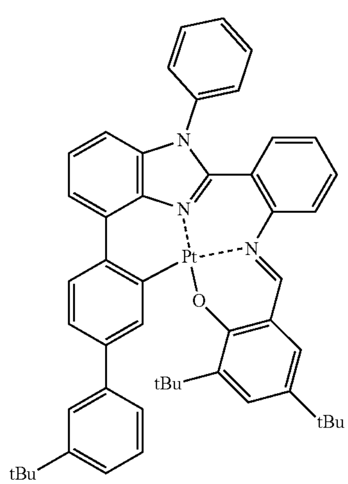
-continued
5-22
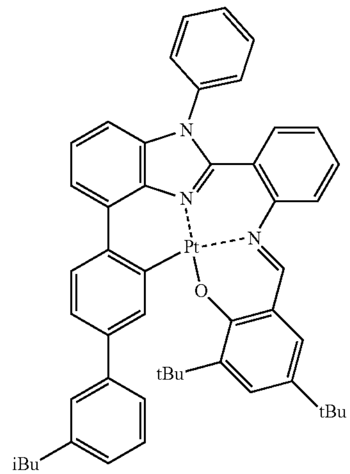
5-23
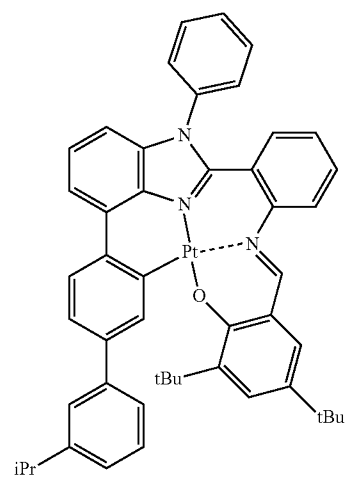
5-24
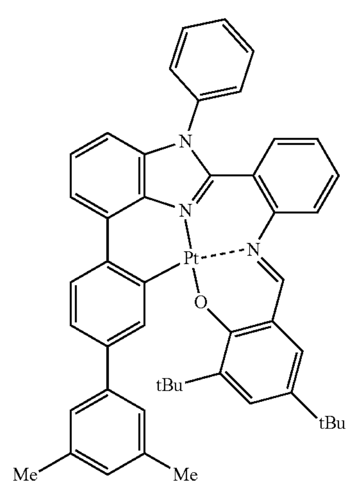

-continued
5-25
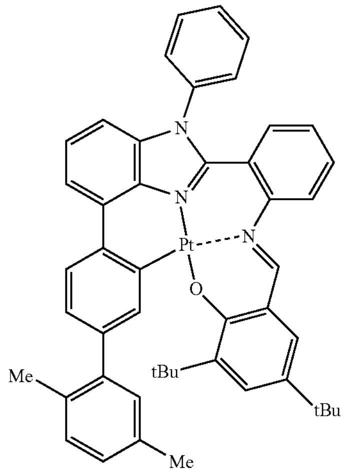
5-26
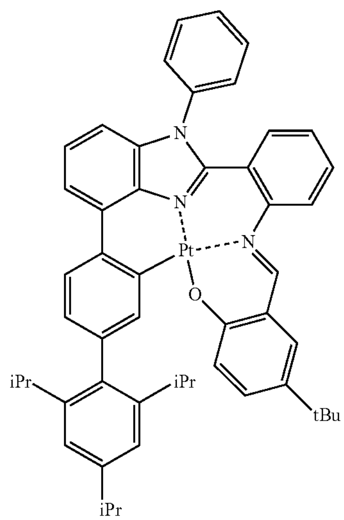
5-27
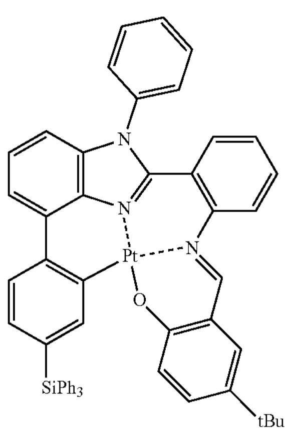
-continued
5-28
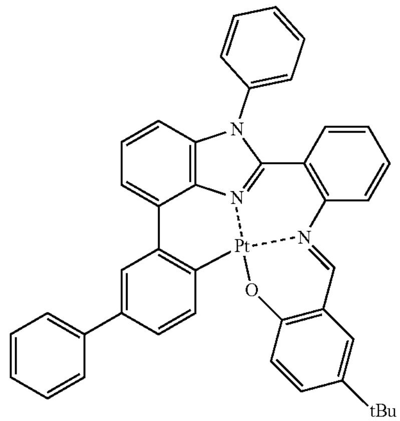
5-29
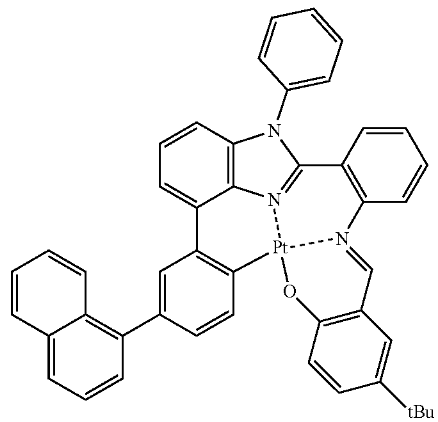
5-30
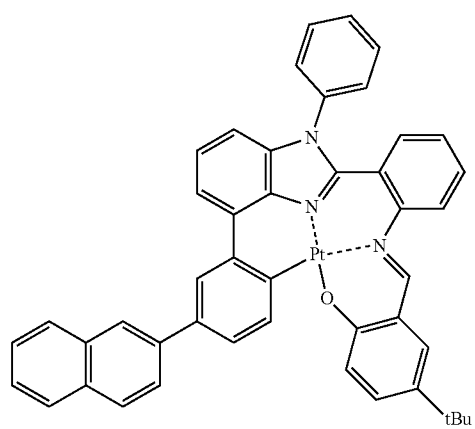

-continued
5-31
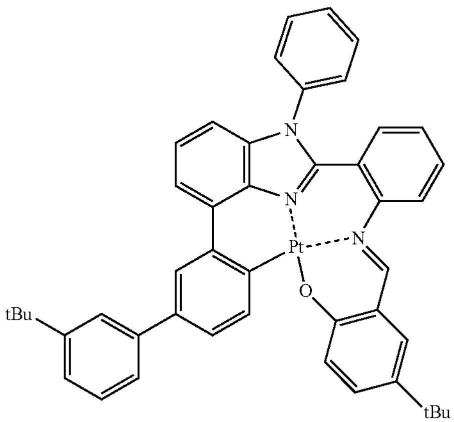
5-32
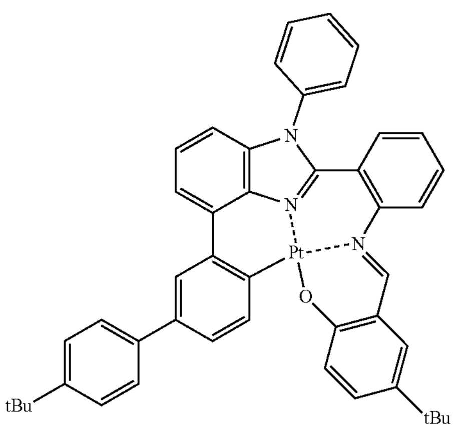
5-33
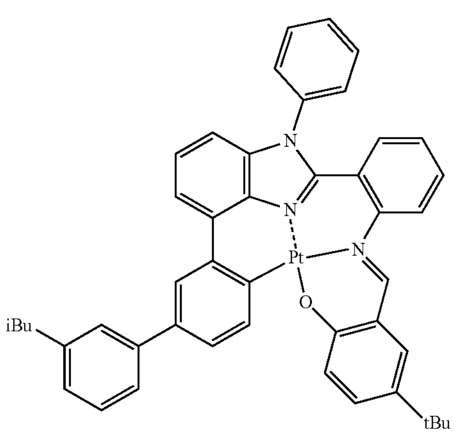
-continued
5-34
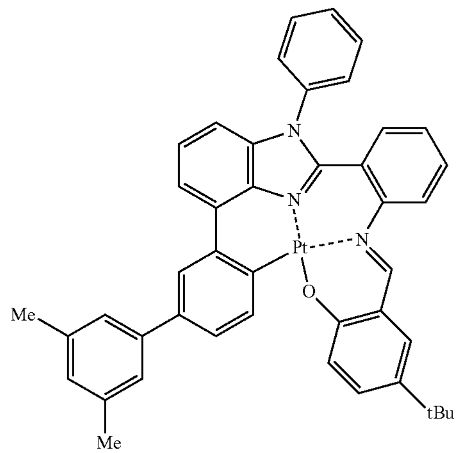
5-35
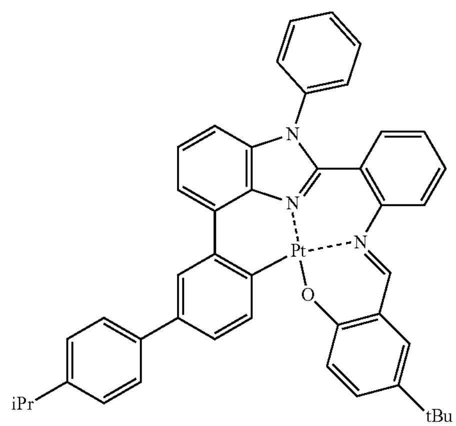
5-36
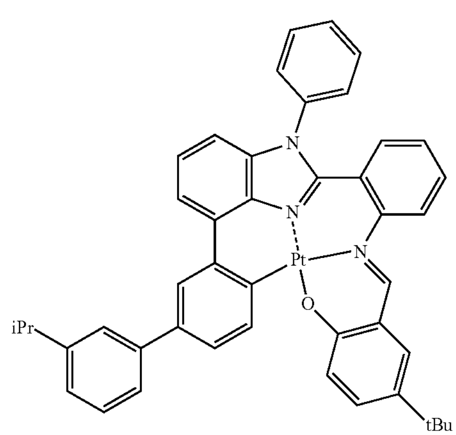

-continued
5-37
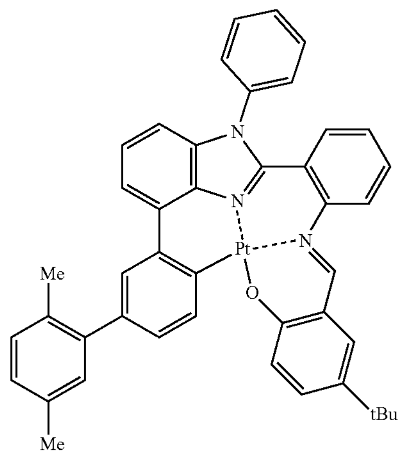
5-38
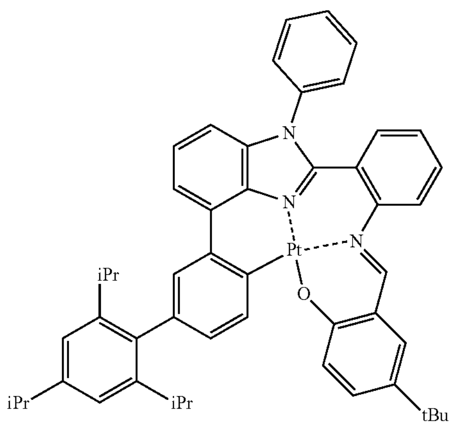
5-39
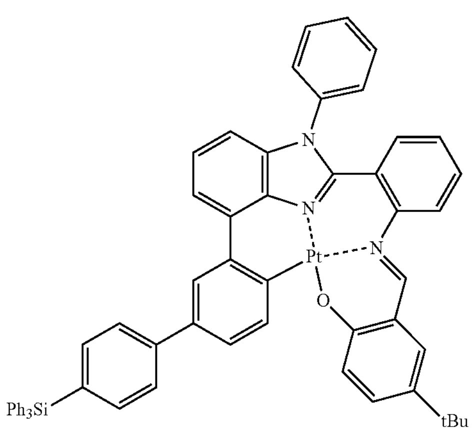
-continued
5-40
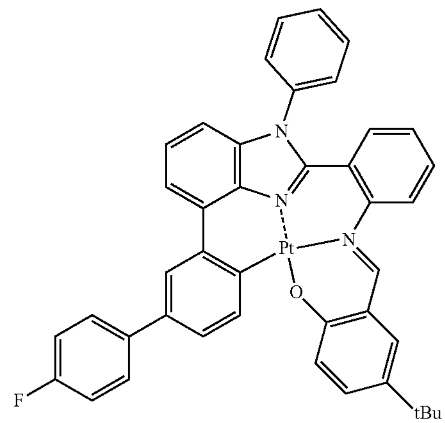
5-41
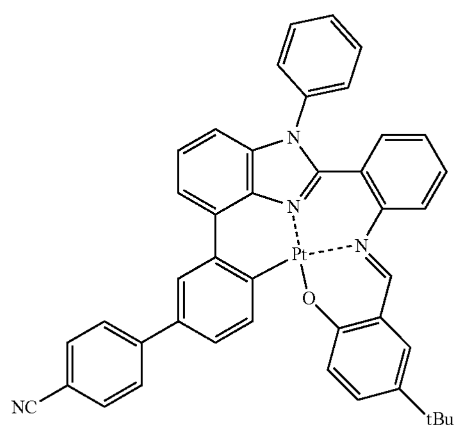
5-42
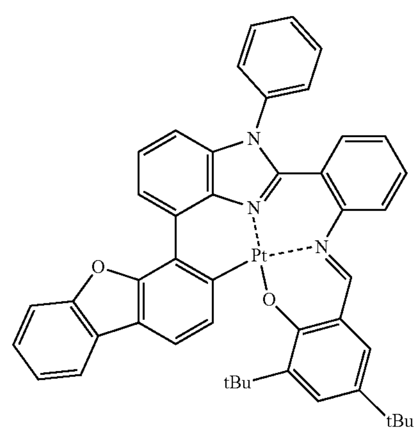

-continued
5-43
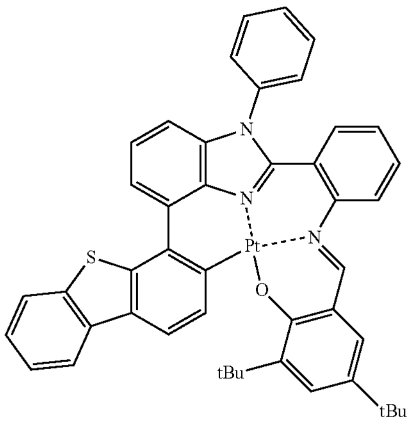
5-44
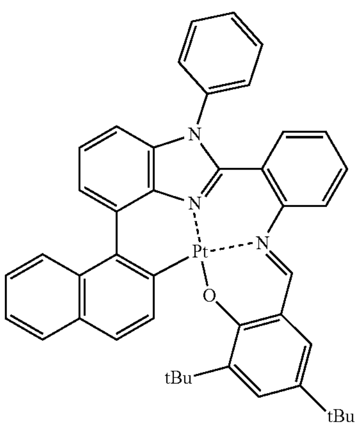
5-45
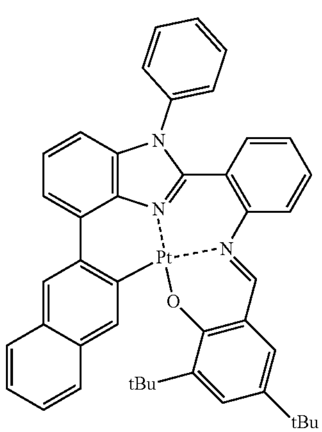
-continued
5-42
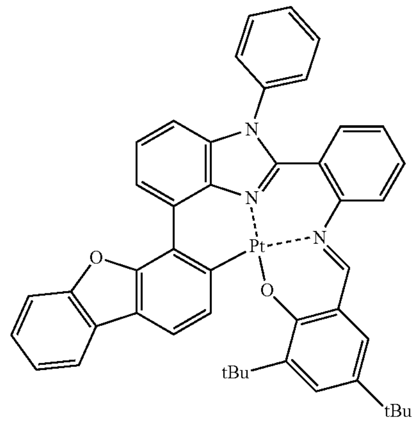
5-43
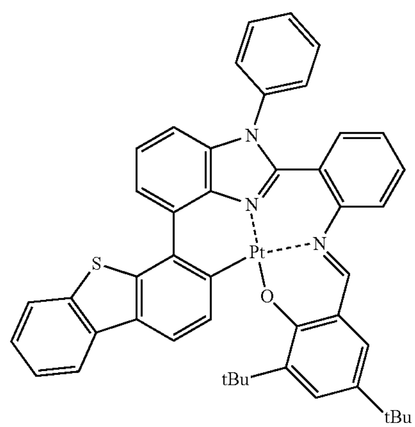
5-44
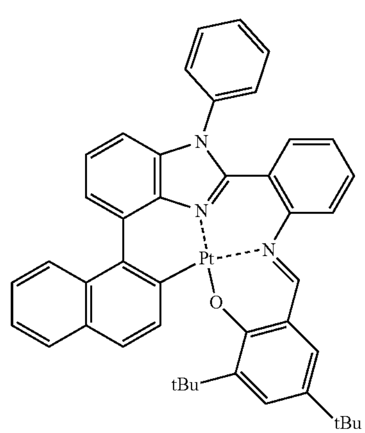

5-45
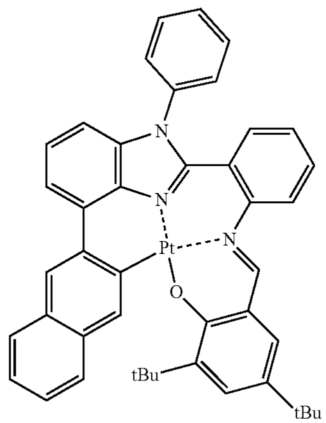
5-46
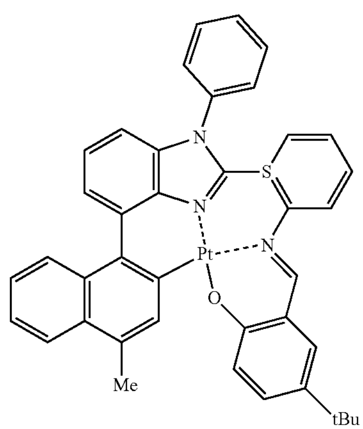
5-47
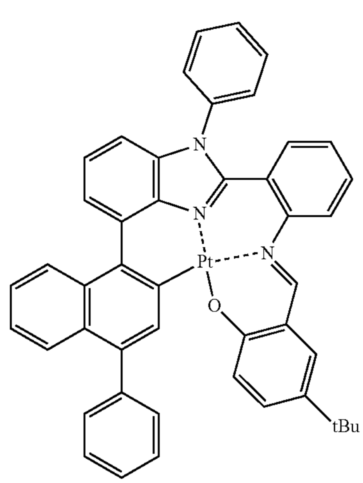
5-48
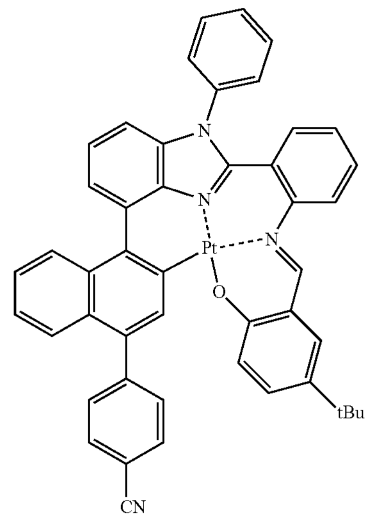
5-49
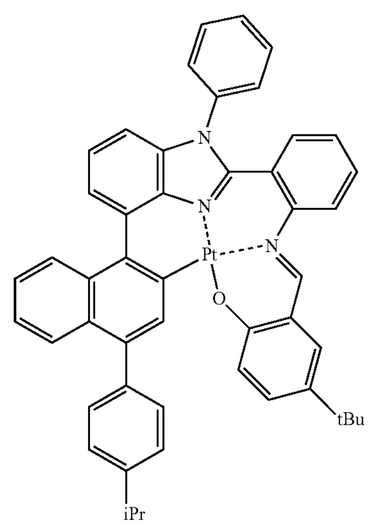
5-50
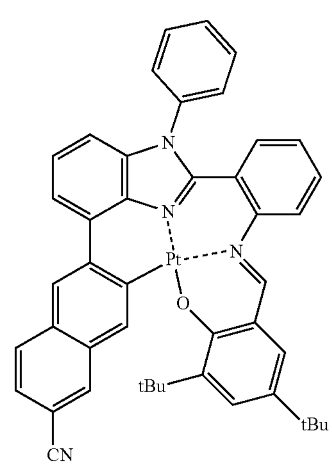

5-51
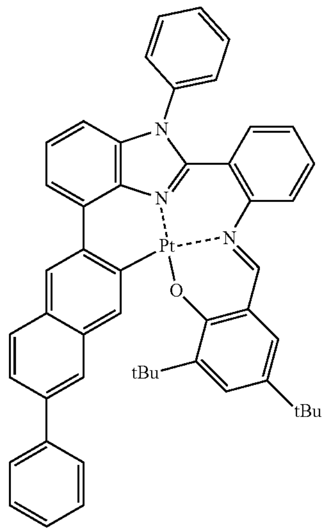
5-52
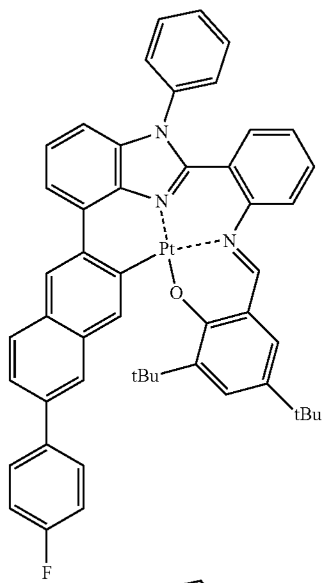
5-53
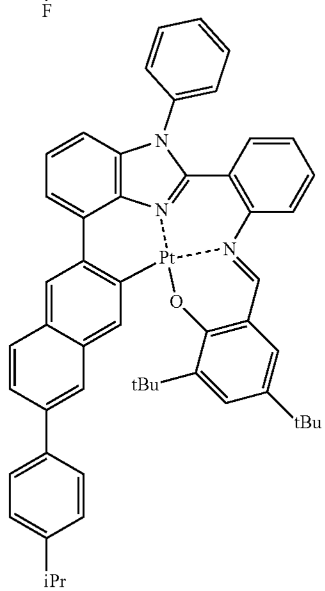
5-54
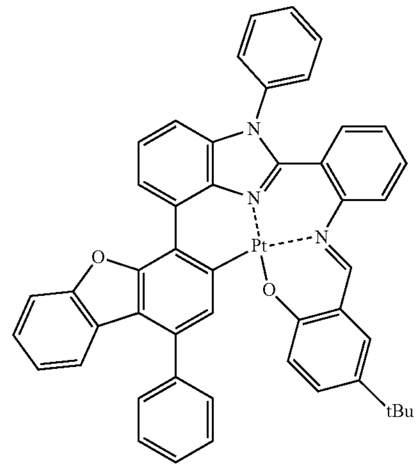
5-55
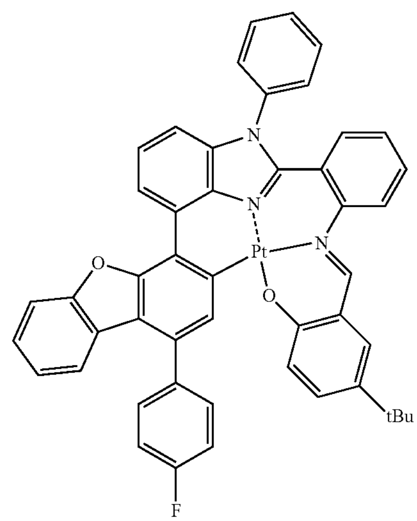
5-56
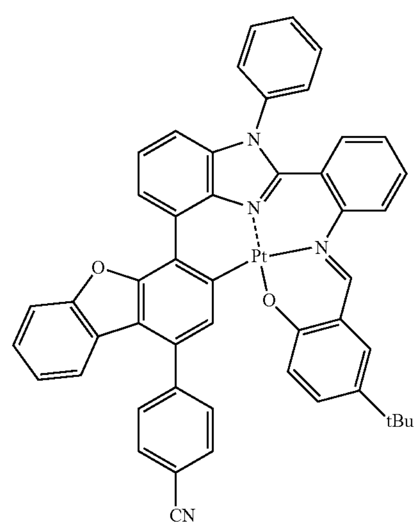

-continued
5-57
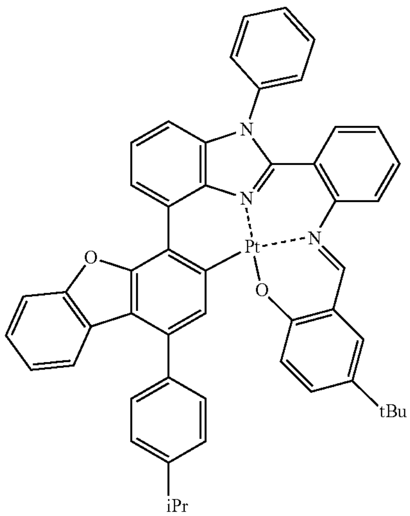
5-58
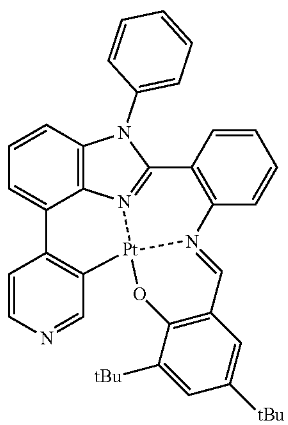
5-59
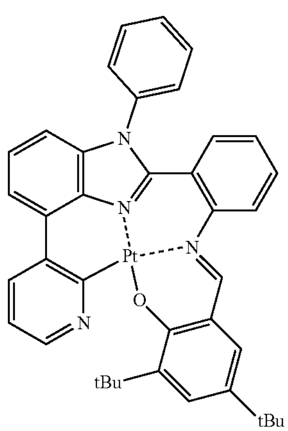
-continued
5-60
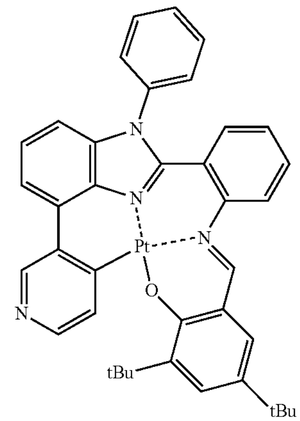
5-61
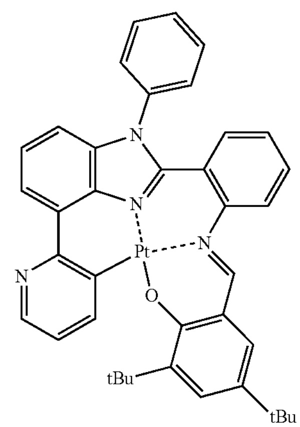
5-62
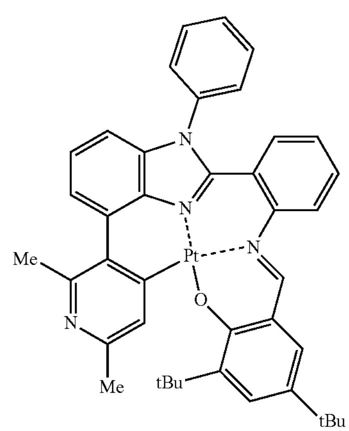

-continued
5-63
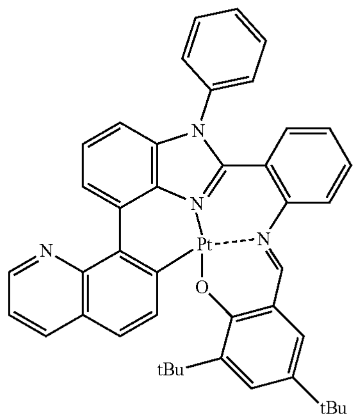
5-64
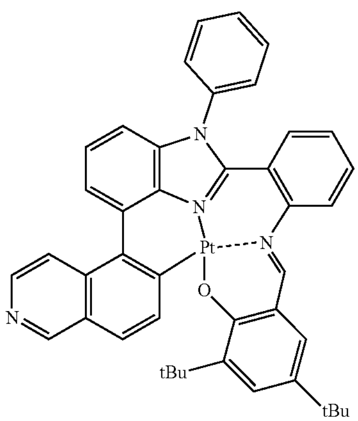
5-65
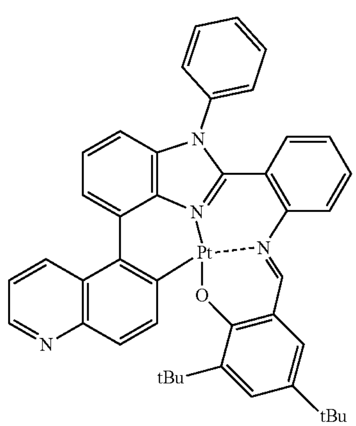
5-66
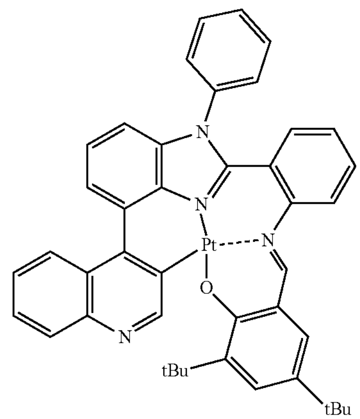
5-67
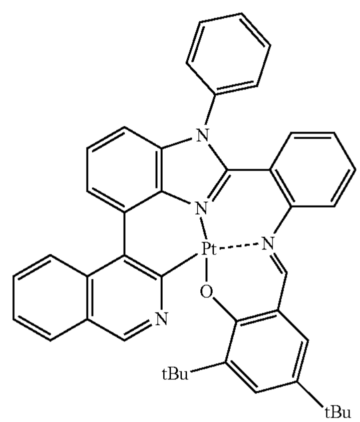
5-68
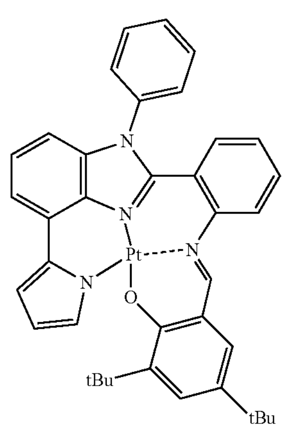

-continued 5-69

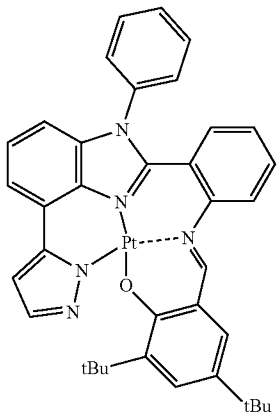

5-70

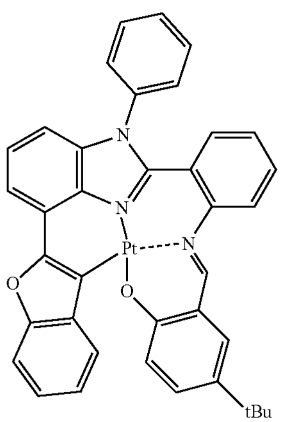

5-71

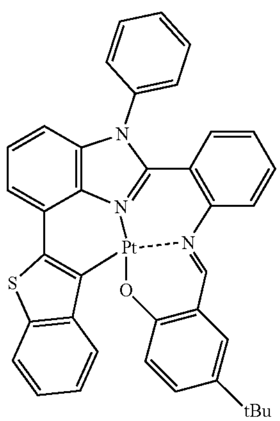

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Intermediate Synthetic Example 1: Synthesis of Intermediate 2

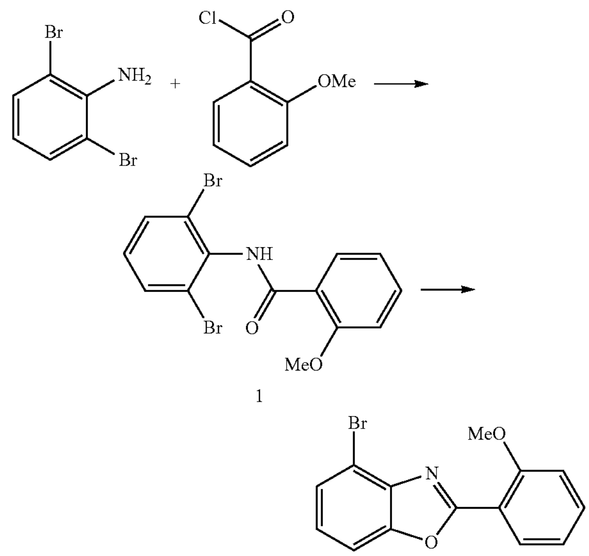

1

2

Synthesis of Intermediate 1

48.2 g (0.192 mol) of 2,6-dibromoaniline, 32.8 g (0.192 mol) of 2-methoxybenzoyl chloride and 360 ml of THF were added and stirred at room temperature for about 3 hours. After finishing the reaction, solvents were distilled under a reduced pressure. The resultant product was solidified using diisopropyl ether (IPE) to obtain 69.2 g (yield: 93.5%) of a white solid compound (Intermediate 1).

Synthesis of Intermediate 2

To a one-neck 1 L flask, 66.4 g (0.172 mmol) of Intermediate 1, 3.28 g (0.017 mol) of CuI, 3.26 g (0.018 mol) of 1,10-phenanthroline, 152 g (0.466 mol) of $Cs_2CO_3$, and 180 ml of dimethoxyethane (DME)) were added, followed by stirring at about 90° C. all day. After finishing the reaction, the resultant product was passed through a celite pad using DCM. After removing solvents, the solid thus obtained was dissolved in chloroform and separated by column chromatography ($CHCl_3$). The product thus obtained was solidified using methanol to obtain 40.2 g (yield: 76.9%) of a white solid compound (Intermediate 2).

Intermediate Synthetic Example 2: Synthesis of Intermediate 5

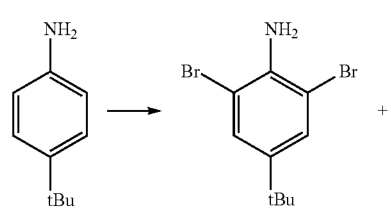

3

-continued

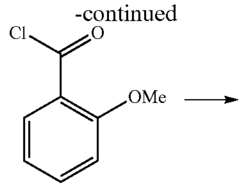

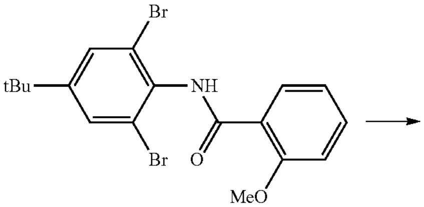

4

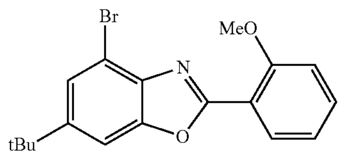

5

Synthesis of Intermediate 3

To a solution obtained by dissolving 20.0 g (134.0 mmol) of 4-tert-butylaniline in 100 ml of methanol and 100 ml of dichloromethane (DCM), a solution obtained by diluting 17.2 ml (335.1 mmol) of bromine ($Br_2$) in 50 ml of methanol and 50 ml of dichloromethane (DCM) at about 0° C. was slowly added dropwisely, followed by stirring at room temperature for about 24 hours. After finishing the reaction, reaction solvents were distilled under a reduced pressure, and the resultant product was neutralized with 20% NaOH and then, extracted with dichloromethane (DCM). The extracted organic layer was washed with a saturated saline solution once and distilled under a reduced pressure. The crude product was separated by column chromatography (CHCl3:HEX) to obtain 41.0 g (yield: 99.6%) of a yellow liquid compound (Intermediate 3).

Synthesis of Intermediate 4

The same procedure as in the synthesis of Intermediate 1 of Intermediate Synthetic Example 1 was performed except for using Intermediate 3 (41.0 g, 133.54 mmol) instead of 2,6-dibromoaniline to obtain Intermediate 4 (38.2 g, 64.8%).

Synthesis of Intermediate 5

The same procedure as in the synthesis of Intermediate 2 of Intermediate Synthetic Example 1 was performed except for using Intermediate 4 (66.4 g, 0.150 mol) instead of Intermediate 1 to obtain Intermediate 5 (40.2 g, 76.9%).

Intermediate Synthetic Example 3: Synthesis of Intermediate 10

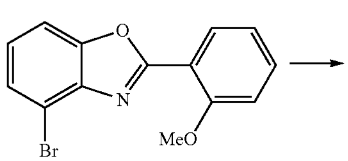

2

-continued

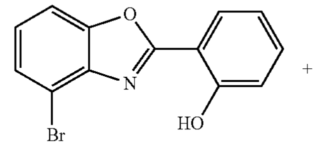

6

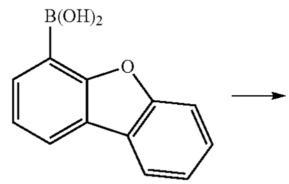

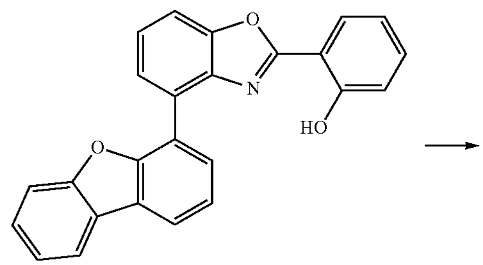

7

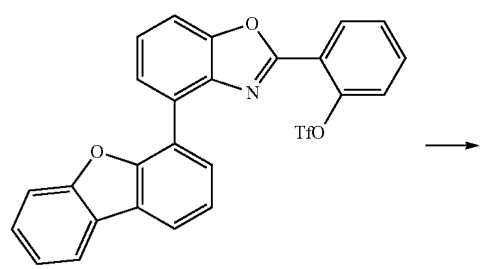

8

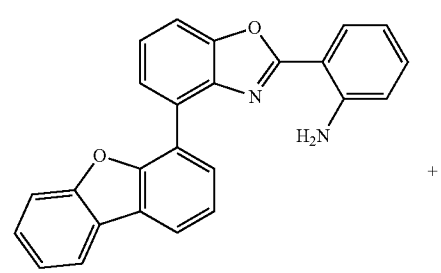

9

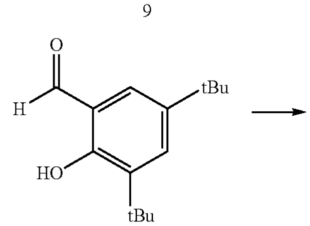

-continued

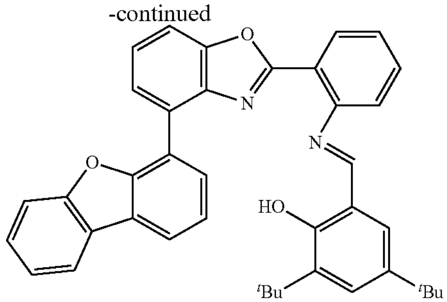

10

Synthesis of Intermediate 6

3.7 g (15.4 ml) of Intermediate 2 and 140 ml of 48% HBr were refluxed at about 120° C. all day. After finishing the reaction, the resultant product was poured into 135 ml of ice water and basified with 150 ml of 32% NaOH, followed by stirring at room temperature for about 20 minutes. The resultant product was extracted with EA, and water was removed with $MgSO_4$. Solvents were removed by distillation under a reduced pressure. The crude product was solidified with hexane to obtain 3.13 g (yield: 90.0%) of a solid compound (Intermediate 6).

Synthesis of Intermediate 7

In a one-neck 100 ml flask, 2.0 g (6.89 mmol) of Intermediate 6, 1.60 g (7.57 mmol) of 4-dibenzofuran boronic acid, 0.38 g (0.34 mmol) of $Pd(PPh_3)_4$, 26 ml of toluene, 13 ml of EtOH and 10 ml (19.6 mmol) of 2M $K_2CO_3$ were mixed and refluxed. After finishing the reaction, a solid produced by cooling the reaction product at room temperature was filtered using methanol. The solid was dissolved in chloroform and separated by silica gel column chromatography ($CHCl_3$:HEX). The product thus obtained was solidified with methanol and filtered to obtain 1.76 g (yield: 67.8%) of Intermediate 7.

Synthesis of Intermediate 8

1.76 g (4.66 mmol) of Intermediate 7, 44 ml of dichloromethane and 1.07 ml (13.2 mmol) of pyridine were stirred, and then, the temperature was decreased to about 0° C. 0.89 ml (5.30 mmol) of trifluoromethansulfonic anhydride was added thereto and stirred at room temperature all day. After checking the reaction, the reaction product was extracted with dichloromethane to remove water. The crude product was separated by silica gel column chromatography (MC). Solvents were completely removed to obtain 2.37 g (100%) of Intermediate 8.

Synthesis of Intermediate 9

2.37 g (4.66 mmol) of Intermediate 8, 0.89 ml (5.29 mmol) of benzophenone imine, 0.13 g (0.22 mmol) of $Pd(dba)_2$, 0.27 g (0.44 mmol) of BINAP, 4.31 g (13.2 mmol) of $Cs_2CO_3$, and 22 ml of toluene were added and refluxed and stirred all day. After checking the reaction, impurities were removed using a celite pad.

After removing solvents, the resultant mixture was acidified (pH<2) with 15 ml of THF and 9 ml of 2 M HCl and then, stirred for about 1 hour. After checking the reaction, the resultant product was basified (pH>8) with a $NaHCO_3$ aqueous solution and stirred for about 30 minutes or more. Water and solvents were removed via extraction with EA, and the solid thus obtained was filtered using methanol to obtain 1.52 g (87.2%) of Intermediate 9.

Synthesis of Intermediate 10

1.52 g (4.04 mmol) of Intermediate 10, 0.98 g (4.20 mmol) of 3,5-di-tert-butyl-2-hydroxybenzaldehyde and 76 ml of ethanol were added and refluxed for three days. After finishing the reaction, the reaction product was filtered in a hot state using ethanol, 2.13 g (89.4%) of light yellow Intermediate 10 was obtained.

Intermediate Synthetic Example 4: Synthesis of Intermediate 15

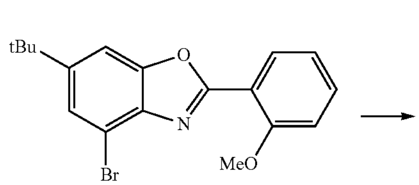

5

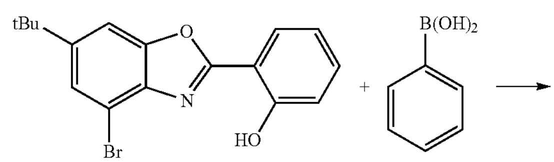

11

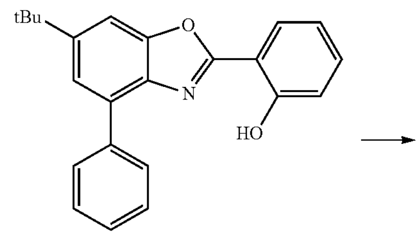

12

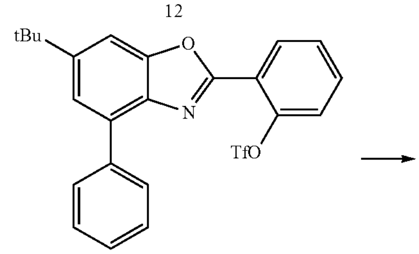

13

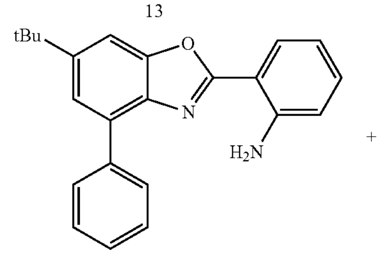

14

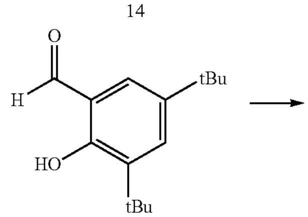

-continued

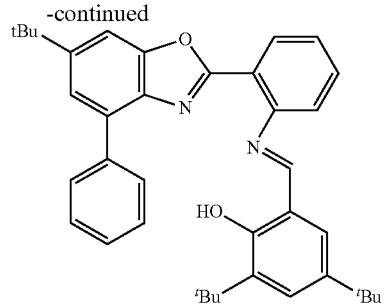

15

Synthesis of Intermediate 11

The same procedure as in the synthesis of Intermediate 6 of Intermediate Synthetic Example 3 was performed except for using Intermediate 5 (11.0 g, 30.53 mmol) instead of Intermediate 2 to obtain Intermediate 11 (8.3 g, 78.6%).

Synthesis of Intermediate 12

The same procedure as in the synthesis of Intermediate 7 of Intermediate Synthetic Example 3 was performed except for using Intermediate 11 (4.0 g, 11.55 mmol) instead of Intermediate 6 to obtain Intermediate 12 (3.2 g, 80.9%).

Synthesis of Intermediate 13

The same procedure as in the synthesis of Intermediate 8 of Intermediate Synthetic Example 3 was performed except for using Intermediate 12 (2.17 g, 6.32 mmol) instead of Intermediate 7 to obtain Intermediate 13 (3.0 g, 99.85%).

Synthesis of Intermediate 14

The same procedure as in the synthesis of Intermediate 9 of Intermediate Synthetic Example 3 was performed except for using Intermediate 13 (3.0 g, 6.31 mmol) instead of Intermediate 8 to obtain Intermediate 14 (1.8 g, 85.6%).

Synthesis of Intermediate 15

The same procedure as in the synthesis of Intermediate 10 of Intermediate Synthetic Example 3 was performed except for using Intermediate 14 (670 mg, 1.96 mmol) instead of Intermediate 9 to obtain Intermediate 15 (874 mg, 79.9%).

Intermediate Synthetic Example 5: Synthesis of Intermediate 19

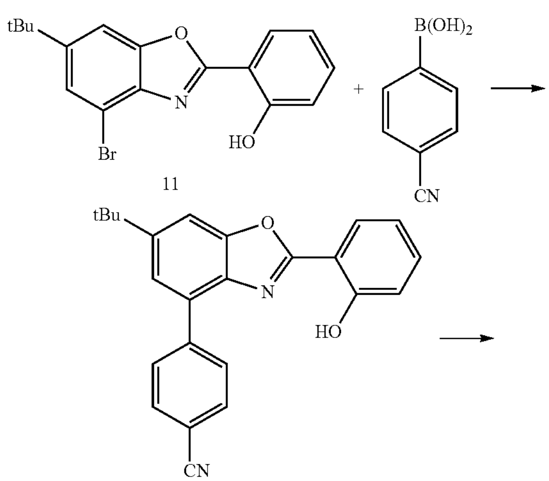

11

16

-continued

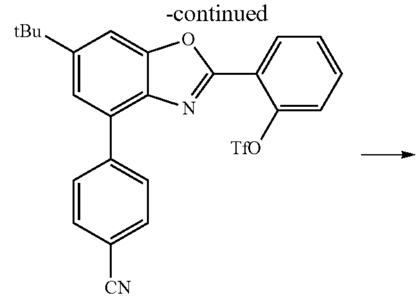

17

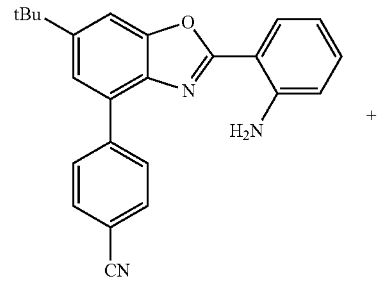

18

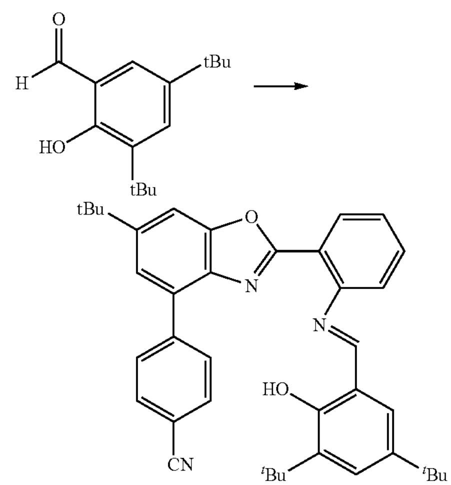

19

Synthesis of Intermediate 16

The same procedure as in the synthesis of Intermediate 7 of Intermediate Synthetic Example 3 was performed except for using Intermediate 11 (5.0 g, 14.4 mmol) instead of Intermediate 6 to obtain Intermediate 16 (4.9 g, 92.0%).

Synthesis of Intermediate 17

The same procedure as in the synthesis of Intermediate 8 of Intermediate Synthetic Example 3 was performed except for using Intermediate 16 (4.9 g, 13.3 mmol) instead of Intermediate 7 to obtain Intermediate 17 (6.2 g, 93.1%).

Synthesis of Intermediate 18

The same procedure as in the synthesis of Intermediate 9 of Intermediate Synthetic Example 3 was performed except for using Intermediate 17 (6.2 g, 12.3 mmol) instead of Intermediate 8 to obtain Intermediate 18 (3.2 g, 70.3%).

Synthesis of Intermediate 19

The same procedure as in the synthesis of Intermediate 10 of Intermediate Synthetic Example 3 was performed except for using Intermediate 18 (2.0 g, 5.44 mmol) instead of Intermediate 9 to obtain Intermediate 19 (2.3 g, 72.3%).

Intermediate Synthetic Example 6: Synthesis of Intermediate 23

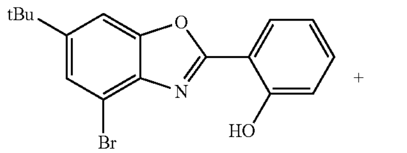

11

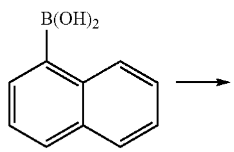

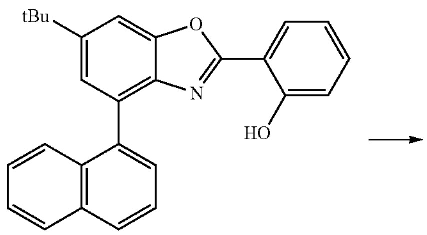

20

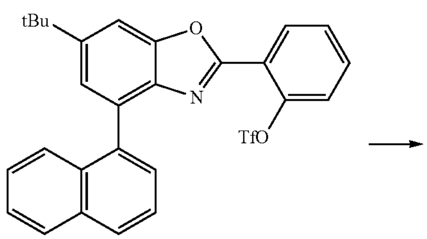

21

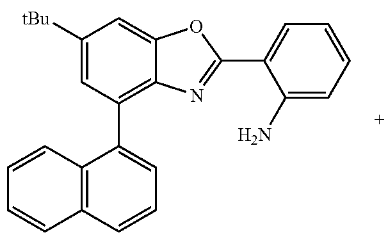

22

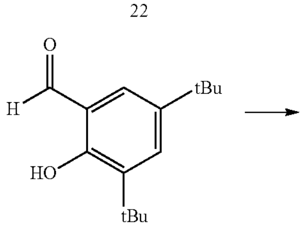

-continued

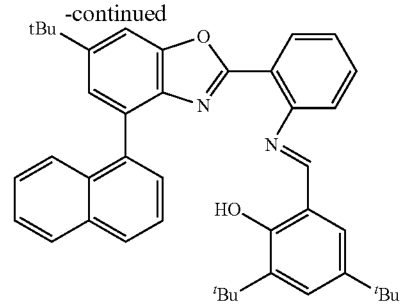

23

Synthesis of Intermediate 20

The same procedure as in the synthesis of Intermediate 7 of Intermediate Synthetic Example 3 was performed except for using Intermediate 11 (5.0 g, 14.4 mmol) instead of Intermediate 6 to obtain Intermediate 20 (5.1 g, 89.7%).

Synthesis of Intermediate 21

The same procedure as in the synthesis of Intermediate 8 of Intermediate Synthetic Example 3 was performed except for using Intermediate 20 (5.1 g, 12.9 mmol) instead of Intermediate 7 to obtain Intermediate 21 (5.8 g, 85.1%).

Synthesis of Intermediate 22

The same procedure as in the synthesis of Intermediate 9 of Intermediate Synthetic Example 3 was performed except for using Intermediate 21 (5.8 g, 11.04 mmol) instead of Intermediate 8 to obtain Intermediate 22 (3.6 g, 83.1%).

Synthesis of Intermediate 23

The same procedure as in the synthesis of Intermediate 10 of Intermediate Synthetic Example 3 was performed except for using Intermediate 22 (2.0 g, 5.10 mmol) instead of Intermediate 9 to obtain Intermediate 23 (2.9 g, 93.4%).

Intermediate Synthetic Example 7: Synthesis of Intermediate 26

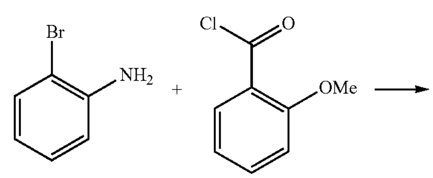

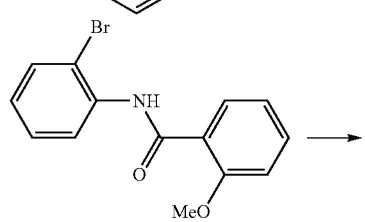

24

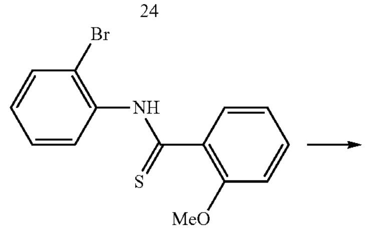

25

-continued

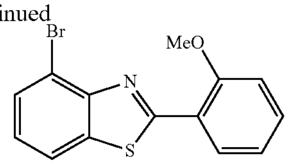

26

Synthesis of Intermediate 24

The same procedure as in the synthesis of Intermediate 1 of Intermediate Synthetic Example 1 was performed except for using 2-bromoaniline (30.0 g, 174.4 mmol) instead of 2,6-dibromoaniline to obtain Intermediate 24 (42.6 g, 79.7%).

Synthesis of Intermediate 26

42.6 g (0.139 mol) of Intermediate 1, 67.5 g (0.167 mol) of Lawesson's reagent, and 930 ml of toluene were refluxed all day. After finishing the reaction, solvents were distilled under a reduced pressure, and the product thus obtained was dissolved in dichlorobenzene (DCM) and passed through a celite pad. The filtrate thus passed was concentrated under a reduced pressure to obtain 44.8 g of Intermediate 25. The next reaction was performed without purification.

To 44.8 g (0.139 mol) of Intermediate 25, 550 ml of 2 M NaOH and 23 ml of ethanol were added dropwisely, followed by stirring at room temperature for about 20 minutes, 460 ml of 1.2 M $K_3[Fe(CN)_6]$ was slowed added thereto dropwisely, followed by refluxing all day. After finishing the reaction, the reaction product was cooled to room temperature, and a solid produced during the reaction was filtered and washed with water. The solid thus obtained was dissolved in chloroform and separated by column chromatography ($CHCl_3$:HEX=1:1) and solidified with methanol to obtain 15.0 g (yield: 33.7%) of a white solid compound (Intermediate 26).

Intermediate Synthetic Example 8: Synthesis of Intermediate 31

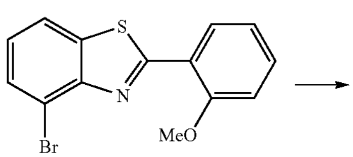

26

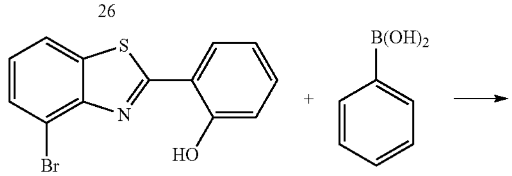

27

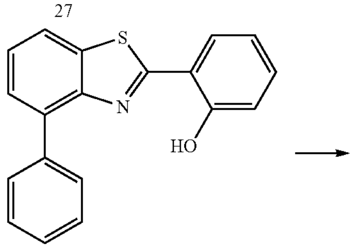

28

-continued

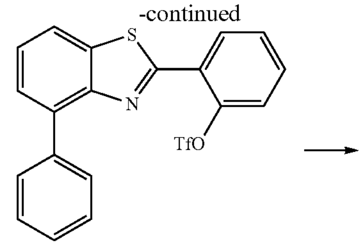

29

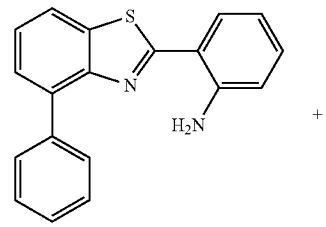

30

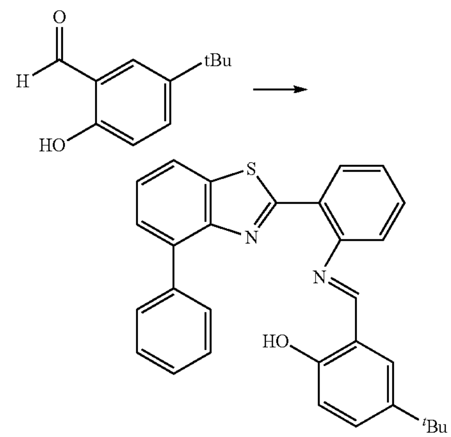

31

Synthesis of Intermediate 27

The same procedure as in the synthesis of Intermediate 6 of Intermediate Synthetic Example 3 was performed except for using Intermediate 26 (10.0 g, 31.23 mmol) instead of Intermediate 2 to obtain Intermediate 27 (8.6 g, 90.1%).

Synthesis of Intermediate 28

The same procedure as in the synthesis of Intermediate 7 of Intermediate Synthetic Example 3 was performed except for using Intermediate 27 (4.0 g, 13.06 mmol) instead of Intermediate 6 to obtain Intermediate 28 (3.5 g, 88.3%).

Synthesis of Intermediate 29

The same procedure as in the synthesis of Intermediate 8 of Intermediate Synthetic Example 3 was performed except for using Intermediate 28 (3.5 g, 11.54 mmol) instead of Intermediate 7 to obtain Intermediate 29 (3.3 g, 65.6%).

Synthesis of Intermediate 30

The same procedure as in the synthesis of Intermediate 9 of Intermediate Synthetic Example 3 was performed except for using Intermediate 29 (3.3 g, 7.58 mmol) instead of Intermediate 8 to obtain Intermediate 30 (2.0 g, 87.2%).

Synthesis of Intermediate 31

The same procedure as in the synthesis of Intermediate 10 of Intermediate Synthetic Example 3 was performed except for using Intermediate 30 (2.0 g, 6.61 mmol) instead of Intermediate 9 to obtain Intermediate 31 (1.9 g, 62.1%).

Intermediate Synthetic Example 9: Synthesis of Intermediate 32

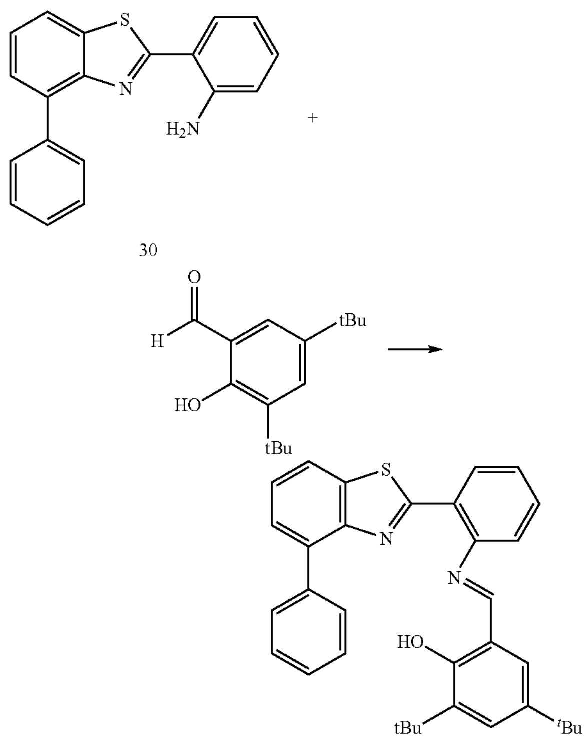

30

32

Synthesis of Intermediate 32

The same procedure as in the synthesis of Intermediate 10 of Intermediate Synthetic Example 3 was performed except for using Intermediate 30 (2.0 g, 6.61 mmol) instead of Intermediate 9 to obtain Intermediate 32 (2.1 g, 61.2%).

Intermediate Synthetic Example 10: Synthesis of Intermediate 36

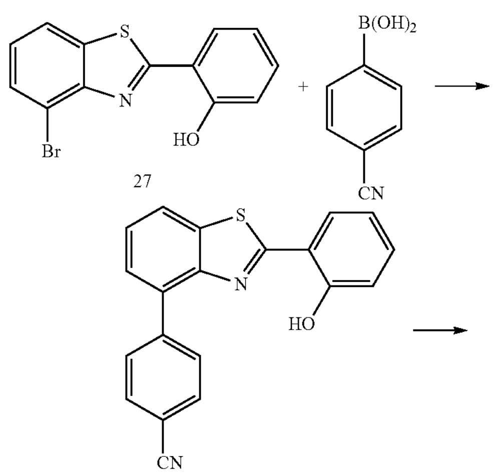

27

33

-continued

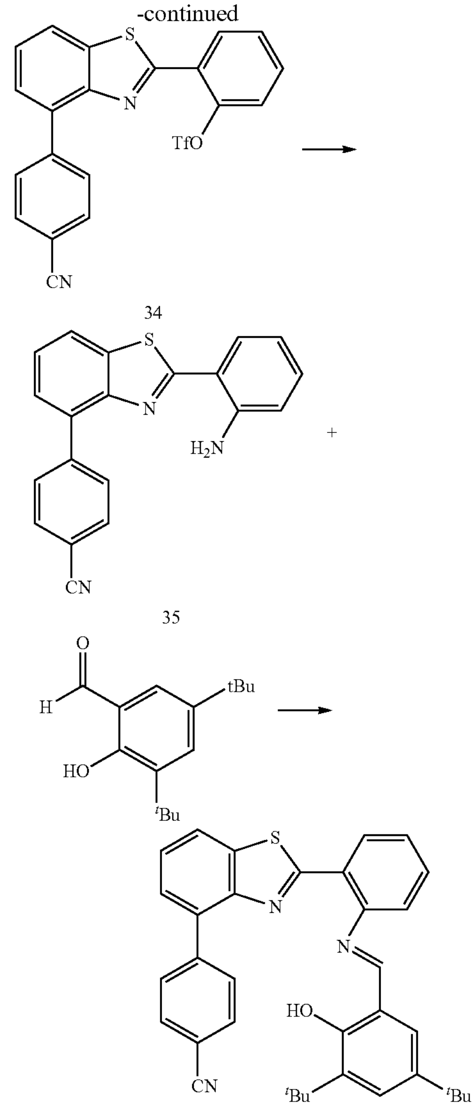

34

35

36

Synthesis of Intermediate 33

The same procedure as in the synthesis of Intermediate 7 of Intermediate Synthetic Example 3 was performed except for using Intermediate 27 (4.0 g, 13.06 mmol) instead of Intermediate 6 to obtain Intermediate 33 (3.2 g, 74.5%).

Synthesis of Intermediate 34

The same procedure as in the synthesis of Intermediate 8 of Intermediate Synthetic Example 3 was performed except for using Intermediate 33 (3.2 g, 9.74 mmol) instead of Intermediate 7 to obtain Intermediate 34 (3.3 g, 73.5%).

Synthesis of Intermediate 35

The same procedure as in the synthesis of Intermediate 9 of Intermediate Synthetic Example 3 was performed except for using Intermediate 34 (3.3 g, 7.17 mmol) instead of Intermediate 8 to obtain Intermediate 35 (1.9 g, 80.9%).

Synthesis of Intermediate 36

The same procedure as in the synthesis of Intermediate 10 of Intermediate Synthetic Example 3 was performed except for using Intermediate 35 (1.9 g, 5.80 mmol) instead of Intermediate 9 to obtain Intermediate 36 (2.0 g, 63.3%).

Intermediate Synthetic Example 11: Synthesis of Intermediate 40

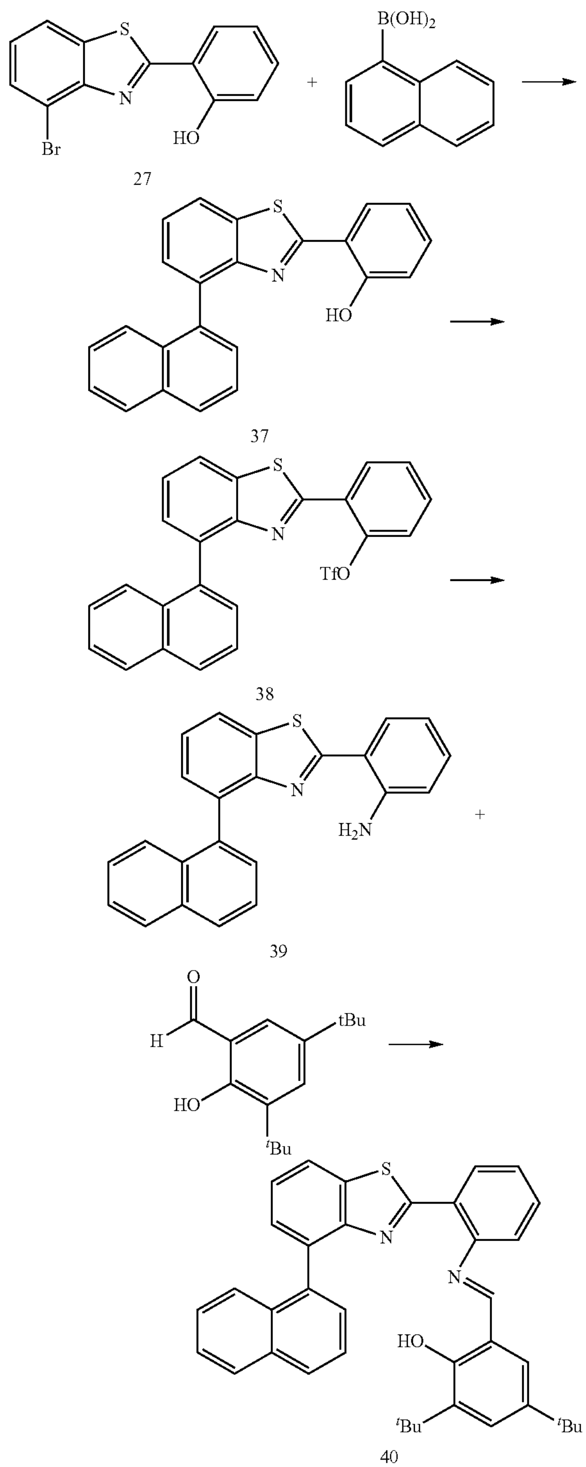

Synthesis of Intermediate 37

The same procedure as in the synthesis of Intermediate 7 of Intermediate Synthetic Example 3 was performed except for using Intermediate 27 (4.0 g, 13.06 mmol) instead of Intermediate 6 to obtain Intermediate 37 (4.0 g, 86.6%).

Synthesis of Intermediate 38

The same procedure as in the synthesis of Intermediate 8 of Intermediate Synthetic Example 3 was performed except for using Intermediate 37 (4.0 g, 11.32 mmol) instead of Intermediate 7 to obtain Intermediate 38 (3.3 g, 60.0%).

Synthesis of Intermediate 39

The same procedure as in the synthesis of Intermediate 9 of Intermediate Synthetic Example 3 was performed except for using Intermediate 38 (3.3 g, 6.80 mmol) instead of Intermediate 8 to obtain Intermediate 39 (1.8 g, 75.1%).

Synthesis of Intermediate 40

The same procedure as in the synthesis of Intermediate 10 of Intermediate Synthetic Example 3 was performed except for using Intermediate 39 (1.8 g, 5.11 mmol) instead of Intermediate 9 to obtain Intermediate 40 (2.0 g, 68.8%).

Intermediate Synthetic Example 12: Synthesis of Intermediate 45

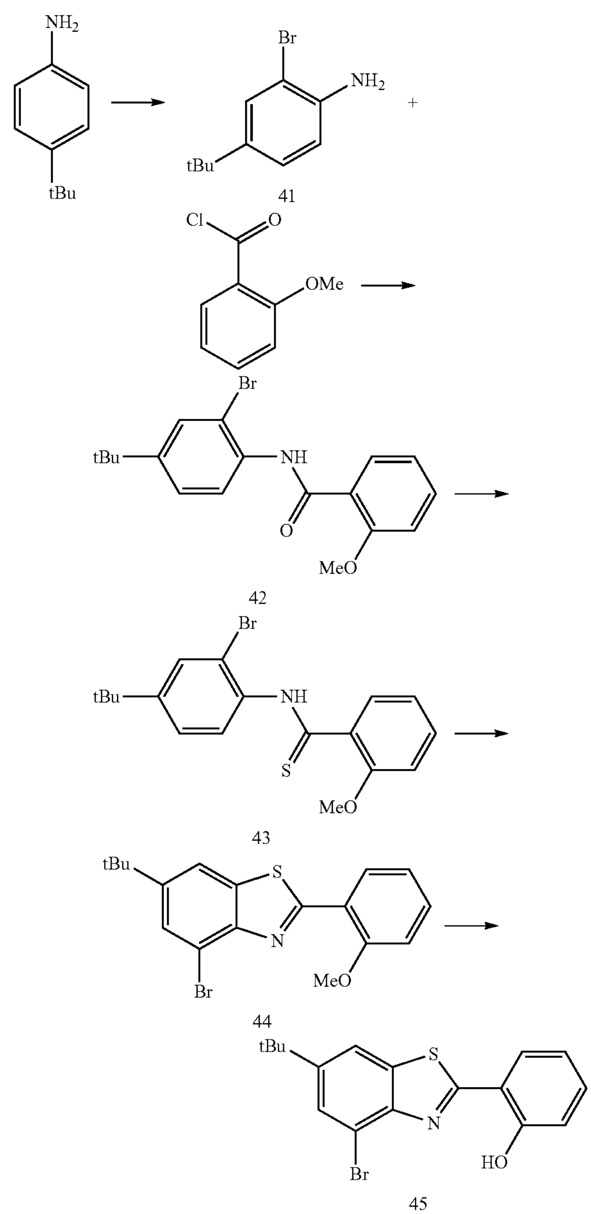

Synthesis of Intermediate 41

To a solution obtained by dissolving 30.0 g (201.03 mmol) of 4-tert-butylaniline in 670 ml of acetonitrile, 35.8 g (201.03 mmol) of NBS was slowly added dropwisely at about 0° C., followed by stirring at room temperature for about 24 hours. After finishing the reaction, water was added and extraction was performed using dichloromethane (DCM). The organic layer thus extracted was washed with a saturated saline solution once and then, distilled under a reduced pressure. The crude product was separated by column chromatography ($CHCl_3$) to obtain 45.0 g (yield: 98.0%) of a yellow liquid compound (Intermediate 41).

Synthesis of Intermediate 42

The same procedure as in the synthesis of Intermediate 1 of Intermediate Synthetic Example 1 was performed except for using Intermediate 41 (45.0 g, 197.26 mmol) instead of 2,6-dibromoaniline to obtain Intermediate 42 (63.0 g, 88.1%).

Synthesis of Intermediate 44

The same procedure as in the synthesis of Intermediate 26 of Intermediate Synthetic Example 7 was performed except for using Intermediate 42 (63.0 g, 173.91 mmol) instead of Intermediate 24 to obtain Intermediate 44 (36.3 g, 55.4%).

Synthesis of Intermediate 45

36.3 g (96.46 mmol) of Intermediate 44 and 222.9 g (1.93 mol) of pyridine hydrochloride were stirred at about 180° C. for about 2 hours. After finishing the reaction, the reaction product was poured into an ice water and basified using a Na2CO3 saturated solution, followed by stirring at room temperature for about 20 hours. The resultant product was extracted with $CHCl_3$, water was removed with $MgSO_4$, and solvents were removed by distillation under a reduced pressure. The resultant product was solidified using methanol to obtain 29.6 g (yield: 84.7%) of ivory Intermediate 45.

Intermediate Synthetic Example 13: Synthesis of Intermediate 49

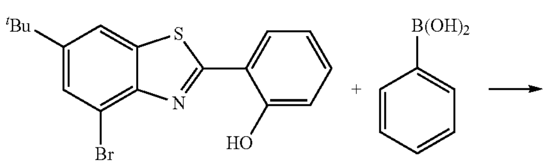

45

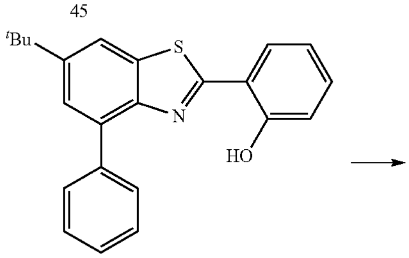

46

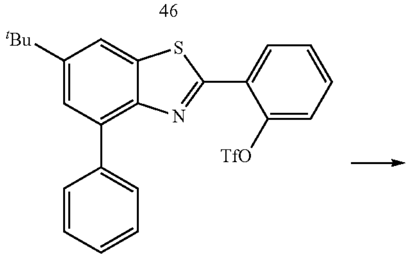

47

-continued

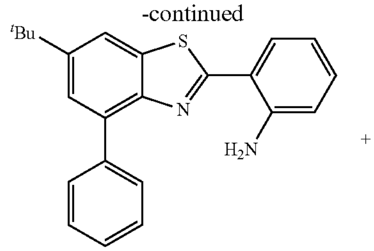

48

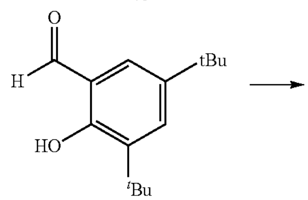

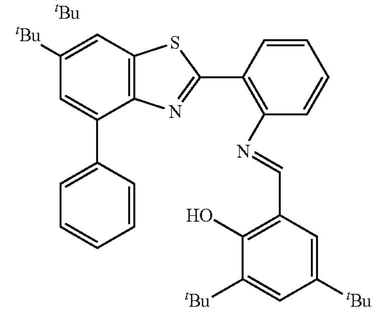

49

Synthesis of Intermediate 46

The same procedure as in the synthesis of Intermediate 7 of Intermediate Synthetic Example 3 was performed except for using Intermediate 45 (4.0 g, 11.04 mmol) instead of Intermediate 6 to obtain Intermediate 46 (3.5 g, 88.1%).

Synthesis of Intermediate 47

The same procedure as in the synthesis of Intermediate 8 of Intermediate Synthetic Example 3 was performed except for using Intermediate 46 (3.5 g, 9.74 mmol) instead of Intermediate 7 to obtain Intermediate 47 (3.6 g, 75.2%).

Synthesis of Intermediate 48

The same procedure as in the synthesis of Intermediate 9 of Intermediate Synthetic Example 3 was performed except for using Intermediate 47 (3.6 g, 7.32 mmol) instead of Intermediate 8 to obtain Intermediate 48 (2.0 g, 76.1%).

Synthesis of Intermediate 49

The same procedure as in the synthesis of Intermediate 10 of Intermediate Synthetic Example 3 was performed except for using Intermediate 48 (2.0 g, 5.11 mmol) instead of Intermediate 9 to obtain Intermediate 49 (2.1 g, 65.4%).

Intermediate Synthetic Example 14: Synthesis of Intermediate 53

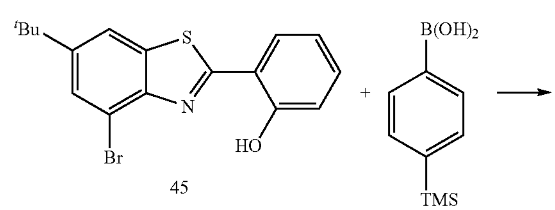

45

-continued

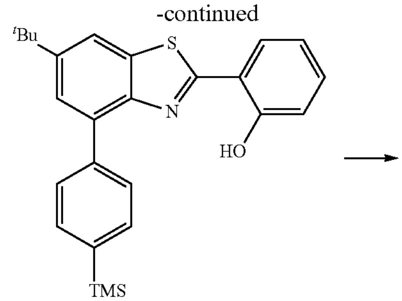

50

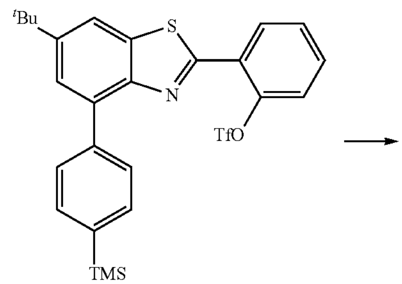

51

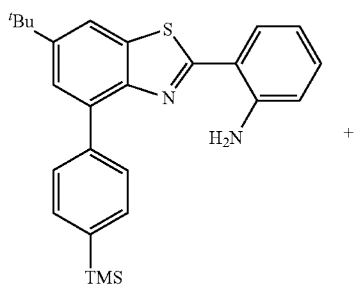

52

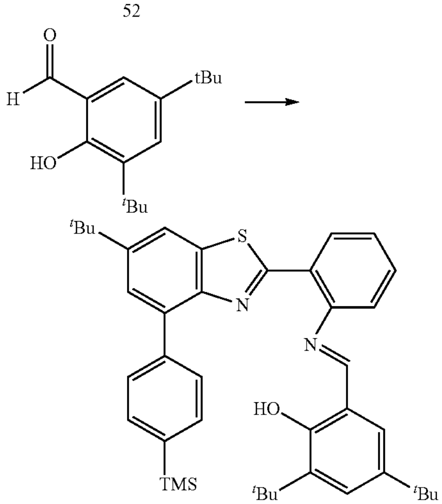

53

Synthesis of Intermediate 50

The same procedure as in the synthesis of Intermediate 7 of Intermediate Synthetic Example 3 was performed except for using Intermediate 45 (5.0 g, 13.8 mmol) instead of Intermediate 6 to obtain Intermediate 50 (3.9 g, 65.4%).

Synthesis of Intermediate 51

The same procedure as in the synthesis of Intermediate 8 of Intermediate Synthetic Example 3 was performed except for using Intermediate 50 (3.9 g, 9.03 mmol) instead of Intermediate 7 to obtain Intermediate 51 (4.1 g, 80.5%).

Synthesis of Intermediate 52

The same procedure as in the synthesis of Intermediate 9 of Intermediate Synthetic Example 3 was performed except for using Intermediate 51 (4.1 g, 7.27 mmol) instead of Intermediate 8 to obtain Intermediate 52 (2.0 g, 63.8%).

Synthesis of Intermediate 53

The same procedure as in the synthesis of Intermediate 10 of Intermediate Synthetic Example 3 was performed except for using Intermediate 52 (2.0 g, 4.64 mmol) instead of Intermediate 9 to obtain Intermediate 53 (2.0 g, 66.5%).

Intermediate Synthetic Example 15: Synthesis of Intermediate 57

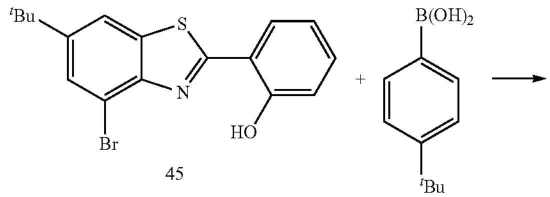

45

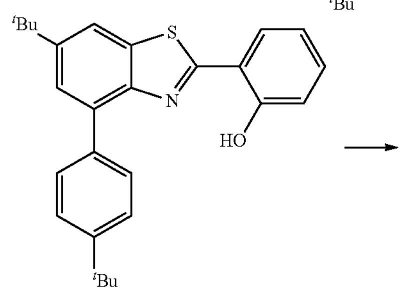

54

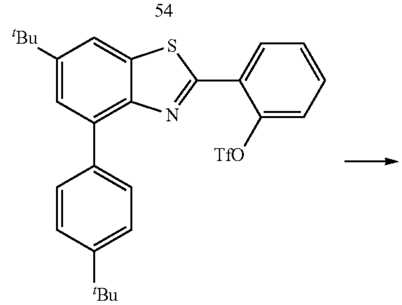

55

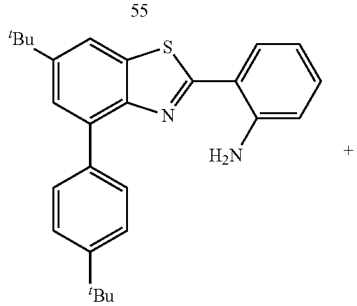

56

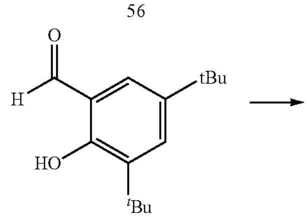

-continued

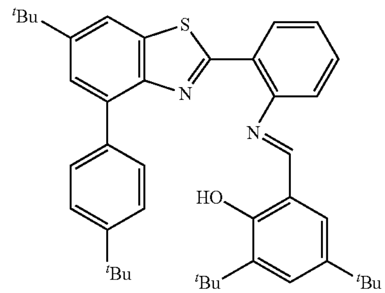

57

Synthesis of Intermediate 54

The same procedure as in the synthesis of Intermediate 7 of Intermediate Synthetic Example 3 was performed except for using Intermediate 45 (5.0 g, 13.8 mmol) instead of Intermediate 6 to obtain Intermediate 54 (5.1 g, 88.9%).

Synthesis of Intermediate 55

The same procedure as in the synthesis of Intermediate 8 of Intermediate Synthetic Example 3 was performed except for using Intermediate 54 (5.1 g, 12.27 mmol) instead of Intermediate 7 to obtain Intermediate 55 (5.3 g, 78.8%).

Synthesis of Intermediate 56

The same procedure as in the synthesis of Intermediate 9 of Intermediate Synthetic Example 3 was performed except for using Intermediate 55 (5.3 g, 9.68 mmol) instead of Intermediate 8 to obtain Intermediate 56 (2.3 g, 57.3%).

Synthesis of Intermediate 57

The same procedure as in the synthesis of Intermediate 10 of Intermediate Synthetic Example 3 was performed except for using Intermediate 56 (2.3 g, 5.55 mmol) instead of Intermediate 9 to obtain Intermediate 57 (2.2 g, 62.8%).

Intermediate Synthetic Example 16: Synthesis of Intermediate 61

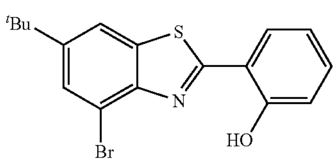

45

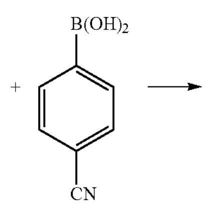

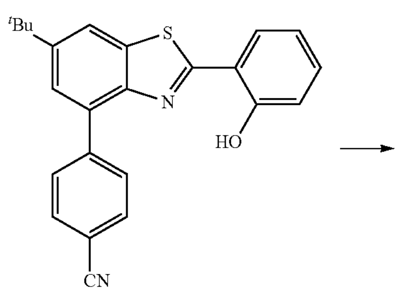

58

-continued

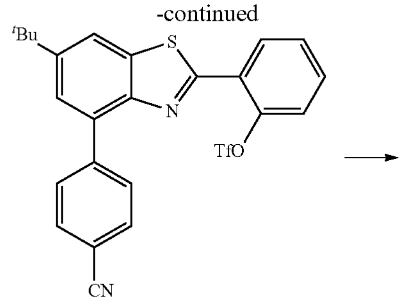

59

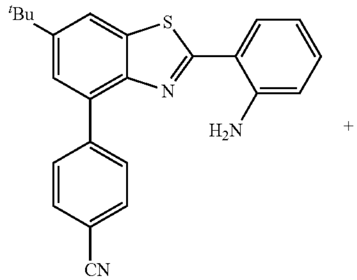

60

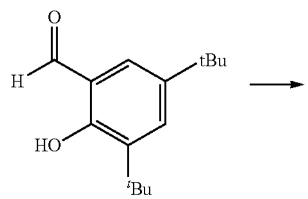

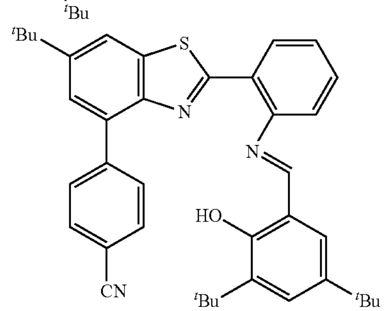

61

Synthesis of Intermediate 58

The same procedure as in the synthesis of Intermediate 7 of Intermediate Synthetic Example 3 was performed except for using Intermediate 45 (5.0 g, 13.8 mmol) instead of Intermediate 6 to obtain Intermediate 58 (4.2 g, 79.1%).

Synthesis of Intermediate 59

The same procedure as in the synthesis of Intermediate 8 of Intermediate Synthetic Example 3 was performed except for using Intermediate 58 (4.2 g, 10.92 mmol) instead of Intermediate 7 to obtain Intermediate 59 (5.1 g, 90.3%).

The same procedure as in the synthesis of Intermediate 9 of Intermediate Synthetic Example 3 was performed except for using Intermediate 59 (5.1 g, 9.87 mmol) instead of Intermediate 8 to obtain Intermediate 60 (1.9 g, 50.1%).

Synthesis of Intermediate 61

The same procedure as in the synthesis of Intermediate 10 of Intermediate Synthetic Example 3 was performed except for using Intermediate 60 (1.9 g, 5.55 mmol) instead of Intermediate 9 to obtain Intermediate 61 (1.6 g, 53.8%).

Intermediate Synthetic Example 17: Synthesis of Intermediate 65

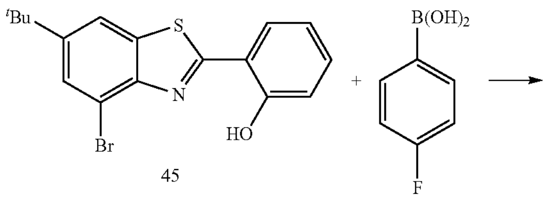

45

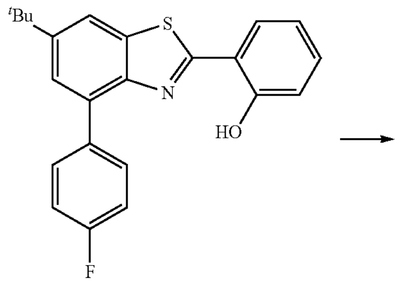

62

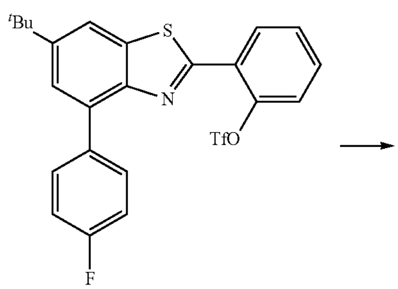

63

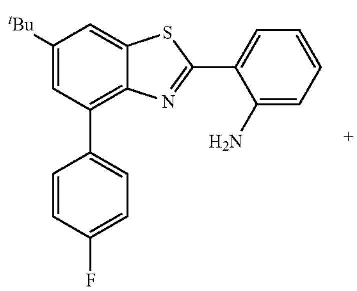

64

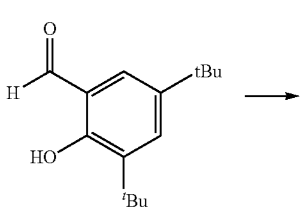

-continued

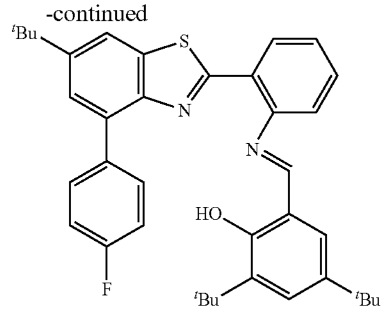

65

Synthesis of Intermediate 62)

The same procedure as in the synthesis of Intermediate 7 of Intermediate Synthetic Example 3 was performed except for using Intermediate 45 (5.0 g, 13.8 mmol) instead of Intermediate 6 to obtain Intermediate 62 (3.9 g, 74.8%).

Synthesis of Intermediate 63

The same procedure as in the synthesis of Intermediate 8 of Intermediate Synthetic Example 3 was performed except for using Intermediate 62 (3.9 g, 10.33 mmol) instead of Intermediate 7 to obtain Intermediate 63 (3.3 g, 62.6%).

Synthesis of Intermediate 64

The same procedure as in the synthesis of Intermediate 9 of Intermediate Synthetic Example 3 was performed except for using Intermediate 63 (3.3 g, 6.38 mmol) instead of Intermediate 8 to obtain Intermediate 64 (1.1 g, 45.1%).

Synthesis of Intermediate 65

The same procedure as in the synthesis of Intermediate 10 of Intermediate Synthetic Example 3 was performed except for using Intermediate 64 (1.1 g, 2.92 mmol) instead of Intermediate 9 to obtain Intermediate 65 (1.6 g, 92.3%).

Intermediate Synthetic Example 18: Synthesis of Intermediate 69

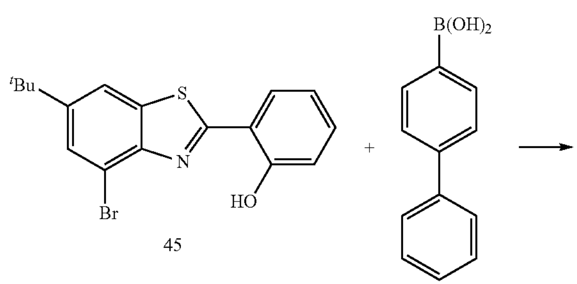

45

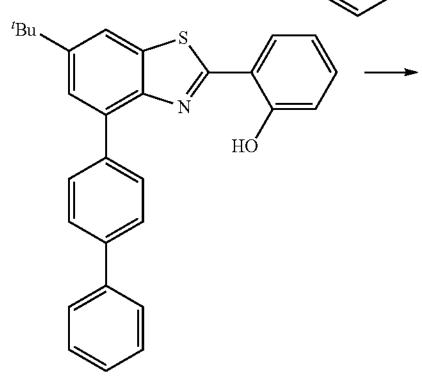

66

-continued

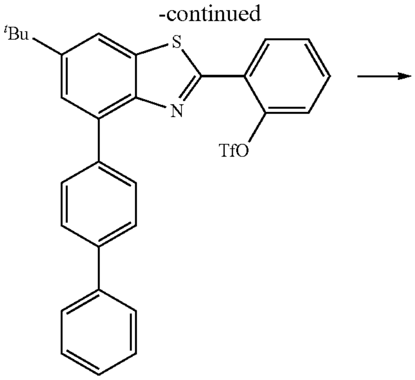

67

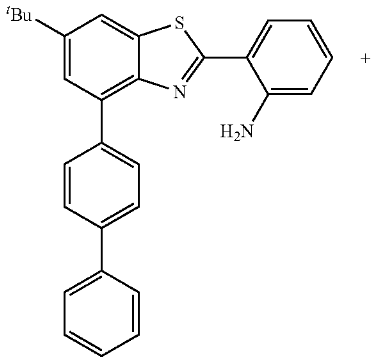

68

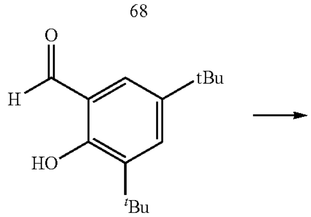

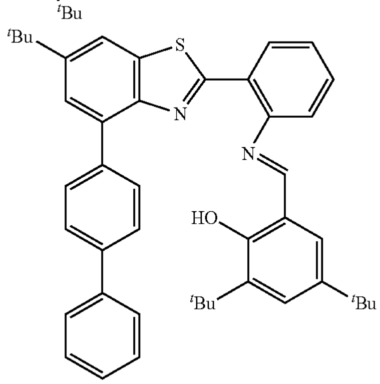

69

Synthesis of Intermediate 66

The same procedure as in the synthesis of Intermediate 7 of Intermediate Synthetic Example 3 was performed except for using Intermediate 45 (5.0 g, 13.8 mmol) instead of Intermediate 6 to obtain Intermediate 66 (5.2 g, 86.5%).

Synthesis of Intermediate 67

The same procedure as in the synthesis of Intermediate 8 of Intermediate Synthetic Example 3 was performed except for using Intermediate 66 (5.2 g, 11.94 mmol) instead of Intermediate 7 to obtain Intermediate 67 (6.1 g, 90.0%).

Synthesis of Intermediate 68

The same procedure as in the synthesis of Intermediate 9 of Intermediate Synthetic Example 3 was performed except for using Intermediate 67 (6.1 g, 10.75 mmol) instead of Intermediate 8 to obtain Intermediate 68 (3.5 g, 74.9%).

Synthesis of Intermediate 69

The same procedure as in the synthesis of Intermediate 10 of Intermediate Synthetic Example 3 was performed except for using Intermediate 68 (3.5 g, 8.05 mmol) instead of Intermediate 9 to obtain Intermediate 69 (2.5 g, 47.6%).

Intermediate Synthetic Example 19: Synthesis of Intermediate 73

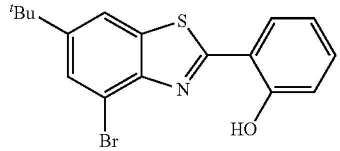

45

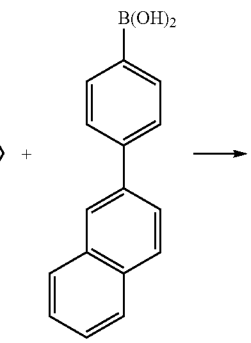

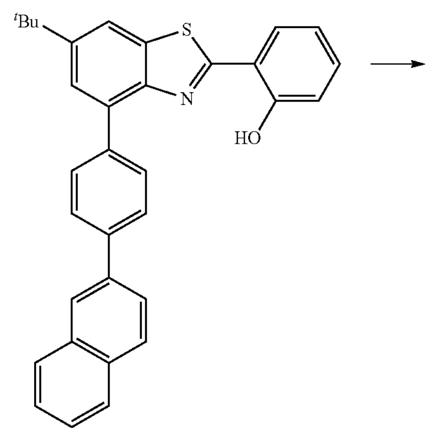

70

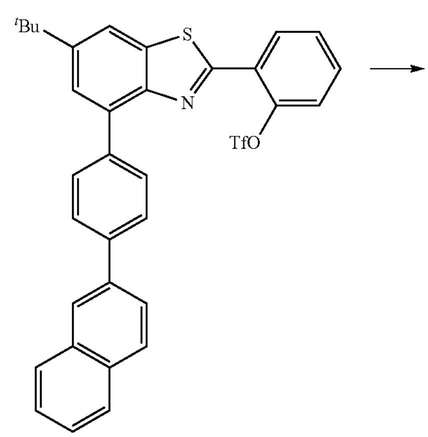

71

-continued

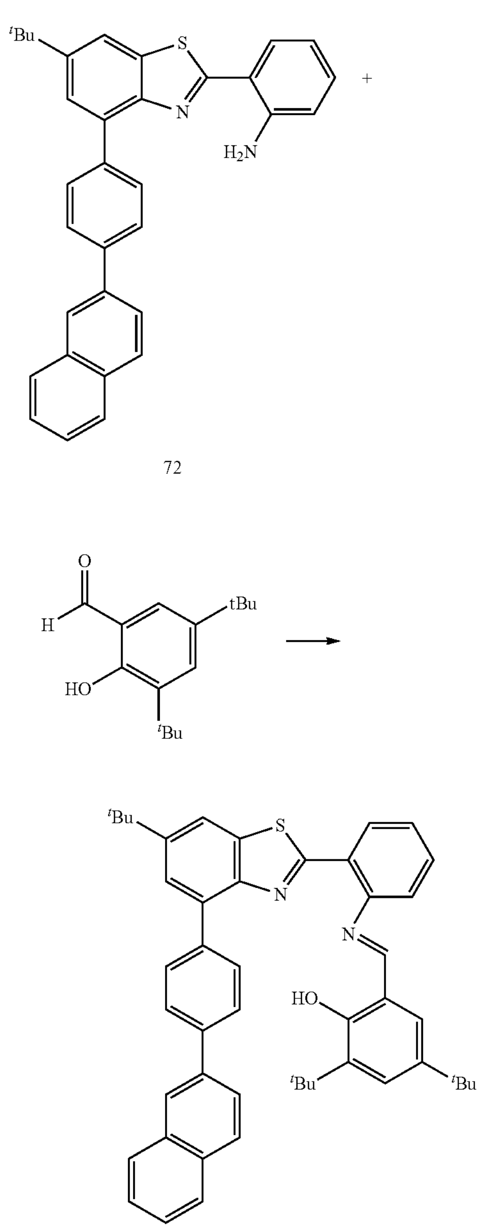

72

73

Synthesis of Intermediate 70

The same procedure as in the synthesis of Intermediate 7 of Intermediate Synthetic Example 3 was performed except for using Intermediate 45 (4.0 g, 11.04 mmol) instead of Intermediate 6 to obtain Intermediate 70 (4.4 g, 82.0%).

Synthesis of Intermediate 71

The same procedure as in the synthesis of Intermediate 8 of Intermediate Synthetic Example 3 was performed except for using Intermediate 70 (4.4 g, 9.06 mmol) instead of Intermediate 7 to obtain Intermediate 71 (4.5 g, 80.4%).

Synthesis of Intermediate 72)

The same procedure as in the synthesis of Intermediate 9 of Intermediate Synthetic Example 3 was performed except for using Intermediate 71 (4.5 g, 7.29 mmol) instead of Intermediate 8 to obtain Intermediate 72 (2.2 g, 62.3%).

Synthesis of Intermediate 73

The same procedure as in the synthesis of Intermediate 10 of Intermediate Synthetic Example 3 was performed except for using Intermediate 72 (2.2 g, 4.54 mmol) instead of Intermediate 9 to obtain Intermediate 73 (2.0 g, 62.8%).

Intermediate Synthetic Example 20: Synthesis of Intermediate 77

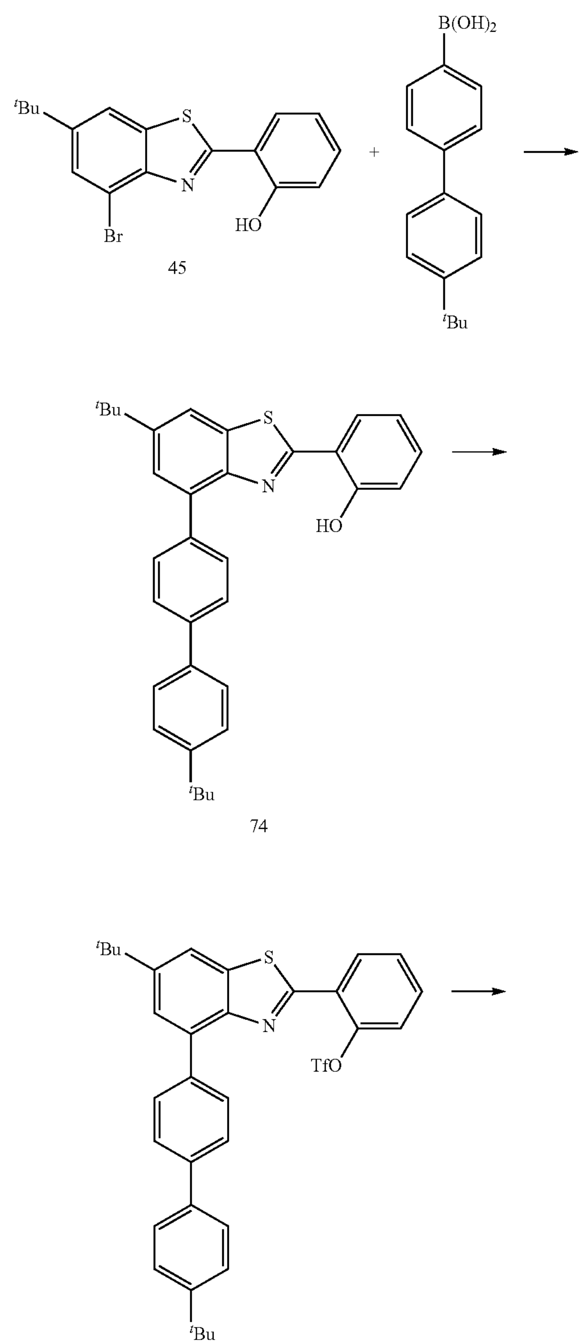

45

74

75

-continued

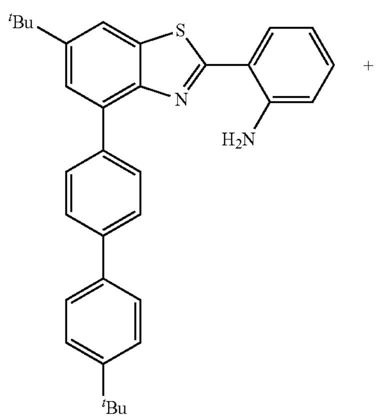

76

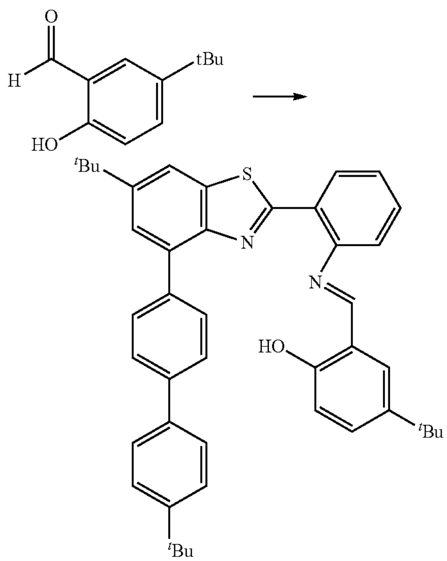

77

Synthesis of Intermediate 74

The same procedure as in the synthesis of Intermediate 7 of Intermediate Synthetic Example 3 was performed except for using Intermediate 45 (4.0 g, 11.04 mmol) instead of Intermediate 6 to obtain Intermediate 74 (4.2 g, 77.3%).

Synthesis of Intermediate 75

The same procedure as in the synthesis of Intermediate 8 of Intermediate Synthetic Example 3 was performed except for using Intermediate 74 (4.2 g, 8.54 mmol) instead of Intermediate 7 to obtain Intermediate 75 (4.5 g, 84.4%).

Synthesis of Intermediate 76

The same procedure as in the synthesis of Intermediate 9 of Intermediate Synthetic Example 3 was performed except for using Intermediate 75 (4.5 g, 7.21 mmol) instead of Intermediate 8 to obtain Intermediate 76 (2.5 g, 70.6%).

Synthesis of Intermediate 77

The same procedure as in the synthesis of Intermediate 10 of Intermediate Synthetic Example 3 was performed except for using Intermediate 76 (2.5 g, 5.09 mmol) instead of Intermediate 9 to obtain Intermediate 77 (2.3 g, 69.3%).

Intermediate Synthetic Example 21: Synthesis of Intermediate 81

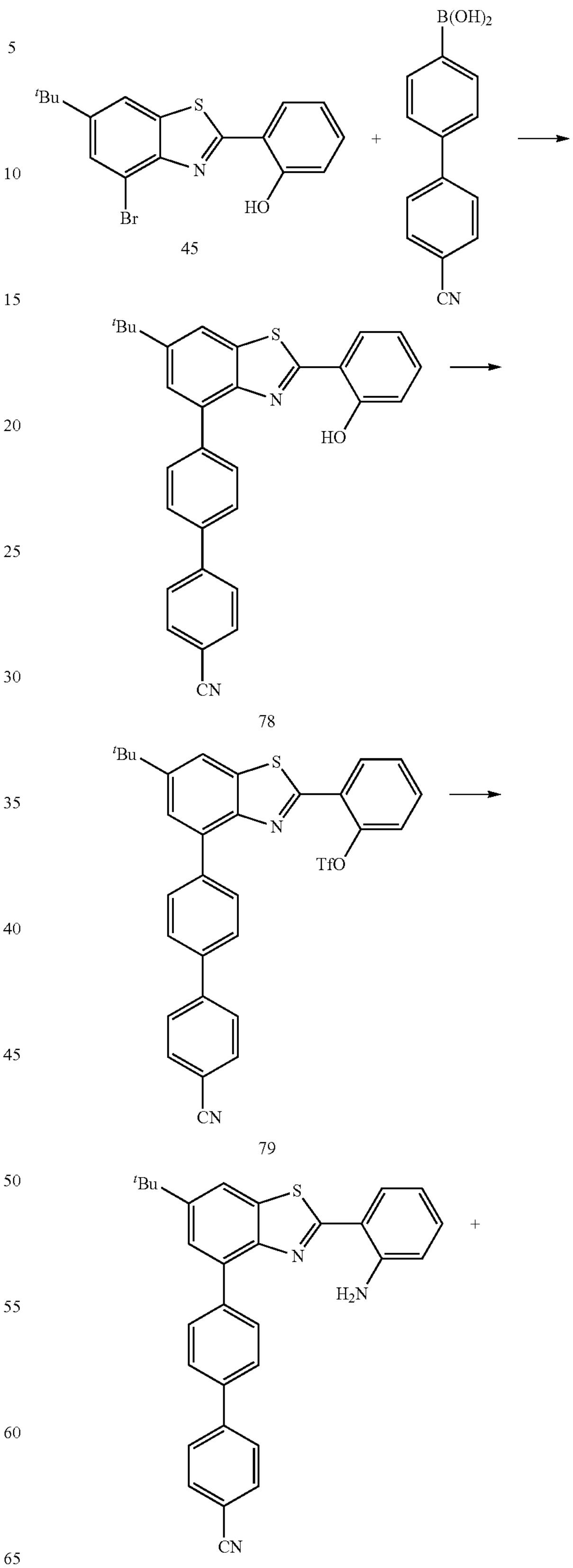

45, 78, 79, 80

-continued

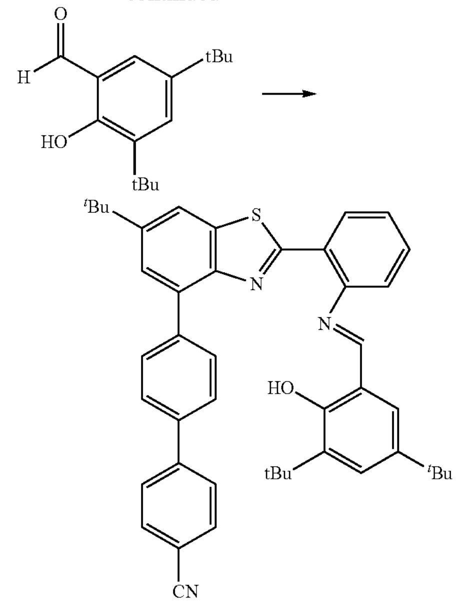

81

Synthesis of Intermediate 78

The same procedure as in the synthesis of Intermediate 7 of Intermediate Synthetic Example 3 was performed except for using Intermediate 45 (4.0 g, 11.04 mmol) instead of Intermediate 6 to obtain Intermediate 78 (4.5 g, 88.4%).

Synthesis of Intermediate 79

The same procedure as in the synthesis of Intermediate 8 of Intermediate Synthetic Example 3 was performed except for using Intermediate 78 (4.5 g, 9.77 mmol) instead of Intermediate 7 to obtain Intermediate 79 (4.2 g, 72.6%).

Synthesis of Intermediate 80

The same procedure as in the synthesis of Intermediate 9 of Intermediate Synthetic Example 3 was performed except for using Intermediate 79 (4.2 g, 7.09 mmol) instead of Intermediate 8 to obtain Intermediate 80 (1.6 g, 49.1%).

Synthesis of Intermediate 81

The same procedure as in the synthesis of Intermediate 10 of Intermediate Synthetic Example 3 was performed except for using Intermediate 80 (1.6 g, 3.48 mmol) instead of Intermediate 9 to obtain Intermediate 81 (2.1 g, 89.2%).

Intermediate Synthetic Example 22: Synthesis of Intermediate 85

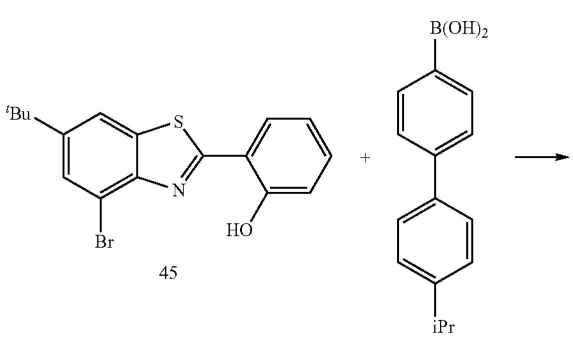

45

-continued

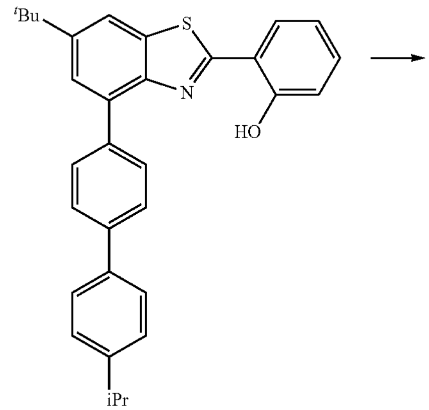

82

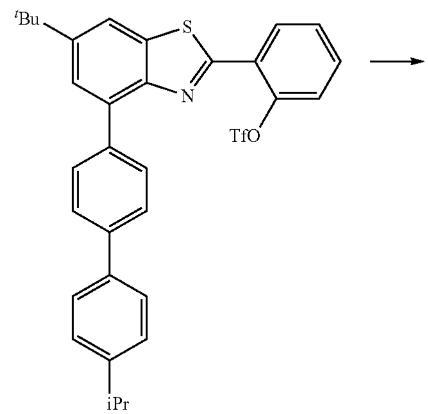

83

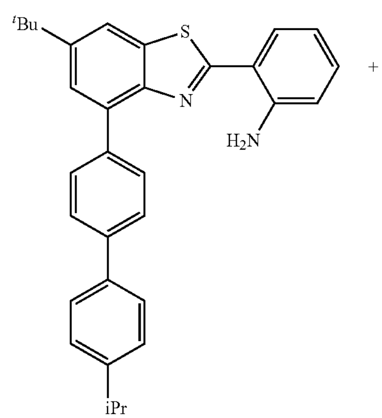

84

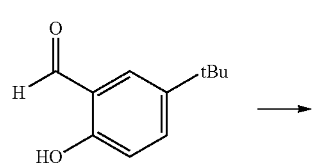

-continued

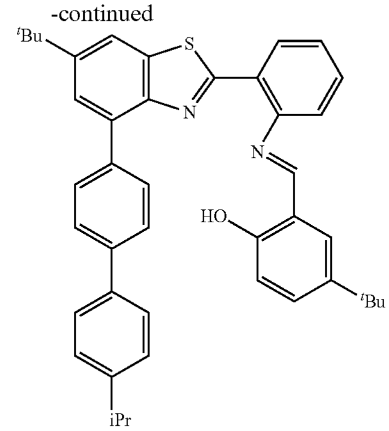

85

Synthesis of Intermediate 82

The same procedure as in the synthesis of Intermediate 7 of Intermediate Synthetic Example 3 was performed except for using Intermediate 45 (4.0 g, 11.04 mmol) instead of Intermediate 6 to obtain Intermediate 82 (4.5 g, 85.3%).

Synthesis of Intermediate 83

The same procedure as in the synthesis of Intermediate 8 of Intermediate Synthetic Example 3 was performed except for using Intermediate 82 (4.5 g, 9.42 mmol) instead of Intermediate 7 to obtain Intermediate 83 (4.2 g, 73.1%).

Synthesis of Intermediate 84

The same procedure as in the synthesis of Intermediate 9 of Intermediate Synthetic Example 3 was performed except for using Intermediate 83 (4.2 g, 6.89 mmol) instead of Intermediate 8 to obtain Intermediate 84 (1.6 g, 48.7%).

Synthesis of Intermediate 85

The same procedure as in the synthesis of Intermediate 10 of Intermediate Synthetic Example 3 was performed except for using Intermediate 84 (1.6 g, 3.36 mmol) instead of Intermediate 9 to obtain Intermediate 85 (2.1 g, 98.2%).

Intermediate Synthetic Example 23: Synthesis of Intermediate 89

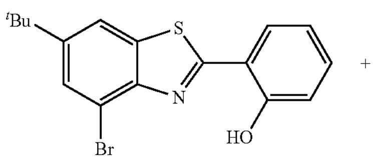

45

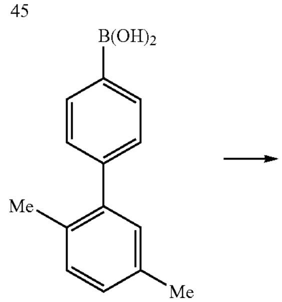

-continued

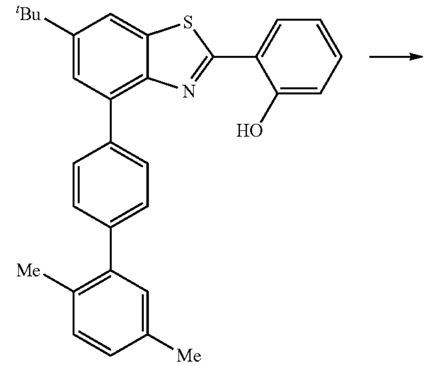

86

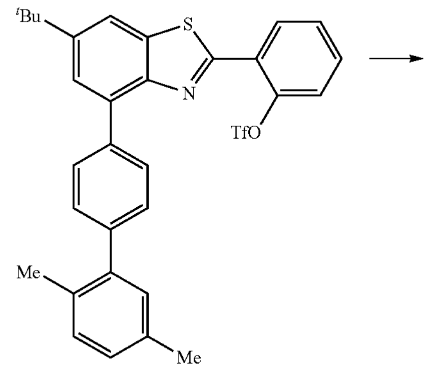

87

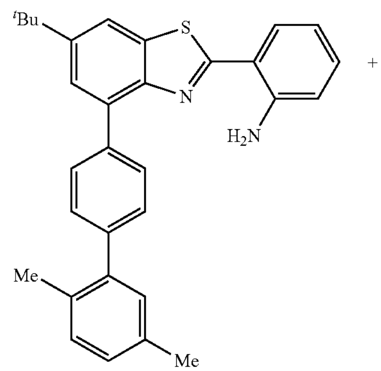

88

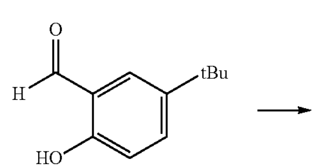

-continued

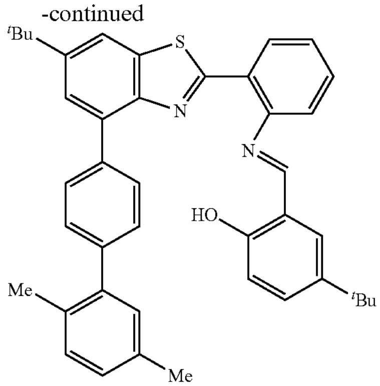

89

Synthesis of Intermediate 86

The same procedure as in the synthesis of Intermediate 7 of Intermediate Synthetic Example 3 was performed except for using Intermediate 45 (4.0 g, 11.04 mmol) instead of Intermediate 6 to obtain Intermediate 86 (3.9 g, 76.1%).

Synthesis of Intermediate 87

The same procedure as in the synthesis of Intermediate 8 of Intermediate Synthetic Example 3 was performed except for using Intermediate 86 (3.9 g, 8.41 mmol) instead of Intermediate 7 to obtain Intermediate 87 (4.0 g, 79.8%).

Synthesis of Intermediate 88

The same procedure as in the synthesis of Intermediate 9 of Intermediate Synthetic Example 3 was performed except for using Intermediate 87 (4.0 g, 6.71 mmol) instead of Intermediate 8 to obtain Intermediate 88 (2.1 g, 67.6%).

Synthesis of Intermediate 89

The same procedure as in the synthesis of Intermediate 10 of Intermediate Synthetic Example 3 was performed except for using Intermediate 88 (2.1 g, 4.54 mmol) instead of Intermediate 9 to obtain Intermediate 89 (2.0 g, 70.7%).

Intermediate Synthetic Example 24: Synthesis of Intermediate 93

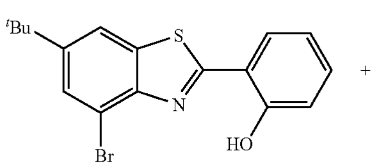

45

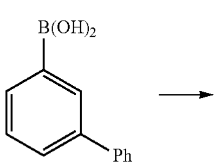

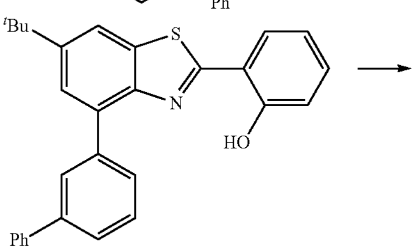

90

-continued

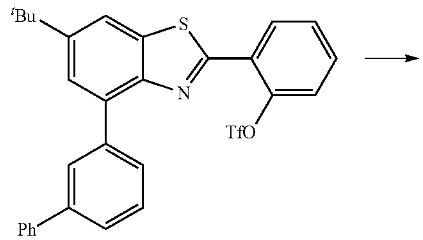

91

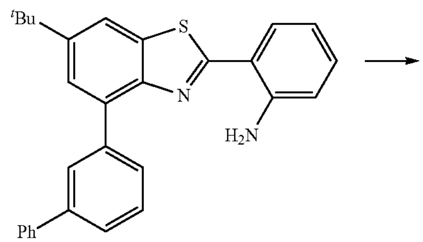

92

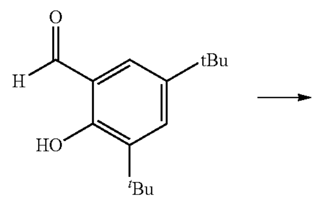

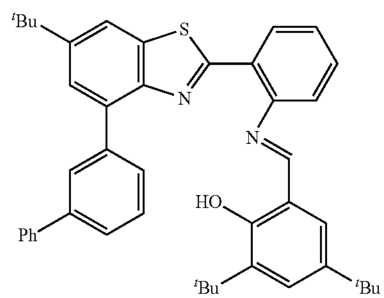

93

Synthesis of Intermediate 90

The same procedure as in the synthesis of Intermediate 7 of Intermediate Synthetic Example 3 was performed except for using Intermediate 45 (4.0 g, 11.04 mmol) instead of Intermediate 6 to obtain Intermediate 90 (3.5 g, 72.7%).

Synthesis of Intermediate 91

The same procedure as in the synthesis of Intermediate 8 of Intermediate Synthetic Example 3 was performed except for using Intermediate 90 (3.5 g, 8.04 mmol) instead of Intermediate 7 to obtain Intermediate 91 (4.0 g, 87.7%).

Synthesis of Intermediate 92

The same procedure as in the synthesis of Intermediate 9 of Intermediate Synthetic Example 3 was performed except for using Intermediate 91 (4.0 g, 7.05 mmol) instead of Intermediate 8 to obtain Intermediate 92 (1.9 g, 62.0%).

Synthesis of Intermediate 93

The same procedure as in the synthesis of Intermediate 10 of Intermediate Synthetic Example 3 was performed except for using Intermediate 92 (1.9 g, 4.37 mmol) instead of Intermediate 9 to obtain Intermediate 93 (2.0 g, 70.2%).

Intermediate Synthetic Example 25: Synthesis of Intermediate 97

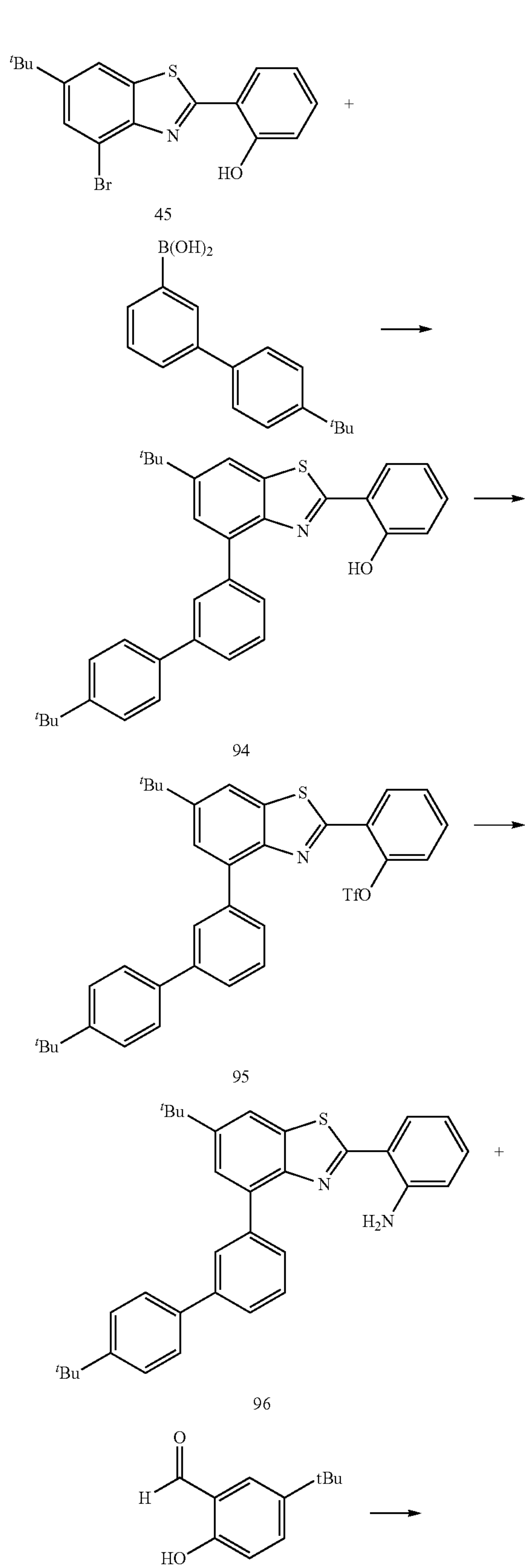 [SMILES: CC(C)(C)c1cc(Br)c2nc(-c3ccccc3O)sc2c1 ; CC(C)(C)c1ccc(-c2cccc(B(O)O)c2)cc1 ; CC(C)(C)c1ccc(-c2cccc(-c3cc(C(C)(C)C)cc4sc(-c5ccccc5O)nc34)c2)cc1 ; CC(C)(C)c1ccc(-c2cccc(-c3cc(C(C)(C)C)cc4sc(-c5ccccc5OS(=O)(=O)C(F)(F)F)nc34)c2)cc1 ; CC(C)(C)c1ccc(-c2cccc(-c3cc(C(C)(C)C)cc4sc(-c5ccccc5N)nc34)c2)cc1 ; CC(C)(C)c1ccc(O)c(C=O)c1]

45, 94, 95, 96

-continued

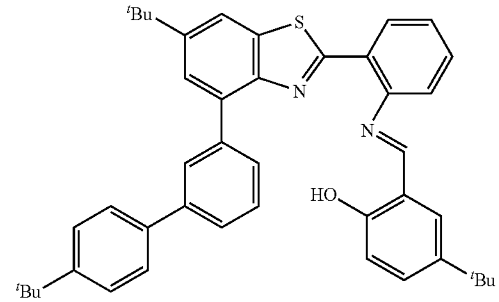

97

Synthesis of Intermediate 94

The same procedure as in the synthesis of Intermediate 7 of Intermediate Synthetic Example 3 was performed except for using Intermediate 45 (4.0 g, 11.04 mmol) instead of Intermediate 6 to obtain Intermediate 94 (4.0 g, 73.6%).

Synthesis of Intermediate 95

The same procedure as in the synthesis of Intermediate 8 of Intermediate Synthetic Example 3 was performed except for using Intermediate 94 (4.0 g, 8.14 mmol) instead of Intermediate 7 to obtain Intermediate 95 (4.1 g, 80.8%).

Synthesis of Intermediate 96

The same procedure as in the synthesis of Intermediate 9 of Intermediate Synthetic Example 3 was performed except for using Intermediate 95 (4.1 g, 6.57 mmol) instead of Intermediate 8 to obtain Intermediate 96 (2.1 g, 65.1%).

Synthesis of Intermediate 97

The same procedure as in the synthesis of Intermediate 10 of Intermediate Synthetic Example 3 was performed except for using Intermediate 96 (2.1 g, 4.28 mmol) instead of Intermediate 9 to obtain Intermediate 97 (1.9 g, 68.2%).

Intermediate Synthetic Example 26: Synthesis of Intermediate 101

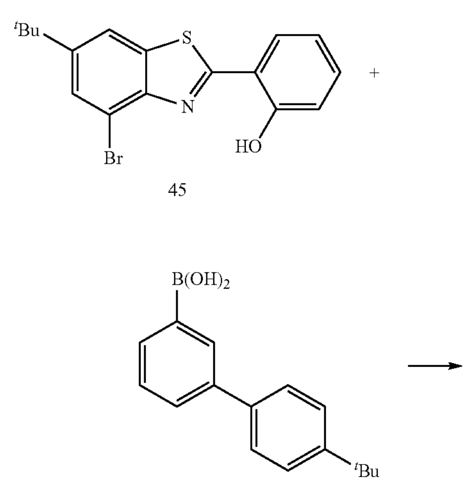

45

-continued

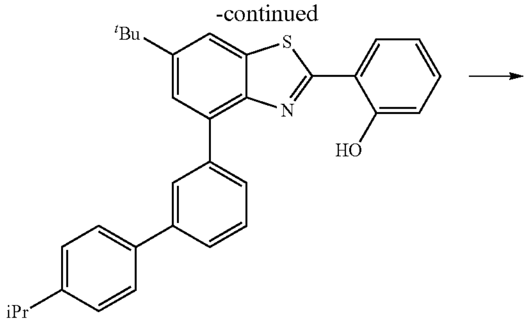

98

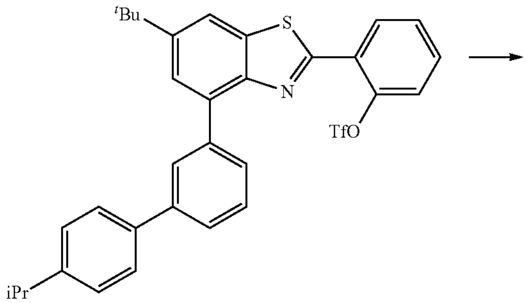

99

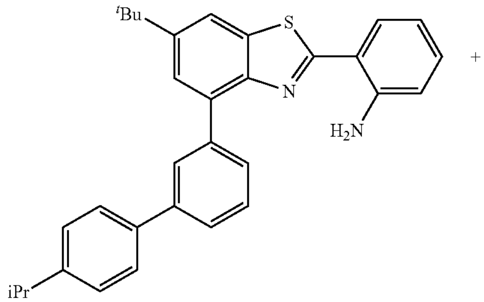

100

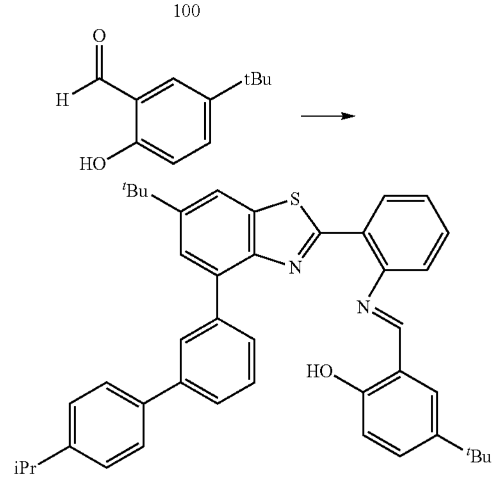

101

Synthesis of Intermediate 98

The same procedure as in the synthesis of Intermediate 7 of Intermediate Synthetic Example 3 was performed except for using Intermediate 45 (4.0 g, 11.04 mmol) instead of Intermediate 6 to obtain Intermediate 98 (3.7 g, 70.1%).

Synthesis of Intermediate 99

The same procedure as in the synthesis of Intermediate 8 of Intermediate Synthetic Example 3 was performed except for using Intermediate 98 (3.7 g, 7.75 mmol) instead of Intermediate 7 to obtain Intermediate 99 (4.5 g, 95.2%).

Synthesis of Intermediate 100

The same procedure as in the synthesis of Intermediate 9 of Intermediate Synthetic Example 3 was performed except for using Intermediate 99 (4.5 g, 7.38 mmol) instead of Intermediate 8 to obtain Intermediate 100 (2.5 g, 71.0%).

Synthesis of Intermediate 101

The same procedure as in the synthesis of Intermediate 10 of Intermediate Synthetic Example 3 was performed except for using Intermediate 100 (2.5 g, 5.24 mmol) instead of Intermediate 9 to obtain Intermediate 101 (2.5 g, 74.8%).

Intermediate Synthetic Example 27: Synthesis of Intermediate 105

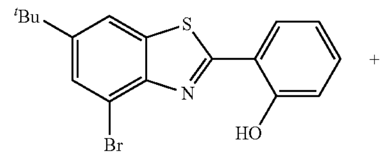

45

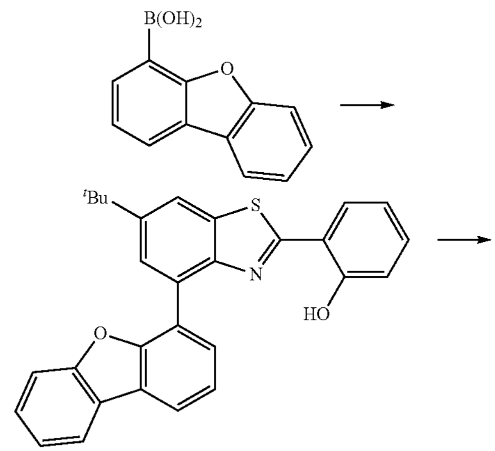

102

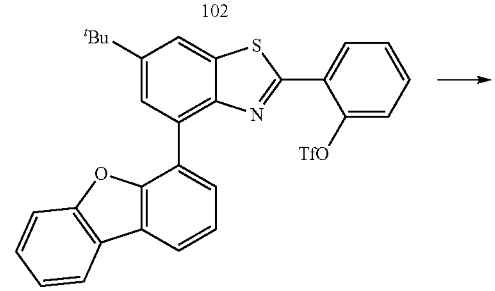

103

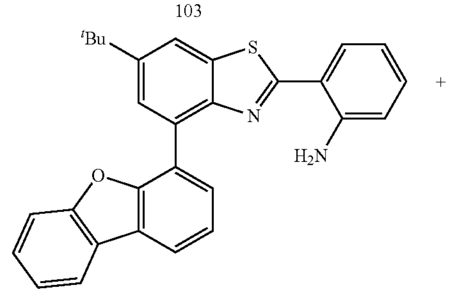

104

-continued

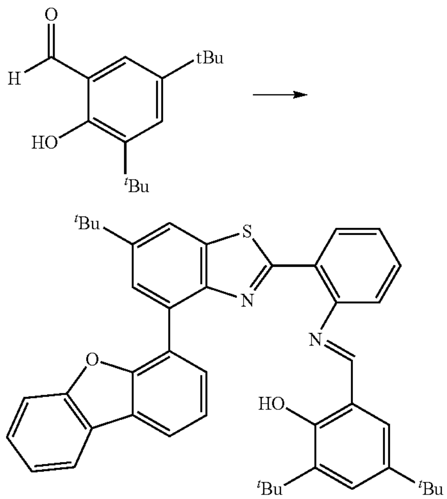

105

Synthesis of Intermediate 102

The same procedure as in the synthesis of Intermediate 7 of Intermediate Synthetic Example 3 was performed except for using Intermediate 45 (4.0 g, 11.04 mmol) instead of Intermediate 6 to obtain Intermediate 102 (4.0 g, 80.5%).

Synthesis of Intermediate 103

The same procedure as in the synthesis of Intermediate 8 of Intermediate Synthetic Example 3 was performed except for using Intermediate 102 (4.0 g, 8.90 mmol) instead of Intermediate 7 to obtain Intermediate 103 (4.2 g, 81.1%).

Synthesis of Intermediate 104

The same procedure as in the synthesis of Intermediate 9 of Intermediate Synthetic Example 3 was performed except for using Intermediate 103 (4.2 g, 7.22 mmol) instead of Intermediate 8 to obtain Intermediate 104 (2.6 g, 80.2%).

Synthesis of Intermediate 105

The same procedure as in the synthesis of Intermediate 10 of Intermediate Synthetic Example 3 was performed except for using Intermediate 104 (2.6 g, 5.80 mmol) instead of Intermediate 9 to obtain Intermediate 105 (2.1 g, 54.4%).

Intermediate Synthetic Example 28: Synthesis of Intermediate 109

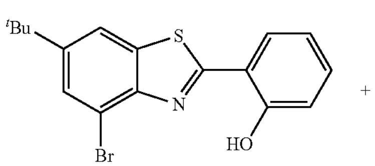

45

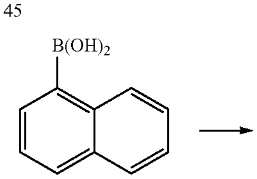

-continued

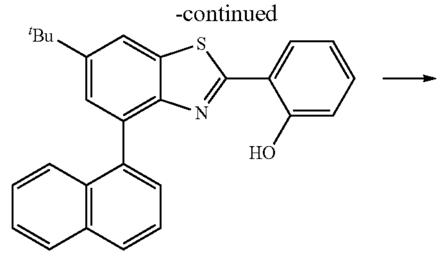

106

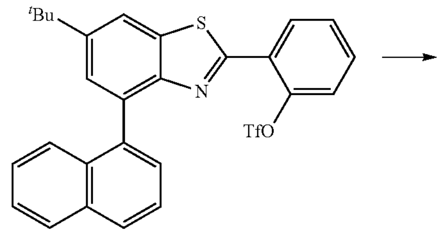

107

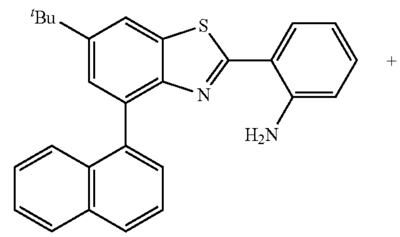

108

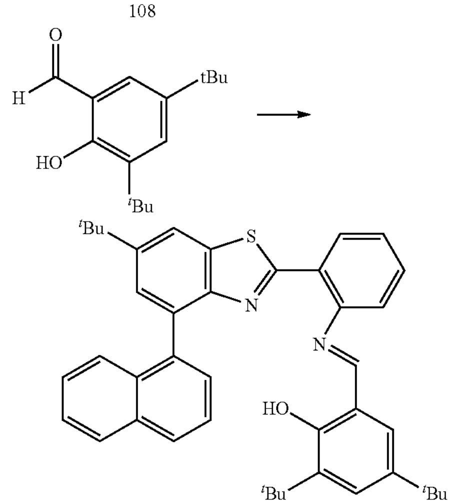

109

Synthesis of Intermediate 106

The same procedure as in the synthesis of Intermediate 7 of Intermediate Synthetic Example 3 was performed except for using Intermediate 45 (4.0 g, 11.04 mmol) instead of Intermediate 6 to obtain Intermediate 106 (3.9 g, 86.2%).

Synthesis of Intermediate 107

The same procedure as in the synthesis of Intermediate 8 of Intermediate Synthetic Example 3 was performed except for using Intermediate 106 (3.9 g, 9.52 mmol) instead of Intermediate 7 to obtain Intermediate 107 (4.5 g, 87.2%).

Synthesis of Intermediate 108

The same procedure as in the synthesis of Intermediate 9 of Intermediate Synthetic Example 3 was performed except for using Intermediate 107 (4.5 g, 8.31 mmol) instead of Intermediate 8 to obtain Intermediate 108 (2.7 g, 79.5%).

Synthesis of Intermediate 109

The same procedure as in the synthesis of Intermediate 10 of Intermediate Synthetic Example 3 was performed except for using Intermediate 108 (2.7 g, 6.61 mmol) instead of Intermediate 9 to obtain Intermediate 109 (3.1 g, 75.0%).

Intermediate Synthetic Example 29: Synthesis of Intermediate 113

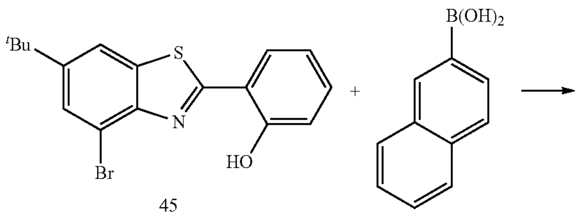

45

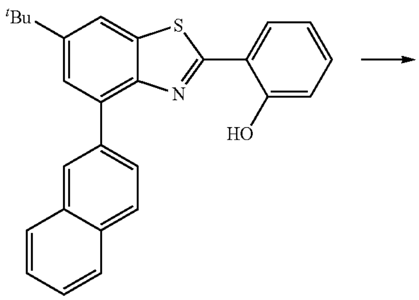

110

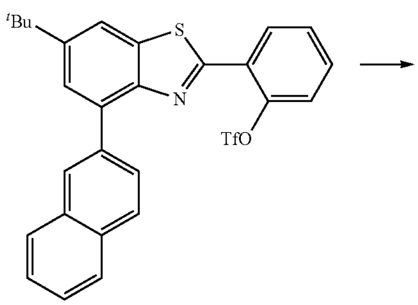

111

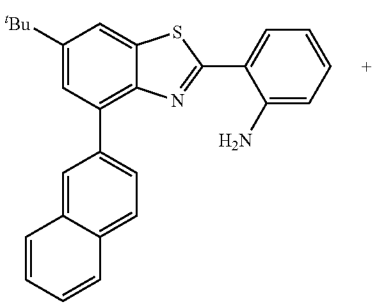

112

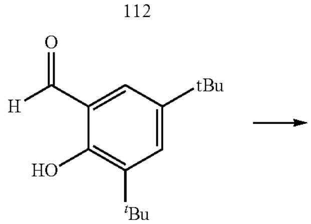

-continued

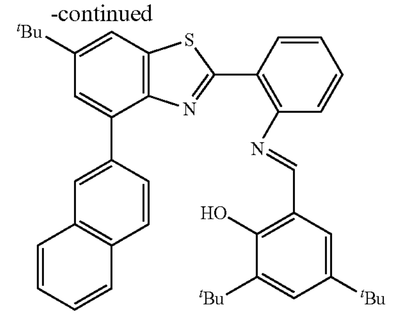

113

Synthesis of Intermediate 110

The same procedure as in the synthesis of Intermediate 7 of Intermediate Synthetic Example 3 was performed except for using Intermediate 45 (4.0 g, 11.04 mmol) instead of Intermediate 6 to obtain Intermediate 110 (4.2 g, 92.8%).

Synthesis of Intermediate 111

The same procedure as in the synthesis of Intermediate 8 of Intermediate Synthetic Example 3 was performed except for using Intermediate 110 (4.2 g, 10.26 mmol) instead of Intermediate 7 to obtain Intermediate 111 (5.1 g, 91.8%).

Synthesis of Intermediate 112

The same procedure as in the synthesis of Intermediate 9 of Intermediate Synthetic Example 3 was performed except for using Intermediate 111 (5.1 g, 9.42 mmol) instead of Intermediate 8 to obtain Intermediate 112 (3.6 g, 93.5%).

Synthesis of Intermediate 113

The same procedure as in the synthesis of Intermediate 10 of Intermediate Synthetic Example 3 was performed except for using Intermediate 112 (3.6 g, 8.81 mmol) instead of Intermediate 9 to obtain Intermediate 113 (4.6 g, 83.5%).

Intermediate Synthetic Example 30: Synthesis of Intermediate 117

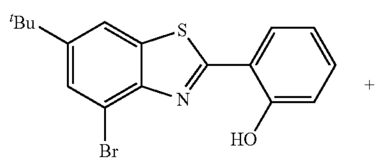

45

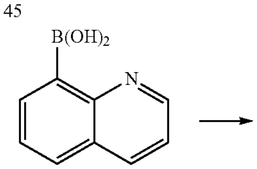

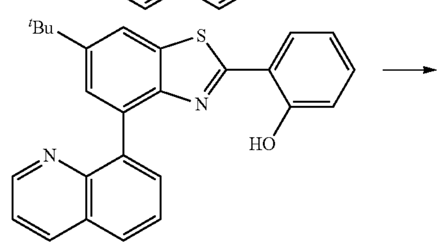

114

-continued

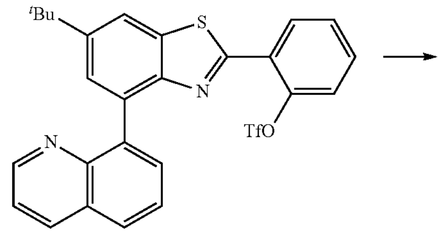

115

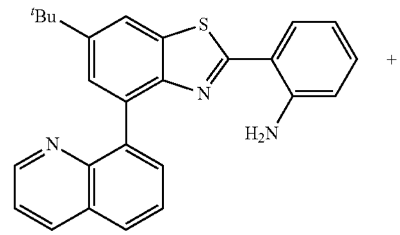

116

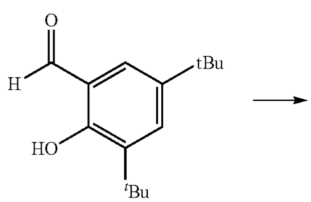

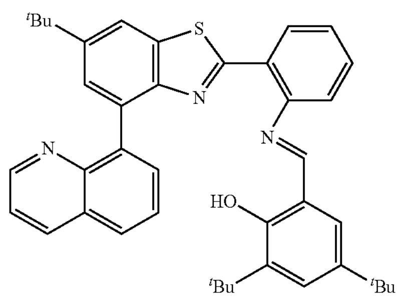

117

Synthesis of Intermediate 114

The same procedure as in the synthesis of Intermediate 7 of Intermediate Synthetic Example 3 was performed except for using Intermediate 45 (5.0 g, 13.80 mmol) instead of Intermediate 6 to obtain Intermediate 114 (5.1 g, 90.0%).

Synthesis of Intermediate 115

The same procedure as in the synthesis of Intermediate 8 of Intermediate Synthetic Example 3 was performed except for using Intermediate 114 (5.1 g, 12.42 mmol) instead of Intermediate 7 to obtain Intermediate 115 (6.1 g, 90.5%).

Synthesis of Intermediate 116

The same procedure as in the synthesis of Intermediate 9 of Intermediate Synthetic Example 3 was performed except for using Intermediate 115 (6.1 g, 11.24 mmol) instead of Intermediate 8 to obtain Intermediate 116 (1.9 g, 41.2%).

Synthesis of Intermediate 117

The same procedure as in the synthesis of Intermediate 10 of Intermediate Synthetic Example 3 was performed except for using Intermediate 116 (1.9 g, 4.64 mmol) instead of Intermediate 9 to obtain Intermediate 117 (2.0 g, 68.8%).

Intermediate Synthetic Example 31: Synthesis of Intermediate 121

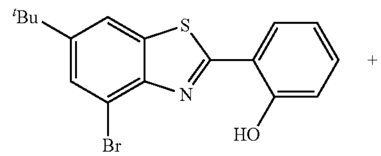

45

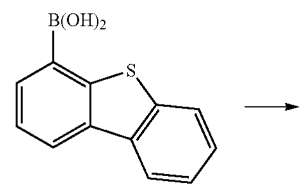

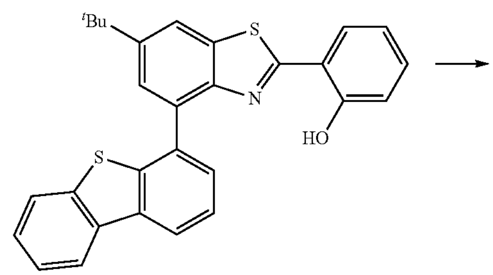

118

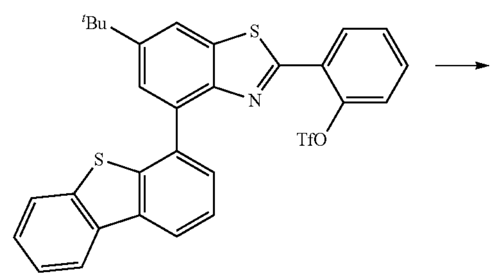

119

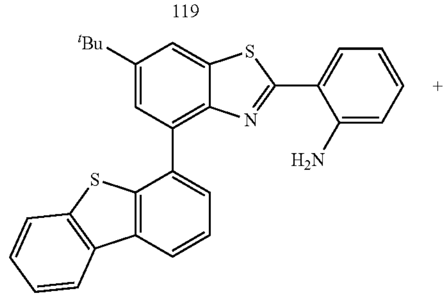

120

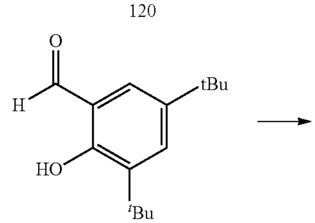

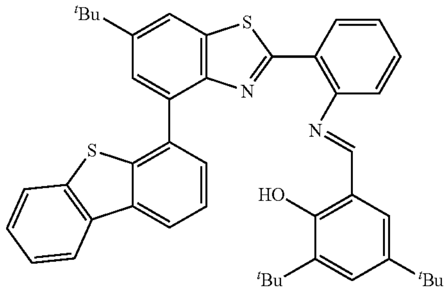

121

Synthesis of Intermediate 118

The same procedure as in the synthesis of Intermediate 7 of Intermediate Synthetic Example 3 was performed except for using Intermediate 45 (4.0 g, 11.04 mmol) instead of Intermediate 6 to obtain Intermediate 118 (4.6 g, 89.4%).

Synthesis of Intermediate 119

The same procedure as in the synthesis of Intermediate 8 of Intermediate Synthetic Example 3 was performed except for using Intermediate 118 (4.6 g, 9.88 mmol) instead of Intermediate 7 to obtain Intermediate 119 (4.5 g, 76.2%).

Synthesis of Intermediate 120

The same procedure as in the synthesis of Intermediate 9 of Intermediate Synthetic Example 3 was performed except for using Intermediate 119 (4.5 g, 7.53 mmol) instead of Intermediate 8 to obtain Intermediate 120 (2.6 g, 74.3%).

Synthesis of Intermediate 121

The same procedure as in the synthesis of Intermediate 10 of Intermediate Synthetic Example 3 was performed except for using Intermediate 120 (2.6 g, 5.60 mmol) instead of Intermediate 9 to obtain Intermediate 121 (2.0 g, 52.4%).

Intermediate Synthetic Example 32: Synthesis of Intermediate 130

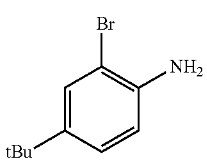

41

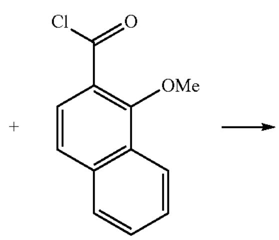

122

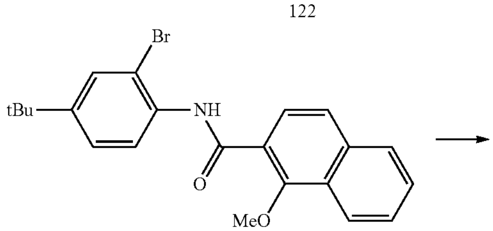

123

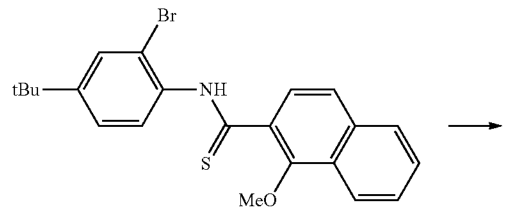

124

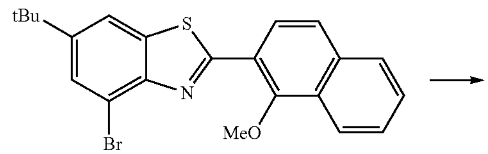

125

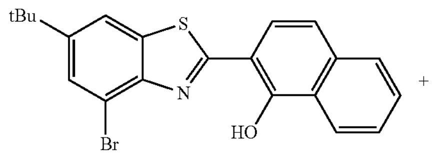

126

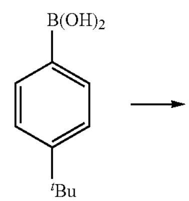

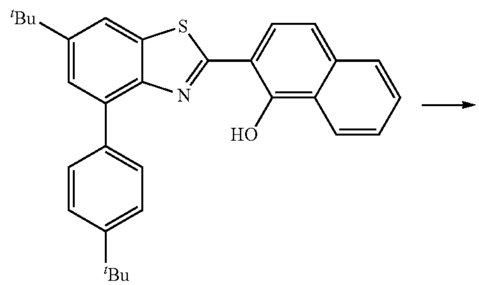

127

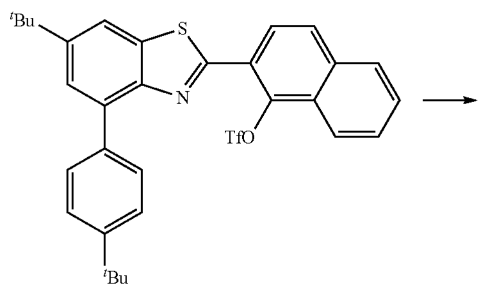

128

-continued

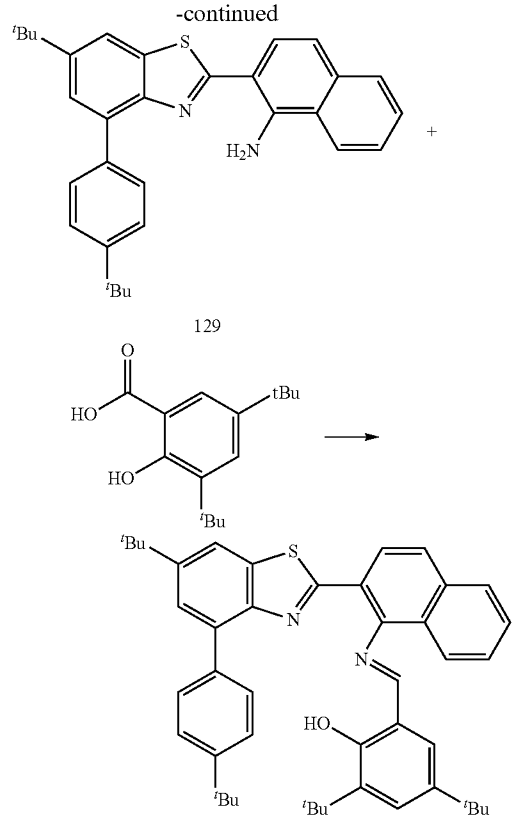

129

130

Synthesis of Intermediate 123

99.7 g (0.437 mol) of Intermediate 41 and 997 ml of tetrahydrofuran were added. 100.2 g (0.454 mol) of Intermediate 122 was dissolved in 506 ml of tetrahydrofuran and then, was slowly added thereto, followed by stirring for about 2 hours. After finishing the reaction, solvents were removed by distillation under a reduced pressure. The resultant product was extracted using EA and a sodium carbonate aqueous solution, and water was removed with $MgSO_4$. Solvents were removed by distillation under a reduced pressure, and the resultant product was solidified to obtain 155.6 g (86.4%) of ivory Intermediate 123.

Synthesis of Intermediate 124

110.0 g (0.266 mol) of Intermediate 123, 129.5 g (0.320 mol) of Lawesson's reagent, and 1773 ml of toluene were added and refluxed at about 105° C. all day. After finishing the reaction, solvents were distilled under a reduced pressure. The crude product thus obtained was separated by chromatography (MC:HEX=1:3) to obtain 114.0 g (100%) of a yellow oil Intermediate 124.

Synthesis of Intermediate 125

62.0 g (0.145 mol) of Intermediate 124, 580.0 ml (1.159 mol) of 2 M NaOH, and 30.0 ml (0.508 mol) of ethanol were added, and 483.0 ml (0.579 mol) of 1.2 M $K_3[Fe(CN)_6]$ was slowly added thereto, followed by stirring at about 100° C. for four days. After finishing the reaction, the solid thus obtained was filtered with water, the solid was dissolved in $CHCl_3$, and then, water was removed with $MgSO_4$. The resultant product was separated by chromatography ($CHCl_3$: Hex=1:5) to obtain 14.0 g (22.7%) of orange oil Intermediate 125.

Synthesis of Intermediate 126

14.0 g (32.8 mmol) of Intermediate 125 and 75.9 g (656.7 mmol) of pyridine hydrochloride were stirred at about 180° C. for about 1 hour. After finishing the reaction, the resultant product was poured into ice water and basified with a $Na_2CO_3$ saturated solution, followed by stirring at room temperature for about 20 minutes. The resultant product was extracted with $CHCl_3$, water was removed with $MgSO_4$, and solvents were removed by distillation under a reduced pressure. The crude product thus obtained was solidified with methanol to obtain 9.79 g (yield 72.3%) of yellow Intermediate 126.

Synthesis of Intermediate 127

3.0 g (7.27 mmol) of Intermediate 126, 1.55 g (8.73 mmol) of 4-tert-butylphenylboronic acid, 0.42 g (0.36 mmol) of $Pd(PPh_3)_4$, 15.0 ml (29.1 mmol) of 2 M $K_2CO_3$, 15.0 ml of ethanol and 30 ml of toluene were added, followed by stirring at about 80° C. all day. After finishing the reaction, the reaction product was passed via a celite pad using EA, and then, was extracted with EA. Water was removed with $MgSO_4$, and solvents were removed by distillation under a reduced pressure. The crude product was separated by column chromatography ($CHCl_3$:HEX=1:3) to obtain 3.38 g (100%) of yellow solid Intermediate 127.

Synthesis of Intermediate 128

3.38 g (7.26 mmol) of Intermediate 127, 1.8 ml (21.8 mmol) of pyridine and 73 ml of MC were added, followed by cooling to about 0° C. 1.47 ml (8.71 mmol) of trifluoromethanesulfonic acid was slowly added thereto dropwisely, followed by stirring at about 0° C. for about 10 minutes, and then, at room temperature all day. After finishing the reaction, the resultant product was extracted with MC, and water was removed with $MgSO_4$. Solvents were removed by distillation under a reduced pressure. The crude product was separated by column chromatography ($CHCl_3$: HEX=1:2) to obtain 4.13 g (94.7%) of ivory solid Intermediate 128.

Synthesis of Intermediate 129

4.10 g (6.86 mmol) of Intermediate 128, 0.20 g (0.34 mmol) of $Pd(dba)_2$, 0.43 g (0.69 mmol) of BINAP, 6.70 g (20.6 mmol) of $Cs_2CO_3$ and 35 ml of toluene were added, and 1.40 ml (8.23 mmol) of benzophenone imine was added thereto, followed by refluxing all day. Solvents were removed by distillation under a reduced pressure. 50 ml of THF and 50 ml of 6 M HCl were slowly added thereto dropwisely, followed by stirring at about 70° C. all day. The reaction product was basified (pH>8) using a $Na_2CO_3$ saturated solution and extracted with EA, and then, water was removed with $MgSO_4$. Solvents were removed by distillation under a reduced pressure. The crude product was separated by column chromatography (EA:HEX=1:100) and then, solidified with methanol to obtain 1.54 g (48.3%) of yellow Intermediate 129.

Synthesis of Intermediate 130

1.35 g (2.91 mmol) of Intermediate 129, 1.02 g (4.35 mmol) of 3,5-di-tert-butylsalicylaidehyde, 55 mg (0.29 mmol) of p-toluenesulfonic acid and 29 ml of toluene were added, followed by refluxing for about 3 hours. After finishing the reaction, solvents were removed by distillation under a reduced pressure, and the resultant product was solidified with methanol to obtain 1.82 g (92.1%) of yellow Intermediate 130.

Intermediate Synthetic Example 33: Synthesis of Intermediate 135

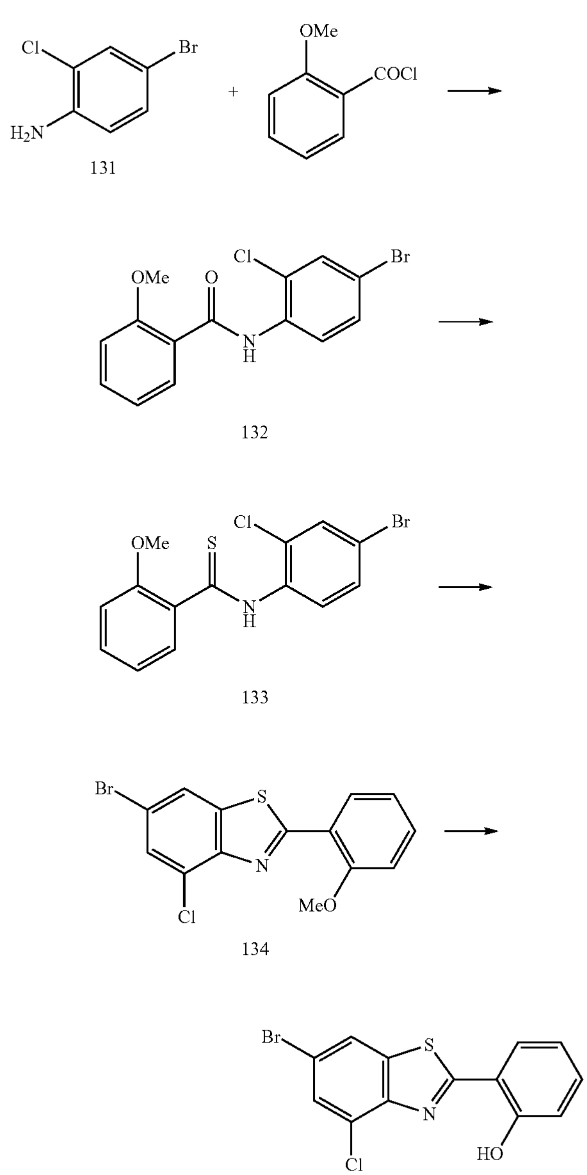

131, 132, 133, 134, 135

Synthesis of Intermediate 132

The same procedure as in the synthesis of Intermediate 1 of Intermediate Synthetic Example 1 was performed except for using Intermediate 131 (100.0 g, 484.34 mmol) instead of 2,6-dibromoaniline to obtain Intermediate 132 (150 g, 90.9%).

Synthesis of Intermediate 134

The same procedure as in the synthesis of Intermediate 26 of Intermediate Synthetic Example 7 was performed except for using Intermediate 132 (150 g, 440.40 mmol) instead of Intermediate 24 to obtain Intermediate 134 (82.6 g, 52.8%).

Synthesis of Intermediate 135

The same procedure as in the synthesis of Intermediate 45 of Intermediate Synthetic Example 12 was performed except for using Intermediate 134 (82.6 g, 232.91 mmol) instead of Intermediate 44 to obtain Intermediate 135 (63.9 g, 80.5%).

Intermediate Synthetic Example 34: Synthesis of Intermediate 140

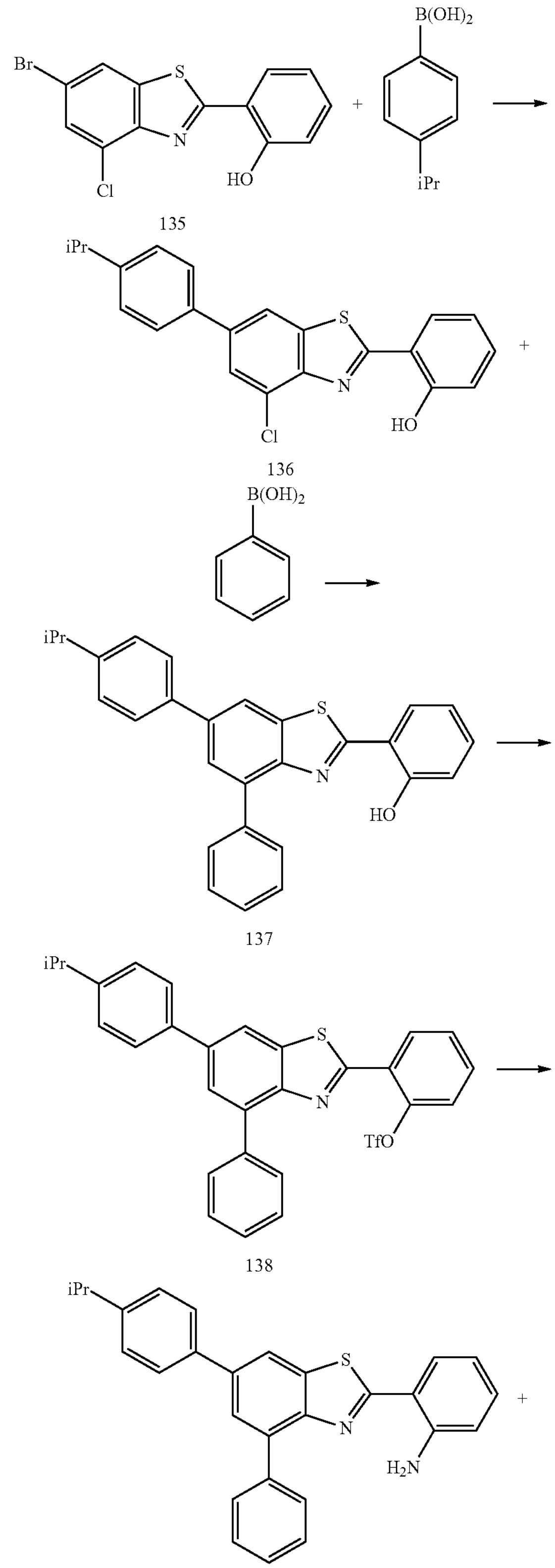

135, 136, 137, 138, 139

-continued

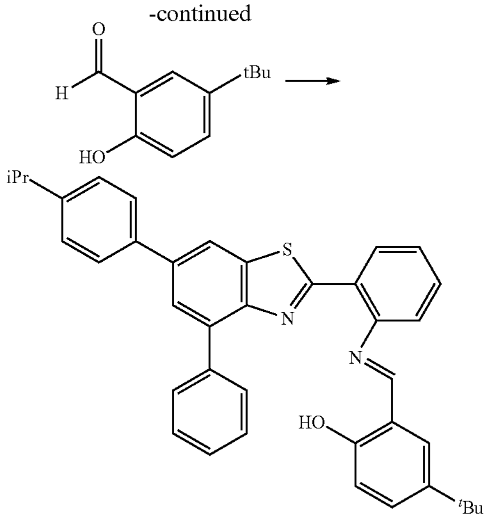

140

Synthesis of Intermediate 136

2.5 g (7.34 mmol) of Intermediate 135, 1.2 g (7.71 mmol) of 4-isopropylphenylboronic acid, 254.4 mg (0.220 mmol) of $Pd(PPh_3)_4$, 15.0 ml (22.02 mmol) of 2 M $K_2CO_3$, 10.0 ml of ethanol and 40.0 ml of toluene were added, followed by stirring at about 80 C all day. After finishing the reaction, the resultant product was passed via a celite pad with EA and extracted with EA, and then, water was removed with $MgSO_4$. Solvents were removed by distillation under a reduced pressure. The crude product was separated by column chromatography ($CHCl_3$:HEX=1:3) to obtain 2.7 g (96.8%) of yellow Intermediate 136.

Synthesis of Intermediate 137

2.7 g (7.11 mmol) of Intermediate 136, 1.7 g (14.2 mmol) of 1-phenylboronic acid, 408 mg (0.71 mmol) of $Pd(dba)_3$, 200 mg (1.42 mmol) of SPhos, 4.53 g (21.32 mmol) of $K_3PO_4$, 10 ml of $H_2O$ and 40 ml of toluene were added and refluxed all day. After finishing the reaction, the resultant product was passed via a celite pad with $CHCl_3$, and extracted with $CHCl_3$, and then, water was removed with $MgSO_4$. Solvents were removed by distillation under a reduced pressure. The crude product was separated by column chromatography ($CHCl_3$:HEX=1:1) to obtain 3.1 g (100%) of yellow oil Intermediate 137.

Synthesis of Intermediate 138

3.1 g (7.35 mmol) of Intermediate 137, 1.7 ml (22.06 mmol) of pyridine and 36 ml of MC were added, followed by cooling to about 0° C. 1.4 ml (8.82 mmol) of trifluoromethanesulfonic acid was slowly added thereto dropwisely, followed by stirring at about 0° C. for about 10 minutes, and then, at room temperature all day. After finishing the reaction, the resultant product was extracted with MC, and water was removed with $MgSO_4$. Solvents were removed by distillation under a reduced pressure. The crude product was separated by column chromatography ($CHCl_3$) to obtain 4.0 g (99.9%) of white solid Intermediate 138.

Synthesis of Intermediate 139

4.0 g (6.61 mmol) of Intermediate 138, 207 mg (0.36 mmol) of $Pd(dba)_2$, 449 mg (0.722 mmol) of BINAP, 7.0 g (21.68 mmol) of $Cs_2CO_3$ and 36 ml of toluene were added, and 1.57 g (8.67 mmol) of benzophenone imine was added thereto, followed by refluxing all day. Solvents were removed by distillation under a reduced pressure. 66.0 ml of THF and 66.0 ml of 6 M HCl were slowly added thereto dropwisely, followed by stirring at about room temperature for about 2 hours. The reaction product was basified (pH>8) using a $Na_2CO_3$ saturated solution and extracted with $CHCl_3$, and then, water was removed with $MgSO_4$. Solvents were removed by distillation under a reduced pressure. The crude product was separated by column chromatography (EA:MC:HEX=1:1:50) to obtain 1.69 g (55.6%) of yellow solid Intermediate 139.

Synthesis of Intermediate 140

1.69 g (4.02 mmol) of Intermediate 139, 1.07 g (6.03 mmol) of 5-di-tert-butylsalicylaldehyde, 69.2 mg (0.401 mmol) of p-toluenesulfonic acid and 40 ml of toluene were added, followed by refluxing all day. After finishing the reaction, solvents were removed by distillation under a reduced pressure, and the resultant product was solidified with methanol to obtain 2.3 g (98.6%) of yellow Intermediate 140.

Intermediate Synthetic Example 35: Synthesis of Intermediate 145

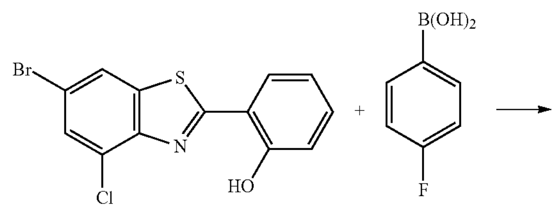

135

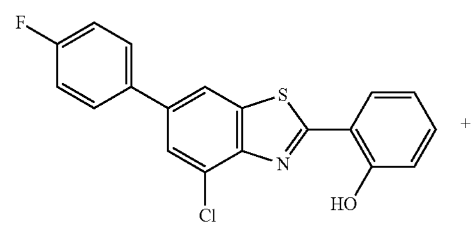

141

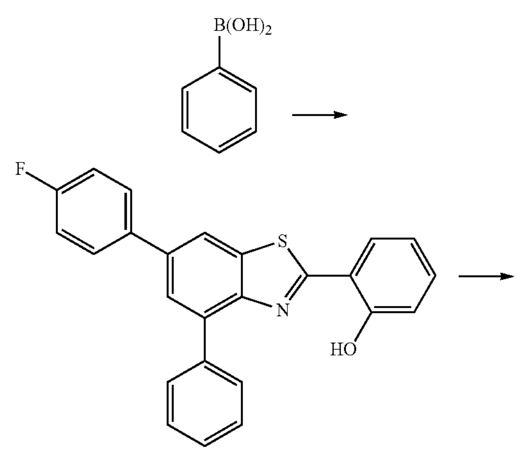

142

-continued

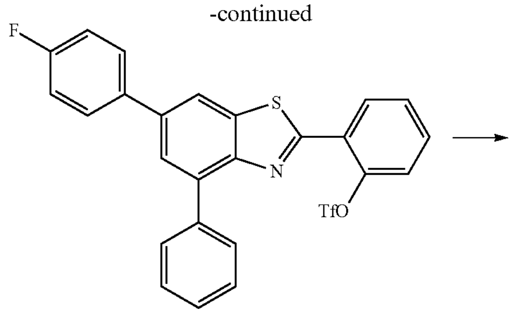

143

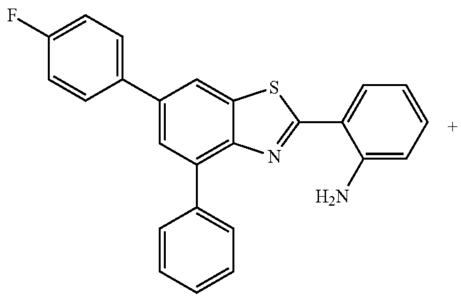

144

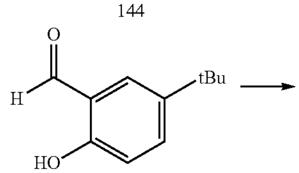

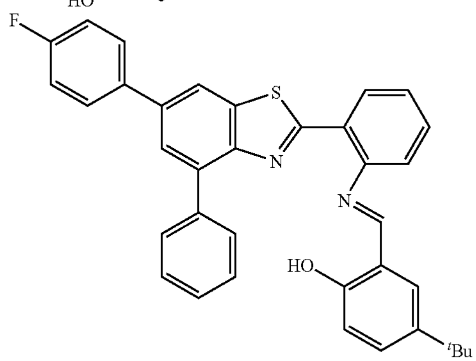

145

Synthesis of Intermediate 141

The same procedure as in the synthesis of Intermediate 136 of Intermediate Synthetic Example 34 was performed except for using Intermediate 135 (3.0 g, 8.81 mmol) to obtain Intermediate 141 (2.9 g, 92.5%).

Synthesis of Intermediate 142

The same procedure as in the synthesis of Intermediate 137 of Intermediate Synthetic Example 34 was performed except for using Intermediate 141 (2.9 g, 8.15 mmol) instead of Intermediate 136 to obtain Intermediate 142 (2.6 g, 80.2%).

Synthesis of Intermediate 143

The same procedure as in the synthesis of Intermediate 138 of Intermediate Synthetic Example 34 was performed except for using Intermediate 142 (2.6 g, 6.54 mmol) instead of Intermediate 137 to obtain Intermediate 143 (3.1 g, 89.5%).

Synthesis of Intermediate 144

The same procedure as in the synthesis of Intermediate 139 of Intermediate Synthetic Example 34 was performed except for using Intermediate 143 (3.1 g, 5.85 mmol) instead of Intermediate 138 to obtain Intermediate 144 (2.0 g, 86.1%).

Synthesis of Intermediate 145

The same procedure as in the synthesis of Intermediate 140 of Intermediate Synthetic Example 34 was performed except for using Intermediate 144 (2.0 g, 5.04 mmol) instead of Intermediate 139 to obtain Intermediate 145 (2.4 g, 85.4%).

Intermediate Synthetic Example 36: Synthesis of Intermediate 150

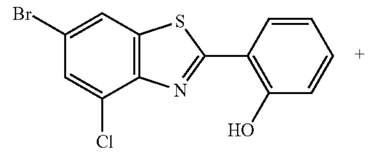

135

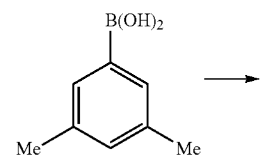

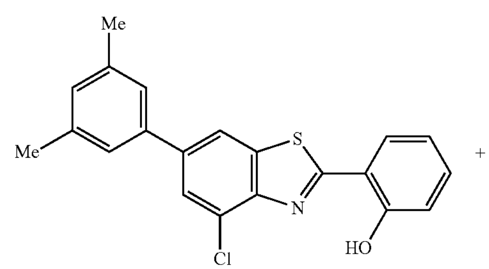

146

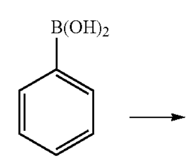

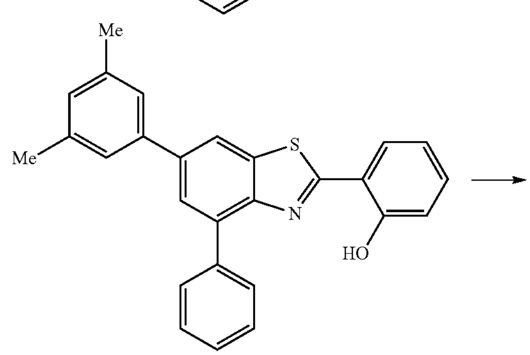

147

-continued

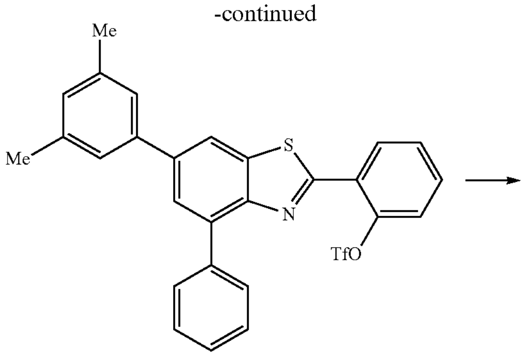

148

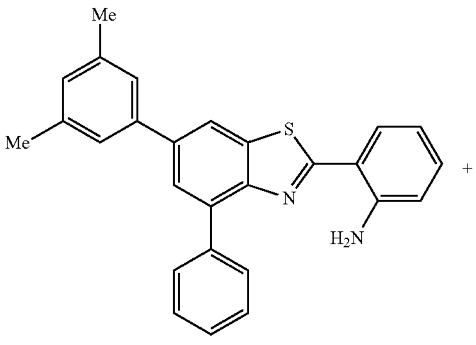

149

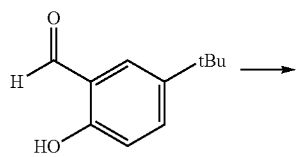

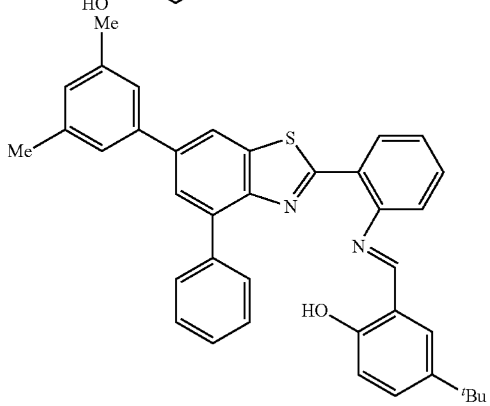

150

Synthesis of Intermediate 146

The same procedure as in the synthesis of Intermediate 136 of Intermediate Synthetic Example 34 was performed except for using Intermediate 135 (3.0 g, 8.81 mmol) to obtain Intermediate 146 (3.0 g, 93.1%).

Synthesis of Intermediate 147

The same procedure as in the synthesis of Intermediate 137 of Intermediate Synthetic Example 34 was performed except for using Intermediate 136 (3.0 g, 3.20 mmol) instead of Intermediate 136 to obtain Intermediate 147 (3.1 g, 92.7%).

Synthesis of Intermediate 148

The same procedure as in the synthesis of Intermediate 138 of Intermediate Synthetic Example 34 was performed except for using Intermediate 147 (3.1 g, 7.61 mmol) instead of Intermediate 137 to obtain Intermediate 148 (3.8 g, 92.5%).

Synthesis of Intermediate 149

The same procedure as in the synthesis of Intermediate 139 of Intermediate Synthetic Example 34 was performed except for using Intermediate 148 (3.8 g, 7.04 mmol) instead of Intermediate 138 to obtain Intermediate 149 (2.3 g, 80.3%).

Synthesis of Intermediate 150

The same procedure as in the synthesis of Intermediate 140 of Intermediate Synthetic Example 34 was performed except for using Intermediate 149 (2.3 g, 5.66 mmol) instead of Intermediate 139 to obtain Intermediate 150 (2.9 g, 90.4%).

Intermediate Synthetic Example 37: Synthesis of Intermediate 155

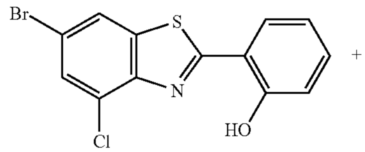

135

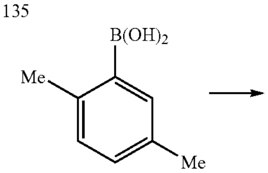

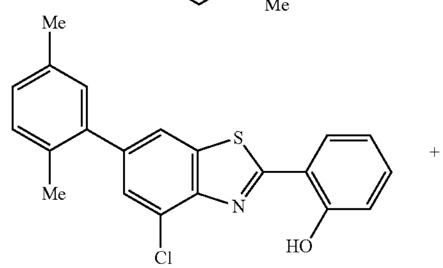

151

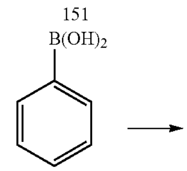

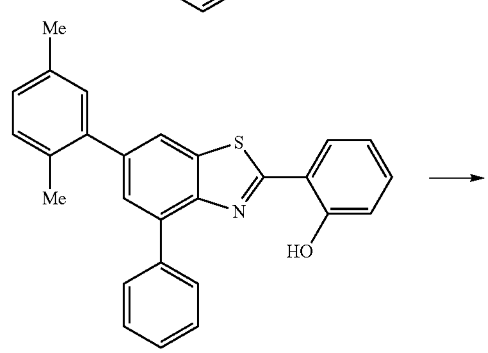

152

-continued

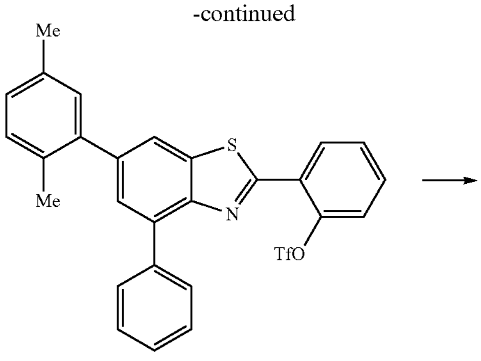

153

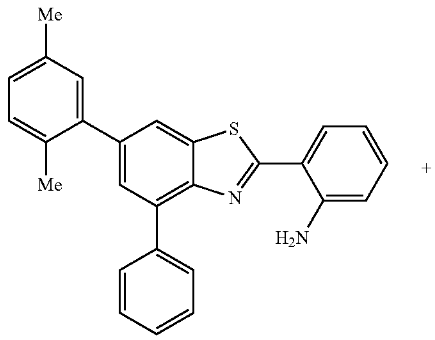

154

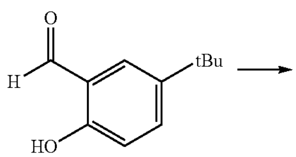

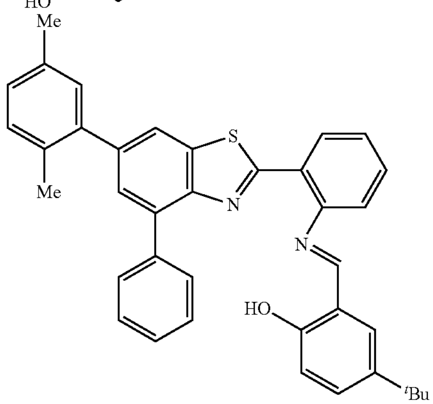

155

Synthesis of Intermediate 151

The same procedure as in the synthesis of Intermediate 136 of Intermediate Synthetic Example 34 was performed except for using Intermediate 135 (3.0 g, 8.81 mmol) to obtain Intermediate 151 (2.5 g, 77.5%).

Synthesis of Intermediate 152

The same procedure as in the synthesis of Intermediate 137 of Intermediate Synthetic Example 34 was performed except for using Intermediate 151 (2.5 g, 6.83 mmol) instead of Intermediate 136 to obtain Intermediate 152 (2.6 g, 93.3%).

Synthesis of Intermediate 153

The same procedure as in the synthesis of Intermediate 138 of Intermediate Synthetic Example 34 was performed except for using Intermediate 152 (2.6 g, 7.61 mmol) instead of Intermediate 137 to obtain Intermediate 153 (3.1 g, 90.0%).

Synthesis of Intermediate 154

The same procedure as in the synthesis of Intermediate 139 of Intermediate Synthetic Example 34 was performed except for using Intermediate 153 (3.1 g, 5.75 mmol) instead of Intermediate 138 to obtain Intermediate 154 (1.9 g, 81.3%).

Synthesis of Intermediate 155

The same procedure as in the synthesis of Intermediate 140 of Intermediate Synthetic Example 34 was performed except for using Intermediate 154 (1.9 g, 4.67 mmol) instead of Intermediate 139 to obtain Intermediate 155 (2.5 g, 94.3%).

Intermediate Synthetic Example 38: Synthesis of Intermediate 160

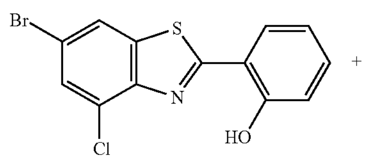

135

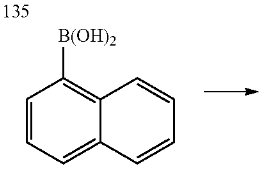

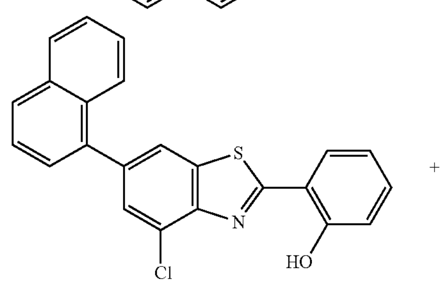

156

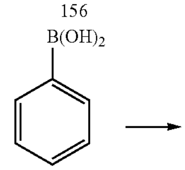

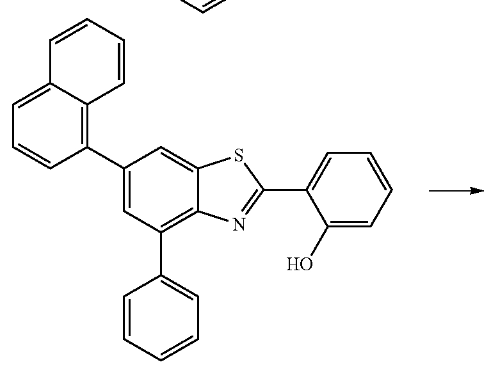

157

-continued

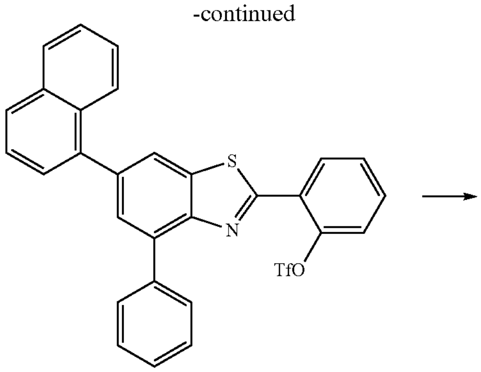

158

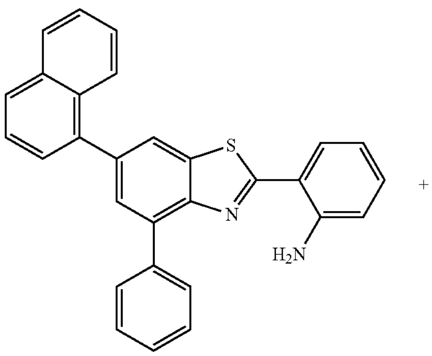

159

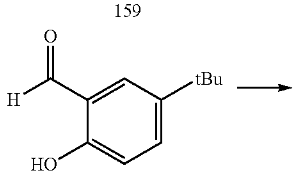

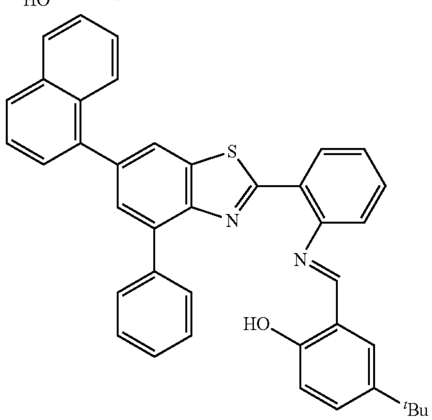

160

Synthesis of Intermediate 156

The same procedure as in the synthesis of Intermediate 136 of Intermediate Synthetic Example 34 was performed except for using Intermediate 135 (3.0 g, 8.81 mmol) to obtain Intermediate 156 (2.1 g, 61.4%).

Synthesis of Intermediate 157

The same procedure as in the synthesis of Intermediate 137 of Intermediate Synthetic Example 34 was performed except for using Intermediate 156 (2.1 g, 5.41 mmol) instead of Intermediate 136 to obtain Intermediate 157 (2.2 g, 94.6%).

Synthesis of Intermediate 158

The same procedure as in the synthesis of Intermediate 138 of Intermediate Synthetic Example 34 was performed except for using Intermediate 157 (2.2 g, 5.12 mmol) instead of Intermediate 137 to obtain Intermediate 158 (2.6 g, 90.3%).

Synthesis of Intermediate 159

The same procedure as in the synthesis of Intermediate 139 of Intermediate Synthetic Example 34 was performed except for using Intermediate 158 (2.6 g, 4.63 mmol) instead of Intermediate 138 to obtain Intermediate 159 (1.6 g, 80.6%).

Synthesis of Intermediate 160

The same procedure as in the synthesis of Intermediate 140 of Intermediate Synthetic Example 34 was performed except for using Intermediate 159 (1.6 g, 3.73 mmol) instead of Intermediate 139 to obtain Intermediate 160 (2.0 g, 90.9%).

Intermediate Synthetic Example 39: Synthesis of Intermediate 165

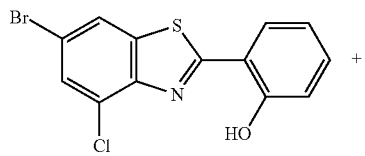

135

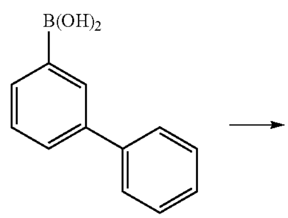

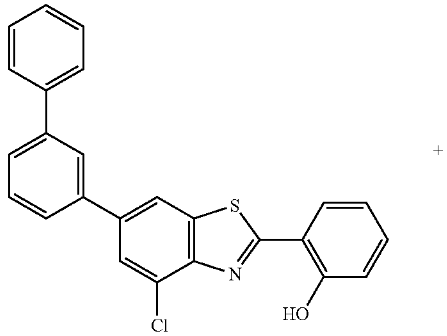

161

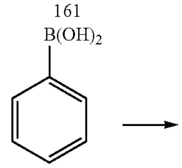

-continued

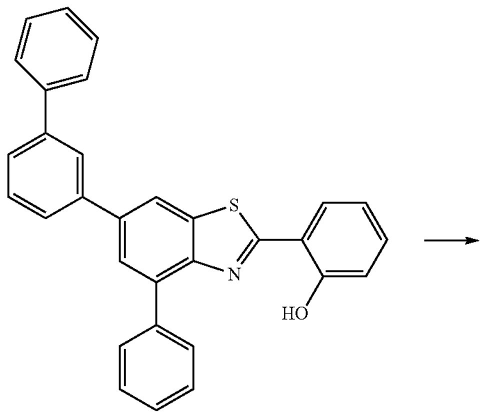

162

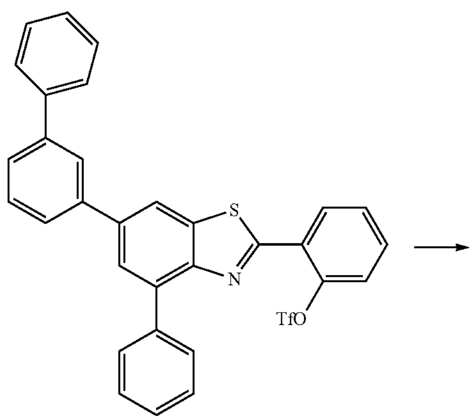

163

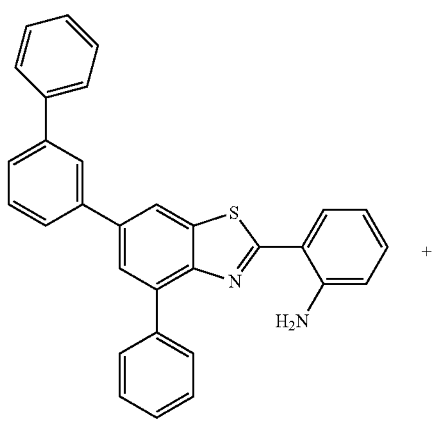

164

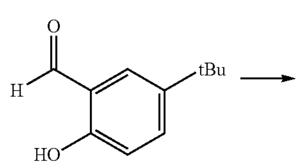

-continued

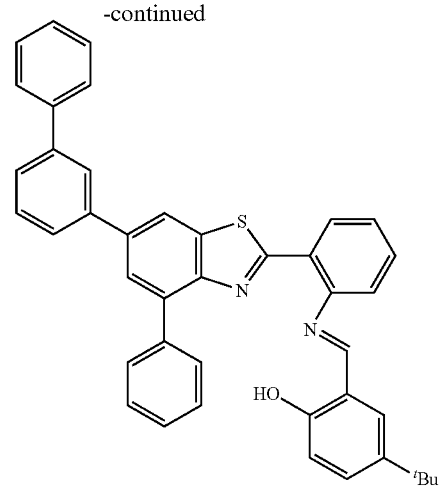

165

Synthesis of Intermediate 161

The same procedure as in the synthesis of Intermediate 136 of Intermediate Synthetic Example 34 was performed except for using Intermediate 135 (3.0 g, 8.81 mmol) to obtain Intermediate 161 (3.0 g, 82.2%).

Synthesis of Intermediate 162

The same procedure as in the synthesis of Intermediate 137 of Intermediate Synthetic Example 34 was performed except for using Intermediate 161 (3.0 g, 7.25 mmol) instead of Intermediate 136 to obtain Intermediate 162 (2.9 g, 87.8%).

Synthesis of Intermediate 163

The same procedure as in the synthesis of Intermediate 138 of Intermediate Synthetic Example 34 was performed except for using Intermediate 162 (2.9 g, 6.37 mmol) instead of Intermediate 137 to obtain Intermediate 163 (3.5 g, 93.5%).

Synthesis of Intermediate 164

The same procedure as in the synthesis of Intermediate 139 of Intermediate Synthetic Example 34 was performed except for using Intermediate 163 (3.5 g, 5.96 mmol) instead of Intermediate 138 to obtain Intermediate 164 (1.9 g, 70.1%).

Synthesis of Intermediate 165

The same procedure as in the synthesis of Intermediate 140 of Intermediate Synthetic Example 34 was performed except for using Intermediate 164 (1.9 g, 4.18 mmol) instead of Intermediate 139 to obtain Intermediate 165 (2.1 g, 81.7%).

Intermediate Synthetic Example 40: Synthesis of Intermediate 170

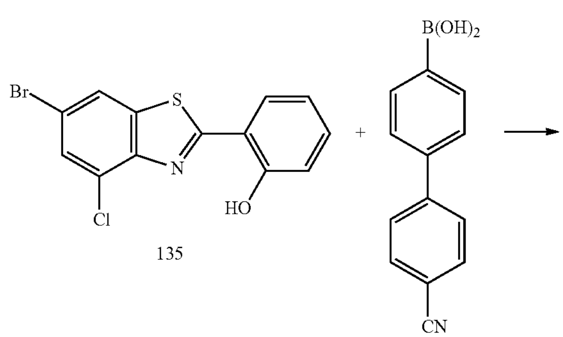

135

-continued

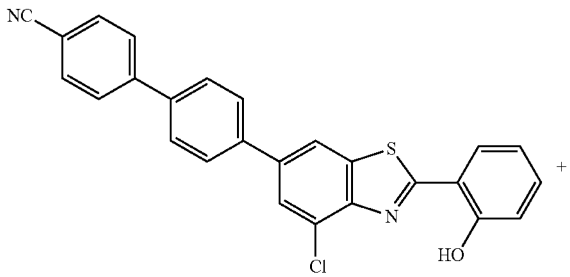

166

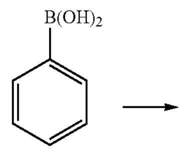

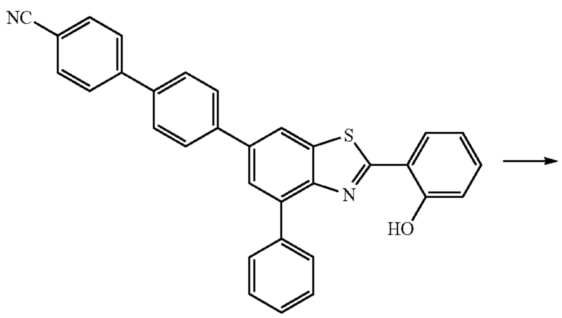

167

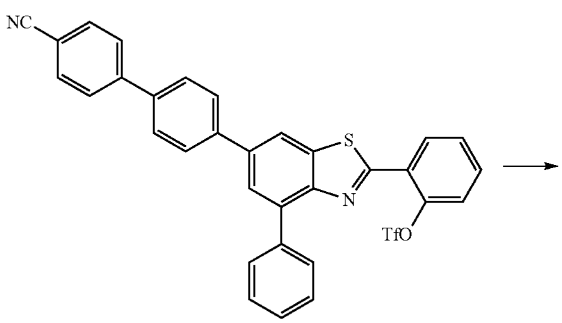

168

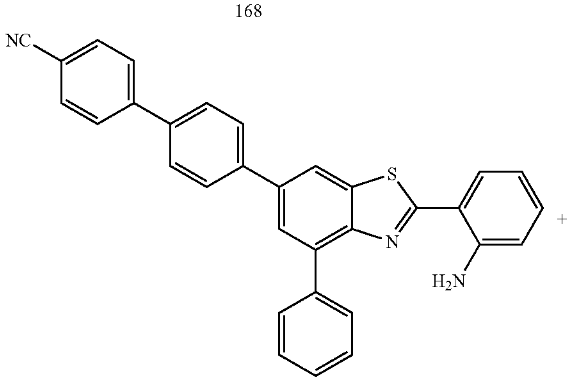

169

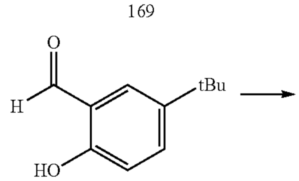

-continued

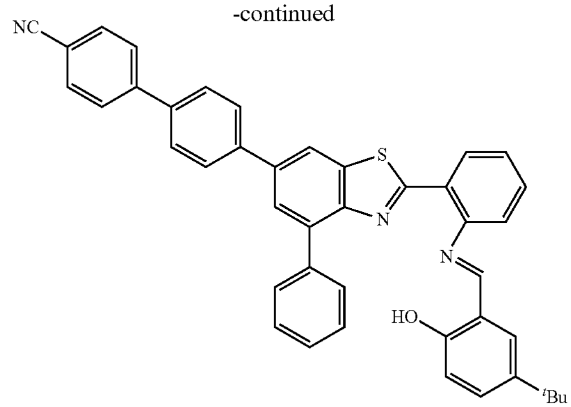

170

Synthesis of Intermediate 166

The same procedure as in the synthesis of Intermediate 136 of Intermediate Synthetic Example 34 was performed except for using Intermediate 135 (3.0 g, 8.81 mmol) to obtain Intermediate 166 (3.1 g, 80.1%).

Synthesis of Intermediate 167

The same procedure as in the synthesis of Intermediate 137 of Intermediate Synthetic Example 34 was performed except for using Intermediate 166 (3.1 g, 7.06 mmol) instead of Intermediate 136 to obtain Intermediate 167 (3.2 g, 94.2%).

Synthesis of Intermediate 168

The same procedure as in the synthesis of Intermediate 138 of Intermediate Synthetic Example 34 was performed except for using Intermediate 167 (3.2 g, 6.66 mmol) instead of Intermediate 137 to obtain Intermediate 168 (3.9 g, 95.6%).

Synthesis of Intermediate 169

The same procedure as in the synthesis of Intermediate 139 of Intermediate Synthetic Example 34 was performed except for using Intermediate 168 (3.9 g, 6.37 mmol) instead of Intermediate 138 to obtain Intermediate 169 (2.6 g, 85.1%).

Synthesis of Intermediate 170

The same procedure as in the synthesis of Intermediate 140 of Intermediate Synthetic Example 34 was performed except for using Intermediate 169 (2.6 g, 5.42 mmol) instead of Intermediate 139 to obtain Intermediate 170 (3.1 g, 89.3%).

Intermediate Synthetic Example 41: Synthesis of Intermediate 175

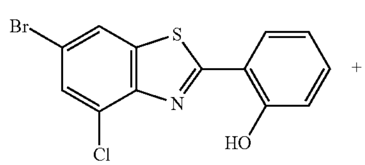

135

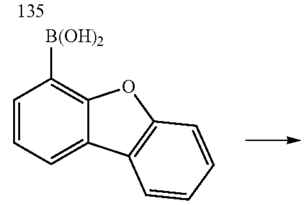

-continued

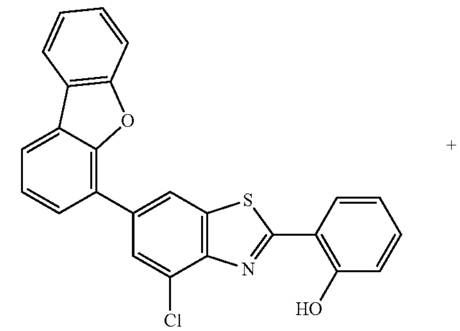

171

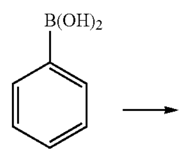

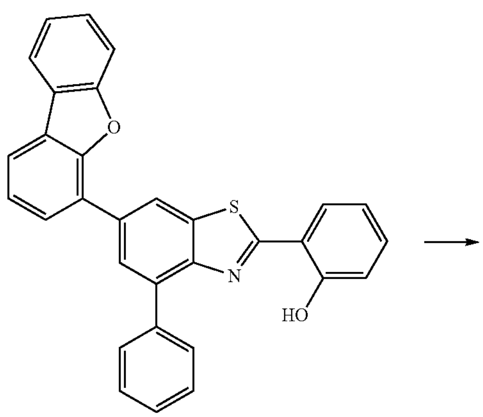

172

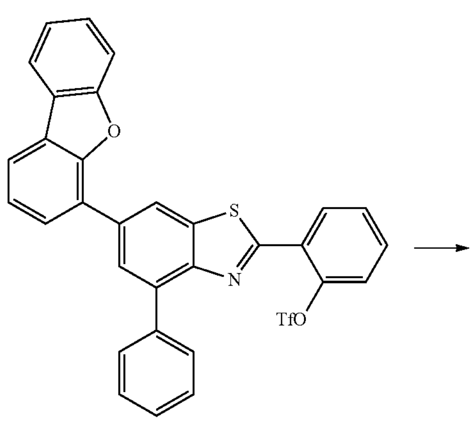

173

-continued

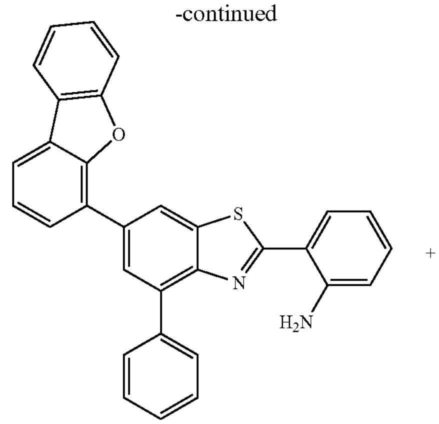

174

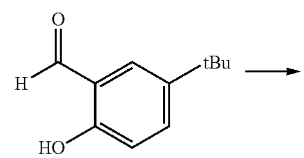

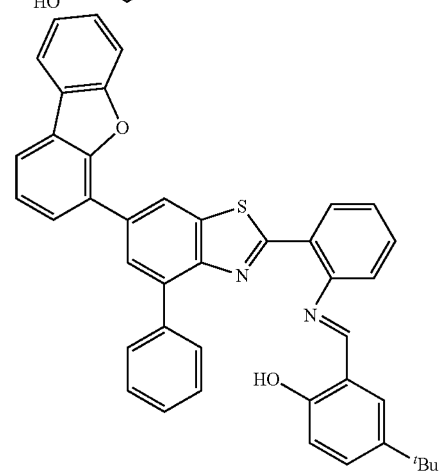

175

Synthesis of Intermediate 171

The same procedure as in the synthesis of Intermediate 136 of Intermediate Synthetic Example 34 was performed except for using Intermediate 135 (3.0 g, 8.81 mmol) to obtain Intermediate 171 (2.6 g, 68.9%).

Synthesis of Intermediate 172

The same procedure as in the synthesis of Intermediate 137 of Intermediate Synthetic Example 34 was performed except for using Intermediate 171 (2.6 g, 6.08 mmol) instead of Intermediate 136 to obtain Intermediate 172 (2.8 g, 98.1%).

Synthesis of Intermediate 173

The same procedure as in the synthesis of Intermediate 138 of Intermediate Synthetic Example 34 was performed except for using Intermediate 172 (2.8 g, 5.96 mmol) instead of Intermediate 137 to obtain Intermediate 173 (3.3 g, 91.9%).

Synthesis of Intermediate 174

The same procedure as in the synthesis of Intermediate 139 of Intermediate Synthetic Example 34 was performed except for using Intermediate 173 (3.3 g, 5.49 mmol) instead of Intermediate 138 to obtain Intermediate 174 (2.1 g, 81.7%).

Synthesis of Intermediate 175

The same procedure as in the synthesis of Intermediate 140 of Intermediate Synthetic Example 34 was performed except for using Intermediate 174 (2.1 g, 4.48 mmol) instead of Intermediate 139 to obtain Intermediate 175 (2.5 g, 88.7%).

Intermediate Synthetic Example 42: Synthesis of Intermediate 180

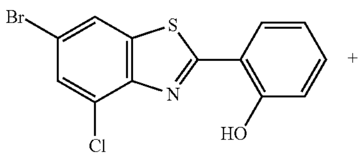

135

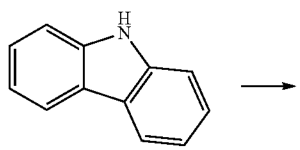

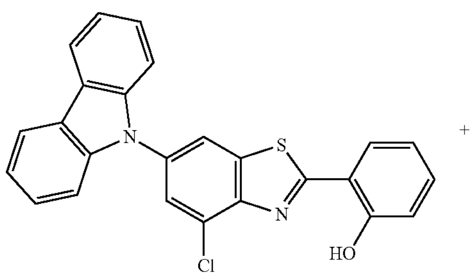

176

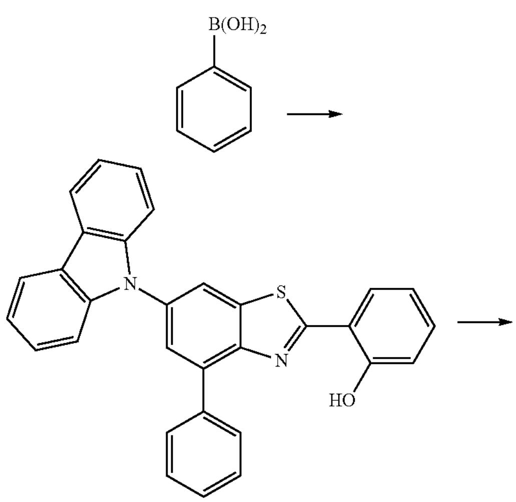

177

-continued

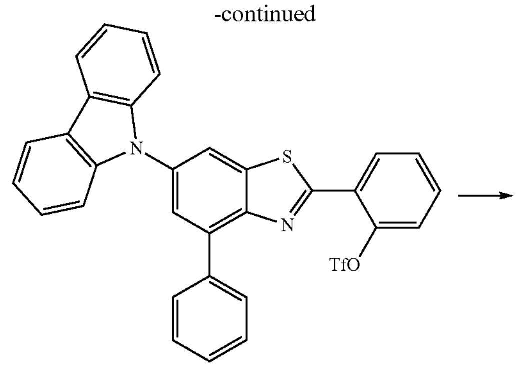

178

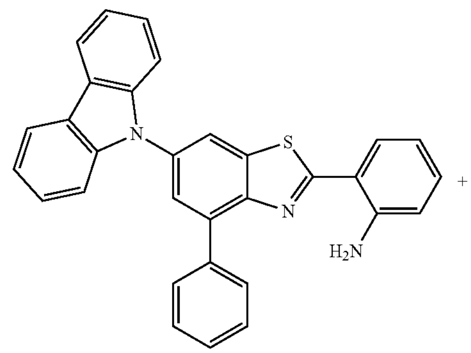

179

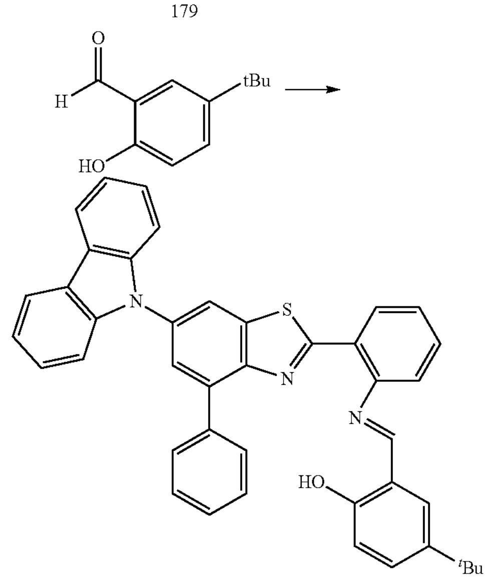

180

Synthesis of Intermediate 176

In a one-neck 100 ml flask, 1.35 g (8.07 mmol) of carbazole, 2.5 g (7.34 mmol) of Intermediate 135, 422 mg (0.733 mmol) of $Pd(dba)_2$, 593 mg (1.47 mmol) of $P(t\text{-}Bu)_3$, 1.55 g (16.15 mmol) of $NaO^tBu$, and 86 ml of toluene were mixed and then, refluxed. After finishing the reaction, the reaction product was cooled to room temperature and then, solidified with MeOH and filtered. The solid thus obtained was separated by silica gel column chromatography (MC:HEX), and then solidified with EX to obtain 3.1 g (yield: 98.9%) of Intermediate 176 as a yellow solid compound.

Synthesis of Intermediate 177

The same procedure as in the synthesis of Intermediate 137 of Intermediate Synthetic Example 34 was performed except for using Intermediate 176 (3.1 g, 7.26 mmol) instead of Intermediate 136 to obtain Intermediate 177 (2.6 g, 76.4%).

Synthesis of Intermediate 178

The same procedure as in the synthesis of Intermediate 138 of Intermediate Synthetic Example 34 was performed except for using Intermediate 177 (2.6 g, 5.55 mmol) instead of Intermediate 137 to obtain Intermediate 178 (3.2 g, 96.0%).

Synthesis of Intermediate 179

The same procedure as in the synthesis of Intermediate 139 of Intermediate Synthetic Example 34 was performed except for using Intermediate 178 (3.2 g, 5.33 mmol) instead of Intermediate 138 to obtain Intermediate 179 (1.8 g, 72.2%).

Synthesis of Intermediate 180

The same procedure as in the synthesis of Intermediate 140 of Intermediate Synthetic Example 34 was performed except for using Intermediate 179 (1.8 g, 3.85 mmol) instead of Intermediate 139 to obtain Intermediate 180 (2.2 g, 91.0%).

Intermediate Synthetic Example 43: Synthesis of Intermediate 184

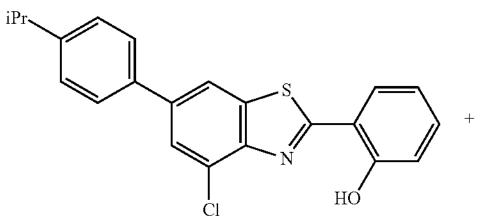

136

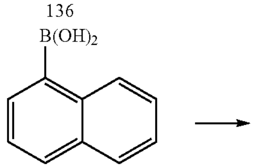

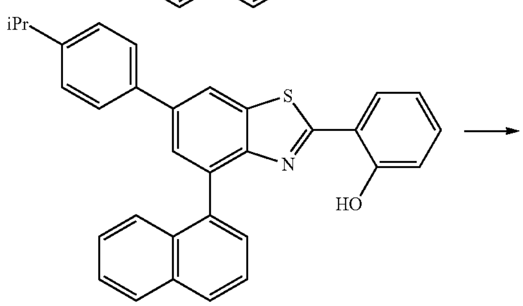

181

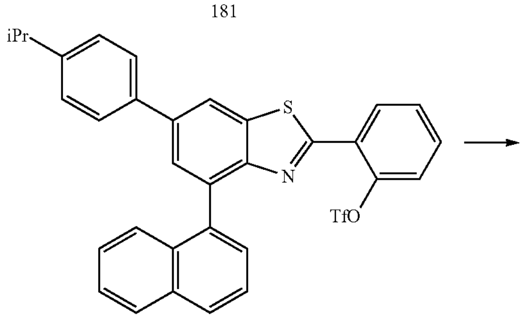

182

-continued

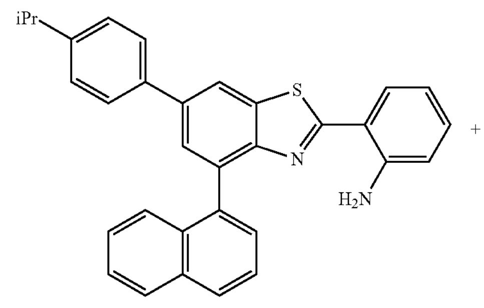

183

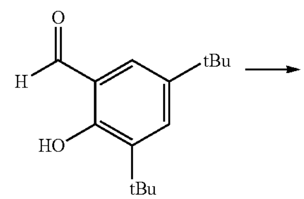

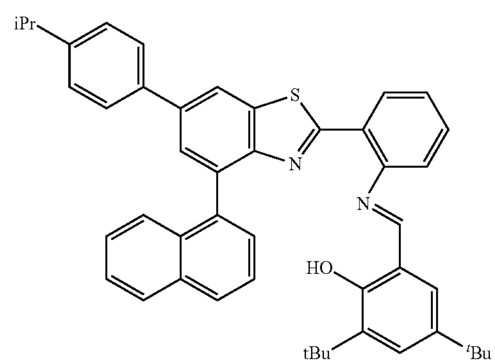

184

Synthesis of Intermediate 181

The same procedure as in the synthesis of Intermediate 136 of Intermediate Synthetic Example 34 was performed except for using Intermediate 136 (3.0 g, 7.90 mmol) instead of Intermediate 136 to to obtain Intermediate 181 (3.5 g, 93.9%).

Synthesis of Intermediate 182

The same procedure as in the synthesis of Intermediate 137 of Intermediate Synthetic Example 34 was performed except for using Intermediate 181 (3.5 g, 7.42 mmol) instead of Intermediate 137 to obtain Intermediate 182 (4.1 g, 91.5%).

Synthesis of Intermediate 183

The same procedure as in the synthesis of Intermediate 139 of Intermediate Synthetic Example 34 was performed except for using Intermediate 182 (4.1 g, 6.79 mmol) instead of Intermediate 138 to obtain Intermediate 183 (2.6 g, 81.3%).

Synthesis of Intermediate 184

The same procedure as in the synthesis of Intermediate 140 of Intermediate Synthetic Example 34 was performed except for using Intermediate 183 (2.6 g, 5.52 mmol) instead of Intermediate 139 to obtain Intermediate 184 (3.3 g, 86.9%).

Intermediate Synthetic Example 44: Synthesis of Intermediate 188

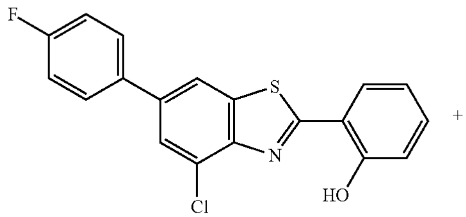

141

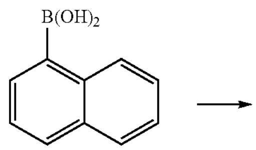

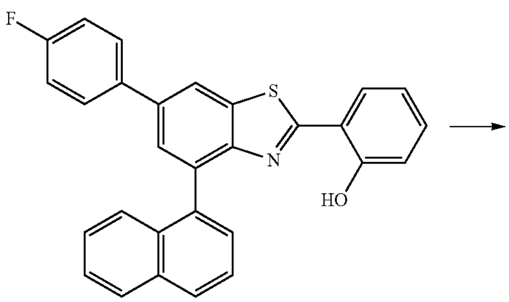

185

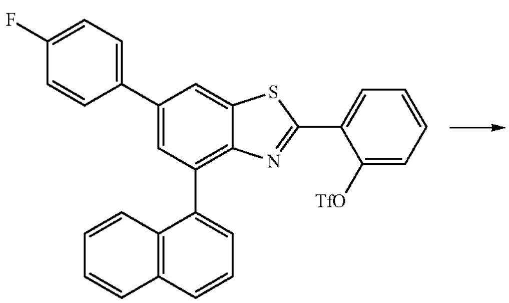

186

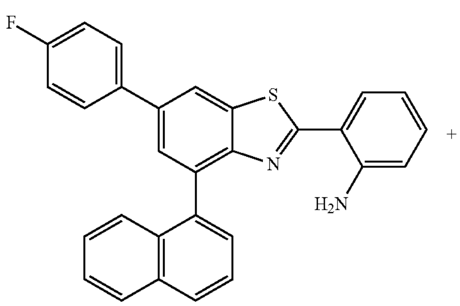

187

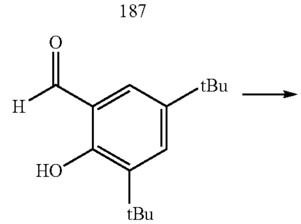

-continued

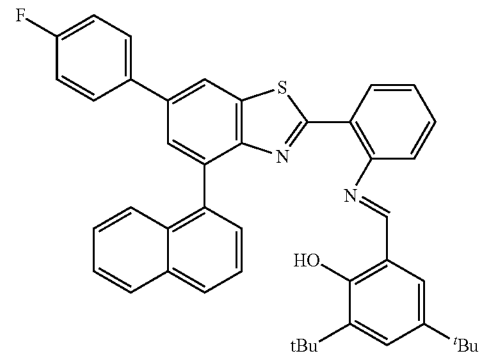

188

Synthesis of Intermediate 185

The same procedure as in the synthesis of Intermediate 137 of Intermediate Synthetic Example 34 was performed except for using Intermediate 141 (2.5 g, 7.03 mmol) instead of Intermediate 136 to obtain Intermediate 185 (2.8 g, 89.0%).

Synthesis of Intermediate 186

The same procedure as in the synthesis of Intermediate 138 of Intermediate Synthetic Example 34 was performed except for using Intermediate 185 (2.8 g, 6.26 mmol) instead of Intermediate 137 to obtain Intermediate 186 (3.2 g, 88.2%).

Synthesis of Intermediate 187

The same procedure as in the synthesis of Intermediate 139 of Intermediate Synthetic Example 34 was performed except for using Intermediate 186 (3.2 g, 5.52 mmol) instead of Intermediate 138 to obtain Intermediate 187 (2.0 g, 81.1%).

Synthesis of Intermediate 188

The same procedure as in the synthesis of Intermediate 140 of Intermediate Synthetic Example 34 was performed except for using Intermediate 187 (2.0 g, 4.48 mmol) instead of Intermediate 139 to obtain Intermediate 188 (2.3 g, 77.4%).

Intermediate Synthetic Example 45: Synthesis of Intermediate 193

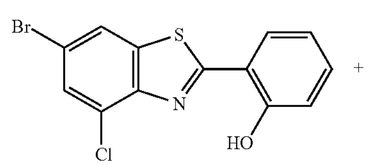

135

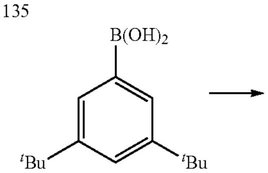

-continued

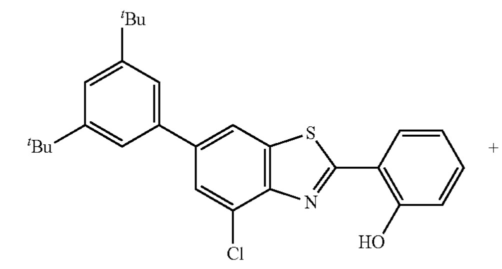

189

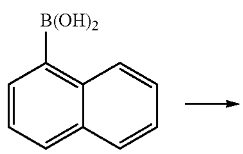

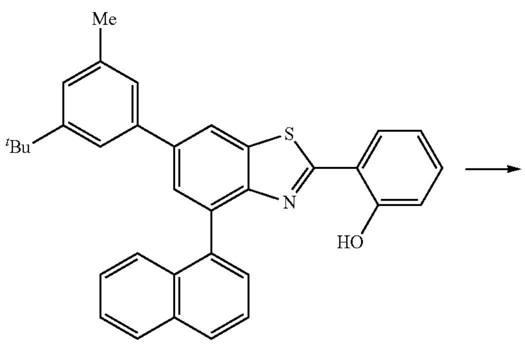

190

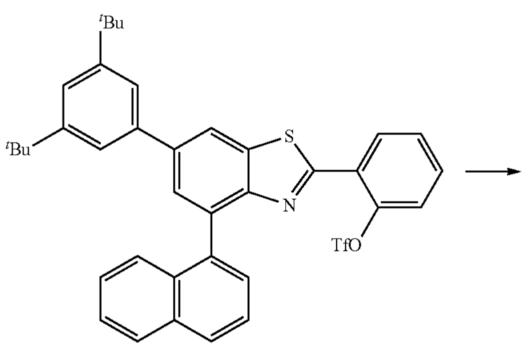

191

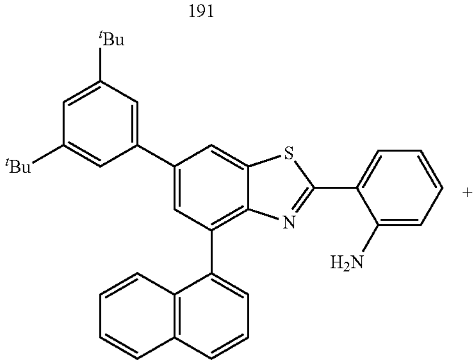

192

-continued

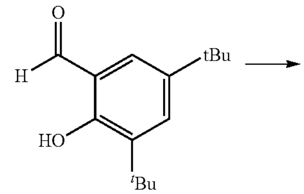

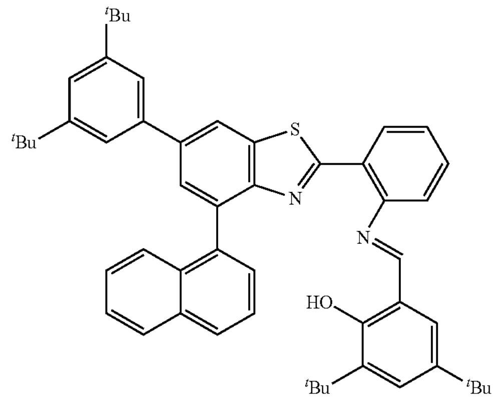

193

Synthesis of Intermediate 189

The same procedure as in the synthesis of Intermediate 136 of Intermediate Synthetic Example 34 was performed except for using Intermediate 135 (3.0 g, 8.81 mmol) to obtain Intermediate 189 (3.1 g, 78.2%).

Synthesis of Intermediate 190

The same procedure as in the synthesis of Intermediate 137 of Intermediate Synthetic Example 34 was performed except for using Intermediate 189 (3.1 g, 6.89 mmol) instead of Intermediate 136 to obtain Intermediate 190 (3.3 g, 95.8%).

Synthesis of Intermediate 191

The same procedure as in the synthesis of Intermediate 138 of Intermediate Synthetic Example 34 was performed except for using Intermediate 190 (3.3 g, 6.60 mmol) instead of Intermediate 137 to obtain Intermediate 191 (4.0 g, 89.8%).

Synthesis of Intermediate 192

The same procedure as in the synthesis of Intermediate 139 of Intermediate Synthetic Example 34 was performed except for using Intermediate 191 (4.0 g, 5.94 mmol) instead of Intermediate 138 to obtain Intermediate 192 (2.1 g, 65.4%).

Synthesis of Intermediate 193

The same procedure as in the synthesis of Intermediate 140 of Intermediate Synthetic Example 34 was performed except for using Intermediate 192 (2.1 g, 3.88 mmol) instead of Intermediate 139 to obtain Intermediate 193 (2.5 g, 85.0%).

Intermediate Synthetic Example 46: Synthesis of Intermediate 194
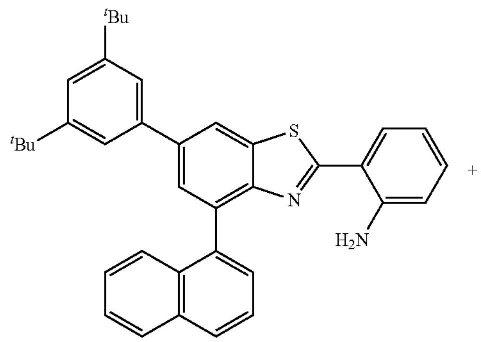
192
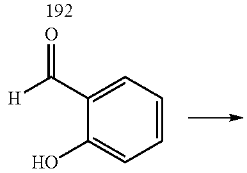
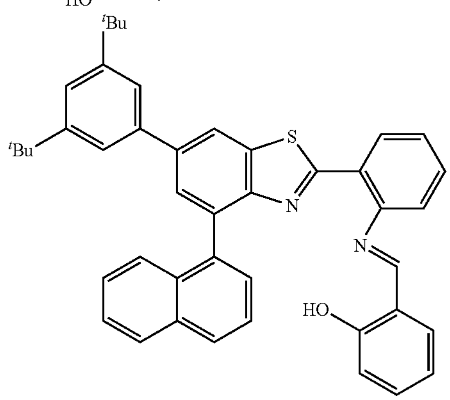
194
Synthesis of Intermediate 194
The same procedure as in the synthesis of Intermediate 140 of Intermediate Synthetic Example 34 was performed except for using Intermediate 192 (2.0 g, 3.88 mmol) instead of Intermediate 139 to obtain Intermediate 194 (2.1 g, 88.0%).
Intermediate Synthetic Example 47: Synthesis of Intermediate 198
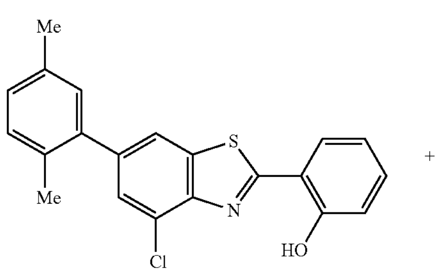
151
-continued
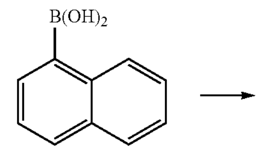
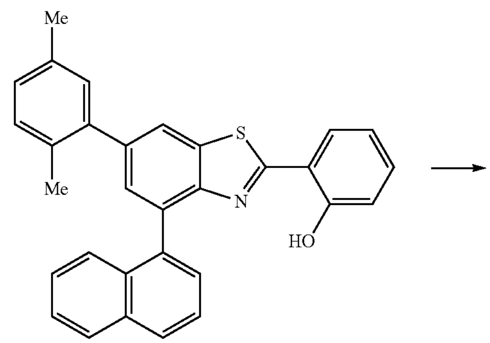
195
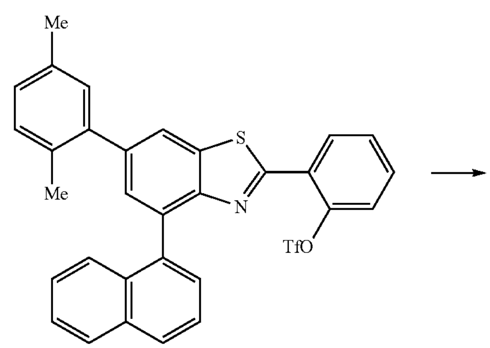
196
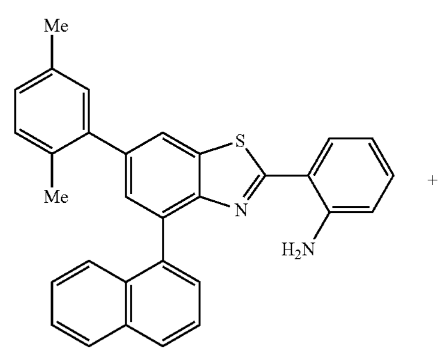
197
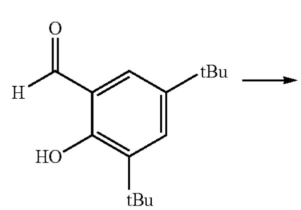

-continued

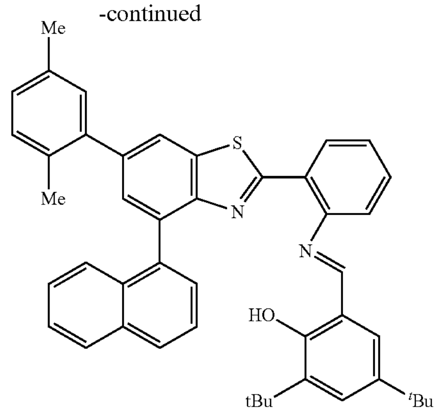

198

Synthesis of Intermediate 195

The same procedure as in the synthesis of Intermediate 137 of Intermediate Synthetic Example 34 was performed except for using Intermediate 151 (2.0 g, 5.47 mmol) instead of Intermediate 136 to obtain Intermediate 195 (2.5 g, 99.9%).

Synthesis of Intermediate 196

The same procedure as in the synthesis of Intermediate 138 of Intermediate Synthetic Example 34 was performed except for using Intermediate 195 (2.5 g, 5.46 mmol) instead of Intermediate 137 to obtain Intermediate 196 (3.1 g, 96.2%).

Synthesis of Intermediate 197

The same procedure as in the synthesis of Intermediate 139 of Intermediate Synthetic Example 34 was performed except for using Intermediate 196 (3.1 g, 5.26 mmol) instead of Intermediate 138 to obtain Intermediate 197 (1.5 g, 62.4%).

Synthesis of Intermediate 198

The same procedure as in the synthesis of Intermediate 140 of Intermediate Synthetic Example 34 was performed except for using Intermediate 197 (1.5 g, 3.29 mmol) instead of Intermediate 139 to obtain Intermediate 198 (2.2 g, 99.5%).

Intermediate Synthetic Example 48: Synthesis of Intermediate 202

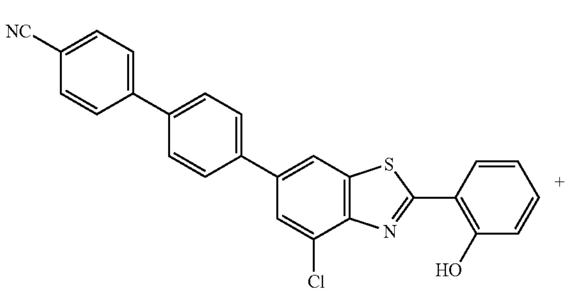

166

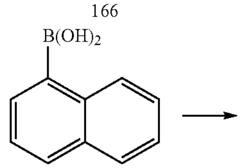

-continued

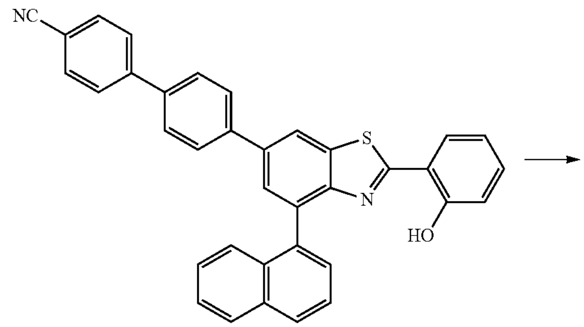

199

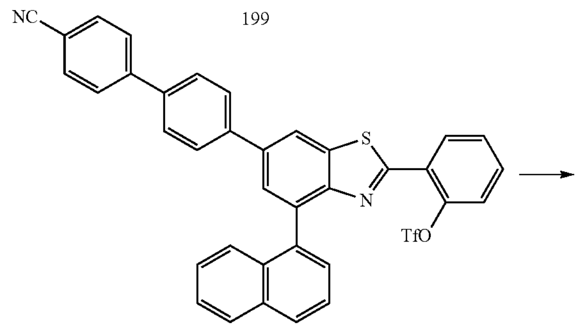

200

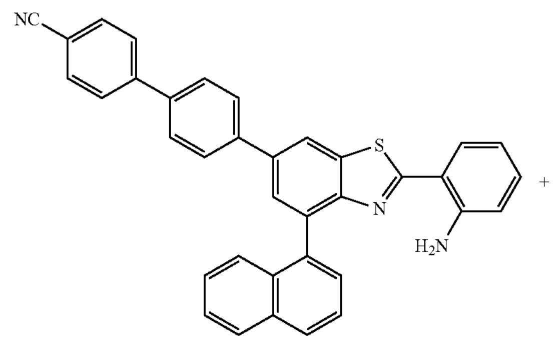

201

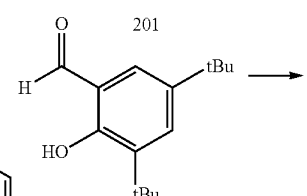

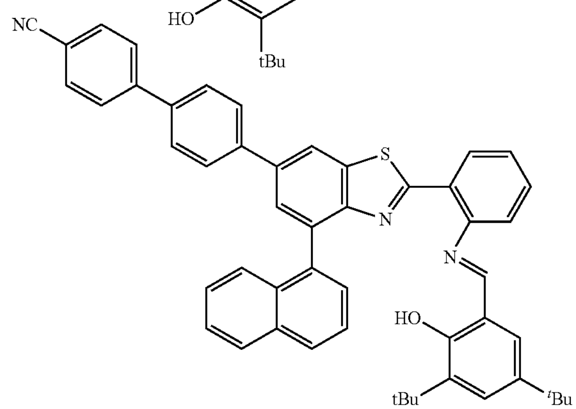

202

Synthesis of Intermediate 199

The same procedure as in the synthesis of Intermediate 137 of Intermediate Synthetic Example 34 was performed except for using Intermediate 166 (2.0 g, 4.56 mmol) instead of Intermediate 136 to obtain Intermediate 199 (2.3 g, 95.1%).

Synthesis of Intermediate 200

The same procedure as in the synthesis of Intermediate 138 of Intermediate Synthetic Example 34 was performed except for using Intermediate 199 (2.3 g, 4.33 mmol) instead of Intermediate 137 to obtain Intermediate 200 (2.8 g, 97.4%).

Synthesis of Intermediate 201

The same procedure as in the synthesis of Intermediate 139 of Intermediate Synthetic Example 34 was performed except for using Intermediate 200 (2.8 g, 4.23 mmol) instead of Intermediate 138 to obtain Intermediate 201 (1.8 g, 80.4%).

Synthesis of Intermediate 202

The same procedure as in the synthesis of Intermediate 140 of Intermediate Synthetic Example 34 was performed except for using Intermediate 201 (1.8 g, 3.40 mmol) instead of Intermediate 139 to obtain Intermediate 202 (2.3 g, 90.7%).

Intermediate Synthetic Example 49: Synthesis of Intermediate 206

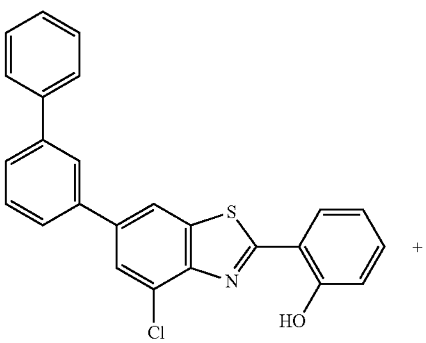

161

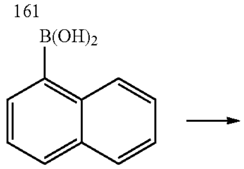

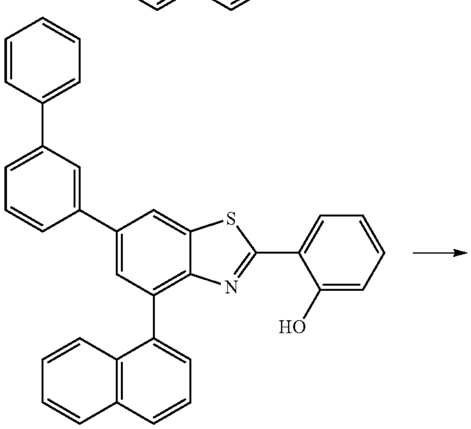

203

-continued

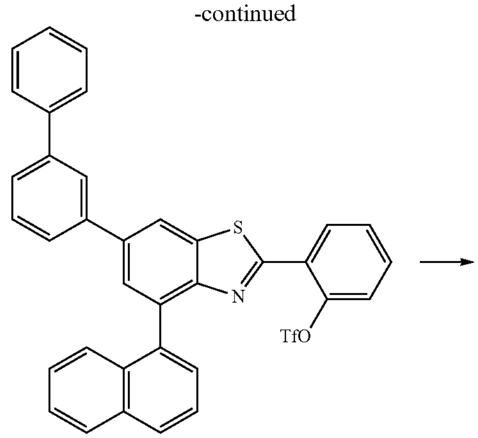

204

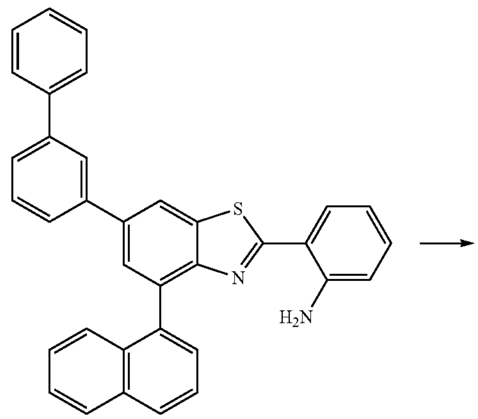

205

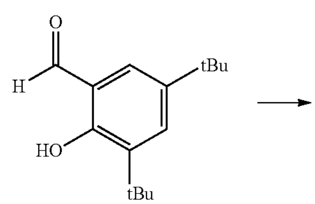

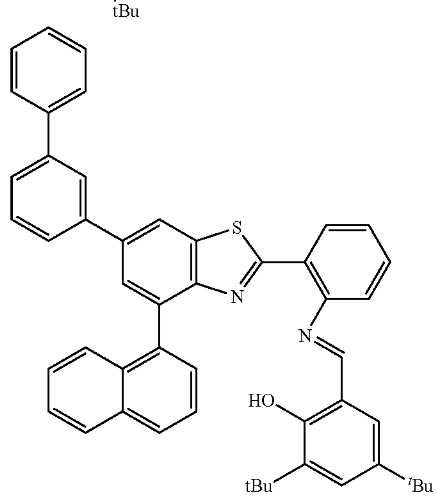

206

Synthesis of Intermediate 203

The same procedure as in the synthesis of Intermediate 137 of Intermediate Synthetic Example 34 was performed except for using Intermediate 161 (2.0 g, 4.83 mmol) instead of Intermediate 136 to obtain Intermediate 203 (2.3 g, 94.1%).

Synthesis of Intermediate 204

The same procedure as in the synthesis of Intermediate 138 of Intermediate Synthetic Example 34 was performed except for using Intermediate 203 (2.3 g, 4.55 mmol) instead of Intermediate 137 to obtain Intermediate 204 (2.8 g, 96.5%).

Synthesis of Intermediate 205

The same procedure as in the synthesis of Intermediate 139 of Intermediate Synthetic Example 34 was performed except for using Intermediate 204 (2.8 g, 4.39 mmol) instead of Intermediate 138 to obtain Intermediate 205 (2.0 g, 90.2%).

Synthesis of Intermediate 206

The same procedure as in the synthesis of Intermediate 140 of Intermediate Synthetic Example 34 was performed except for using Intermediate 205 (2.0 g, 3.96 mmol) instead of Intermediate 139 to obtain Intermediate 206 (2.5 g, 87.4%).

Intermediate Synthetic Example 50: Synthesis of Intermediate 300

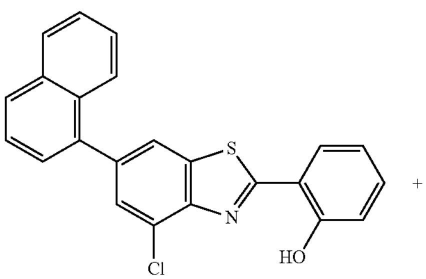

156

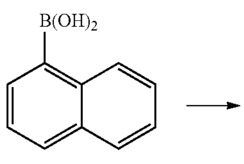

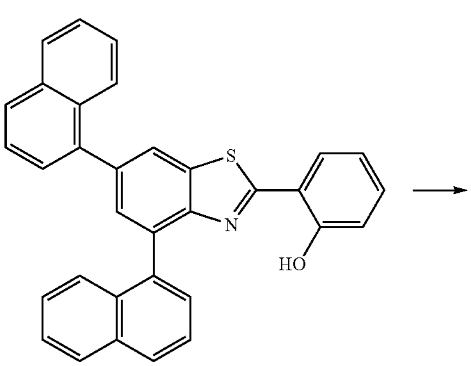

207

-continued

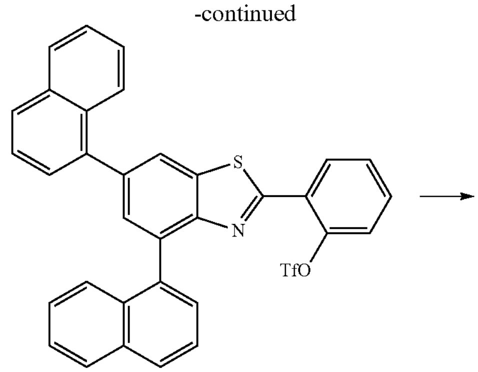

208

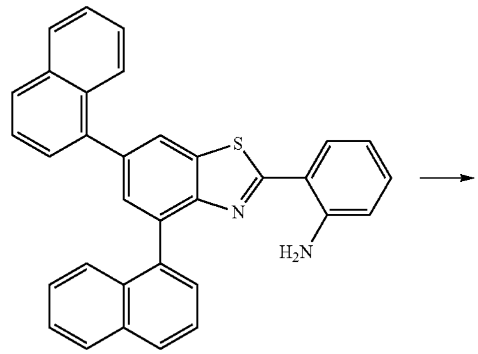

209

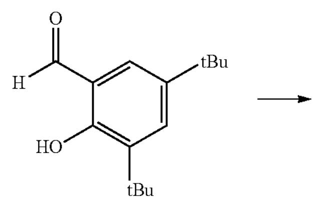

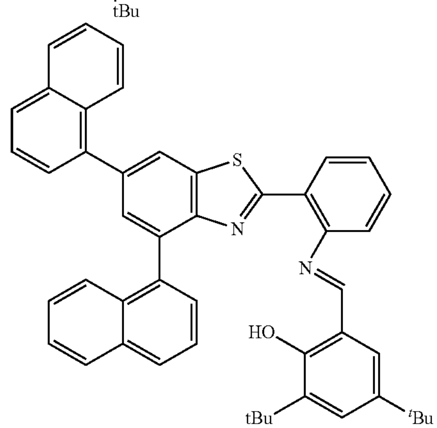

300

Synthesis of Intermediate 207

The same procedure as in the synthesis of Intermediate 137 of Intermediate Synthetic Example 34 was performed except for using Intermediate 156 (2.5 g, 6.45 mmol) instead of Intermediate 136 to obtain Intermediate 207 (2.8 g, 90.5%).

Synthesis of Intermediate 208

The same procedure as in the synthesis of Intermediate 138 of Intermediate Synthetic Example 34 was performed except for using Intermediate 207 (2.8 g, 5.84 mmol) instead of Intermediate 137 to obtain Intermediate 208 (3.2 g, 89.6%).

Synthesis of Intermediate 209

The same procedure as in the synthesis of Intermediate 139 of Intermediate Synthetic Example 34 was performed except for using Intermediate 208 (3.2 g, 5.23 mmol) instead of Intermediate 138 to obtain Intermediate 209 (2.0 g, 79.8%).

Synthesis of Intermediate 300

The same procedure as in the synthesis of Intermediate 140 of Intermediate Synthetic Example 34 was performed except for using Intermediate 209 (2.0 g, 4.18 mmol) instead of Intermediate 139 to obtain Intermediate 300 (2.3 g, 79.2%).

Intermediate Synthetic Example 51: Synthesis of Intermediate 304

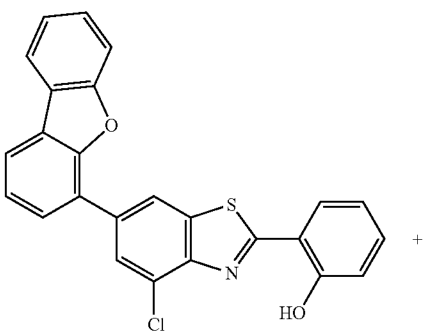

171

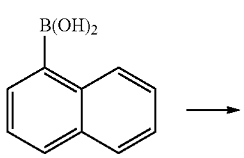

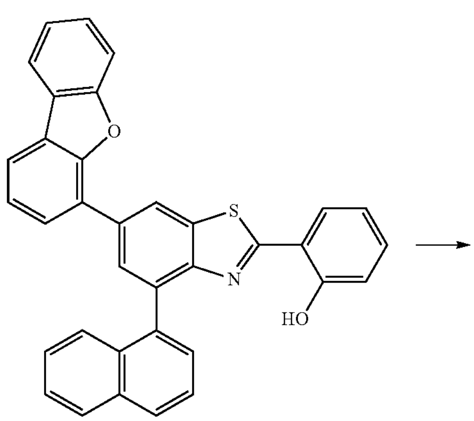

301

-continued

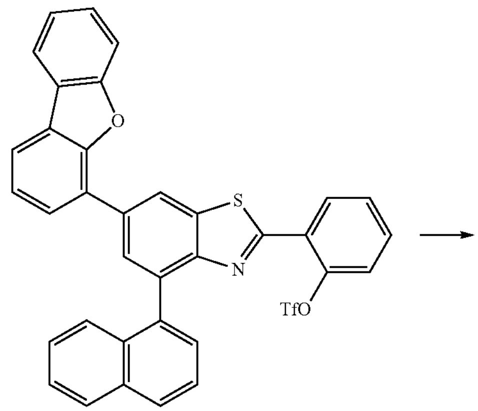

302

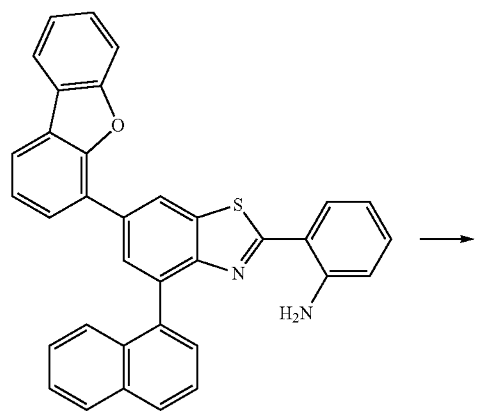

303

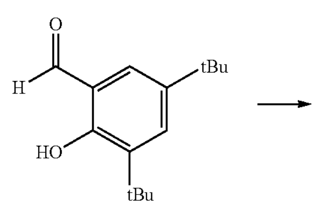

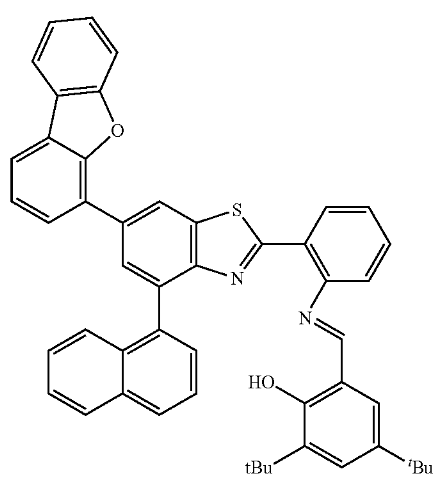

304

Synthesis of Intermediate 301

The same procedure as in the synthesis of Intermediate 137 of Intermediate Synthetic Example 34 was performed except for using Intermediate 171 (2.5 g, 5.84 mmol) instead of Intermediate 136 to obtain Intermediate 301 (2.9 g, 95.5%).

Synthesis of Intermediate 302

The same procedure as in the synthesis of Intermediate 138 of Intermediate Synthetic Example 34 was performed except for using Intermediate 301 (2.9 g, 5.58 mmol) instead of Intermediate 137 to obtain Intermediate 302 (3.4 g, 93.4%).

Synthesis of Intermediate 303

The same procedure as in the synthesis of Intermediate 139 of Intermediate Synthetic Example 34 was performed except for using Intermediate 302 (3.4 g, 5.22 mmol) instead of Intermediate 138 to obtain Intermediate 303 (1.9 g, 70.2%).

Synthesis of Intermediate 304

The same procedure as in the synthesis of Intermediate 140 of Intermediate Synthetic Example 34 was performed except for using Intermediate 303 (1.9 g, 3.66 mmol) instead of Intermediate 139 to obtain Intermediate 304 (2.3 g, 85.4%).

Intermediate Synthetic Example 52: Synthesis of Intermediate 312

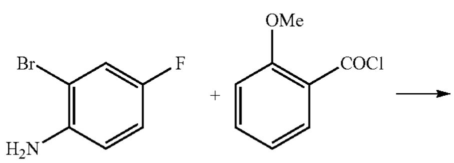

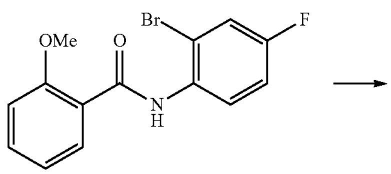

305

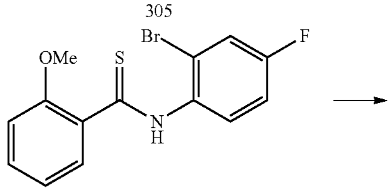

306

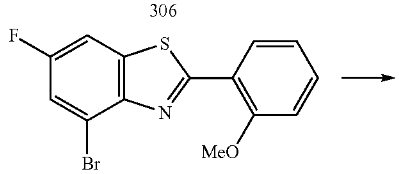

307

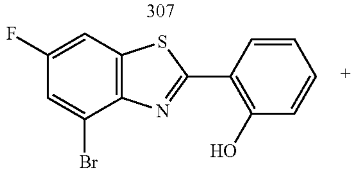

308

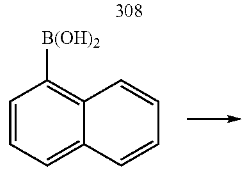

-continued

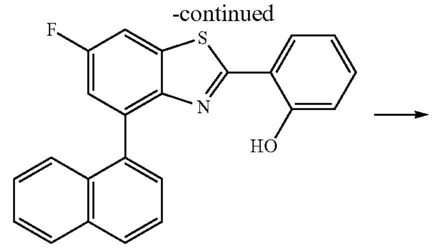

309

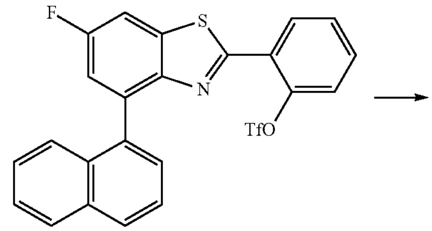

310

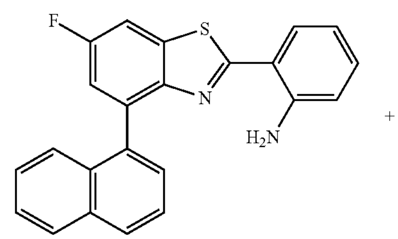

311

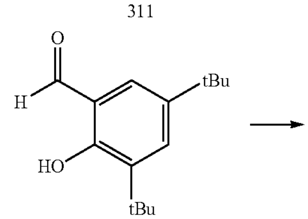

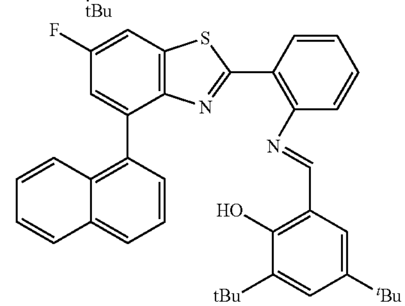

312

Synthesis of Intermediate 305

The same procedure as in the synthesis of Intermediate 1 of Intermediate Synthetic Example 1 was performed except for using 2-bromo-4-fluoroaniline (10.0 g, 52.6 mmol) instead of 2,6-dibromoaniline to obtain Intermediate 305 (16.5 g, 96.7%).

Synthesis of Intermediate 307

The same procedure as in the synthesis of Intermediate 26 of Intermediate Synthetic Example 7 was performed except for using Intermediate 305 (16.5 g, 50.90 mmol) instead of Intermediate 24 to obtain Intermediate 307 (8.3 g, 48.2%).

Synthesis of Intermediate 308

The same procedure as in the synthesis of Intermediate 45 of Intermediate Synthetic Example 12 was performed except for using Intermediate 307 (8.3 g, 24.54 mmol) instead of Intermediate 44 to obtain Intermediate 308 (6.2 g, 77.9%).

Synthesis of Intermediate 309

The same procedure as in the synthesis of Intermediate 137 of Intermediate Synthetic Example 34 was performed except for using Intermediate 308 (3.0 g, 9.25 mmol) instead of Intermediate 136 to obtain Intermediate 309 (3.0 g, 87.2%).

Synthesis of Intermediate 310

The same procedure as in the synthesis of Intermediate 138 of Intermediate Synthetic Example 34 was performed except for using Intermediate 309 (3.0 g, 8.08 mmol) instead of Intermediate 137 to obtain Intermediate 310 (3.2 g, 78.6%).

Synthesis of Intermediate 311

The same procedure as in the synthesis of Intermediate 139 of Intermediate Synthetic Example 34 was performed except for using Intermediate 310 (3.2 g, 6.36 mmol) instead of Intermediate 138 to obtain Intermediate 311 (1.8 g, 76.4%).

Synthesis of Intermediate 312

The same procedure as in the synthesis of Intermediate 140 of Intermediate Synthetic Example 34 was performed except for using Intermediate 311 (1.8 g, 4.86 mmol) instead of Intermediate 139 to obtain Intermediate 312 (2.1 g, 73.6%).

Intermediate Synthetic Example 53: Synthesis of Intermediate 316

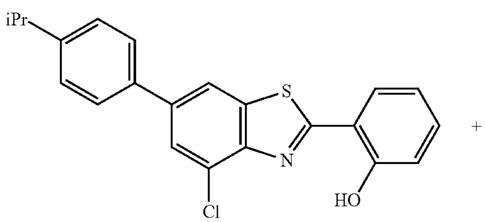

136

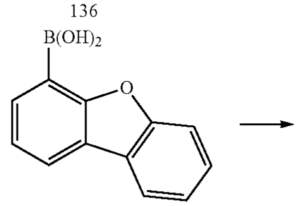

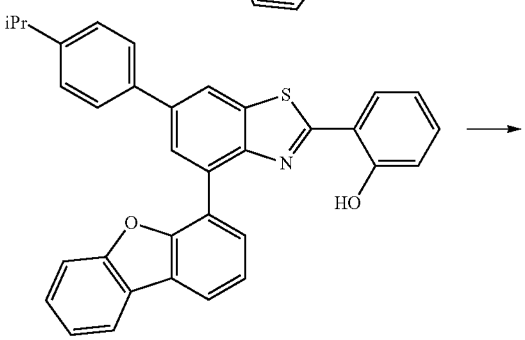

313

-continued

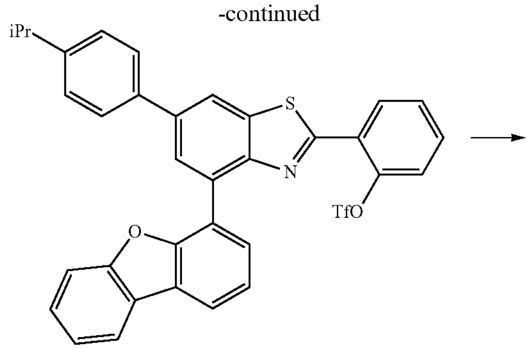

314

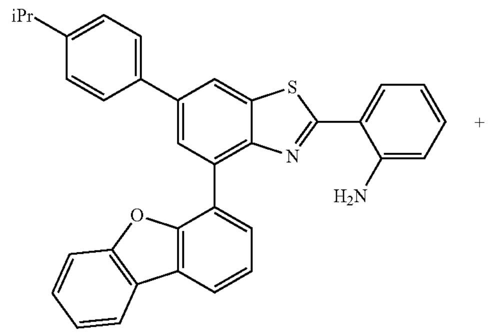

315

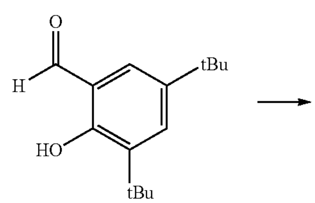

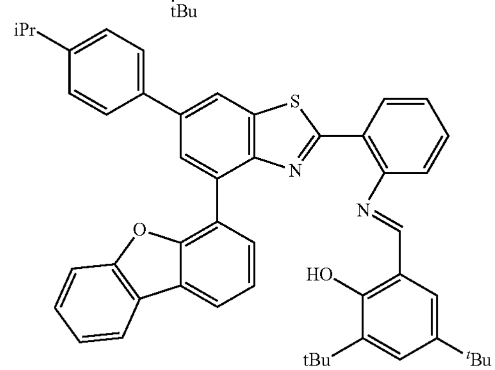

316

Synthesis of Intermediate 313

The same procedure as in the synthesis of Intermediate 137 of Intermediate Synthetic Example 34 was performed except for using Intermediate 136 (2.5 g, 6.58 mmol) to obtain Intermediate 313 (3.1 g, 92.0%).

Synthesis of Intermediate 314

The same procedure as in the synthesis of Intermediate 138 of Intermediate Synthetic Example 34 was performed except for using Intermediate 313 (3.1 g, 6.06 mmol) instead of Intermediate 137 to obtain Intermediate 314 (3.5 g, 89.7%).

Synthesis of Intermediate 315

The same procedure as in the synthesis of Intermediate 139 of Intermediate Synthetic Example 34 was performed except for using Intermediate 314 (3.5 g, 5.44 mmol) instead of Intermediate 138 to obtain Intermediate 315 (2.0 g, 72.0%).

Synthesis of Intermediate 316

The same procedure as in the synthesis of Intermediate 140 of Intermediate Synthetic Example 34 was performed except for using Intermediate 315 (2.0 g, 3.92 mmol) instead of Intermediate 139 to obtain Intermediate 316 (2.5 g, 87.8%).

Intermediate Synthetic Example 54: Synthesis of Intermediate 320

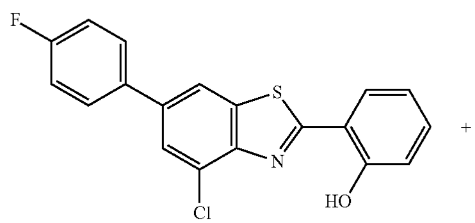

141

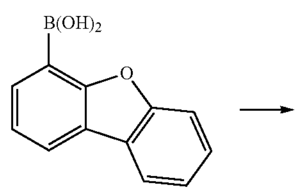

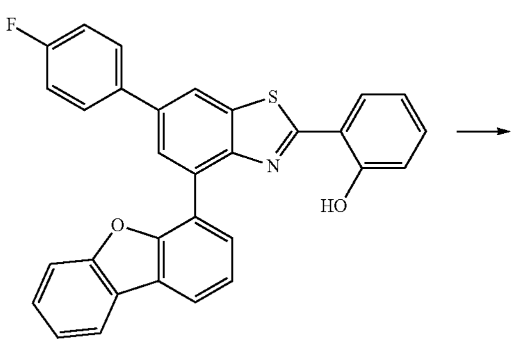

317

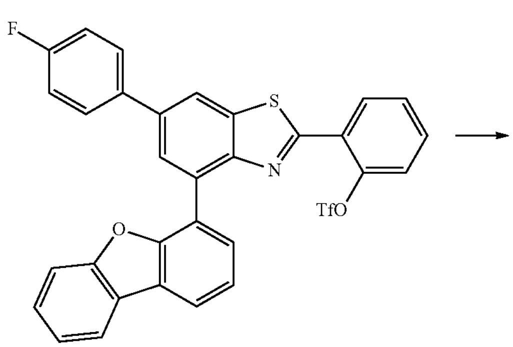

318

-continued

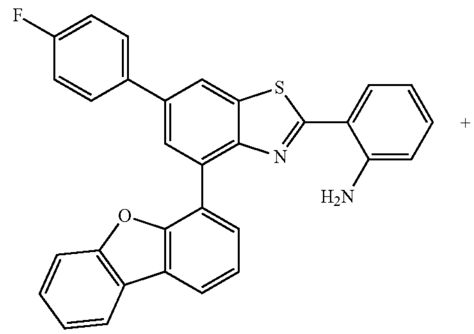

319

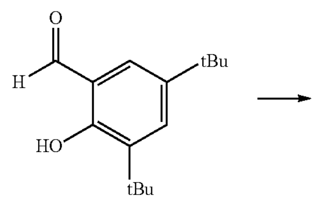

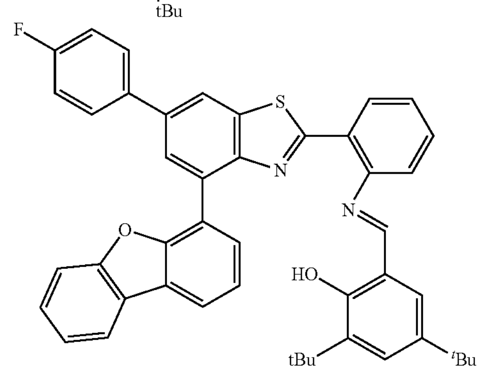

320

Synthesis of Intermediate 317

The same procedure as in the synthesis of Intermediate 137 of Intermediate Synthetic Example 34 was performed except for using Intermediate 141 (2.5 g, 7.03 mmol) instead of Intermediate 136 to obtain Intermediate 317 (3.0 g, 87.5%).

Synthesis of Intermediate 318

The same procedure as in the synthesis of Intermediate 138 of Intermediate Synthetic Example 34 was performed except for using Intermediate 317 (3.0 g, 6.15 mmol) instead of Intermediate 137 to obtain Intermediate 318 (3.4 g, 89.1%).

Synthesis of Intermediate 319

The same procedure as in the synthesis of Intermediate 139 of Intermediate Synthetic Example 34 was performed except for using Intermediate 318 (3.4 g, 5.49 mmol) instead of Intermediate 138 to obtain Intermediate 319 (2.0 g, 74.9%).

Synthesis of Intermediate 320

The same procedure as in the synthesis of Intermediate 140 of Intermediate Synthetic Example 34 was performed except for using Intermediate 319 (2.0 g, 4.11 mmol) instead of Intermediate 139 to obtain Intermediate 320 (2.2 g, 76.1%).

Intermediate Synthetic Example 55: Synthesis of Intermediate 324

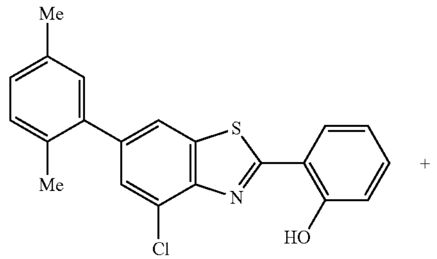

151

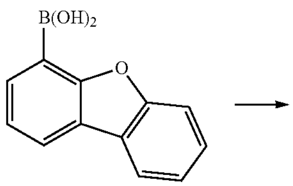

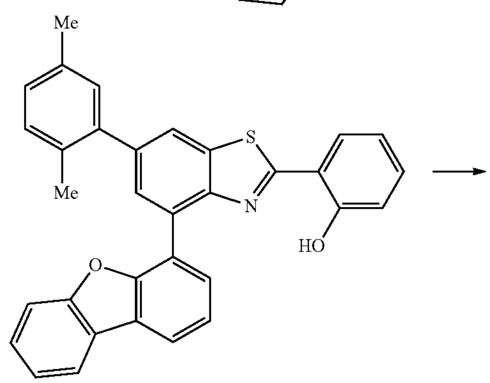

321

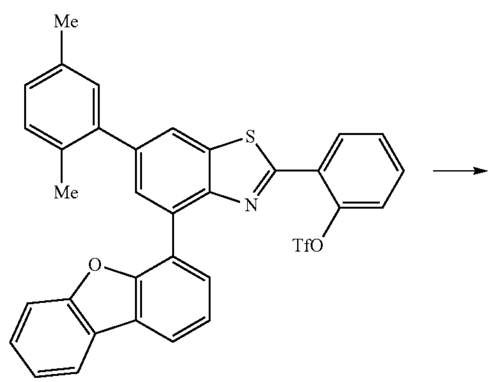

322

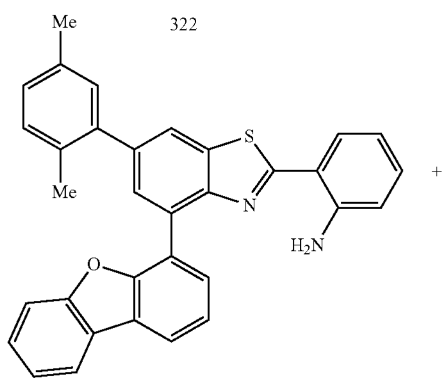

323

-continued

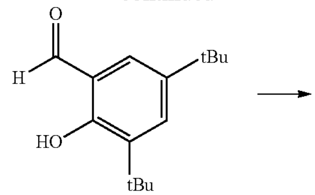

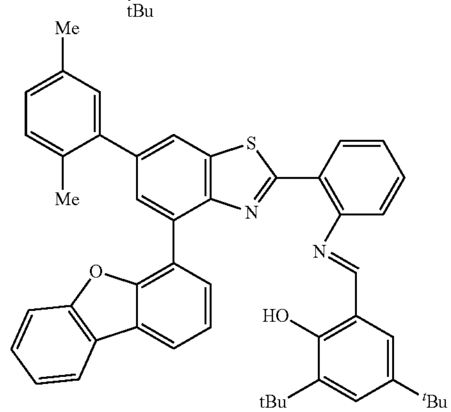

324

Synthesis of Intermediate 321

The same procedure as in the synthesis of Intermediate 137 of Intermediate Synthetic Example 34 was performed except for using Intermediate 151 (2.5 g, 6.83 mmol) instead of Intermediate 136 to obtain Intermediate 321 (3.1 g, 91.1%).

Synthesis of Intermediate 322

The same procedure as in the synthesis of Intermediate 138 of Intermediate Synthetic Example 34 was performed except for using Intermediate 321 (3.1 g, 6.23 mmol) instead of Intermediate 137 to obtain Intermediate 322 (3.4 g, 86.6%).

Synthesis of Intermediate 323

The same procedure as in the synthesis of Intermediate 139 of Intermediate Synthetic Example 34 was performed except for using Intermediate 322 (3.4 g, 5.40 mmol) instead of Intermediate 138 to obtain Intermediate 323 (1.9 g, 70.8%).

Synthesis of Intermediate 324

The same procedure as in the synthesis of Intermediate 140 of Intermediate Synthetic Example 34 was performed except for using Intermediate 323 (1.9 g, 3.83 mmol) instead of Intermediate 139 to obtain Intermediate 324 (2.5 g, 91.6%).

Intermediate Synthetic Example 56: Synthesis of Intermediate 328

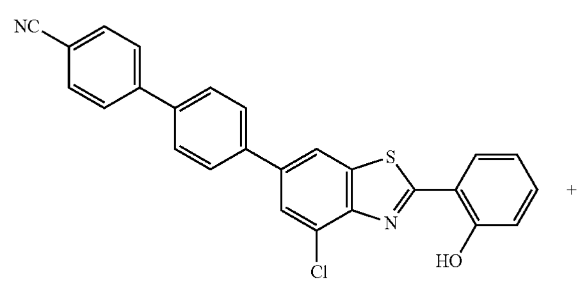

166

-continued

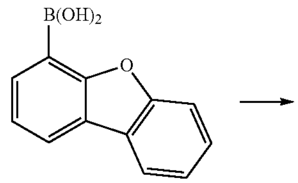

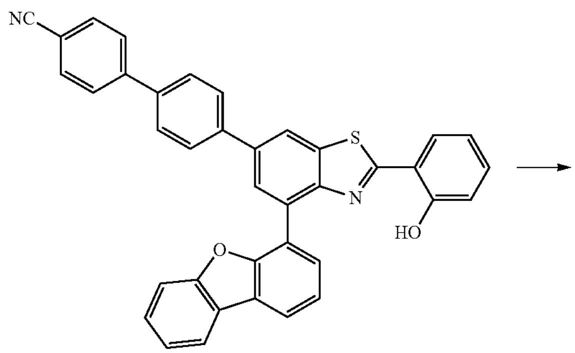

325

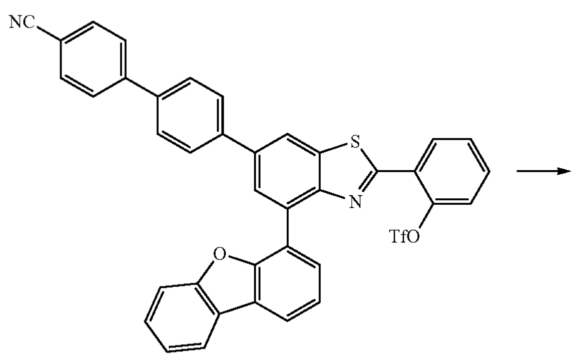

326

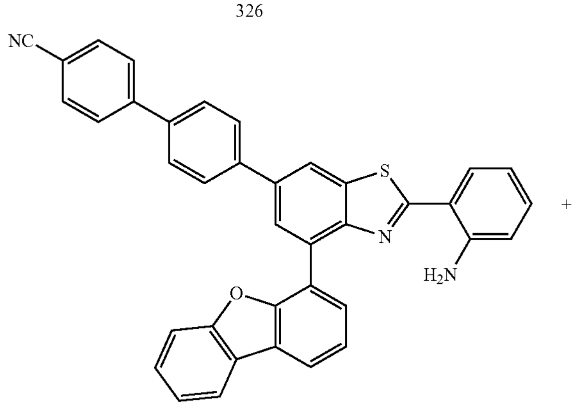

327

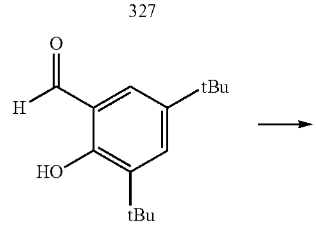

-continued

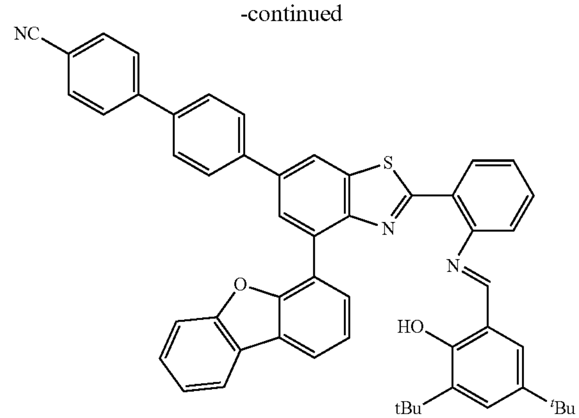

328

Synthesis of Intermediate 325

The same procedure as in the synthesis of Intermediate 137 of Intermediate Synthetic Example 34 was performed except for using Intermediate 166 (2.5 g, 5.70 mmol) instead of Intermediate 136 to obtain Intermediate 325 (3.1 g, 95.3%).

Synthesis of Intermediate 326

The same procedure as in the synthesis of Intermediate 138 of Intermediate Synthetic Example 34 was performed except for using Intermediate 325 (3.1 g, 5.43 mmol) instead of Intermediate 137 to obtain Intermediate 326 (3.4 g, 89.0%).

Synthesis of Intermediate 327

The same procedure as in the synthesis of Intermediate 139 of Intermediate Synthetic Example 34 was performed except for using Intermediate 326 (3.4 g, 4.84 mmol) instead of Intermediate 138 to obtain Intermediate 327 (1.6 g, 58.0%).

Synthesis of Intermediate 328

The same procedure as in the synthesis of Intermediate 140 of Intermediate Synthetic Example 34 was performed except for using Intermediate 327 (1.6 g, 2.81 mmol) instead of Intermediate 139 to obtain Intermediate 328 (2.1 g, 95.1%).

Intermediate Synthetic Example 57: Synthesis of Intermediate 332

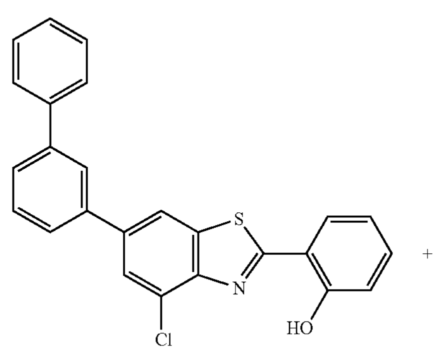

161

-continued

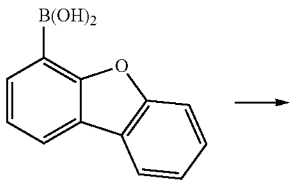

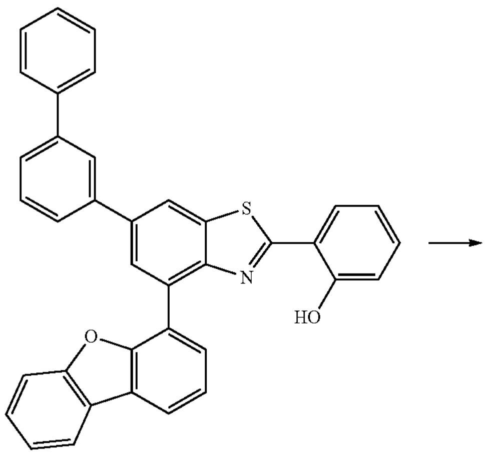

329

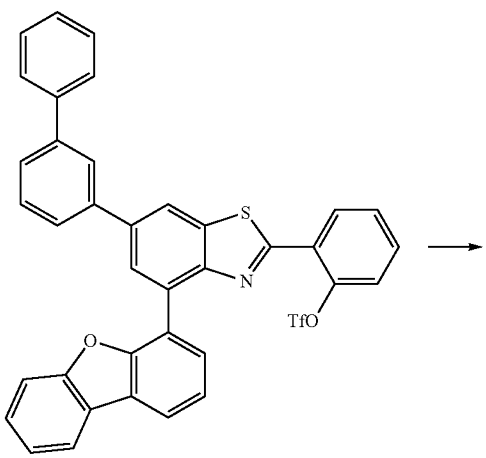

330

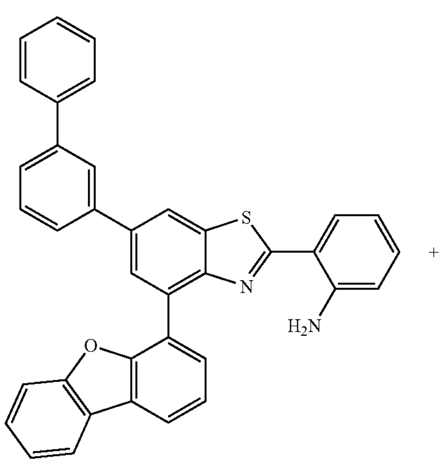

331

-continued

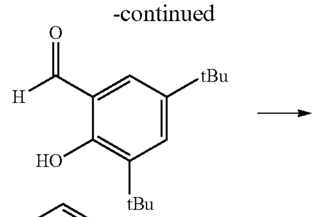

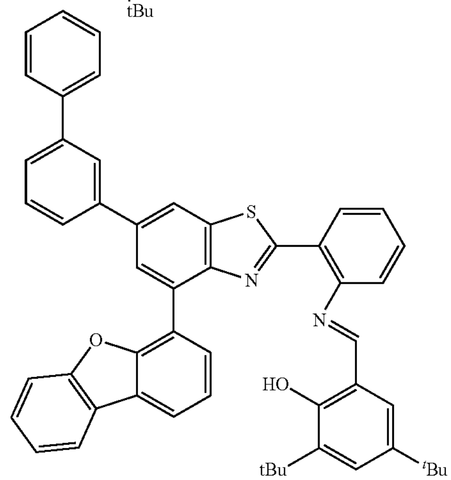

332

Synthesis of Intermediate 329

The same procedure as in the synthesis of Intermediate 137 of Intermediate Synthetic Example 34 was performed except for using Intermediate 161 (2.2 g, 5.32 mmol) instead of Intermediate 136 to obtain Intermediate 329 (2.8 g, 96.5%).

Synthesis of Intermediate 330

The same procedure as in the synthesis of Intermediate 138 of Intermediate Synthetic Example 34 was performed except for using Intermediate 329 (2.8 g, 5.13 mmol) instead of Intermediate 137 to obtain Intermediate 330 (3.2 g, 92.0%).

Synthesis of Intermediate 331

The same procedure as in the synthesis of Intermediate 139 of Intermediate Synthetic Example 34 was performed except for using Intermediate 330 (3.2 g, 4.72 mmol) instead of Intermediate 138 to obtain Intermediate 331 (2.0 g, 77.7%).

Synthesis of Intermediate 332

The same procedure as in the synthesis of Intermediate 140 of Intermediate Synthetic Example 34 was performed except for using Intermediate 331 (2.0 g, 3.67 mmol) instead of Intermediate 139 to obtain Intermediate 332 (2.3 g, 82.3%).

Intermediate Synthetic Example 58: Synthesis of Intermediate 336

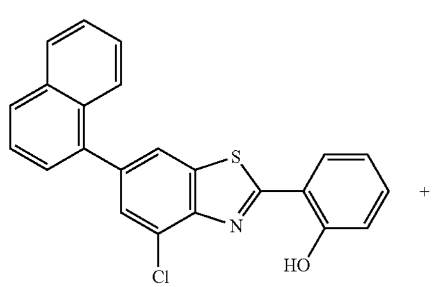

156

-continued

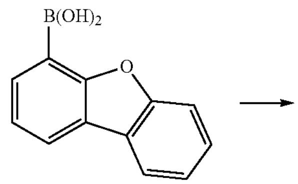

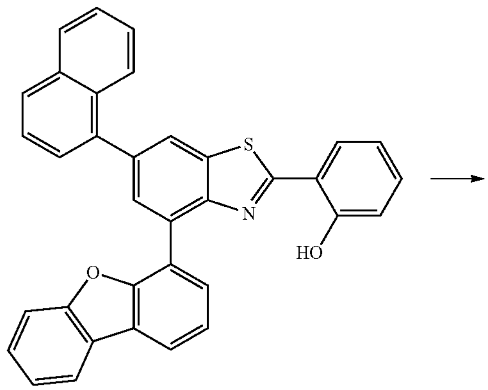

333

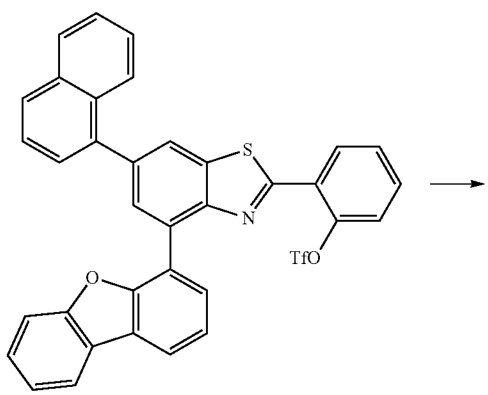

334

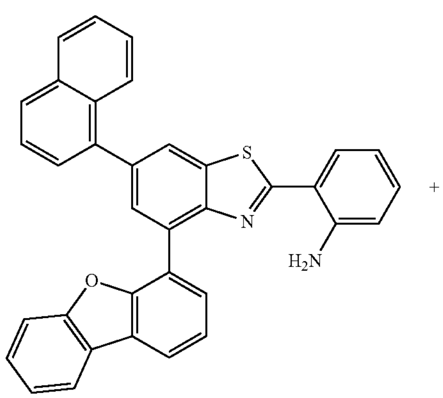

335

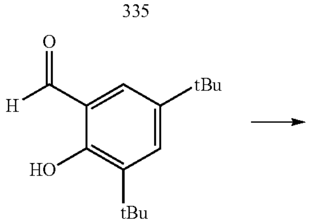

-continued

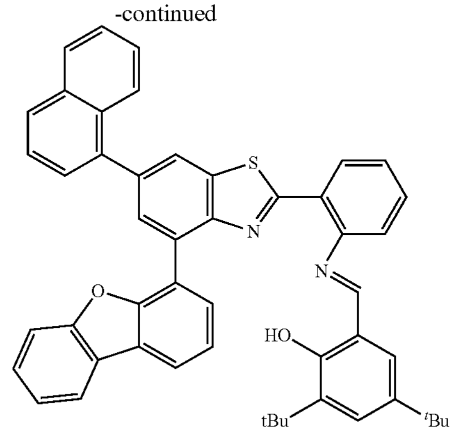

336

Synthesis of Intermediate 333

The same procedure as in the synthesis of Intermediate 137 of Intermediate Synthetic Example 34 was performed except for using Intermediate 156 (2.5 g, 6.45 mmol) instead of Intermediate 136 to obtain Intermediate 333 (2.9 g, 86.5%).

Synthesis of Intermediate 334

The same procedure as in the synthesis of Intermediate 138 of Intermediate Synthetic Example 34 was performed except for using Intermediate 333 (2.9 g, 5.58 mmol) instead of Intermediate 137 to obtain Intermediate 334 (3.4 g, 93.4%).

Synthesis of Intermediate 335

The same procedure as in the synthesis of Intermediate 139 of Intermediate Synthetic Example 34 was performed except for using Intermediate 334 (3.4 g, 5.22 mmol) instead of Intermediate 138 to obtain Intermediate 335 (1.9 g, 70.2%).

Synthesis of Intermediate 336

The same procedure as in the synthesis of Intermediate 140 of Intermediate Synthetic Example 34 was performed except for using Intermediate 335 (1.9 g, 3.66 mmol) instead of Intermediate 139 to obtain Intermediate 336 (2.3 g, 85.4%).

Intermediate Synthetic Example 59: Synthesis of Intermediate 340

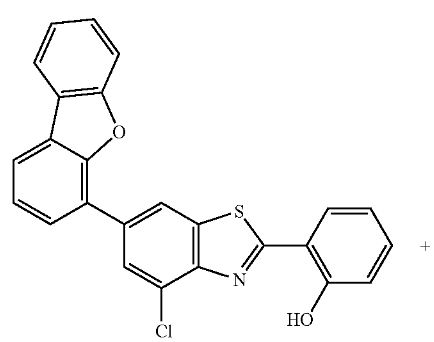

171

-continued

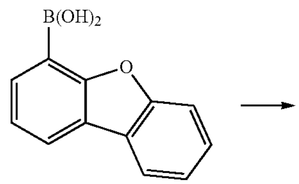

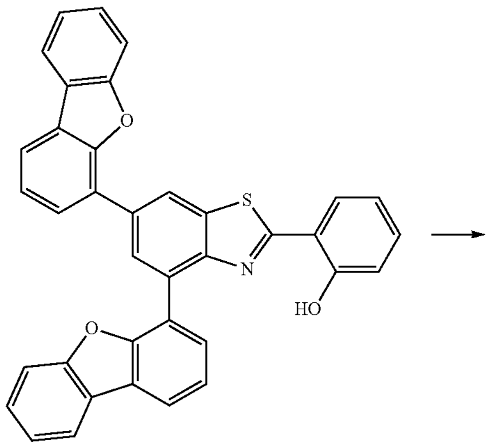

337

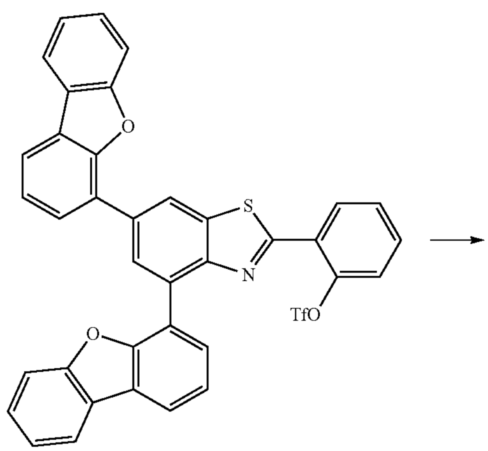

338

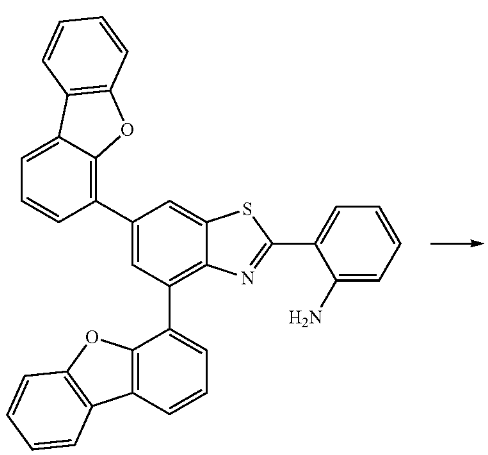

339

-continued

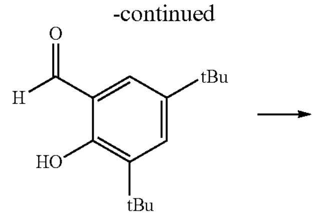

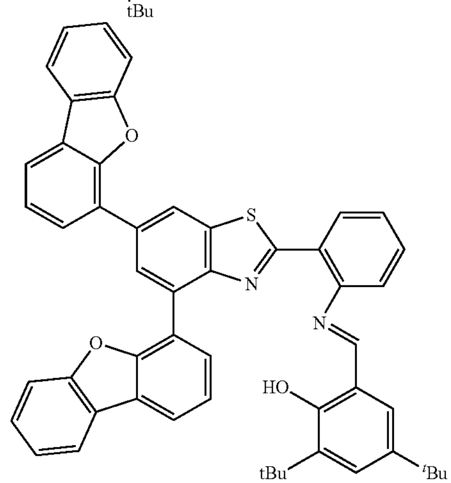

340

Synthesis of Intermediate 337

The same procedure as in the synthesis of Intermediate 137 of Intermediate Synthetic Example 34 was performed except for using Intermediate 171 (2.5 g, 5.84 mmol) instead of Intermediate 136 to obtain Intermediate 337 (3.0 g, 91.7%).

Synthesis of Intermediate 338

The same procedure as in the synthesis of Intermediate 138 of Intermediate Synthetic Example 34 was performed except for using Intermediate 337 (3.0 g, 5.36 mmol) instead of Intermediate 137 to obtain Intermediate 338 (3.5 g, 94.3%).

Synthesis of Intermediate 339

The same procedure as in the synthesis of Intermediate 139 of Intermediate Synthetic Example 34 was performed except for using Intermediate 338 (3.5 g, 5.06 mmol) instead of Intermediate 138 to obtain Intermediate 339 (2.0 g, 70.7%).

Synthesis of Intermediate 340

The same procedure as in the synthesis of Intermediate 140 of Intermediate Synthetic Example 34 was performed except for using Intermediate 339 (2.0 g, 3.58 mmol) instead of Intermediate 139 to obtain Intermediate 340 (2.5 g, 90.1%).

Intermediate Synthetic Example 60: Synthesis of Intermediate 344

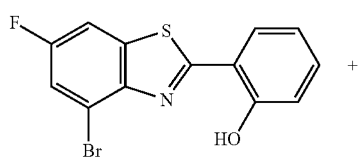

308

-continued

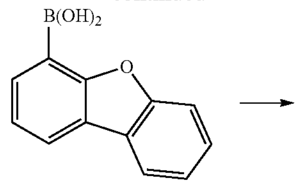

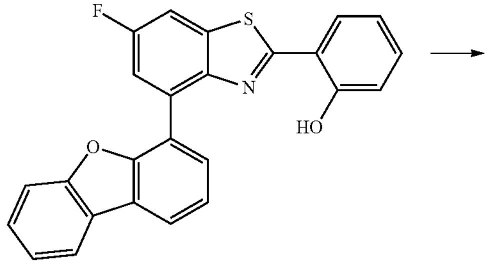

341

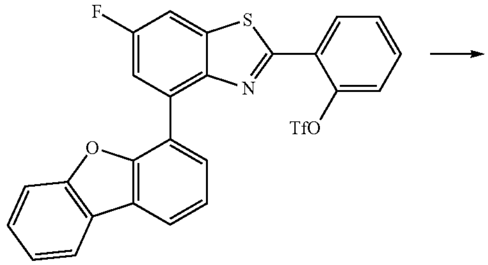

342

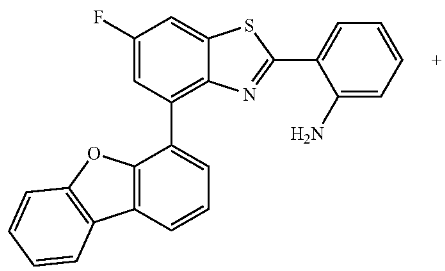

343

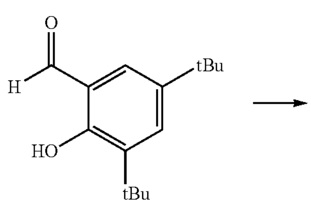

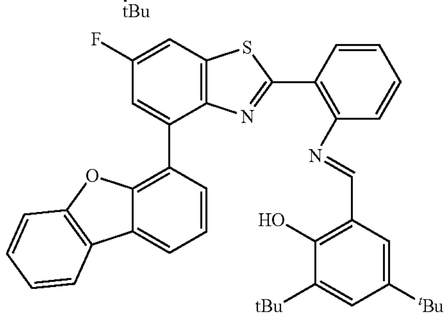

344

Synthesis of Intermediate 341

The same procedure as in the synthesis of Intermediate 137 of Intermediate Synthetic Example 34 was performed except for using Intermediate 308 (3.0 g, 9.25 mmol) instead of Intermediate 136 to obtain Intermediate 341 (3.6 g, 94.5%).

Synthesis of Intermediate 342

The same procedure as in the synthesis of Intermediate 138 of Intermediate Synthetic Example 34 was performed except for using Intermediate 341 (3.6 g, 8.75 mmol) instead of Intermediate 137 to obtain Intermediate 342 (4.2 g, 88.3%).

Synthesis of Intermediate 343

The same procedure as in the synthesis of Intermediate 139 of Intermediate Synthetic Example 34 was performed except for using Intermediate 342 (4.2 g, 7.73 mmol) instead of Intermediate 138 to obtain Intermediate 343 (1.5 g, 47.2%).

Synthesis of Intermediate 344

The same procedure as in the synthesis of Intermediate 140 of Intermediate Synthetic Example 34 was performed except for using Intermediate 343 (1.5 g, 3.65 mmol) instead of Intermediate 139 to obtain Intermediate 343 (2.0 g, 87.3%).

Intermediate Synthetic Example 61: Synthesis of Intermediate 348

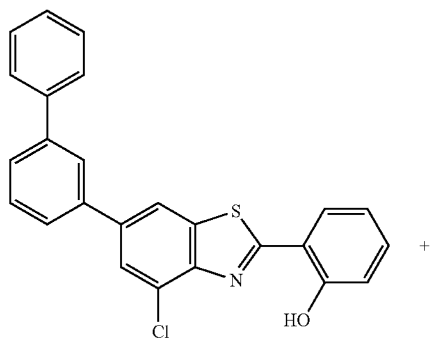

161

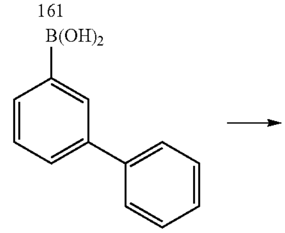

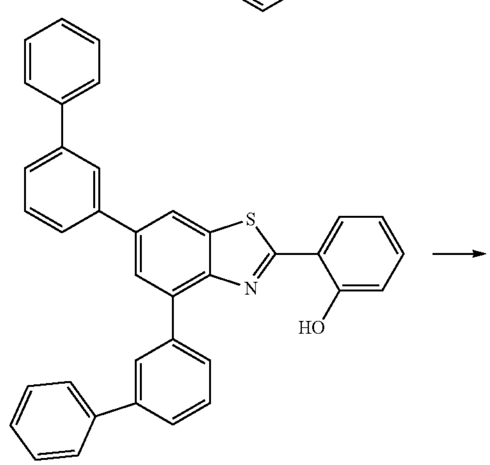

345

-continued

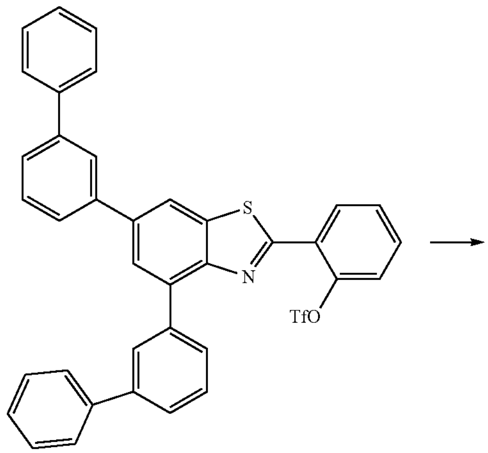

346

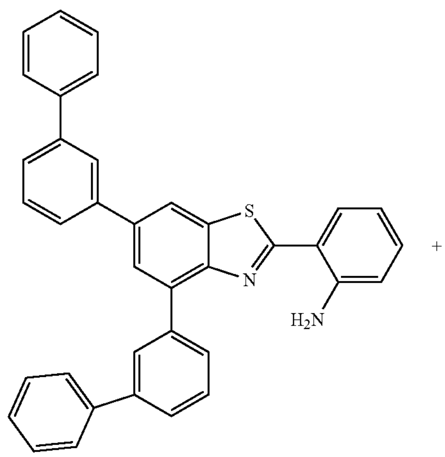

347

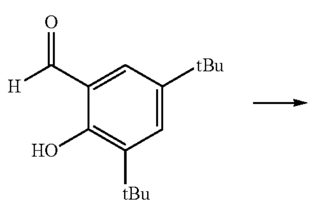

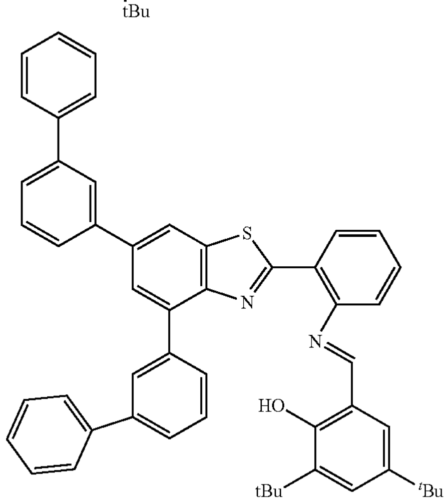

348

Synthesis of Intermediate 345

The same procedure as in the synthesis of Intermediate 137 of Intermediate Synthetic Example 34 was performed except for using Intermediate 161 (2.5 g, 6.04 mmol) instead of Intermediate 136 to obtain Intermediate 345 (2.9 g, 90.3%).

Synthesis of Intermediate 346

The same procedure as in the synthesis of Intermediate 138 of Intermediate Synthetic Example 34 was performed except for using Intermediate 345 (2.9 g, 5.45 mmol) instead of Intermediate 137 to obtain Intermediate 346 (3.1 g, 85.6%).

Synthesis of Intermediate 347

The same procedure as in the synthesis of Intermediate 139 of Intermediate Synthetic Example 34 was performed except for using Intermediate 346 (3.1 g, 4.67 mmol) instead of Intermediate 138 to obtain Intermediate 347 (1.8 g, 72.6%).

Synthesis of Intermediate 348

The same procedure as in the synthesis of Intermediate 140 of Intermediate Synthetic Example 34 was performed except for using Intermediate 347 (1.8 g, 3.39 mmol) instead of Intermediate 139 to obtain Intermediate 348 (1.9 g, 74.9%).

Intermediate Synthetic Example 62: Synthesis of Intermediate 352

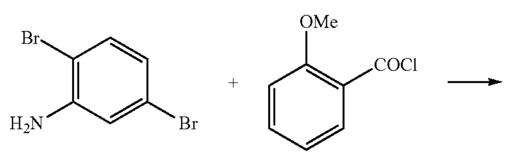

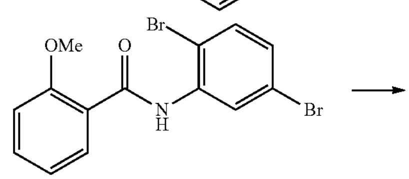

349

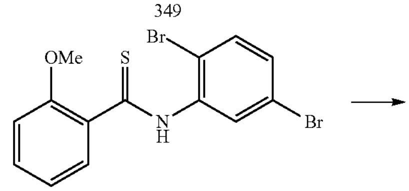

350

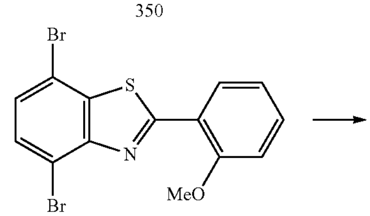

351

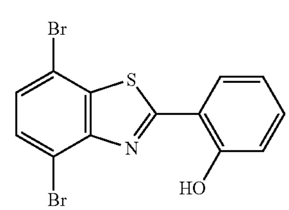

352

Synthesis of Intermediate 349

The same procedure as in the synthesis of Intermediate 1 of Intermediate Synthetic Example 1 was performed except for using 2,5-dibromoaniline (50.0 g, 199.27 mmol) instead of 2,6-dibromoaniline to obtain Intermediate 349 (69.0 g, 89.9%).

Synthesis of Intermediate 351

The same procedure as in the synthesis of Intermediate 26 of Intermediate Synthetic Example 7 was performed except for using Intermediate 349 (69.0 g, 179.20 mmol) instead of Intermediate 24 to obtain Intermediate 351 (35.4 g, 49.2%).

Synthesis of Intermediate 352

The same procedure as in the synthesis of Intermediate 45 of Intermediate Synthetic Example 12 was performed except for using Intermediate 351 (35.4 g, 88.7 mmol) instead of Intermediate 44 to obtain Intermediate 352 (30.3 g, 88.7%).

Intermediate Synthetic Example 63: Synthesis of Intermediate 356

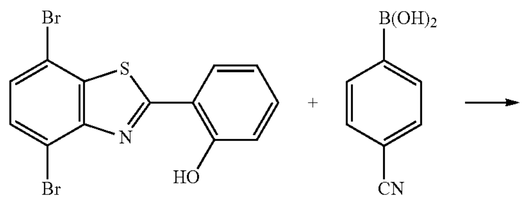

352

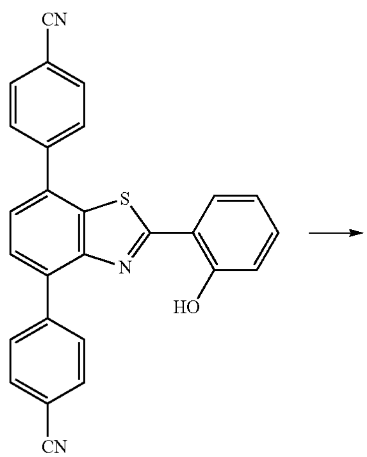

353

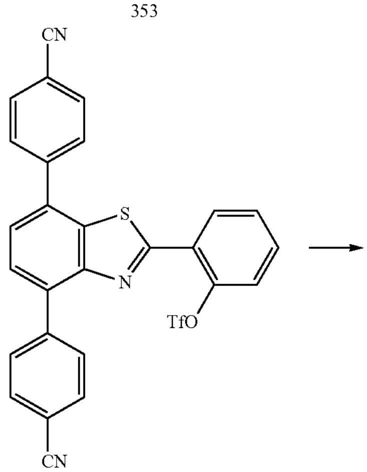

354

-continued

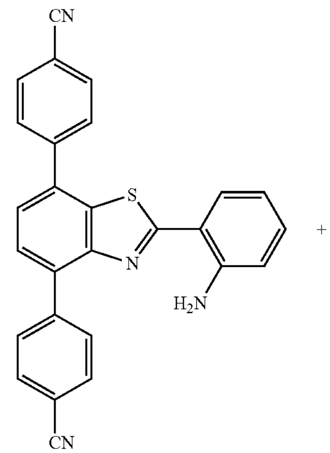

355

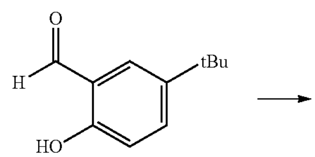

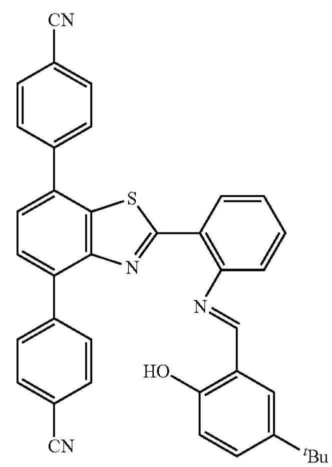

356

Synthesis of Intermediate 353

In a one-neck 250 ml flask, 2.0 g (5.19 mmol) of Intermediate 352, 1.6 g (11.43 mmol) of 4-cyanophenylboronic acid, 299 mg (0.25 mmol) of $Pd(PPh_3)_4$, 29 ml of toluene, 15 ml of EtOH and 8 ml (15.5 mmol) of 2 M $K_2CO_3$ were mixed and then, refluxed. After finishing the reaction, the reaction product was cooled to room temperature and then, the solid thus obtained was filtered with methanol. The solid was dissolved in chloroform and separated by silica gel column chromatography ($EA:CHCl_3$). Solvents were removed and the resultant product was solidified with methanol and filtered to obtain 2.0 g (yield: 89.6%) of Intermediate 353.

Synthesis of Intermediate 354

The same procedure as in the synthesis of Intermediate 138 of Intermediate Synthetic Example 34 was performed except for using Intermediate 353 (2.0 g, 4.66 mmol) instead of Intermediate 137 to obtain Intermediate 354 (2.5 g, 95.6%).

Synthesis of Intermediate 355

The same procedure as in the synthesis of Intermediate 139 of Intermediate Synthetic Example 34 was performed except for using Intermediate 354 (2.5 g, 4.45 mmol) instead of Intermediate 138 to obtain Intermediate 355 (1.5 g, 78.6%).

Synthesis of Intermediate 356

The same procedure as in the synthesis of Intermediate 140 of Intermediate Synthetic Example 34 was performed except for using Intermediate 355 (1.5 g, 3.50 mmol) instead of Intermediate 139 to obtain Intermediate 356 (2.0 g, 97.0%).

Intermediate Synthetic Example 64: Synthesis of Intermediate 360

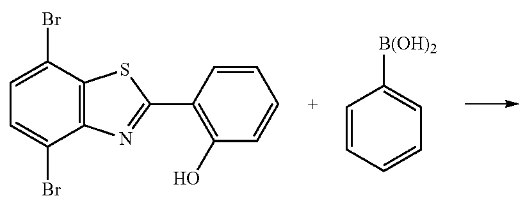

352

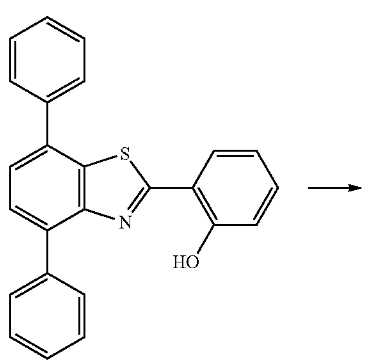

357

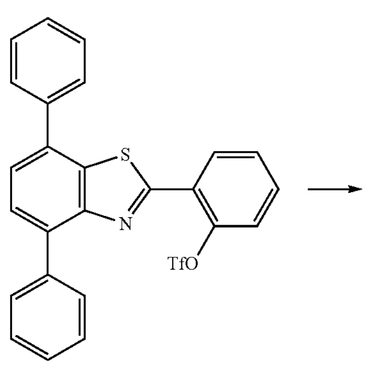

358

-continued

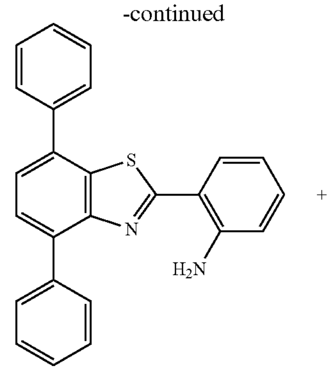

359

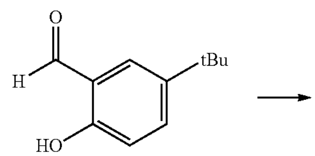

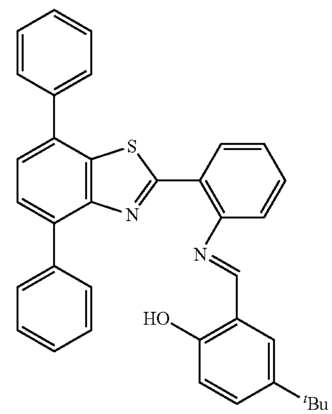

360

Synthesis of Intermediate 357

The same procedure as in the synthesis of Intermediate 353 of Intermediate Synthetic Example 63 was performed except for using phenylboronic acid (1.3 g, 11.43 mmol) instead of 4-cyanophenylboronic acid with Intermediate 352 (2.0 g, 5.19 mmol) to obtain Intermediate 357 (1.9 g, 96.4%).

Synthesis of Intermediate 358

The same procedure as in the synthesis of Intermediate 138 of Intermediate Synthetic Example 34 was performed except for using Intermediate 357 (1.9 g, 5.01 mmol) instead of Intermediate 137 to obtain Intermediate 358 (2.4 g, 93.7%).

Synthesis of Intermediate 359

The same procedure as in the synthesis of Intermediate 139 of Intermediate Synthetic Example 34 was performed except for using Intermediate 358 (2.4 g, 4.69 mmol) instead of Intermediate 138 to obtain Intermediate 359 (1.3 g, 73.2%).

Synthesis of Intermediate 360

The same procedure as in the synthesis of Intermediate 140 of Intermediate Synthetic Example 34 was performed except for using Intermediate 359 (1.3 g, 3.43 mmol) instead of Intermediate 139 to obtain Intermediate 360 (1.7 g, 91.8%).

Intermediate Synthetic Example 65: Synthesis of Intermediate 364

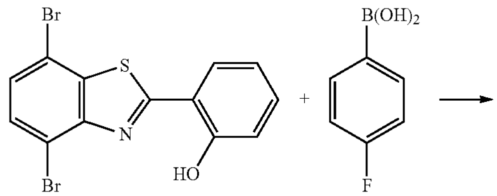

352

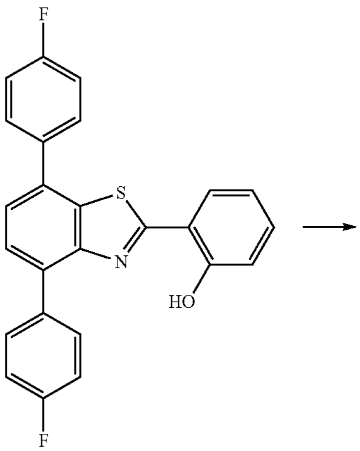

361

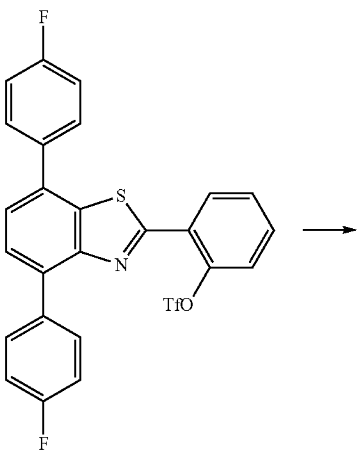

362

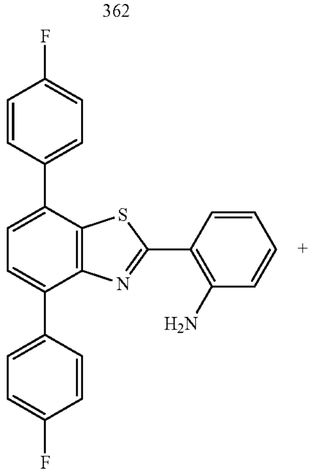

363

-continued

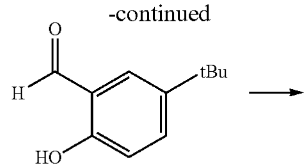

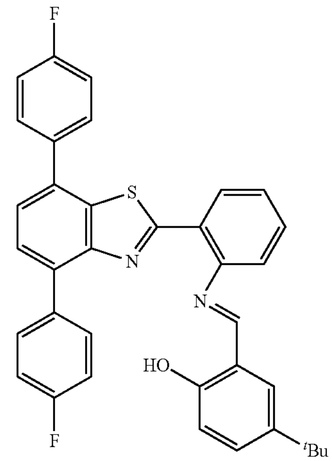

364

Synthesis of Intermediate 361

The same procedure as in the synthesis of Intermediate 353 of Intermediate Synthetic Example 63 was performed except for using 4-fluorophenylboronic acid (1.6 g, 11.43 mmol) instead of 4-cyanophenylboronic acid with Intermediate 352 (2.0 g, 5.19 mmol) to obtain Intermediate 361 (2.1 g, 97.3%).

Synthesis of Intermediate 362

The same procedure as in the synthesis of Intermediate 138 of Intermediate Synthetic Example 34 was performed except for using Intermediate 361 (2.1 g, 5.05 mmol) instead of Intermediate 137 to obtain Intermediate 362 (2.6 g, 93.9%).

Synthesis of Intermediate 363

The same procedure as in the synthesis of Intermediate 139 of Intermediate Synthetic Example 34 was performed except for using Intermediate 362 (2.6 g, 4.75 mmol) instead of Intermediate 138 to obtain Intermediate 363 (1.1 g, 55.8%).

Synthesis of Intermediate 364

The same procedure as in the synthesis of Intermediate 140 of Intermediate Synthetic Example 34 was performed except for using Intermediate 363 (1.1 g, 2.65 mmol) instead of Intermediate 139 to obtain Intermediate 364 (1.5 g, 98.3%).

Intermediate Synthetic Example 66: Synthesis of Intermediate 368

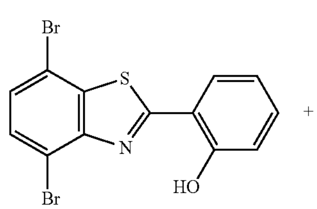

352

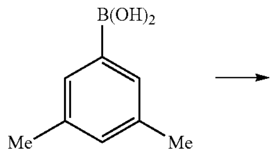

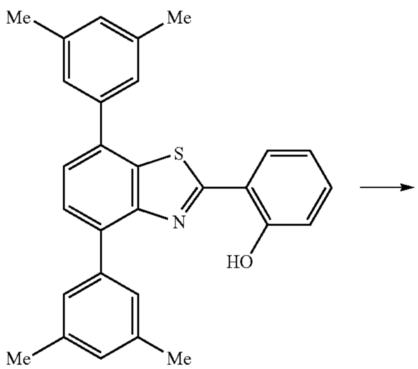

365

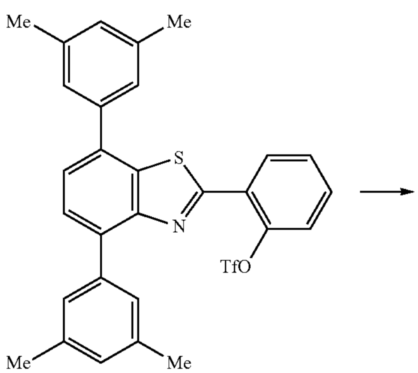

366

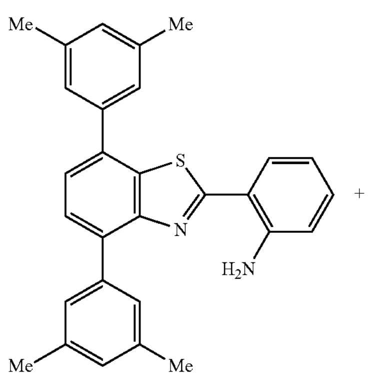

367

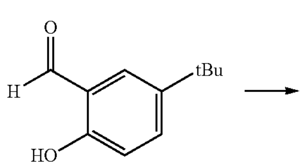

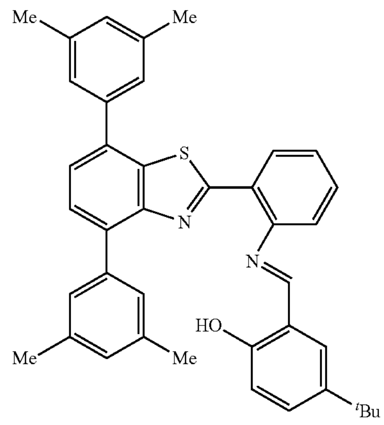

368

Synthesis of Intermediate 365

The same procedure as in the synthesis of Intermediate 353 of Intermediate Synthetic Example 63 was performed except for using 3,5-dimethylphenylboronic acid (1.7 g, 11.43 mmol) instead of 4-cyanophenylboronic acid with Intermediate 352 (2.0 g, 5.19 mmol) to obtain Intermediate 365 (2.0 g, 88.4%).

Synthesis of Intermediate 366

The same procedure as in the synthesis of Intermediate 138 of Intermediate Synthetic Example 34 was performed except for using Intermediate 365 (2.0 g, 4.59 mmol) instead of Intermediate 137 to obtain Intermediate 366 (2.5 g, 95.2%).

Synthesis of Intermediate 367

The same procedure as in the synthesis of Intermediate 139 of Intermediate Synthetic Example 34 was performed except for using Intermediate 366 (2.5 g, 4.40 mmol) instead of Intermediate 138 to obtain Intermediate 367 (1.4 g, 73.1%).

Synthesis of Intermediate 368

The same procedure as in the synthesis of Intermediate 140 of Intermediate Synthetic Example 34 was performed except for using Intermediate 367 (1.4 g, 3.22 mmol) instead of Intermediate 139 to obtain Intermediate 368 (1.8 g, 93.9%).

Intermediate Synthetic Example 67: Synthesis of Intermediate 372

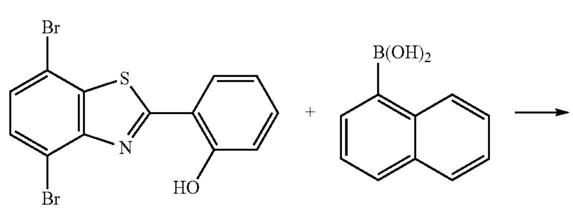

352

-continued

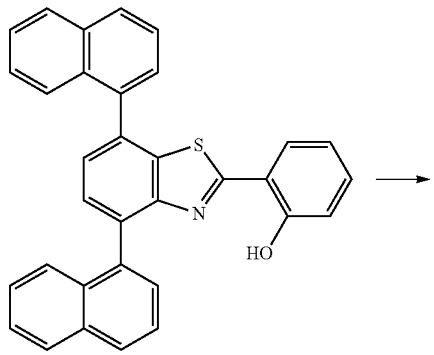

369

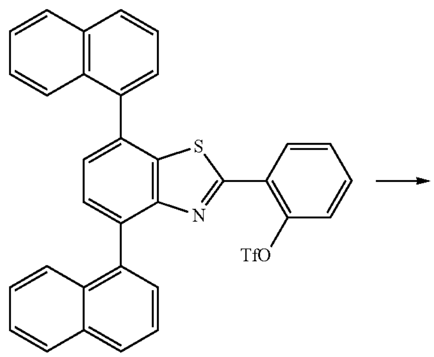

370

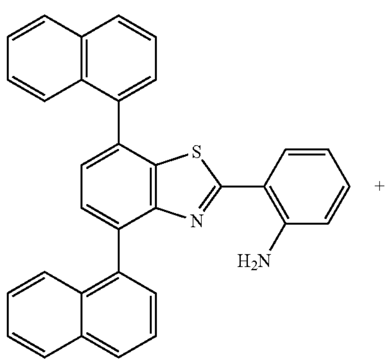

371

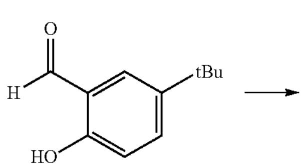

-continued

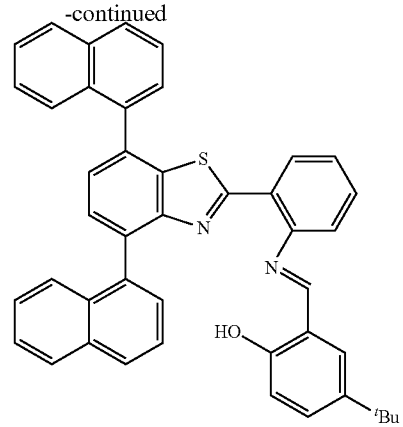

372

Synthesis of Intermediate 369

The same procedure as in the synthesis of Intermediate 353 of Intermediate Synthetic Example 63 was performed except for using 1-naphthylboronic acid (1.9 g, 11.43 mmol) instead of 4-cyanophenylboronicc acid with Intermediate 352 (2.0 g, 5.19 mmol) to obtain Intermediate 369 (2.3 g, 92.3%).

Synthesis of Intermediate 370

The same procedure as in the synthesis of Intermediate 138 of Intermediate Synthetic Example 34 was performed except for using Intermediate 369 (2.3 g, 4.80 mmol) instead of Intermediate 137 to obtain Intermediate 370 (2.8 g, 95.4%).

Synthesis of Intermediate 371

The same procedure as in the synthesis of Intermediate 139 of Intermediate Synthetic Example 34 was performed except for using Intermediate 370 (2.8 g, 4.58 mmol) instead of Intermediate 138 to obtain Intermediate 371 (1.6 g, 73.0%).

Synthesis of Intermediate 372

The same procedure as in the synthesis of Intermediate 140 of Intermediate Synthetic Example 34 was performed except for using Intermediate 371 (1.6 g, 3.34 mmol) instead of Intermediate 139 to obtain Intermediate 372 (2.0 g, 93.6%).

Intermediate Synthetic Example 68: Synthesis of Intermediate 373

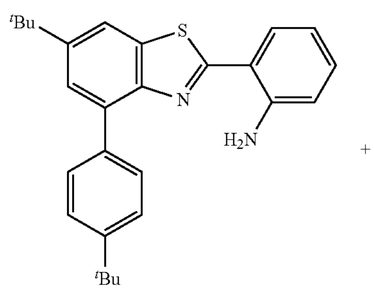

56

-continued

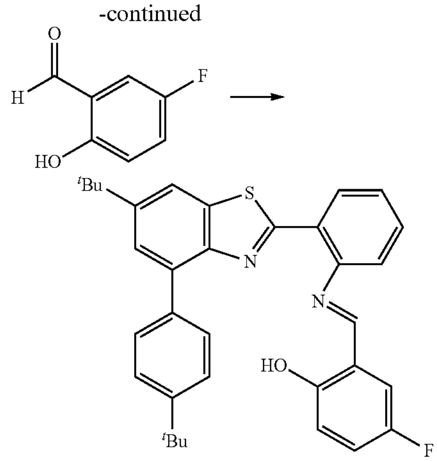

373

Synthesis of Intermediate 373

The same procedure as in the synthesis of Intermediate 140 of Intermediate Synthetic Example 34 was performed except for using Intermediate 56 (2.0 g, 4.82 mmol) instead of Intermediate 139 to obtain Intermediate 373 (1.6 g, 61.0%).

Intermediate Synthetic Example 69: Synthesis of Intermediate 374

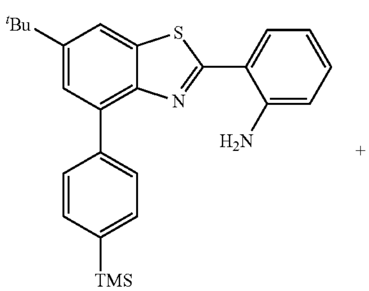

52

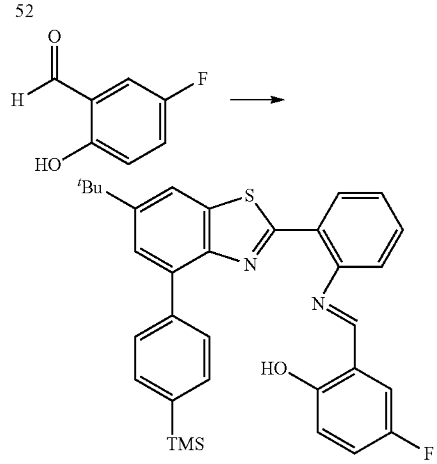

374

Synthesis of Intermediate 374

The same procedure as in the synthesis of Intermediate 140 of Intermediate Synthetic Example 34 was performed except for using Intermediate 52 (2.0 g, 4.64 mmol) instead of Intermediate 139 to obtain Intermediate 374 (1.9 g, 74.0%).

Intermediate Synthetic Example 70: Synthesis of Intermediate 375

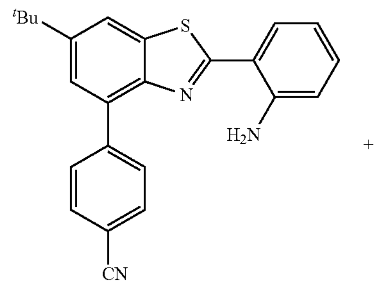

60

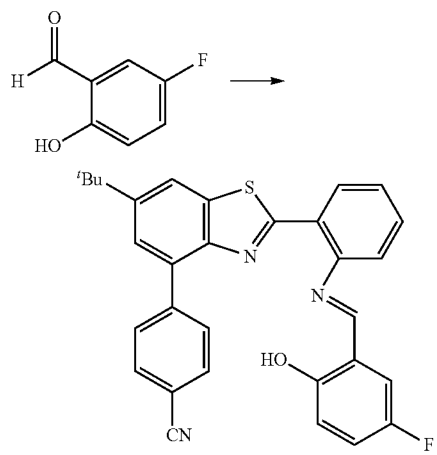

375

Synthesis of Intermediate 375

The same procedure as in the synthesis of Intermediate 140 of Intermediate Synthetic Example 34 was performed except for using Intermediate 60 (2.0 g, 5.22 mmol) instead of Intermediate 139 to obtain Intermediate 375 (2.1 g, 79.6%).

Intermediate Synthetic Example 71: Synthesis of Intermediate 376

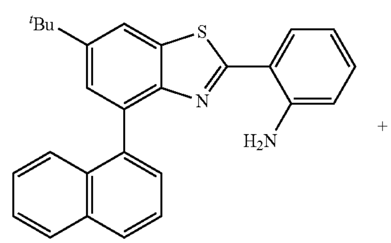

108

-continued

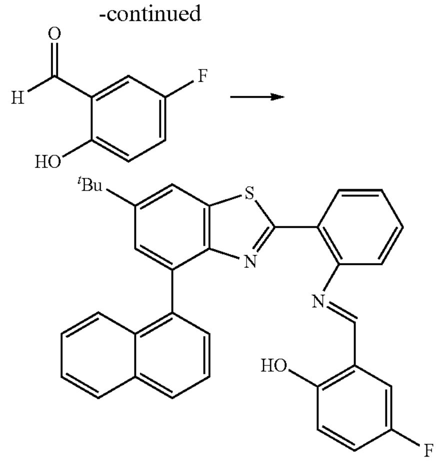

376

Synthesis of Intermediate 376

The same procedure as in the synthesis of Intermediate 140 of Intermediate Synthetic Example 34 was performed except for using Intermediate 108 (2.0 g, 4.90 mmol) instead of Intermediate 139 to obtain Intermediate 376 (2.0 g, 76.8%).

Intermediate Synthetic Example 72: Synthesis of Intermediate 377

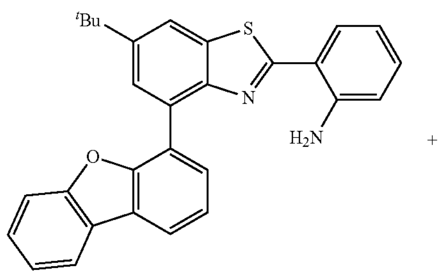

104

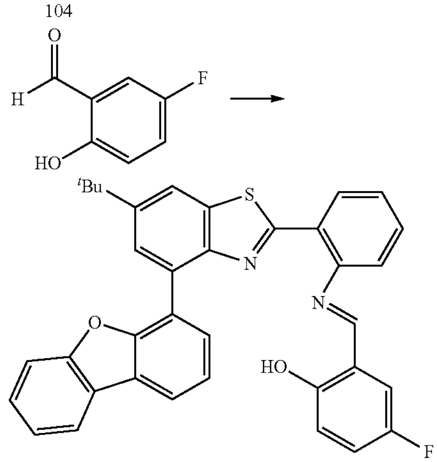

377

Synthesis of Intermediate 377

The same procedure as in the synthesis of Intermediate 140 of Intermediate Synthetic Example 34 was performed except for using Intermediate 104 (2.0 g, 4.46 mmol) instead of Intermediate 139 to obtain Intermediate 377 (1.9 g, 74.6%).

Intermediate Synthetic Example 73: Synthesis of Intermediate 378

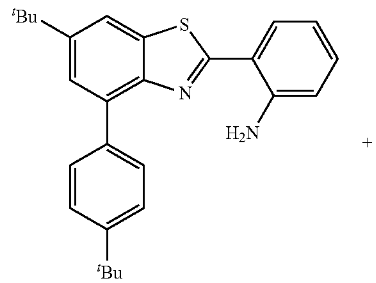

56

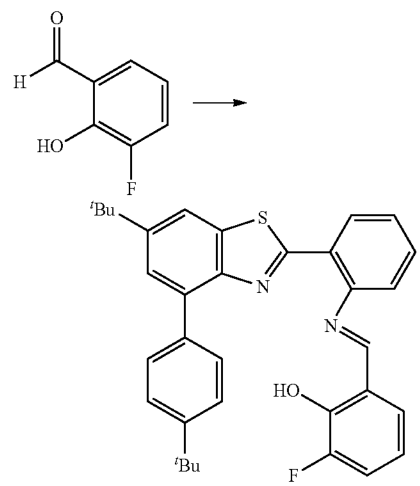

378

Synthesis of Intermediate 378

The same procedure as in the synthesis of Intermediate 140 of Intermediate Synthetic Example 34 was performed except for using Intermediate 56 (2.0 g, 4.82 mmol) instead of Intermediate 139 to obtain Intermediate 378 (2.0 g, 77.2%).

Intermediate Synthetic Example 74: Synthesis of Intermediate 379

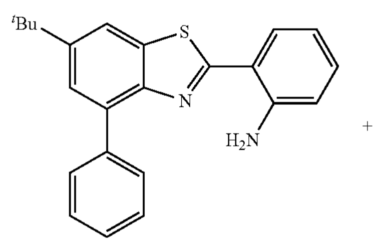

48

-continued

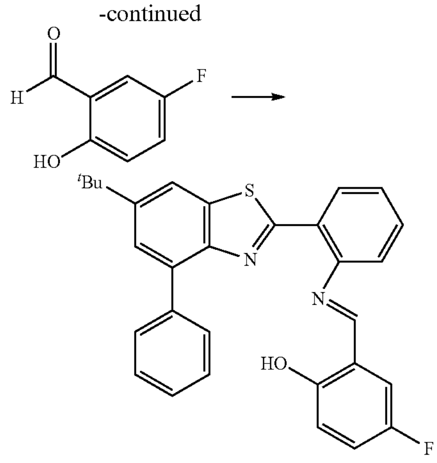

379

Synthesis of Intermediate 379

The same procedure as in the synthesis of Intermediate 140 of Intermediate Synthetic Example 34 was performed except for using Intermediate 48 (2.0 g, 5.58 mmol) instead of Intermediate 139 to obtain Intermediate 379 (2.1 g, 78.3%).

Intermediate Synthetic Example 75: Synthesis of Intermediate 380

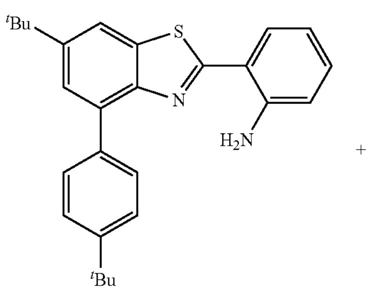

56

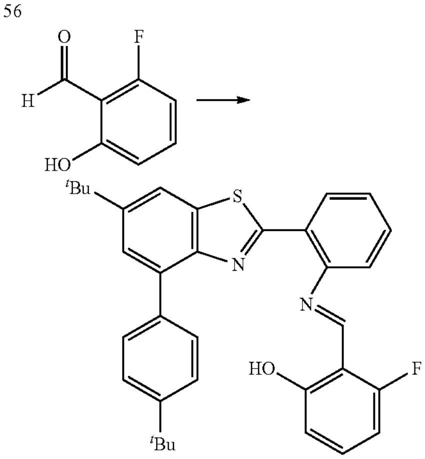

380

Synthesis of Intermediate 380

The same procedure as in the synthesis of Intermediate 140 of Intermediate Synthetic Example 34 was performed except for using Intermediate 56 (2.0 g, 4.82 mmol) instead of Intermediate 139 to obtain Intermediate 380 (1.8 g, 69.5%).

Intermediate Synthetic Example 76: Synthesis of Intermediate 381

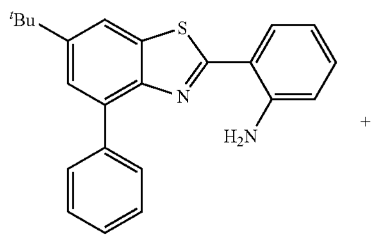

48

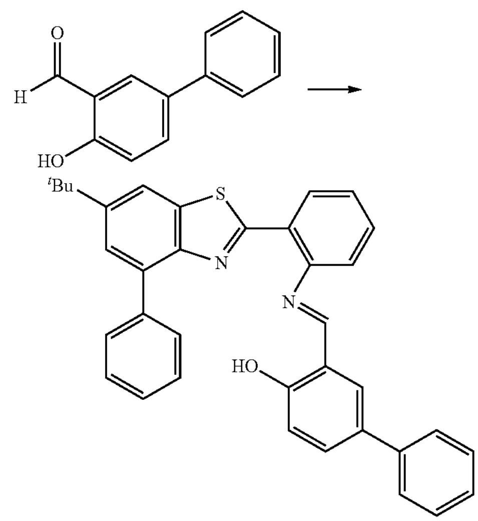

381

Synthesis of Intermediate 381

The same procedure as in the synthesis of Intermediate 140 of Intermediate Synthetic Example 34 was performed except for using Intermediate 48 (2.0 g, 5.58 mmol) instead of Intermediate 139 to obtain Intermediate 381 (2.6 g, 86.5%).

Intermediate Synthetic Example 77: Synthesis of Intermediate 382

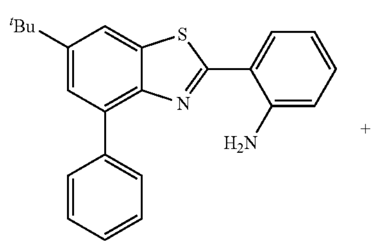

48

-continued

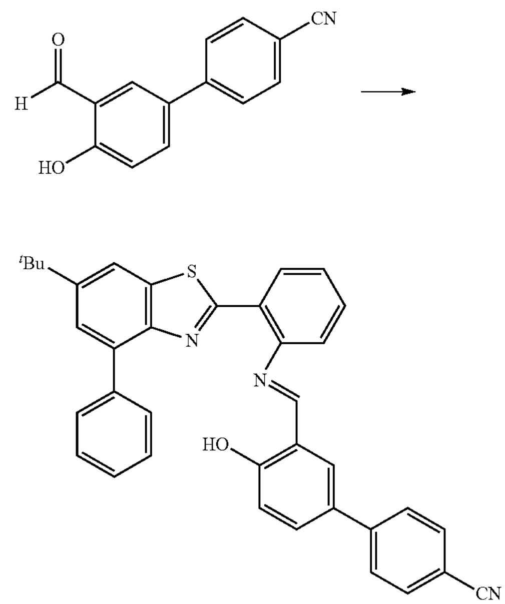

382

Synthesis of Intermediate 382

The same procedure as in the synthesis of Intermediate 140 of Intermediate Synthetic Example 34 was performed except for using Intermediate 48 (2.0 g, 5.58 mmol) instead of Intermediate 139 to obtain Intermediate 382 (2.8 g, 89.0%).

Intermediate Synthetic Example 78: Synthesis of Intermediate 383

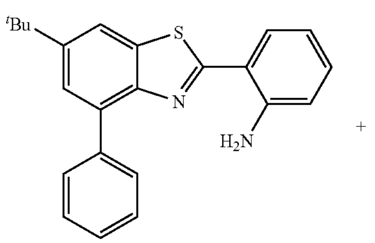

48

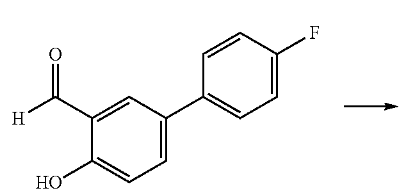

-continued

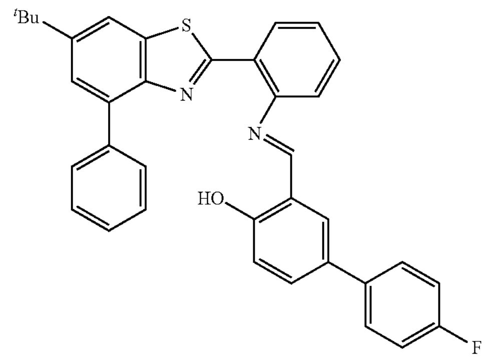

383

Synthesis of Intermediate 383

The same procedure as in the synthesis of Intermediate 140 of Intermediate Synthetic Example 34 was performed except for using Intermediate 48 (2.0 g, 5.58 mmol) instead of Intermediate 139 to obtain Intermediate 383 (2.0 g, 64.4%).

Intermediate Synthetic Example 79: Synthesis of Intermediate 384

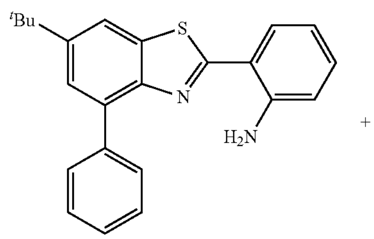

48

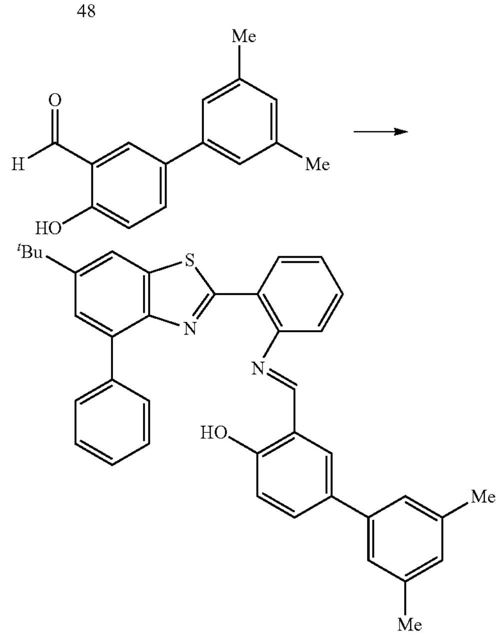

384

Synthesis of Intermediate 384

The same procedure as in the synthesis of Intermediate 140 of Intermediate Synthetic Example 34 was performed except for using Intermediate 48 (2.0 g, 5.58 mmol) instead of Intermediate 139 to obtain Intermediate 384 (2.9 g, 91.7%).

Intermediate Synthetic Example 80: Synthesis of Intermediate 385

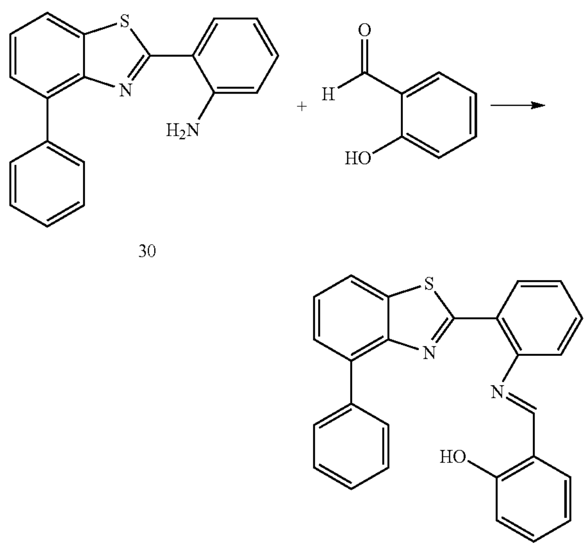

30

385

Synthesis of Intermediate 385

The same procedure as in the synthesis of Intermediate 140 of Intermediate Synthetic Example 34 was performed except for using Intermediate 30 (2.0 g, 6.61 mmol) instead of Intermediate 139 to obtain Intermediate 385 (2.5 g, 92.90%).

Intermediate Synthetic Example 81: Synthesis of Intermediate 386

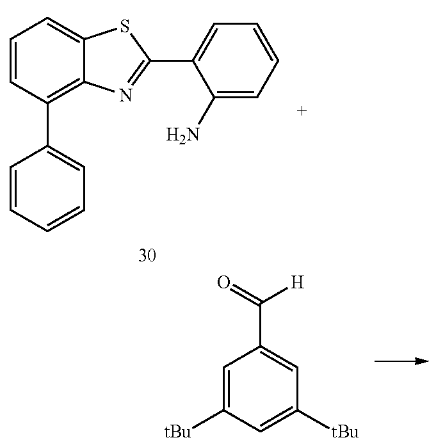

30

-continued

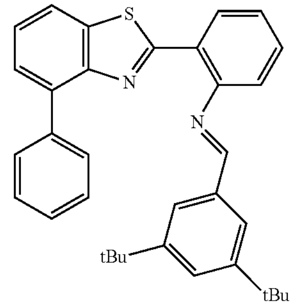

386

Synthesis of Intermediate 386

The same procedure as in the synthesis of Intermediate 140 of Intermediate Synthetic Example 34 was performed except for using Intermediate 30 (4.0 g, 13.23 mmol) instead of Intermediate 139 to obtain Intermediate 386 (4.2 g, 63.1%).

Intermediate Synthetic Example 82: Synthesis of Intermediate 391

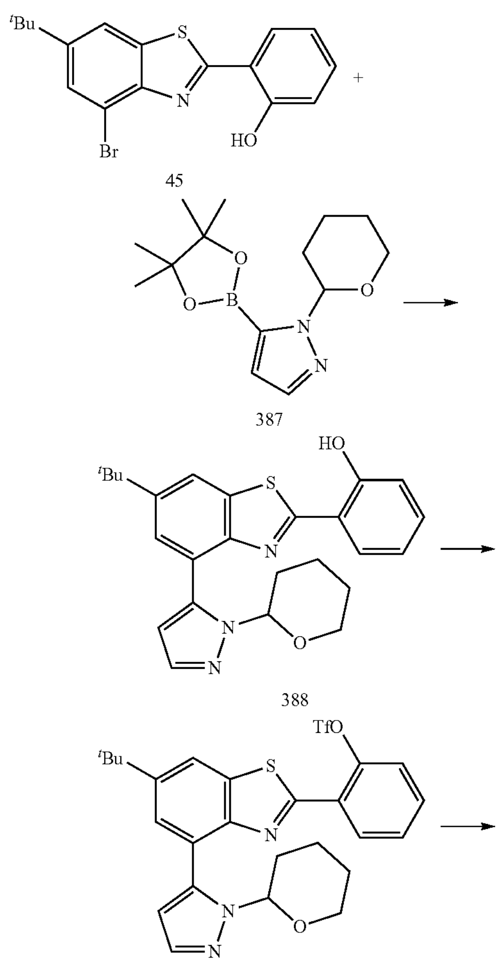

45

387

388

389

-continued

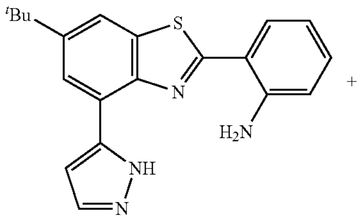

390

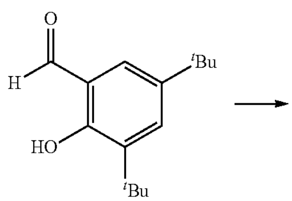

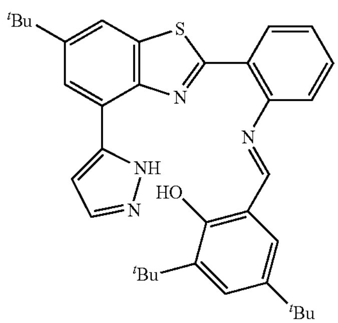

391

Synthesis of Intermediate 388

The same procedure as in the synthesis of Intermediate 7 of Intermediate Synthetic Example 3 was performed except for using Intermediate 45 (4.0 g, 11.04 mmol) instead of Intermediate 6 to obtain Intermediate 388 (4.7 g, 98.1%).

Synthesis of Intermediate 389

The same procedure as in the synthesis of Intermediate 8 of Intermediate Synthetic Example 3 was performed except for using Intermediate 388 (4.7 g, 10.84 mmol) instead of Intermediate 7 to obtain Intermediate 389 (6.0 g, 97.8%).

Synthesis of Intermediate 390

The same procedure as in the synthesis of Intermediate 9 of Intermediate Synthetic Example 3 was performed except for using Intermediate 389 (6.0 g, 10.61 mmol) instead of Intermediate 8 to obtain Intermediate 390 (895 mg, 36.0%).

Synthesis of Intermediate 391

The same procedure as in the synthesis of Intermediate 140 of Intermediate Synthetic Example 34 was performed except for using Intermediate 390 (895 mg, 2.57 mmol) instead of Intermediate 139 to obtain Intermediate 391 (918 mg, 63.2%).

Intermediate Synthetic Example 83: Synthesis of Intermediate 392

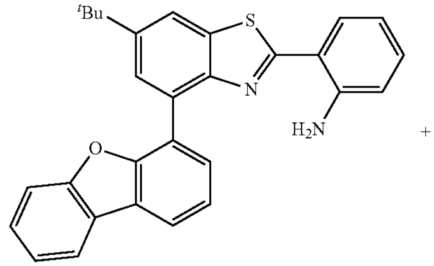

104

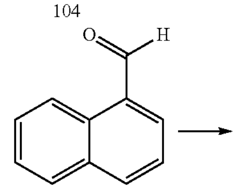

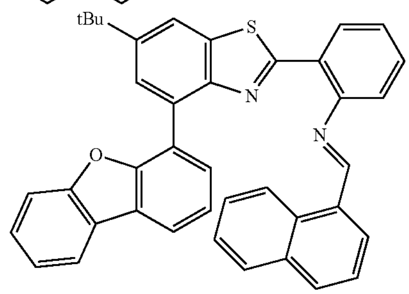

392

Synthesis of Intermediate 392

The same procedure as in the synthesis of Intermediate 140 of Intermediate Synthetic Example 34 was performed except for using Intermediate 104 (4.0 g, 8.92 mmol) instead of Intermediate 139 to obtain Intermediate 392 (3.6 g, 68.8%).

Intermediate Synthetic Example 84: Synthesis of Intermediate 393

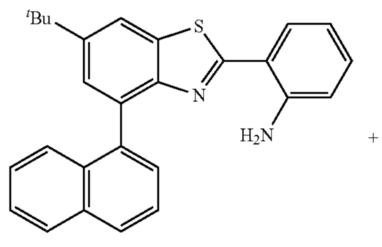

108

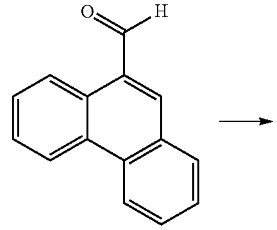

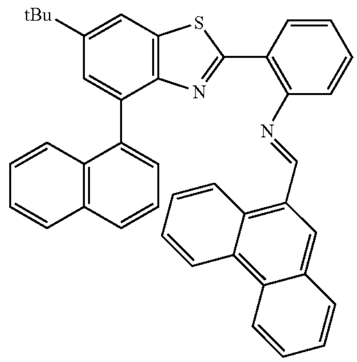
393
Synthesis of Intermediate 393
The same procedure as in the synthesis of Intermediate 140 of Intermediate Synthetic Example 34 was performed except for using Intermediate 108 (4.0 g, 9.79 mmol) instead of Intermediate 139 to obtain Intermediate 393 (2.9 g, 49.6%).
Intermediate Synthetic Example 85: Synthesis of Intermediate 400
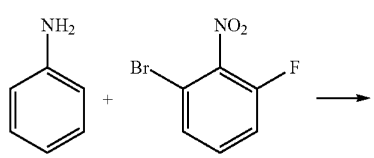
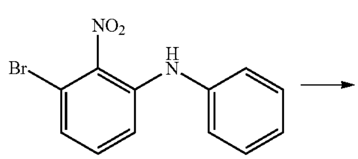
394
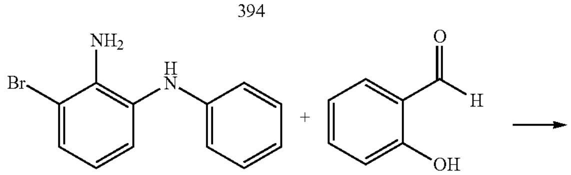
395
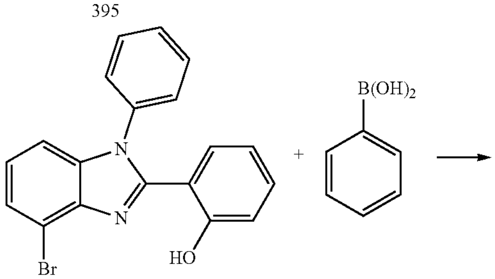
396
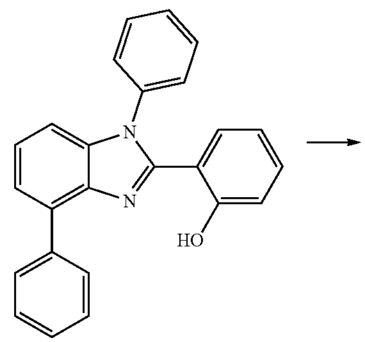
397
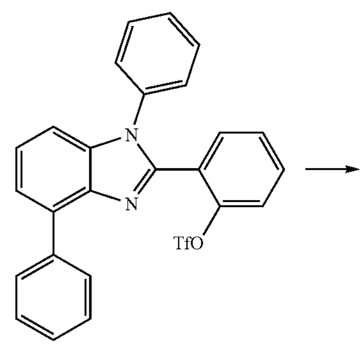
398
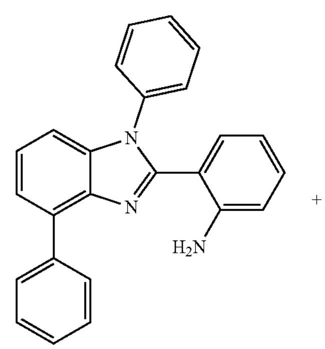
399
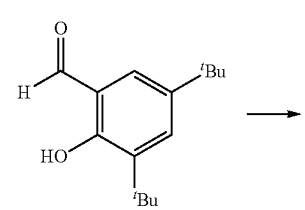

-continued

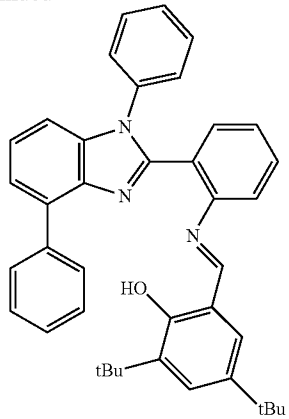

400

Synthesis of Intermediate 394

To a two-neck 2 L flask, 32.0 g (0.344 mol) of aniline, and 1280 ml of anhydrous tetrahydrofuran were added and cooled to about −78° C., and 180 ml of a 2.5 M butyl lithium solution was slowly added thereto dropwisely, followed by stirring for about 1 hour. A solution obtained by dissolving 83.2 g (0.378 mol) of 2-bromo-6-fluoronitrobenzene in 250 ml of anhydrous tetrahydrofuran was slowly added thereto dropwisely, followed slowly elevating the temperature and stirring at room temperature for about 12 hours or more. After checking the completion of the reaction, water and EA were injected to the reaction product and the resultant product was extracted with EA. Water was removed with $MgSO_4$, and solvents were removed by distillation under a reduced pressure. The extract thus obtained was separated by column chromatography (Hex:EA). The product thus obtained was solidified with hexane to obtain 33.4 g (33.3%) of Intermediate 394 of an orange solid compound.

Synthesis of Intermediate 395

To a one-neck 2 L flask, 33.3 g (0.114 mol) of Intermediate 394 and 333 ml of tetrahydrofuran (THF) were added, and 407 ml (0.570 mol) of a 1.4 M $Na_2S_2O_4$ solution was slowly added thereto dropwisely at room temperature and then, 24 ml of methanol (MeOH) was added dropwisely. After stirring at room temperature for about 12 hours, water and EA were injected, and the resultant product was extracted with EA. Water was removed with $MgSO_4$, and solvents were removed by distillation under a reduced pressure to obtain 29.8 g (yield: 99.5%) of a light pink solid compound (Intermediate 395).

Synthesis of Intermediate 396

To a one-neck 2 L flask, 29.7 g (0.113 mol) of Intermediate 395, 13.8 g (0.113 mol) of salicylaldehyde, 26.0 g (0.136 mol) of $Na_2S_2O_5$, and 450 ml of dimethylformamide were added, followed by stirring at about 100° C. for about 12 hours. After finishing the reaction, water and EA were injected, and the resultant product was extracted with EA. The extracted organic layer was washed with a saline solution. Water was removed with $MgSO_4$, and solvents were removed by distillation under a reduced pressure. The solid thus obtained was dissolved in chloroform and then separated by column chromatography ($CHCl_3$). The product thus obtained was solidified with hexane to obtain 24.9 g (yield: 60.3%) of a yellow solid compound (Intermediate 396).

Synthesis of Intermediate 397

The same procedure as in the synthesis of Intermediate 137 of Intermediate Synthetic Example 34 was performed except for using Intermediate 396 (3.0 g, 8.21 mmol) instead of Intermediate 136 to obtain Intermediate 397 (2.6 g, 87.3%).

Synthesis of Intermediate 398

The same procedure as in the synthesis of Intermediate 138 of Intermediate Synthetic Example 34 was performed except for using Intermediate 397 (2.6 g, 7.17 mmol) instead of Intermediate 137 to obtain Intermediate 398 (3.1 g, 87.3%).

Synthesis of Intermediate 399

The same procedure as in the synthesis of Intermediate 139 of Intermediate Synthetic Example 34 was performed except for using Intermediate 398 (3.1 g, 6.27 mmol) instead of Intermediate 138 to obtain Intermediate 399 (1.2 g, 52.9%).

Synthesis of Intermediate 400

The same procedure as in the synthesis of Intermediate 140 of Intermediate Synthetic Example 34 was performed except for using Intermediate 399 (1.2 g, 3.39 mmol) instead of Intermediate 139 to obtain Intermediate 400 (1.8 g, 93.8%).

Intermediate Synthetic Example 86: Synthesis of Intermediate 404

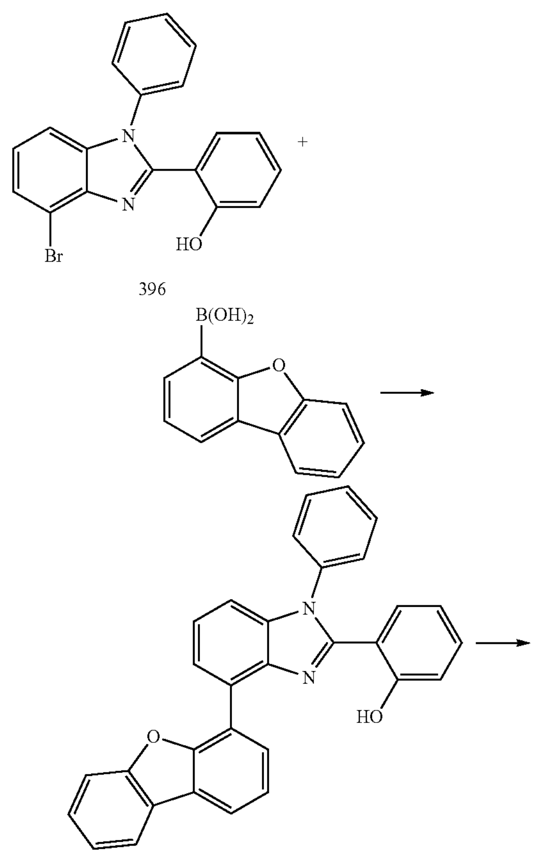

401

-continued

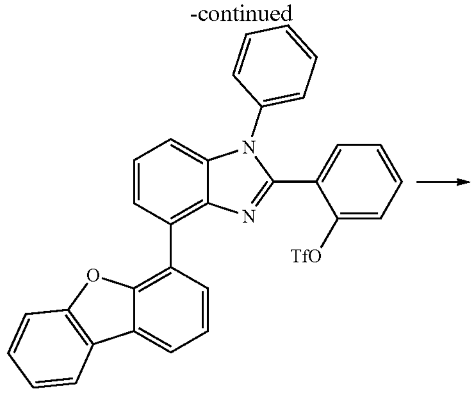

402

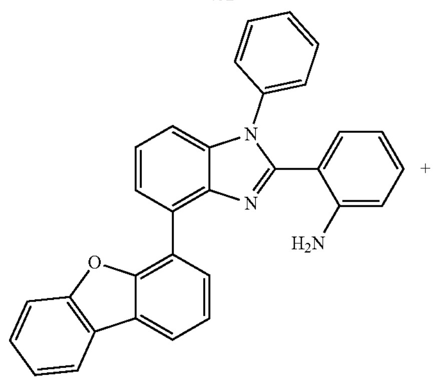

403

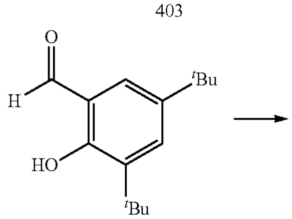

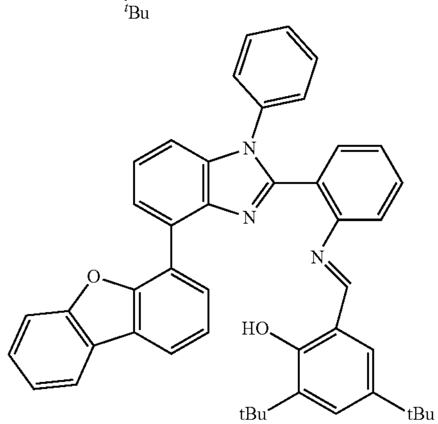

404

Synthesis of Intermediate 401

The same procedure as in the synthesis of Intermediate 137 of Intermediate Synthetic Example 34 was performed except for using Intermediate 396 (3.0 g, 8.21 mmol) instead of Intermediate 136 to obtain Intermediate 401 (3.3 g, 88.7%).

Synthesis of Intermediate 402

The same procedure as in the synthesis of Intermediate 138 of Intermediate Synthetic Example 34 was performed except for using Intermediate 401 (3.3 g, 7.29 mmol) instead of Intermediate 137 to obtain Intermediate 402 (3.9 g, 91.4%).

Synthesis of Intermediate 403

The same procedure as in the synthesis of Intermediate 139 of Intermediate Synthetic Example 34 was performed except for using Intermediate 402 (3.9 g, 6.67 mmol) instead of Intermediate 138 to obtain Intermediate 403 (1.9 g, 63.0%).

Synthesis of Intermediate 404

The same procedure as in the synthesis of Intermediate 140 of Intermediate Synthetic Example 34 was performed except for using Intermediate 403 (1.9 g, 4.21 mmol) instead of Intermediate 139 to obtain Intermediate 404 (2.4 g, 85.4%).

By using the synthesized intermediate compounds, various organometallic compounds having a benzazole derivative as a ligand were synthesized as follows.

Example 1: Synthesis of Compound 3-42 (LT17-30-303)

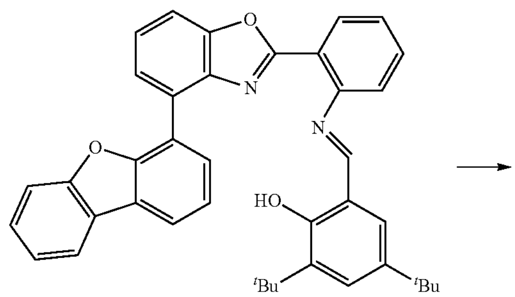

10

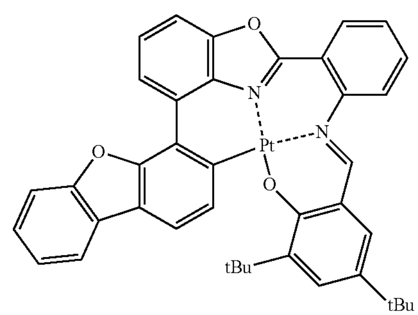

3-42(LT17-30-303)

In a one-neck 50 ml flask, 2.13 g (3.59 mmol) of Intermediate 10, 589 mg (7.19 mmol) of NaOAc, and 14 ml of DMF were stirred at about 75° C. 1.32 g (3.13 mmol) of $Pt(DMSO)_2Cl_2$ and 21 ml of DMSO were added thereto, followed by stirring at about 85° C. for two days. The reaction mixture was cooled at room temperature and filtered using methanol. The solid thus obtained was dissolved by boiling in chloroform and then was separated by silica gel column chromatography ($CHCl_3$). The product thus obtained was solidified with dichloromethane to obtain 1.3 g (yield: 46.0%) of Compound of 3-42 (LT17-30-303) as a red solid.

Example 2: Synthesis of Compound 3-143 (LT17-30-114)

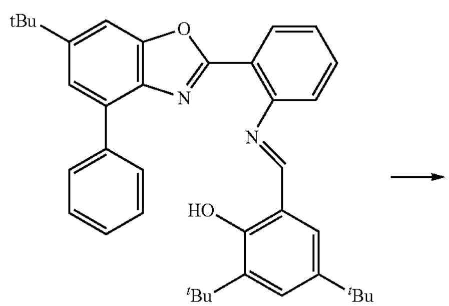

15

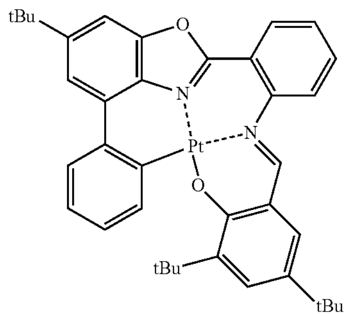

3-143(LT17-30-114)

The same procedure as in the synthesis of Compound 3-42 (LT17-30-303) of Example 1 was performed except for using Intermediate 15 (874 mg, 1.56 mmol) instead of Intermediate 10 to obtain Compound 3-143 (LT17-30-114) (521 mg, 44.3%).

Example 3: Synthesis of Compound 3-146 (LT17-30-220)

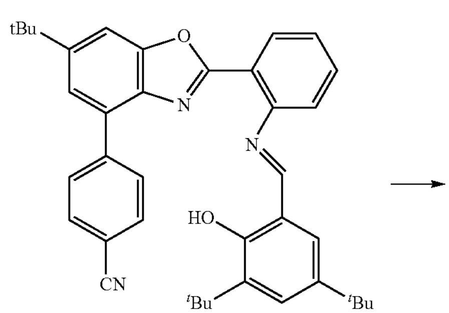

19

-continued

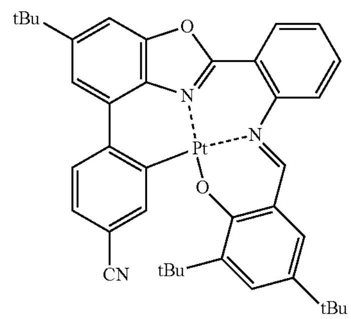

3-146(LT17-30-220)

The same procedure as in the synthesis of Compound 3-42 (LT17-30-303) of Example 1 was performed except for using Intermediate 19 (2.3 g, 3.94 mmol) instead of Intermediate 10 to obtain Compound 3-146 (LT17-30-220) (1.3 g, 42.4%).

Example 4: Synthesis of Compound 3-186 (LT17-30-293)

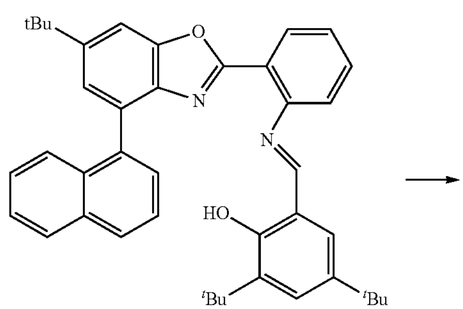

23

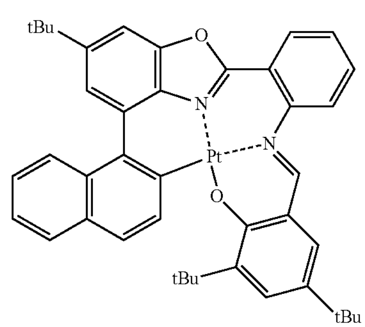

3-186(LT17-30-293)

The same procedure as in the synthesis of Compound 3-42 (LT17-30-303) of Example 1 was performed except for using Intermediate 23 (2.9 g, 4.76 mmol) instead of Intermediate 10 to obtain Compound 3-186 (LT17-30-293) (1.6 g, 41.8%).

Example 5: Synthesis of Compound 4-1 (LT17-30-113)

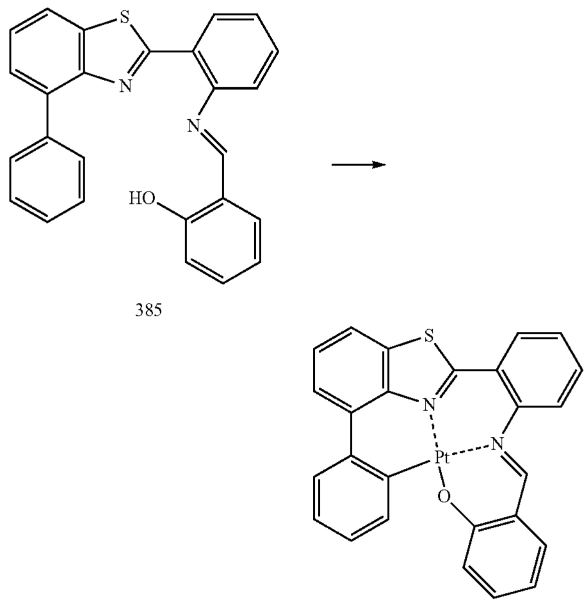

385

4-1(LT17-30-113)

The same procedure as in the synthesis of Compound 3-42 (LT17-30-303) of Example 1 was performed except for using Intermediate 385 (2.5 g, 6.15 mmol) instead of Intermediate 10 to obtain Compound 4-1 (LT17-30-113) (1.9 g, 51.5%).

Example 6: Synthesis of Compound 4-2 (LT17-30-104)

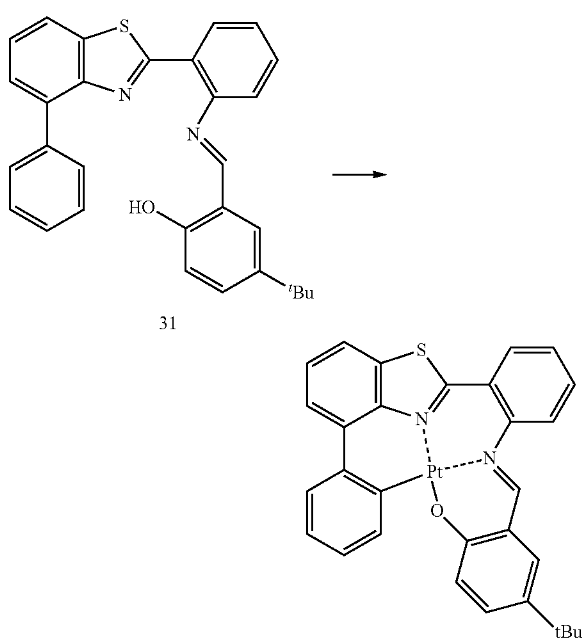

31

4-2(LT17-30-104)

The same procedure as in the synthesis of Compound 3-42 (LT17-30-303) of Example 1 was performed except for using Intermediate 31 (1.9 g, 4.11 mmol) instead of Intermediate 10 to obtain Compound 4-2 (LT17-30-104) (1.3 g, 48.2%).

Example 7: Synthesis of Compound 4-3 (LT17-30-106)

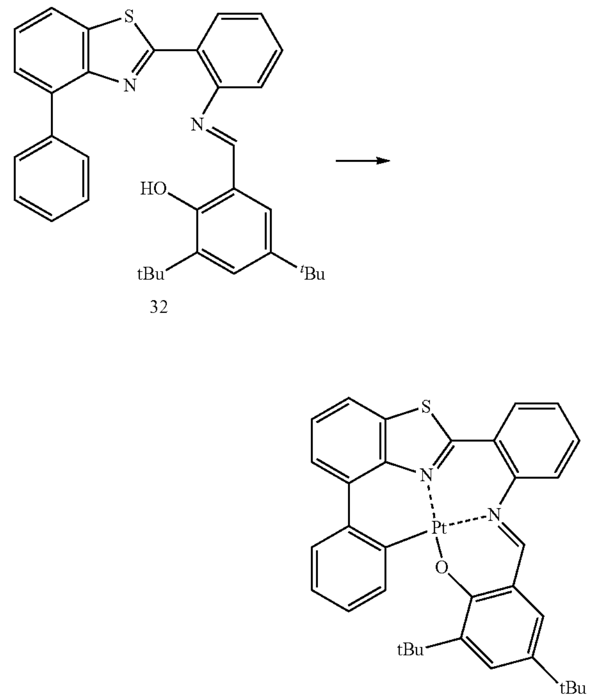

32

4-3(LT17-30-106)

The same procedure as in the synthesis of Compound 3-42 (LT17-30-303) of Example 1 was performed except for using Intermediate 32 (2.1 g, 4.05 mmol) instead of Intermediate 10 to obtain Compound 4-3 (LT17-30-106) (1.1 g, 38.1%).

Example 8: Synthesis of Compound 4-4 (LT17-30-197)

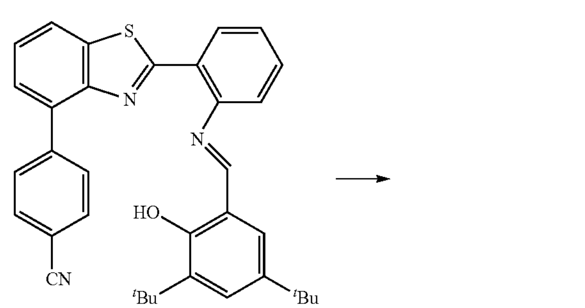

36

-continued

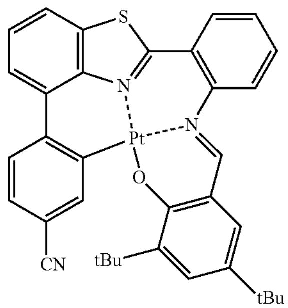

4-4(LT17-30-197)

The same procedure as in the synthesis of Compound 3-42 (LT17-30-303) of Example 1 was performed except for using Intermediate 36 (2.0 g, 3.68 mmol) instead of Intermediate 10 to obtain Compound 4-4 (LT17-30-197) (1.2 g, 44.2%).

Example 9: Synthesis of Compound 4-44 (LT7-30-201)

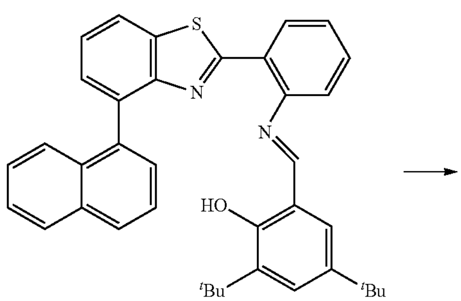

40

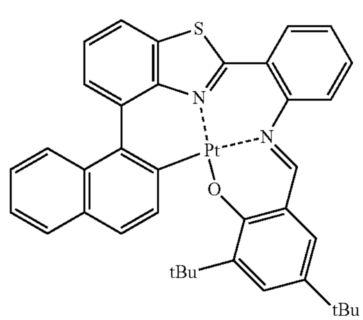

4-44(LT17-30-201)

The same procedure as in the synthesis of Compound 3-42 (LT17-30-303) of Example 1 was performed except for using Intermediate 40 (2.0 g, 3.52 mmol) instead of Intermediate 10 to obtain Compound 4-44 (LT17-30-201) (1.4 g, 52.2%).

Example 10: Synthesis of Compound 4-72 (LT17-35-105)

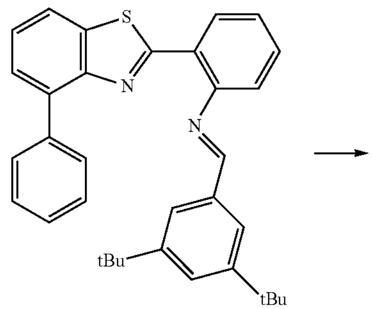

386

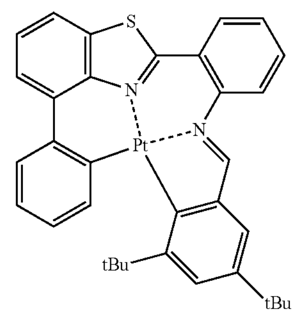

4-72(LT17-35-105)

The same procedure as in the synthesis of Compound 3-42 (LT17-30-303) of Example 1 was performed except for using Intermediate 386 (4.2 g, 8.35 mmol) instead of Intermediate 10 to obtain Compound 4-72 (LT17-35-105) (618 mg, 10.6%).

Example 11: Synthesis of Compound 4-143 (LT17-30-190)

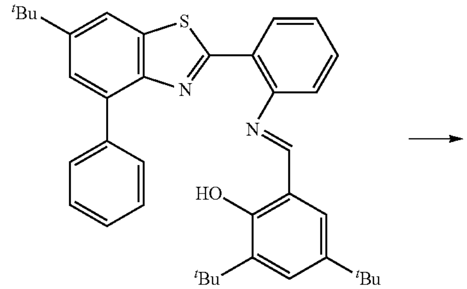

49

-continued

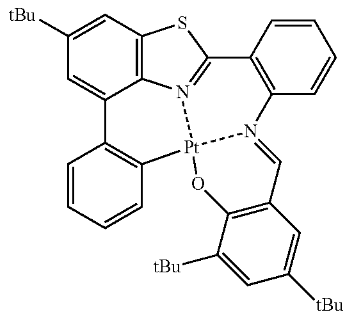

4-143(LT17-30-190)

The same procedure as in the synthesis of Compound 3-42 (LT17-30-303) of Example 1 was performed except for using Intermediate 49 (2.1 g, 3.65 mmol) instead of Intermediate 10 to obtain Compound 4-143 (LT17-30-190) (1.3 g, 46.3%).

Example 12: Synthesis of Compound 4-144 (LT17-30-221)

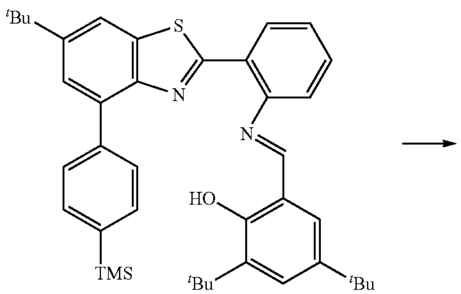

53

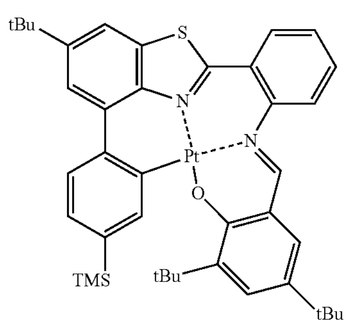

4-144(LT17-30-221)

The same procedure as in the synthesis of Compound 3-42 (LT17-30-303) of Example 1 was performed except for using Intermediate 53 (2.0 g, 3.09 mmol) instead of Intermediate 10 to obtain Compound 4-144 (LT17-30-221) (1.1 g, 42.3%).

Example 13: Synthesis of Compound 4-145 (LT17-30-212)

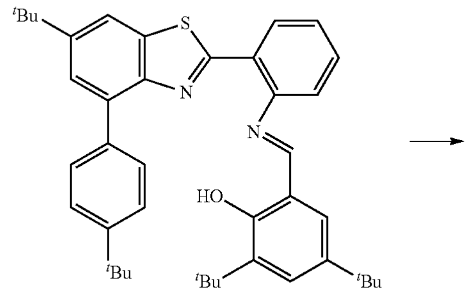

57

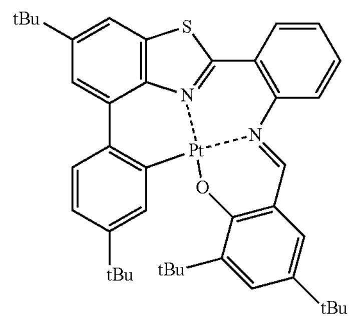

4-145 (LT17-30-212)

The same procedure as in the synthesis of Compound 3-42 (LT17-30-303) of Example 1 was performed except for using Intermediate 57 (2.2 g, 3.49 mmol) instead of Intermediate 10 to obtain Compound 4-145 (LT17-30-212) (1.4 g, 48.7%).

Example 14: Synthesis of Compound 4-146 (LT17-30-192)

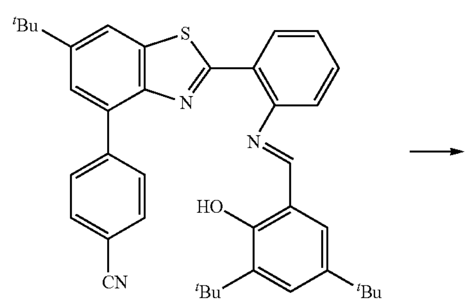

61

-continued

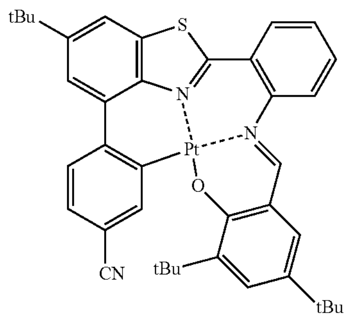

4-146(LT17-30-192)

The same procedure as in the synthesis of Compound 3-42 (LT17-30-303) of Example 1 was performed except for using Intermediate 61 (1.6 g, 2.67 mmol) instead of Intermediate 10 to obtain Compound 4-146 (LT17-30-192) (0.9 g, 42.5%).

Example 15: Synthesis of Compound 4-147 (LT17-30-290)

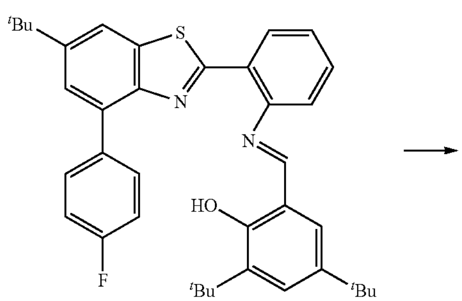

65

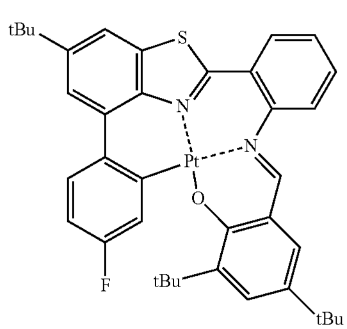

4-147(LT17-30-290)

The same procedure as in the synthesis of Compound 3-42 (LT17-30-303) of Example 1 was performed except for using Intermediate 65 (1.6 g, 2.70 mmol) instead of Intermediate 10 to obtain Compound 4-147 (LT17-30-290) (1.0 g, 47.1%).

Example 16: Synthesis of Compound 4-156 (LT17-30-306)

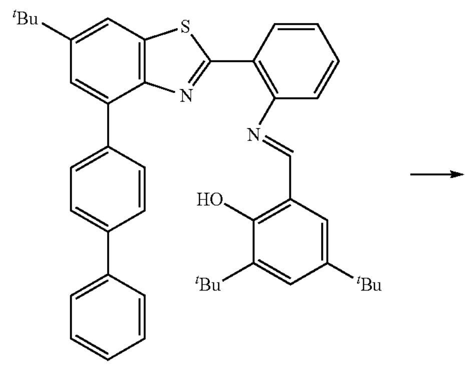

69

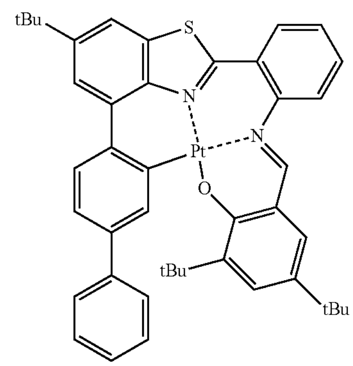

4-156(LT17-30-306)

The same procedure as in the synthesis of Compound 3-42 (LT17-30-303) of Example 1 was performed except for using Intermediate 69 (2.5 g, 3.84 mmol) instead of Intermediate 10 to obtain Compound 4-156 (LT17-30-306) (1.1 g, 33.9%).

Example 17: Synthesis of Compound 4-158 (LT17-30-307)

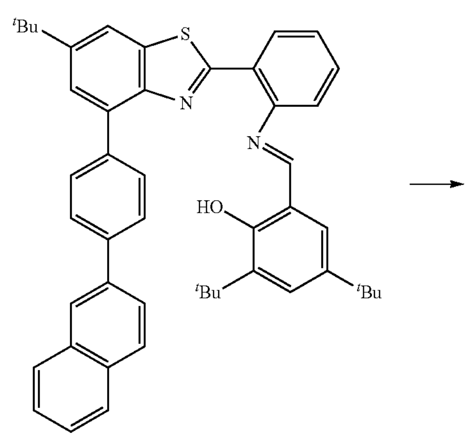

73

-continued

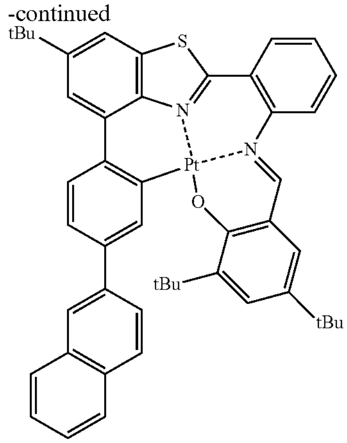

4-158(LT17-30-307)

The same procedure as in the synthesis of Compound 3-42 (LT17-30-303) of Example 1 was performed except for using Intermediate 73 (2.0 g, 2.85 mmol) instead of Intermediate 10 to obtain Compound 4-158 (LT17-30-307) (1.3 g, 50.9%).

Example 18: Synthesis of Compound 4-160 (LT17-30-449)

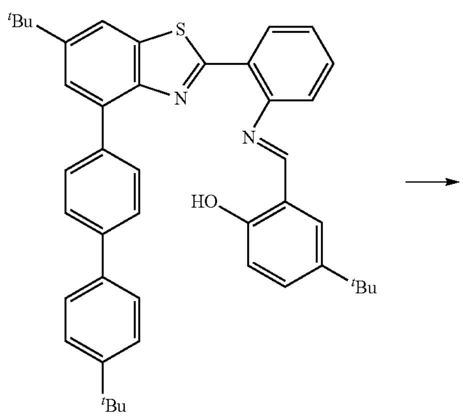

77

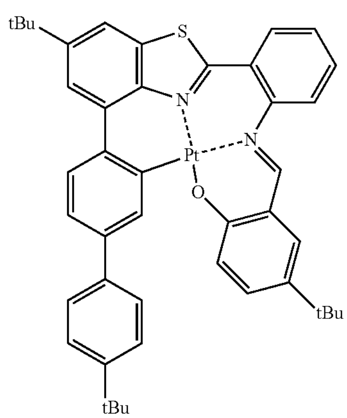

4-160(LT17-30-449)

The same procedure as in the synthesis of Compound 3-42 (LT17-30-303) of Example 1 was performed except for using Intermediate 77 (2.3 g, 3.53 mmol) instead of Intermediate 10 to obtain Compound 4-160 (LT17-30-449) (1.3 g, 43.5%).

Example 19: Synthesis of Compound 4-161 (LT17-30-302)

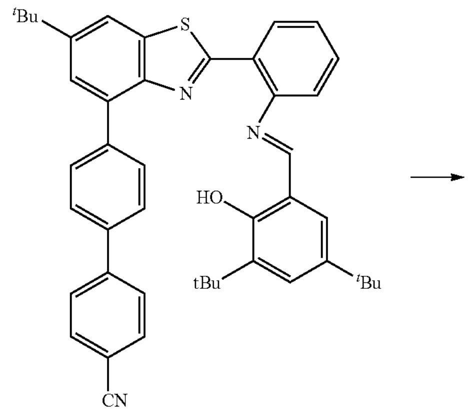

81

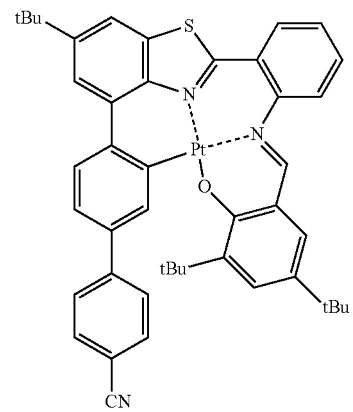

4-161(LT17-30-302)

The same procedure as in the synthesis of Compound 3-42 (LT17-30-303) of Example 1 was performed except for using Intermediate 81 (2.1 g, 3.11 mmol) instead of Intermediate 10 to obtain Compound 4-161 (LT17-30-302) (1.1 g, 40.7%).

Example 20: Synthesis of Compound 4-162 (LT7-30-448)

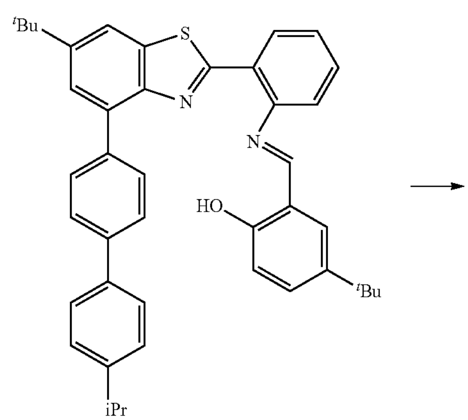

85

-continued

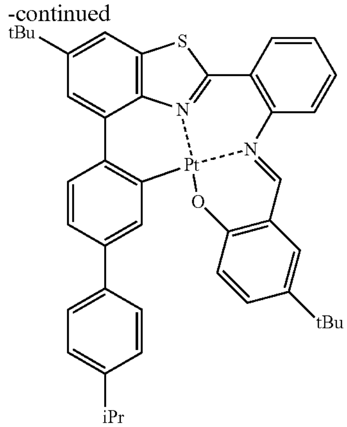

4-162(LT17-30-448)

The same procedure as in the synthesis of Compound 3-42 (LT17-30-303) of Example 1 was performed except for using Intermediate 85 (2.1 g, 3.30 mmol) instead of Intermediate 10 to obtain Compound 4-162 (LT17-30-448) (1.2 g, 43.8%).

Example 21: Synthesis of Compound 4-167 (LT17-30-445)

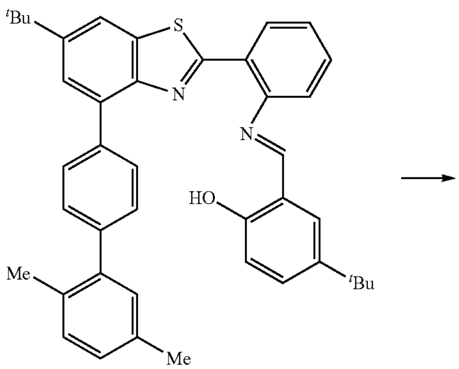

89

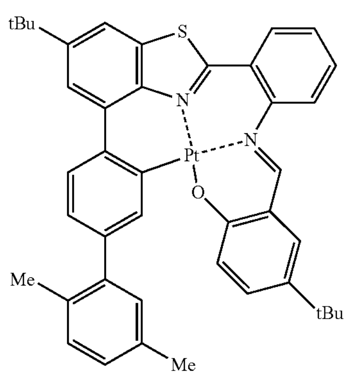

4-167(LT17-30-445)

The same procedure as in the synthesis of Compound 3-42 (LT17-30-303) of Example 1 was performed except for using Intermediate 89 (2.0 g, 3.21 mmol) instead of Intermediate 10 to obtain Compound 4-167 (LT17-30-445) (1.1 g, 41.9%).

Example 22: Synthesis of Compound 4-170 (LT17-30-311)

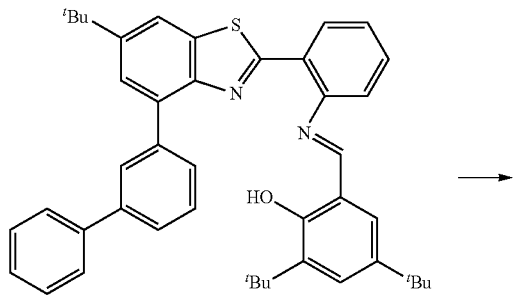

93

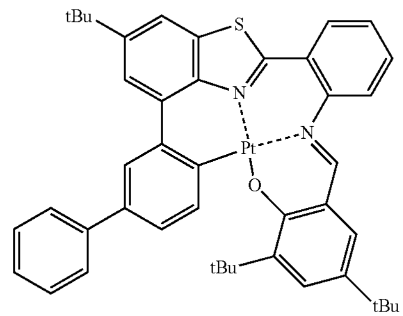

4-170(LT17-30-311)

The same procedure as in the synthesis of Compound 3-42 (LT17-30-303) of Example 1 was performed except for using Intermediate 93 (2.0 g, 3.07 mmol) instead of Intermediate 10 to obtain Compound 4-170 (LT17-30-311) (1.2 g, 46.2%).

Example 23: Synthesis of Compound 4-174 (LT17-30-456)

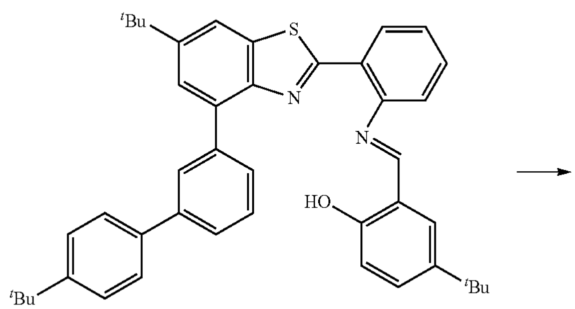

97

-continued

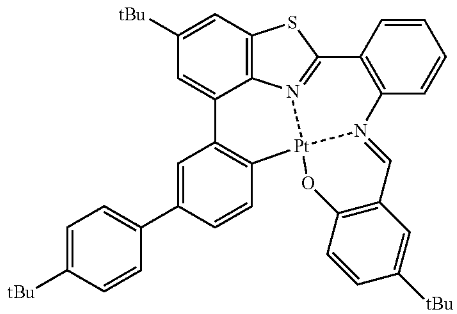

4-174(LT17-30-456)

The same procedure as in the synthesis of Compound 3-42 (LT17-30-303) of Example 1 was performed except for using Intermediate 97 (1.9 g, 2.92 mmol) instead Intermediate 10 to obtain Compound 4-174 (LT17-30-456) (1.1 g, 44.6%).

Example 24: Synthesis of Compound 4-177 (LT17-30-403)

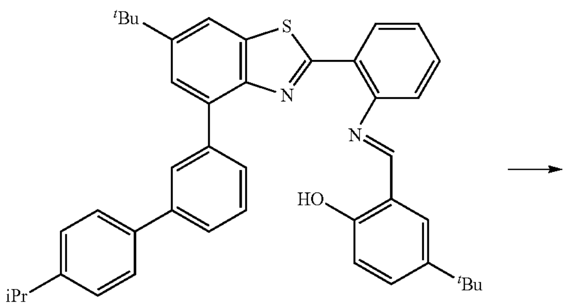

101

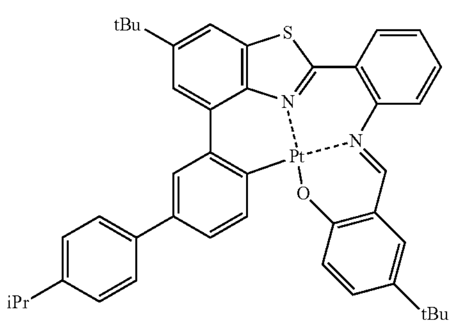

4-177 (LT17-30-403)

The same procedure as in the synthesis of Compound 3-42 (LT17-30-303) of Example 1 was performed except for using Intermediate 101 (2.5 g, 3.93 mmol) instead of Intermediate 10 to obtain Compound 4-177 (LT17-30-403) (1.6 g, 49.1%).

Example 25: Synthesis of Compound 4-184 (LT17-30-214)

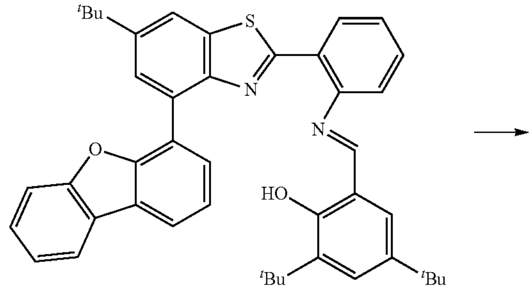

105

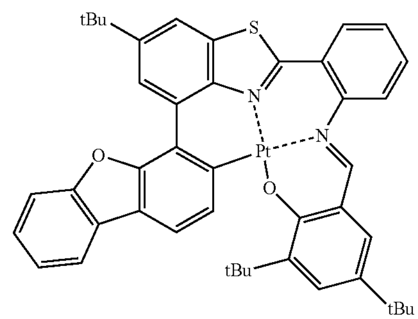

4-184(LT17-30-214)

The same procedure as in the synthesis of Compound 3-42 (LT17-30-303) of Example 1 was performed except for using Intermediate 105 (2.1 g, 3.16 mmol) instead of Intermediate 10 to obtain Compound 4-184 (LT17-30-214) (1.3 g, 47.9%).

Example 26: Synthesis of Compound 4-185 (LT17-30-305)

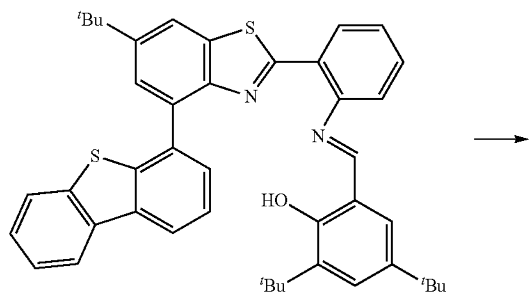

121

-continued

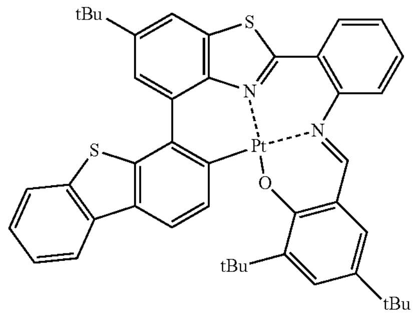

4-185(LT17-30-305)

The same procedure as in the synthesis of Compound 3-42 (LT17-30-303) of Example 1 was performed except for using Intermediate 121 (2.0 g, 2.94 mmol) instead of Intermediate 10 to obtain Compound 4-185 (LT17-30-305) (1.2 g, 46.7%).

Example 27: Synthesis of Compound 4-186 (LT17-30-209)

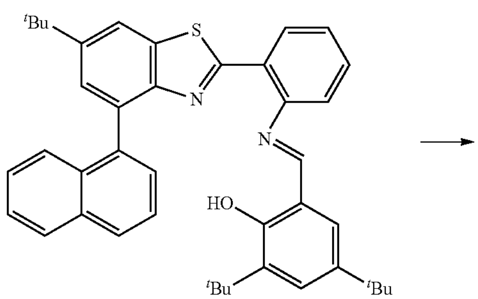

109

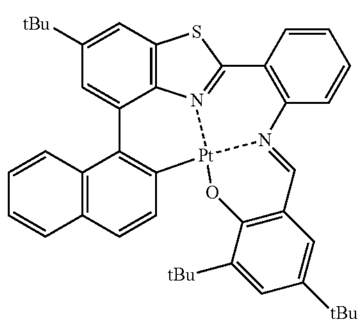

4-186 (LT17-30-209)

The same procedure as in the synthesis of Compound 3-42 (LT17-30-303) of Example 1 was performed except for using Intermediate 109 (3.1 g, 4.96 mmol) instead of Intermediate 10 to obtain Compound 4-186 (LT17-30-209) (1.9 g, 46.8%).

Example 28: Synthesis of Compound 4-187 (LT17-30-308)

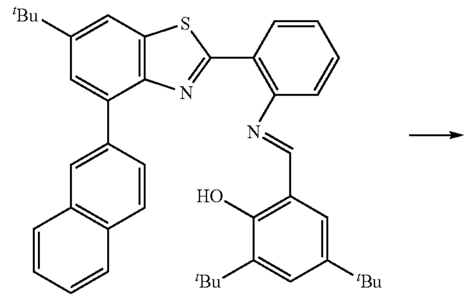

113

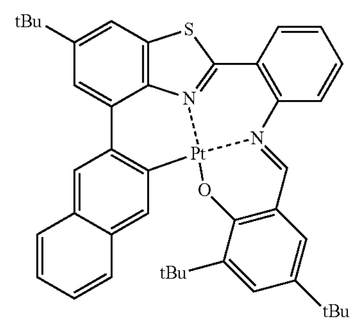

4-187 (LT17-30-308)

The same procedure as in the synthesis of Compound 3-42 (LT17-30-303) of Example 1 was performed except for using Intermediate 113 (4.6 g, 7.36 mmol) instead of Intermediate 10 to obtain Compound 4-187 (LT17-30-308) (0.9 g, 14.9%).

Example 29: Synthesis of Compound 4-205 (LT17-30-222)

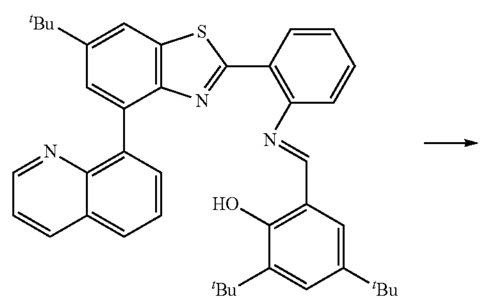

117

-continued

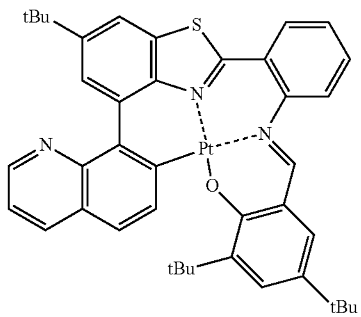

4-205(LT17-30-222)

The same procedure as in the synthesis of Compound 3-42 (LT17-30-303) of Example 1 was performed except for using Intermediate 117 (2.0 g, 3.20 mmol) instead of Intermediate 10 to obtain Compound 4-205 (LT17-30-222) (1.3 g, 49.6%).

Example 30: Synthesis of Compound 4-211 (LT17-35-106)

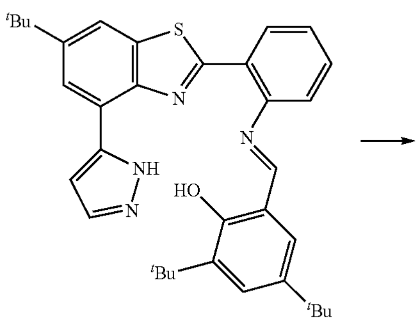

391

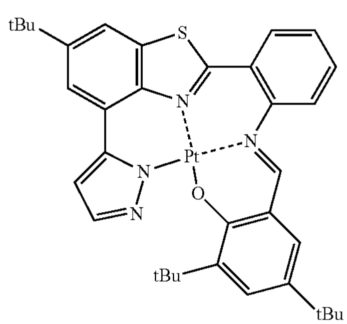

4-211(LT17-35-106)

The same procedure as in the synthesis of Compound 3-42 (LT17-30-303) of Example 1 was performed except for using Intermediate 391 (918 mg, 1.63 mmol) instead of Intermediate 10 to obtain Compound 4-211 (LT17-35-106) (48 mg, 3.9%).

Example 31: Synthesis of Compound 4-217 (LT17-30-330)

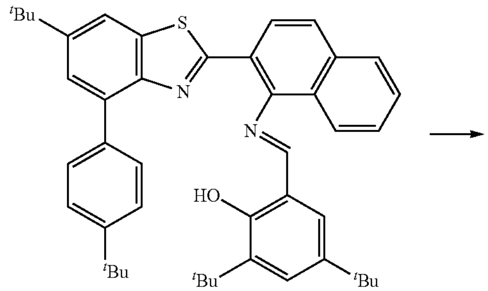

130

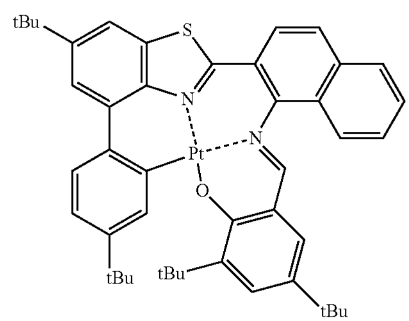

4-217(LT17-30-330)

The same procedure as in the synthesis of Compound 3-42 (LT17-30-303) of Example 1 was performed except for using Intermediate 130 (1.8 g, 2.64 mmol) instead of Intermediate 10 to obtain Compound 4-217 (LT17-30-330) (43 mg, 1.8%).

Example 32: Synthesis of Compound 4-327 (LT17-35-107)

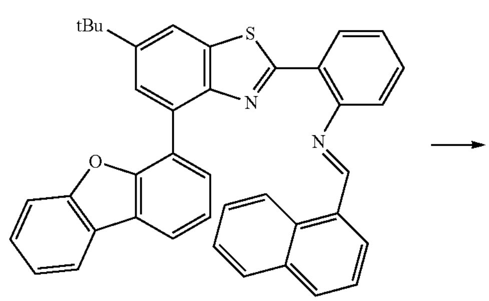

392

-continued

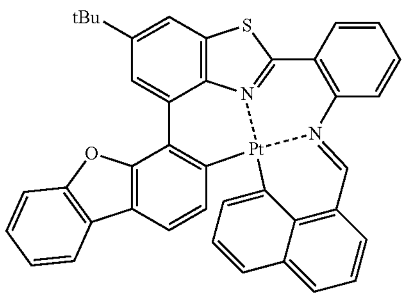

4-327(LT17-35-107)

The same procedure as in the synthesis of Compound 3-42 (LT17-30-303) of Example 1 was performed except for using Intermediate 392 (3.6 g, 6.14 mmol) instead of Intermediate 10 to obtain Compound 4-327 (LT17-35-107) (956 mg, 19.9%).

Example 33: Synthesis of Compound 4-384 (LT17-35-108)

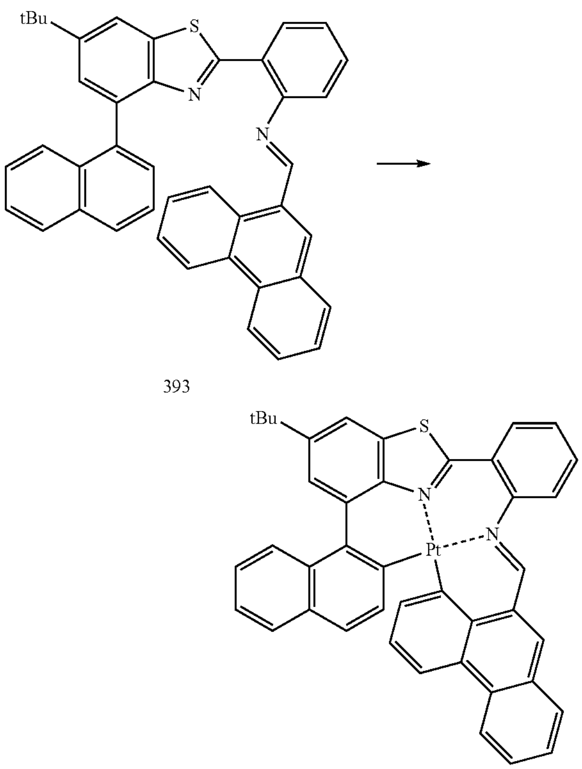

393

4-384(LT17-35-108)

The same procedure as in the synthesis of Compound 3-42 (LT17-30-303) of Example 1 was performed except for using Intermediate 393 (2.9 g, 4.86 mmol) instead of Intermediate 10 to obtain Compound 4-384 (LT17-35-108) (487 mg, 12.6%).

Example 34: Synthesis of Compound 4-392 (LT17-30-402)

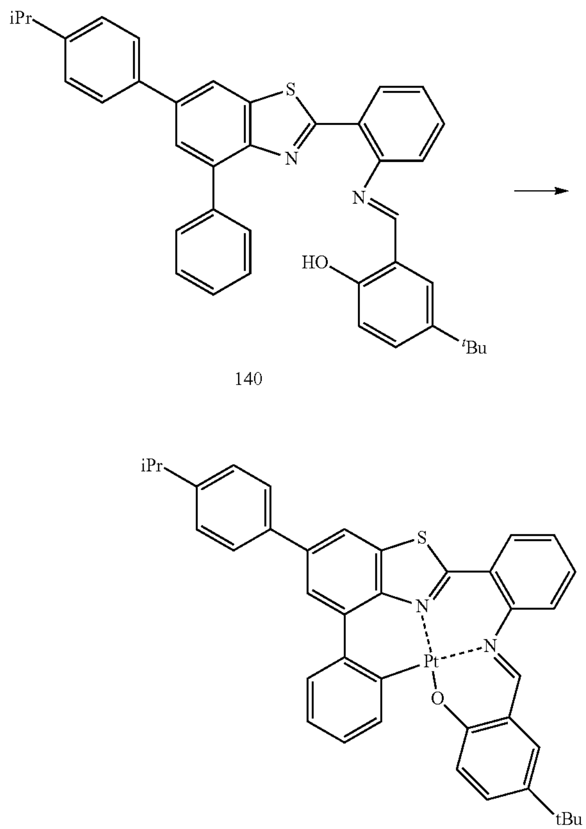

140

4-392(LT17-30-402)

The same procedure as in the synthesis of Compound 3-42 (LT17-30-303) of Example 1 was performed except for using Intermediate 140 (2.3 g, 3.96 mmol) instead of Intermediate 10 to obtain Compound 4-392 (LT17-30-402) (1.2 g, 39.1%).

Example 35: Synthesis of Compound 4-396 (LT17-30-405)

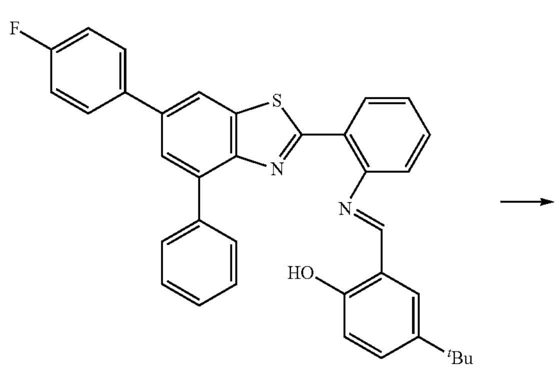

145

-continued

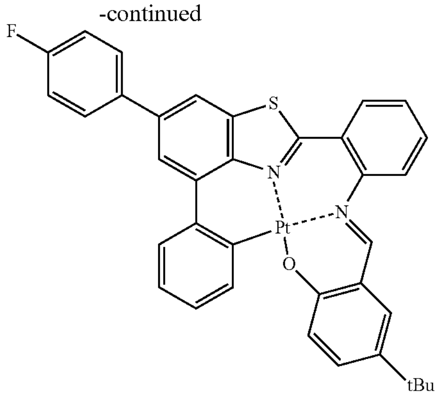

4-396(LT17-30-405)

The same procedure as in the synthesis of Compound 3-42 (LT17-30-303) of Example 1 was performed except for using Intermediate 145 (2.4 g, 4.31 mmol) instead of Intermediate 10 to obtain Compound 4-396 (LT17-30-405) (1.5 g, 46.4%).

Example 36: Synthesis of Compound 4-401 (LT17-30-450)

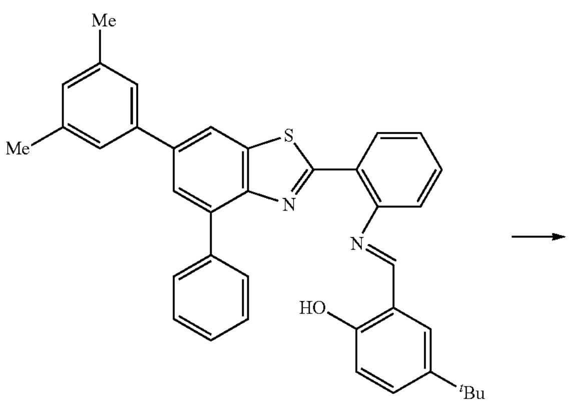

150

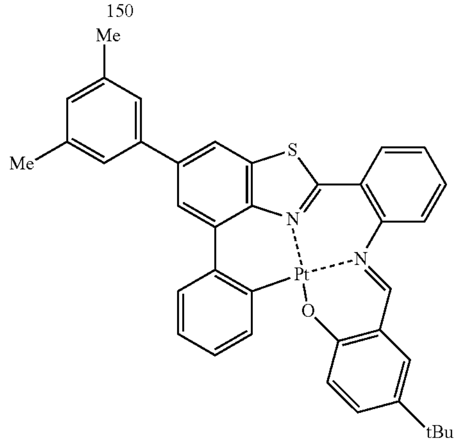

4-401(LT17-30-450)

The same procedure as in the synthesis of Compound 3-42 (LT17-30-303) of Example 1 was performed except for using Intermediate 150 (2.9 g, 5.12 mmol) instead of Intermediate 10 to obtain Compound 4-401 (LT17-30-450) (1.5 g, 38.5%).

Example 37: Synthesis of Compound 4-404 (LT17-30-394)

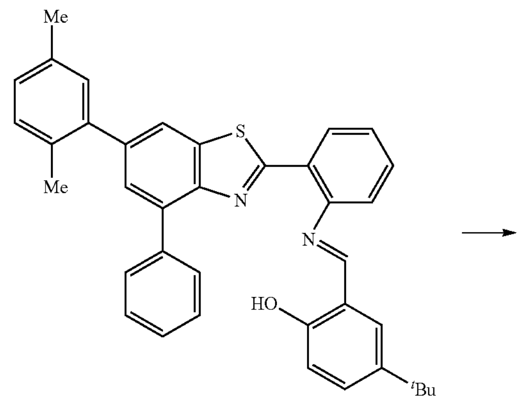

155

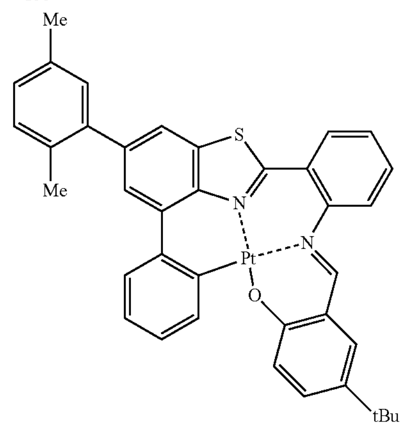

4-404(LT17-30-394)

The same procedure as in the synthesis of Compound 3-42 (LT17-30-303) of Example 1 was performed except for using Intermediate 155 (2.5 g, 4.41 mmol) instead of Intermediate 10 to obtain Compound 4-404 (LT17-30-394) (1.6 g, 47.7%).

Example 38: Synthesis of Compound 4-408 (LT17-30-400)

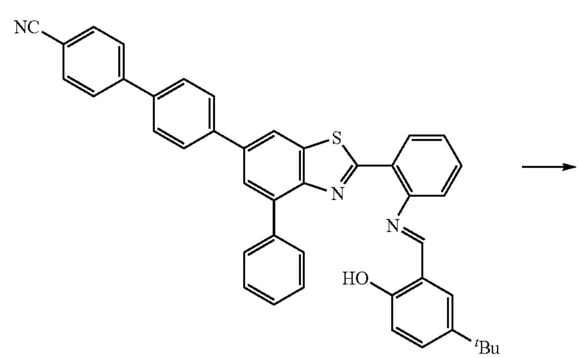

170

-continued

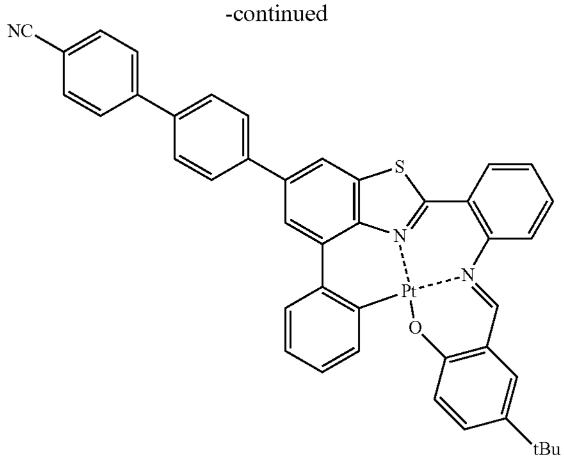

4-408(LT17-30-400)

The same procedure as in the synthesis of Compound 3-42 (LT17-30-303) of Example 1 was performed except for using Intermediate 170 (3.1 g, 4.85 mmol) instead of Intermediate 10 to obtain Compound 4-408 (LT17-30-400) (1.9 g, 47.0%).

Example 39: Synthesis of Compound 4-418 (LT17-30-395)

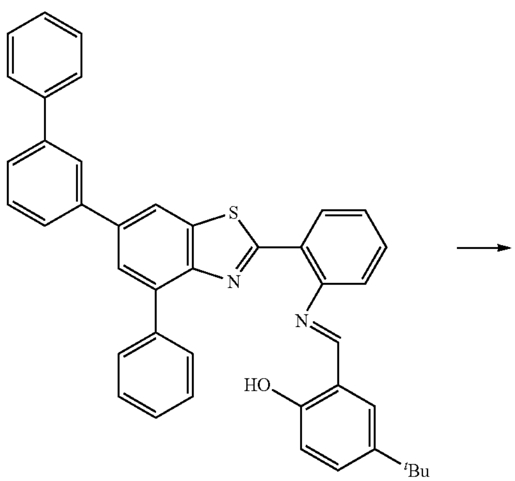

165

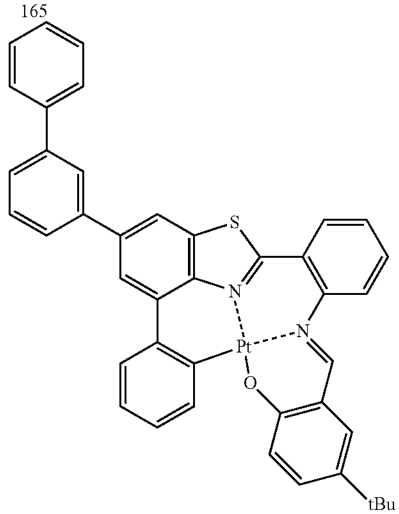

4-418(LT17-30-395)

The same procedure as in the synthesis of Compound 3-42 (LT17-30-303) of Example 1 was performed except for using Intermediate 165 (2.1 g, 3.42 mmol) instead of Intermediate 10 to obtain Compound 4-418 (LT17-30-395) (1.0 g, 36.2%).

Example 40: Synthesis of Compound 4-419 (LT17-30-404)

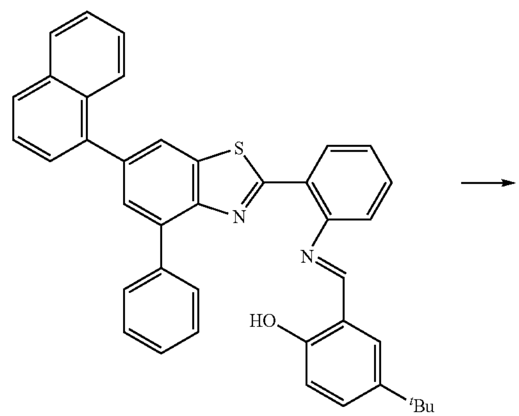

160

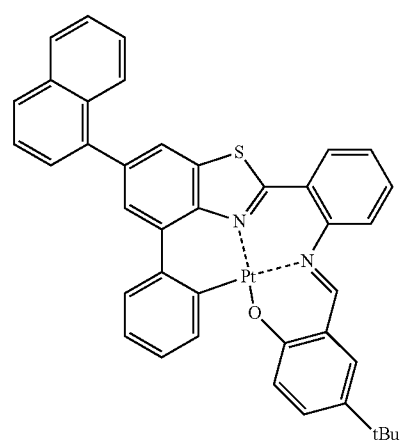

4-419(LT17-30-404)

The same procedure as in the synthesis of Compound 3-42 (LT17-30-303) of Example 1 was performed except for using Intermediate 160 (2.0 g, 3.40 mmol) instead of Intermediate 10 to obtain Compound 4-419 (LT17-30-404) (1.1 g, 41.4%).

Example 41: Synthesis of Compound 4-421 (LT17-30-409)

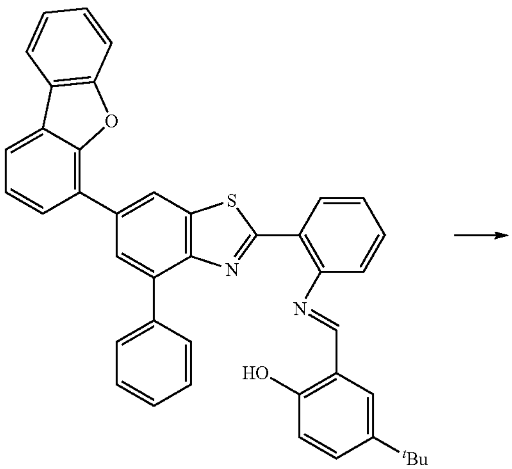

175

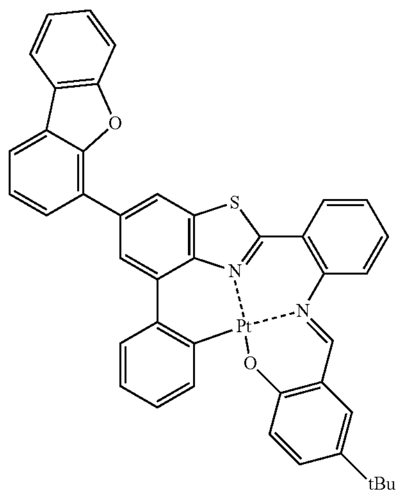

4-421(LT17-30-409)

The same procedure as in the synthesis of Compound 3-42 (LT17-30-303) of Example 1 was performed except for using Intermediate 175 (2.5 g, 3.98 mmol) instead of Intermediate 10 to obtain Compound 4-421 (LT17-30-409) (1.5 g, 45.9%).

Example 42: Synthesis of Compound 4-428 (LT17-30-398)

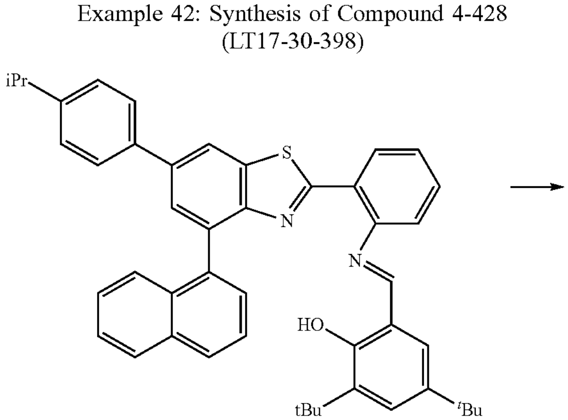

184

-continued

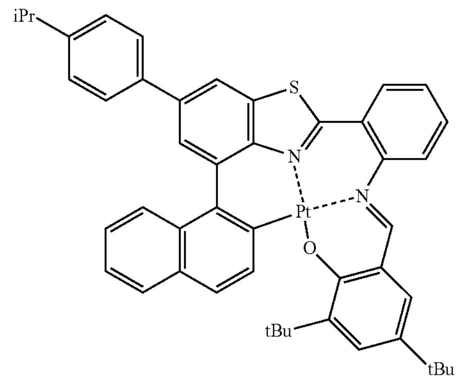

4-428(LT17-30-398)

The same procedure as in the synthesis of Compound 3-42 (LT17-30-303) of Example 1 was performed except for using Intermediate 184 (3.3 g, 4.80 mmol) instead of Intermediate 10 to obtain Compound 4-428 (LT17-30-398) (2.0 g, 47.3%).

Example 43: Synthesis of Compound 4-432 (LT17-30-397)

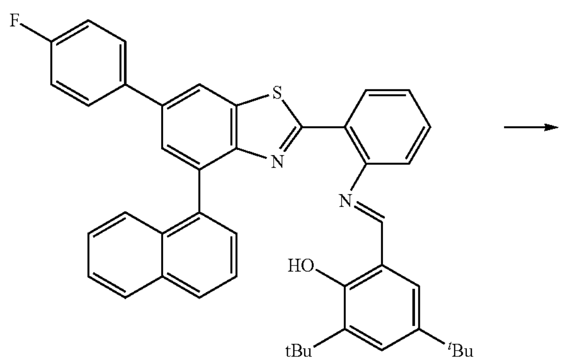

188

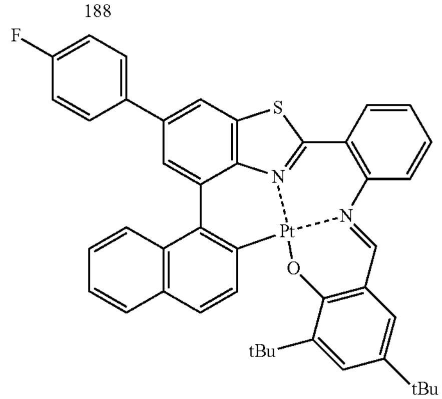

4-432(LT17-30-397)

The same procedure as in the synthesis of Compound 3-42 (LT17-30-303) of Example 1 was performed except for using Intermediate 188 (2.3 g, 3.47 mmol) instead of Intermediate 10 to obtain Compound 4-432 (LT17-30-397) (1.1 g, 37.0%).

Example 44: Synthesis of Compound 4-438 (LT17-30-411)

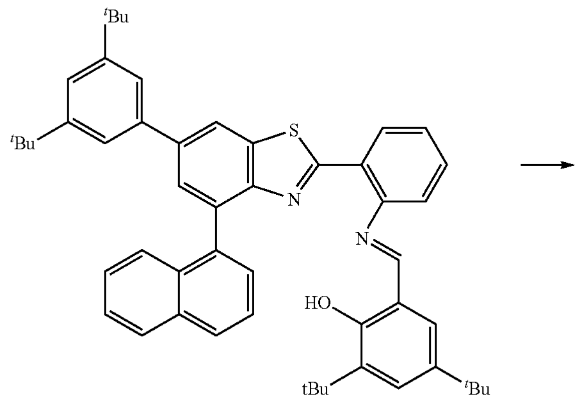

193

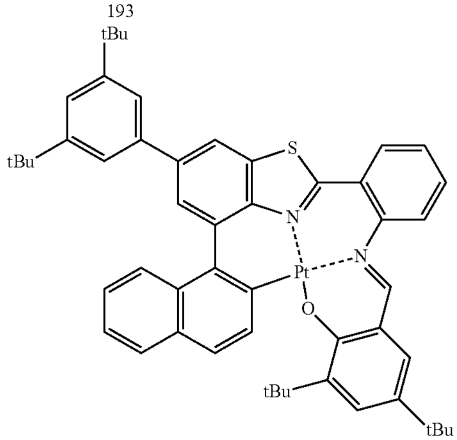

4-438(LT17-30-411)

The same procedure as in the synthesis of Compound 3-42 (LT17-30-303) of Example 1 was performed except for using Intermediate 193 (2.5 g, 3.30 mmol) instead of Intermediate 10 to obtain Compound 4-438 (LT17-30-411) (1.2 g, 38.2%).

Example 45: Synthesis of Compound 4-439 (LT17-30-447)

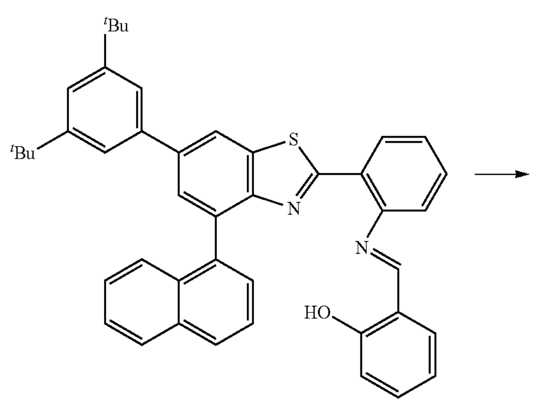

194

-continued

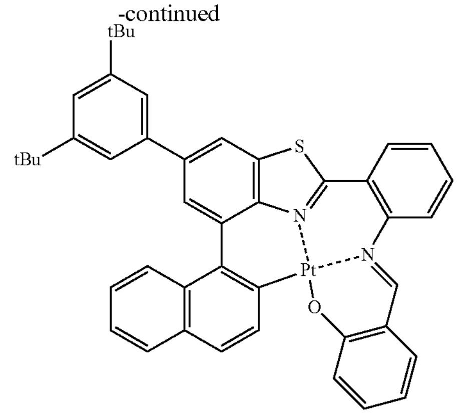

4-439(LT17-30-447)

The same procedure as in the synthesis of Compound 3-42 (LT17-30-303) of Example 1 was performed except for using Intermediate 194 (2.1 g, 3.26 mmol) instead of Intermediate 10 to obtain Compound 4-439 (LT17-30-447) (1.0 g, 36.6%).

Example 46: Synthesis of Compound 4-440 (LT17-30-336)

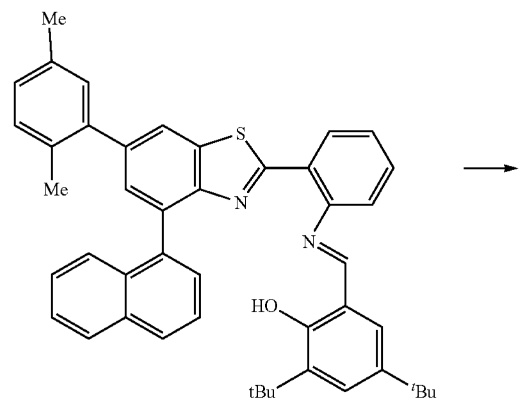

198

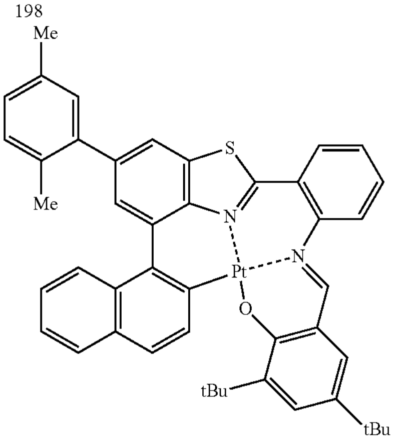

4-440(LT17-30-336)

The same procedure as in the synthesis of Compound 3-42 (LT17-30-303) of Example 1 was performed except for using Intermediate 198 (2.2 g, 3.27 mmol) instead of Intermediate 10 to obtain Compound 4-440 (LT17-30-336) (1.3 g, 45.9%).

Example 47: Synthesis of Compound 4-444 (LT17-30-382)

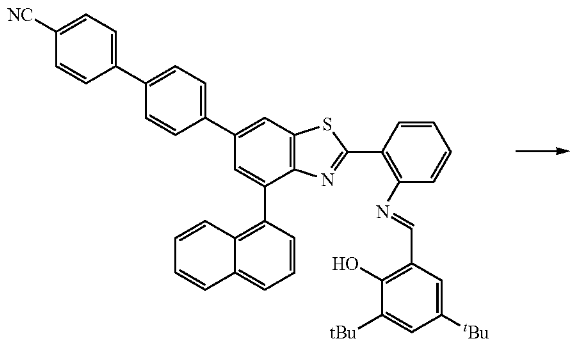

202

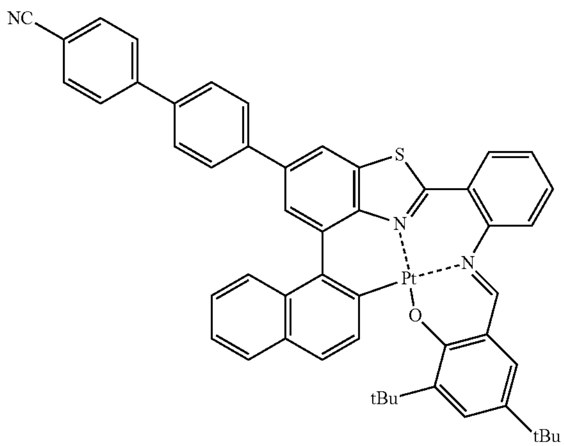

4-444(LT17-30-382)

The same procedure as in the synthesis of Compound 3-42 (LT17-30-303) of Example 1 was performed except for using Intermediate 202 (2.3 g, 3.08 mmol) instead of Intermediate 10 to obtain Compound 4-444 (LT17-30-382) (1.3 g, 44.9%).

Example 48: Synthesis of Compound 4-454 (LT17-30-339)

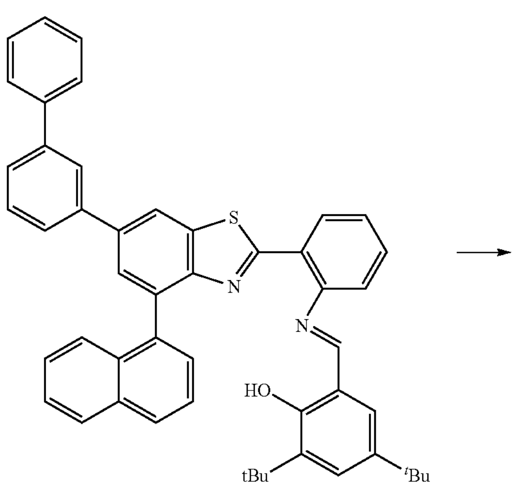

206

-continued

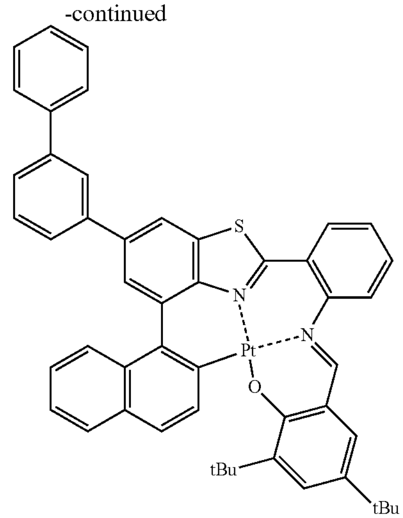

4-454(LT17-30-339)

The same procedure as in the synthesis of Compound 3-42 (LT17-30-303) of Example 1 was performed except for using Intermediate 206 (2.5 g, 3.47 mmol) instead of Intermediate 10 to obtain Compound 4-454 (LT17-30-339) (1.5 g, 47.3%).

Example 49: Synthesis of Compound 4-455 (LT17-30-391)

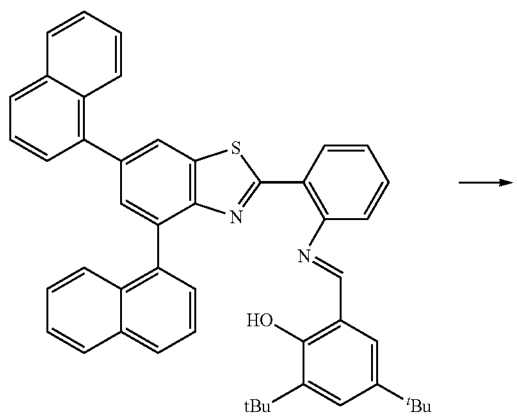

300

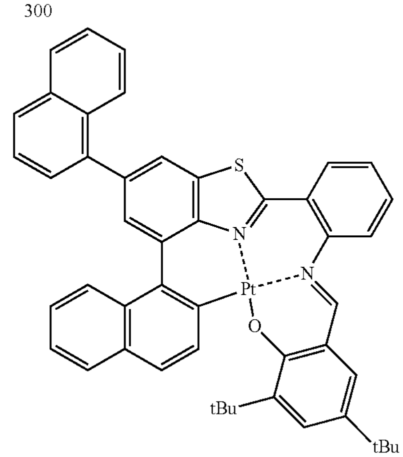

4-455(LT17-30-391)

The same procedure as in the synthesis of Compound 3-42 (LT17-30-303) of Example 1 was performed except for using Intermediate 300 (2.3 g, 3.31 mmol) instead of Intermediate 10 to obtain Compound 4-455 (LT17-30-391) (1.4 g, 47.6%).

Example 50: Synthesis of Compound 4-457 (LT17-30-406)

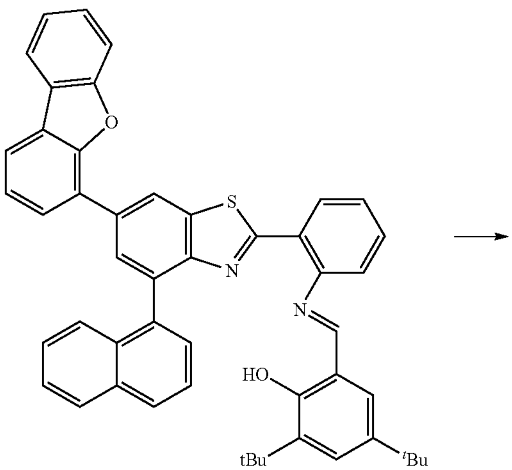

304

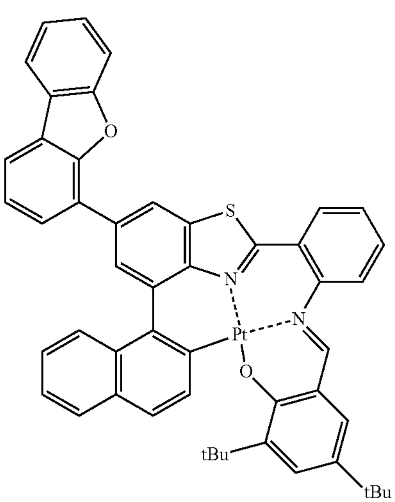

4-457(LT17-30-406)

The same procedure as in the synthesis of Compound 3-42 (LT17-30-303) of Example 1 was performed except for using Intermediate 304 (2.3 g, 3.13 mmol) instead of Intermediate 10 to obtain Compound 4-457 (LT17-30-406) (1.2 g, 41.3%).

Example 51: Synthesis of Compound 4-461 (LT17-30-399)

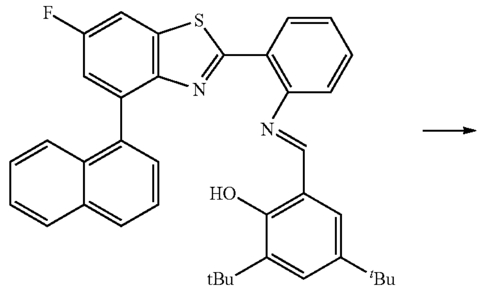

312

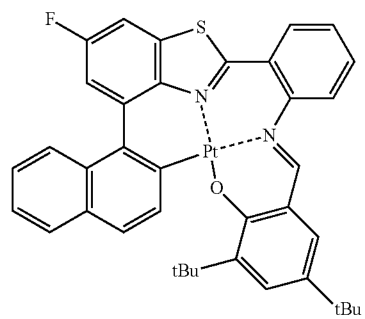

4-461(LT17-30-399)

The same procedure as in the synthesis of Compound 3-42 (LT17-30-303) of Example 1 was performed except for using Intermediate 312 (2.1 g, 3.58 mmol) instead of Intermediate 10 to obtain Compound 4-461 (LT17-30-399) (1.0 g, 35.8%).

Example 52: Synthesis of Compound 4-464 (LT17-30-392)

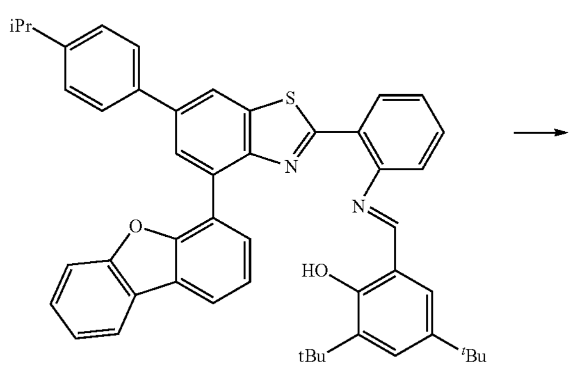

316

-continued

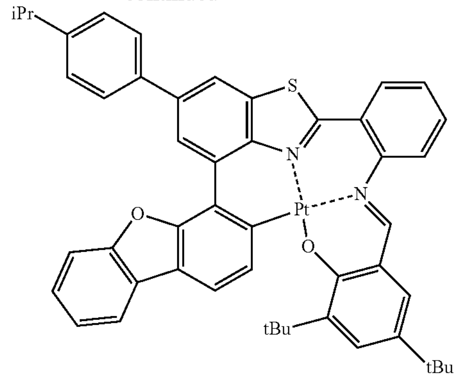

4-464(LT17-30-392)

The same procedure as in the synthesis of Compound 3-42 (LT17-30-303) of Example 1 was performed except for using Intermediate 316 (2.5 g, 3.44 mmol) instead of Intermediate 10 to obtain Compound 4-464 (LT17-30-392) (1.2 g, 37.9%).

Example 53: Synthesis of Compound 4-468 (LT17-30-396)

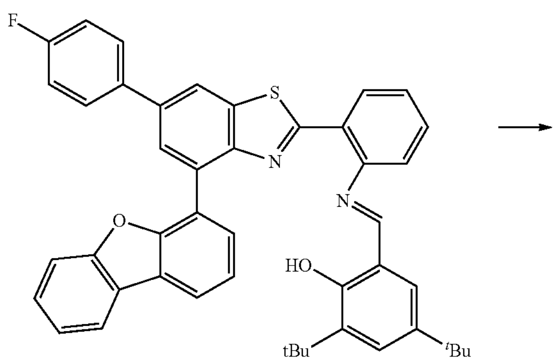

320

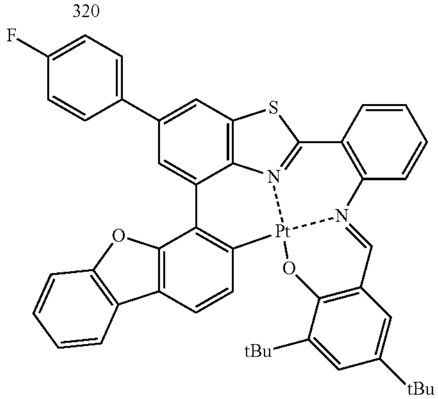

4-468(LT17-30-396)

The same procedure as in the synthesis of Compound 3-42 (LT17-30-303) of Example 1 was performed except for using Intermediate 320 (2.2 g, 3.13 mmol) instead of Intermediate 10 to obtain Compound 4-468 (LT17-30-396) (1.0 g, 35.6%).

Example 54: Synthesis of Compound 4-476 (LT17-30-337)

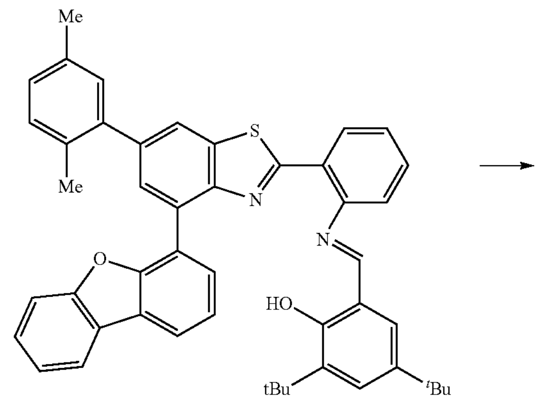

324

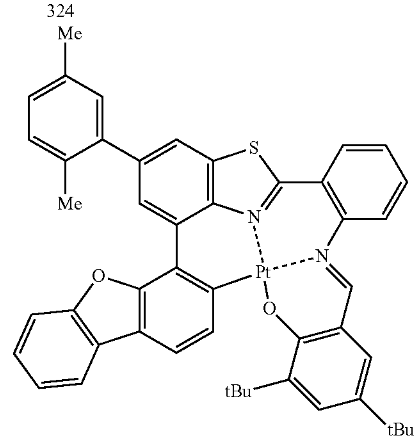

4-476(LT17-30-337)

The same procedure as in the synthesis of Compound 3-42 (LT17-30-303) of Example 1 was performed except for using Intermediate 324 (2.5 g, 3.51 mmol) instead of Intermediate 10 to obtain Compound 4-476 (LT17-30-337) (1.3 g, 40.9%).

Example 55: Synthesis of Compound 4-480 (LT17-30-383)

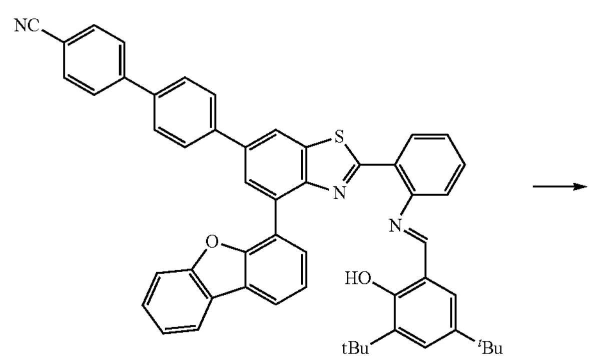

328

-continued

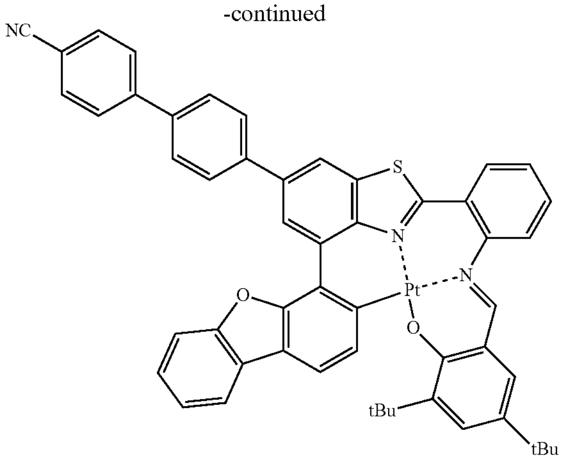

4-480(LT17-30-383)

The same procedure as in the synthesis of Compound 3-42 (LT17-30-303) of Example 1 was performed except for using Intermediate 328 (2.1 g, 2.67 mmol) instead of Intermediate 10 to obtain Compound 4-480 (LT17-30-383) (1.0 g, 38.2%).

Example 56: Synthesis of Compound 4-490 (LT17-30-407)

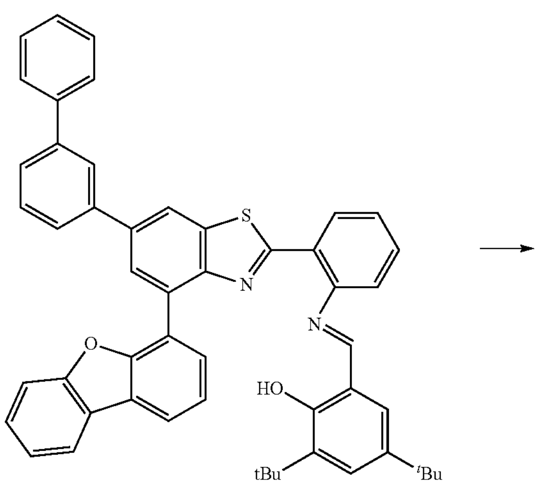

332

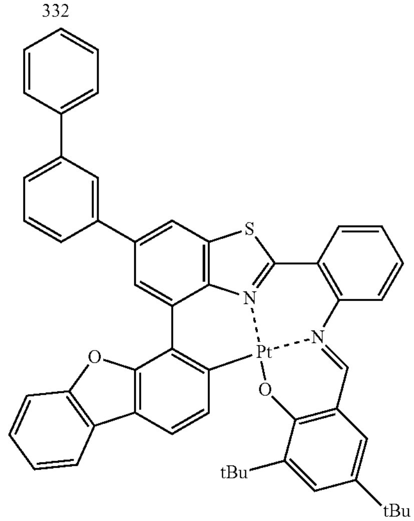

4-490(LT17-30-407)

The same procedure as in the synthesis of Compound 3-42 (LT17-30-303) of Example 1 was performed except for using Intermediate 332 (2.3 g, 3.02 mmol) instead of Intermediate 10 to obtain Compound 4-490 (LT17-30-407) (1.2 g, 41.6%).

Example 57: Synthesis of Compound 4-491 (LT17-30-401)

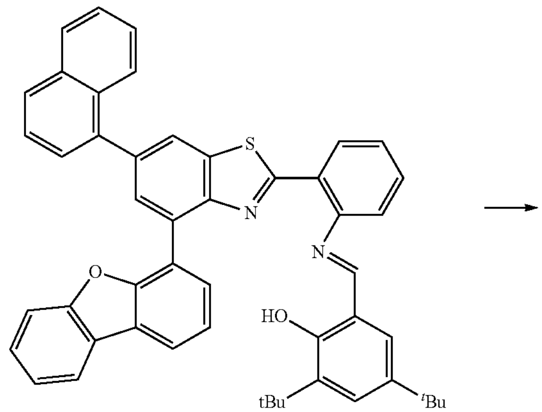

336

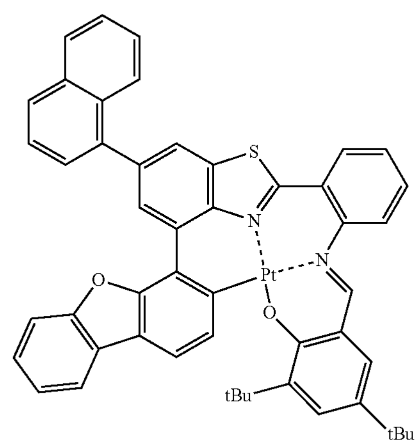

4-491(LT17-30-401)

The same procedure as in the synthesis of Compound 3-42 (LT17-30-303) of Example 1 was performed except for using Intermediate 336 (2.3 g, 3.13 mmol) instead of Intermediate 10 to obtain Compound 4-491 (LT17-30-401) (1.3 g, 44.7%).

Example 58: Synthesis of Compound 4-493 (LT17-30-408)

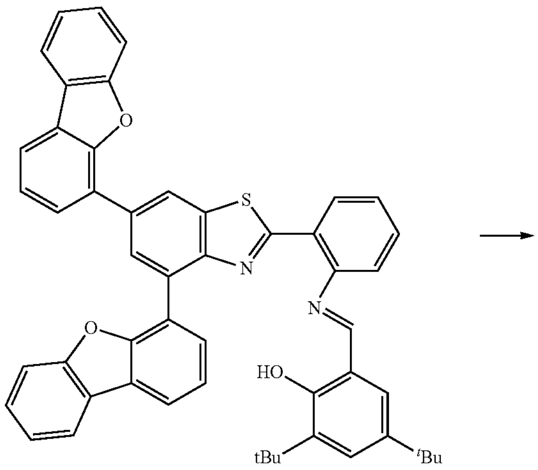

340

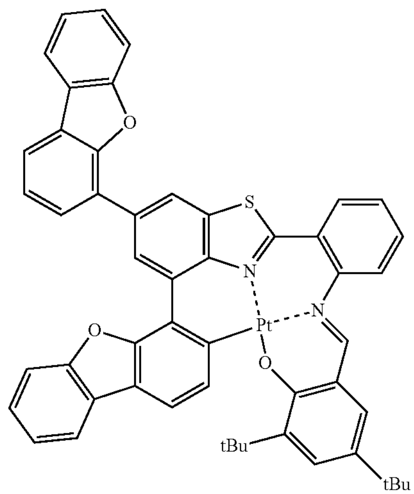

4-493(LT17-30-408)

The same procedure as in the synthesis of Compound 3-42 (LT17-30-303) of Example 1 was performed except for using Intermediate 340 (2.5 g, 3.23 mmol) instead of Intermediate 10 to obtain Compound 4-493 (LT17-30-408) (1.6 g, 51.2%).

Example 59: Synthesis of Compound 4-497 (LT17-30-393)

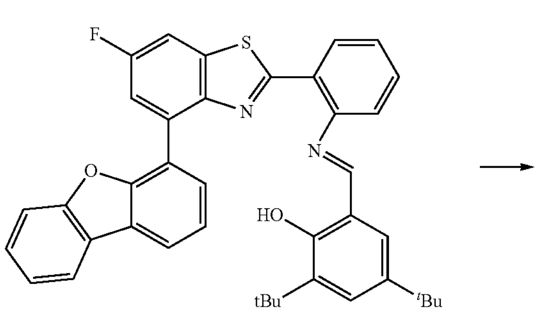

344

-continued

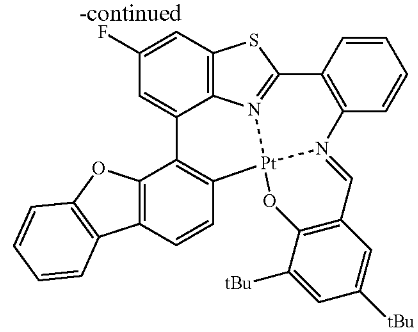

4-497(LT17-30-393)

The same procedure as in the synthesis of Compound 3-42 (LT17-30-303) of Example 1 was performed except for using Intermediate 344 (2.0 g, 3.19 mmol) instead of Intermediate 10 to obtain Compound 4-497 (LT17-30-393) (1.1 g, 42.0%).

Example 60: Synthesis of Compound 4-498 (LT17-30-455)

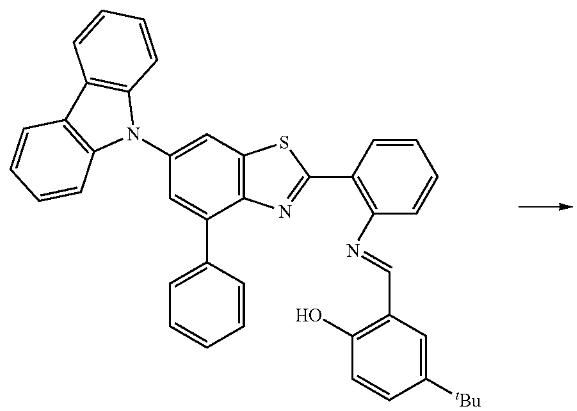

180

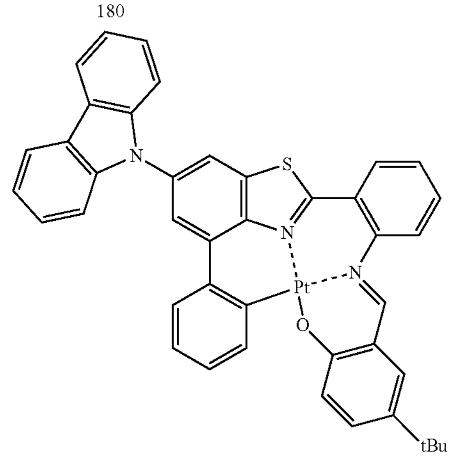

4-498(LT17-30-455)

The same procedure as in the synthesis of Compound 3-42 (LT17-30-303) of Example 1 was performed except for using Intermediate 180 (2.2 g, 3.50 mmol) instead of Intermediate 10 to obtain Compound 4-498 (LT17-30-455) (1.4 g, 48.6%).

Example 61: Synthesis of Compound 4-501 (LT17-30-189)

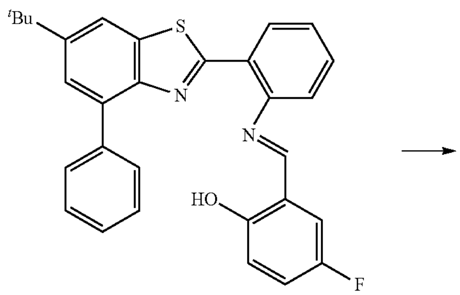

379

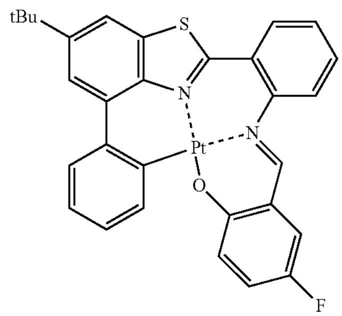

4-501(LT17-30-189)

The same procedure as in the synthesis of Compound 3-42 (LT17-30-303) of Example 1 was performed except for using Intermediate 379 (2.1 g, 4.37 mmol) instead of Intermediate 10 to obtain Compound 4-501 (LT17-30-189) (1.2 g, 40.7%).

Example 62: Synthesis of Compound 4-502 (LT17-30-208)

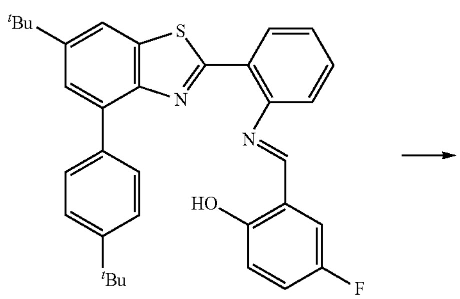

373

-continued

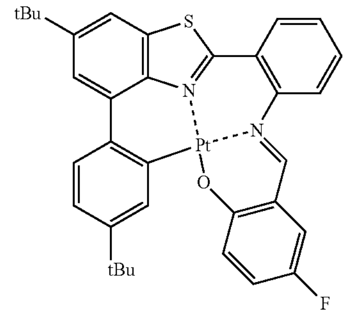

4-502(LT17-30-208)

The same procedure as in the synthesis of Compound 3-42 (LT17-30-303) of Example 1 was performed except for using Intermediate 373 (1.6 g, 2.98 mmol) instead of Intermediate 10 to obtain Compound 4-502 (LT17-30-208) (1.0 g, 45.9%).

Example 63: Synthesis of Compound 4-503 (LT17-30-211)

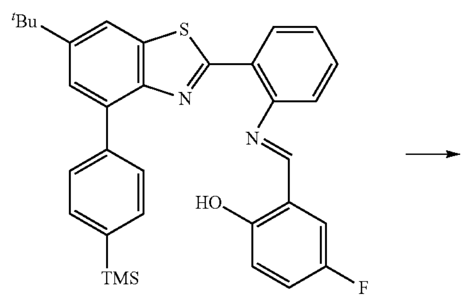

374

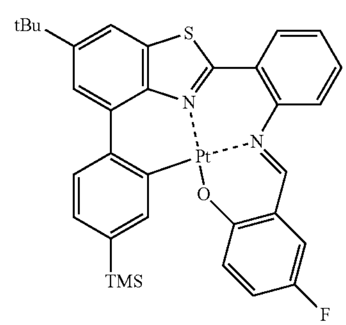

4-503(LT17-30-211)

The same procedure as in the synthesis of Compound 3-42 (LT17-30-303) of Example 1 was performed except for using Intermediate 374 (1.9 g, 3.44 mmol) instead of Intermediate 10 to obtain Compound 4-503 (LT17-30-211) (853 mg, 33.2%).

Example 64: Synthesis of Compound 4-504 (LT17-30-191)

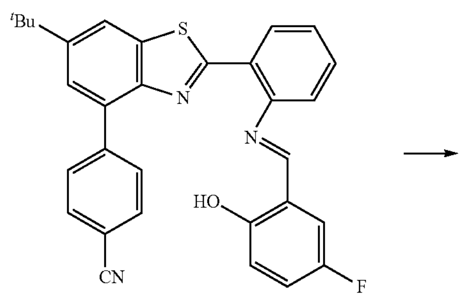

375

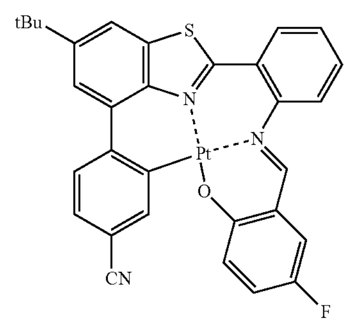

4-504(LT17-30-191)

The same procedure as in the synthesis of Compound 3-42 (LT17-30-303) of Example 1 was performed except for using Intermediate 375 (2.1 g, 4.15 mmol) instead of Intermediate 10 to obtain Compound 4-504 (LT17-30-191) (1.3 g, 44.8%).

Example 65: Synthesis of Compound 4-506 (LT17-30-207)

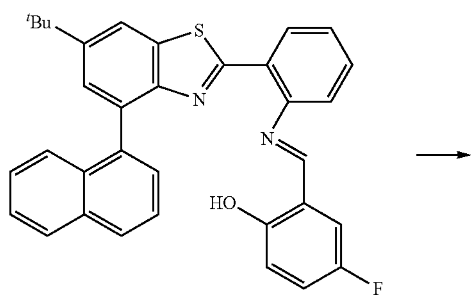

376

-continued

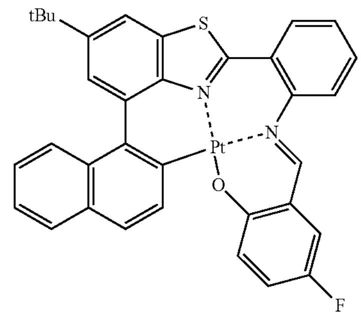

4-506(LT17-30-207)

The same procedure as in the synthesis of Compound 3-42 (LT17-30-303) of Example 1 was performed except for using Intermediate 376 (2.0 g, 3.77 mmol) instead of Intermediate 10 to obtain Compound 4-506 (LT17-30-207) (1.1 g, 40.3%).

Example 66: Synthesis of Compound 4-508 (LT17-30-210)

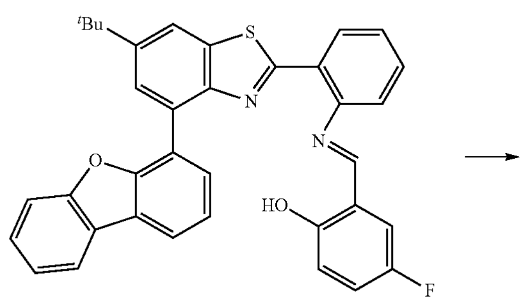

377

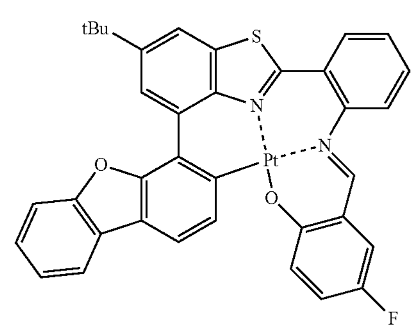

4-508(LT17-30-210)

The same procedure as in the synthesis of Compound 3-42 (LT17-30-303) of Example 1 was performed except for using Intermediate 377 (1.9 g, 3.33 mmol) instead of Intermediate 10 to obtain Compound 4-508 (LT17-30-210) (912 mg, 35.8%).

Example 67: Synthesis of Compound 4-510 (LT17-30-292)

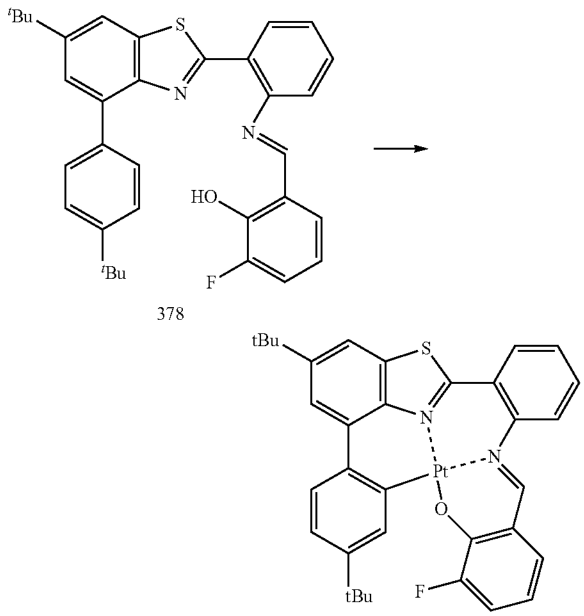

378

4-510(LT17-30-292)

The same procedure as in the synthesis of Compound 3-42 (LT17-30-303) of Example 1 was performed except for using Intermediate 378 (2.0 g, 3.44 mmol) instead of Intermediate 10 to obtain Compound 4-510 (LT17-30-292) (1.2 g, 44.1%).

Example 68: Synthesis of Compound 4-511 (LT17-30-289)

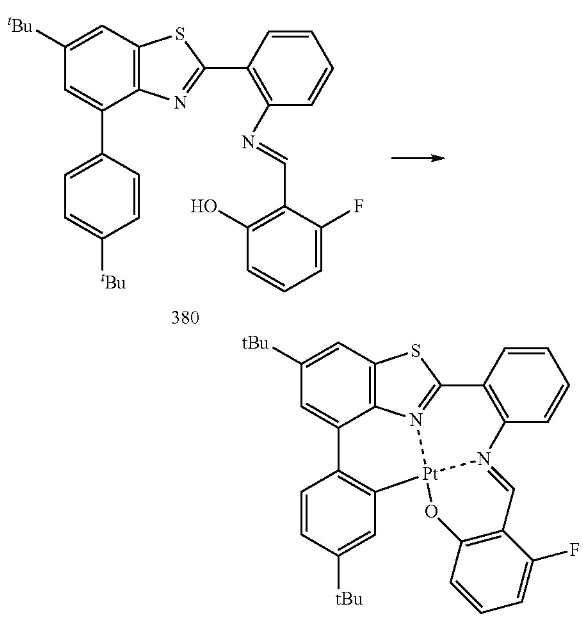

380

4-511(LT17-30-289)

The same procedure as in the synthesis of Compound 3-42 (LT17-30-303) of Example 1 was performed except for using Intermediate 380 (1.8 g, 3.35 mmol) instead of Intermediate 10 to obtain Compound 4-511 (LT17-30-289) (985 mg, 40.2%).

Example 69: Synthesis of Compound 4-513 (LT17-30-497)

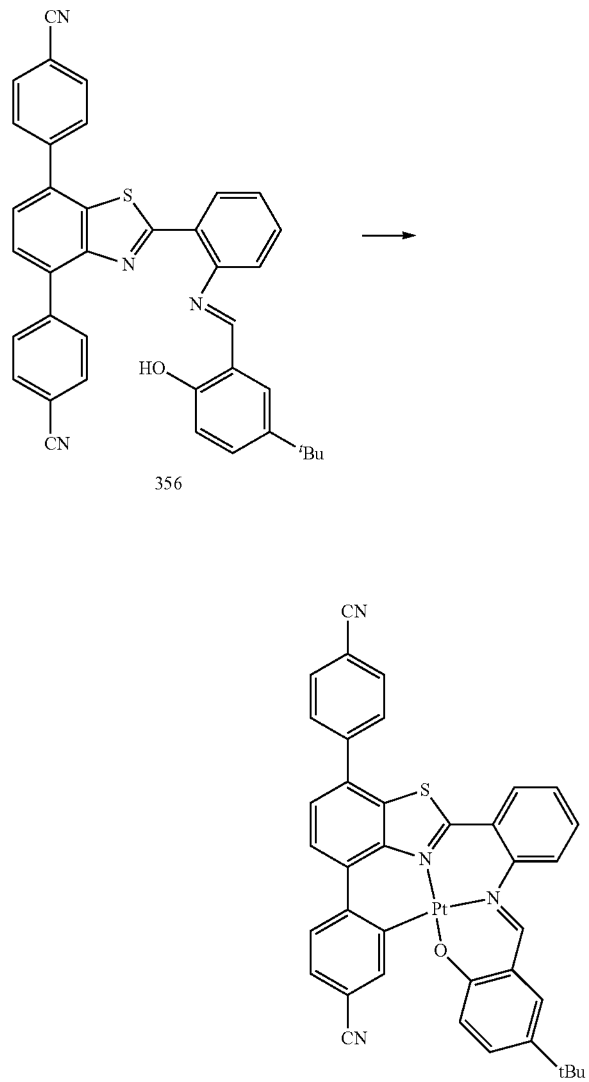

356

4-513(LT17-30-497)

The same procedure as in the synthesis of Compound 3-42 (LT17-30-303) of Example 1 was performed except for using Intermediate 356 (2.0 g, 3.40 mmol) instead of Intermediate 10 to obtain Compound 4-513 (LT17-30-497) (1.3 g, 48.9%).

Example 70: Synthesis of Compound 4-515 (LT17-30-493)

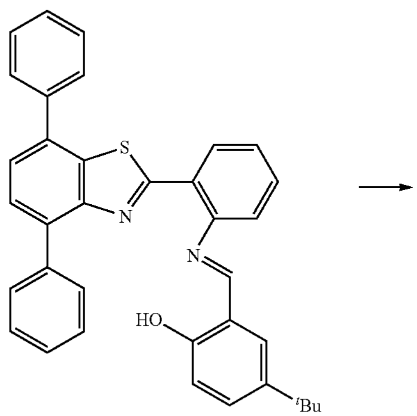

360

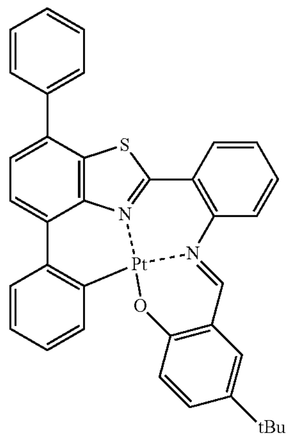

4-515(LT17-30-493)

The same procedure as in the synthesis of Compound 3-42 (LT17-30-303) of Example 1 was performed except for using Intermediate 360 (1.7 g, 3.16 mmol) instead of Intermediate 10 to obtain Compound 4-515 (LT17-30-493) (756 mg, 33.7%).

Example 71: Synthesis of Compound 4-516 (LT17-30-498)

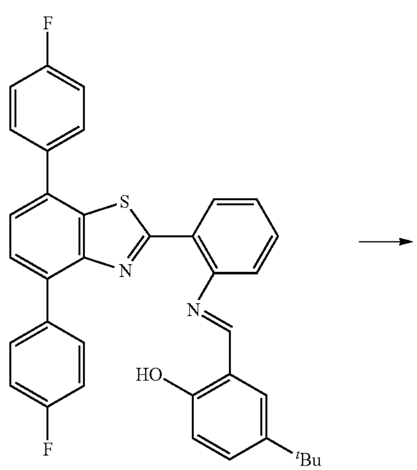

364

-continued

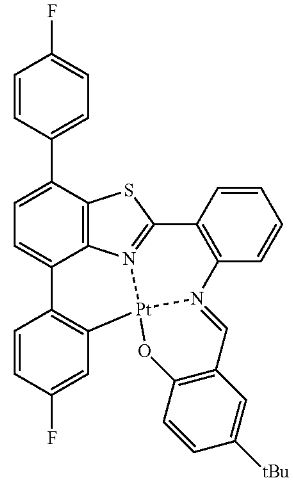

4-516(LT17-30-498)

The same procedure as in the synthesis of Compound 3-42 (LT17-30-303) of Example 1 was performed except for using Intermediate 364 (1.5 g, 2.61 mmol) instead of Intermediate 10 to obtain Compound 4-516 (LT17-30-498) (1.0 g, 49.9%).

Example 72: Synthesis of Compound 4-517 (LT17-30-496)

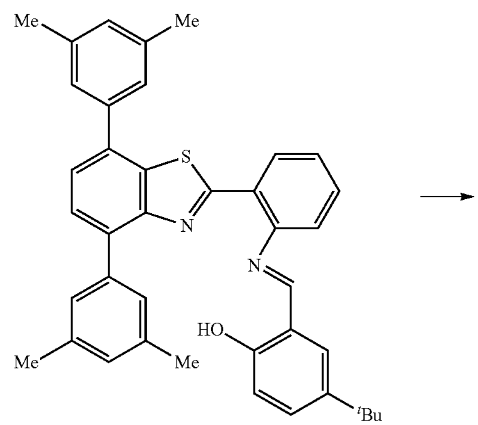

368

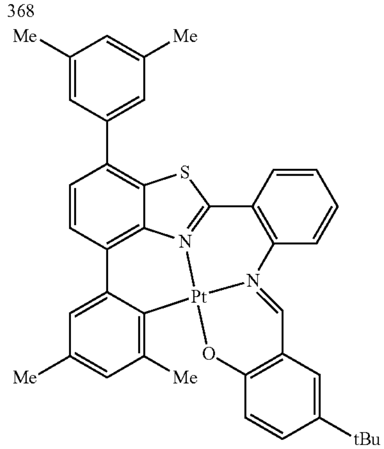

4-517(LT17-30-496)

The same procedure as in the synthesis of Compound 3-42 (LT17-30-303) of Example 1 was performed except for using Intermediate 368 (1.8 g, 3.03 mmol) instead of Intermediate 10 to obtain Compound 4-517 (LT17-30-496) (1.0 g, 41.9%).

Example 73: Synthesis of Compound 4-518 (LT17-30-500)

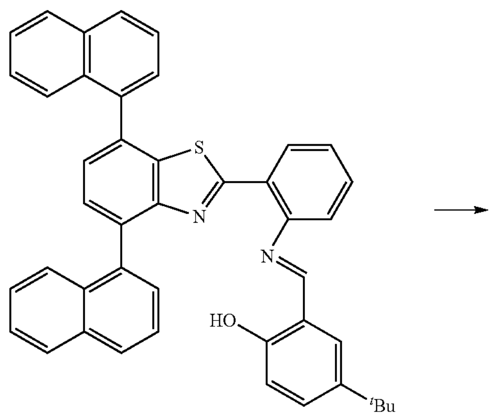

372

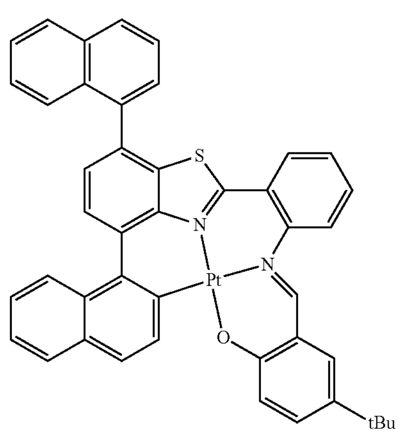

4-518(LT17-30-500)

The same procedure as in the synthesis of Compound 3-42 (LT17-30-303) of Example 1 was performed except for using Intermediate 372 (2.0 g, 3.13 mmol) instead of Intermediate 10 to obtain Compound 4-518 (LT17-30-500) (1.1 g, 42.2%).

Example 74: Synthesis of Compound 4-519 (LT17-30-491)

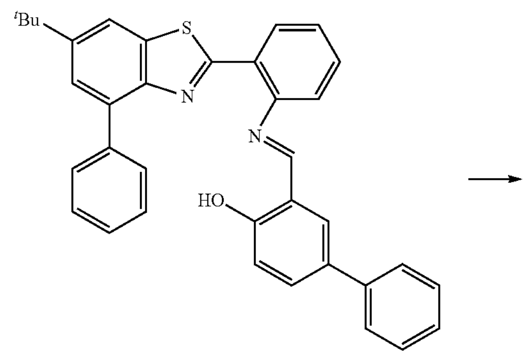

381

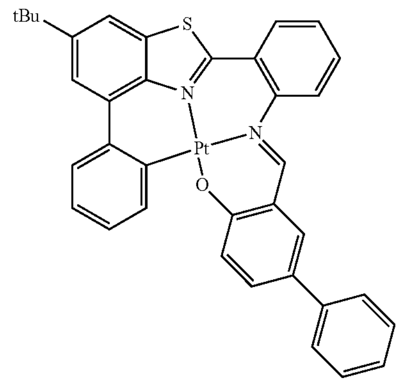

4-519(LT17-30-491)

The same procedure as in the synthesis of Compound 3-42 (LT17-30-303) of Example 1 was performed except for using Intermediate 381 (2.6 g, 4.83 mmol) instead of Intermediate 10 to obtain Compound 4-519 (LT17-30-491) (1.0 g, 28.3%).

Example 75: Synthesis of Compound 4-520 (LT17-30-490)

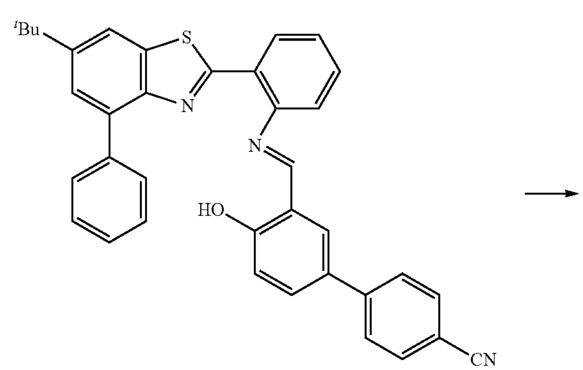

382

-continued

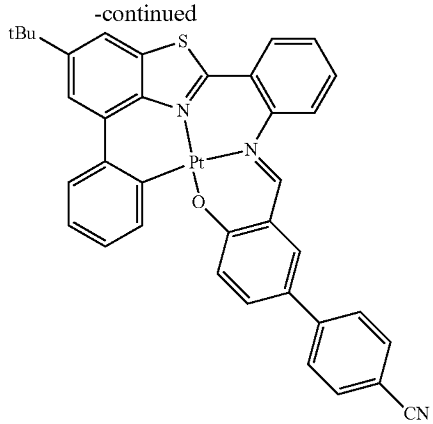

4-520(LT17-30-490)

The same procedure as in the synthesis of Compound 3-42 (LT17-30-303) of Example 1 was performed except for using Intermediate 382 (2.8 g, 4.97 mmol) instead of Intermediate 10 to obtain Compound 4-520 (LT17-30-490) (1.2 g, 31.9%).

Example 76: Synthesis of Compound 4-521 (LT17-30-467)

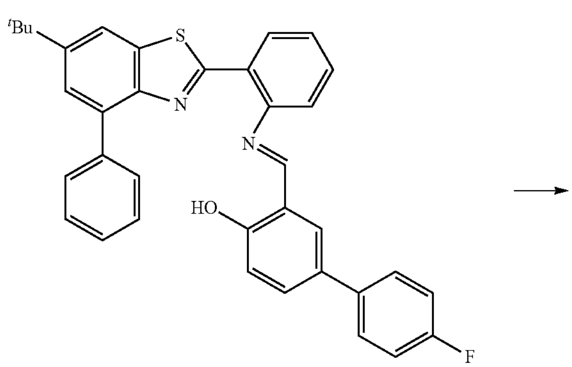

383

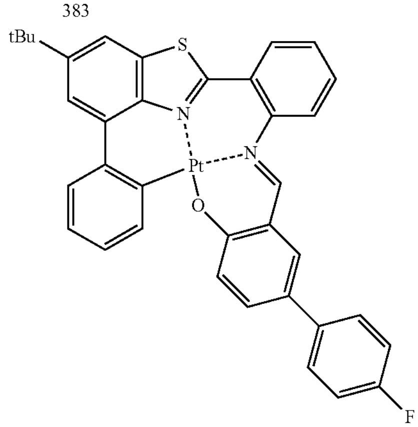

4-521(LT17-30-467)

The same procedure as in the synthesis of Compound 3-42 (LT17-30-303) of Example 1 was performed except for using Intermediate 383 (2.0 g, 3.59 mmol) instead of Intermediate 10 to obtain Compound 4-521 (LT17-30-467) (846 mg, 31.4%).

Example 77: Synthesis of Compound 4-522 (LT17-30-495)

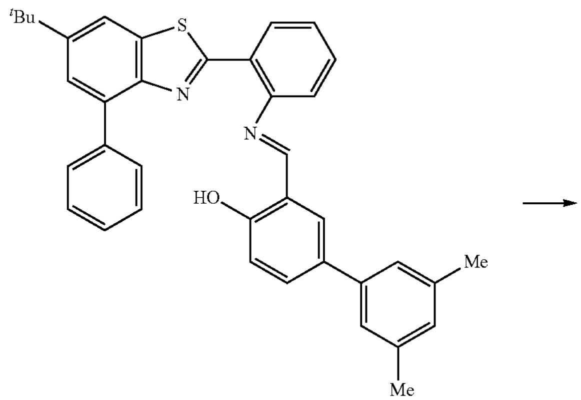

384

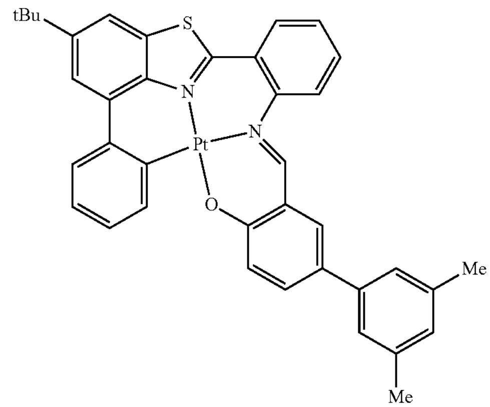

4-522(LT17-30-495)

The same procedure as in the synthesis of Compound 3-42 (LT17-30-303) of Example 1 was performed except for using Intermediate 384 (2.9 g, 5.12 mmol) instead of Intermediate 10 to obtain Compound 4-522 (LT17-30-495) (1.6 g, 41.1%).

Example 78: Synthesis of Compound 4-523 (LT17-30-451)

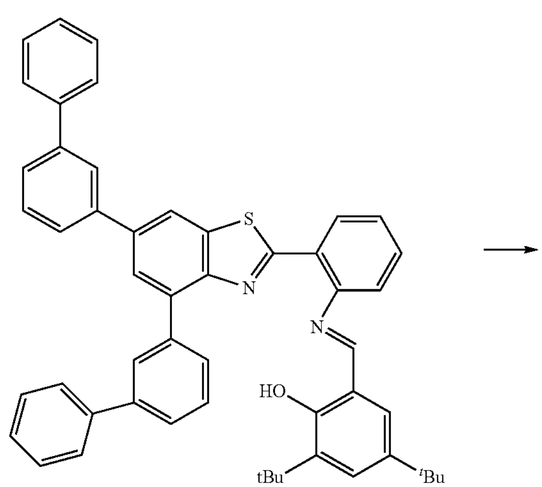

348

-continued

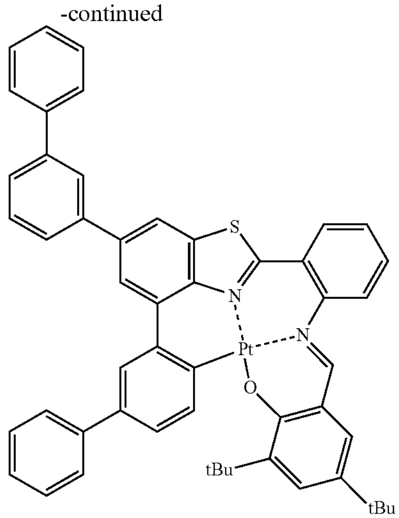

4-523(LT17-30-451)

The same procedure as in the synthesis of Compound 3-42 (LT17-30-303) of Example 1 was performed except for using Intermediate 348 (1.9 g, 2.54 mmol) instead of Intermediate 10 to obtain Compound 4-523 (LT17-30-451) (856 mg, 35.8%).

Example 79: Synthesis of Compound 5-1 (LT17-35-642)

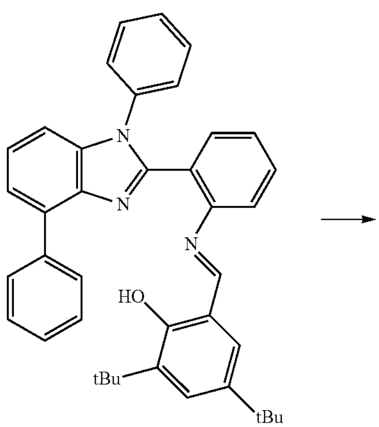

400

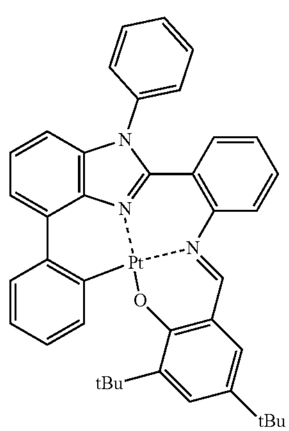

5-1 (LT17-35-642)

The same procedure as in the synthesis of Compound 3-42 (LT17-30-303) of Example 1 was performed except for using Intermediate 400 (1.8 g, 3.12 mmol) instead of Intermediate 10 to obtain Compound 5-1 (LT17-35-642) (472 mg, 15.4%).

Example 80: Synthesis of Compound 5-42 (LT17-35-659)

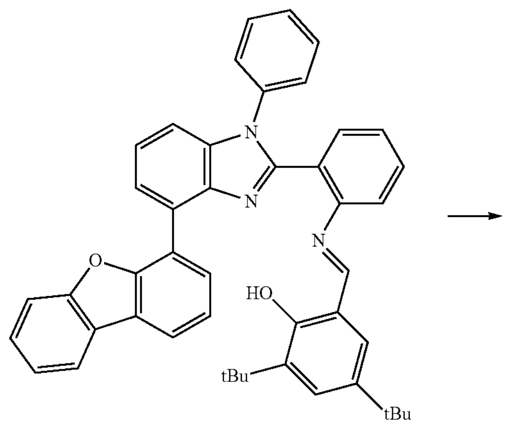

404

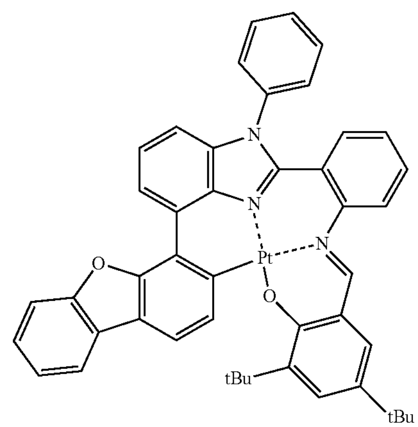

5-42(LT17-35-659)

The same procedure as in the synthesis of Compound 3-42 (LT17-30-303) of Example 1 was performed except for using Intermediate 404 (2.4 g, 3.59 mmol) instead of Intermediate 10 to obtain Compound 5-42 (LT17-35-659) (912 mg, 29.4%).

Experimental Example 1

UV/VIS spectra of compounds described above were measured by using a Jasco V-630 apparatus. Photoluminescence (PL) spectra for the compounds were measured by using a Jasco FP-8500 apparatus. The results are listed in Tables 1 to 5 below.

TABLE 1

| UV/VIS and PL results of compounds | | | |
|---|---|---|---|
| Category | Compound | UV(nm)*1 | PL(nm, rt)*2 |
| Example 1 | 3-42 | 248, 335, 401 | 604 |
| Example 2 | 3-143 | 241, 320, 363 | 601 |
| Example 3 | 3-146 | 251, 340, 399 | 599 |
| Example 4 | 3-186 | 245, 330, 395 | 605 |
| Example 5 | 4-1 | 248, 271, 338, 368, 401 | 601 |
| Example 6 | 4-2 | 248, 335, 401 | 610 |
| Example 7 | 4-3 | 366, 386, 450, 511, 529 | 609 |
| Example 8 | 4-4 | 248, 335, 401 | 608 |
| Example 9 | 4-44 | 254, 317, 366, 386, 450, 511, 529 | 614 |
| Example 10 | 4-72 | 240, 312, 327, 369, 420, 474 | 604 |

TABLE 2

| Category | Compound | UV(nm)*1 | PL(nm, rt)*2 |
|---|---|---|---|
| Example 11 | 4-1434-143 | 248, 335, 401248, 335, 401 | 608608 |
| Example 12 | 4-144 | 241, 320, 363 | 609 |
| Example 13 | 4-145 | 251, 340, 399 | 609 |
| Example 14 | 4-146 | 245, 330, 395 | 608 |
| Example 15 | 4-147 | 248, 271, 338, 368, 401 | 606 |
| Example 16 | 4-156 | 241, 320, 363 | 612 |
| Example 17 | 4-158 | 256, 315, 366, 387, 430, 451, 536 | 612 |
| Example 18 | 4-160 | 248, 335, 401 | 615 |
| Example 19 | 4-161 | 248, 271, 338, 368, 401 | 610 |
| Example 20 | 4-162 | 256, 315, 366, 387, 430, 451, 536 | 615 |
| Example 21 | 4-167 | 251, 340, 399 | 612 |
| Example 22 | 4-170 | 245, 330, 395 | 610 |
| Example 23 | 4-174 | 366, 386, 450, 511, 529 | 614 |
| Example 24 | 4-177 | 248, 335, 401 | 614 |
| Example 25 | 4-184 | 248, 271, 338, 368, 401 | 610 |
| Example 26 | 4-185 | 366, 386, 450, 511, 529 | 608 |
| Example 27 | 4-186 | 251, 340, 399 | 613 |
| Example 28 | 4-187 | 245, 330, 395 | 610 |
| Example 29 | 4-205 | 256, 315, 366, 387, 430, 451, 536 | 606 |
| Example 30 | 4-211 | 366, 386, 450, 511, 529 | 609 |
| Example 31 | 4-217 | 248, 271, 338, 368, 401 | 637 |
| Example 32 | 4-327 | 248, 335, 401 | 618 |
| Example 33 | 4-384 | 251, 340, 399 | 617 |
| Example 34 | 4-392 | 245, 330, 395 | 614 |
| Example 35 | 4-396 | 256, 315, 366, 387, 430, 451, 536 | 614 |
| Example 36 | 4-401 | 366, 386, 450, 511, 529 | 613 |
| Example 37 | 4-404 | 248, 271, 338, 368, 401 | 613 |
| Example 38 | 4-408 | 335, 401 | 616 |
| Example 39 | 4-418 | 248, 271, 338, 368, 401 | 613 |
| Example 40 | 4-419 | 366, 386, 450, 511, 529 | 612 |

TABLE 3

| Category | Compound | UV(nm)*1 | PL(nm, rt)*2 |
|---|---|---|---|
| Example 41 | 4-421 | 256, 315, 366, 387, 430, 451, 536 | 615 |
| Example 42 | 4-428 | 251, 340, 399 | 622 |
| Example 43 | 4-432 | 245, 330, 395 | 631 |
| Example 44 | 4-438 | 248, 335, 401 | 621 |
| Example 45 | 4-439 | 248, 271, 338, 368, 401 | 622 |
| Example 46 | 4-440 | 366, 386, 450, 511, 529 | 623 |
| Example 47 | 4-444 | 251, 340, 399 | 618 |
| Example 48 | 4-454 | 245, 330, 395 | 625 |
| Example 49 | 4-455 | 248, 335, 401 | 623 |
| Example 50 | 4-457 | 248, 271, 338, 368, 401 | 619 |
| Example 51 | 4-461 | 248, 335, 401 | 625 |
| Example 52 | 4-464 | 271, 338, 400 | 609 |
| Example 53 | 4-468 | 252, 317, 346, 364, 449, 500, 514 | 614 |

TABLE 3-continued

| Category | Compound | UV(nm)*1 | PL(nm, rt)*2 |
|---|---|---|---|
| Example 54 | 4-476 | 254, 317, 366, 386, 450, 511, 529 | 614 |
| Example 55 | 4-480 | 240, 312, 327, 369, 420, 474 | 612 |

TABLE 4

| Category | Compound | UV(nm)*1 | PL(nm, rt)*2 |
|---|---|---|---|
| Example 56 | 4-490 | 248, 335, 401 | 614 |
| Example 57 | 4-491 | 335, 401 | 613 |
| Example 58 | 4-493 | 256, 315, 366, 387, 430, 451, 536 | — |
| Example 59 | 4-497 | 241, 320, 363 | 608 |
| Example 60 | 4-498 | 248, 271, 338, 368, 401 | 614 |
| Example 61 | 4-501 | 366, 386, 450, | 624 |
| Example 62 | 4-502 | 251, 340, 399 | — |
| Example 63 | 4-503 | 256, 315, 366, | 526 |
| Example 64 | 4-504 | 248, 271, 338, 368, 401 | 631 |
| Example 65 | 4-506 | 245, 330, 395 | 621 |
| Example 66 | 4-508 | 335, 401 | 625 |
| Example 67 | 4-510 | 248, 271, 338, 368, 401 | 626 |
| Example 68 | 4-511 | 248, 271, 338, 368, 401 | — |
| Example 69 | 4-513 | 366, 386, 450, | 604 |
| Example 70 | 4-515 | 251, 340, 399 | 613 |

TABLE 5

| Category | Compound | UV(nm)*1 | PL(nm, rt)*2 |
|---|---|---|---|
| Example 71 | 4-516 | 245, 330, 395 | 612 |
| Example 72 | 4-517 | 248, 271, 338, 368, 401 | 608 |
| Example 73 | 4-518 | 254, 317, 366, 386, 450, 511, 529 | 617 |
| Example 74 | 4-519 | 366, 386, 450, | 626 |
| Example 75 | 4-520 | 366, 386, 450, | 617 |
| Example 76 | 4-521 | 240, 312, 327, 369, 420, 474 | 610 |
| Example 77 | 4-522 | 338, 368, 401 | 618 |
| Example 78 | 4-523 | 338, 368, 401 | 620 |
| Example 79 | 5-1 | 251, 340, 399 | 525 |
| Example 80 | 5-42 | 245, 330, 395 | 561 |

*1: 1.0 × 10−5M in methylene chloride

*2: 5.0 × 10−6M in methylene chloride

Device Manufacturing Experimental Examples

To manufacture devices, a transparent electrode, ITO was used as a first electrode, 2-TNATA was used as a hole injection layer, NPB was used as a hole transport layer, CBP was used as a host of an emission layer, $Alq_3$ was used as an electron transport layer, Liq was used as an electron injection layer, and Al was used as a second electrode. The structures of the compounds are shown below.

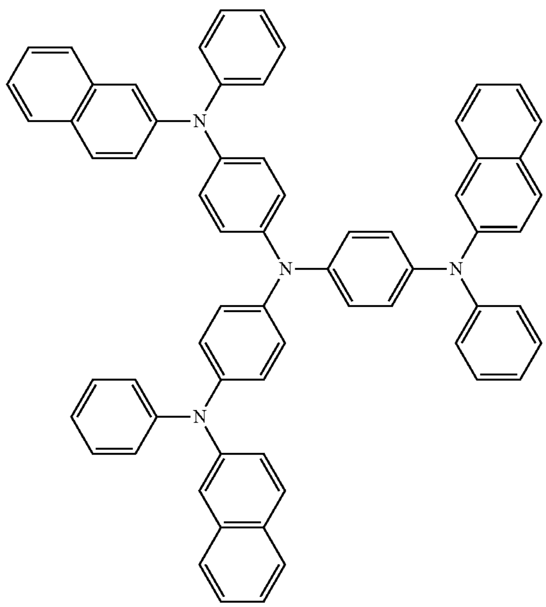

2-TNATA

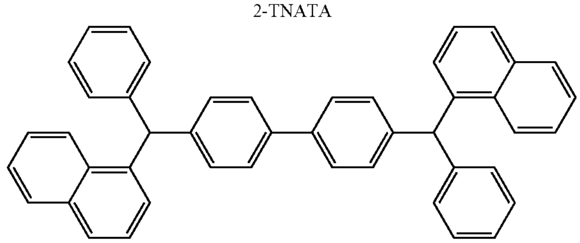

NPB

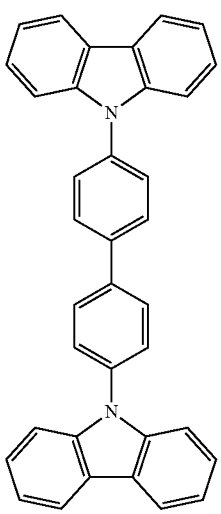

CBP

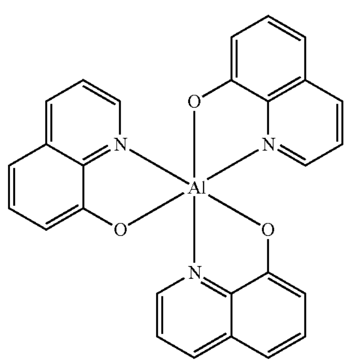

$Alq_3$

Comparative Experimental Examples

Phosphorescence organic electroluminescence devices were manufactured by depositing ITO (about 180 nm)/2-TNATA (about 60 nm)/NPB (about 20 nm)/CBP: dopant 3% (about 40 nm)/$Alq_3$ (about 30 nm)/Liq (about 2 nm)/Al (about 100 nm) in order. Prior to depositing organic materials, an ITO electrode was treated with oxygen plasma under about $2\times10^{-2}$ torr with about 125 W for about 2 minutes. Organic materials were deposited under a vacuum degree of about $2\times10^{-7}$ torr, and Liq was deposited in a rate of about 0.1 Å/sec, CBP was deposited in a rate of about 0.18 Å/sec. a dopant was deposited in a rate of about 0.02 Å/sec, and remaining organic materials were deposited in a rate of about 1 Å/sec. A dopant material used in the experiments was WS16-30-336. After completing the manufacture of a device, the device was encapsulated in a glove box charged with a nitrogen gas to prevent the contact with air and moisture. Spacers were formed using a tape for adhesion (3M Co.), barium oxide as a moisture absorbent for removing moisture, etc. was injected, and glass plates were attached.

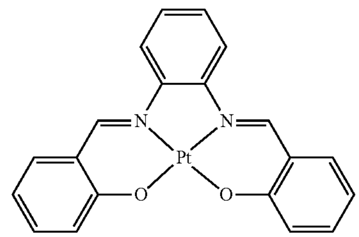

WS 16-30-336

Experimental Examples 1 to 78

Devices were manufactured by the same method described in Comparative Experimental Example except for using each compound shown in Tables 6 to 9 instead of WS16-30-336.

Electric light-emitting properties of the organic electroluminescence devices manufactured in Comparative Experimental Example and Experimental Examples 1 to 78 are shown in Tables 6 to 9.

In Tables 6 to 9, a driving voltage (V), emission efficiency (LE) and life are suggested at 1000 nits, and the life was defined as a decomposition ratio after 100 hours when initial luminance ($L_0$) under a constant current density was defined as 100%.

TABLE 6

| Category | Compound | Driving voltage [V] | Efficiency [cd/A] | Life (%) | EL max [nm] |
|---|---|---|---|---|---|
| Comparative Example | WS16-30-336 | 5.28 | 6.53 | 87.52 | 600 |
| Experimental Example 1 | 3-42 (LT17-30-303) | 4.16 | 17.14 | 99.08 | 604 |
| Experimental Example 2 | 3-143 (LT17-30-114) | 4.15 | 19.56 | 97.18 | 601 |
| Experimental Example 3 | 3-146 (LT17-30-220) | 4.16 | 21.54 | 99.04 | 599 |
| Experimental Example 4 | 3-186 (LT17-30-293) | 5.10 | 6.47 | 96.99 | 605 |
| Experimental Example 5 | 4-1 (LT17-30-113) | 4.74 | 9.27 | 92.01 | 601 |
| Experimental Example 6 | 4-2 (LT17-30-104) | 4.76 | 8.91 | 97.97 | 610 |
| Experimental Example 7 | 4-3 (LT17-30-106) | 4.59 | 10.98 | 98.05 | 609 |
| Experimental Example 8 | 4-4 LT17-30-197) | 4.77 | 10.48 | 98.91 | 608 |
| Experimental Example 9 | 4-44 (LT17-30-201) | 5.06 | 7.45 | 98.70 | 614 |
| Experimental Example 10 | 4-72 (LT17-35-105) | 6.07 | 2.70 | 85.09 | 604 |

TABLE 6-continued

| Category | Compound | Driving voltage [V] | Efficiency [cd/A] | Life (%) | EL max [nm] |
|---|---|---|---|---|---|
| Experimental Example 11 | 4-143 (LT17-30-190) | 4.48 | 13.30 | 98.64 | 608 |
| Experimental Example 12 | 4-144 (LT17-30-221) | 4.61 | 12.64 | 98.48 | 609 |
| Experimental Example 13 | 4-145 (LT17-30-212) | 4.65 | 11.88 | 97.92 | 609 |
| Experimental Example 14 | 4-146 (LT17-30-192) | 4.48 | 14.43 | 99.10 | 608 |
| Experimental Example 15 | 4-147 (LT17-30-290) | 4.59 | 12.14 | 98.89 | 606 |
| Experimental Example 16 | 4-156 (LT17-30-306) | 4.53 | 11.88 | 98.84 | 612 |
| Experimental Example 17 | 4-158 (LT17-30-307) | 4348 | 11.73 | 98.62 | 612 |
| Experimental Example 18 | 4-160 (LT17-30-449) | 4.64 | 8.66 | 98.24 | 615 |
| Experimental Example 19 | 4-161 (LT17-30-302) | 4.47 | 12.38 | 99.02 | 610 |
| Experimental Example 20 | 4-162 (LT17-30-448) | 4.80 | 8.73 | 85.09 | 615 |

TABLE 7

| Category | Compound | Driving voltage [V] | Efficiency [cd/A] | Life (%) | EL max [nm] |
|---|---|---|---|---|---|
| Experimental Example 21 | 4-167 (LT17-30-445) | 4.61 | 11.16 | 98.24 | 612 |
| Experimental Example 22 | 4-170 (LT17-30-311) | 4.47 | 13.91 | 98.30 | 609 |
| Experimental Example 23 | 4-174 (LT17-30-456) | 4.69 | 10.31 | 85.09 | 614 |
| Experimental Example 24 | 4-177 (LT17-30-403) | 4.69 | 10.39 | 98.05 | 614 |
| Experimental Example 25 | 4-184 (LT17-30-214) | 4.46 | 13.62 | 98.71 | 610 |
| Experimental Example 26 | 4-185 (LT17-30-305) | 4.37 | 14.84 | 98.73 | 608 |
| Experimental Example 27 | 4-186 (LT17-30-209) | 4.91 | 8.86 | 98.15 | 613 |
| Experimental Example 28 | 4-187 (LT17-30-308) | 4.55 | 11.68 | 98.53 | 610 |
| Experimental Example 29 | 4-205 (LT17-30-222) | 4.42 | 13.68 | 98.73 | 606 |
| Experimental Example 30 | 4-211 (LT17-35-106) | 4.59 | 10.98 | 98.05 | 609 |
| Experimental Example 31 | 4-217 (LT17-30-330) | 6.58 | 2.10 | 91.70 | 637 |
| Experimental Example 32 | 4-327 (LT17-35-107) | 4.56 | 9.97 | 75.97 | 618 |
| Experimental Example 33 | 4-384 (LT17-35-108) | 6.01 | 2.77 | 85.09 | 617 |
| Experimental Example 34 | 4-392 (LT17-30-402) | 4.97 | 8.17 | 96.34 | 614 |
| Experimental Example 35 | 4-396 (LT17-30-405) | 4.75 | 9.72 | 98.69 | 614 |
| Experimental Example 36 | 4-401 (LT17-30-450) | 4.72 | 10.20 | 98.35 | 613 |
| Experimental Example 37 | 4-404 (LT17-30-394) | 4.62 | 10.58 | 98.80 | 613 |
| Experimental Example 38 | 4-408 (LT17-30-400) | 4.84 | 9.22 | 98.98 | 616 |
| Experimental Example 39 | 4-418 (LT17-30-395) | 4.71 | 10.45 | 96.84 | 613 |
| Experimental Example 40 | 4-419 (LT 17-30-404) | 5.60 | 4.40 | 89.69 | 612 |

TABLE 8

| Category | Compound | Driving voltage [V] | Efficiency [cd/A] | Life (%) | EL max [nm] |
|---|---|---|---|---|---|
| Experimental Example 41 | 4-421 (LT17-30-409) | 4.81 | 9.41 | 97.18 | 615 |
| Experimental Example 42 | 4-428 (LT17-30-398) | 5.28 | 5.22 | 98.11 | 622 |
| Experimental Example 43 | 4-432 (LT17-30-397) | 5.31 | 5.10 | 98.17 | 621 |
| Experimental Example 44 | 4-438 (LT17-30-411) | 5.17 | 6.36 | 98.33 | 622 |
| Experimental Example 45 | 4-439 (LT17-30-447) | 5.86 | 3.48 | 94.04 | 623 |
| Experimental Example 46 | 4-440 (LT17-30-336) | 5.81 | 3.91 | 93.55 | 618 |
| Experimental Example 47 | 4-444 (LT17-30-382) | 5.79 | 4.02 | 94.54 | 625 |
| Experimental Example 48 | 4-454 (LT17-30-339) | 5.48 | 5.31 | 98.05 | 623 |
| Experimental Example 49 | 4-455 (LT17-30-391) | 5.27 | 6.07 | 97.64 | 619 |
| Experimental Example 50 | 4-457 (LT17-30-406) | 5.97 | 3.36 | 92.24 | 625 |
| Experimental Example 51 | 4-461 (LT17-30-399) | 4.67 | 9.68 | 98.90 | 609 |
| Experimental Example 52 | 4-464 (LT17-30-392) | 4.68 | 11.34 | 98.88 | 614 |
| Experimental Example 53 | 4-468 (LT17-30-396) | 4.67 | 11.17 | 98.68 | 614 |
| Experimental Example 54 | 4-476 (LT17-30-337) | 4.62 | 12.58 | 98.53 | 612 |
| Experimental Example 55 | 4-480 (LT17-30-383) | 4.85 | 9.57 | 86.30 | 617 |
| Experimental Example 56 | 4-490 (LT17-30-407) | 4.69 | 10.84 | 98.54 | 614 |
| Experimental Example 57 | 4-491 (LT17-30-401) | 4.57 | 11.65 | 98.65 | 613 |
| Experimental Example 58 | 4-493 (LT17-30-408) | 5.51 | 3.22 | 89.31 | 670 |
| Experimental Example 59 | 4-497 (LT17-30-393) | 4.46 | 13.63 | 99.17 | 608 |
| Experimental Example 60 | 4-498 (LT17-30-455) | 4.75 | 9.89 | 98.94 | 614 |

TABLE 9

| Category | Compound | Driving voltage [V] | Efficiency [cd/A] | Life (%) | EL max [nm] |
|---|---|---|---|---|---|
| Experimental Example 61 | 4-501 (LT17-30-189) | 5.98 | 3.40 | 84.52 | 624 |
| Experimental Example 62 | 4-502 (LT17-30-208) | 6.52 | 2.31 | 75.6 | 652 |
| Experimental Example 63 | 4-503 (LT17-30-211) | 4.46 | 23.53 | 99.17 | 526 |
| Experimental Example 64 | 4-504 (LT17-30-191) | 5.91 | 3.65 | 86.72 | 621 |
| Experimental Example 65 | 4-506 (LT17-30-207) | 6.02 | 3.48 | 88.36 | 625 |
| Experimental Example 66 | 4-508 (LT17-30-210) | 5.81 | 3.41 | 86.51 | 626 |
| Experimental Example 67 | 4-510 (LT17-30-292) | 4.85 | 9.57 | 86.30 | 612 |
| Experimental Example 68 | 4-511 (LT17-30-289) | 5.10 | 6.47 | 96.99 | 604 |
| Experimental Example 69 | 4-513 (LT17-30-497) | 4.64 | 9.19 | 98.83 | 613 |
| Experimental Example 70 | 4-515 (LT17-30-493) | 4.60 | 9.40 | 98.41 | 612 |
| Experimental Example 71 | 4-516 (LT17-30-498) | 4.46 | 10.48 | 97.90 | 608 |
| Experimental Example 72 | 4-517 (LT17-30-496) | 4.90 | 8.58 | 96.67 | 617 |
| Experimental Example 73 | 4-518 (LT17-30-500) | 5.62 | 3.64 | 88.64 | 626 |

TABLE 9-continued

| Category | Compound | Driving voltage [V] | Efficiency [cd/A] | Life (%) | EL max [nm] |
|---|---|---|---|---|---|
| Experimental Example 74 | 4-519 (LT17-30-491) | 4.64 | 9.03 | 98.57 | 617 |
| Experimental Example 75 | 4-520 (LT17-30-490) | 5.31 | 4.84 | 90.96 | 610 |
| Experimental Example 76 | 4-521 (LT17-30-467) | 5.33 | 4.90 | 90.94 | 618 |
| Experimental Example 77 | 4-522 (LT17-30-495) | 5.08 | 5.80 | 94.83 | 620 |
| Experimental Example 78 | 4-523 (LT17-30-451) | 5.51 | 3.22 | 89.31 | 670 |

Results

As shown in Tables 6 to 9, the EL peak of Comparative Example (WS16-30-336) was about 600 nm. In most of the example compounds, the EL peak was shifted by about 1 to about 70 nm towards the red region. The results coincide with the PL spectra. A portion of the example compounds show a somewhat lower driving voltage than Comparative Example at 1000 nits (5.28 V vs. 4.64 V). Some devices including a portion of the compound represented by Formula 1 showed longer device life as compared to the device using the Comparative Compound.

From the results of Tables 6 to 9, compounds according to embodiments may be used as a material for an organic layer of an organic electroluminescence device as well as an organic light-emitting device, and an organic electric device as well as an organic electroluminescence device using the same shows improved properties, for example, high device efficiency, saturated emission color and longer device life. Particularly, the compounds according to embodiments show a color shift to somewhat deeper color and higher efficiency when compared to the Comparative Compound (WS16-30-336). The compounds of Formula 1 exhibited unexpected superior properties as a saturated red emitter in an OLED device.

By way of summation and review, in the application of an organic electroluminescence device to a display device, the decrease of a driving voltage and the increase of emission efficiency and life are desirable. The development of materials for stably providing an organic electroluminescence device is desirable.

In addition, the development of a novel phosphorescence-emitting material for improving the emission properties, emission efficiency and color purity of an organic electroluminescence device is being conducted.

Embodiments provide an organic electroluminescence device with improved emission efficiency by including an organometallic compound. Embodiments also provide an organometallic compound as a material which is capable of improving the emission efficiency of an organic electroluminescence device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic electroluminescence device, comprising:
a first electrode;
an organic layer on the first electrode; and
a second electrode on the organic layer,
wherein the organic layer includes an organometallic compound represented by the following Formula 1:

[Formula 1]

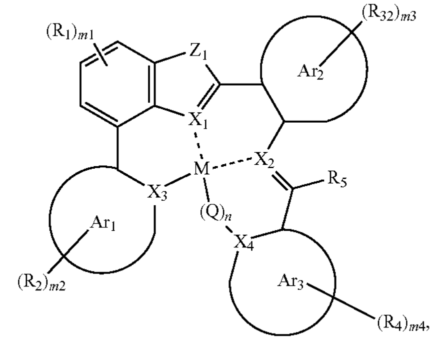

and wherein in Formula 1,
M is osmium (Os), iridium (Ir), or platinum (Pt),
$Z_1$ is 0, S or $NR_6$,
Q is O, S or $CH_2$, n is 0 or 1,
$X_1$, $X_2$, and $X_3$ are each independently N or C,
$X_4$ is C,
if n is 0, M is combined with two C atoms and two N atoms,
$Ar_1$, $Ar_2$ and $Ar_3$ are each independently a substituted or unsubstituted aryl group having 6 to 30 ring carbon atoms, or a substituted or unsubstituted heteroaryl group having 2 to 30 ring carbon atoms,
$R_1$, $R_2$, $R_3$, $R_4$, $R_5$ and $R_6$ are each independently a hydrogen atom, a deuterium atom, a halogen atom, a substituted or unsubstituted alkyl group having 1 to 20 carbon atoms, a substituted or unsubstituted hydrocarbon ring having 5 to 20 ring carbon atoms, a substituted or unsubstituted heteroalkyl group having 1 to 20 carbon atoms, an alkoxy group, an aryloxy group, a cyano group, an amino group, a substituted or unsubstituted silyl group, an alkenyl group, a heteroalkenyl group, an alkynyl group, an unsaturated hydrocarbon ring, a substituted or unsubstituted aryl group having 6 to 30 ring carbon atoms, a substituted or unsubstituted heteroaryl group having 2 to 30 ring carbon atoms, an acyl group, a carbonyl group, a carbonyl acid, a carbonyl ester, a nitrile group, an isonitrile group, a sulfanyl group, a sulfinyl group, a sulfonyl group, a phosphino group, a substituted or unsubstituted monovalent non aromatic condensed polycycle, a substituted or unsubstituted monovalent non aromatic condensed heteropolycycle, or may be combined with an adjacent group to form a ring, and
$m_1$ to $m_4$ are each independently an integer of 0 to 4.

2. The organic electroluminescence device as claimed in claim 1, wherein the organic layer includes:
a hole transport region;
an emission layer on the hole transport region; and
an electron transport region on the emission layer, and the emission layer includes the organometallic compound represented by Formula 1.

3. The organic electroluminescence device as claimed in claim 2, wherein the emission layer includes a host and a dopant, and the dopant includes the organometallic compound represented by Formula 1.

4. The organic electroluminescence device as claimed in claim 1, wherein M is platinum (Pt).

5. The organic electroluminescence device as claimed in claim 1, wherein $Ar_1$ to $Ar_3$ in Formula 1 are each independently phenyl, naphthyl, pyridine, pyrimidine, pyrazine, pyridazine, quinoline, isoquinoline, furan, thiophene, pyrrole, benzofuran, benzothiophene, phenanthryl, phenanthridine, indole, or indazole.

6. The organic electroluminescence device as claimed in claim 1, wherein Formula 1 is represented by one of the following Formula 1-1 to Formula 1-3:

[Formula 1-1]

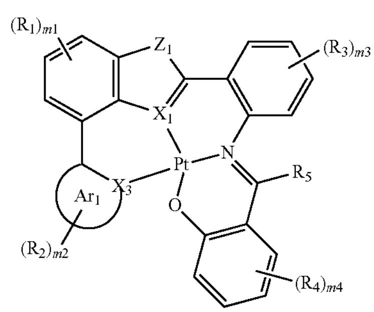

[Formula 1-2]

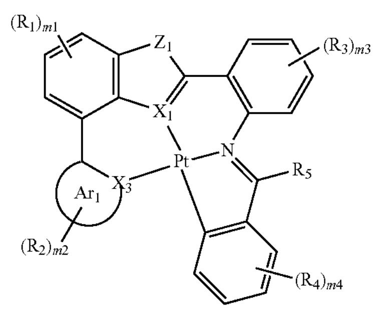

[Formula 1-3]

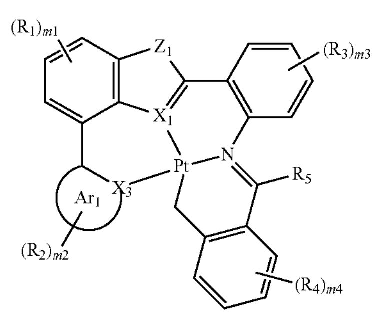

wherein in Formula 1-1 to Formula 1-3, $X_1$ and $X_3$ are each independently N or C, and $Z_1$, $Ar_1$, $R_1$ to $R_5$, and $m_1$ to $m_4$ are the same as defined in claim 1, and in Formula 1-2, Pt is combined with two C atoms and two N atoms.

7. The organic electroluminescence device as claimed in claim 6, wherein $R_1$, $R_2$, $R_3$, $R_4$ and $R_5$ are each independently a hydrogen atom, a deuterium atom, a halogen atom, a substituted or unsubstituted alkyl group having 1 to 20 carbon atoms, a substituted or unsubstituted heteroalkyl group having 1 to 20 carbon atoms, a substituted or unsubstituted silyl group, a substituted or unsubstituted aryl group having 6 to 30 ring ring carbon atoms, or a substituted or unsubstituted heteroaryl group having 2 to 30 ring ring carbon atoms, or combined with an adjacent group to form a ring.

8. The organic electroluminescence device as claimed in claim 1, wherein Formula 1 is represented by one of the following Formula 2-1 to Formula 2-30:

2--1

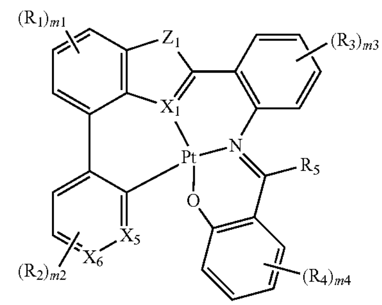

2-2

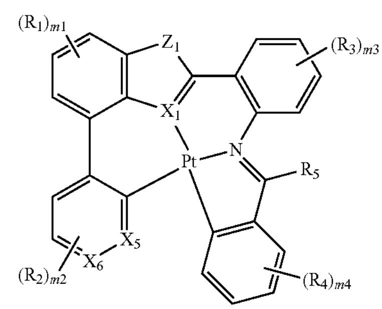

2-3

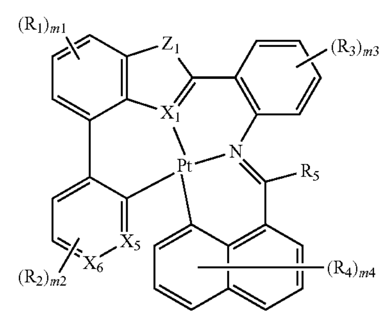

2-4

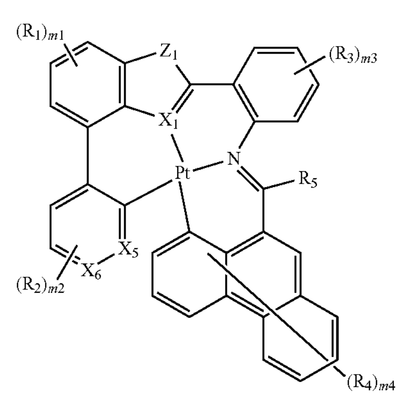

2-5
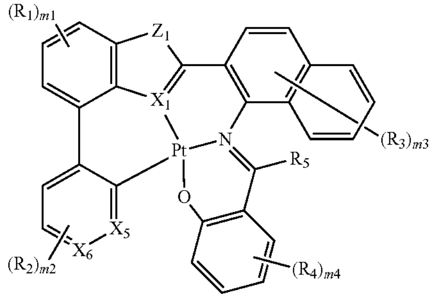
2-6
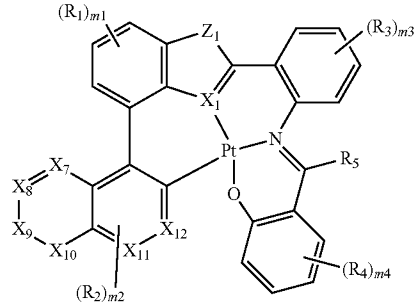
2-7
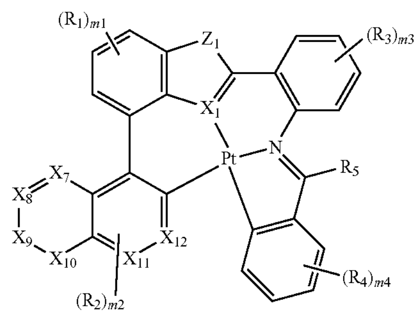
2-8
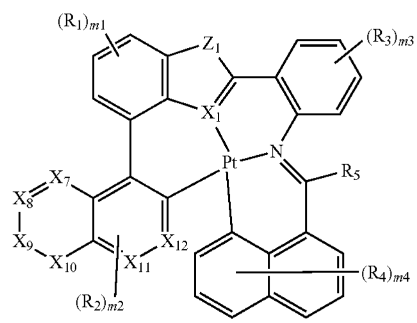
2-9
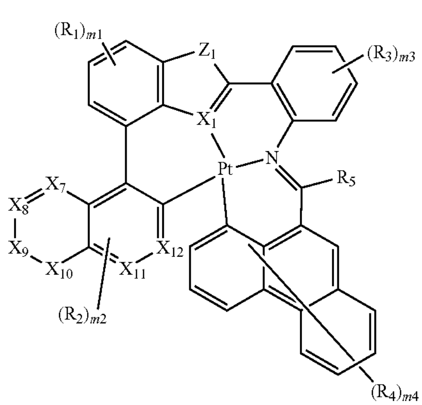
2-10
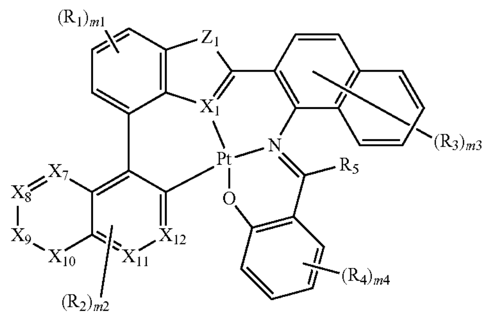
2-11
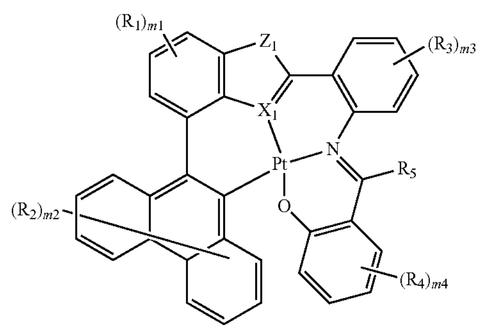
2-12
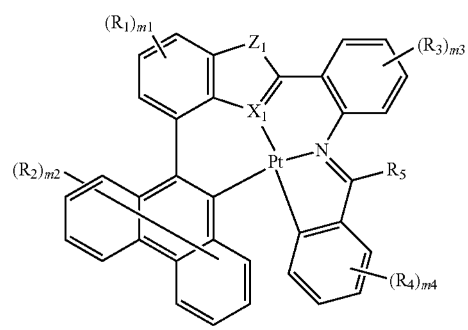
2-13
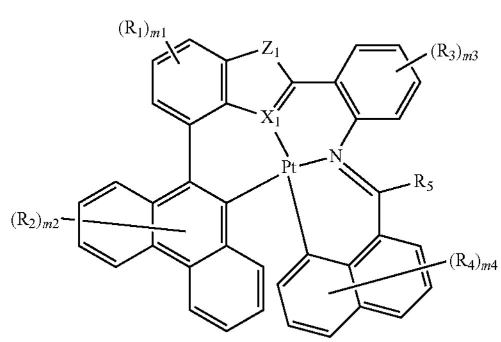

2-14
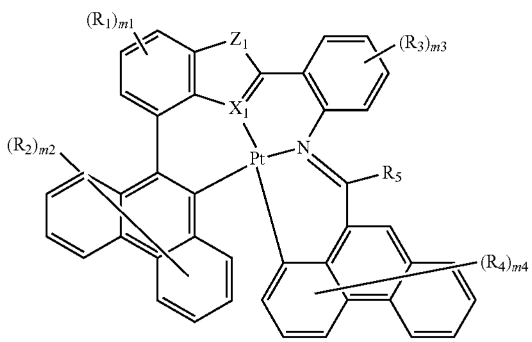
2-15
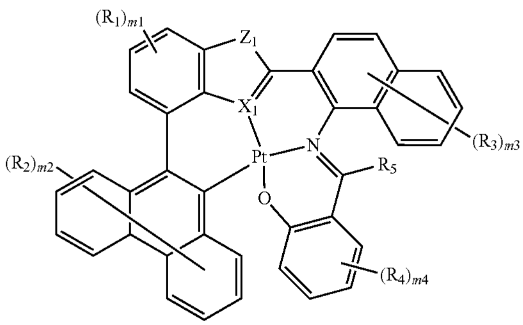
2-16
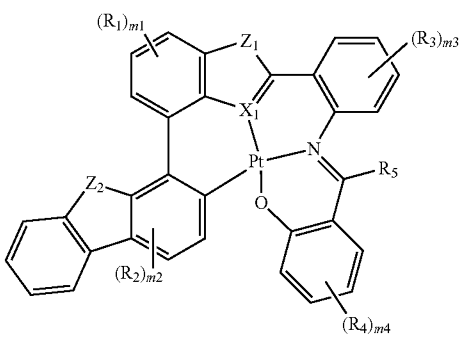
2-17
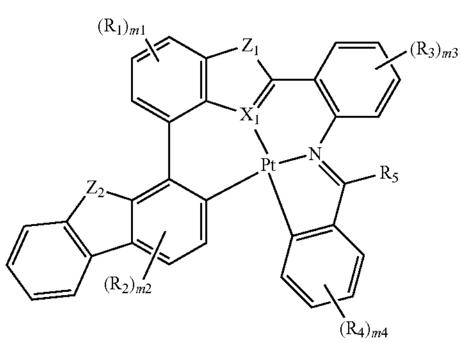
2-18
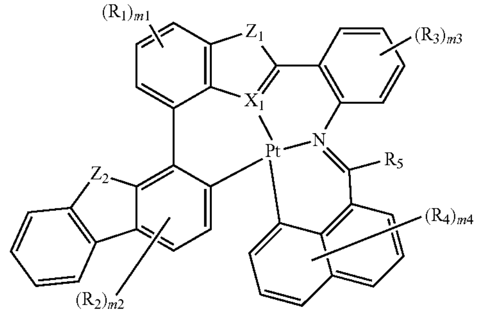
2-19
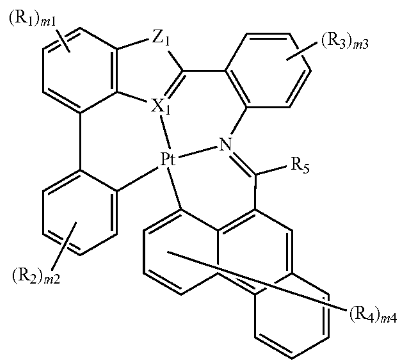
2-20
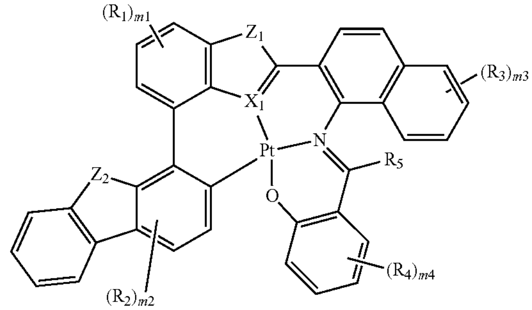
2-21
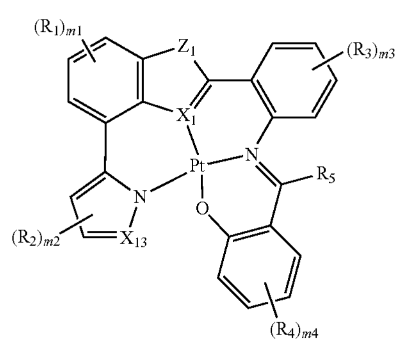

-continued
2-22
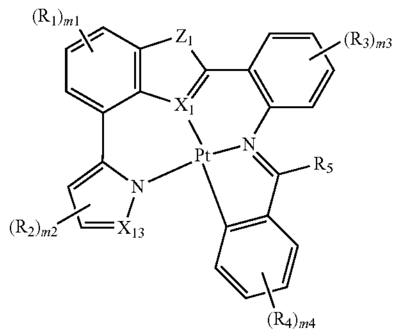
2-23
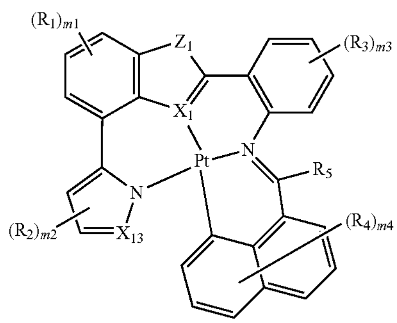
2-24
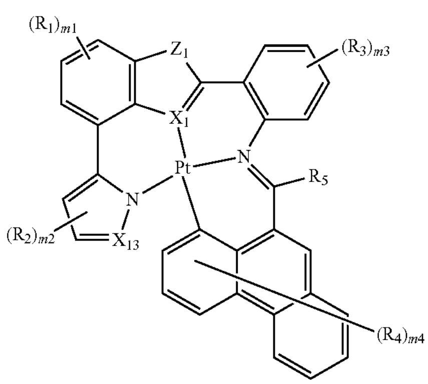
2-25
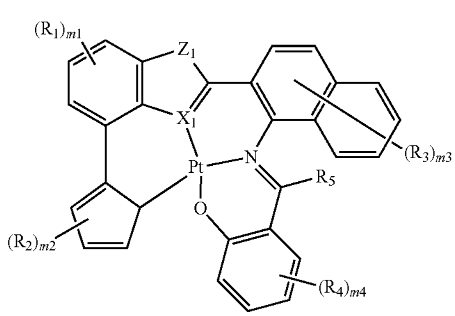
-continued
2-26
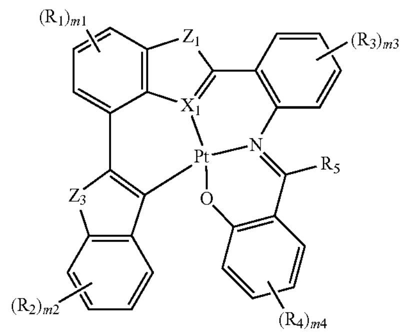
2-27
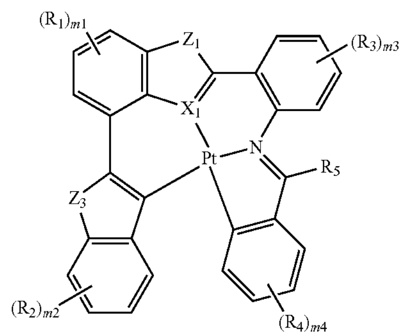
2-28
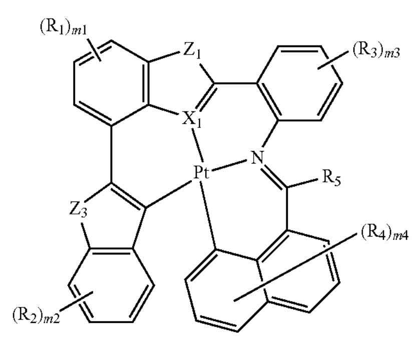
2-29
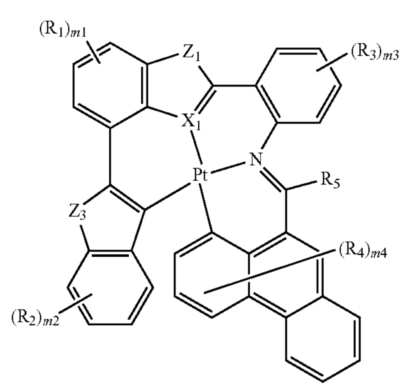

-continued 2-30

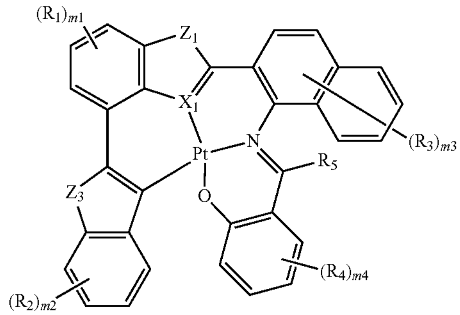

wherein in Formulae 2-1 to 2-30, $X_5$ to $X_{13}$ are each independently N or CH, $Z_1$, $Z_2$ and $Z_3$ are each independently O or S, and $R_1$ to $R_5$, and $m_1$ to $m_4$ are the same as defined in claim 1.

9. The organic electroluminescence device as claimed in claim 8, wherein $R_1$ to $R_5$ are each independently hydrogen, deuterium, a fluorine atom, a cyano group, a methyl group, an isopropyl group, an isobutyl group, a t-butyl group, a trimethylsilyl group, a triphenylsilyl group, a trifluoromethyl group, a substituted or unsubstituted phenyl group, a substituted or unsubstituted naphthyl group, a substituted or unsubstituted phenanthryl group, a substituted or unsubstituted dibenzothiophene group, or a substituted or unsubstituted dibenzofuran group, or combined with an adjacent group to form a ring.

10. The organic electroluminescence device as claimed in claim 1, wherein Formula 1 is any one selected from compounds in the following Compound Group 3 to Compound Group 5:

[Compound Group 3]

3-1

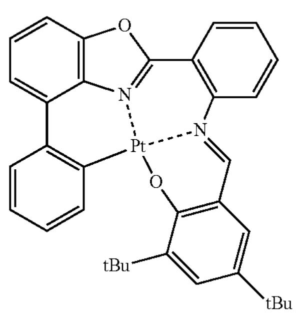

3-2

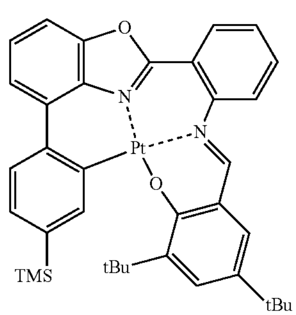

-continued 3-3

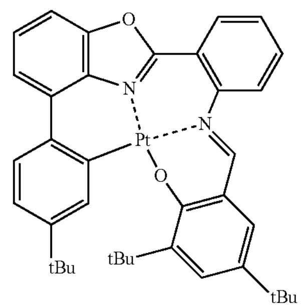

3-4

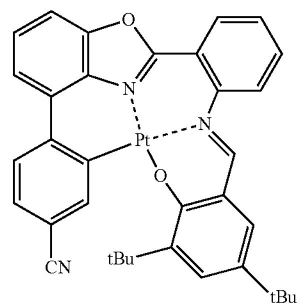

3-5

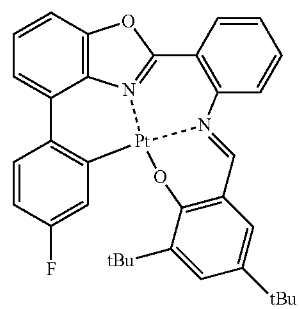

3-6

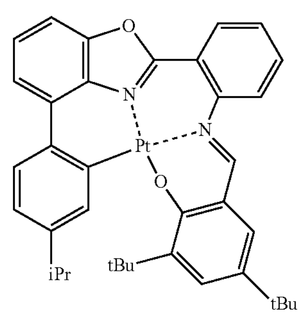

3-7

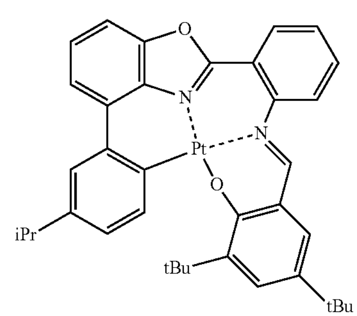

3-8
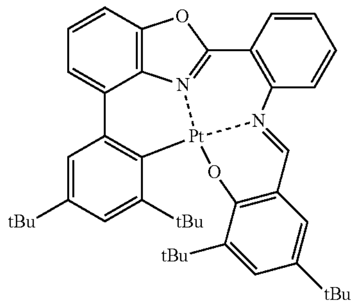
3-9
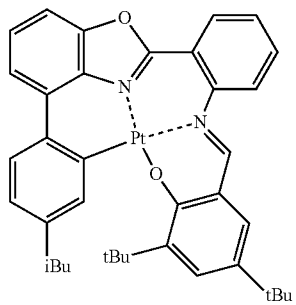
3-10
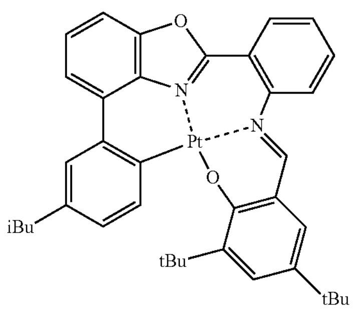
3-11
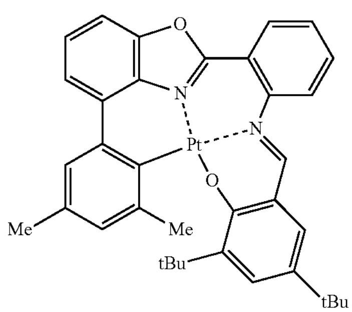
3-12
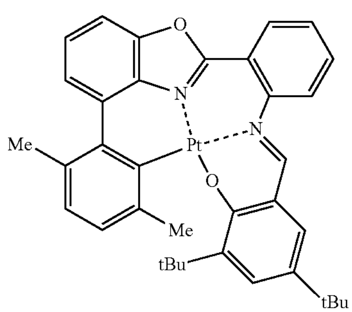
3-13
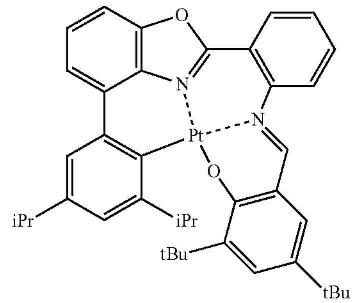
3-14
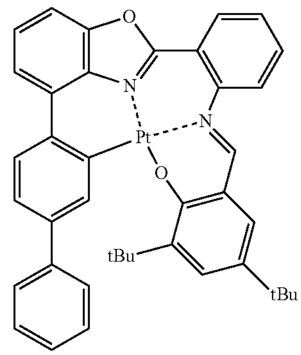
3-15
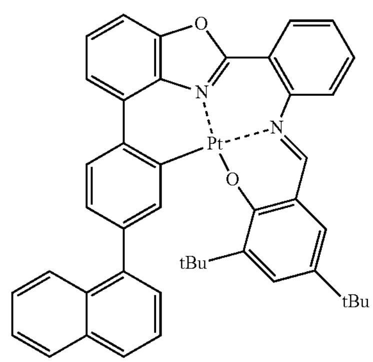
3-16
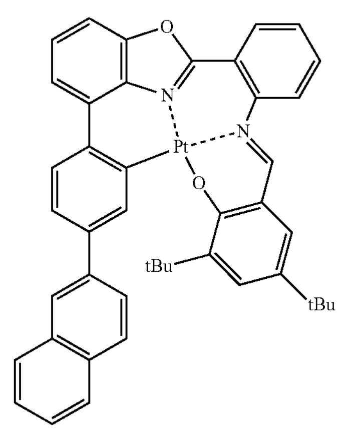

-continued
3-17
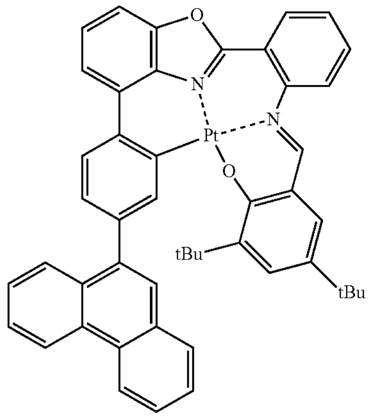
3-18
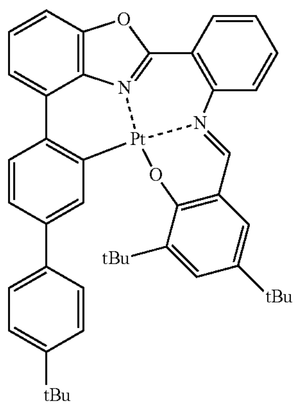
3-19
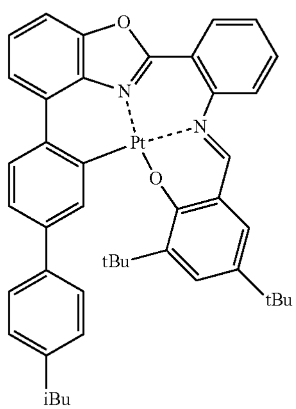
3-20
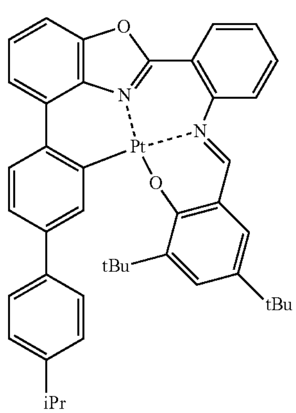
-continued
3-21
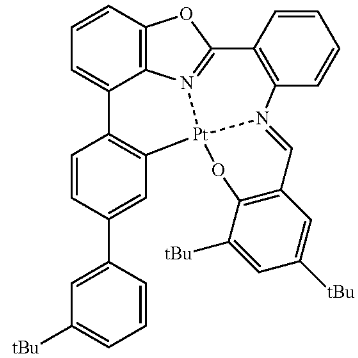
3-22
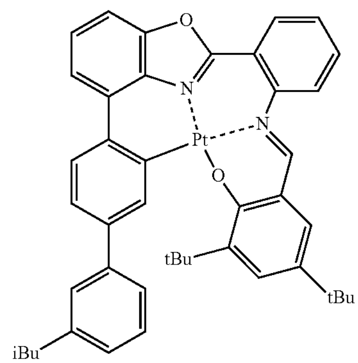
3-23
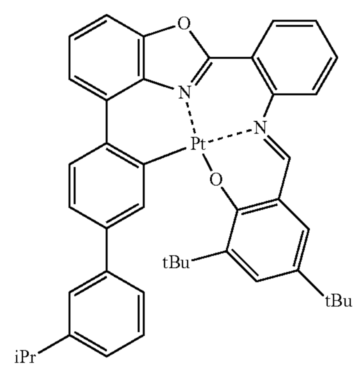
3-24
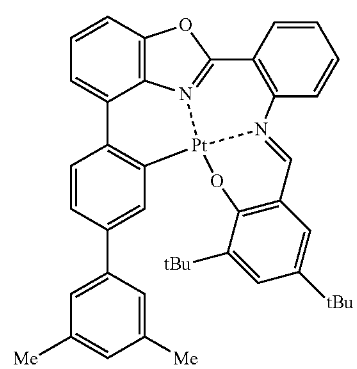

-continued
3-25
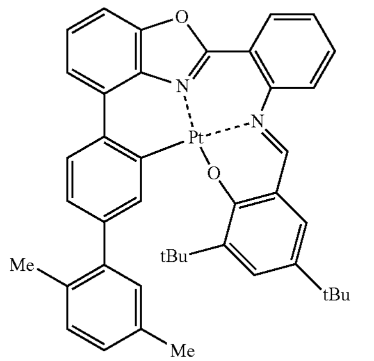
3-26
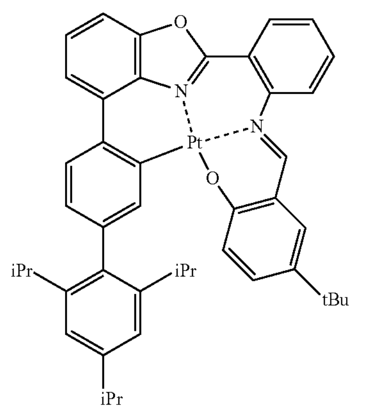
3-27
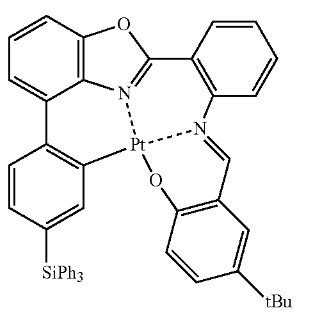
3-28
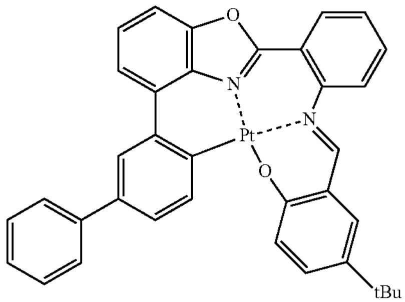
-continued
3-29
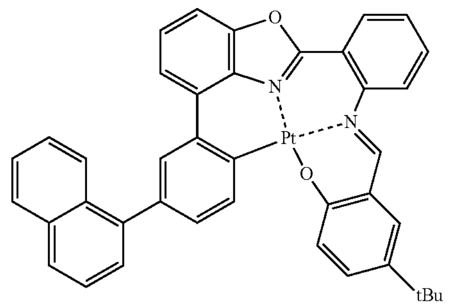
3-30
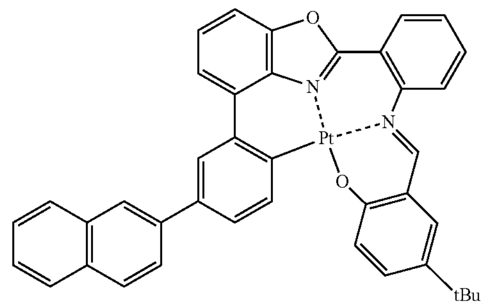
3-31
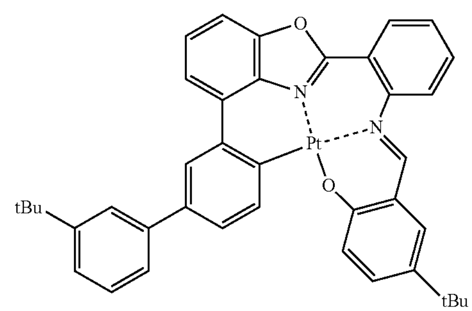
3-32
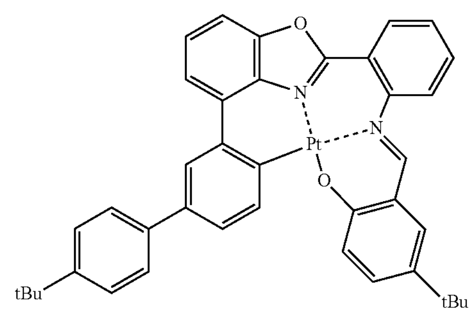
3-33
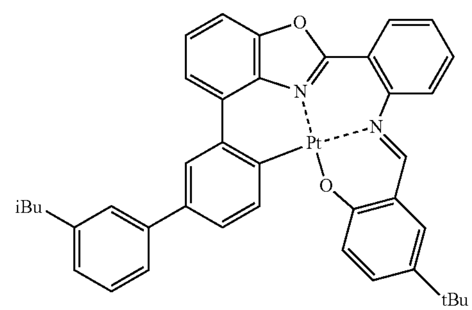

-continued
3-34
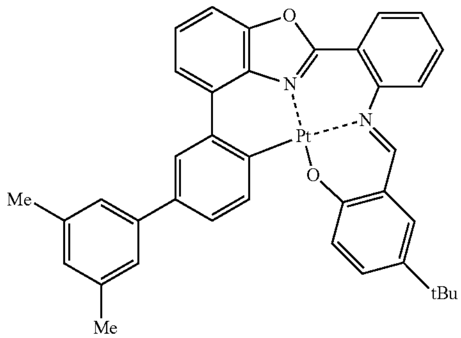
3-35
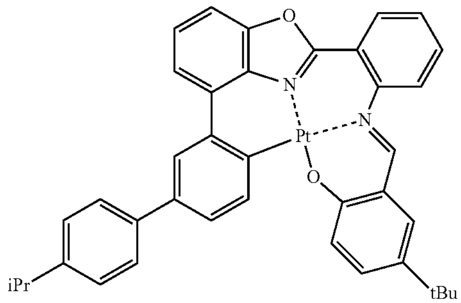
3-36
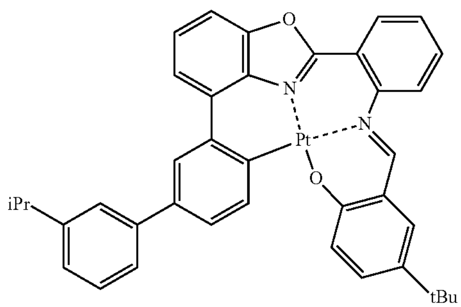
3-37
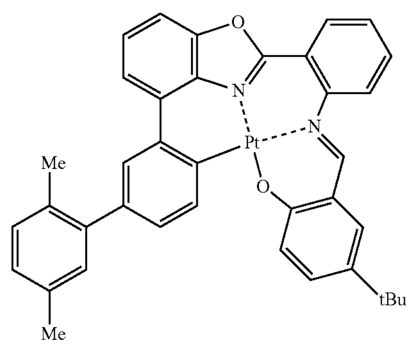
3-38
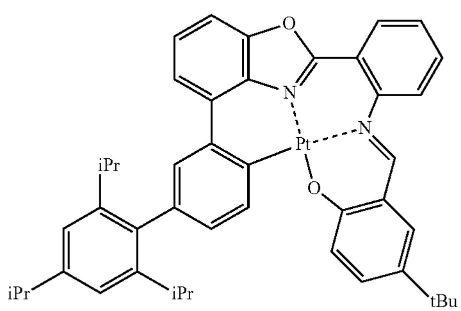
-continued
3-39
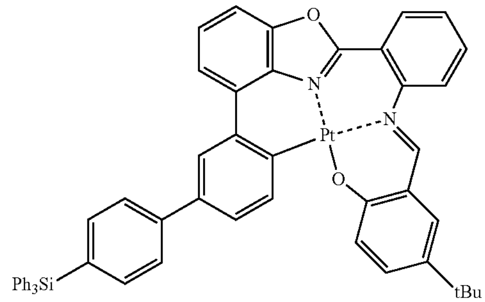
3-40
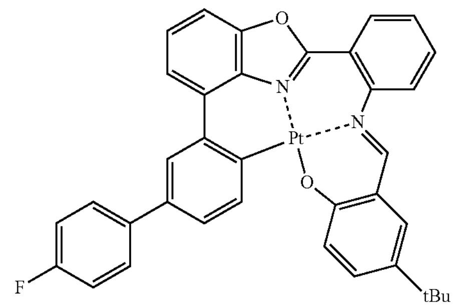
3-41
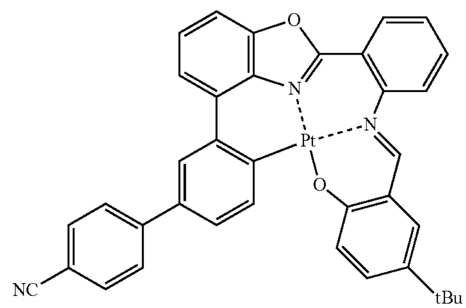
3-42
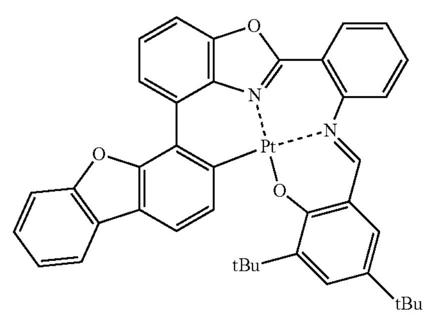
3-43
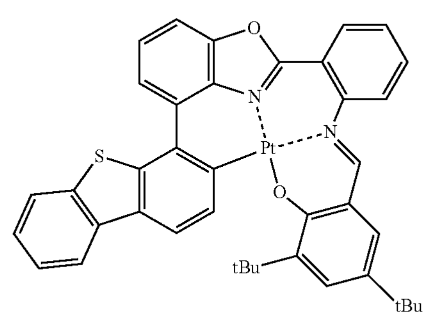

-continued
3-44
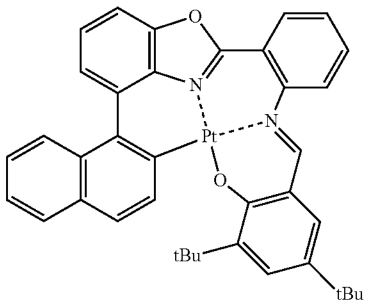
3-45
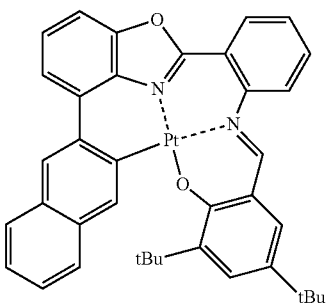
3-46
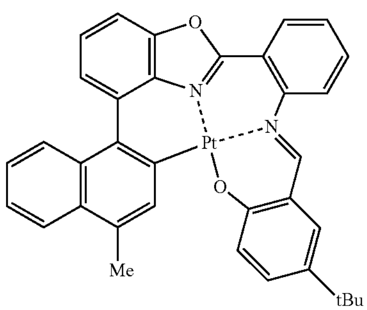
3-47
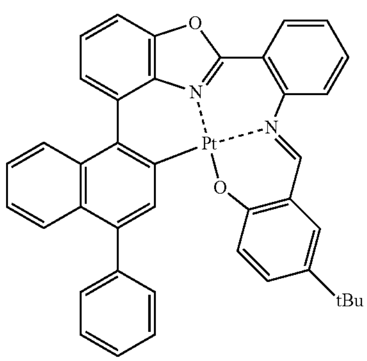
-continued
3-48
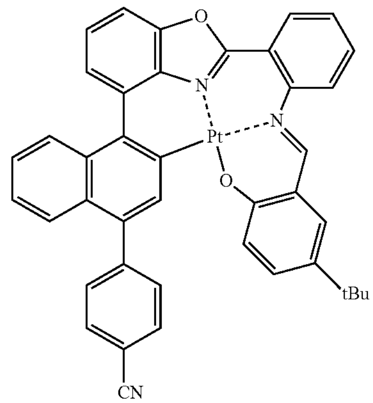
3-49
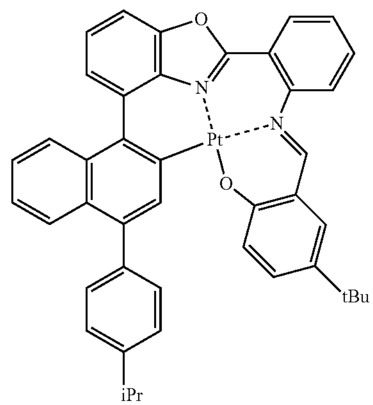
3-50
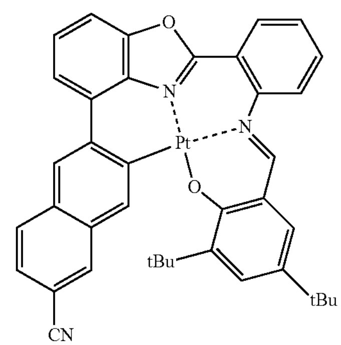
3-51
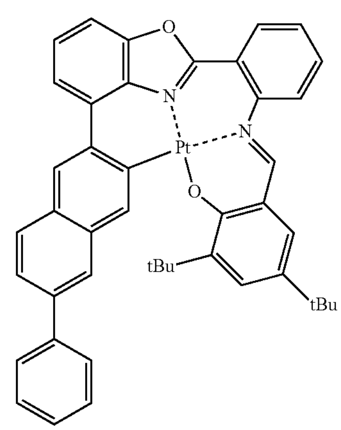

3-52
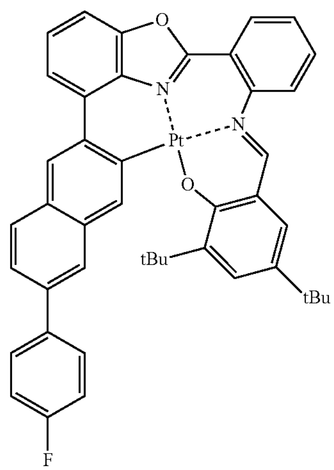
3-53
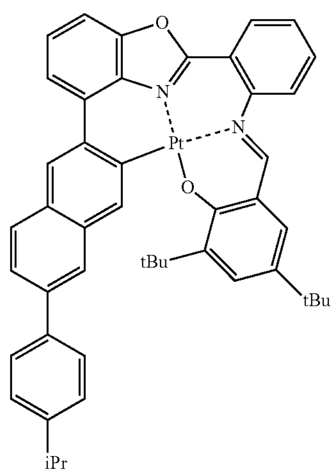
3-54
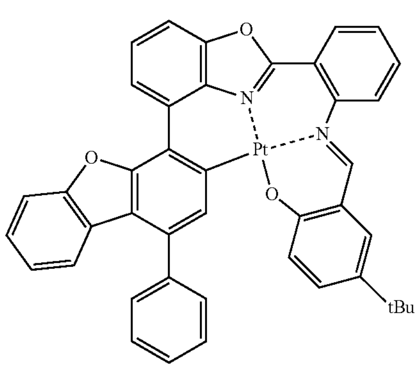
3-55
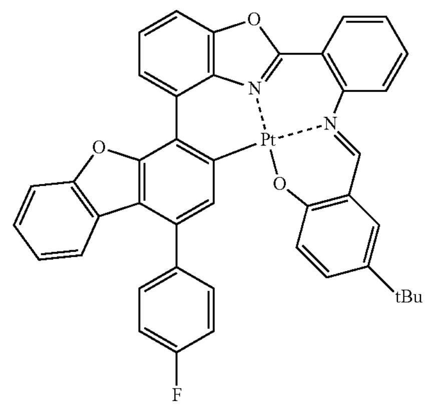
3-56
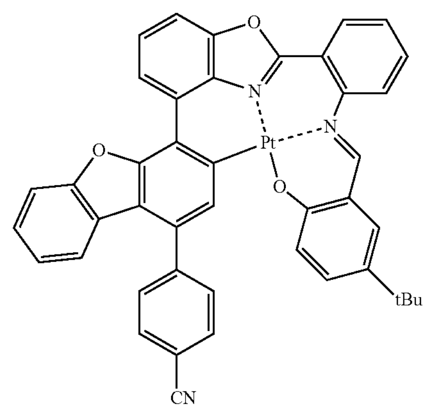
3-57
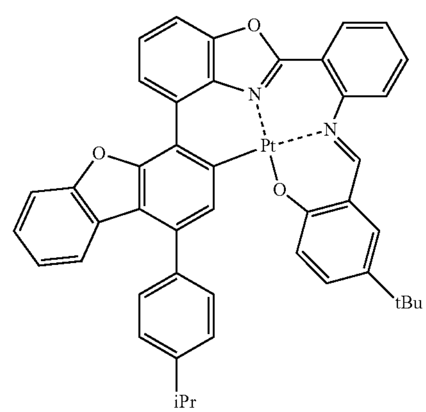
3-58
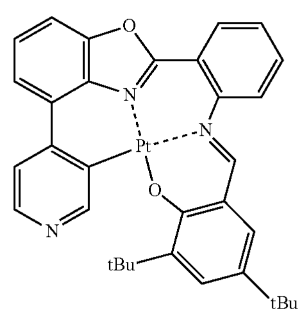

-continued
3-59
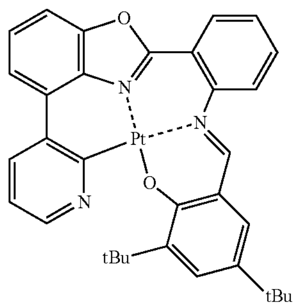
3-60
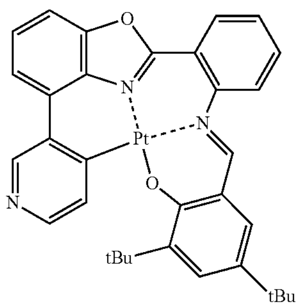
3-61
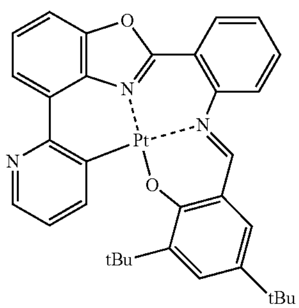
3-62
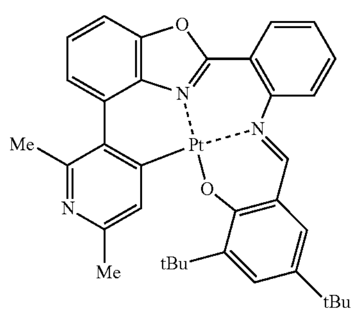
3-63
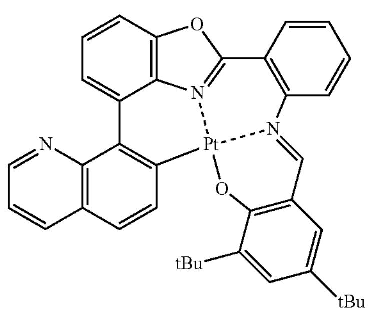
-continued
3-64
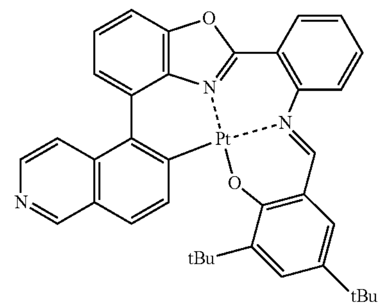
3-65
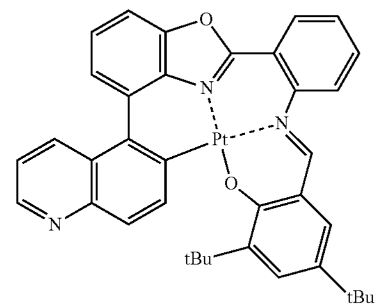
3-66
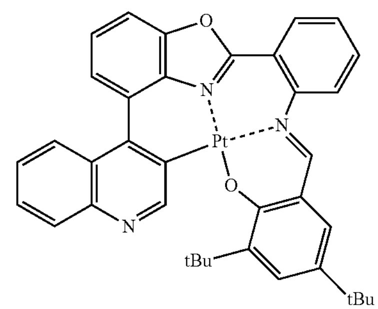
3-67
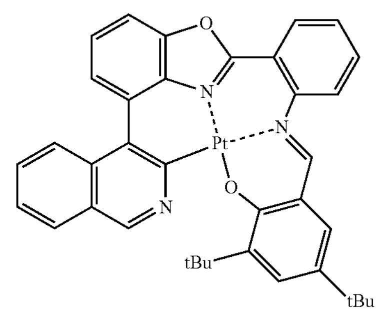
3-68
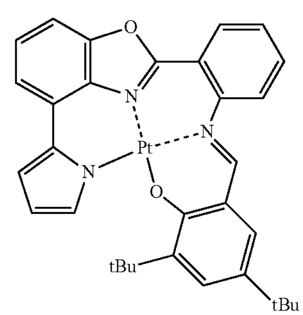

-continued
3-69
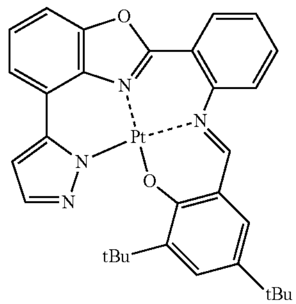
3-70
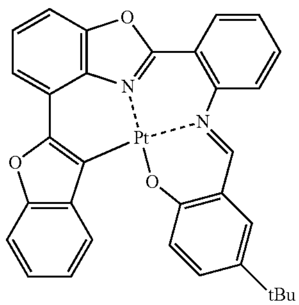
3-71
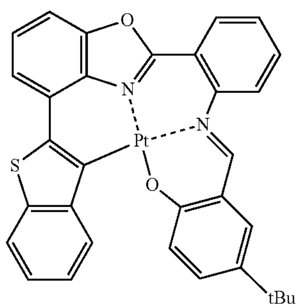
3-72
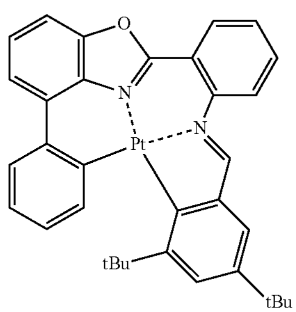
3-73
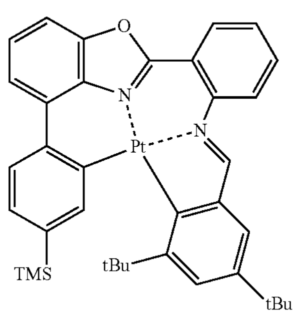
-continued
3-74
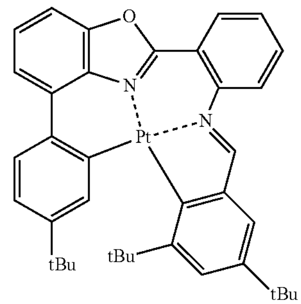
3-75
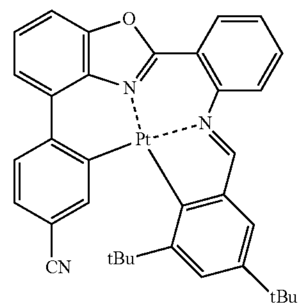
3-76
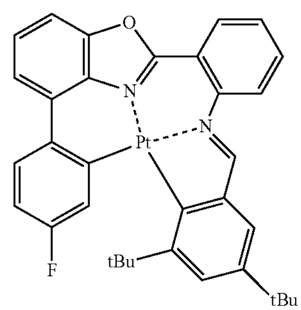
3-82
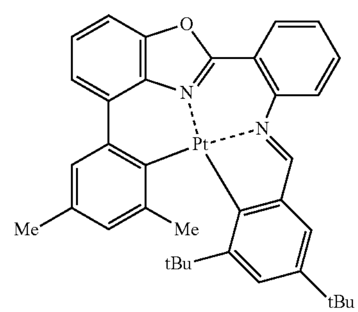
3-83
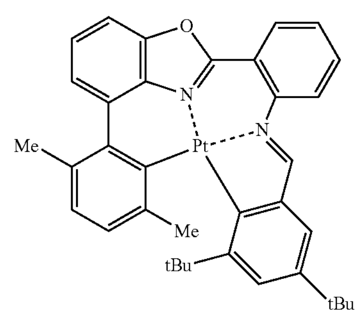

-continued
3-84
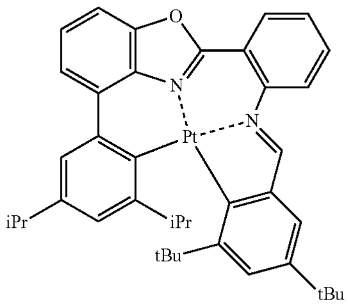
3-85
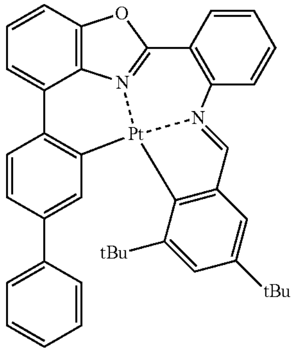
3-86
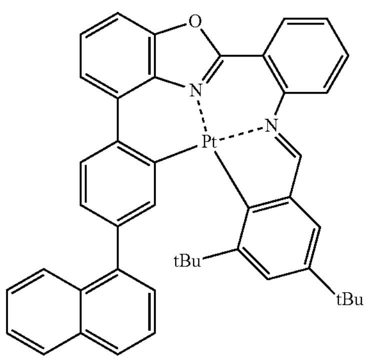
3-87
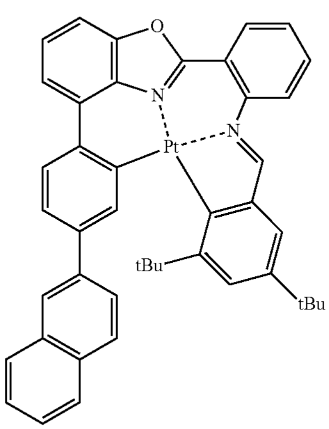
-continued
3-88
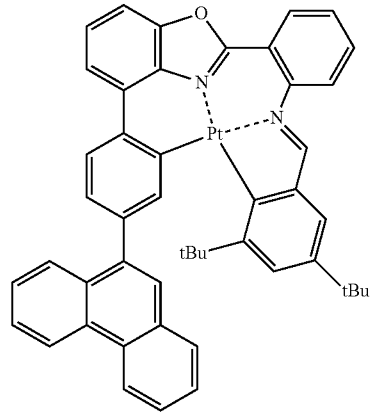
3-89
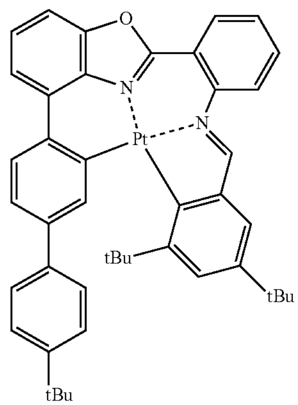
3-90
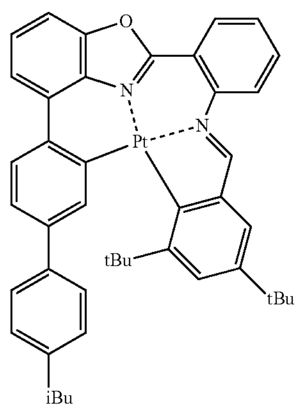
3-91
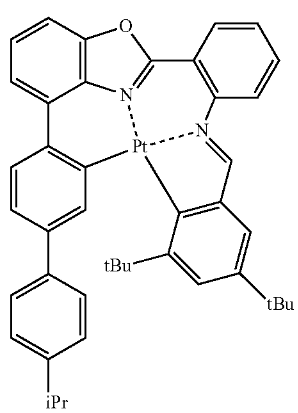

-continued
3-92
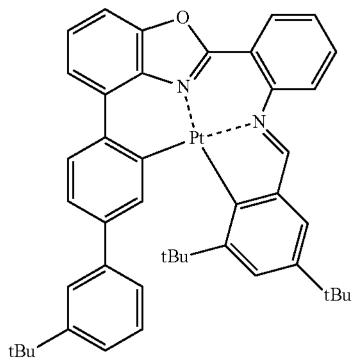
3-93
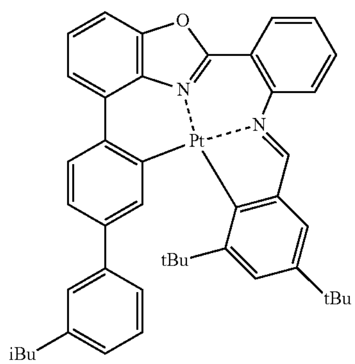
3-94
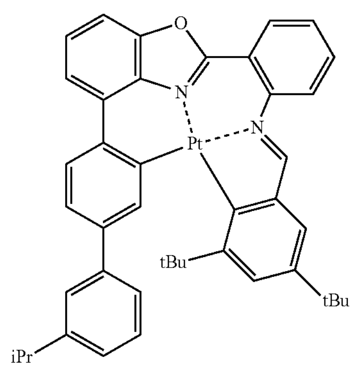
3-95
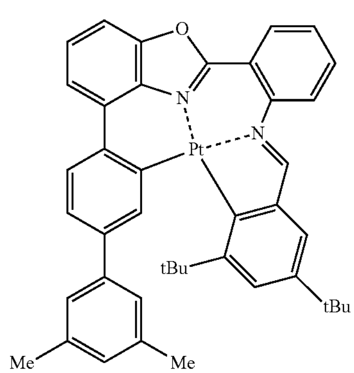
-continued
3-96
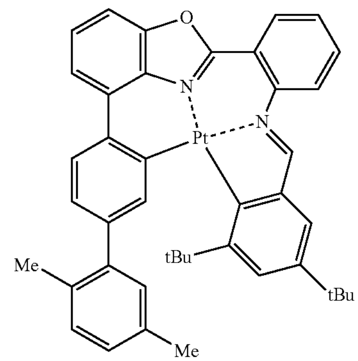
3-97
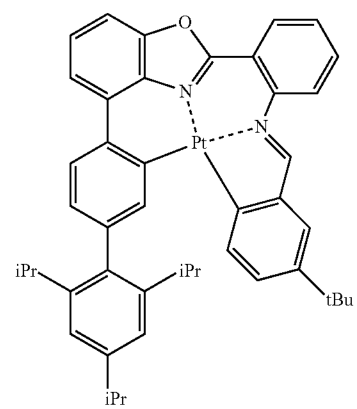
3-98
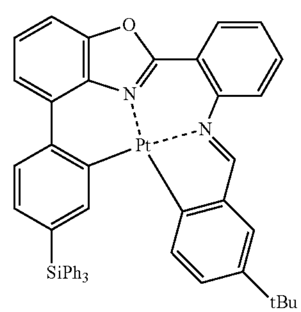
3-99
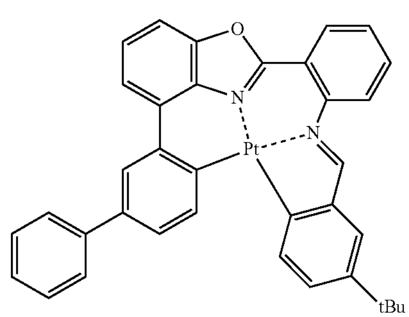

3-100
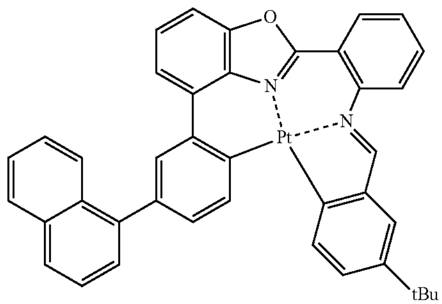
3-101
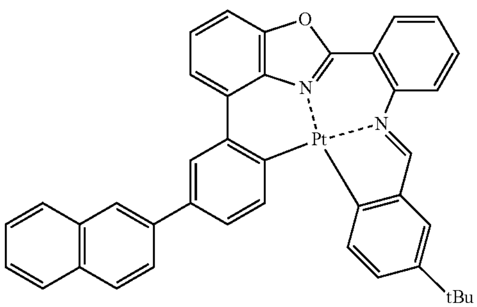
3-102
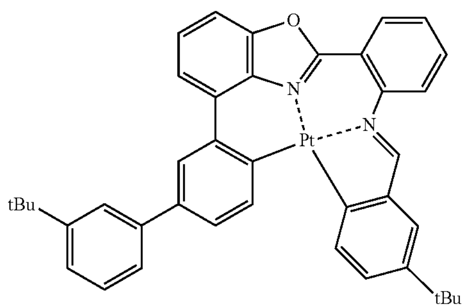
3-103
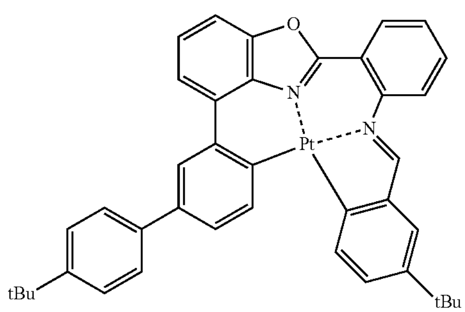
3-104
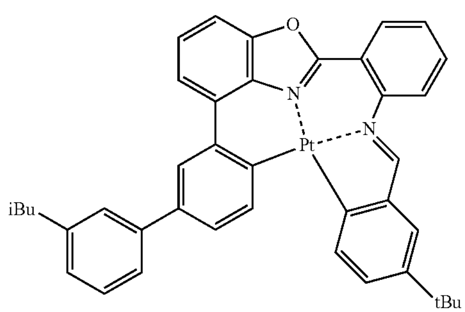
3-105
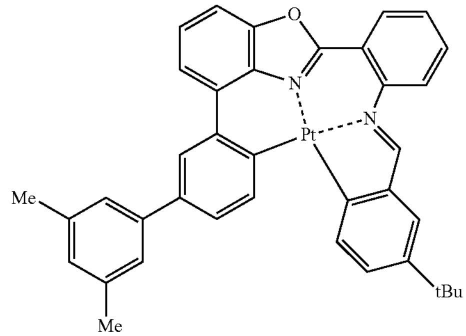
3-106
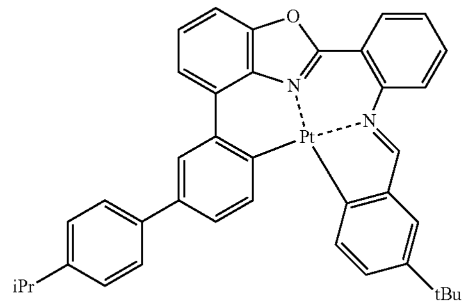
3-107
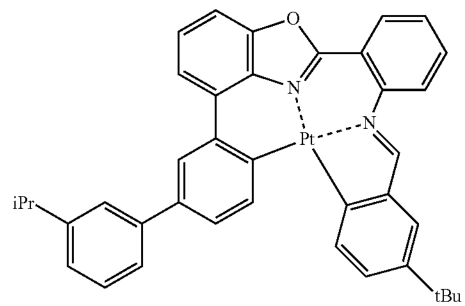
3-108
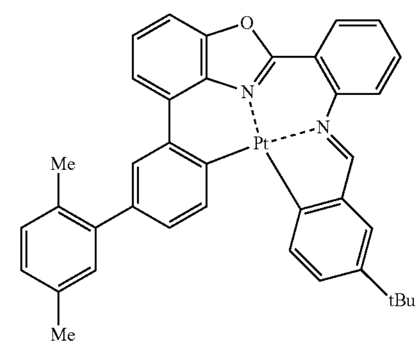
3-109
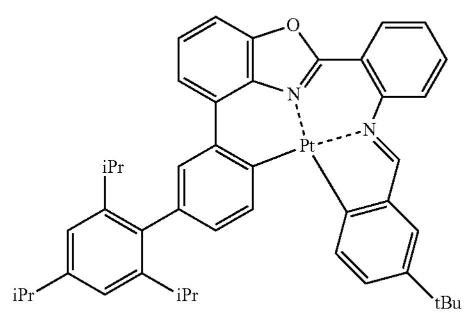

-continued
3-110
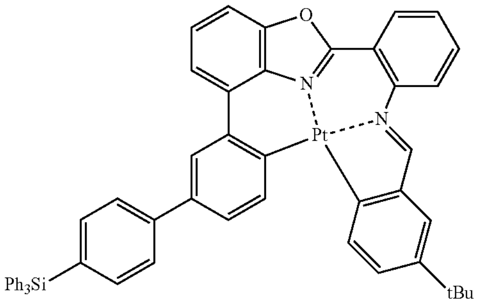
3-111
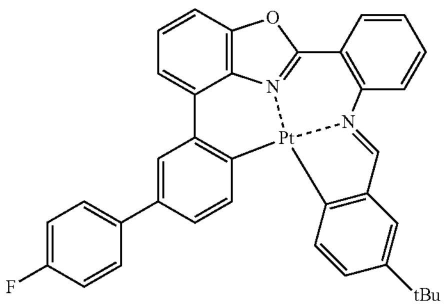
3-112
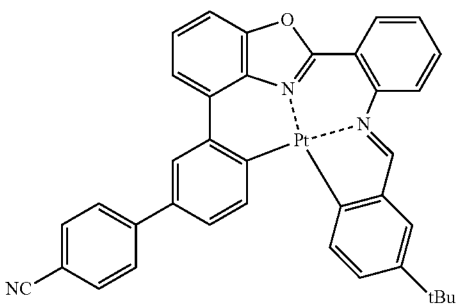
3-113
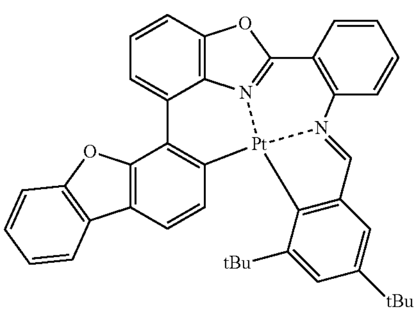
3-114
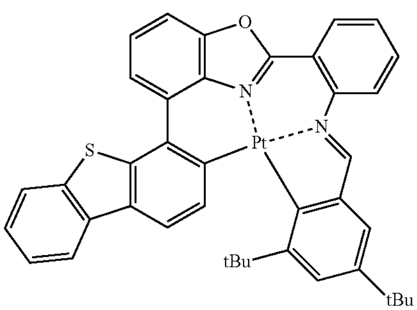
-continued
3-115
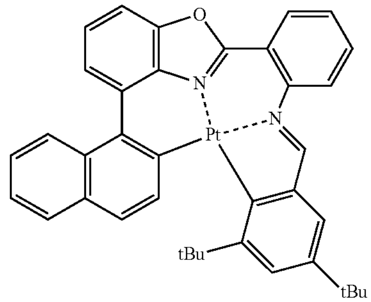
3-116
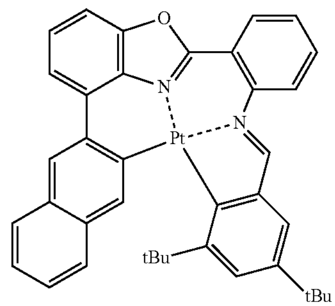
3-117
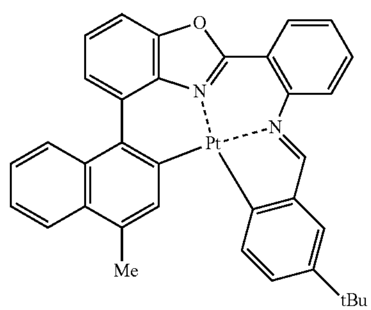
3-118
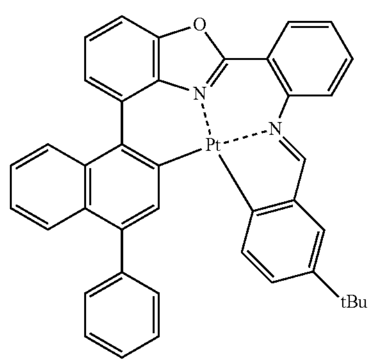

-continued
3-119
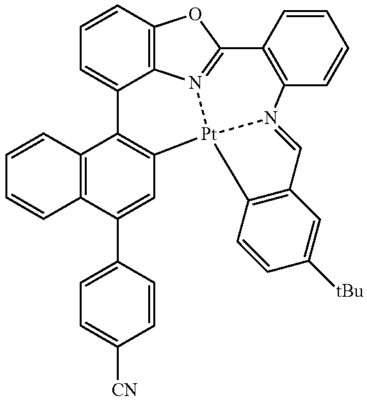
3-120
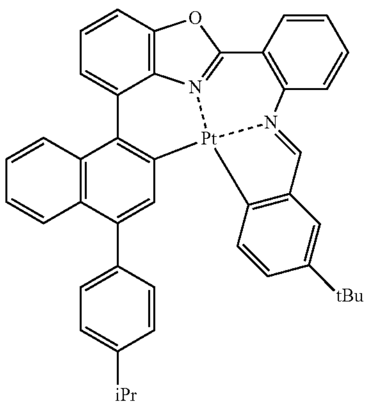
3-121
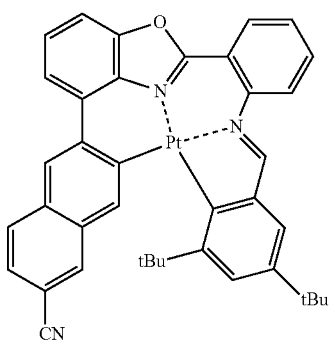
3-122
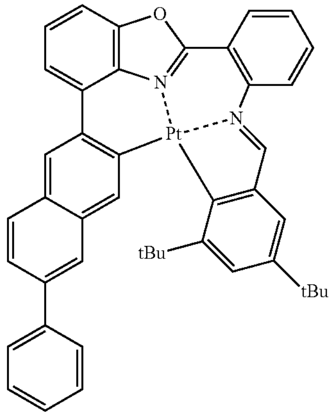
-continued
3-123
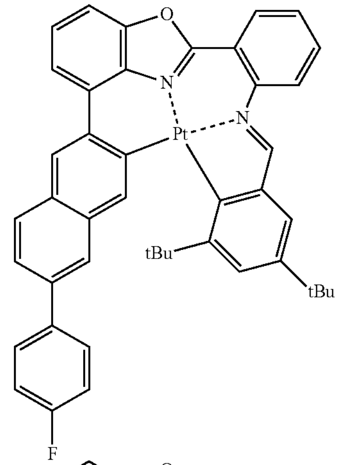
3-124
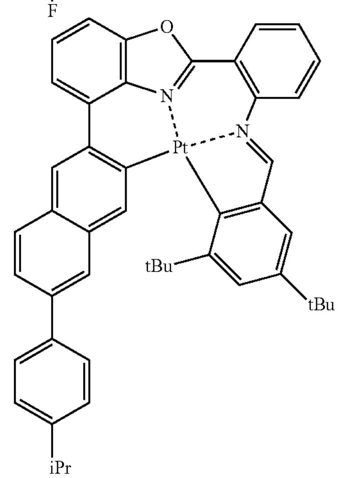
3-125
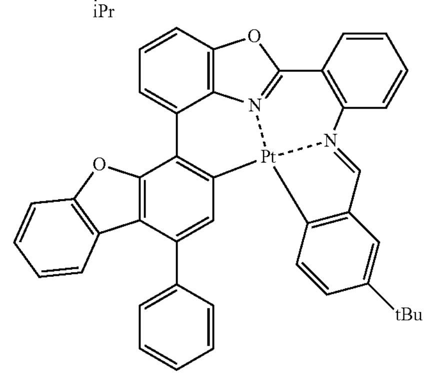
3-126
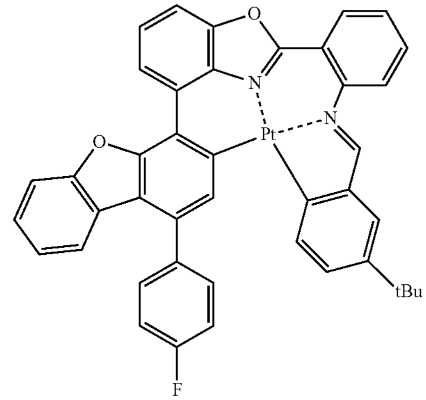

-continued
3-127
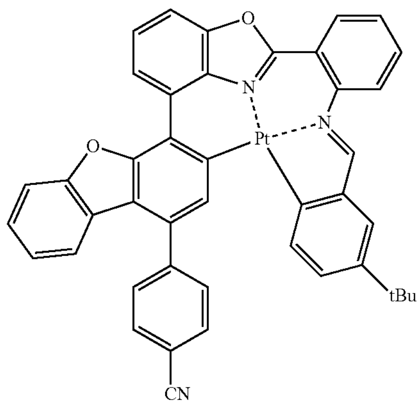
3-128
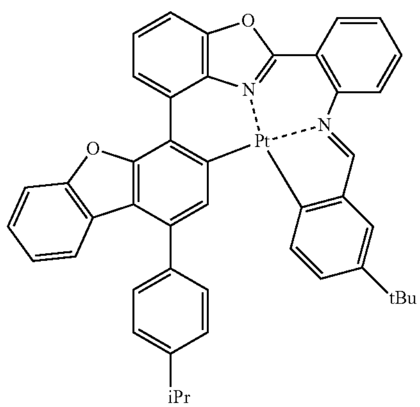
3-129
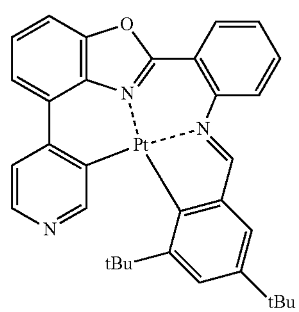
3-130
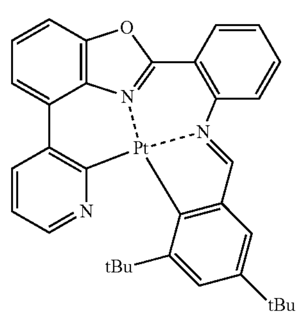
-continued
3-131
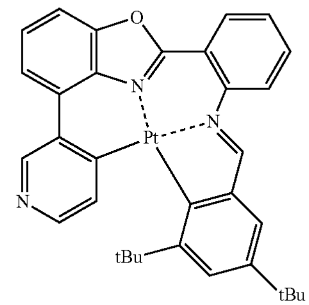
3-132
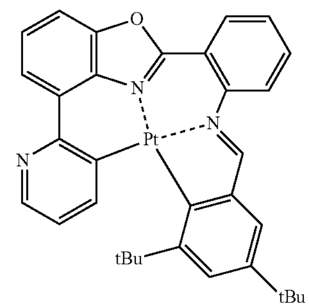
3-133
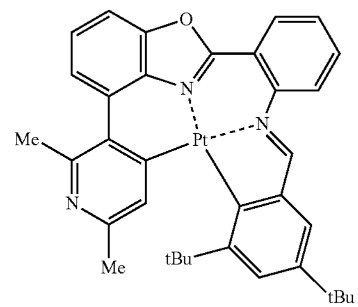
3-134
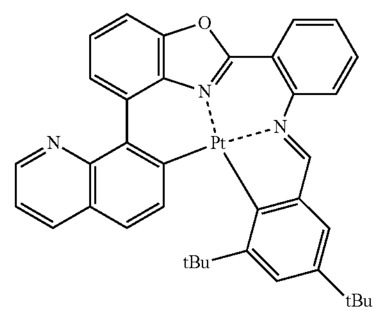
3-135
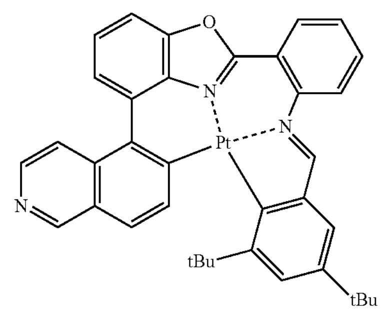

-continued
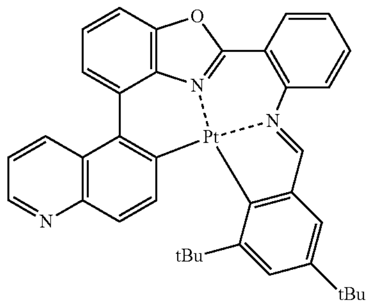
3-136
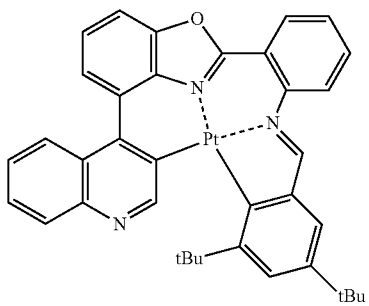
3-137
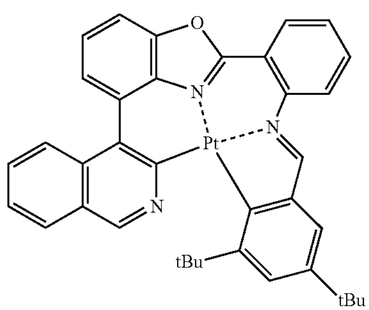
3-138
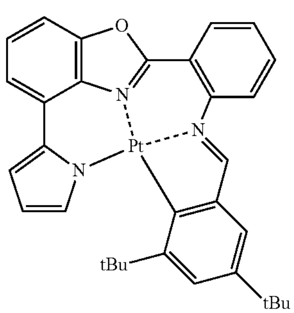
3-139
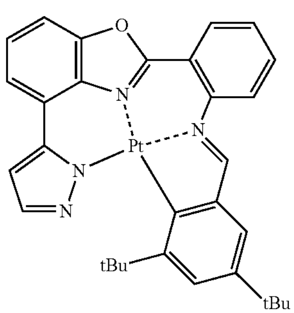
3-140
-continued
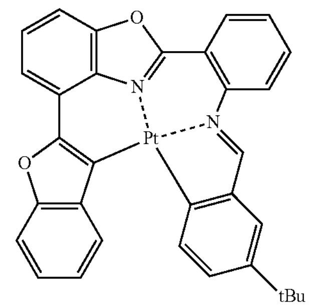
3-141
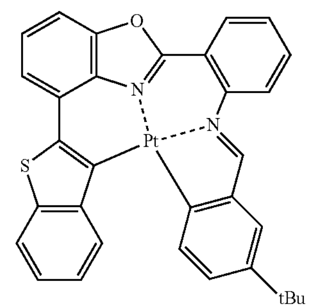
3-142
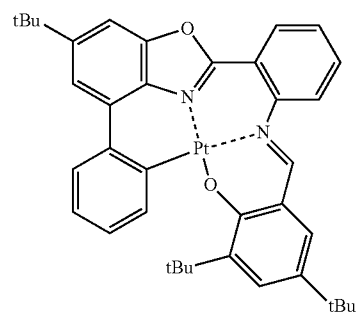
3-143
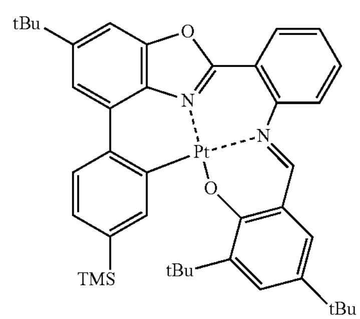
3-144
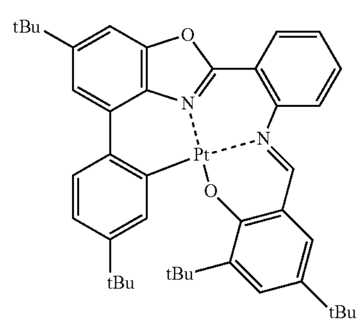
3-145

3-146
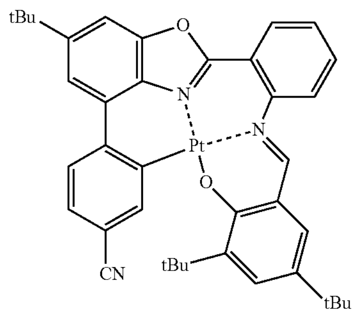
3-147
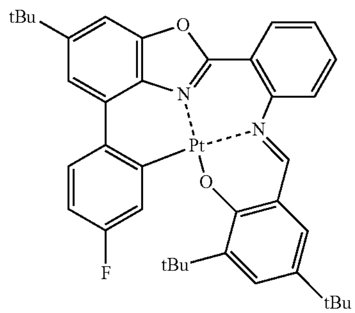
3-148
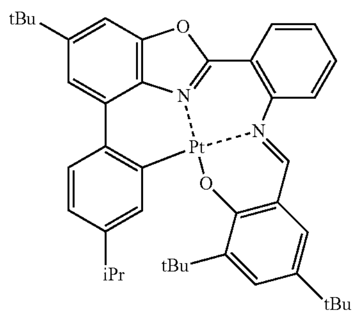
3-149
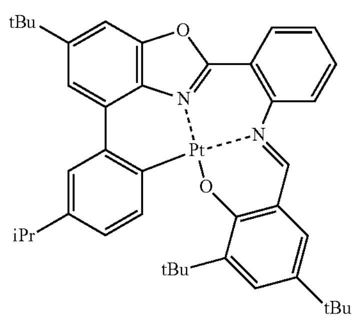
3-150
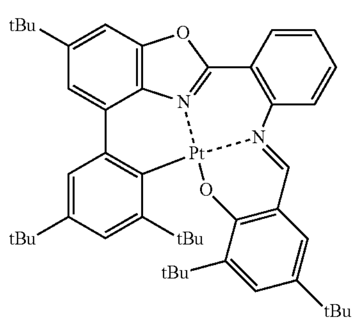
3-151
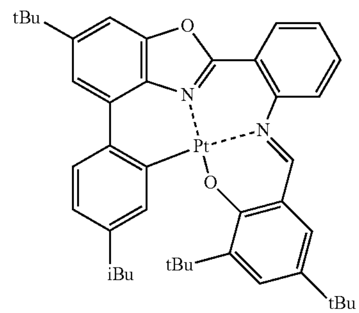
3-152
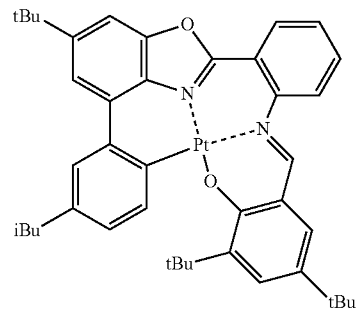
3-153
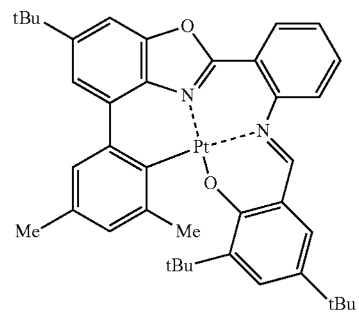
3-154
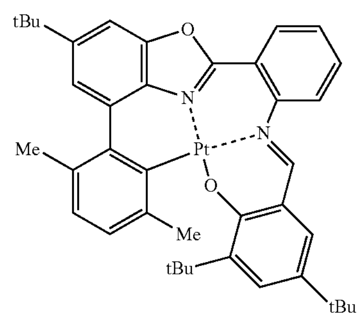
3-155
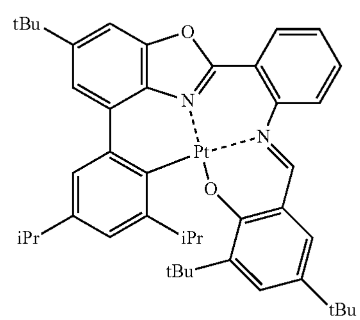

-continued
3-156
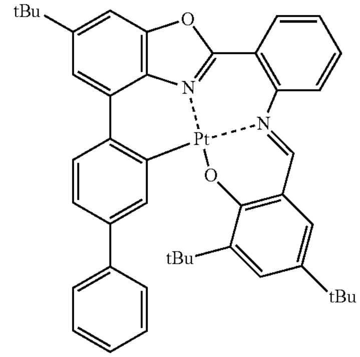
3-157
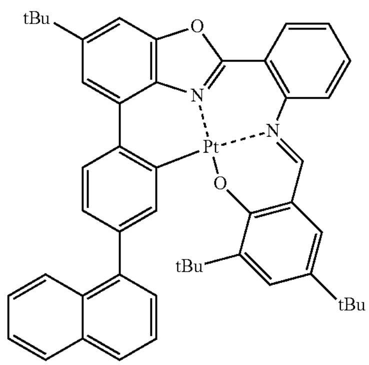
3-158
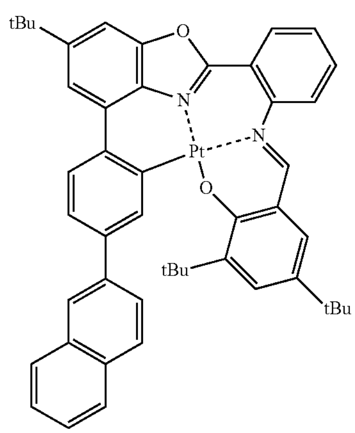
3-159
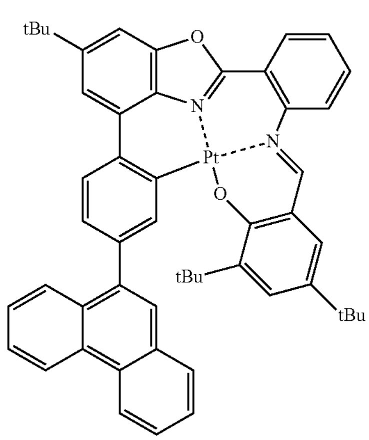
-continued
3-160
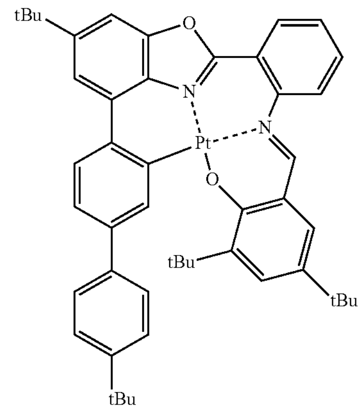
3-161
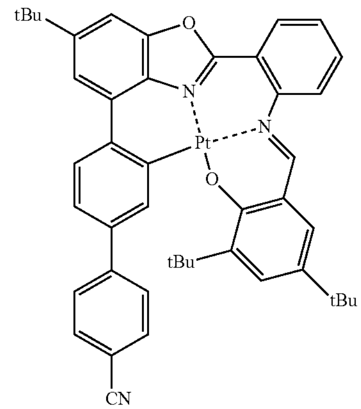
3-162
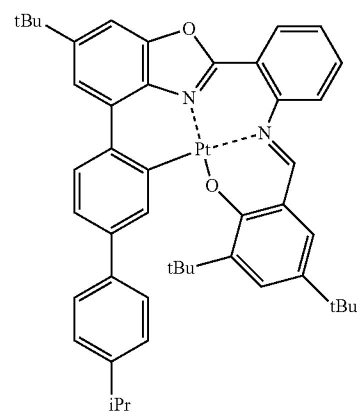
3-168
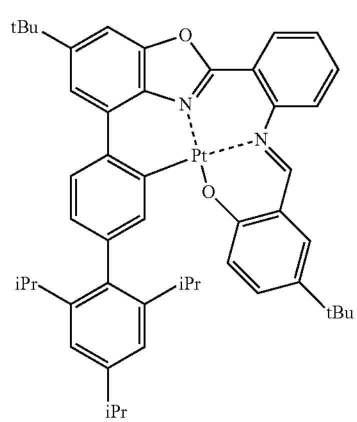

-continued
3-169
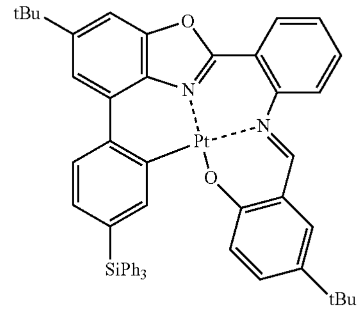
3-170
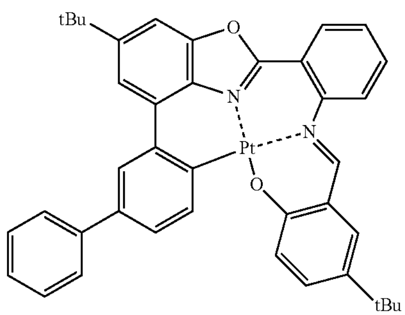
3-171
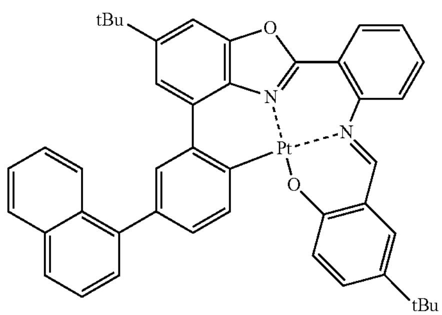
3-172
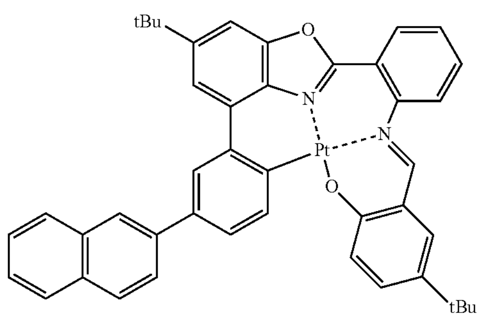
3-173
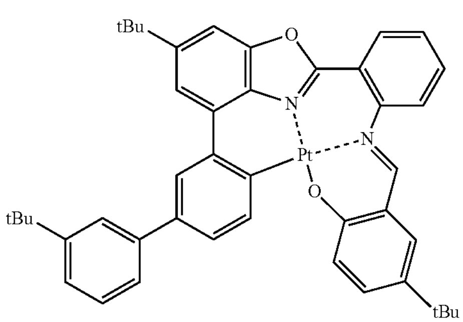
-continued
3-174
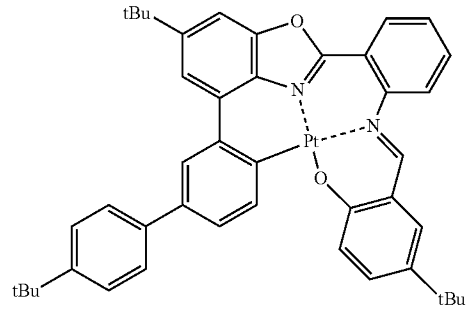
3-175
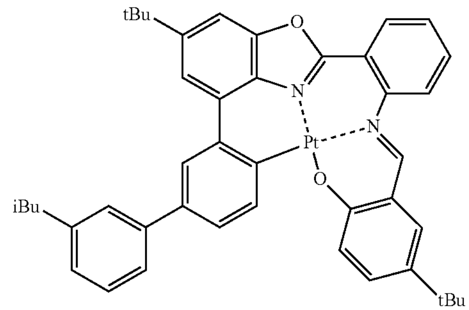
3-176
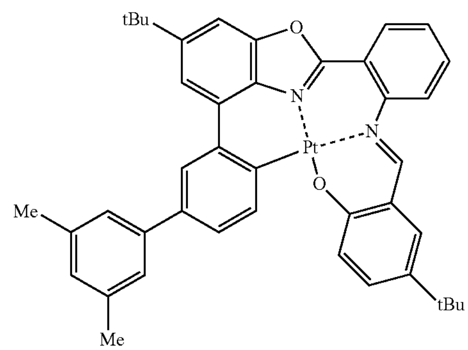
3-177
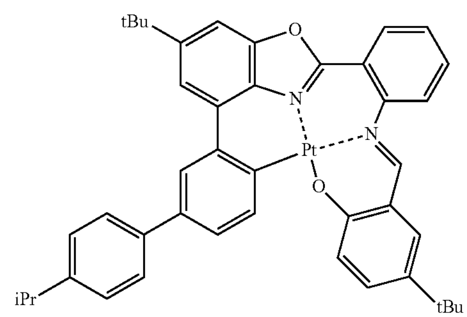
3-178
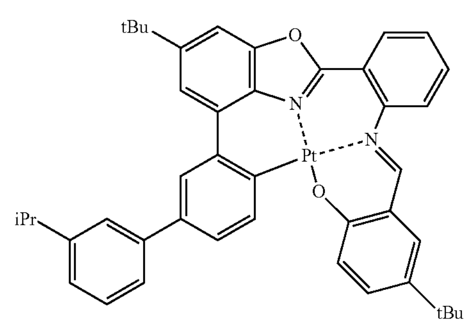

-continued
3-179
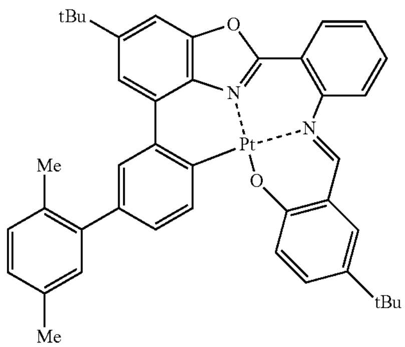
3-180
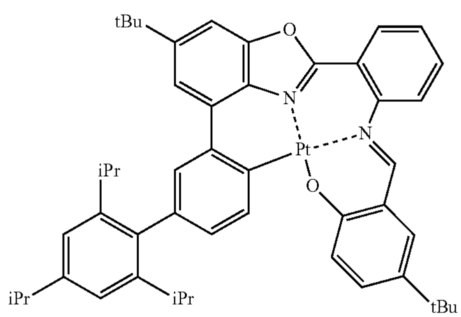
3-181
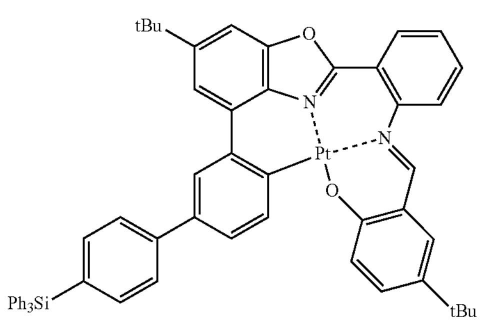
3-182
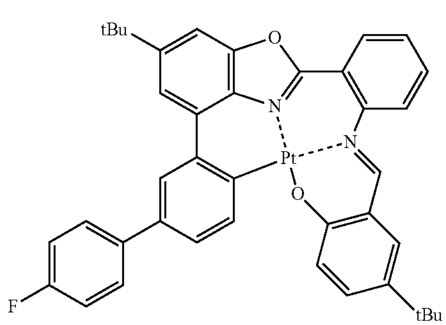
-continued
3-183
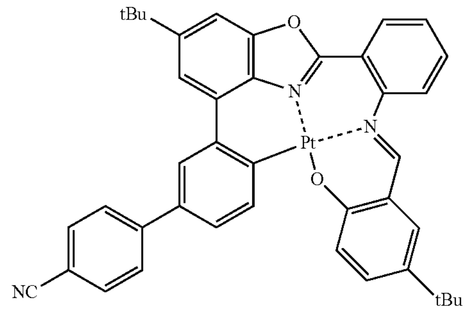
3-184
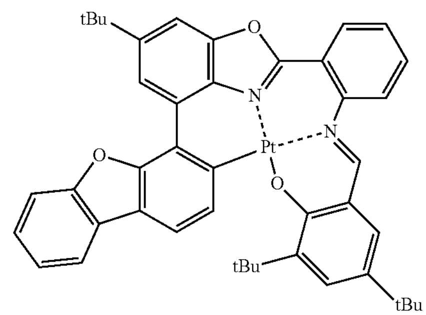
3-185
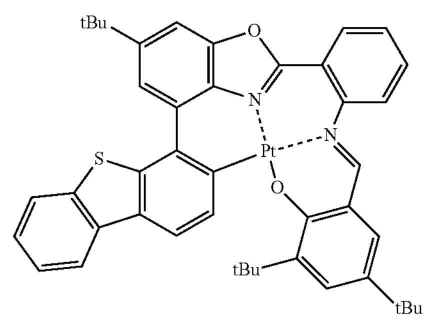
3-186
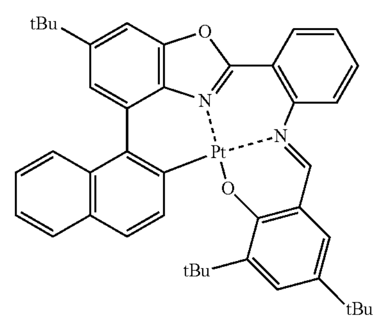
3-187
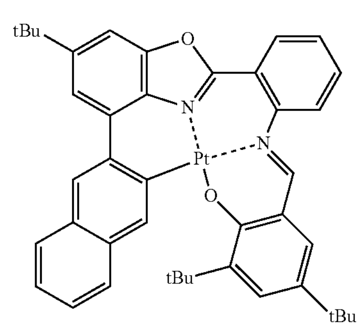

-continued
3-188
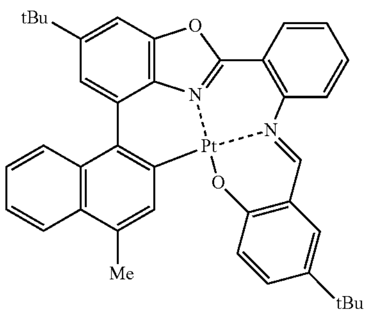
3-189
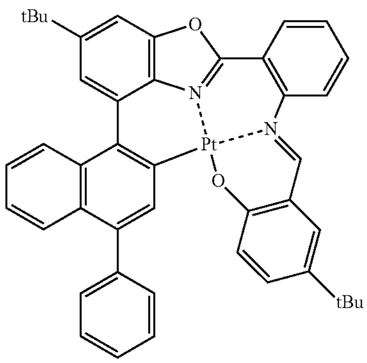
3-190
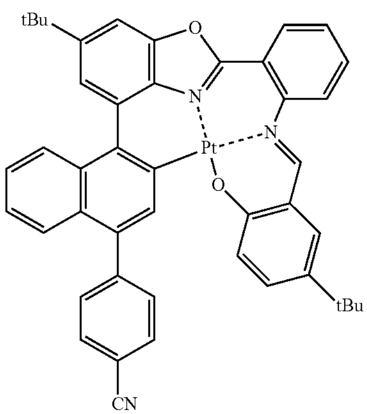
3-191
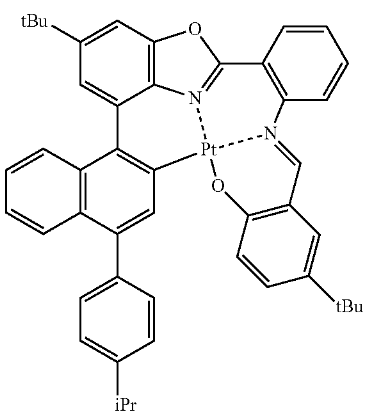
-continued
3-192
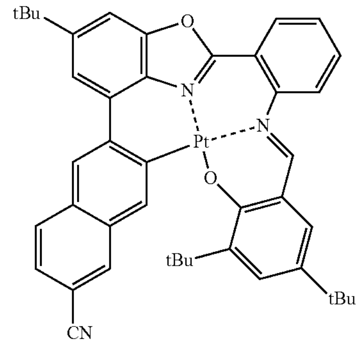
3-193
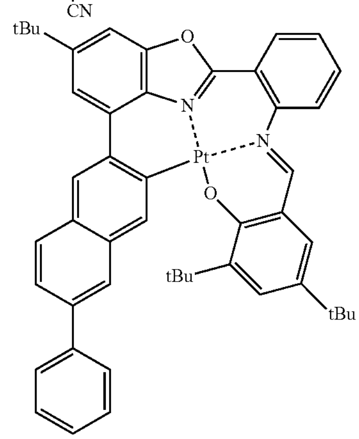
3-194
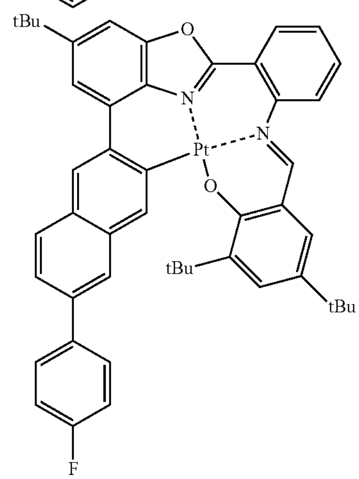
3-195
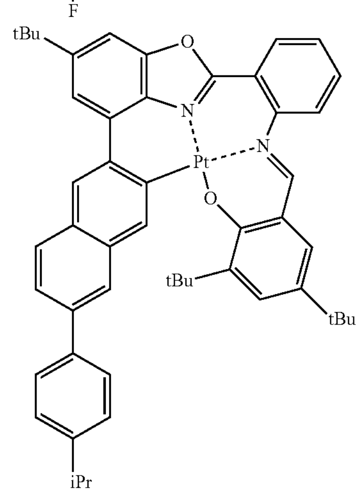

-continued
3-196
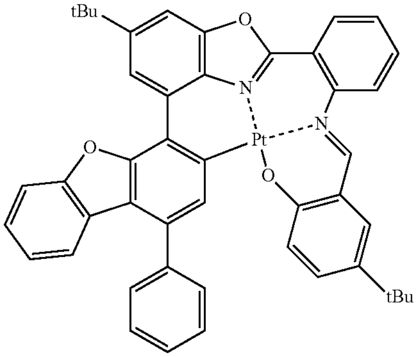
3-197
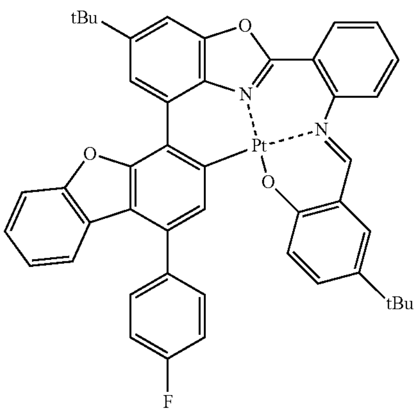
3-198
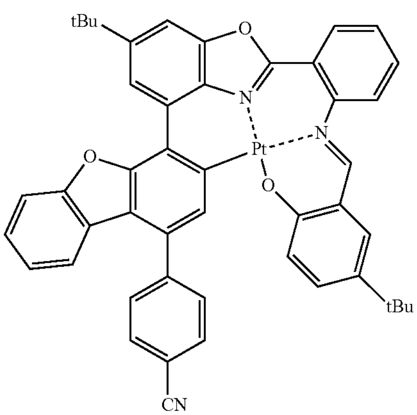
3-199
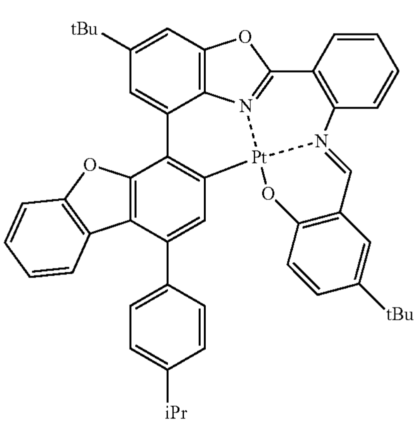
-continued
3-200
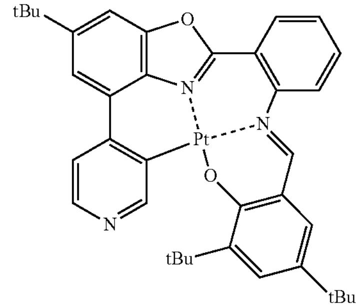
3-201
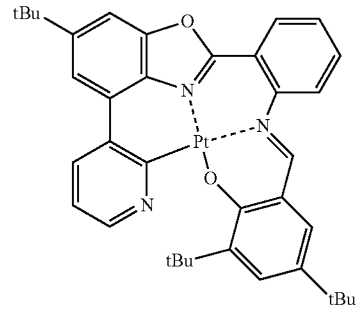
3-202
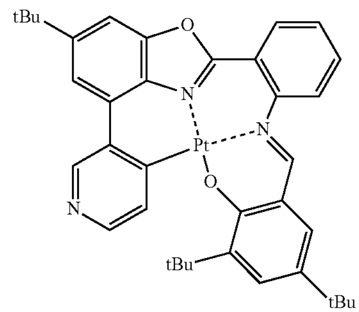
3-203
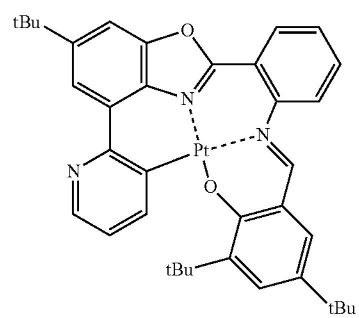
3-204
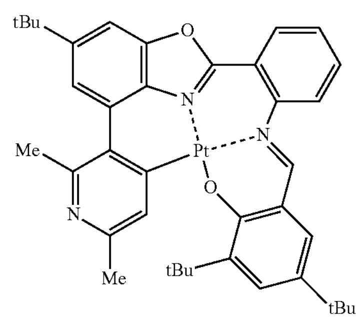

-continued
3-205
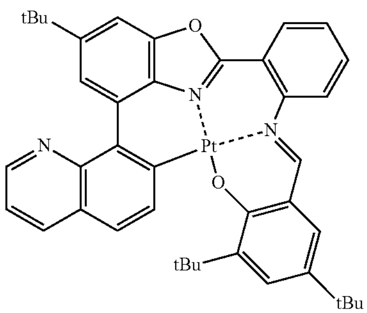
3-206
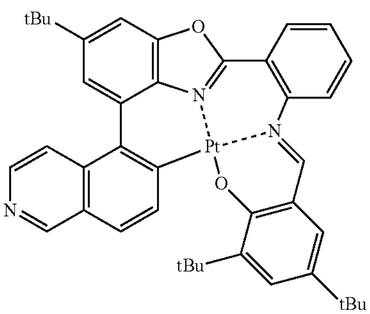
3-207
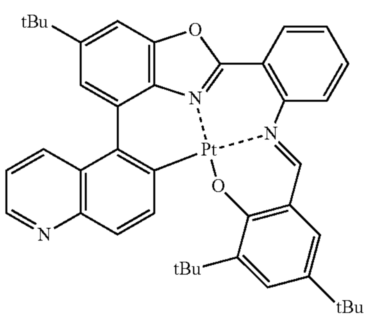
3-208
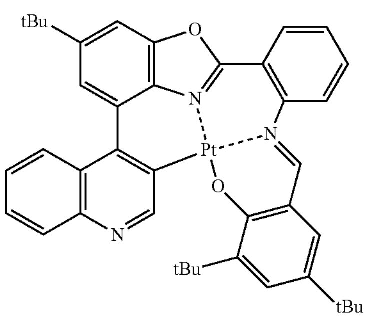
3-209
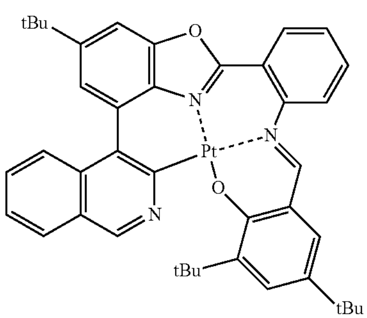
-continued
3-210
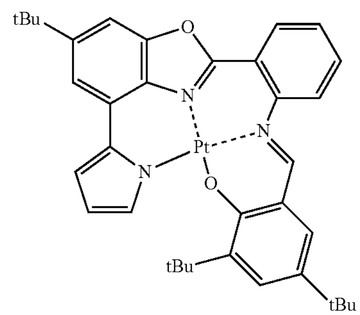
3-211
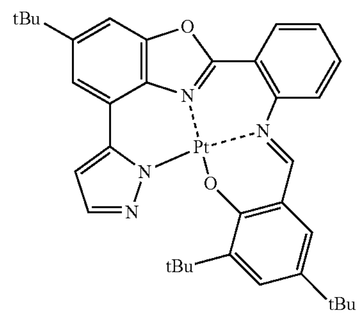
3-212
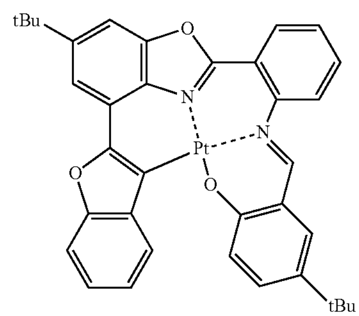
3-213
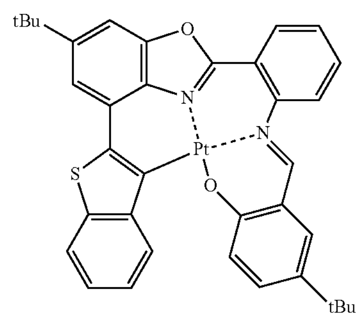
3-214
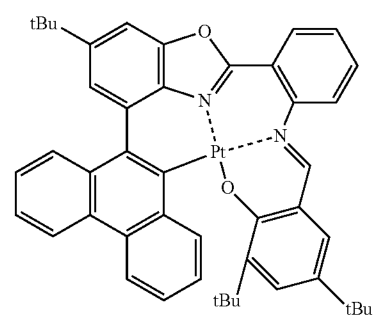

-continued
3-215
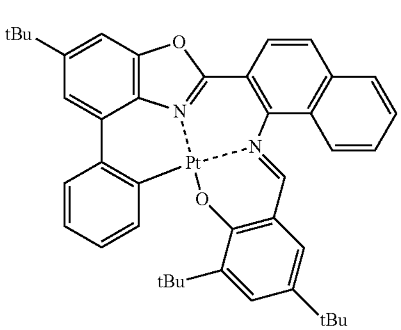
3-216
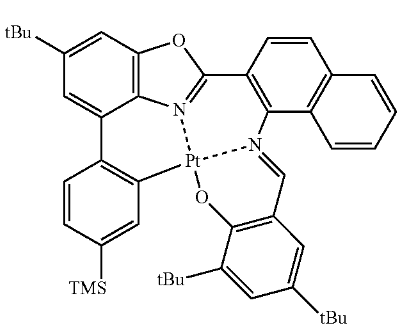
3-217
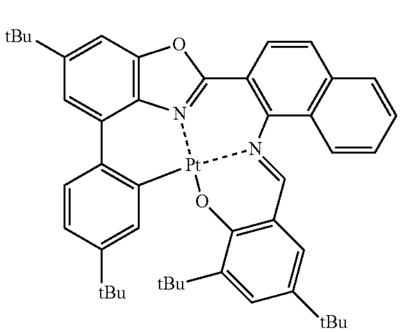
3-218
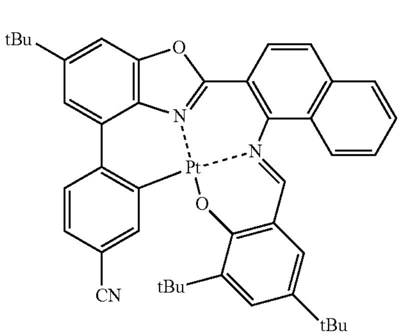
3-219
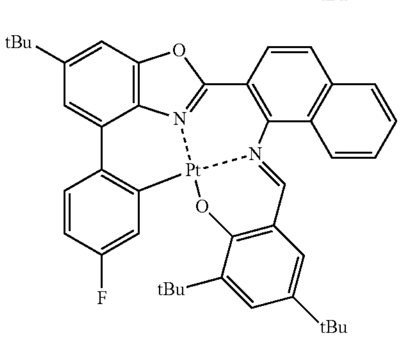
-continued
3-220
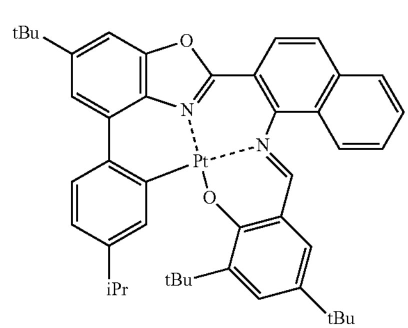
3-221
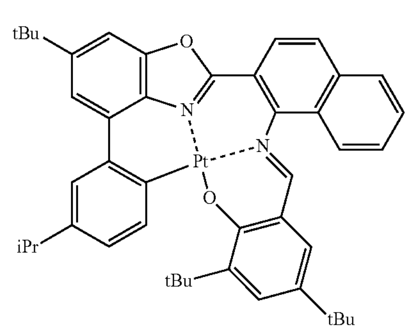
3-222
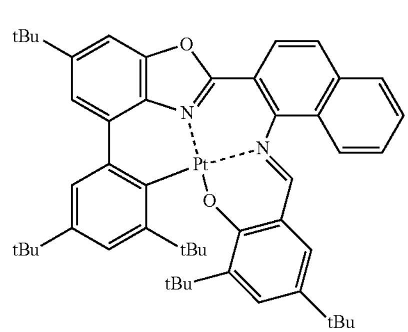
3-223
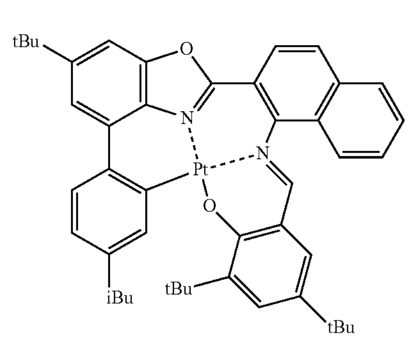
3-224
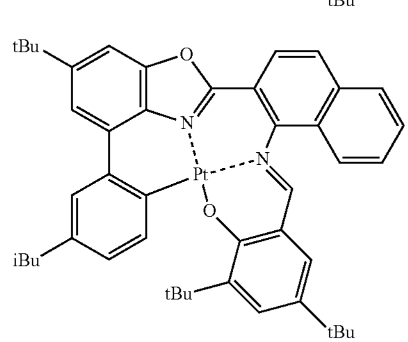

-continued
3-225
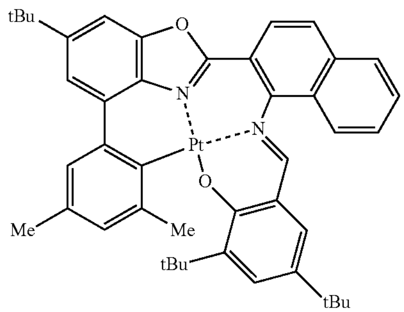
3-226
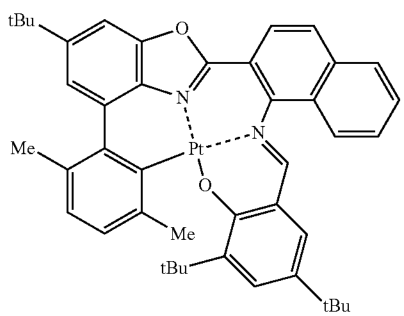
3-227
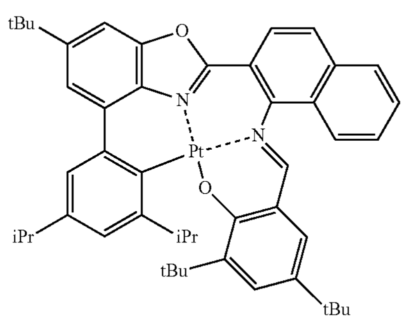
3-228
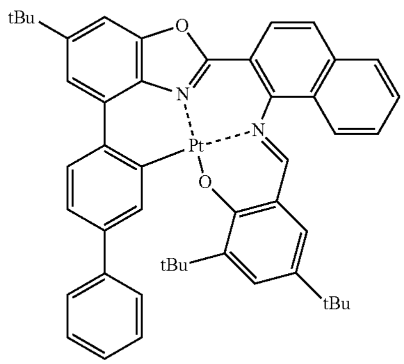
-continued
3-229
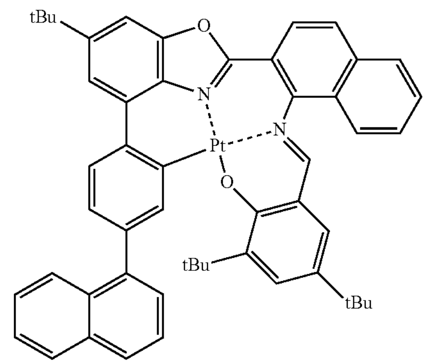
3-230
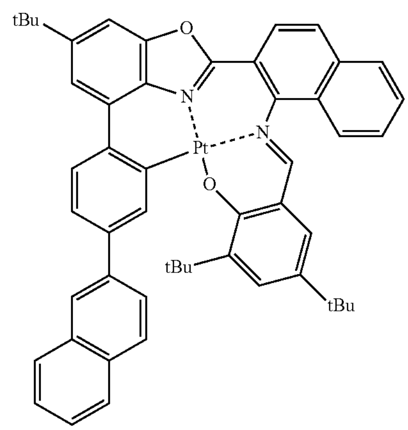
3-231
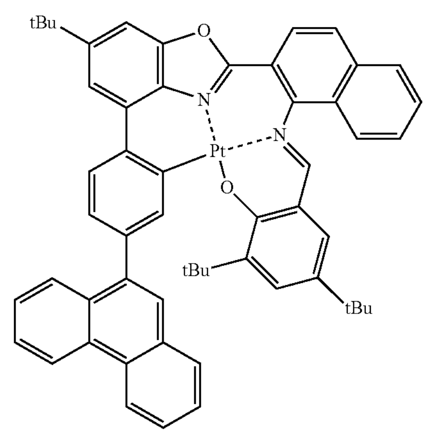
3-232
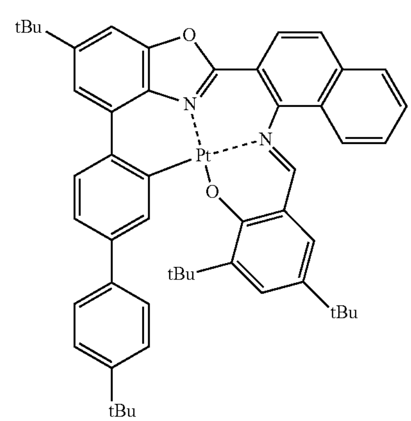

3-233
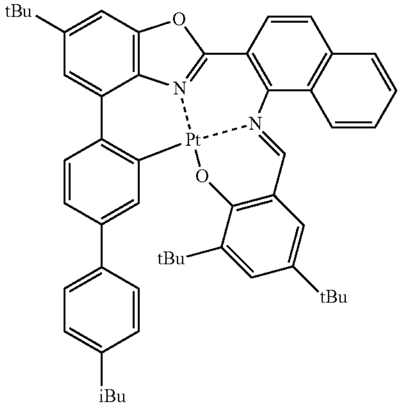
3-234
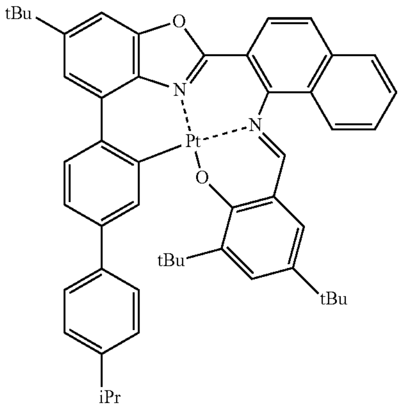
3-235
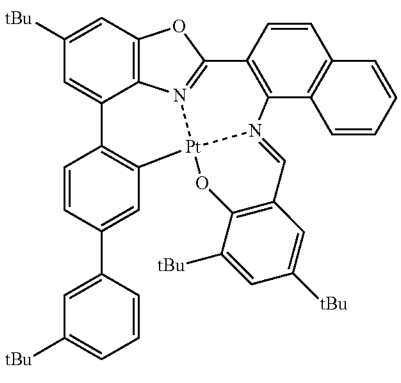
3-236
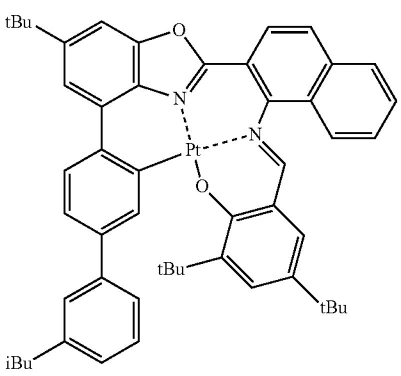
3-237
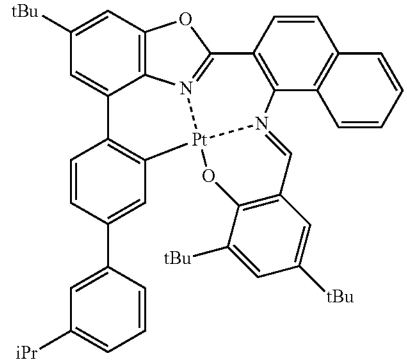
3-238
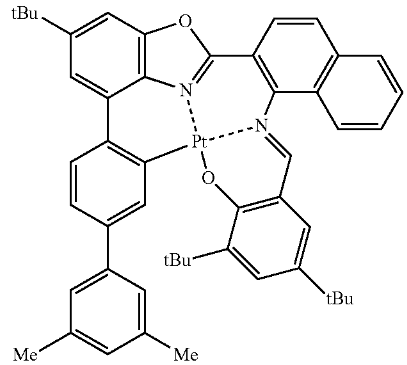
3-239
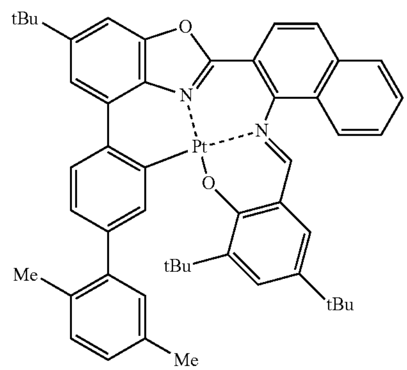
3-240
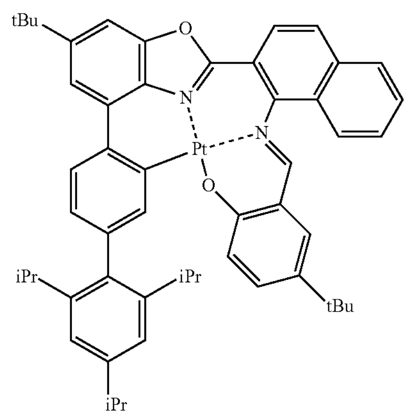

-continued
3-241
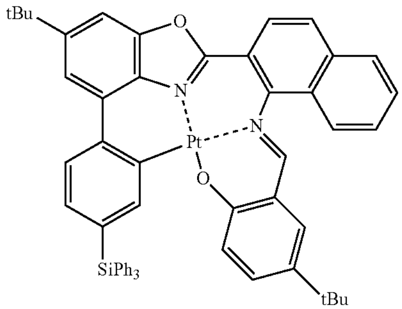
3-242
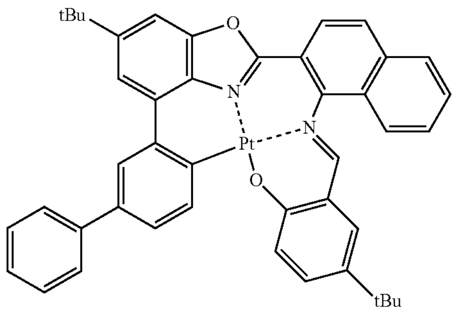
3-243
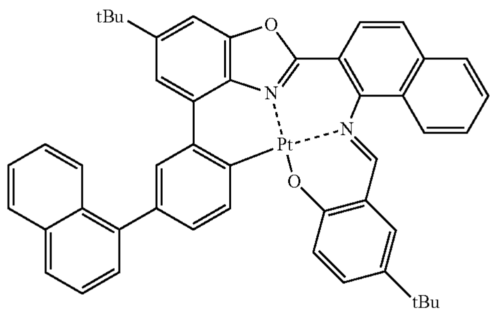
3-244
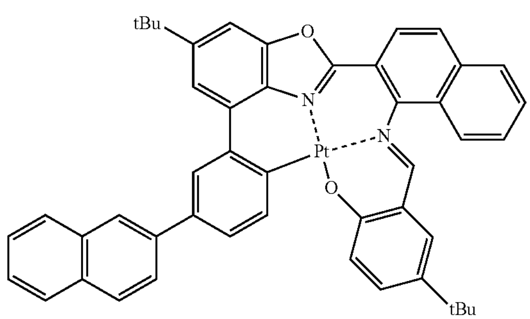
3-245
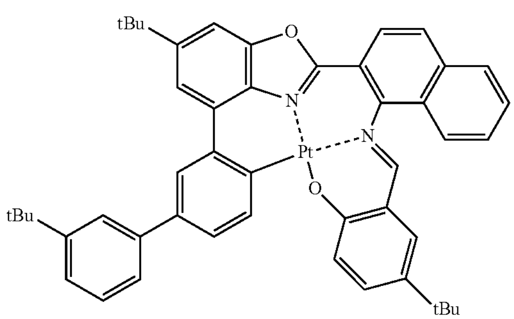
-continued
3-246
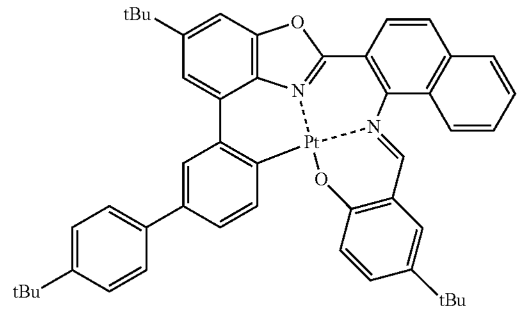
3-247
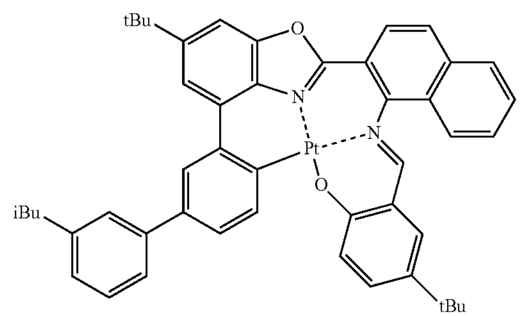
3-248
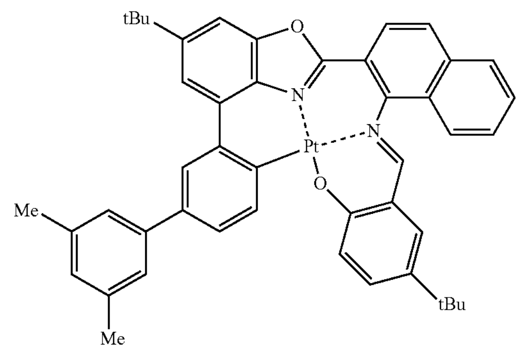
3-249
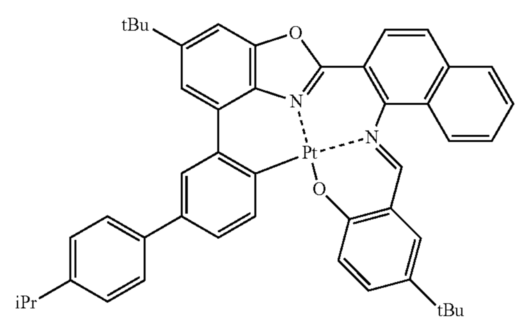

-continued
3-250
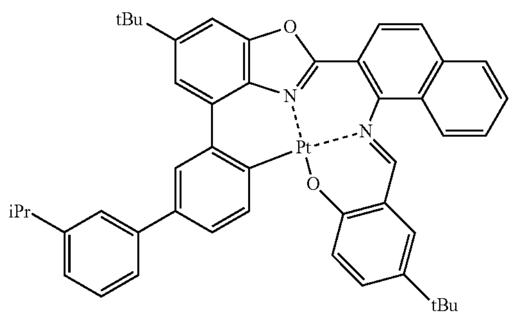
3-251
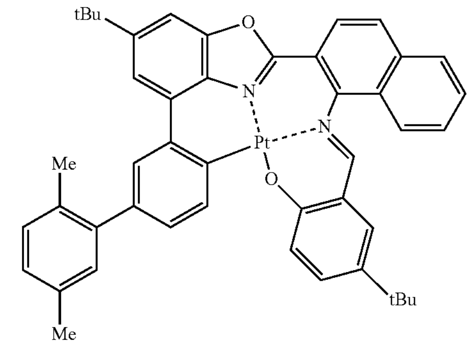
3-252
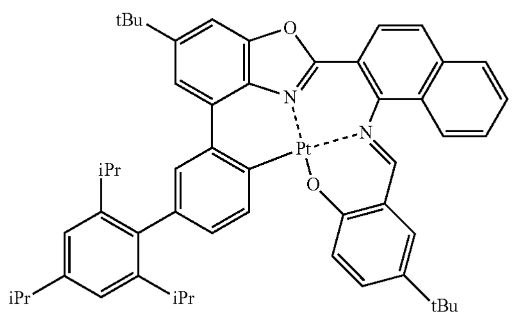
3-253
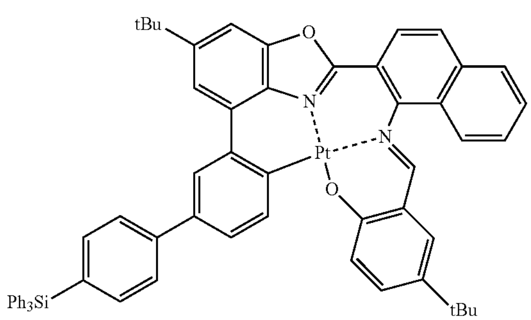
-continued
3-254
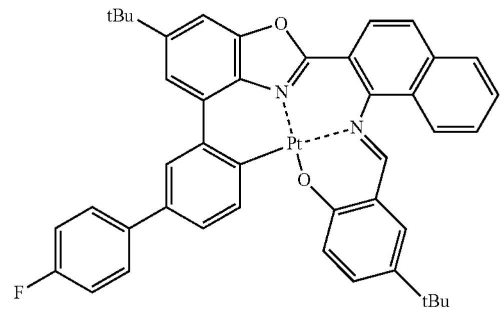
3-255
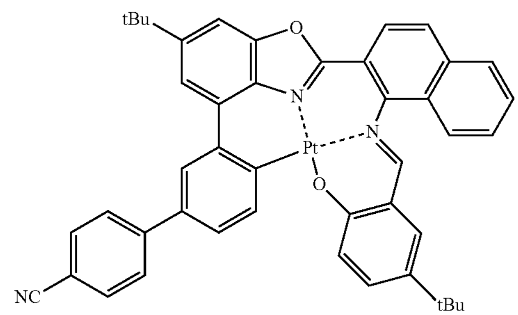
3-256
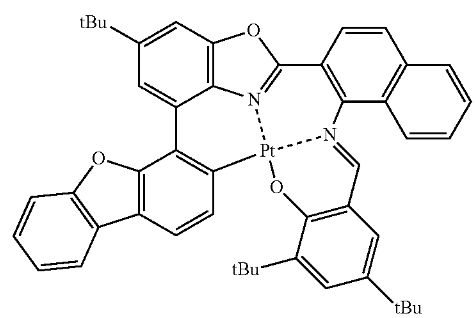
3-257
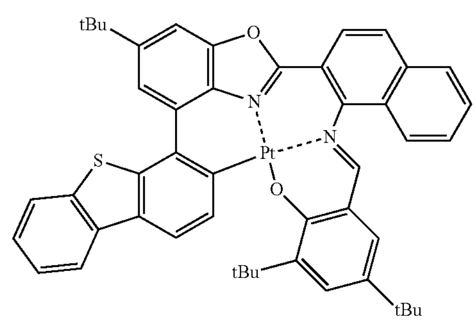
3-258
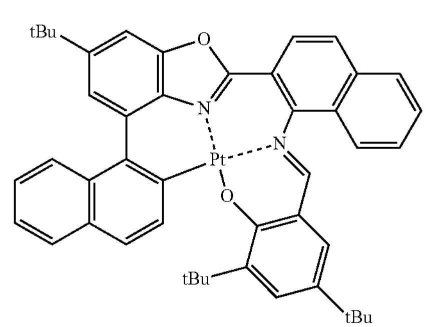

3-259
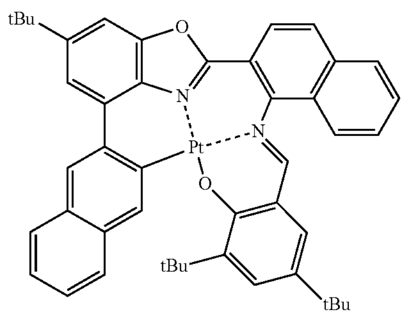
3-260
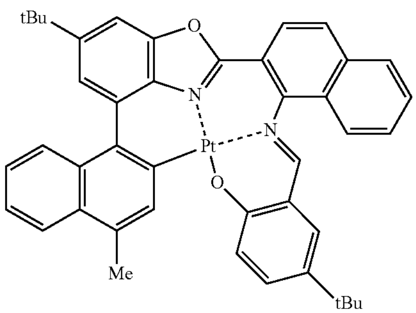
3-261
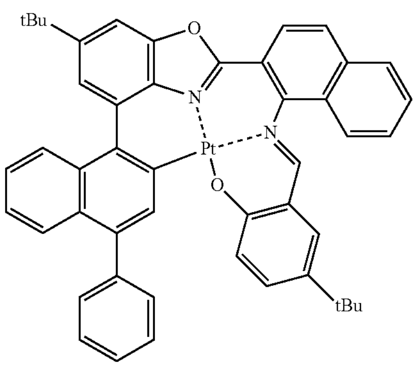
3-262
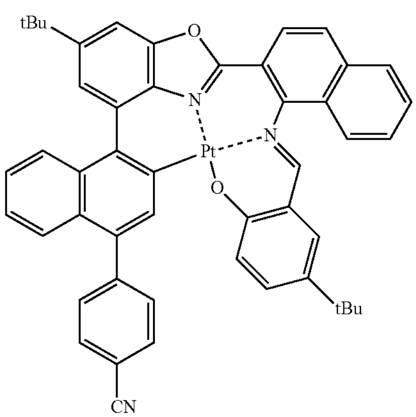
3-263
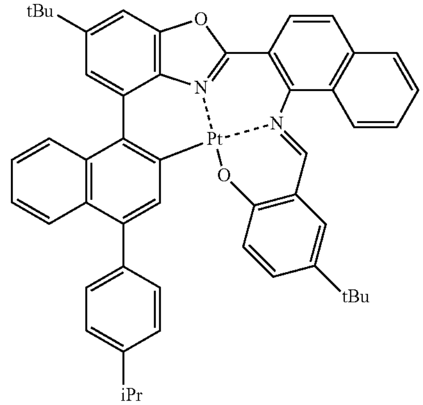
3-264
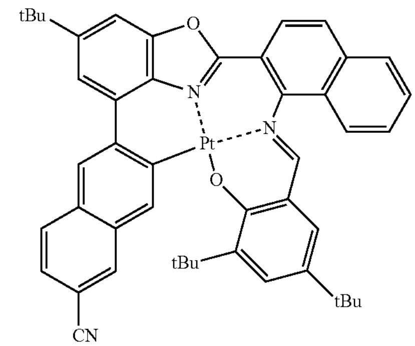
3-265
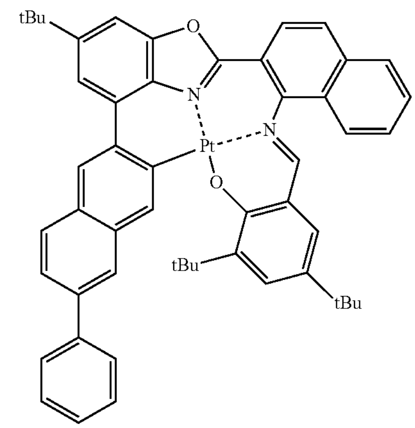
3-266
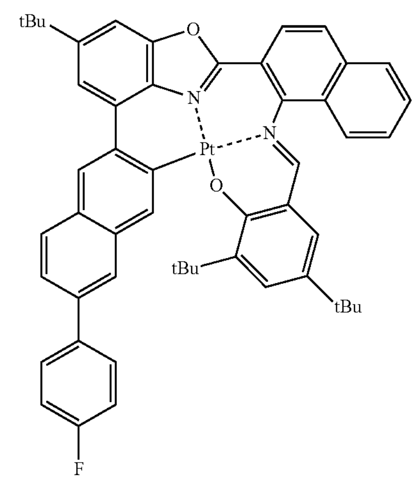

-continued
3-267
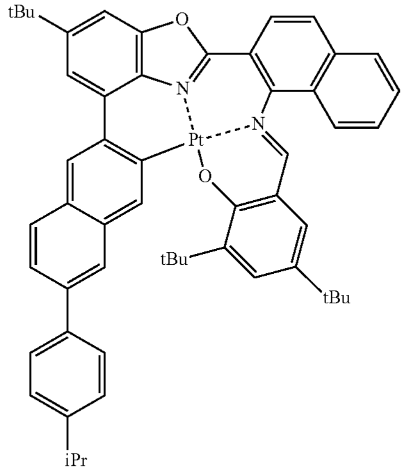
3-268
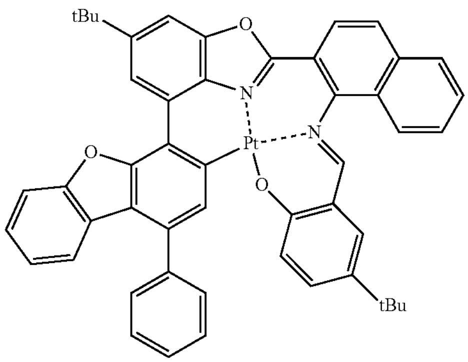
3-269
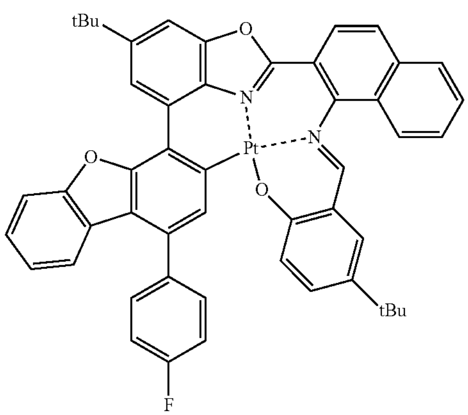
3-270
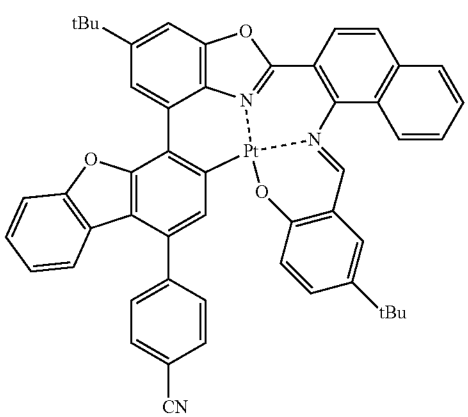
-continued
3-271
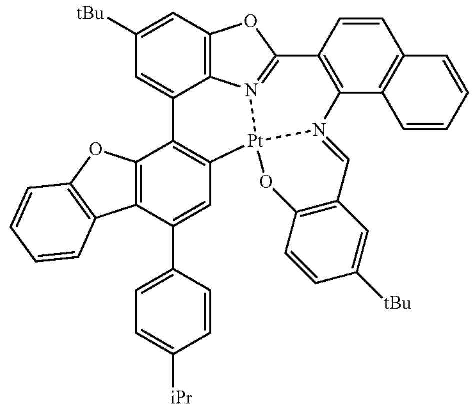
3-272
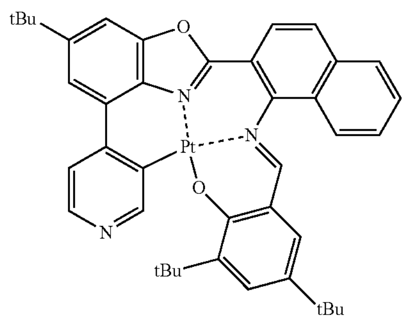
3-273
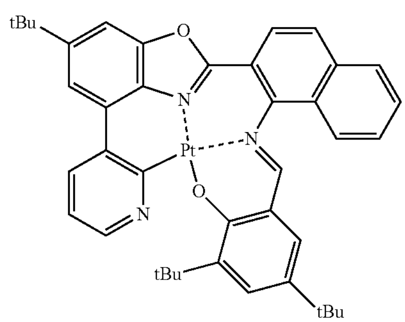
3-274
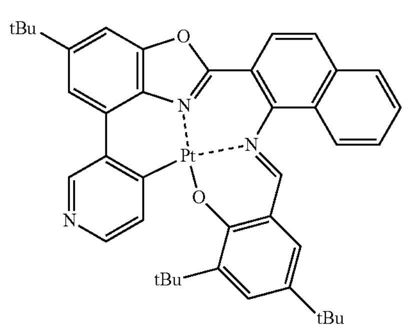

3-275
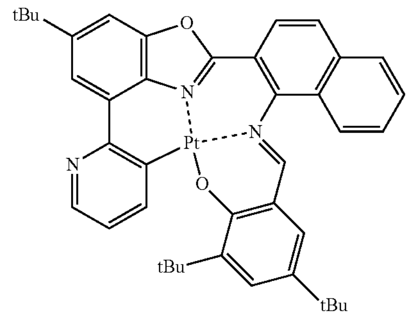
3-276
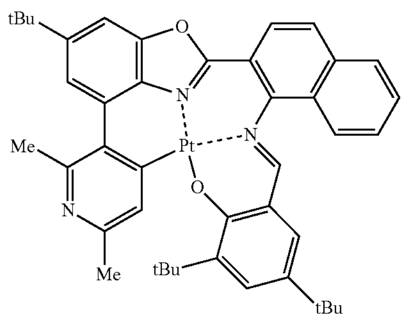
3-277
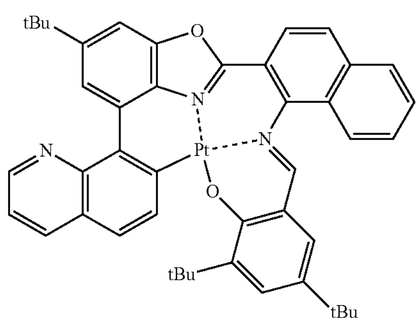
3-278
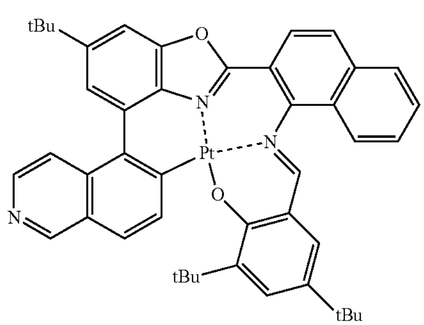
3-279
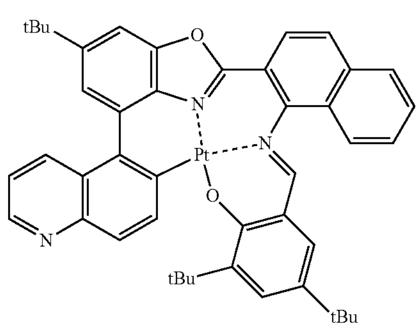
3-280
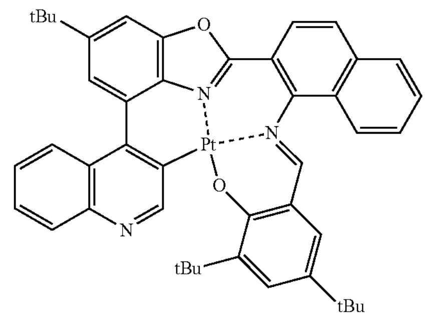
3-281
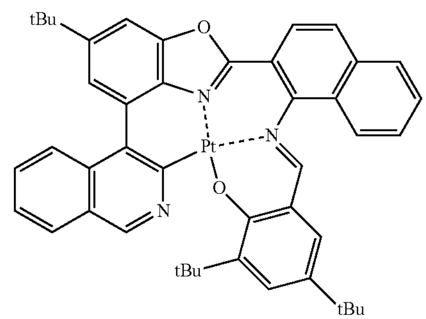
3-282
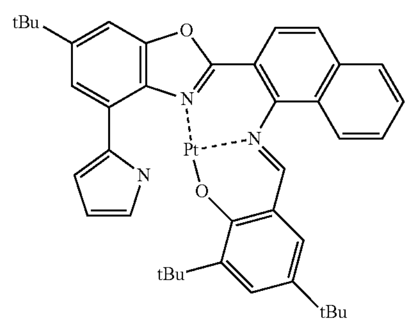
3-283
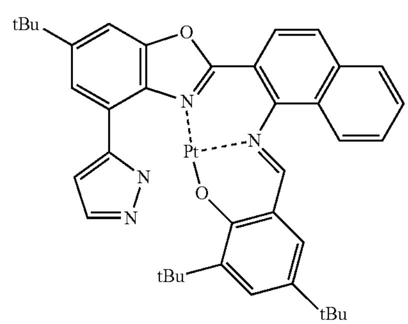
3-284
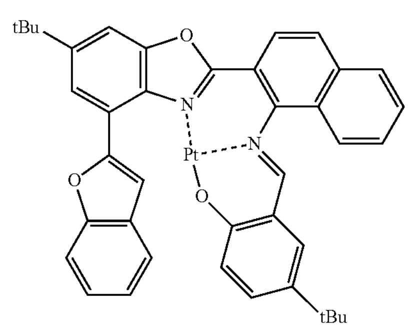

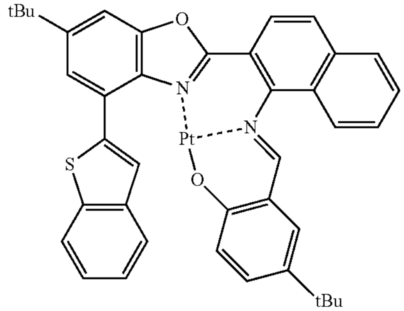
3-285
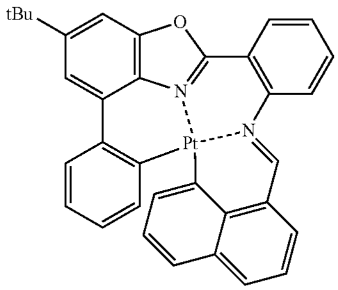
3-286
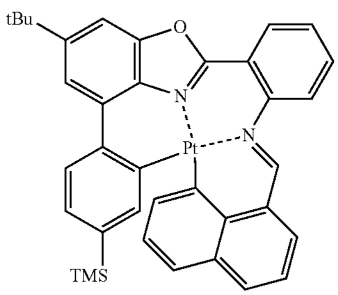
3-287
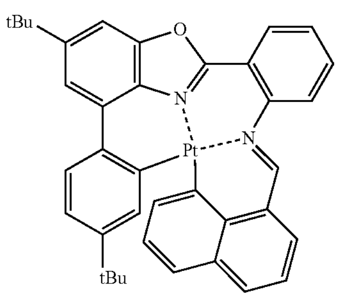
3-288
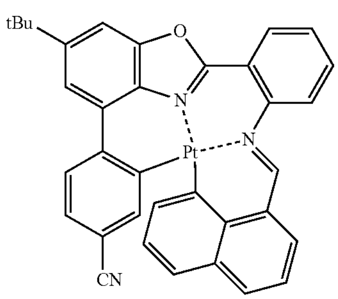
3-289
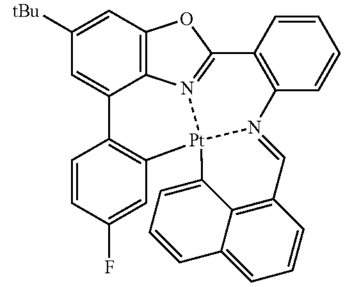
3-290
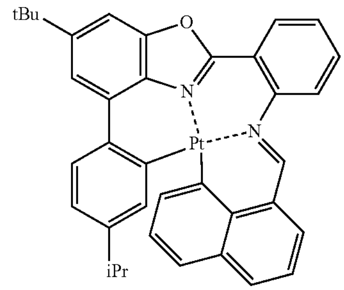
3-291
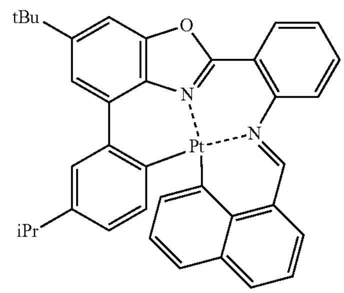
3-292
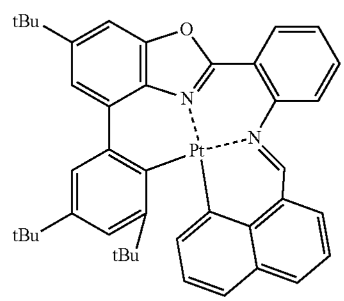
3-293
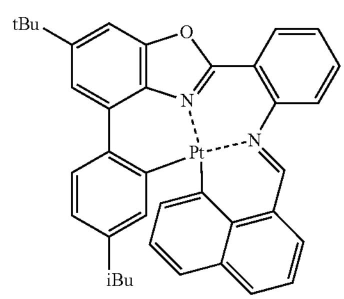
3-294

3-295
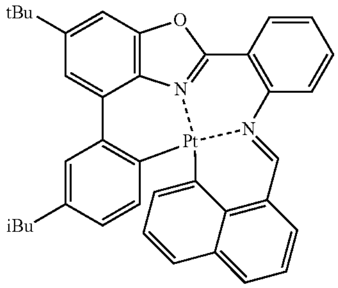
3-296
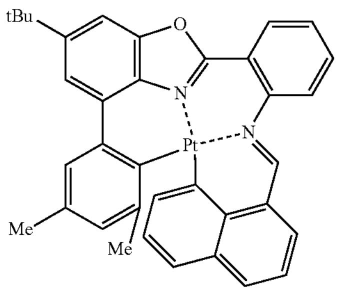
3-297
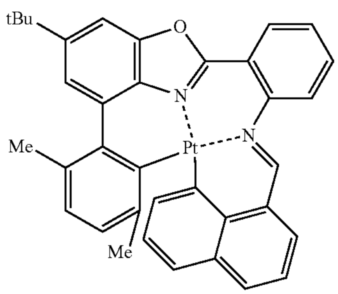
3-298
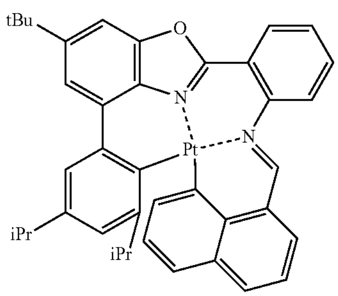
3-299
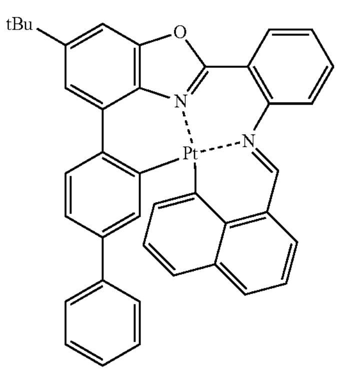
3-300
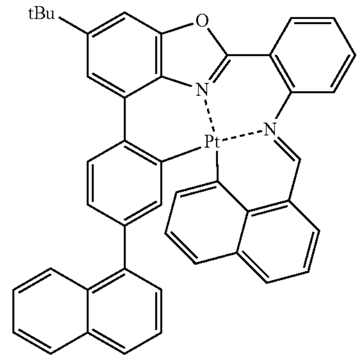
3-301
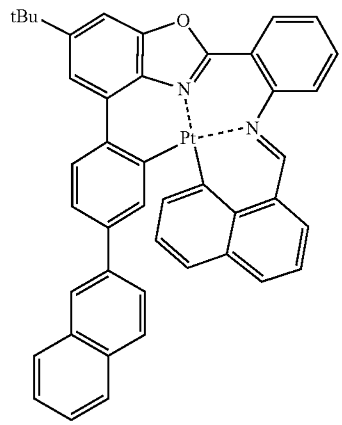
3-302
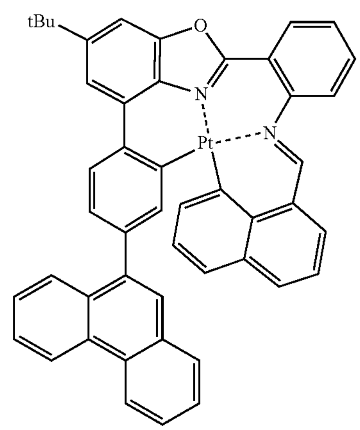
3-303
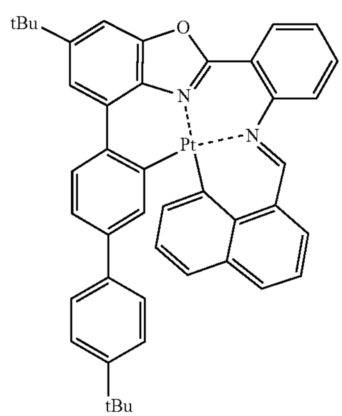

-continued
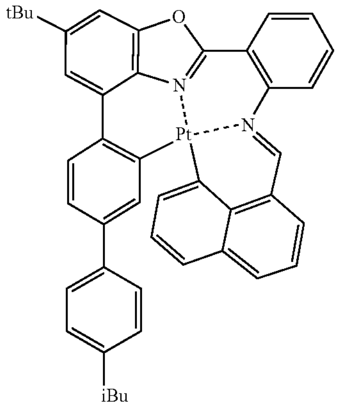
3-304
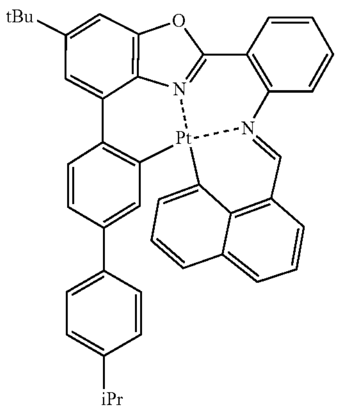
3-305
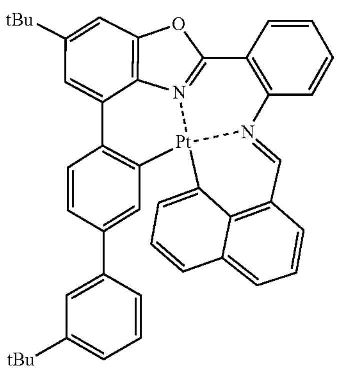
3-306
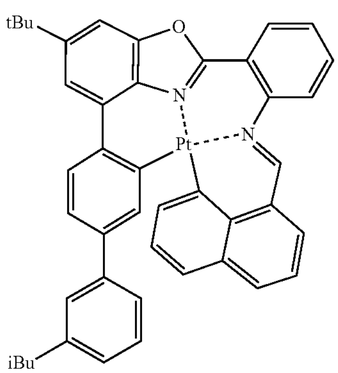
3-307
-continued
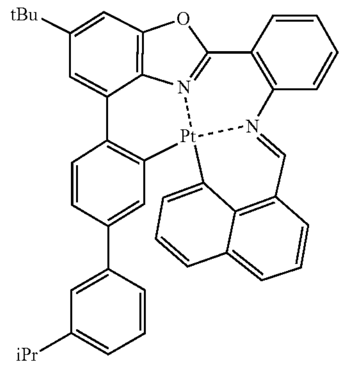
3-308
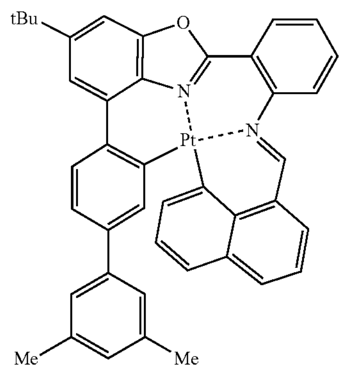
3-309
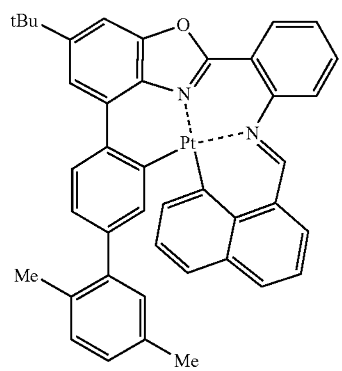
3-310
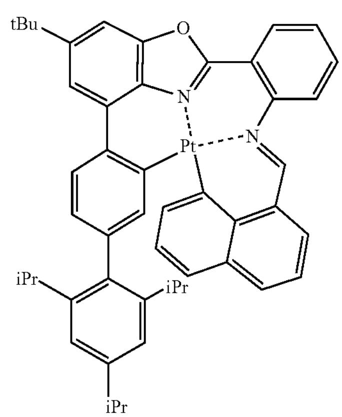
3-311

-continued
3-312
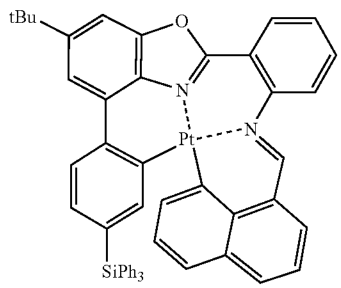
3-313
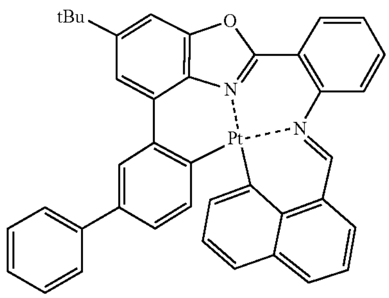
3-314
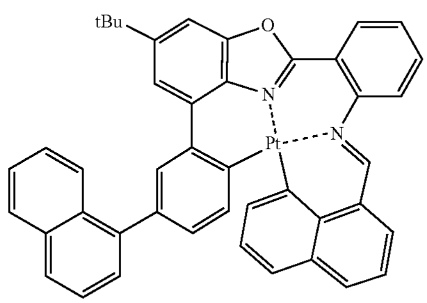
3-315
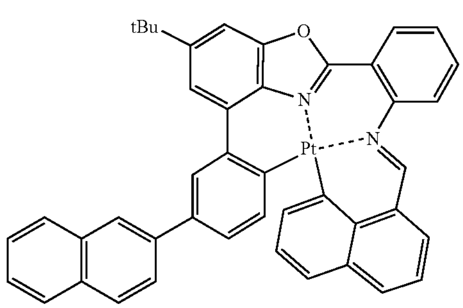
3-316
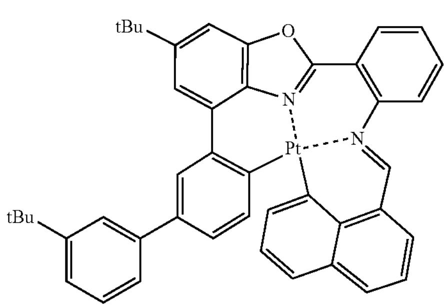
-continued
3-317
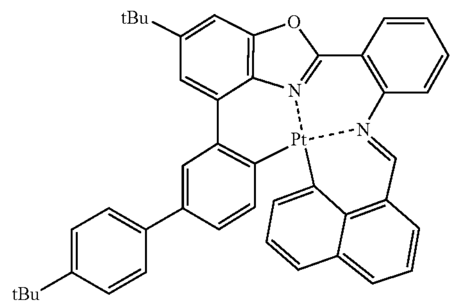
3-318
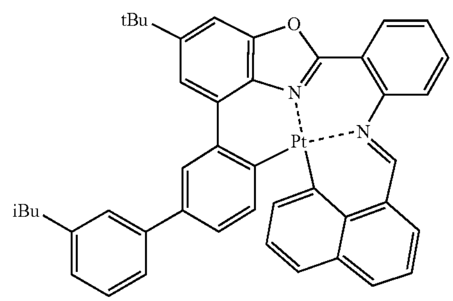
3-319
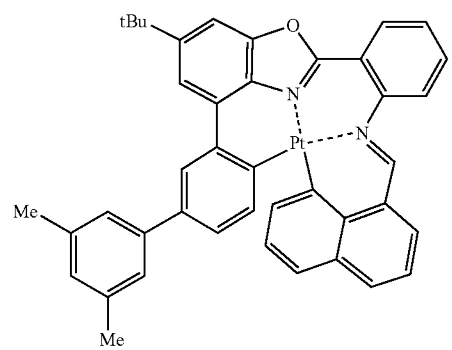
3-320
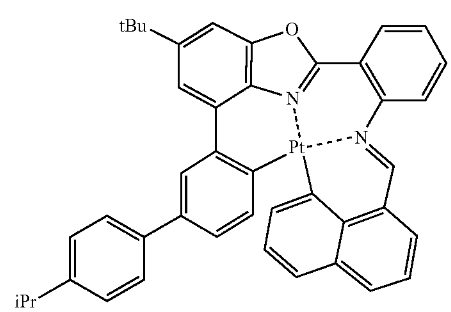
3-321
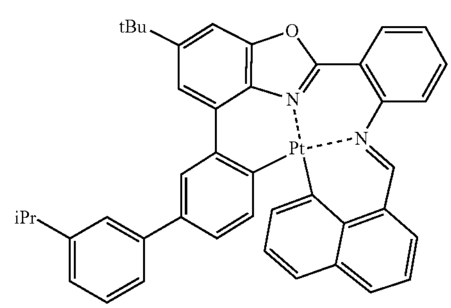

-continued
3-322
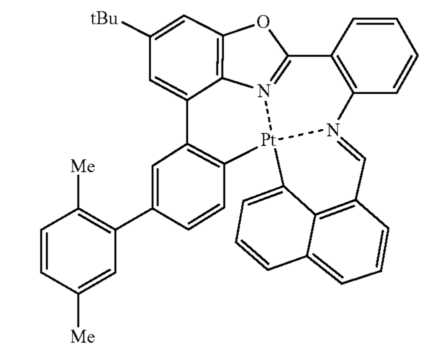
3-323
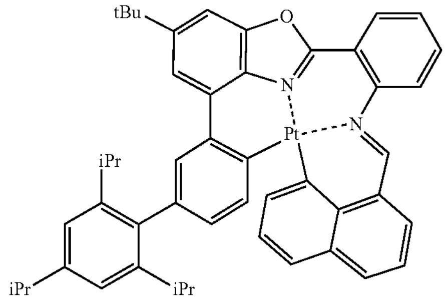
3-324
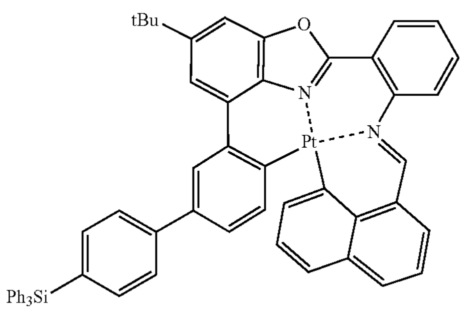
3-325
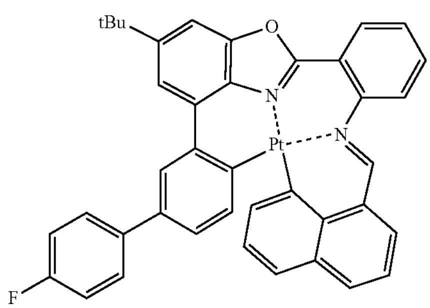
3-326
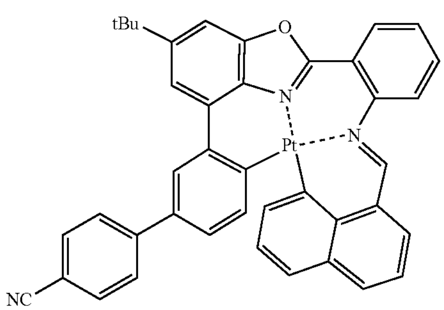
-continued
3-327
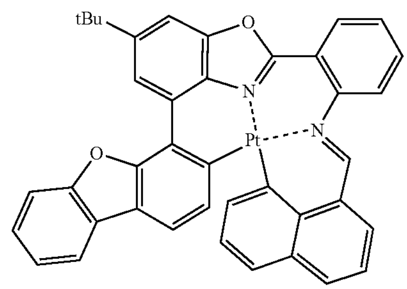
3-328
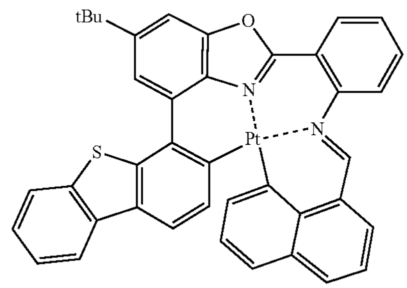
3-329
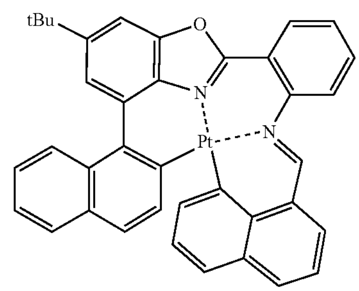
3-330
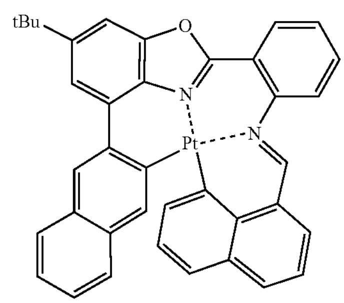
3-331
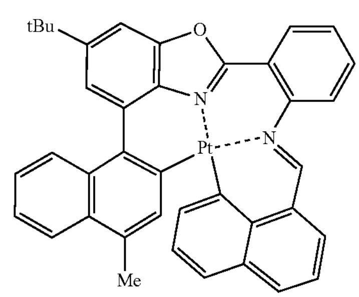

-continued
3-332
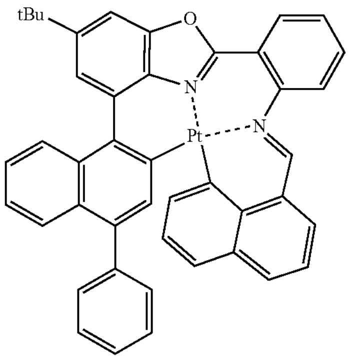
3-333
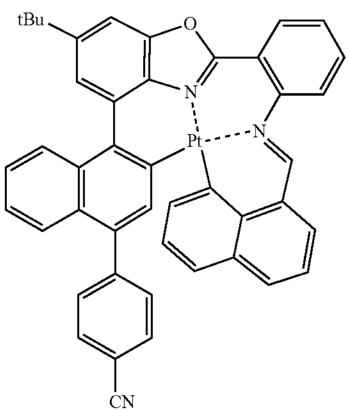
3-334
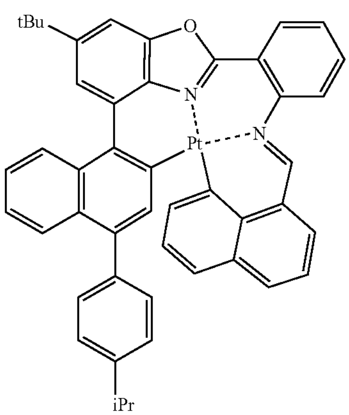
3-335
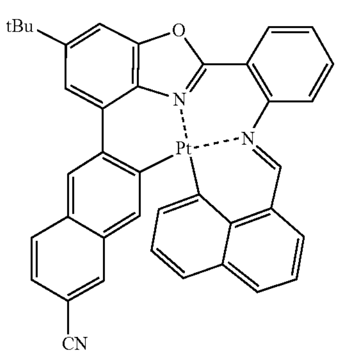
-continued
3-336
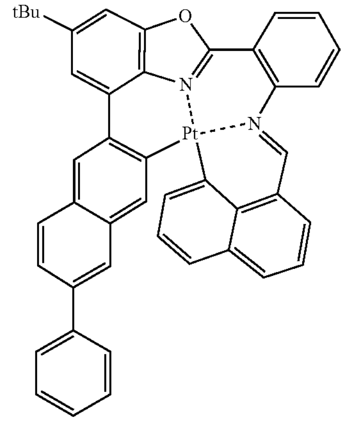
3-337
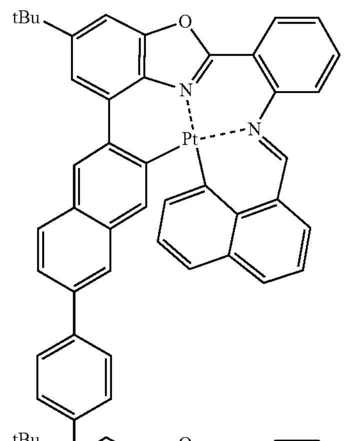
3-338
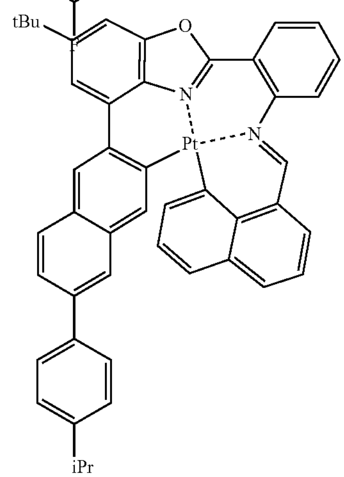
3-339
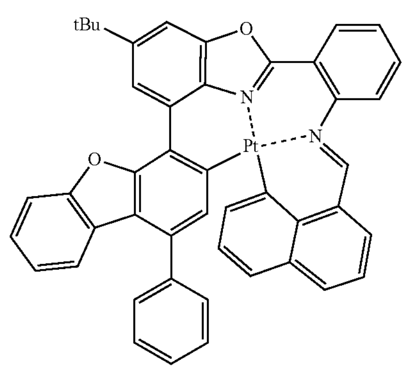

-continued
3-340
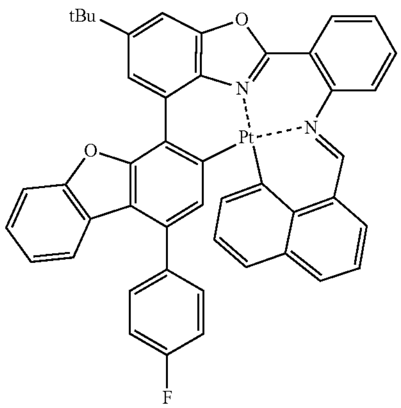
3-341
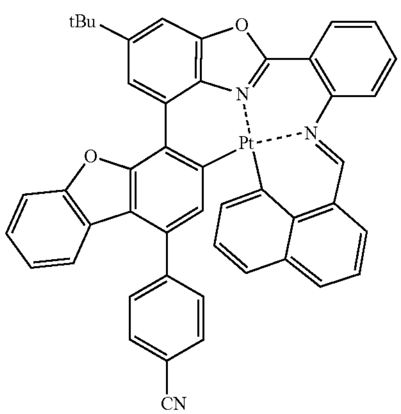
3-342
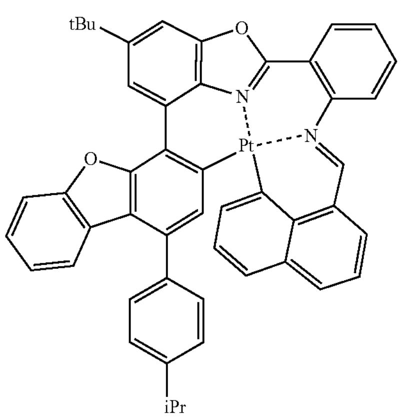
3-343
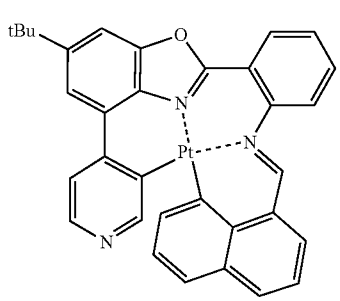
-continued
3-344
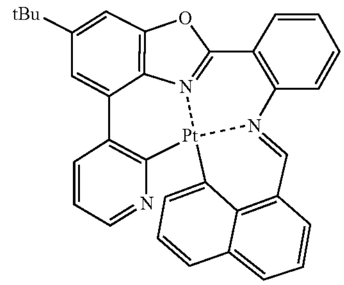
3-345
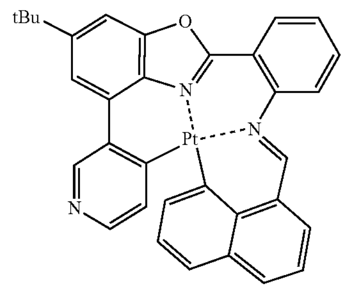
3-346
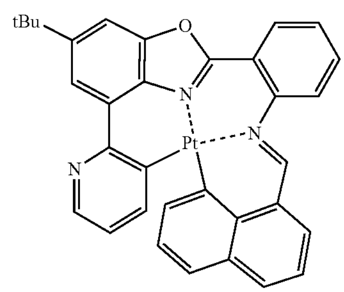
3-347
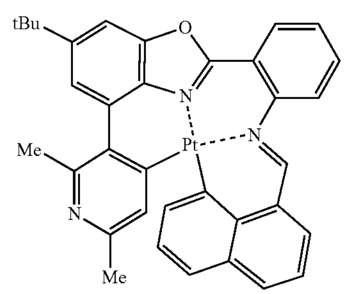
3-348
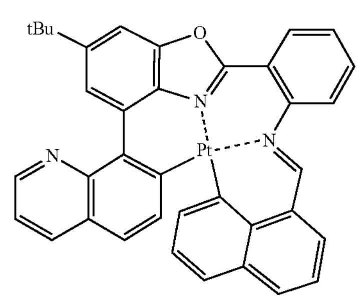

3-349
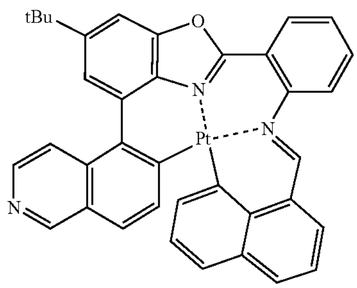
3-350
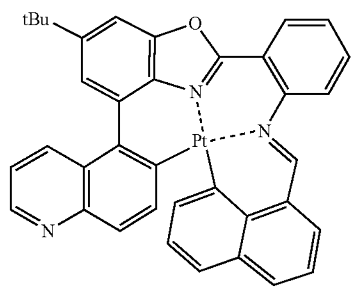
3-351
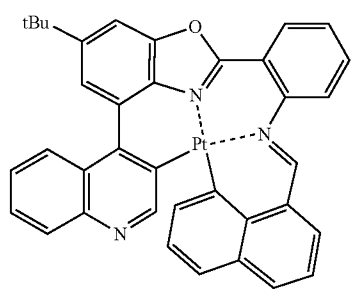
3-352
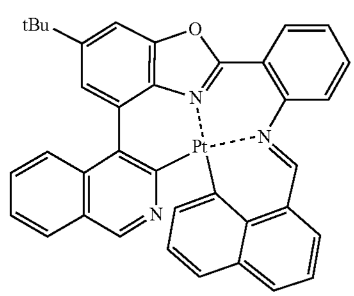
3-353
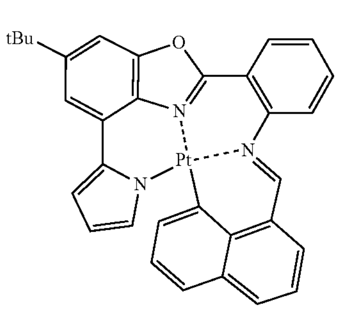
3-354
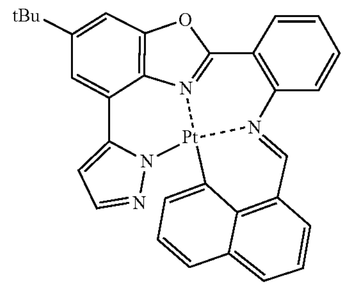
3-355
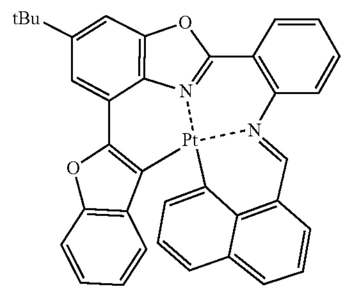
3-356
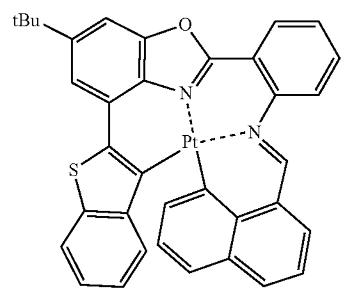
3-357
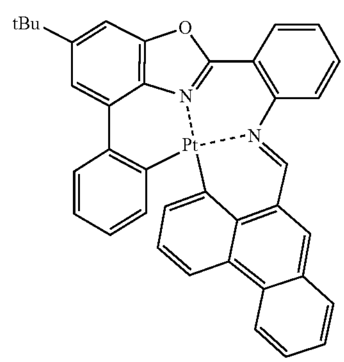
3-358
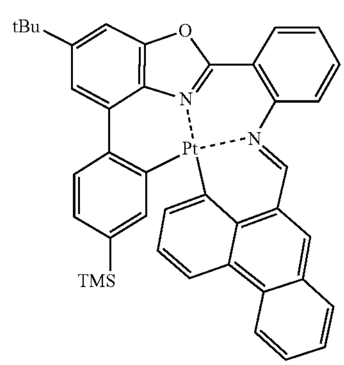

-continued
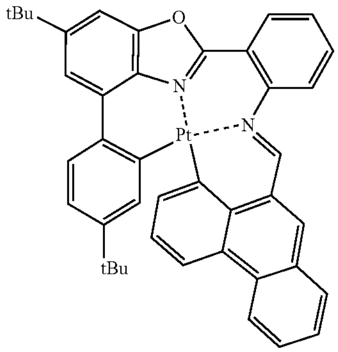
3-359
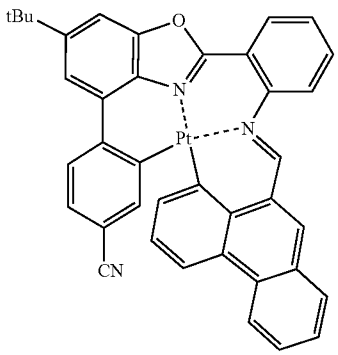
3-360
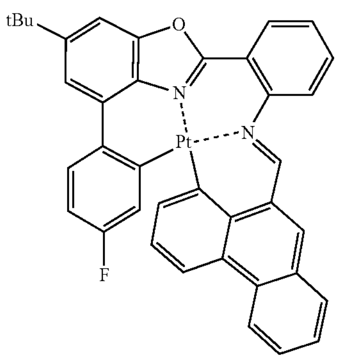
3-361
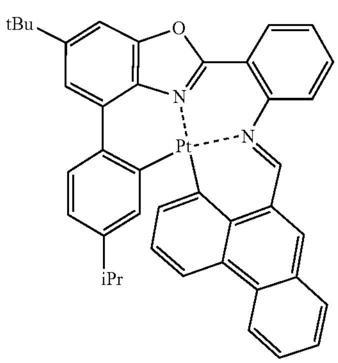
3-362
-continued
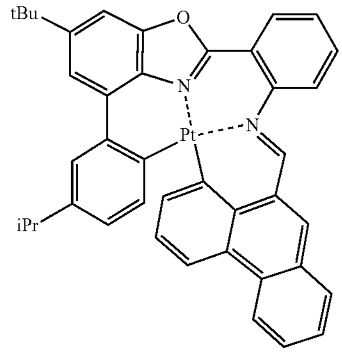
3-363
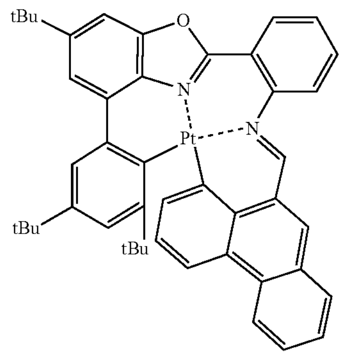
3-364
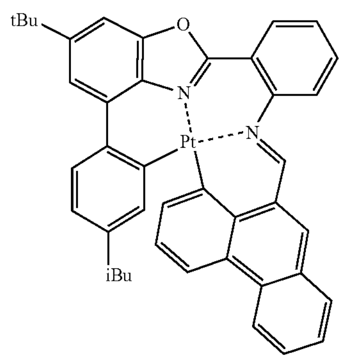
3-365
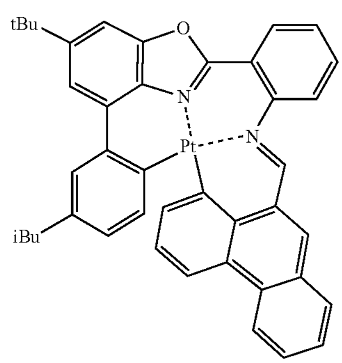
3-366

-continued
3-367
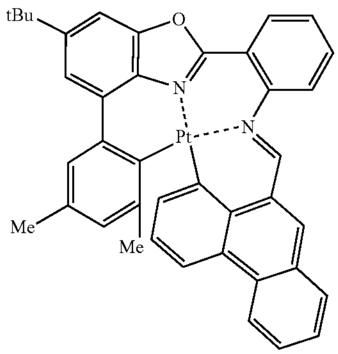
3-368
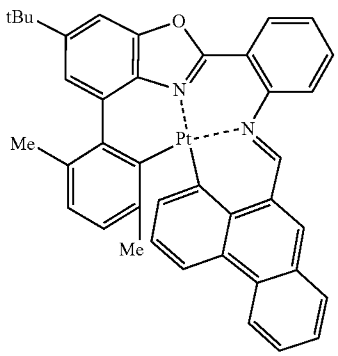
3-369
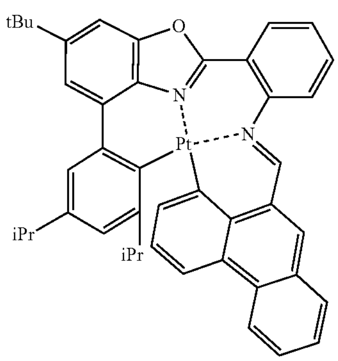
3-370
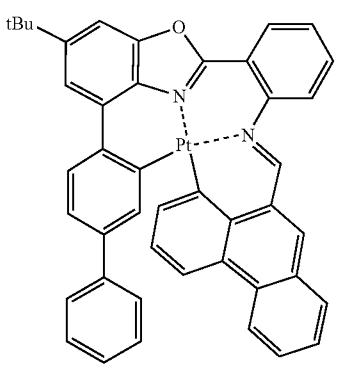
-continued
3-371
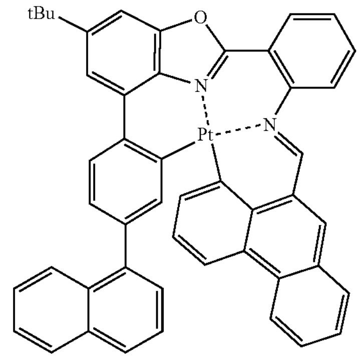
3-372
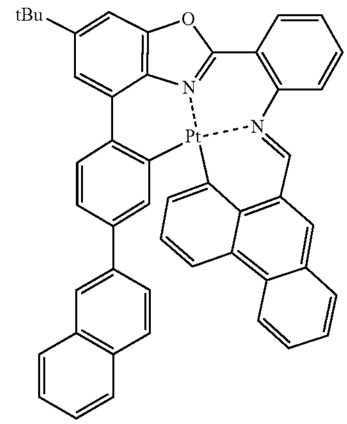
3-373
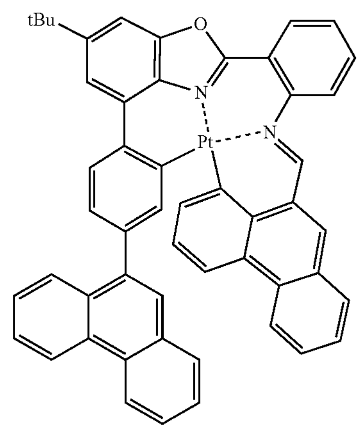
3-374
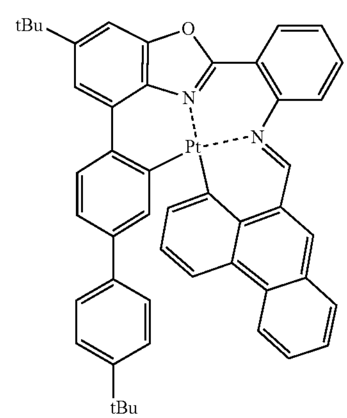

-continued
3-375
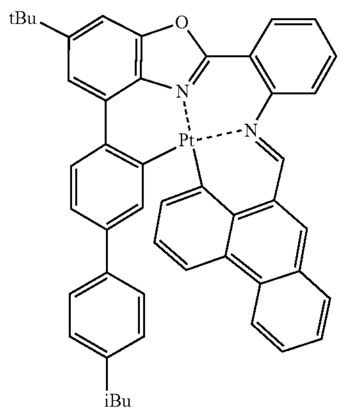
3-376
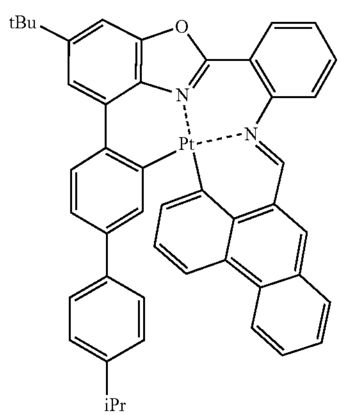
3-377
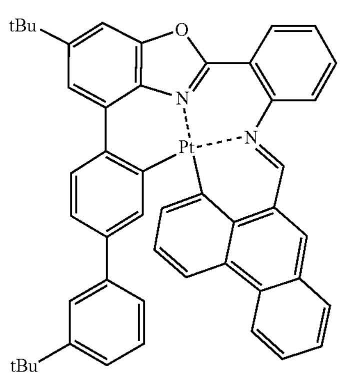
3-378
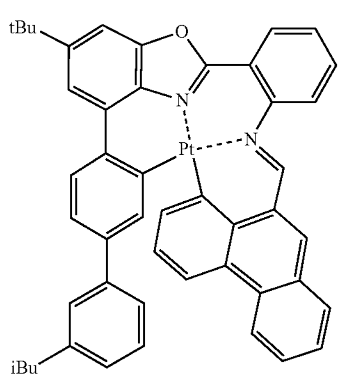
-continued
3-379
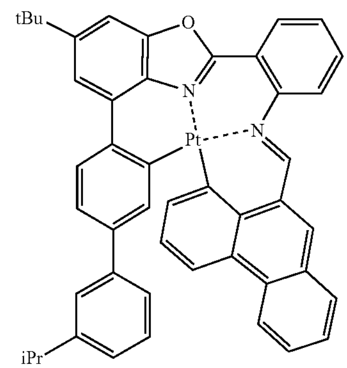
3-380
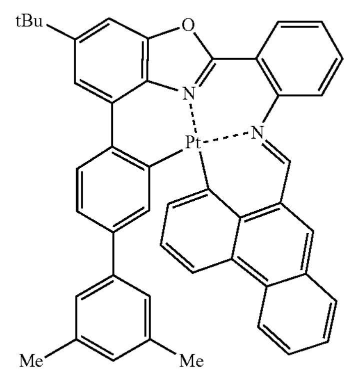
3-381
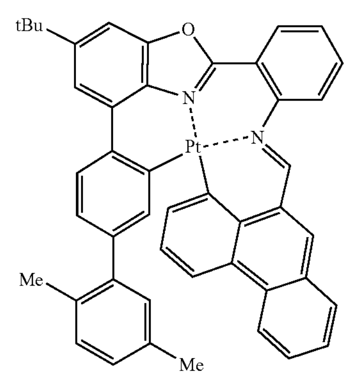
3-382
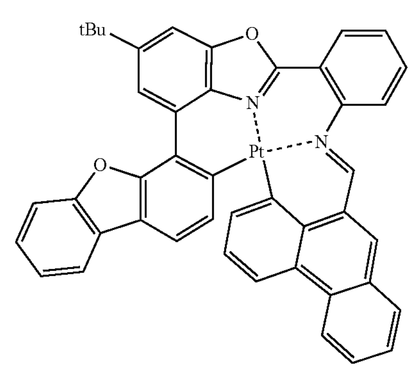

3-383
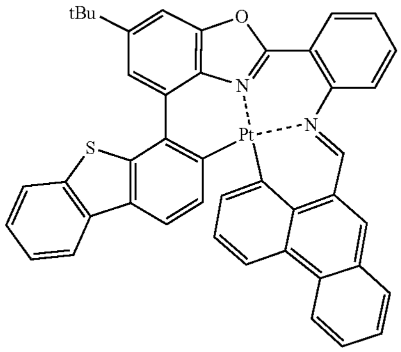
3-384
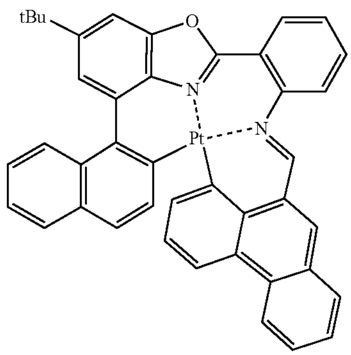
3-385
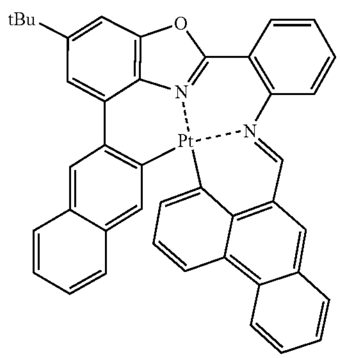
3-386
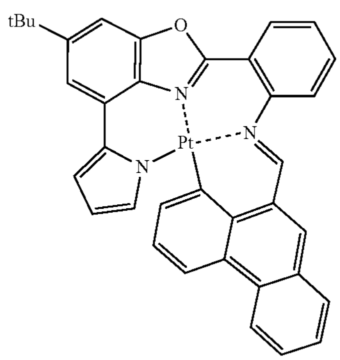
3-387
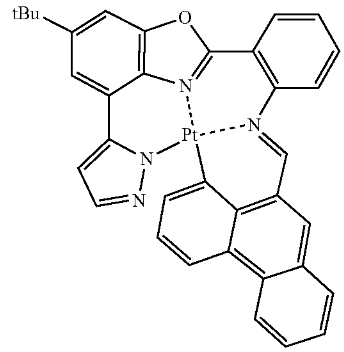
3-388
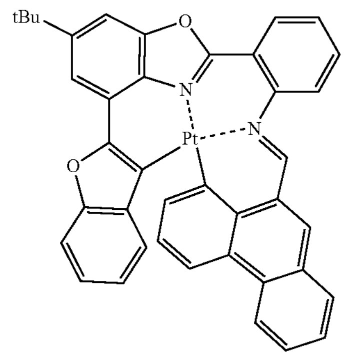
3-389
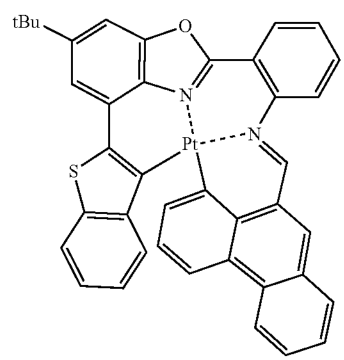
3-390
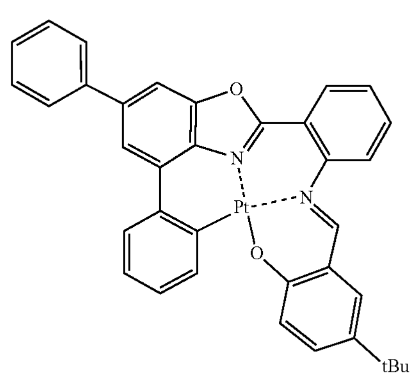

-continued
3-391
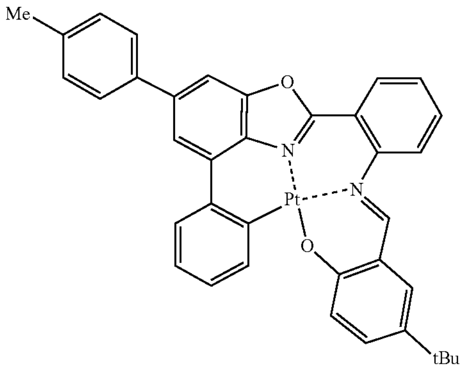
3-392
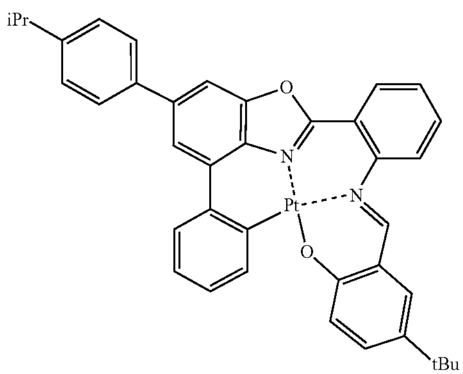
3-393
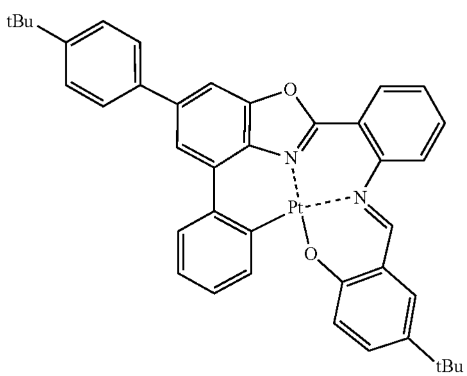
3-394
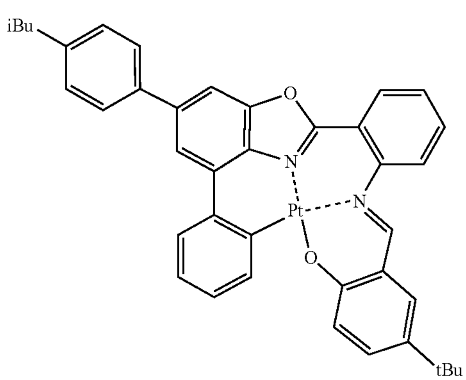
-continued
3-395
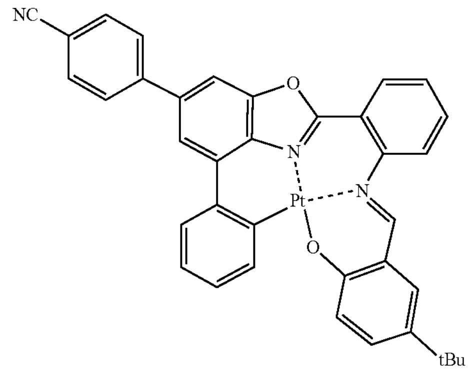
3-396
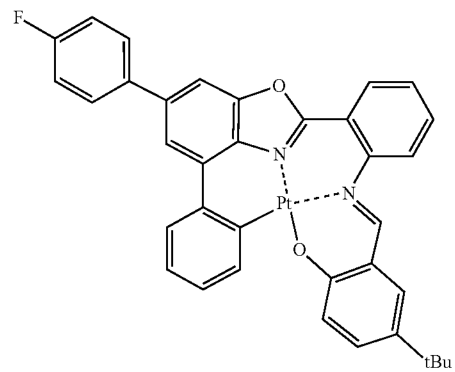
3-397
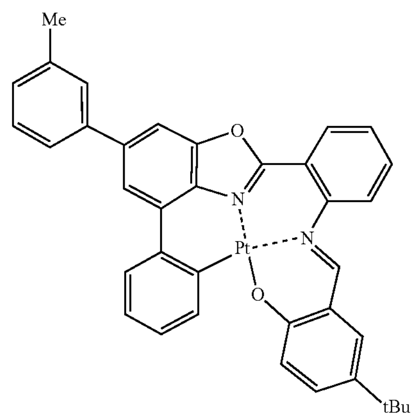
3-398
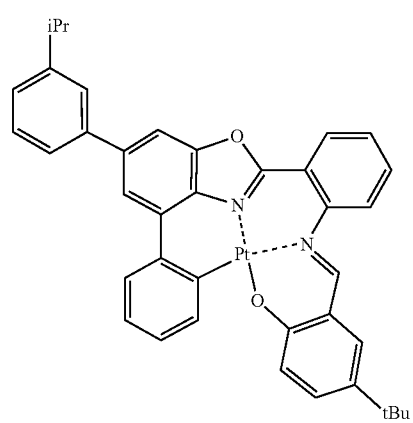

-continued
3-399
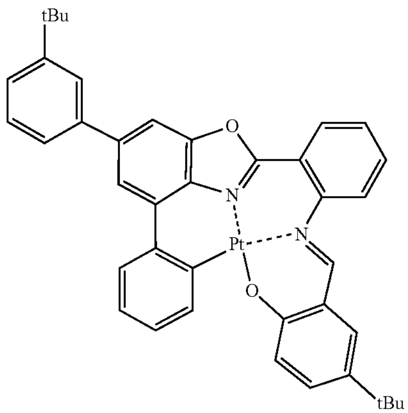
3-400
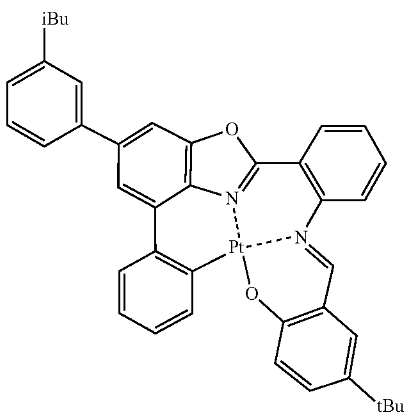
3-401
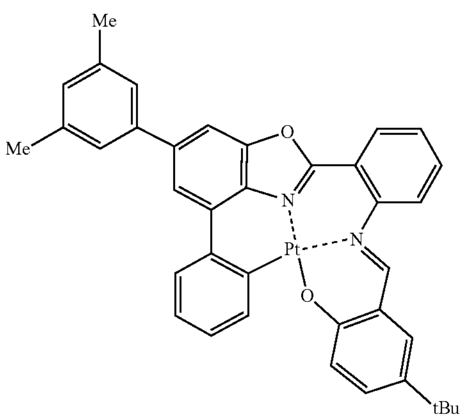
3-402
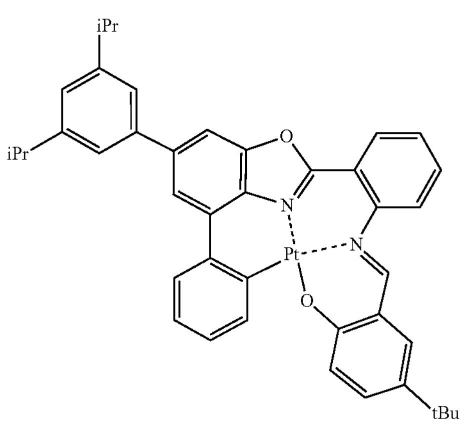
-continued
3-403
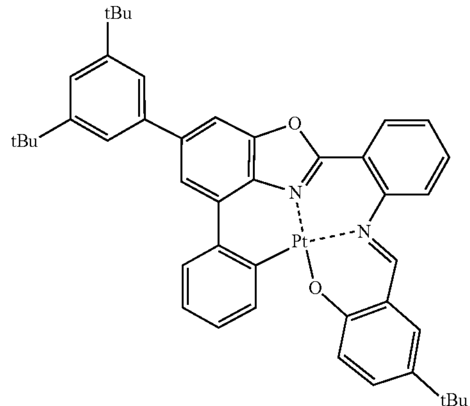
3-404
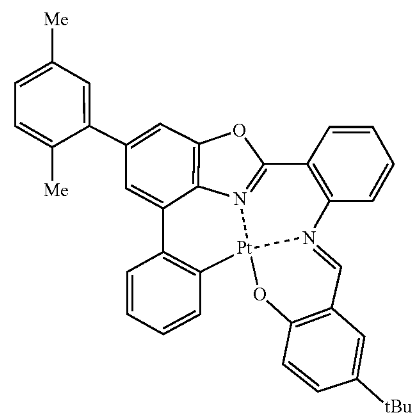
3-405
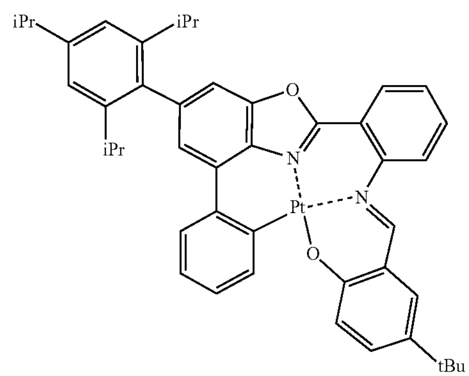
3-406
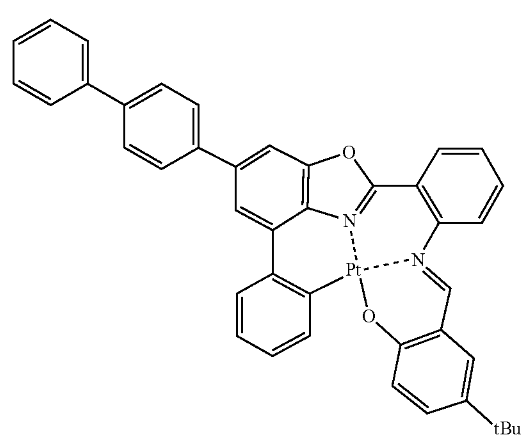

-continued
3-407
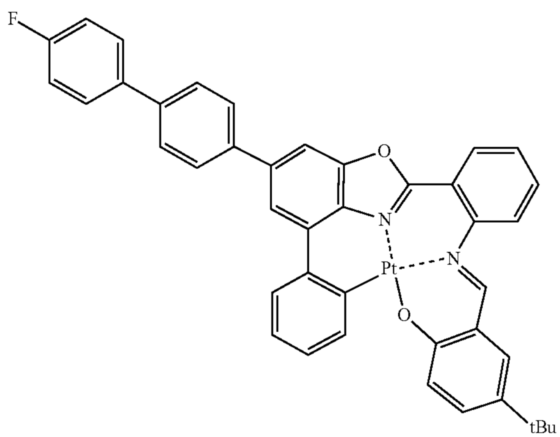
3-408
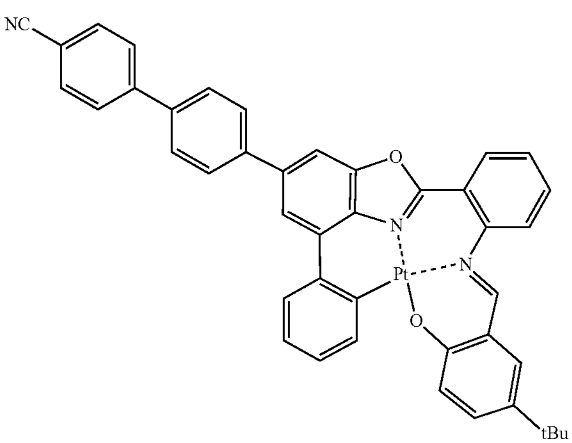
3-409
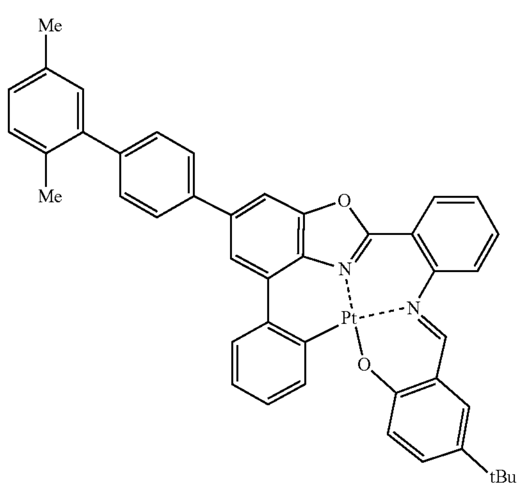
-continued
3-410
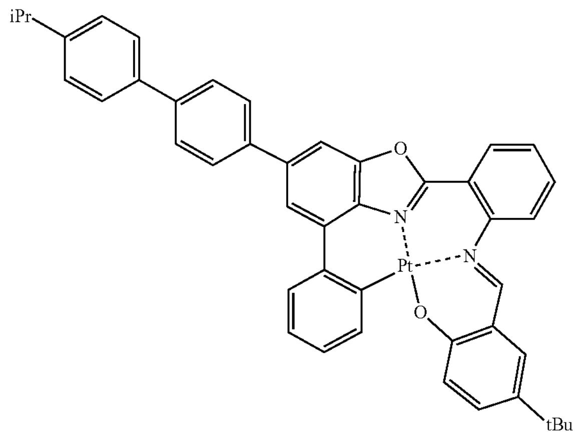
3-411
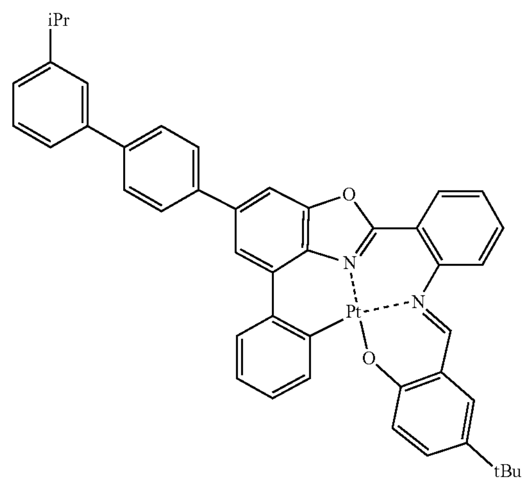
3-412
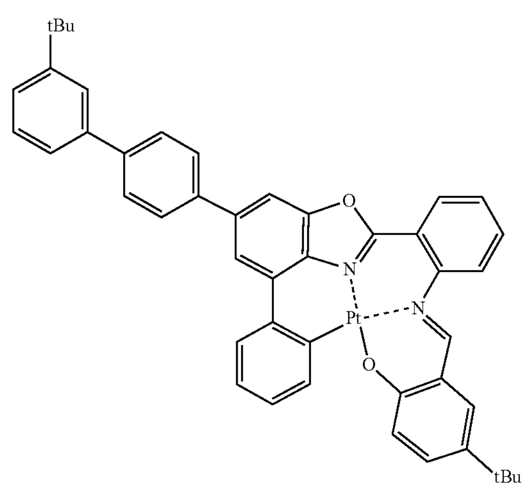

3-413
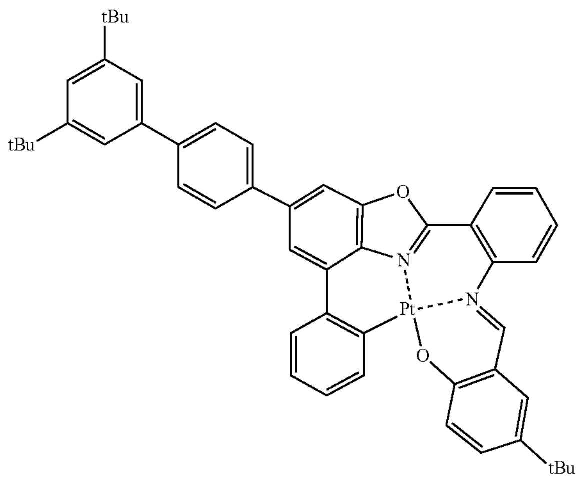
3-414
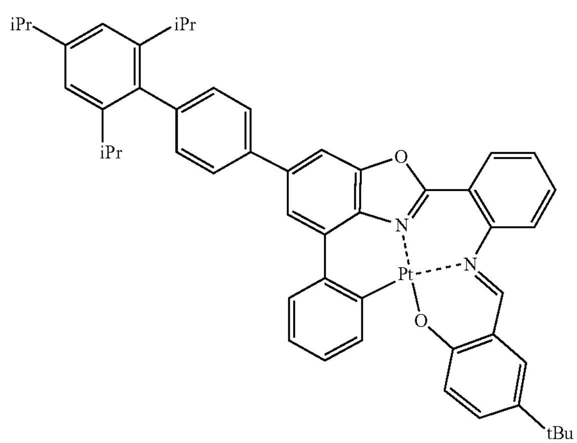
3-415
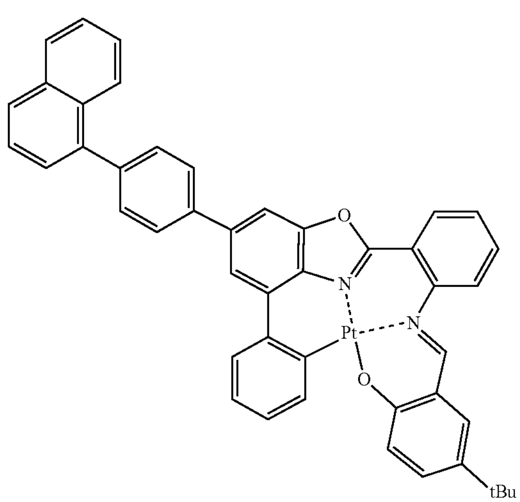
3-416
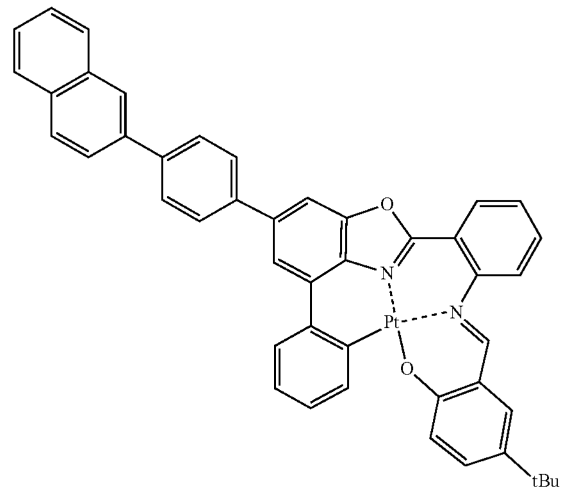
3-417
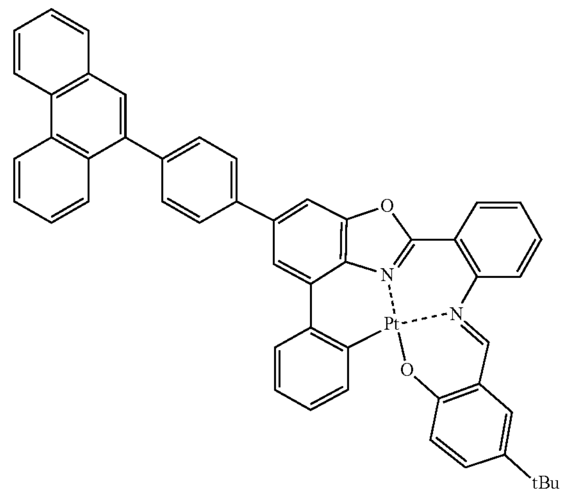
3-418
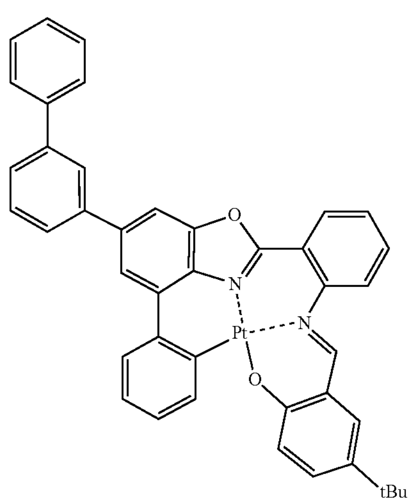

-continued
3-419
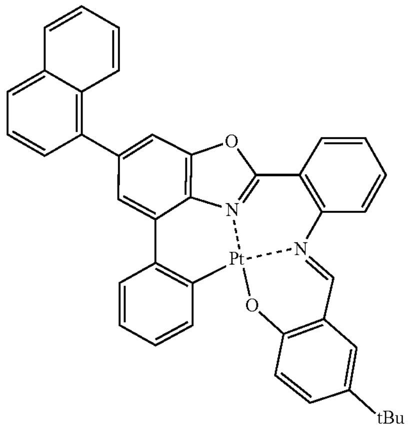
3-420
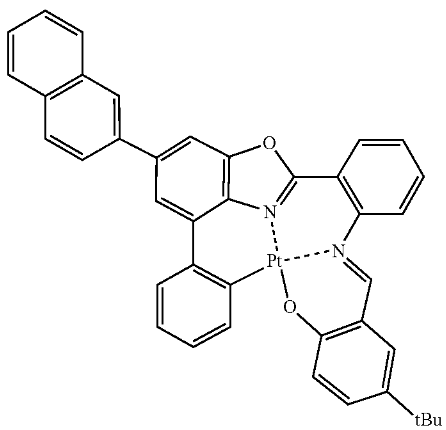
3-421
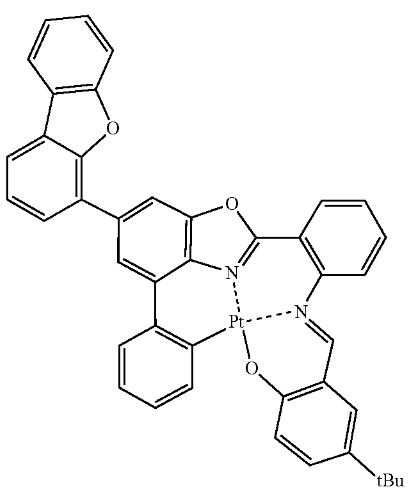
-continued
3-422
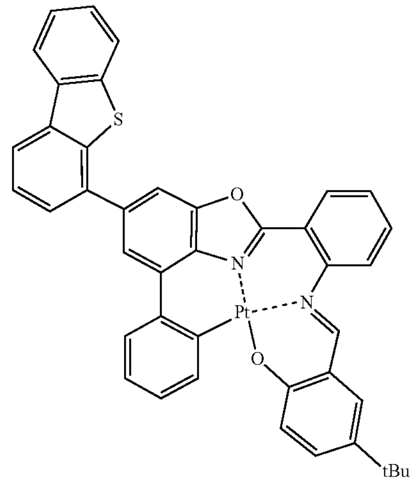
3-423
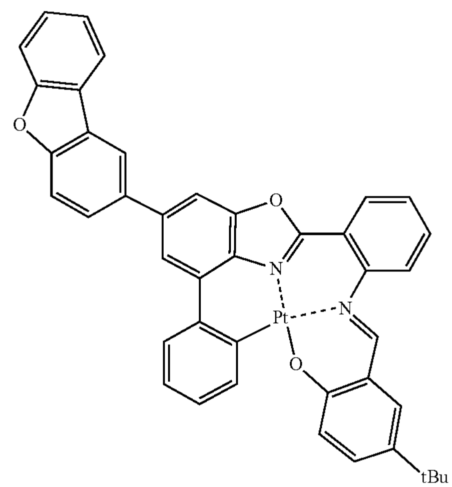
3-424
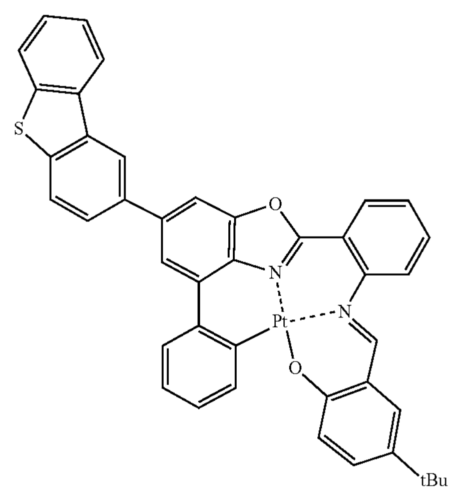

3-425
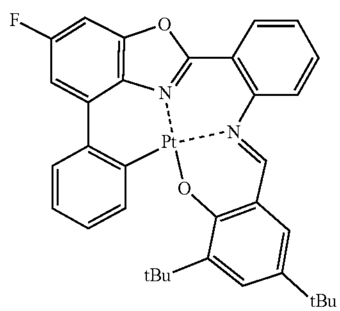
3-426
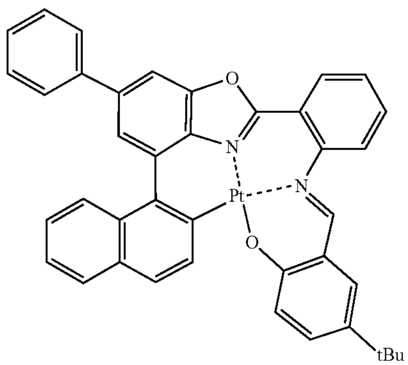
3-427
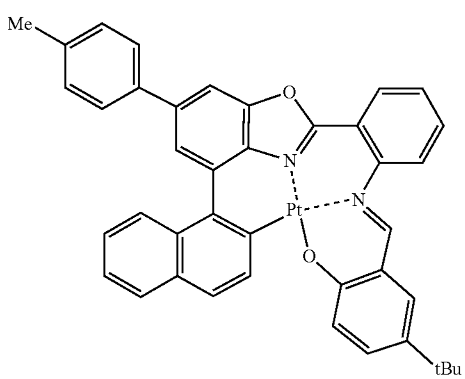
3-428
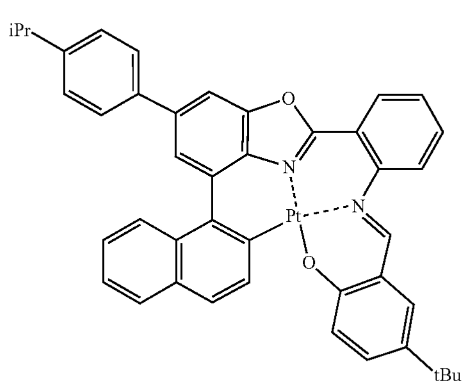
3-429
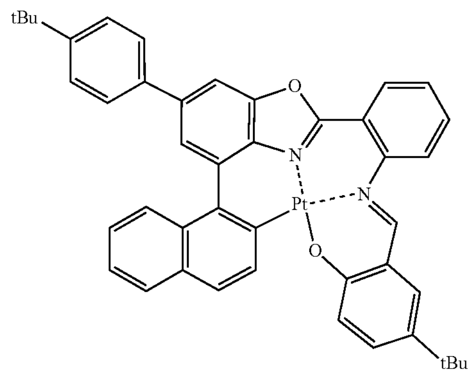
3-430
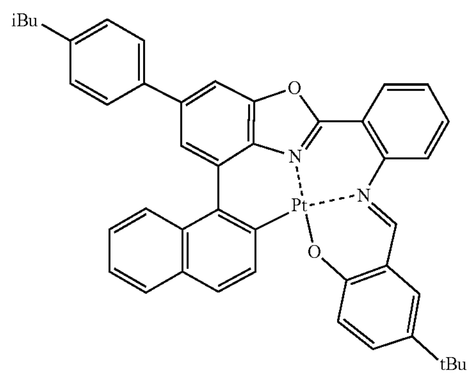
3-431
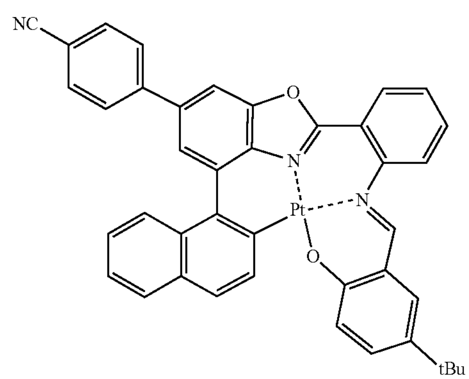
3-432
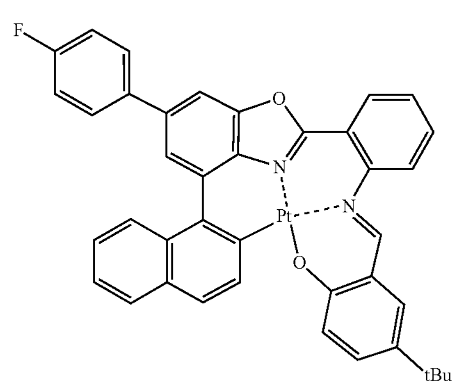

-continued
3-433
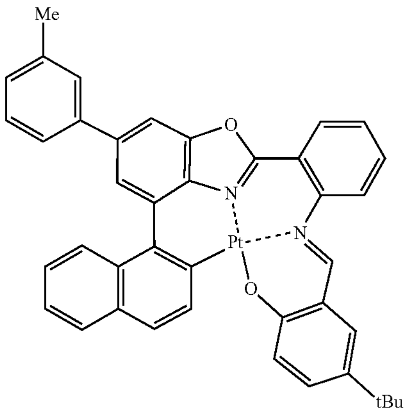
3-434
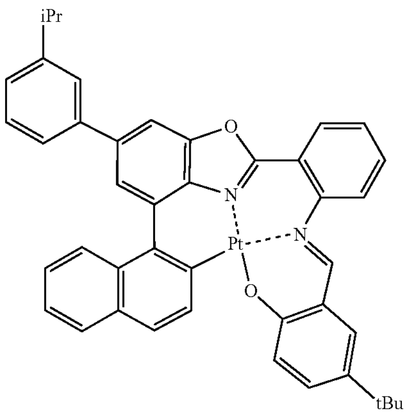
3-435
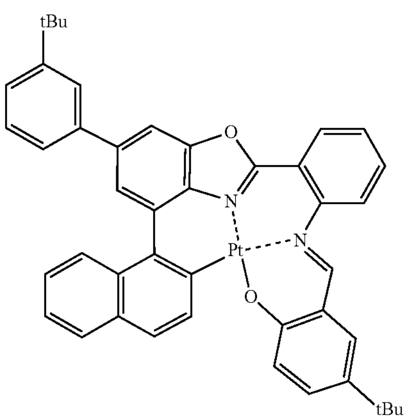
3-436
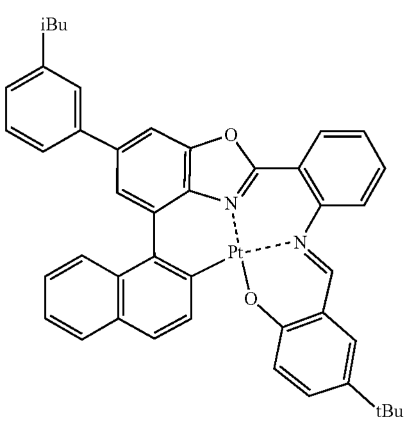
-continued
3-437
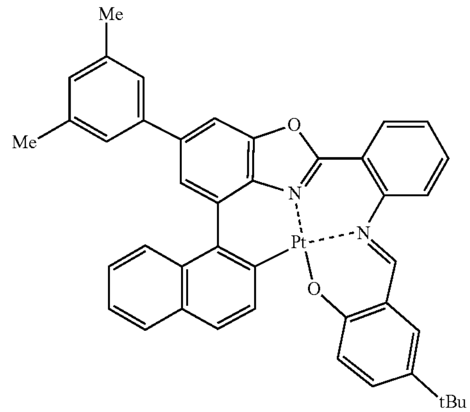
3-438
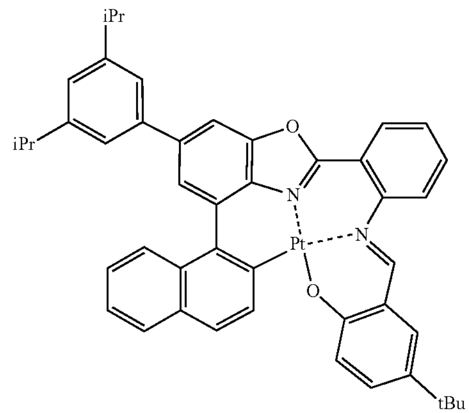
3-439
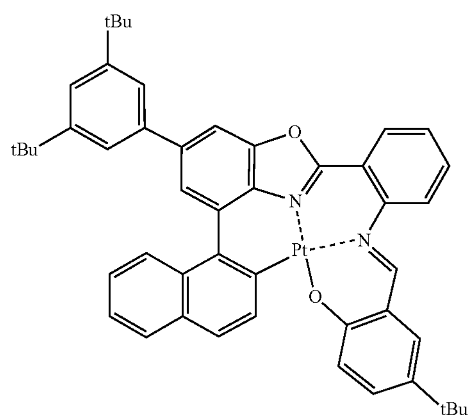
3-440
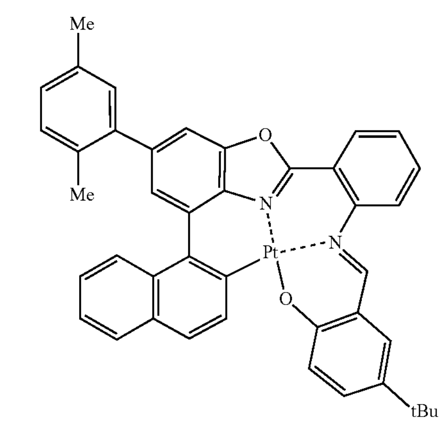

-continued
3-441
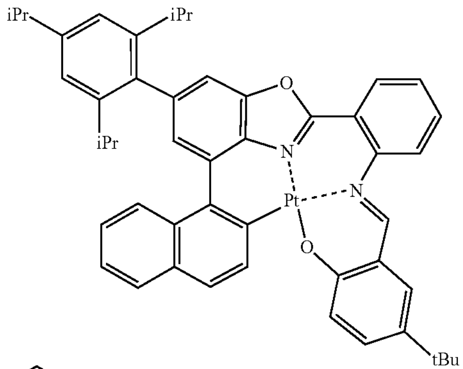
3-442
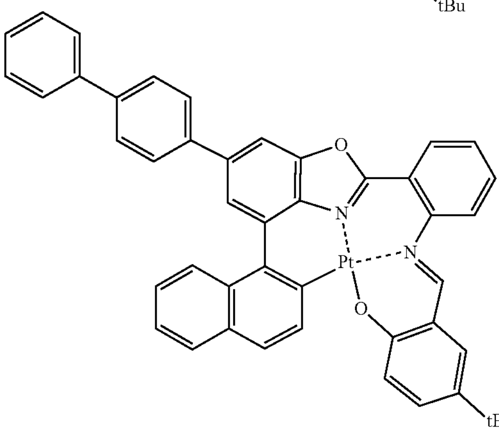
3-443
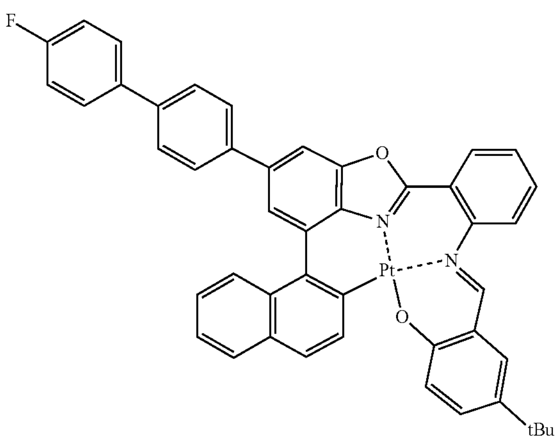
3-444
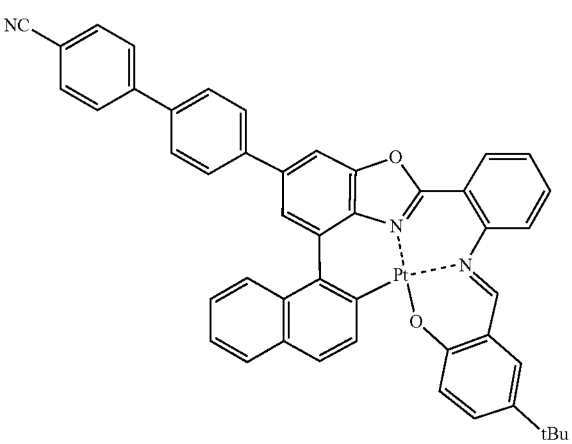
-continued
3-445
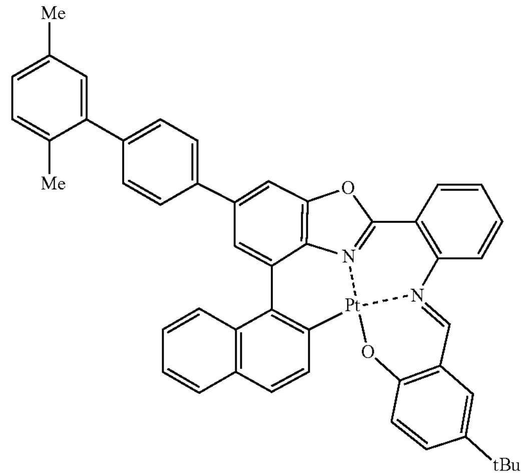
3-446
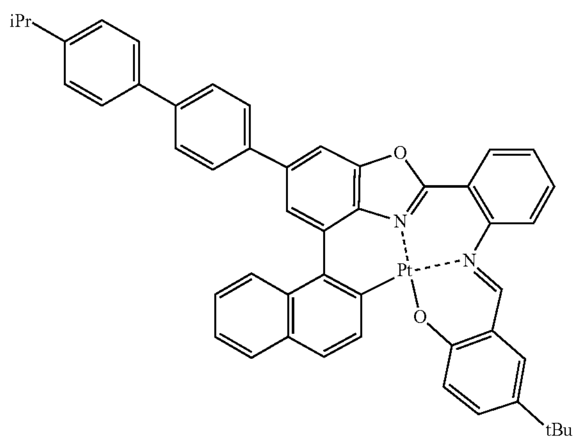
3-447
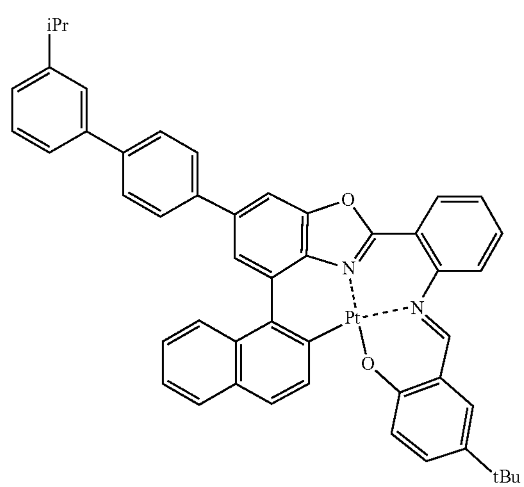

-continued
3-448
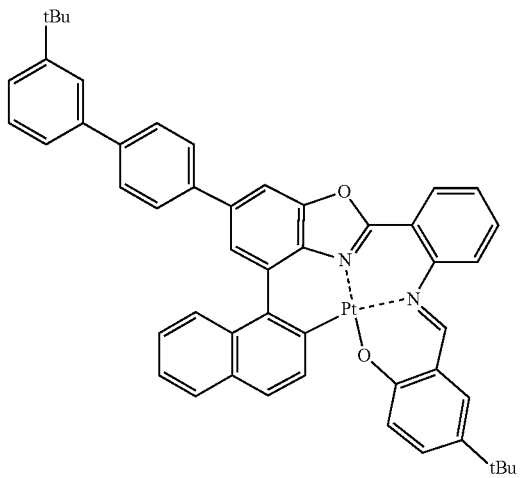
3-449
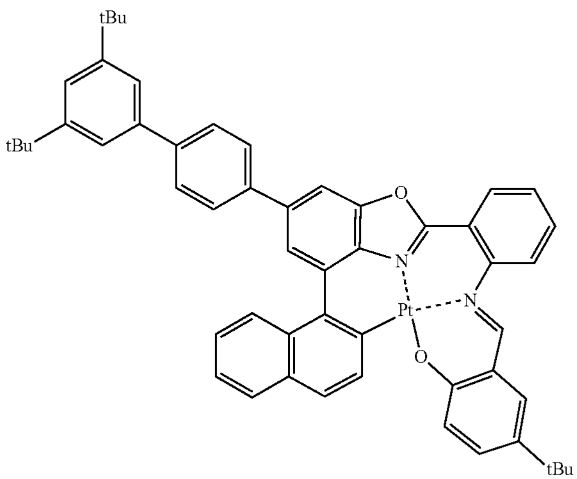
3-450
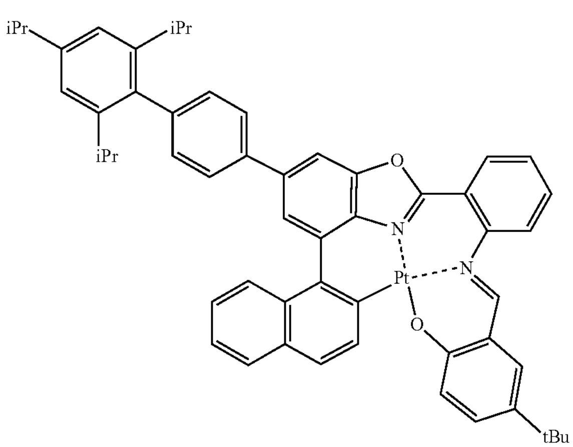
-continued
3-451
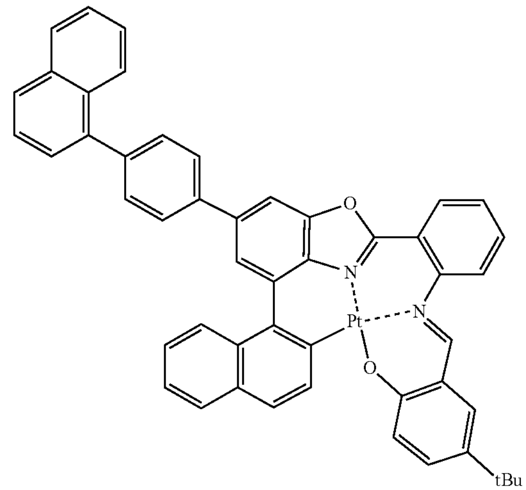
3-452
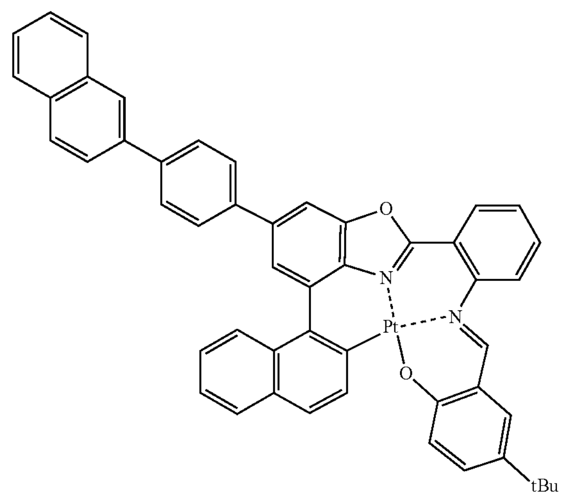
3-453
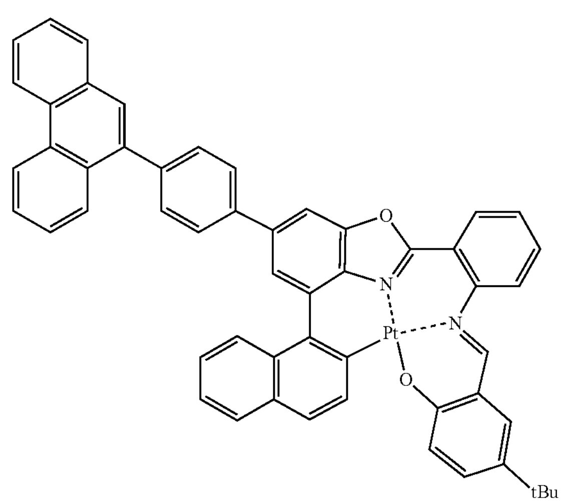

-continued
3-454
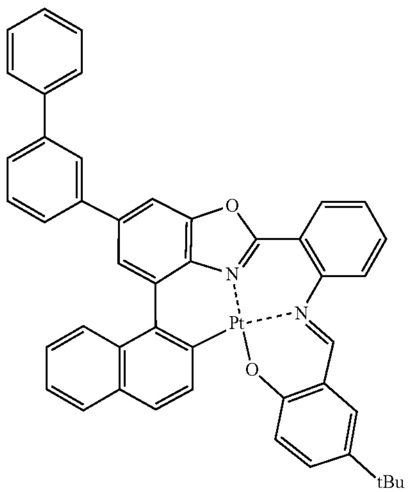
3-455
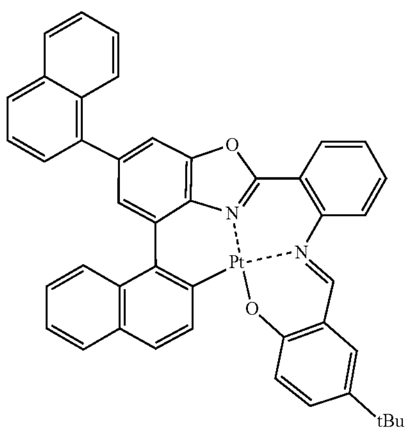
3-456
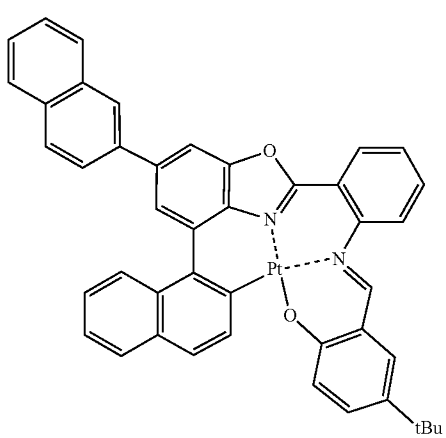
-continued
3-457
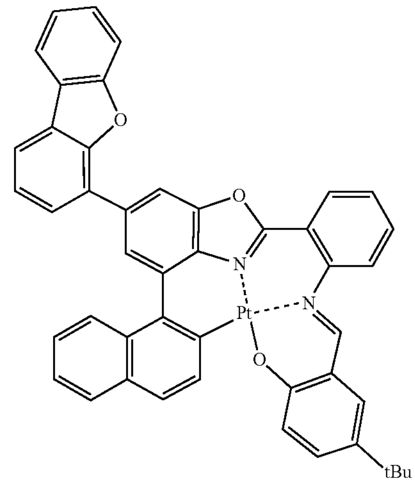
3-458
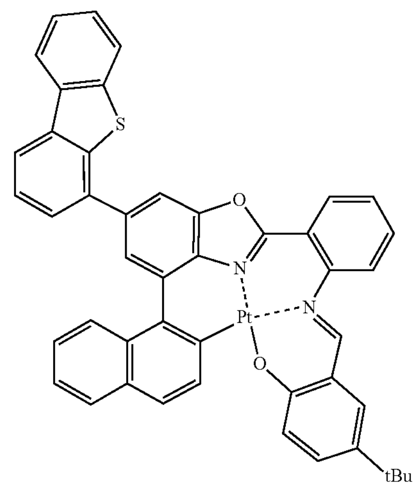
3-459
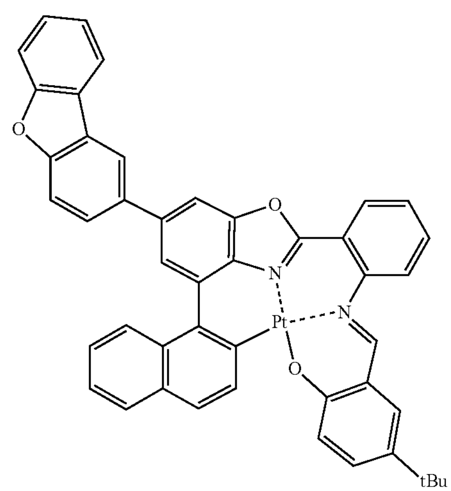

3-460
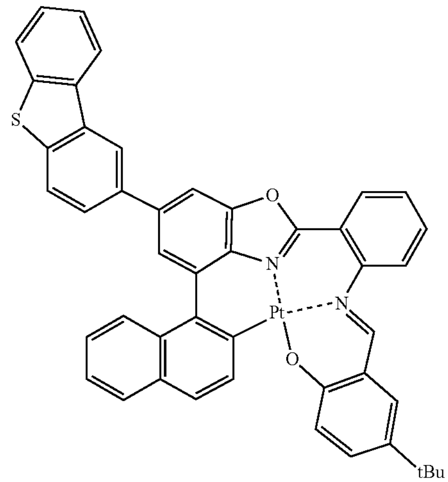
3-461
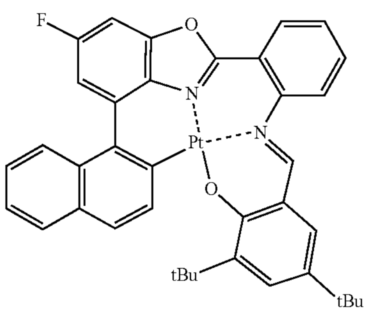
3-462
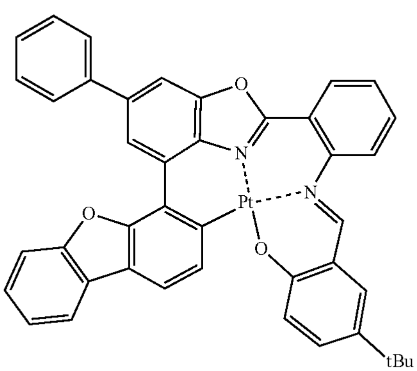
3-463
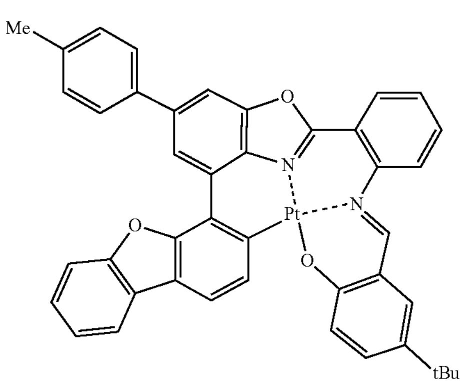
3-464
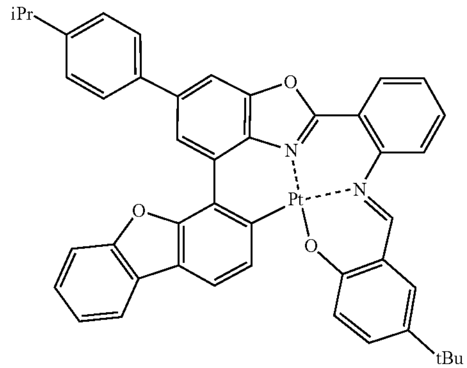
3-465
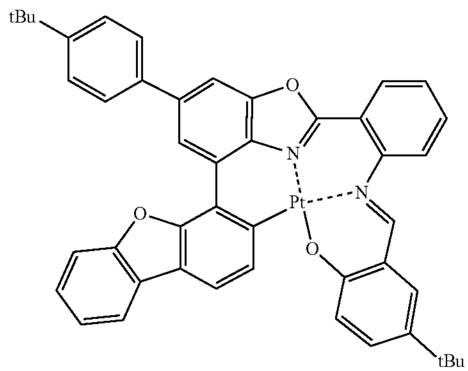
3-466
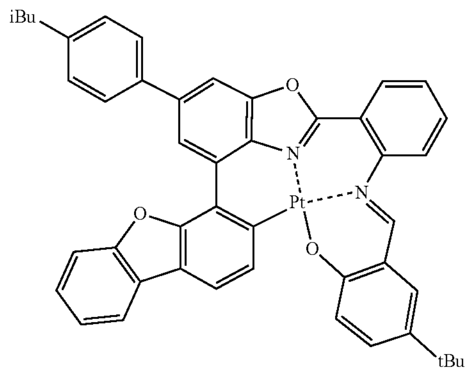
3-467
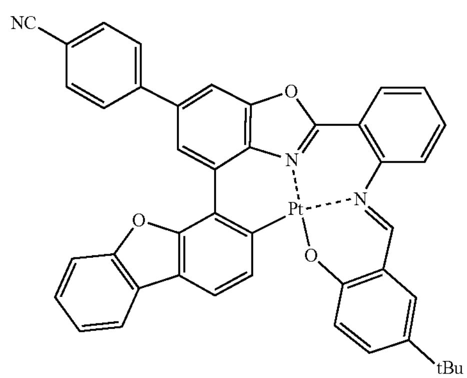

3-468
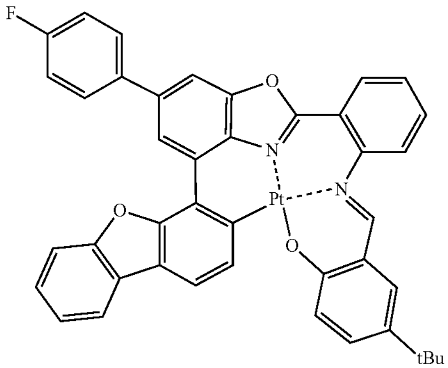
3-469
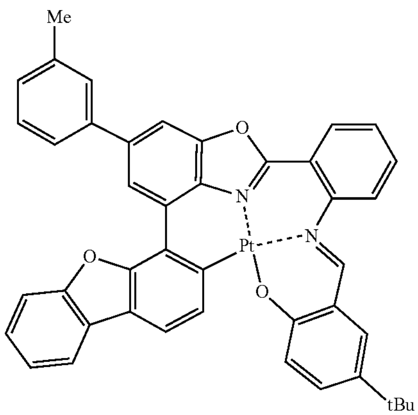
3-470
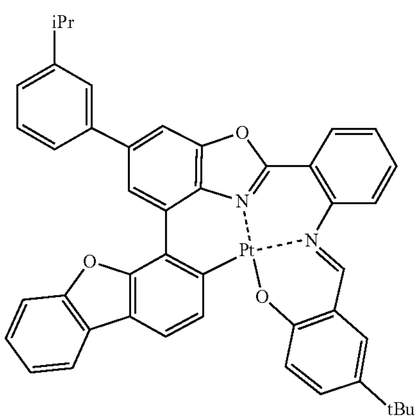
3-471
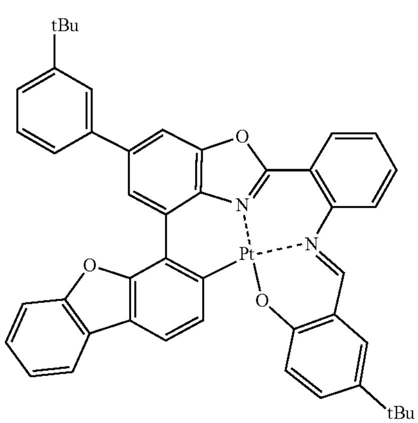
3-472
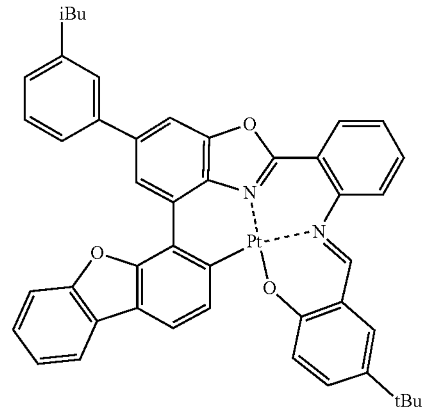
3-473
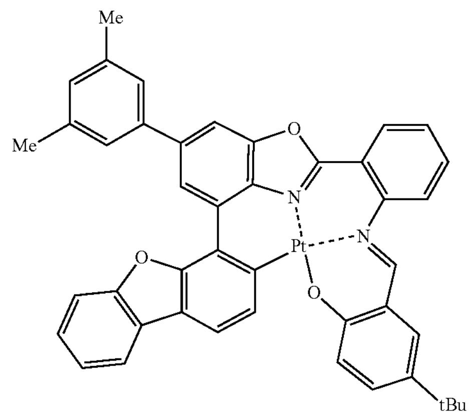
3-474
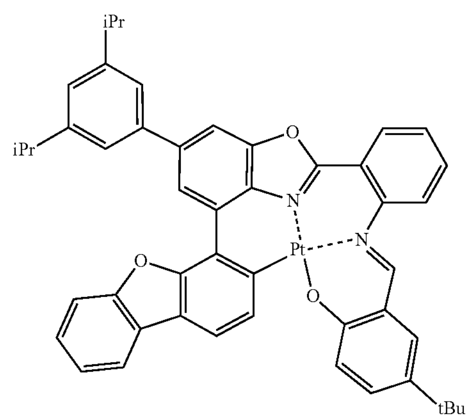
3-475
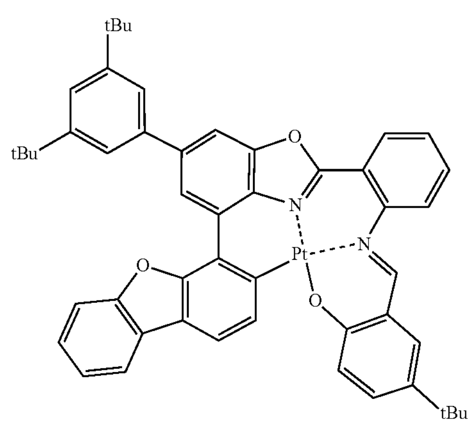

-continued
3-476
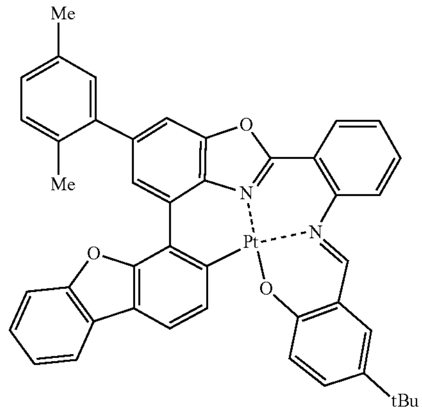
3-477
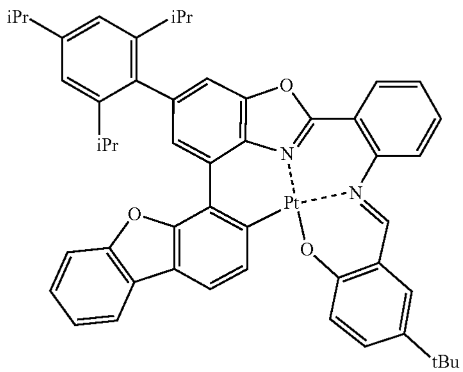
3-478
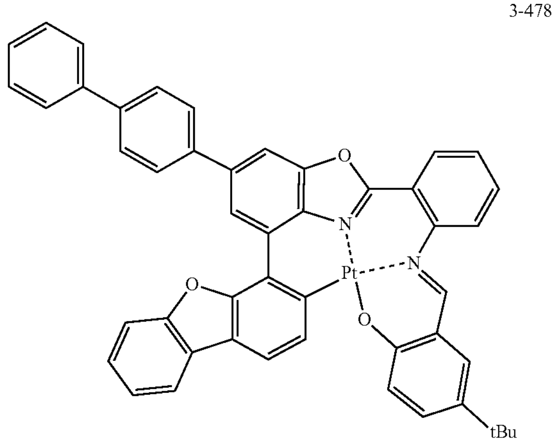
3-479
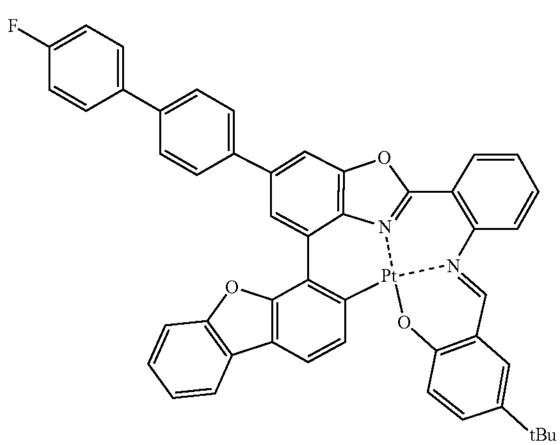
-continued
3-480
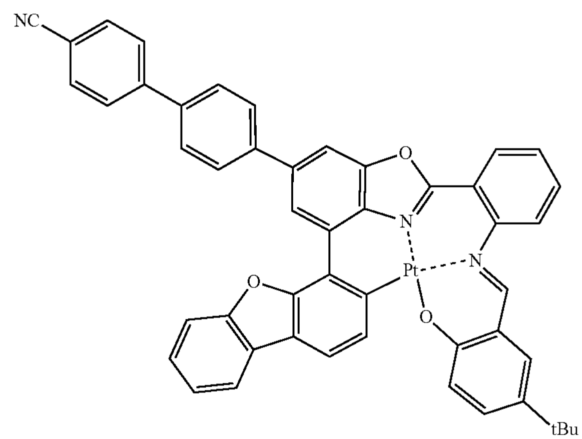
3-481
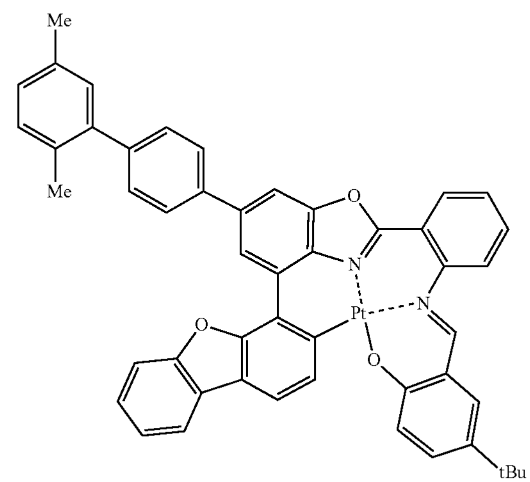
3-482
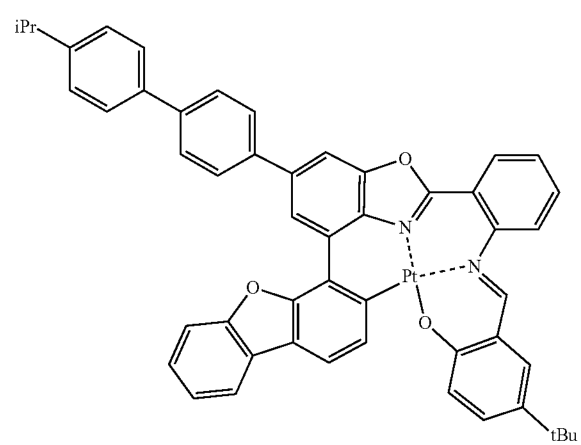

3-483
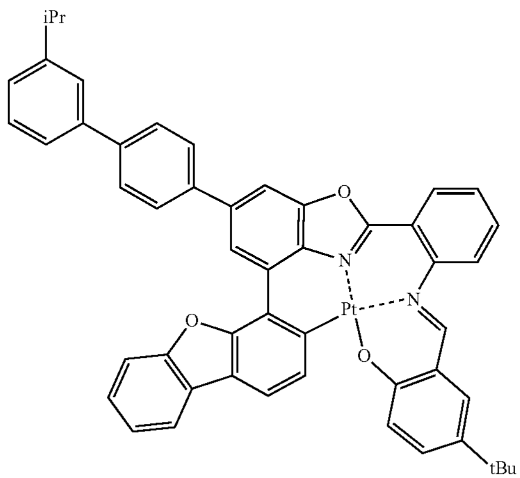
3-484
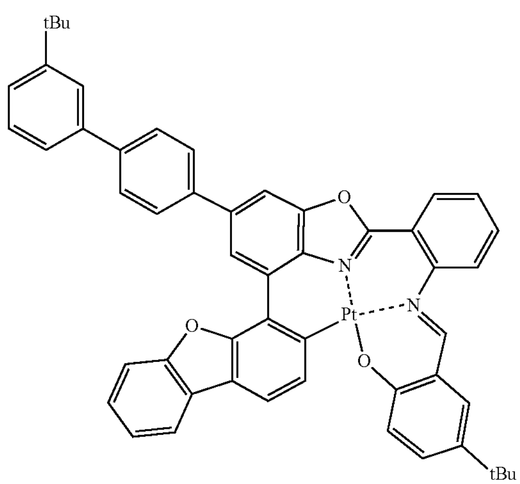
3-485
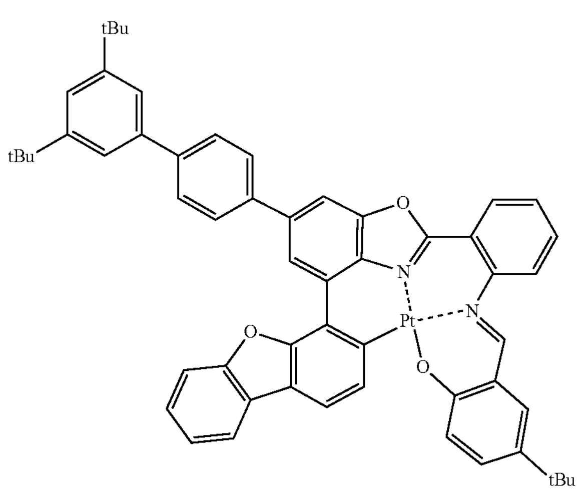
3-486
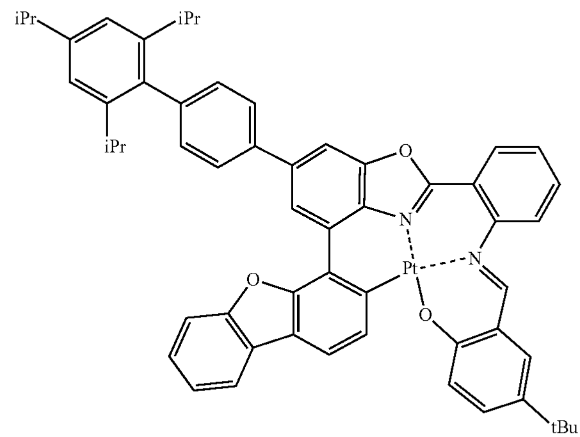
3-487
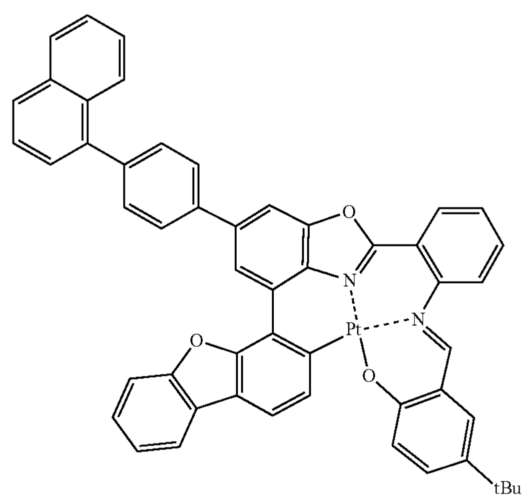
3-488
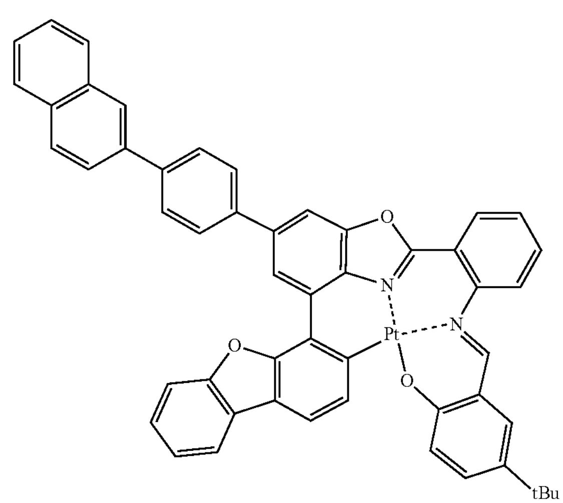

3-489
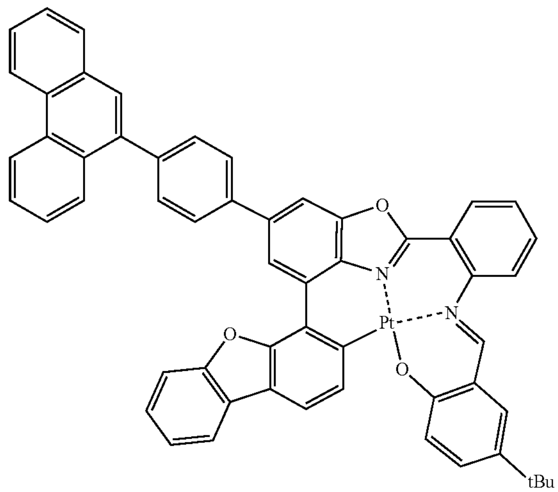
3-490
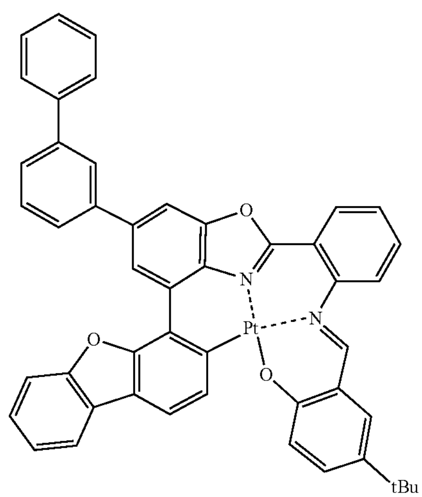
3-491
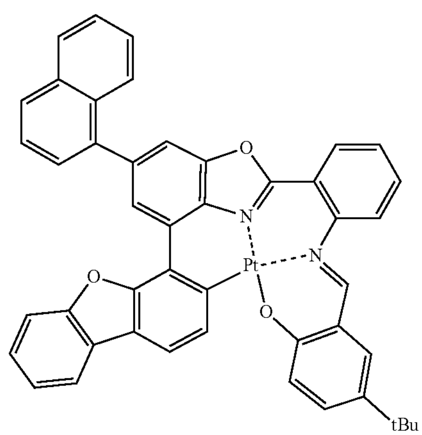
3-492
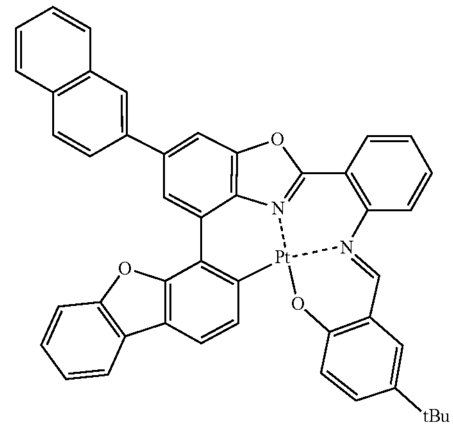
3-493
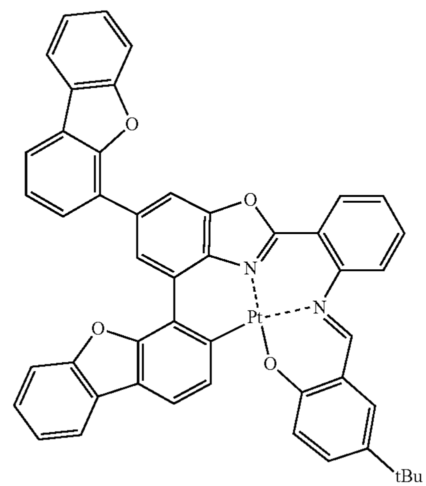
3-494
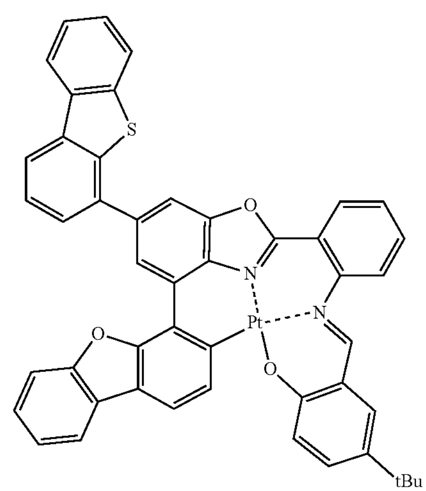

-continued
3-495
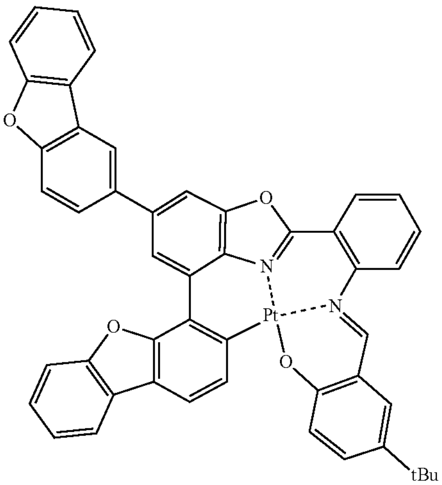
3-496
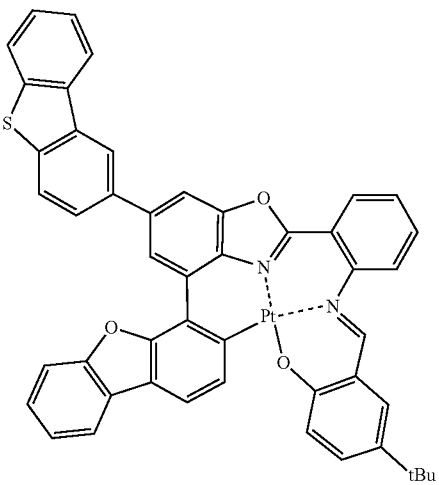
3-497
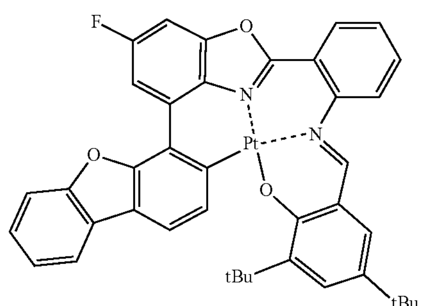
3-498
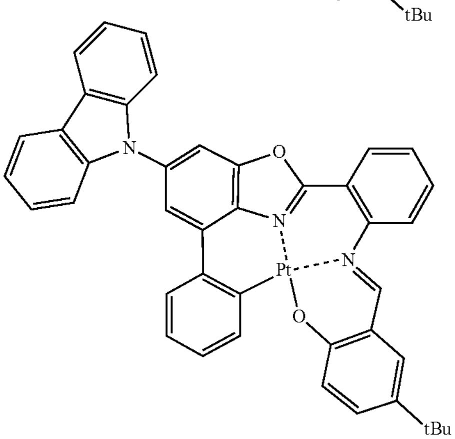
-continued
3-499
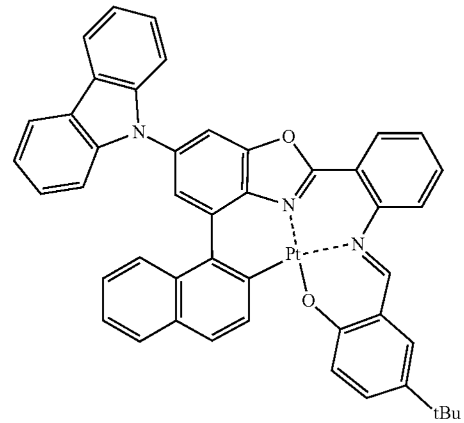
3-500
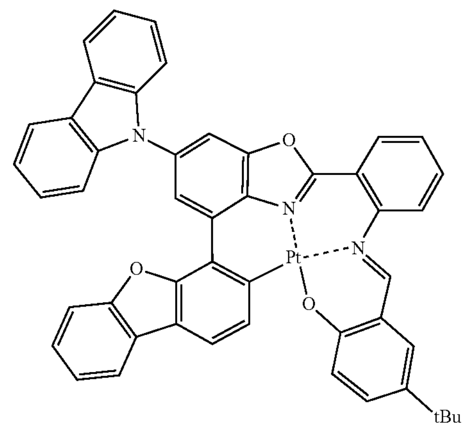
3-501
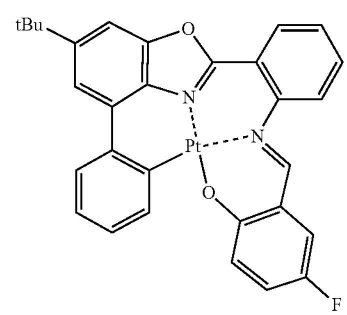
3-502
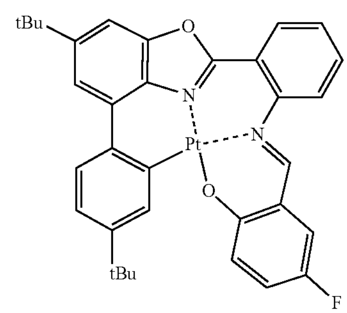

-continued
3-503
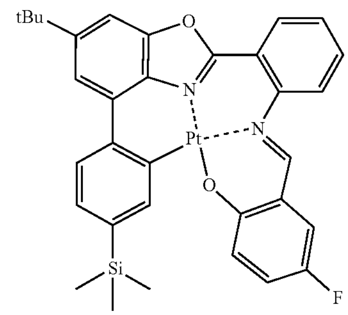
3-504
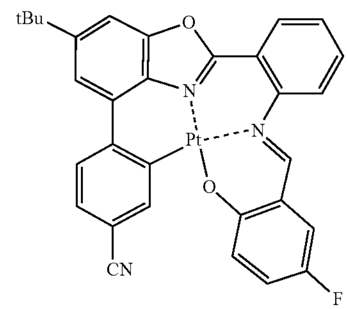
3-505
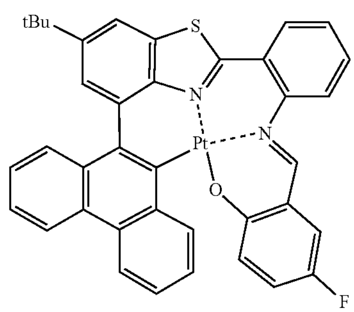
3-506
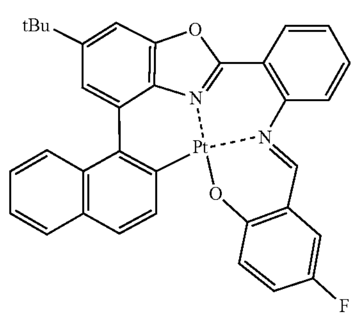
3-507
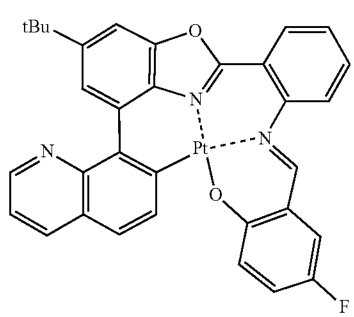
-continued
3-508
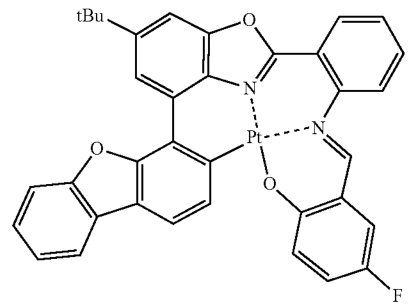
3-509
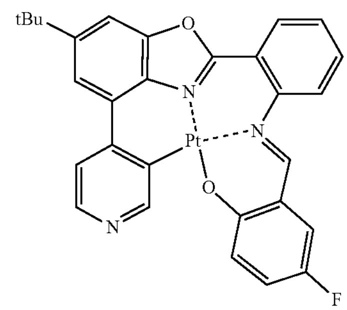
3-510
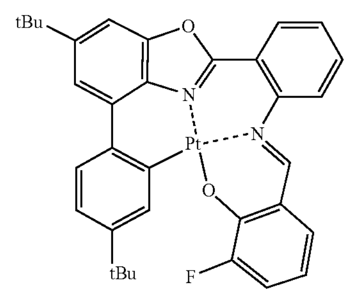
3-511
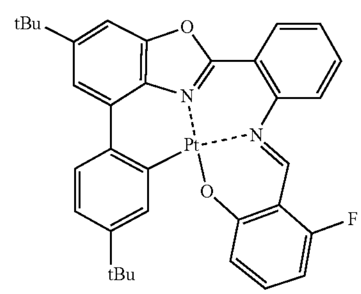
3-512
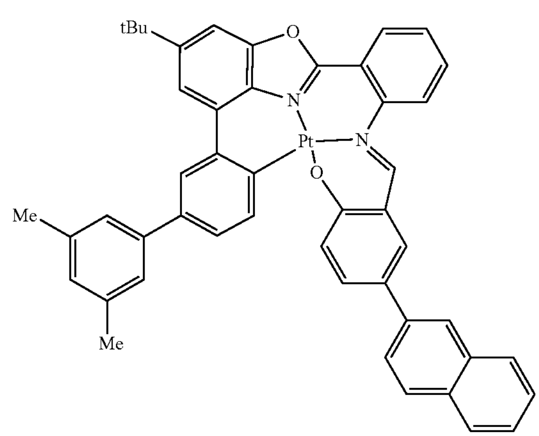

3-513
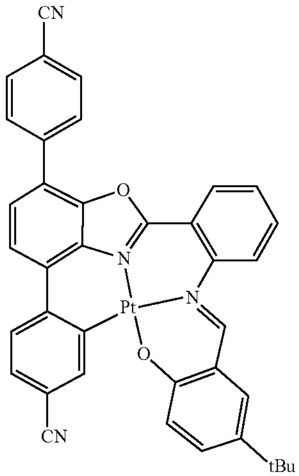
3-514
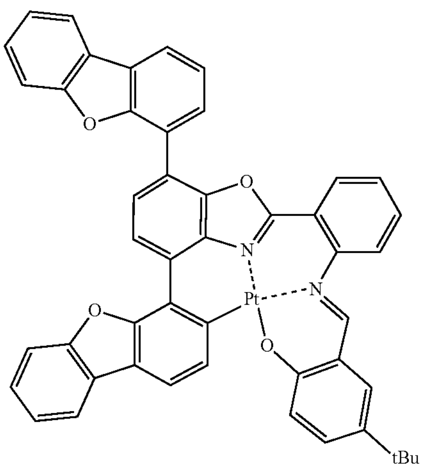
3-515
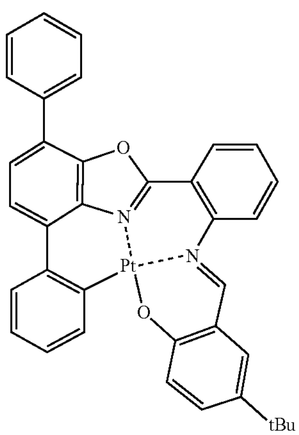
3-516
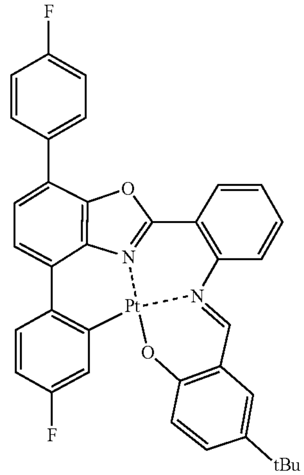
3-517
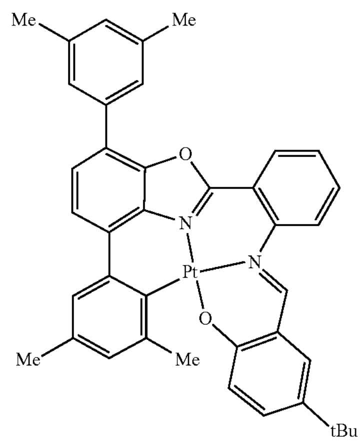
3-518
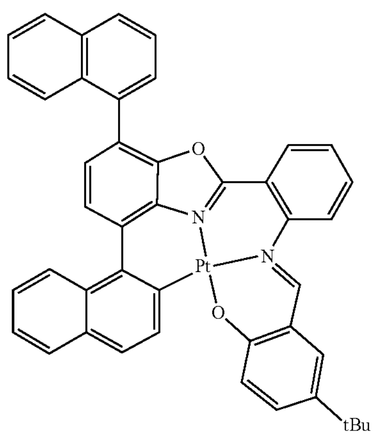

3-519
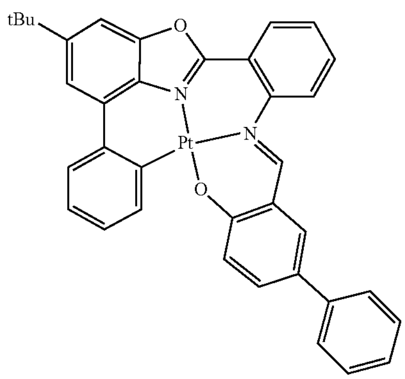
3-520
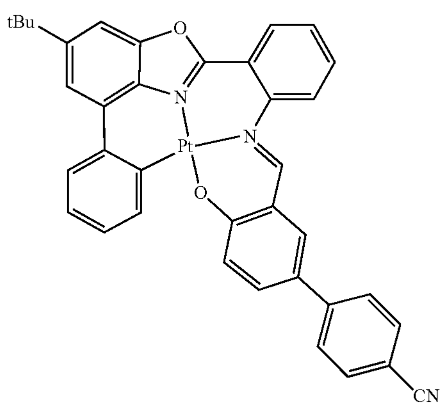
3-521
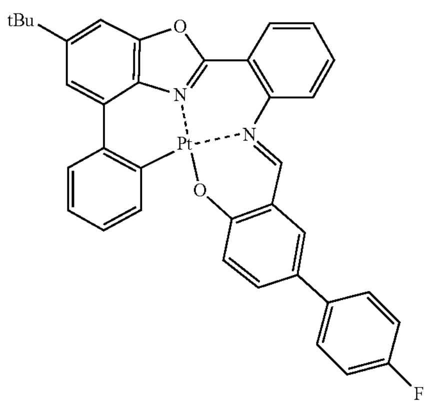
3-522
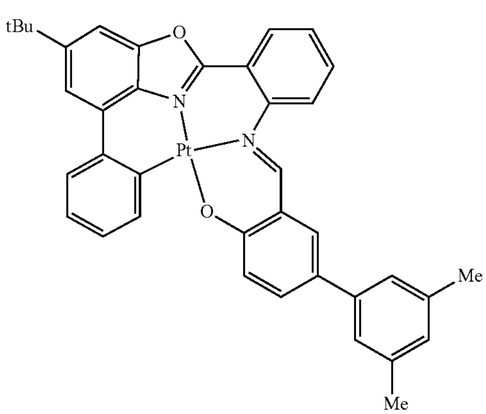
[Compound Group 4]
4-1
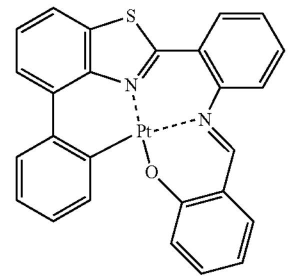
4-2
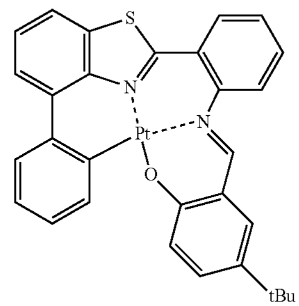
4-3
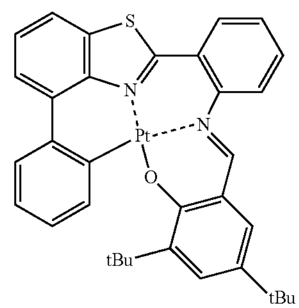
4-4
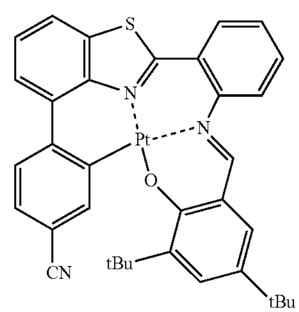
4-5
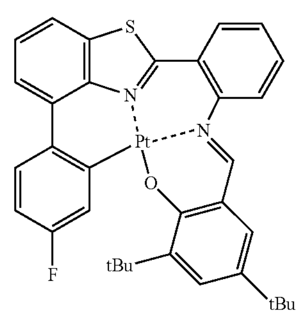

-continued
4-6
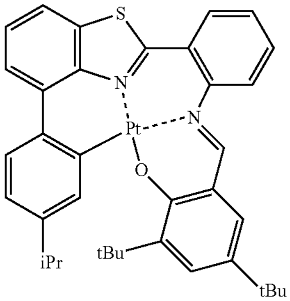
4-7
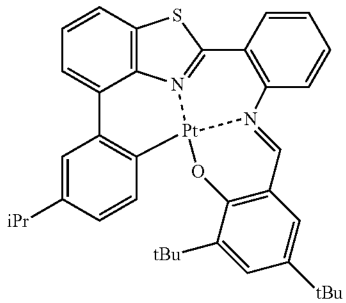
4-8
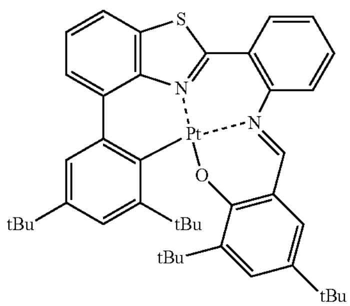
4-9
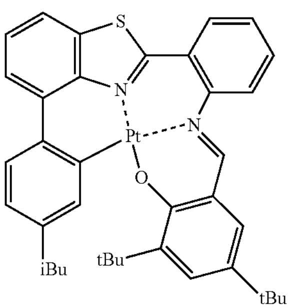
4-10
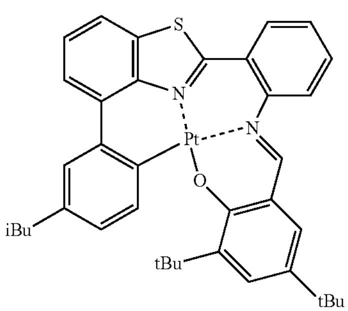
-continued
4-11
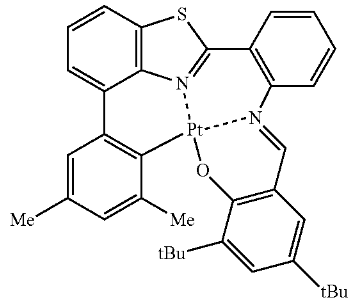
4-12
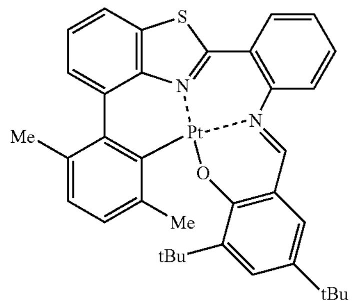
4-13
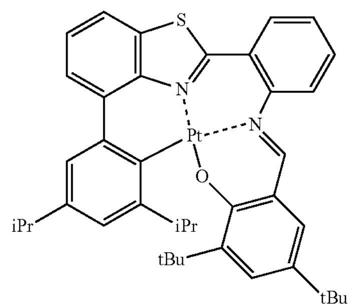
4-14
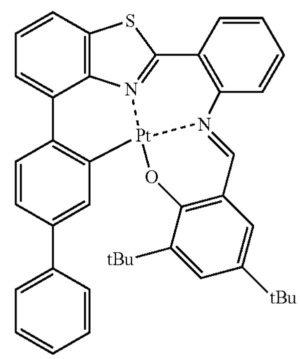
4-15
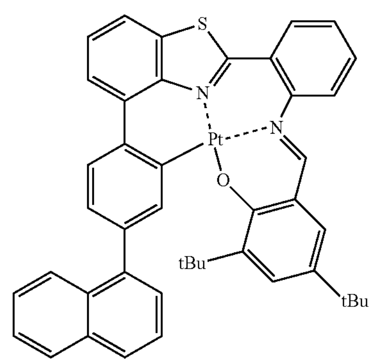

4-16
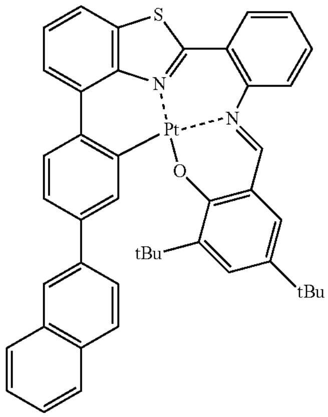
4-17
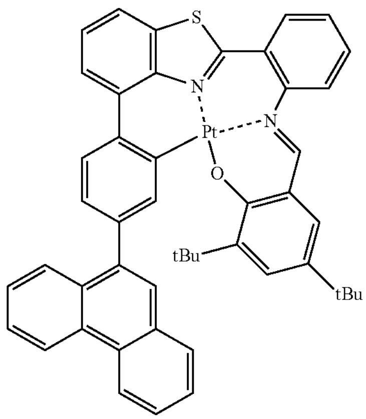
4-18
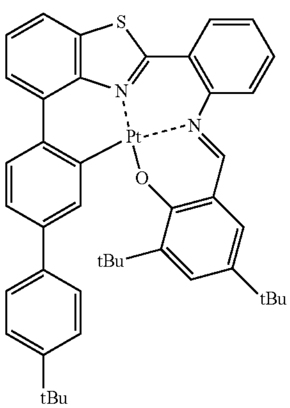
4-19
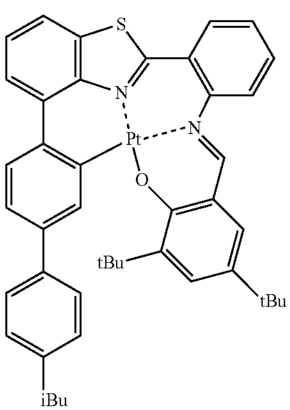
4-20
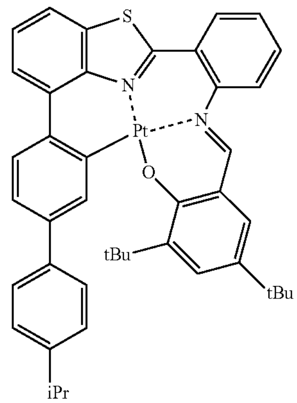
4-21
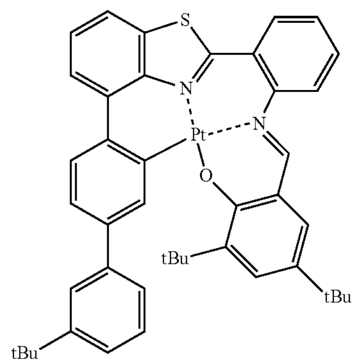
4-22
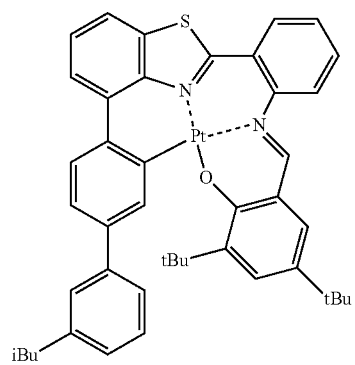
4-23
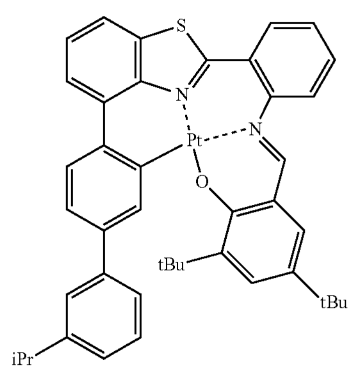

-continued
4-24
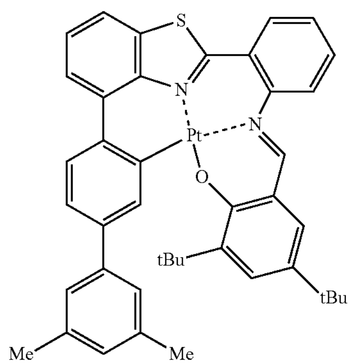
4-25
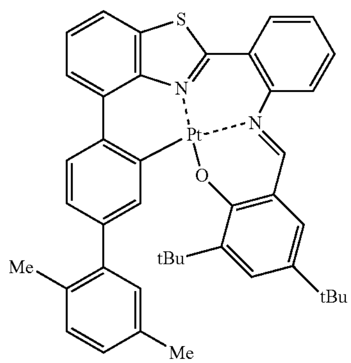
4-26
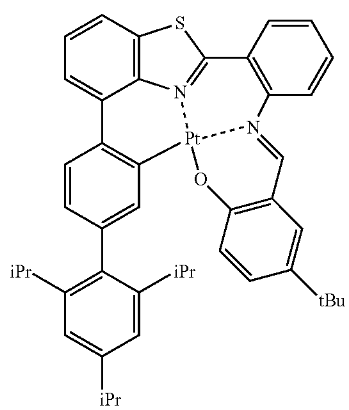
4-27
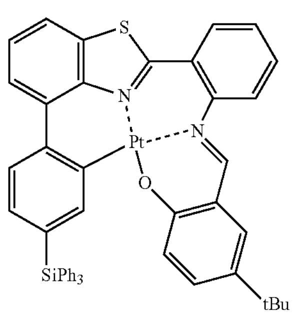
-continued
4-28
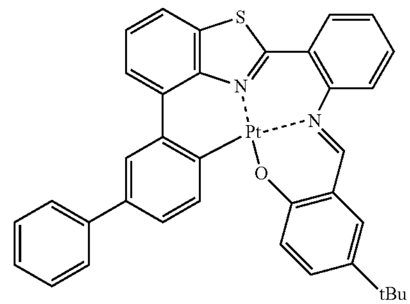
4-29
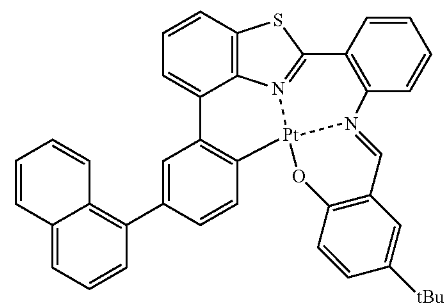
4-30
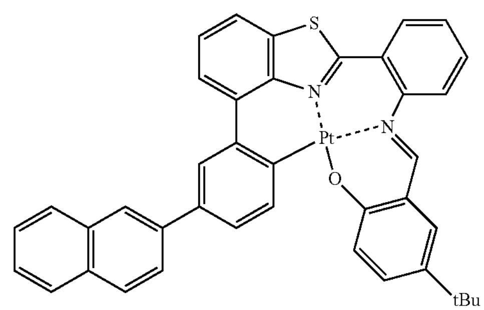
4-31
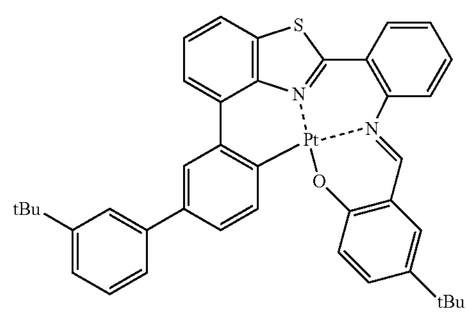
4-32
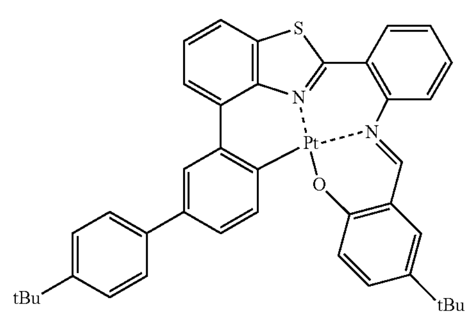

-continued
4-33
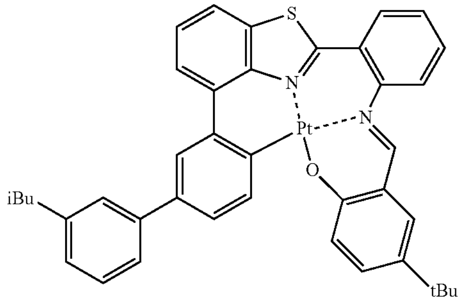
4-34
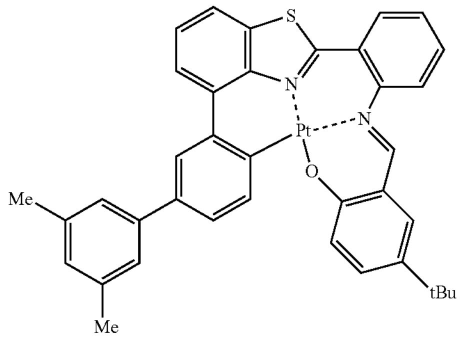
4-35
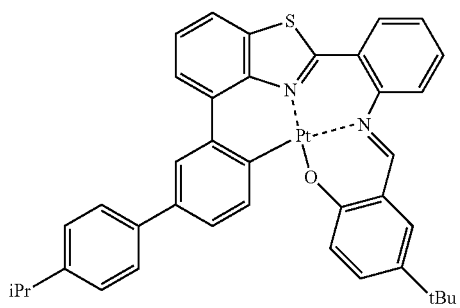
4-36
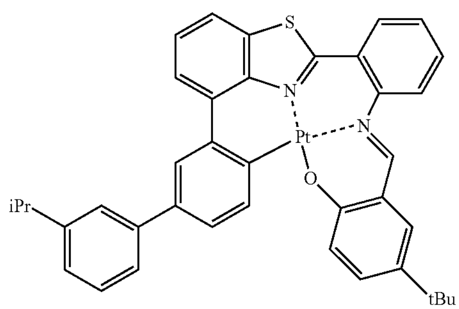
4-37
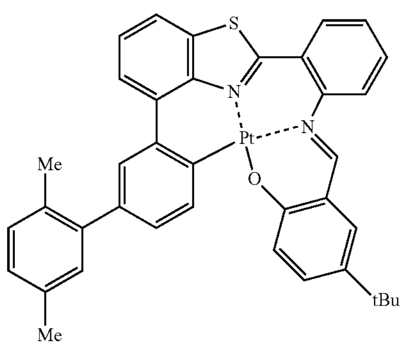
-continued
4-38
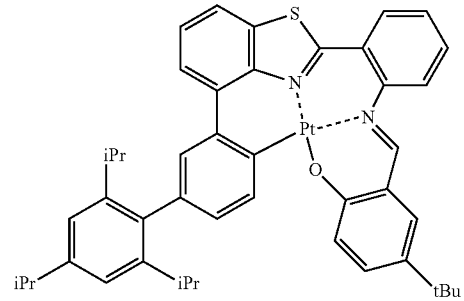
4-39
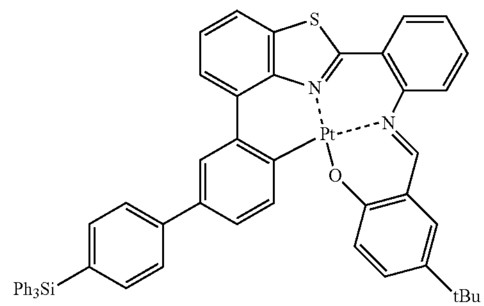
4-40
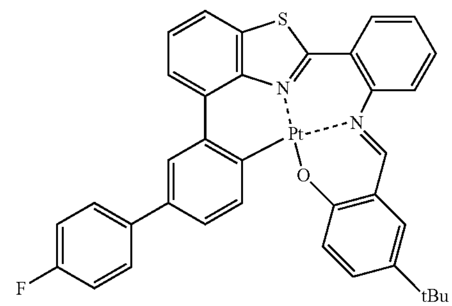
4-41
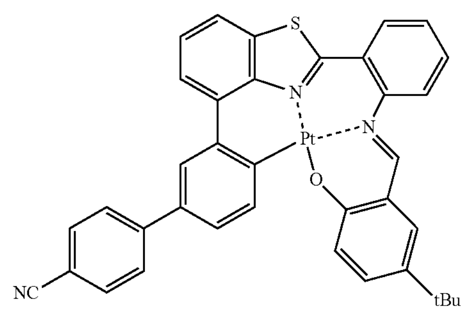
4-42
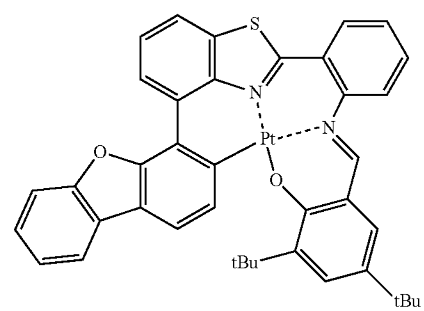

-continued
4-43
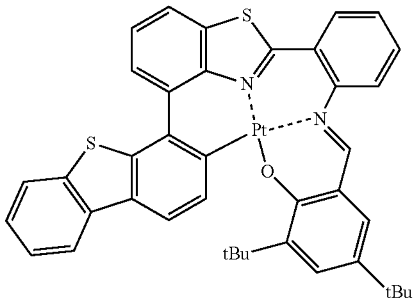
4-44
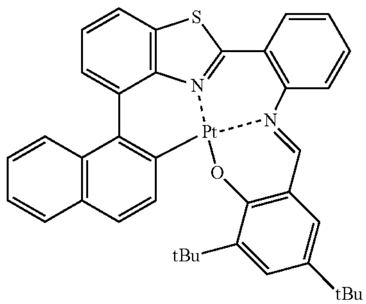
4-45
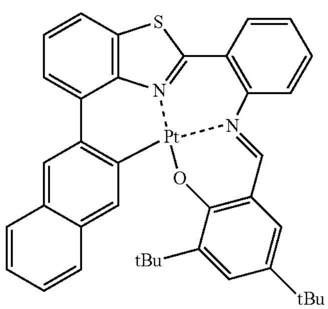
4-46
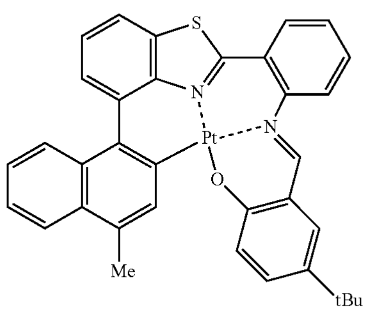
4-47
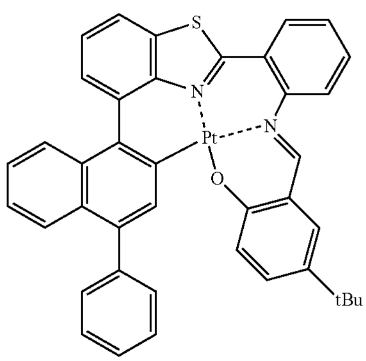
-continued
4-48
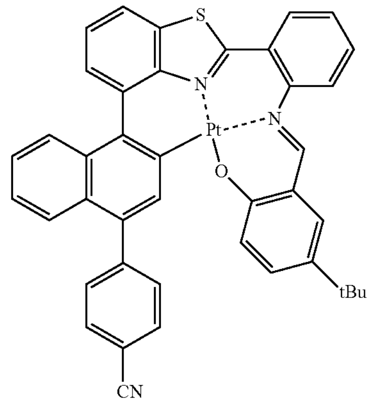
4-49
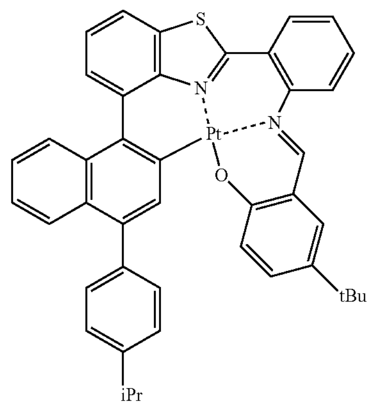
4-50
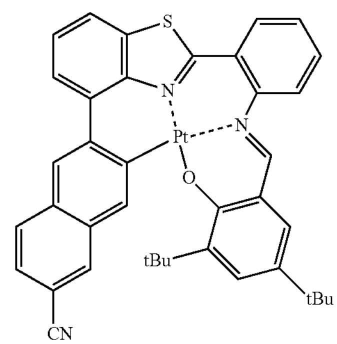
4-51
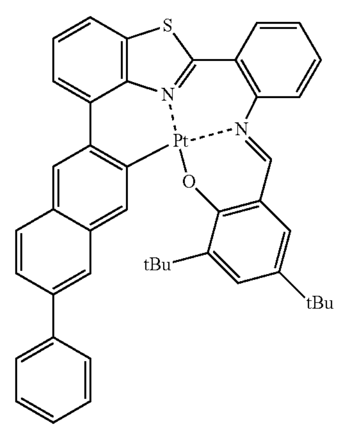

-continued
4-52
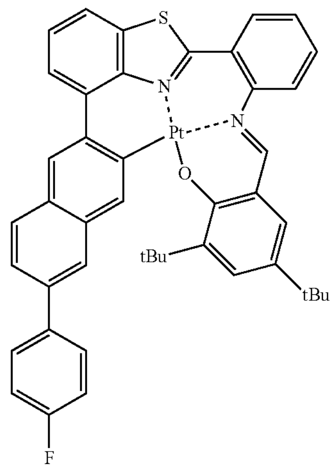
4-53
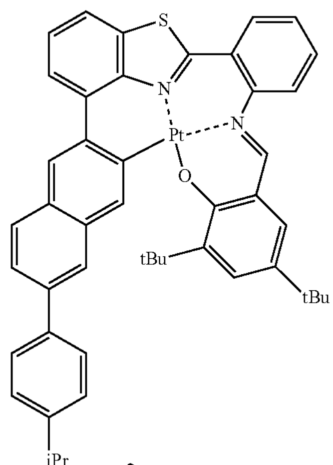
4-54
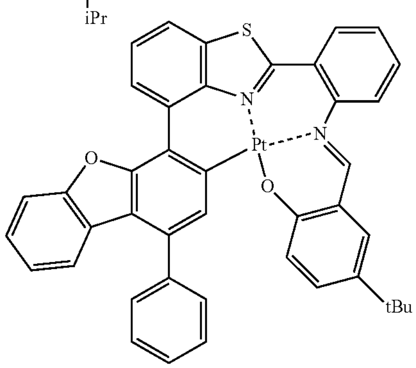
4-55
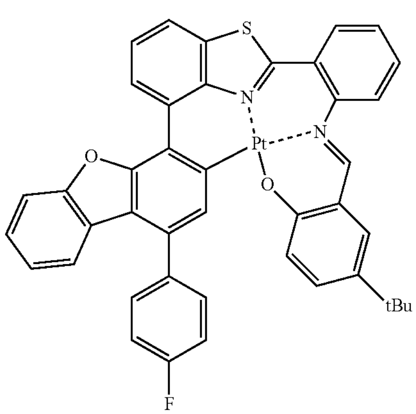
-continued
4-56
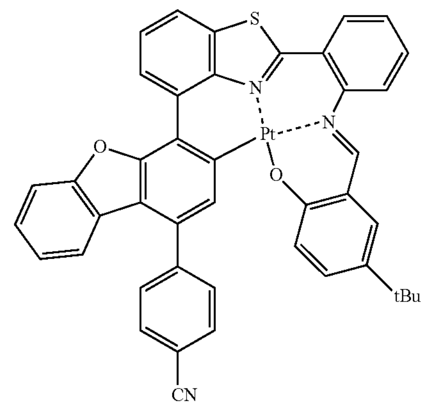
4-57
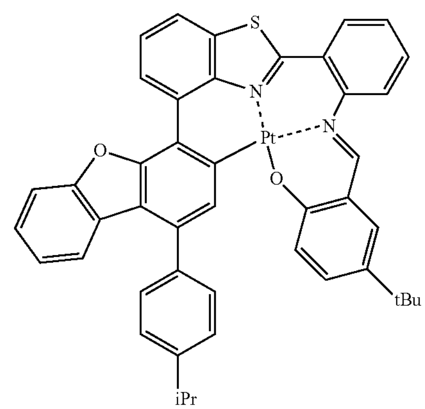
4-58
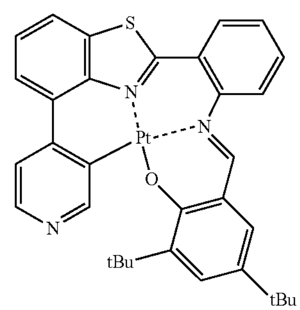
4-59
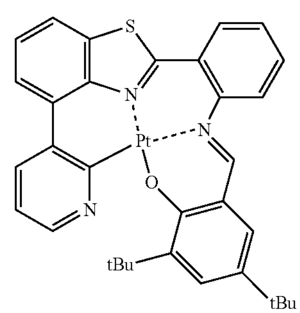

-continued
4-60
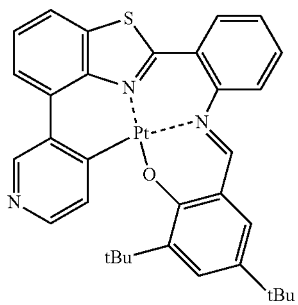
4-61
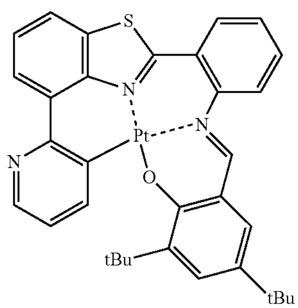
4-62
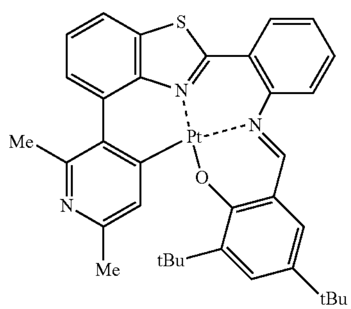
4-63
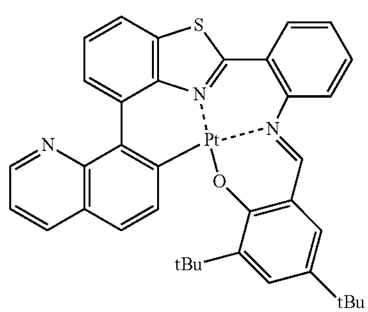
4-64
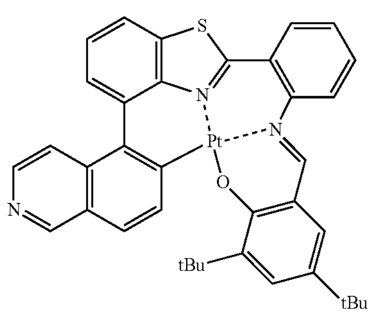
-continued
4-65
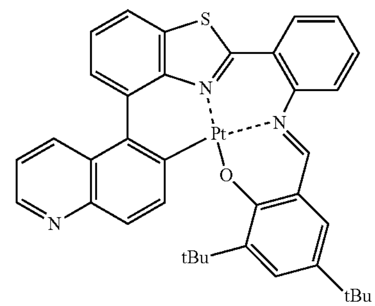
4-66
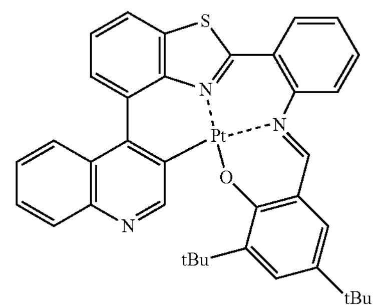
4-67
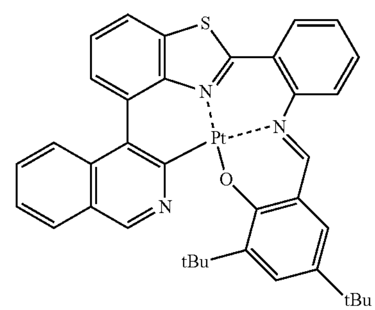
4-68
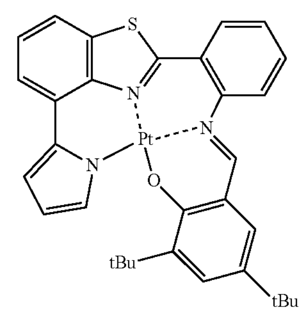
4-69
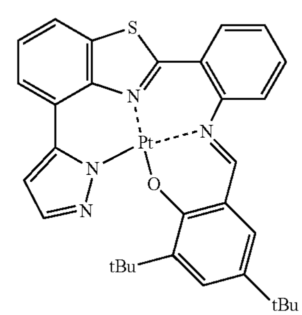

-continued
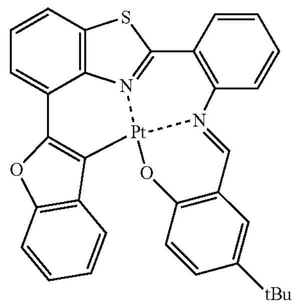
4-70
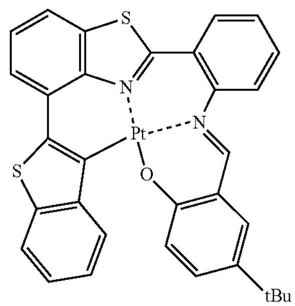
4-71
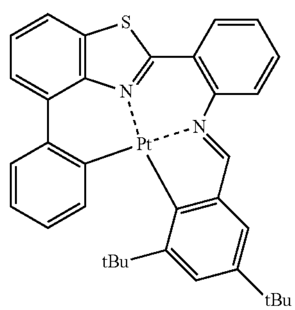
4-72
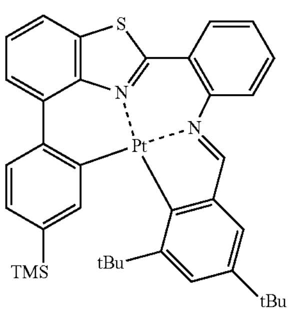
4-73
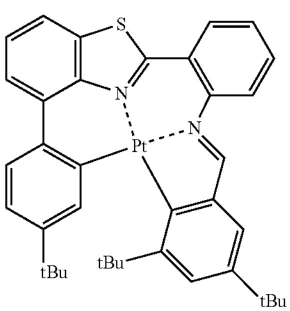
4-74
-continued
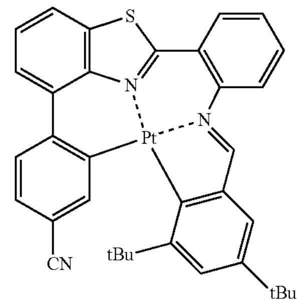
4-75
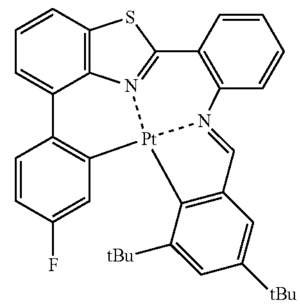
4-76
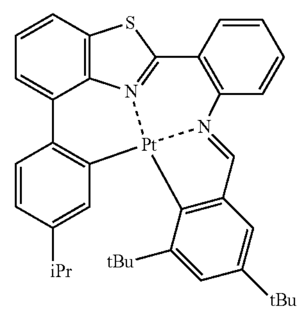
4-77
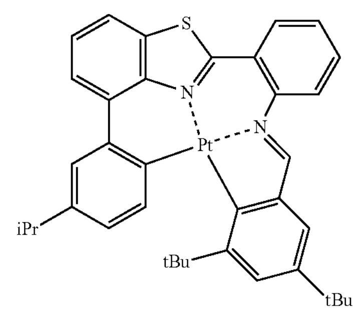
4-78
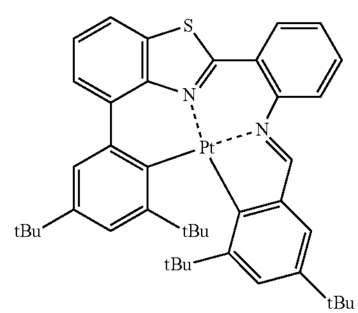
4-79

-continued
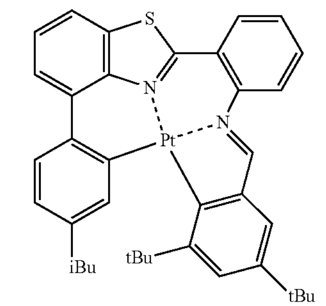
4-80
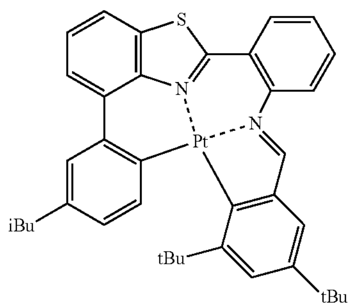
4-81
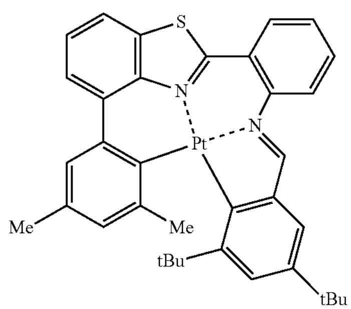
4-82
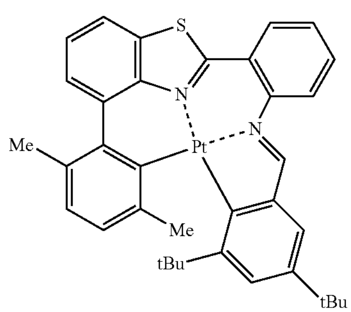
4-83
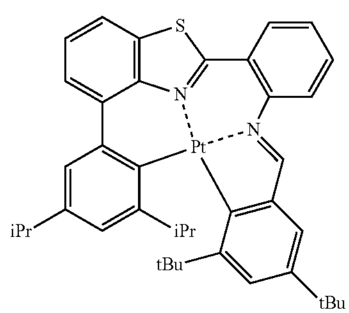
4-84
-continued
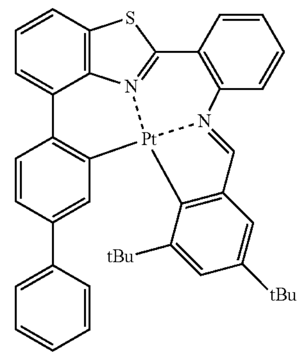
4-85
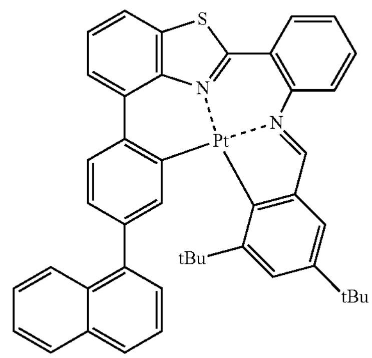
4-86
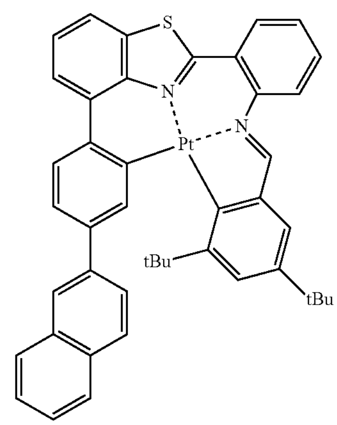
4-87
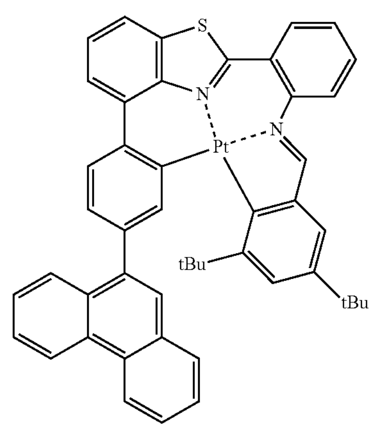
4-88

-continued
4-89
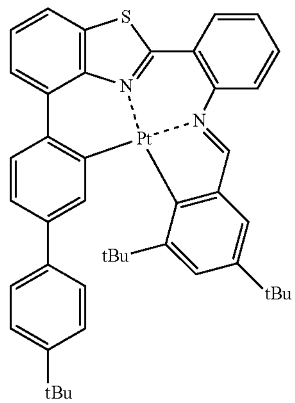
4-90
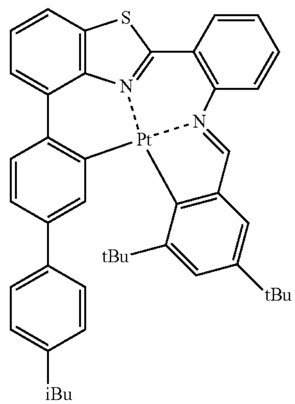
4-91
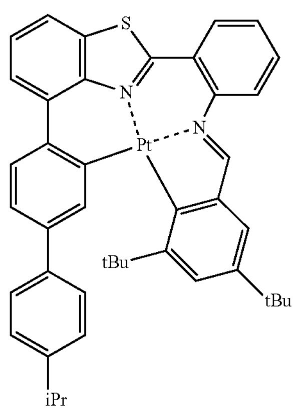
4-92
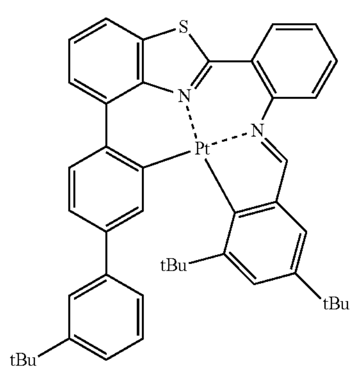
-continued
4-93
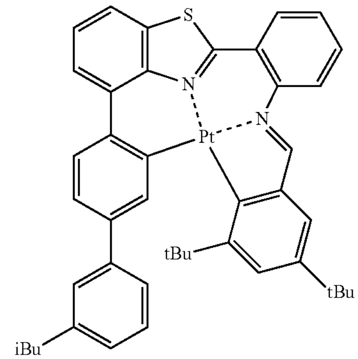
4-94
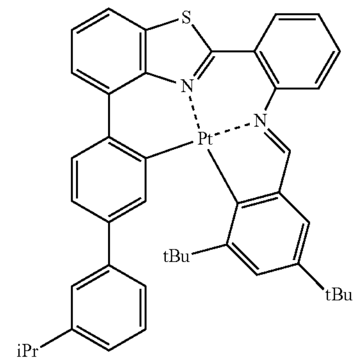
4-95
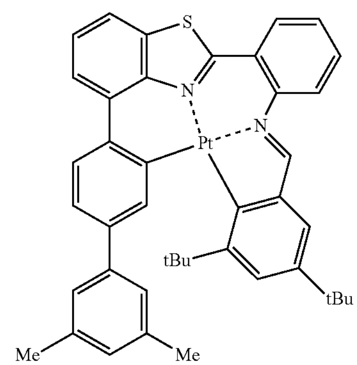
4-96
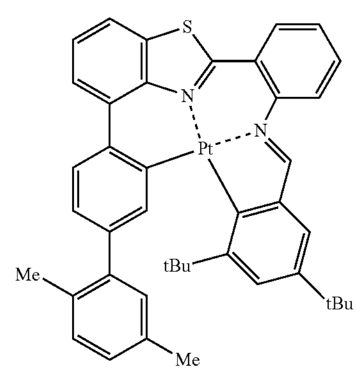

-continued
4-97
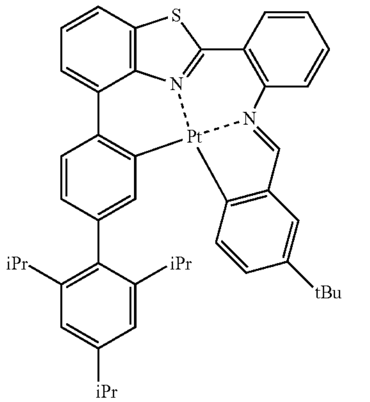
4-98
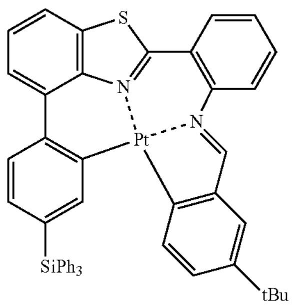
4-99
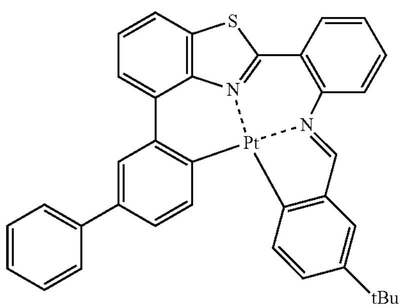
4-100
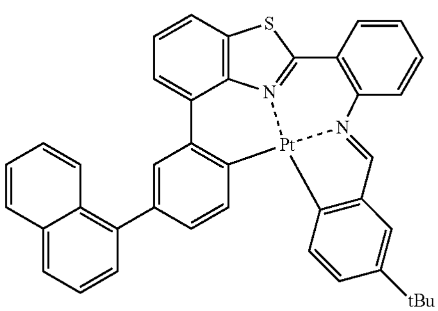
4-101
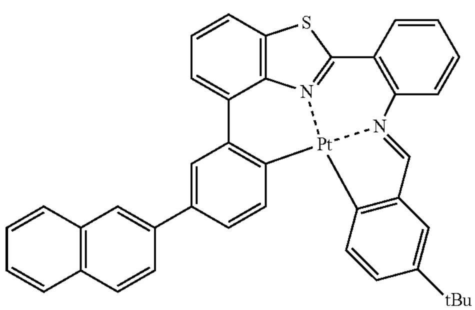
-continued
4-102
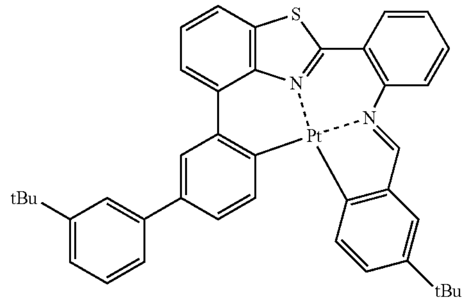
4-103
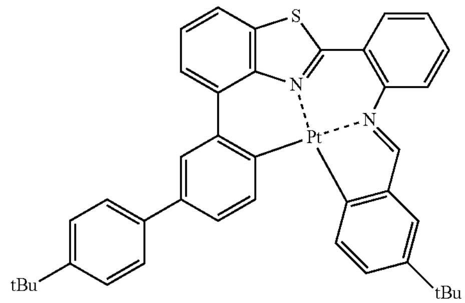
4-104
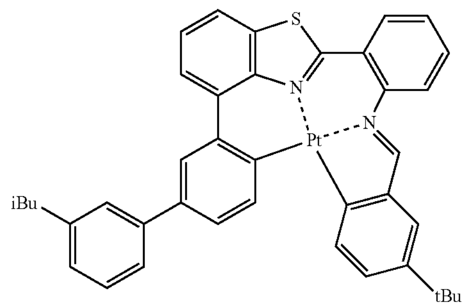
4-105
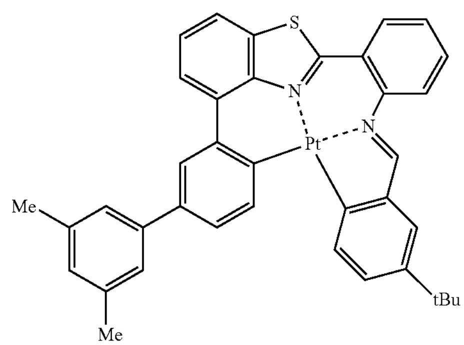
4-106
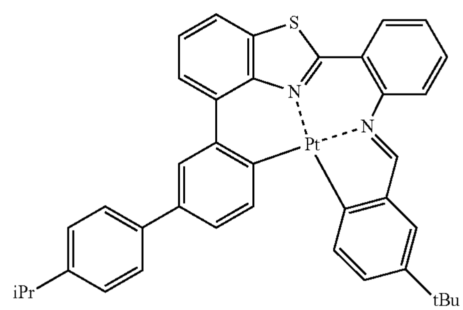

4-107
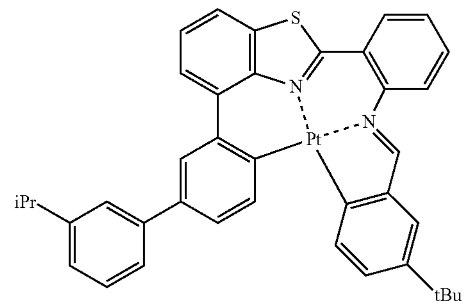
4-108
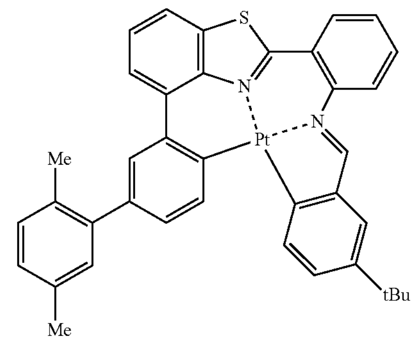
4-109
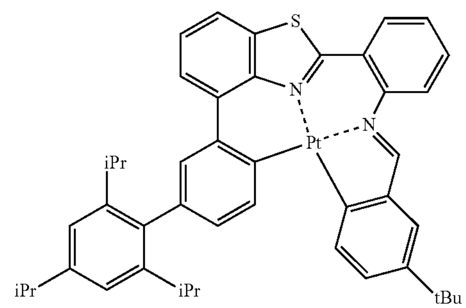
4-110
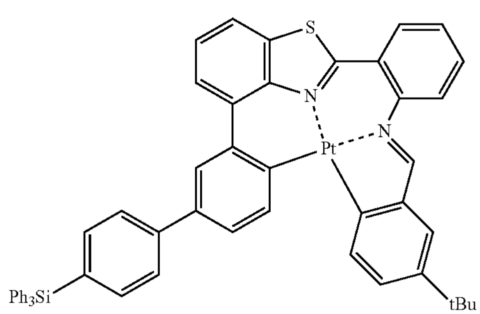
4-111
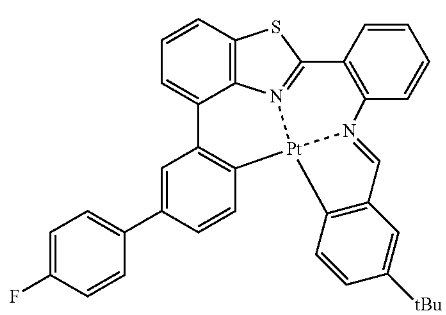
4-112
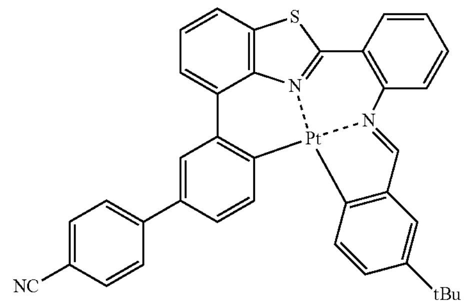
4-113
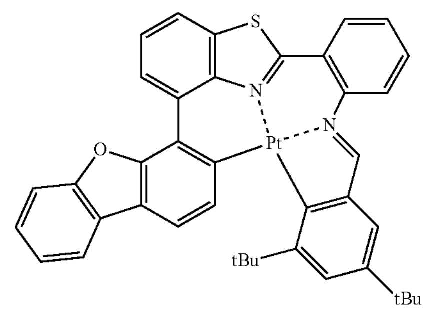
4-114
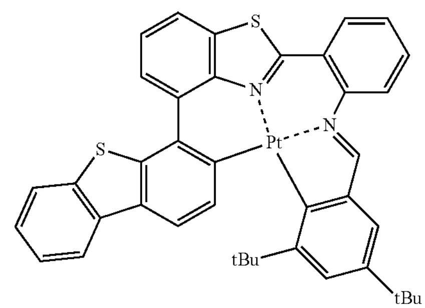
4-115
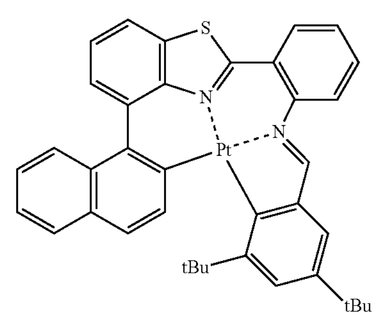
4-116
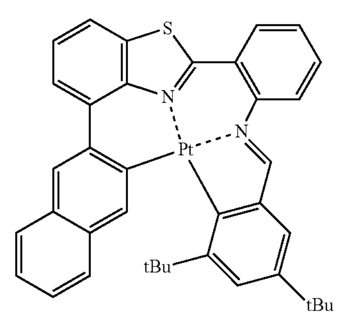

-continued
4-117
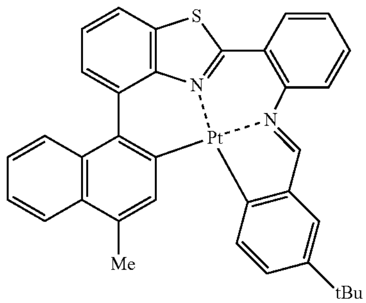
4-118
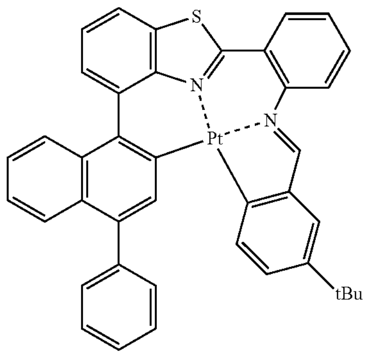
4-119
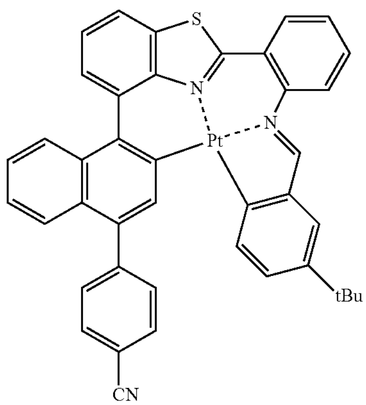
4-120
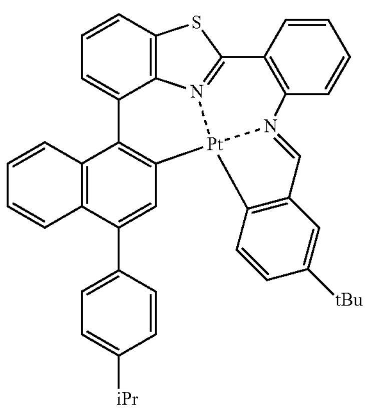
-continued
4-121
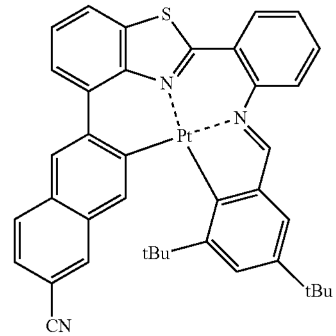
4-122
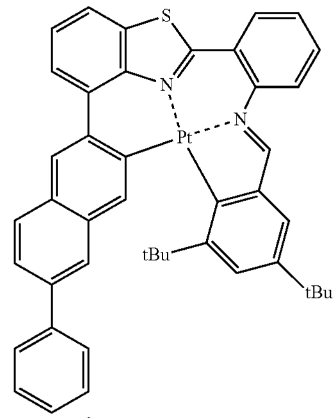
4-123
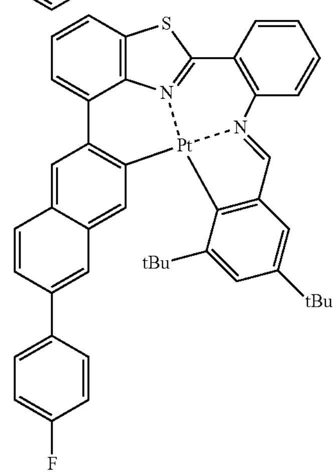
4-124
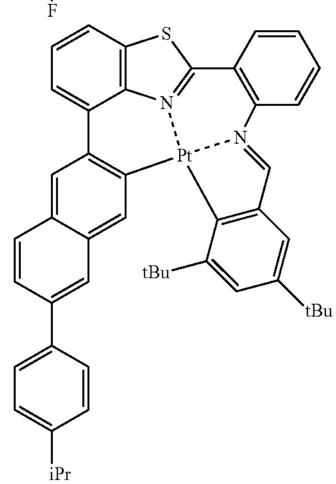

-continued
4-125
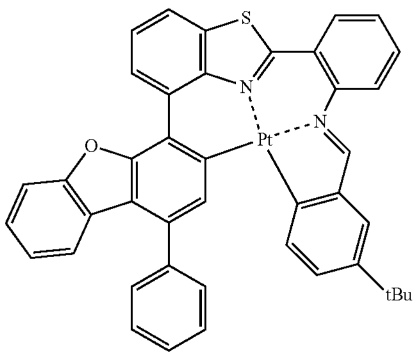
4-126
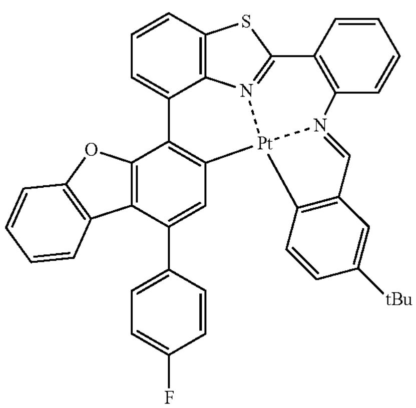
4-127
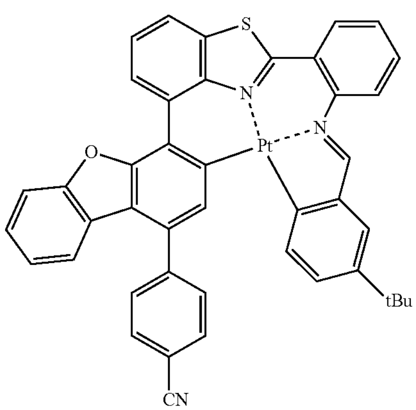
4-128
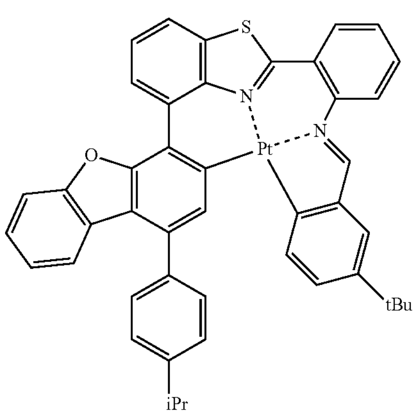
-continued
4-129
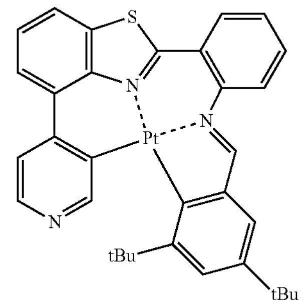
4-130
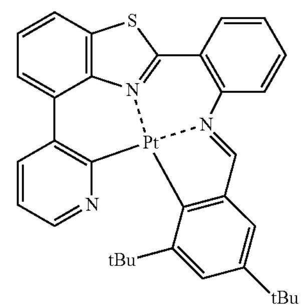
4-131
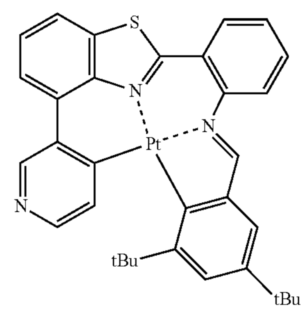
4-132
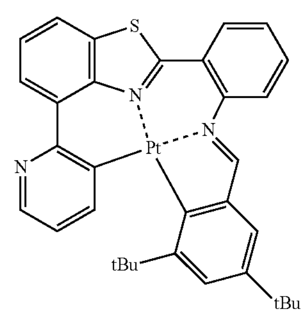
4-133
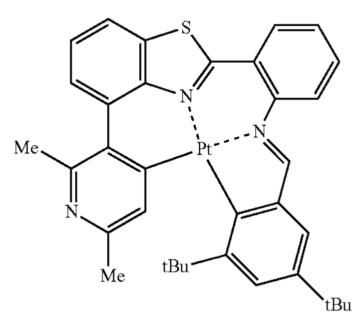

-continued
4-134
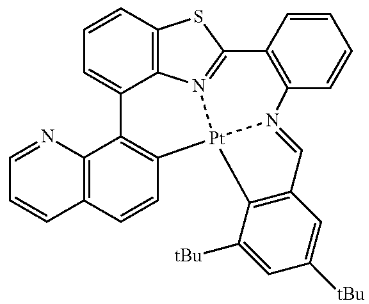
4-135
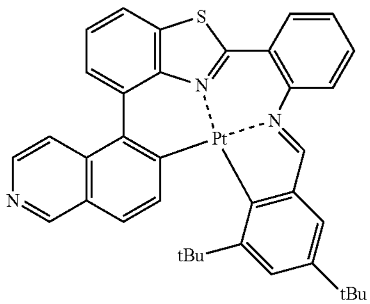
4-136
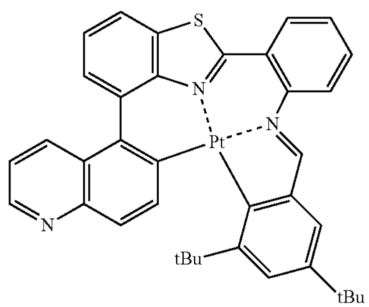
4-137
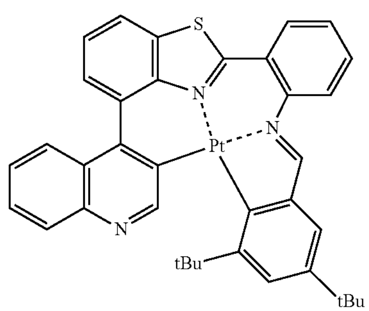
4-138
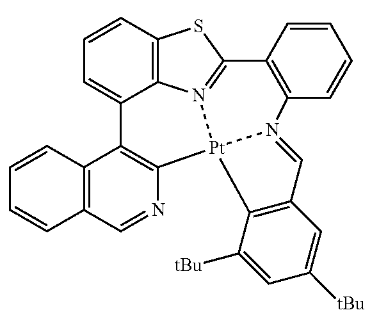
-continued
4-139
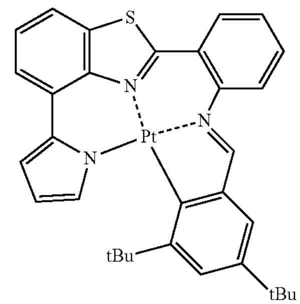
4-140
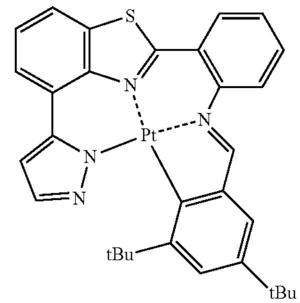
4-141
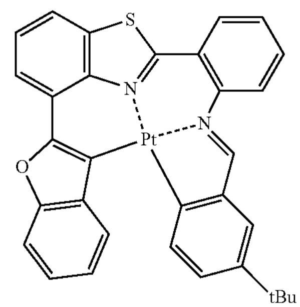
4-142
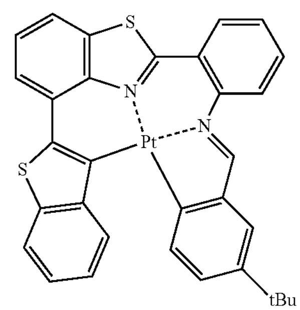
4-143
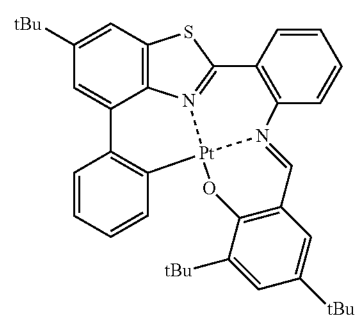

4-144
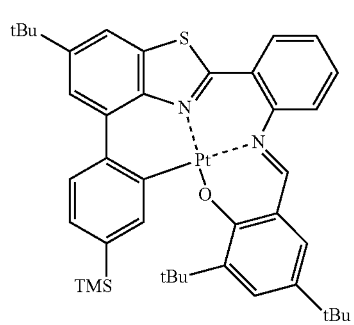
4-145
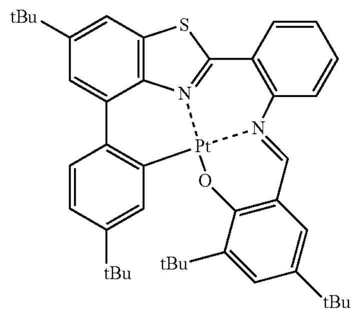
4-146
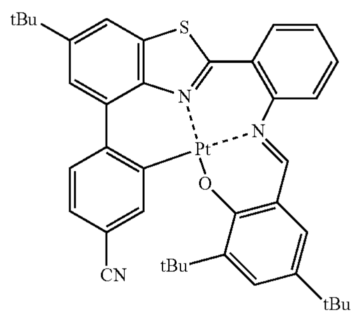
4-147
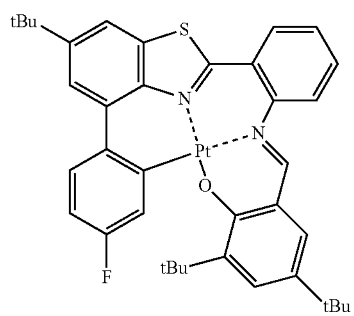
4-148
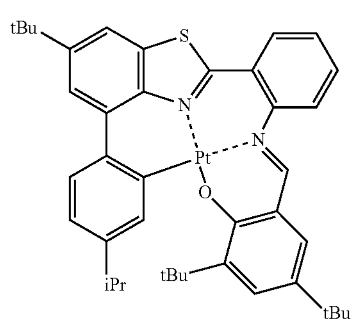
4-149
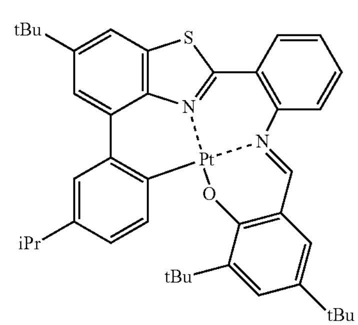
4-150
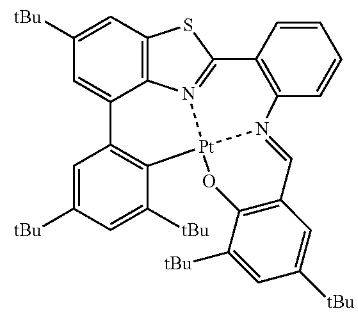
4-151
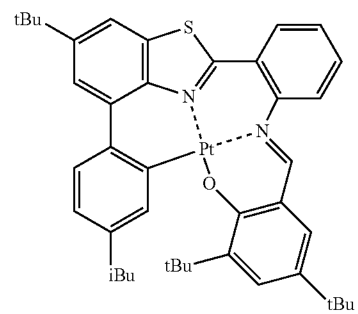
4-152
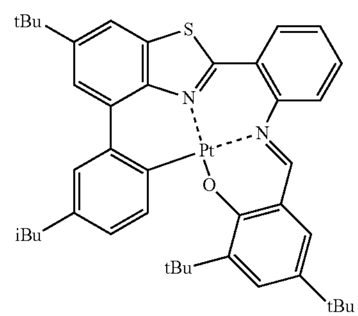
4-153
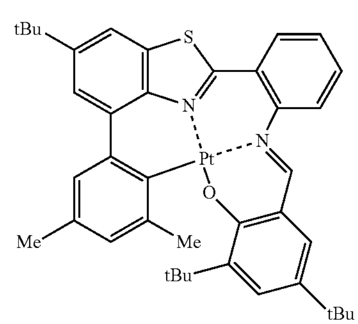

-continued
4-154
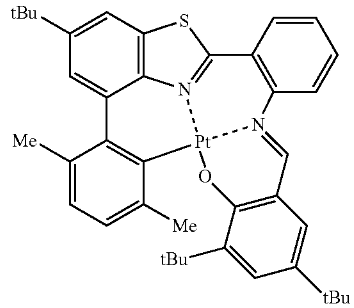
4-155
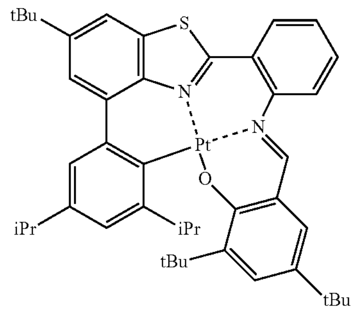
4-156
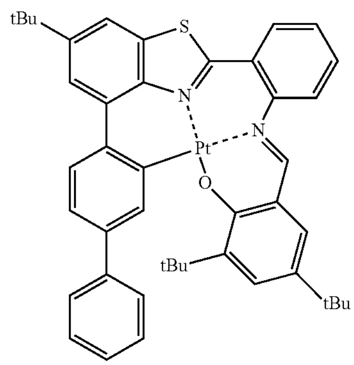
4-157
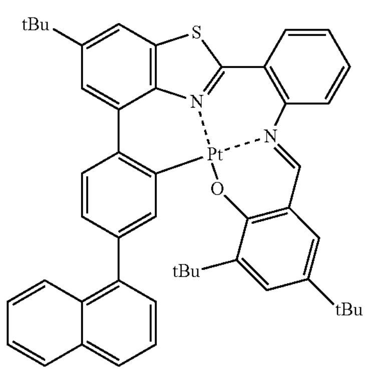
-continued
4-158
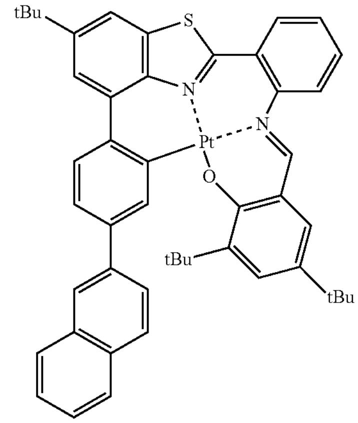
4-159
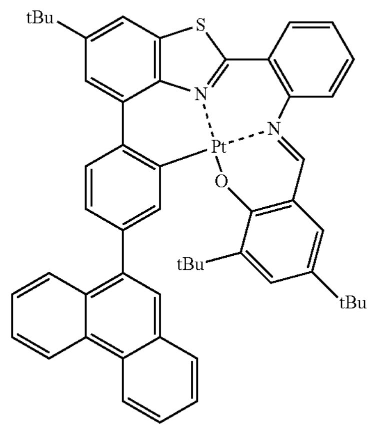
4-160
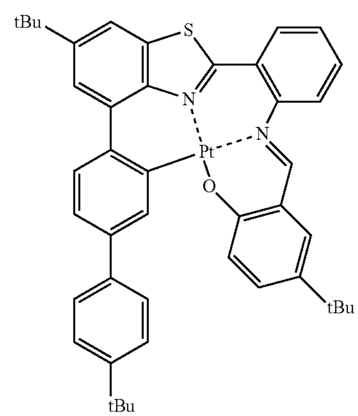

4-161
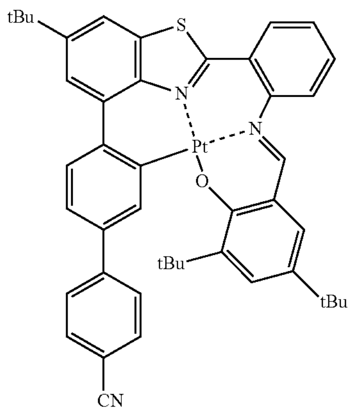
4-162
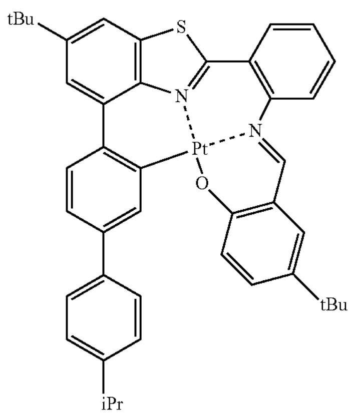
4-163
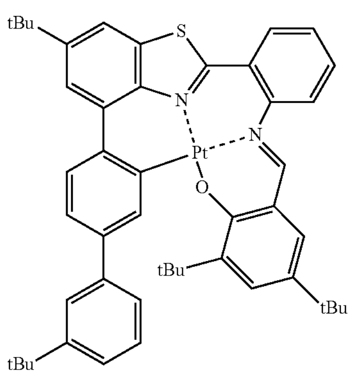
4-164
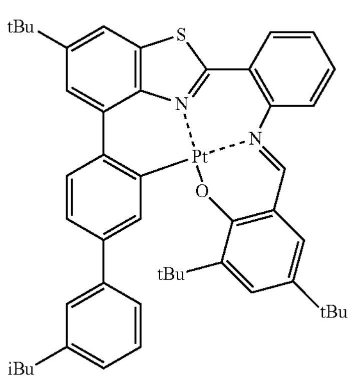
4-165
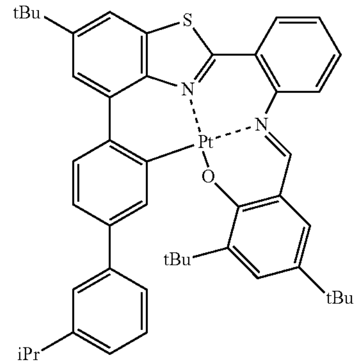
4-166
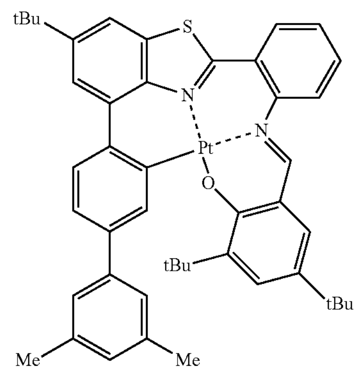
4-167
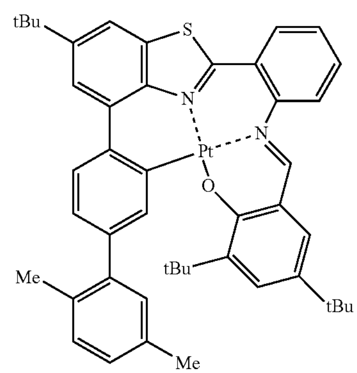
4-168
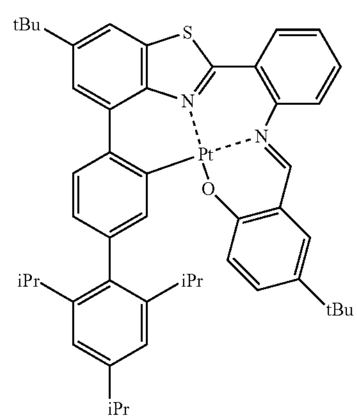

-continued
4-169
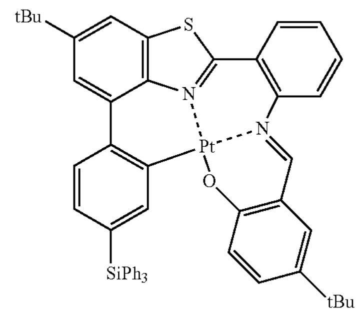
4-170
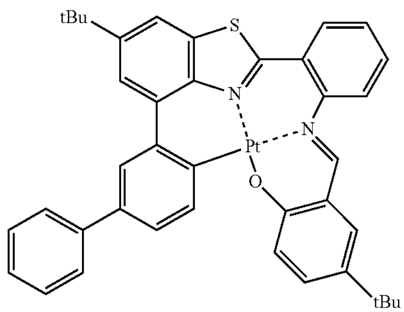
4-171
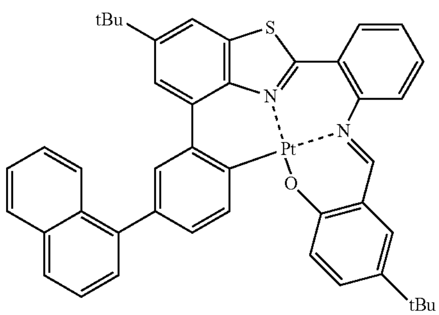
4-172
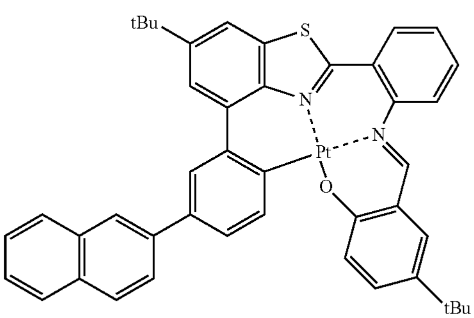
4-173
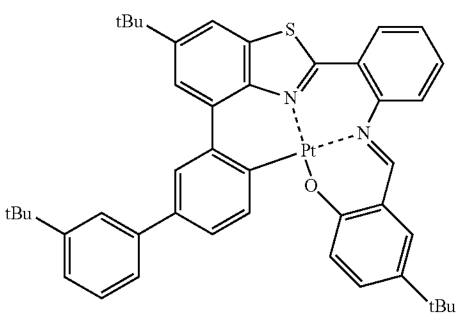
-continued
4-174
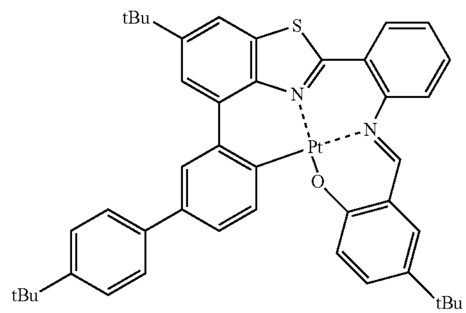
4-175
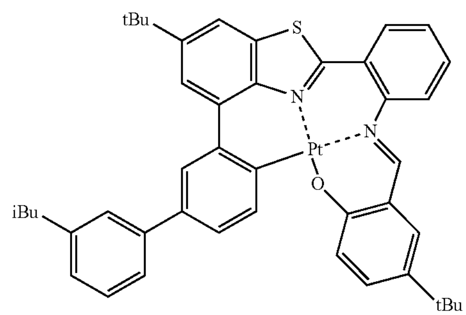
4-176
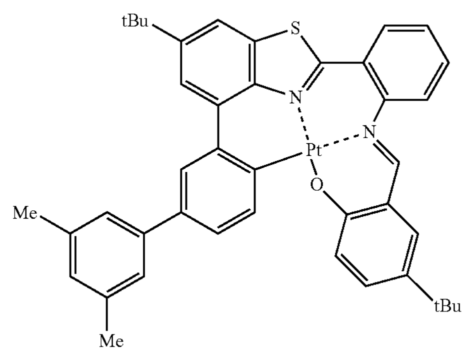
4-177
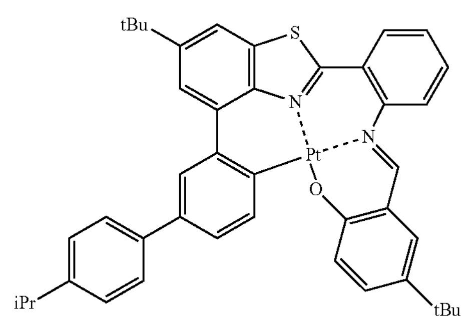
4-178
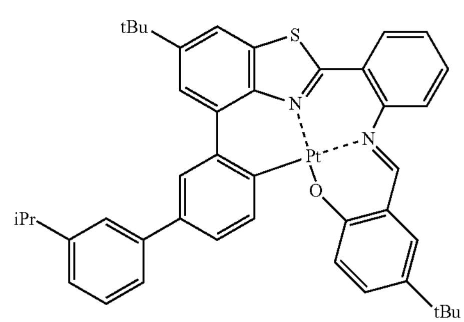

-continued
4-179
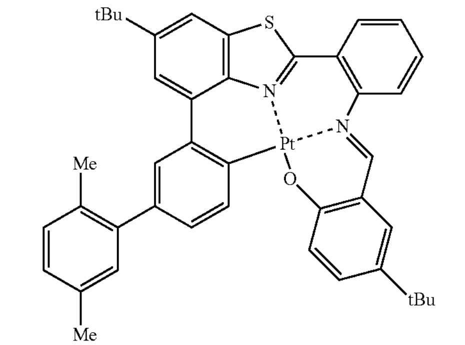
4-180
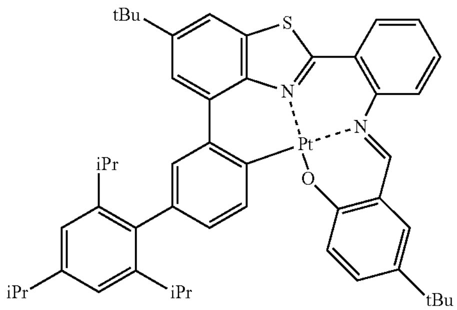
4-181
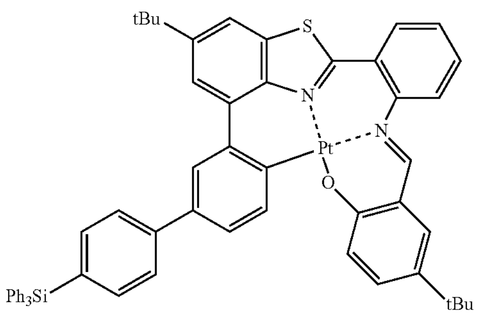
4-182
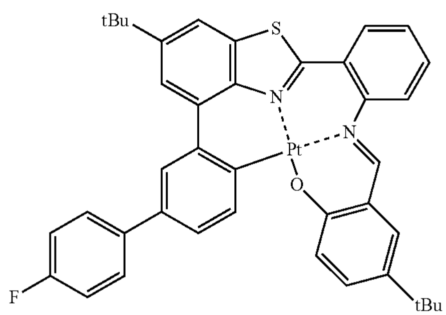
4-183
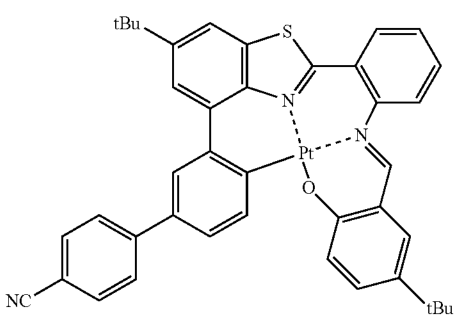
-continued
4-184
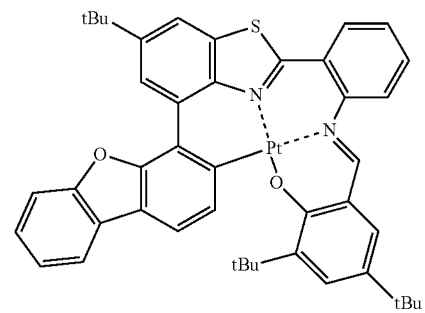
4-185
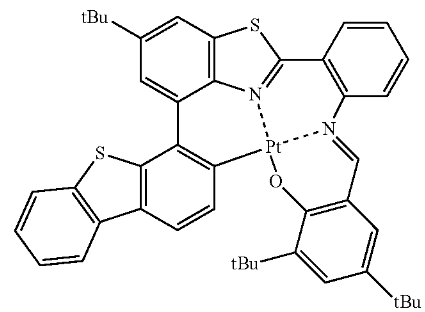
4-186
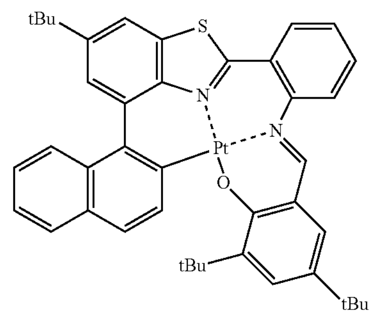
4-187
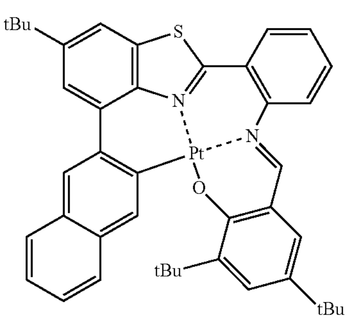
4-188
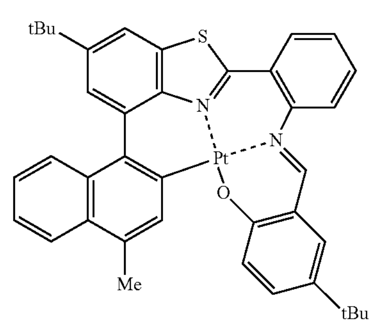

-continued
4-189
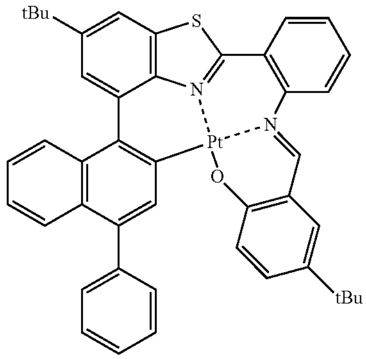
4-190
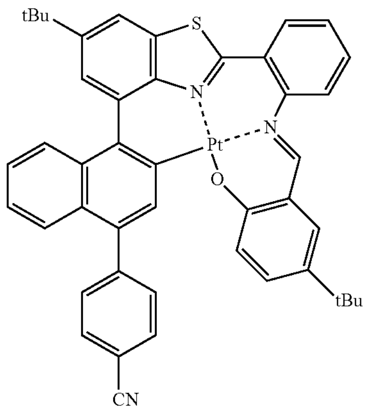
4-191
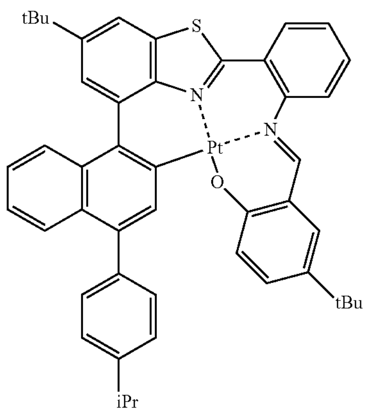
4-192
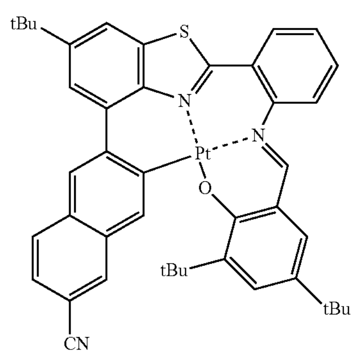
-continued
4-193
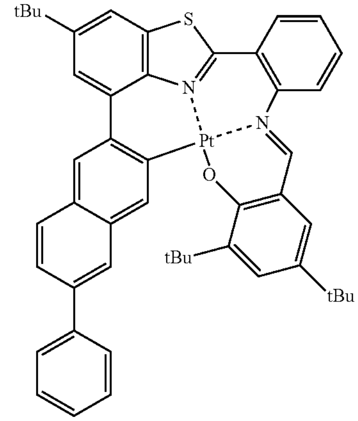
4-194
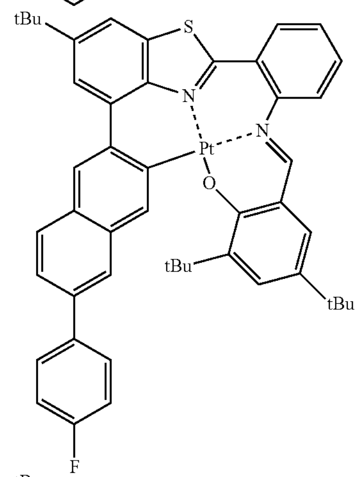
4-195
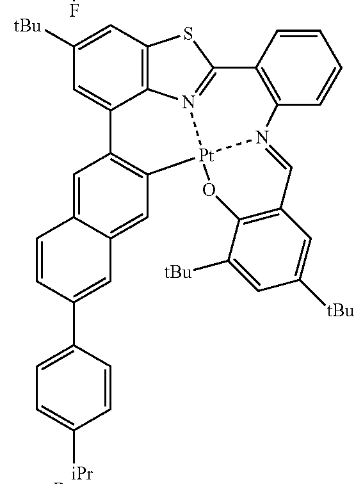
4-196
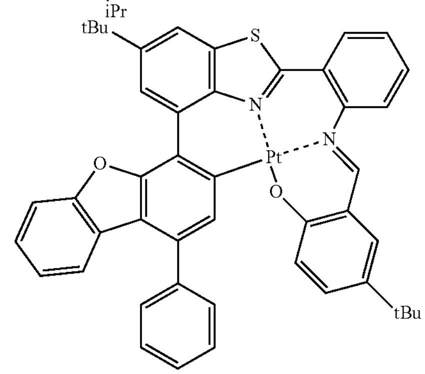

-continued
4-197
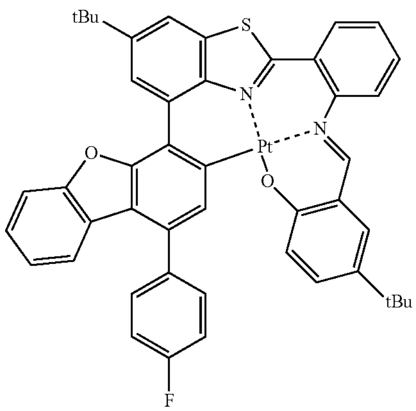
4-198
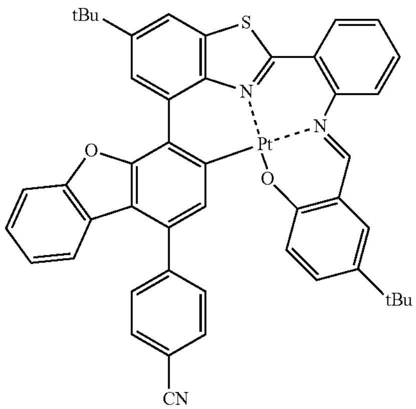
4-199
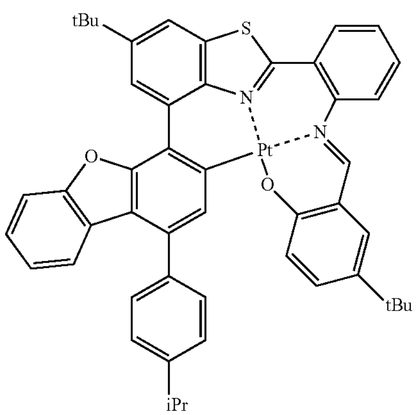
4-200
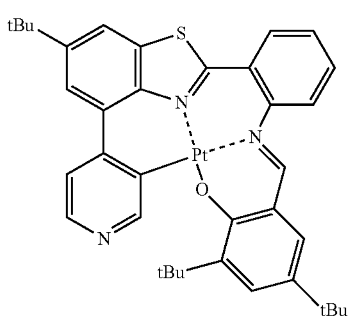
-continued
4-201
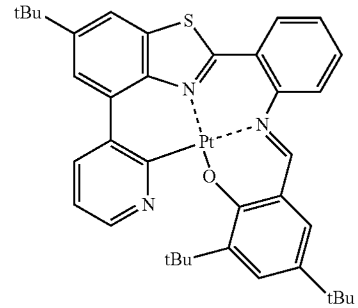
4-202
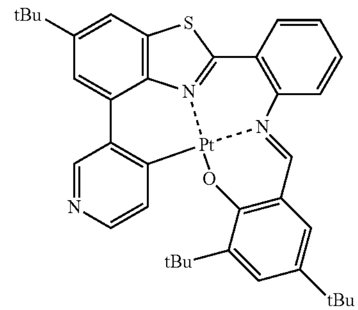
4-203
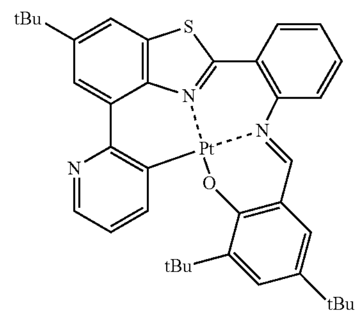
4-204
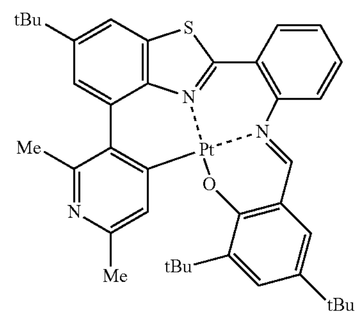
4-205
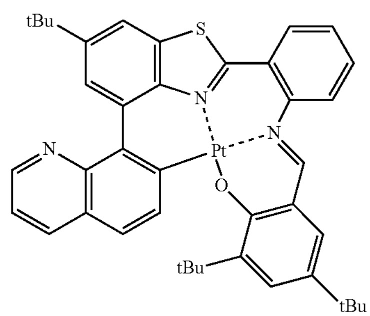

-continued
4-206
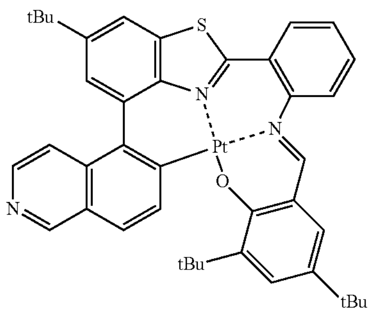
4-207
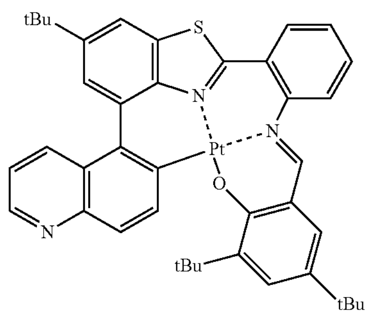
4-208
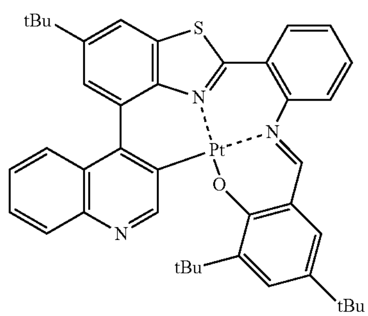
4-209
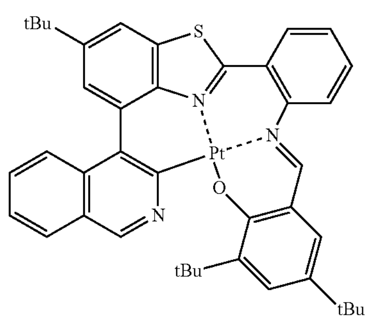
4-210
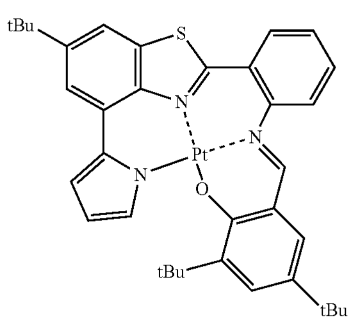
-continued
4-211
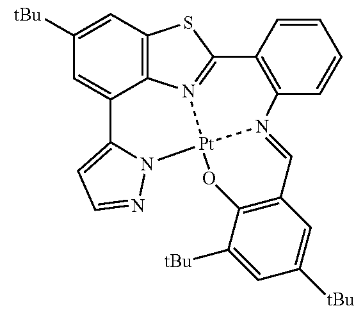
4-212
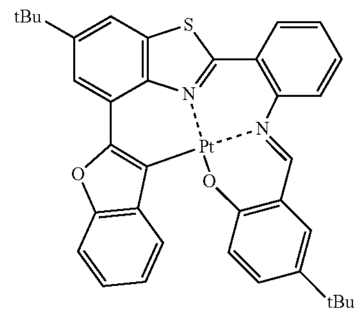
4-213
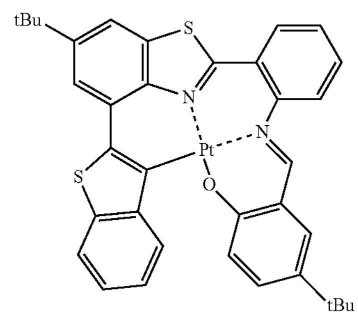
4-214
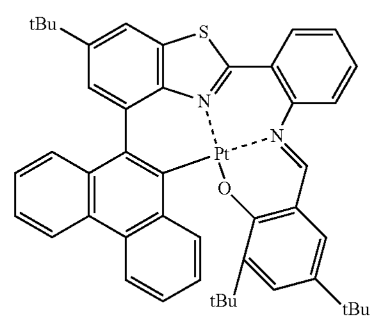
4-215
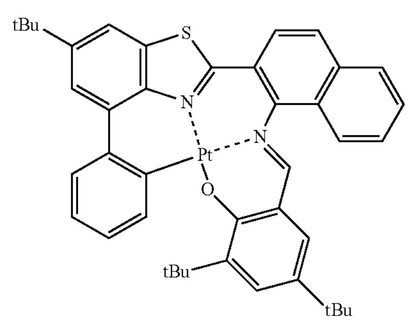

4-216
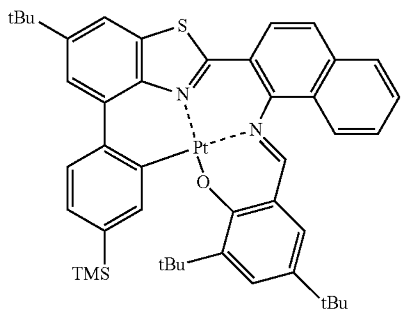
4-217
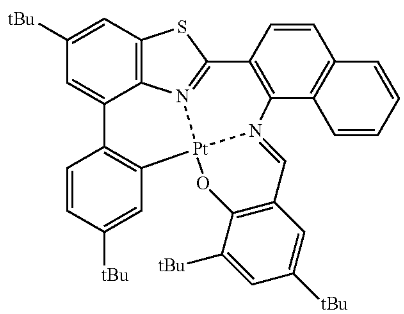
4-218
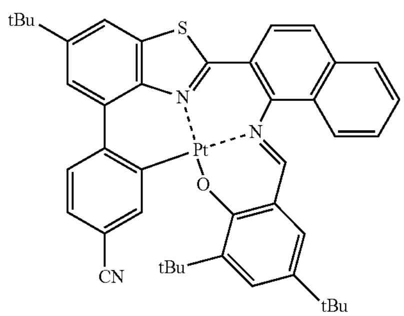
4-219
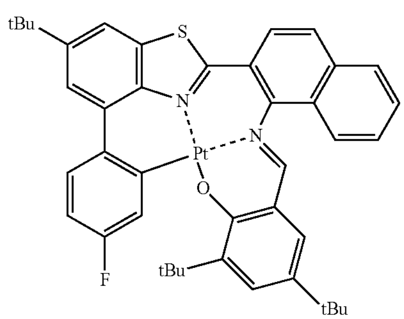
4-220
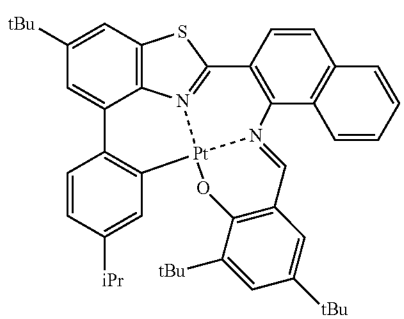
4-221
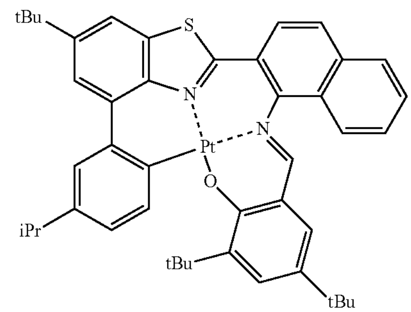
4-222
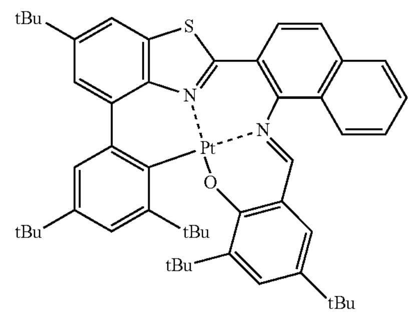
4-223
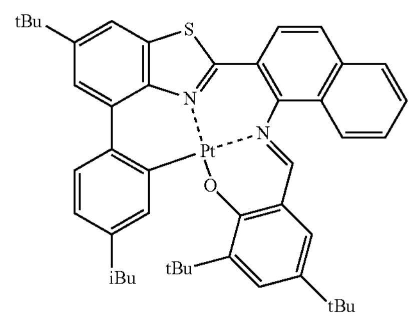
4-224
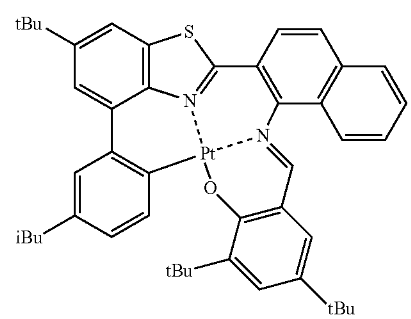
4-225
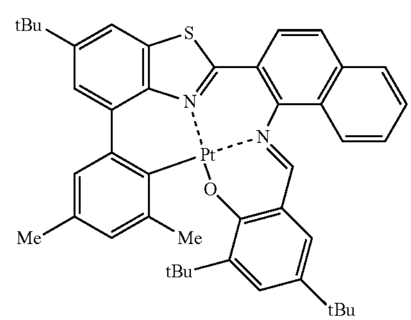

4-226
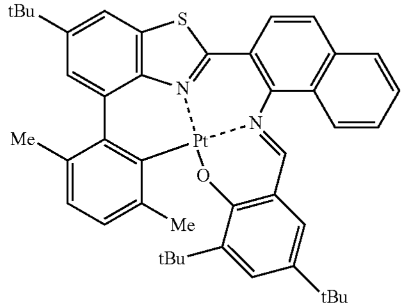
4-227
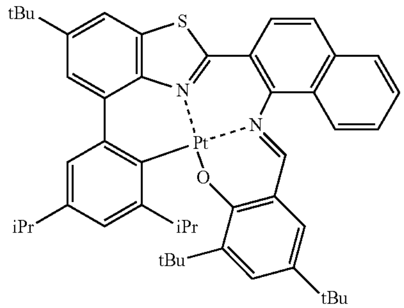
4-228
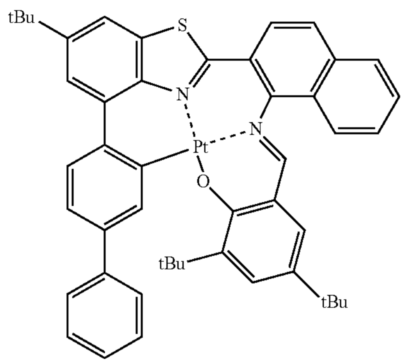
4-229
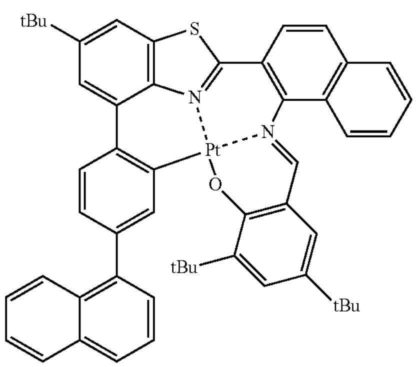
4-230
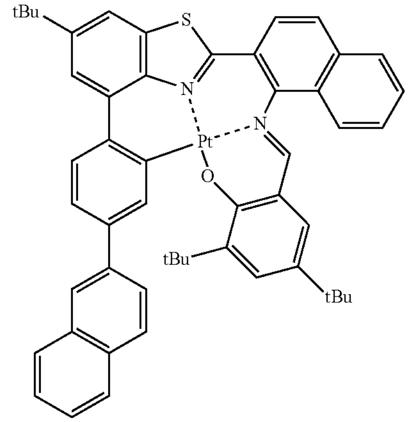
4-231
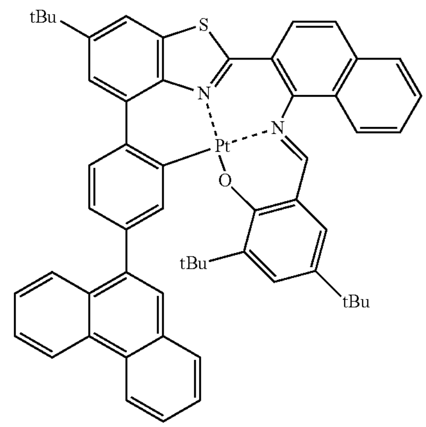
4-232
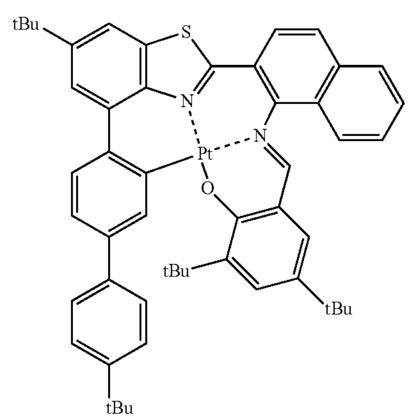

-continued
4-233
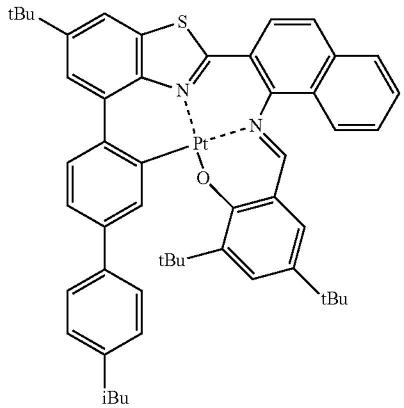
4-234
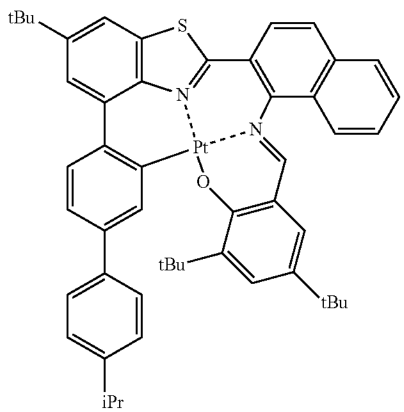
4-235
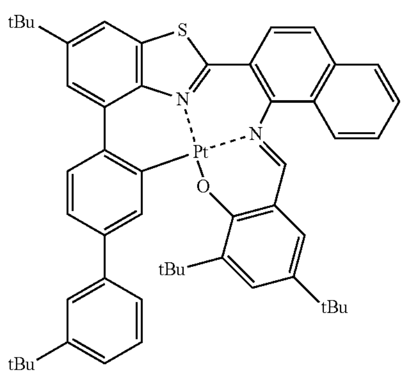
4-236
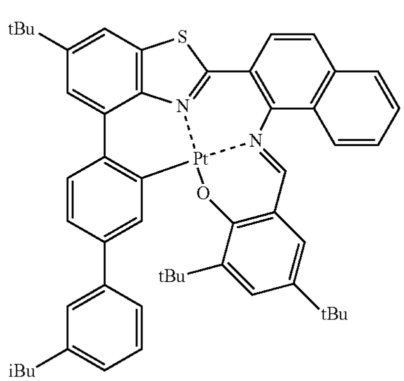
-continued
4-237
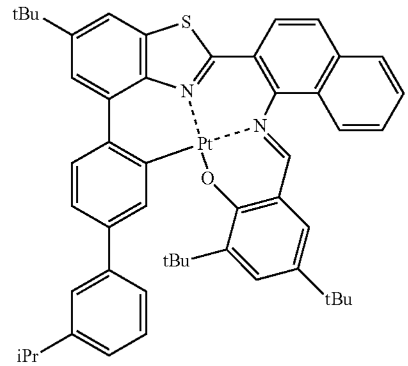
4-238
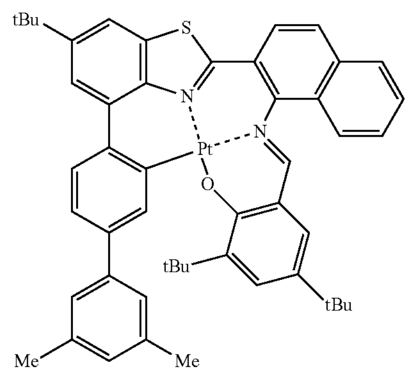
4-239
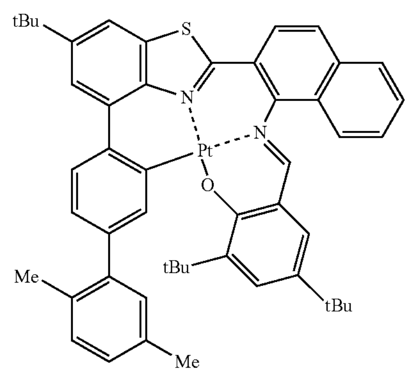
4-240
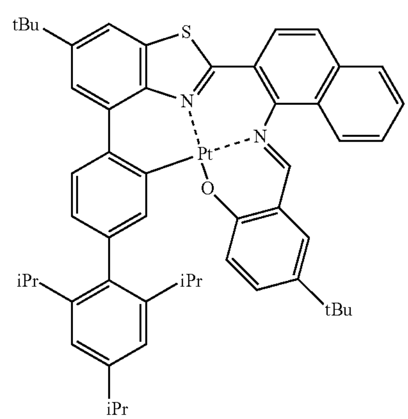

-continued
4-241
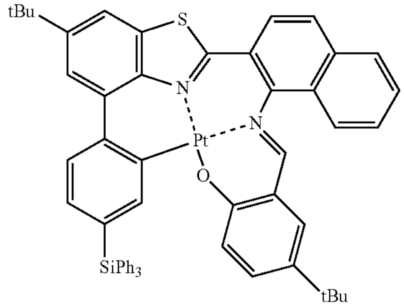
4-242
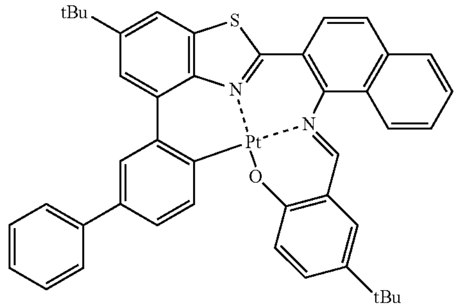
4-243
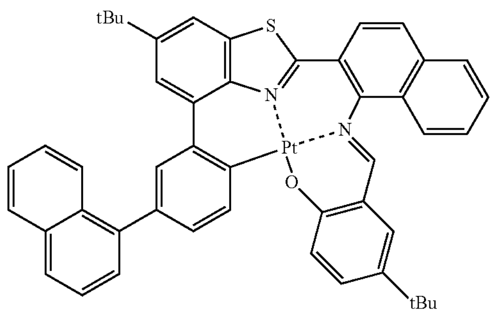
4-244
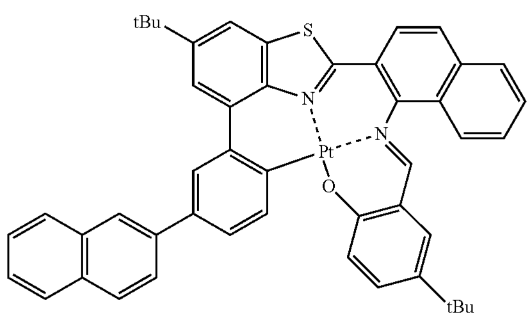
4-245
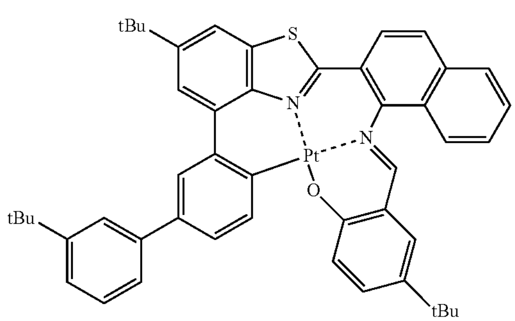
-continued
4-246
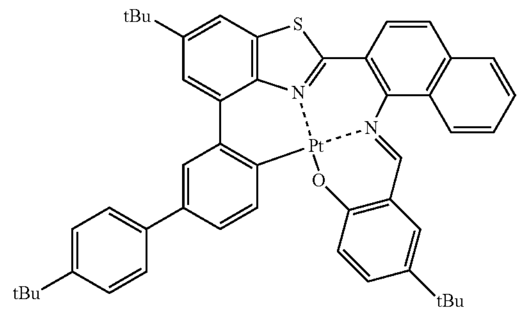
4-247
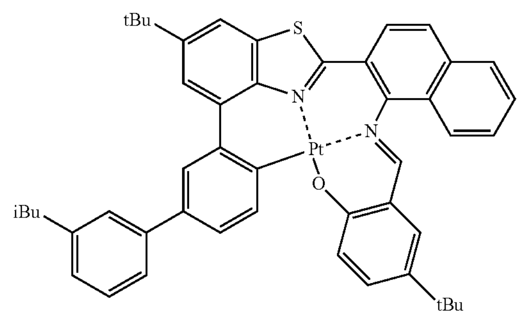
4-248
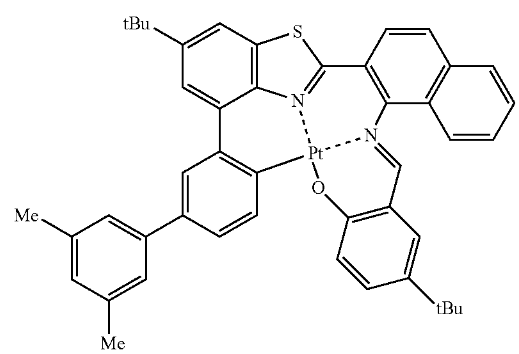
4-249
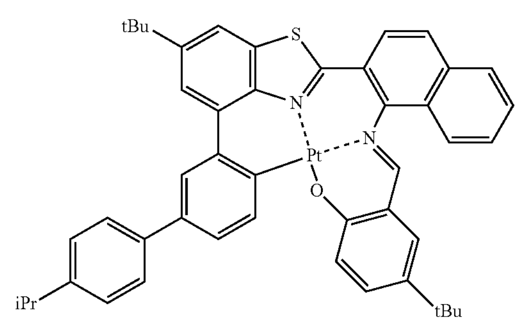

-continued
4-250
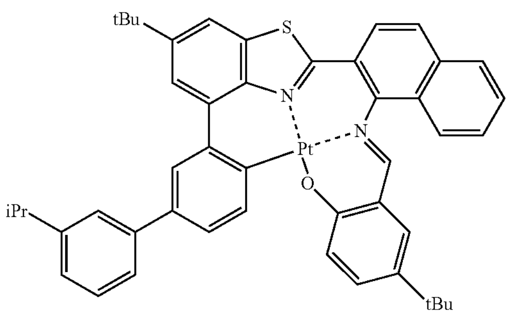
4-251
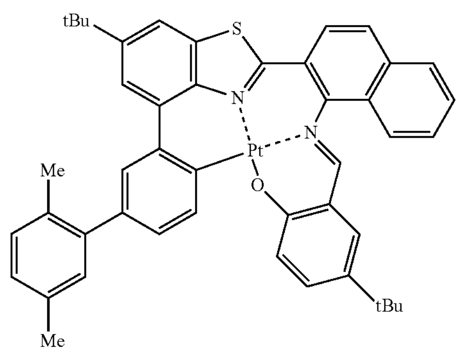
4-252
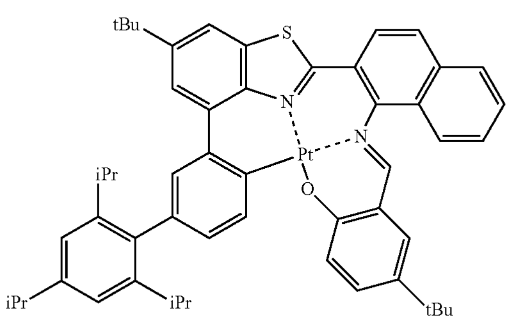
4-253
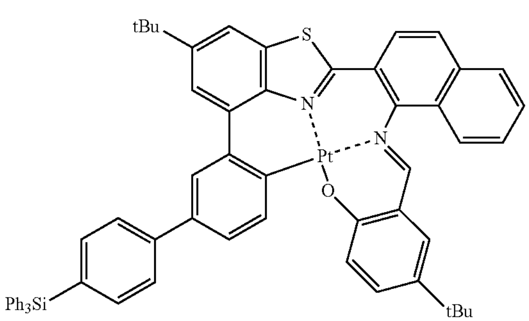
-continued
4-254
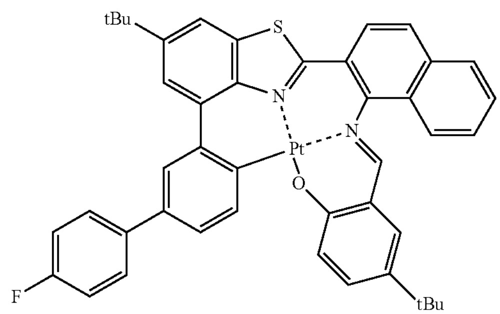
4-255
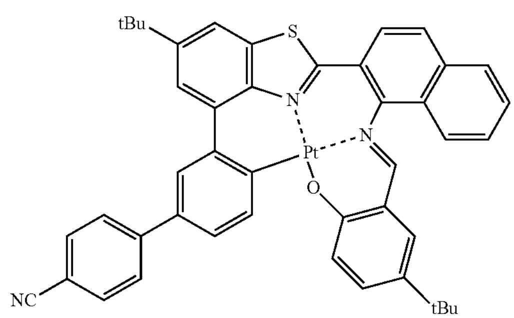
4-256
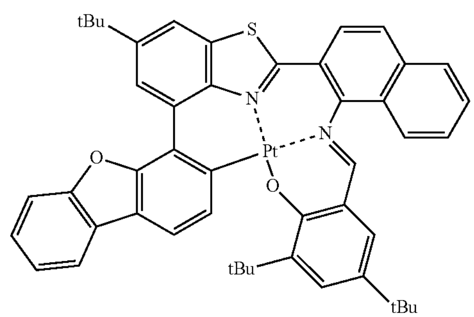
4-257
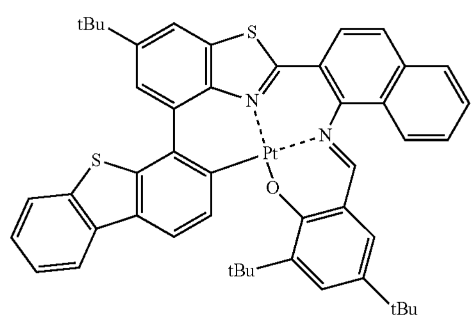
4-258
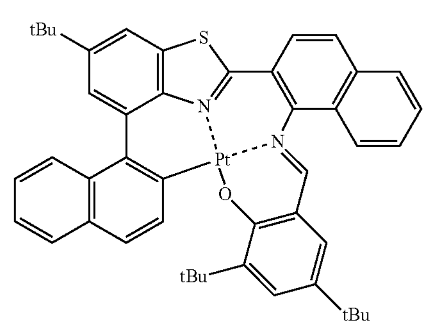

-continued
4-259
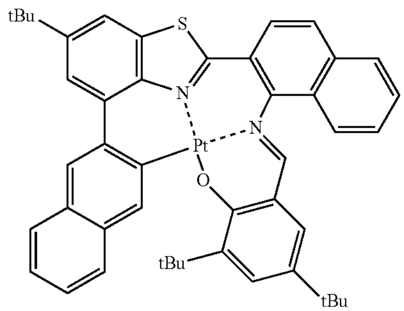
4-260
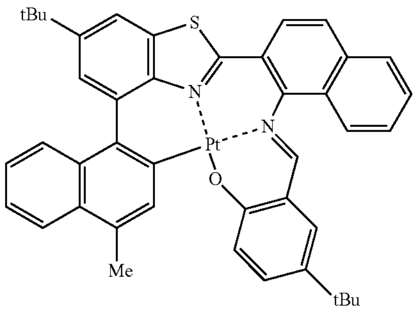
4-261
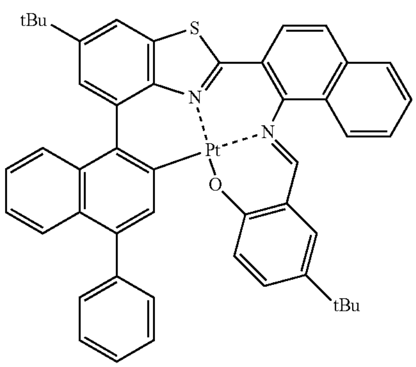
4-262
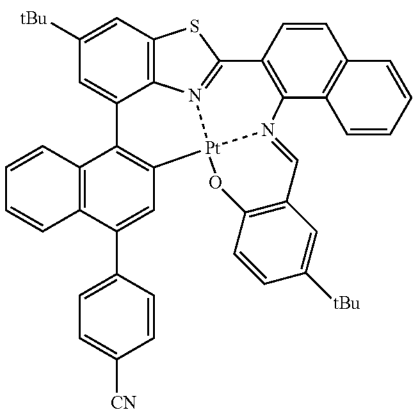
-continued
4-263
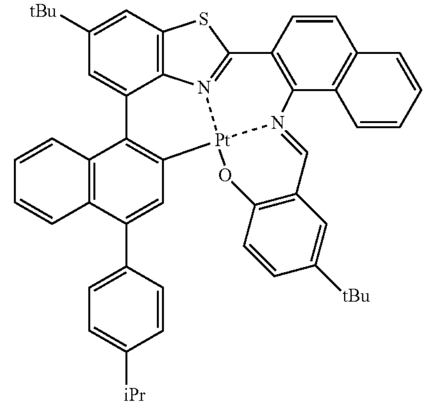
4-264
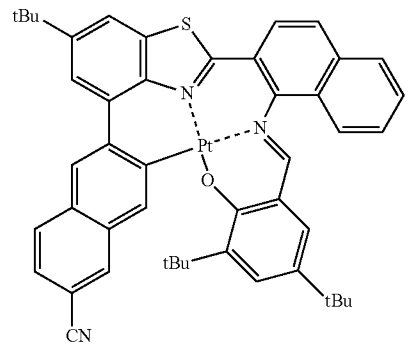
4-265
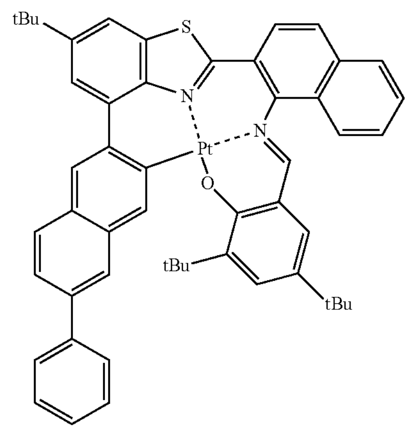
4-266
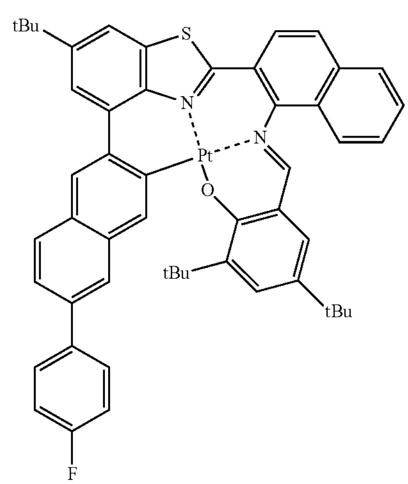

-continued
4-267
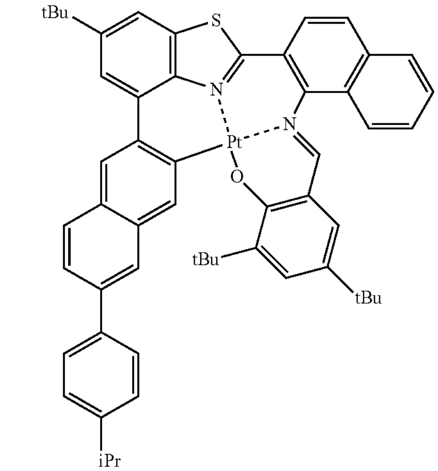
4-268
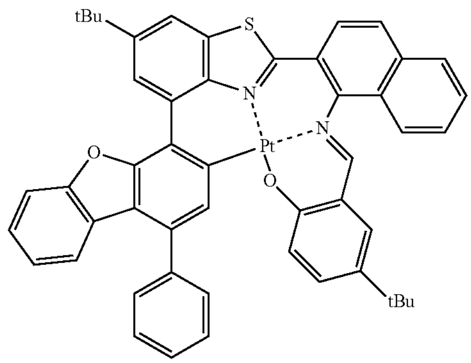
4-269
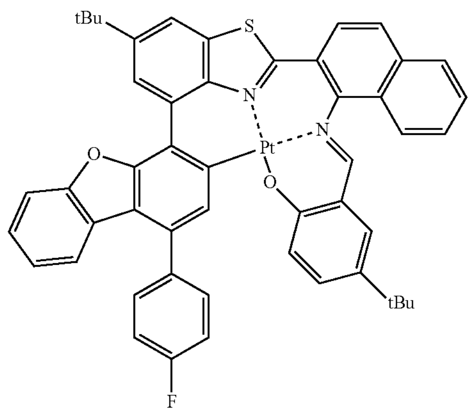
4-270
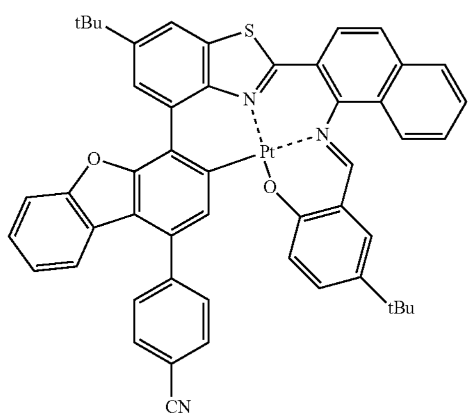
-continued
4-271
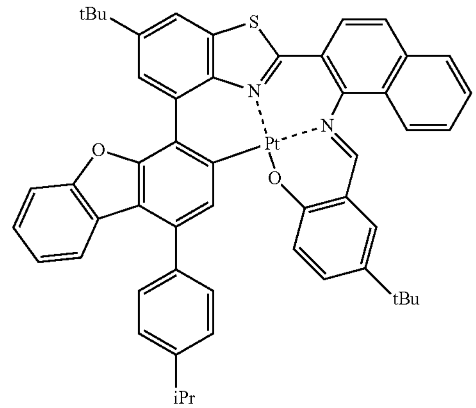
4-272
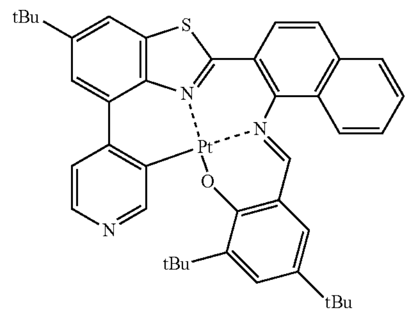
4-273
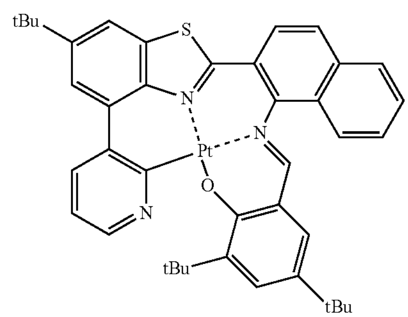
4-274
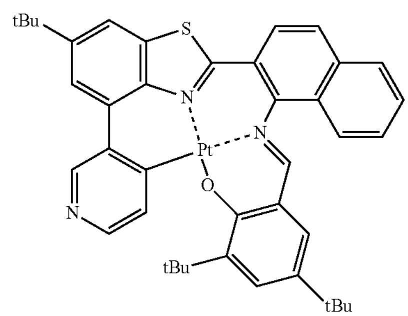

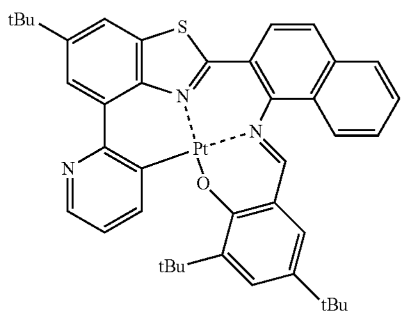
4-275
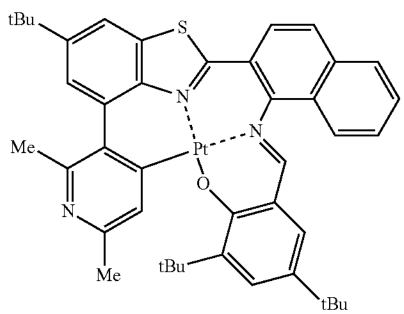
4-276
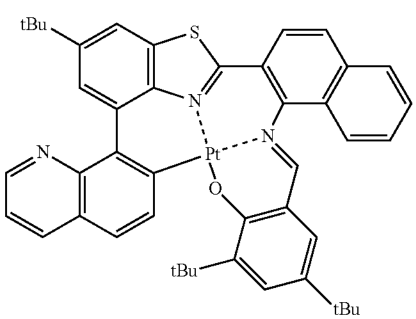
4-277
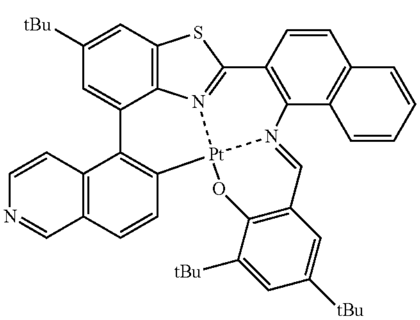
4-278
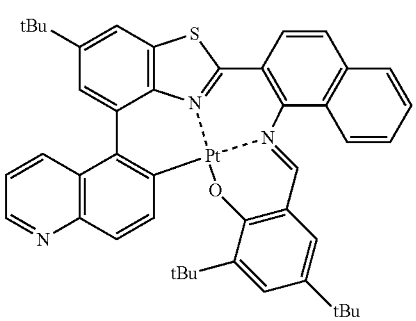
4-279
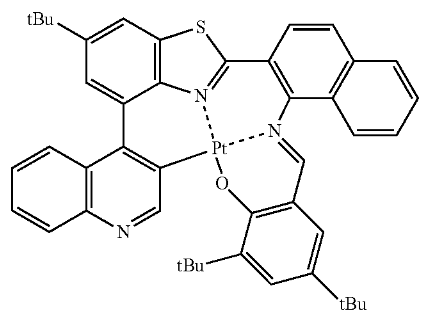
4-280
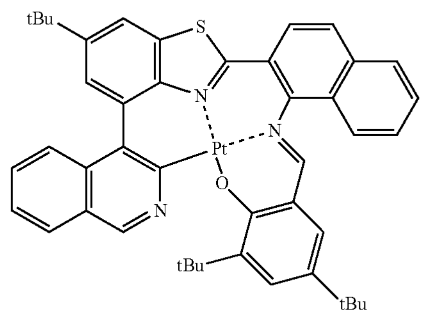
4-281
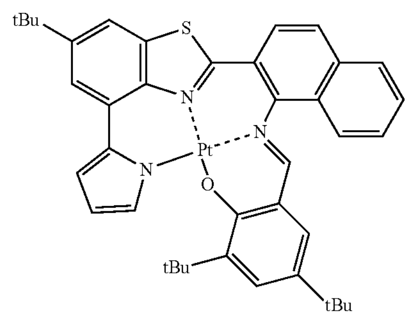
4-282
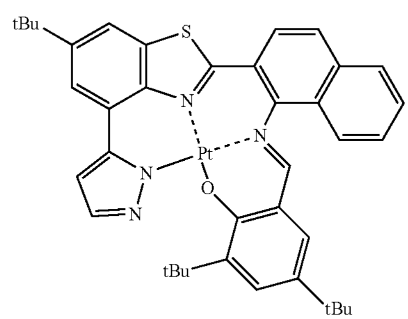
4-283
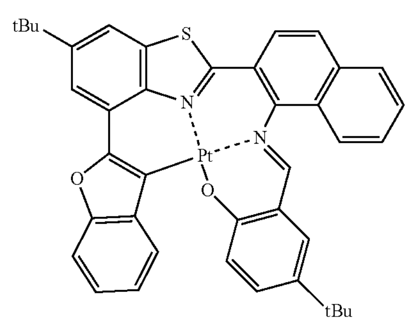
4-284

4-285
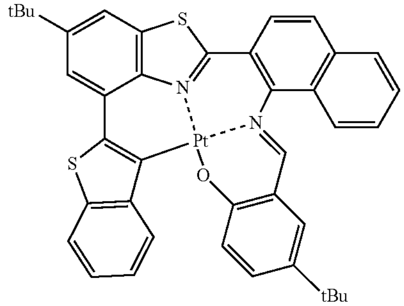
4-286
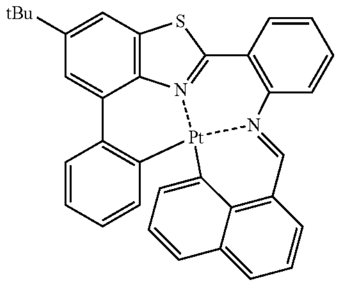
4-287
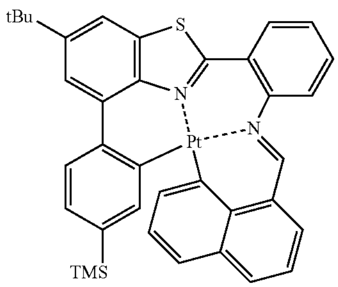
4-288
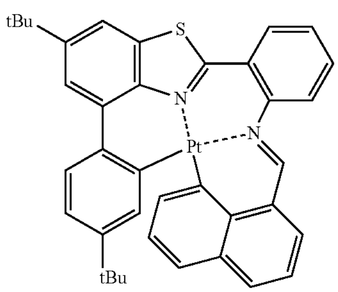
4-289
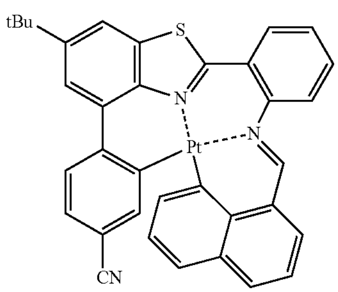
4-290
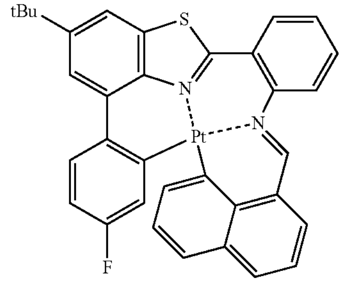
4-291
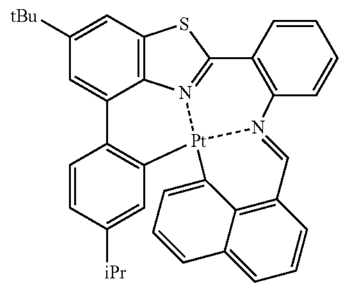
4-292
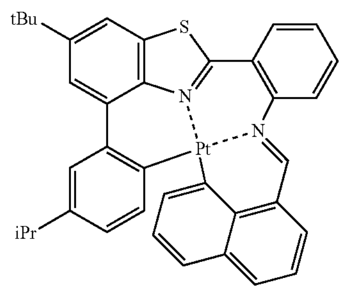
4-293
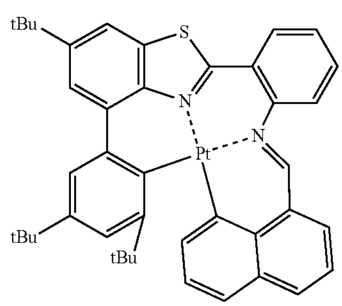
4-294
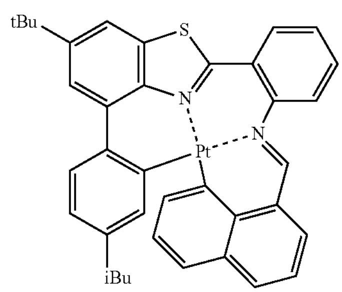

-continued
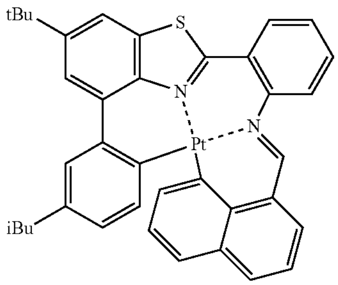
4-295
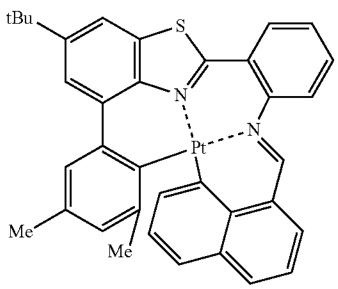
4-296
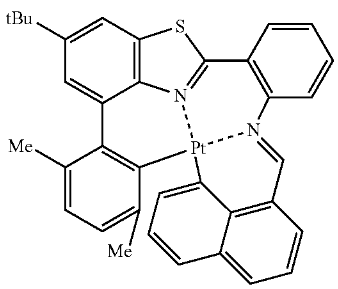
4-297
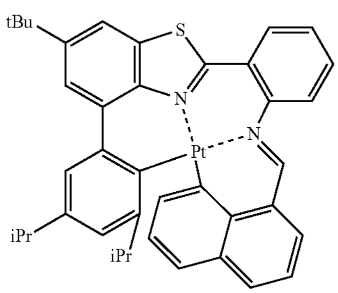
4-298
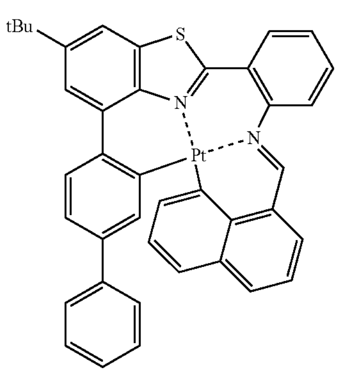
4-299
-continued
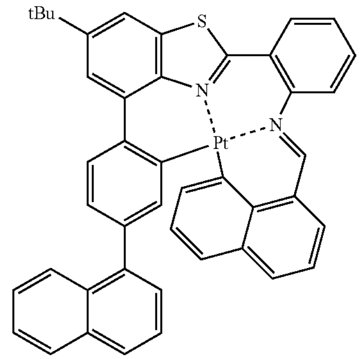
4-300
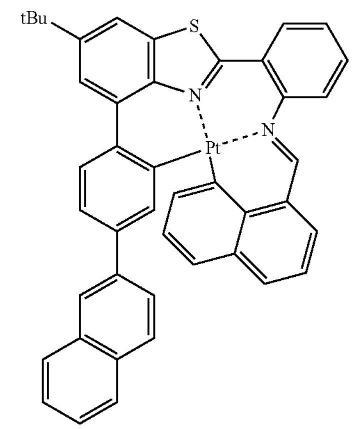
4-301
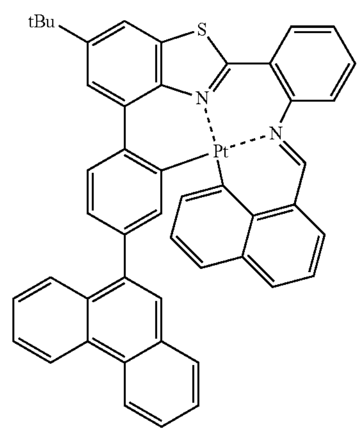
4-302
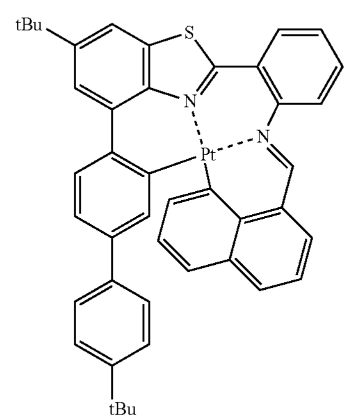
4-303

-continued
4-304
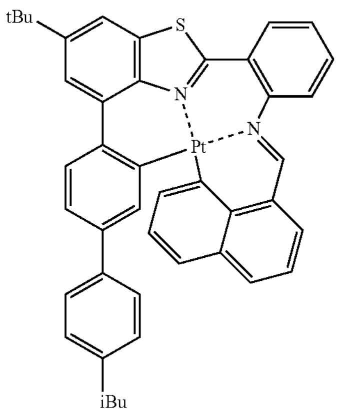
4-305
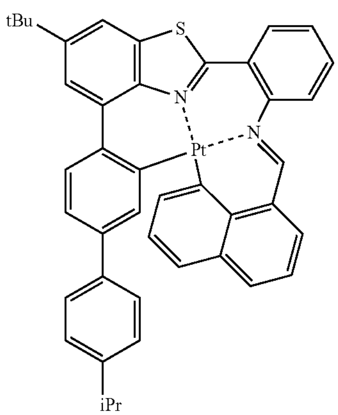
4-306
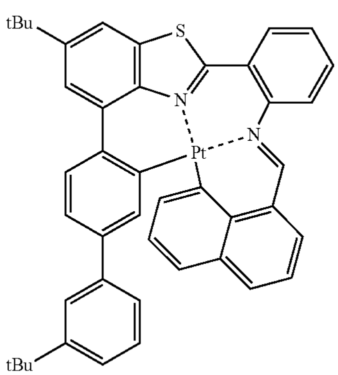
4-307
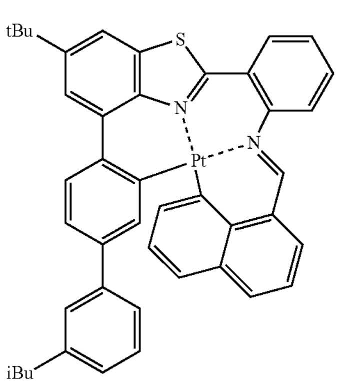
4-308
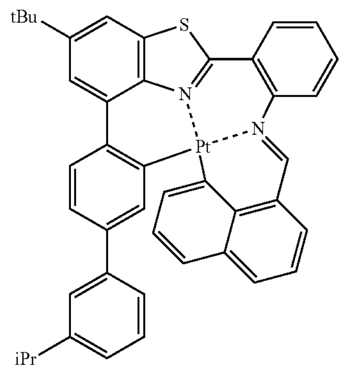
4-309
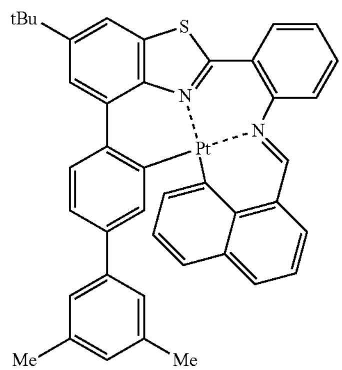
4-310
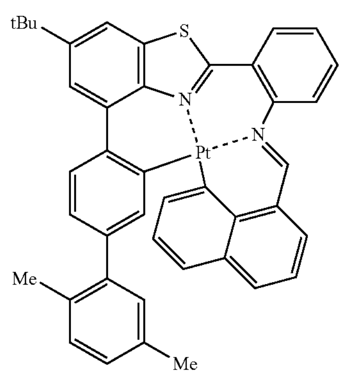
4-311
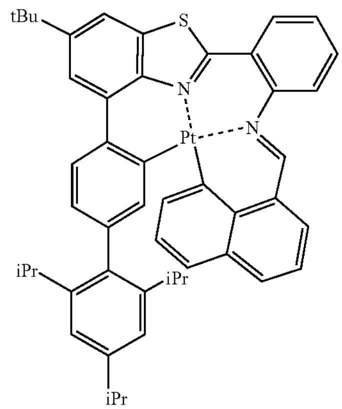

4-312
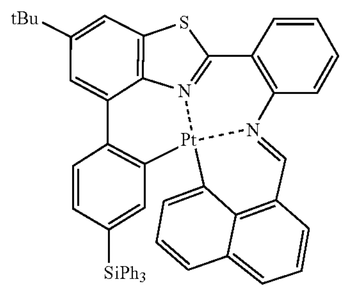
4-313
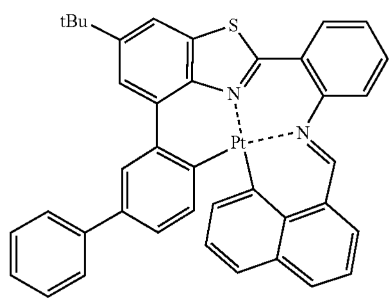
4-314
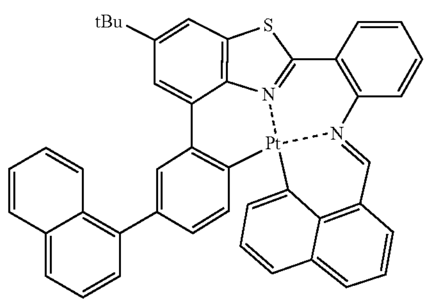
4-315
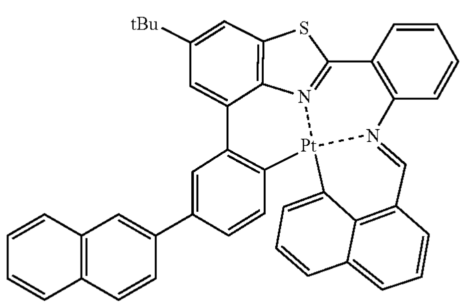
4-316
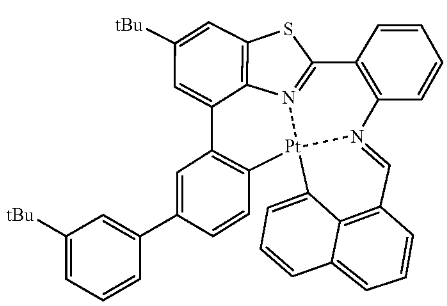
4-317
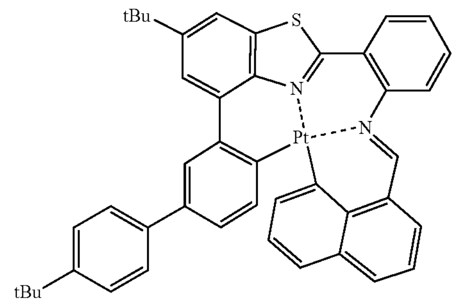
4-318
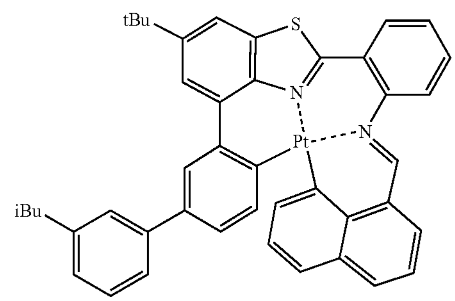
4-319
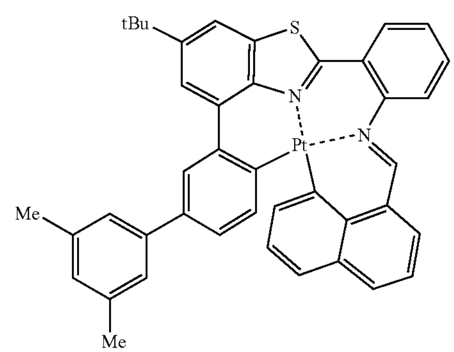
4-320
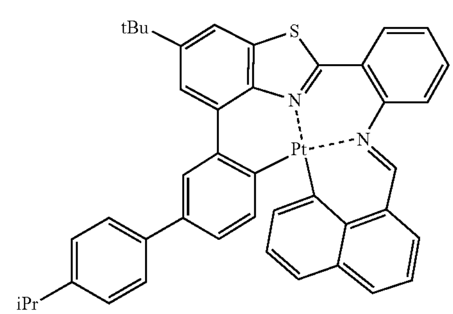
4-321
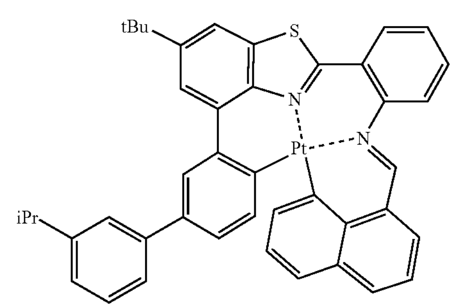

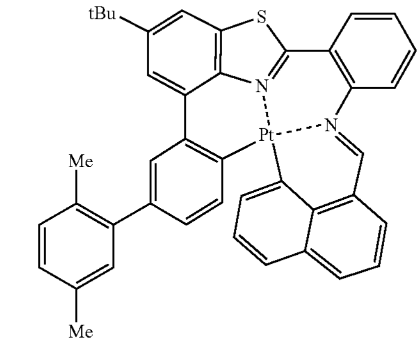
4-322
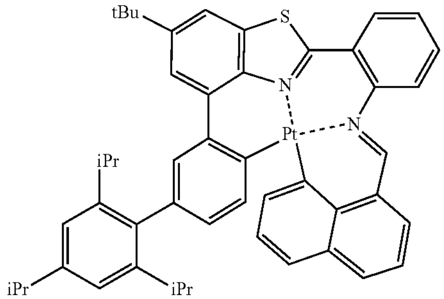
4-323
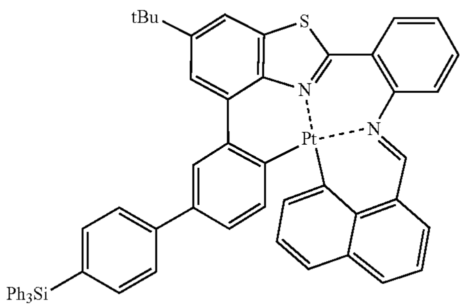
4-324
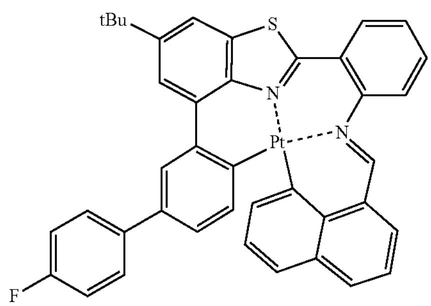
4-325
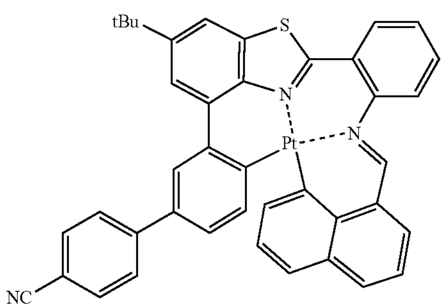
4-326
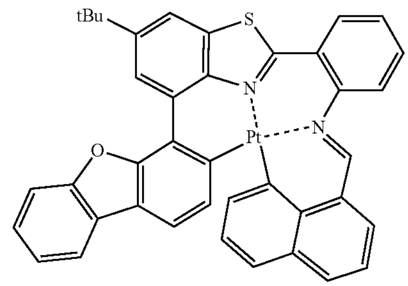
4-327
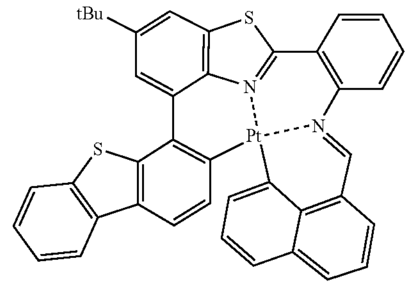
4-328
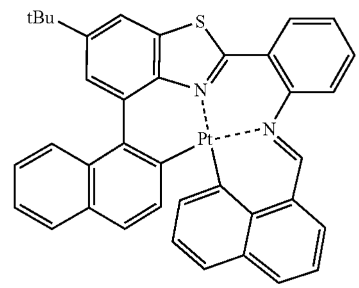
4-329
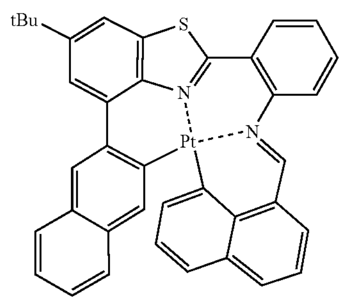
4-330
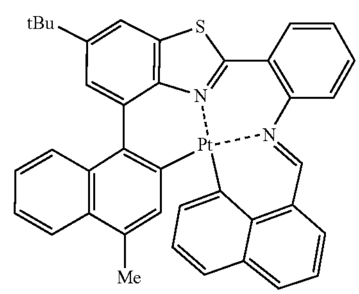
4-331

-continued
4-332
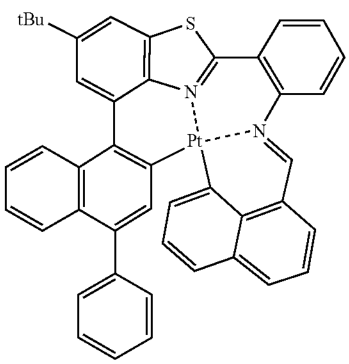
4-333
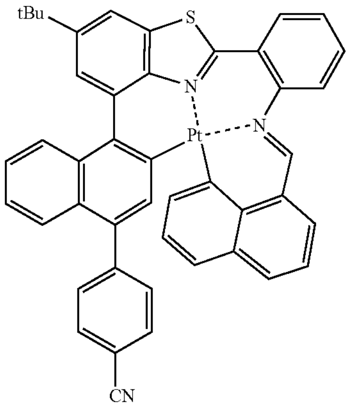
4-334
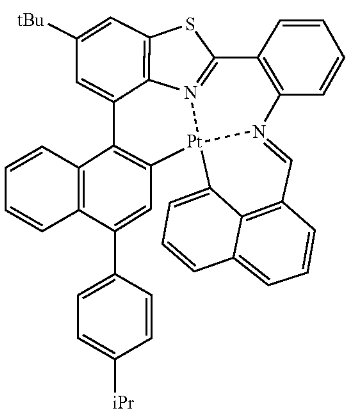
4-335
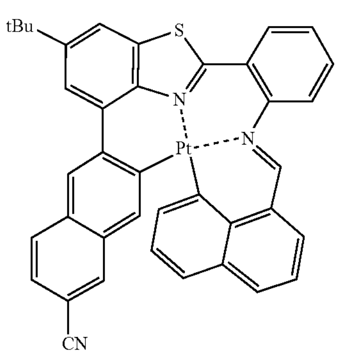
-continued
4-336
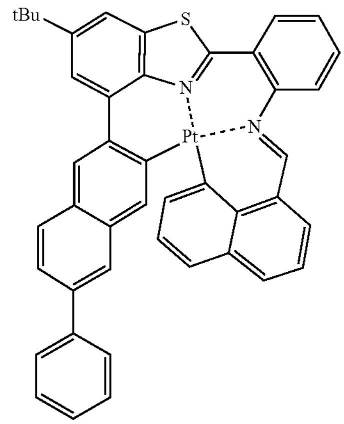
4-337
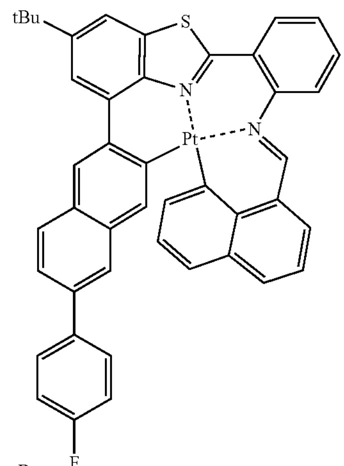
4-338
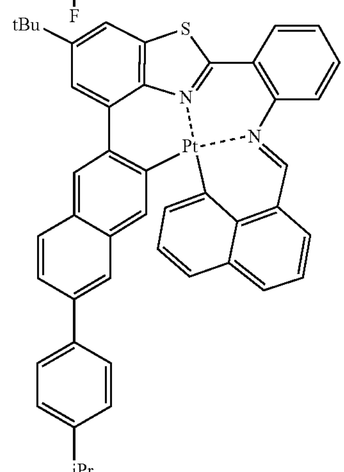
4-339
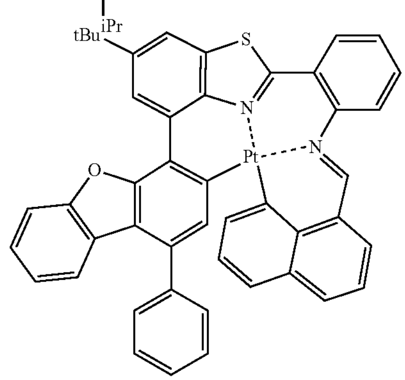

-continued
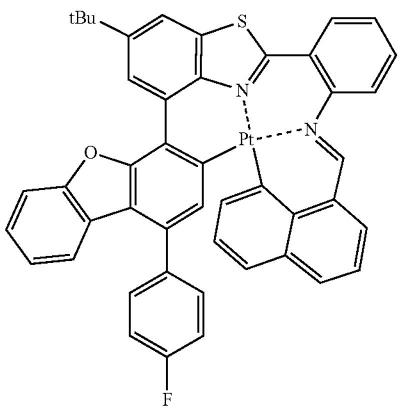
4-340
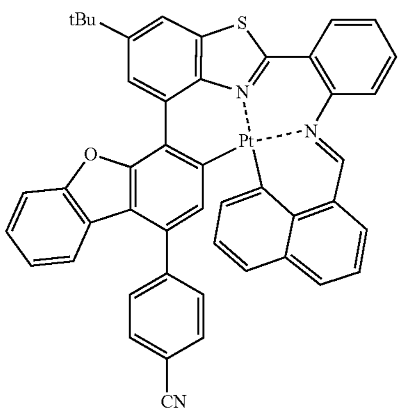
4-341
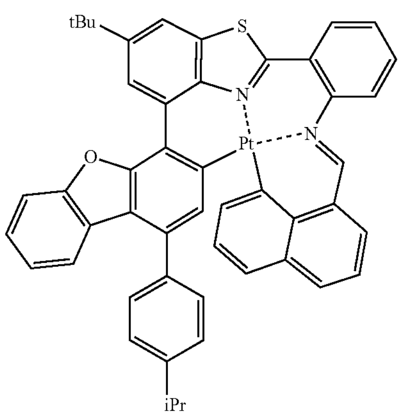
4-342
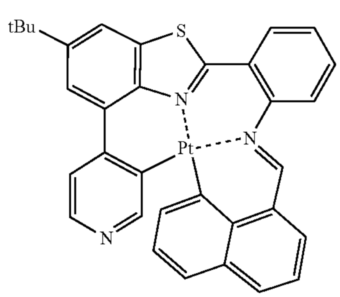
4-343
-continued
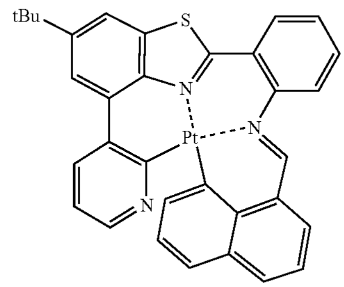
4-344
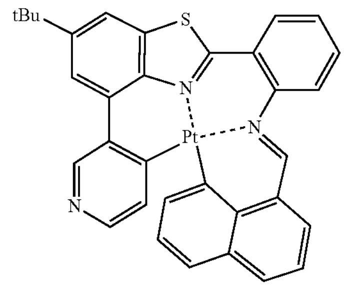
4-345
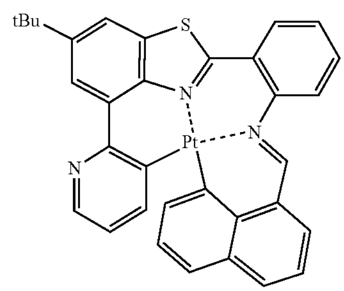
4-346
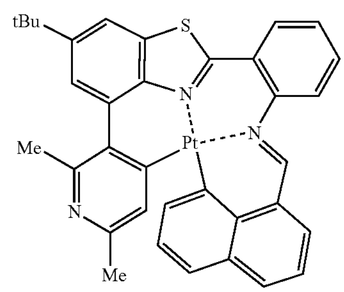
4-347
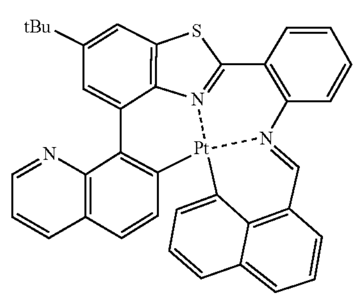
4-348

4-349
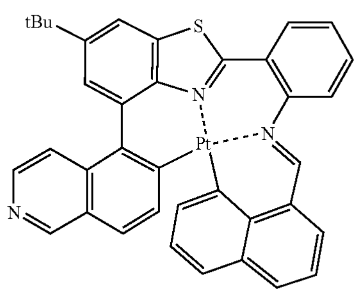
4-350
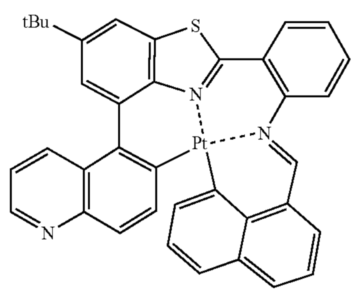
4-351
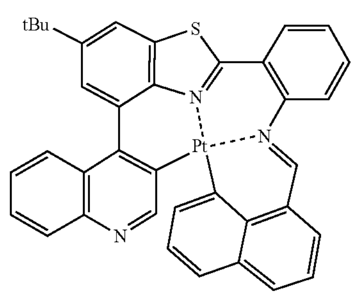
4-352
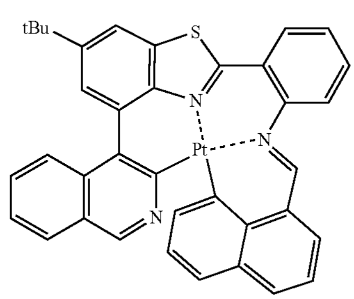
4-353
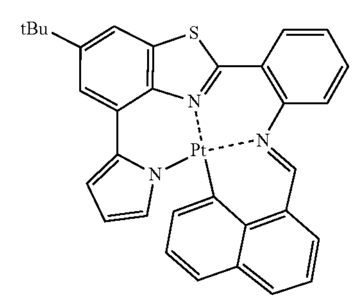
4-354
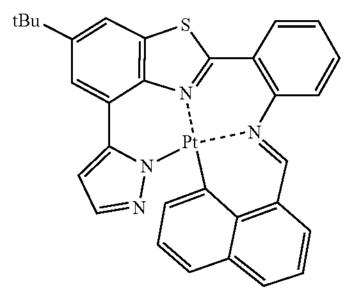
4-355
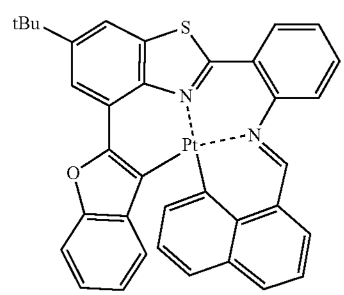
4-356
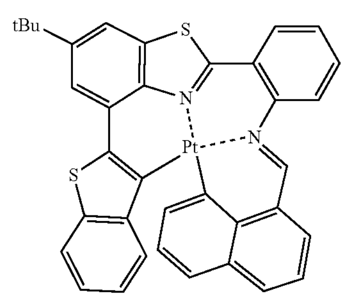
4-357
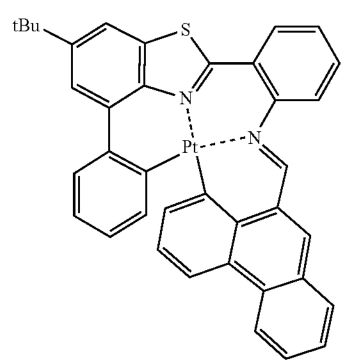
4-358
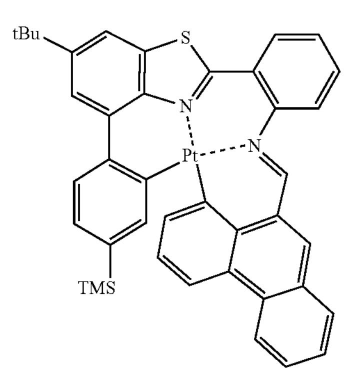

-continued
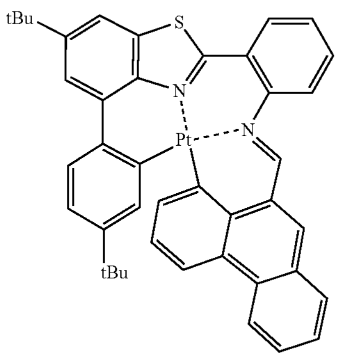
4-359
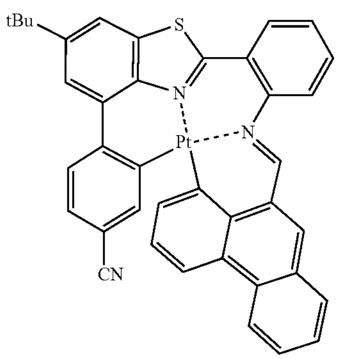
4-360
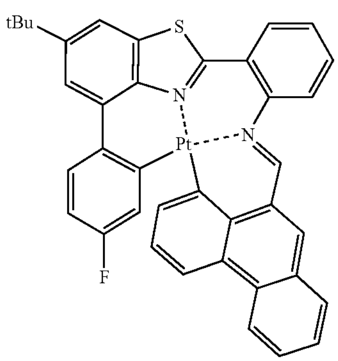
4-361
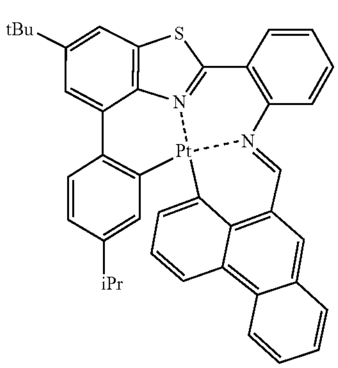
4-362
-continued
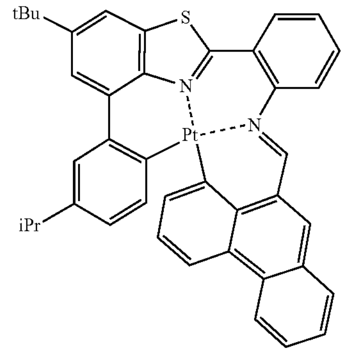
4-363
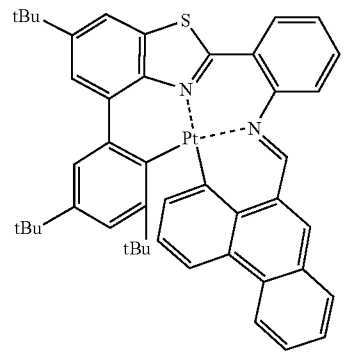
4-364
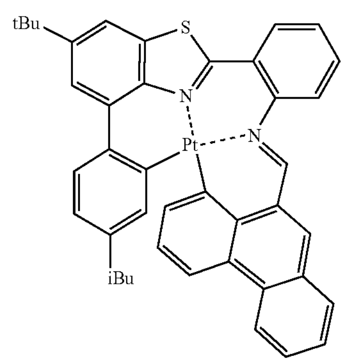
4-365
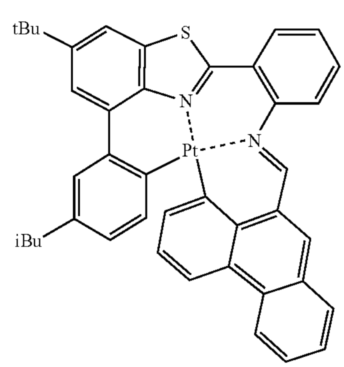
4-366

-continued
4-367
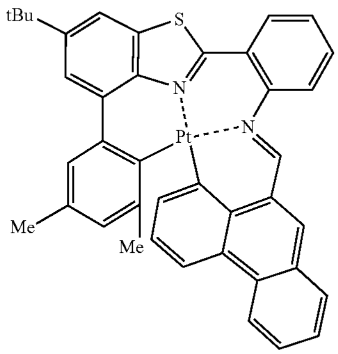
4-368
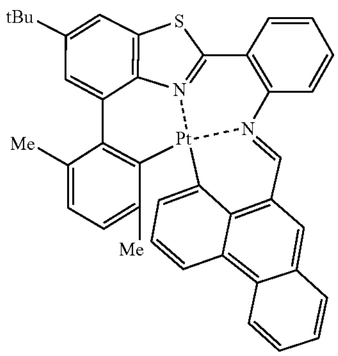
4-369
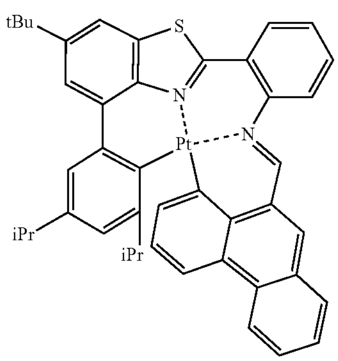
4-370
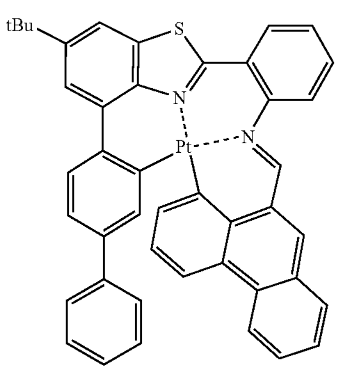
-continued
4-371
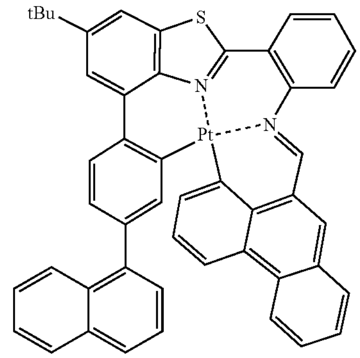
4-372
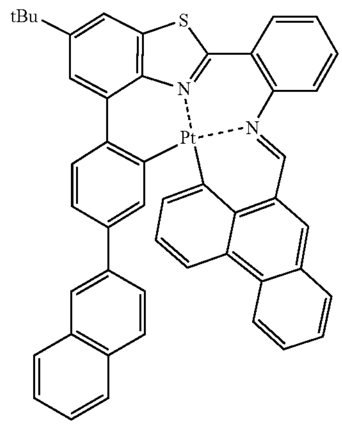
4-373
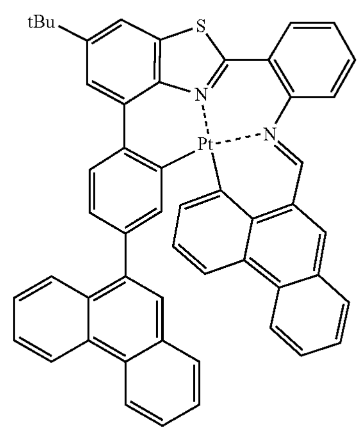
4-374
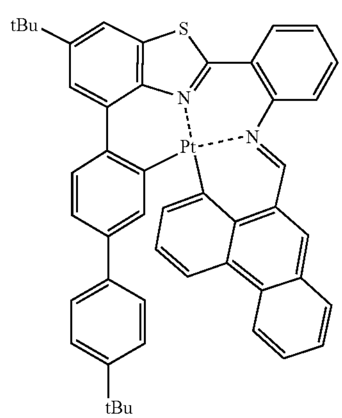

-continued
4-375
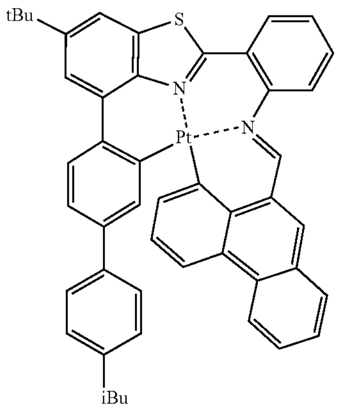
4-376
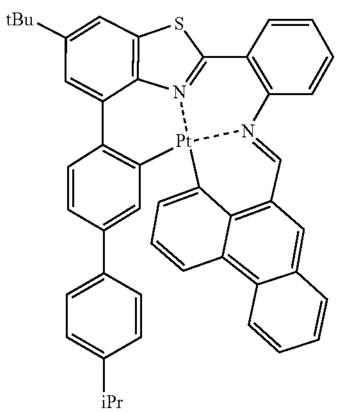
4-377
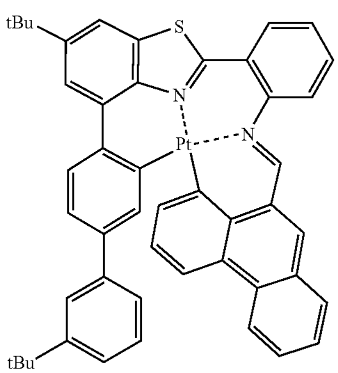
4-378
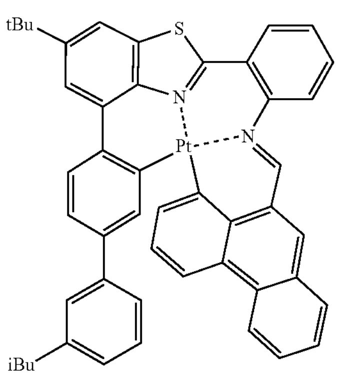
-continued
4-379
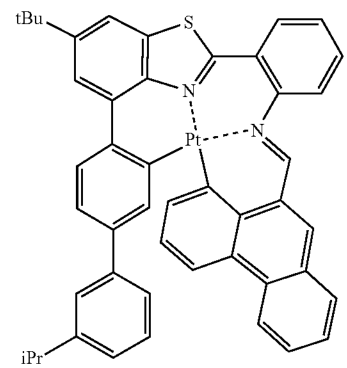
4-380
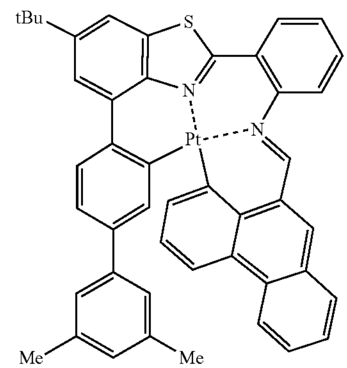
4-381
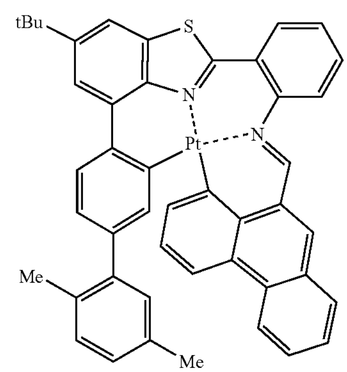
4-382
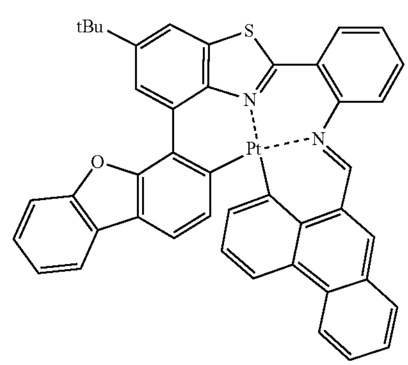

4-383
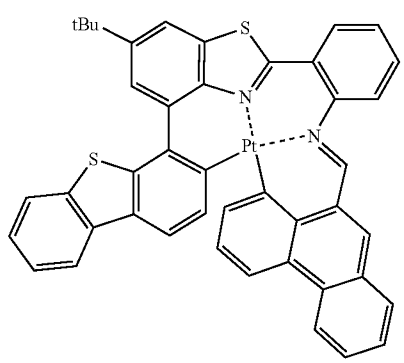
4-384
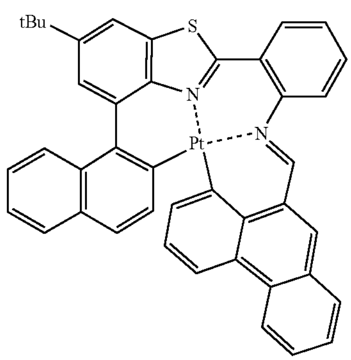
4-385
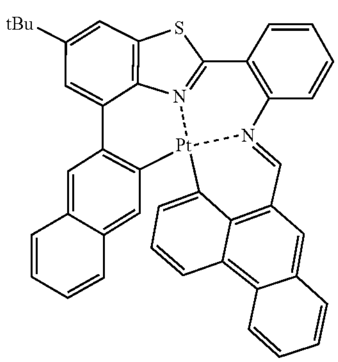
4-386
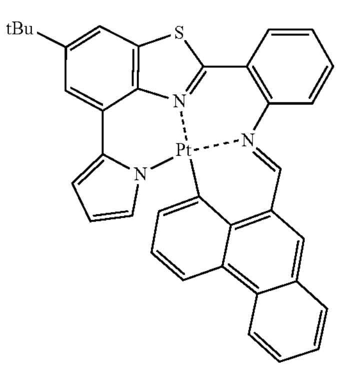
4-387
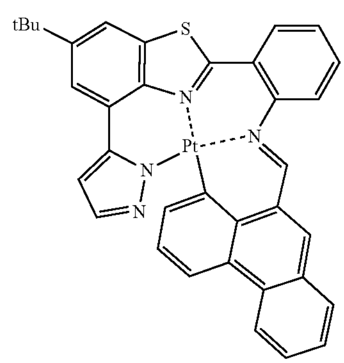
4-388
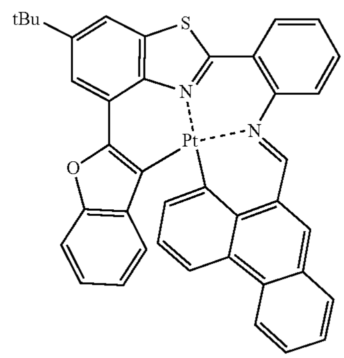
4-389
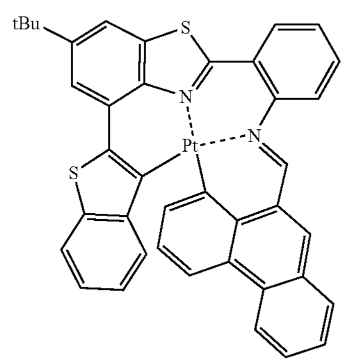
4-390
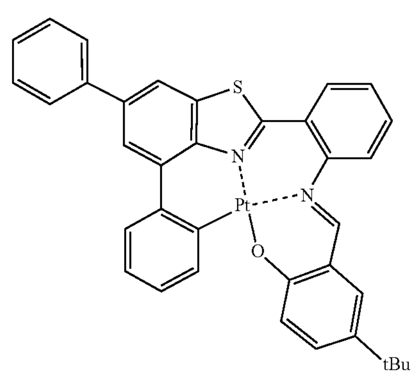

-continued
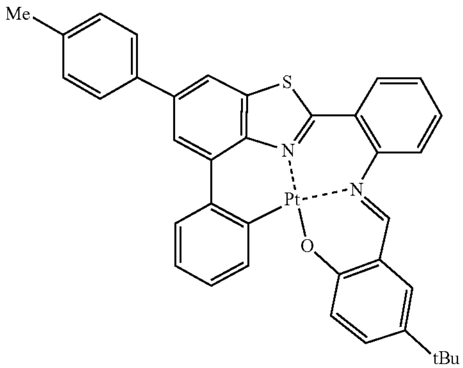
4-391
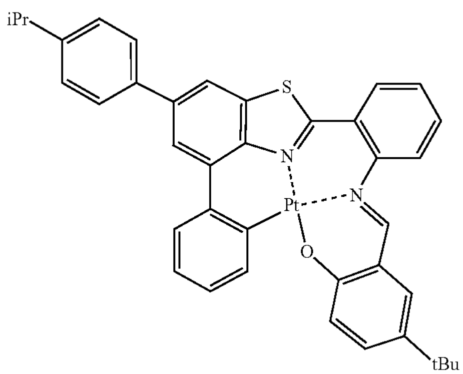
4-392
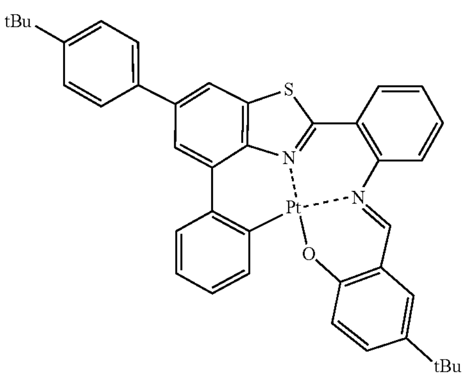
4-393
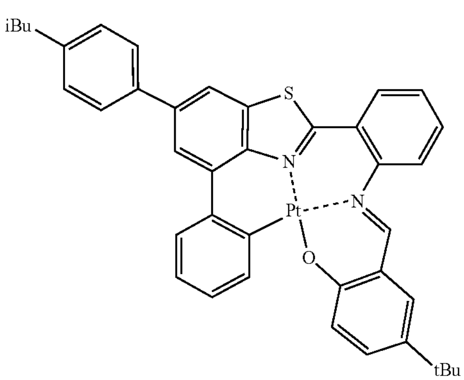
4-394
-continued
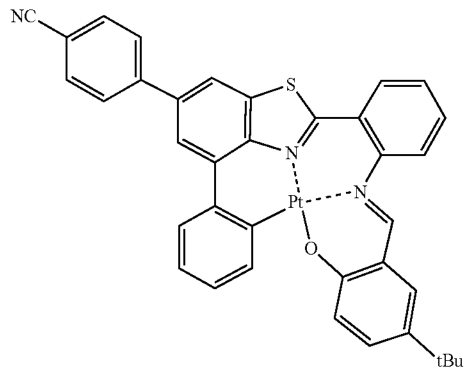
4-395
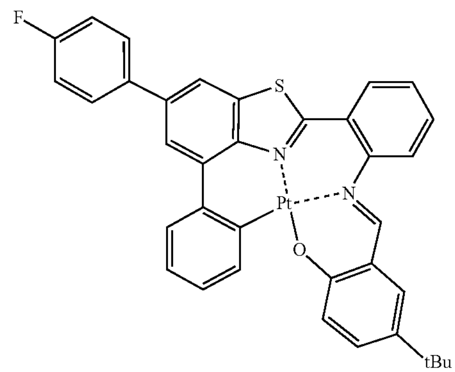
4-396
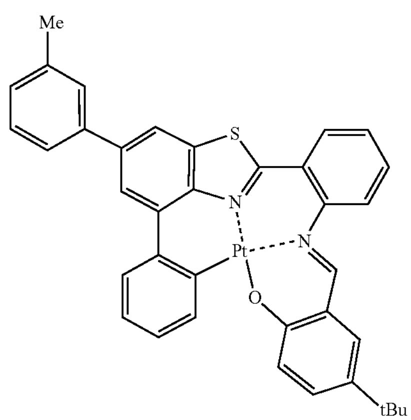
4-397
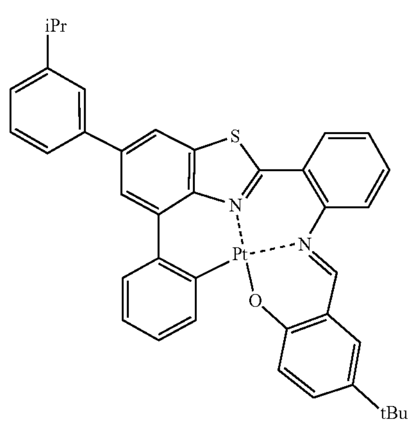
4-398

-continued
4-399
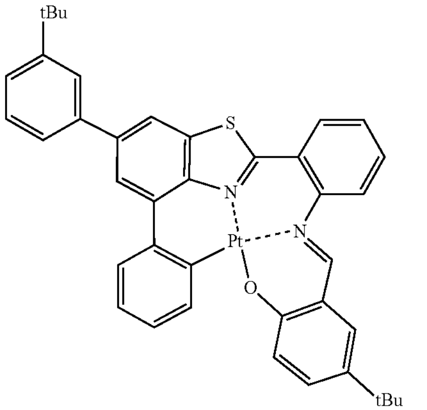
4-400
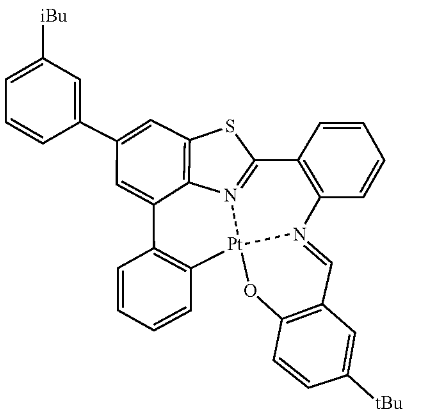
4-401
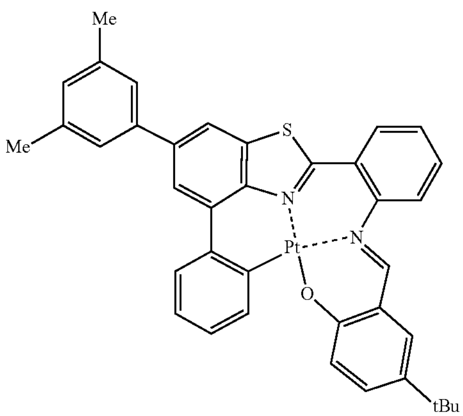
4-402
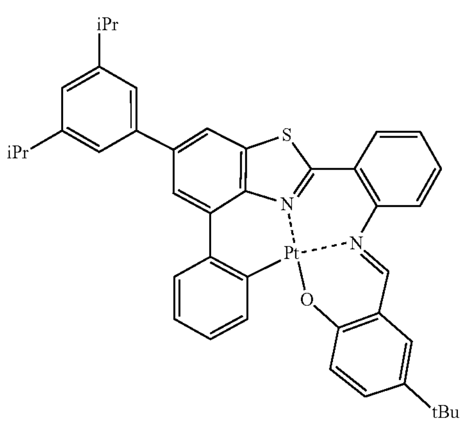
-continued
4-403
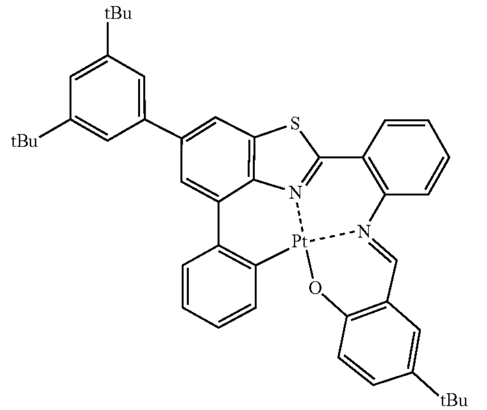
4-404
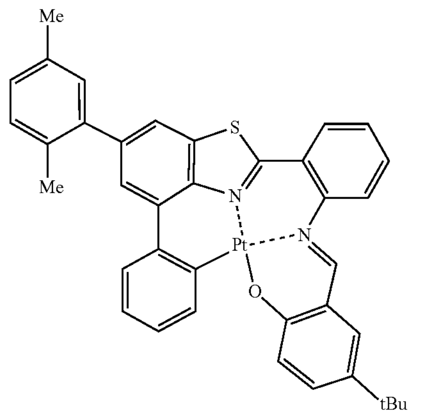
4-405
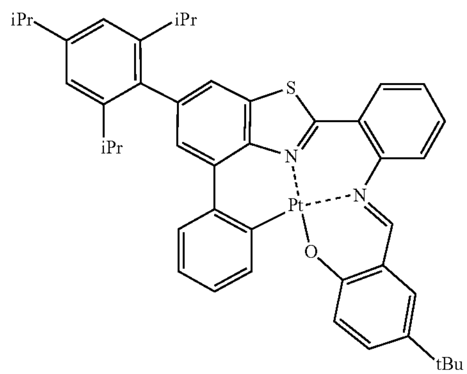
4-406
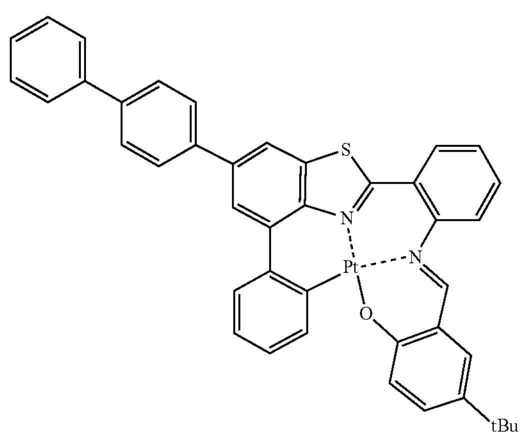

-continued
4-407
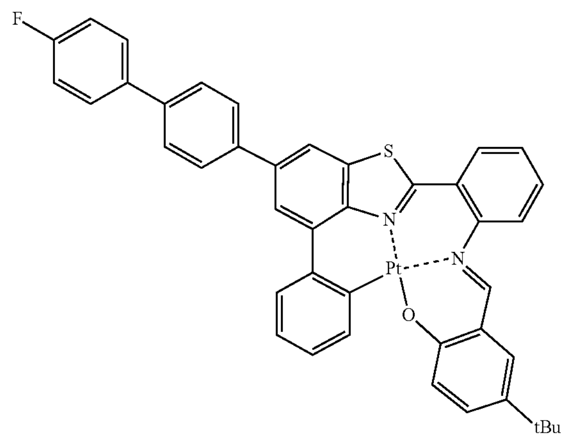
4-408
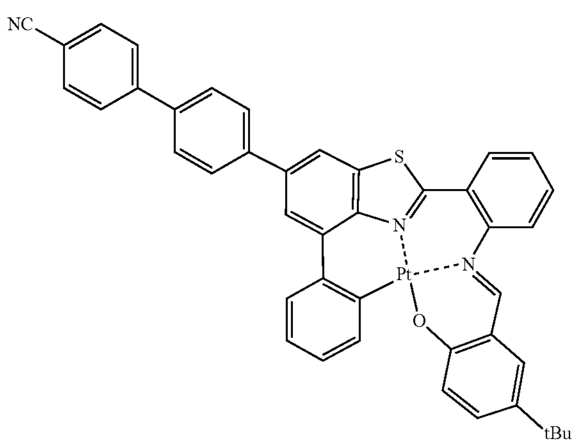
4-409
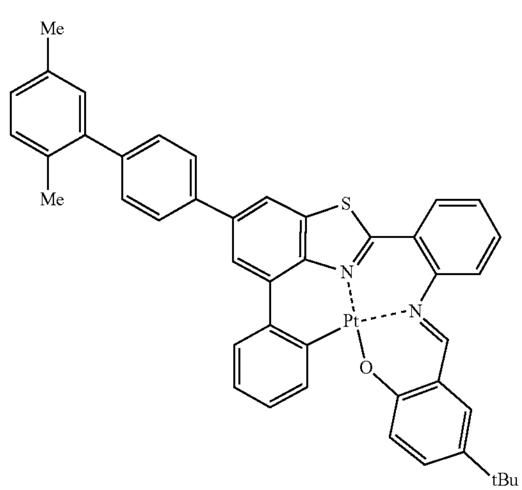
-continued
4-410
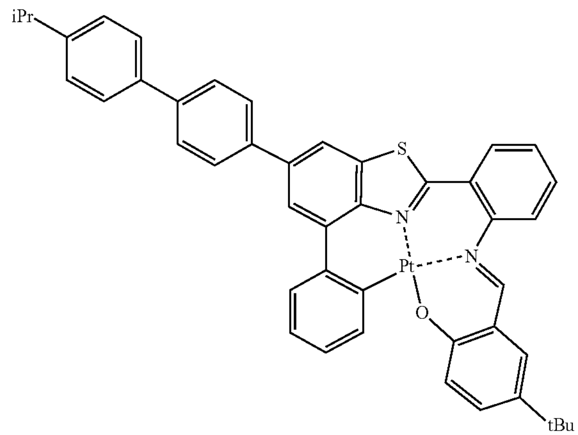
4-411
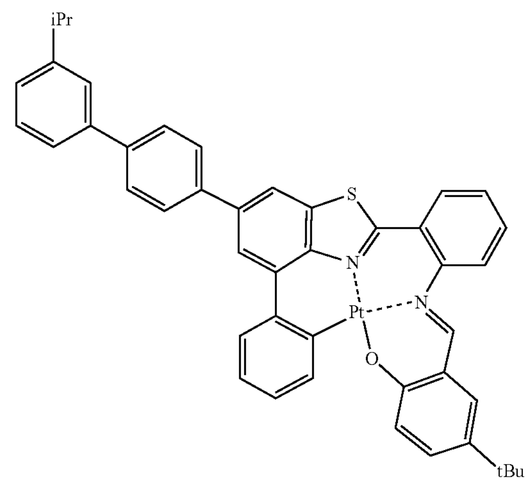
4-412
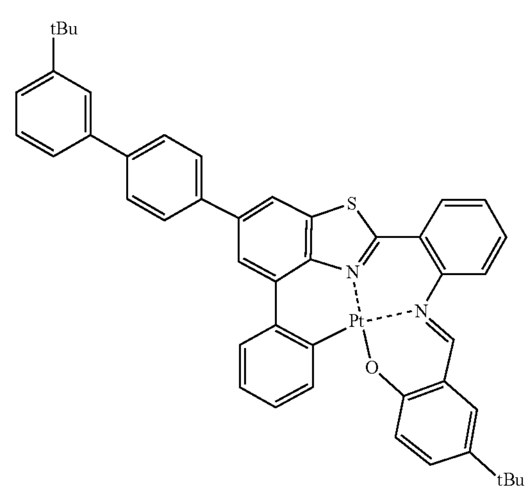

4-413
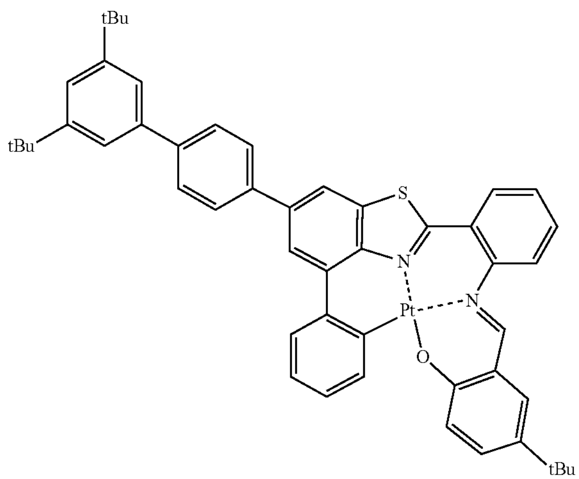
4-414
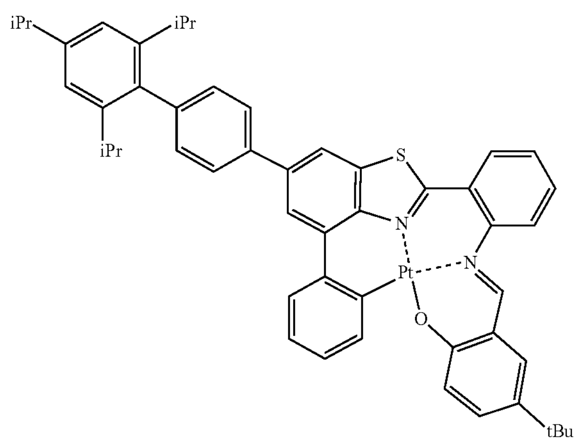
4-415
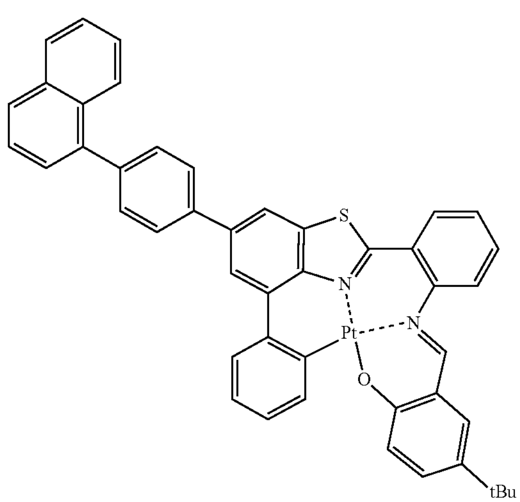
4-416
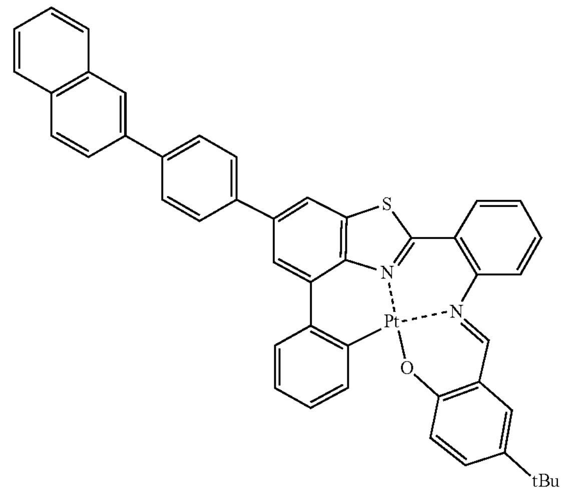
4-417
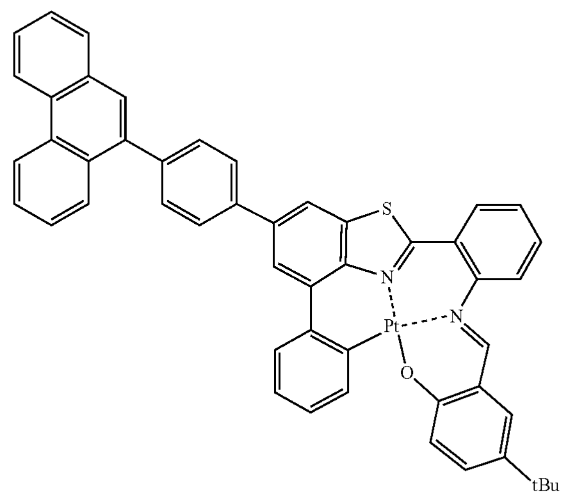
4-418
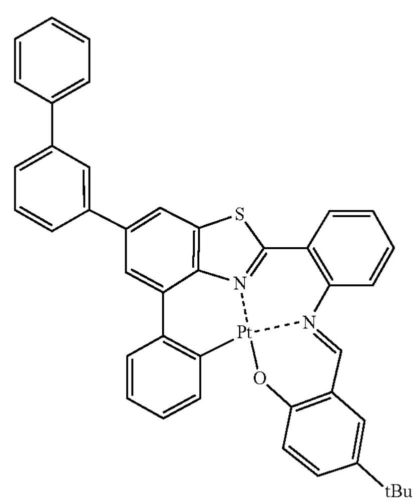

-continued
4-419
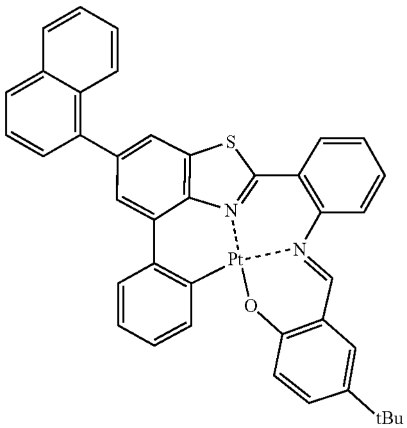
4-420
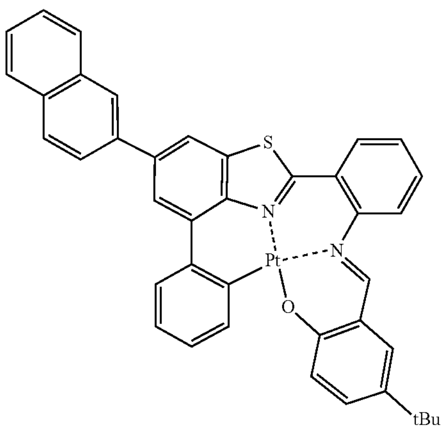
4-421
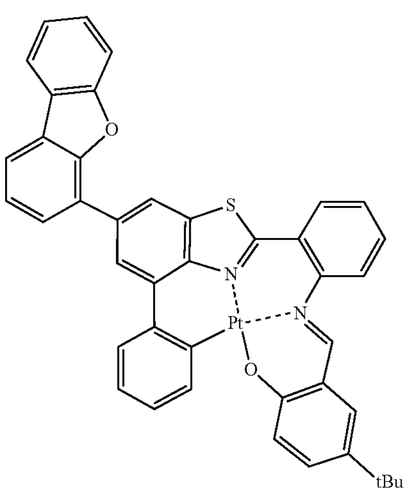
-continued
4-422
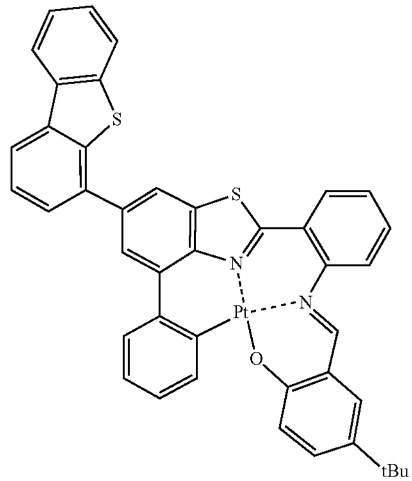
4-423
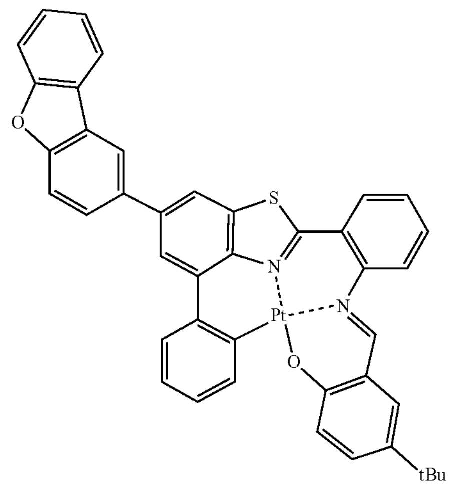
4-424
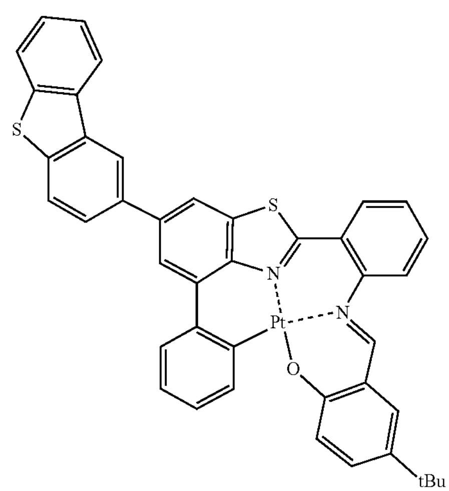

4-425
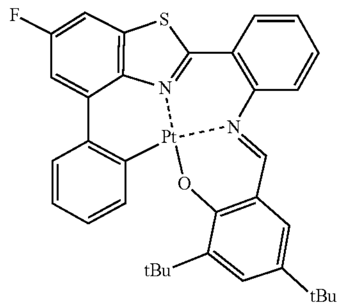
4-426
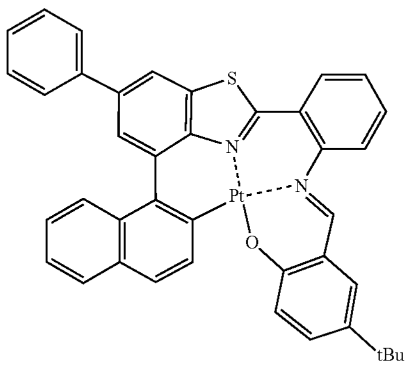
4-427
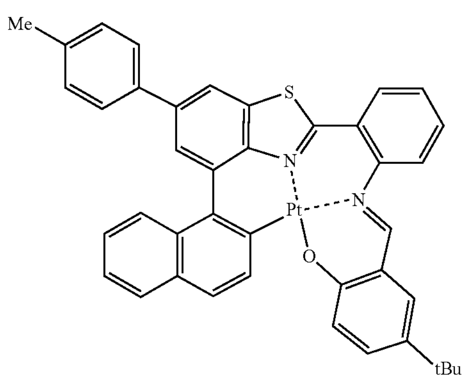
4-428
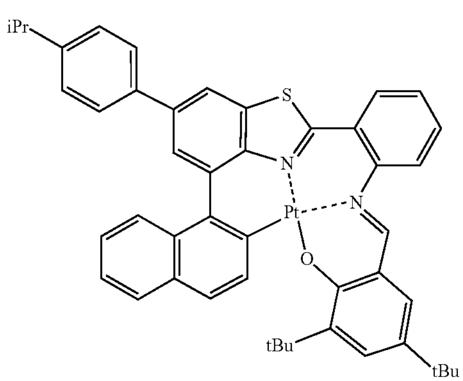
4-429
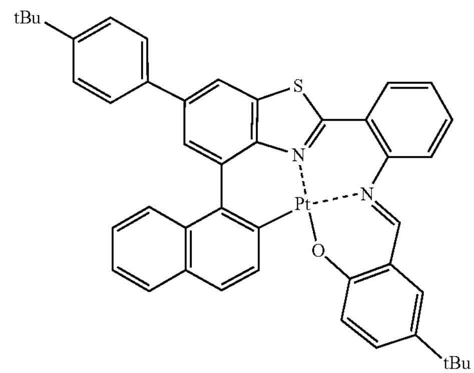
4-430
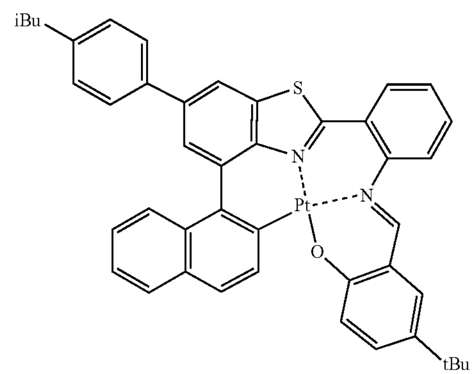
4-431
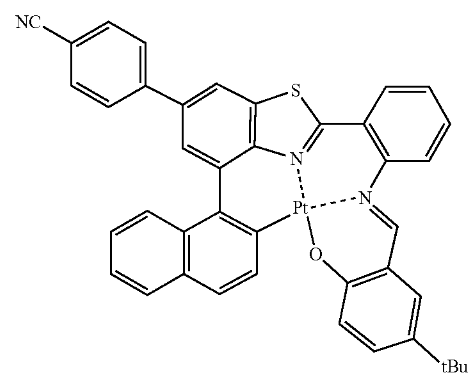
4-432
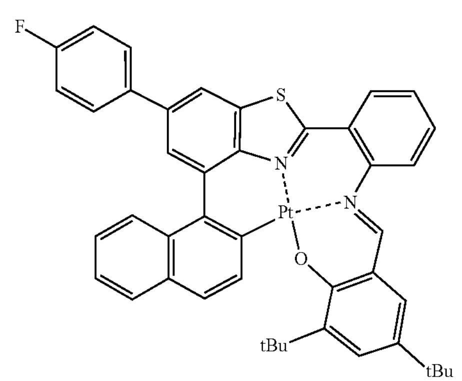

-continued
4-433
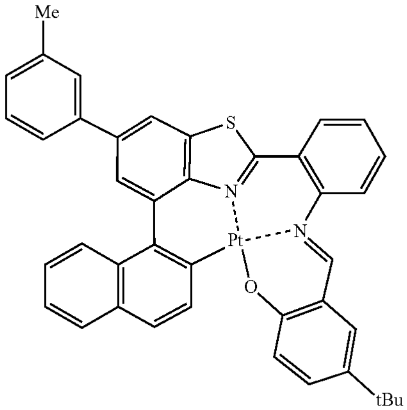
4-434
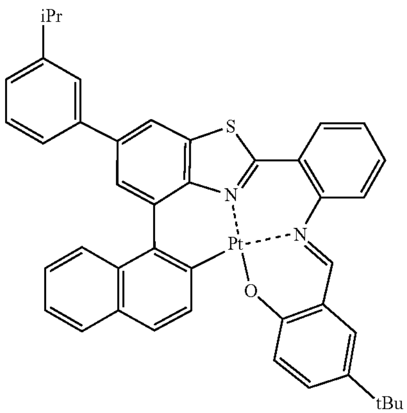
4-435
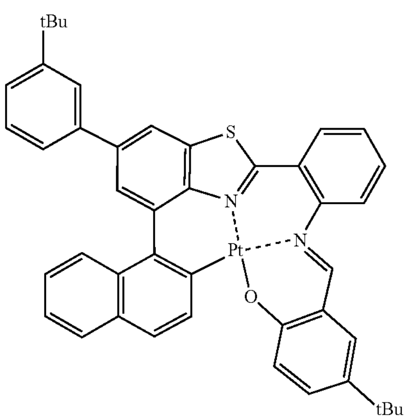
4-436
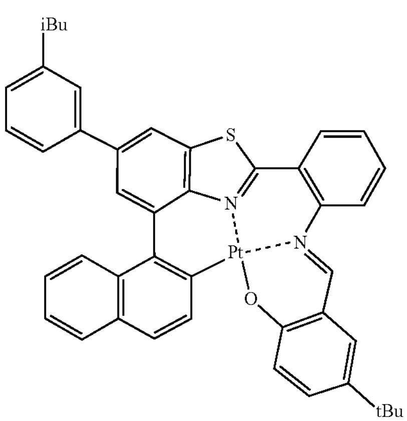
-continued
4-437
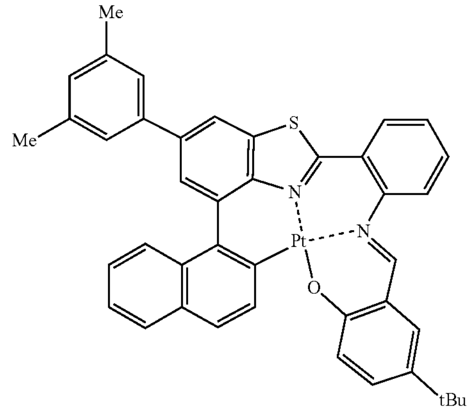
4-438
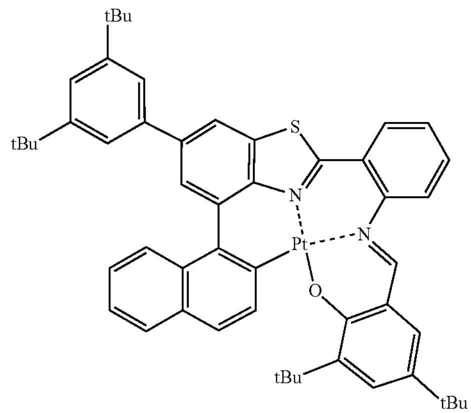
4-439
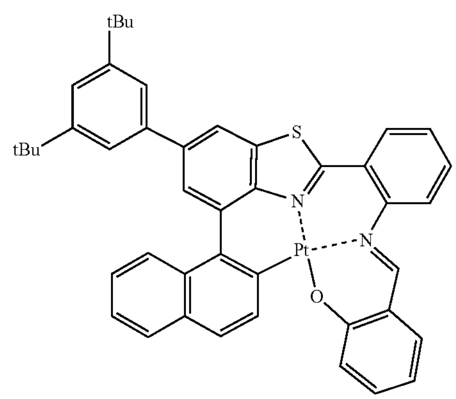
4-440
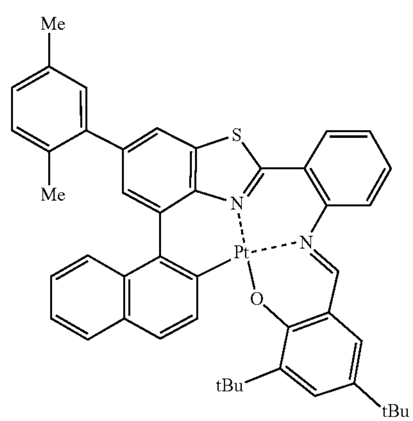

-continued
4-441
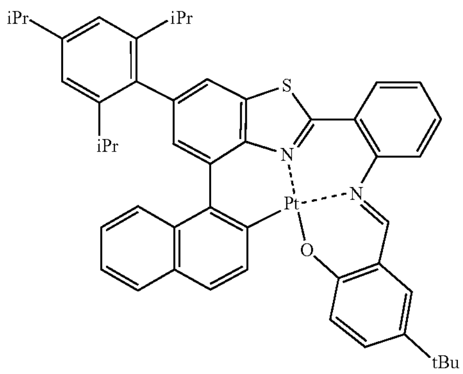
4-442
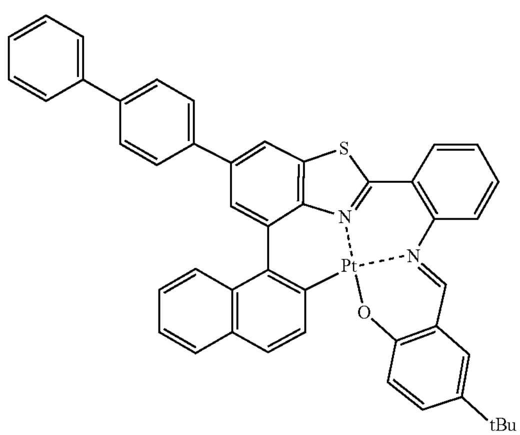
4-443
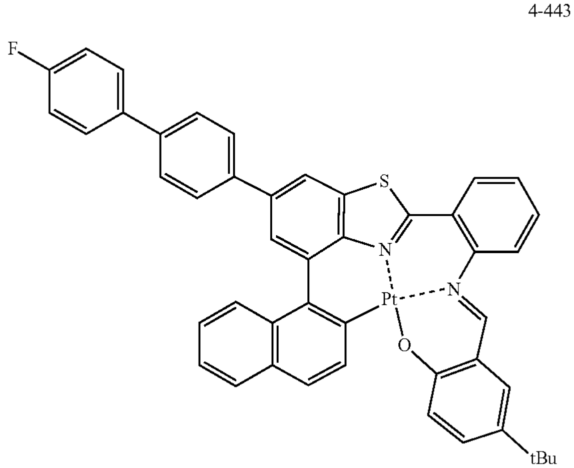
-continued
4-444
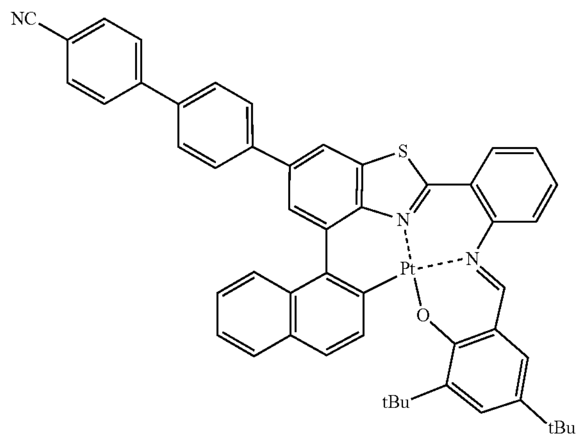
4-445
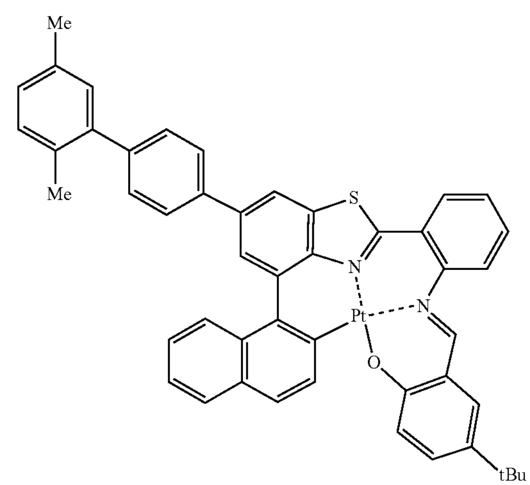
4-446
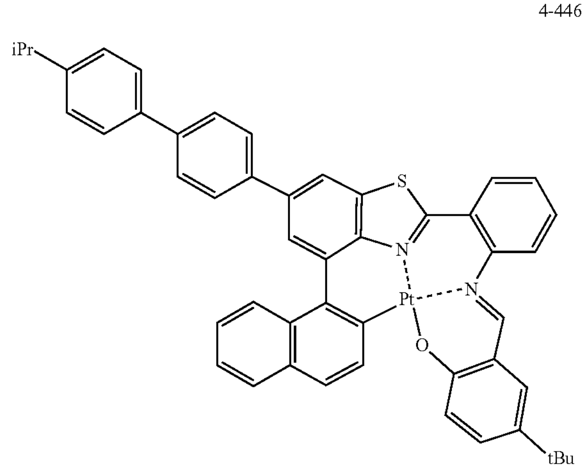

4-447
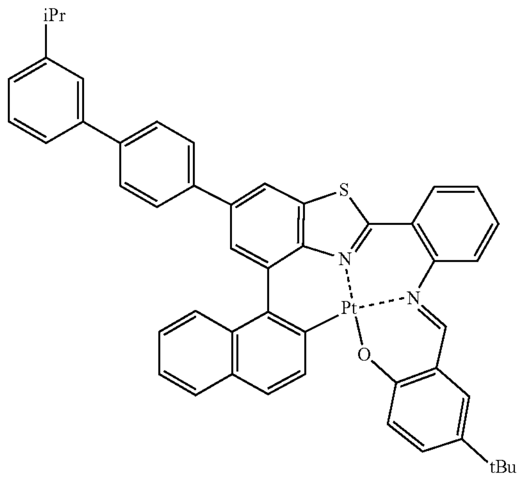
4-448
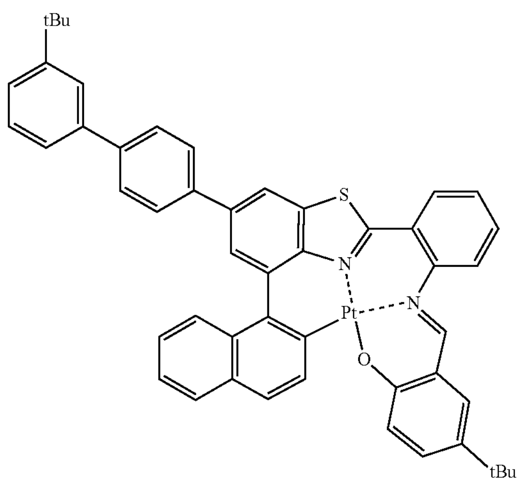
4-449
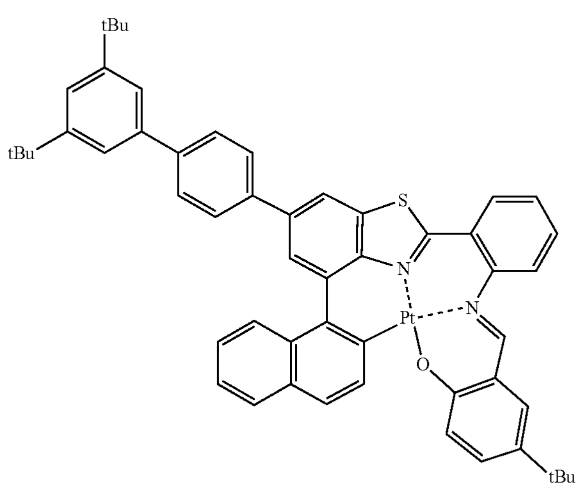
4-450
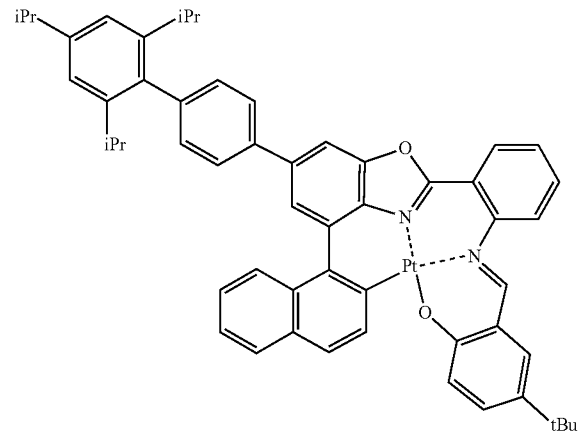
4-451
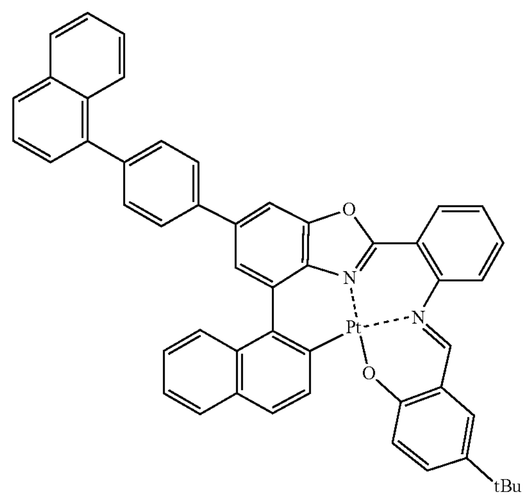
4-452
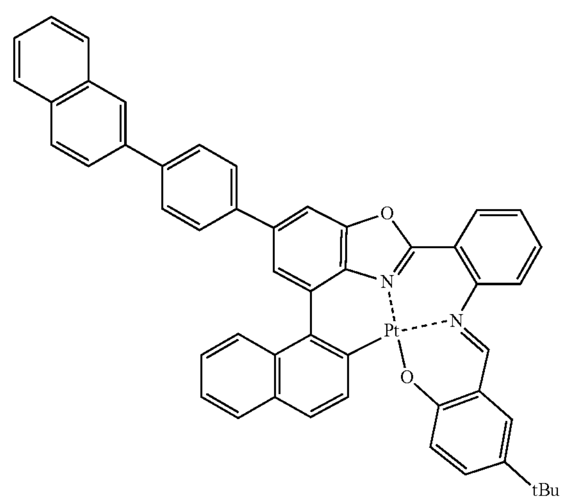

4-453
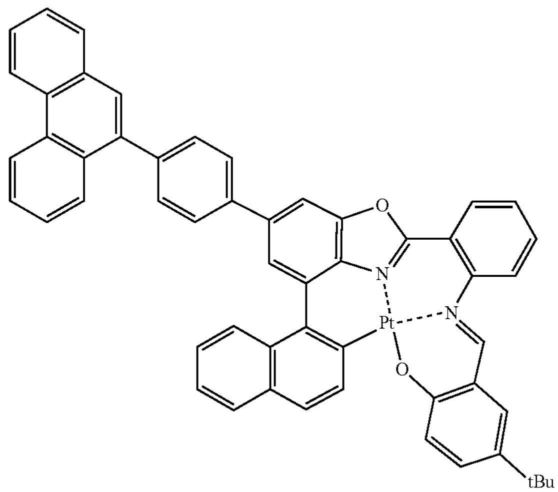
4-454
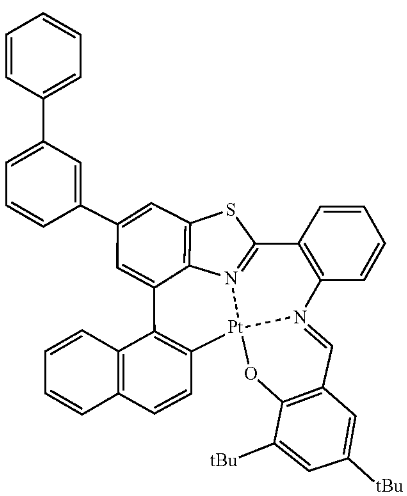
4-455
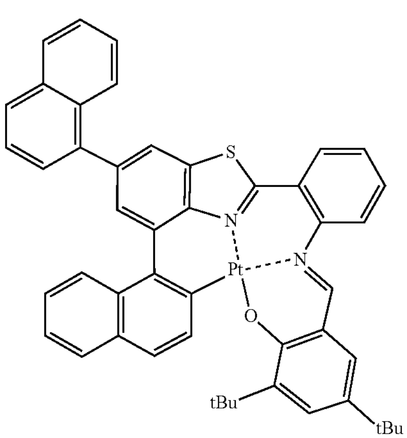
4-456
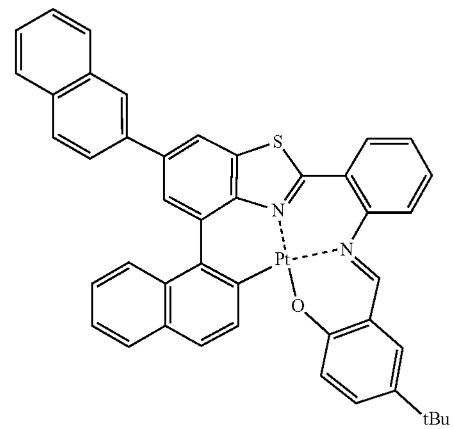
4-457
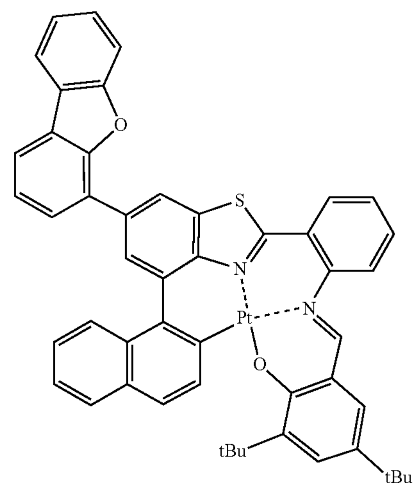
4-458
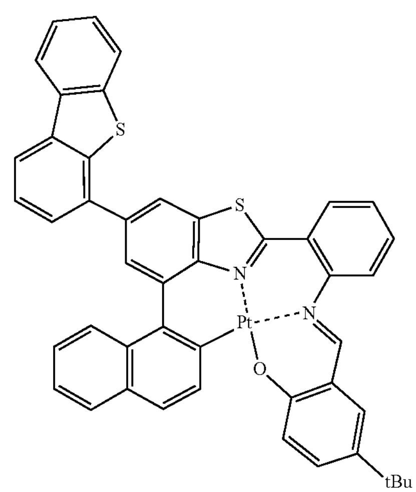

-continued
4-459
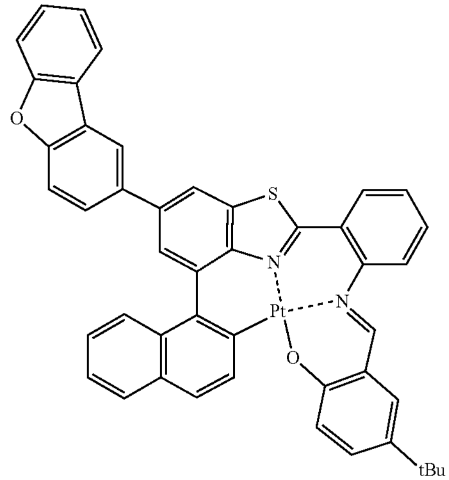
4-460
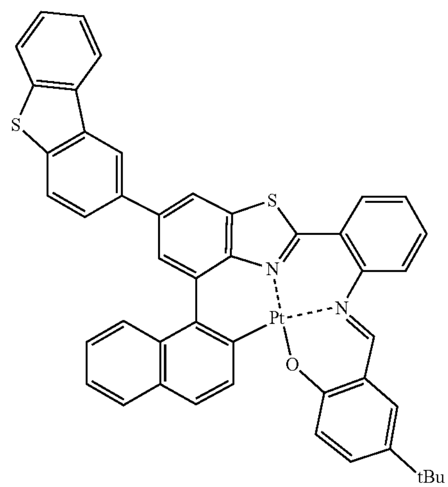
4-461
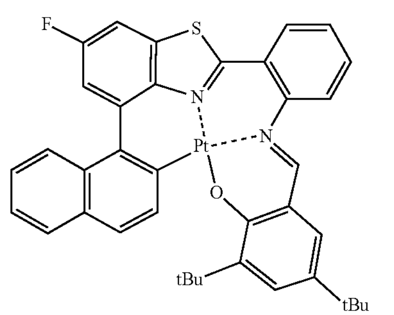
4-462
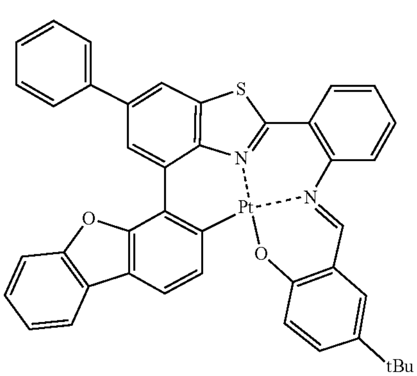
-continued
4-463
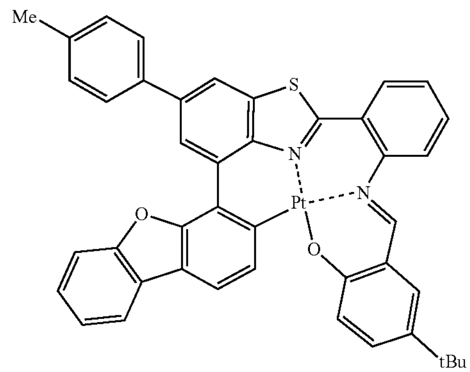
4-464
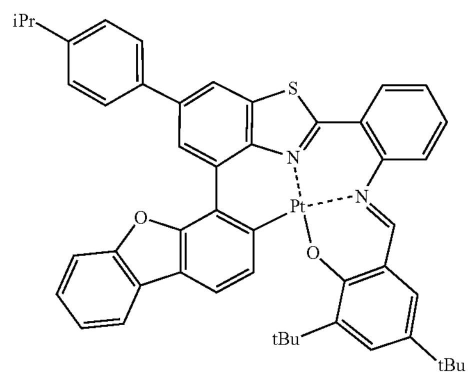
4-465
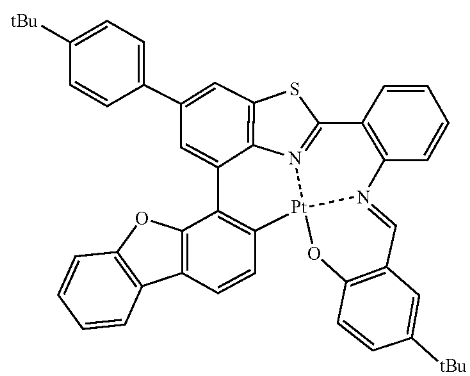
4-466
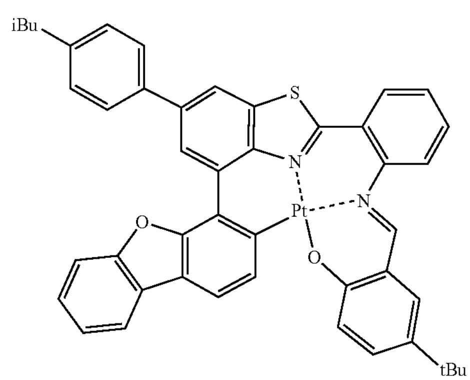

-continued
4-467
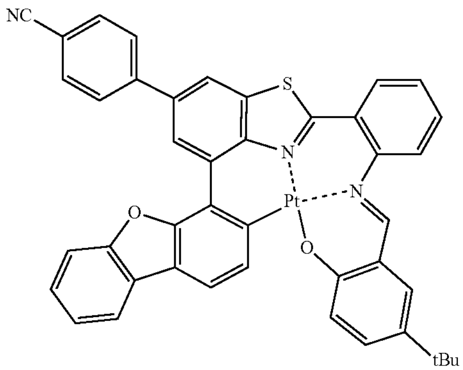
4-468
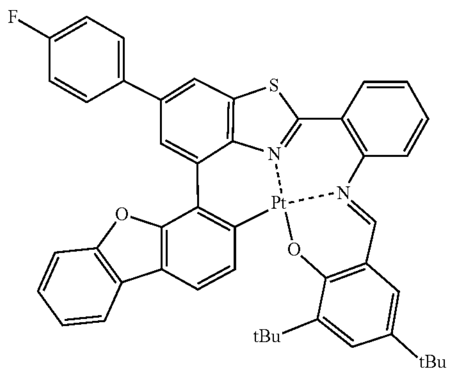
4-469
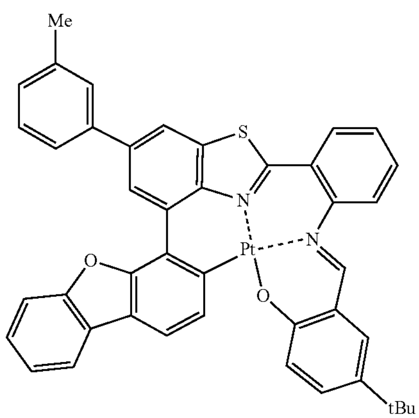
4-470
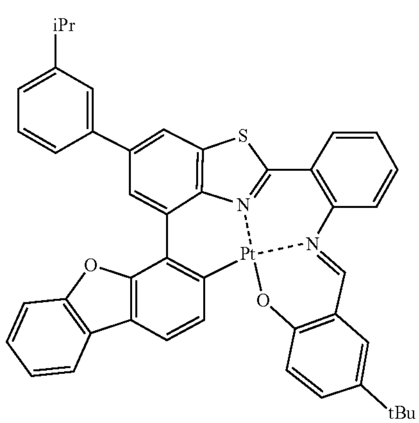
-continued
4-471
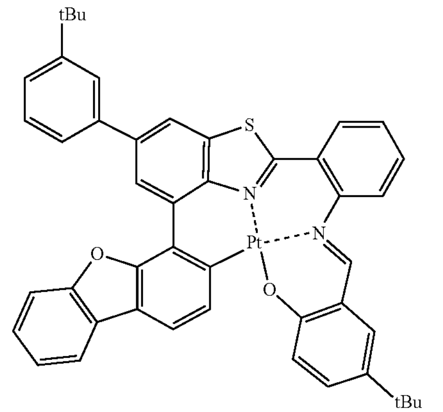
4-472
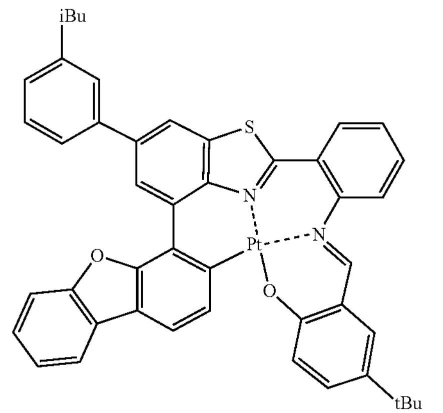
4-473
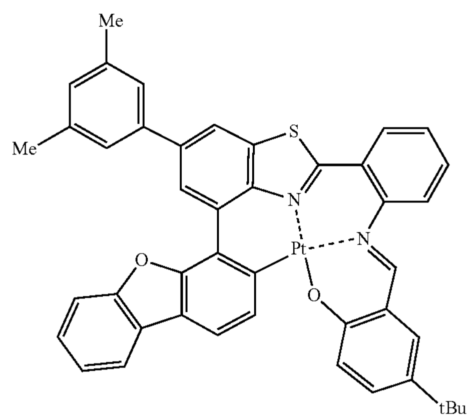
4-474
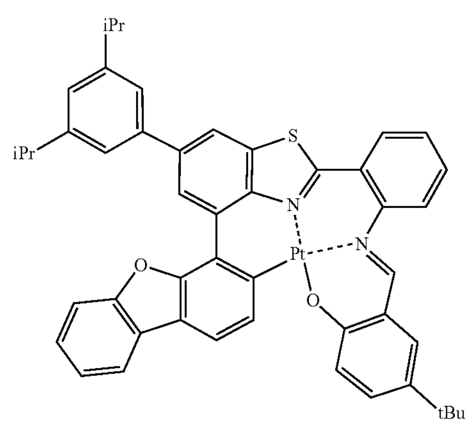

-continued
4-475
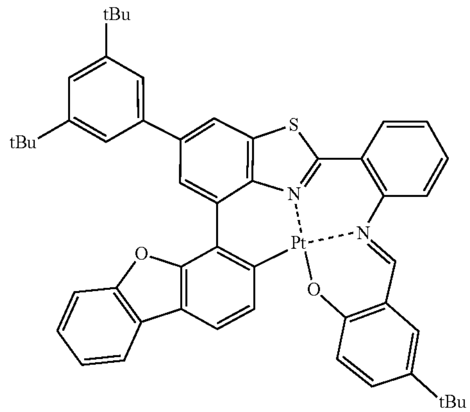
4-476
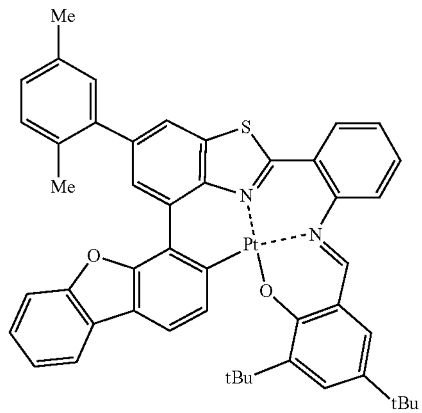
4-477
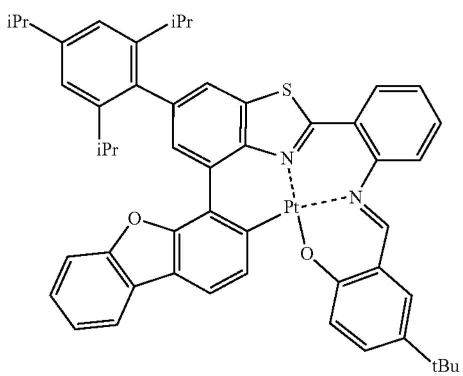
4-478
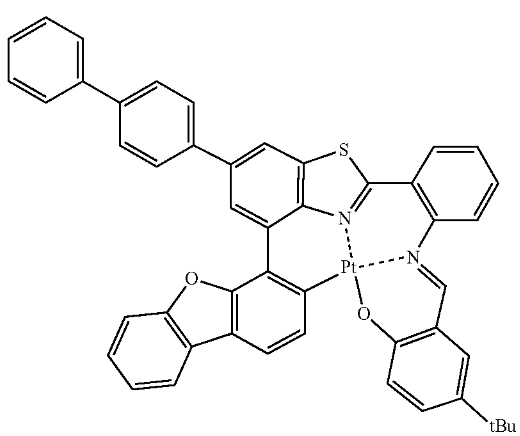
-continued
4-479
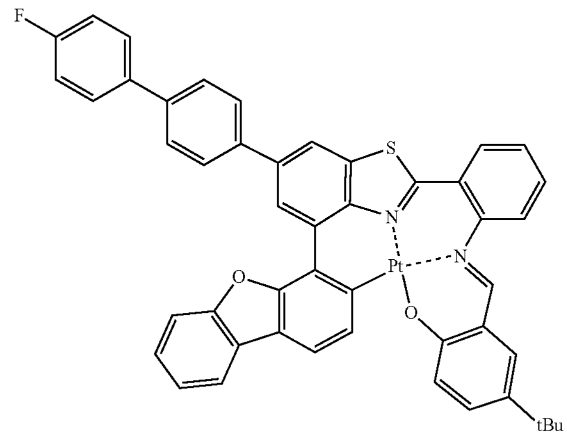
4-480
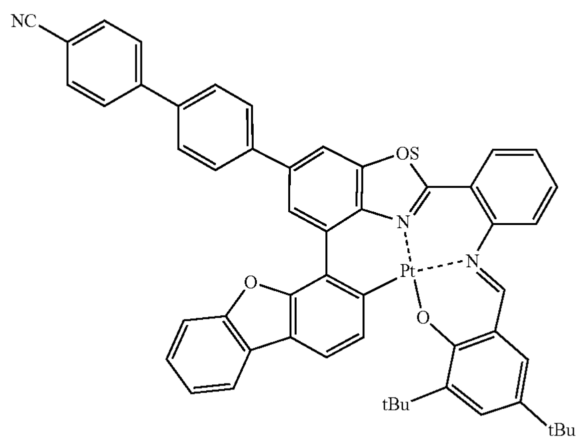
4-481
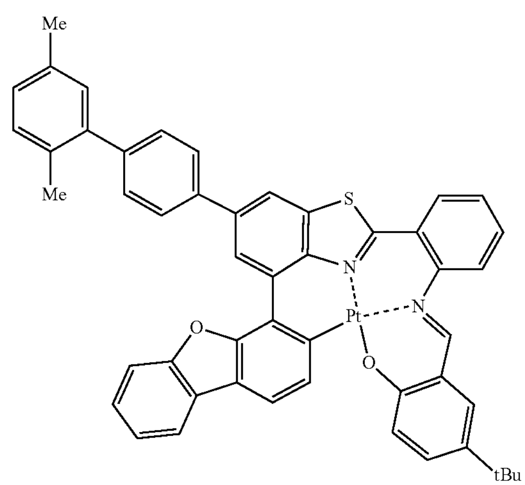

-continued
4-482
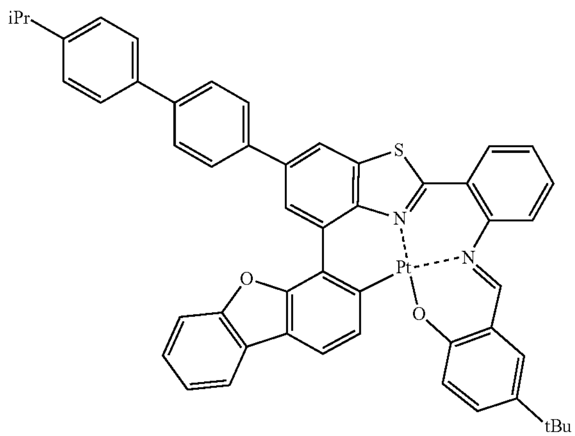
4-483
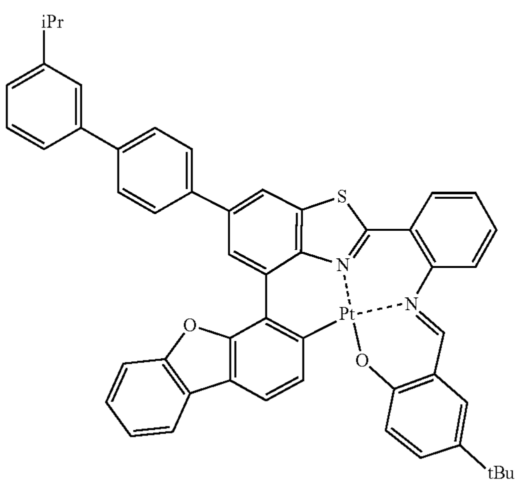
4-484
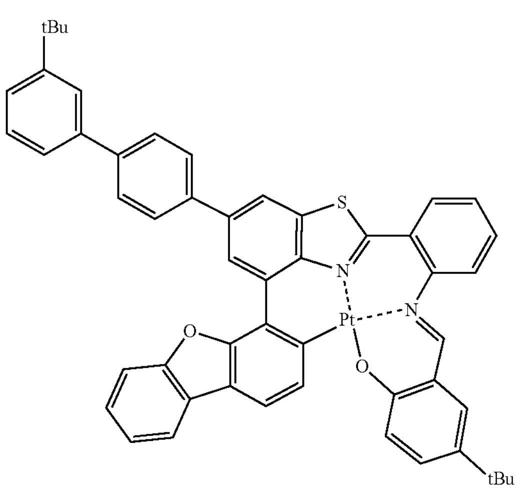
-continued
4-485
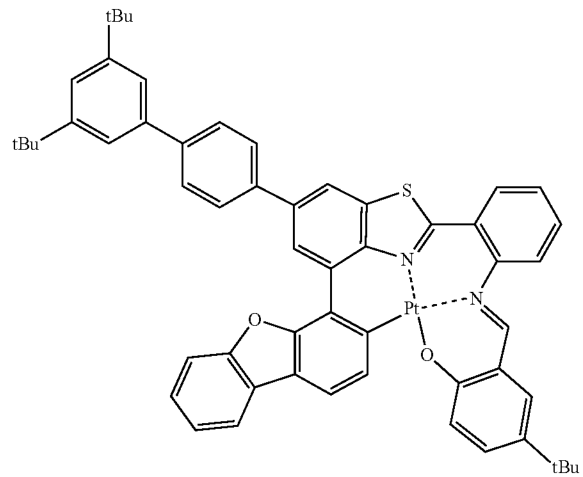
4-486
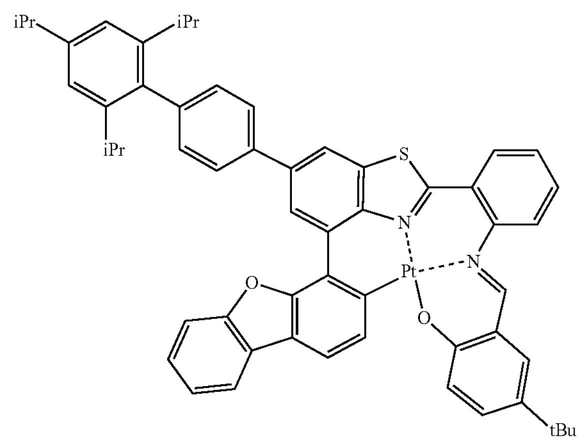
4-487
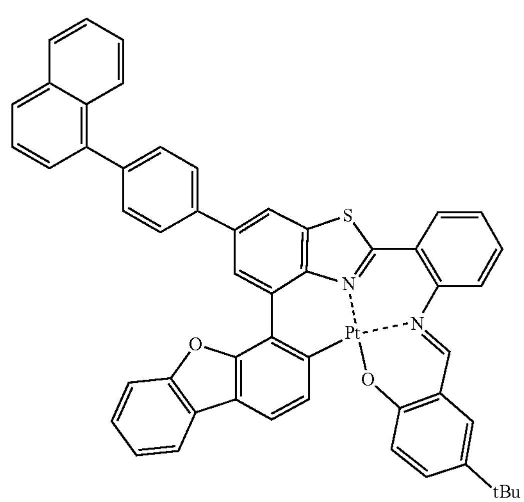

-continued
4-488
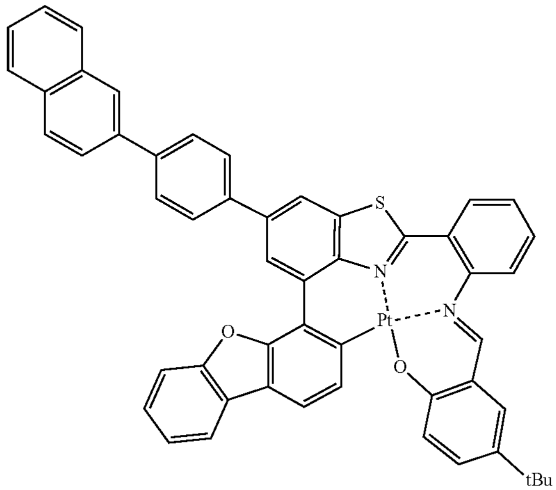
4-489
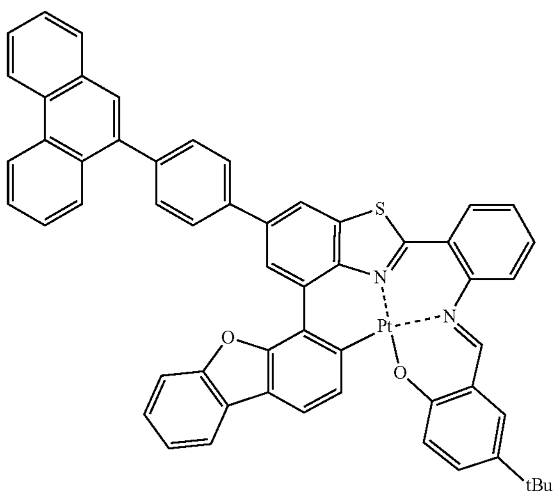
4-490
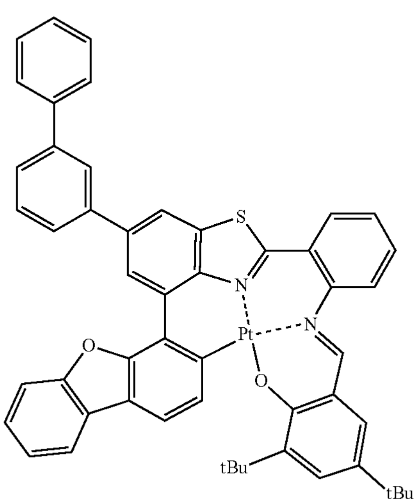
-continued
4-491
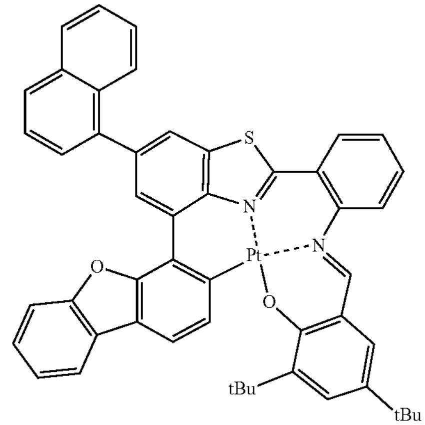
4-492
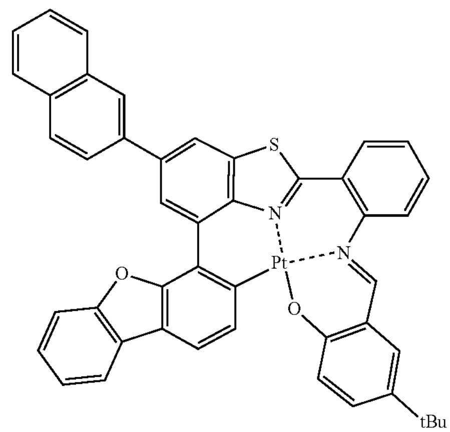
4-493
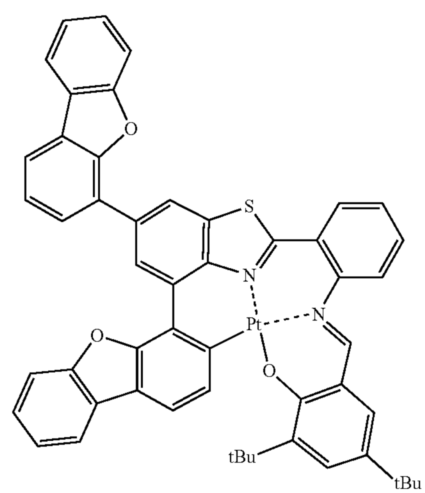

4-494
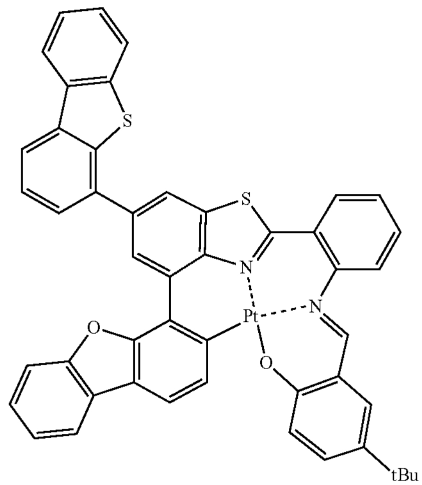
4-495
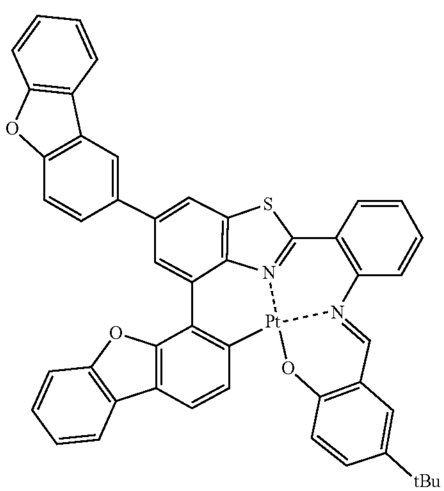
4-496
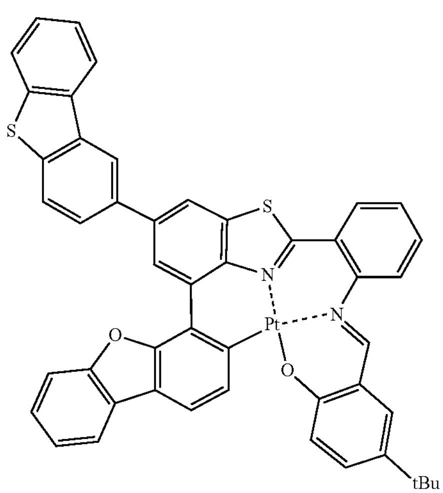
4-497
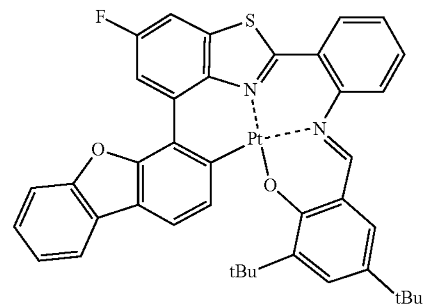
4-498
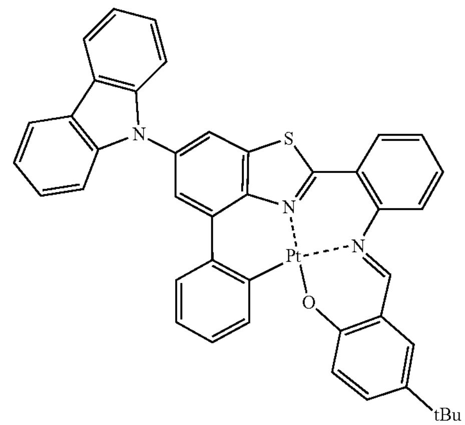
4-499
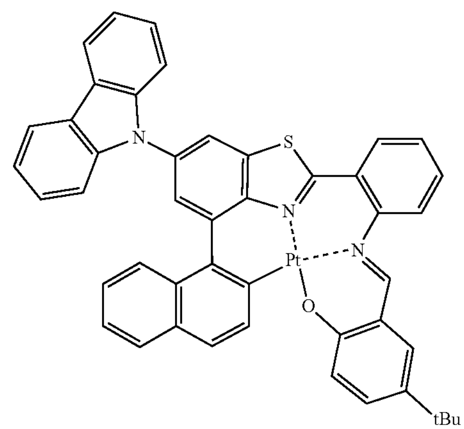
4-500
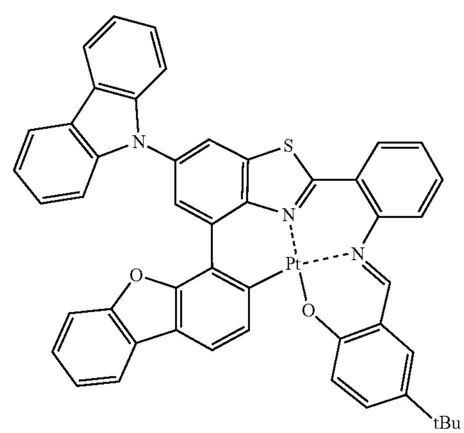

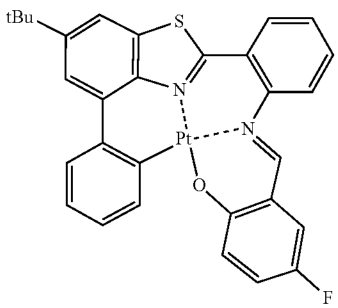
4-501
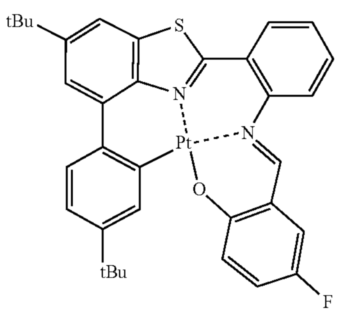
4-502
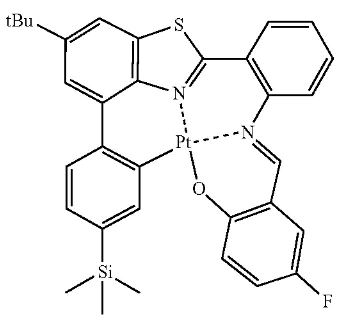
4-503
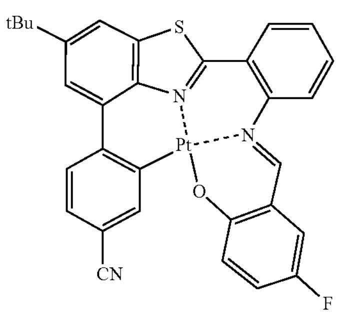
4-504
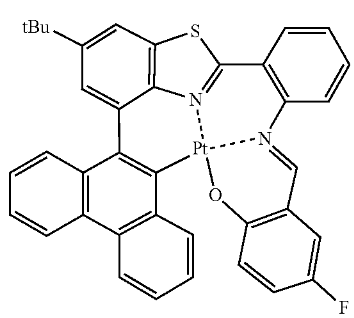
4-505
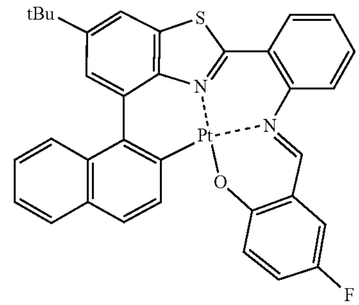
4-506
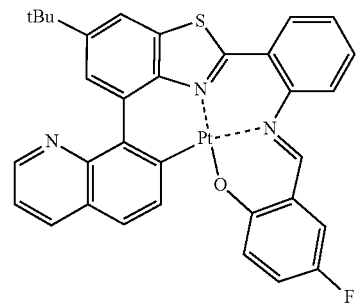
4-507
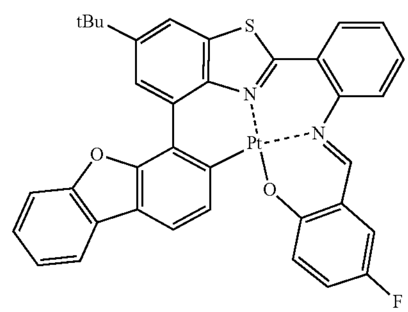
4-508
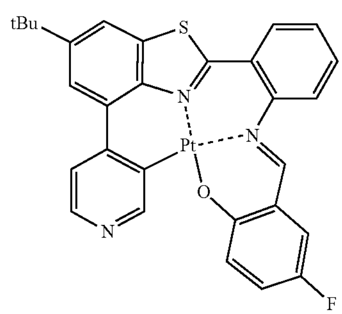
4-509
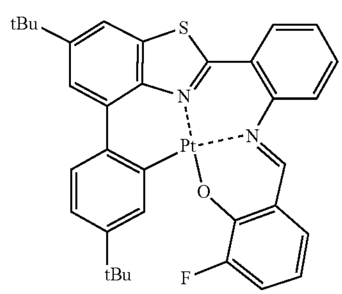
4-510

4-511
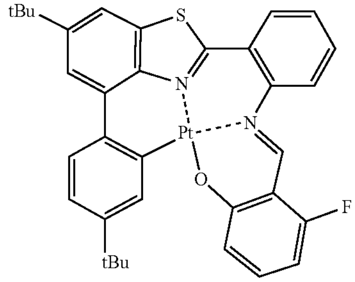
4-512
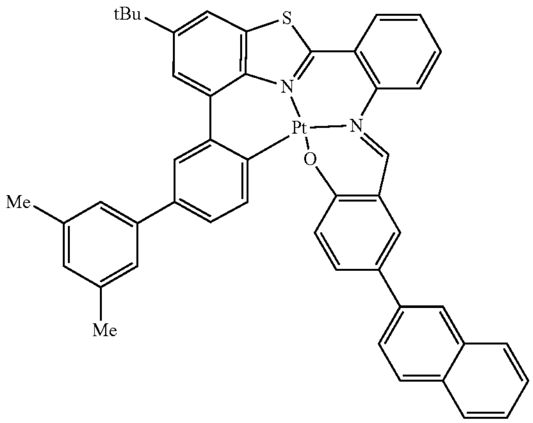
4-513
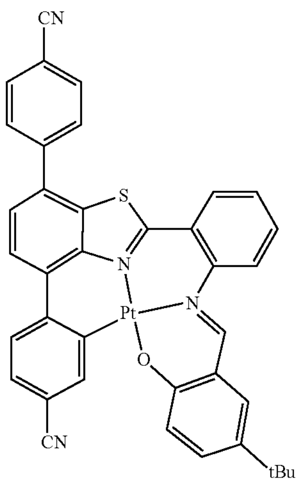
4-514
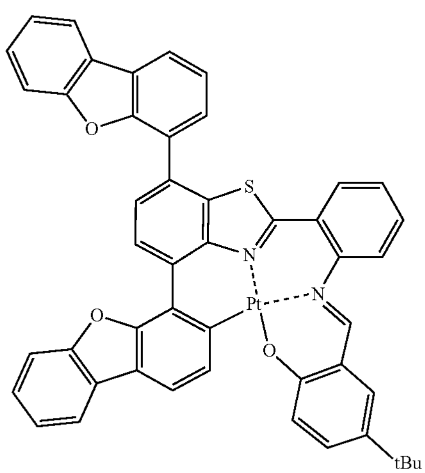
4-515
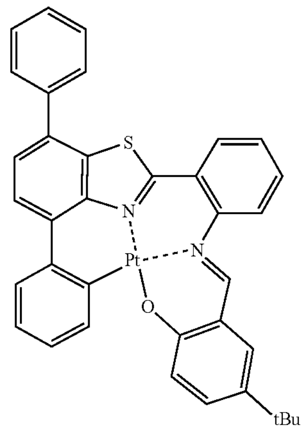
4-516
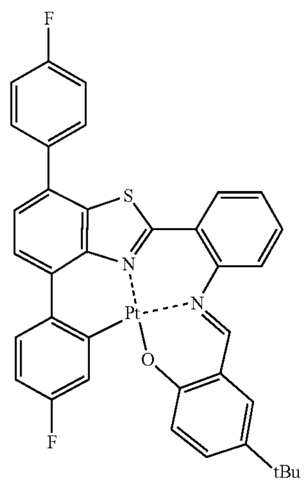
4-517
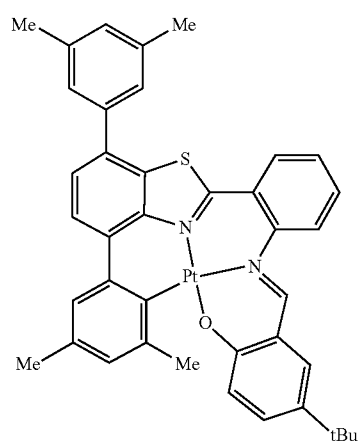

-continued
4-518
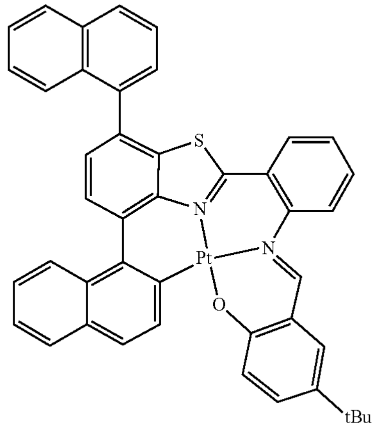
4-519
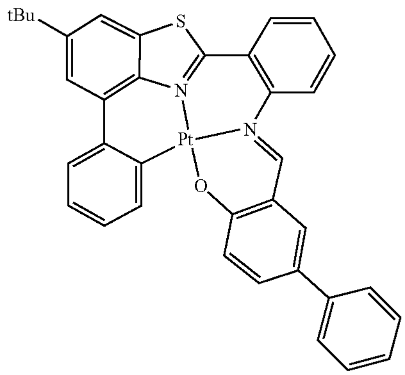
4-520
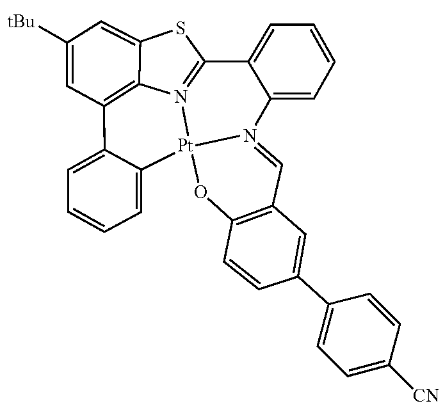
4-521
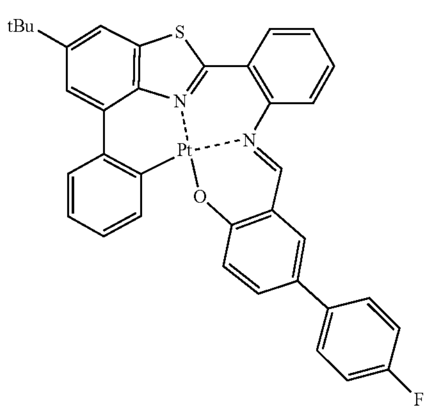
-continued
4-522
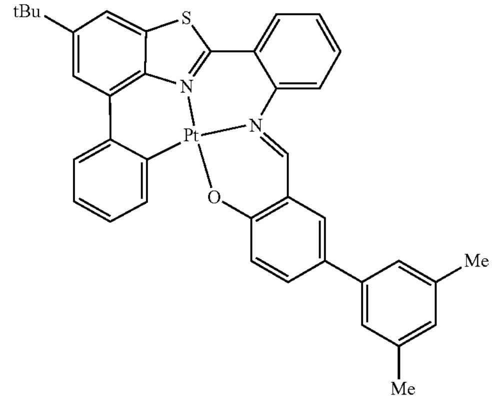
4-523
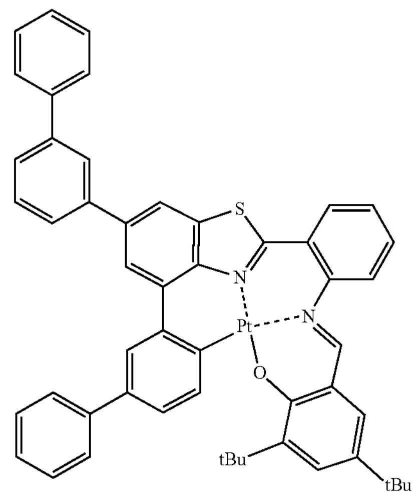
[Compound Group 5]
5-1
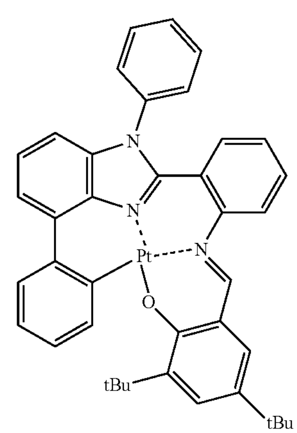

5-2
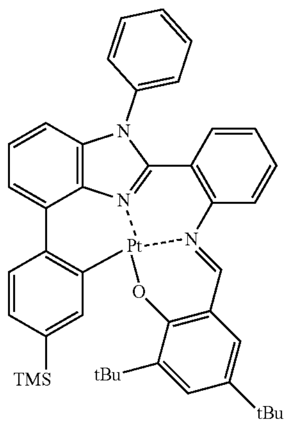
5-5
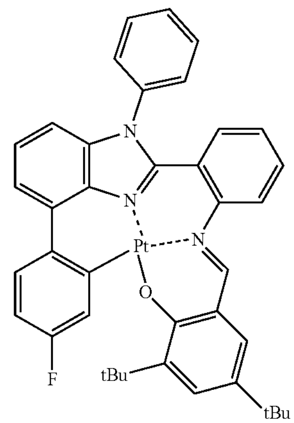
5-3
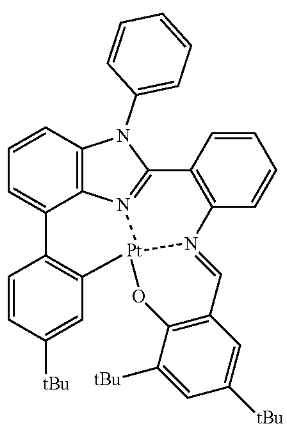
5-6
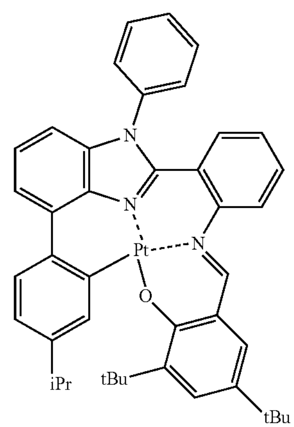
5-4
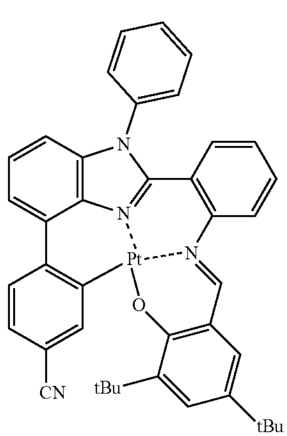
5-7
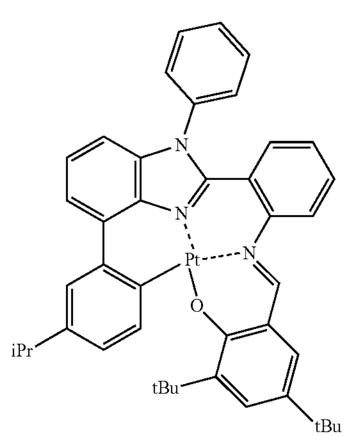

5-8
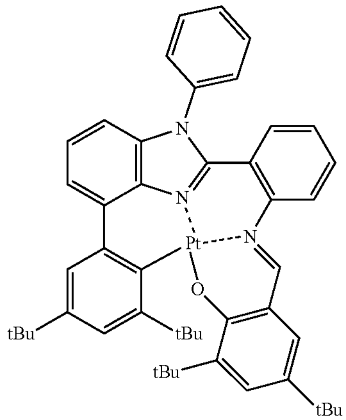
5-9
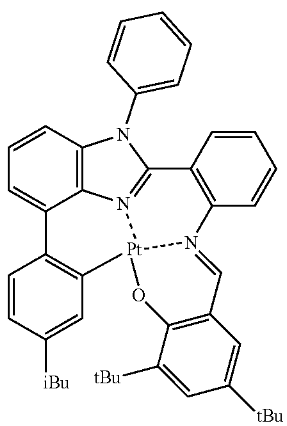
5-10
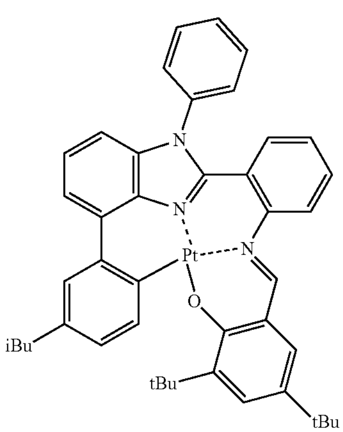
5-11
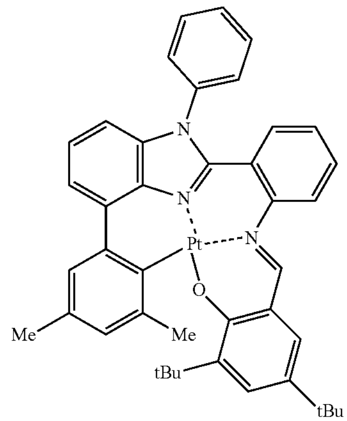
5-12
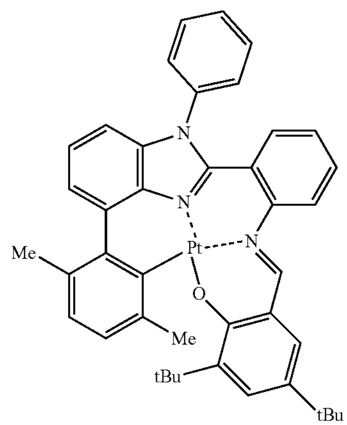
5-13
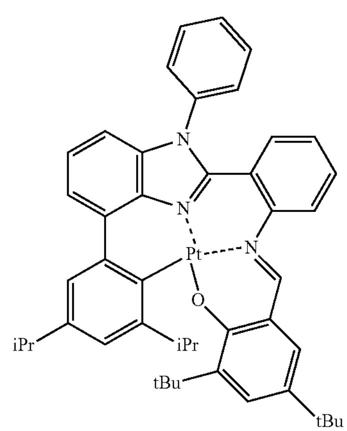

-continued
5-14
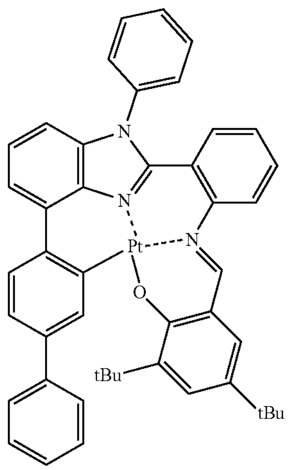
5-15
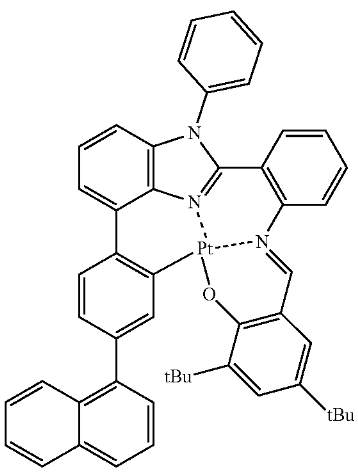
5-16
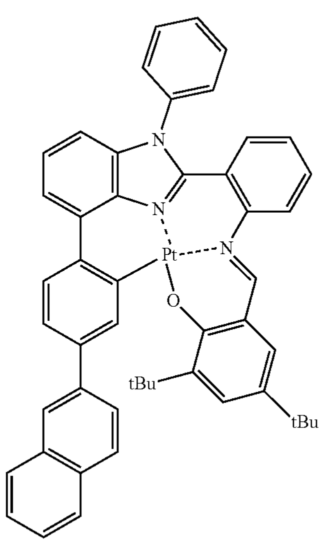
-continued
5-17
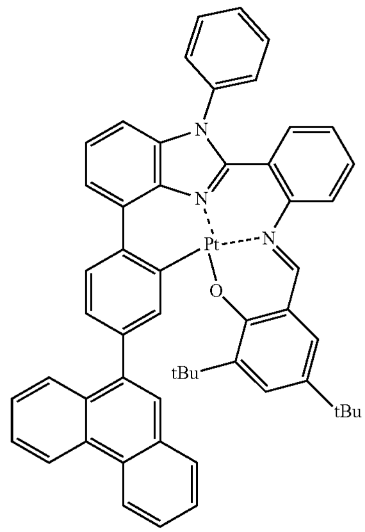
5-18
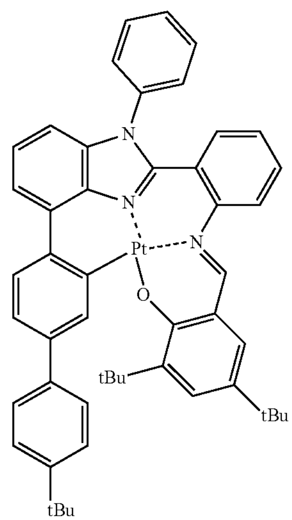
5-19
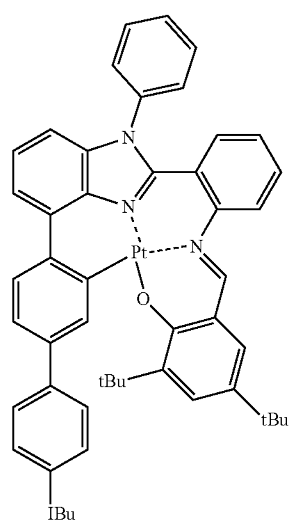

-continued
5-20
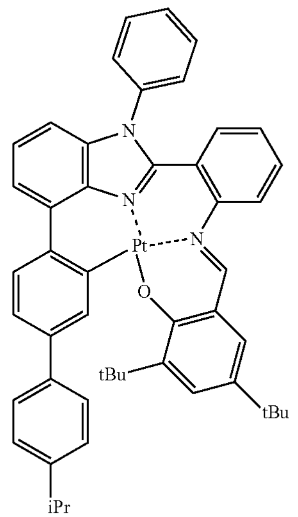
5-21
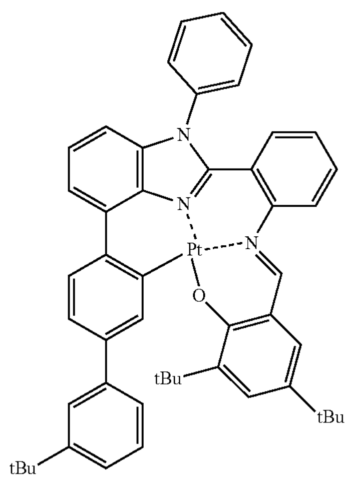
5-22
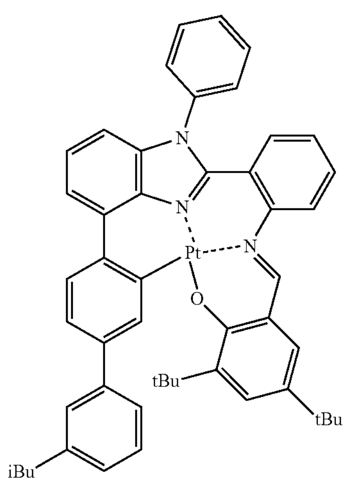
-continued
5-23
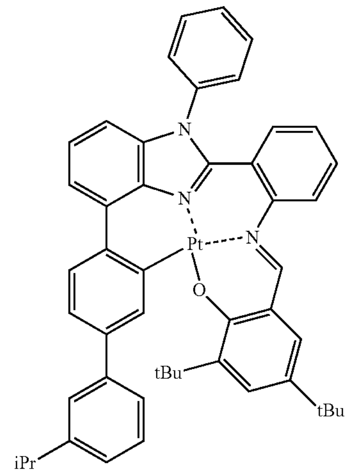
5-24
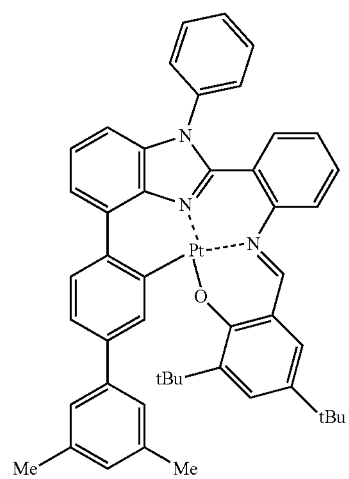
5-25
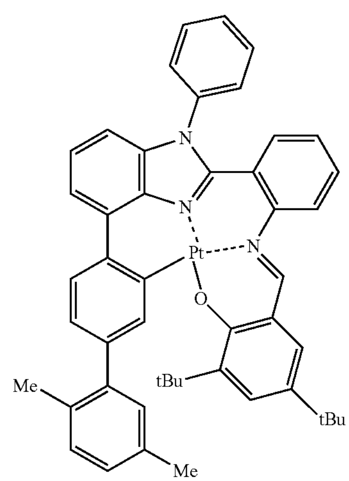

-continued
5-26
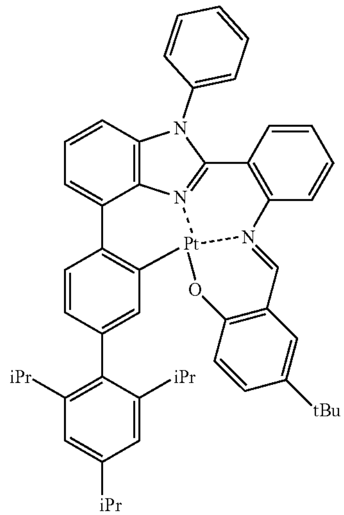
5-27
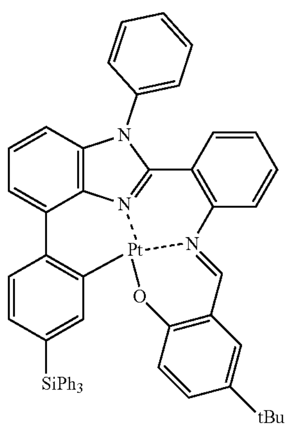
5-28
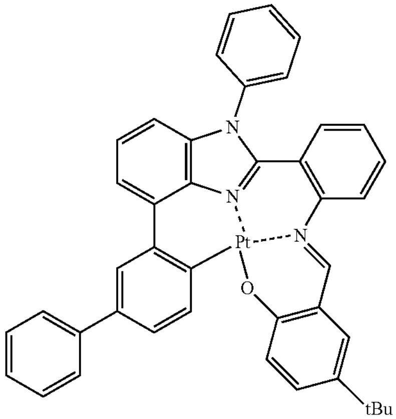
-continued
5-29
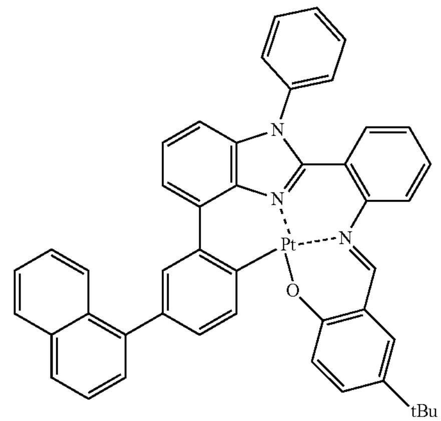
5-30
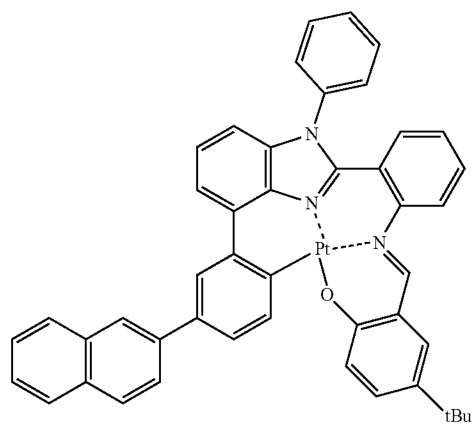
5-31
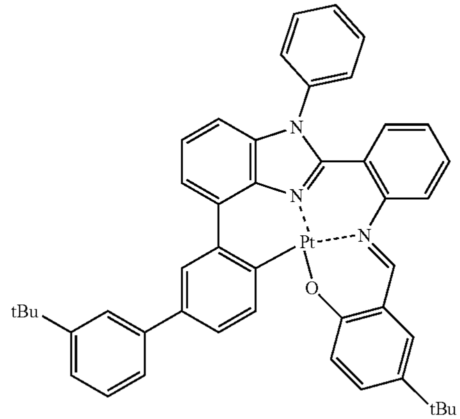

5-32
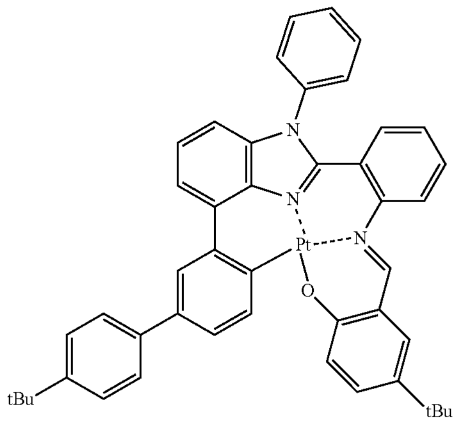
5-33
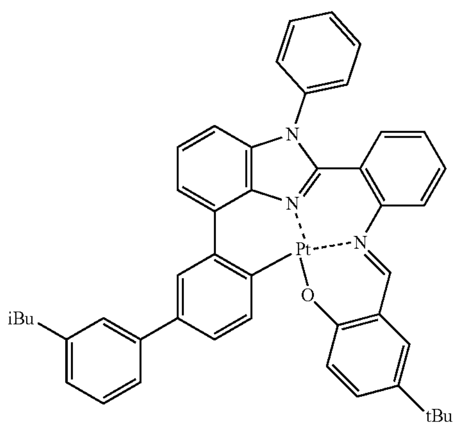
5-34
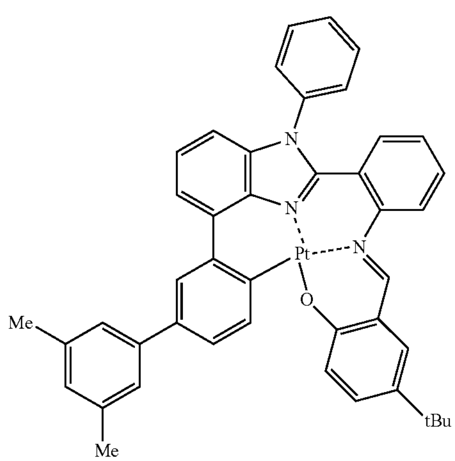
5-35
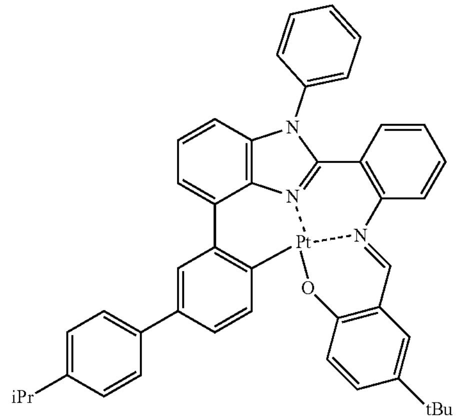
5-36
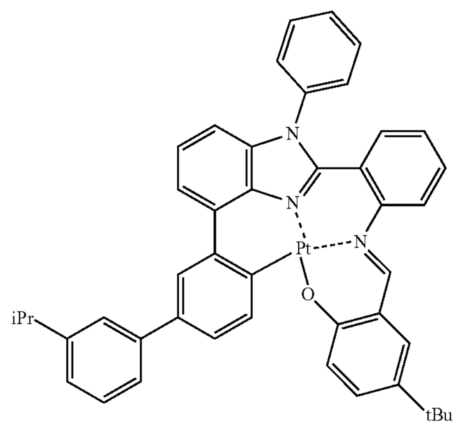
5-37
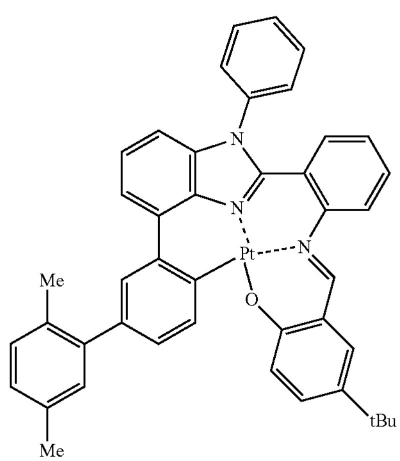

5-38
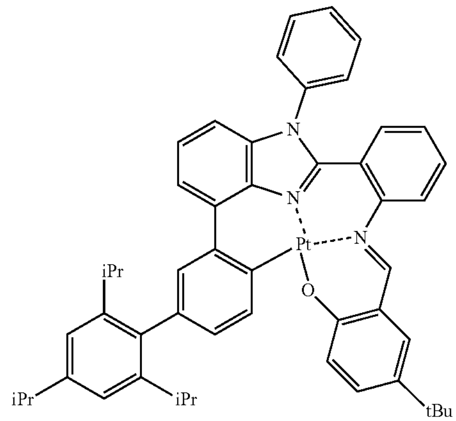
5-39
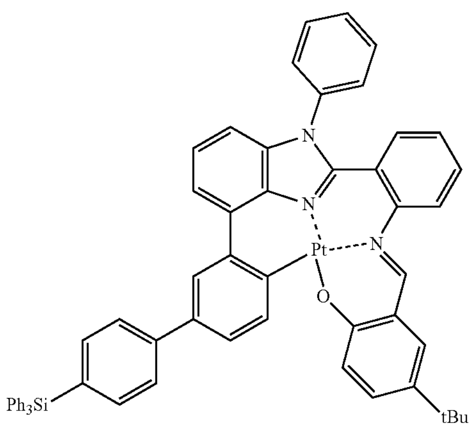
5-40
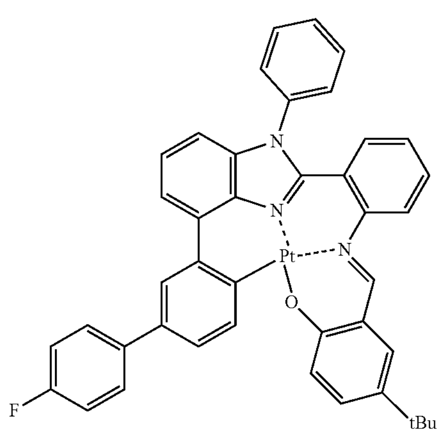
5-41
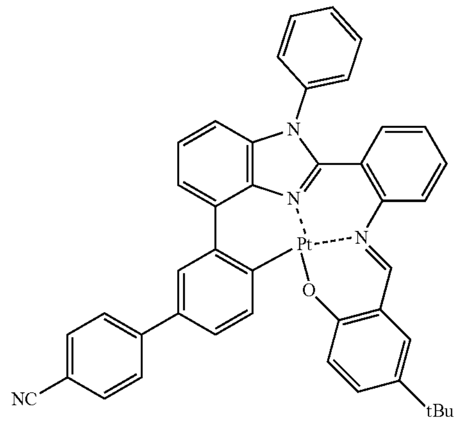
5-42
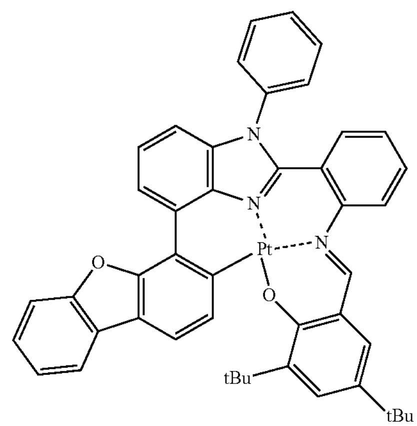
5-43
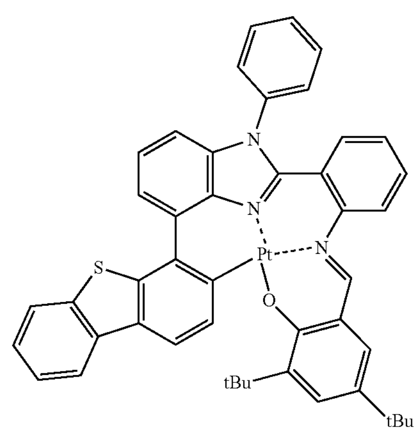

5-44
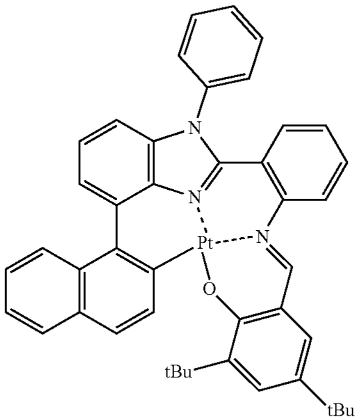
5-45
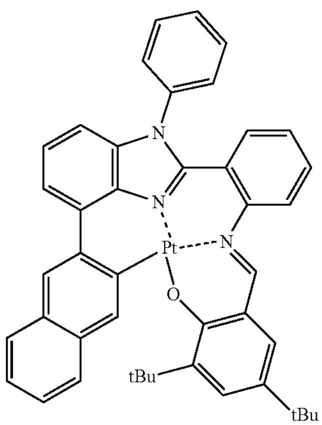
5-46
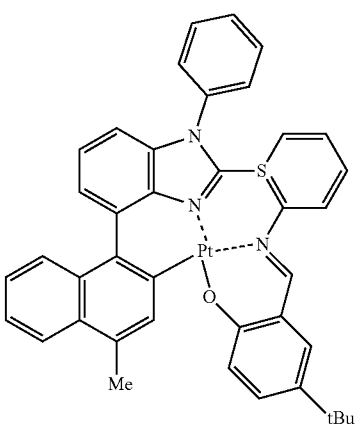
5-47
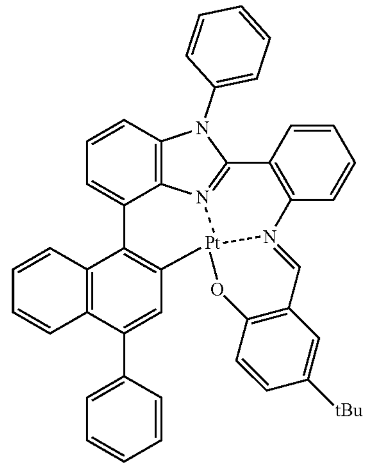
5-48
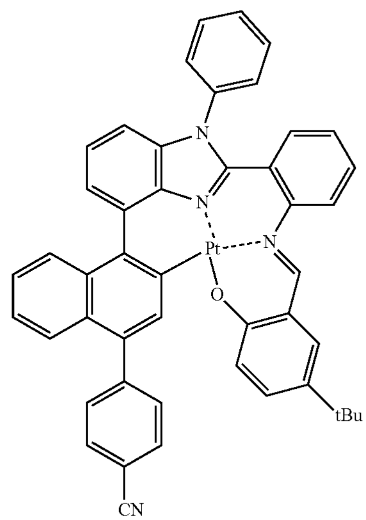
5-49
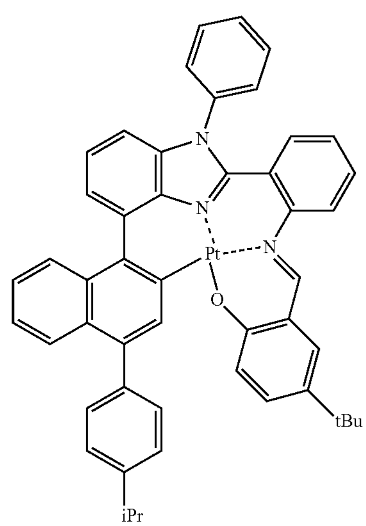

-continued
5-50
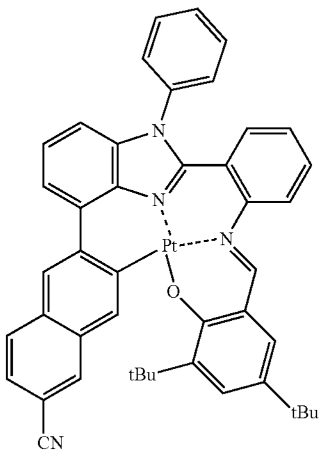
5-51
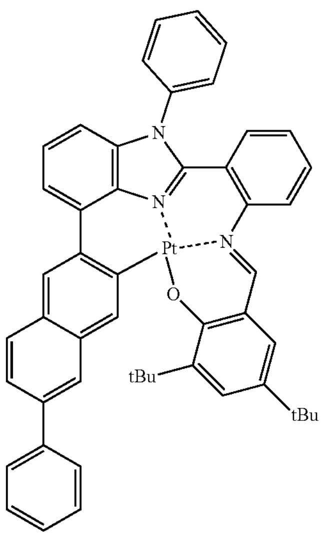
5-52
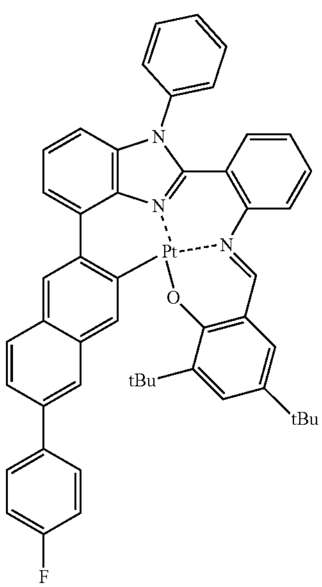
-continued
5-53
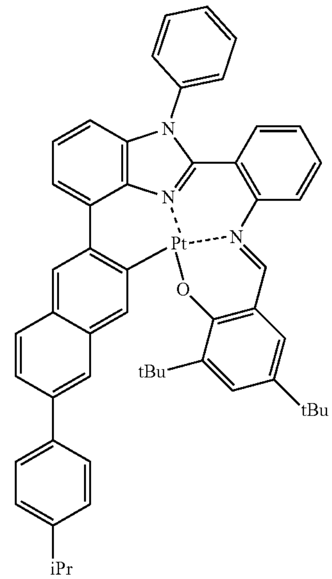
5-54
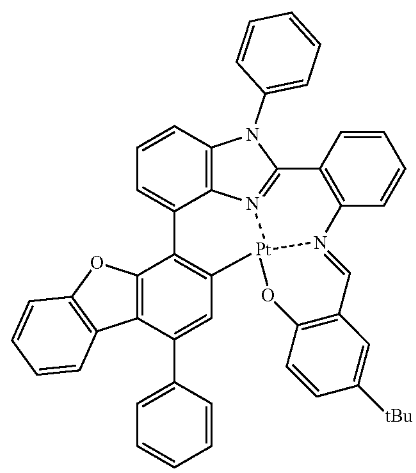
5-55
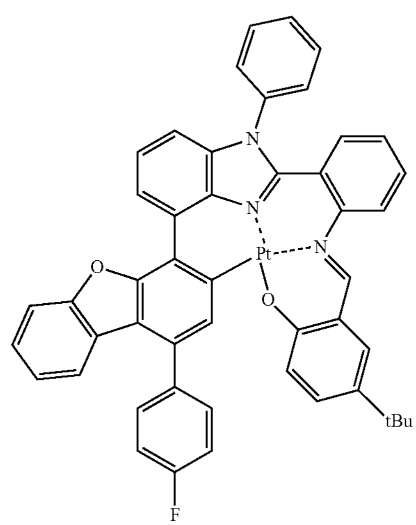

-continued
5-56
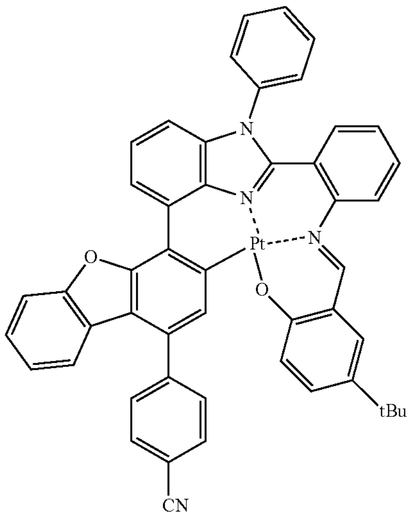
5-57
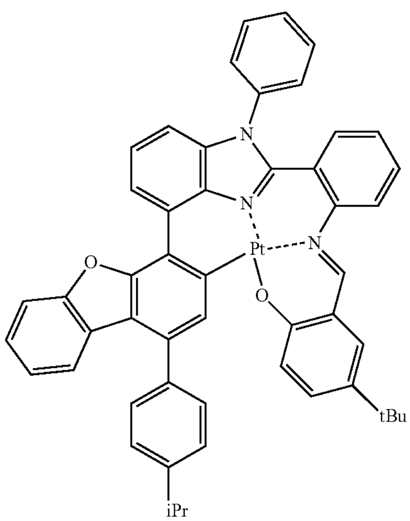
5-58
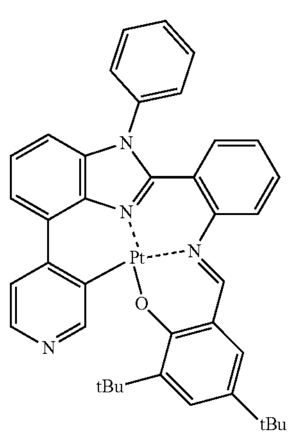
-continued
5-59
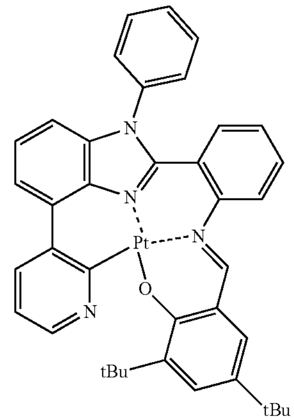
5-60
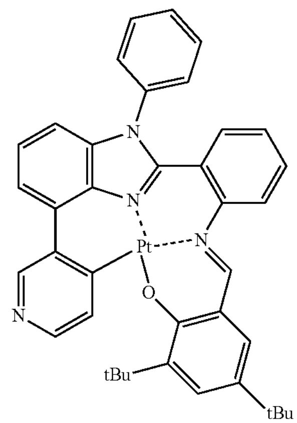
5-61
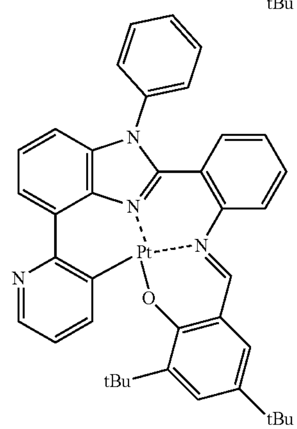
5-62
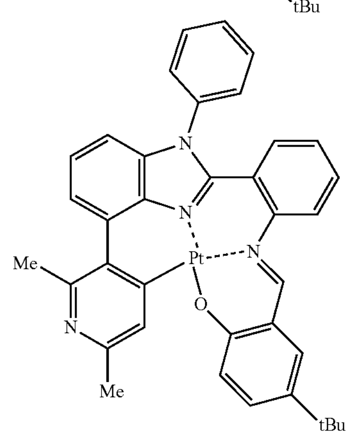

5-63
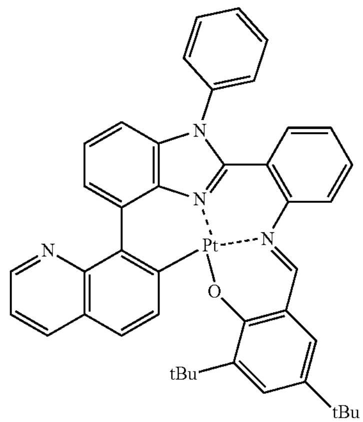
5-64
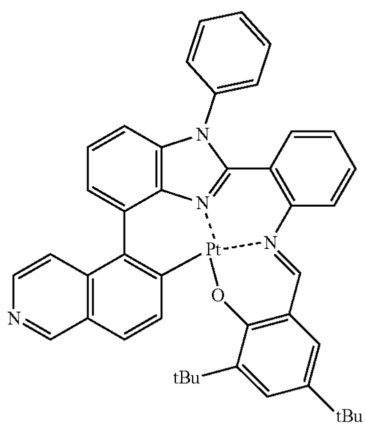
5-65
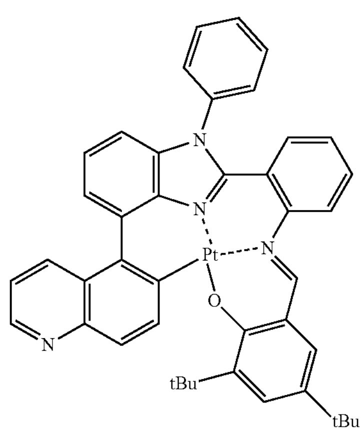
5-66
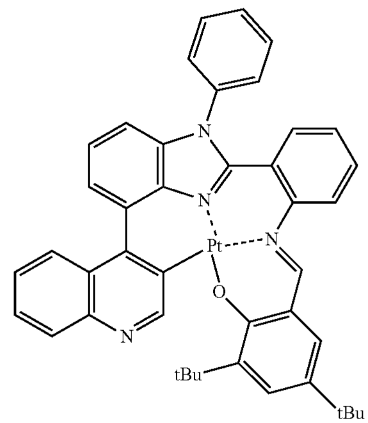
5-67
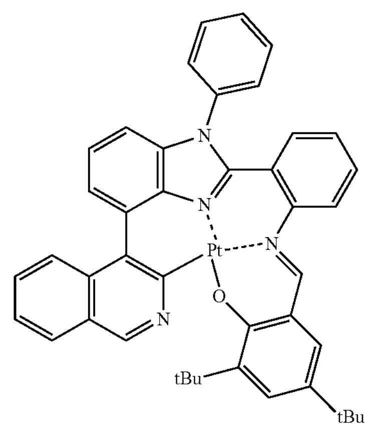
5-68
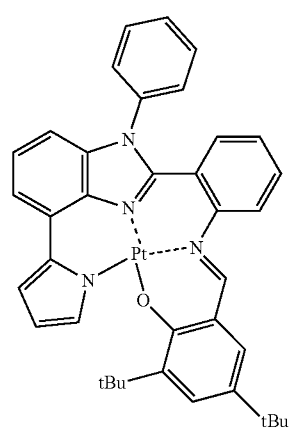

-continued 5-69

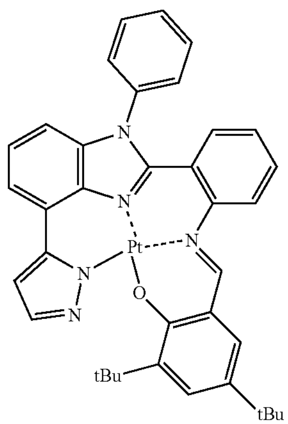

5-70

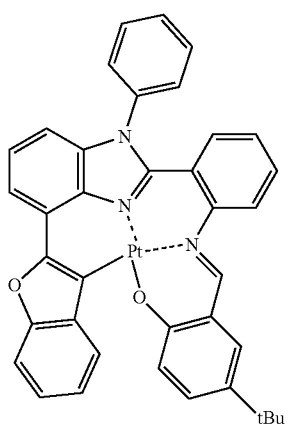

5-71

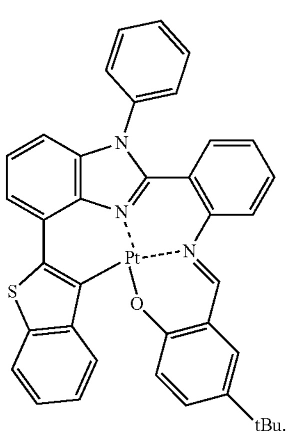

11. An organometallic compound represented by the following Formula 1:

[Formula 1]

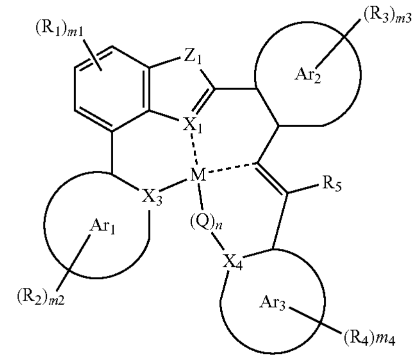

wherein in Formula 1,

M is osmium (Os), iridium (Ir), or platinum (Pt), $Z_1$ is O, S or $NR_6$,

Q is 0, S or $CH_2$, n is 0 or 1, $X_1$, $X_2$, and $X_3$ are each independently N or C, $X_4$ is C, if n is 0, M is combined with two C atoms and two N atoms, $Ar_1$, $Ar_2$ and $Ar_3$ are each independently a substituted or unsubstituted aryl group having 6 to 30 ring carbon atoms, or a substituted or unsubstituted heteroaryl group having 2 to 30 ring carbon atoms, $R_1$, $R_2$, $R_3$, $R_4$, $R_5$ and $R_6$ are each independently a hydrogen atom, a deuterium atom, a halogen atom, a substituted or unsubstituted alkyl group having 1 to 20 carbon atoms, a substituted or unsubstituted hydrocarbon ring having 5 to 20 ring carbon atoms, a substituted or unsubstituted heteroalkyl group having 1 to 20 carbon atoms, an alkoxy group, an aryloxy group, a cyano group, an amino group, a substituted or unsubstituted silyl group, an alkenyl group, a heteroalkenyl group, an alkynyl group, an unsaturated hydrocarbon ring, a substituted or unsubstituted aryl group having 6 to 30 ring carbon atoms, a substituted or unsubstituted heteroaryl group having 2 to 30 ring carbon atoms, an acyl group, a carbonyl group, a carbonyl acid, a carbonyl ester, a nitrile group, an isonitrile group, a sulfanyl group, a sulfinyl group, a sulfonyl group, a phosphino group, a substituted or unsubstituted monovalent non aromatic condensed polycycle, or a substituted or unsubstituted monovalent non aromatic condensed heteropolycycle, or may be combined with an adjacent group to form a ring, and $m_1$ to $m_4$ are each independently an integer of 0 to 4.

12. The organometallic compound as claimed in claim 11, wherein M is platinum (Pt).

13. The organometallic compound as claimed in claim 11, wherein $Ar_1$ to $Ar_3$ in Formula 1 are each independently phenyl, naphthyl, pyridine, pyrimidine, pyrazine, pyridazine, quinoline, isoquinoline, furan, thiophene, pyrrole, benzofuran, benzothiophene, phenanthryl, phenanthridine, indole, or indazole.

14. The organometallic compound as claimed in claim 11, wherein Formula 1 is represented by one of the following Formula 1-1 to Formula 1-3:

[Formula 1-1]

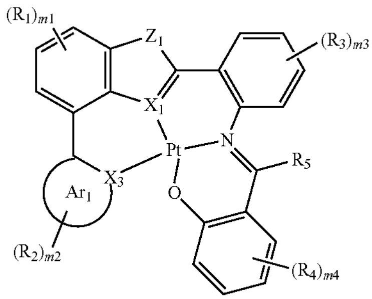

[Formula 1-2]

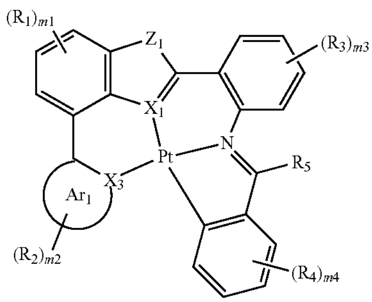

[Formula 1-3]

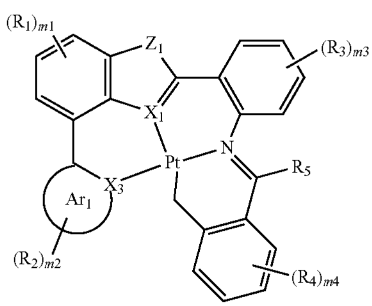

wherein in Formula 1-1 to Formula 1-3, $X_1$ and $X_3$ are each independently N or C, and $Z_1$, $Ar_1$, $R_1$ to $R_5$, and $m_1$ to $m_4$ are the same as defined in claim 11, and in Formula 1-2, Pt is combined with two C atoms and two N atoms.

15. The organometallic compound as claimed in claim 14, wherein $R_1$, $R_2$, $R_3$, $R_4$ and $R_5$ are each independently a hydrogen atom, a deuterium atom, a halogen atom, a substituted or unsubstituted alkyl group having 1 to 20 carbon atoms, a substituted or unsubstituted heteroalkyl group having 1 to 20 carbon atoms, a substituted or unsubstituted silyl group, a substituted or unsubstituted aryl group having 6 to 30 ring ring carbon atoms, or a substituted or unsubstituted heteroaryl group having 2 to 30 ring ring carbon atoms, or combined with an adjacent group to form a ring.

16. The organometallic compound as claimed in claim 11, wherein Formula 1 is represented by one of the following Formula 2-1 to Formula 2-30:

2-1

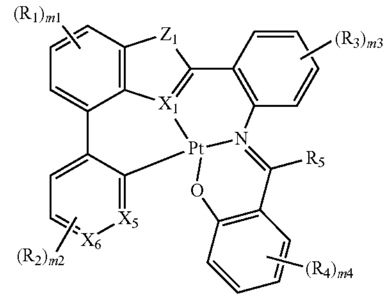

2-2

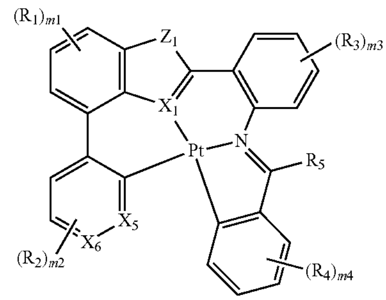

2-3

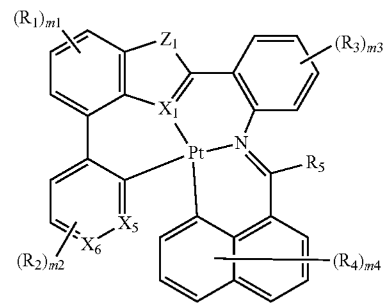

2-4

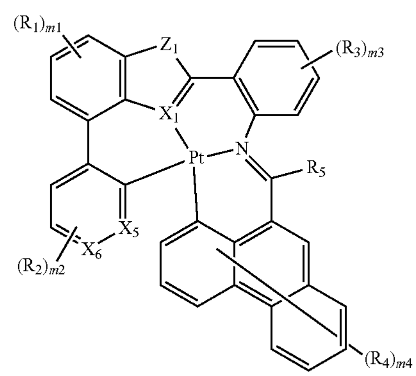

2-5

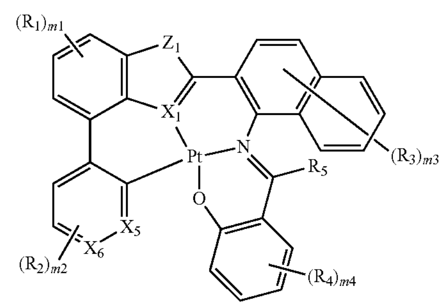

2-6
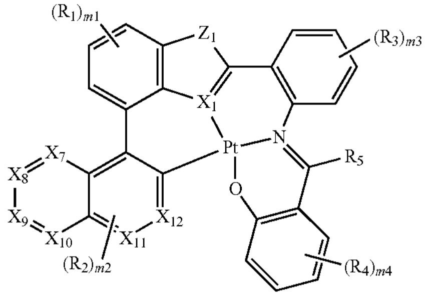
2-7
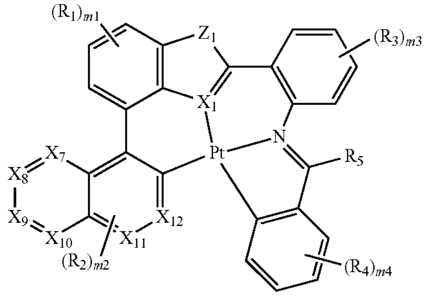
2-8
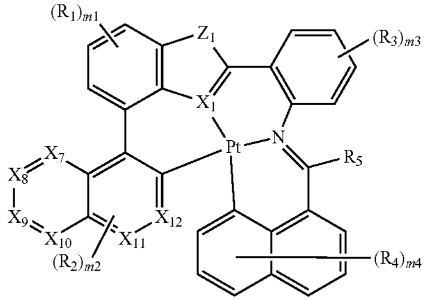
2-9
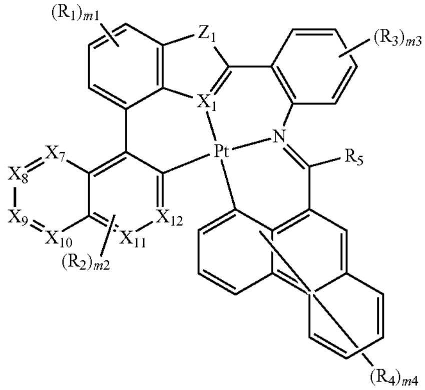
2-10
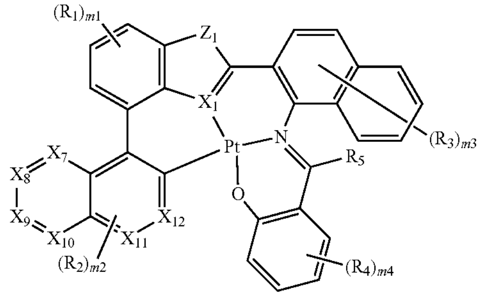
2-11
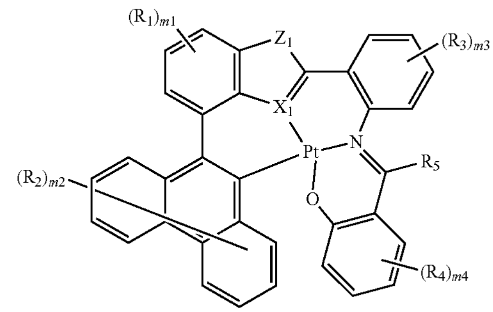
2-12
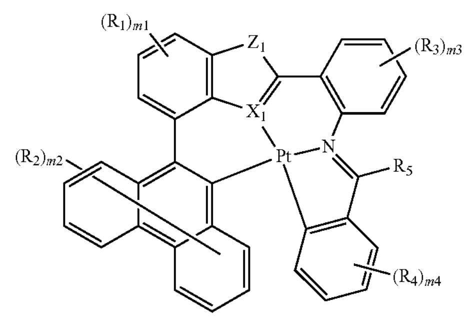
2-13
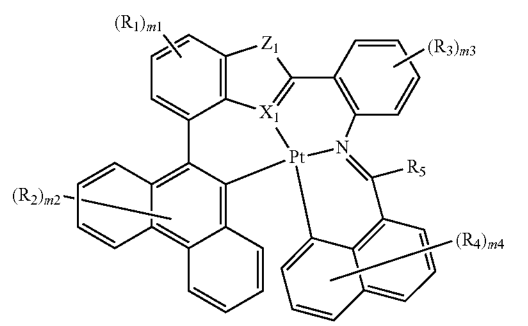
2-14
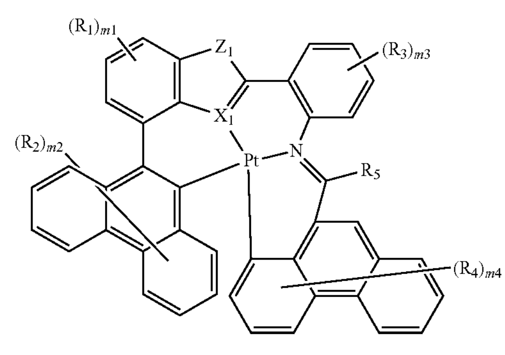
2-15
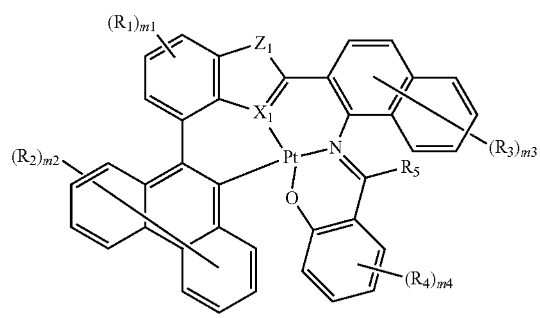

-continued
2-16
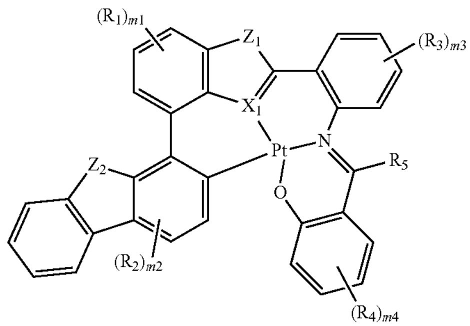
2-17
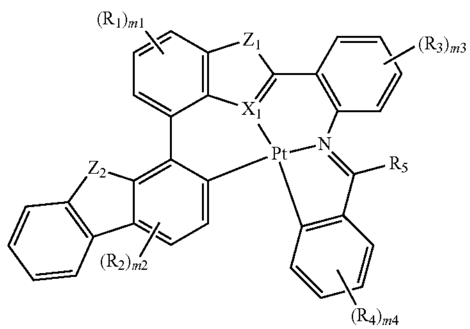
2-18
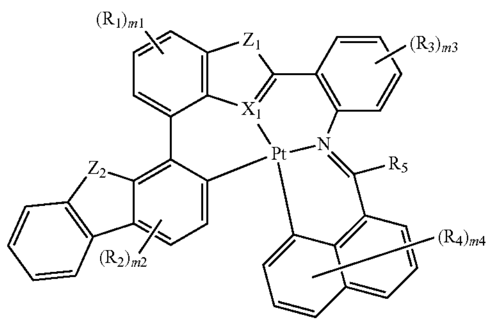
2-19
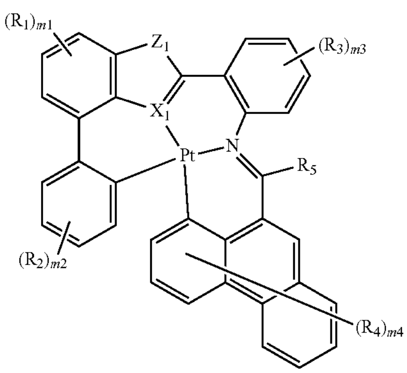
2-20
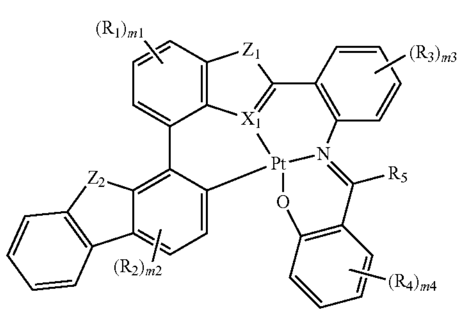
-continued
2-21
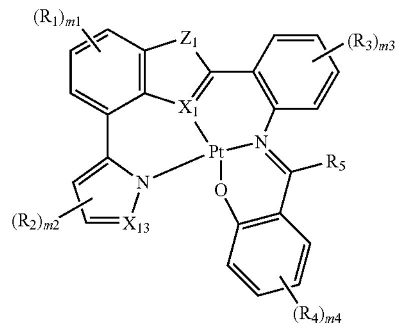
2-22
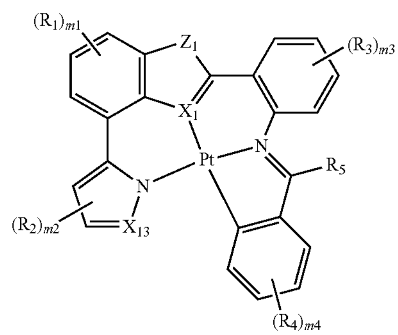
2-23
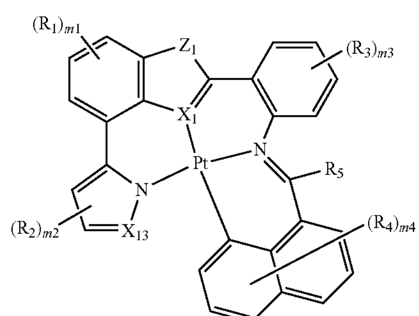
2-24
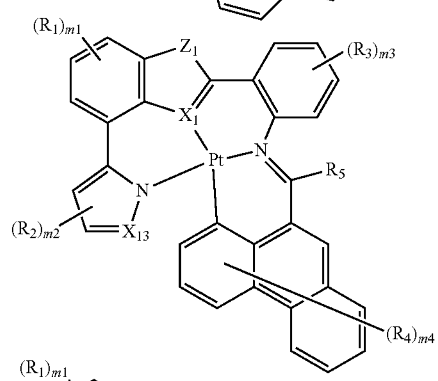
2-25
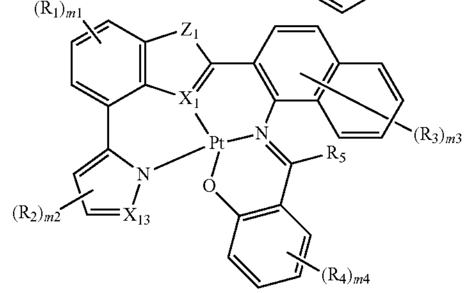

2-26

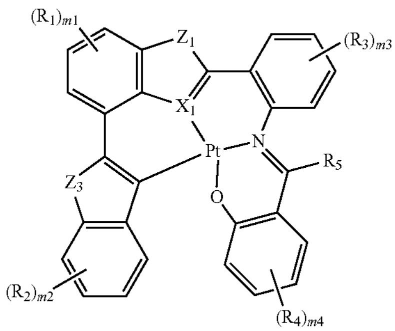

2-27

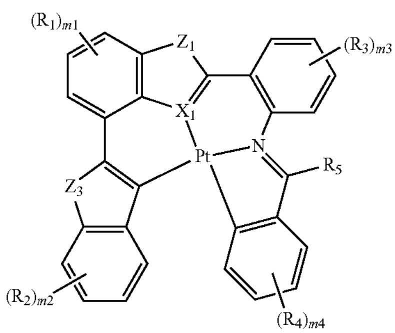

2-28

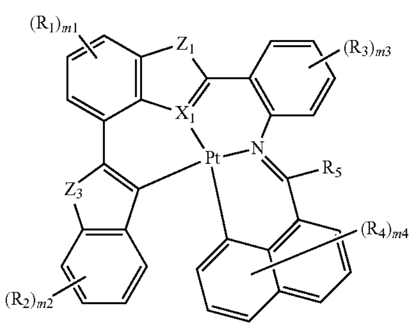

2-29

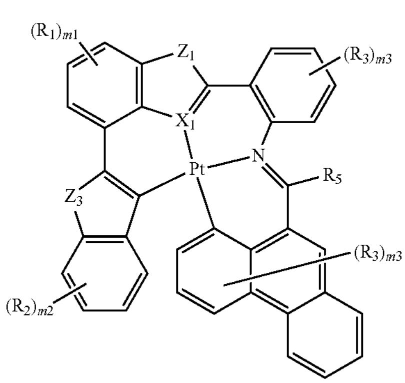

2-30

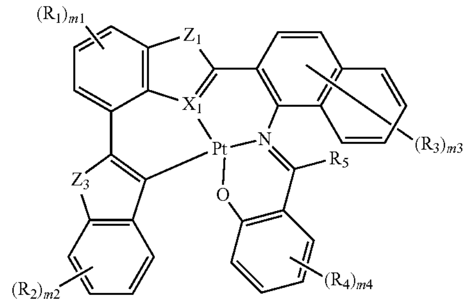

wherein in Formulae 2-1 to 2-30, $X_5$ to $X_{13}$ are each independently N or CH, $Z_1$, $Z_2$ and $Z_3$ are each independently O or S, and $X_1$, $R_1$ to $R_5$, and $m_1$ to $m_4$ are the same as defined in claim 11.

17. The organometallic compound as claimed in claim 16, wherein $R_1$ to $R_5$ are each independently hydrogen, deuterium, a fluorine atom, a cyano group, a methyl group, an isopropyl group, an isobutyl group, a t-butyl group, a trimethylsilyl group, a triphenylsilyl group, a trifluoromethyl group, a substituted or unsubstituted phenyl group, a substituted or unsubstituted naphthyl group, a substituted or unsubstituted phenanthryl group, a substituted or unsubstituted dibenzothiophene group, or a substituted or unsubstituted dibenzofuran group, or combined with an adjacent group to form a ring.

18. The organometallic compound as claimed in claim 11, wherein Formula 1 is any one selected from compounds in the following Compound Group 3 to Compound Group 5:

{Compound Group 3}

3-1

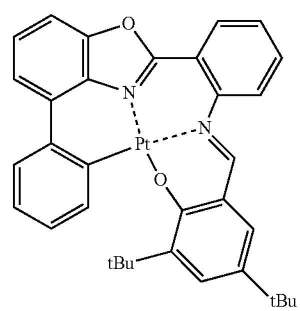

3-2

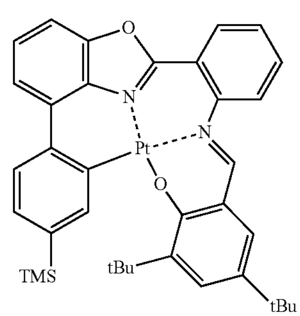

-continued
3-3
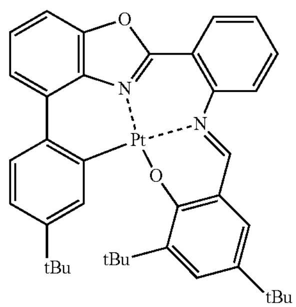
3-4
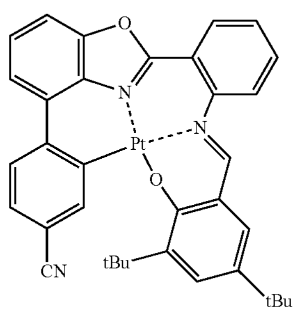
3-5
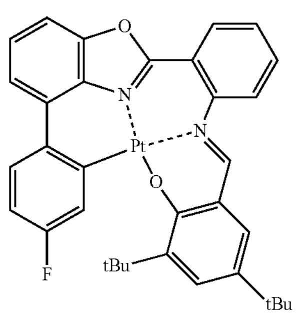
3-6
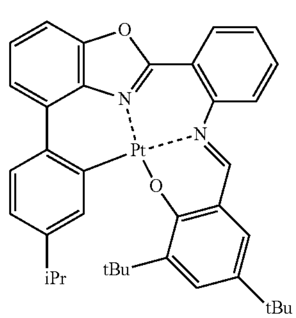
3-7
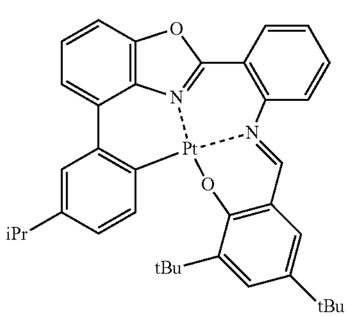
-continued
3-8
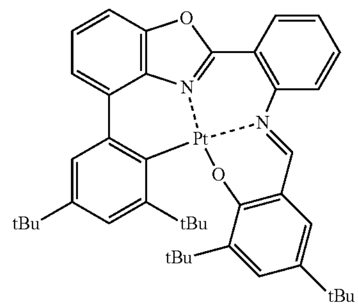
3-9
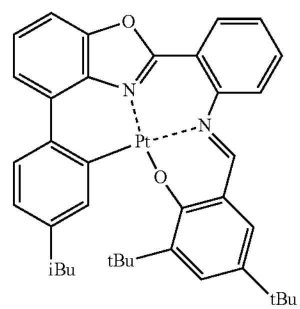
3-10
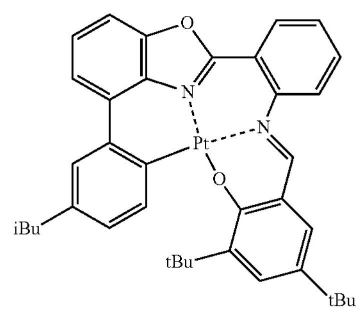
3-11
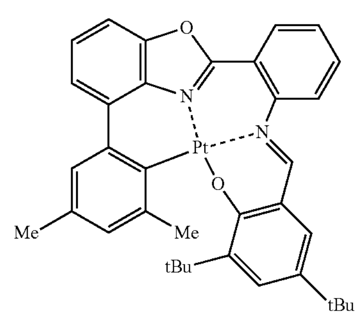
3-12
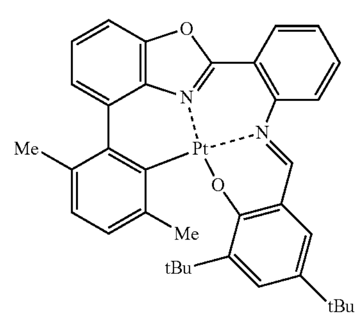

-continued
3-13
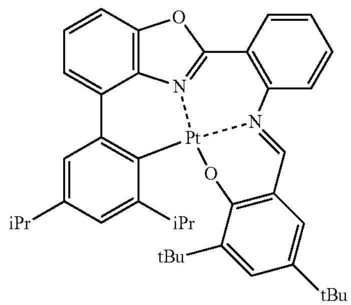
3-14
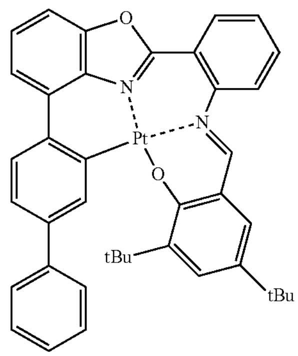
3-15
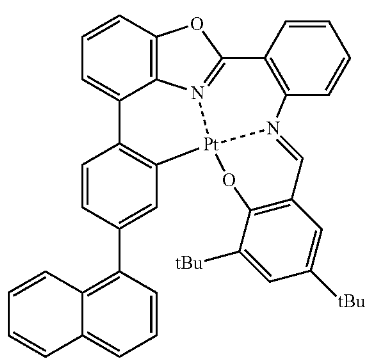
3-16
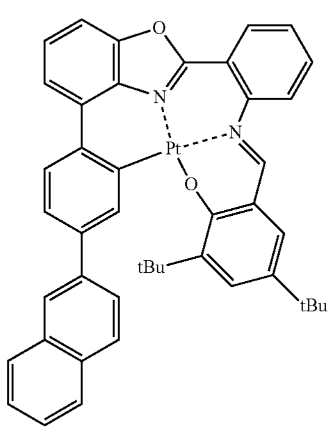
-continued
3-17
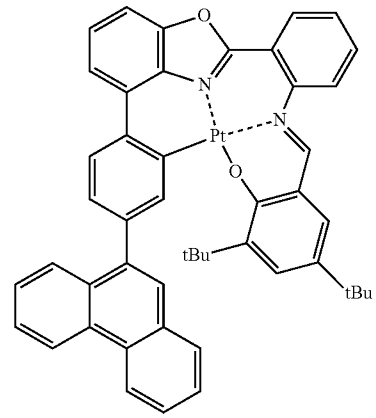
3-18
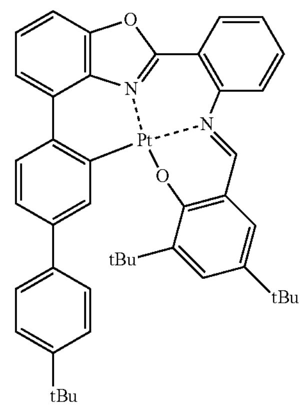
3-19
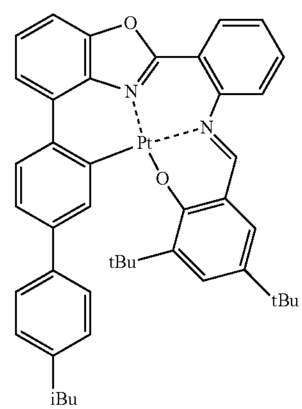
3-20
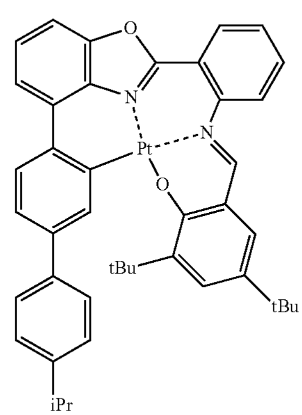

-continued
3-21
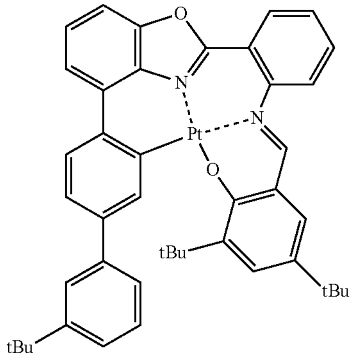
3-22
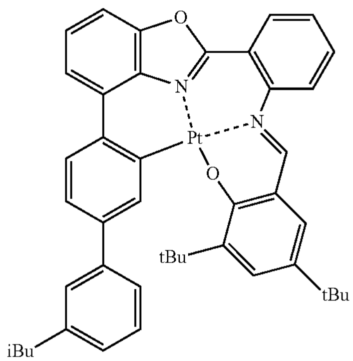
3-23
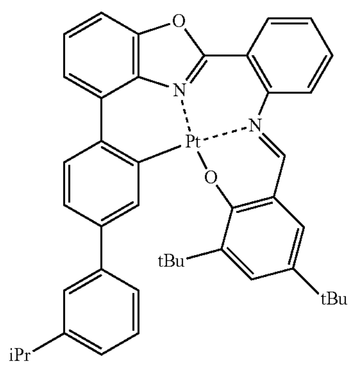
3-24
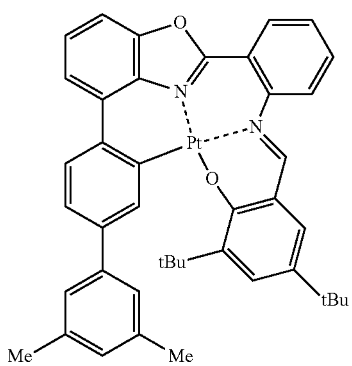
-continued
3-25
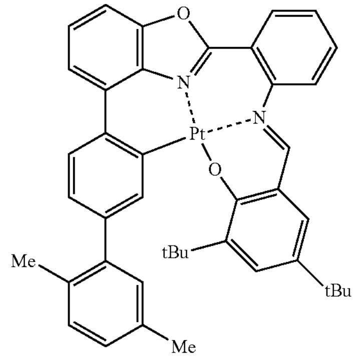
3-26
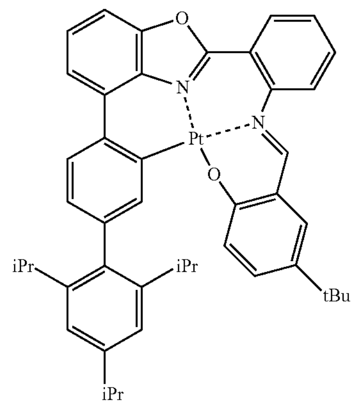
3-27
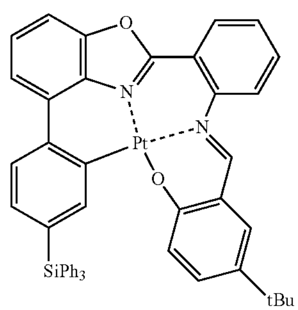
3-28
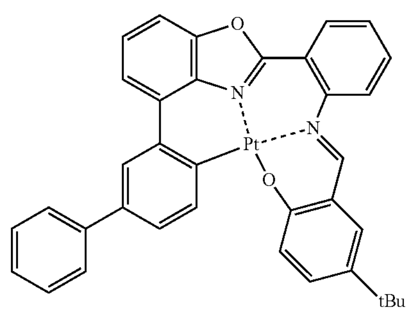

-continued
3-29
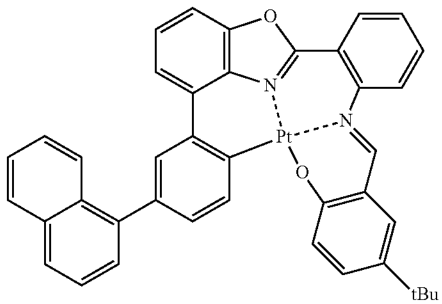
3-30
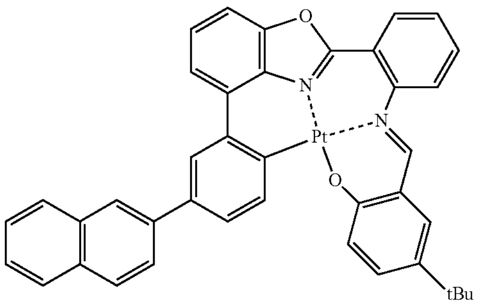
3-31
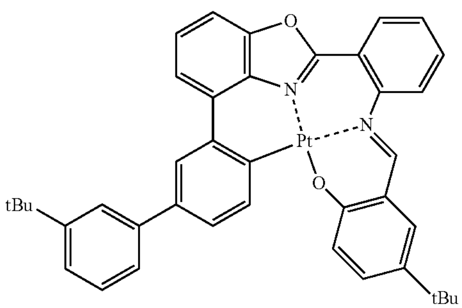
3-32
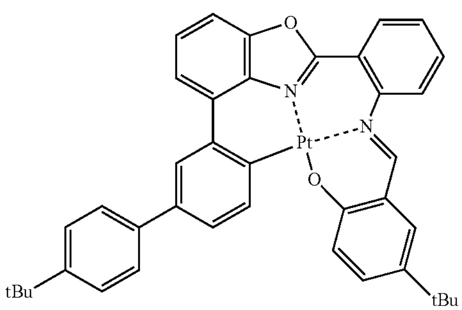
3-33
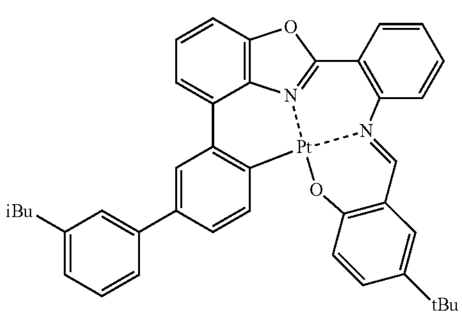
-continued
3-34
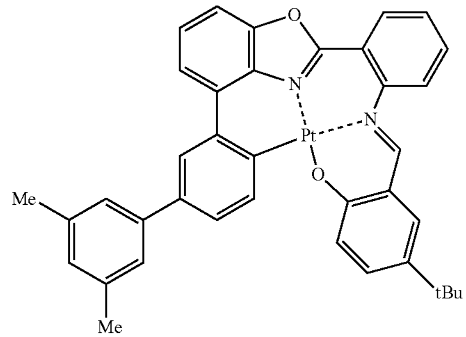
3-35
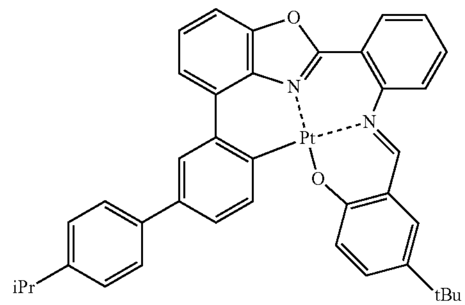
3-36
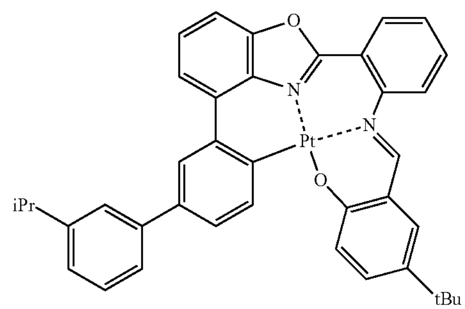
3-37
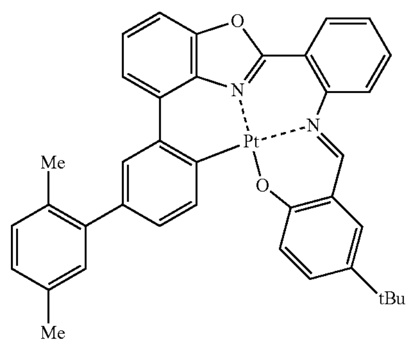
3-38
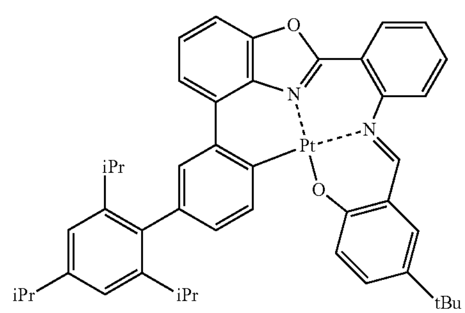

-continued
3-39
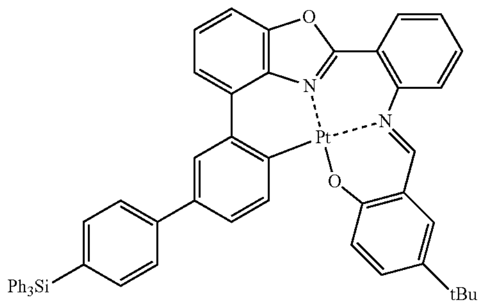
3-40
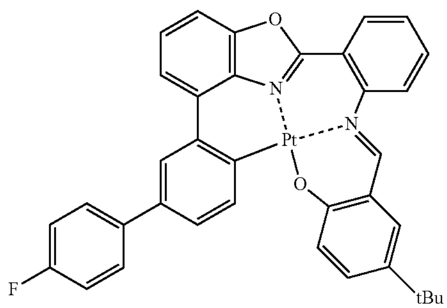
3-41
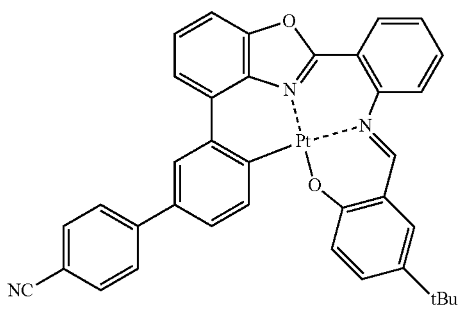
3-42
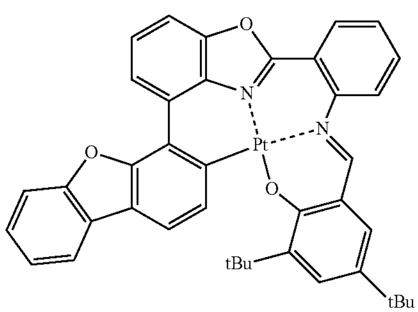
3-43
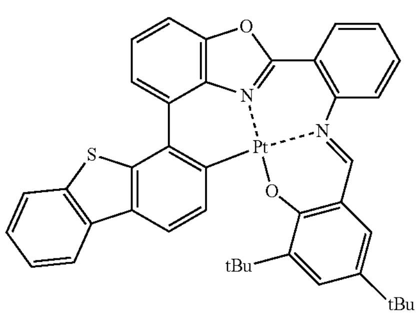
-continued
3-44
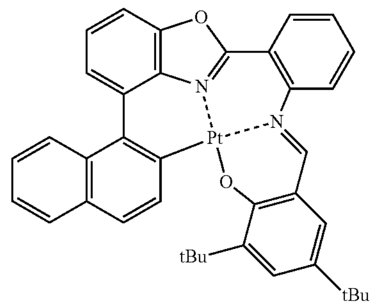
3-45
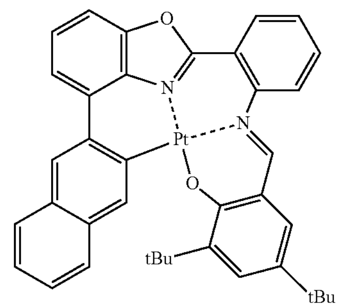
3-46
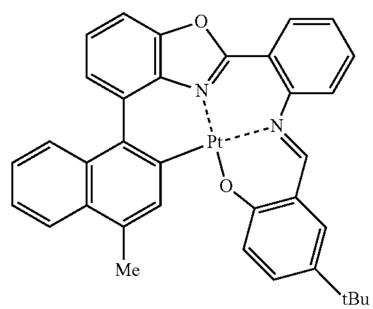
3-47
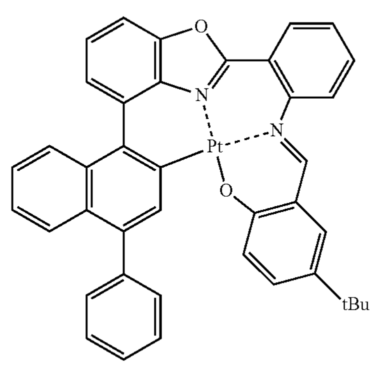

-continued
3-48
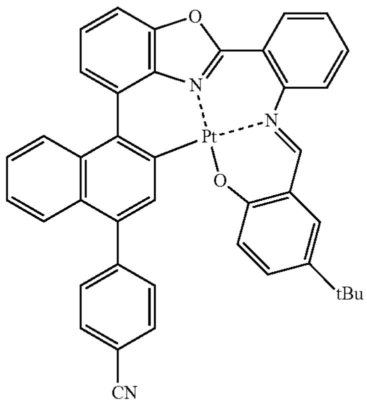
3-49
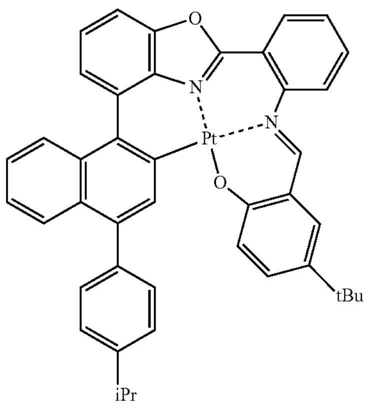
3-50
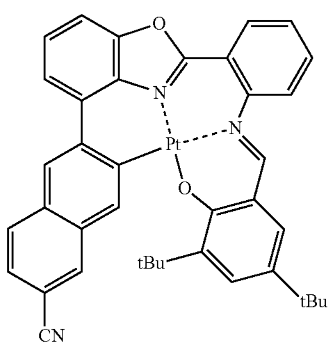
3-51
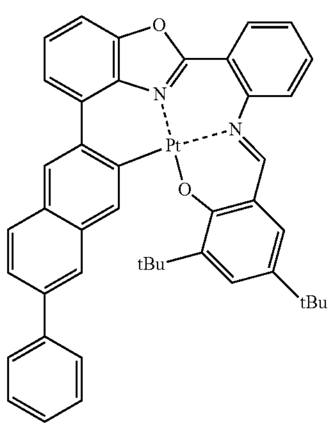
-continued
3-52
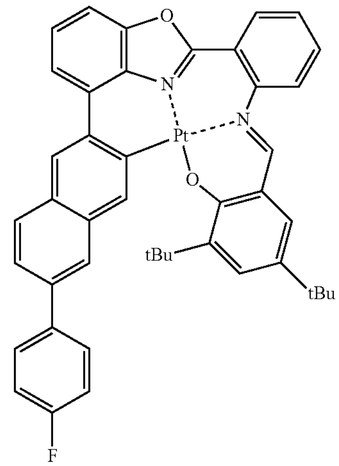
3-53
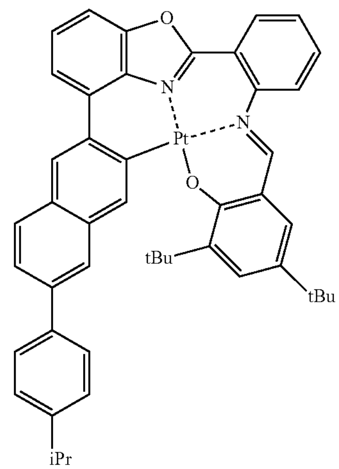
3-54
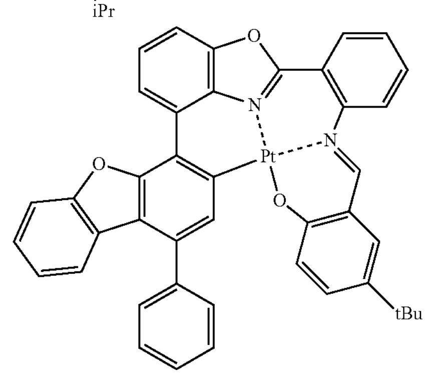
3-55
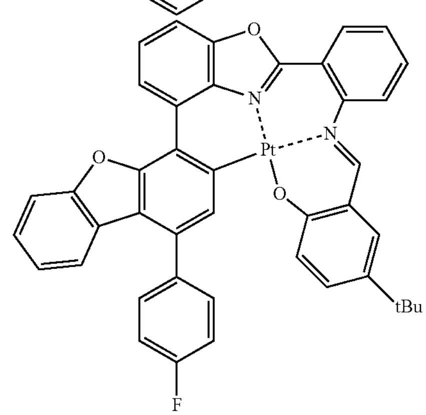

3-56
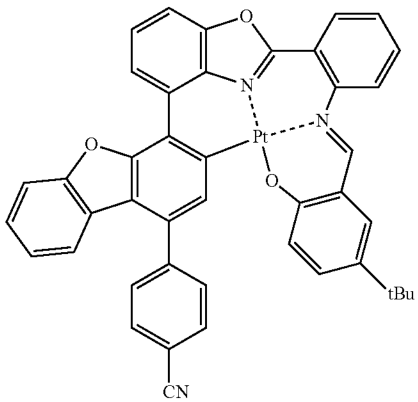
3-57
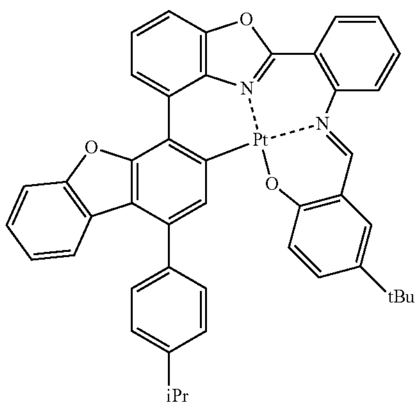
3-58
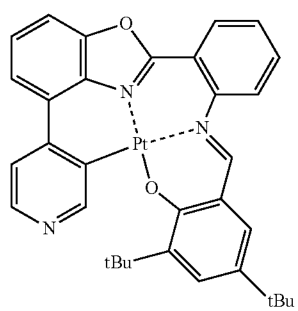
3-59
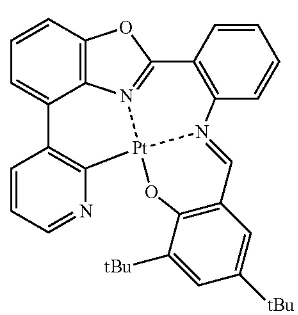
3-60
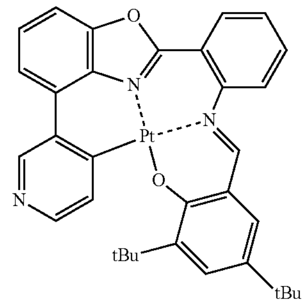
3-61
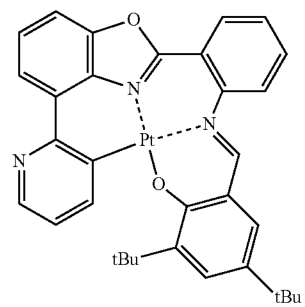
3-62
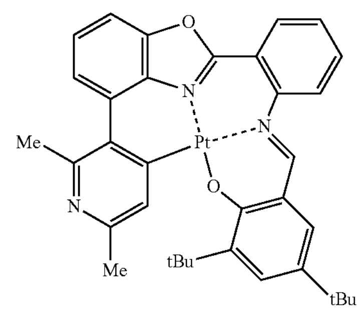
3-63
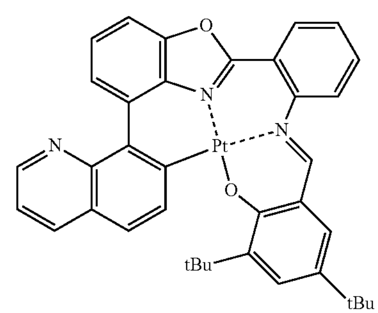
3-64
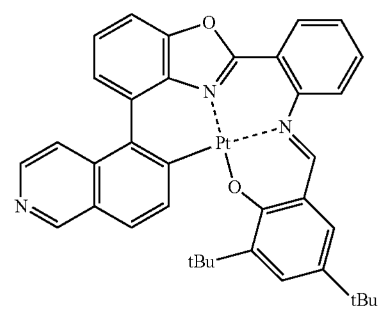

3-65
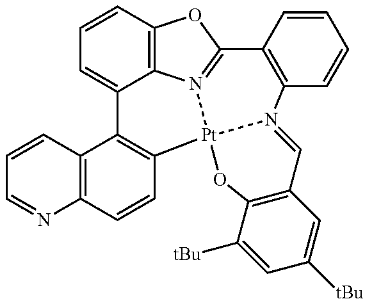
3-66
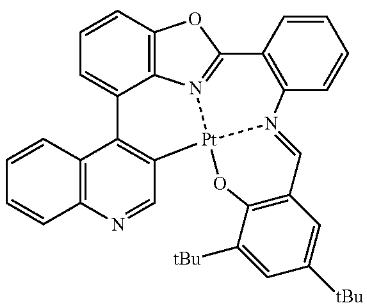
3-67
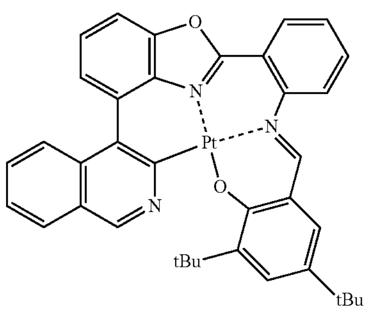
3-68
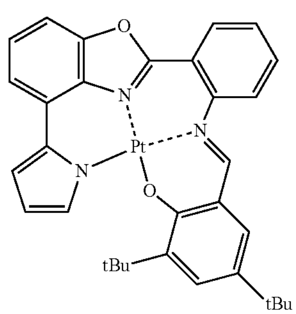
3-69
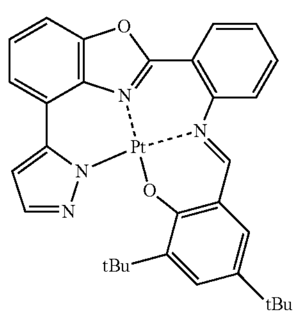
3-70
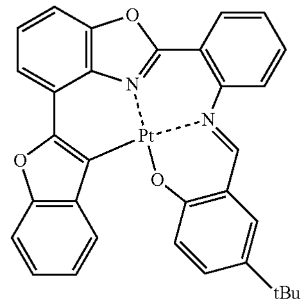
3-71
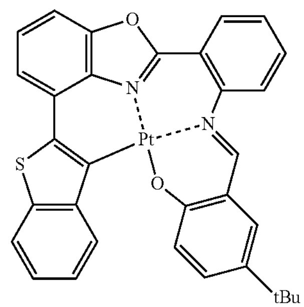
3-72
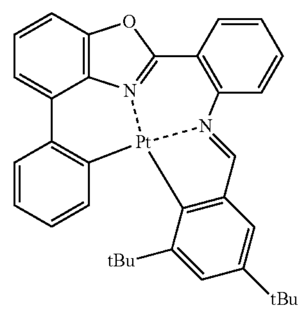
3-73
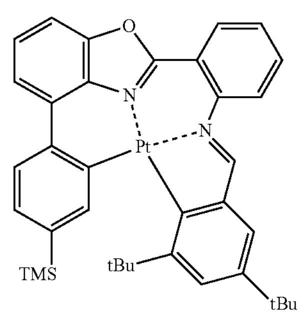
3-74
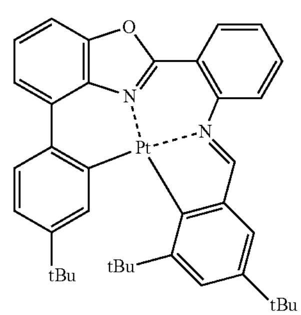

-continued
3-75
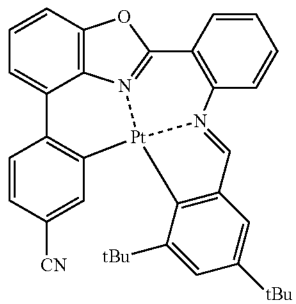
3-76
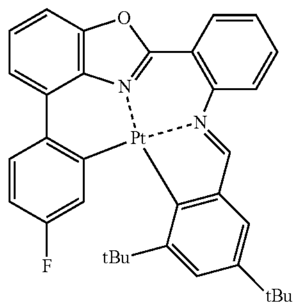
3-82
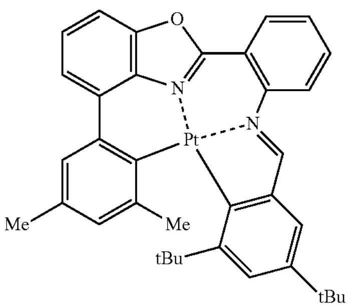
3-83
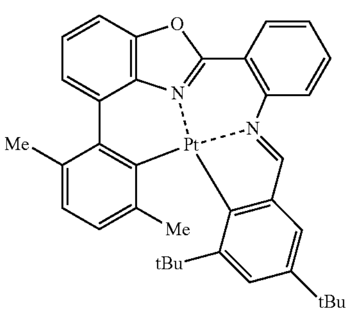
3-84
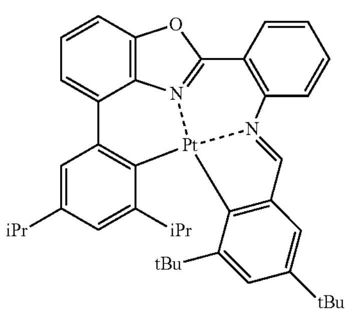
-continued
3-85
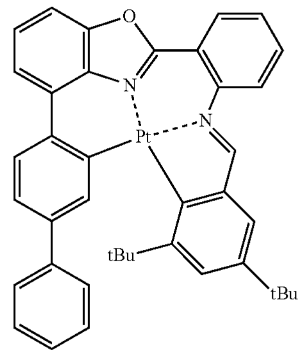
3-86
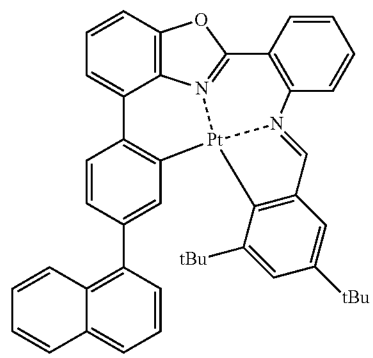
3-87
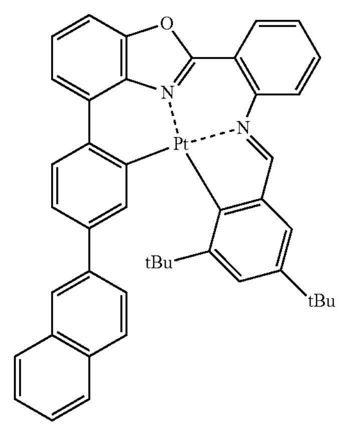
3-88
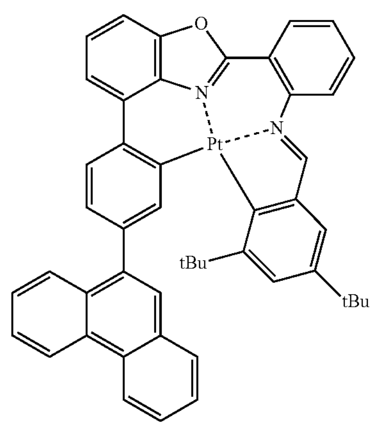

3-89
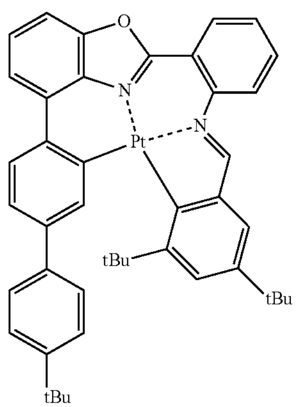
3-90
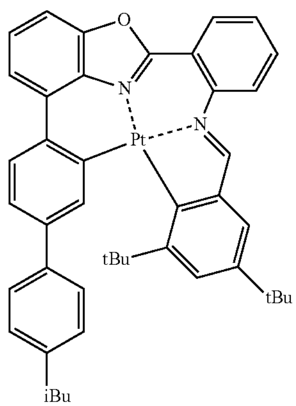
3-91
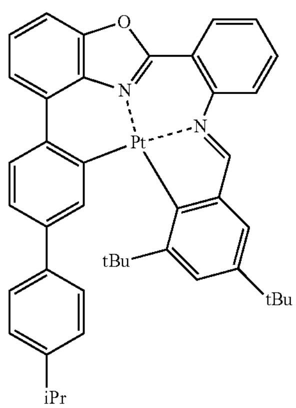
3-92
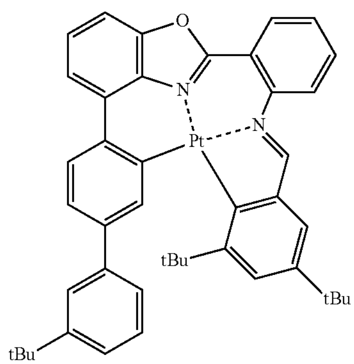
3-93
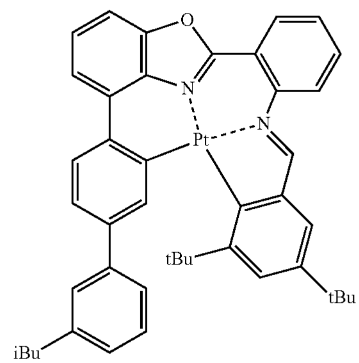
3-94
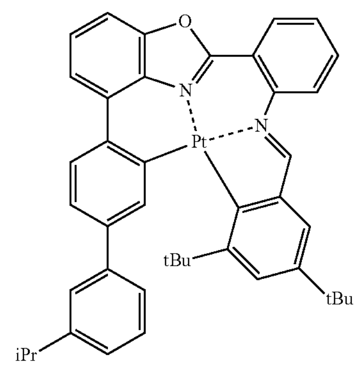
3-95
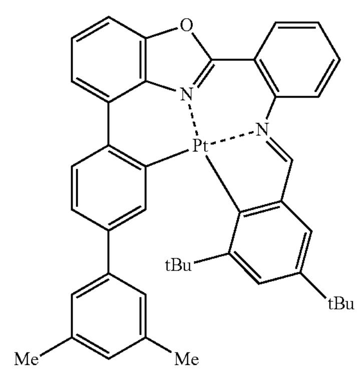
3-96
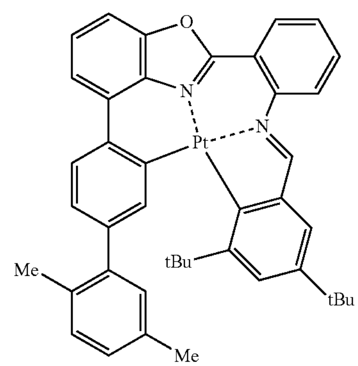

-continued
3-97
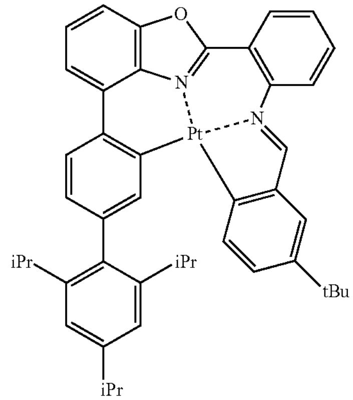
3-98
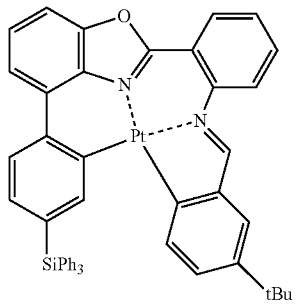
3-99
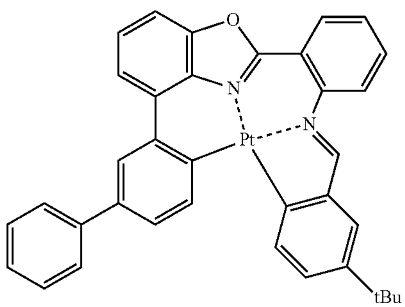
3-100
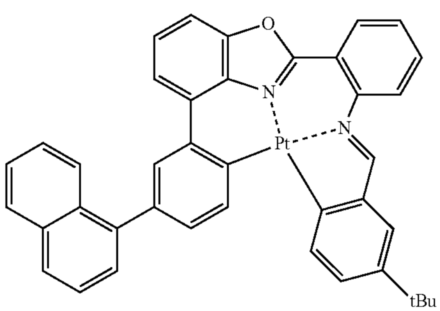
3-101
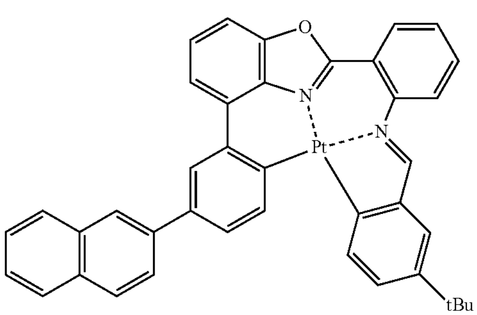
-continued
3-102
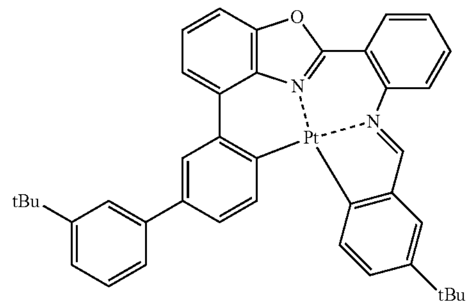
3-103
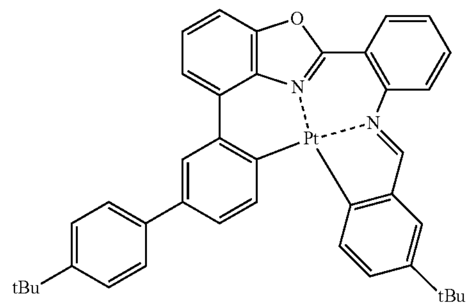
3-104
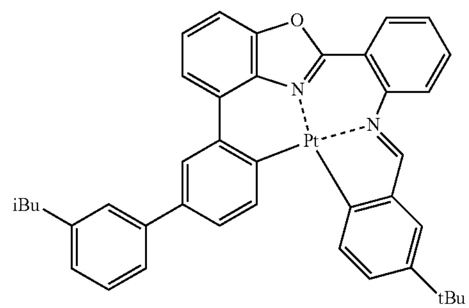
3-105
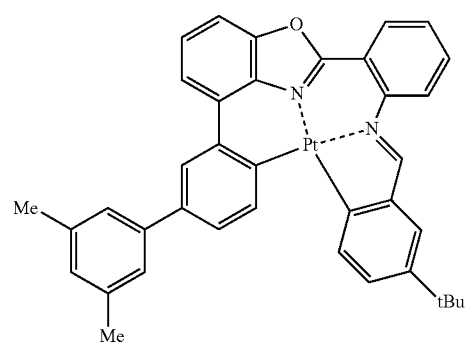
3-106
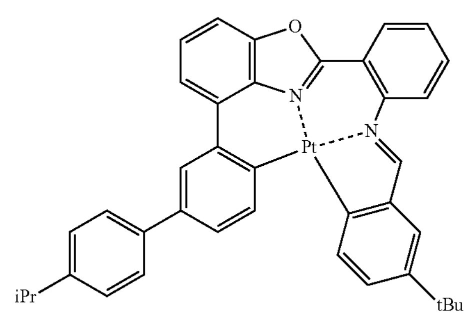

-continued
3-107
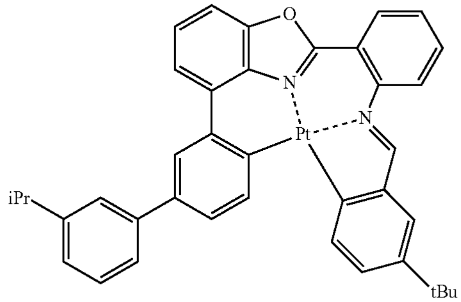
3-108
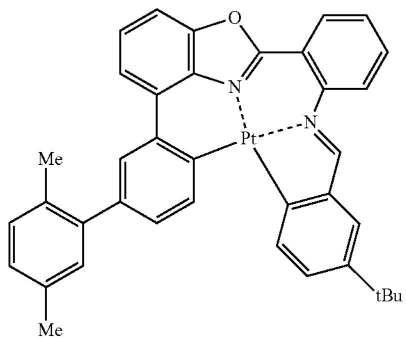
3-109
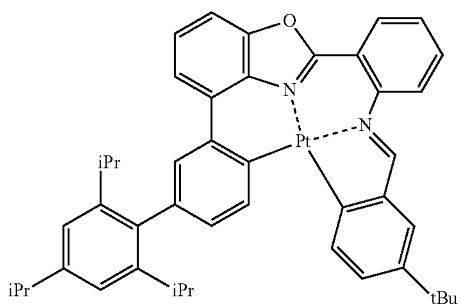
3-110
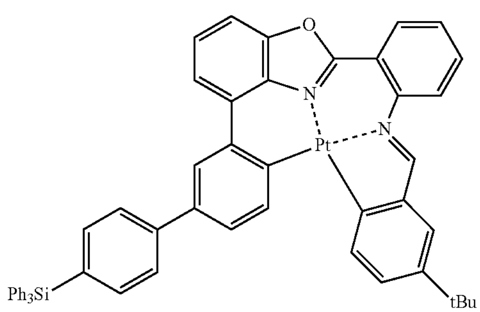
3-111
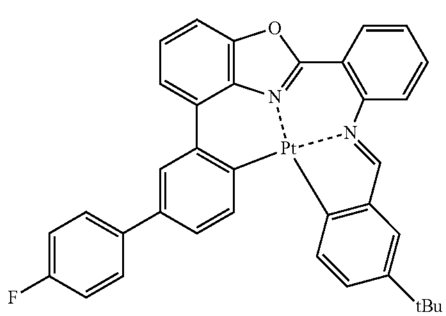
-continued
3-112
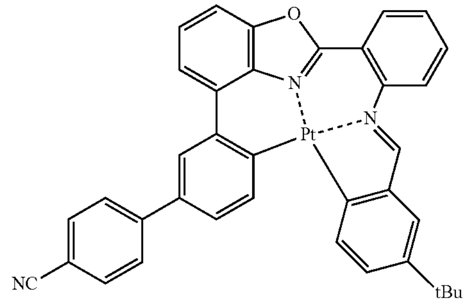
3-113
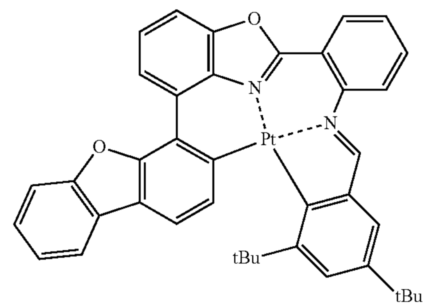
3-114
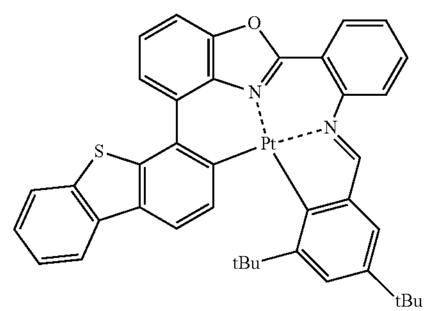
3-115
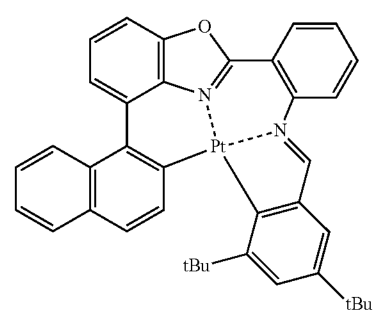
3-116
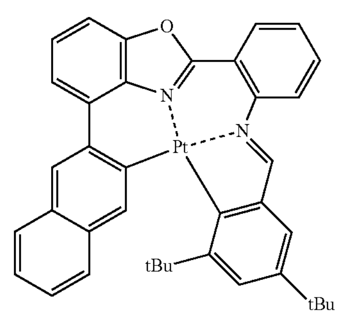

-continued
3-117
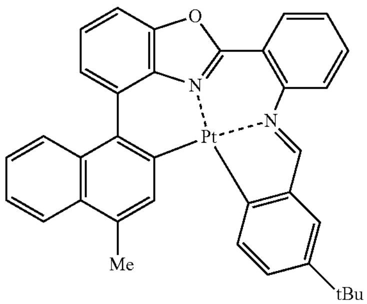
3-118
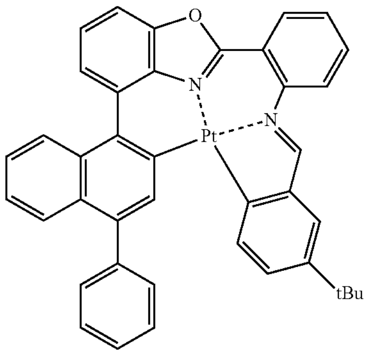
3-119
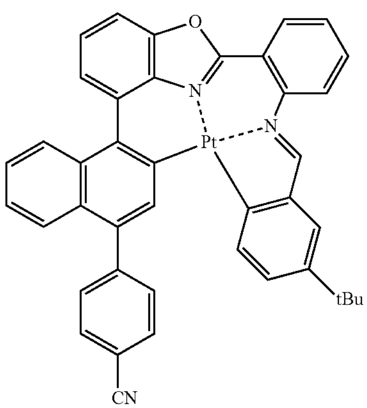
3-120
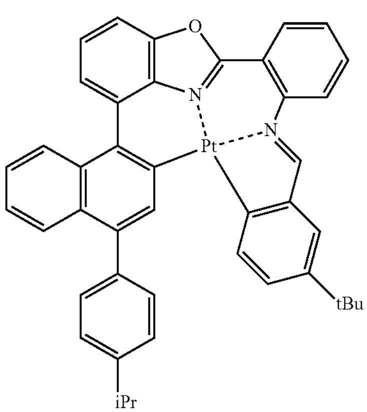
-continued
3-121
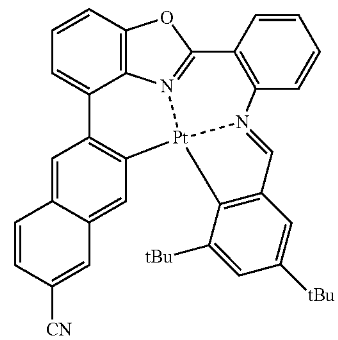
3-122
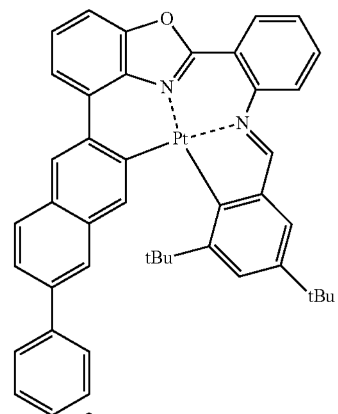
3-123
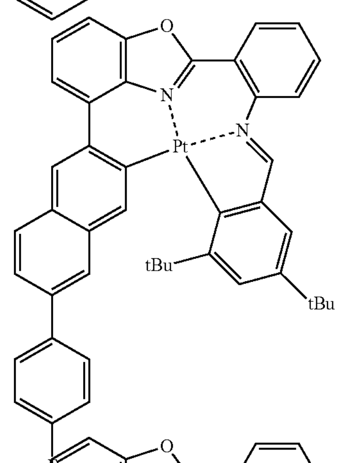
3-124
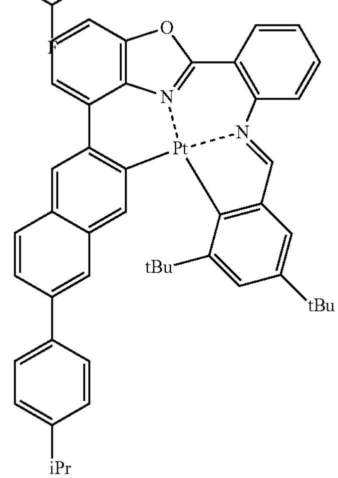

3-125
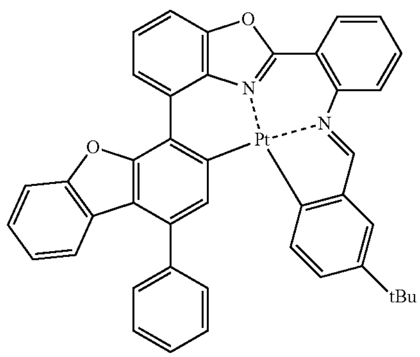
3-126
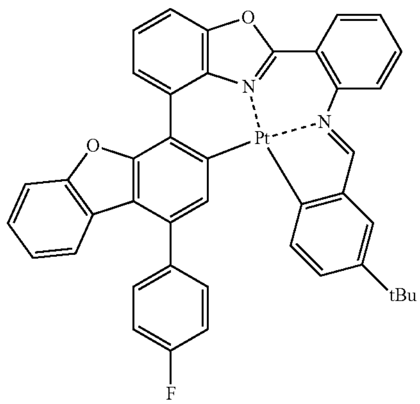
3-127
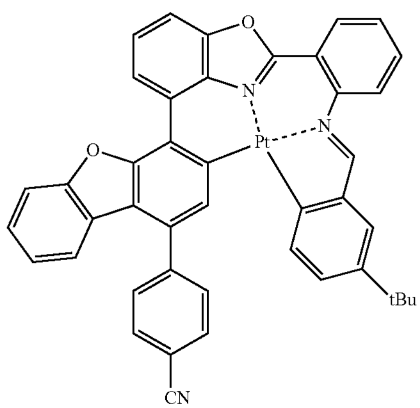
3-128
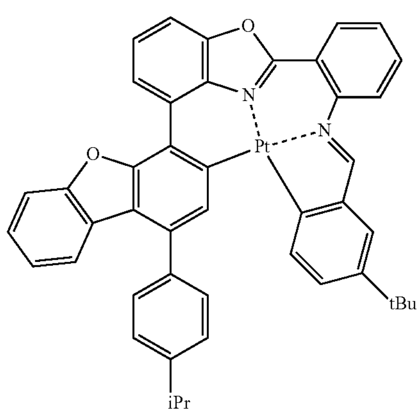
3-129
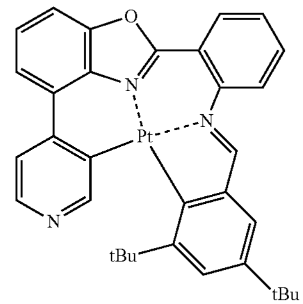
3-130
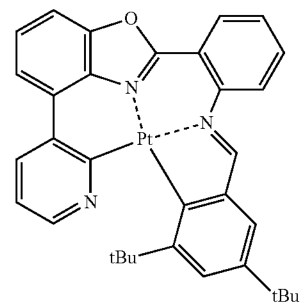
3-131
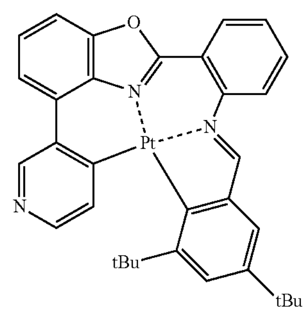
3-132
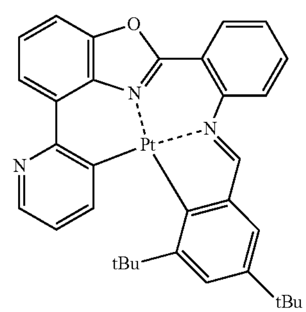
3-133
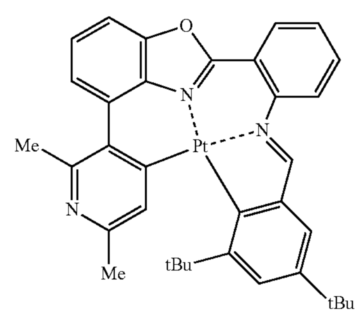

3-134
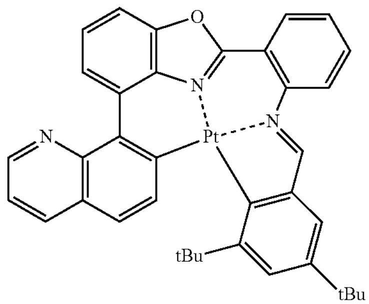
3-135
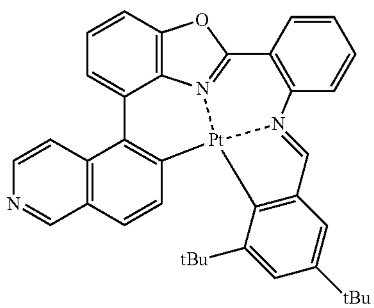
3-136
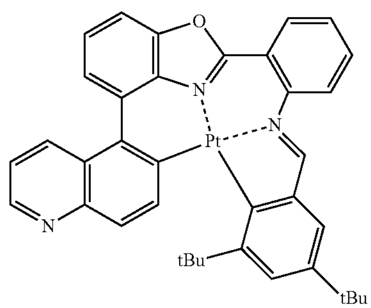
3-137
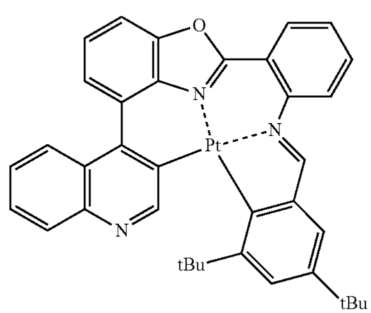
3-138
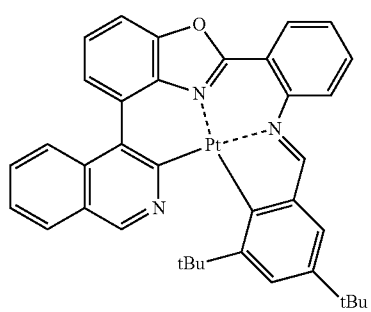
3-139
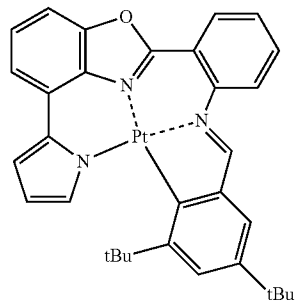
3-140
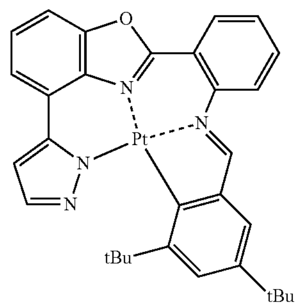
3-141
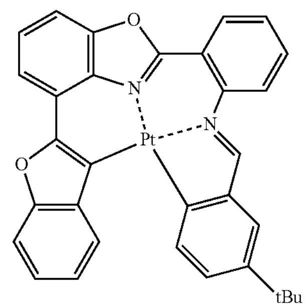
3-142
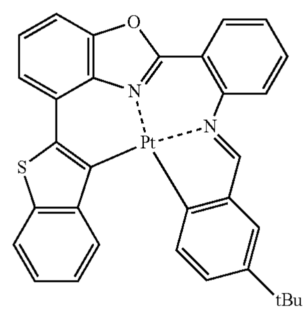
3-143
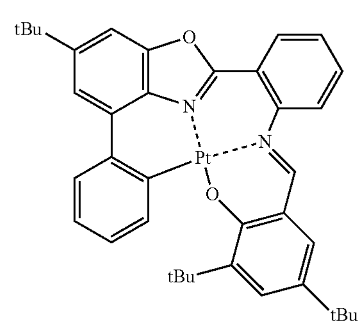

3-144
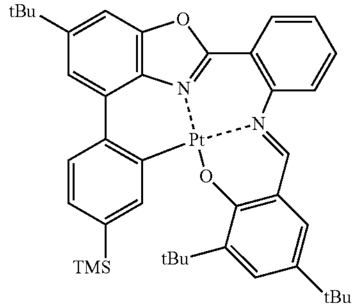
3-145
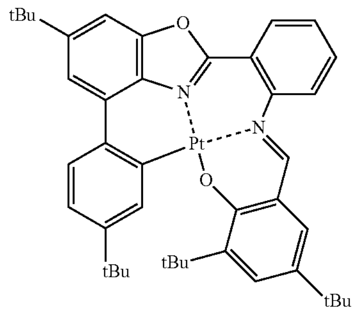
3-146
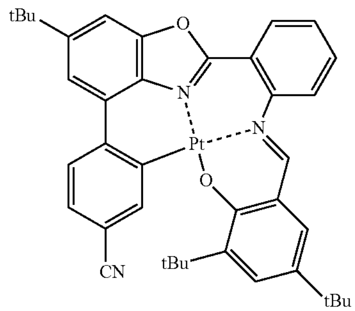
3-147
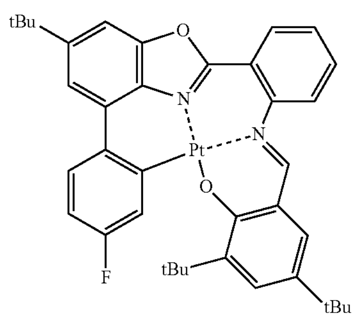
3-148
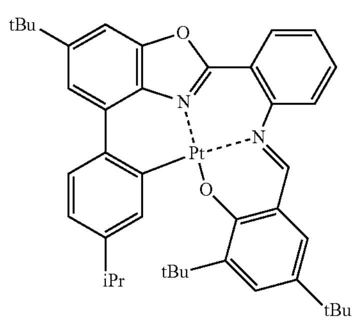
3-149
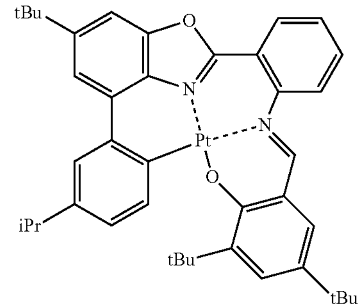
3-150
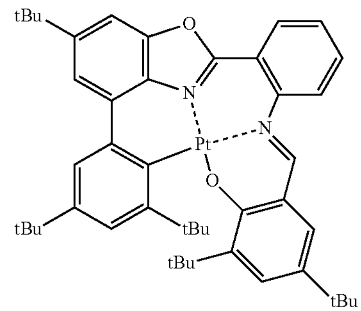
3-151
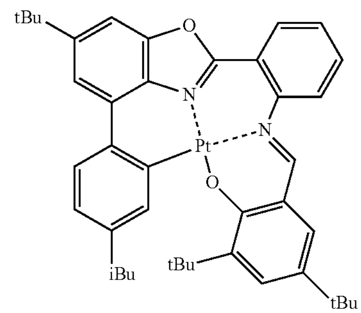
3-152
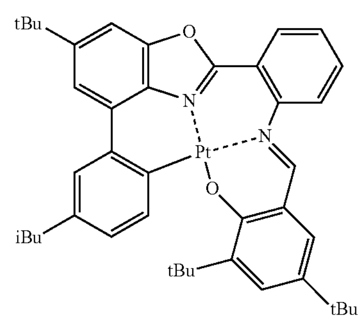
3-153
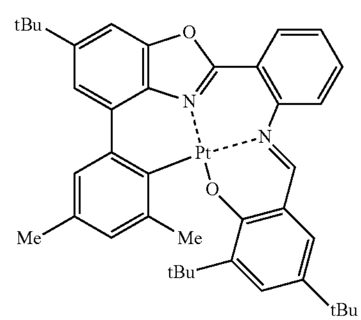

3-154
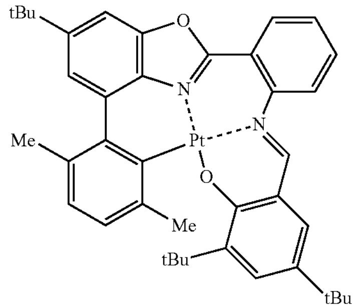
3-155
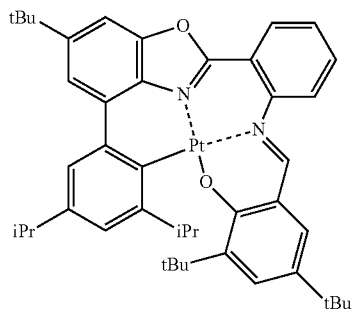
3-156
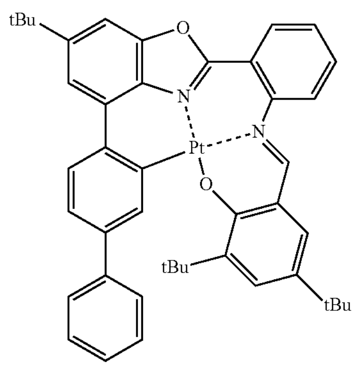
3-157
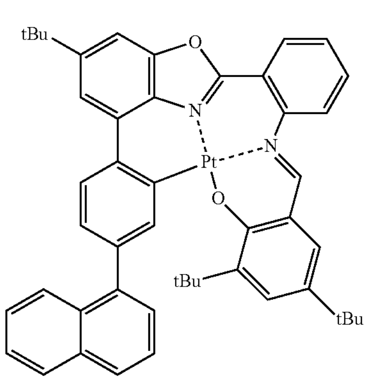
3-158
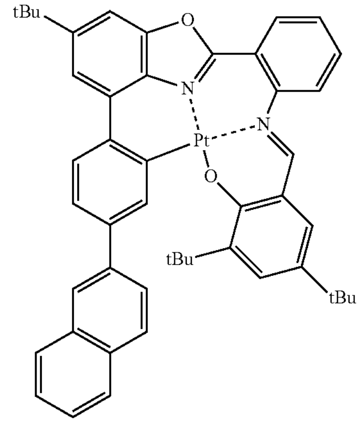
3-159
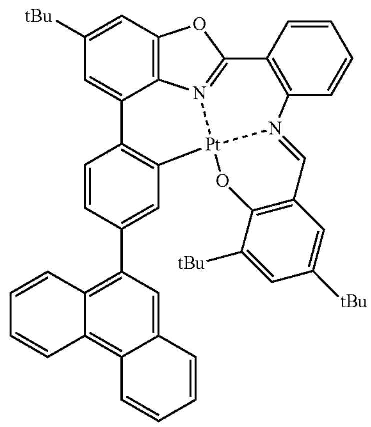
3-160
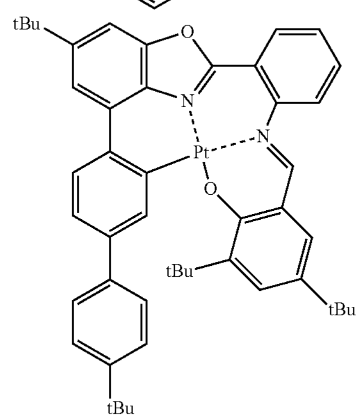
3-161
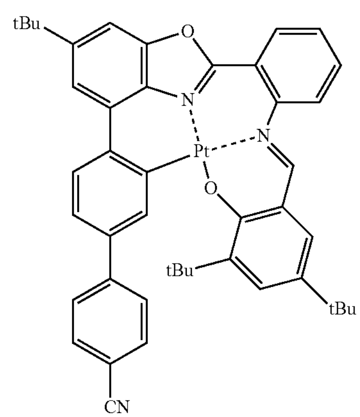

-continued
3-162
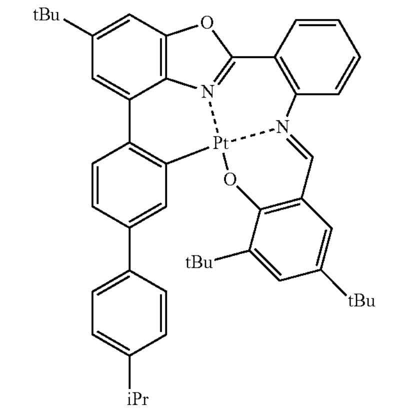
3-168
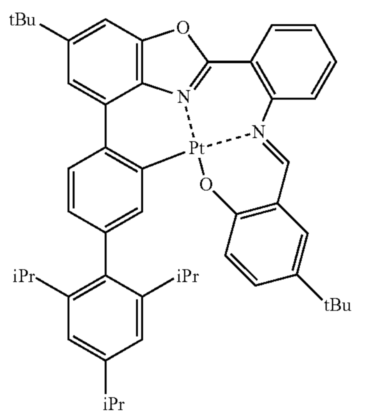
3-169
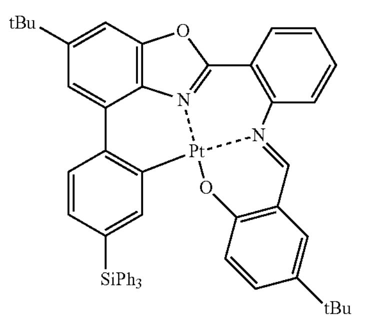
3-170
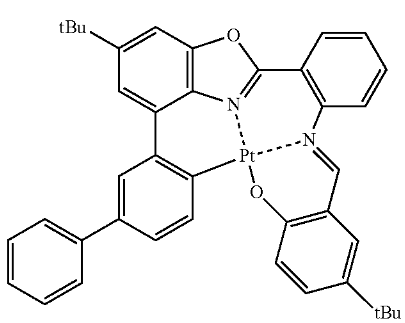
-continued
3-171
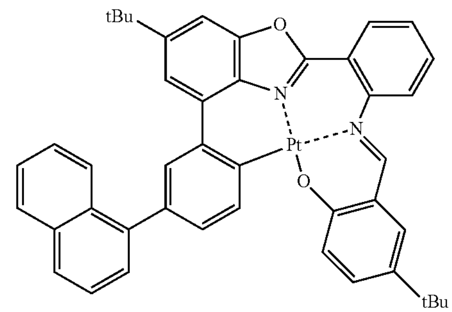
3-172
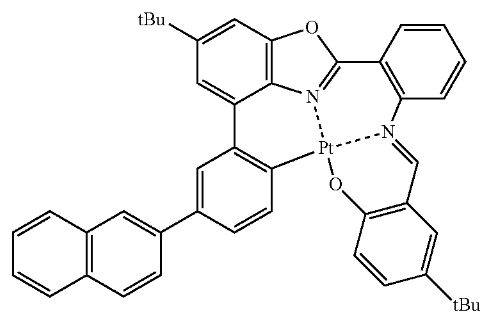
3-173
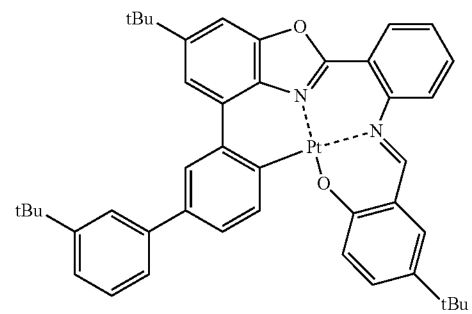
3-174
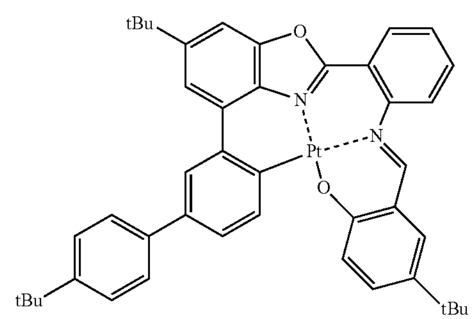
3-175
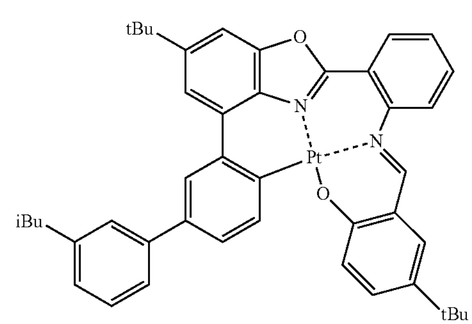

-continued
3-176
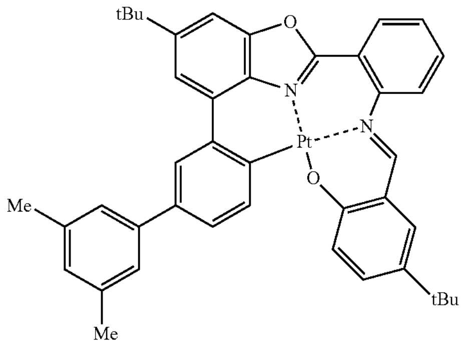
3-177
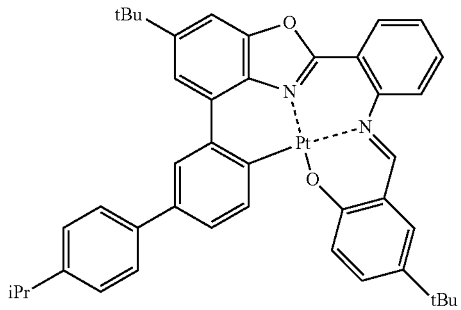
3-178
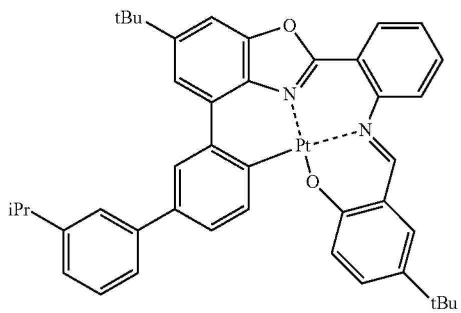
3-179
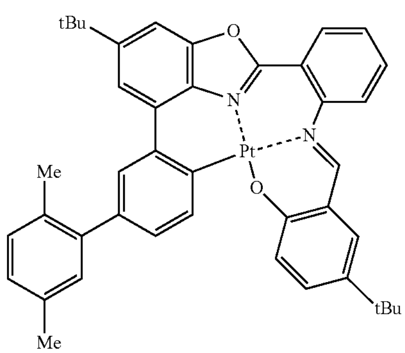
-continued
3-180
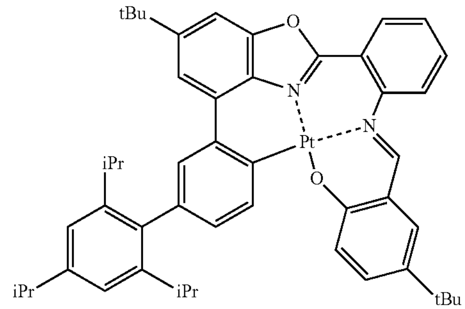
3-181
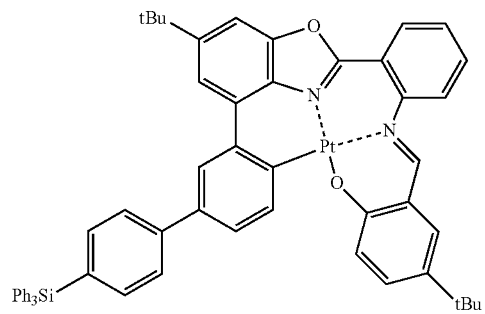
3-182
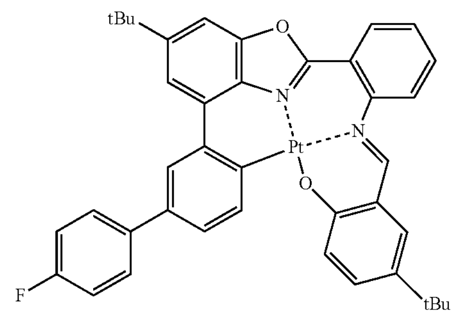
3-183
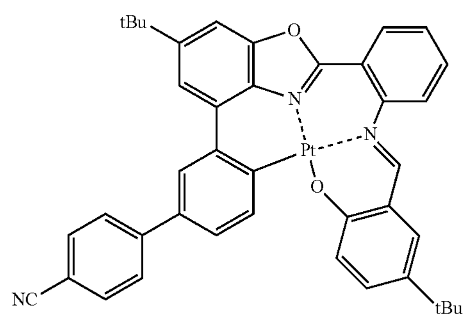
3-184
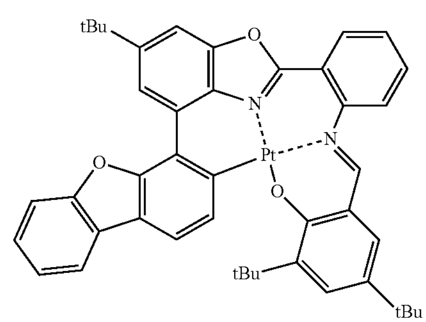

3-185
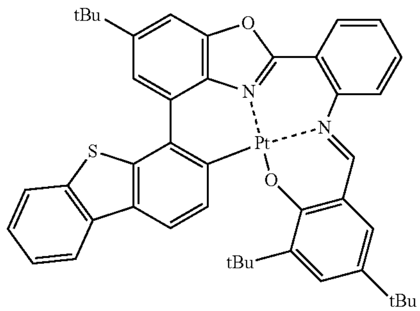
3-186
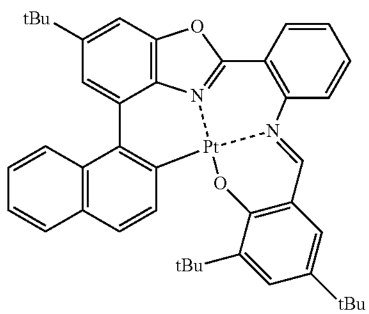
3-187
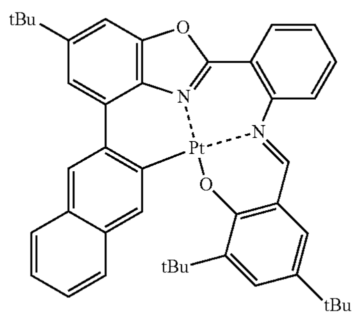
3-188
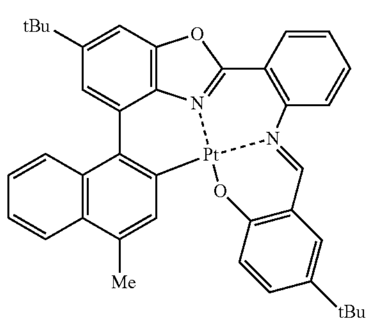
3-189
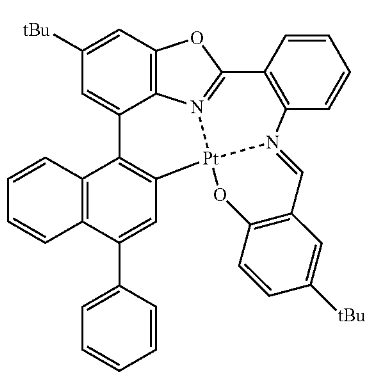
3-190
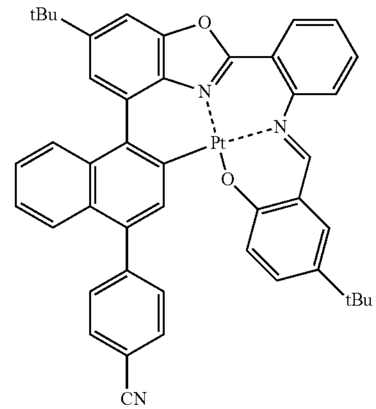
3-191
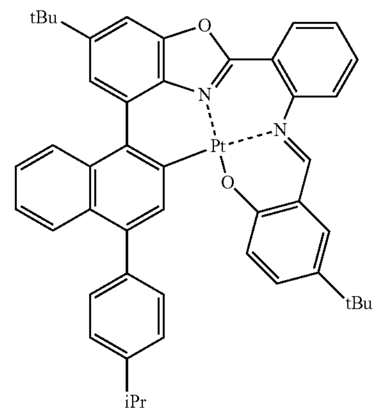
3-192
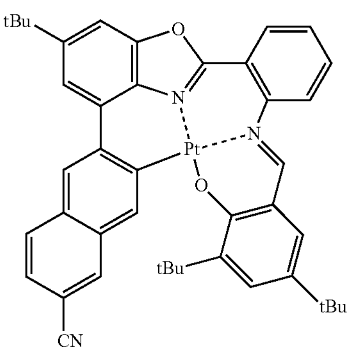
3-193
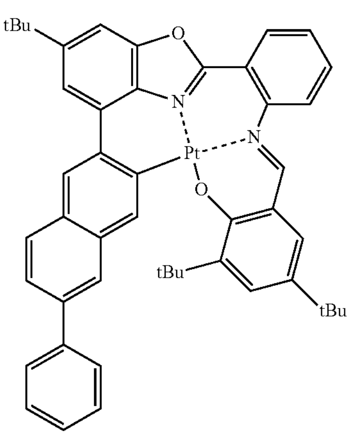

840
-continued
3-194
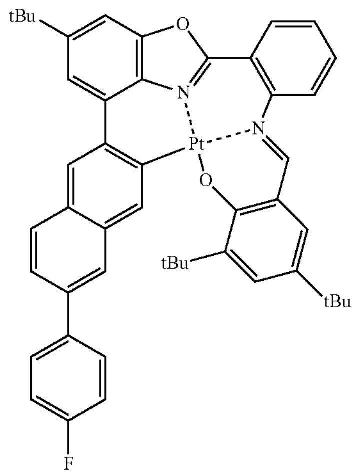
3-195
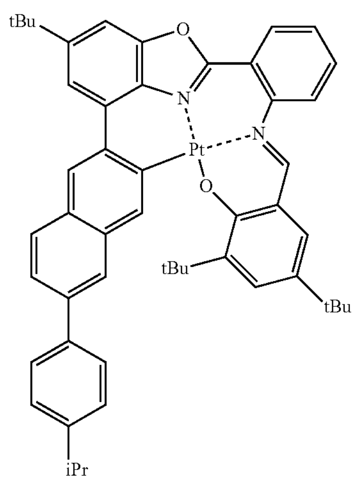
3-196
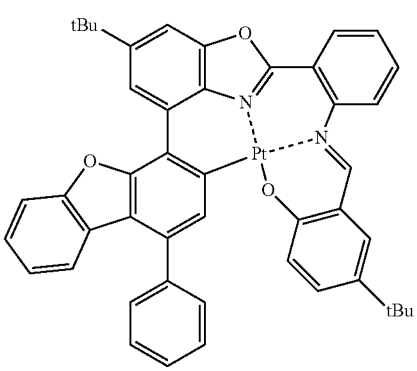
3-197
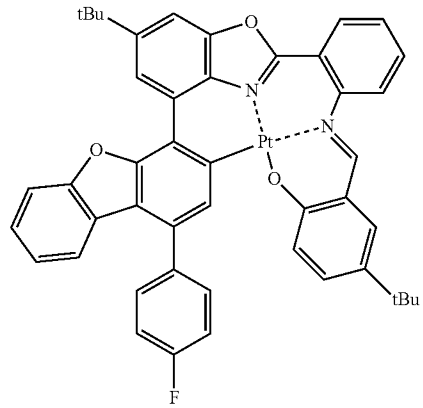
3-198
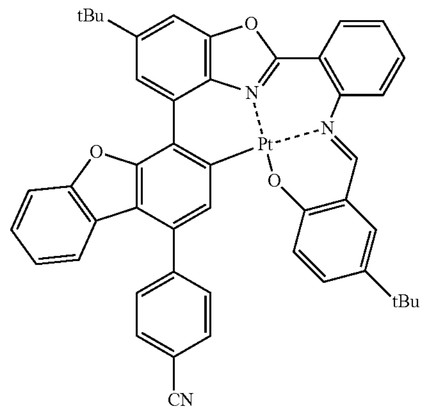
3-199
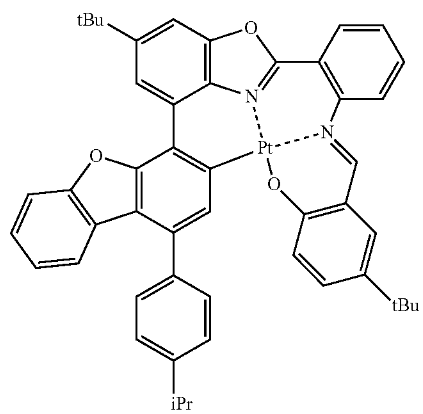
3-200
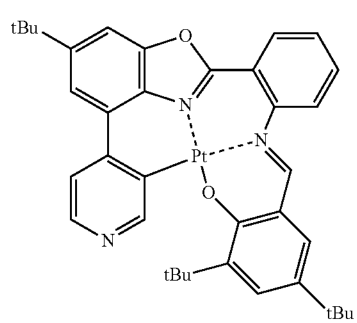

-continued
3-201
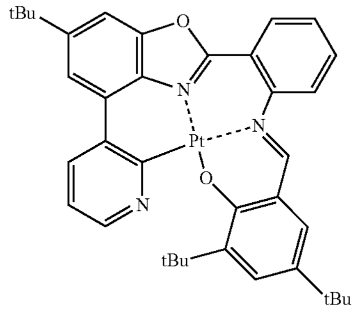
3-202
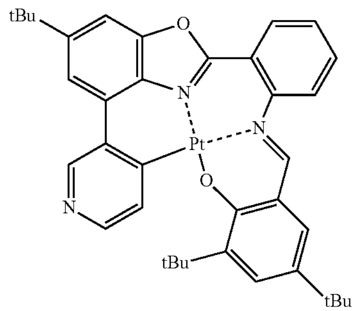
3-203
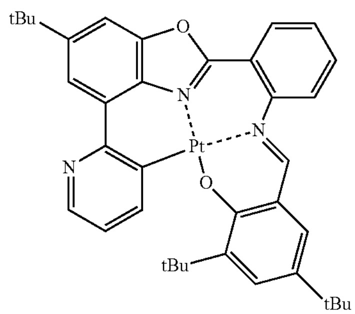
3-204
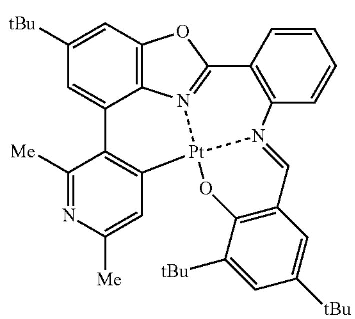
3-205
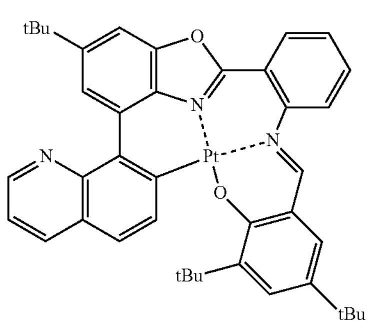
-continued
3-206
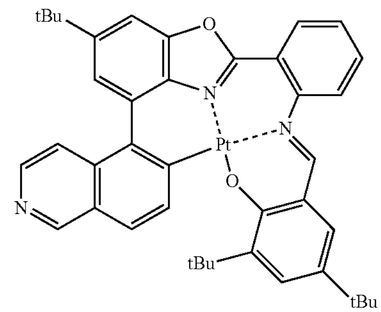
3-207
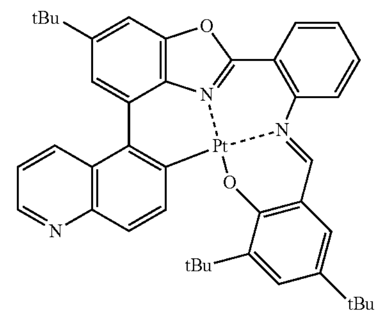
3-208
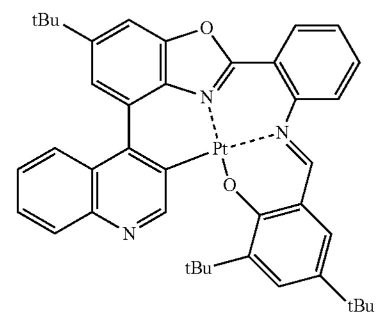
3-209
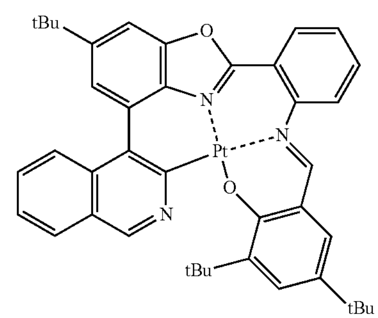
3-210
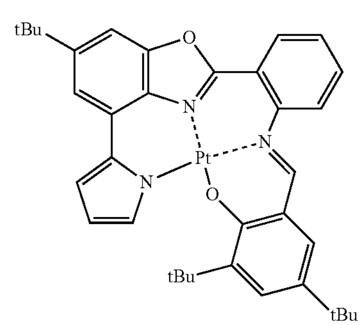

3-211
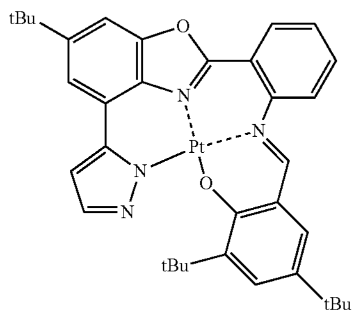
3-212
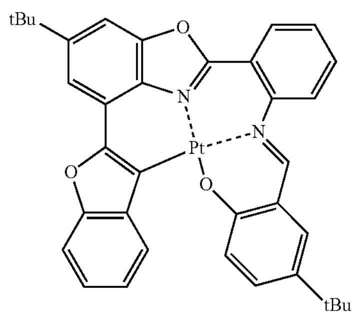
3-213
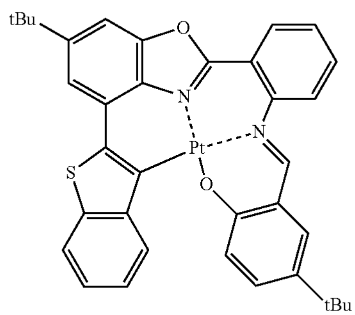
3-214
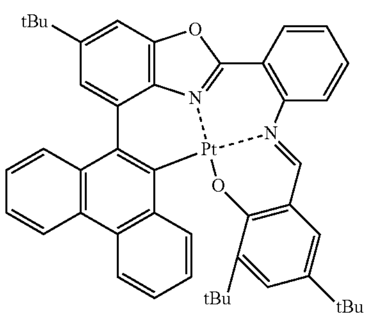
3-215
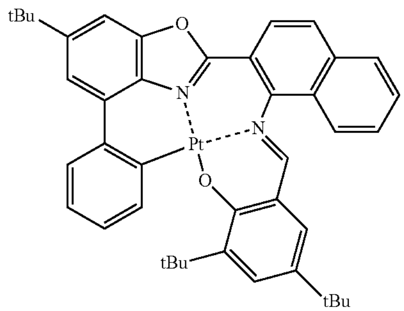
3-216
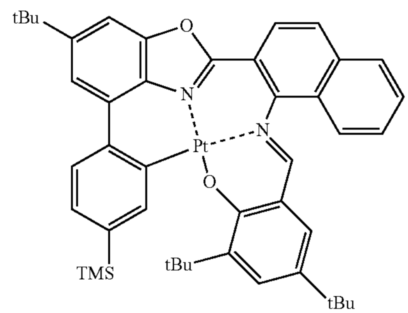
3-217
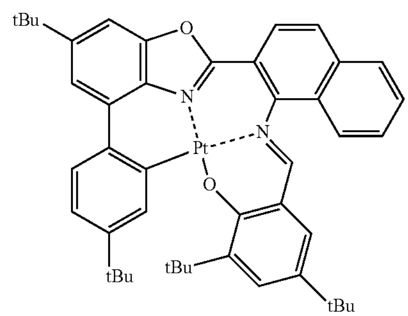
3-218
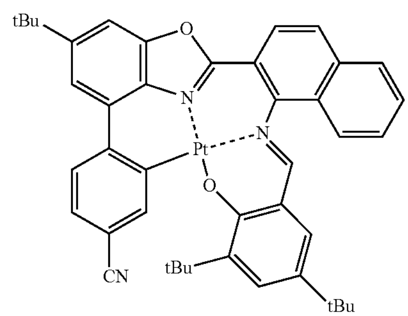
3-219
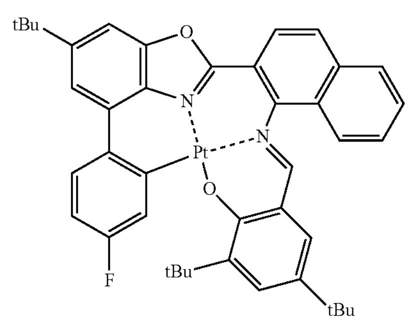
3-220
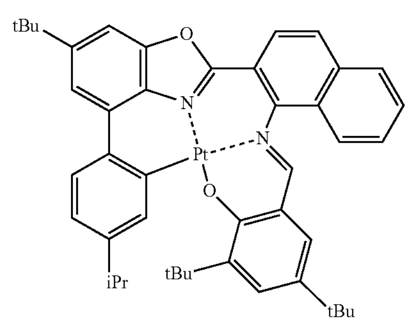

-continued
3-221
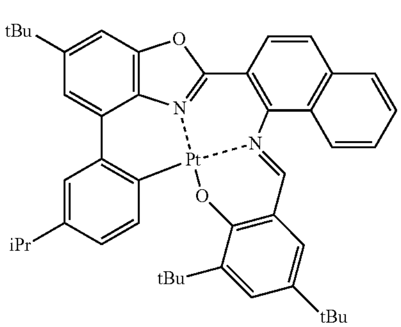
3-222
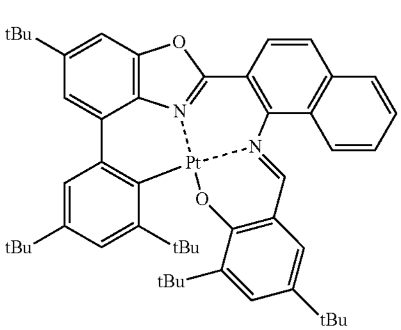
3-223
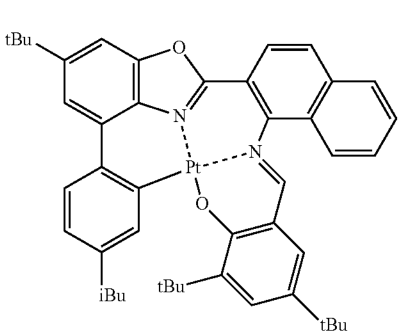
3-224
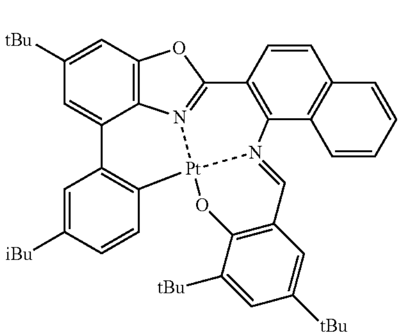
3-225
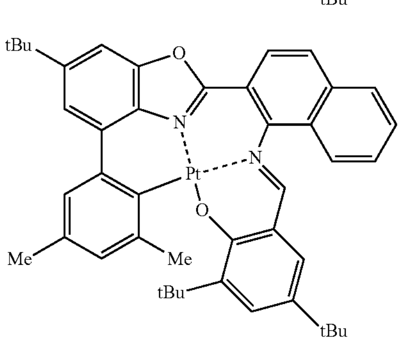
-continued
3-226
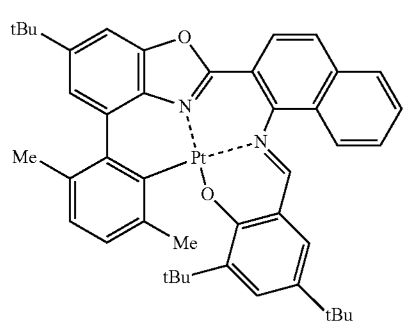
3-227
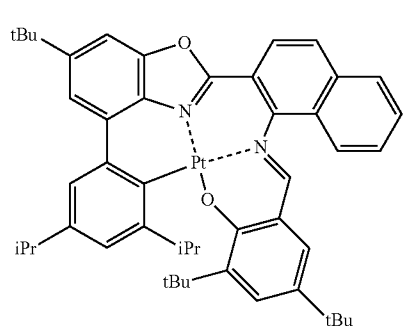
3-228
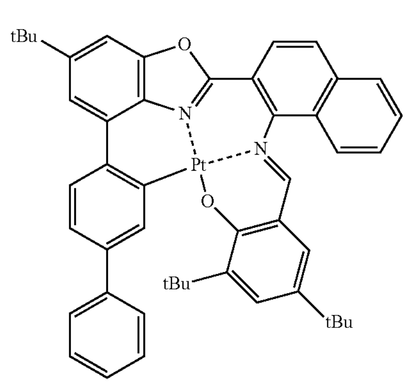
3-229
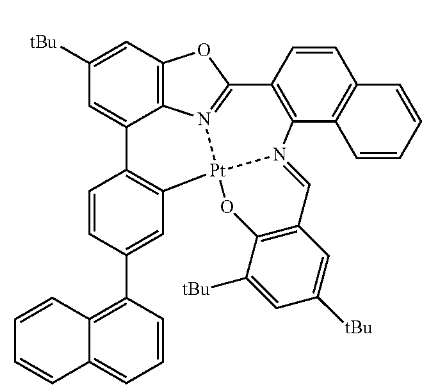

-continued
3-230
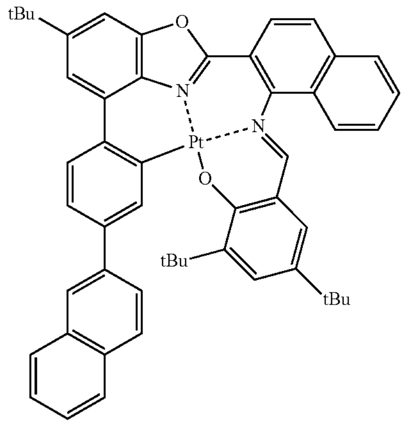
3-231
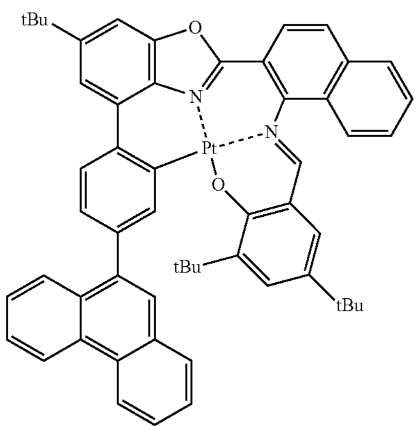
3-232
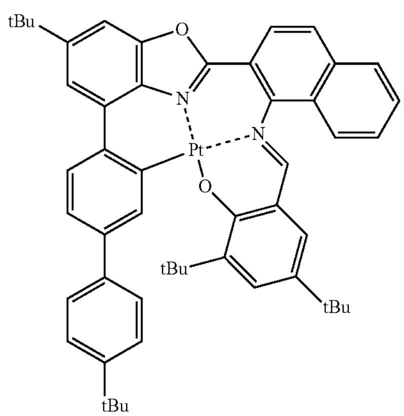
3-233
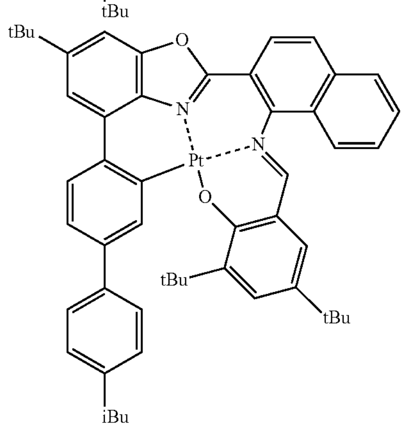
-continued
3-234
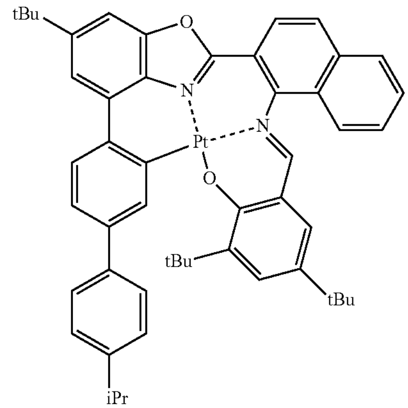
3-235
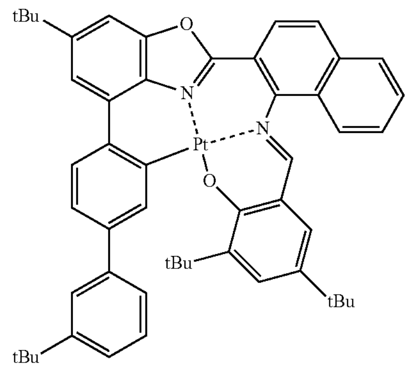
3-236
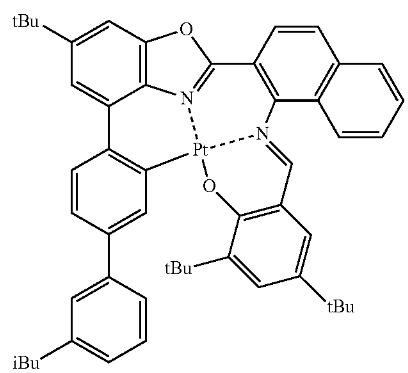
3-237
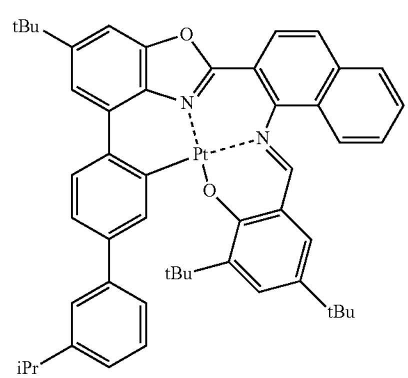

-continued
3-238
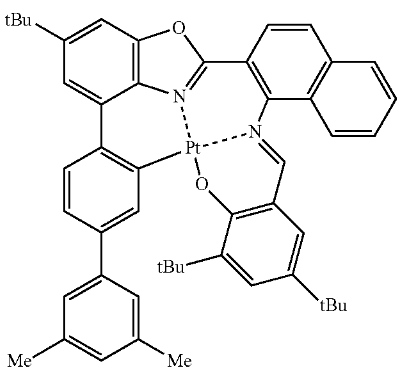
3-239
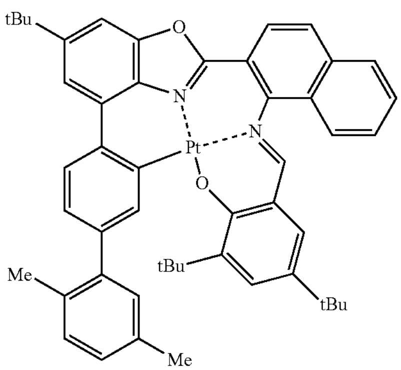
3-240
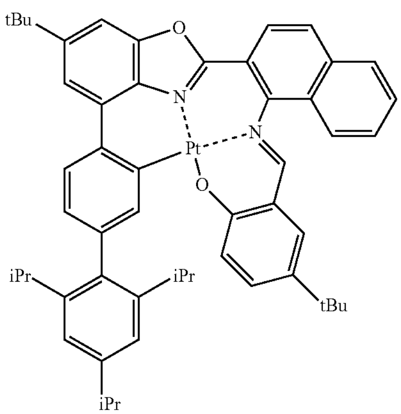
3-241
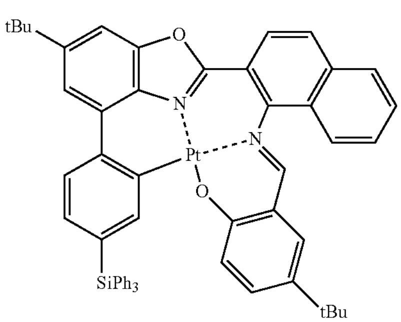
-continued
3-242
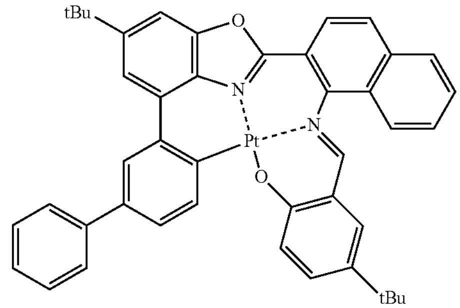
3-243
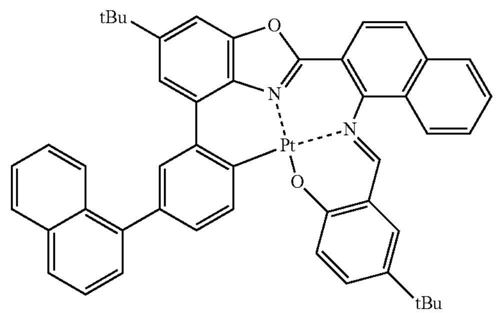
3-244
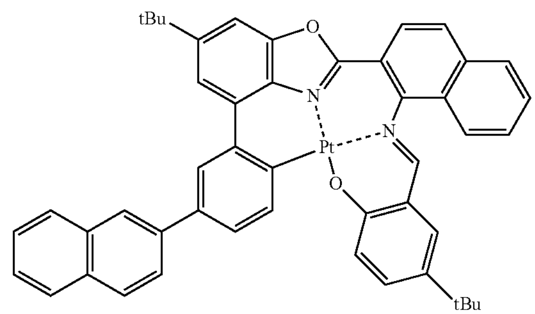
3-245
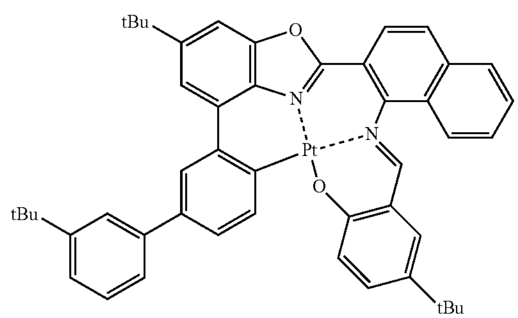
3-246
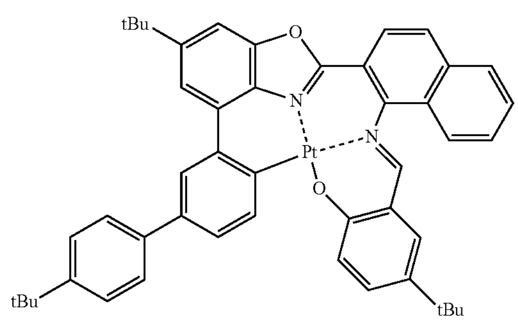

851
-continued
3-247
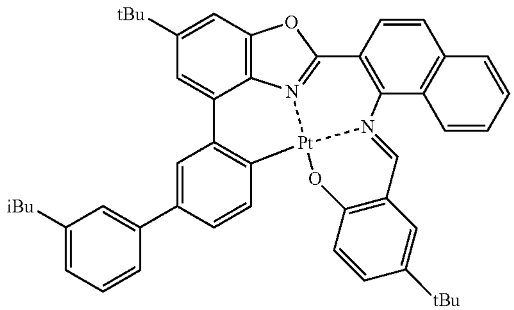
3-248
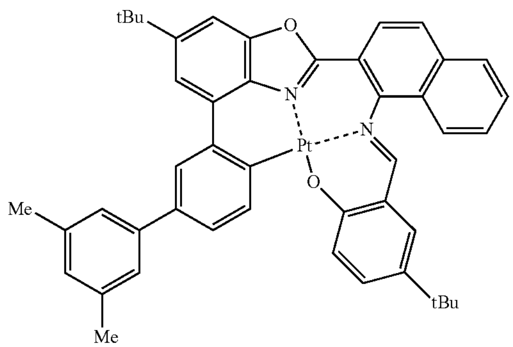
3-249
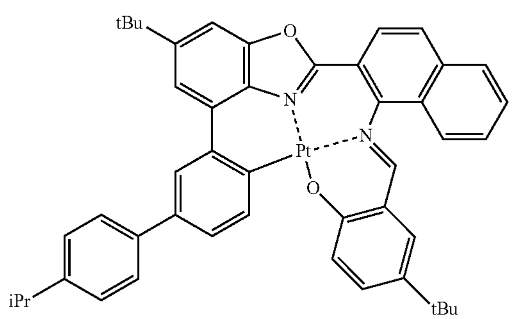
3-250
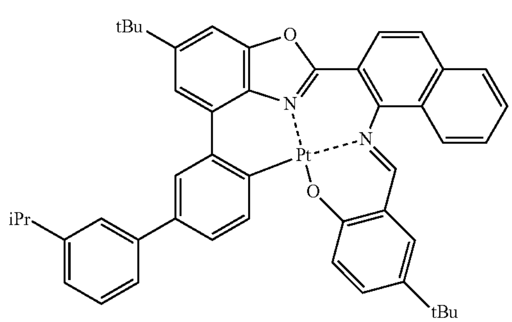
852
-continued
3-251
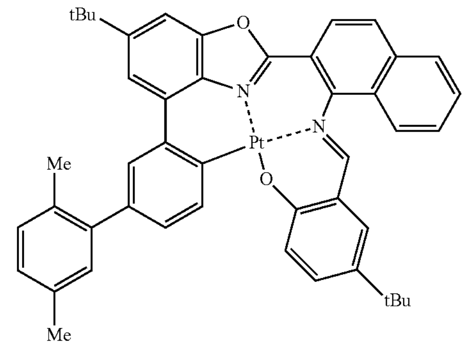
3-252
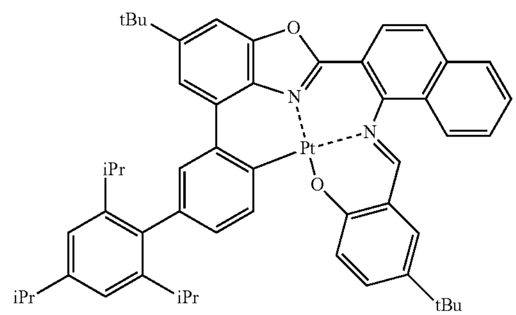
3-253
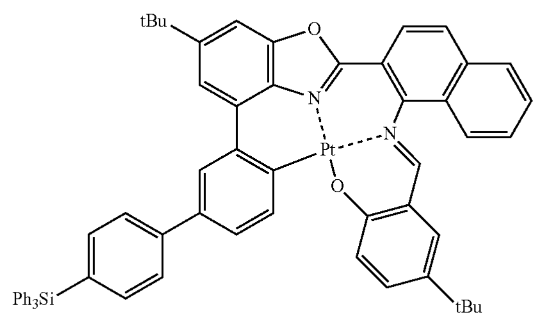
3-254
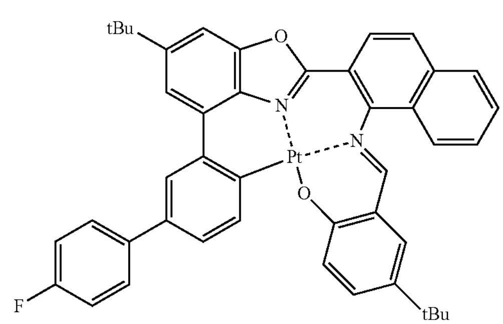

-continued
3-255
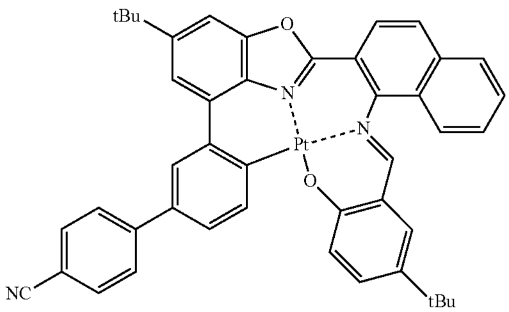
3-256
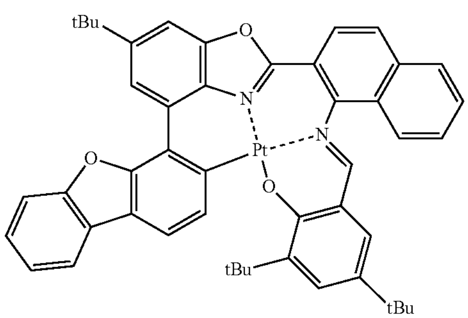
3-257
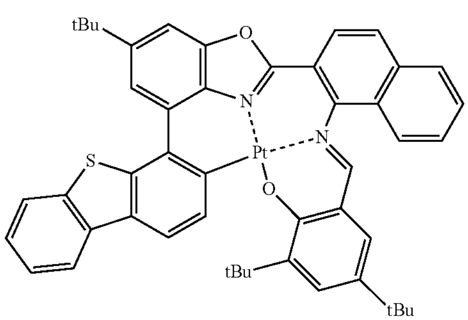
3-258
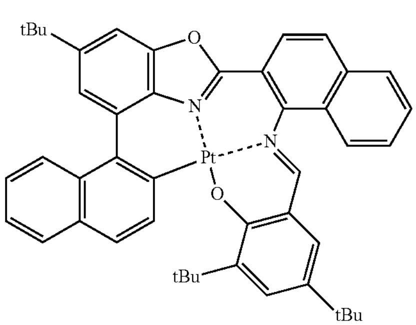
-continued
3-259
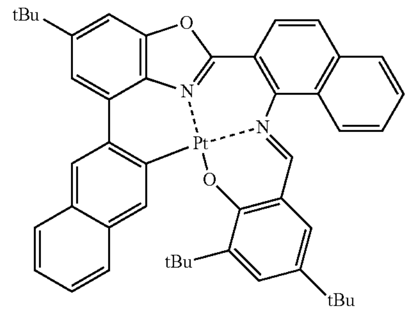
3-260
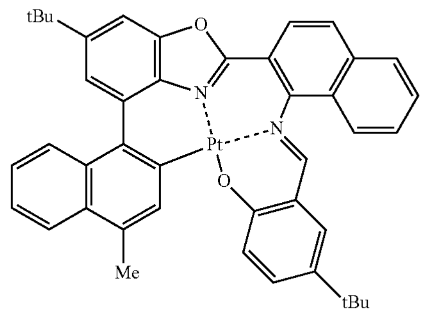
3-261
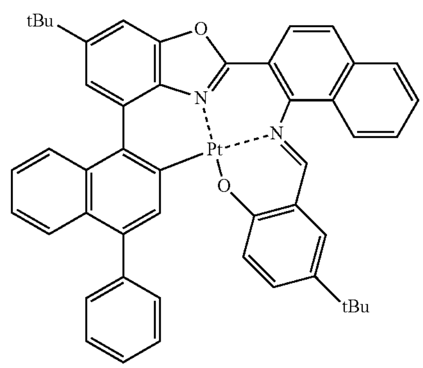
3-262
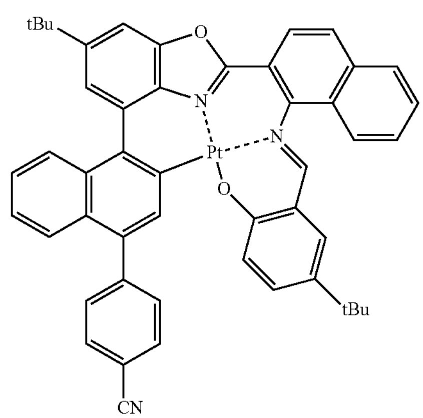

-continued
3-263
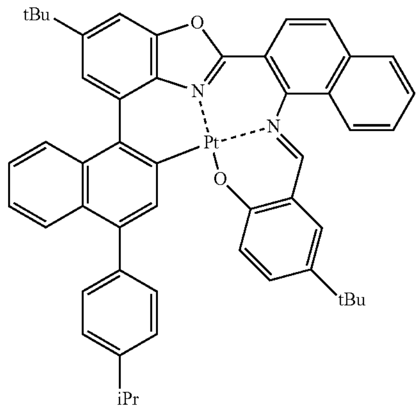
3-264
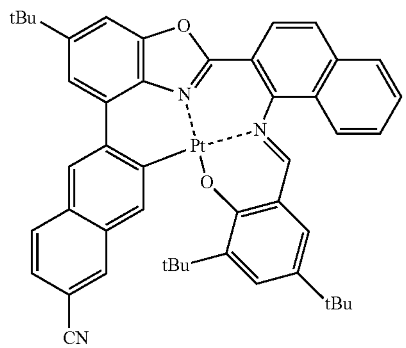
3-265
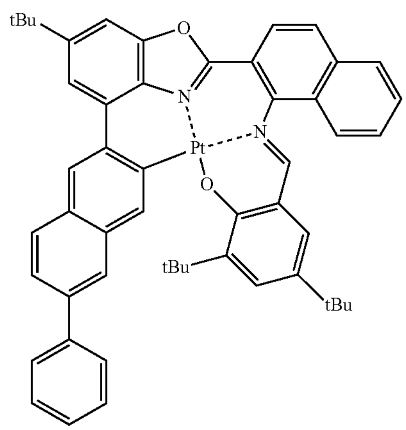
3-266
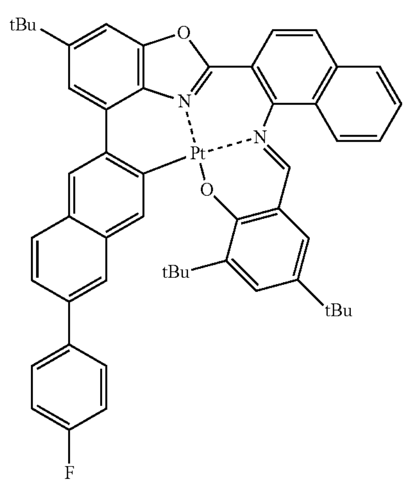
-continued
3-267
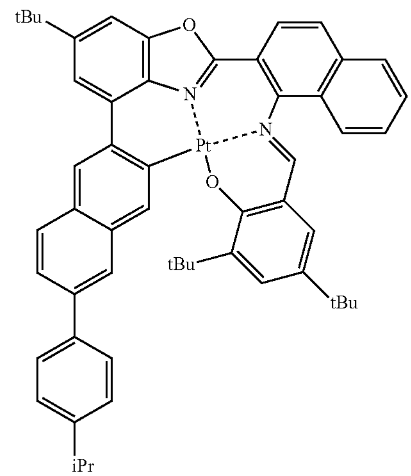
[Compound Group 4]
4-1
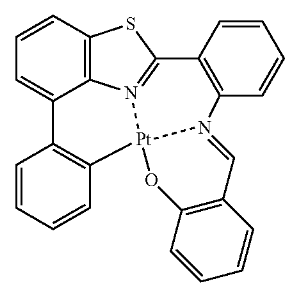
4-2
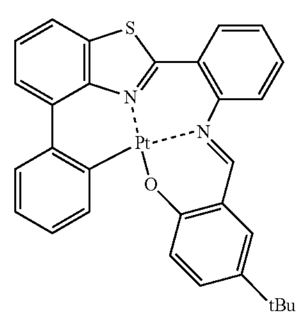
4-3
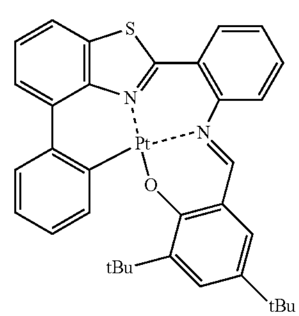

-continued
4-4
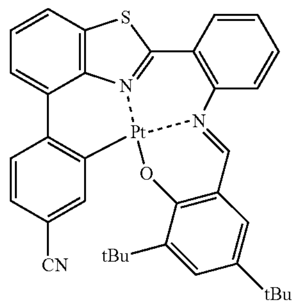
4-5
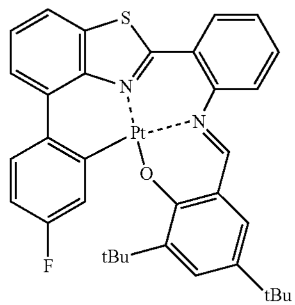
4-6
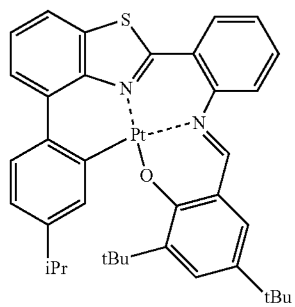
4-7
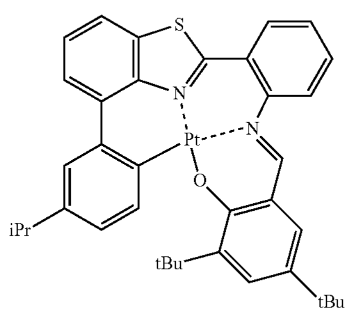
4-8
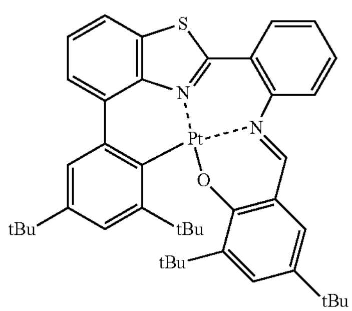
-continued
4-9
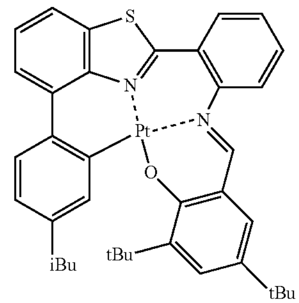
4-10
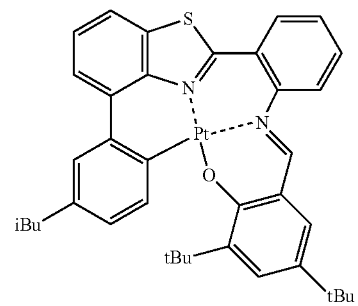
4-11
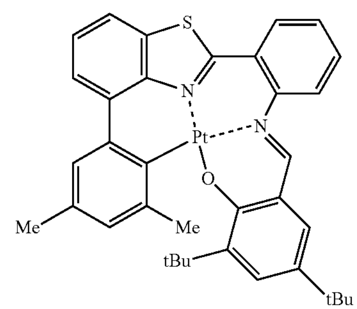
4-12
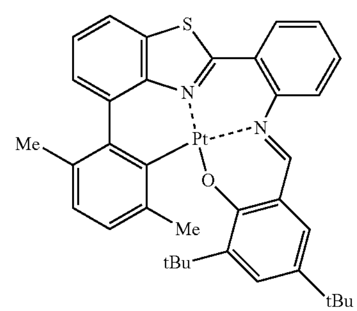
4-13
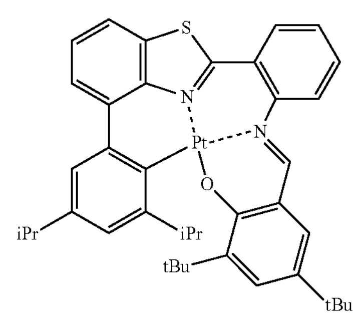

-continued
4-14
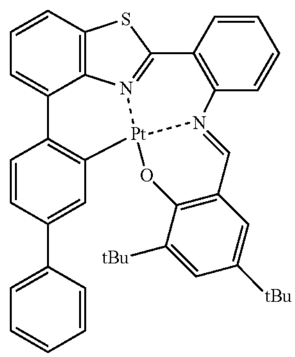
4-15
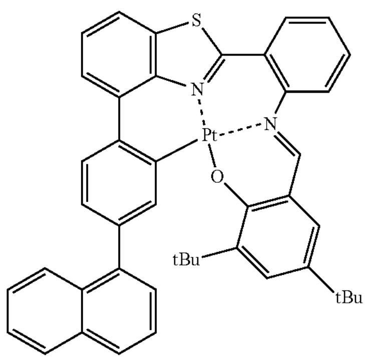
4-16
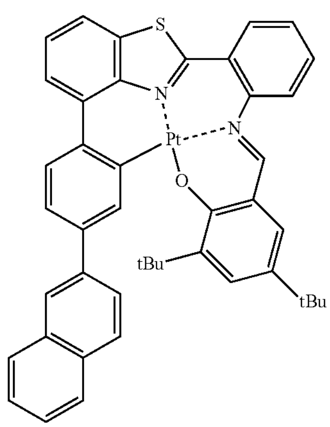
4-17
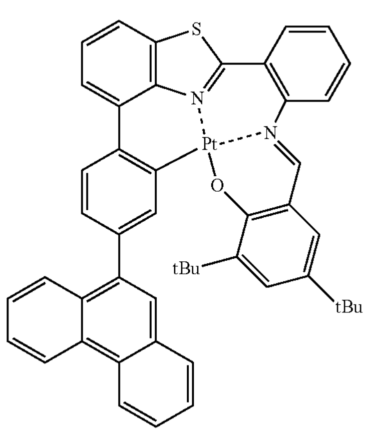
-continued
4-18
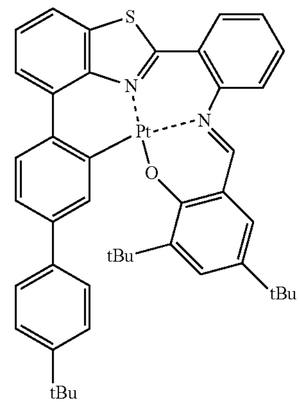
4-19
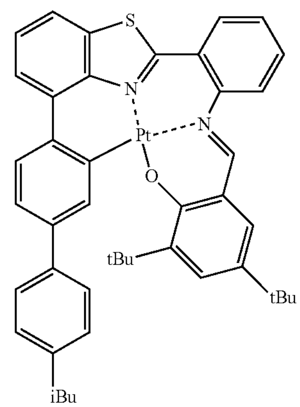
4-20
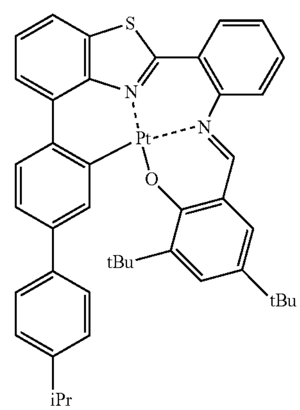
4-21
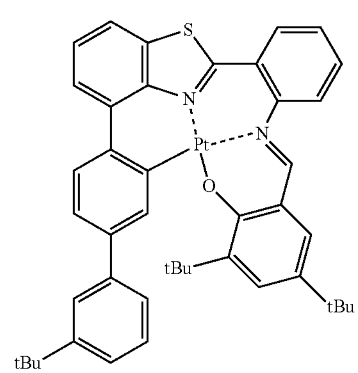

-continued
4-22
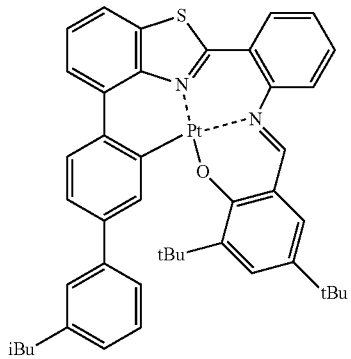
4-23
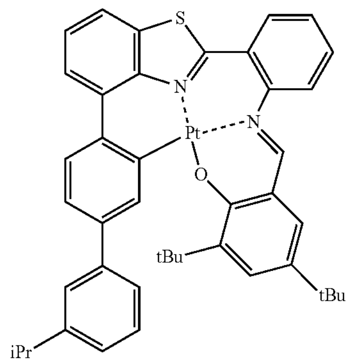
4-24
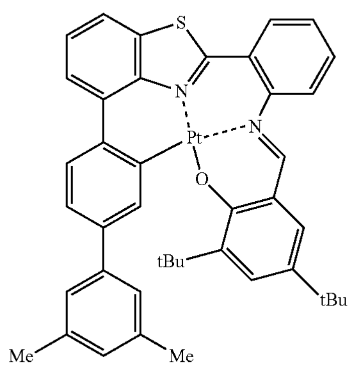
4-25
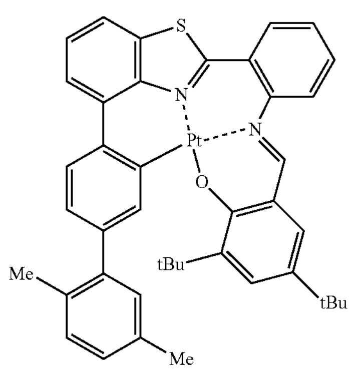
-continued
4-26
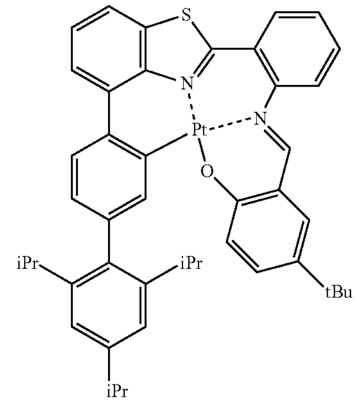
4-27
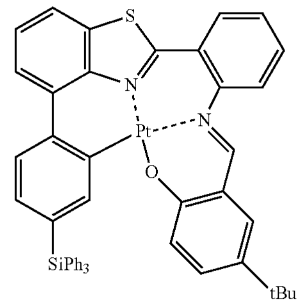
4-28
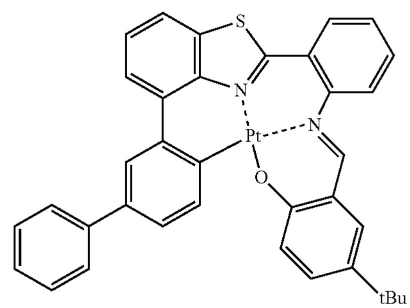
4-29
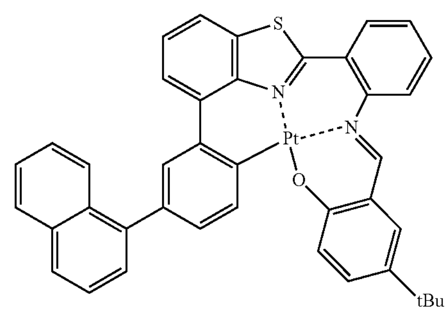
4-30
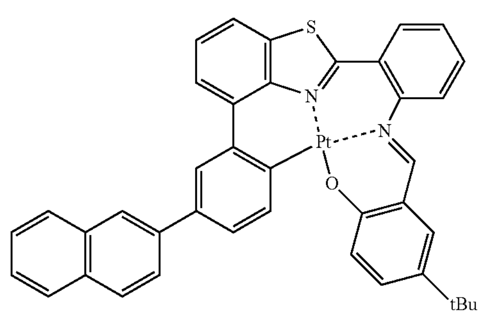

4-31
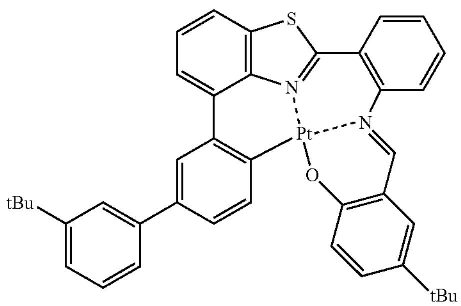
4-32
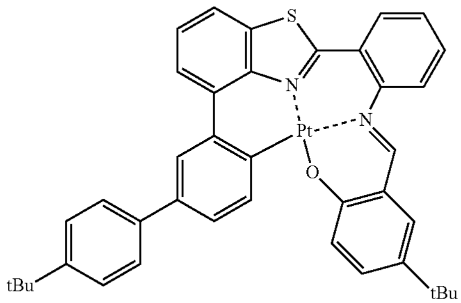
4-33
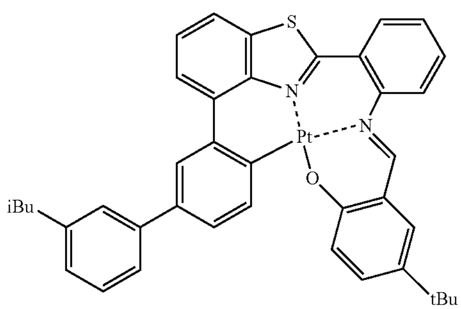
4-34
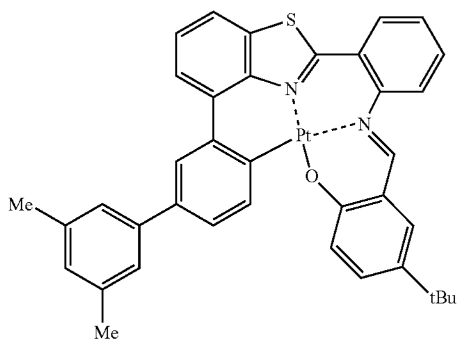
4-35
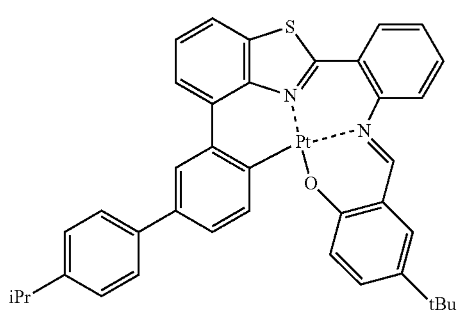
4-36
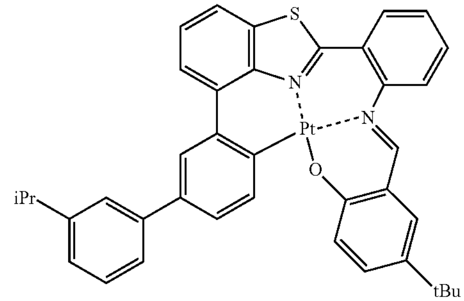
4-37
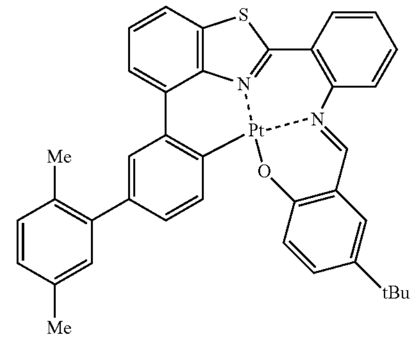
4-38
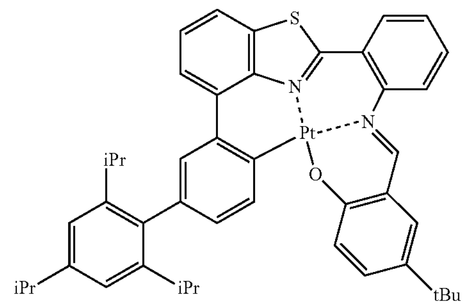
4-39
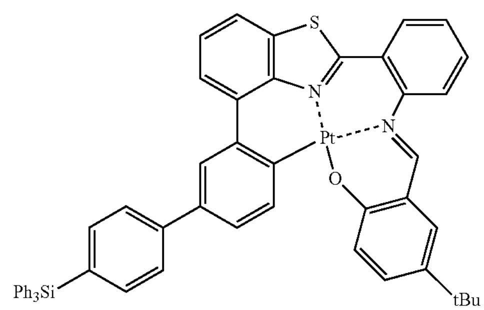
4-40
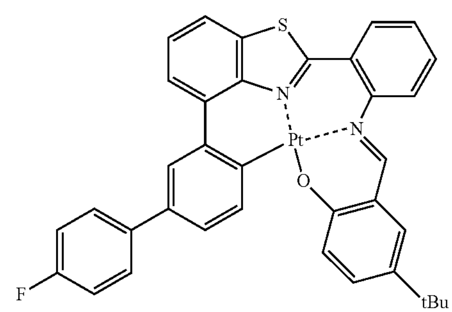

-continued
4-41
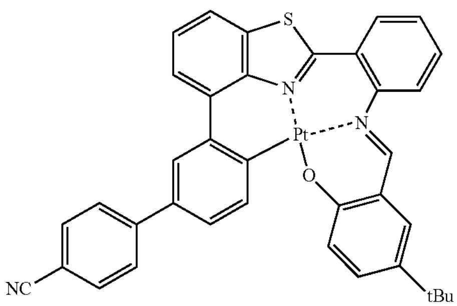
4-42
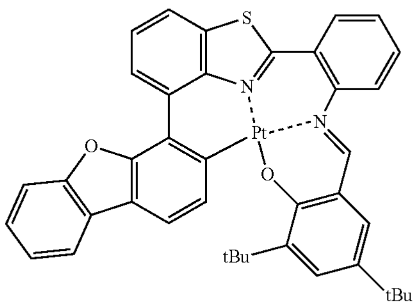
4-43
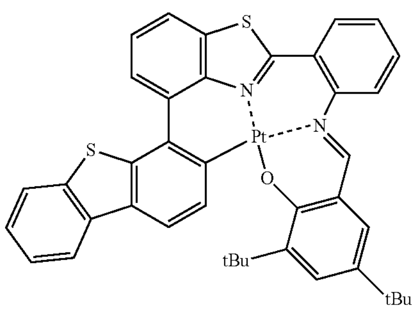
4-44
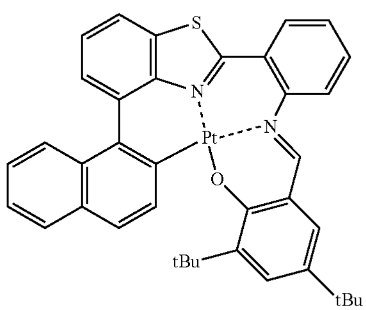
4-45
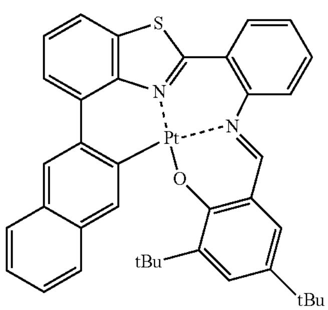
-continued
4-46
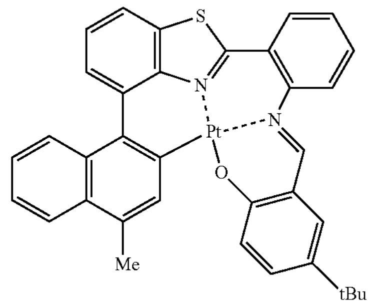
4-47
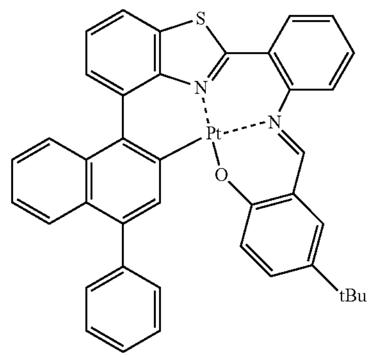
4-48
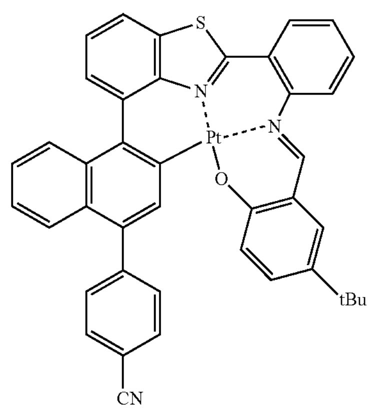
4-49
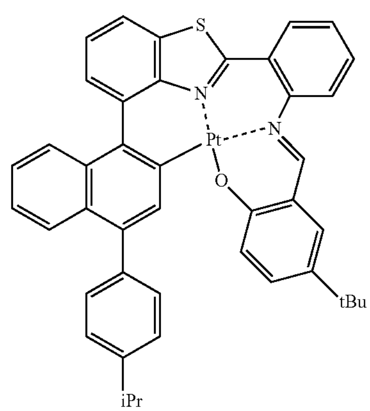

-continued
4-50
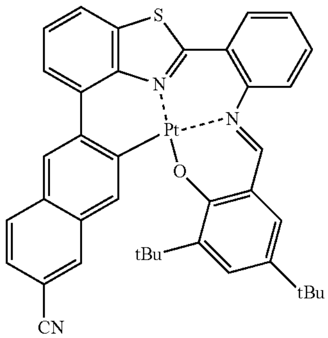
4-51
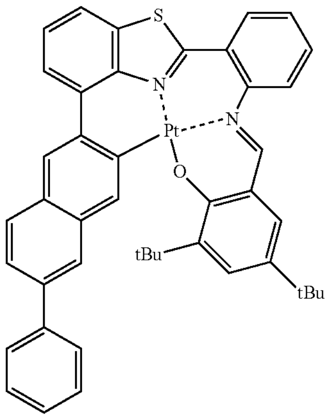
4-52
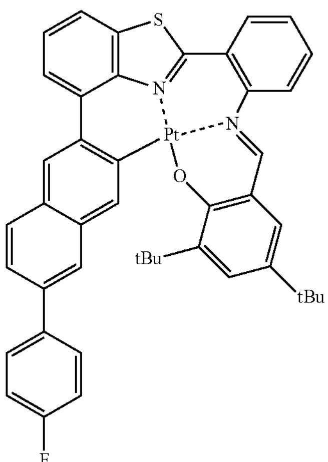
4-53
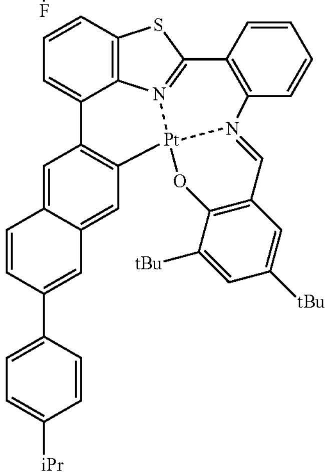
-continued
4-54
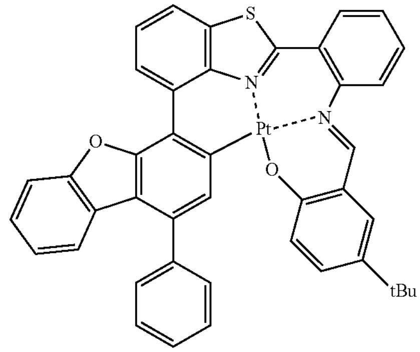
4-55
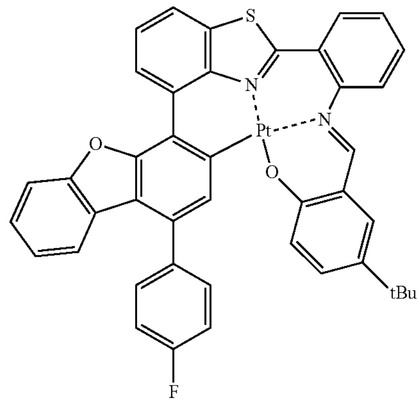
4-56
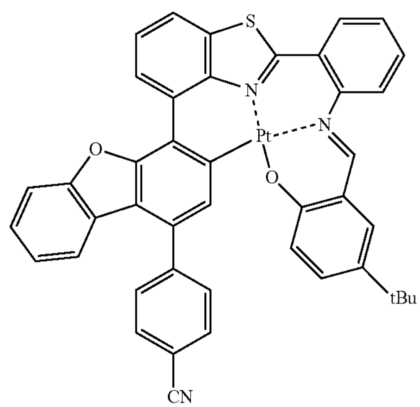
4-57
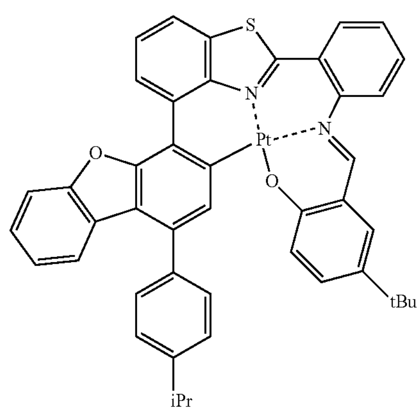

-continued
4-58
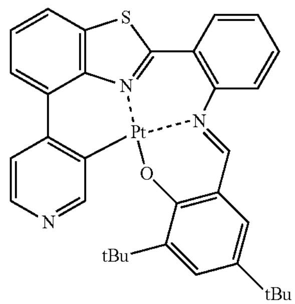
4-59
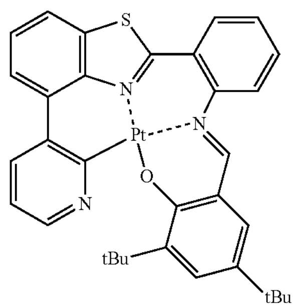
4-60
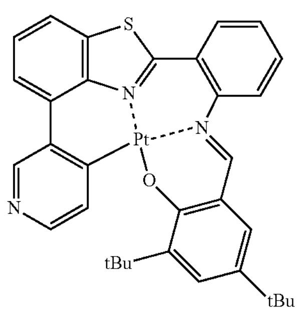
4-61
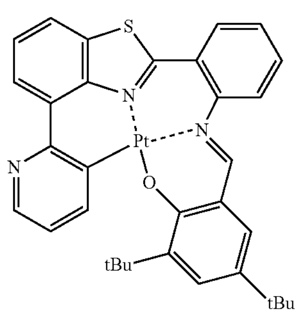
4-62
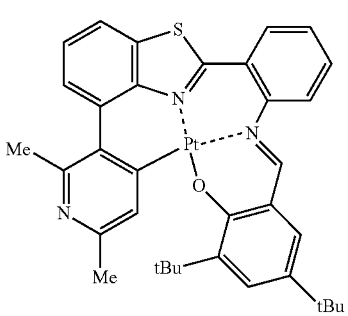
-continued
4-63
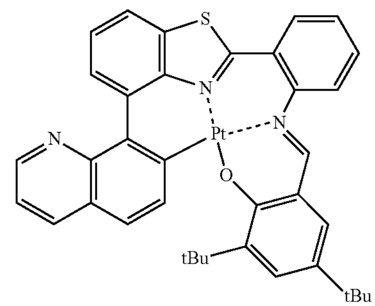
4-64
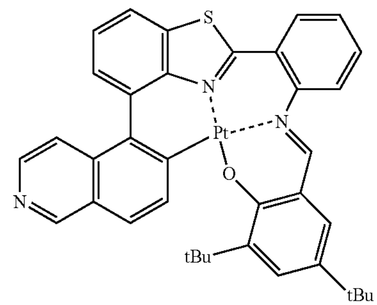
4-65
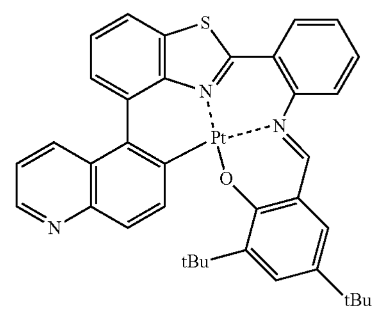
4-66
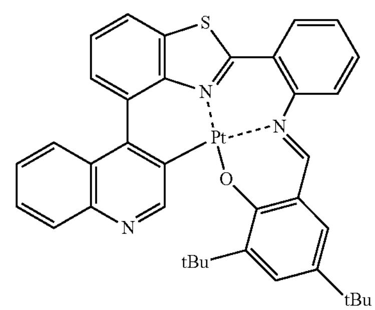
4-67
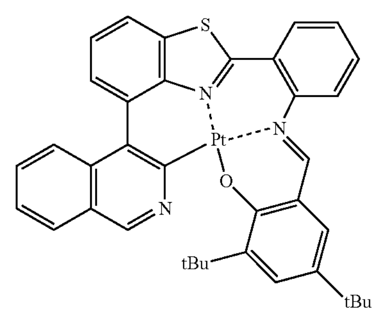

-continued
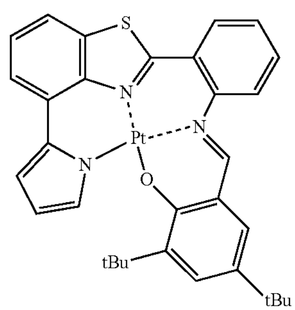
4-68
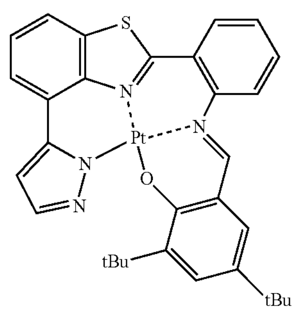
4-69
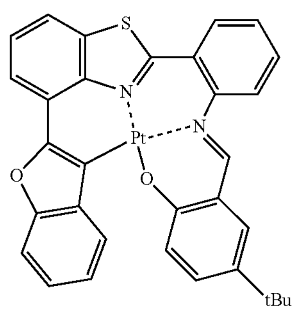
4-70
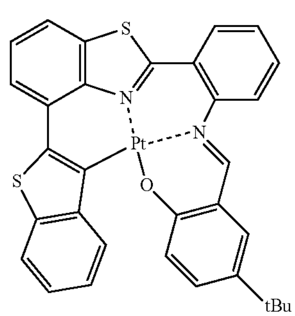
4-71
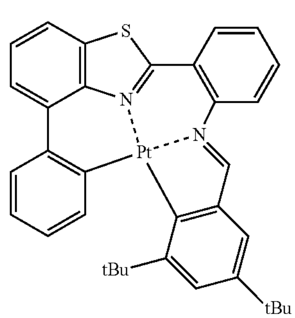
4-72
-continued
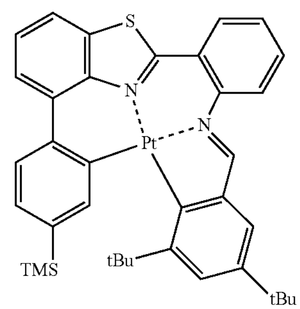
4-73
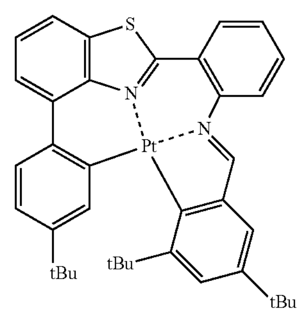
4-74
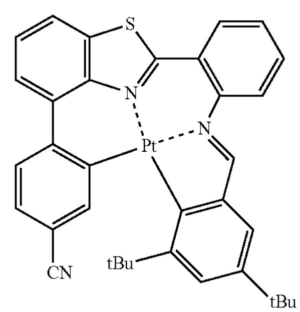
4-75
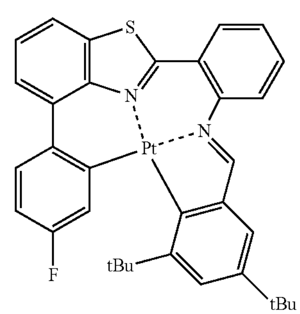
4-76
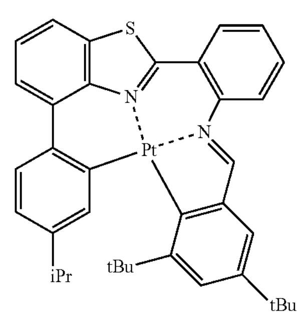
4-77

4-78
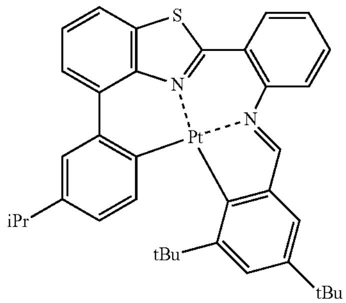
4-79
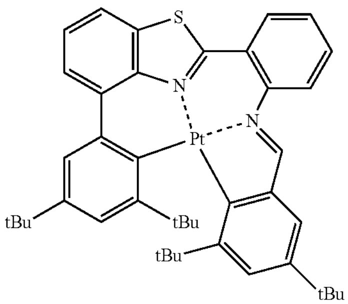
4-80
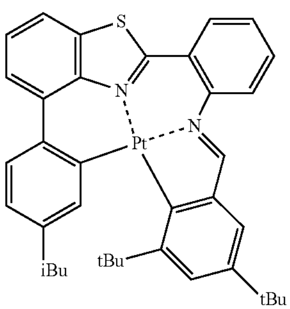
4-81
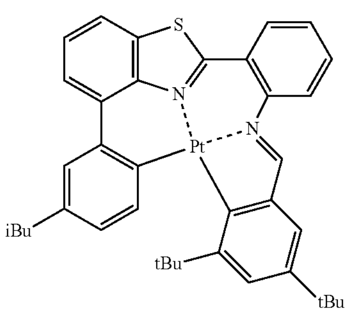
4-82
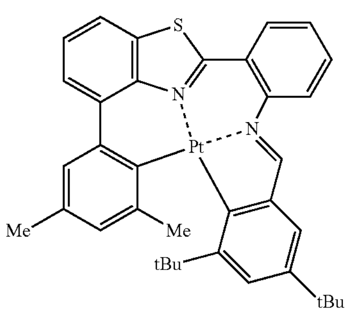
4-83
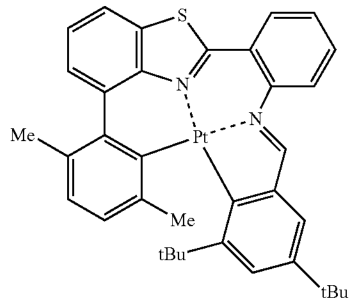
4-84
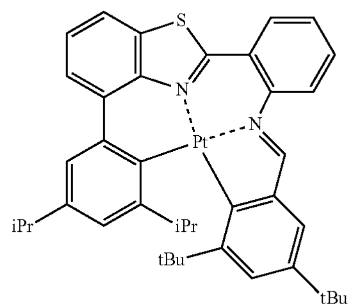
4-85
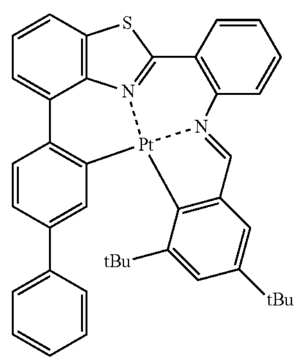
4-86
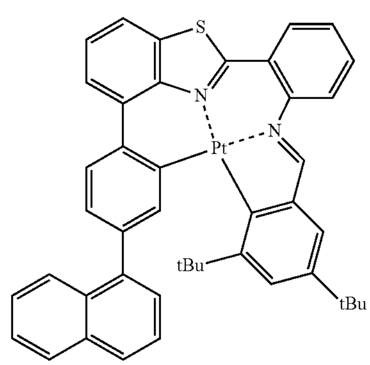

-continued
4-87
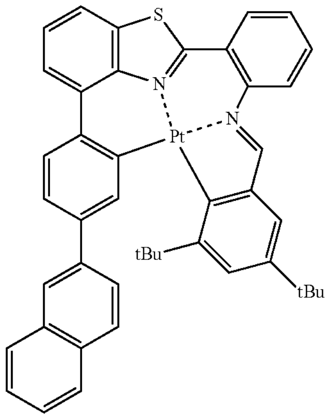
4-88
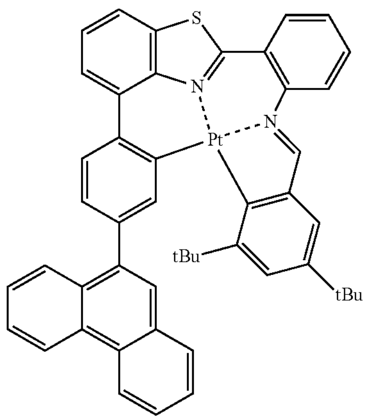
4-89
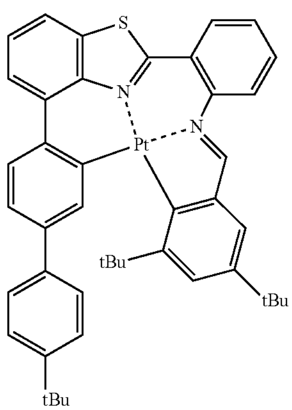
4-90
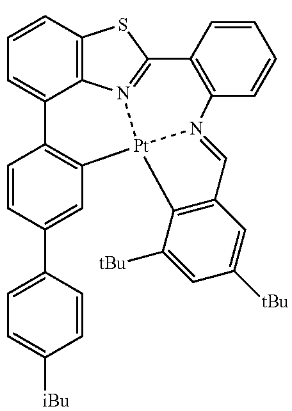
-continued
4-91
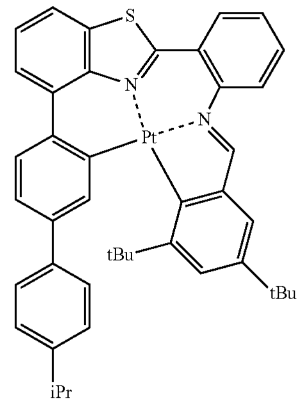
4-92
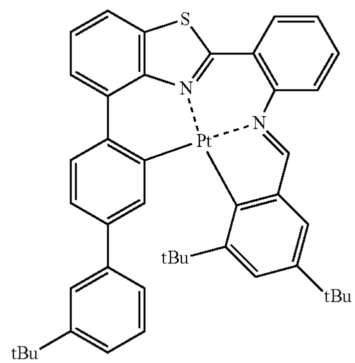
4-93
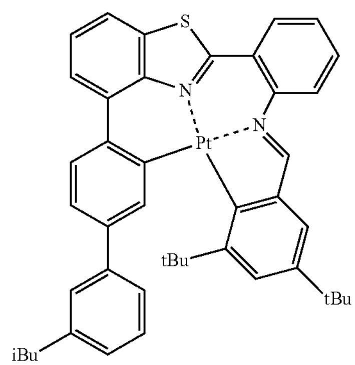
4-94
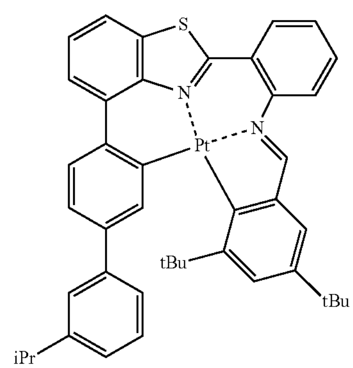

-continued
4-95
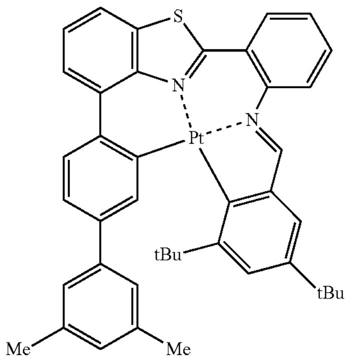
4-96
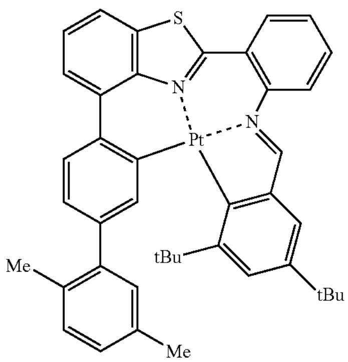
4-97
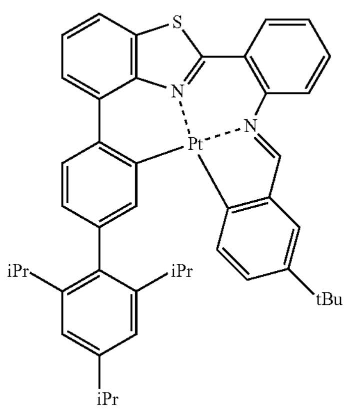
4-98
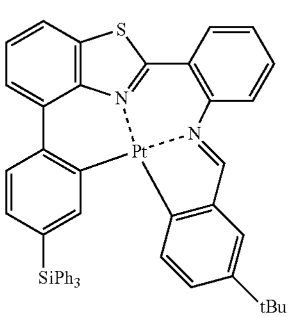
-continued
4-99
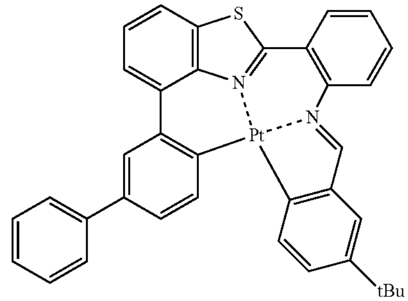
4-100
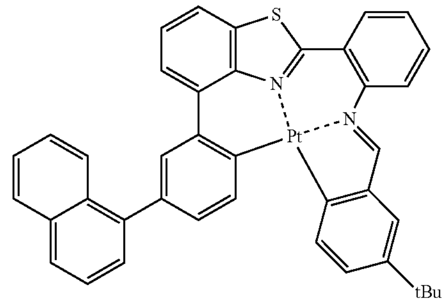
4-101
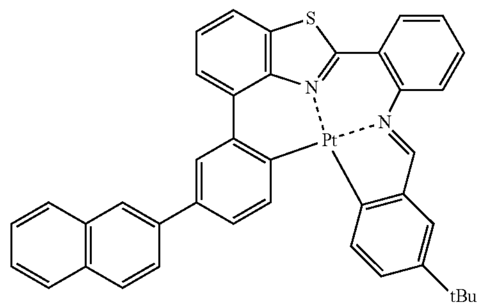
4-102
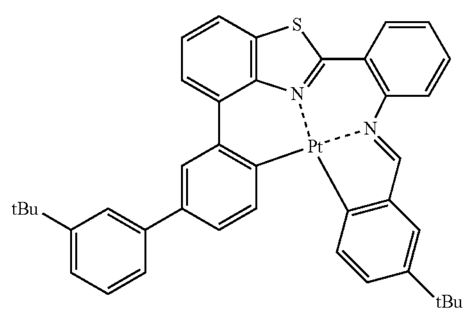
4-103
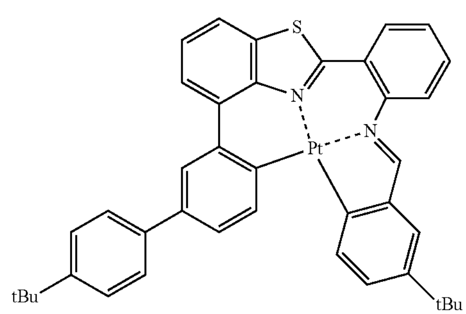

-continued
4-104
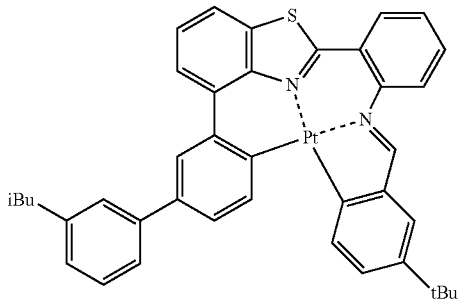
4-105
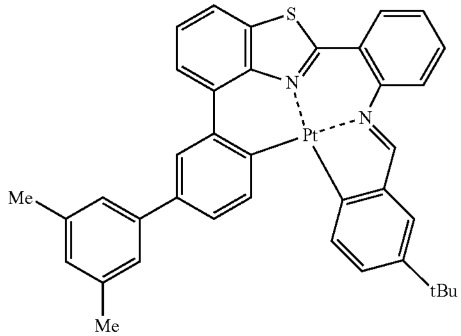
4-106
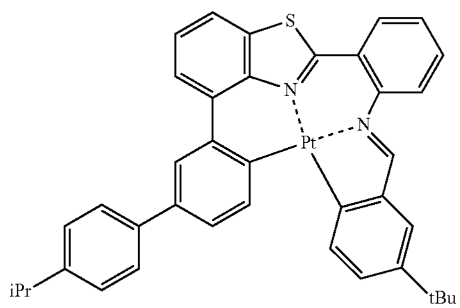
4-107
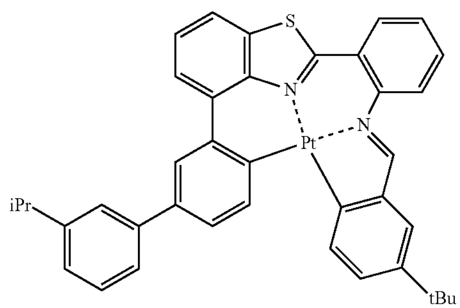
4-108
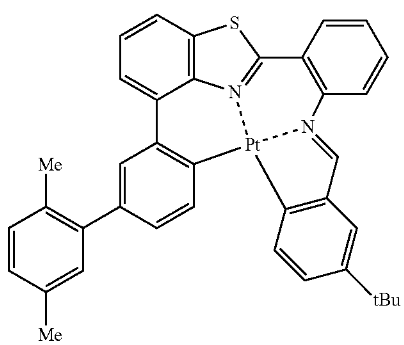
-continued
4-109
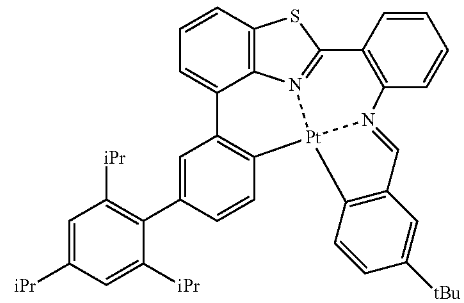
4-110
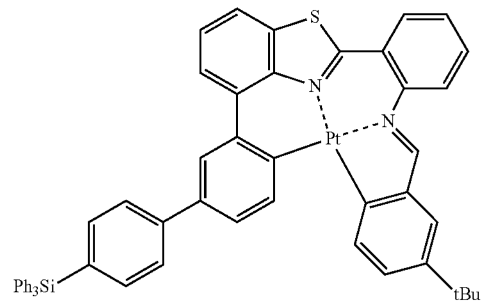
4-111
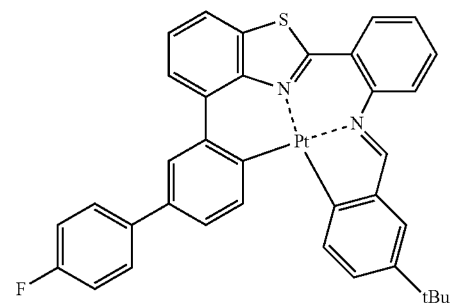
4-112
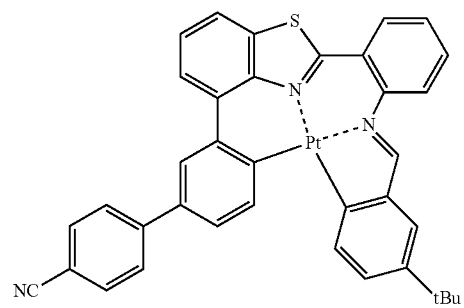
4-113
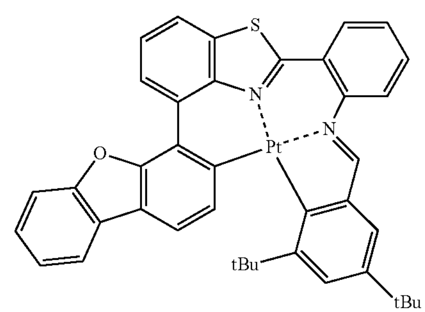

-continued
4-114
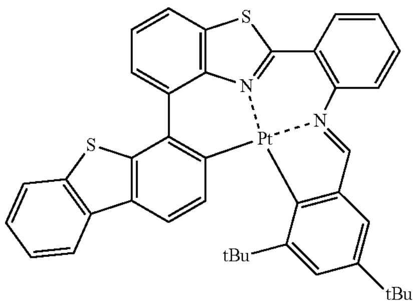
4-115
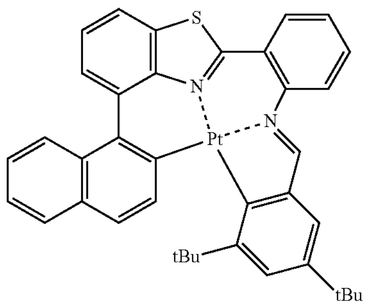
4-116
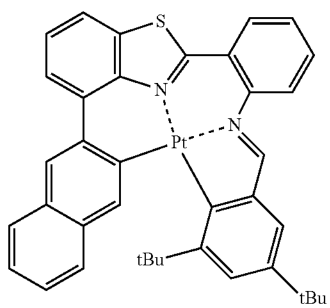
4-117
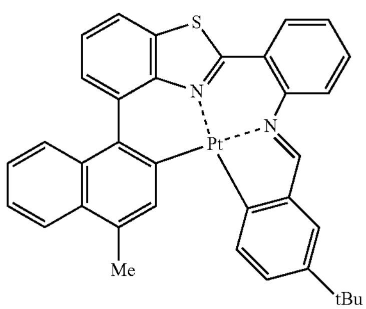
4-118
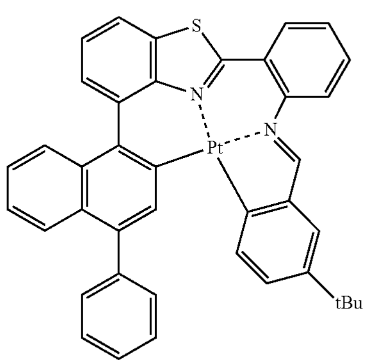
-continued
4-119
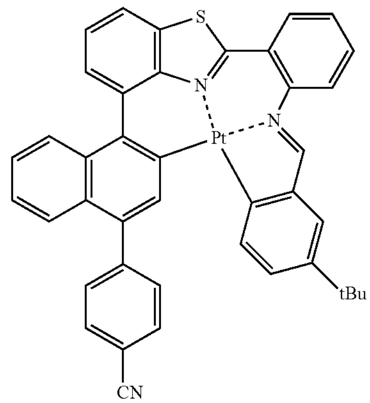
4-120
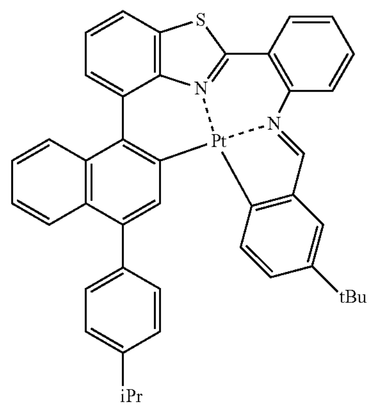
4-121
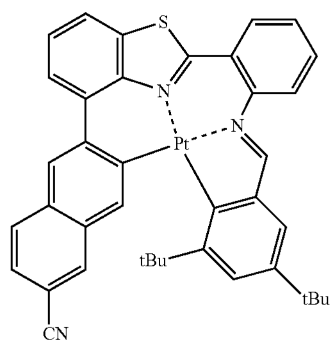
4-122
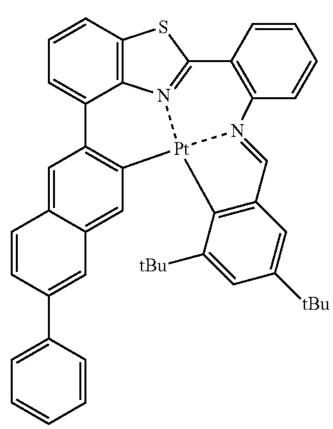

4-123
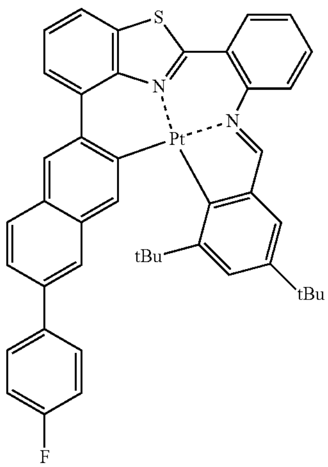
4-124
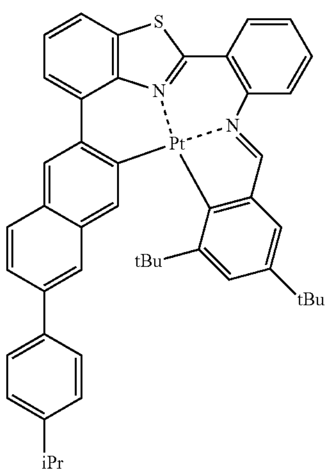
4-125
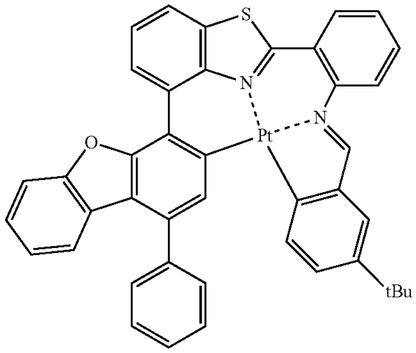
4-126
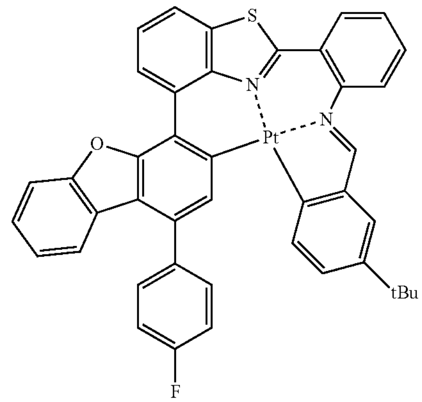
4-127
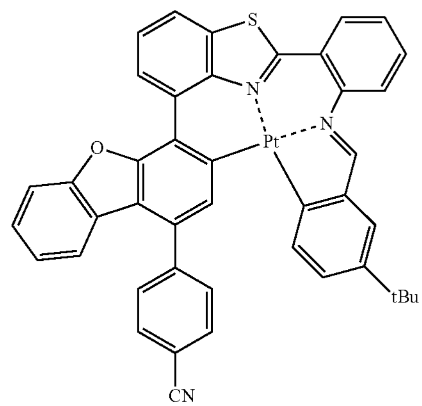
4-128
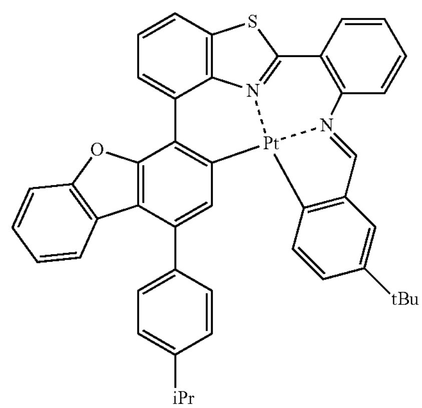
4-129
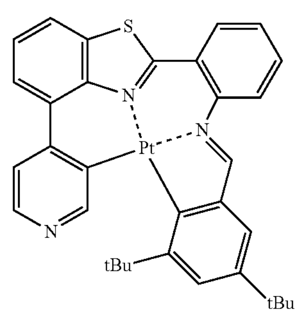

-continued
4-130
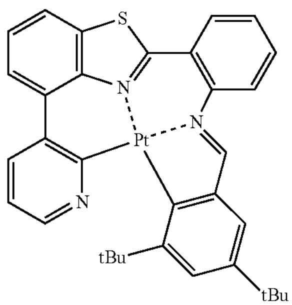
4-131
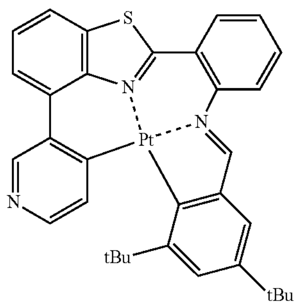
4-132
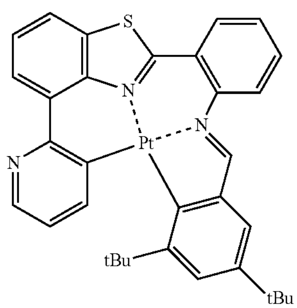
4-133
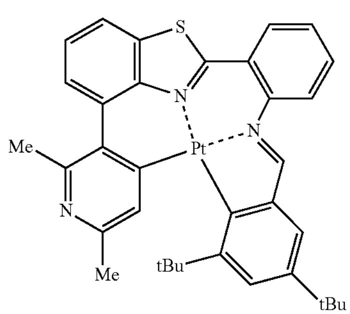
4-134
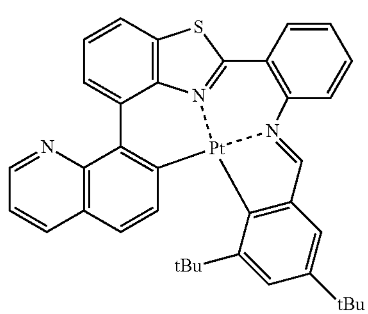
-continued
4-135
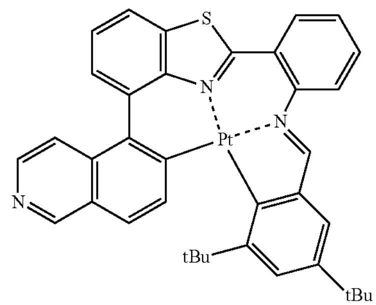
4-136
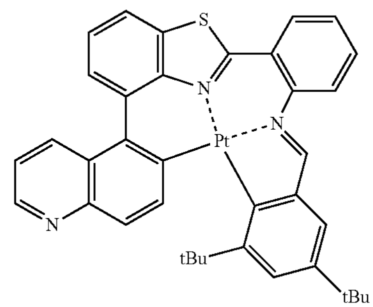
4-137
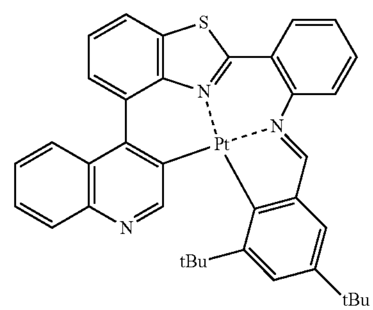
4-138
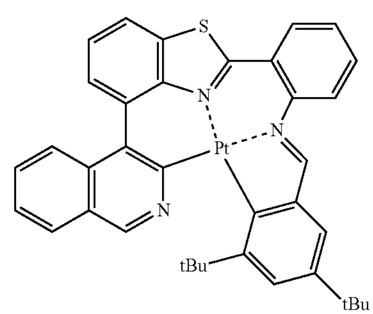
4-139
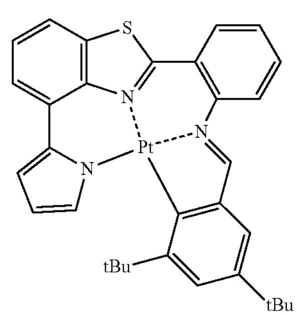

4-140
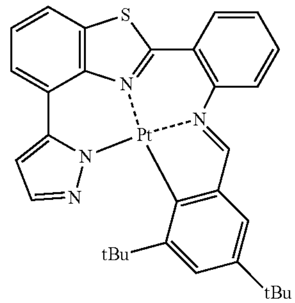
4-141
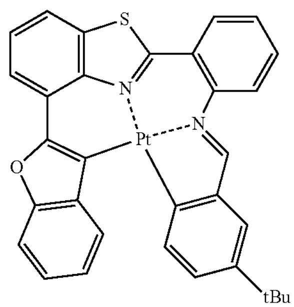
4-142
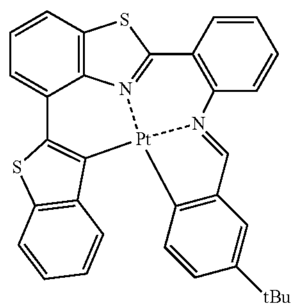
4-143
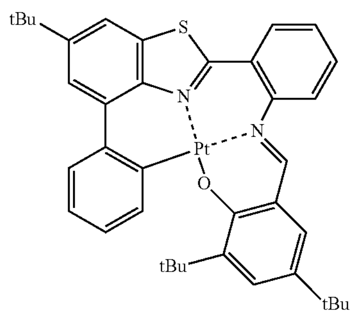
4-144
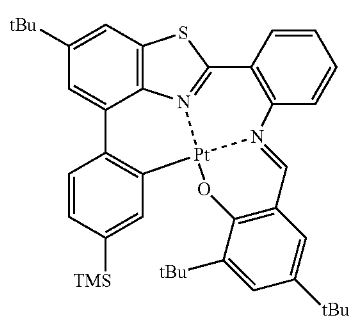
4-145
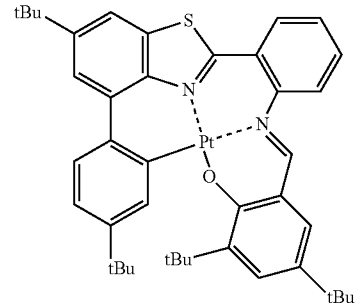
4-146
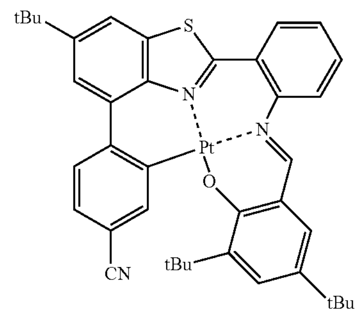
4-147
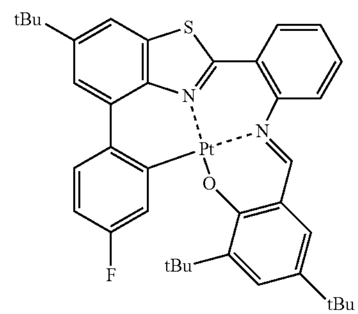
4-148
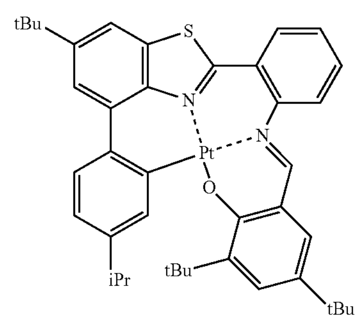
4-149
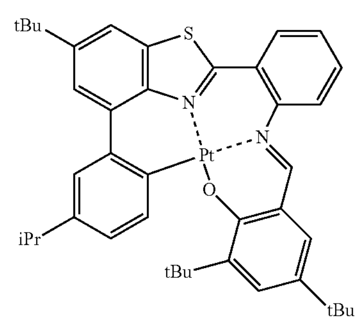

4-150
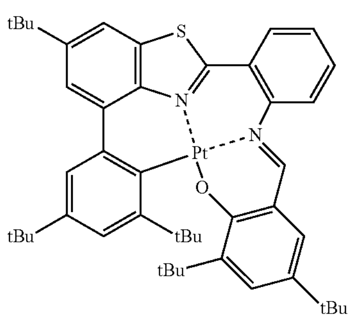
4-151
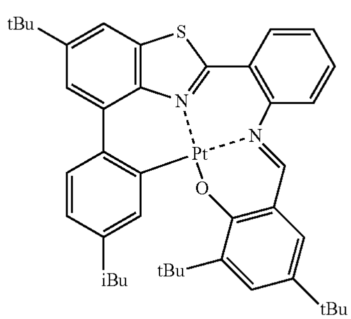
4-152
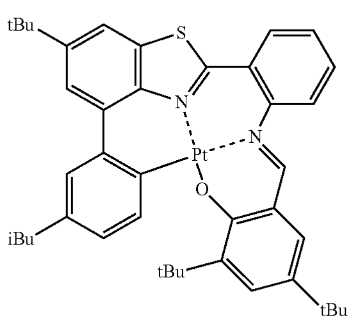
4-153
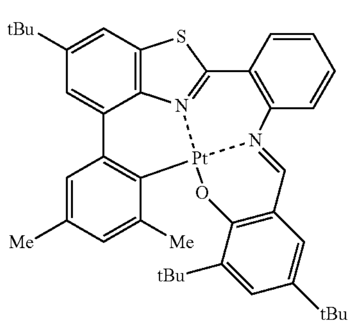
4-154
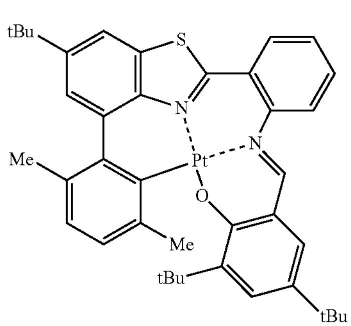
4-155
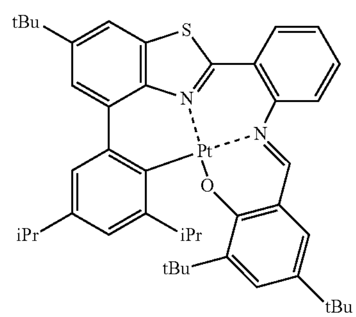
4-156
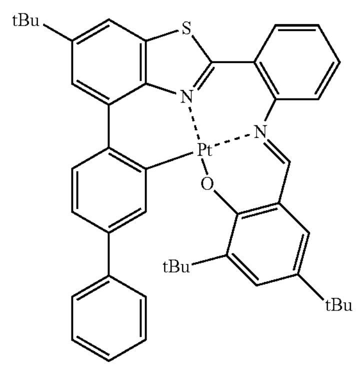
4-157
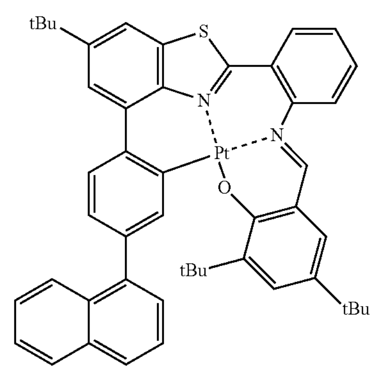
4-158
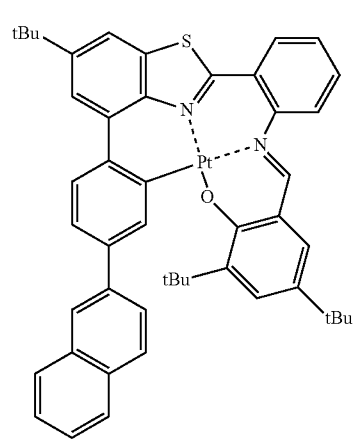

-continued
4-159
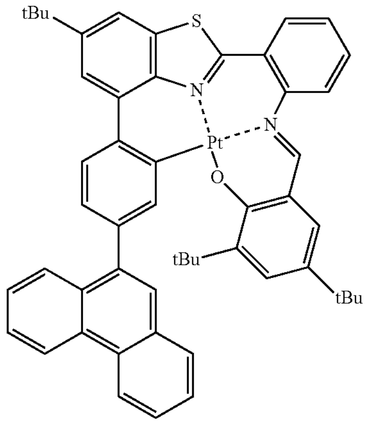
4-160
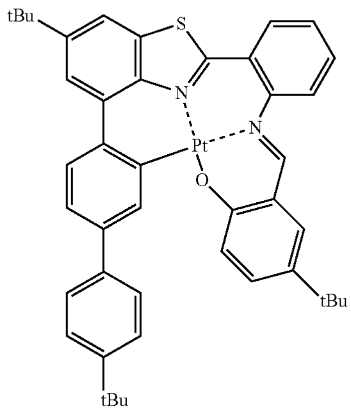
4-161
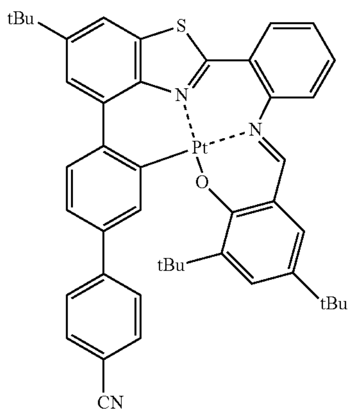
4-162
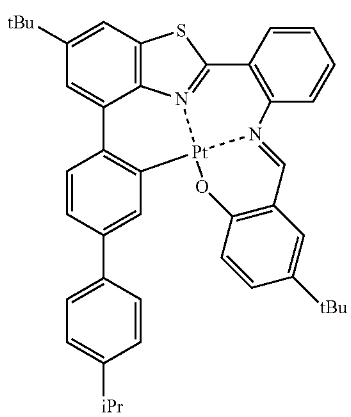
-continued
4-163
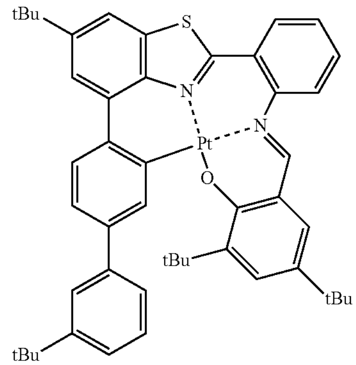
4-164
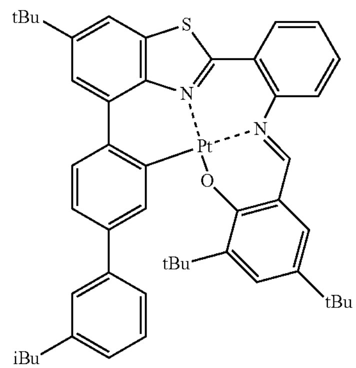
4-165
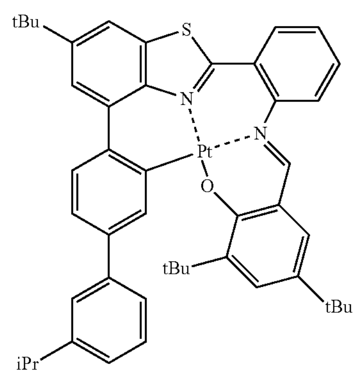
4-166
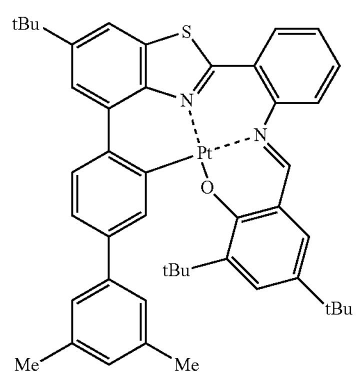

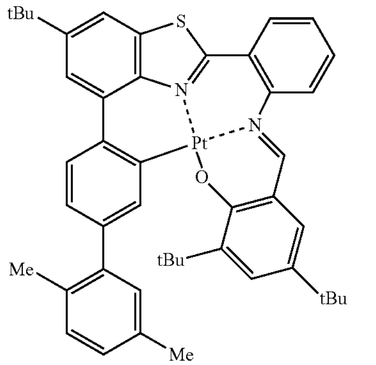
4-167
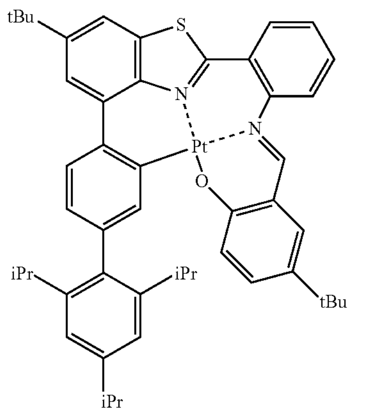
4-168
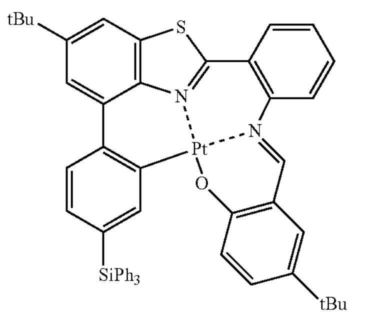
4-169
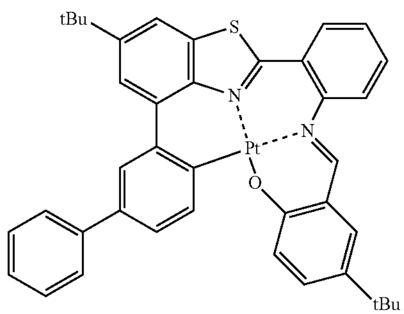
4-170
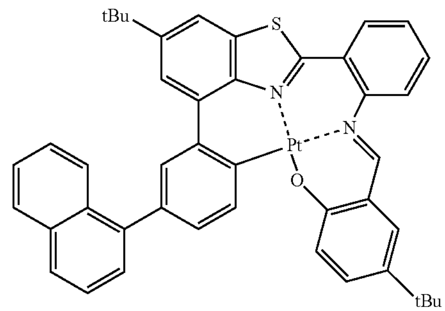
4-171
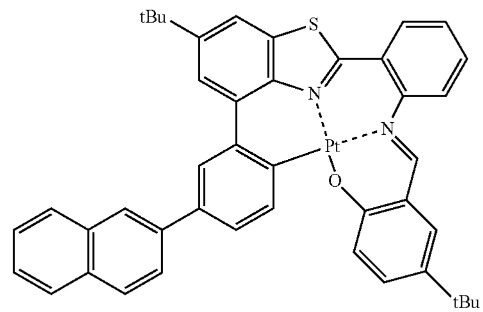
4-172
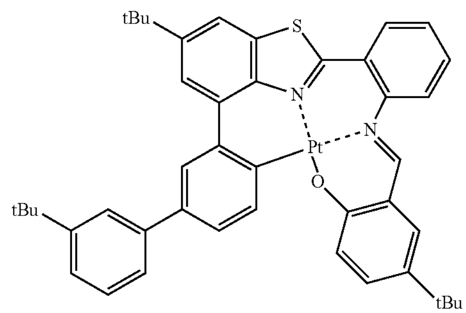
4-173
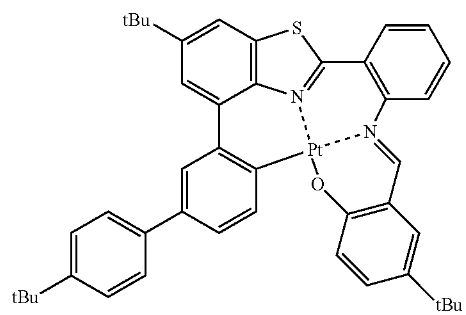
4-174
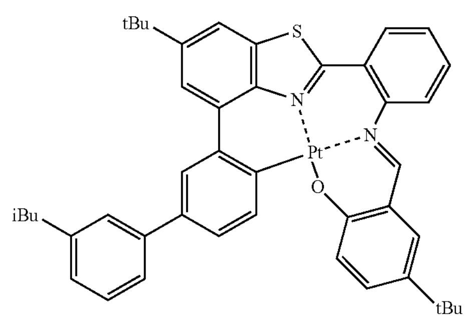
4-175

-continued
4-176
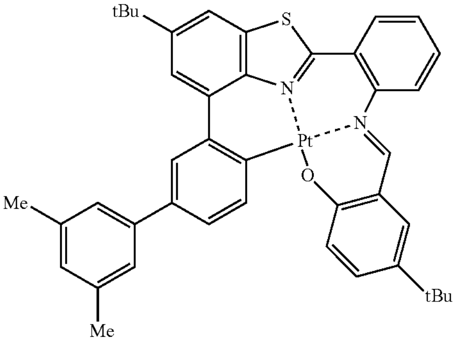
4-177
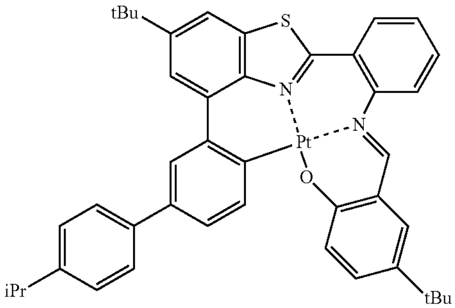
4-178
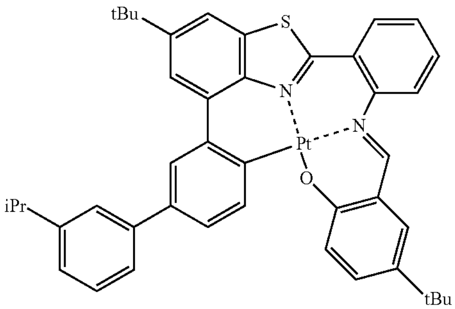
4-179
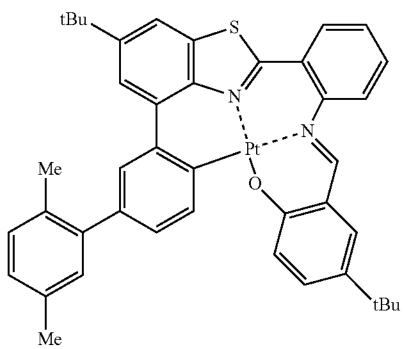
4-180
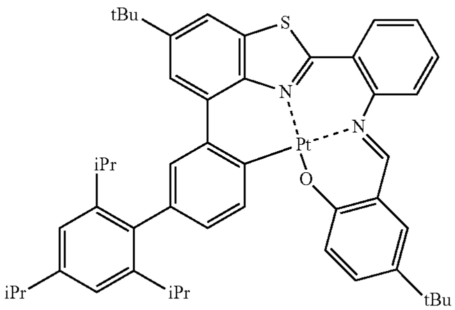
-continued
4-181
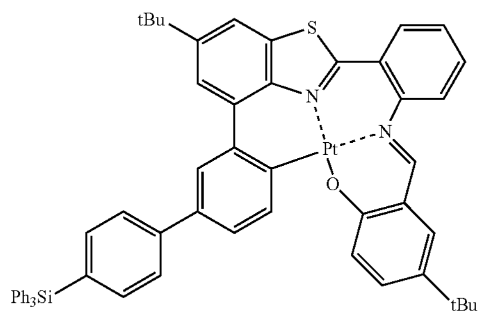
4-182
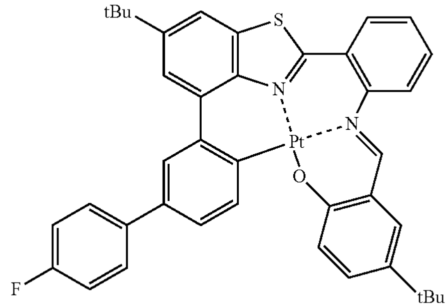
4-183
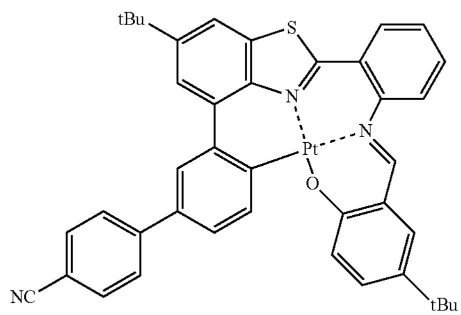
4-184
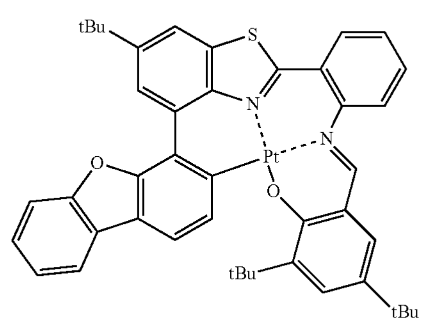
4-185
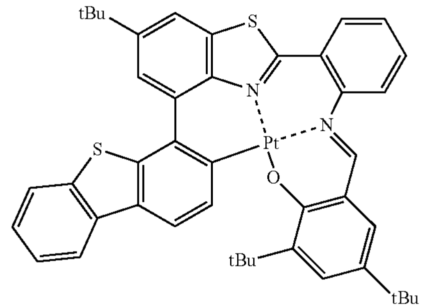

-continued
4-186
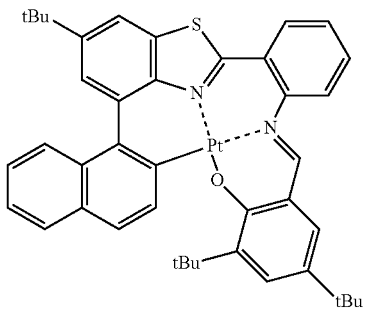
4-187
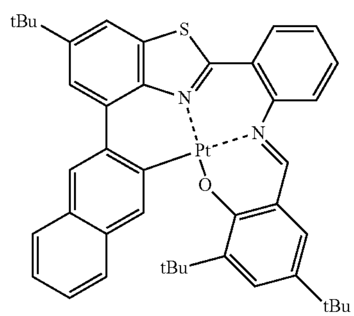
4-188
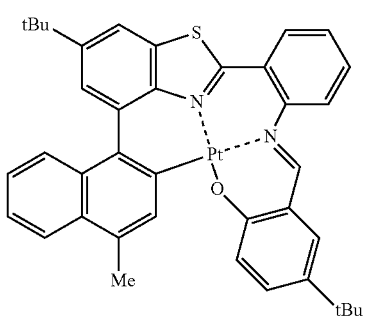
4-189
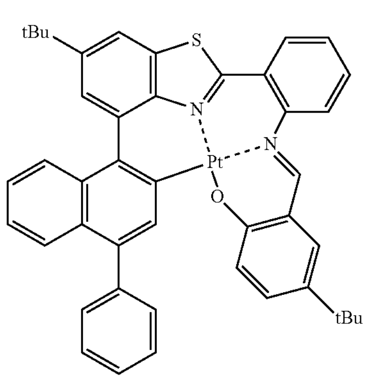
4-190
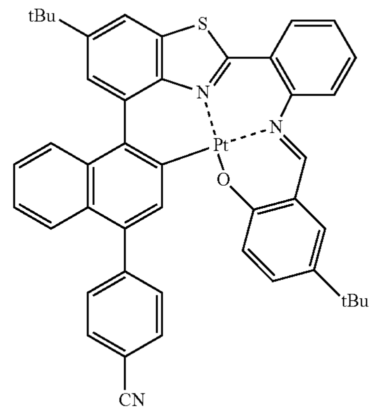
4-191
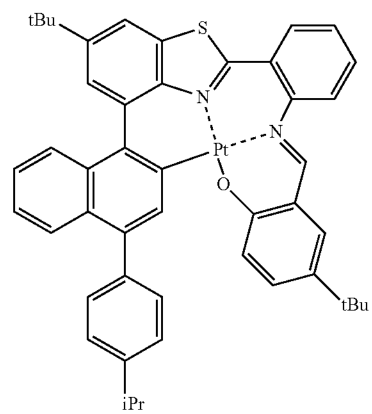
4-192
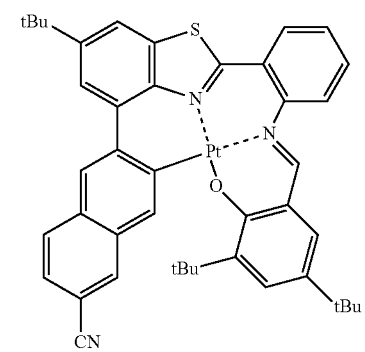
4-193
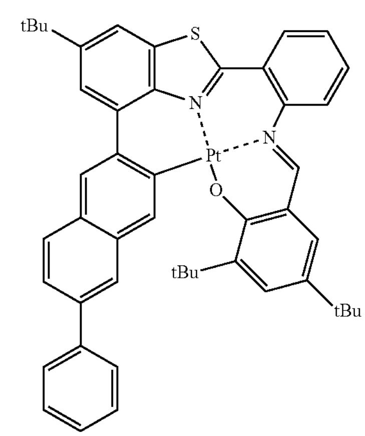

-continued
4-194
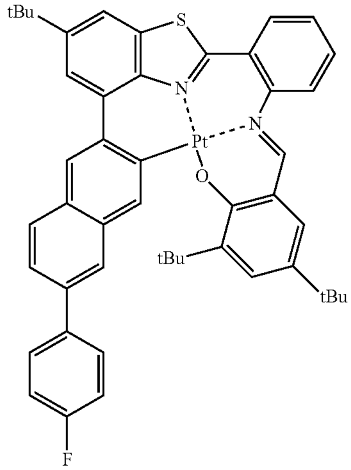
4-195
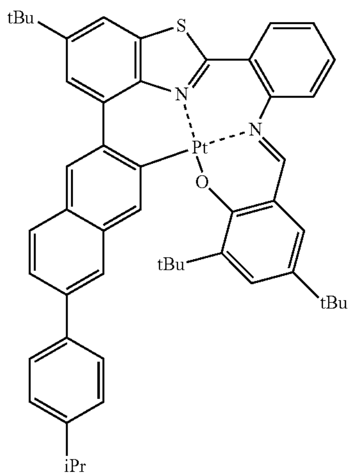
4-196
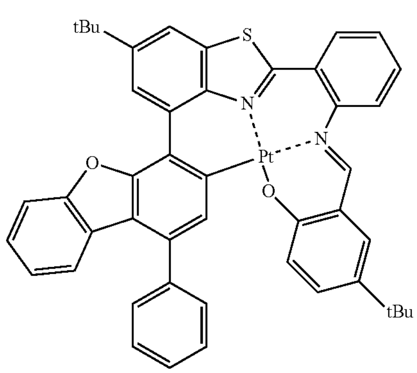
-continued
4-197
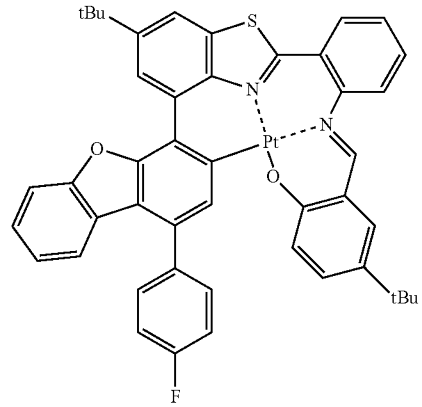
4-198
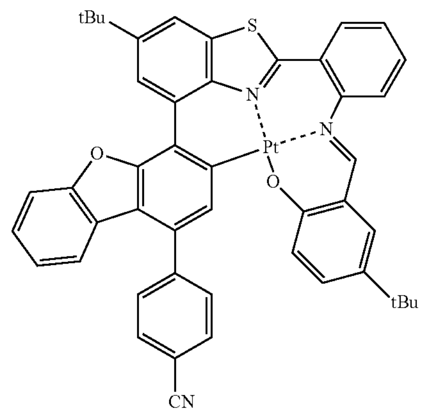
4-199
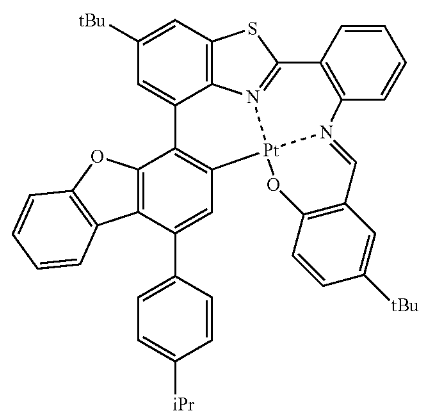
4-200
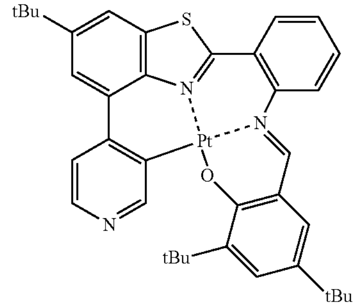

4-201
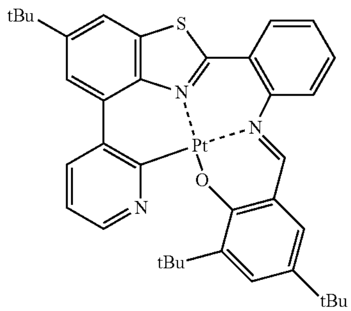
4-202
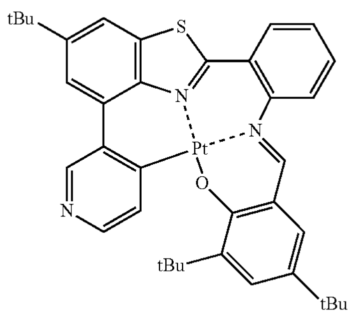
4-203
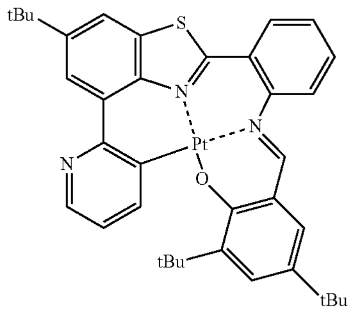
4-204
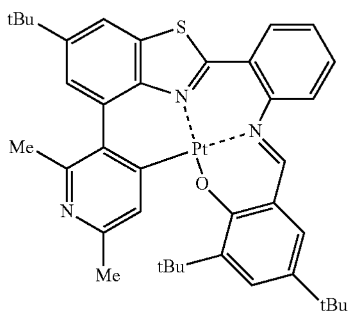
4-205
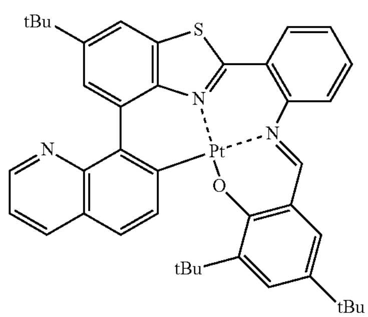
4-206
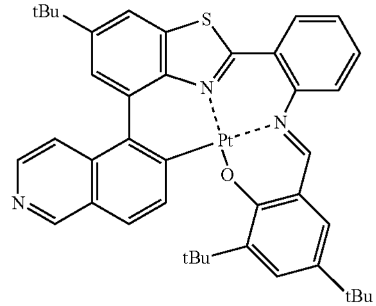
4-207
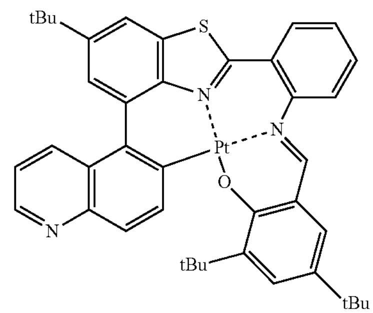
4-208
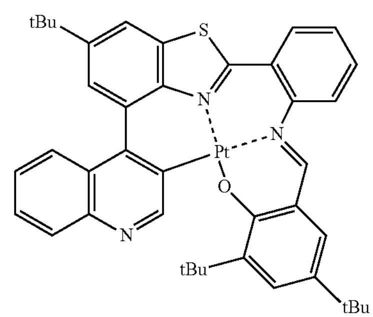
4-209
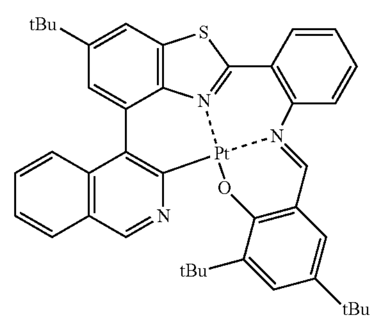
4-210
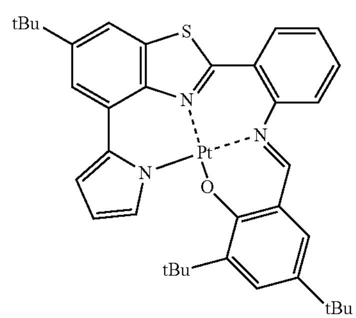

-continued
4-211
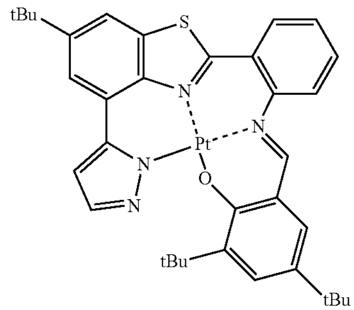
4-212
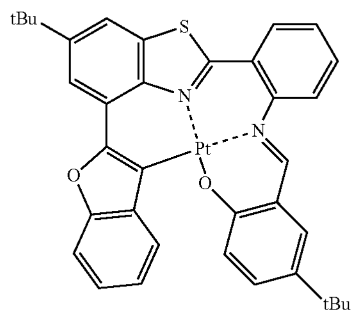
4-213
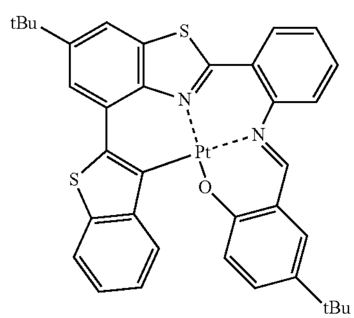
4-214
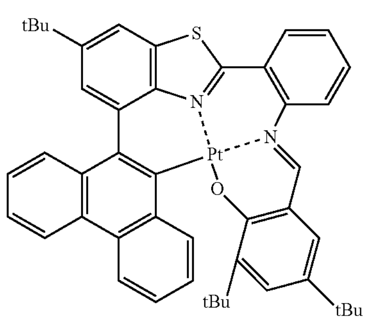
4-215
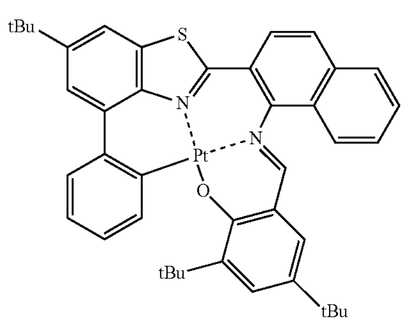
-continued
4-216
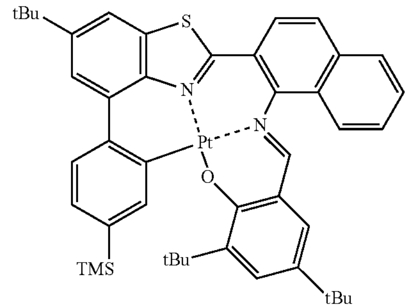
4-217
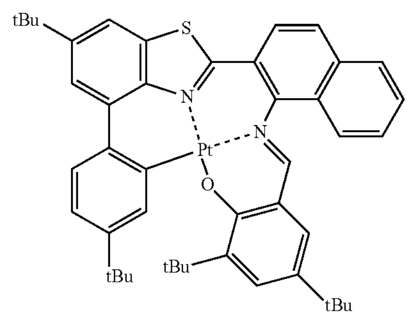
4-218
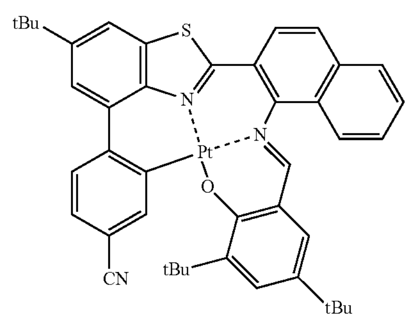
4-219
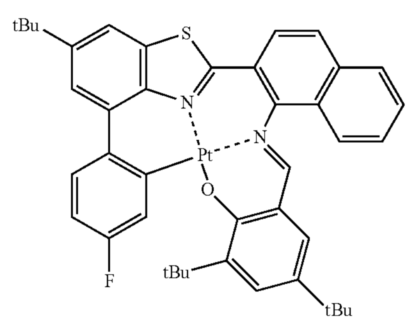
4-220
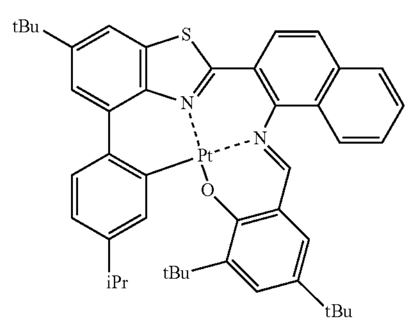

-continued
4-221
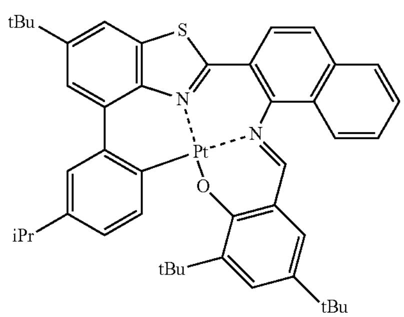
4-222
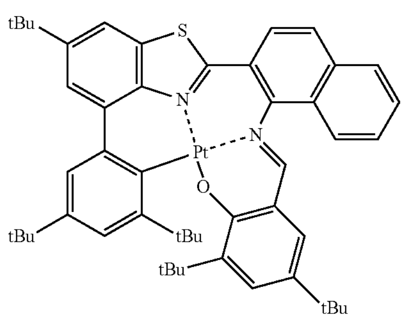
4-223
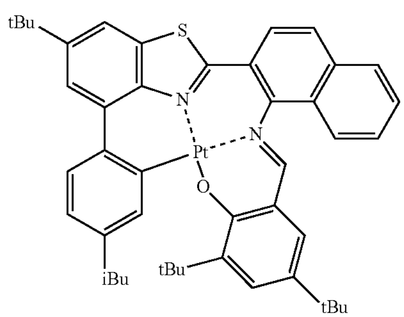
4-224
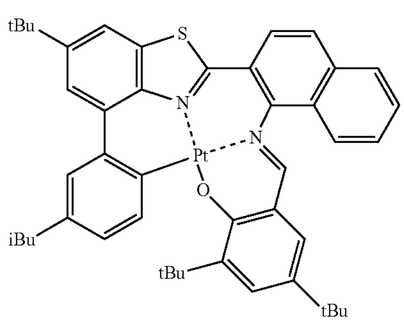
4-225
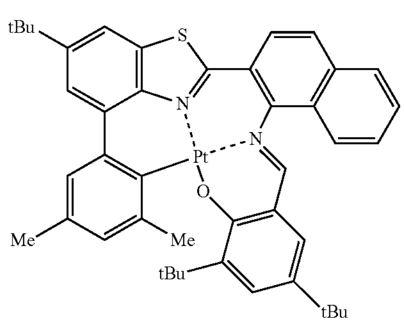
-continued
4-226
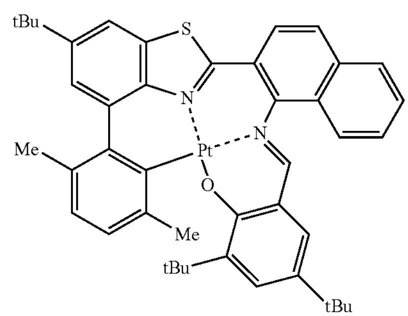
4-227
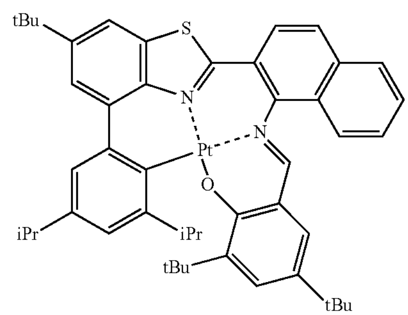
4-228
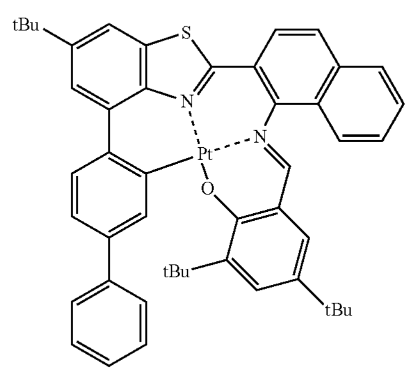
4-229
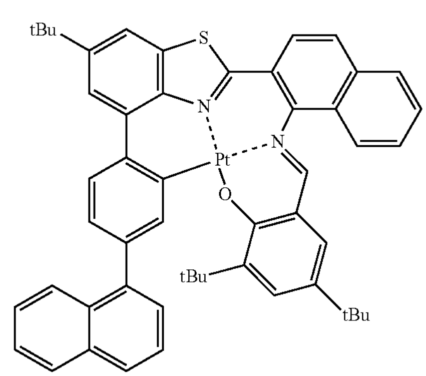

-continued
4-230
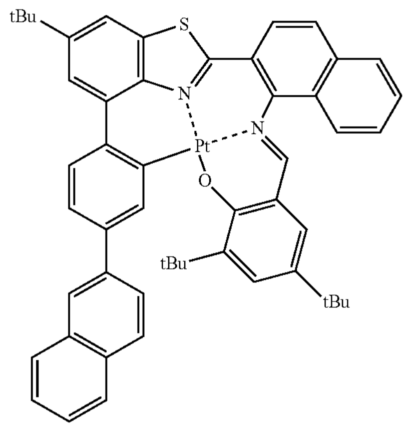
4-231
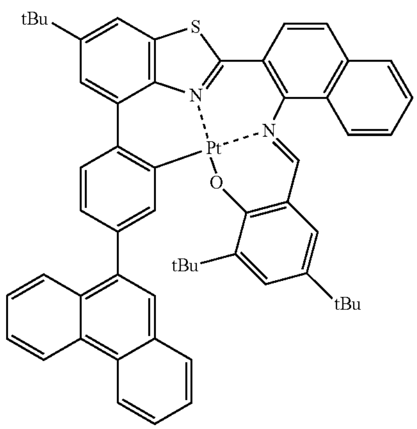
4-232
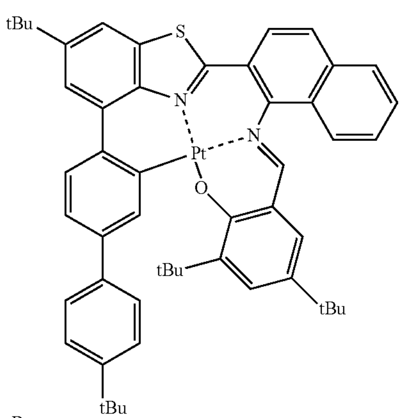
4-233
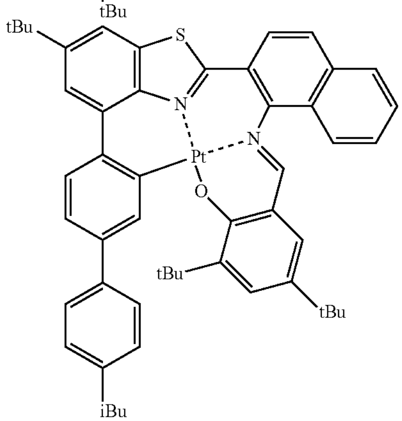
-continued
4-234
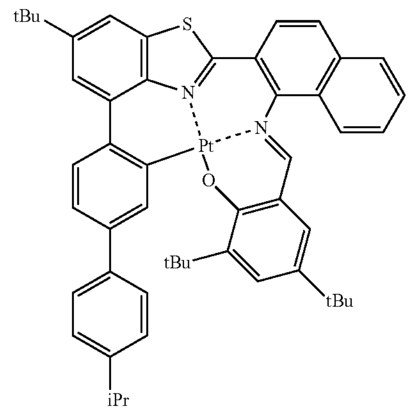
4-235
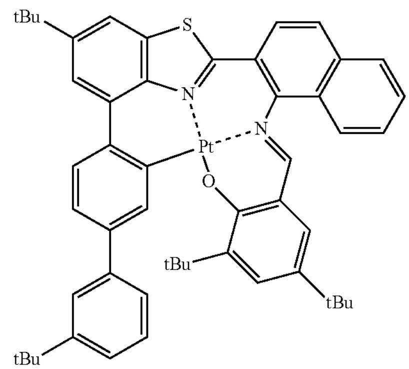
4-236
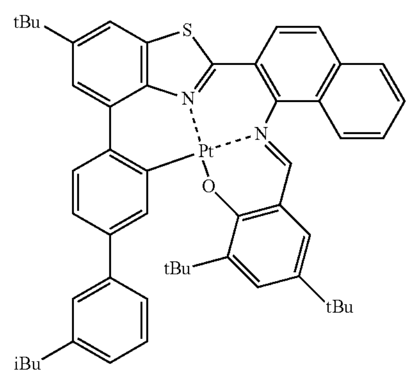
4-237
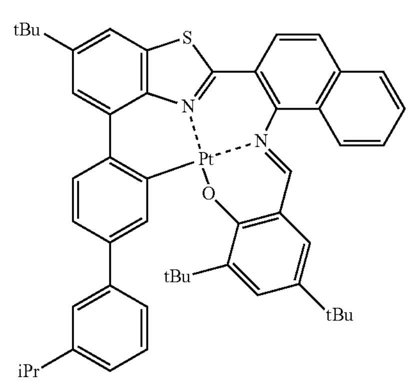

-continued
4-238
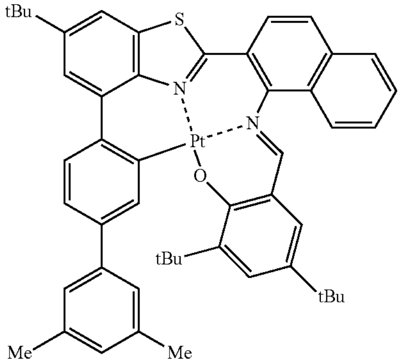
4-239
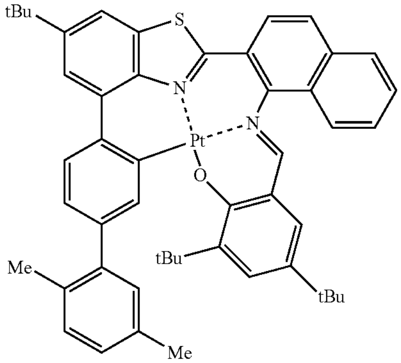
4-240
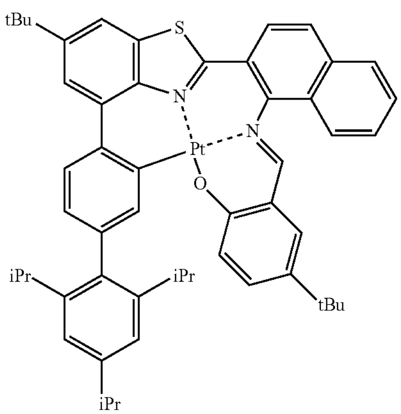
4-241
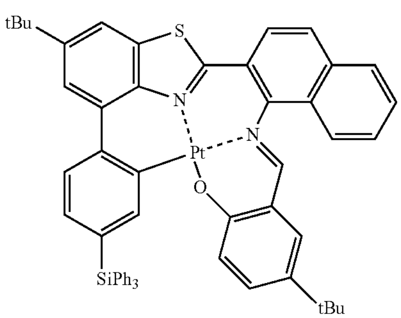
-continued
4-242
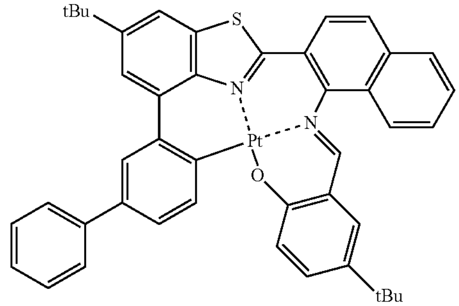
4-243
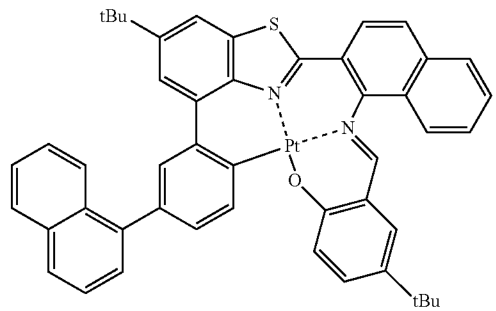
2-244
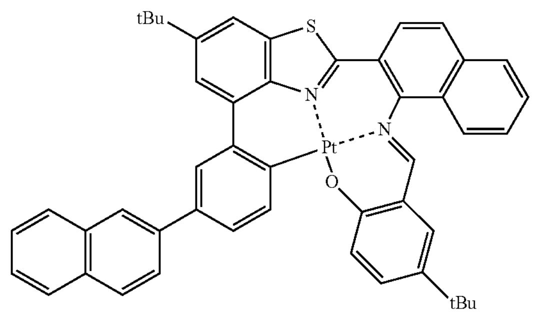
2-245
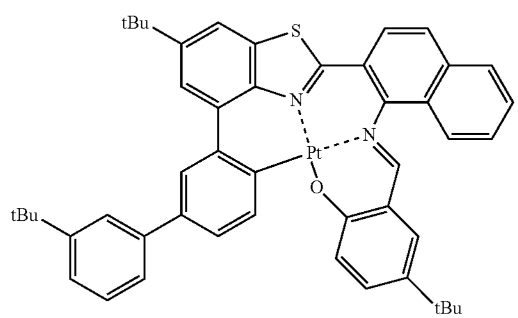

-continued
2-246
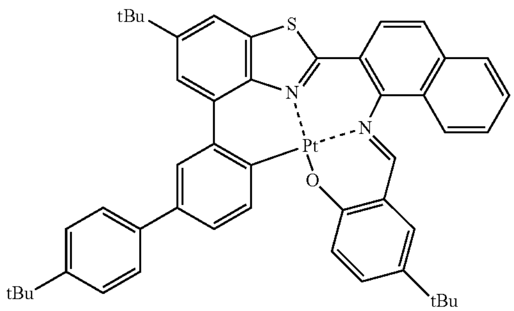
4-247
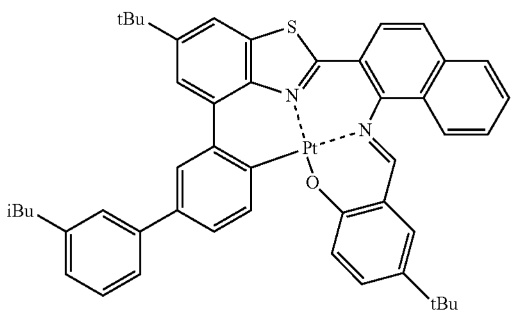
4-248
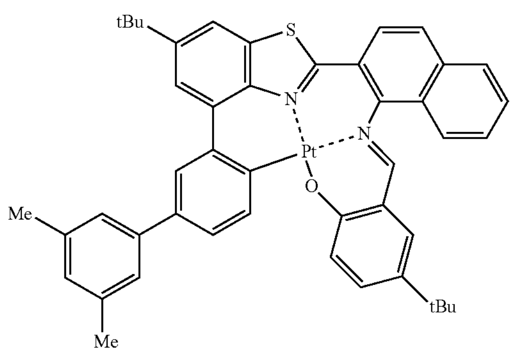
4-249
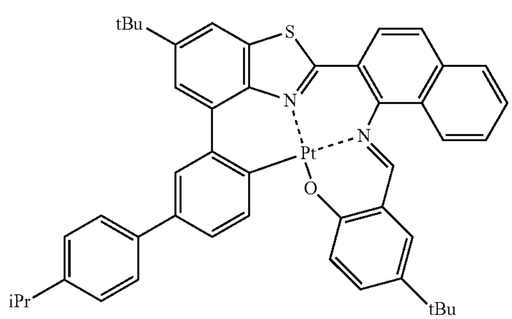
-continued
4-250
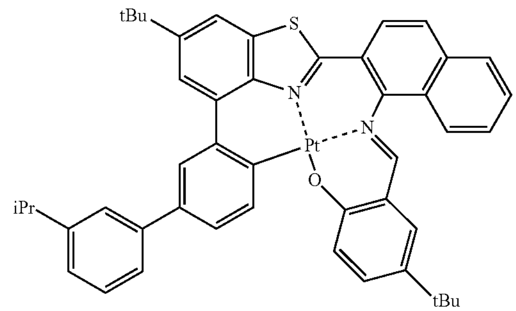
4-251
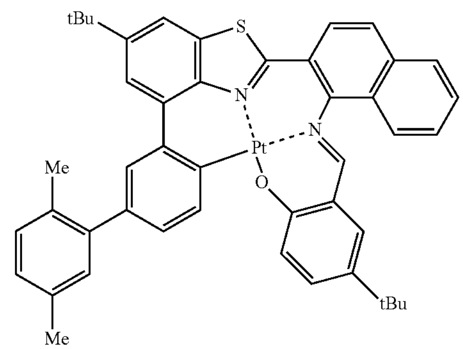
4-252
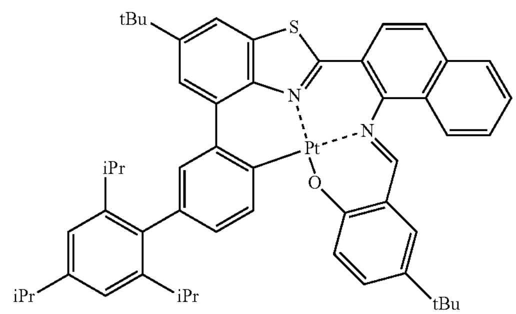
4-253
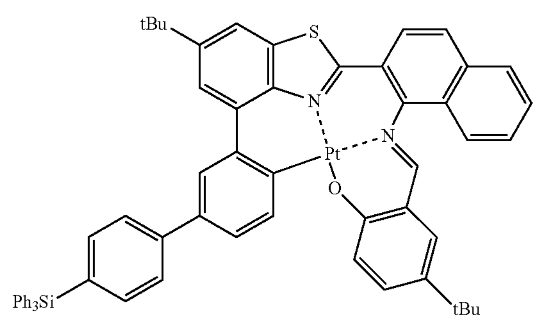

-continued
4-254
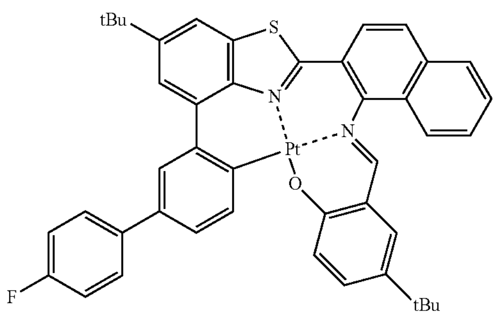
4-255
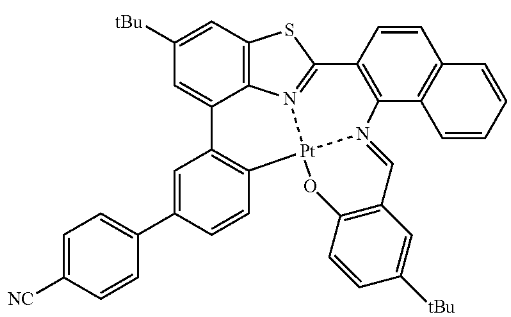
4-256
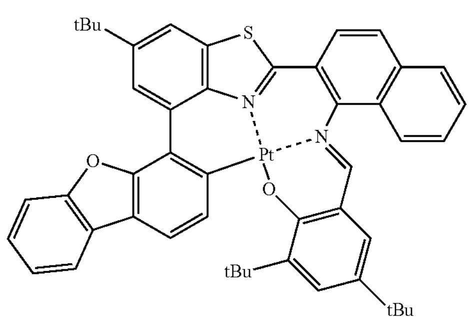
4-257
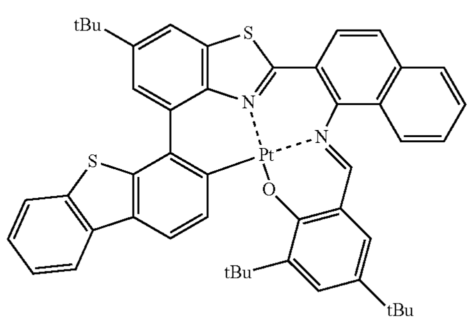
4-258
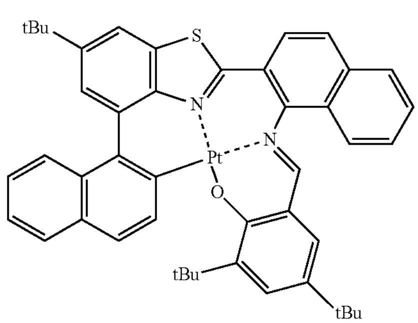
-continued
4-259
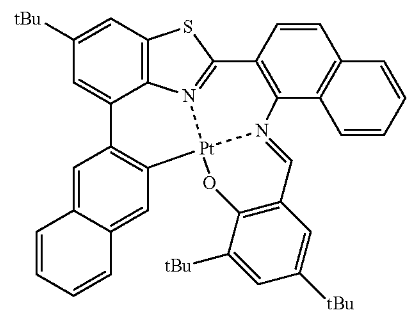
4-260
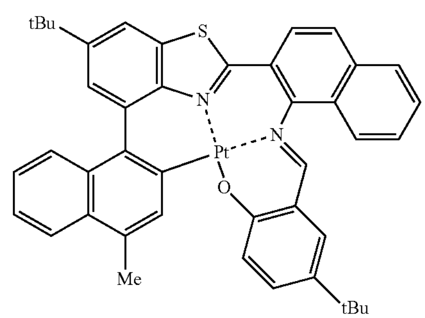
4-261
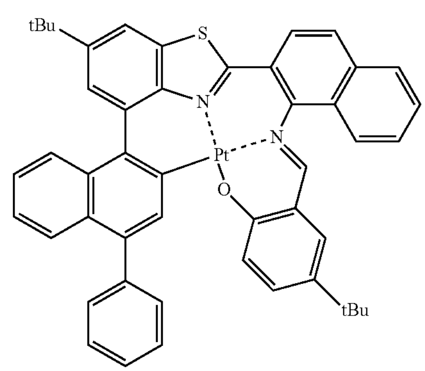
4-262
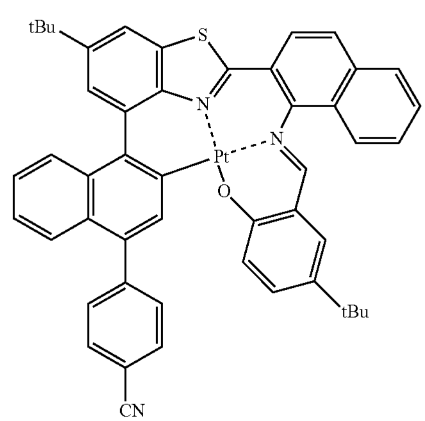

-continued
4-263
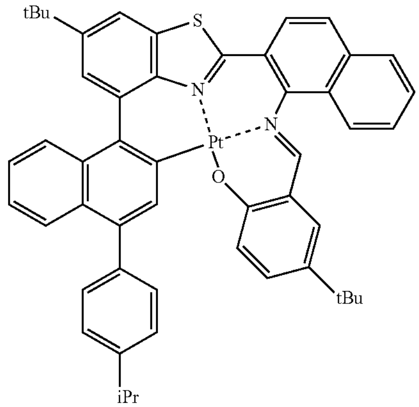
4-264
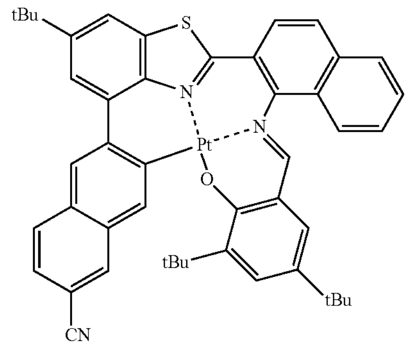
4-265
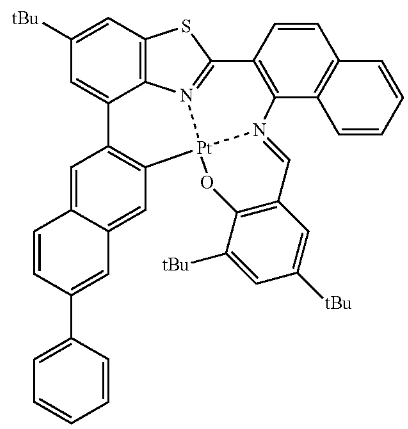
4-266
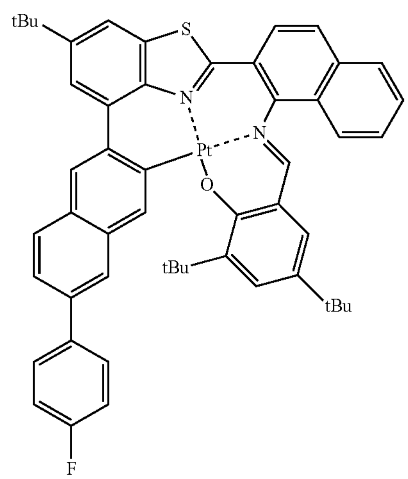
-continued
4-267
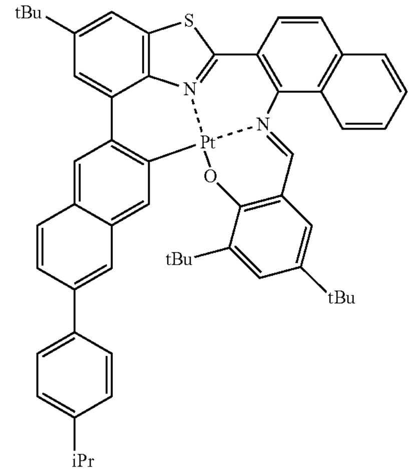
4-268
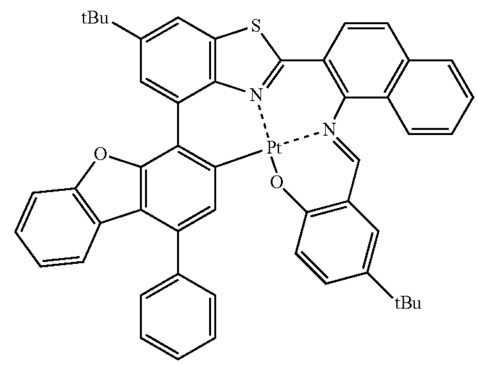
4-269
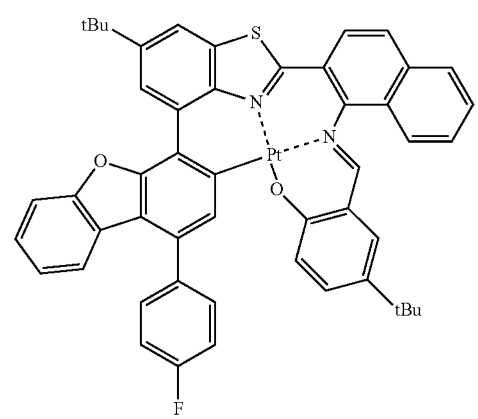
4-270
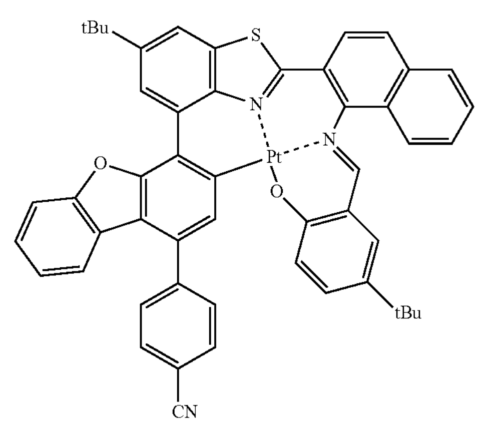

-continued
4-271
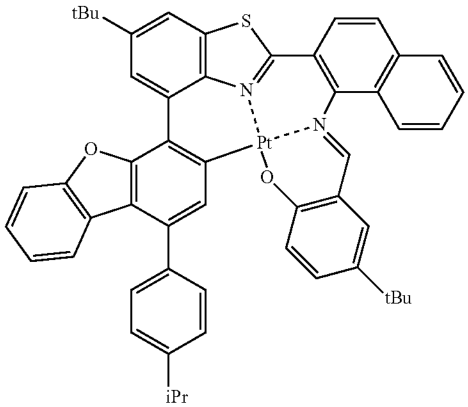
4-272
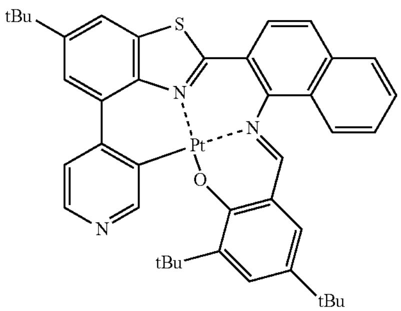
4-273
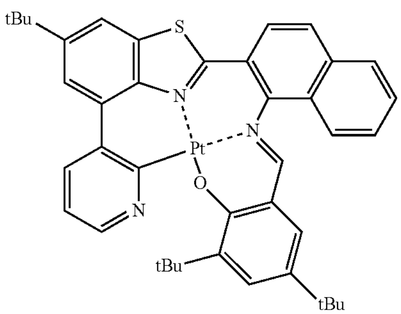
4-274
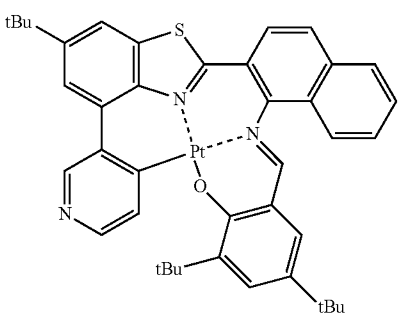
-continued
4-275
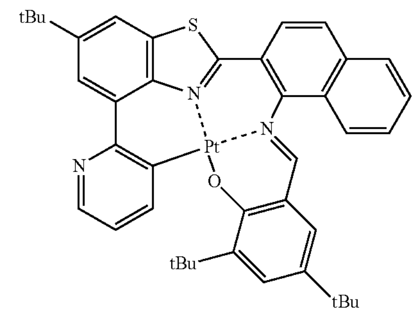
4-276
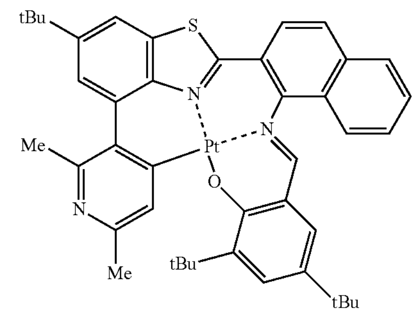
4-277
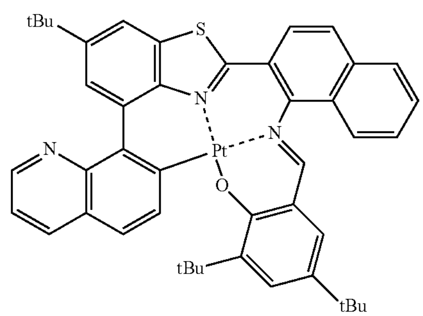
4-278
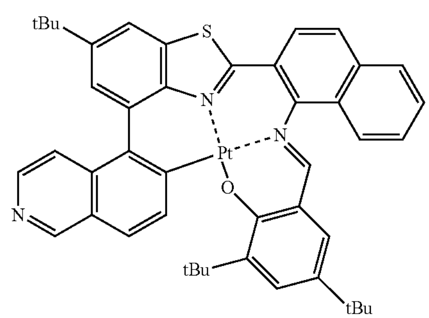
4-279
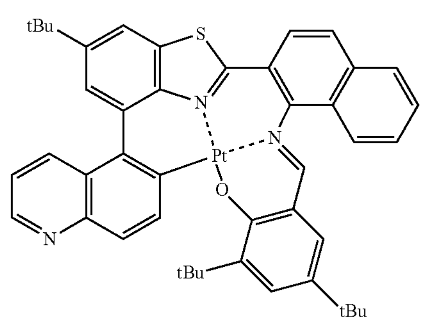

-continued
4-280
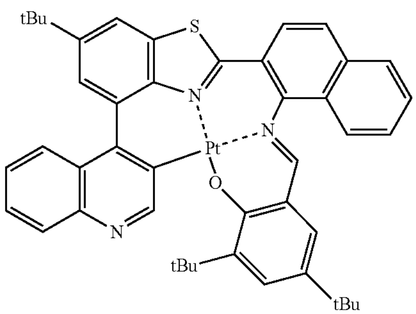
4-281
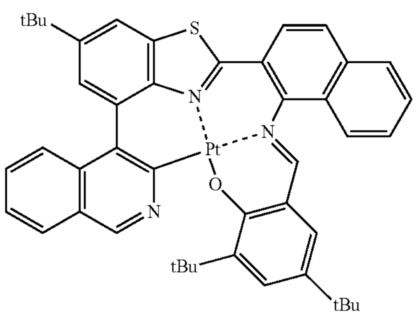
4-282
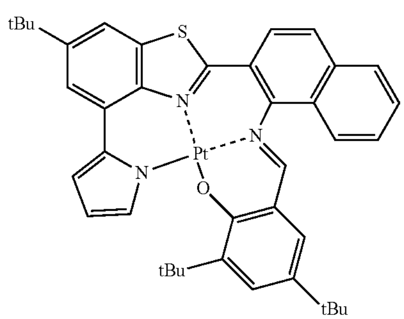
4-283
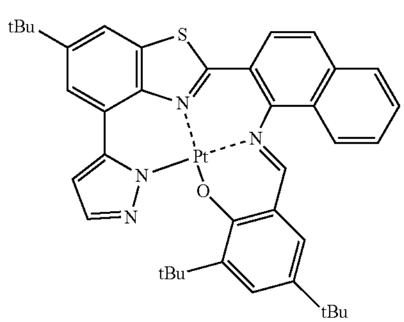
4-284
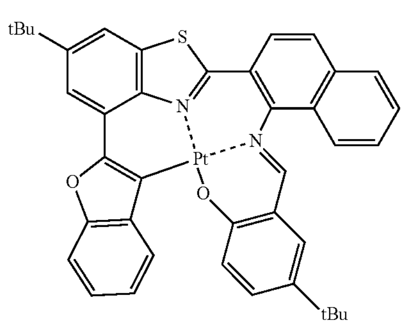
-continued
4-285
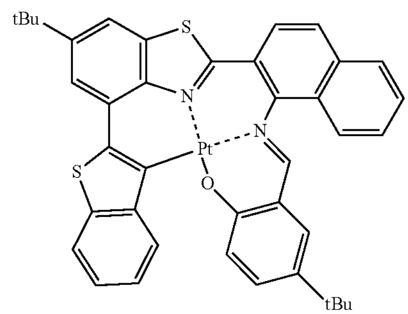
4-286
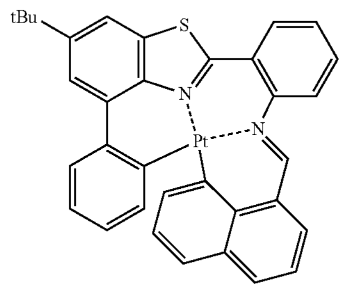
4-287
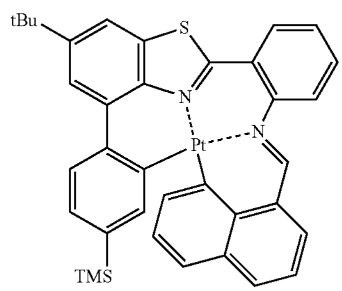
4-288
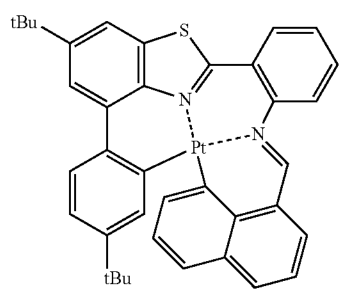
4-289
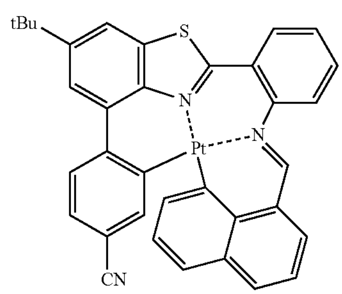

-continued
4-290
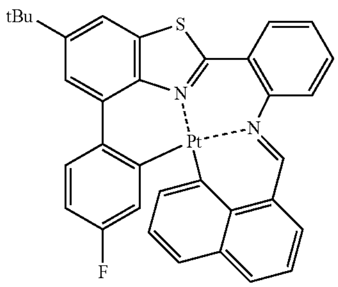
4-291
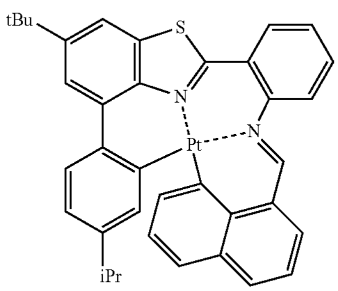
4-292
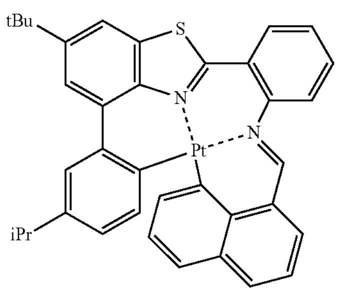
4-293
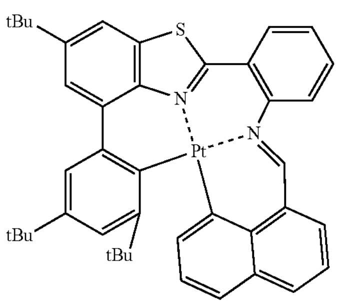
4-294
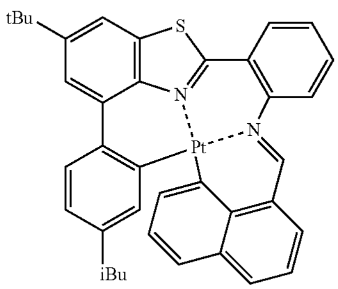
-continued
4-295
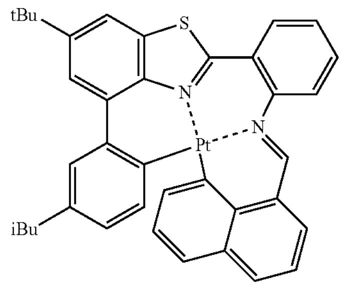
4-296
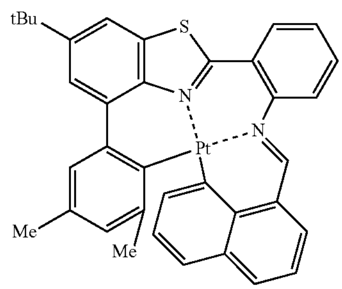
4-297
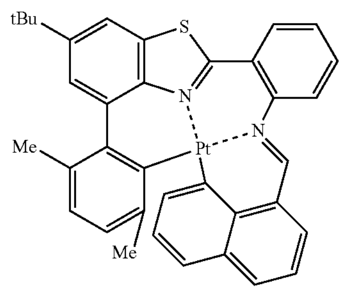
4-298
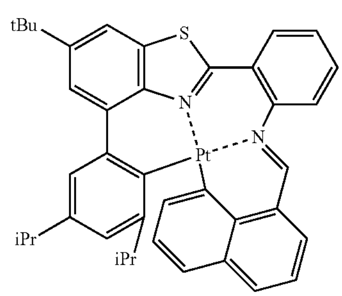
4-299
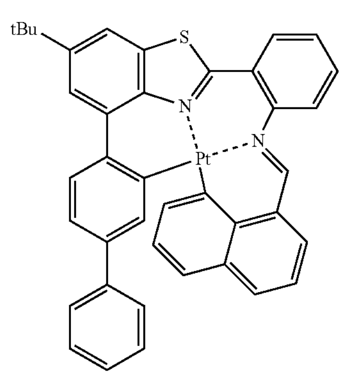

4-300
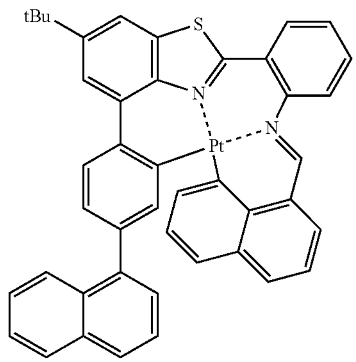
4-301
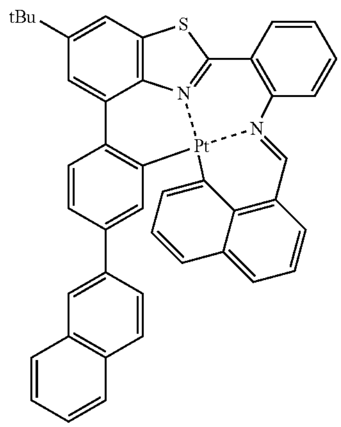
4-302
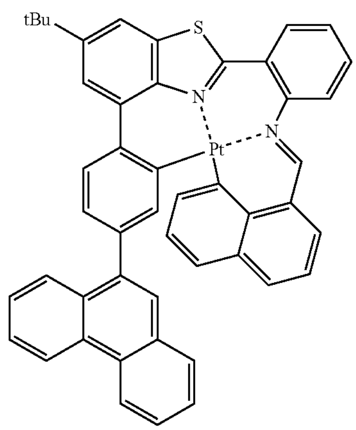
4-303
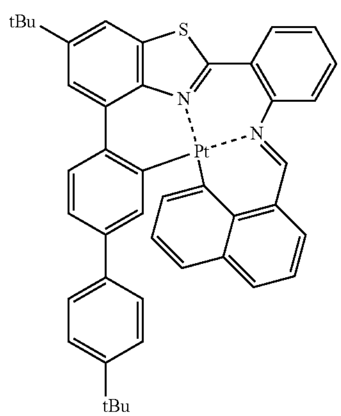
4-304
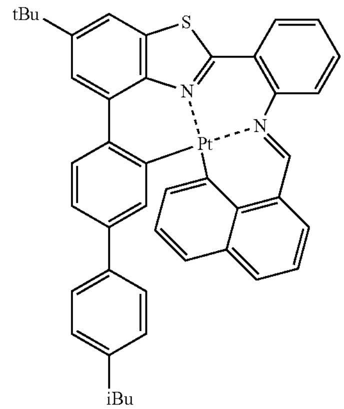
4-305
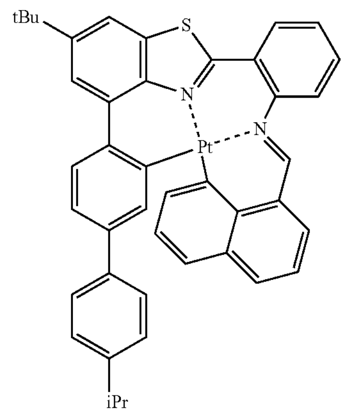
4-306
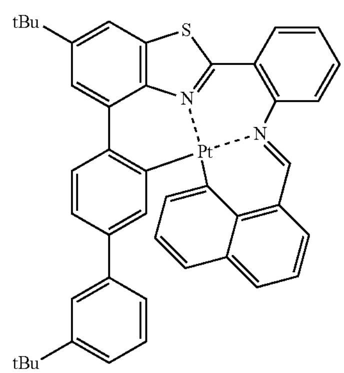
4-307
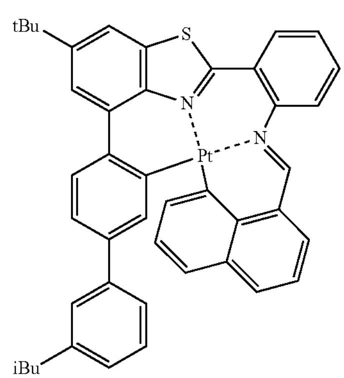

-continued
4-308
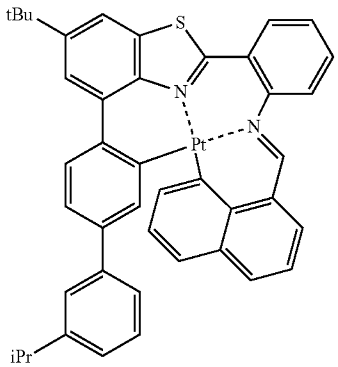
4-309
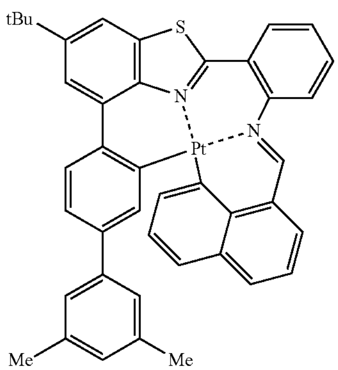
4-310
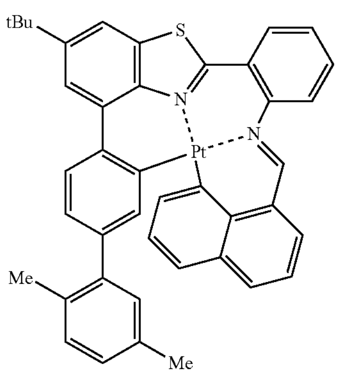
4-311
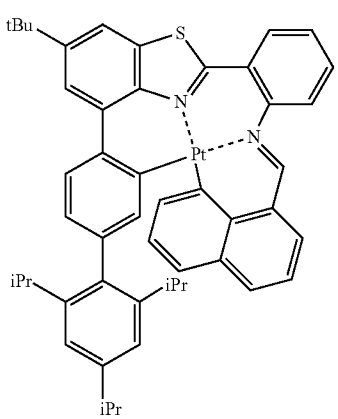
-continued
4-312
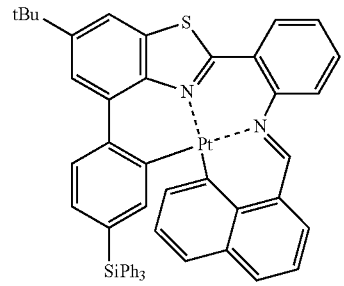
4-313
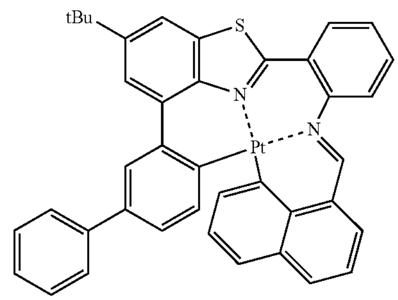
4-314
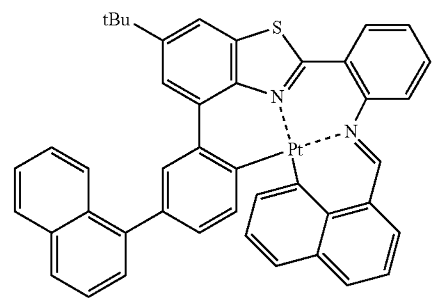
4-315
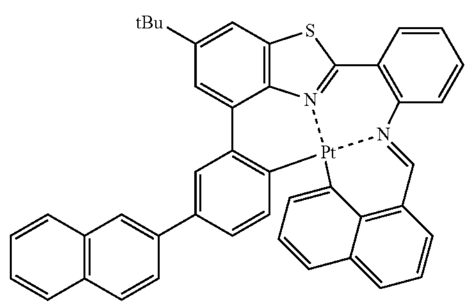
4-316
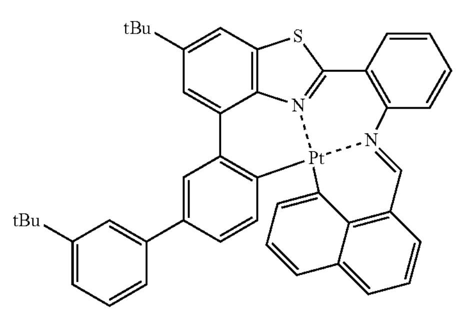

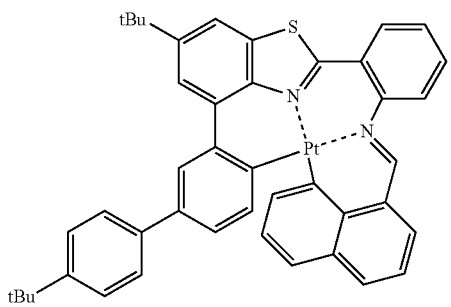
4-317
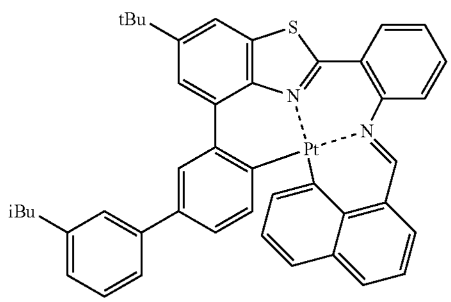
4-318
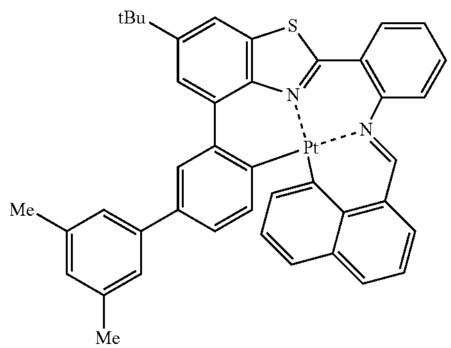
4-319
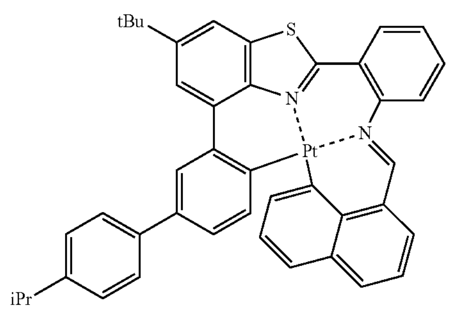
4-320
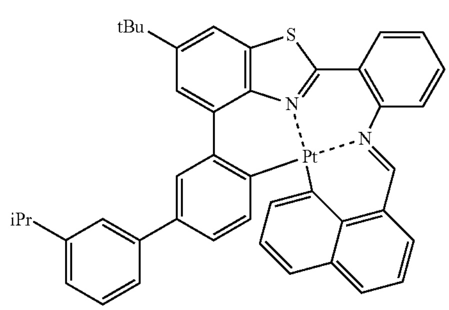
4-321
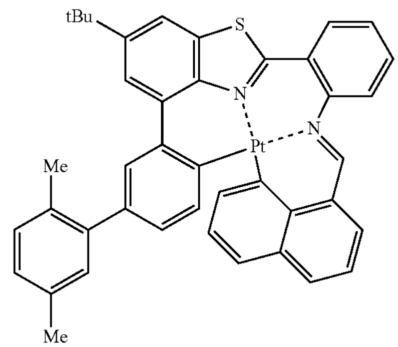
4-322
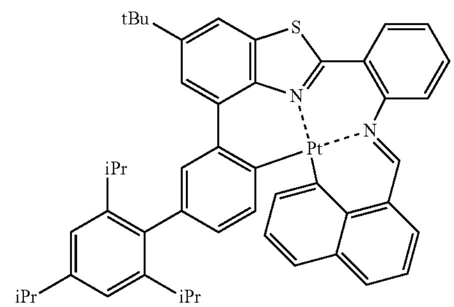
4-323
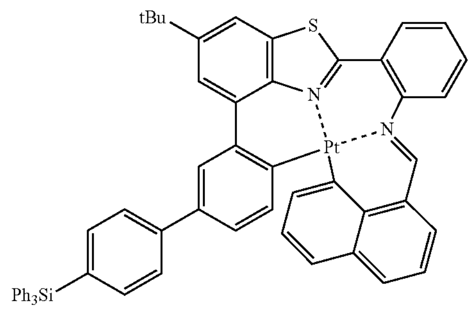
4-324
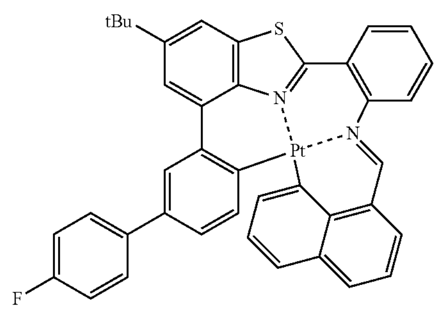
4-325
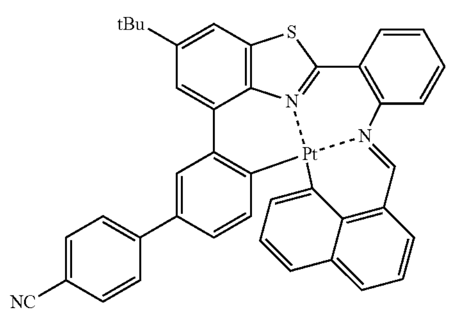
4-326

-continued
4-327
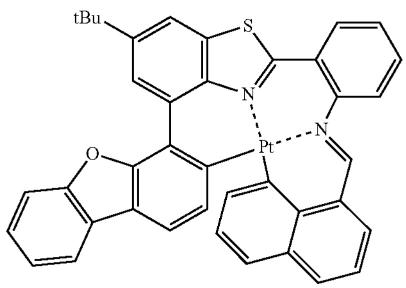
4-328
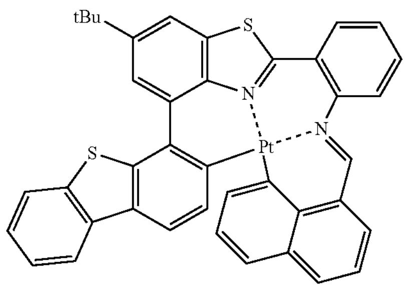
4-329
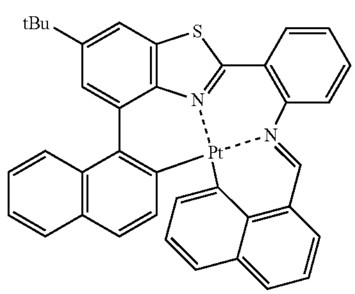
4-330
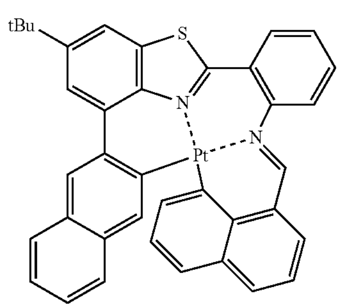
4-331
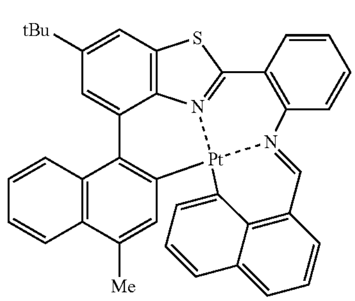
-continued
4-332
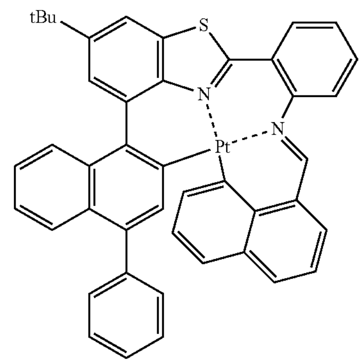
4-333
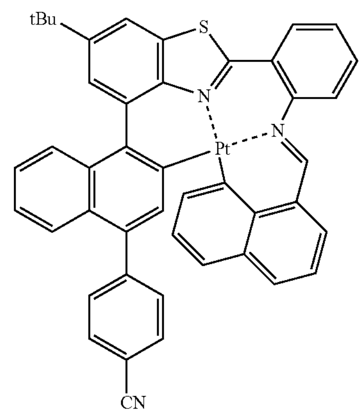
4-334
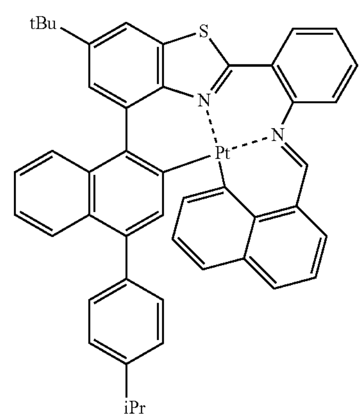
4-335
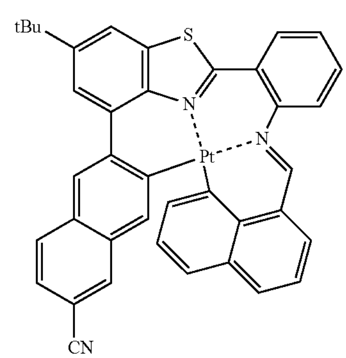

4-336
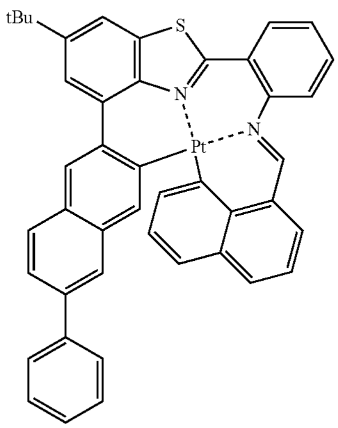
4-337
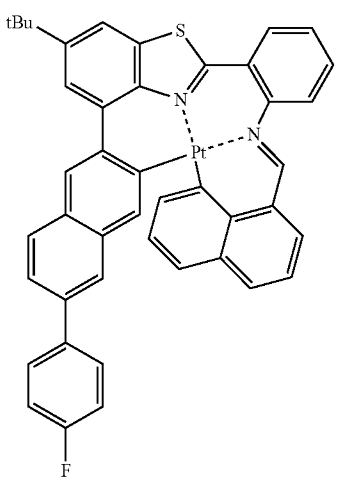
4-338
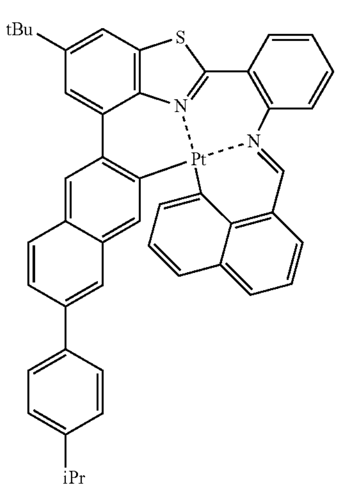
4-339
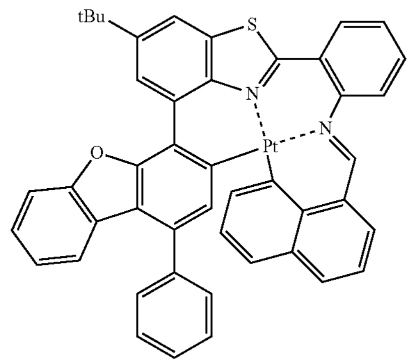
4-340
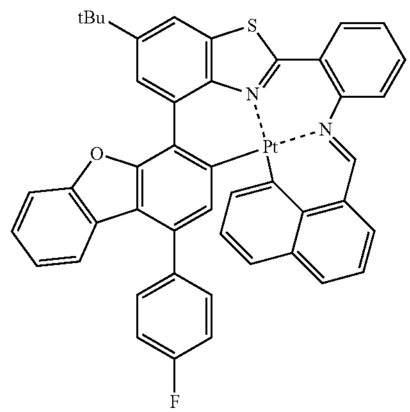
4-341
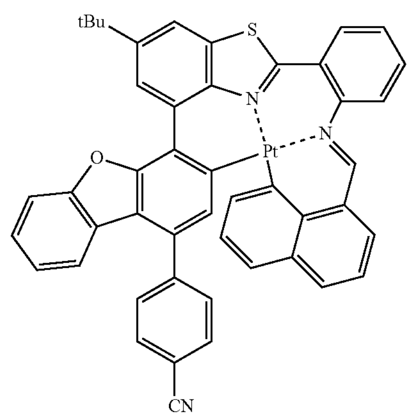
4-342
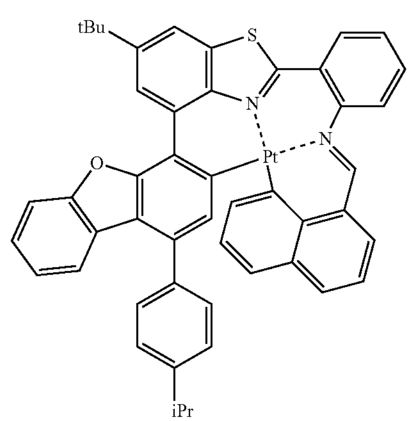

-continued
4-343
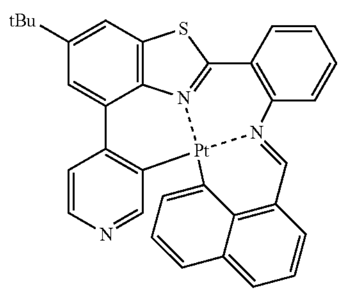
4-344
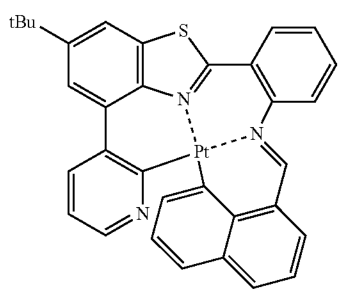
4-345
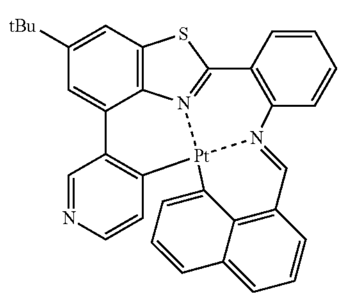
4-346
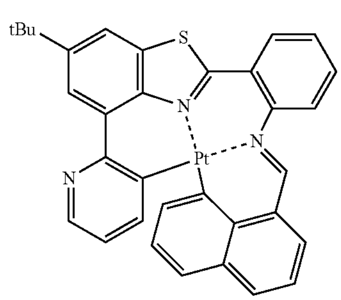
4-347
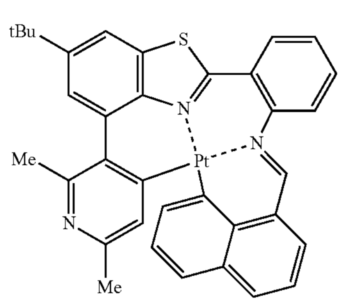
-continued
4-348
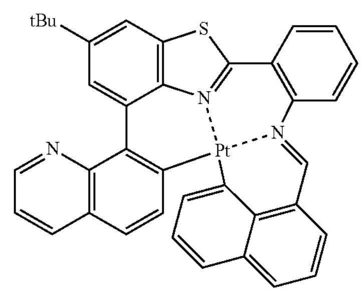
4-349
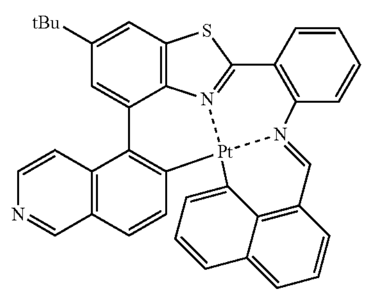
4-350
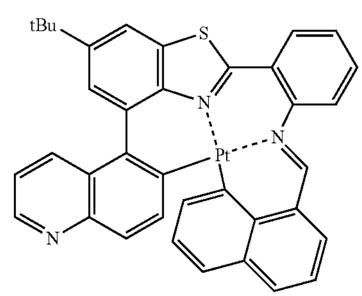
4-351
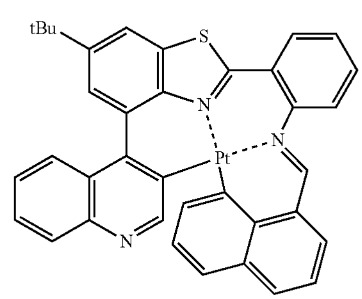
4-352
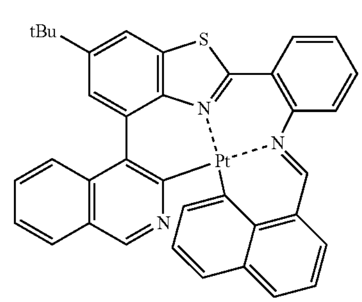

-continued
4-353
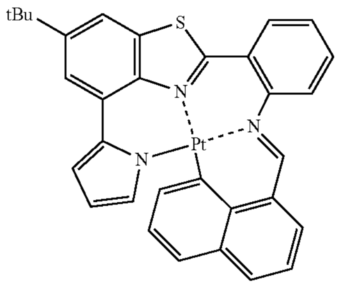
4-354
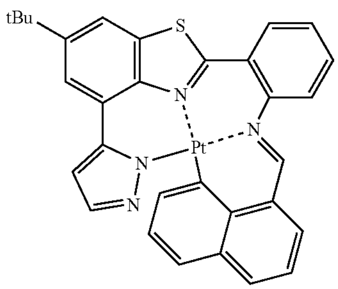
4-355
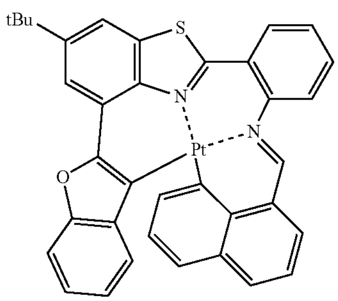
4-356
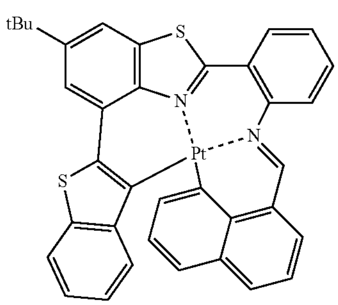
4-357
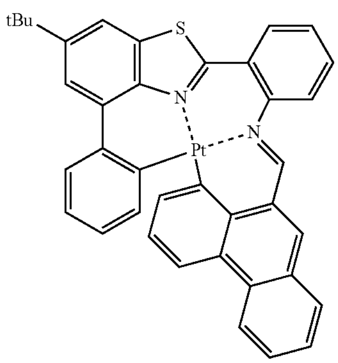
-continued
4-358
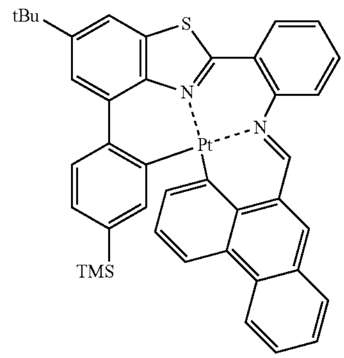
4-359
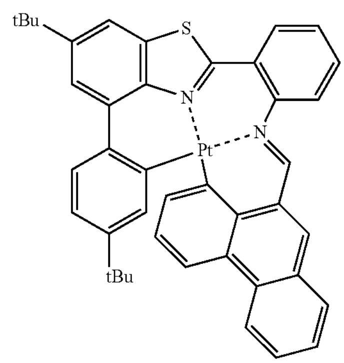
4-360
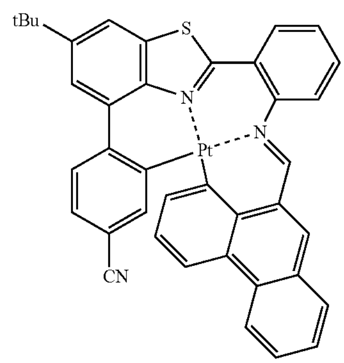
4-361
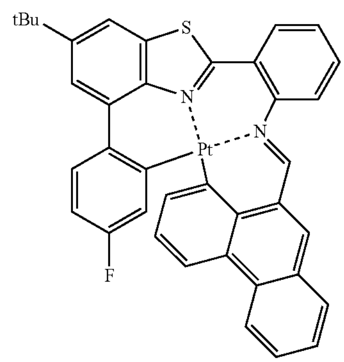

-continued
4-362
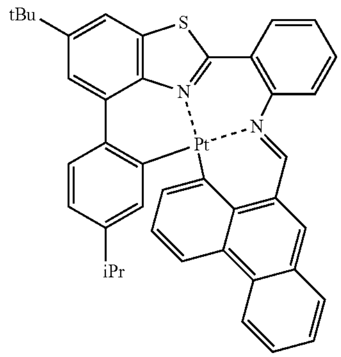
4-363
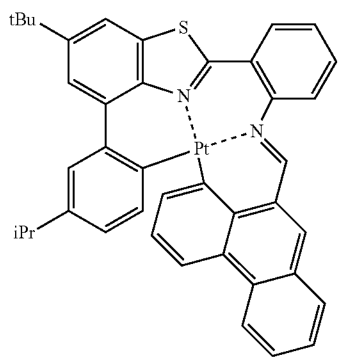
4-364
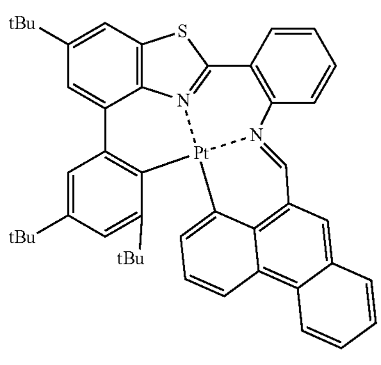
4-365
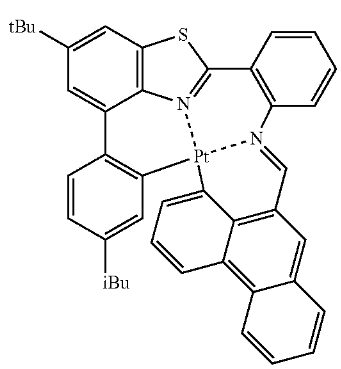
-continued
4-366
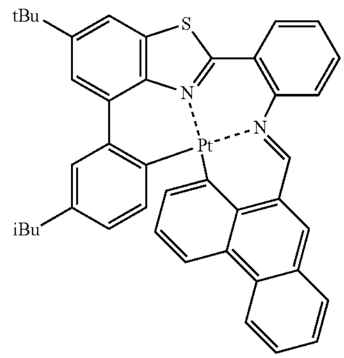
4-367
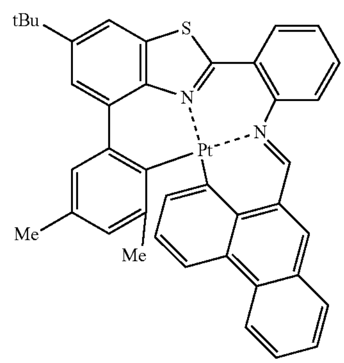
4-368
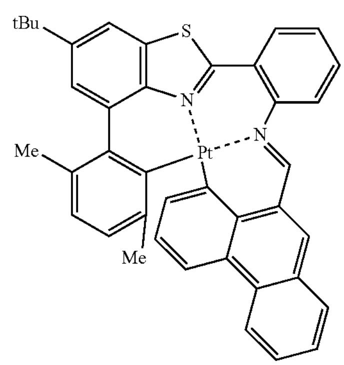
4-369
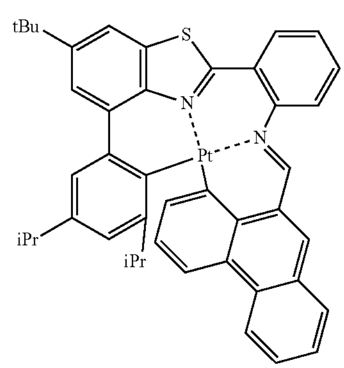

-continued
4-370
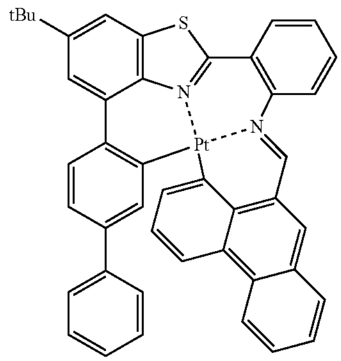
4-371
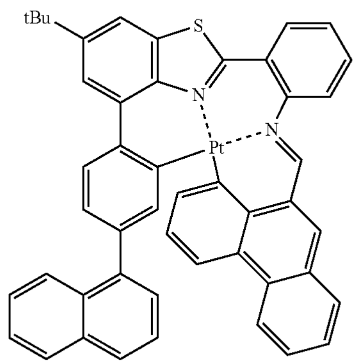
4-372
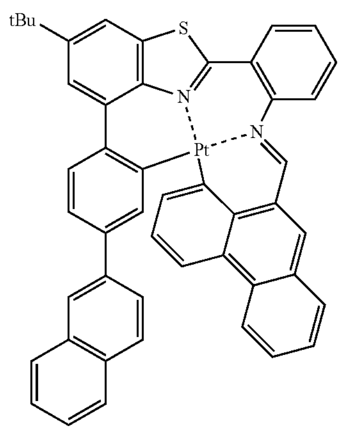
4-373
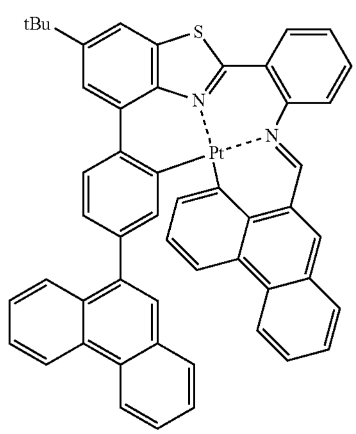
-continued
4-374
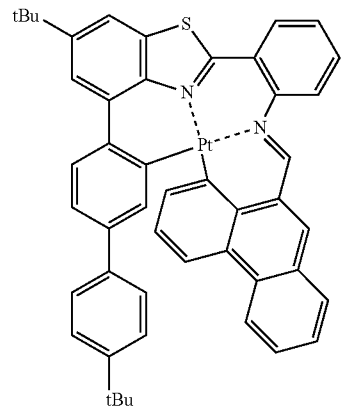
4-375
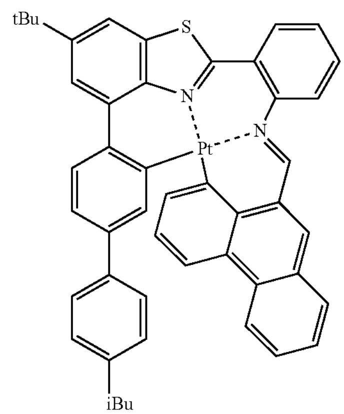
4-376
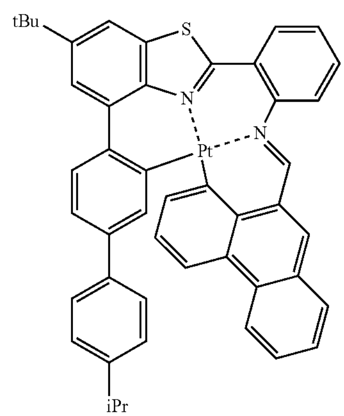
4-377
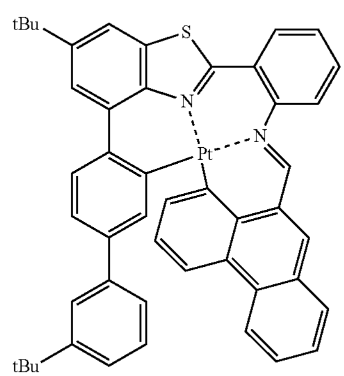

4-378
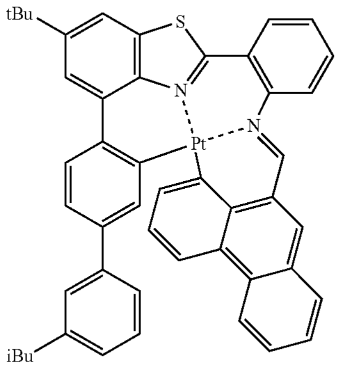
4-379
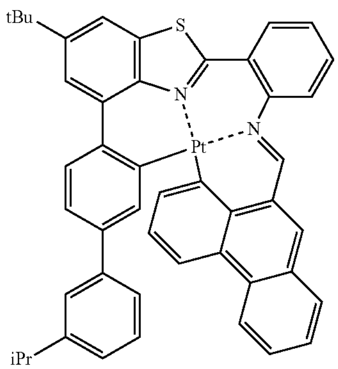
4-380
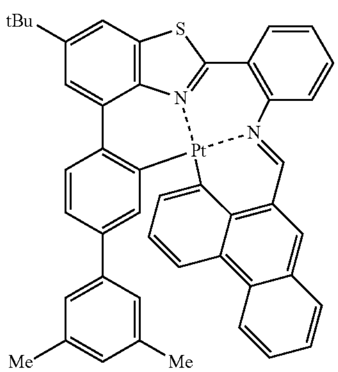
4-381
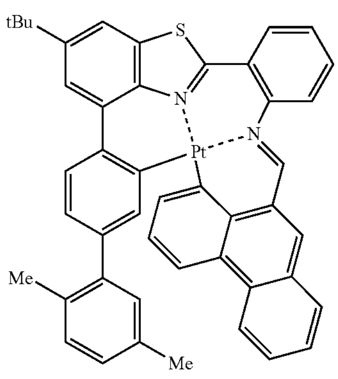
4-382
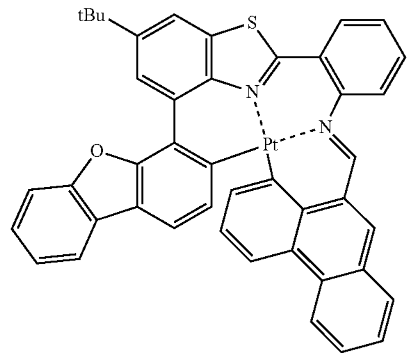
4-383
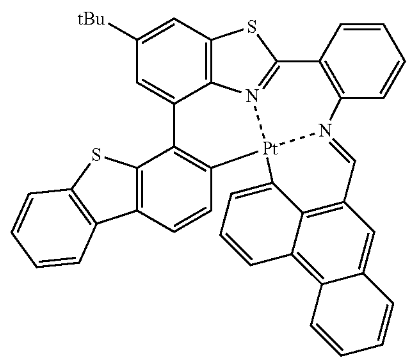
4-384
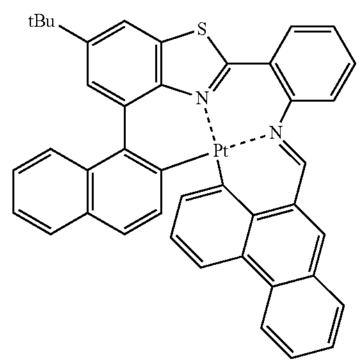
4-385
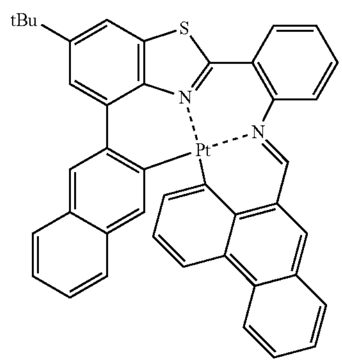

-continued
4-386
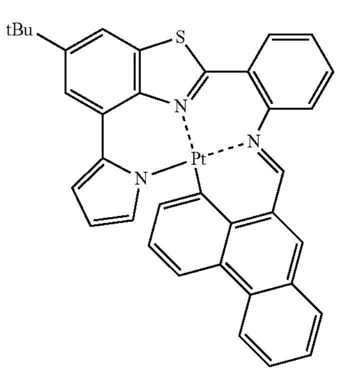
4-387
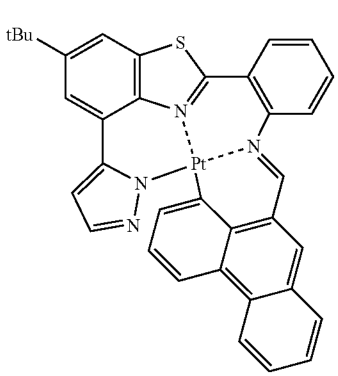
4-388
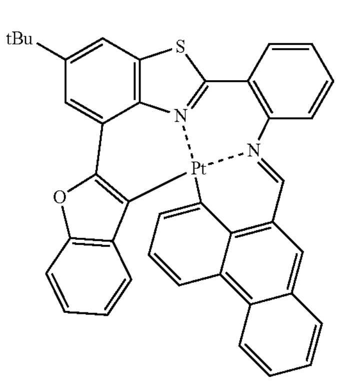
4-389
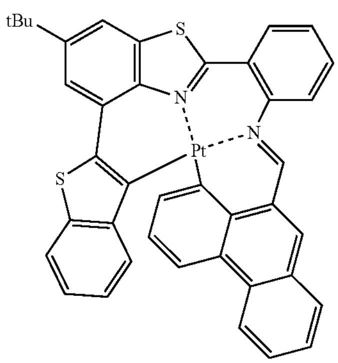
-continued
4-390
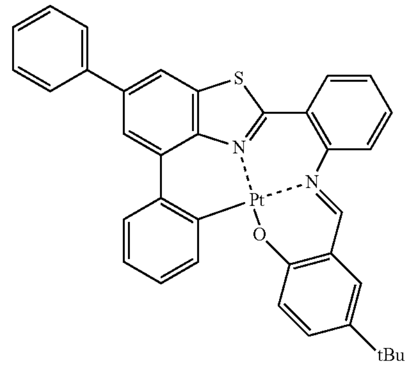
4-391
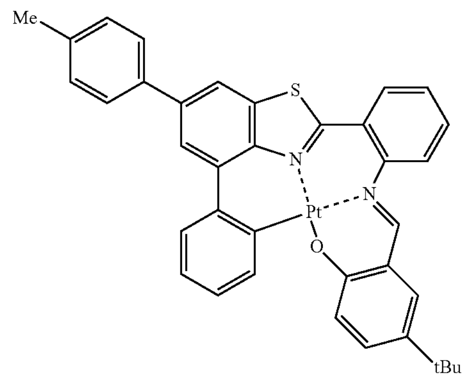
4-392
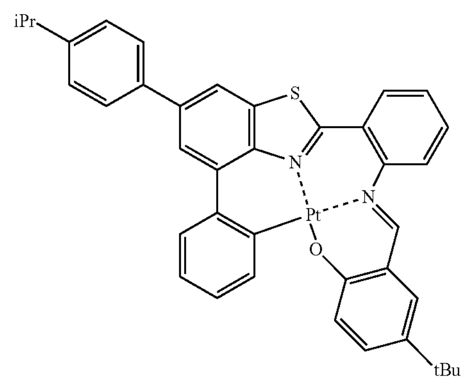
4-393
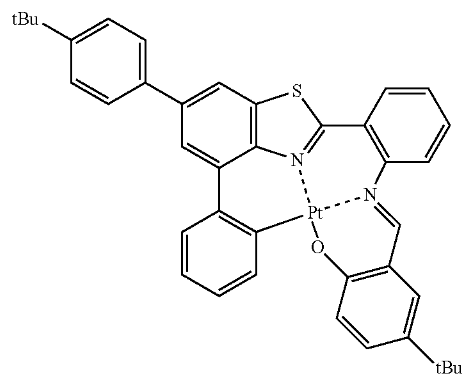

-continued
4-394
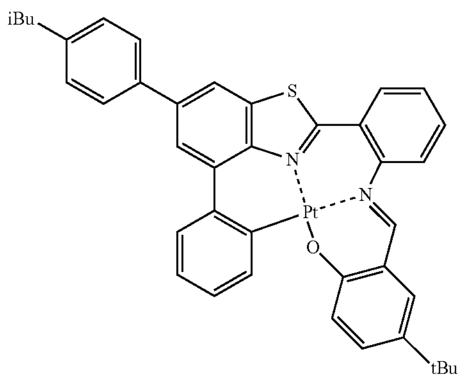
4-395
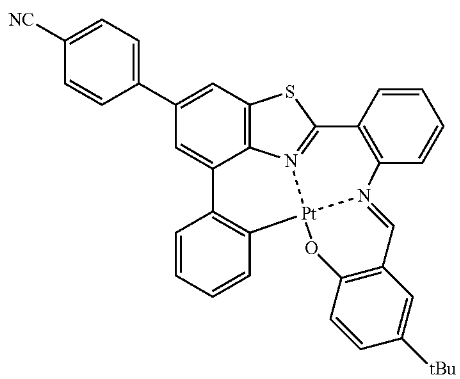
4-396
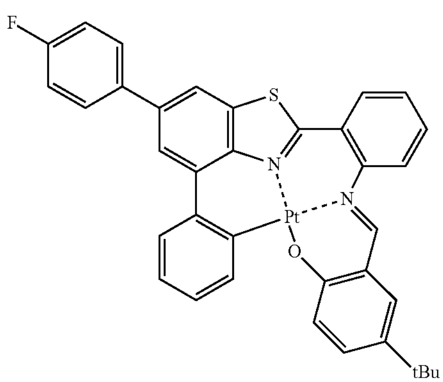
4-397
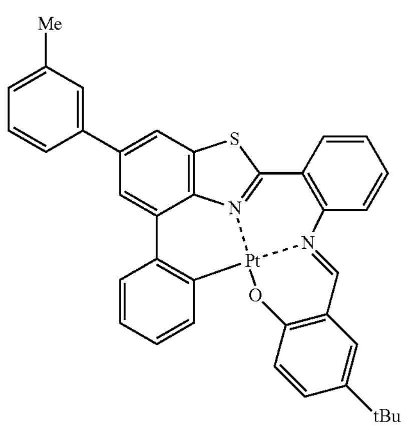
-continued
4-398
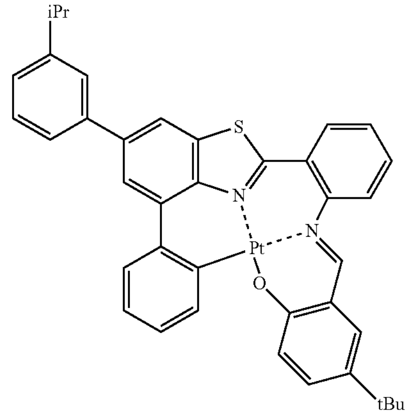
4-399
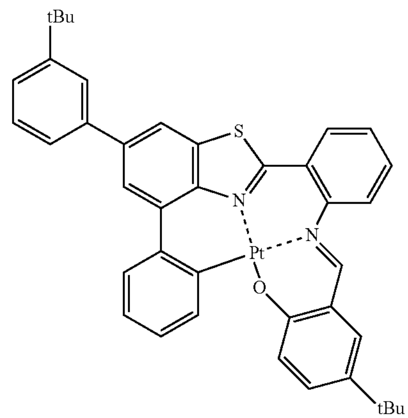
4-400
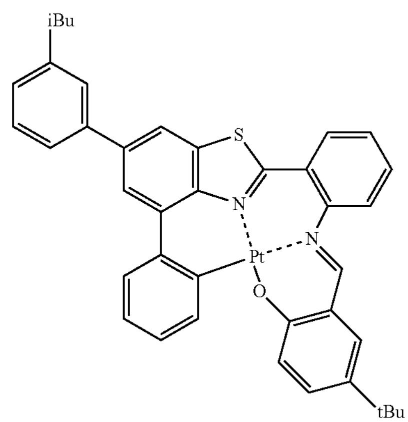
4-401
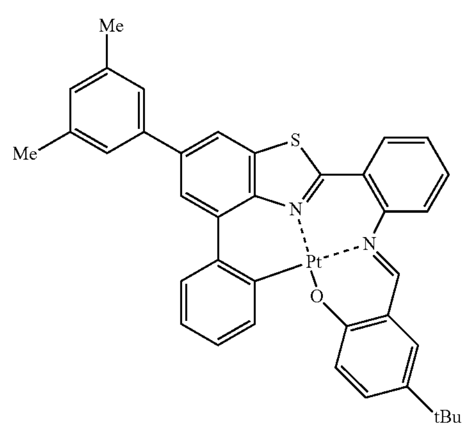

-continued
4-402
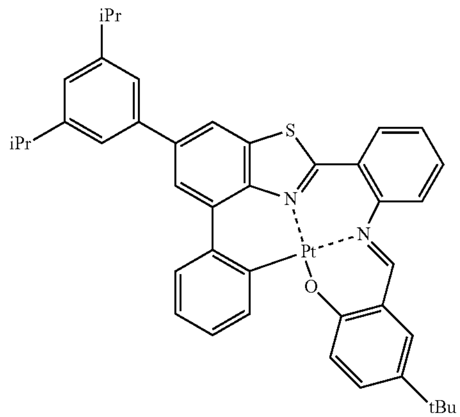
4-403
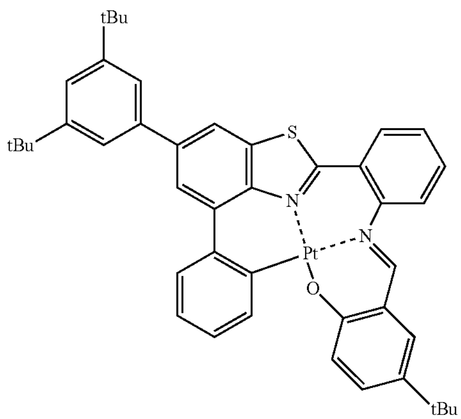
4-404
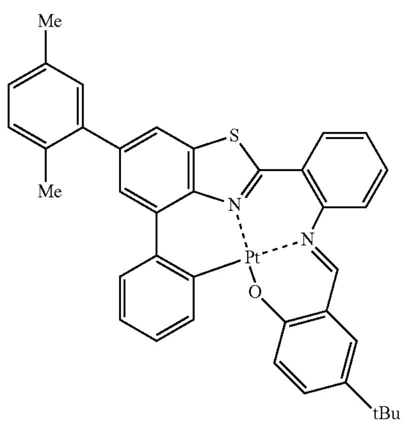
4-405
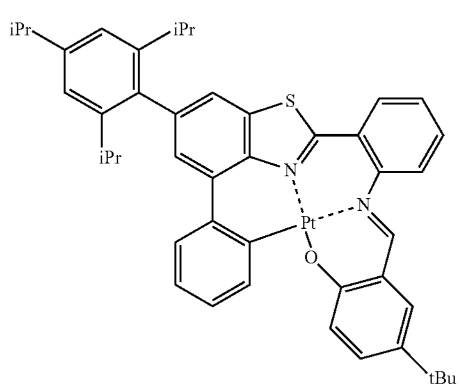
-continued
4-406
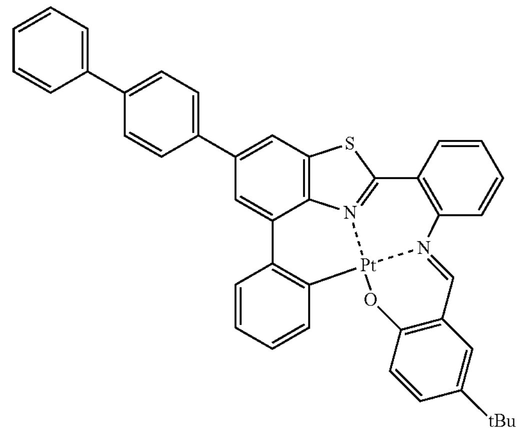
4-407
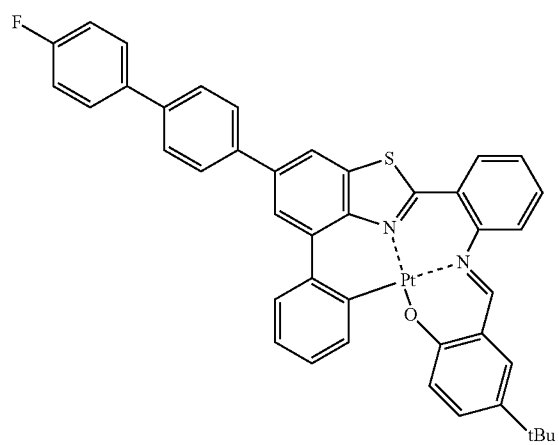
4-408
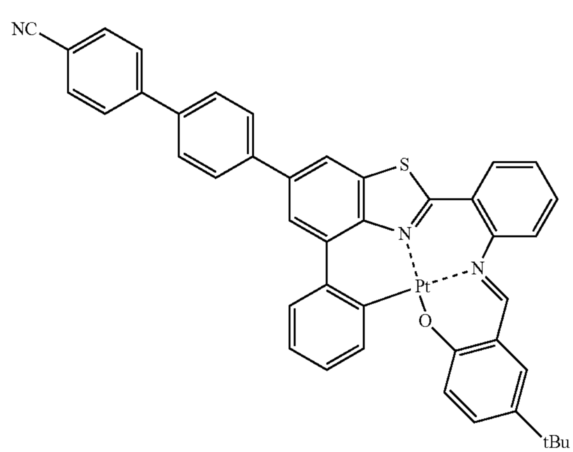

4-409
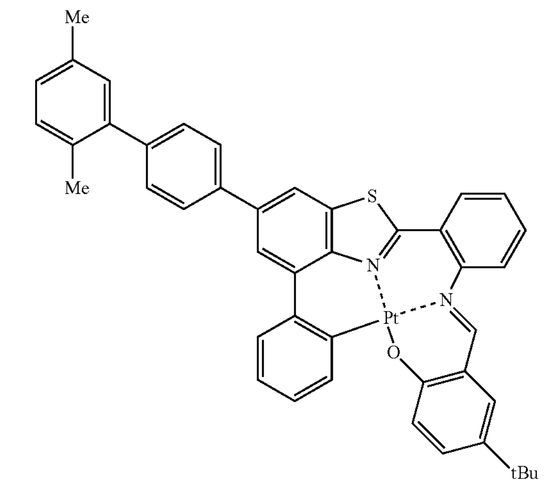
4-410
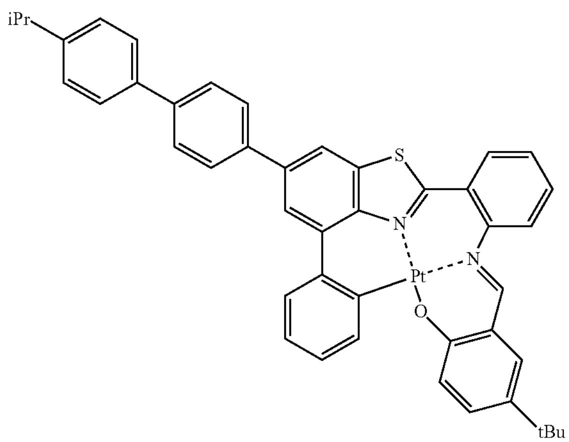
4-411
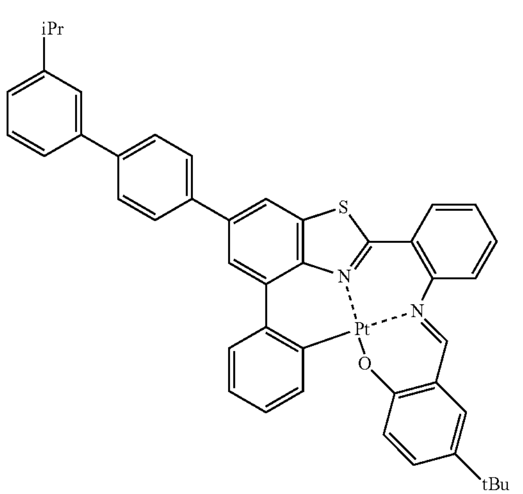
4-412
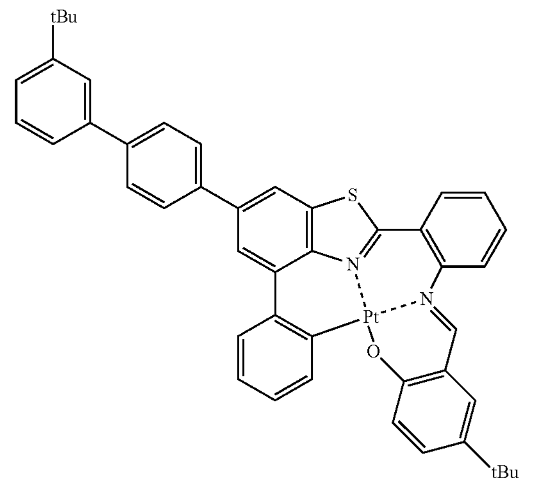
4-413
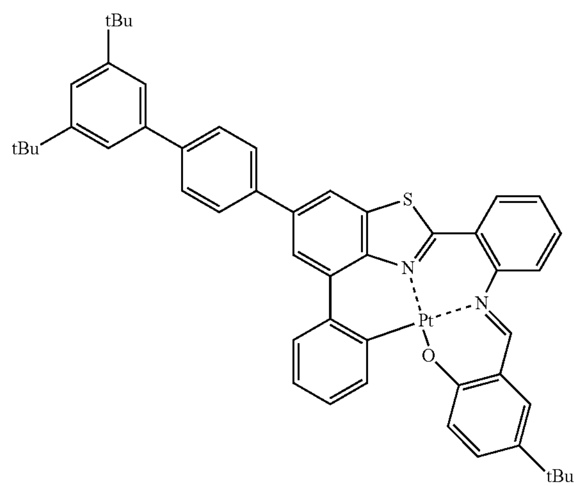
4-414
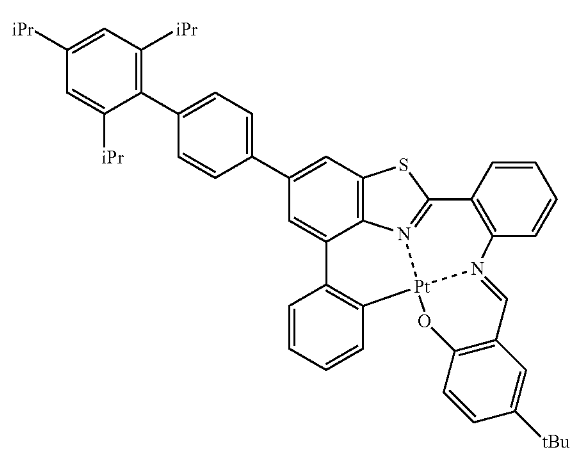

-continued
4-415
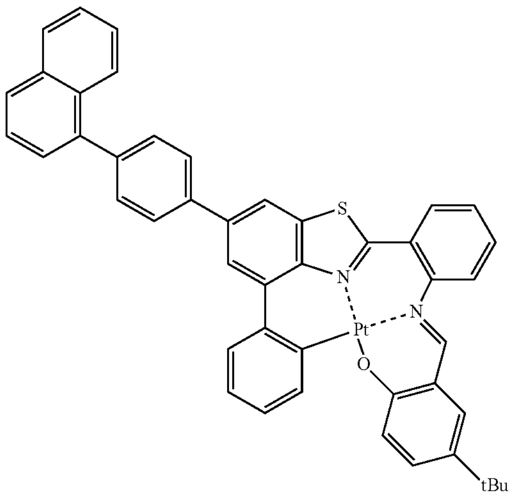
4-416
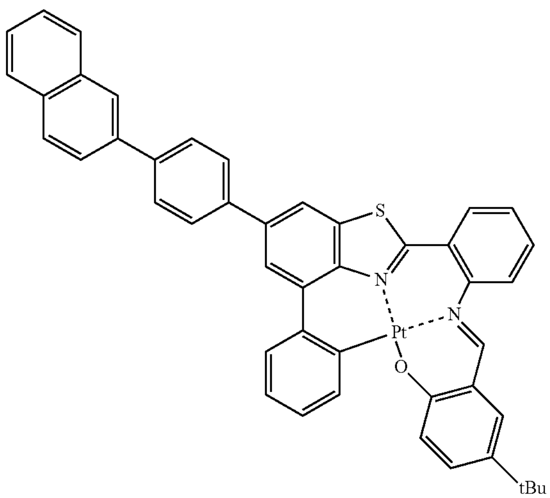
4-417
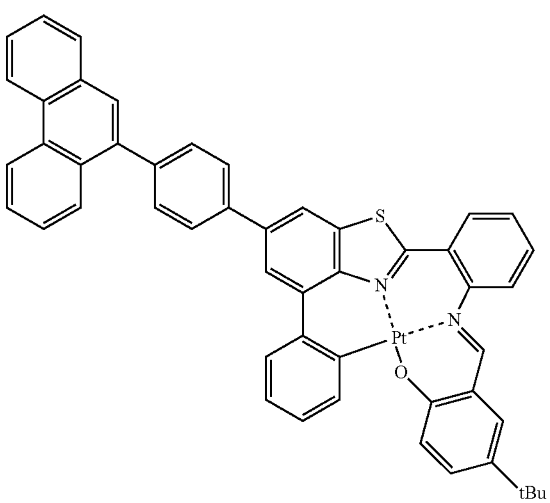
-continued
4-418
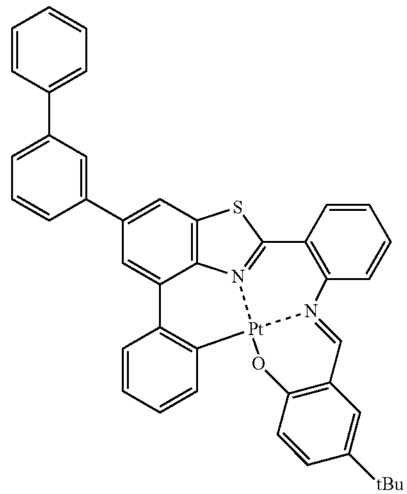
4-419
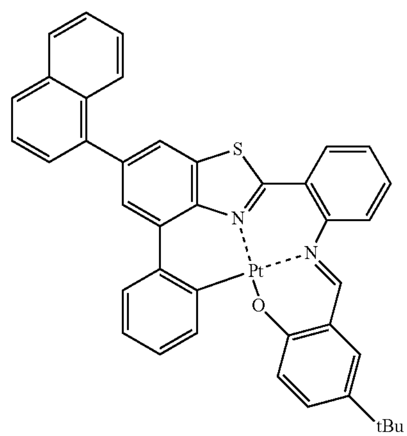
4-420
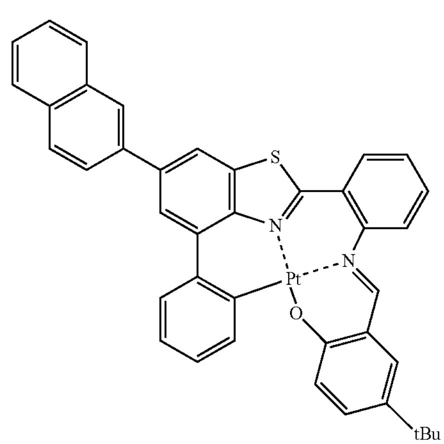

-continued
4-421
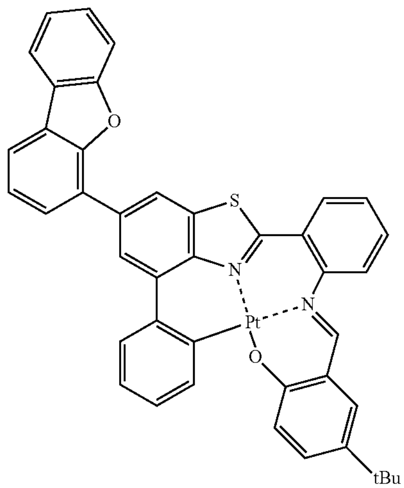
4-422
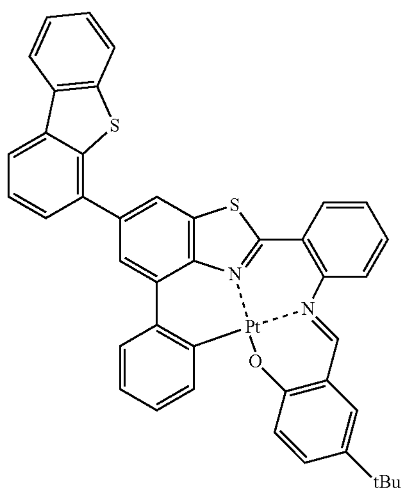
4-423
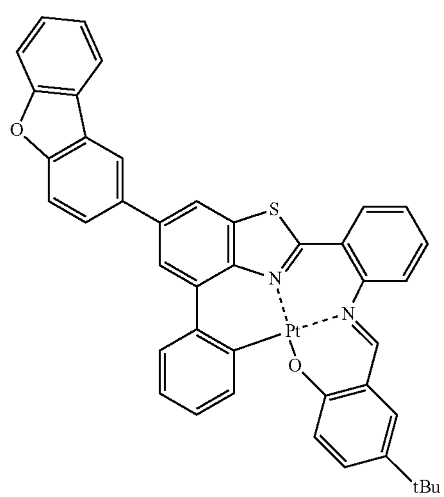
-continued
4-424
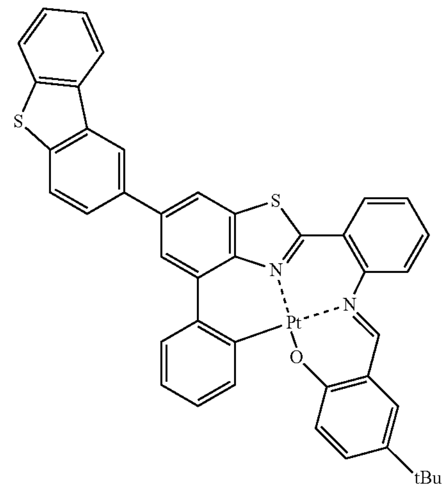
4-425
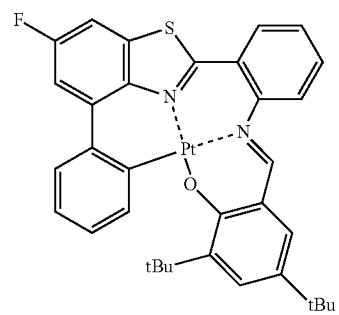
4-426
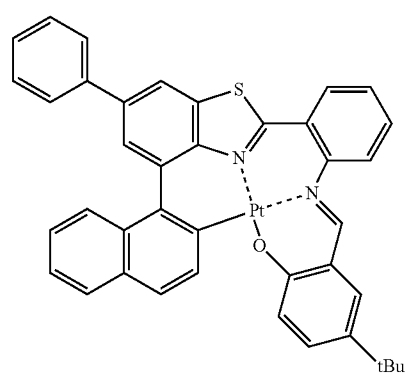
4-427
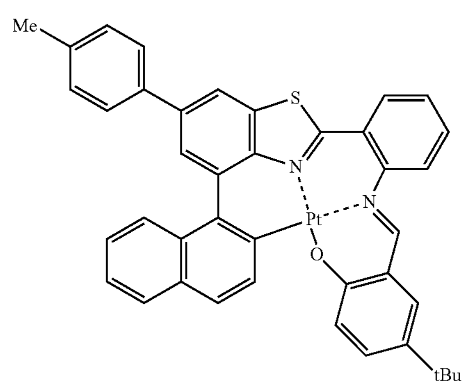

-continued
4-428
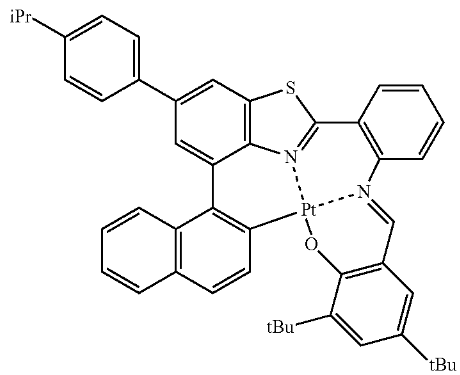
4-429
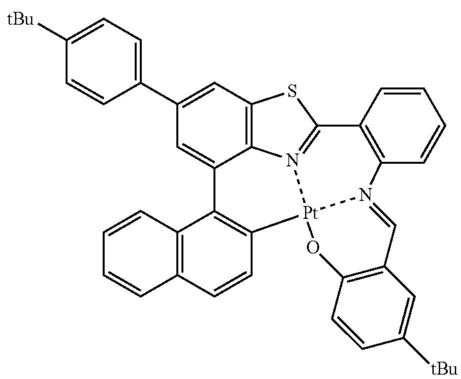
4-430
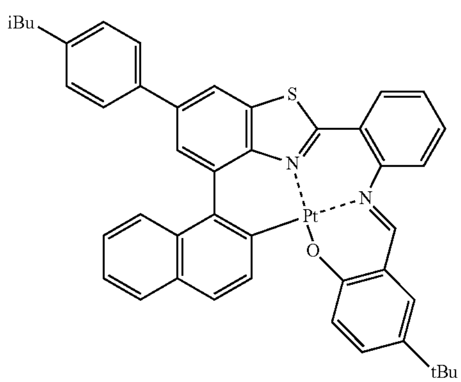
4-431
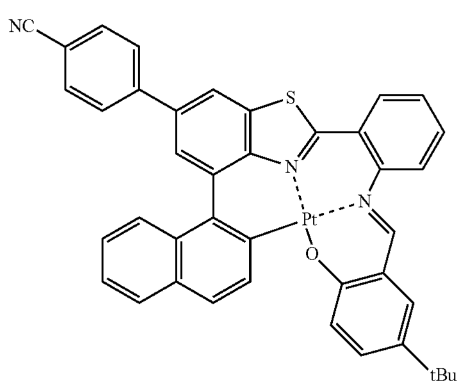
-continued
4-432
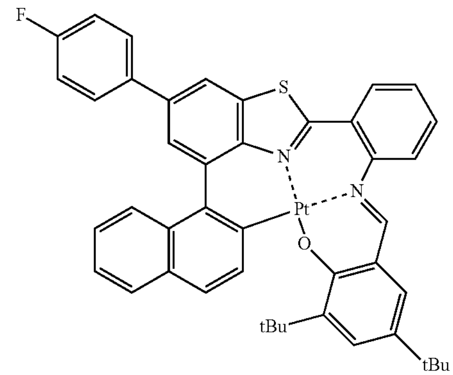
4-433
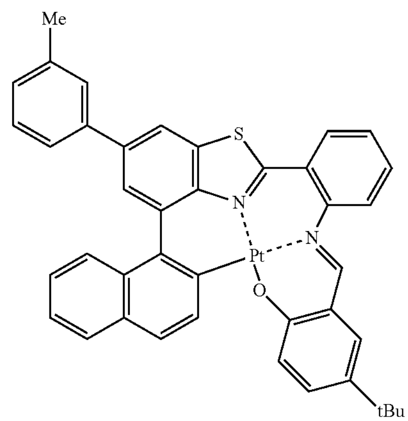
4-434
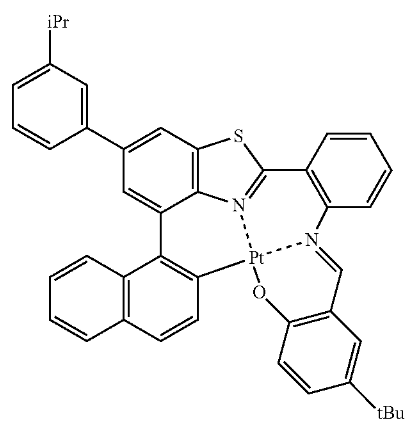
4-435
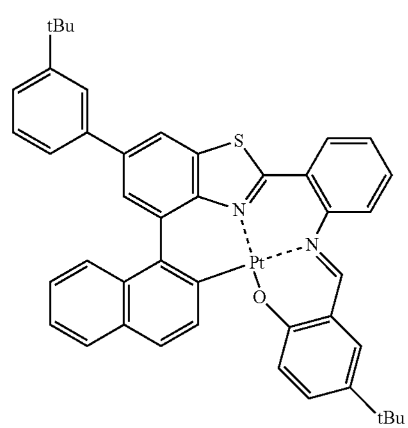

-continued
4-436
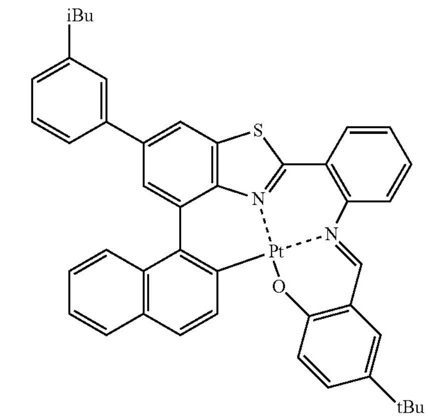
4-437
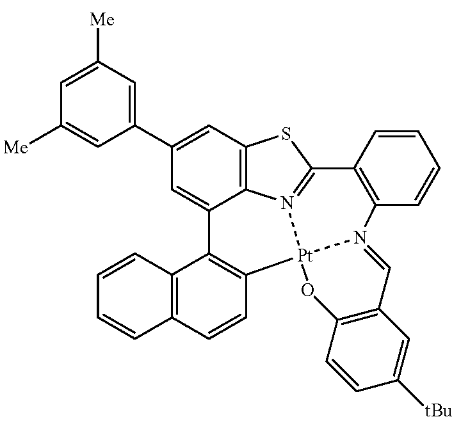
4-438
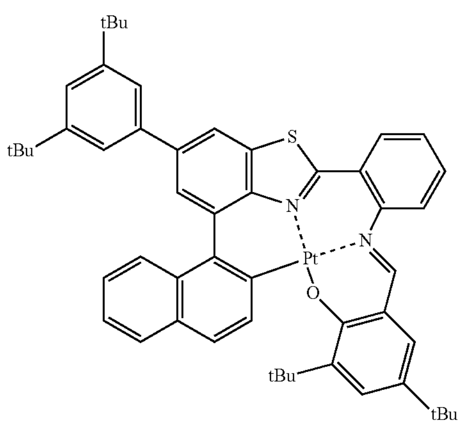
4-439
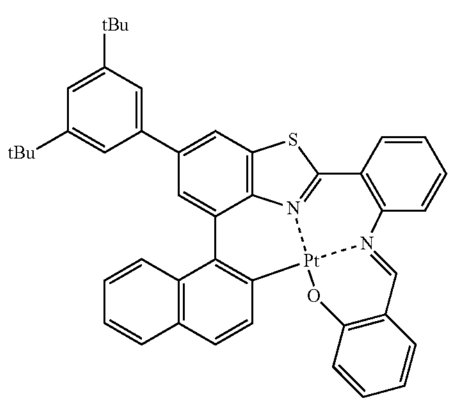
-continued
4-440
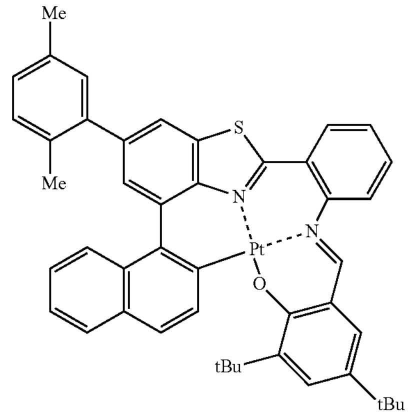
4-441
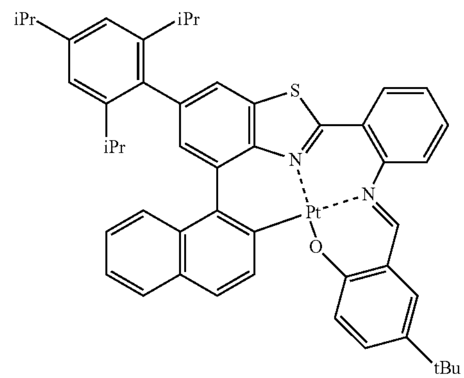
4-442
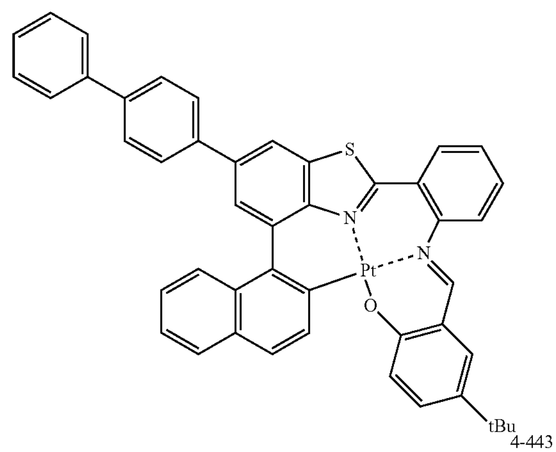
4-443
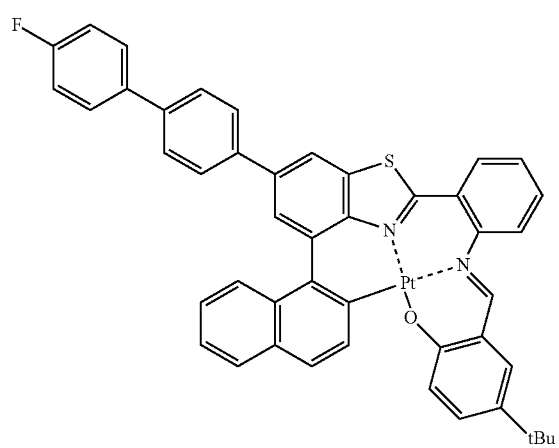

4-444
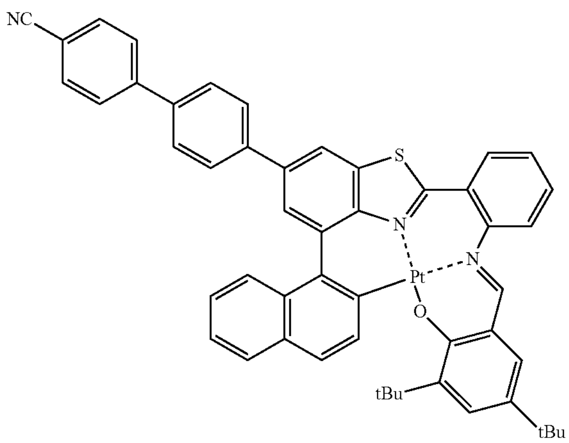
4-445
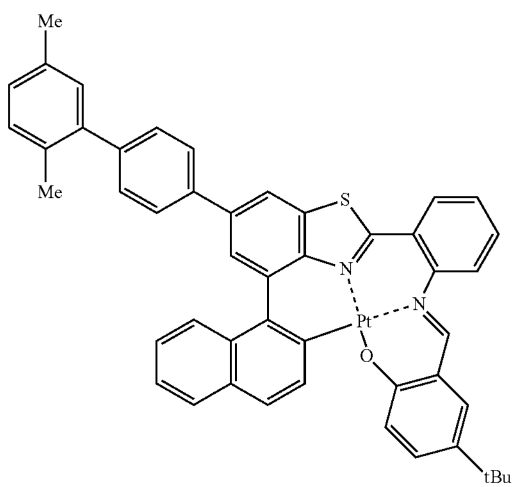
4-446
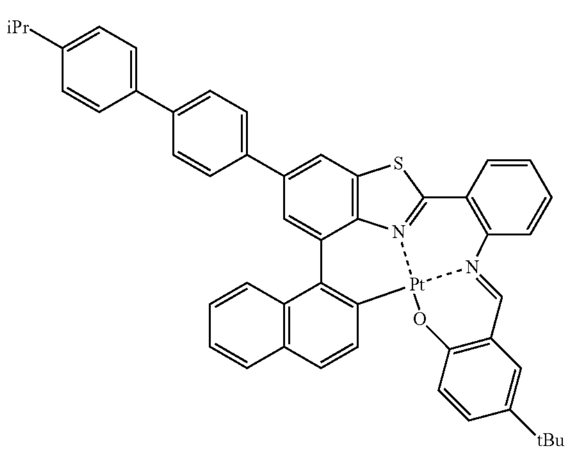
4-447
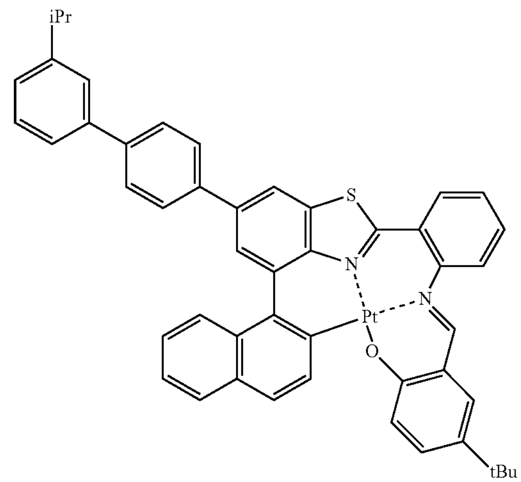
4-448
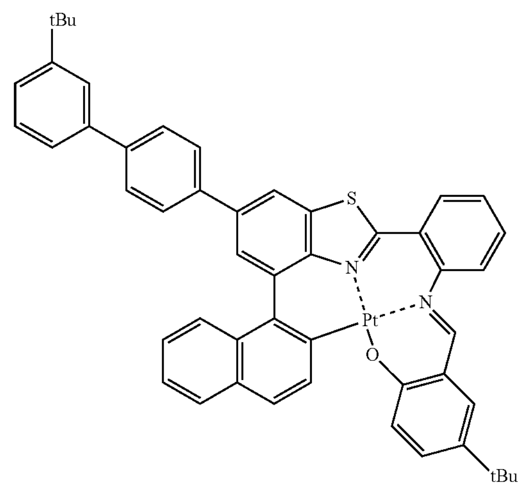
4-449
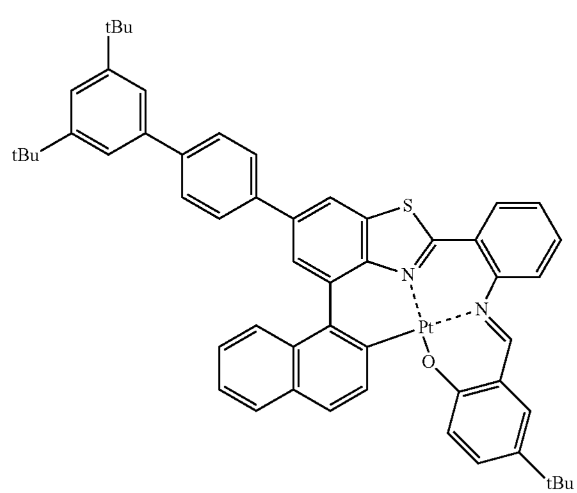

4-450
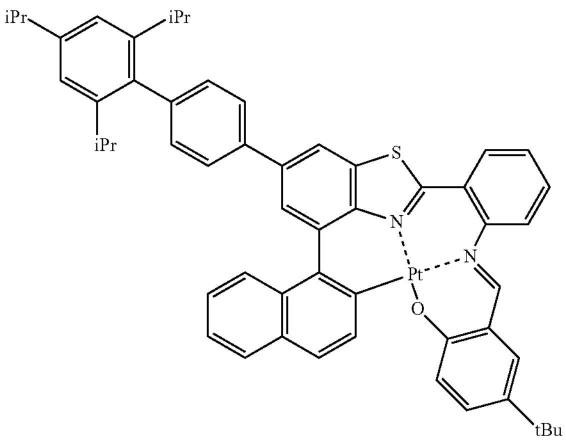
4-451
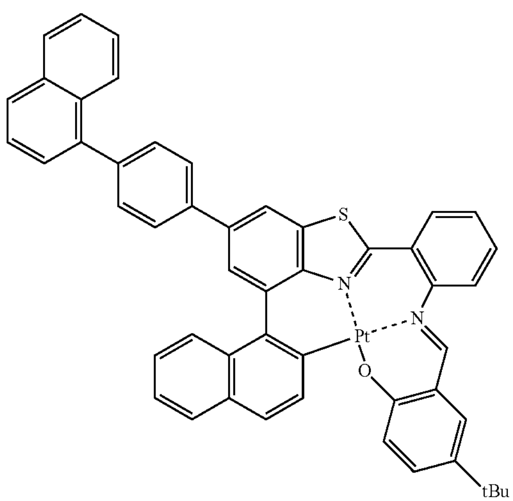
4-452
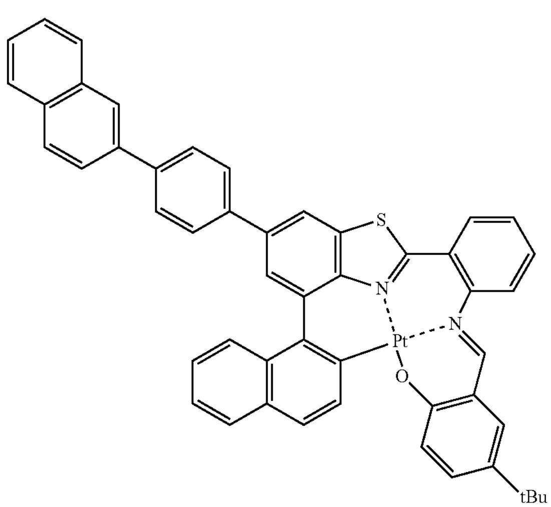
4-453
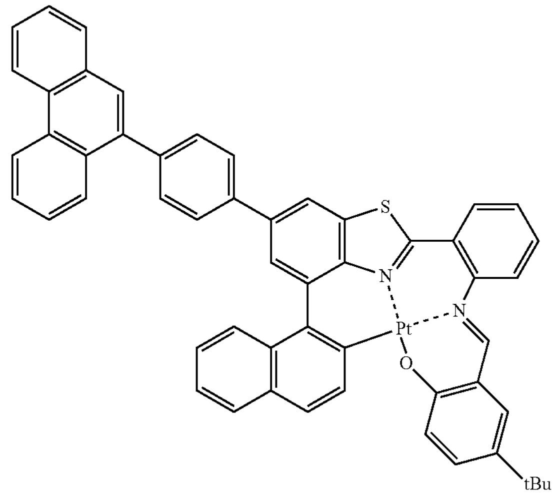
4-454
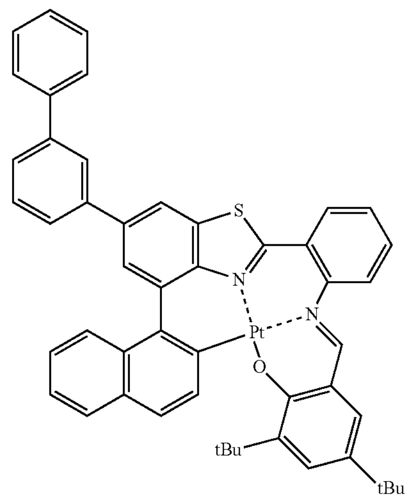
4-455
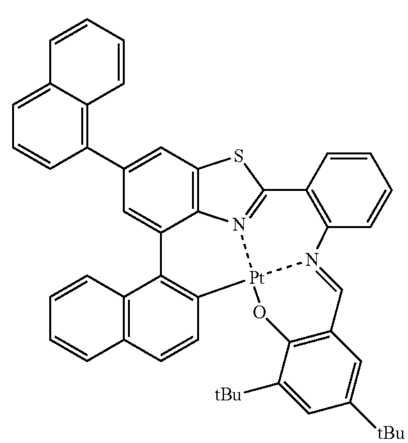

-continued
4-456
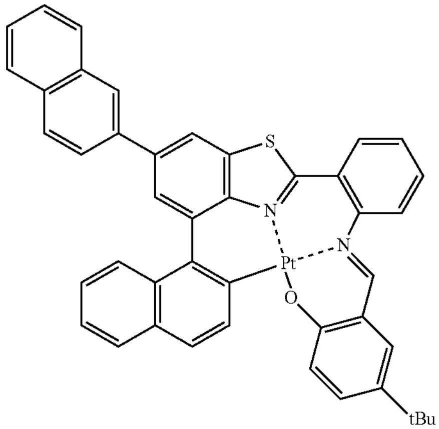
4-457
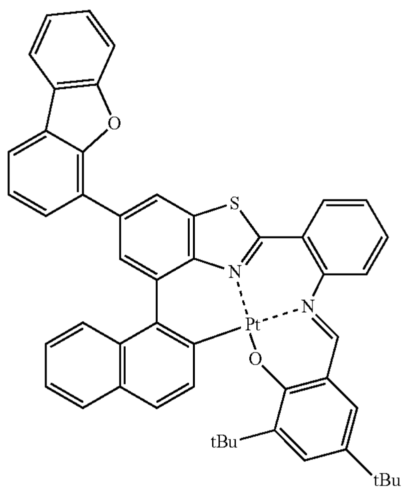
4-458
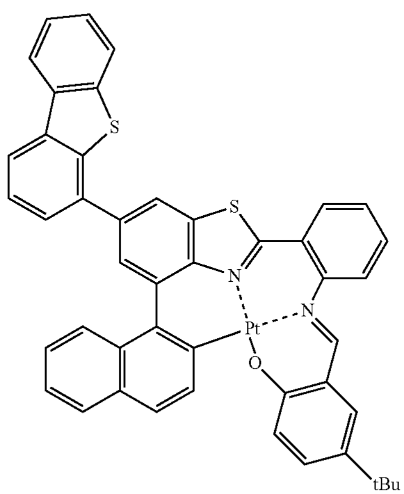
-continued
4-459
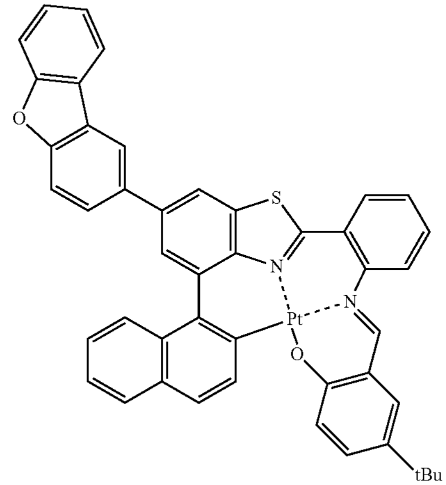
4-460
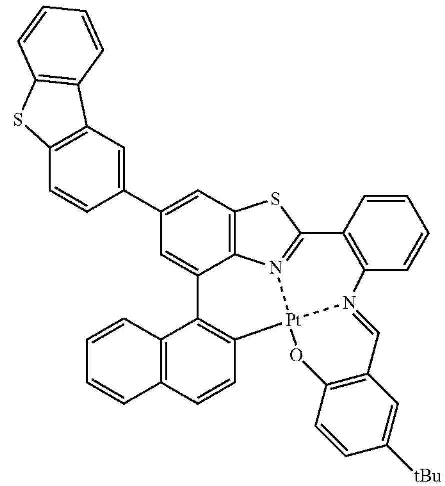
4-461
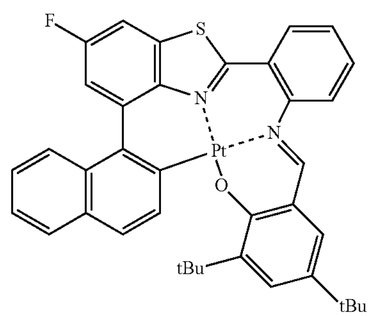
4-462
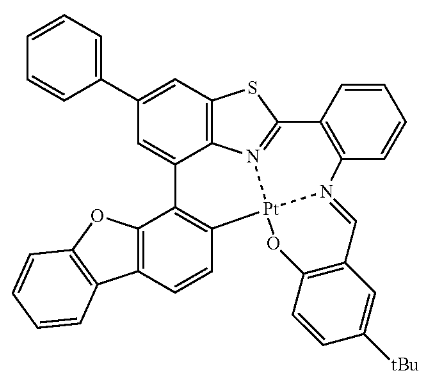

-continued
4-463
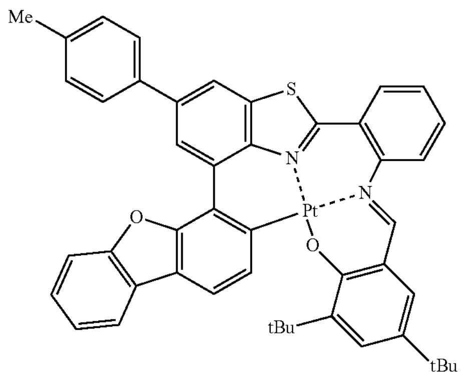
4-464
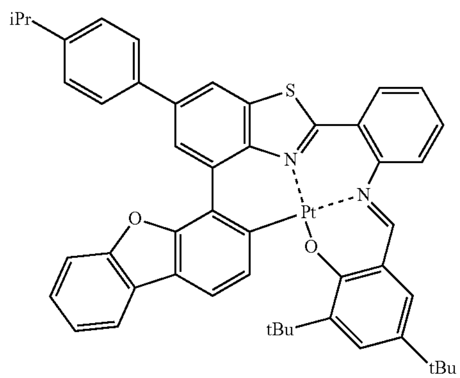
4-465
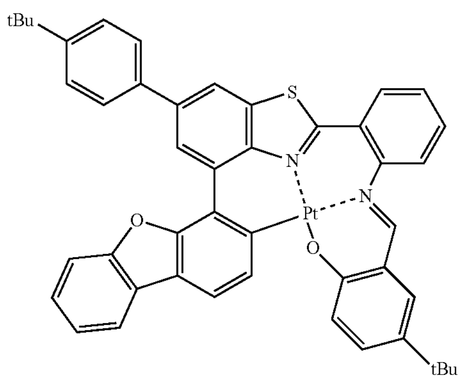
4-466
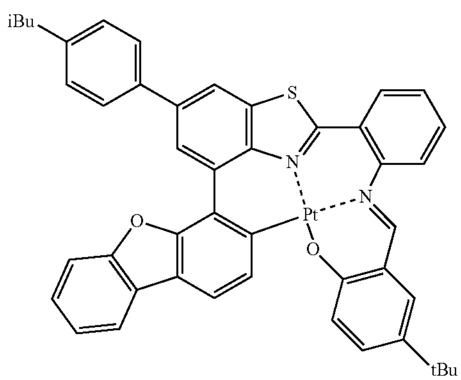
-continued
4-467
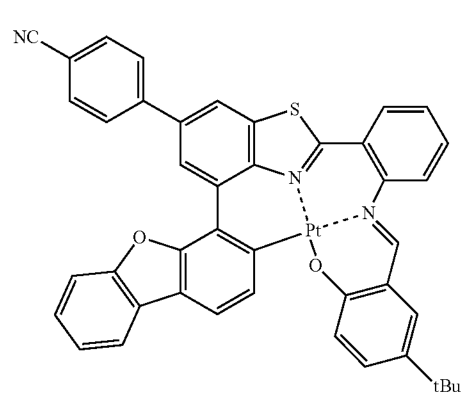
4-468
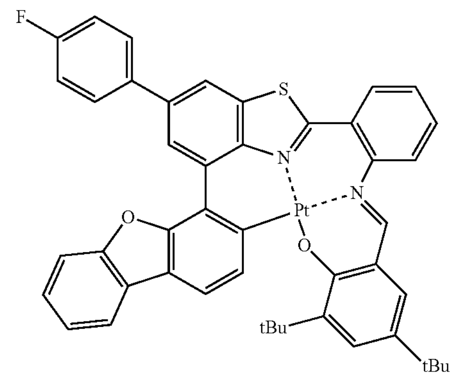
4-469
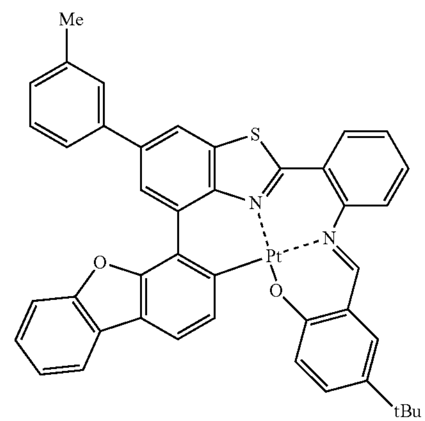
4-470
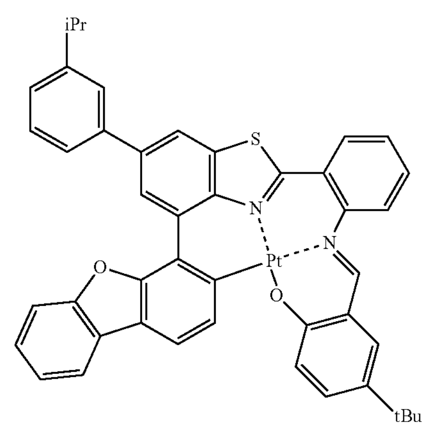

-continued
4-471
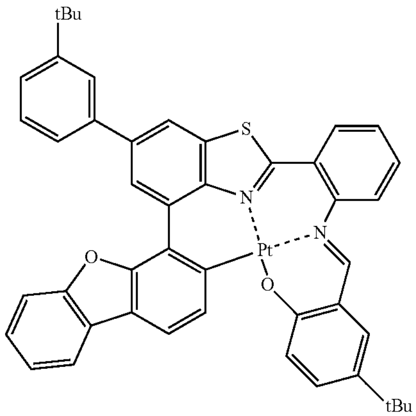
4-472
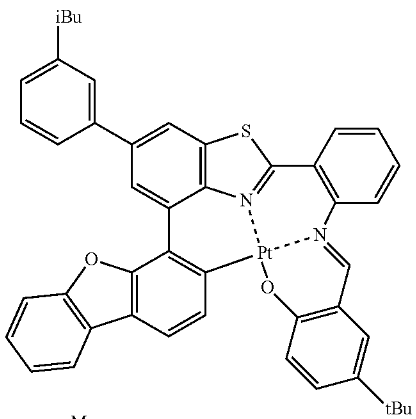
4-473
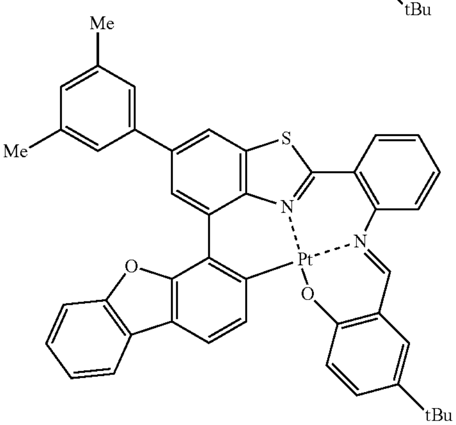
4-474
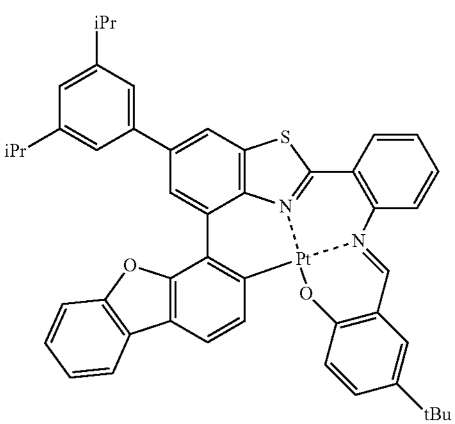
-continued
4-475
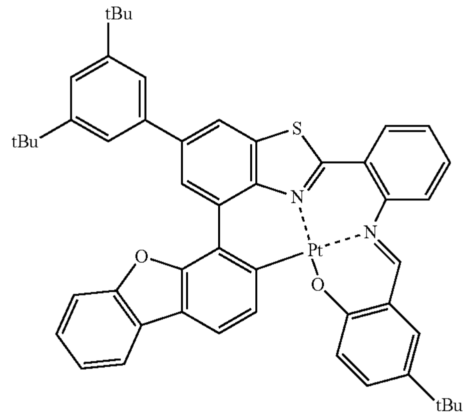
4-476
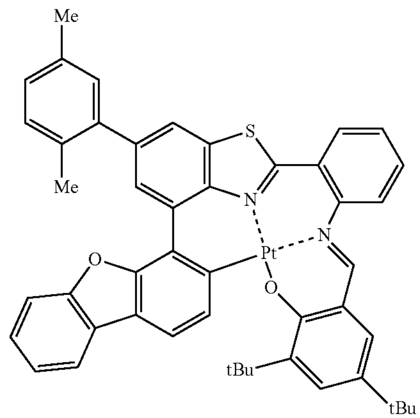
4-477
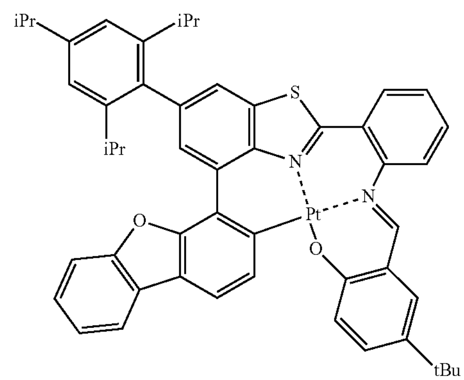
4-478
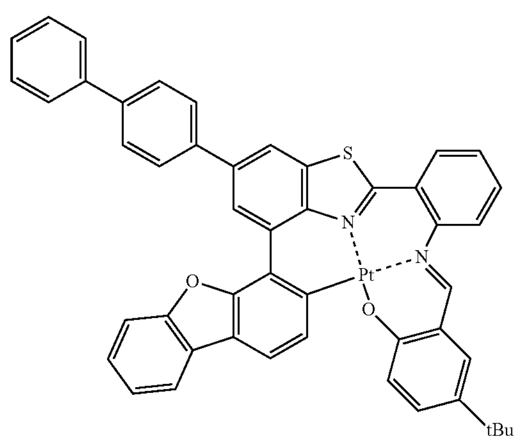

4-479
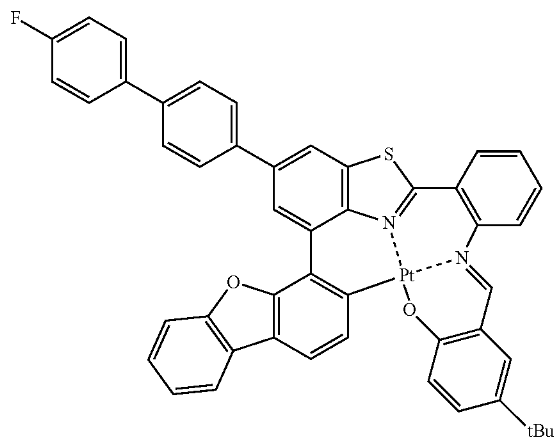
4-480
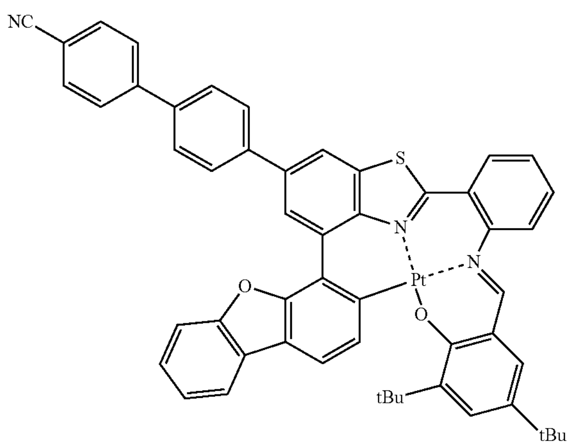
4-481
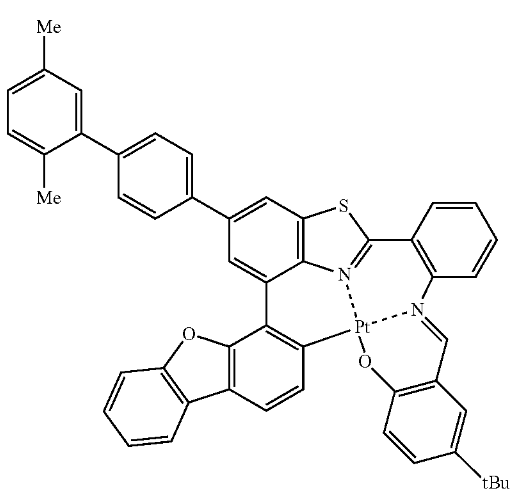
4-482
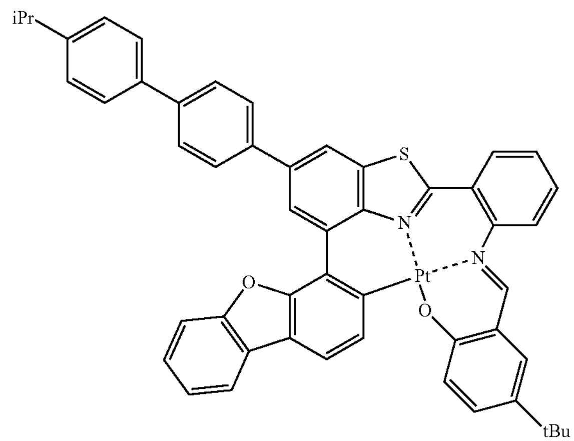
4-483
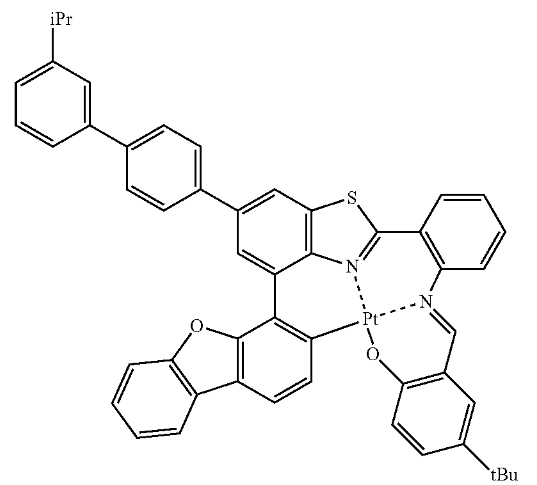
4-484
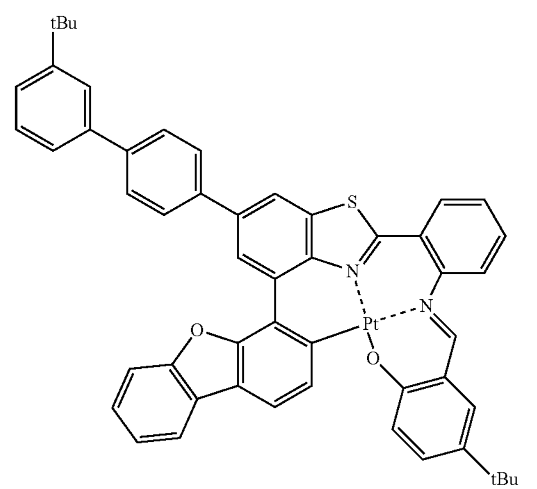

-continued
4-485
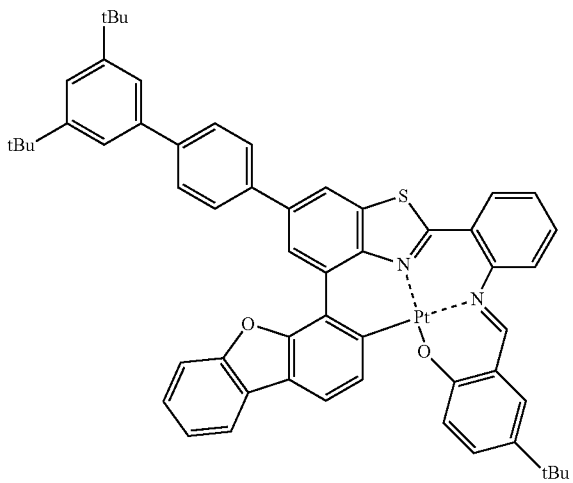
4-486
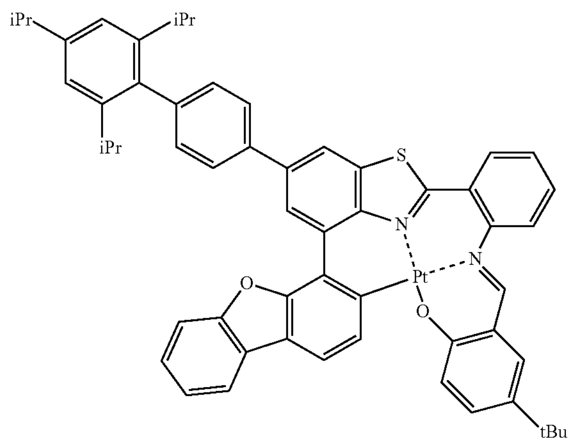
4-487
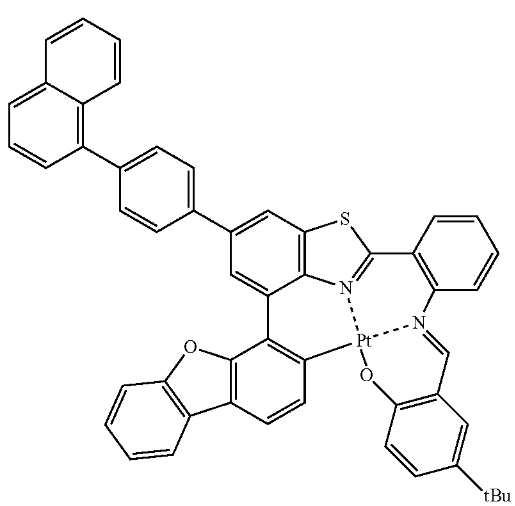
-continued
4-488
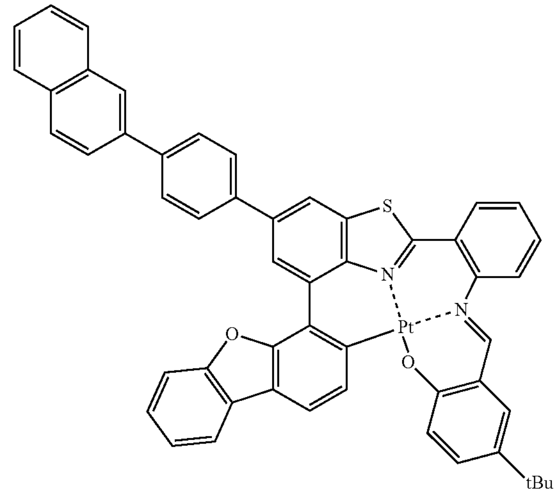
4-489
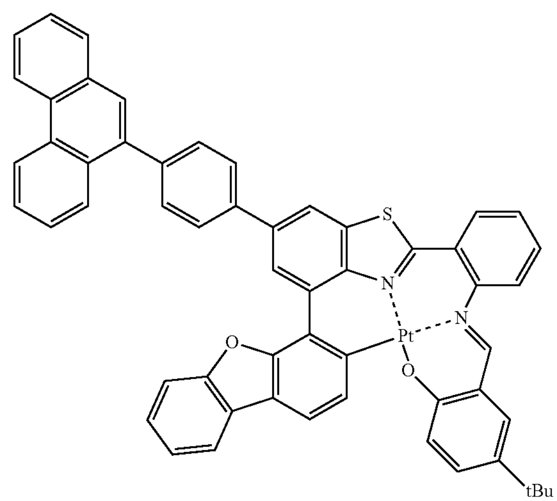
4-490
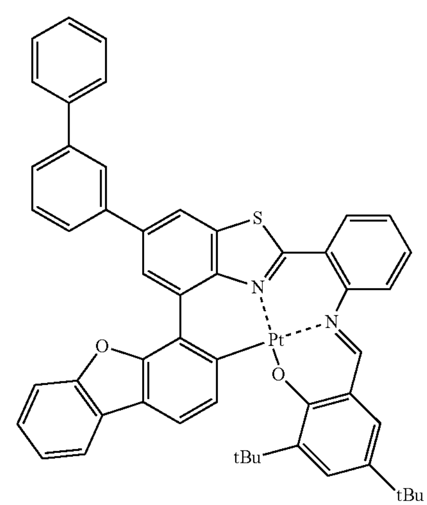

4-491
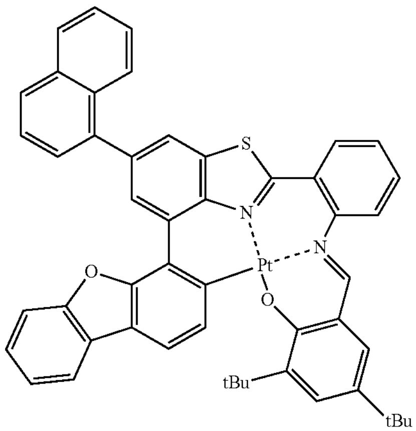
4-492
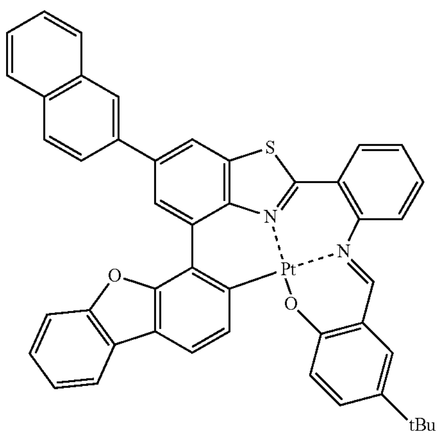
4-493
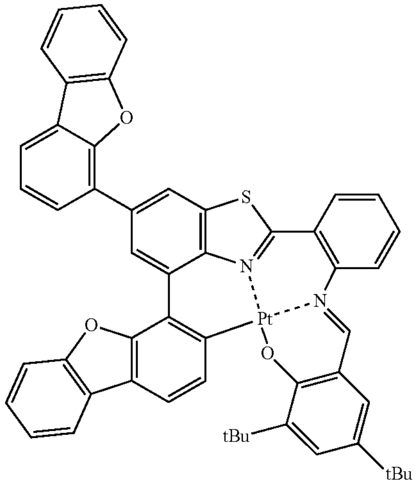
4-494
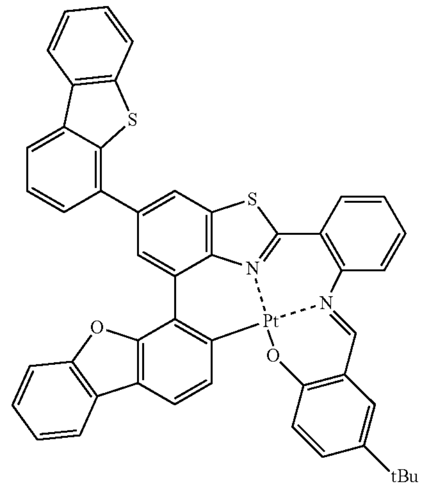
4-495
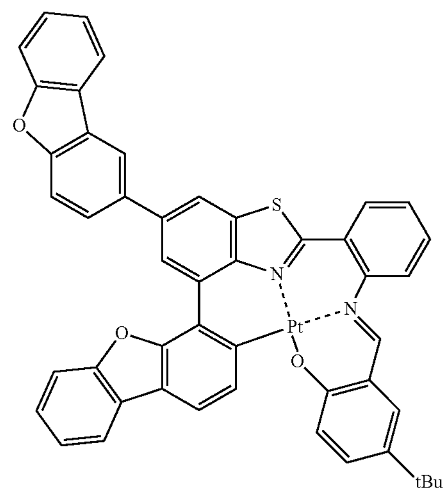
4-496
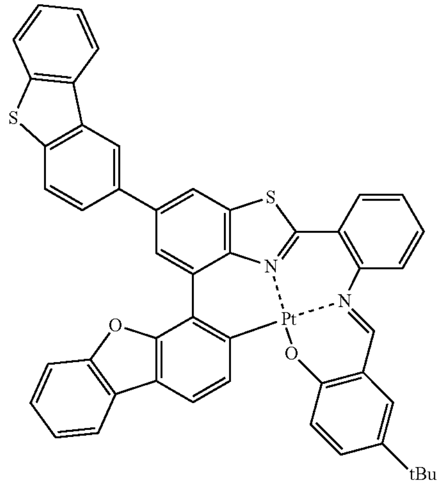

4-497
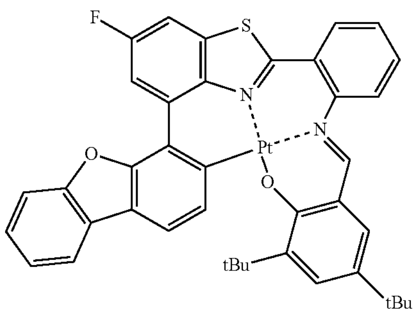
4-498
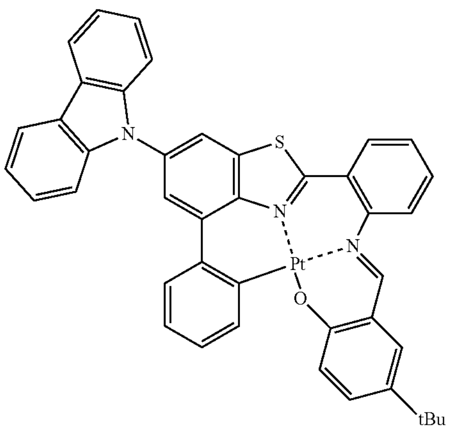
4-499
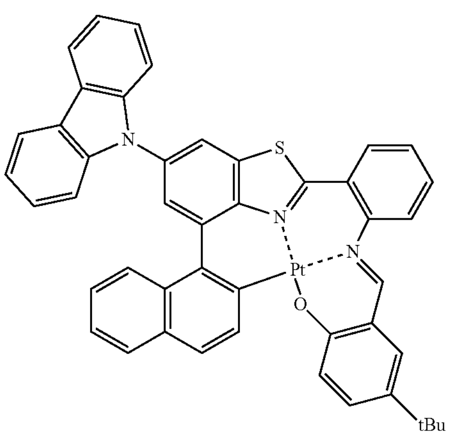
4-500
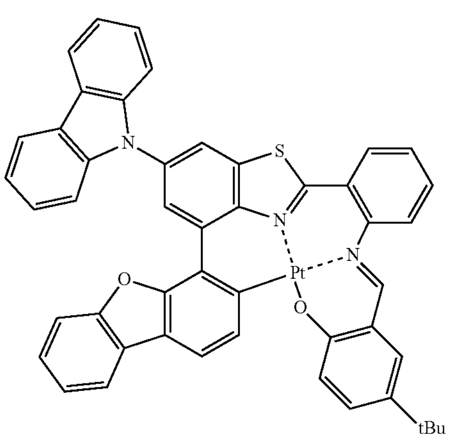
4-501
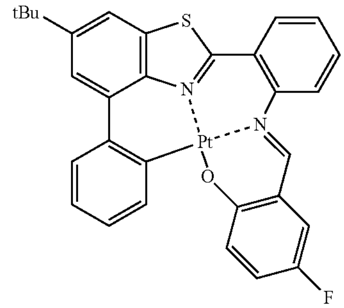
4-502
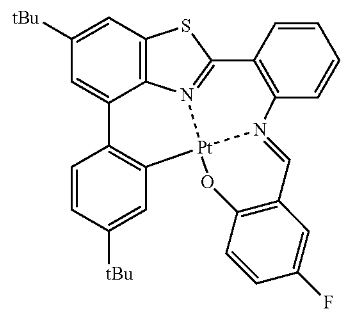
4-503
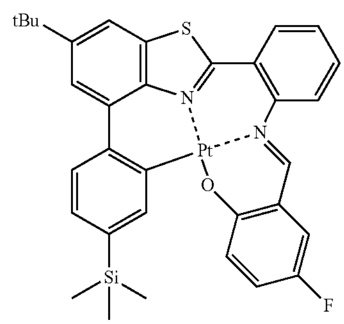
4-504
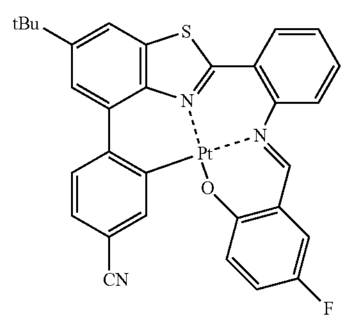
4-505
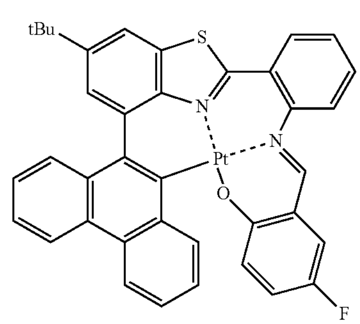

4-506
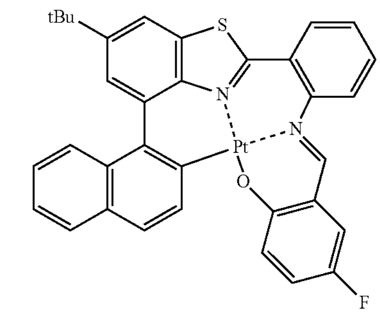
4-507
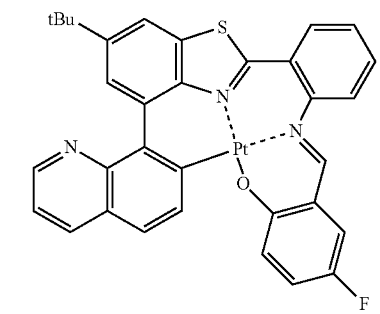
4-508
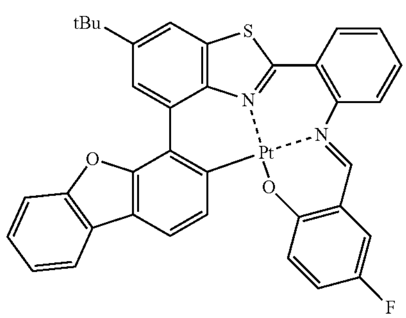
4-509
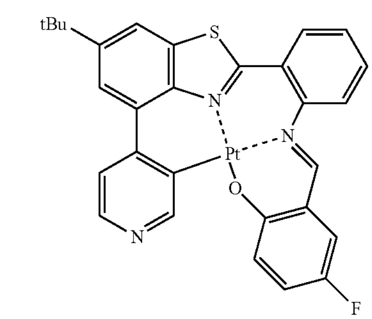
4-510
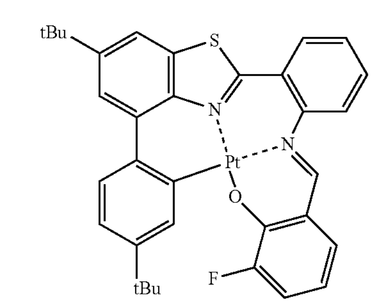
4-511
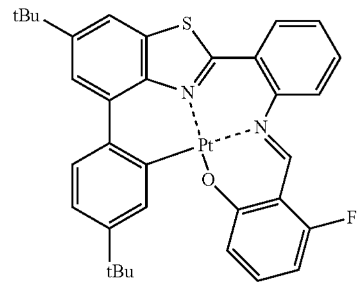
4-512
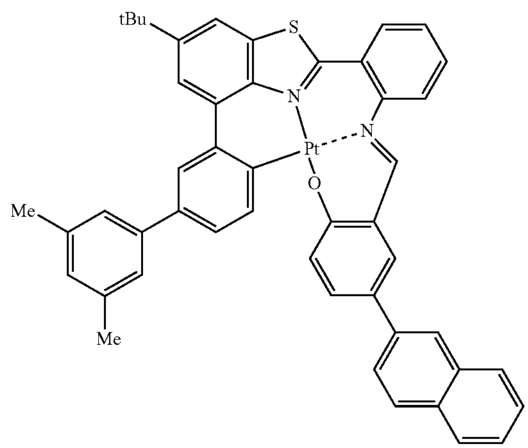
4-513
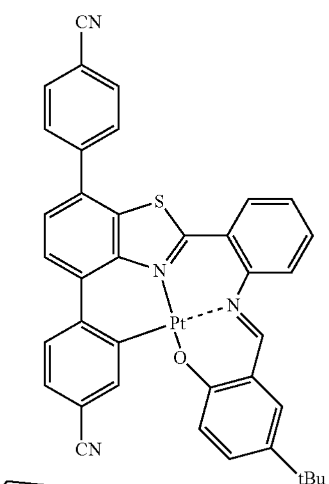
4-514
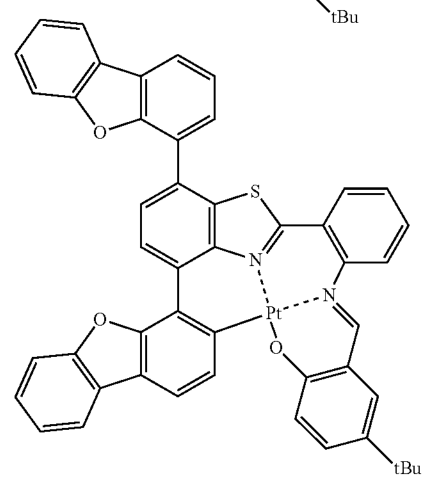

4-515
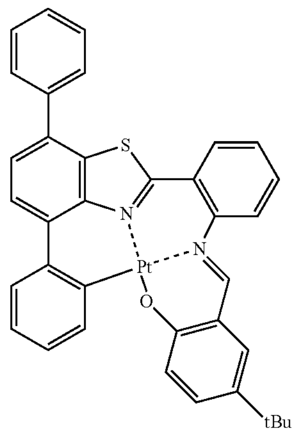
4-516
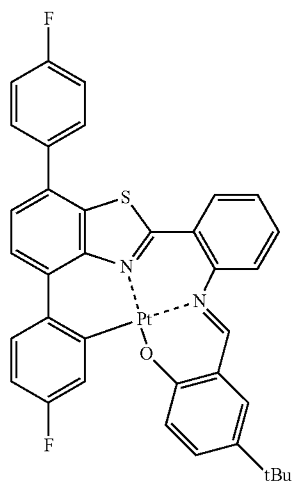
4-517
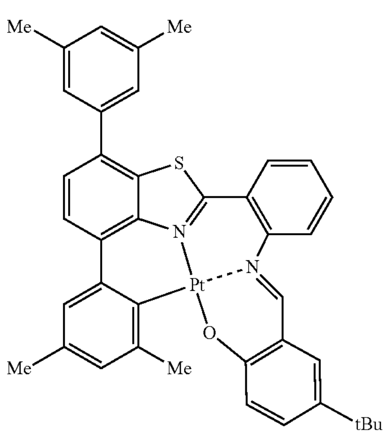
4-518
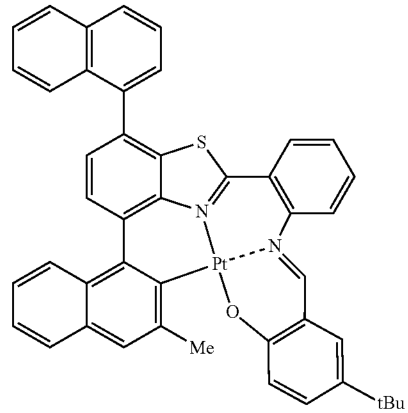
4-519
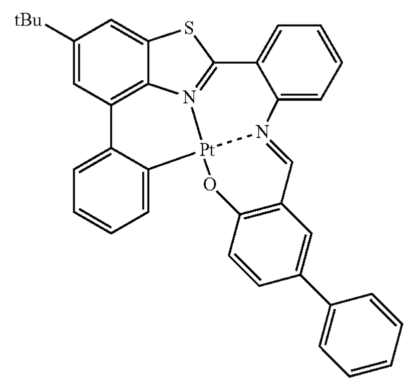
4-520
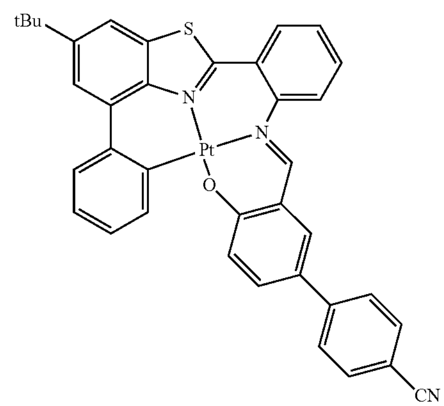
4-521
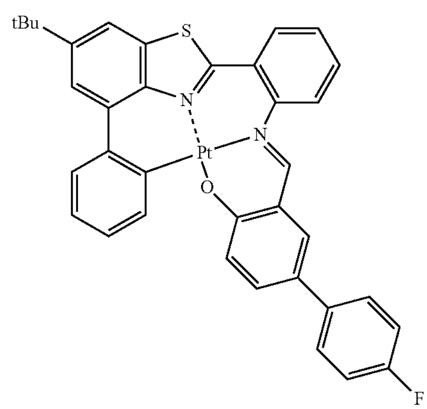

4-522
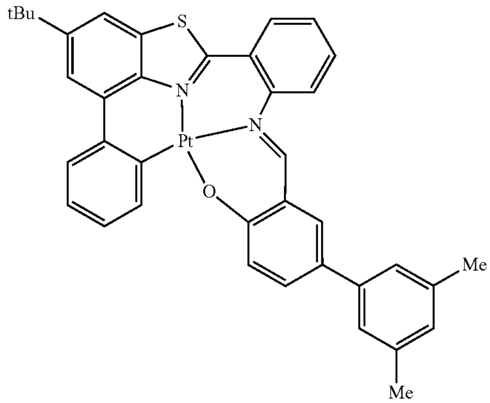
4-523
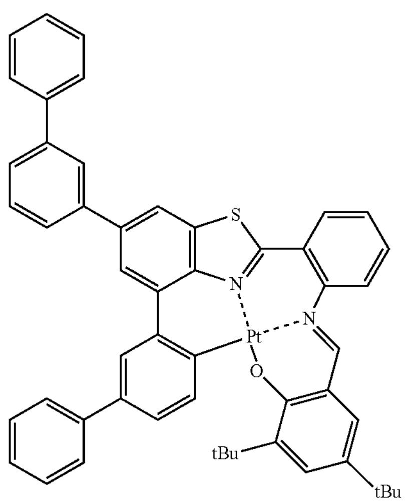
[Compound Group 5]
5-1
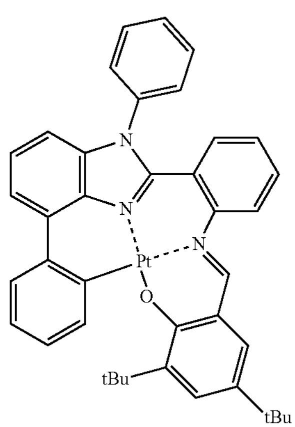
5-2
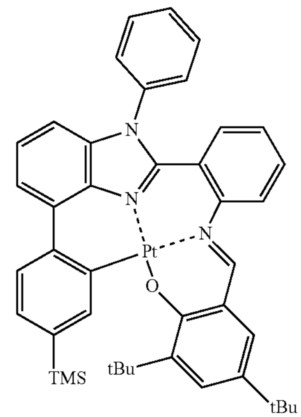
5-3
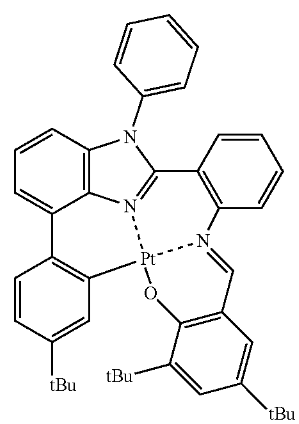
5-4
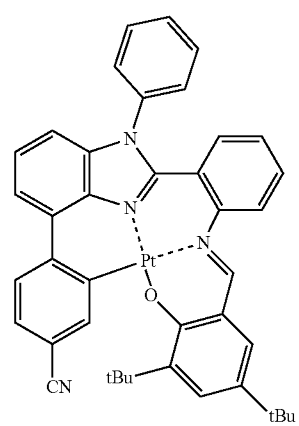

5-5
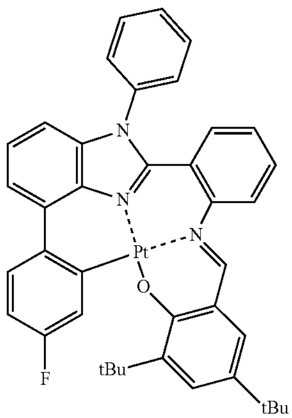
5-6
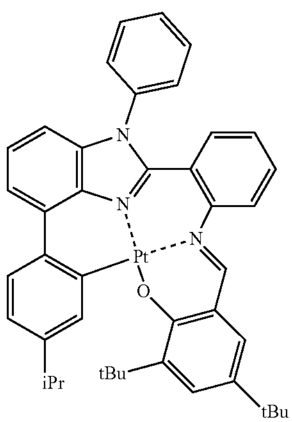
5-7
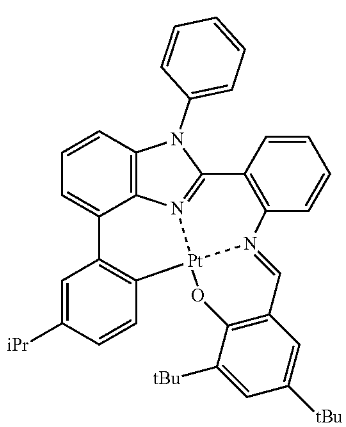
5-8
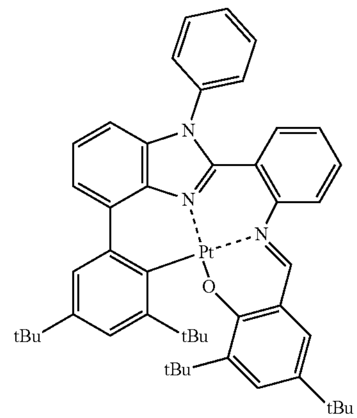
5-9
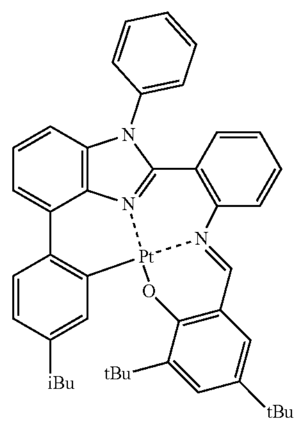
5-10
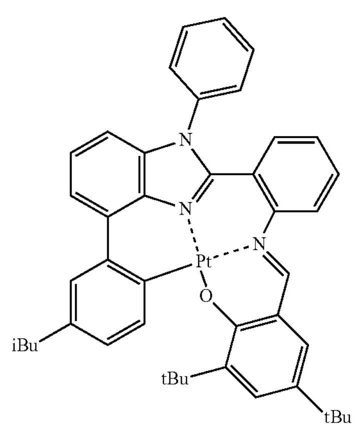

-continued
5-11
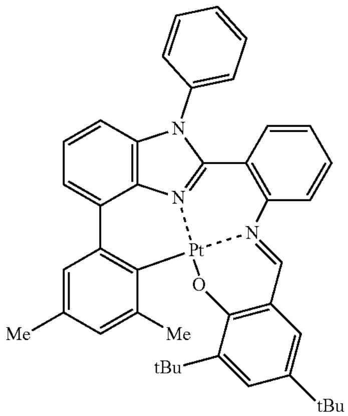
5-12
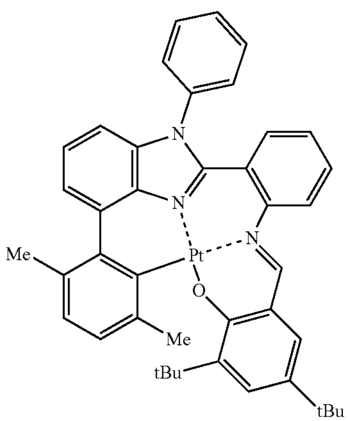
5-13
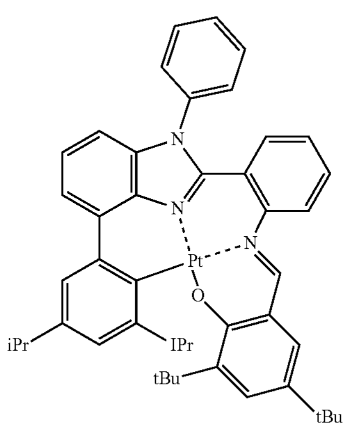
-continued
5-14
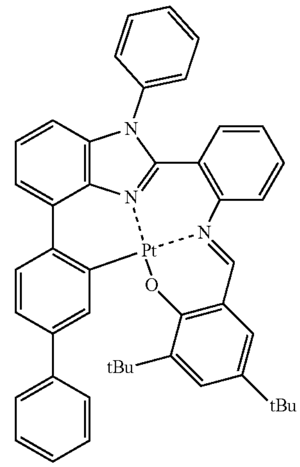
5-15
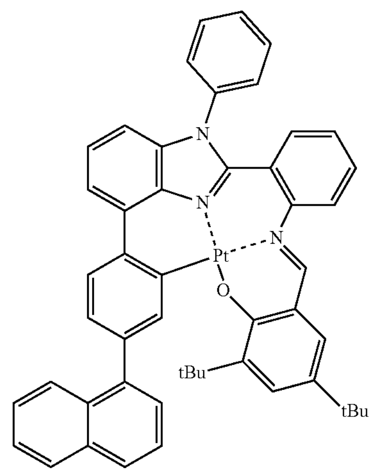
5-16
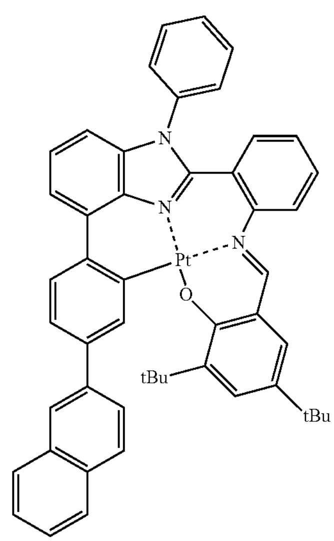

-continued
-continued
5-17
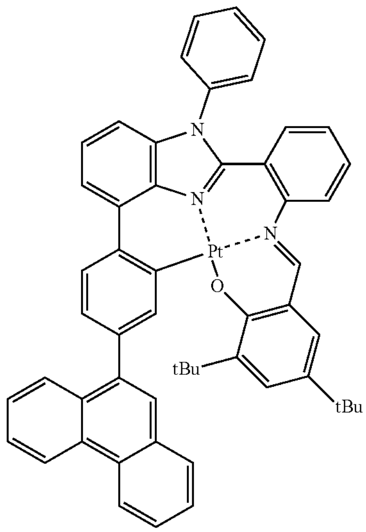
5-18
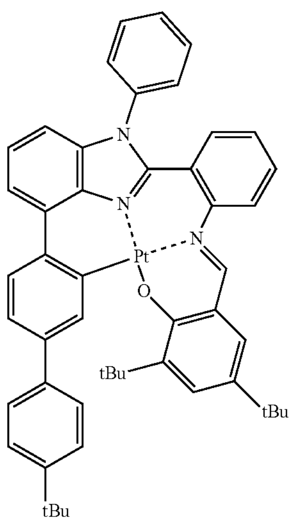
5-19
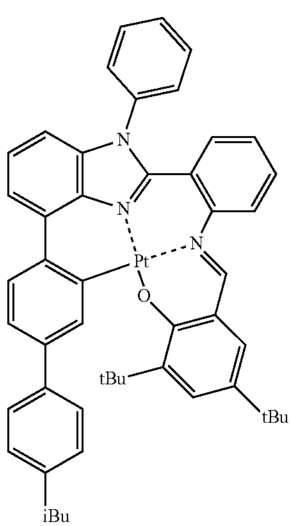
5-20
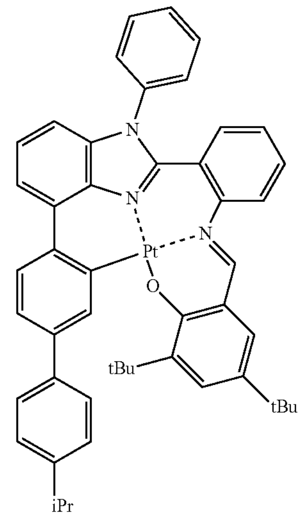
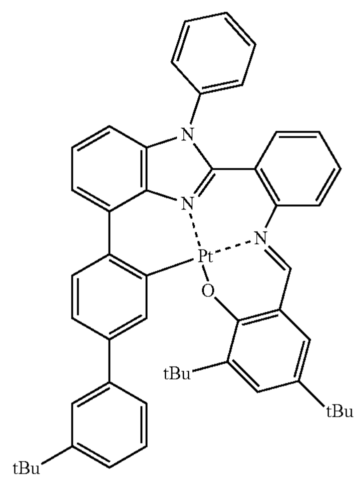
5-22
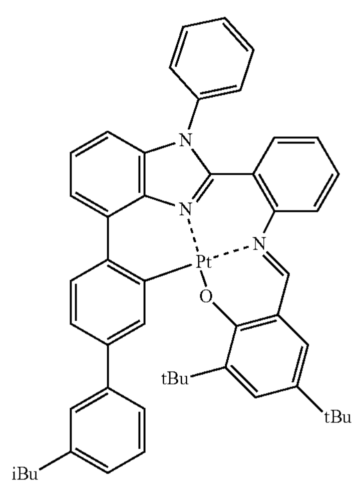

-continued
5-23
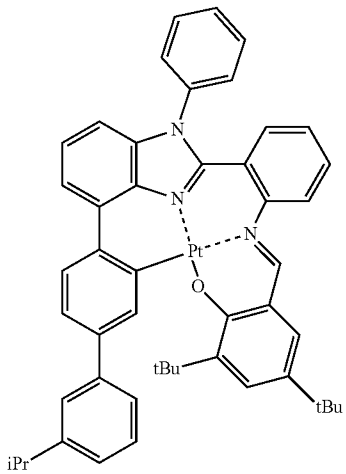
5-24
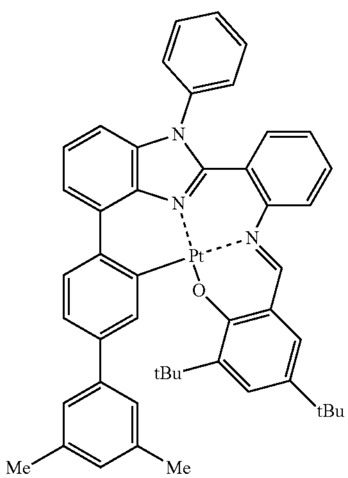
5-25
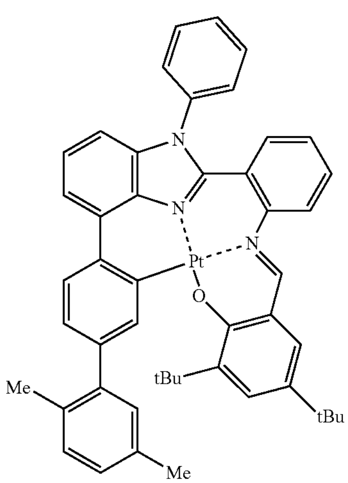
-continued
5-26
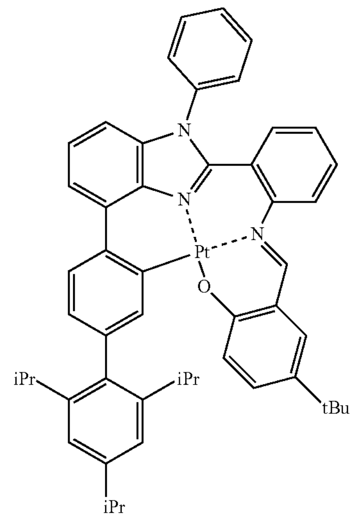
5-27
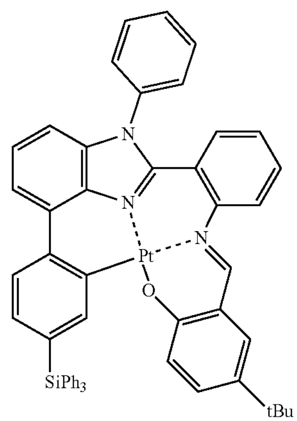
5-28
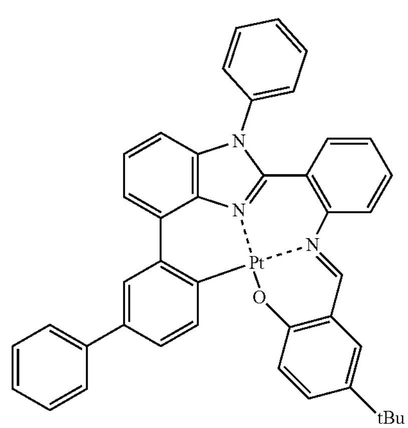

-continued
5-29
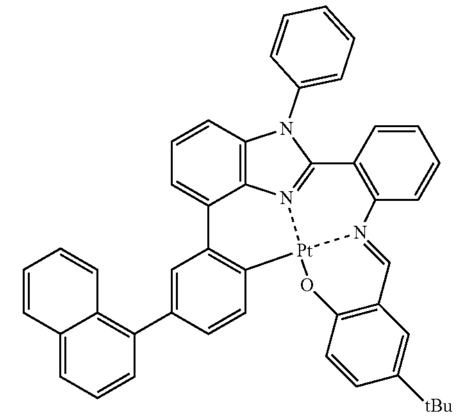
5-30
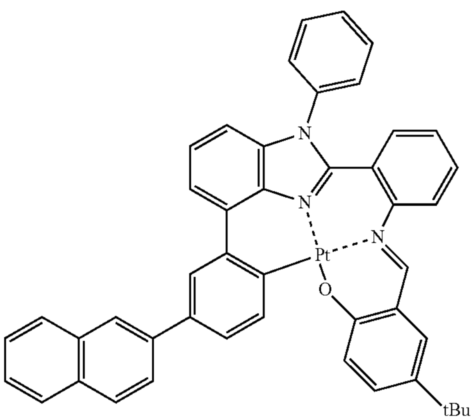
5-31
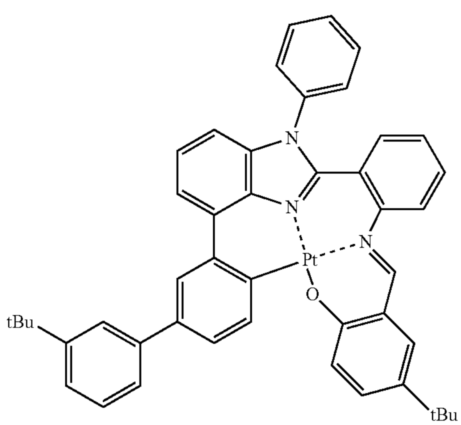
5-32
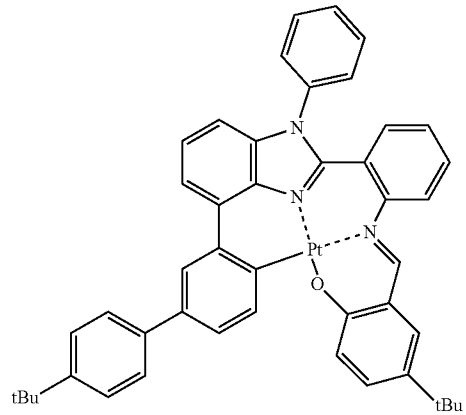
5-33
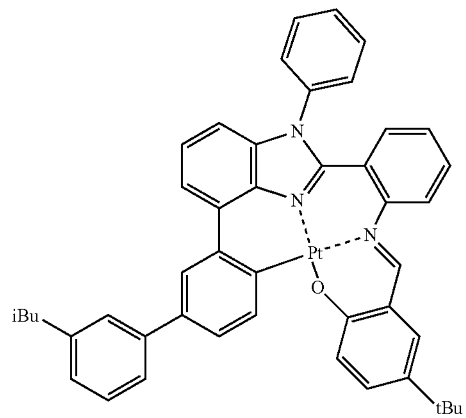
5-34
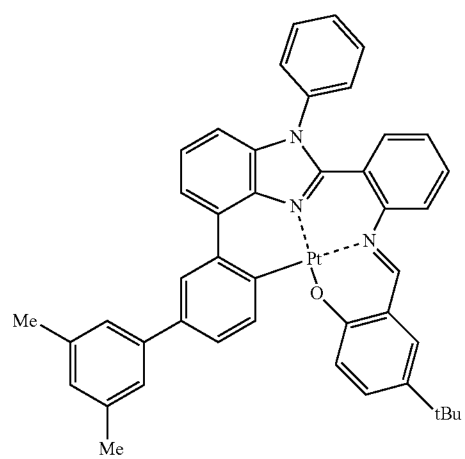

-continued
5-35
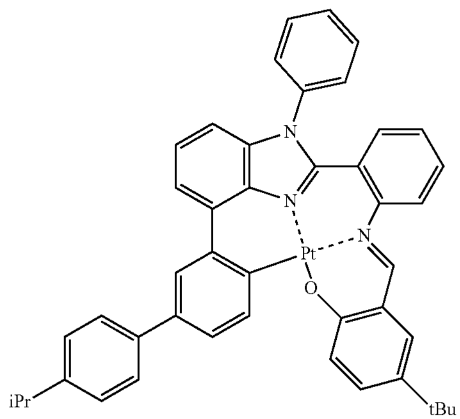
5-36
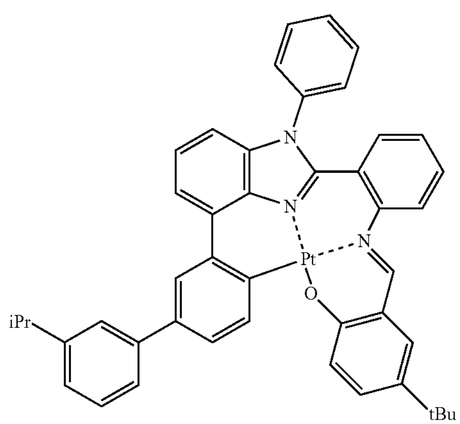
5-37
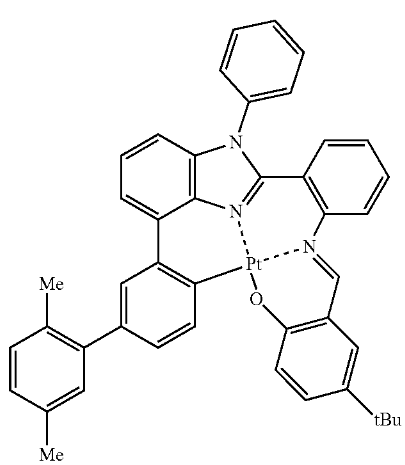
-continued
5-38
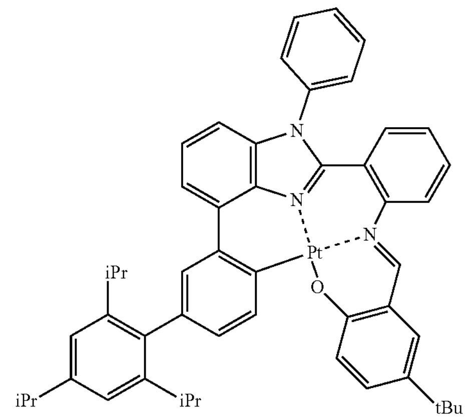
5-39
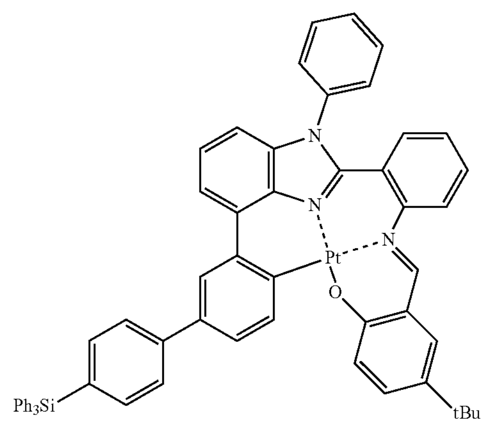
5-40
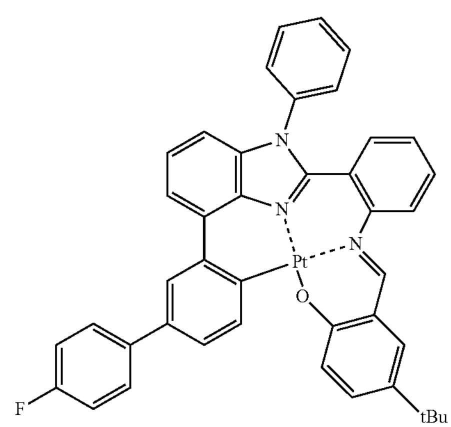

5-41
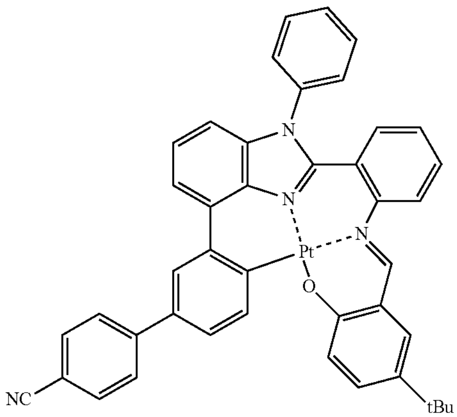
5-42
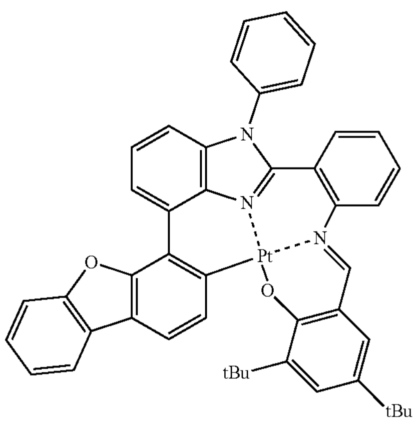
5-43
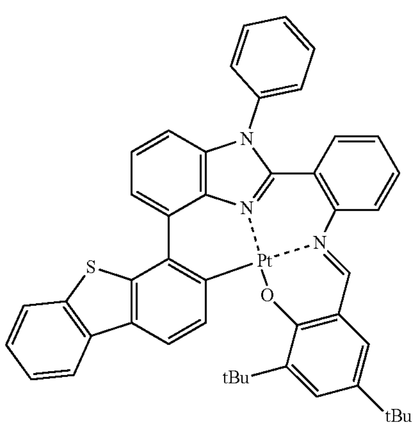
5-44
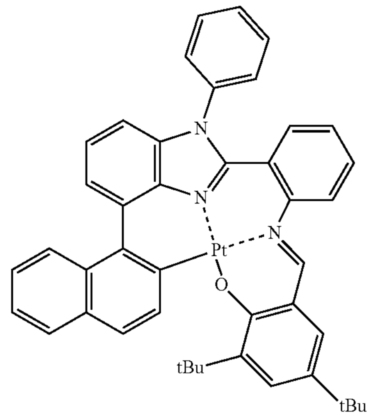
5-45
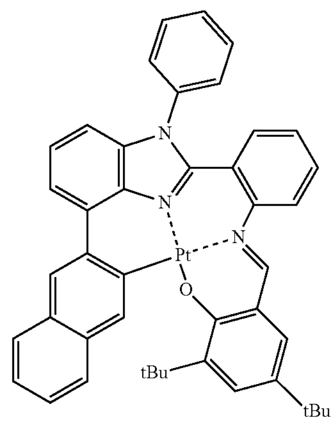
5-46
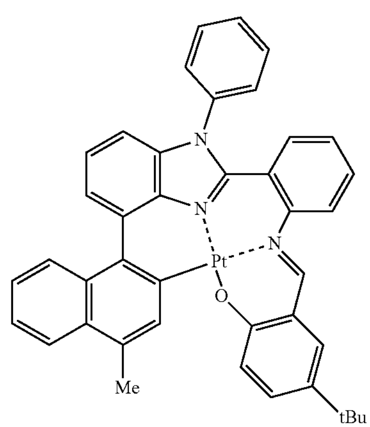

5-47
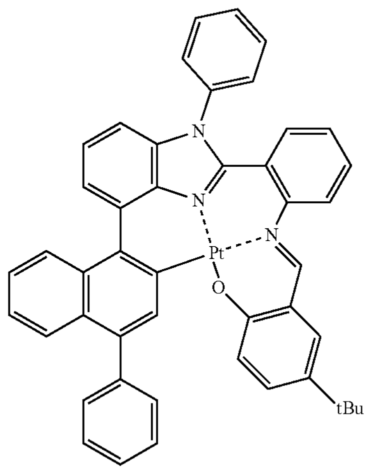
5-48
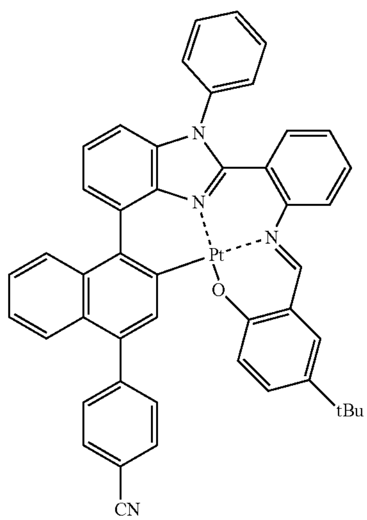
5-49
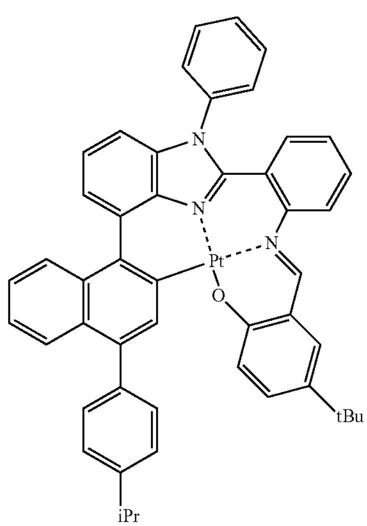
5-50
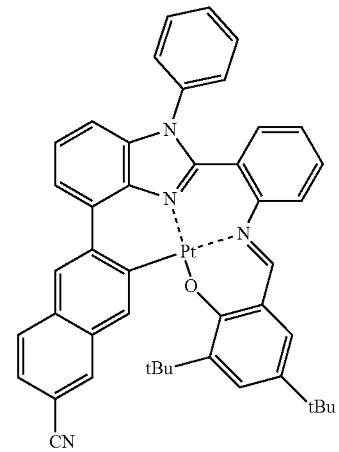
5-51
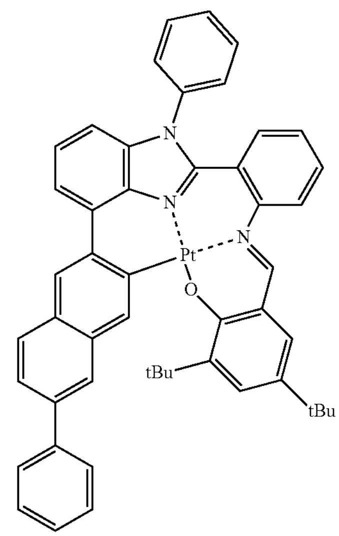
5-52
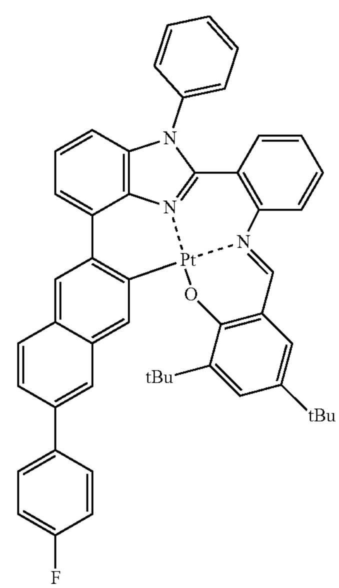

5-53
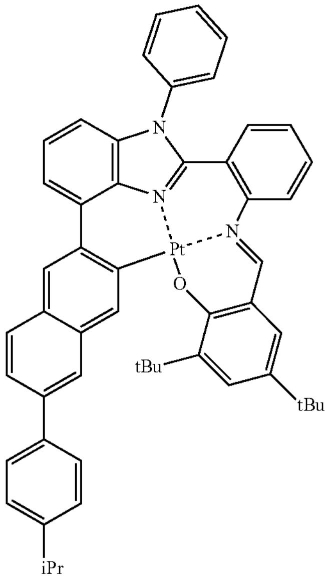
5-54
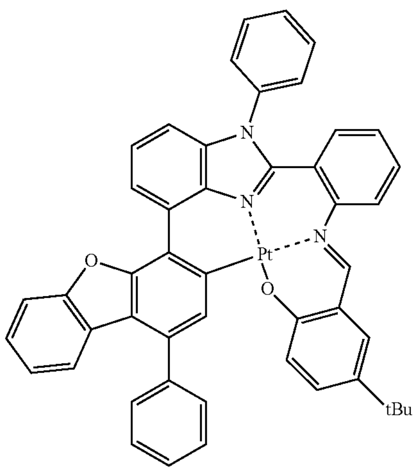
5-55
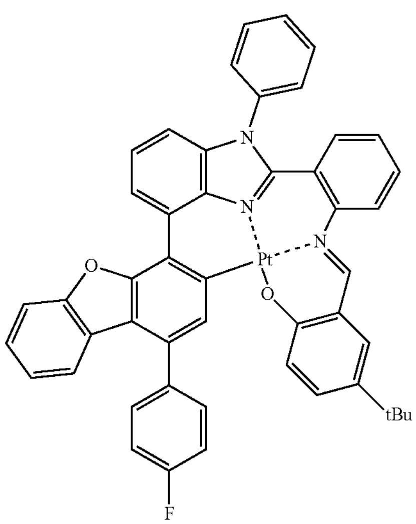
5-56
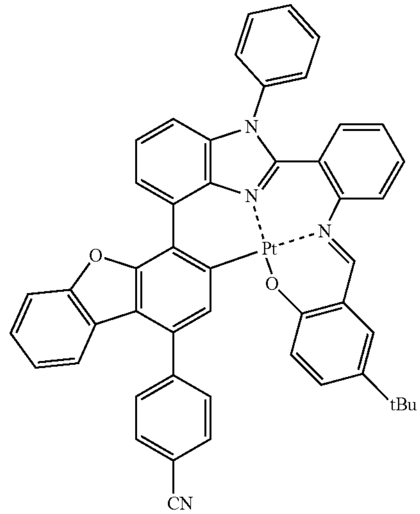
5-57
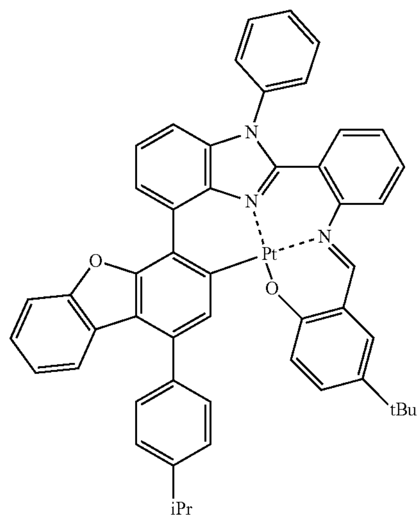
5-58
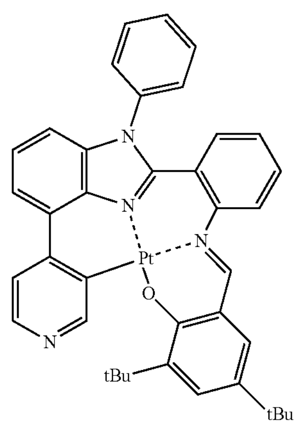

-continued
5-59
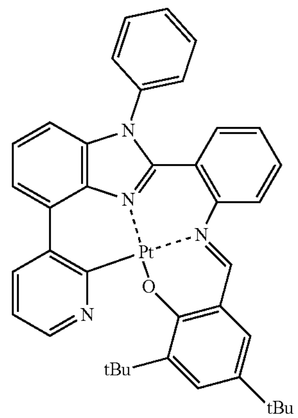
5-60
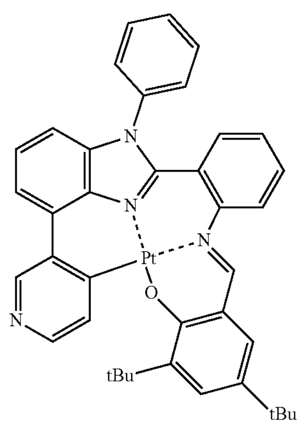
5-61
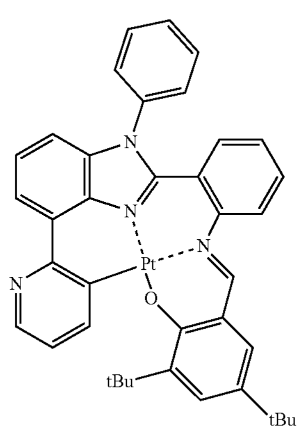
-continued
5-62
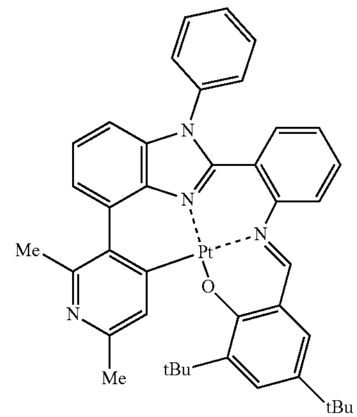
5-63
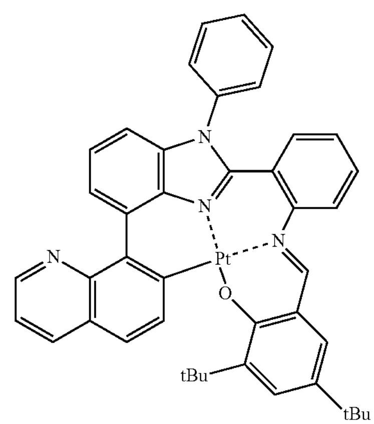
5-64
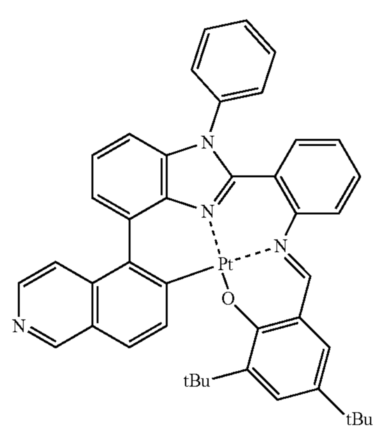

-continued
5-65
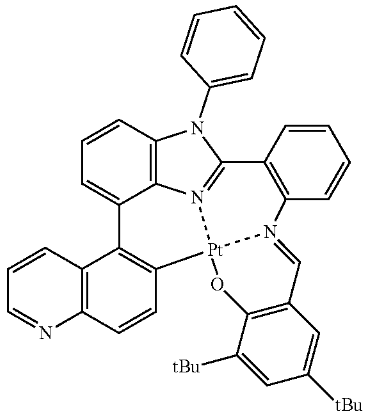
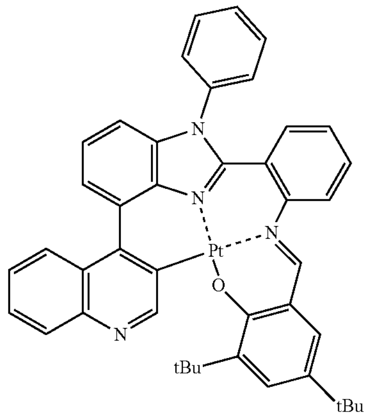
5-67
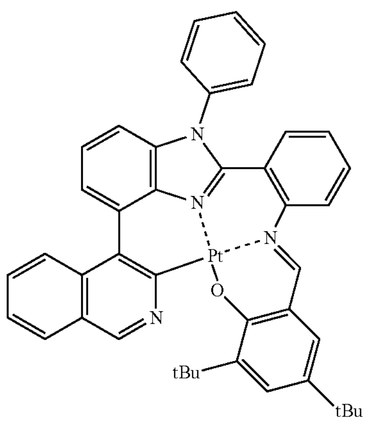
5-68
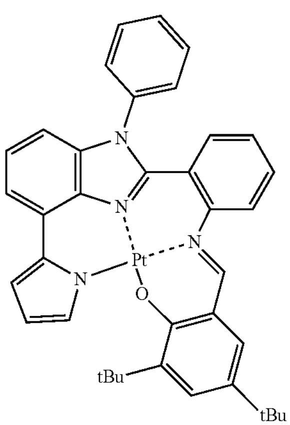
-continued
5-69
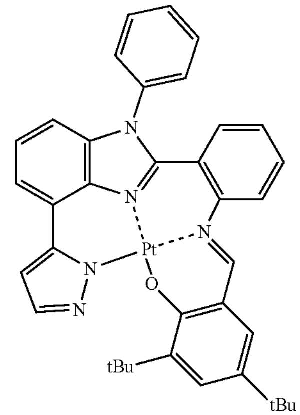
5-70
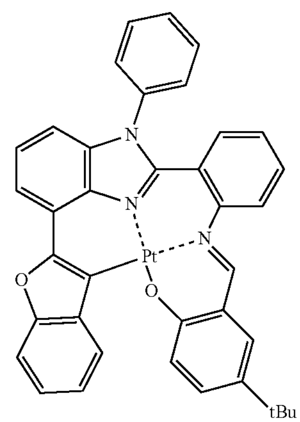
5-71
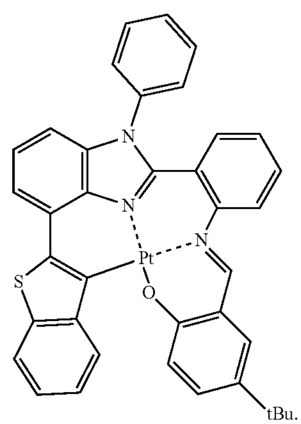
19. The organic electroluminescence device of claim 1, wherein at least two selected from $R_1$ to $R_4$ in Formula 1 is a t-butyl group.
* * * * *